US012598911B2

(12) United States Patent
Kwon et al.

(10) Patent No.: US 12,598,911 B2
(45) Date of Patent: Apr. 7, 2026

(54) ORGANIC LIGHT-EMITTING ELEMENT AND COMPOSITION FOR ORGANIC MATERIAL LAYER THEREOF

(71) Applicant: LT MATERIALS CO., LTD., Yongin-si (KR)

(72) Inventors: Su-Jin Kwon, Yongin-si (KR); Yong-Hui Lee, Yongin-si (KR); Ji-Young Kim, Yongin-si (KR); Jun-Tae Mo, Yongin-si (KR); Dong-Jun Kim, Yongin-si (KR)

(73) Assignee: LT MATERIALS CO., LTD., Yongin-si (KR)

( * ) Notice: Subject to any disclaimer, the term of this patent is extended or adjusted under 35 U.S.C. 154(b) by 1018 days.

(21) Appl. No.: 17/771,743

(22) PCT Filed: Dec. 18, 2020

(86) PCT No.: PCT/KR2020/018636
§ 371 (c)(1),
(2) Date: Apr. 25, 2022

(87) PCT Pub. No.: WO2021/132995
PCT Pub. Date: Jul. 1, 2021

(65) Prior Publication Data

US 2023/0048456 A1 Feb. 16, 2023

(30) Foreign Application Priority Data

Dec. 27, 2019 (KR) ........................ 10-2019-0175843

(51) Int. Cl.

| | |
|---|---|
| ***H01L 51/54*** | (2006.01) |
| ***H10K 85/60*** | (2023.01) |
| *H10K 50/11* | (2023.01) |
| *H10K 101/00* | (2023.01) |
| *H10K 101/10* | (2023.01) |

(52) U.S. Cl.
CPC ......... *H10K 85/615* (2023.02); *H10K 85/622* (2023.02); *H10K 85/624* (2023.02); *H10K 85/631* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 50/11* (2023.02); *H10K 2101/10* (2023.02); *H10K 2101/90* (2023.02)

(58) Field of Classification Search
None
See application file for complete search history.

(56) References Cited

U.S. PATENT DOCUMENTS

| | | | | |
|---|---|---|---|---|
| 4,356,429 | A | 10/1982 | Tang | |
| 10,741,769 | B2 | 8/2020 | Suzuki et al. | |
| 2019/0140177 | A1 | 5/2019 | Lee et al. | |
| 2020/0203623 | A1 * | 6/2020 | Lee ...................... | C07D 409/10 |

FOREIGN PATENT DOCUMENTS

| | | | |
|---|---|---|---|
| JP | 2018-65798 | A | 4/2018 |
| KR | 10-2014-0141951 | A | 12/2014 |
| KR | 10-2016-0041822 | A | 4/2016 |
| KR | 10-2018-0063707 | A | 6/2018 |
| KR | 10-2018-0116635 | A | 10/2018 |
| KR | 10-2019-0052505 | A | 5/2019 |
| WO | WO 2015/084047 | A1 | 6/2015 |

OTHER PUBLICATIONS

International Search Report for PCT/KR2020/018636 mailed on Mar. 30, 2021.
Kuwabara et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenylamino)triphenylamine (m-MTDATA), as Hole-Transport Materials", Advanced Materials, 1994, vol. 6, No. 9, pp. 677-679.

* cited by examiner

*Primary Examiner* — Andrew K Bohaty
(74) *Attorney, Agent, or Firm* — Birch, Stewart, Kolasch & Birch, LLP

(57) ABSTRACT

The present specification relates to an organic light emitting device including Compound (A) represented by Chemical Formula 1 and Compound (B) represented by any one of Chemical Formulae 2 to 4.

14 Claims, 2 Drawing Sheets

【FIG. 1】
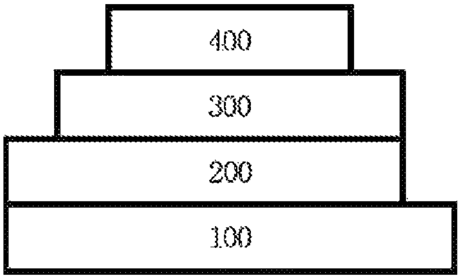
【FIG. 2】
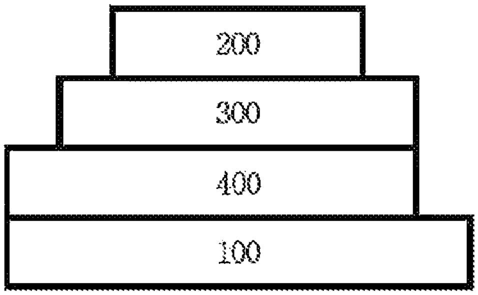

【FIG. 3】
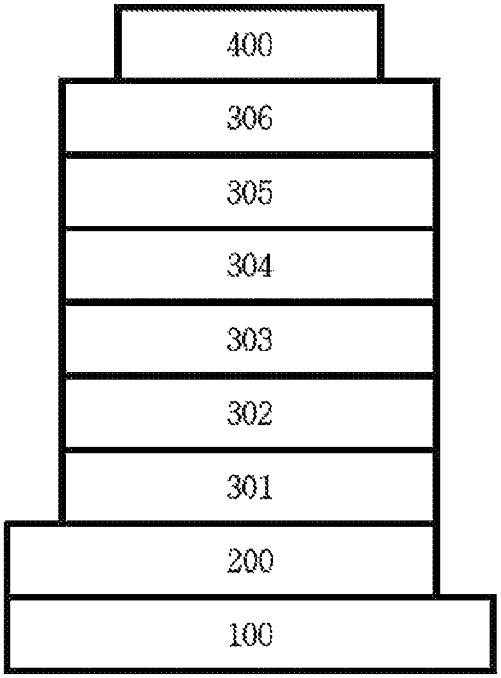

ORGANIC LIGHT-EMITTING ELEMENT AND COMPOSITION FOR ORGANIC MATERIAL LAYER THEREOF

TECHNICAL FIELD

The present specification relates to an organic light emitting device, and a composition for an organic material layer of an organic light emitting device.

The present specification claims priority to and the benefits of Korean Patent Application No. 10-2019-0175843, filed with the Korean Intellectual Property Office on Dec. 27, 2019, the entire contents of which are incorporated herein by reference.

BACKGROUND ART

An electroluminescent device is one type of self-emissive display devices, and has an advantage of having a wide viewing angle, and a high response speed as well as having an excellent contrast.

An organic light emitting device has a structure disposing an organic thin film between two electrodes. When a voltage is applied to an organic light emitting device having such a structure, electrons and holes injected from the two electrodes bind and pair in the organic thin film, and light emits as these annihilate. The organic thin film may be formed in a single layer or a multilayer as necessary.

A material of the organic thin film may have a light emitting function as necessary. For example, as a material of the organic thin film, compounds capable of forming a light emitting layer themselves alone may be used, or compounds capable of performing a role of a host or a dopant of a host-dopant-based light emitting layer may also be used. In addition thereto, compounds capable of performing roles of hole injection, hole transfer, electron blocking, hole blocking, electron transfer, electron injection and the like may also be used as a material of the organic thin film.

Development of an organic thin film material has been continuously required for enhancing performance, lifetime or efficiency of an organic light emitting device.

PRIOR ART DOCUMENTS

Patent Documents (Patent Document 1) U.S. Pat. No. 4,356,429

DISCLOSURE

Technical Problem

The present specification is directed to providing an organic light emitting device, and a composition for an organic material layer of an organic light emitting device.

Technical Solution

One embodiment of the present specification provides an organic light emitting device including a first electrode; a second electrode provided opposite to the first electrode; and one or more organic material layers provided between the first electrode and the second electrode, wherein one or more layers of the organic material layers include Compound (A) represented by the following Chemical Formula 1 and Compound (B) represented by any one of the following Chemical Formulae 2 to 4.

[Chemical Formula 1]

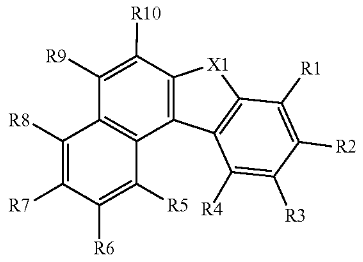

In Chemical Formula 1,

X1 is O; S; or NR,

R1 to R10 are each independently selected from the group consisting of hydrogen; deuterium; a halogen group; a cyano group; a substituted or unsubstituted alkyl group having 1 to 60 carbon atoms; a substituted or unsubstituted alkenyl group having 2 to 60 carbon atoms; a substituted or unsubstituted alkynyl group having 2 to 60 carbon atoms; a substituted or unsubstituted alkoxy group having 1 to 60 carbon atoms; a substituted or unsubstituted cycloalkyl group having 3 to 60 carbon atoms; a substituted or unsubstituted heterocycloalkyl group having 2 to 60 carbon atoms; a substituted or unsubstituted aryl group having 6 to 60 carbon atoms; a substituted or unsubstituted heteroaryl group having 2 to 60 carbon atoms; a substituted or unsubstituted phosphine oxide group; and a substituted or unsubstituted amine group, or adjacent two or more groups bond to form a substituted or unsubstituted ring, at least one of R1 to R10 is —N-Het, and at least one of the rest of R1 to R10 is $-(L)_m-Ar$, L is a direct bond; a substituted or unsubstituted arylene group having 6 to 60 carbon atoms; or a substituted or unsubstituted heteroarylene group having 2 to 60 carbon atoms, Ar is a substituted or unsubstituted aryl group having 6 to 60 carbon atoms; a substituted or unsubstituted heteroaryl group having 2 to 60 carbon atoms; or a substituted or unsubstituted amine group, N-Het is a monocyclic or polycyclic heteroaryl group having 2 to 60 carbon atoms substituted or unsubstituted, and including one or more Ns, R is a substituted or unsubstituted aryl group having 6 to 60 carbon atoms, m is an integer of 1 to 5, and when m is an integer of 2 or greater, substituents in the parentheses are the same as or different from each other,

[Chemical Formula 2]

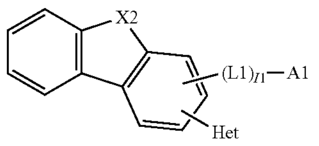

[Chemical Formula 3]

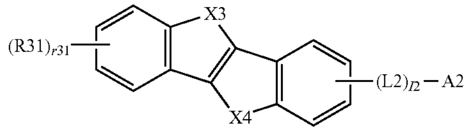

-continued

[Chemical Formula 4]

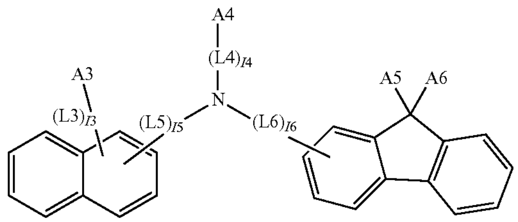

in Chemical Formulae 2 to 4,

X2 is O or S,

X3 and X4 are each independently O; S; or CR'R",

L1 to L6 are each independently a direct bond; a substituted or unsubstituted arylene group having 6 to 60 carbon atoms; or a substituted or unsubstituted heteroarylene group having 2 to 60 carbon atoms, l1 to l6 are each independently an integer of 1 to 5, A1 to A4 are each independently a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; a substituted or unsubstituted heteroaryl group having 2 to 60 carbon atoms; or a substituted or unsubstituted amine group, A5 and A6 are each independently hydrogen; deuterium; a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; or a substituted or unsubstituted heteroaryl group having 2 to 60 carbon atoms, or A5 and A6 bond to form a substituted or unsubstituted ring, R', R" and R31 are each independently hydrogen; deuterium; a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; or a substituted or unsubstituted heteroaryl group having 2 to 60 carbon atoms, Het is a substituted or unsubstituted aryl group having 6 to 60 carbon atoms; or a substituted or unsubstituted heteroaryl group having 2 to 60 carbon atoms, r31 is an integer of 1 to 4, and when l1 to l6 and r31 are each 2 or greater, substituents in the parentheses are the same as or different from each other.

Another embodiment of the present specification provides a composition for an organic material layer of an organic light emitting device, the composition including Compound (A) represented by Chemical Formula 1 and Compound (B) represented by any one of Chemical Formulae 2 to 4.

Advantageous Effects

By including two types of compounds in some of organic material layers, an organic light emitting device described in the present specification is capable of lowering a driving voltage, enhancing light efficiency and enhancing lifetime properties in the device. Particularly, the two types of compounds can be used as a light emitting layer material of an organic light emitting device.

When the compound of Chemical Formula 1 is included in a device together with the compound of Chemical Formula 2, Chemical Formula 3 or Chemical Formula 4, an exciplex phenomenon that is a phenomenon of releasing energy having sizes of an electron donor (p-host) HOMO level and an electron acceptor (n-host) LUMO level due to electron exchanges between two molecules of the compound of Chemical Formula 2, Chemical Formula 3 or Chemical Formula 4 having a favorable hole transfer ability and the compound of Chemical Formula 1 having a favorable electron transfer ability occurs, which is capable of lowering a driving voltage and resultantly helps with enhancement in efficiency and lifetime.

DESCRIPTION OF DRAWINGS

FIG. 1 to FIG. 3 are diagrams each illustrating a lamination structure of an organic light emitting device according to one embodiment of the present specification.

100: Substrate
200: Anode
300: Organic Material Layer
301: Hole Injection Layer
302: Hole Transfer Layer
303: Light Emitting Layer
304: Hole Blocking Layer
305: Electron Transfer Layer
306: Electron Injection Layer
400: Cathode

MODE FOR DISCLOSURE

Hereinafter, the present specification will be described in more detail.

In the present specification, a certain part "including" certain constituents means capable of further including other constituents, and does not exclude other constituents unless particularly stated on the contrary.

In the present specification, $T_1$ energy means an energy level value in a triplet state.

In the present specification, * of a structural formula means a bonding position.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, "substituted or unsubstituted" means being substituted with one or more substituents selected from the group consisting of deuterium; a halogen group; a cyano group; C1 to C60 linear or branched alkyl; C2 to C60 linear or branched alkenyl; C2 to C60 linear or branched alkynyl; C3 to C60 monocyclic or polycyclic cycloalkyl; C2 to C60 monocyclic or polycyclic heterocycloalkyl; C6 to C60 monocyclic or polycyclic aryl; C2 to C60 monocyclic or polycyclic heteroaryl; -SiRR'R"; —P(═O)RR'; C1 to C20 alkylamine; C6 to C60 monocyclic or polycyclic arylamine; and C2 to C60 monocyclic or polycyclic heteroarylamine, or being unsubstituted, or being substituted with a substituent linking two or more substituents selected from among the substituents illustrated above, or being unsubstituted. R, R' and R" are the same as or different from each other, and each independently hydrogen; deuterium; a cyano group; a substituted or unsubstituted alkyl group; a substituted or unsubstituted cycloalkyl group; a substituted or unsubstituted aryl group; or a substituted or unsubstituted heteroaryl group.

In the present specification, a "case of a substituent being not indicated in a chemical formula or compound structure" means that a hydrogen atom bonds to a carbon atom. However, since deuterium ($^2H$) is an isotope of hydrogen, some hydrogen atoms may be deuterium.

In one embodiment of the present application, a "case of a substituent being not indicated in a chemical formula or compound structure" may mean that positions that may come as a substituent may all be hydrogen or deuterium. In other words, since deuterium is an isotope of hydrogen, some hydrogen atoms may be deuterium that is an isotope, and herein, a content of the deuterium may be from 0% to 100%.

In one embodiment of the present application, in a "case of a substituent being not indicated in a chemical formula or compound structure", hydrogen and deuterium may be mixed in the compound when deuterium is not explicitly excluded such as a deuterium content being 0%, a hydrogen content being 100%, or substituents being all hydrogen.

In one embodiment of the present application, deuterium is one of isotopes of hydrogen, is an element having deuteron formed with one proton and one neutron as a nucleus, and may be expressed as hydrogen-2, and the elemental symbol may also be written as D or $^2H$.

In one embodiment of the present application, an isotope means an atom with the same atomic number (Z) but with a different mass number (A), and may also be interpreted as an element with the same number of protons but with a different number of neutrons.

In one embodiment of the present application, a meaning of a content T % of a specific substituent may be defined as T2/T1×100=T % when the total number of substituents that a basic compound may have is defined as T1, and the number of specific substituents among these is defined as T2.

In other words, in one example, having a deuterium content of 20% in a phenyl group represented by

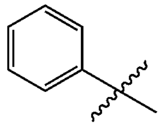 [SMILES: *c1ccccc1]

means that the total number of substituents that the phenyl group may have is 5 (T1 in the formula), and the number of deuterium among these is 1 (T2 in the formula). In other words, having a deuterium content of 20% in a phenyl group may be represented by the following structural formulae.

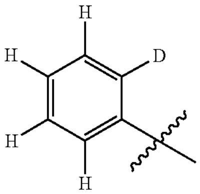

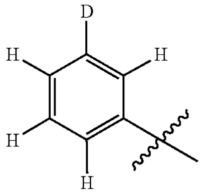

-continued

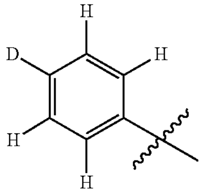

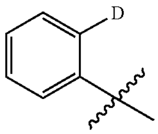

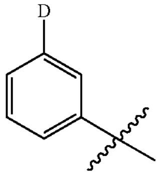

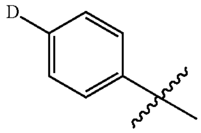

In addition, in one embodiment of the present application, "a phenyl group having a deuterium content of 0%" may mean a phenyl group that does not include a deuterium atom, that is, a phenyl group that has 5 hydrogen atoms.

In the present specification, the halogen may be fluorine, chlorine, bromine or iodine.

In the present specification, the alkyl group includes linear or branched having 1 to 60 carbon atoms, and may be further substituted with other substituents. The number of carbon atoms of the alkyl group may be from 1 to 60, specifically from 1 to 40 and more specifically from 1 to 20. Specific examples thereof may include a methyl group, an ethyl group, a propyl group, an n-propyl group, an isopropyl group, a butyl group, an n-butyl group, an isobutyl group, a tert-butyl group, a sec-butyl group, a 1-methyl-butyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group and the like, but are not limited thereto.

In the present specification, the alkenyl group includes linear or branched having 2 to 60 carbon atoms, and may be further substituted with other substituents. The number of carbon atoms of the alkenyl group may be from 2 to 60, specifically from 2 to 40 and more specifically from 2 to 20. Specific examples thereof may include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group and the like, but are not limited thereto.

In the present specification, the alkynyl group includes linear or branched having 2 to 60 carbon atoms, and may be further substituted with other substituents. The number of carbon atoms of the alkynyl group may be from 2 to 60, specifically from 2 to 40 and more specifically from 2 to 20.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the cycloalkyl group includes monocyclic or polycyclic having 3 to 60 carbon atoms, and may be further substituted with other substituents. Herein, the polycyclic means a group in which the cycloalkyl group is directly linked to or fused with other cyclic groups. Herein, the other cyclic groups may be a cycloalkyl group, but may also be different types of cyclic groups such as a heterocycloalkyl group, an aryl group and a heteroaryl group. The number of carbon groups of the cycloalkyl group may be from 3 to 60, specifically from 3 to 40 and more specifically from 5 to 20. Specific examples thereof may include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the heterocycloalkyl group includes O, S, Se, N or Si as a heteroatom, includes monocyclic or polycyclic having 2 to 60 carbon atoms, and may be further substituted with other substituents. Herein, the polycyclic means a group in which the heterocycloalkyl group is directly linked to or fused with other cyclic groups. Herein, the other cyclic groups may be a heterocycloalkyl group, but may also be different types of cyclic groups such as a cycloalkyl group, an aryl group and a heteroaryl group. The number of carbon atoms of the heterocycloalkyl group may be from 2 to 60, specifically from 2 to 40 and more specifically from 3 to 20.

In the present specification, the aryl group includes monocyclic or polycyclic having 6 to 60 carbon atoms, and may be further substituted with other substituents. Herein, the polycyclic means a group in which the aryl group is directly linked to or fused with other cyclic groups. Herein, the other cyclic groups may be an aryl group, but may also be different types of cyclic groups such as a cycloalkyl group, a heterocycloalkyl group and a heteroaryl group. The aryl group includes a spiro group. The number of carbon atoms of the aryl group may be from 6 to 60, specifically from 6 to 40 and more specifically from 6 to 25. Specific examples of the aryl group may include a phenyl group, a biphenyl group, a triphenyl group, a naphthyl group, an anthryl group, a chrysenyl group, a phenanthrenyl group, a perylenyl group, a fluoranthenyl group, a triphenylenyl group, a phenalenyl group, a pyrenyl group, a tetracenyl group, a pentacenyl group, a fluorenyl group, an indenyl group, an acenaphthylenyl group, a benzofluorenyl group, a spirobifluorenyl group, a 2,3-dihydro-1H-indenyl group, a fused ring group thereof, and the like, but are not limited thereto.

In the present specification, the fluorenyl group may be substituted, and adjacent substituents may bond to each other to form a ring.

When the fluorenyl group is substituted,

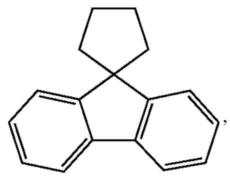,
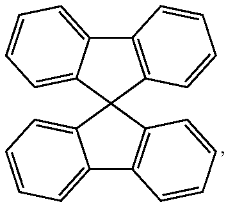,
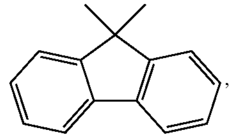,
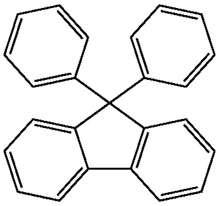,
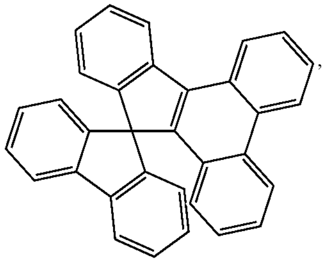,
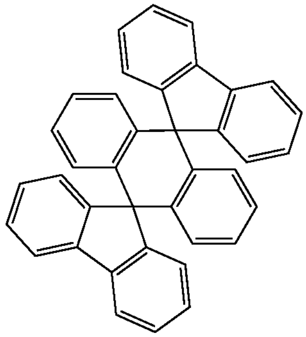

and the like may be included, however, the structure is not limited thereto.

In the present specification, the heteroaryl group includes S, O, Se, N or Si as a heteroatom, includes monocyclic or polycyclic having 2 to 60 carbon atoms, and may be further substituted with other substituents. Herein, the polycyclic means a group in which the heteroaryl group is directly linked to or fused with other cyclic groups. Herein, the other cyclic groups may be a heteroaryl group, but may also be different types of cyclic groups such as a cycloalkyl group, a heterocycloalkyl group and an aryl group. The number of carbon atoms of the heteroaryl group may be from 2 to 60, specifically from 2 to 40 and more specifically from 3 to 25. Specific examples of the heteroaryl group may include a pyridyl group, a pyrrolyl group, a pyrimidyl group, a pyridazinyl group, a furanyl group, a thiophene group, an imidazolyl group, a pyrazolyl group, an oxazolyl group, an isoxazolyl group, a thiazolyl group, an isothiazolyl group, a triazolyl group, a furazanyl group, an oxadiazolyl group, a thiadiazolyl group, a dithiazolyl group, a tetrazolyl group, a pyranyl group, a thiopyranyl group, a diazinyl group, an oxazinyl group, a thiazinyl group, a dioxynyl group, a triazinyl group, a tetrazinyl group, a quinolyl group, an isoquinolyl group, a quinazolinyl group, an isoquinazolinyl group, a qninozolinyl group, a naphthyridyl group, an acridinyl group, a phenanthridinyl group, an imidazopyridinyl group, a diazanaphthalenyl group, a triazaindene group, an indolyl group, an indolizinyl group, a benzothiazolyl group, a benzoxazolyl group, a benzimidazolyl group, a benzothiophene group, a benzofuran group, a dibenzothiophene group, a dibenzofuran group, a carbazolyl group, a benzocarbazolyl group, a dibenzocarbazolyl group, a phenazinyl group, a dibenzosilole group, spirobi(dibenzosilole), a dihydrophenazinyl group, a phenoxazinyl group, a phenanthridyl group, an imidazopyridinyl group, a thienyl group, an indolo[2,3-a]carbazolyl group, an indolo[2,3-b]carbazolyl group, an indolinyl group, a 10,11-dihydro-dibenzo[b,f]azepine group, a 9,10-dihydroacridinyl group, a phenanthrazinyl group, a phenothiathiazinyl group, a phthalazinyl group, a naphthylidinyl group, a phenanthrolinyl group, a benzo[c][1,2,5]thiadiazolyl group, a 2,3-dihydrobenzo[b]thiophene group, a 2,3-dihydrobenzofuran group, a 5,10-dihydrobenzo[b,e] [1,4]azasilinyl group, a pyrazolo[1,5-c]quinazolinyl group, a pyrido[1,2-b]indazolyl group, a pyrido[1,2-a]imidazo[1,2-e]indolinyl group, a 5,11-dihydroindeno[1,2-b]carbazolyl group and the like, but are not limited thereto.

In the present specification, the phosphine oxide group is represented by —P(═O) (R101) (R102), and R101 and R102 are the same as or different from each other and may be each independently a substituent formed with at least one of hydrogen; deuterium; a halogen group; an alkyl group; an alkenyl group; an alkoxy group; a cycloalkyl group; an aryl group; and a heteroaryl group. The phosphine oxide group may specifically be substituted with an aryl group, and as the aryl group, the examples described above may be applied. Examples of the phosphine oxide group may include a dimethylphosphine oxide group, a diphenylphosphine oxide group, a dinaphthylphosphine oxide group and the like, but are not limited thereto.

In the present specification, the amine group is represented by —N(R103) (R104), and R103 and R104 are the same as or different from each other and may be each independently a substituent formed with at least one of hydrogen; deuterium; a halogen group; an alkyl group; an alkenyl group; an alkoxy group; a cycloalkyl group; an aryl group; and a heteroaryl group. The amine group may be selected from the group consisting of $—NH_2$; a monoalkylamine group; a monoarylamine group; a monoheteroarylamine group; a dialkylamine group; a diarylamine group; a diheteroarylamine group; an alkylarylamine group; an alkylheteroarylamine group; and an arylheteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, a dibiphenylamine group, an anthracenylamine group, a 9-methyl-anthracenylamine group, a diphenylamine group, a phenylnaphthylamine group, a ditolylamine group, a phenyltolylamine group, a triphenylamine group, a biphenylnaphthylamine group, a phenylbiphenylamine group, a biphenylfluorenylamine group, a phenyltriphenylenylamine group, a biphenyltriphenylenylamine group and the like, but are not limited thereto.

In the present specification, the arylene group and the heteroarylene group are respectively a divalent aryl group and a divalent heteroaryl group, and the examples of the aryl group and the heteroaryl group described above may be applied.

In the present specification, the "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

The ring that adjacent groups may form may include an aliphatic hydrocarbon ring, an aromatic hydrocarbon ring, an aliphatic heteroring and an aromatic heteroring, and as the aliphatic hydrocarbon ring, the aromatic hydrocarbon ring, the aliphatic heteroring and the aromatic heteroring, the structures illustrated as the cycloalkyl group, the aryl group, the heterocycloalkyl group and the heteroaryl group described above may be applied except for those that are not a monovalent group.

An organic light emitting device according to one embodiment of the present specification includes an organic material layer including Compound (A) and Compound (B).

Compound (A) is represented by Chemical Formula 1, and, by introducing a naphthobenzofuran, naphthobenzothiophene or benzocarbazole structure between an electron accepting substituent (N-Het) containing N and an electron donating substituent (Ar), has a proper band gap (2.7 eV to 3.3 eV) suitable for an application as a host, and has a structure inducing a decrease in $T_1$ energy resulting from an expansion of conjugation and an expansion of molecular structure planarity. The $T_1$ energy value reduced as above is found to be between 2.18 eV to 2.48 eV from a measurement result, and since this value is between $T_1$ energy (2.0 eV to 2.10 eV) of a red dopant and $T_1$ energy (2.5 eV to 2.7 eV) of a host adjacent layer (electron blocking layer, hole transfer layer) generally used, and therefore, energy may be efficiently transferred to a dopant. In addition, the increase in the molecular structure planarity is important in lowering a driving voltage since it increases a degree of overlap between molecules and thereby facilitates electron inflow and transfer.

In one embodiment of the present specification, L may be a direct bond; a substituted or unsubstituted arylene group having 6 to 60 carbon atoms; or a substituted or unsubstituted heteroarylene group having 2 to 60 carbon atoms.

In one embodiment of the present specification, L may be a direct bond; a substituted or unsubstituted arylene group having 6 to 40 carbon atoms; or a substituted or unsubstituted heteroarylene group having 2 to 40 carbon atoms.

In one embodiment of the present specification, L may be a direct bond; a substituted or unsubstituted arylene group having 6 to 30 carbon atoms; or a substituted or unsubstituted heteroarylene group having 2 to 30 carbon atoms.

In one embodiment of the present specification, L may be a direct bond; or a substituted or unsubstituted arylene group having 6 to 30 carbon atoms.

In one embodiment of the present specification, L may be a direct bond; a phenylene group; a biphenylene group; or a divalent naphthyl group.

In one embodiment of the present specification, Ar is a substituted or unsubstituted aryl group having 6 to 60 carbon atoms; a substituted or unsubstituted heteroaryl group having 2 to 60 carbon atoms; or a substituted or unsubstituted amine group.

In one embodiment of the present specification, Ar is a substituted or unsubstituted aryl group having 6 to 40 carbon atoms; a substituted or unsubstituted heteroaryl group having 2 to 40 carbon atoms; or a substituted or unsubstituted amine group.

In one embodiment of the present specification, Ar is a substituted or unsubstituted aryl group having 6 to 30 carbon atoms; a substituted or unsubstituted heteroaryl group having 2 to 30 carbon atoms; or a substituted or unsubstituted amine group.

In one embodiment of the present specification, Ar is a substituted or unsubstituted aryl group having 6 to 30 carbon atoms; or a substituted or unsubstituted heteroaryl group having 2 to 30 carbon atoms.

In one embodiment of the present specification, Ar may be a substituted or unsubstituted phenyl group; a substituted or unsubstituted biphenyl group; a substituted or unsubstituted terphenyl group; a substituted or unsubstituted naphthyl group; a substituted or unsubstituted fluorenyl group; a substituted or unsubstituted dibenzofuran group; or a substituted or unsubstituted dibenzothiophene group.

In one embodiment of the present specification, Ar may be a phenyl group unsubstituted or substituted with an aryl group; a biphenyl group; a terphenyl group; a naphthyl group unsubstituted or substituted with an aryl group; a fluorenyl group unsubstituted or substituted with an alkyl group or a phenyl group; a dibenzofuran group; or a dibenzothiophene group.

In one embodiment of the present specification, N-Het is a monocyclic or polycyclic heteroaryl group having 2 to 60 carbon atoms substituted or unsubstituted, and including one or more Ns.

In one embodiment of the present specification, N-Het may be selected from among the following structural formulae.

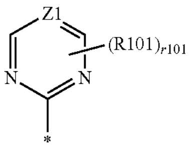

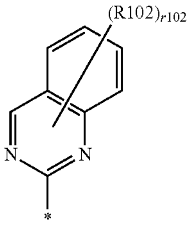

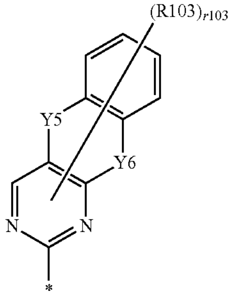

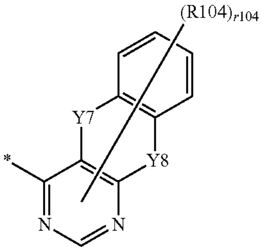

In the structural formulae,

Y5 to Y8 are the same as or different from each other, and are each a direct bond; O; S; or N(R105), Z1 is N or C(R106), R101 to R104 and R106 are each independently selected from the group consisting of hydrogen; deuterium; a halogen group; a cyano group; a substituted or unsubstituted alkyl group having 1 to 60 carbon atoms; a substituted or unsubstituted alkenyl group having 2 to 60 carbon atoms; a substituted or unsubstituted alkynyl group having 2 to 60 carbon atoms; a substituted or unsubstituted alkoxy group having 1 to 60 carbon atoms; a substituted or unsubstituted cycloalkyl group having 3 to 60 carbon atoms; a substituted or unsubstituted heterocycloalkyl group having 2 to 60 carbon atoms; a substituted or unsubstituted aryl group having 6 to 60 carbon atoms; a substituted or unsubstituted heteroaryl group having 2 to 60 carbon atoms; a substituted or unsubstituted phosphine oxide group; and a substituted or unsubstituted amine group, or two or more groups adjacent to each other bond to each other to form a substituted or unsubstituted aliphatic hydrocarbon ring, a substituted or unsubstituted aromatic hydrocarbon ring, a substituted or unsubstituted aliphatic heteroring, or a substituted or unsubstituted aromatic heteroring, R105 is a substituted or unsubstituted aryl group having 6 to 60 carbon atoms, r101 is 1 or 2, r102 to r104 are each an integer of 1 to 5, and when r101 is 2 and r102 to r104 are 2 or greater, substituents in the parentheses are the same as or different from each other.

In one embodiment of the present specification, R101 to R104 are each independently selected from the group consisting of hydrogen; deuterium; a substituted or unsubstituted aryl group having 6 to 60 carbon atoms; and a substituted or unsubstituted heteroaryl group having 2 to 60 carbon atoms, or two or more groups adjacent to each other may bond to each other to form a substituted or unsubstituted aliphatic hydrocarbon ring, a substituted or unsubstituted aromatic hydrocarbon ring, a substituted or unsubstituted aliphatic heteroring, or a substituted or unsubstituted aromatic heteroring.

In one embodiment of the present specification, R101 to R104 are each independently selected from the group consisting of hydrogen; deuterium; a substituted or unsubstituted aryl group having 6 to 40 carbon atoms; and a substituted or unsubstituted heteroaryl group having 2 to 40 carbon atoms, or two or more groups adjacent to each other may bond to each other to form a substituted or unsubstituted aliphatic hydrocarbon ring, a substituted or unsubstituted aromatic hydrocarbon ring, a substituted or unsubstituted aliphatic heteroring, or a substituted or unsubstituted aromatic heteroring.

In one embodiment of the present specification, R101 to R104 are each independently selected from the group consisting of hydrogen; deuterium; a substituted or unsubstituted aryl group having 6 to 20 carbon atoms; and a substituted or unsubstituted heteroaryl group having 2 to 20 carbon atoms, or two or more groups adjacent to each other may bond to each other to form a substituted or unsubstituted aliphatic hydrocarbon ring, a substituted or unsubstituted aromatic hydrocarbon ring, a substituted or unsubstituted aliphatic heteroring, or a substituted or unsubstituted aromatic heteroring.

In one embodiment of the present specification, R101 to R104 are each independently selected from the group consisting of hydrogen; deuterium; a substituted or unsubstituted phenyl group; a substituted or unsubstituted biphenyl group; a substituted or unsubstituted terphenyl group; a substituted or unsubstituted naphthyl group; a substituted or unsubstituted dibenzofuran group; a substituted or unsubstituted dibenzothiophene group; a substituted or unsubstituted carbazole group; a substituted or unsubstituted benzocarbazole group; and a substituted or unsubstituted fluorene group, or two or more groups adjacent to each other may bond to each other to form a substituted or unsubstituted aliphatic hydrocarbon ring, a substituted or unsubstituted aromatic hydrocarbon ring, a substituted or unsubstituted aliphatic heteroring, or a substituted or unsubstituted aromatic heteroring.

In one embodiment of the present specification, R101 to R104 are each independently selected from the group consisting of hydrogen; deuterium; a phenyl group unsubstituted or substituted with an aryl group or a heteroaryl group; a biphenyl group; a naphthyl group unsubstituted or substituted with an aryl group; a dibenzofuran group; a dibenzothiophene group; a carbazole group unsubstituted or substituted with an aryl group; a benzocarbazole group; a dimethylfluorene group; a diphenylfluorene group; and 9,9'-spirobi[fluorene], or two or more groups adjacent to each other may bond to each other to form a substituted or unsubstituted aliphatic hydrocarbon ring, a substituted or unsubstituted aromatic hydrocarbon ring, a substituted or unsubstituted aliphatic heteroring, or a substituted or unsubstituted aromatic heteroring.

In one embodiment of the present specification, R101 to R104 may be each independently selected from the group consisting of hydrogen; deuterium; a substituted or unsubstituted aryl group having 6 to 60 carbon atoms; and a substituted or unsubstituted heteroaryl group having 2 to 60 carbon atoms.

In one embodiment of the present specification, R101 to R104 may be each independently selected from the group consisting of hydrogen; deuterium; a substituted or unsubstituted aryl group having 6 to 30 carbon atoms; and a substituted or unsubstituted heteroaryl group having 2 to 30 carbon atoms.

In one embodiment of the present specification, R101 to R104 may be each independently selected from the group consisting of hydrogen; deuterium; a substituted or unsubstituted phenyl group; a substituted or unsubstituted biphenyl group; a substituted or unsubstituted terphenyl group; a substituted or unsubstituted naphthyl group; a substituted or unsubstituted fluorenyl group; a substituted or unsubstituted carbazole group; a substituted or unsubstituted dibenzofuran group; and a substituted or unsubstituted dibenzothiophene group.

In one embodiment of the present specification, R101 to R104 may be each independently selected from the group consisting of hydrogen; deuterium; a phenyl group unsubstituted or substituted with an aryl group or a heteroaryl group; a biphenyl group; a terphenyl group; a naphthyl group unsubstituted or substituted with an aryl group; a fluorenyl group unsubstituted or substituted with an alkyl group or an aryl group; 9,9'-spirobi[fluorene]; a carbazole group unsubstituted or substituted with an aryl group; a dibenzofuran group; and a dibenzothiophene group.

In one embodiment of the present specification, the rest of R1 to R10 that is not —N-Het or $-(L)_m$-Ar may be hydrogen; deuterium; or a substituted or unsubstituted aryl group having 6 to 60 carbon atoms.

In one embodiment of the present specification, the rest of R1 to R4 that is not —N-Het or $-(L)_m$-Ar may be hydrogen; deuterium; or a substituted or unsubstituted aryl group having 6 to 60 carbon atoms.

In one embodiment of the present specification, the rest of R1 to R4 that is not —N-Het or $-(L)_m$-Ar may be hydrogen; deuterium; or a substituted or unsubstituted aryl group having 6 to 30 carbon atoms.

In one embodiment of the present specification, the rest of R1 to R4 that is not —N-Het or $-(L)_m$-Ar may be hydrogen; deuterium; a substituted or unsubstituted phenyl group; a substituted or unsubstituted biphenyl group; or a substituted or unsubstituted naphthyl group.

In one embodiment of the present specification, the rest of R1 to R4 that is not —N-Het or $-(L)_m$-Ar may be hydrogen; deuterium; a phenyl group; a biphenyl group; or a naphthyl group.

In one embodiment of the present specification, R5 to R8 may be each independently hydrogen; deuterium; or a substituted or unsubstituted aryl group having 6 to 60 carbon atoms.

In one embodiment of the present specification, R5 to R8 may be hydrogen or deuterium.

In one embodiment of the present specification, R5 to R8 may be hydrogen.

In one embodiment of the present specification, R105 may be a phenyl group; or a naphthyl group.

In one embodiment of the present specification, Chemical Formula 1 may be represented by the following Chemical Formula 1-1.

[Chemical Formula 1-1]

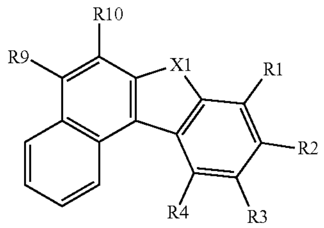

In Chemical Formula 1-1,

X1, R1 to R4, R9 and R10 each have the same definitions as in Chemical Formula 1, any one of R1 to R4 is —N-Het or $-(L)_m$-Ar, i) when any one of R1 to R4 is —N-Het, any one of R9 and R10 is $-(L)_m$-Ar, ii) when any one of R1 to R4 is $-(L)_m$Ar, any one of R9 and R10 is —N-Het, and N-Het, L, Ar and m each have the same definitions as in Chemical Formula 1.

In one embodiment of the present specification, Chemical Formula 1 may be represented by any one of the following compounds, but is not limited thereto.

1-1

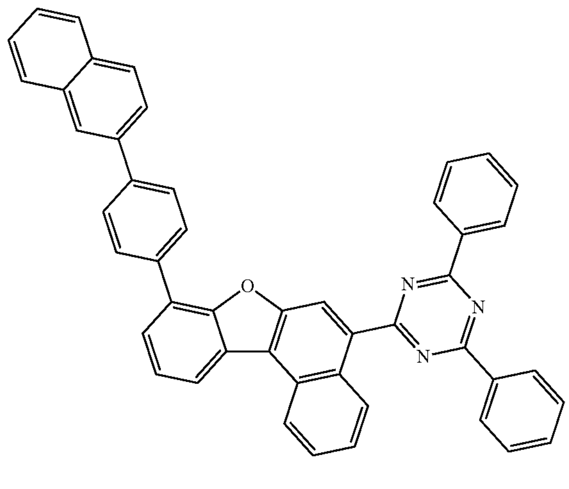

-continued
1-2
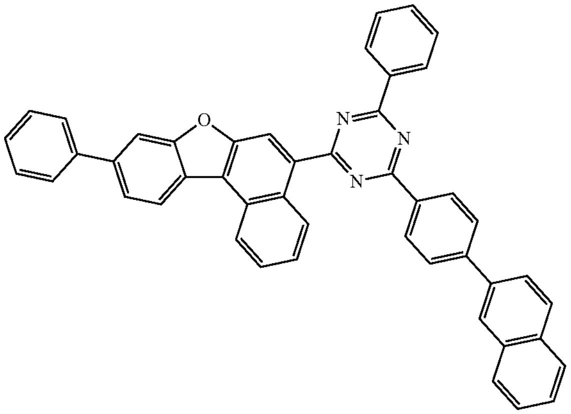
1-3
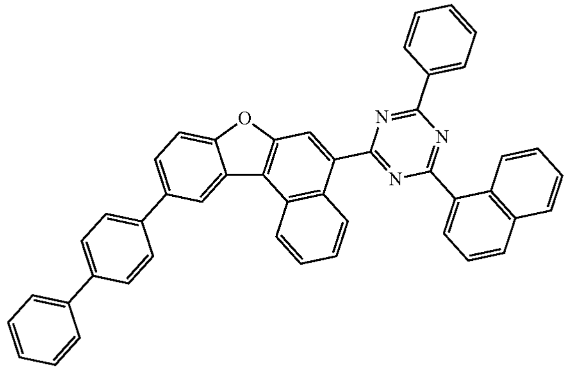
1-4
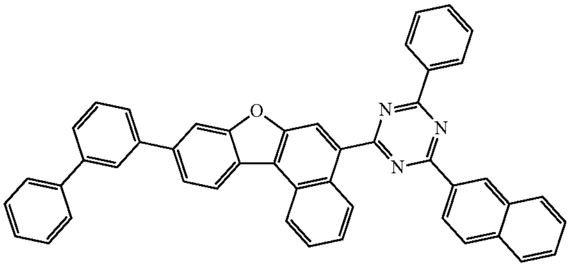
1-5
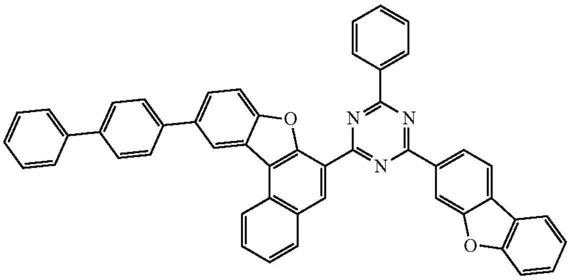
-continued
1-6
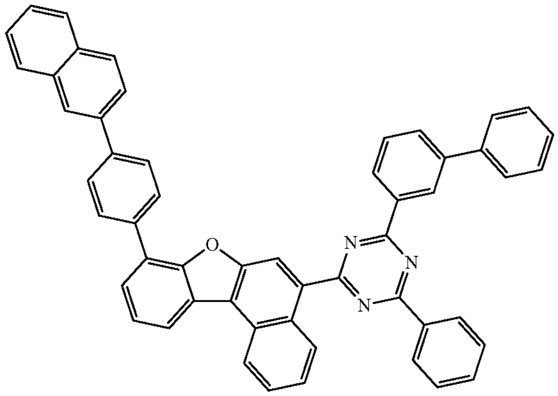
1-7
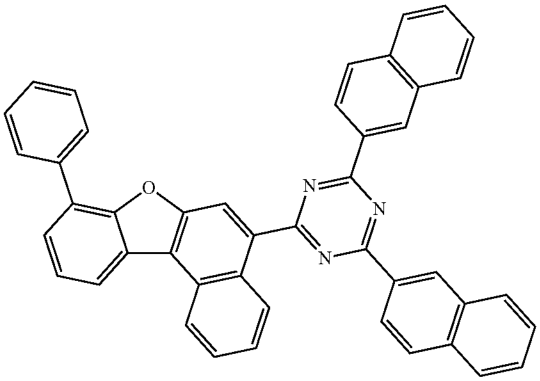
1-8
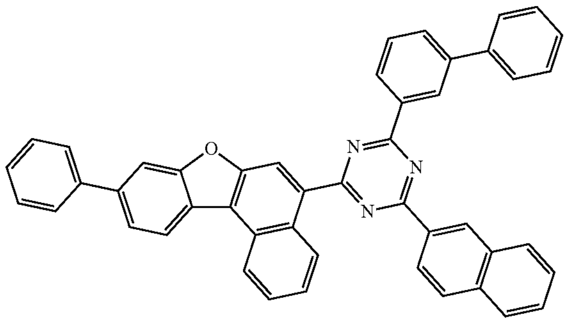
1-9
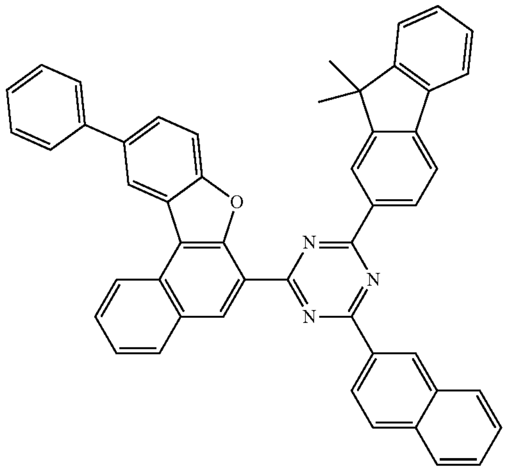

-continued
1-10
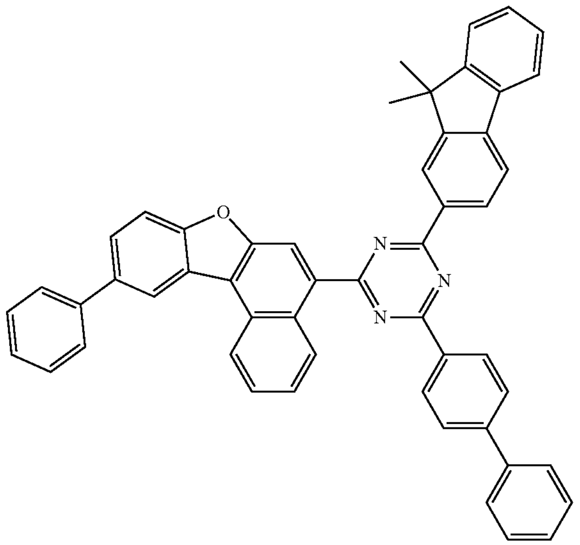
1-11
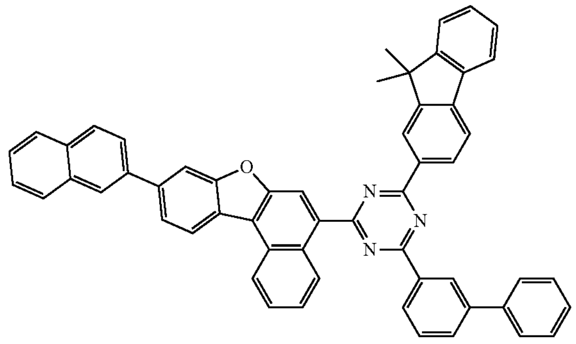
1-12
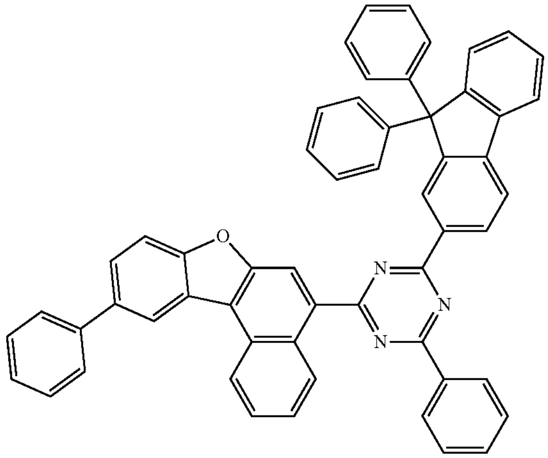
-continued
1-13
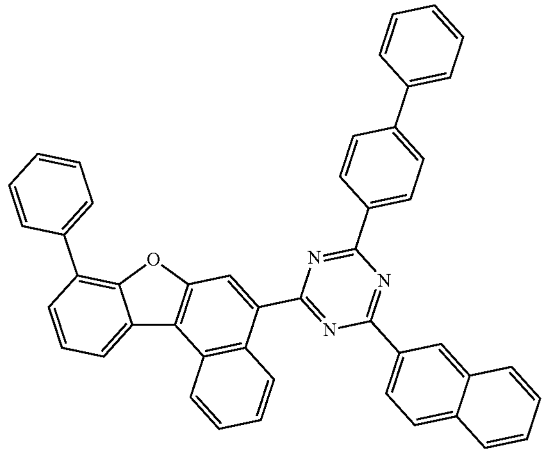
1-14
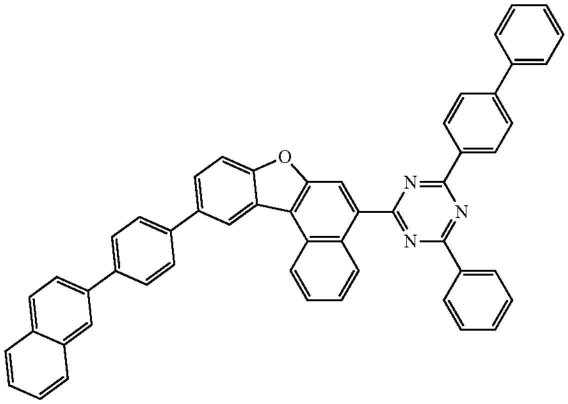
1-15
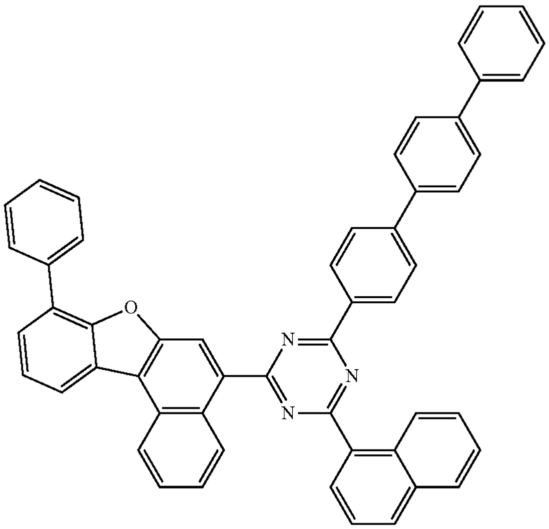

-continued
1-16
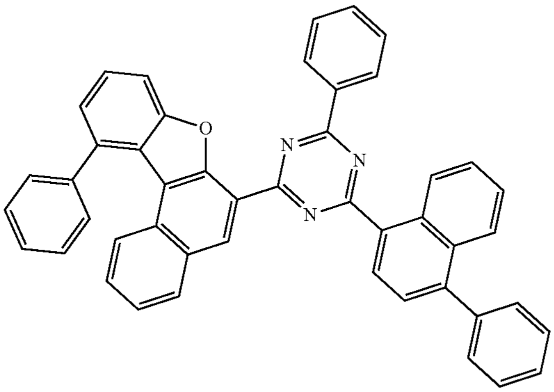
1-17
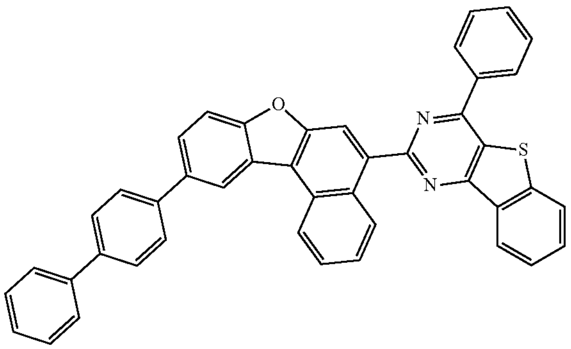
1-18
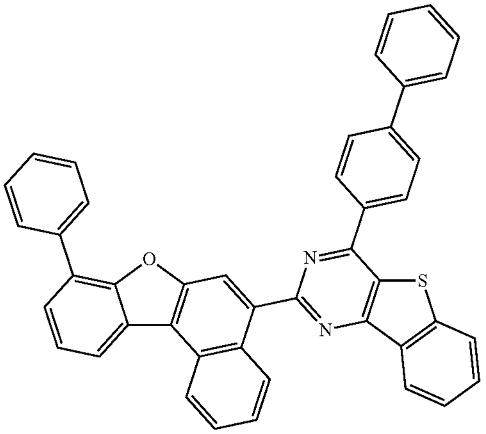
1-19
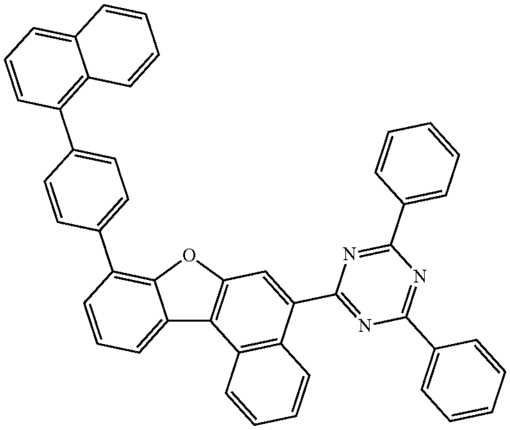
-continued
1-20
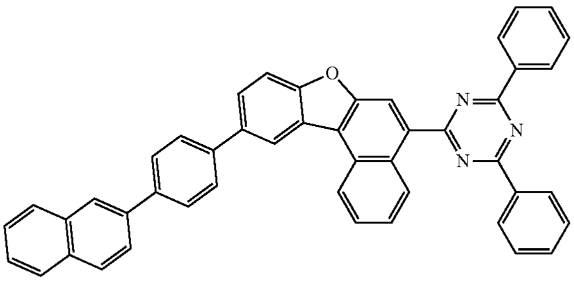
1-21
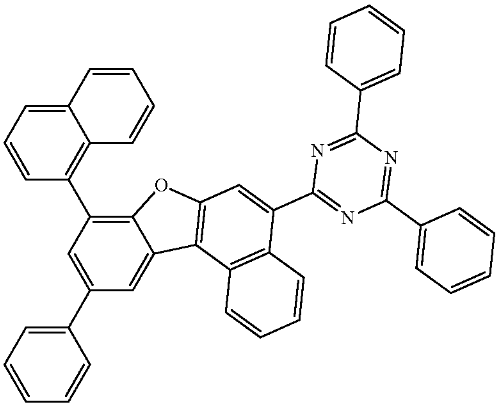
1-22
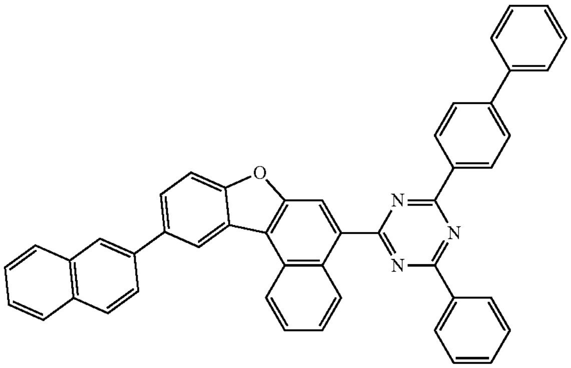
1-23
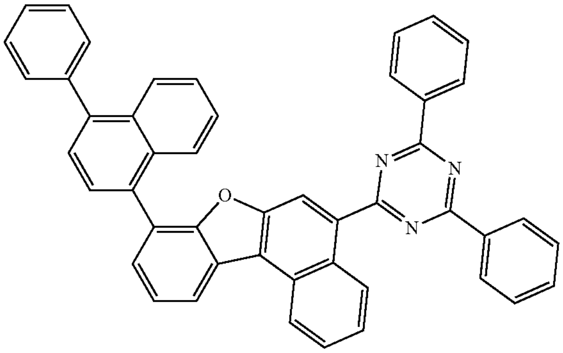

-continued
1-24
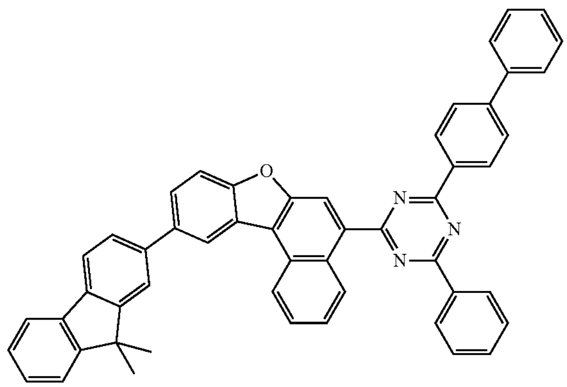
1-25
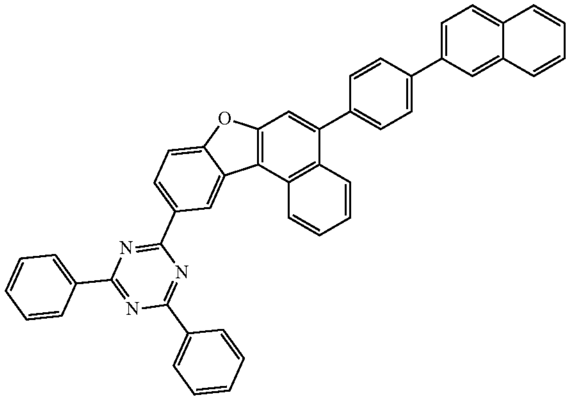
1-26
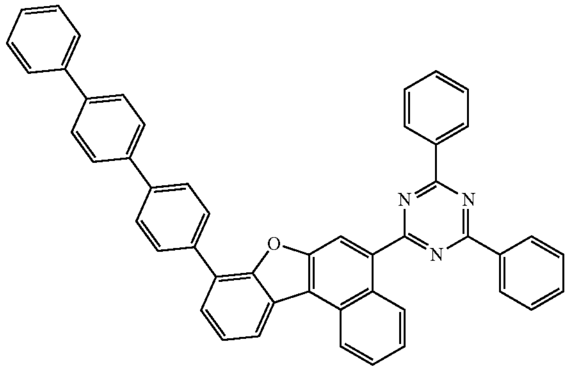
1-27
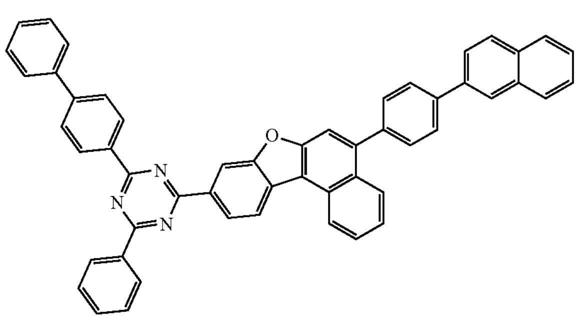
-continued
1-28
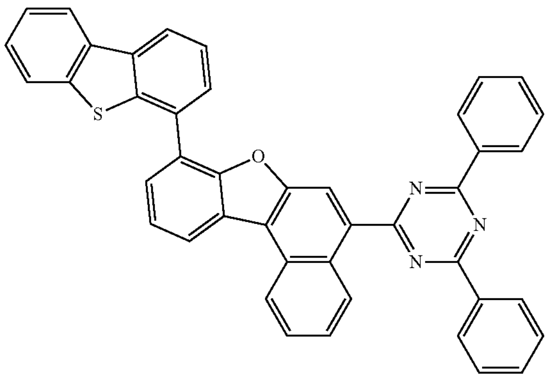
1-29
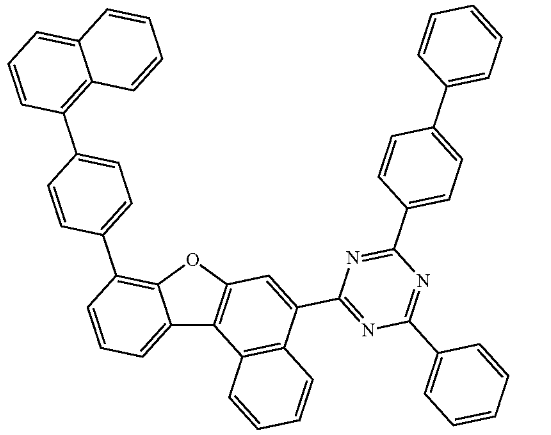
1-30
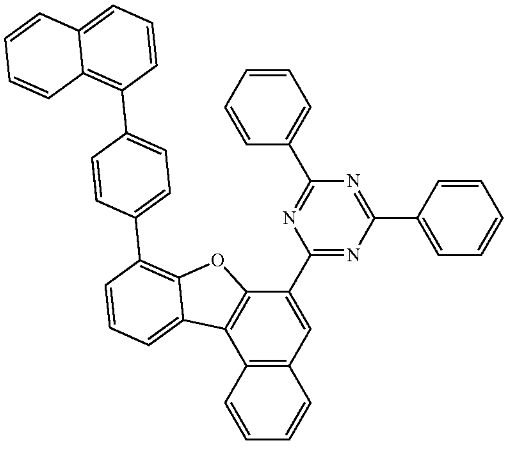

-continued
1-31
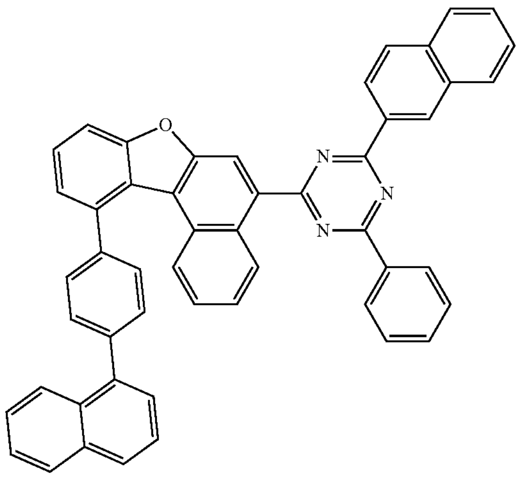
1-32
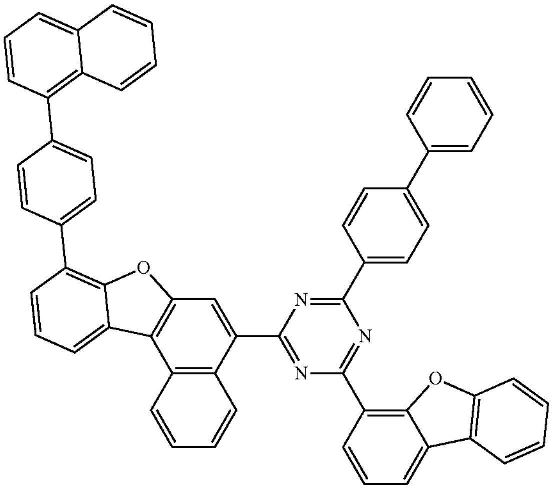
1-33
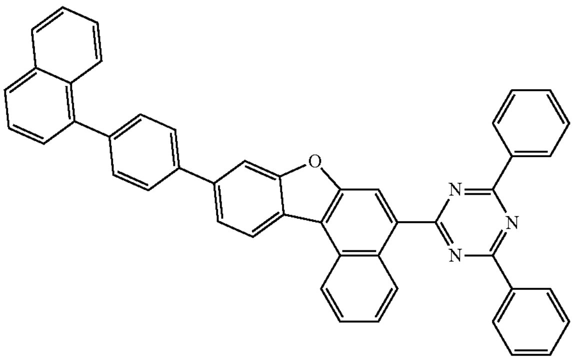
-continued
1-34
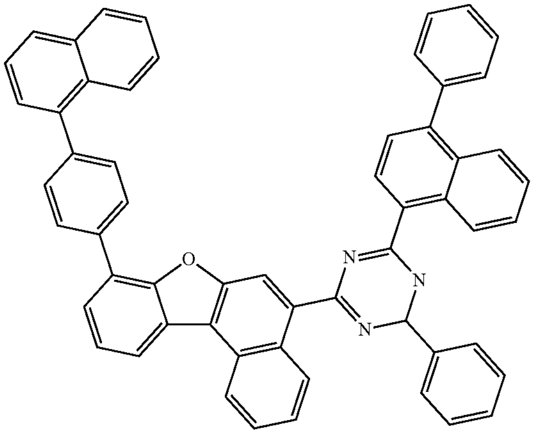
1-35
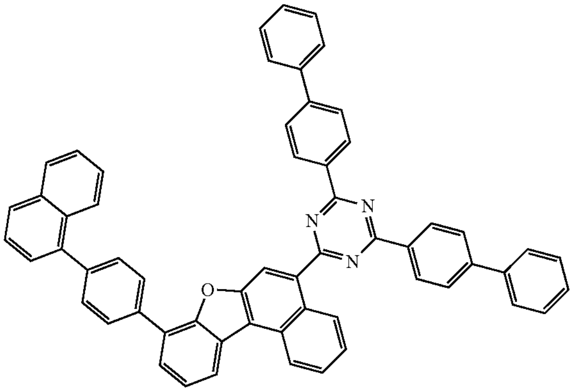
1-36
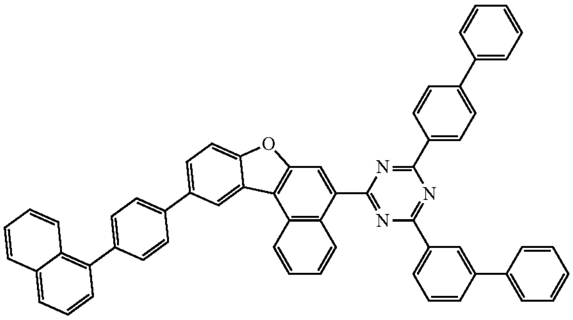
1-37
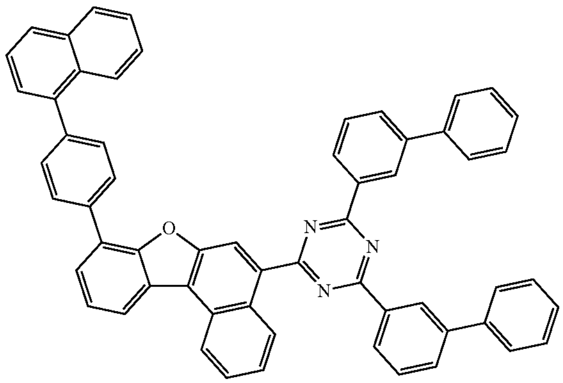

-continued
1-38
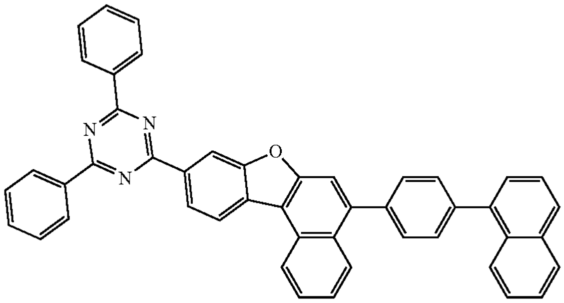
1-39
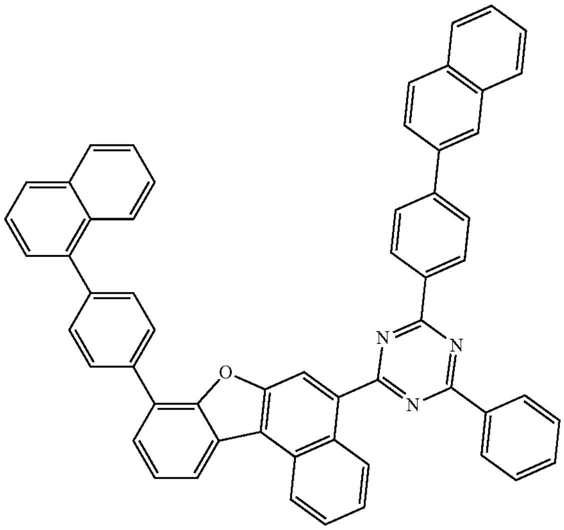
1-40
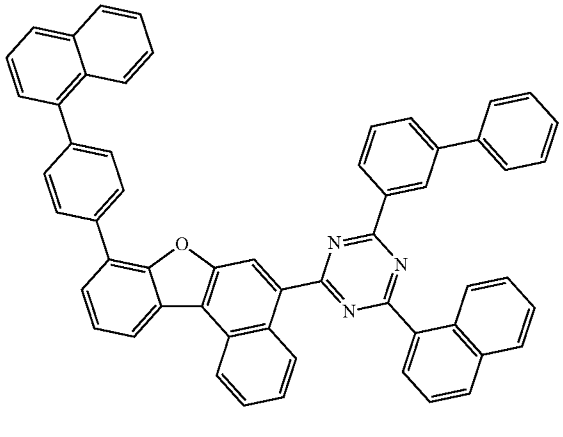
-continued
1-41
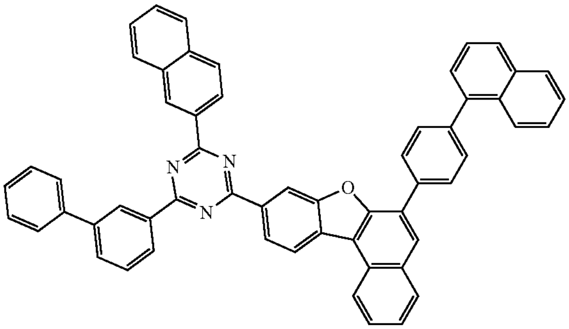
1-42
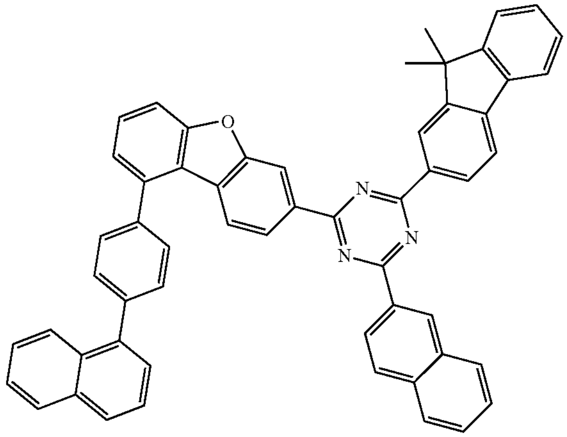
1-43
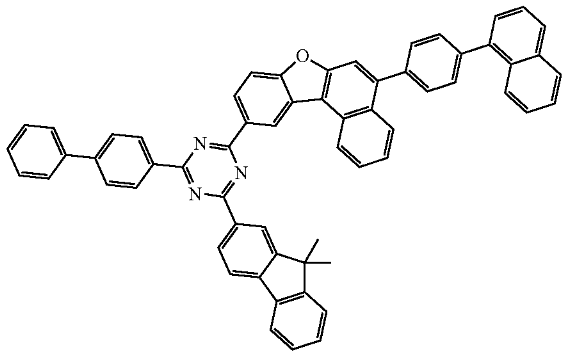

-continued
1-44
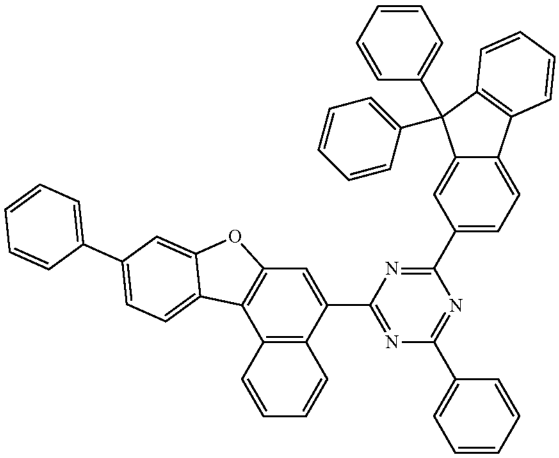
1-45
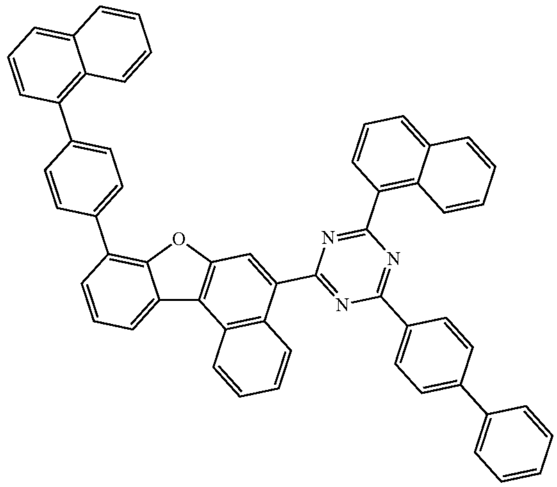
1-46
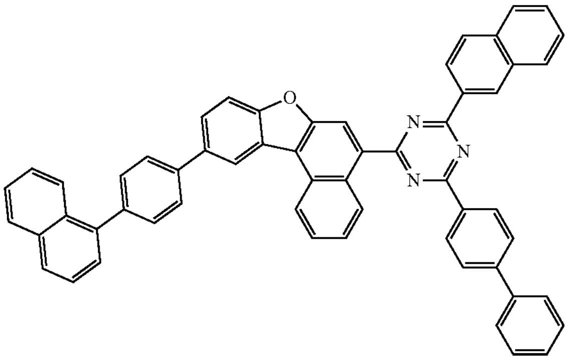
-continued
1-47
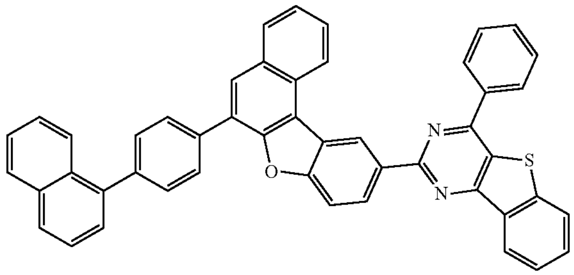
1-48
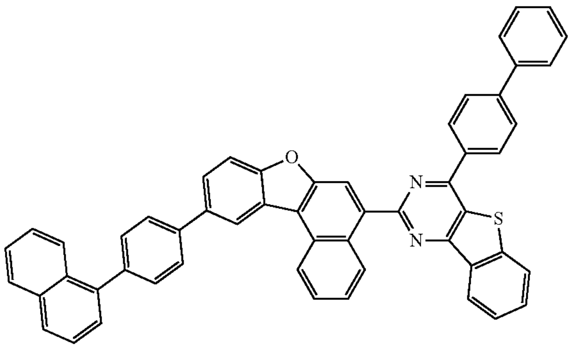
1-49
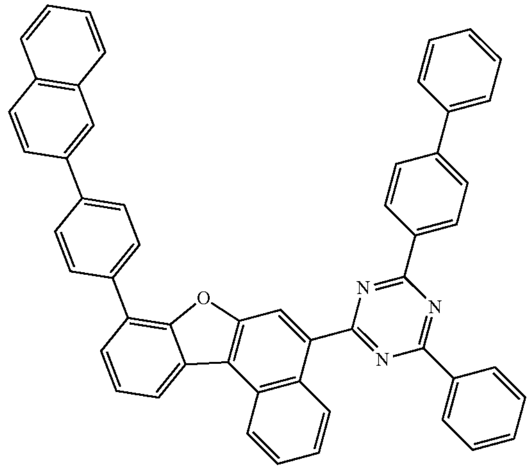
1-50
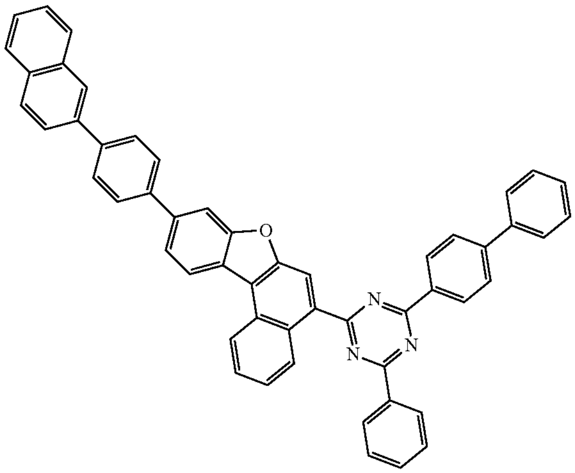

-continued
1-51
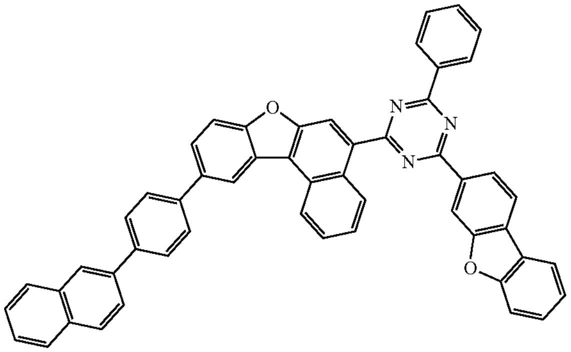
1-52
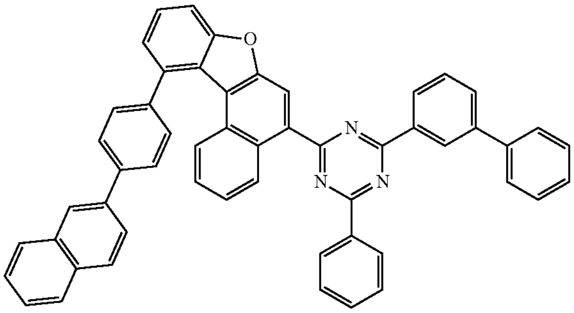
1-53
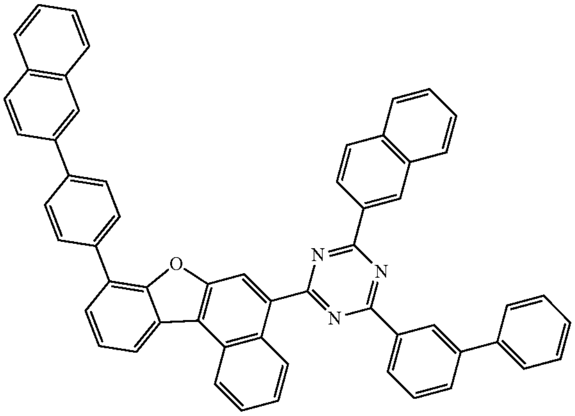
1-54
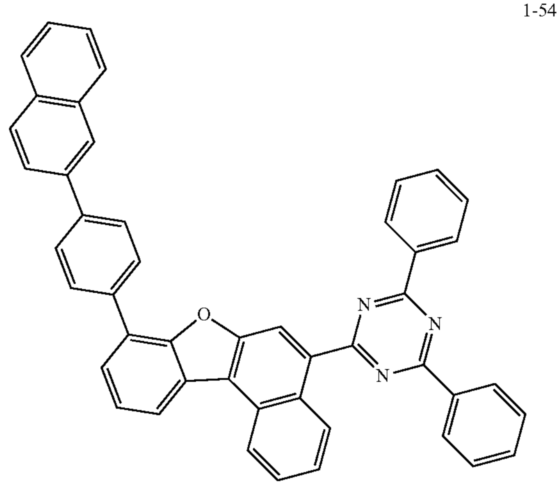
-continued
1-55
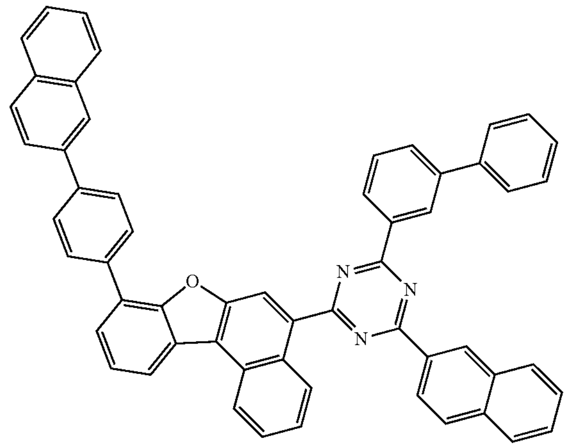
1-56
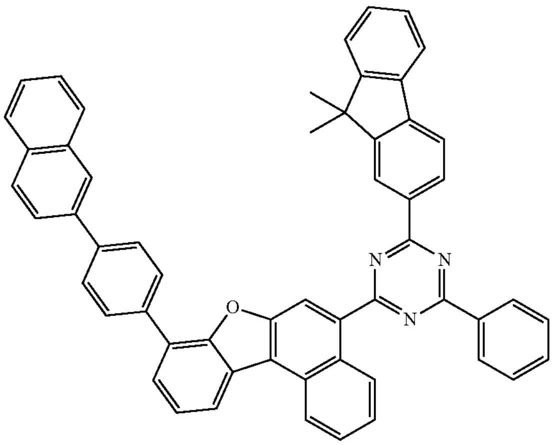
1-57
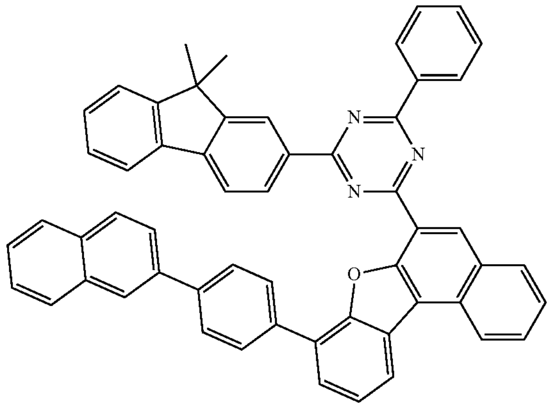

-continued
1-58
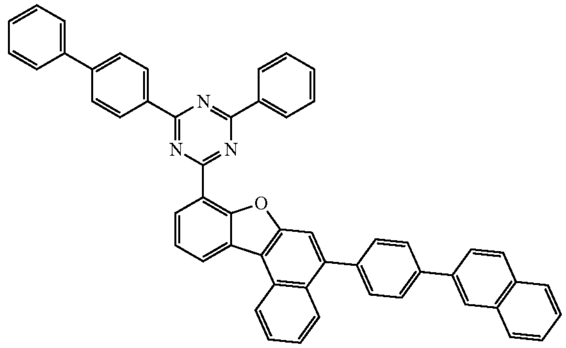
1-59
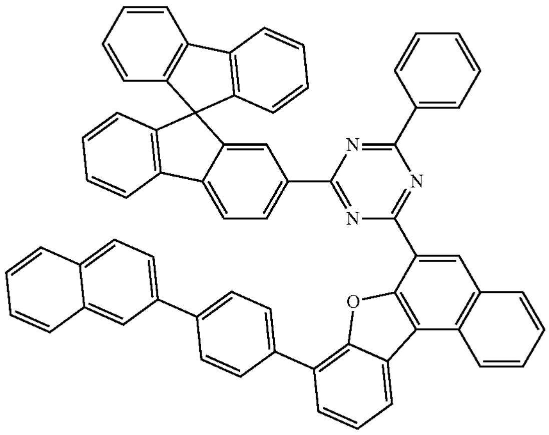
1-60
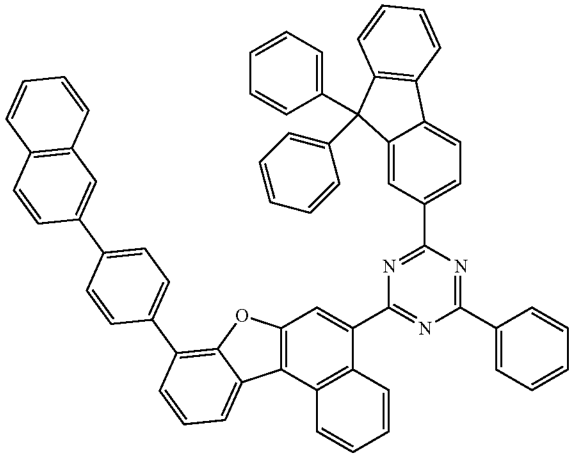
-continued
1-61
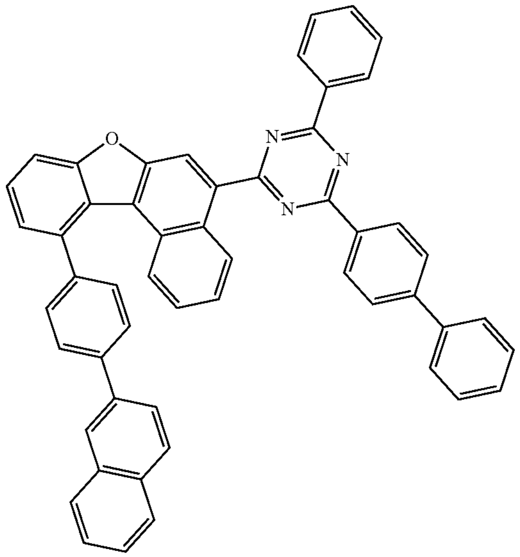
1-62
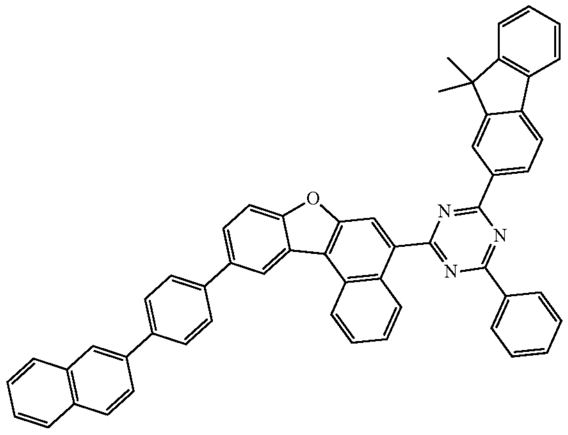
1-63
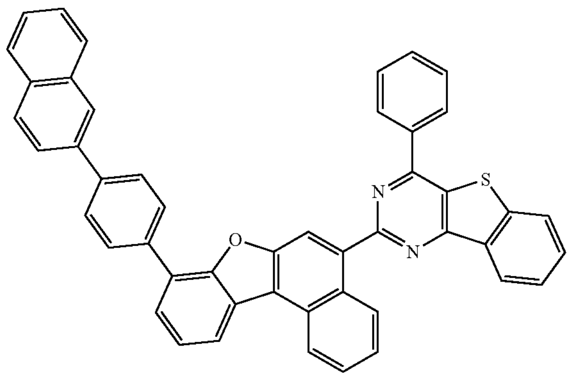

-continued
1-64
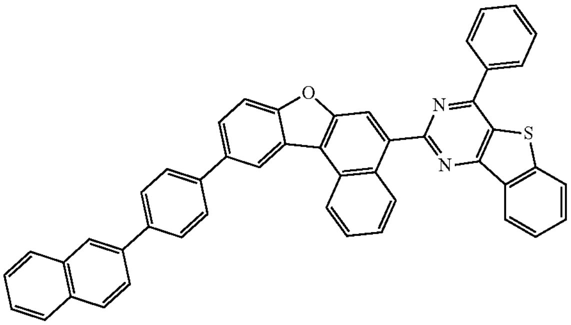
1-65
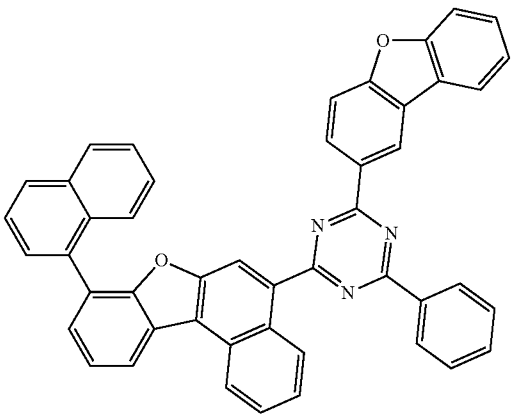
1-66
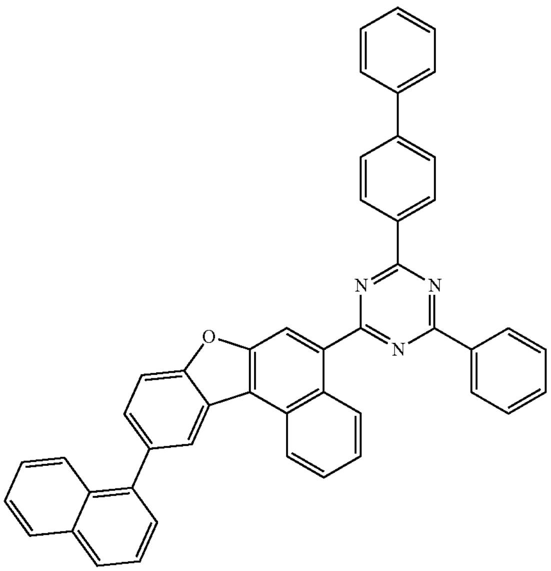
-continued
1-67
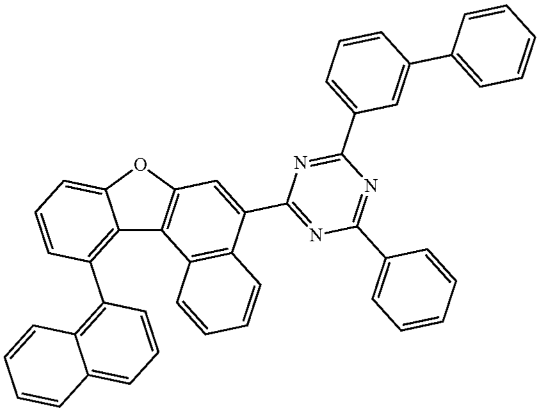
1-68
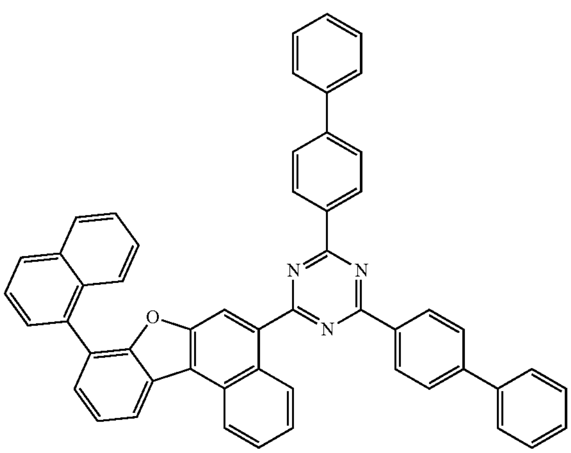
1-69
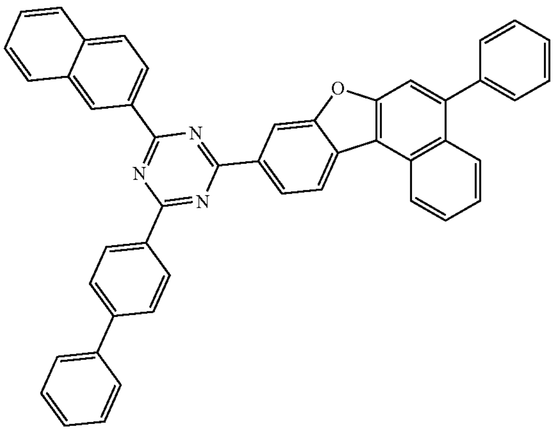

-continued
1-70
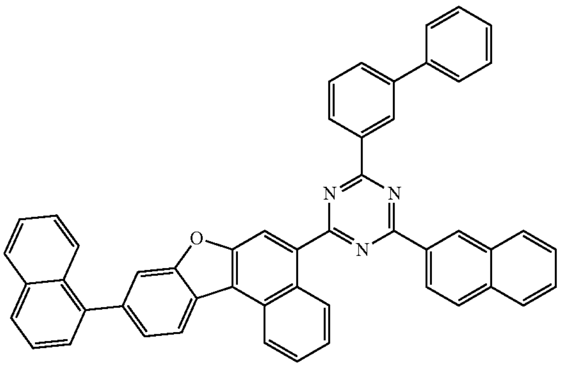
1-71
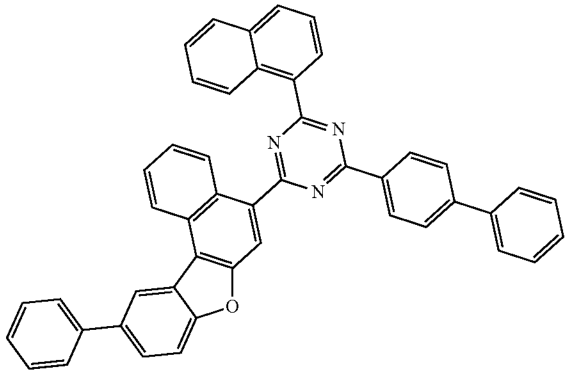
1-72
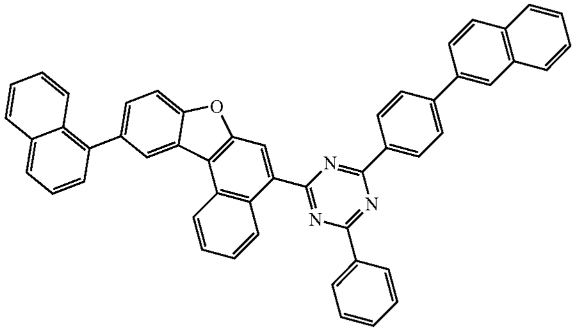
1-73
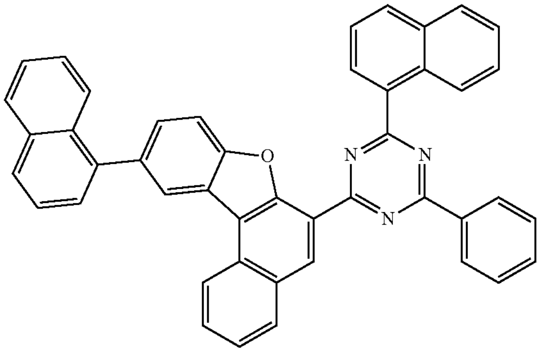
-continued
1-74
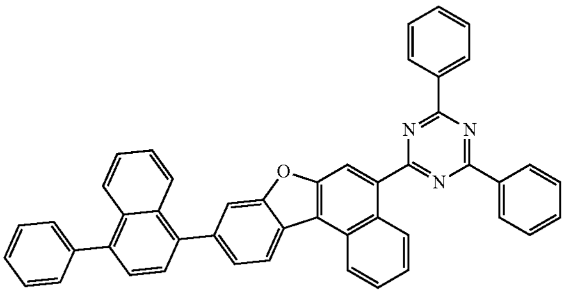
1-75
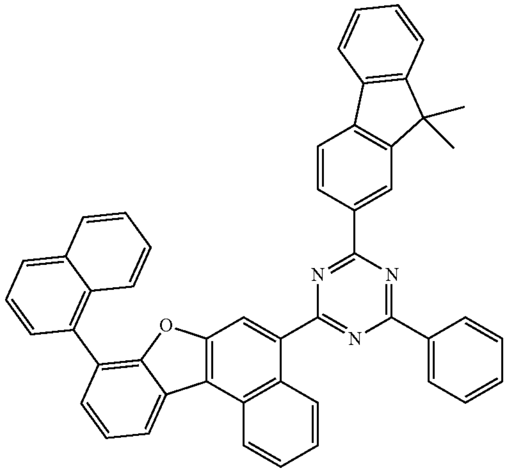
1-76
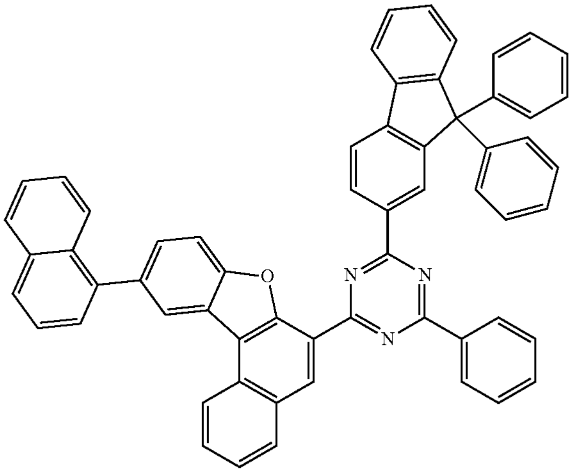

-continued
1-77
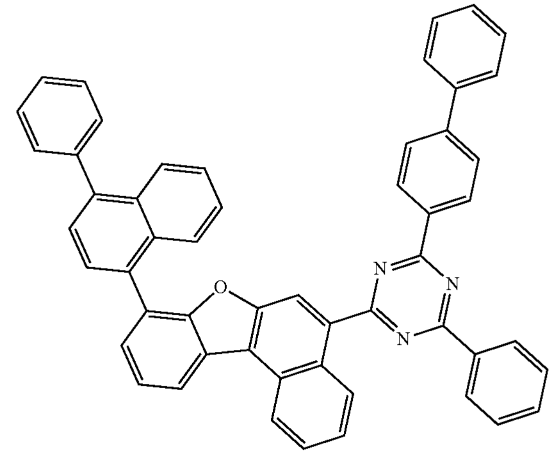
1-78
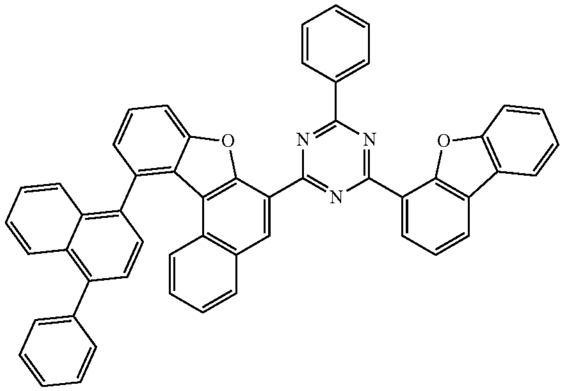
1-79
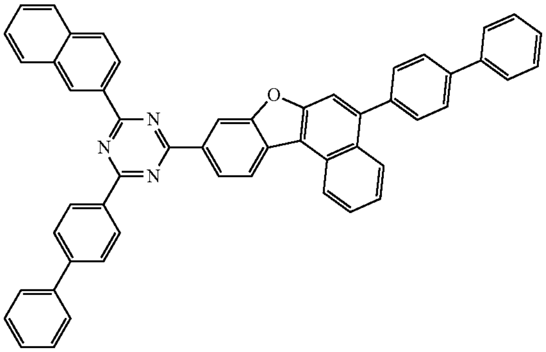
-continued
1-80
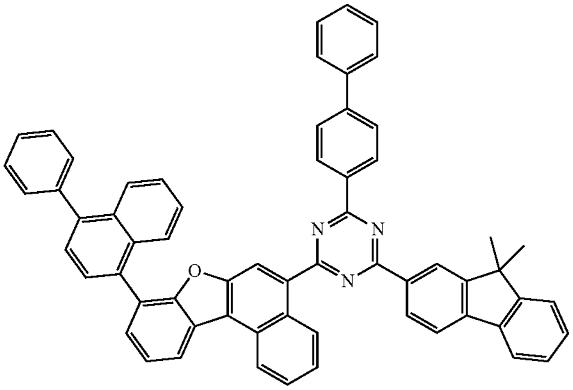
1-81
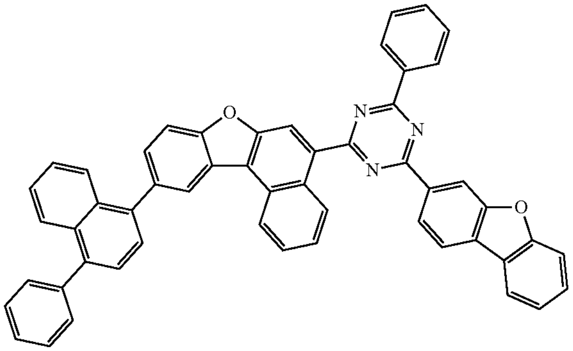
1-82
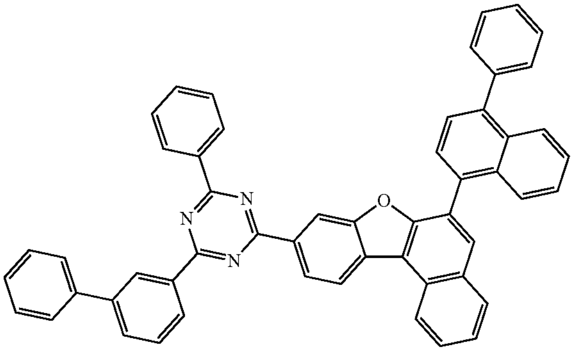

-continued
1-83
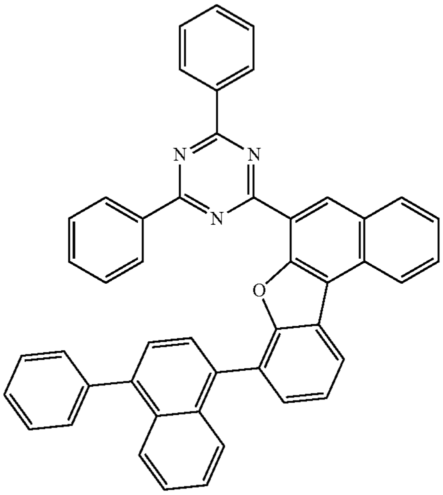
1-84
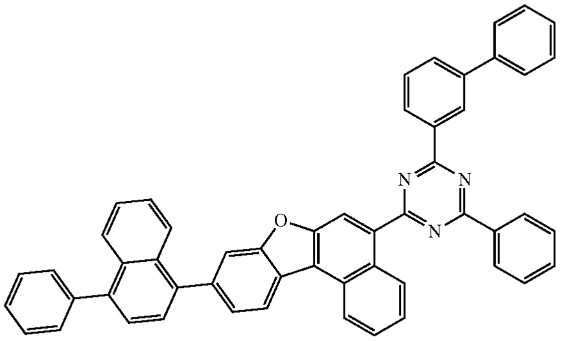
1-85
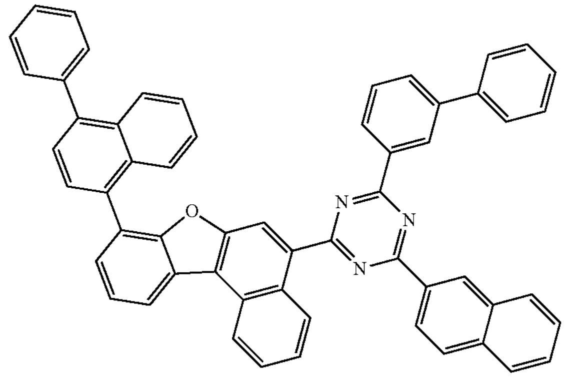
1-86
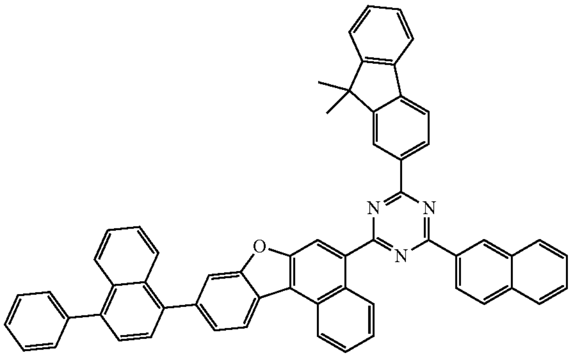
-continued
1-87
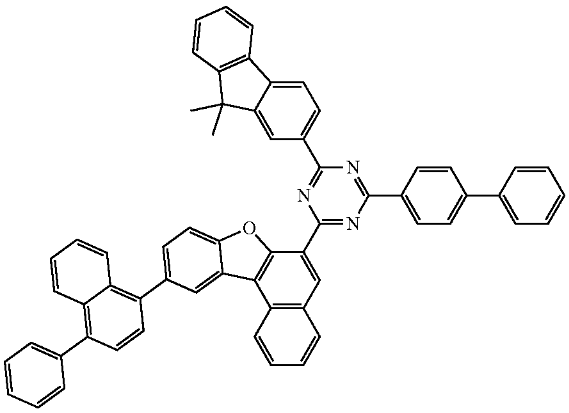
1-88
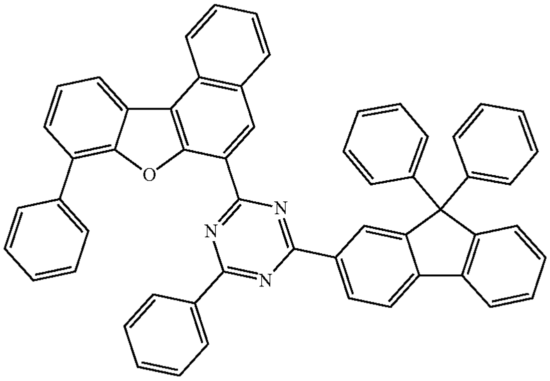
1-89
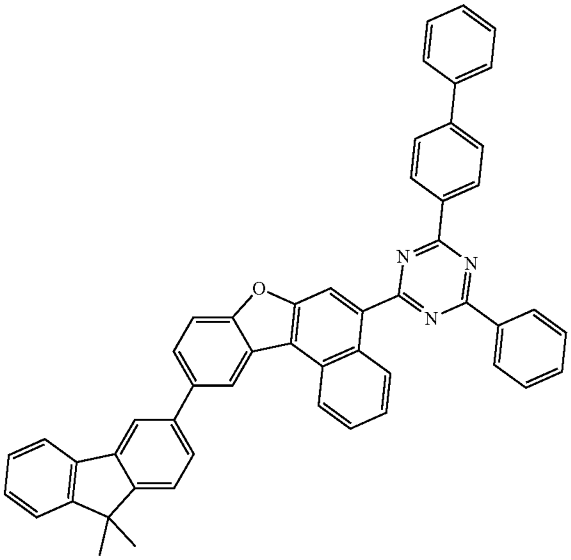

-continued
1-90
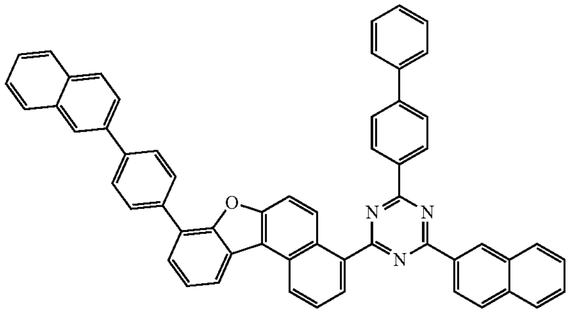
1-91
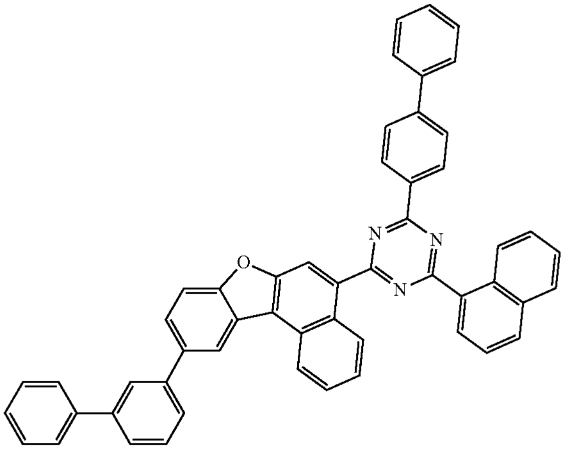
1-92
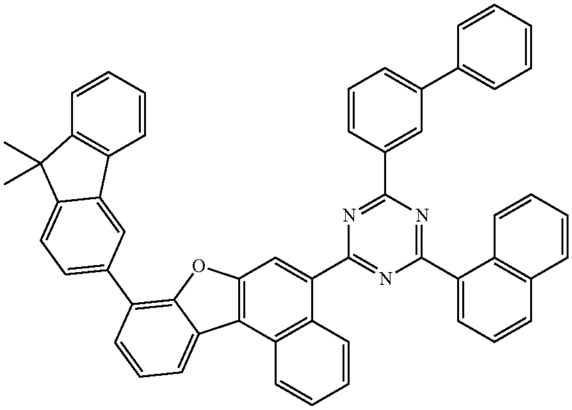
1-93
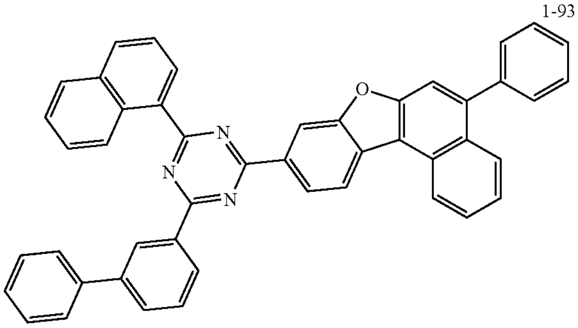
-continued
1-94
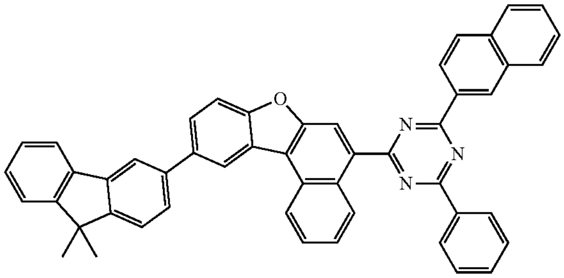
1-95
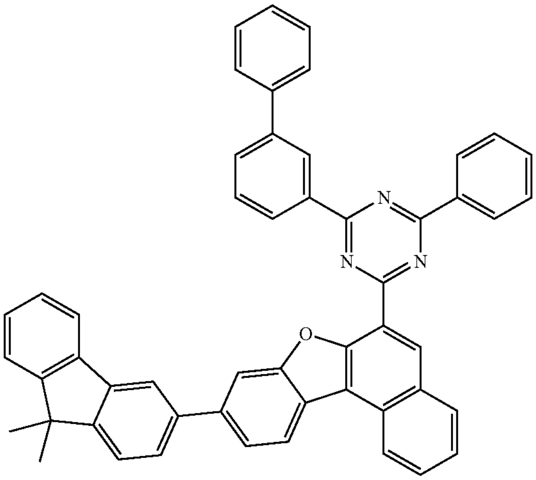
1-96
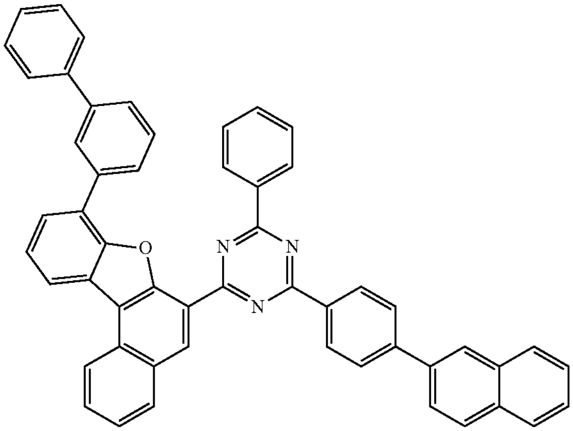
1-97
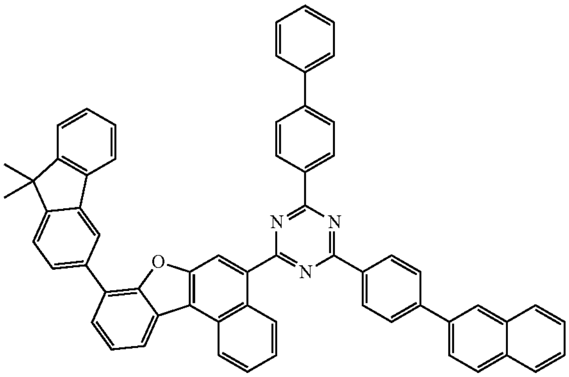

-continued
1-98
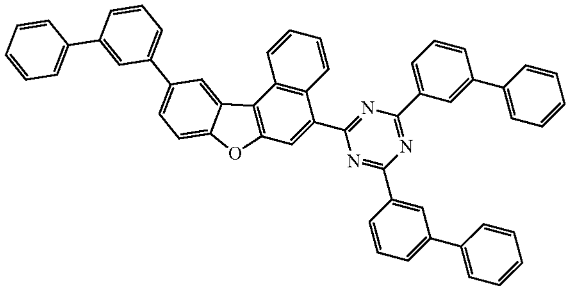
1-99
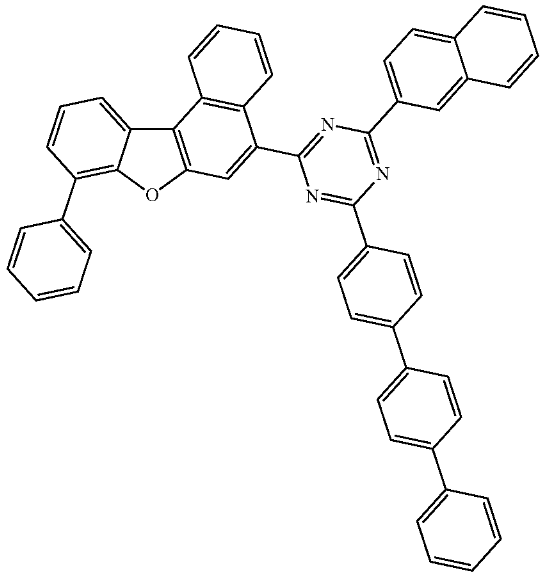
1-100
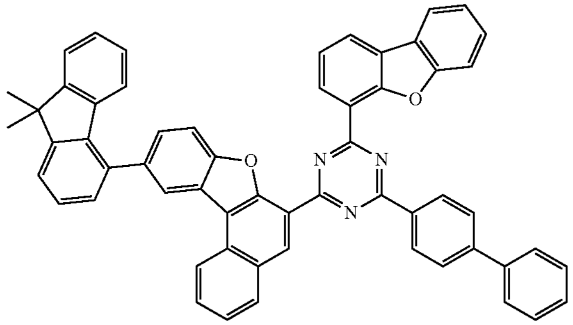
-continued
1-101
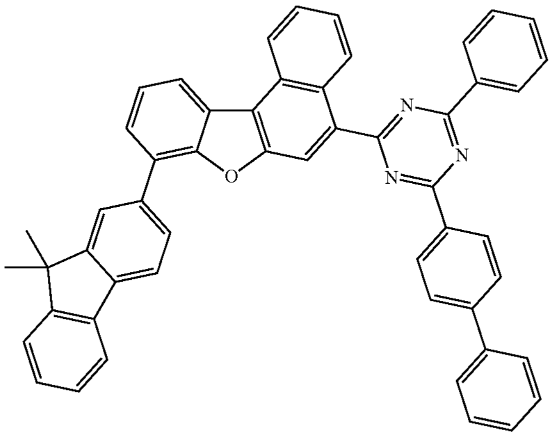
1-102
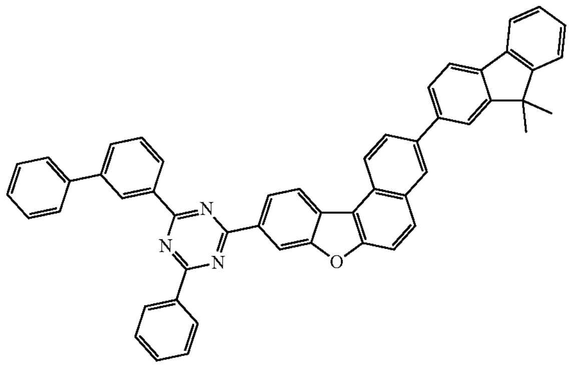
1-103
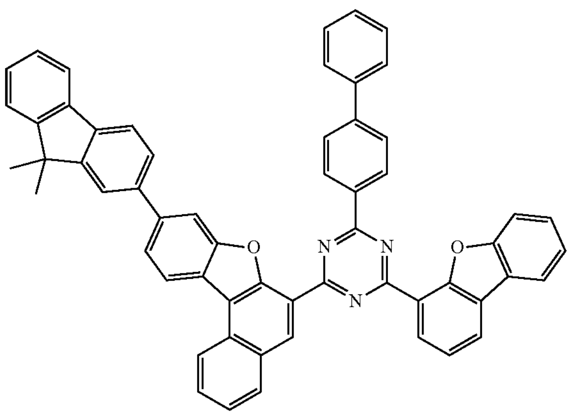

-continued
1-104
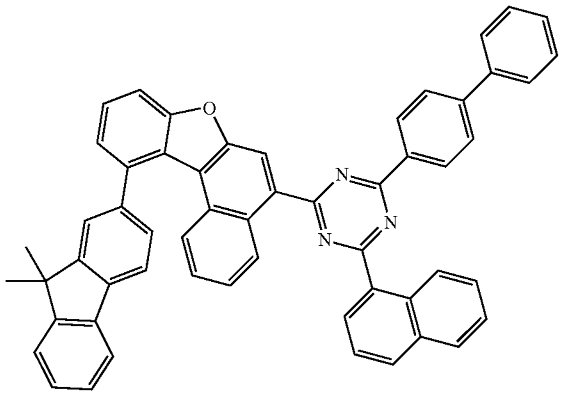
1-105
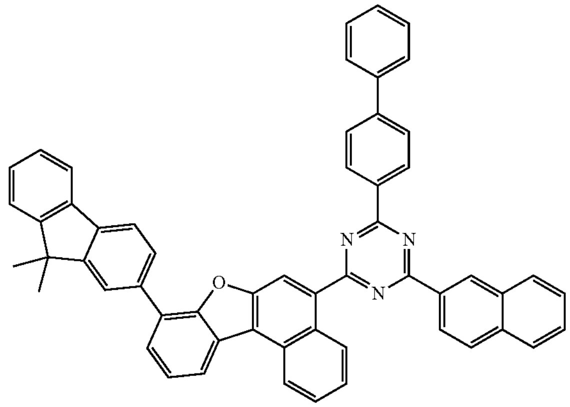
1-106
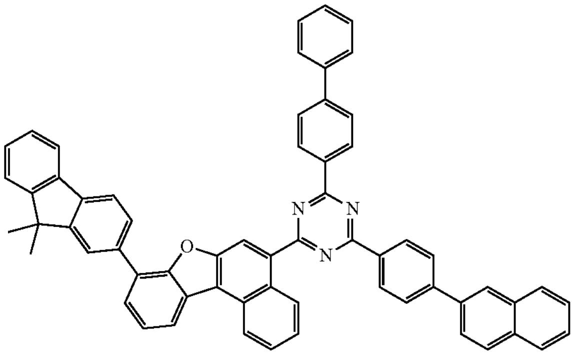
1-107
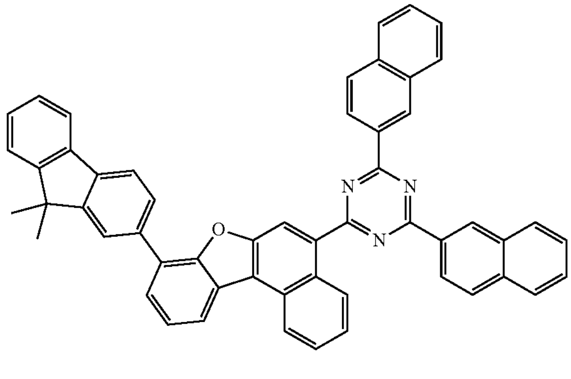
-continued
1-108
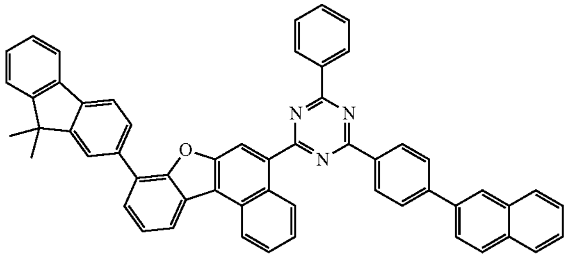
1-109
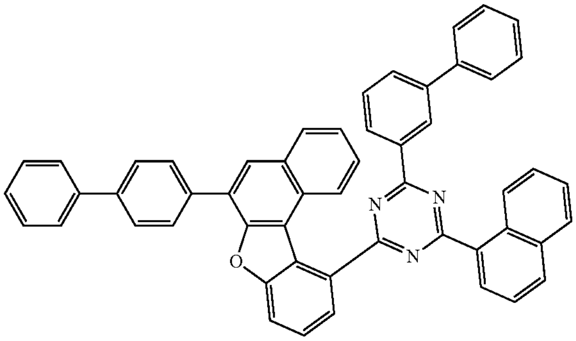
1-110
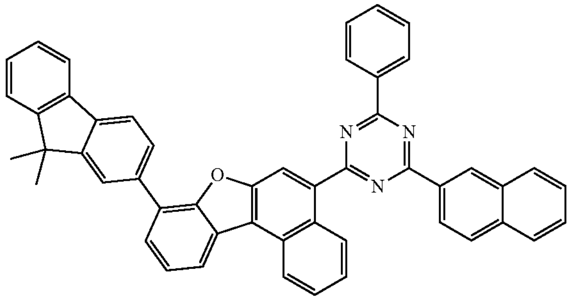
1-111
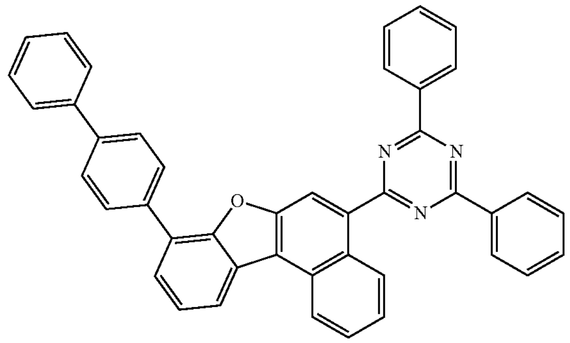

-continued
1-112
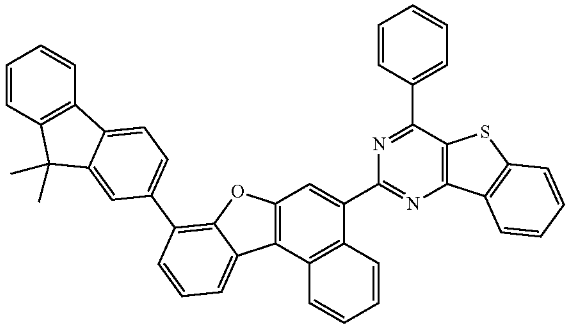
1-113
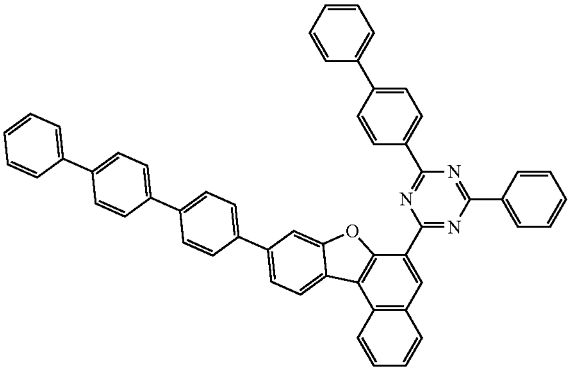
1-114
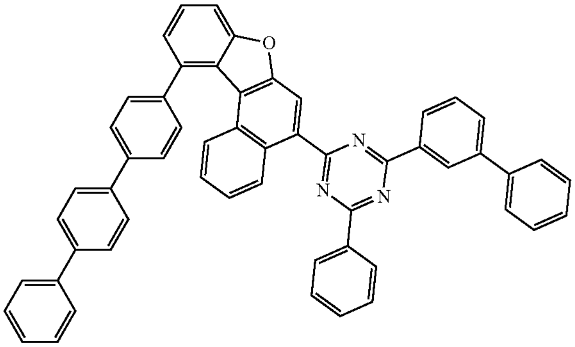
1-115
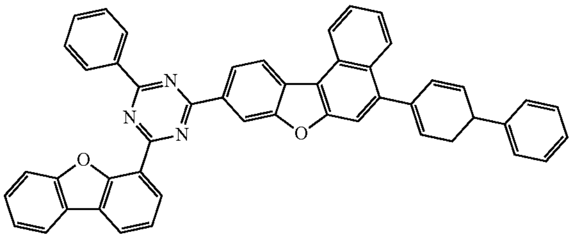
-continued
1-116
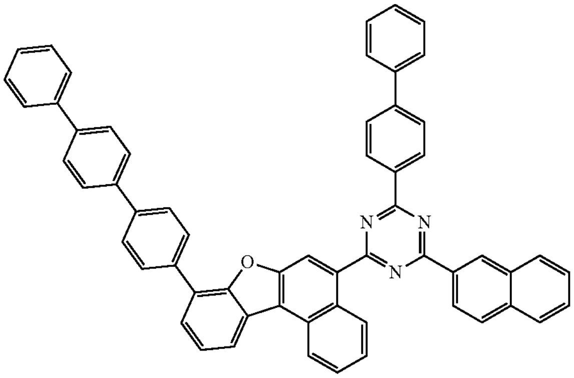
1-117
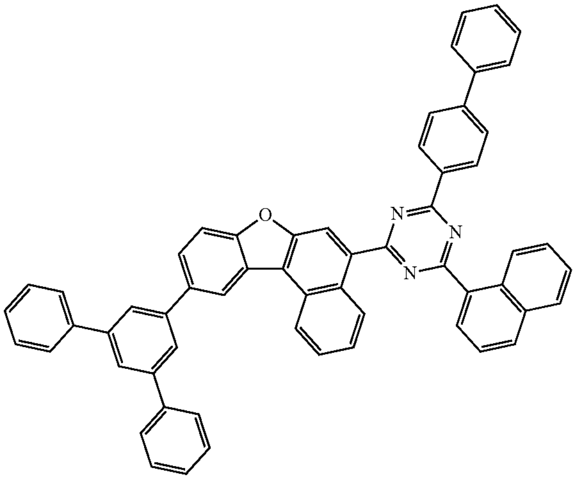
1-118
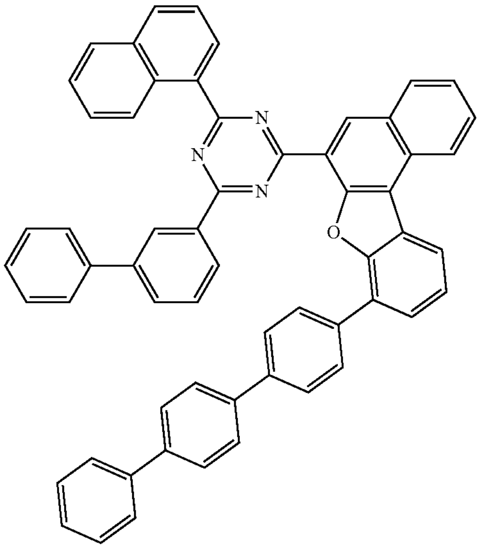

-continued
1-119
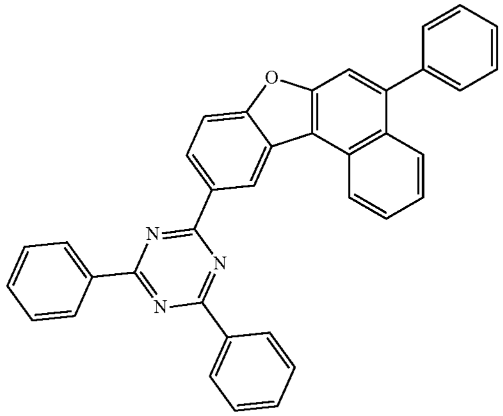
1-120
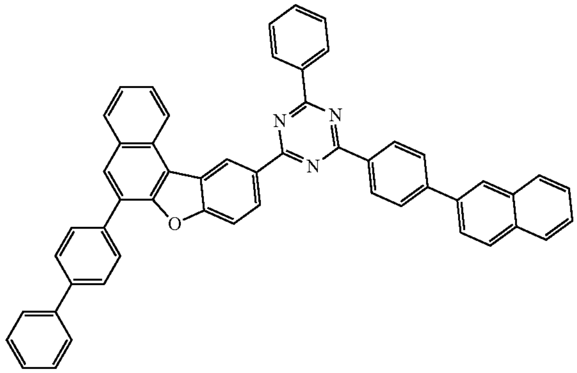
1-121
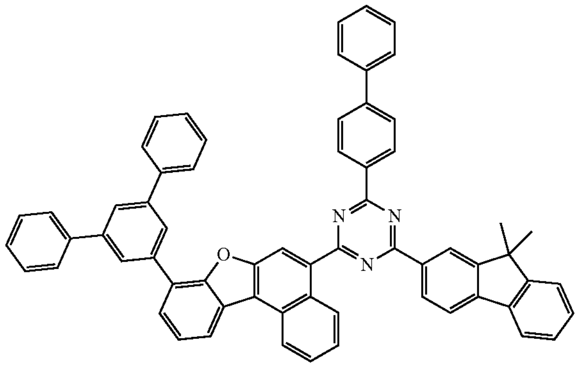
1-122
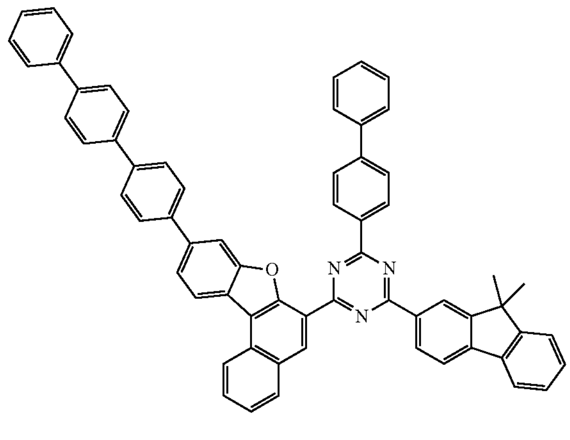
-continued
1-123
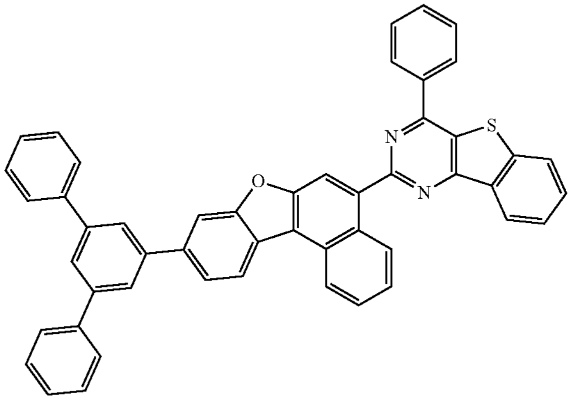
1-124
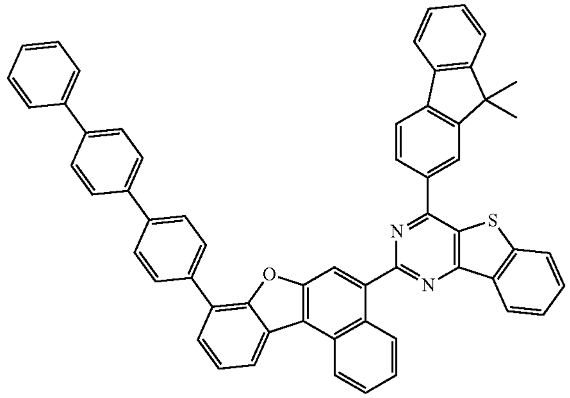
1-125
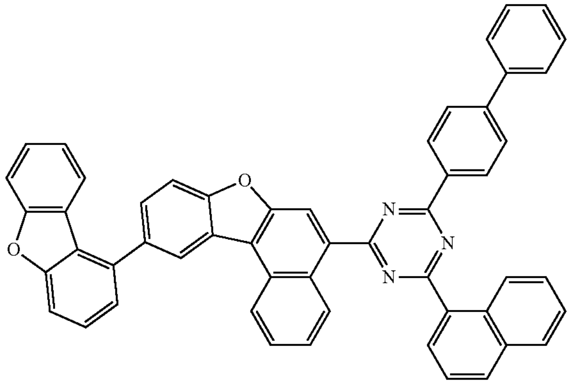
1-126
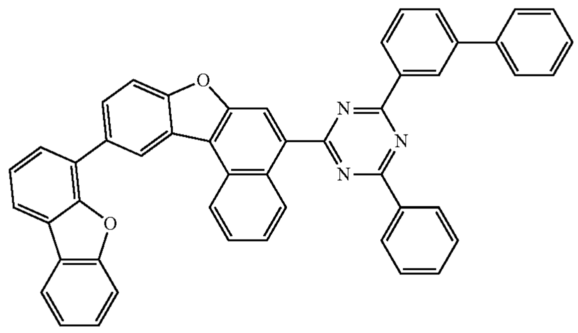

-continued
1-127
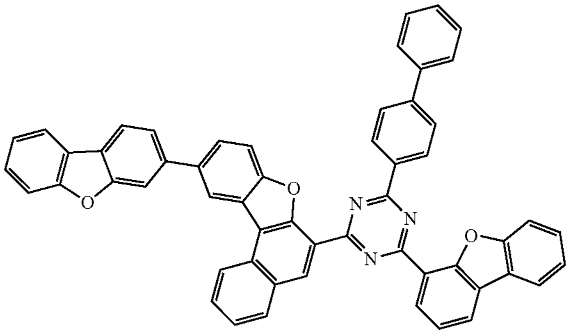
1-128
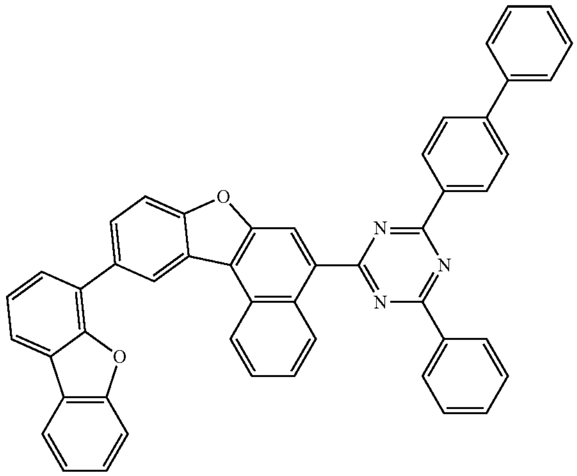
1-129
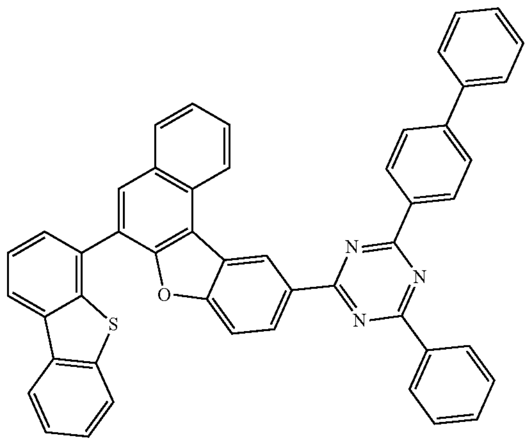
-continued
1-130
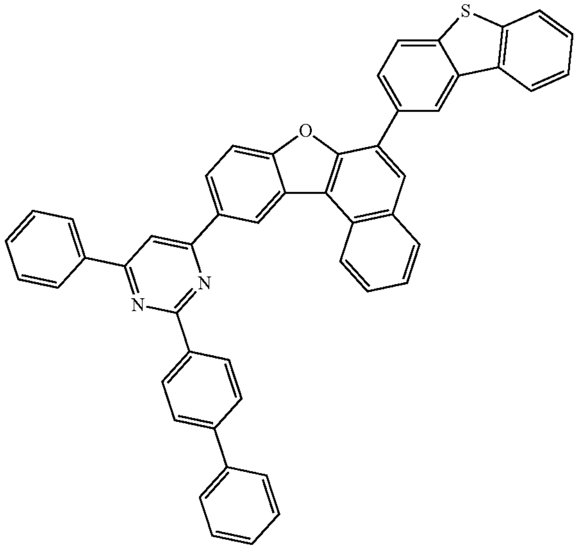
1-131
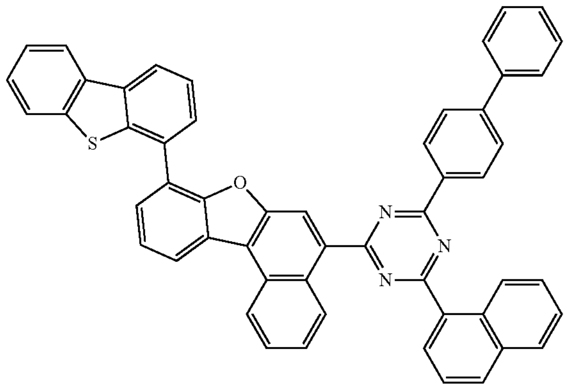
1-132
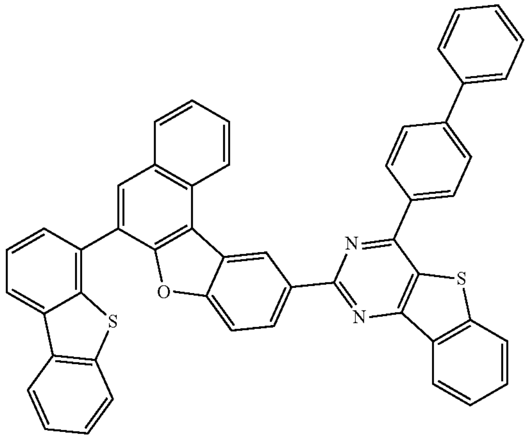

-continued
1-133
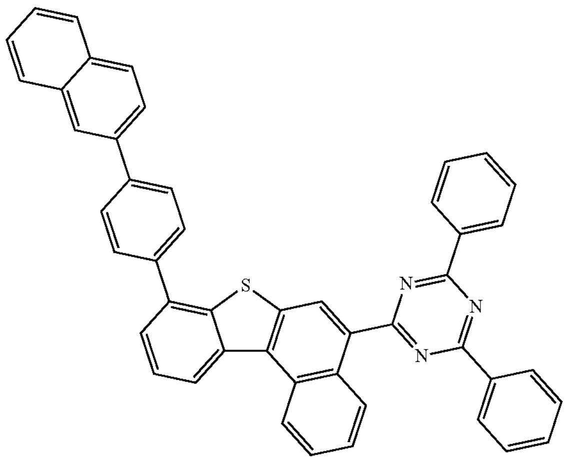
1-134
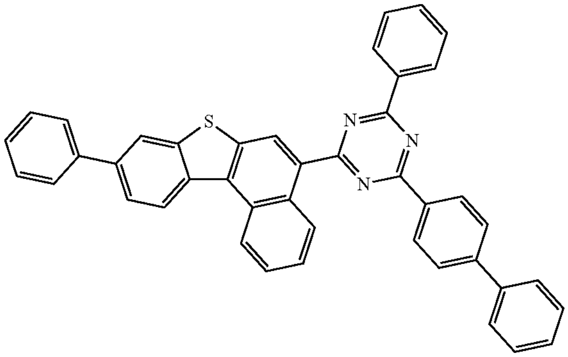
1-135
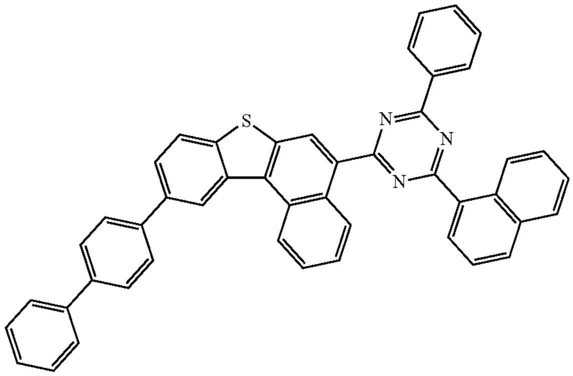
1-136
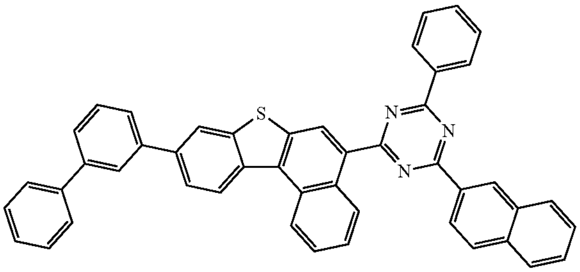
-continued
1-137
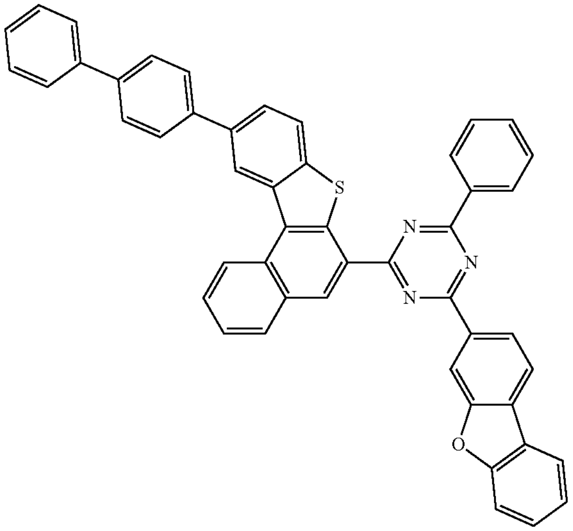
1-138
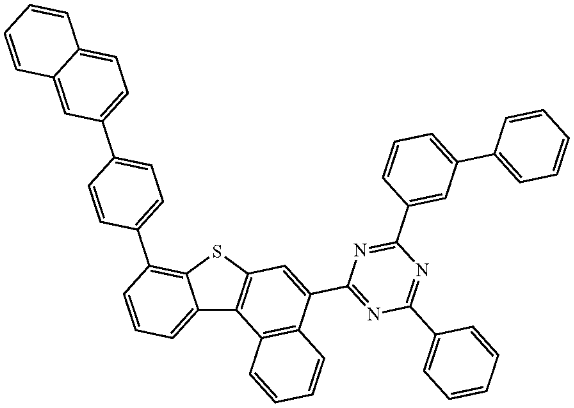
1-139
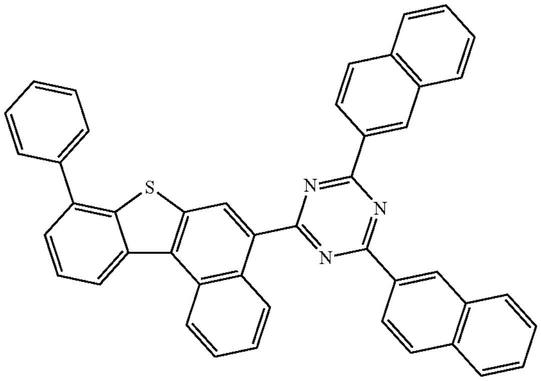

-continued
1-140
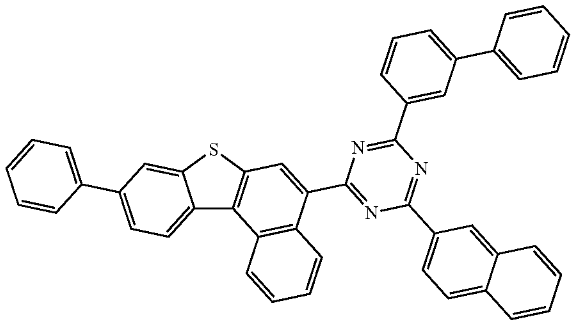
1-141
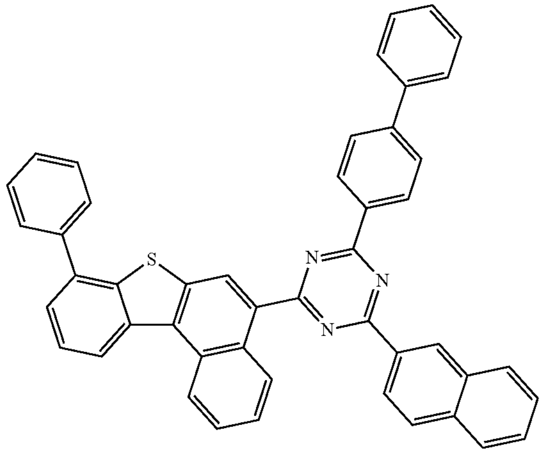
1-142
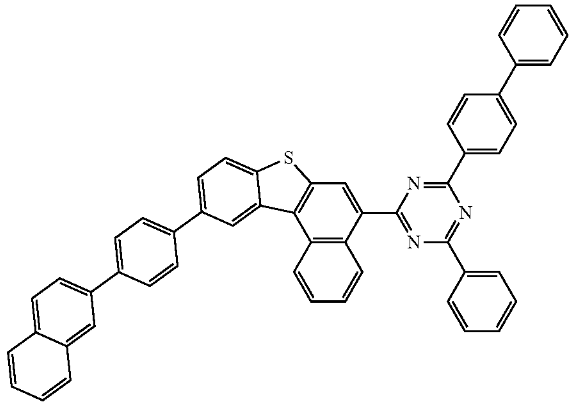
-continued
1-143
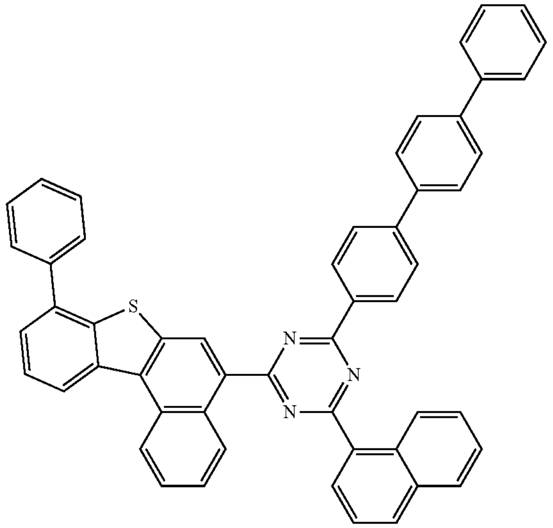
1-144
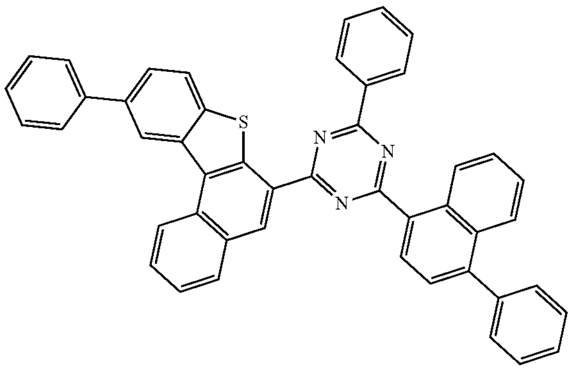
1-145
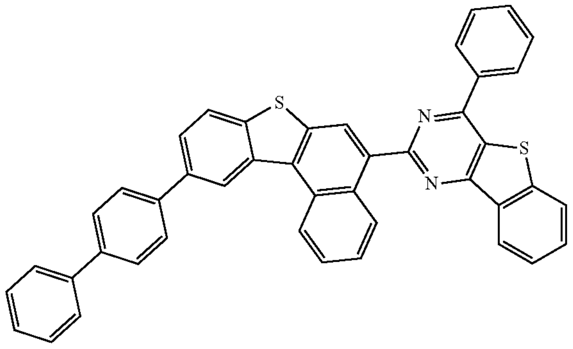

-continued
1-146
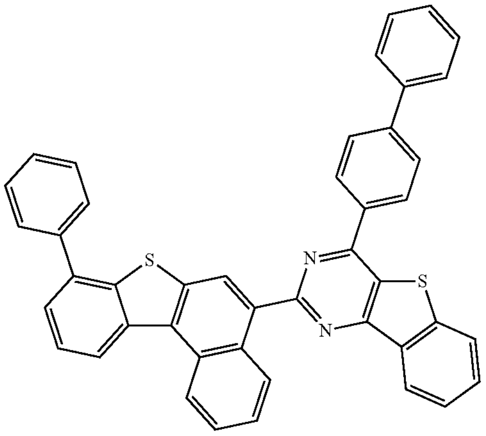
1-147
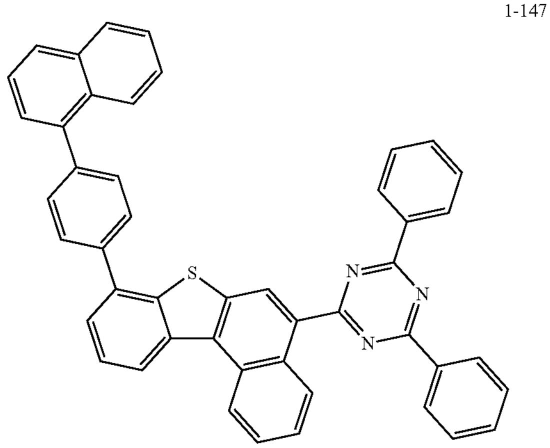
1-148
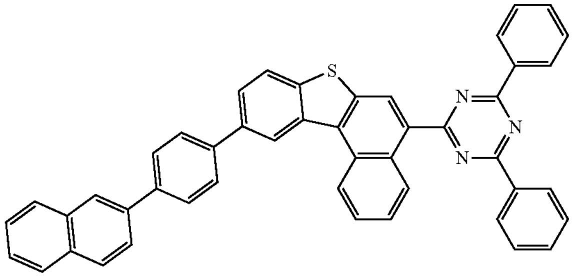
1-149
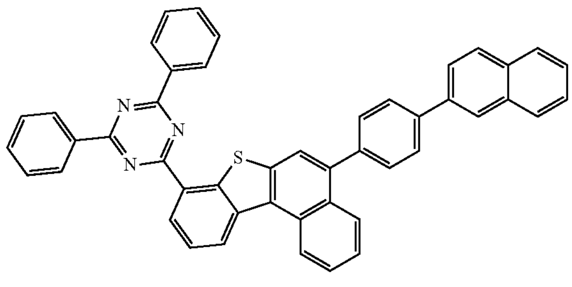
-continued
1-150
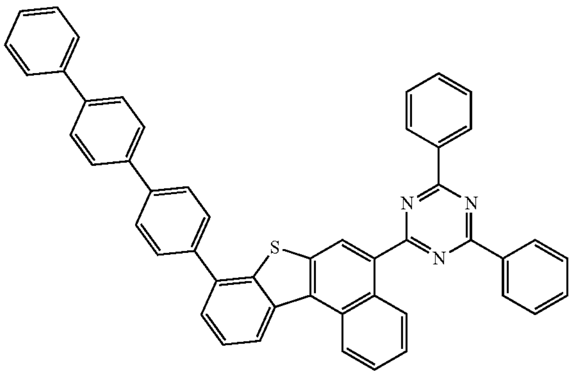
1-151
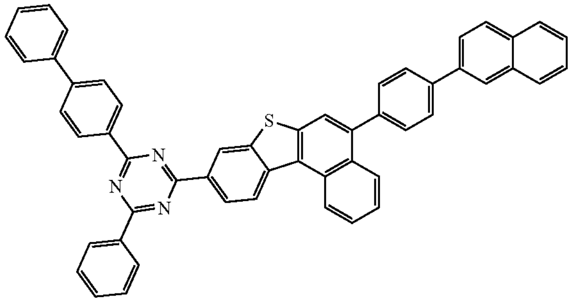
1-152
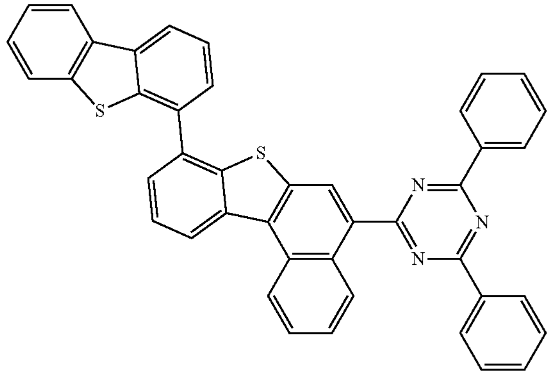
1-153
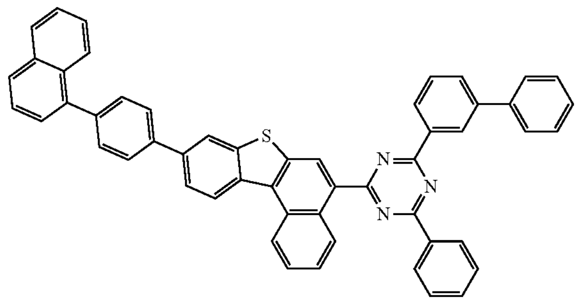

-continued
1-154
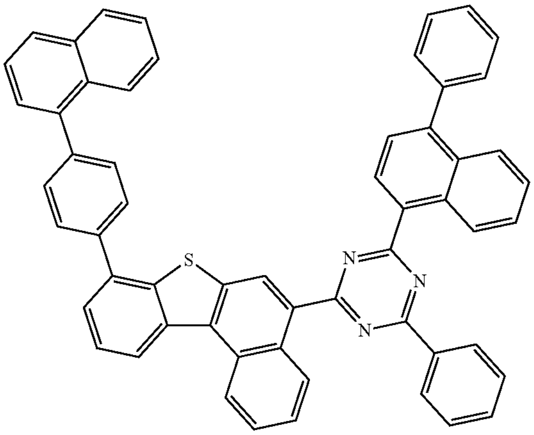
1-155
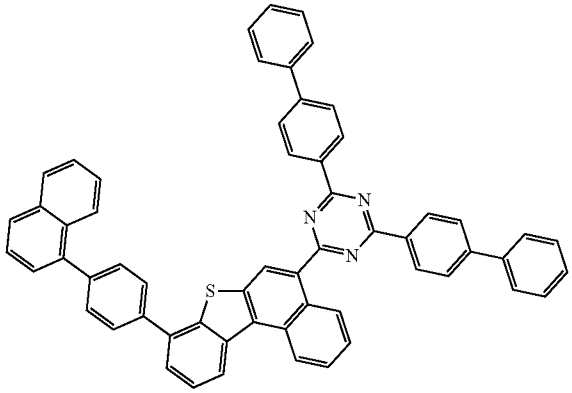
1-156
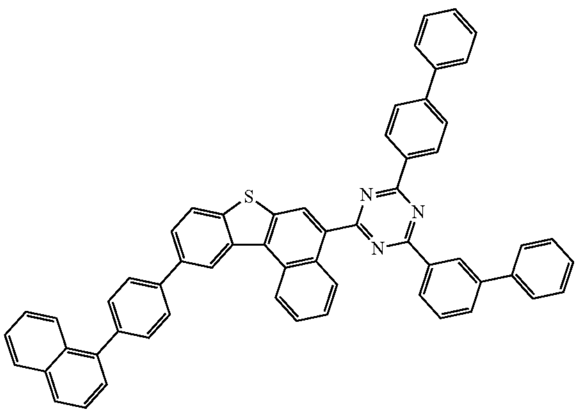
-continued
1-157
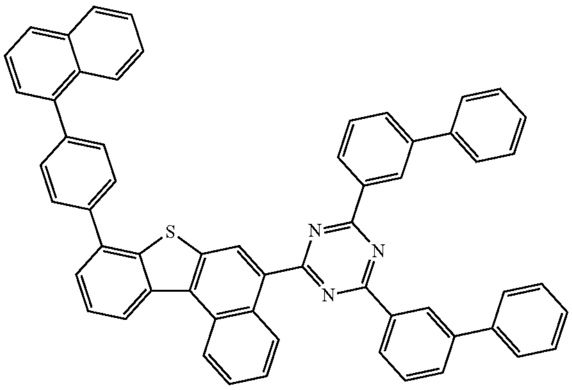
1-158
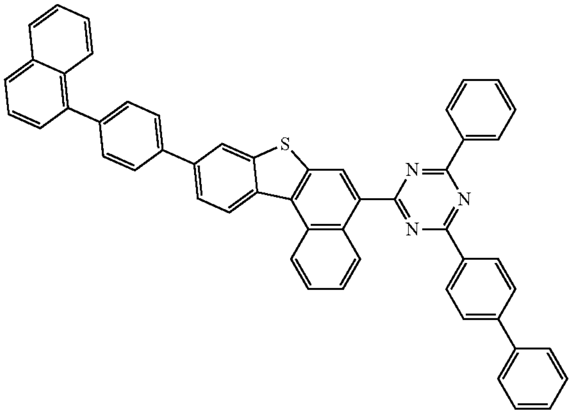
1-159
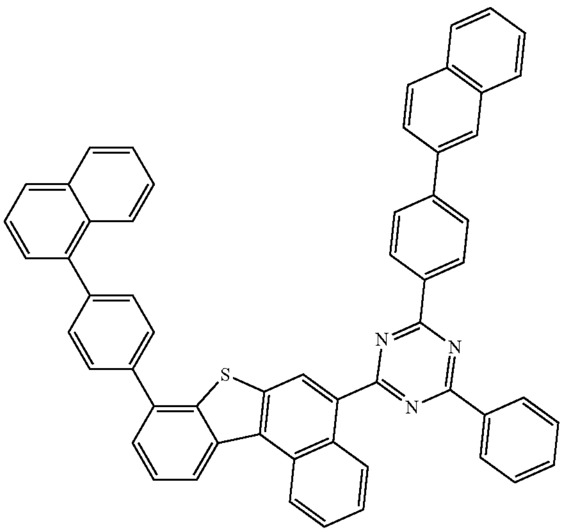

-continued
1-160
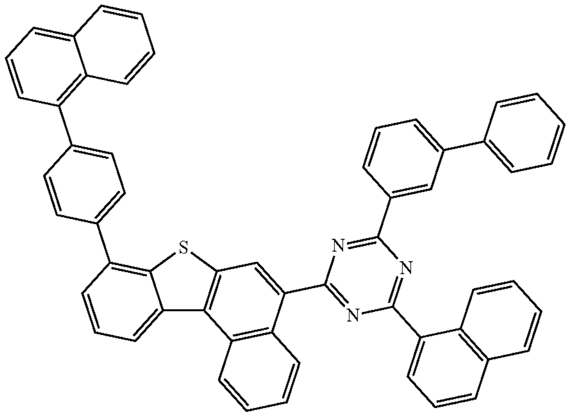
1-161
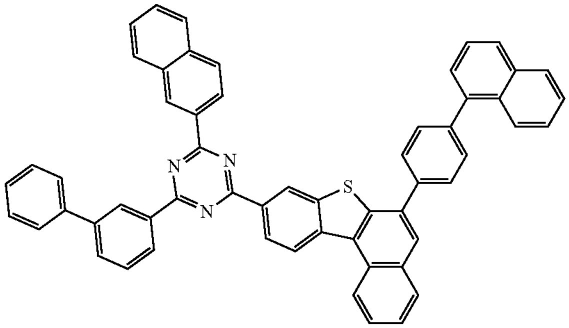
1-162
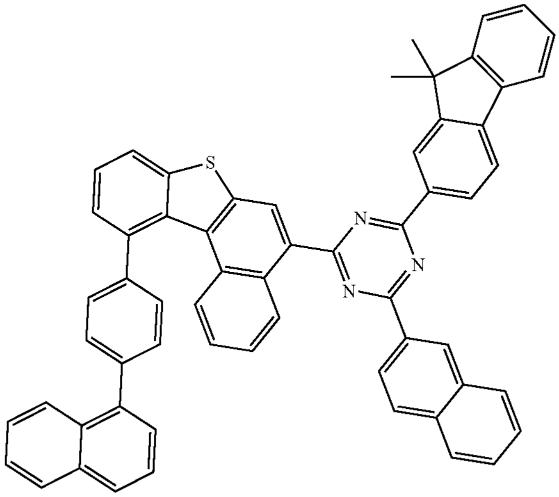
-continued
1-163
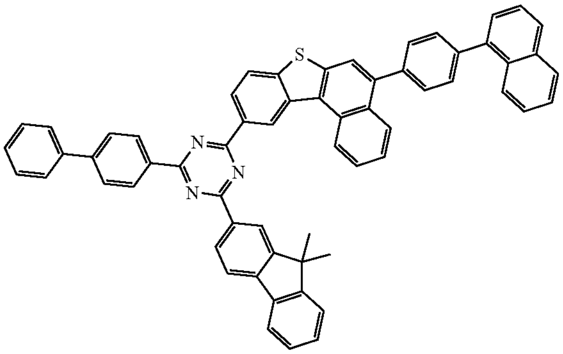
1-164
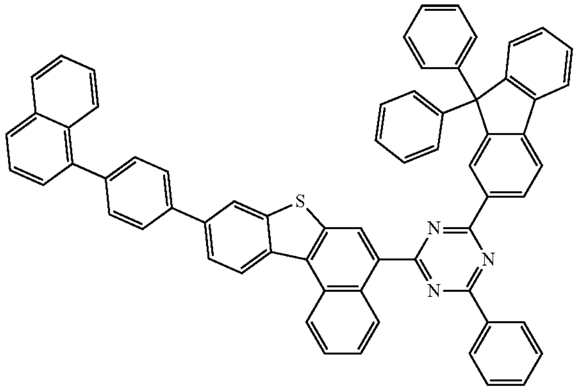
1-165
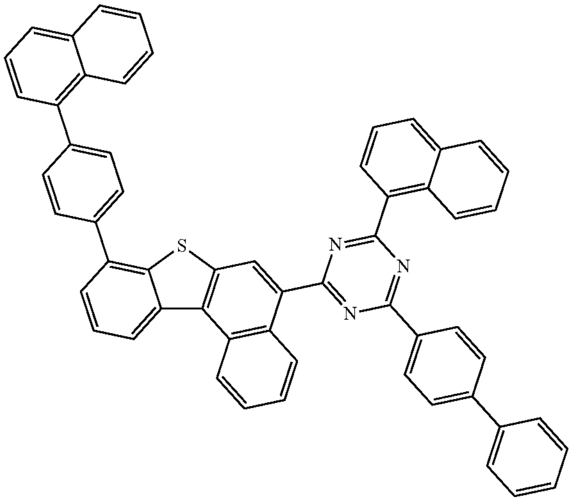

1-166
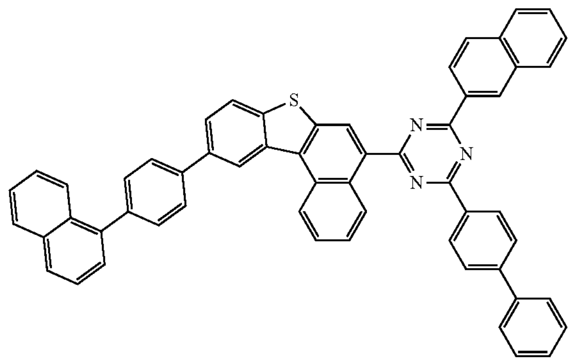
1-167
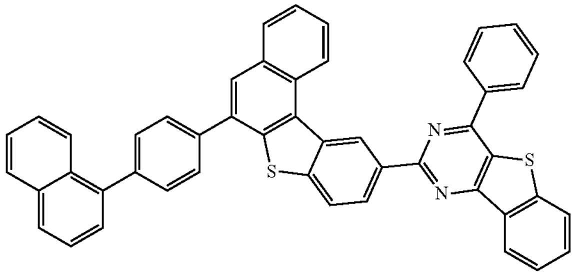
1-168
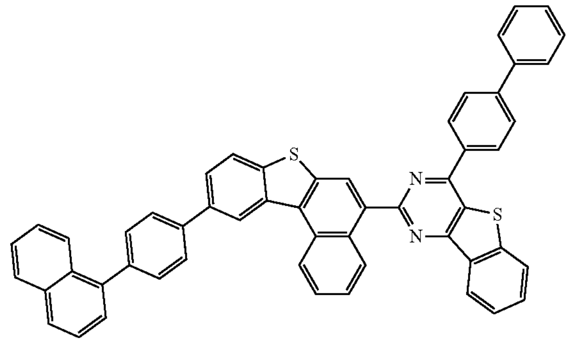
1-169
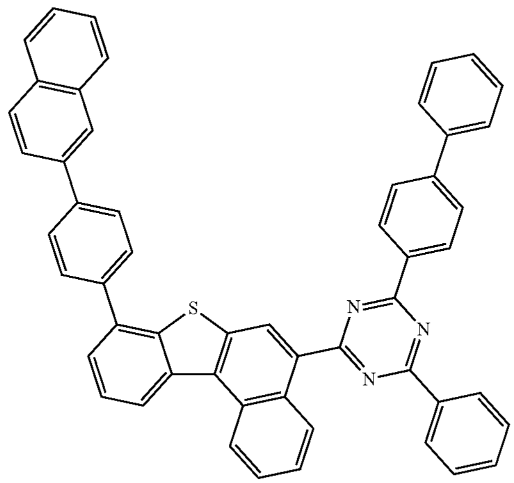
1-170
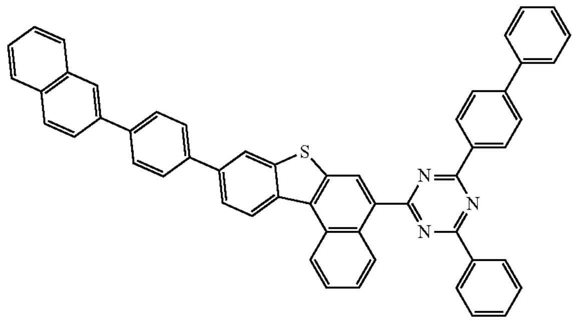
1-171
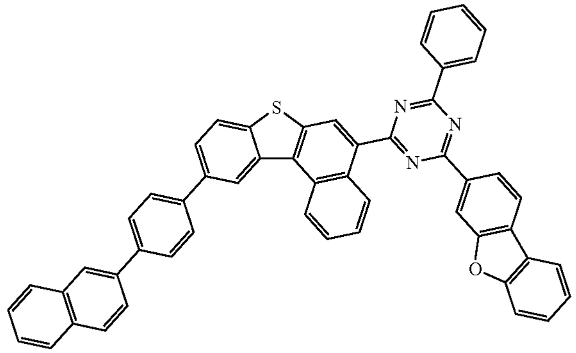
1-172
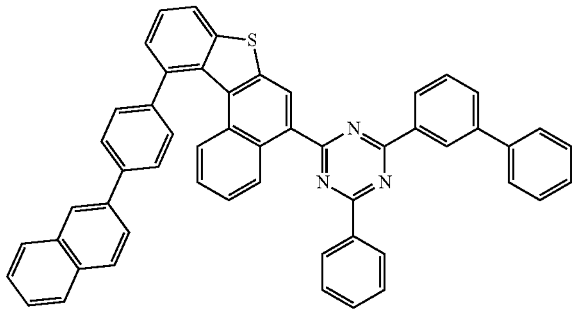
1-173
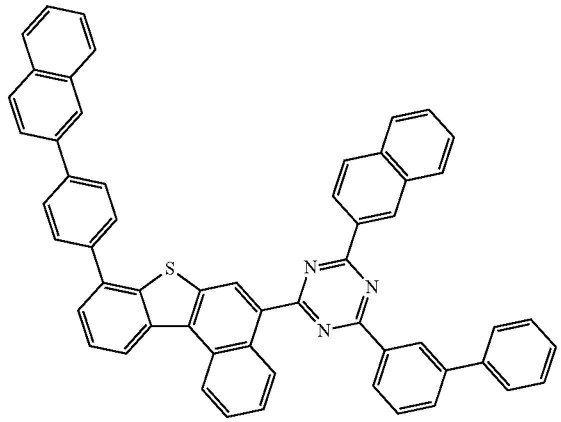

-continued
1-174
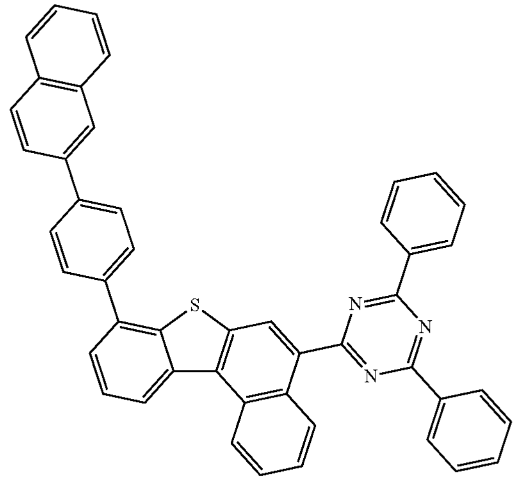
1-175
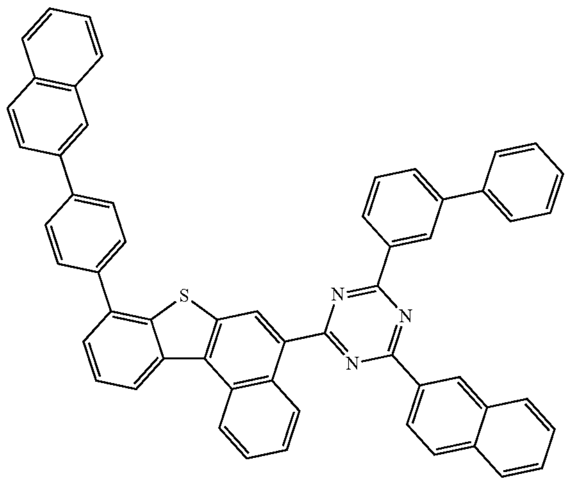
1-176
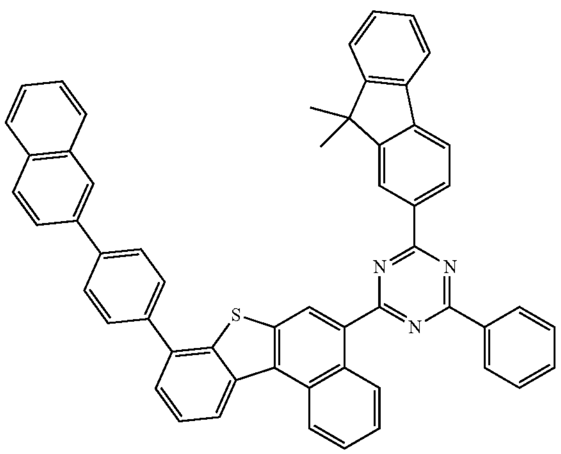
-continued
1-177
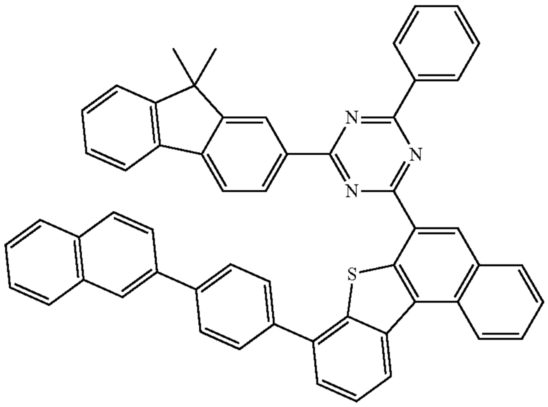
1-178
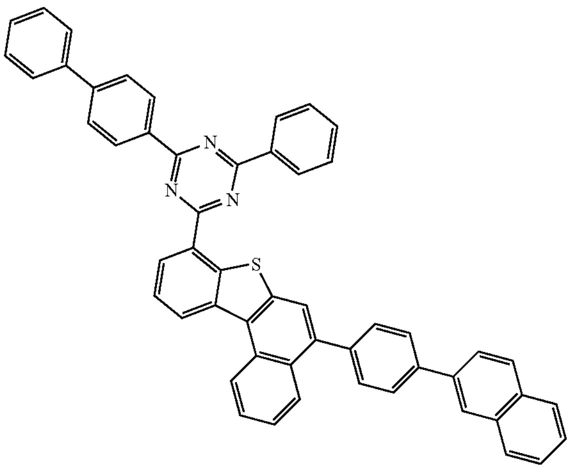
1-179
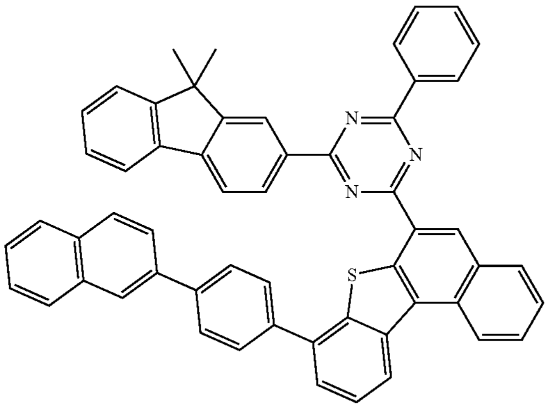

-continued
1-180
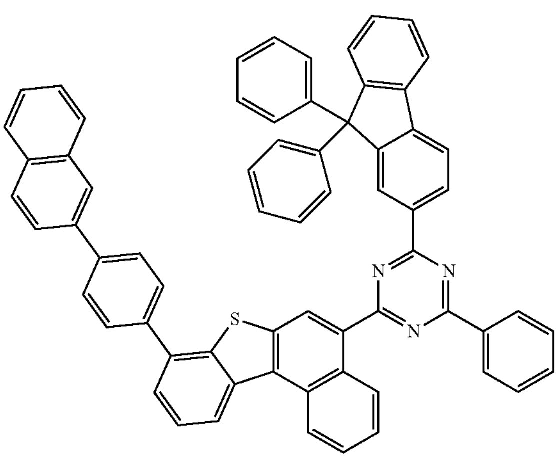
1-181
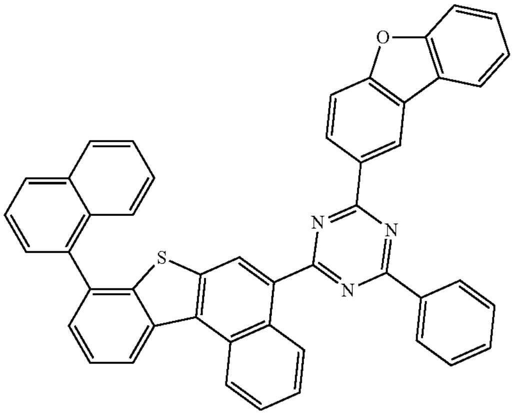
1-182
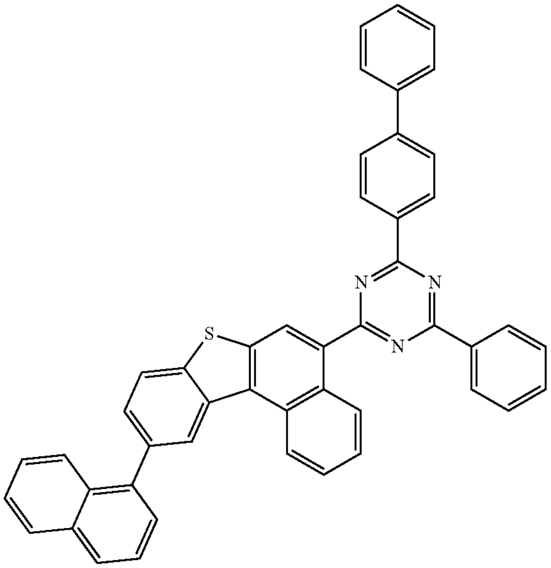
-continued
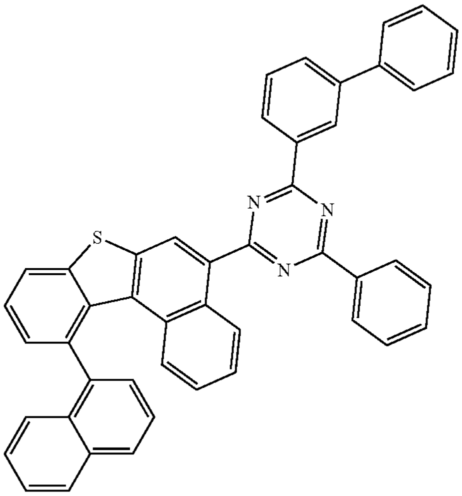
1-184
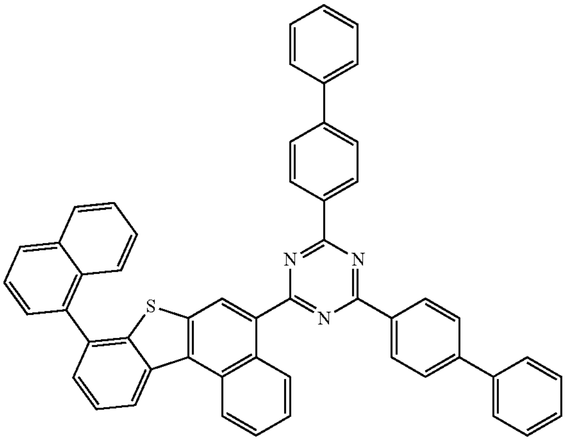
1-185
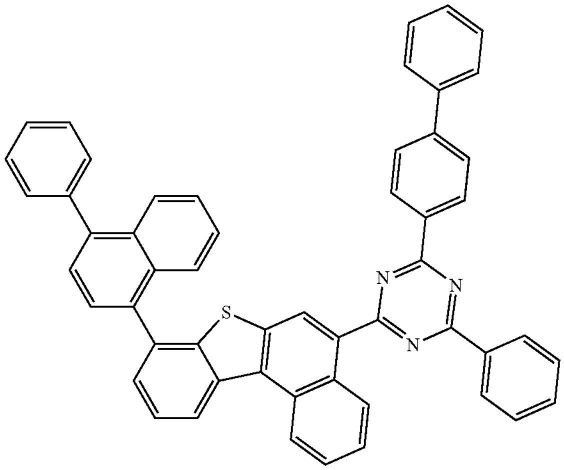

-continued
1-186
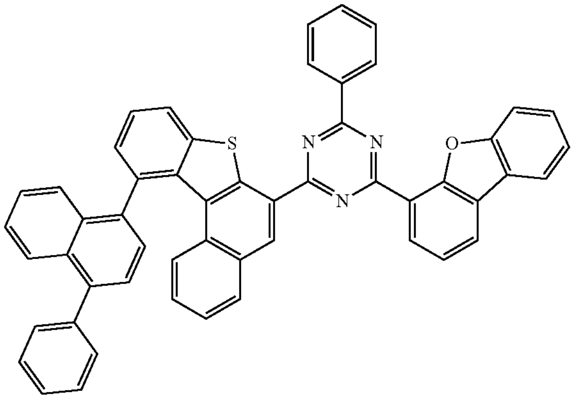
1-187
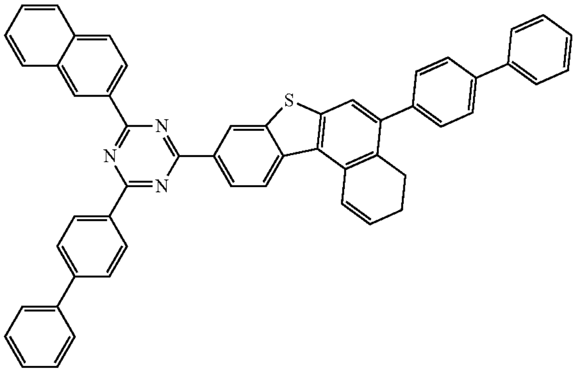
1-188
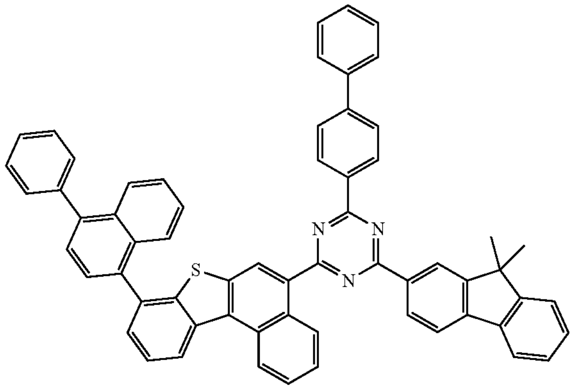
1-189
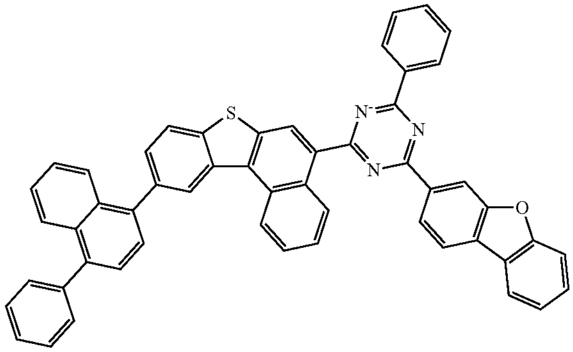
-continued
1-190
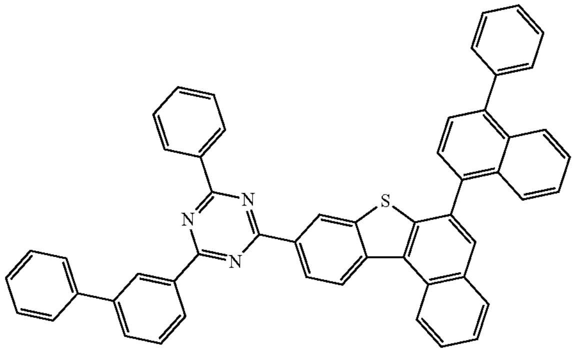
1-191
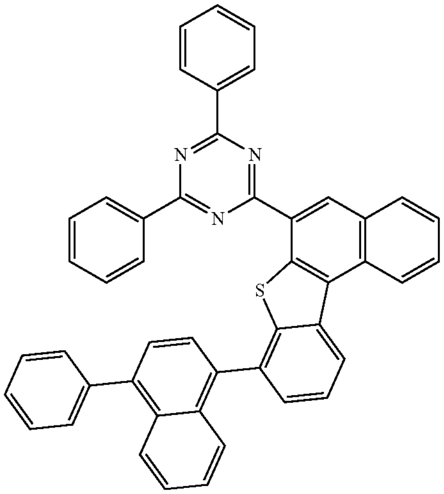
1-192
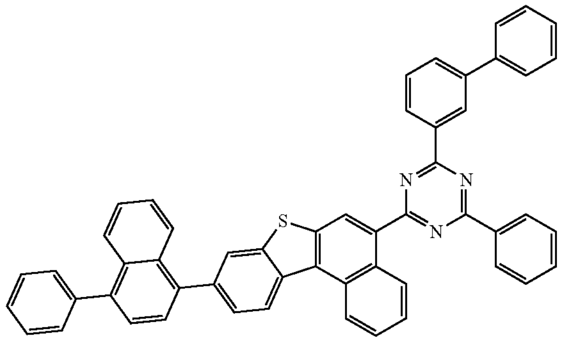
1-193
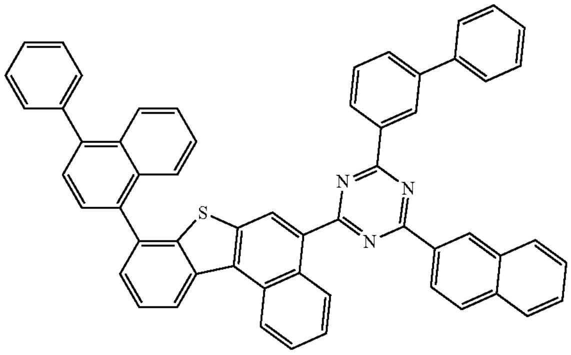

1-194
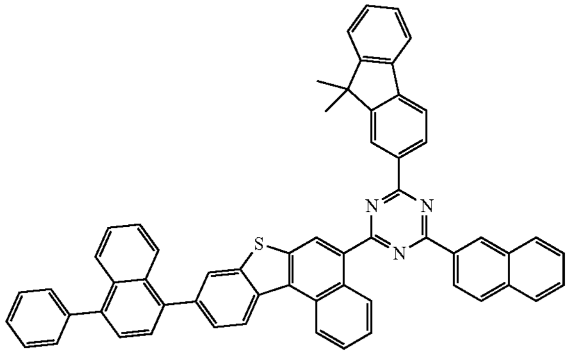
1-195
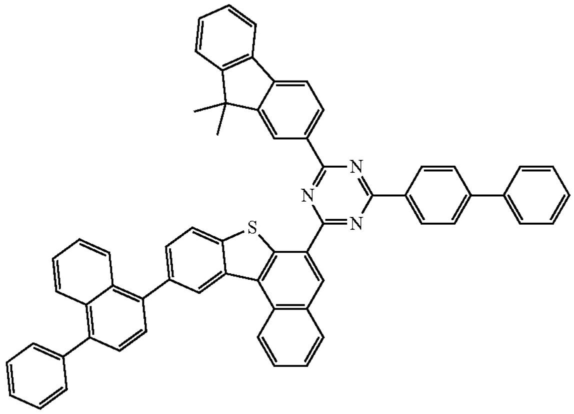
1-196
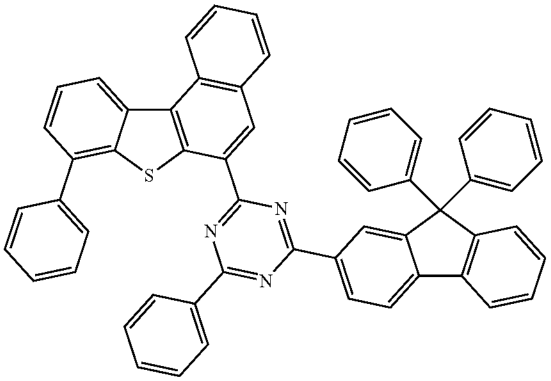
1-197
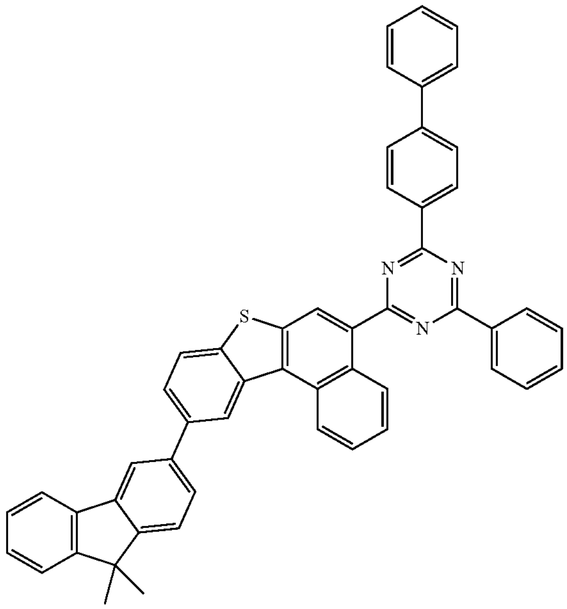
1-198
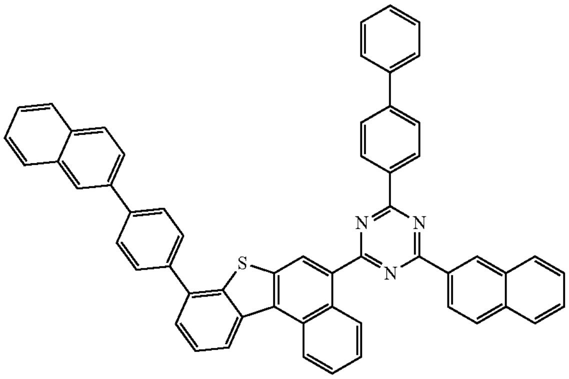
1-199
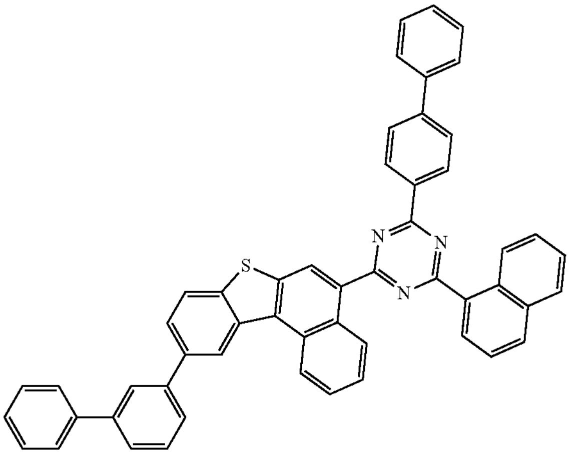

-continued
1-200
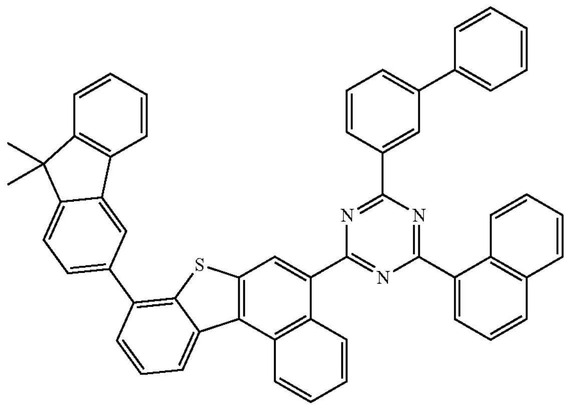
1-201
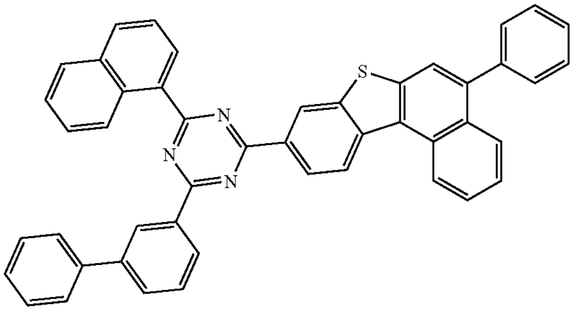
1-202
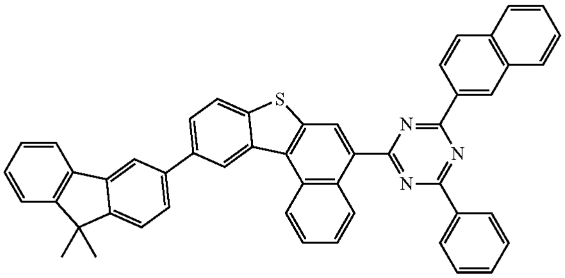
1-203
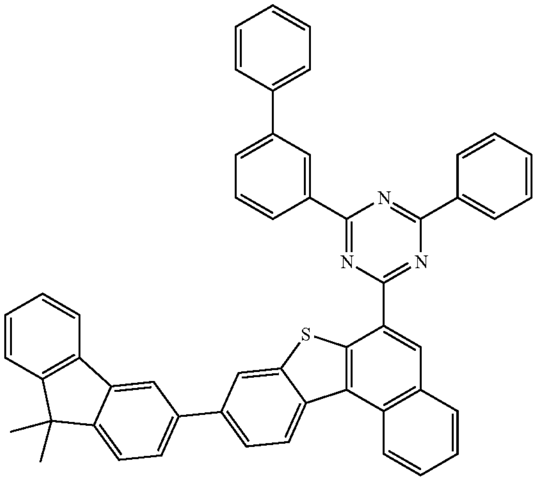
-continued
1-204
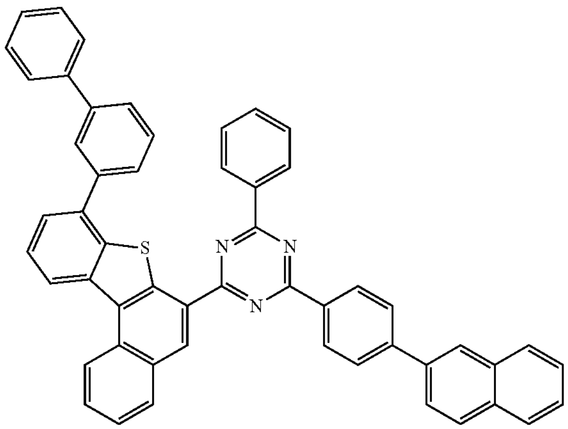
1-205
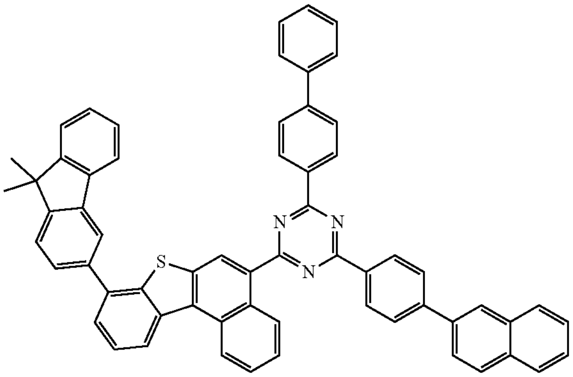
1-206
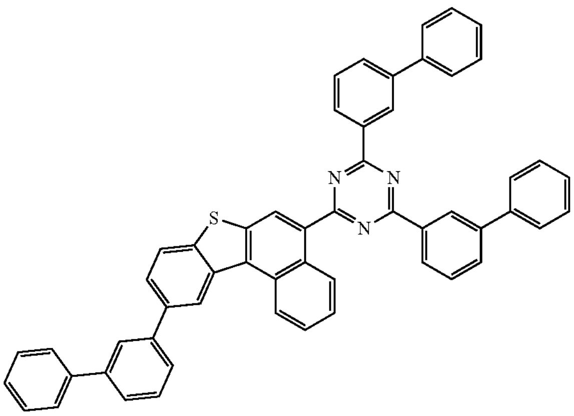

-continued
1-207
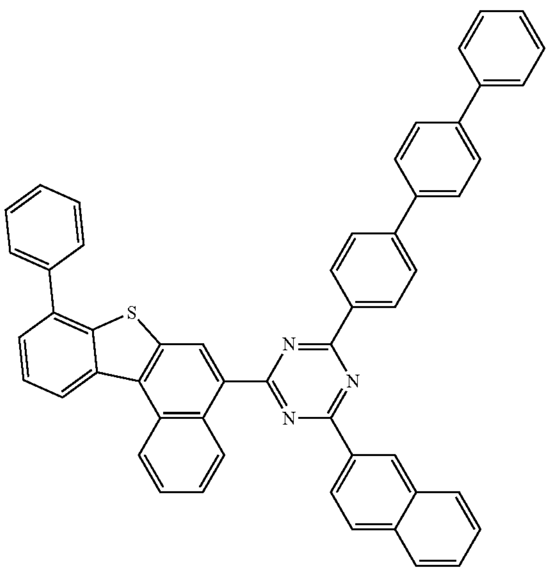
1-208
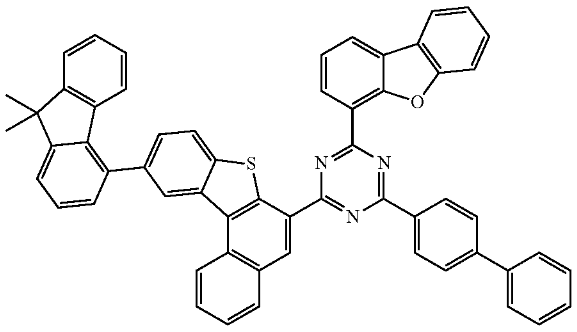
1-209
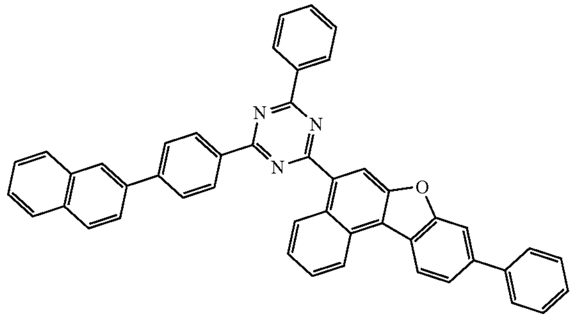
-continued
1-210
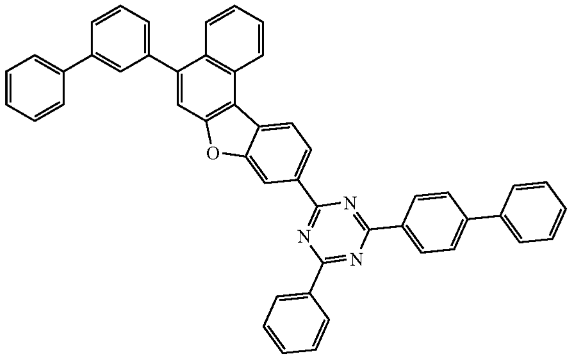
1-211
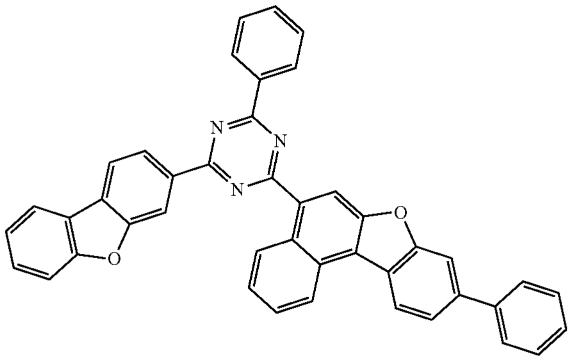
1-212
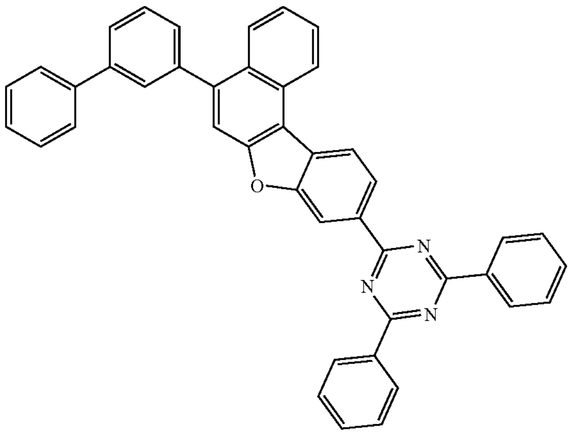
1-213
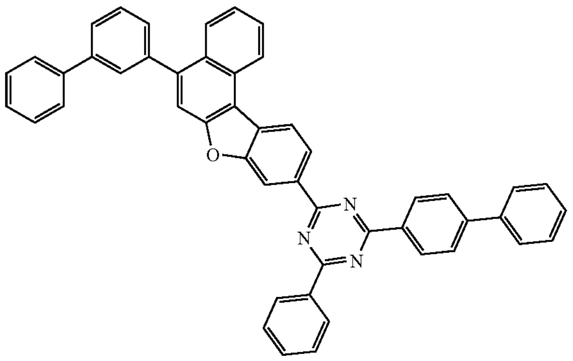

-continued
1-214
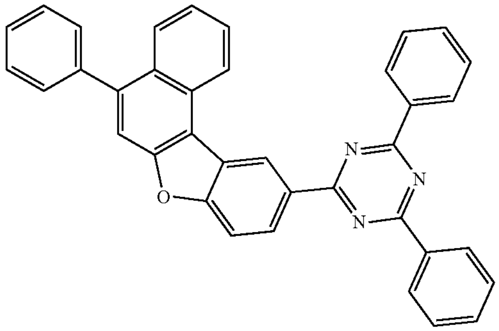
1-215
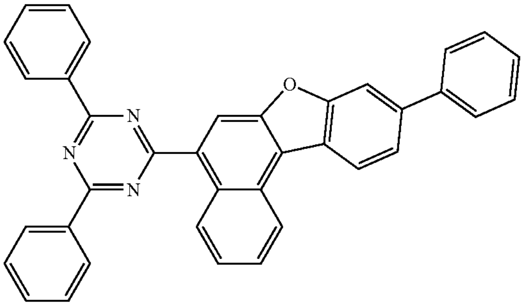
1-216
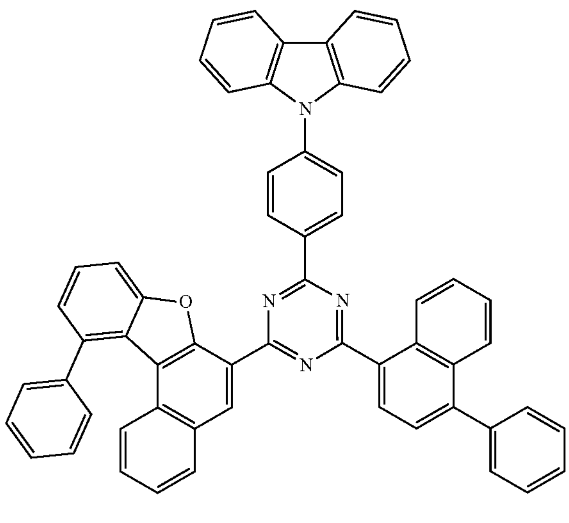
-continued
1-217
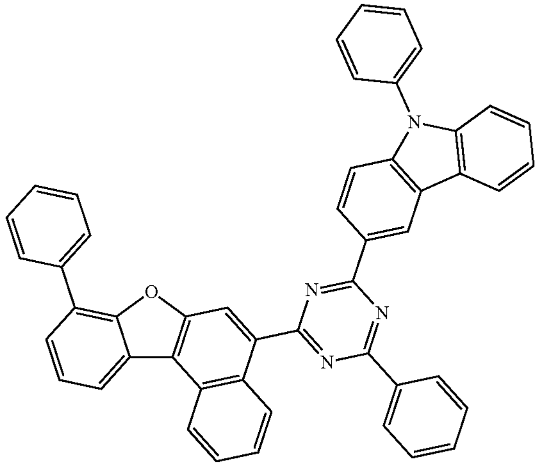
1-218
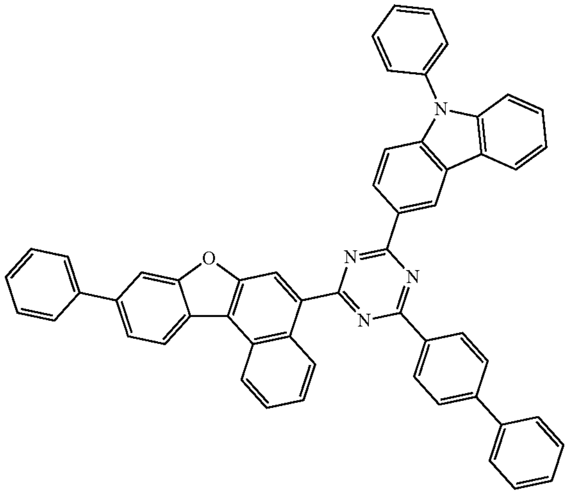
1-219
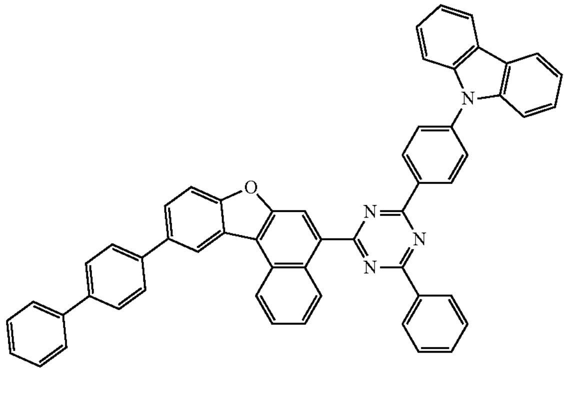

1-220
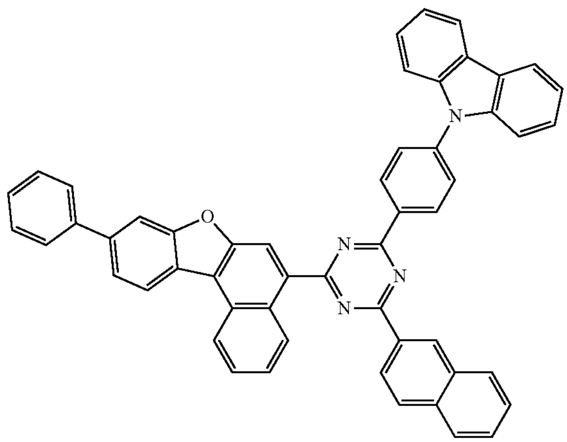
1-221
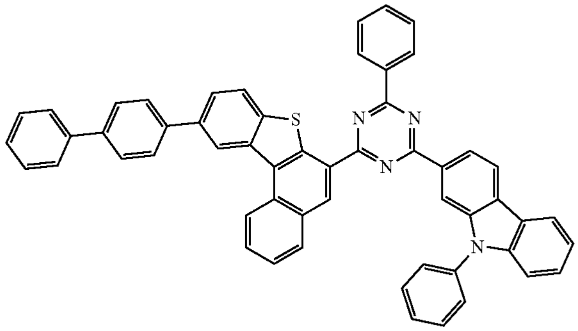
1-222
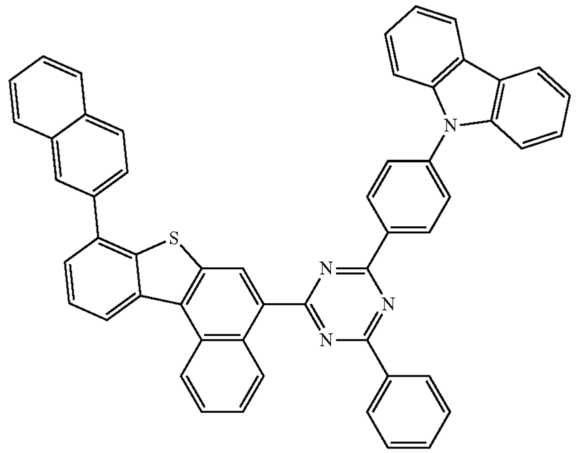
1-223
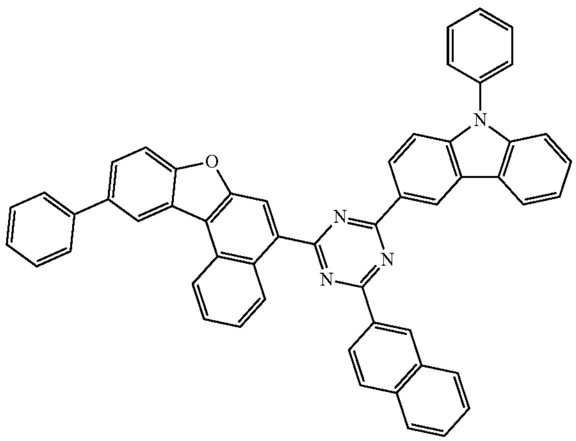
1-224
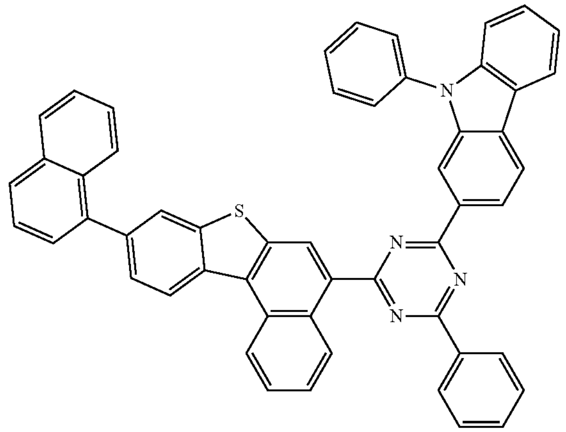
1-225
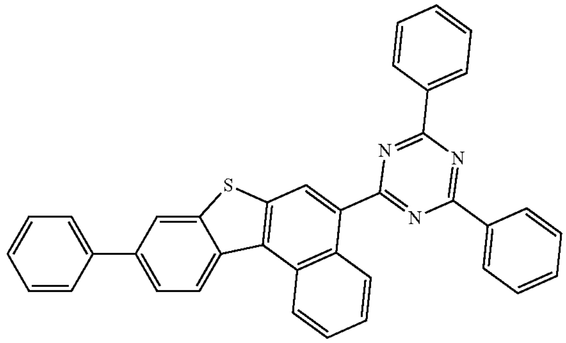
1-226
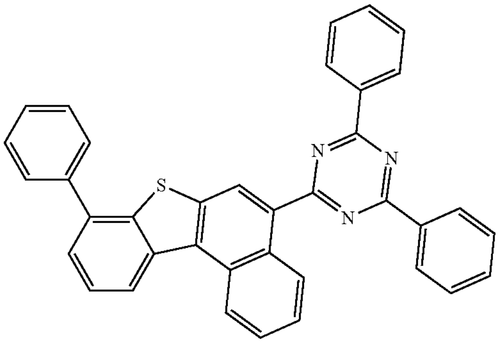

-continued 1-227

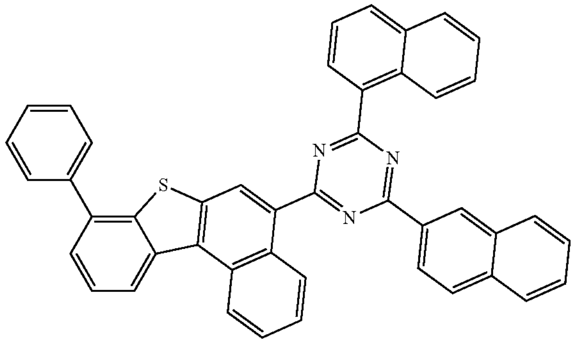

1-228

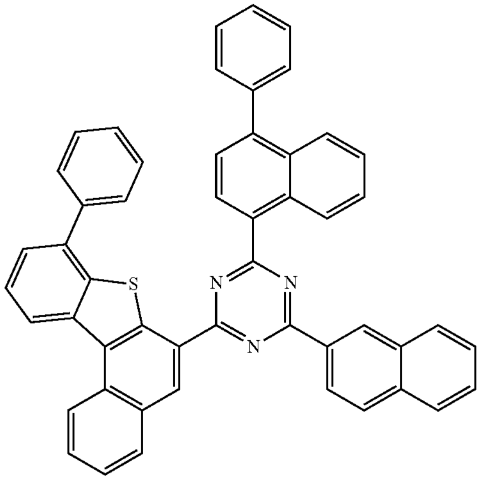

In one embodiment of the present specification, the organic material layer may include Compound (A) of Chemical Formula 1 and Compound (B) represented by Chemical Formula 2.

In one embodiment of the present specification, L1 of Chemical Formula 2 may be a direct bond; a substituted or unsubstituted arylene group having 6 to 40 carbon atoms; or a substituted or unsubstituted heteroarylene group having 2 to 40 carbon atoms.

In one embodiment of the present specification, L1 may be a direct bond; a substituted or unsubstituted arylene group having 6 to 30 carbon atoms; or a substituted or unsubstituted heteroarylene group having 2 to 30 carbon atoms.

In one embodiment of the present specification, L1 may be a direct bond; or a substituted or unsubstituted arylene group having 6 to 30 carbon atoms.

In one embodiment of the present specification, L1 may be a direct bond; or a phenylene group.

In one embodiment of the present specification, A1 may be a substituted or unsubstituted aryl group having 6 to 60 carbon atoms; a substituted or unsubstituted heteroaryl group having 2 to 60 carbon atoms; or a substituted or unsubstituted amine group.

In one embodiment of the present specification, A1 may be a substituted or unsubstituted aryl group having 6 to 60 carbon atoms; or a substituted or unsubstituted heteroaryl group having 2 to 60 carbon atoms.

In another embodiment, A1 may be a substituted or unsubstituted amine group.

In one embodiment of the present specification, A1 may be an amine group unsubstituted or substituted with one or more substituents selected from the group consisting of a substituted or unsubstituted aryl group and a substituted or unsubstituted heteroaryl group.

In one embodiment of the present specification, A1 may be an amine group unsubstituted or substituted with one or more substituents selected from the group consisting of an unsubstituted aryl group, an aryl group substituted with an alkyl group, an aryl group substituted with an aryl group, an aryl group substituted with a heteroaryl group, and a heteroaryl group.

In one embodiment of the present specification, A1 may be an amine group unsubstituted or substituted with one or more substituents selected from the group consisting of a phenyl group, a biphenyl group, a naphthyl group, a fluorenyl group substituted with an alkyl group, a phenyl group substituted with a naphthyl group, a phenyl group substituted with a dibenzofuran group, a phenyl group substituted with a dibenzothiophene group, a dibenzofuran group, a dibenzothiophene group and a benzonaphthofuran group.

In one embodiment of the present specification, Het may be a substituted or unsubstituted aryl group having 6 to 40 carbon atoms; or a substituted or unsubstituted heteroaryl group having 2 to 40 carbon atoms.

In one embodiment of the present specification, Het may be a substituted or unsubstituted heteroaryl group having 2 to carbon atoms.

In one embodiment of the present specification, Het may be represented by the following Structural Formula A or B.

[Structural Formula A]

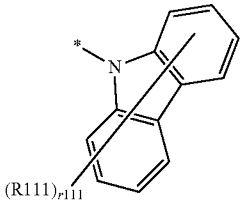

[Structural Formula B]

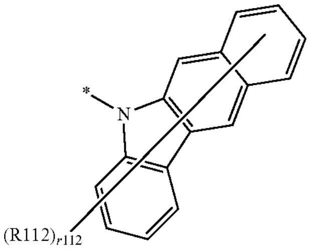

In Structural Formulae A and B,

* is a position bonding to Chemical Formula 2,

R111 and R112 are hydrogen; deuterium; or a substituted or unsubstituted aryl group having 6 to 60 carbon atoms, r111 is an integer of 1 to 8, r112 is an integer of 1 to 10, and when r111 and r112 are each 2 or greater, substituents in the parentheses are the same as or different from each other.

In one embodiment of the present specification, Chemical Formula 2 may be represented by the following Chemical Formula 2-1.

[Chemical Formula 2-1]

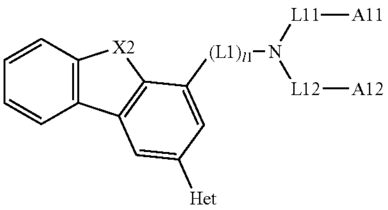

In Chemical Formula 2-1,

X2, Het, L1 and l1 have the same definitions as in Chemical Formula 2,

L11 and L12 are each independently a direct bond; a substituted or unsubstituted arylene group having 6 to 60 carbon atoms; or a substituted or unsubstituted heteroarylene group having 2 to 60 carbon atoms, and A11 and A12 are each independently a substituted or unsubstituted aryl group having 6 to 60 carbon atoms; or a substituted or unsubstituted heteroaryl group having 2 to 60 carbon atoms.

In one embodiment of the present specification, L11 and L12 may be each independently a direct bond; or a substituted or unsubstituted arylene group having 6 to 40 carbon atoms.

In one embodiment of the present specification, L11 and L12 may be each independently a direct bond; or a substituted or unsubstituted arylene group having 6 to 20 carbon atoms.

In one embodiment of the present specification, L11 and L12 may be each independently a direct bond; or an arylene group having 6 to 20 carbon atoms.

In one embodiment of the present specification, L11 and L12 may be each independently a direct bond; or a phenylene group.

In one embodiment of the present specification, A11 and A12 may be each independently a substituted or unsubstituted phenyl group; a substituted or unsubstituted biphenyl group; a substituted or unsubstituted naphthyl group; a substituted or unsubstituted fluorenyl group; a substituted or unsubstituted dibenzofuran group; a substituted or unsubstituted dibenzothiophene group; or a substituted or unsubstituted benzonaphthofuran group.

In one embodiment of the present specification, A11 and A12 may be each independently a phenyl group unsubstituted or substituted with a naphthyl group, a dibenzofuran group or a dibenzothiophene group; a biphenyl group; a naphthyl group; a fluorenyl group substituted with an alkyl group; a dibenzofuran group; a dibenzothiophene group; or a benzonaphthofuran group.

In one embodiment of the present specification, Chemical Formula 2 may be represented by any one of the following compounds, but is not limited thereto.

2-1

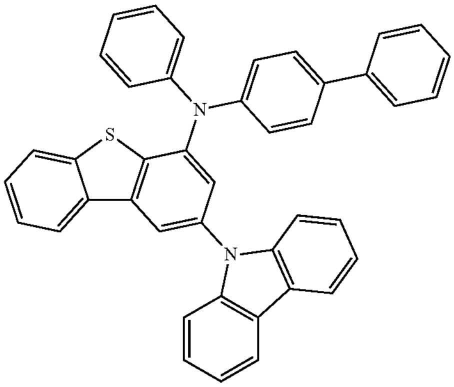

2-2

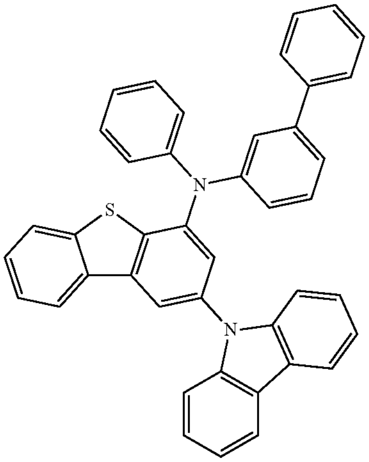

2-3

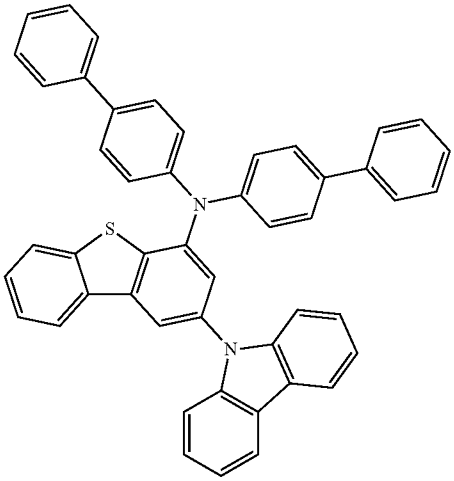

-continued
2-4
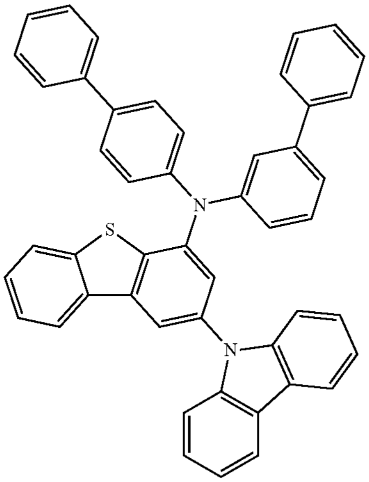
2-5
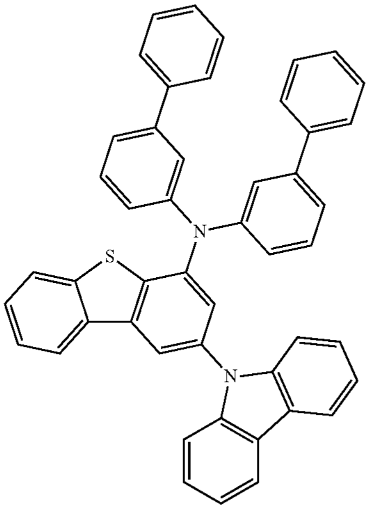
2-6
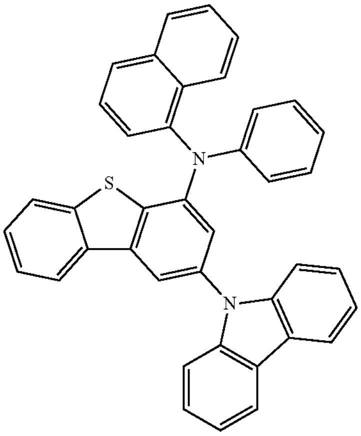
-continued
2-7
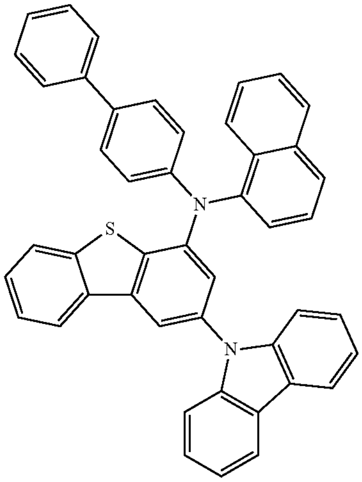
2-8
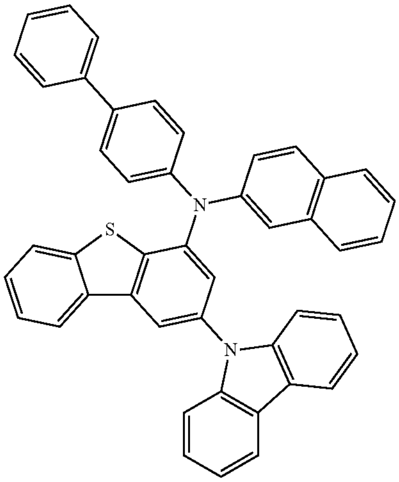
2-9
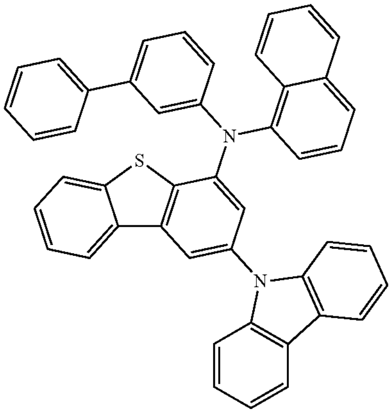

-continued
2-10
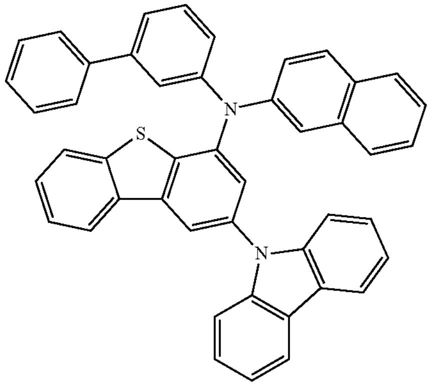
2-11
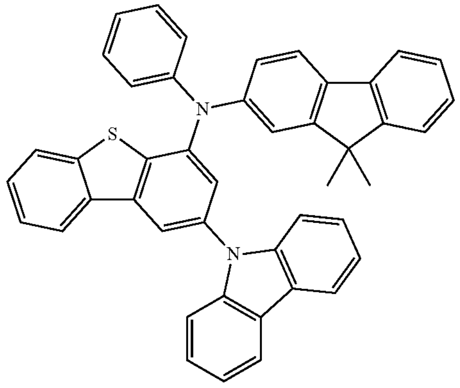
2-12
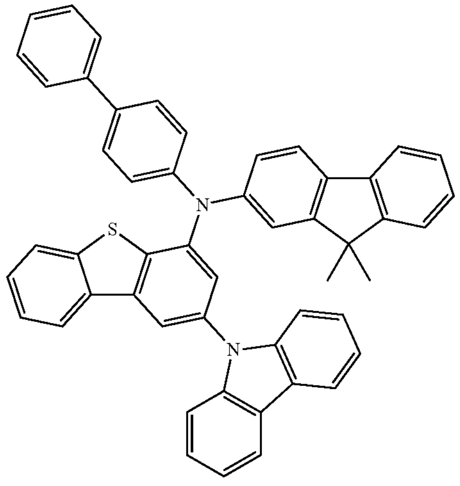
2-13
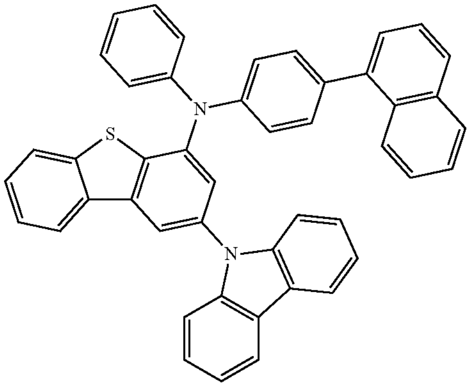
-continued
2-14
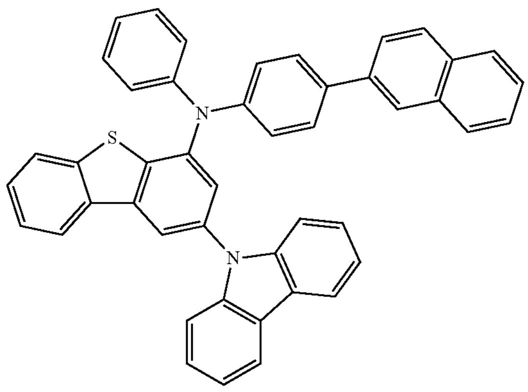
2-15
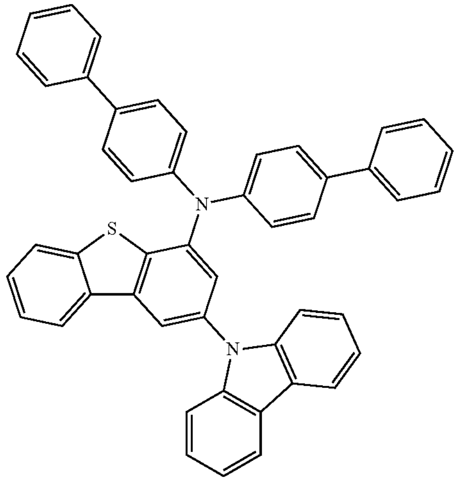
2-16
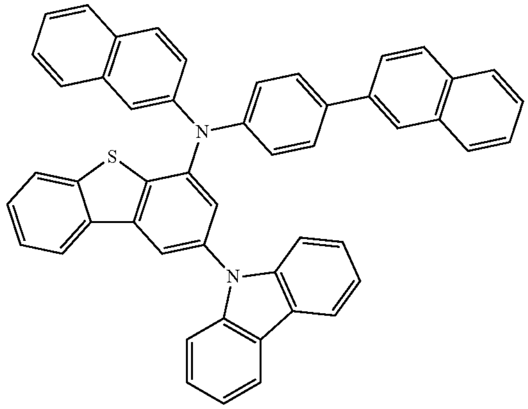

-continued
2-17
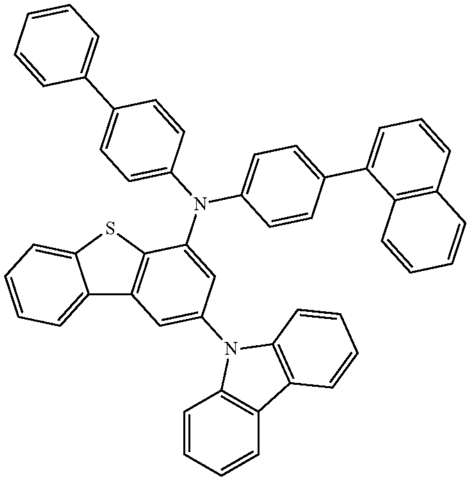
2-18
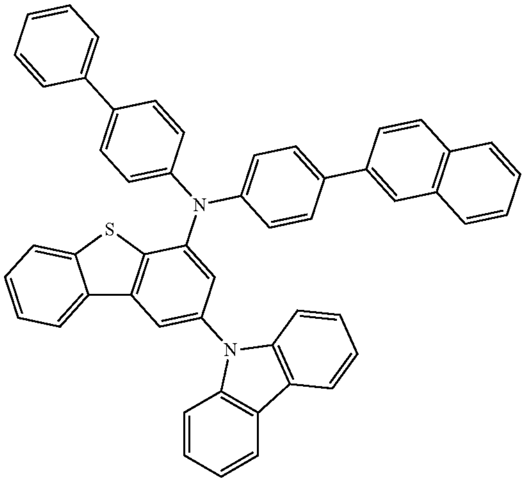
2-19
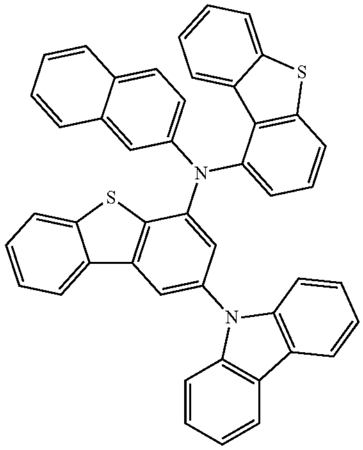
-continued
2-20
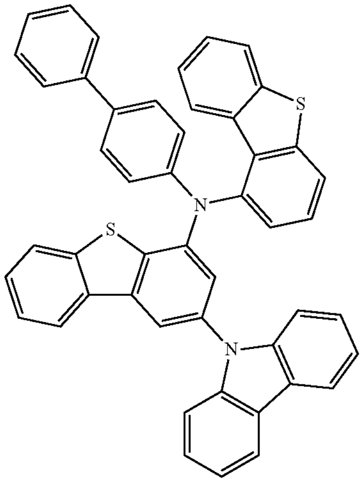
2-21
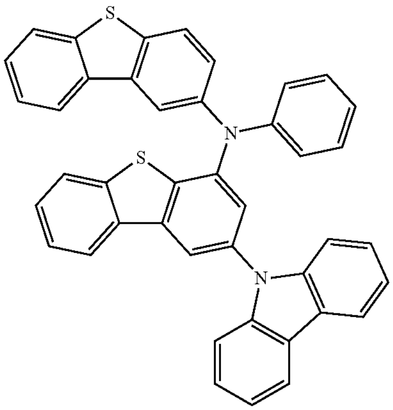
2-22
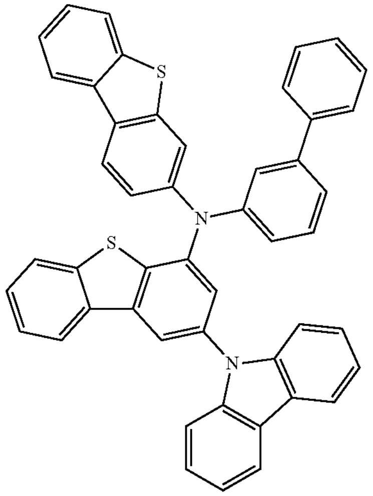

-continued
2-23
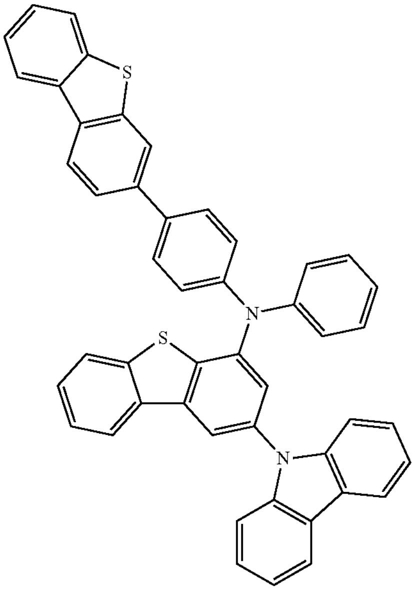
2-24
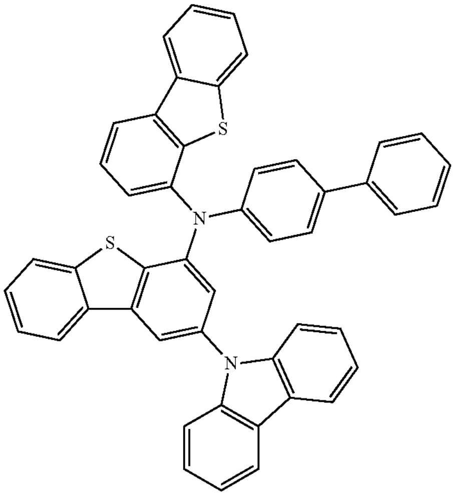
2-25
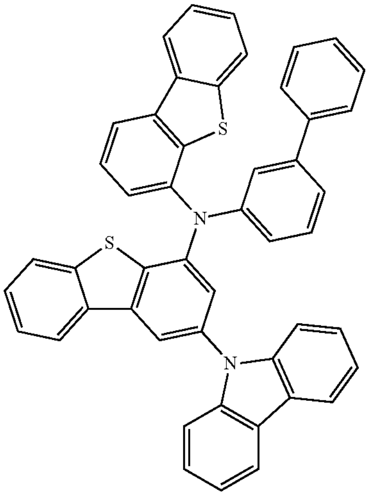
-continued
2-26
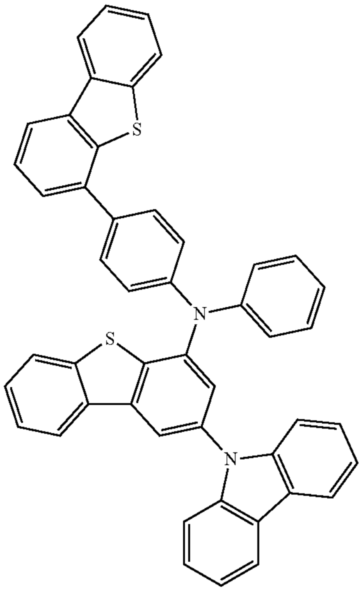
2-27
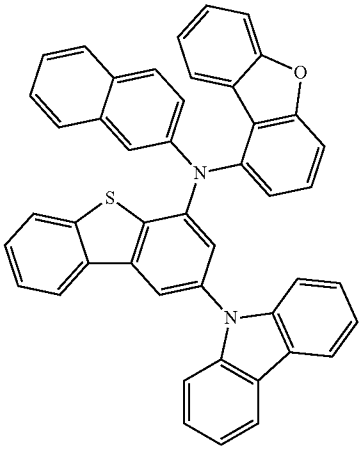
2-28
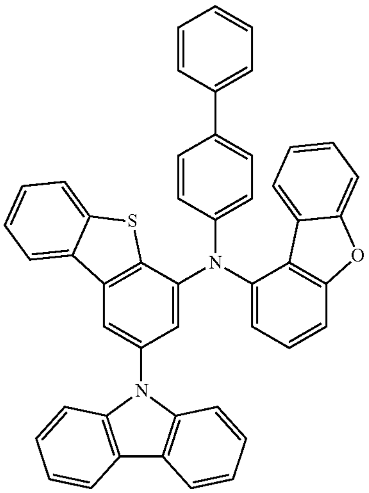

-continued
2-29
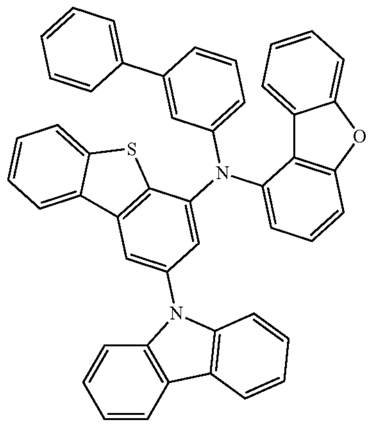
2-30
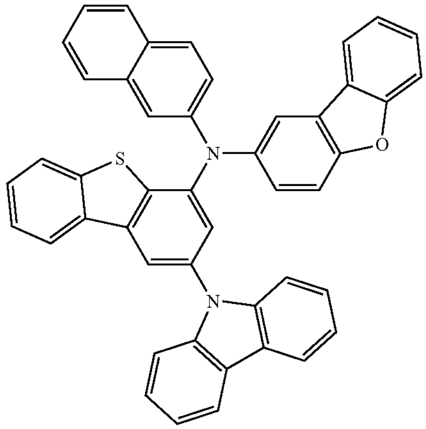
2-31
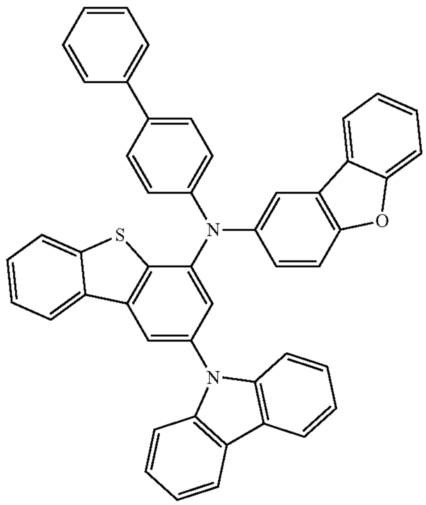
-continued
2-32
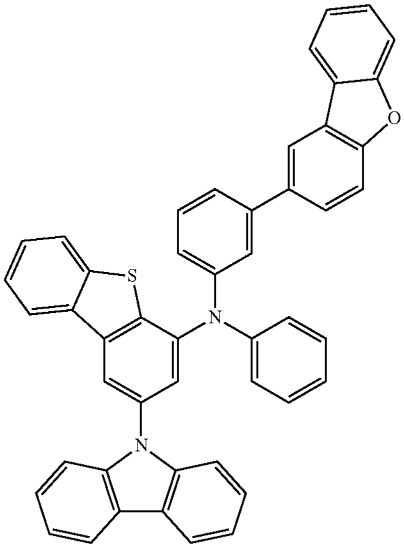
2-33
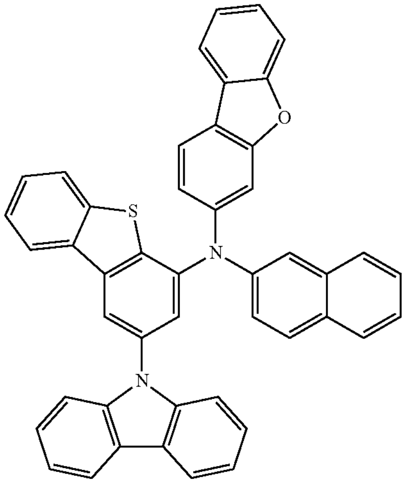
2-34
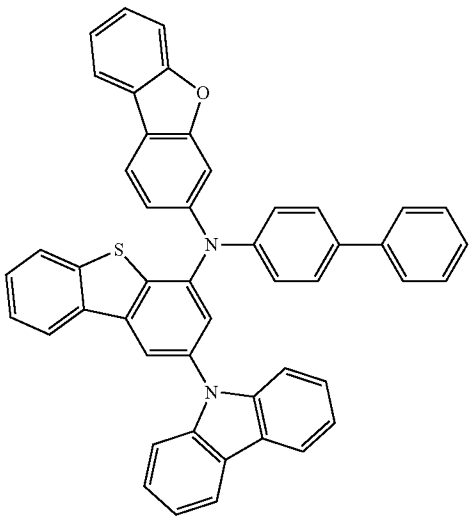

-continued
2-35
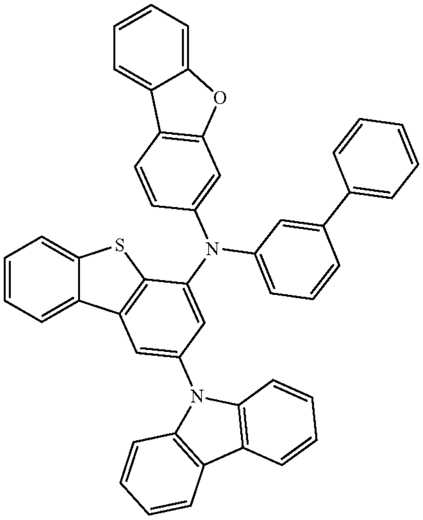
2-36
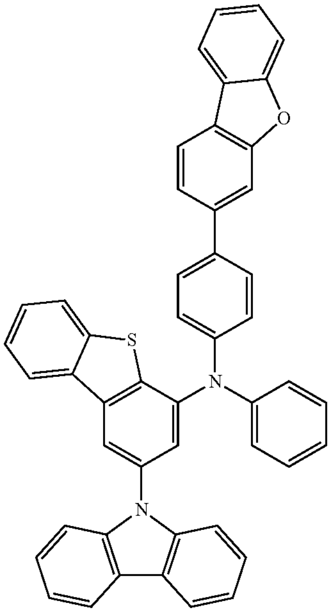
2-37
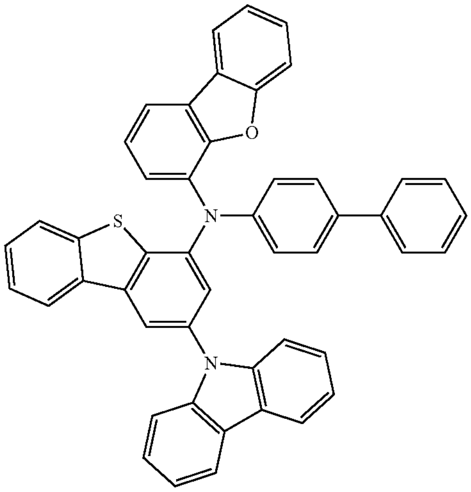
-continued
2-38
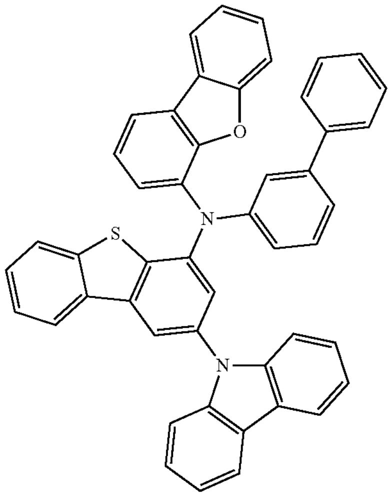
2-39
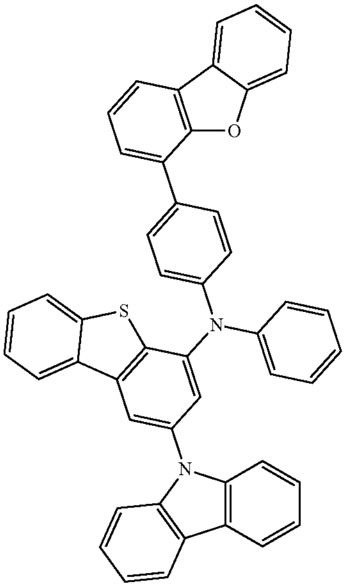
2-40
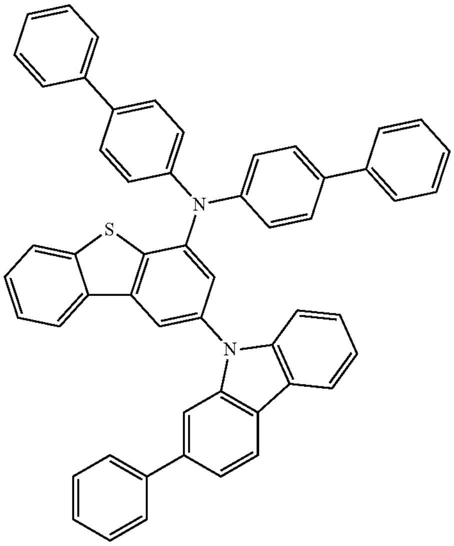

-continued
2-41
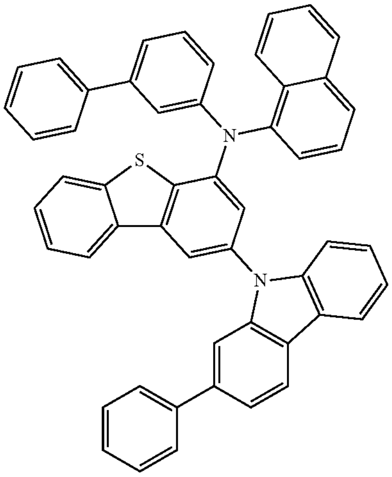
2-42
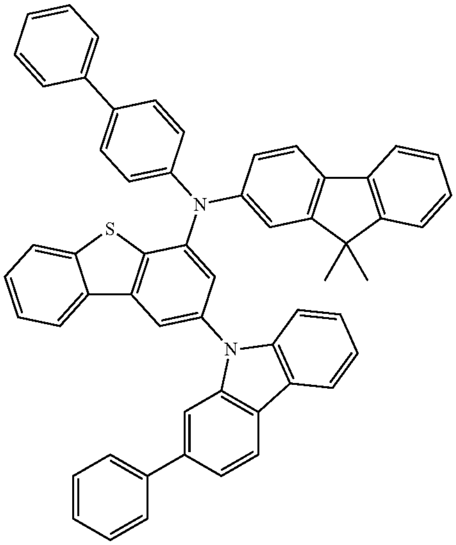
2-43
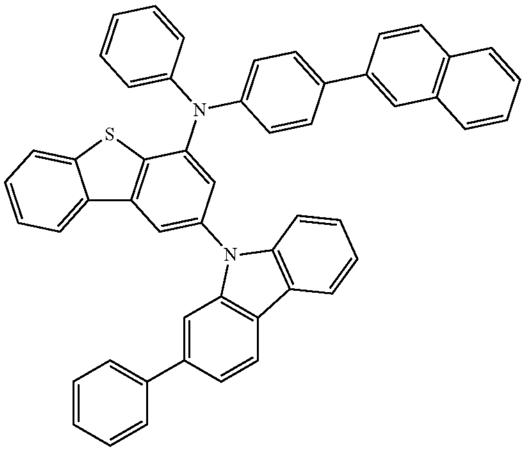
-continued
2-44
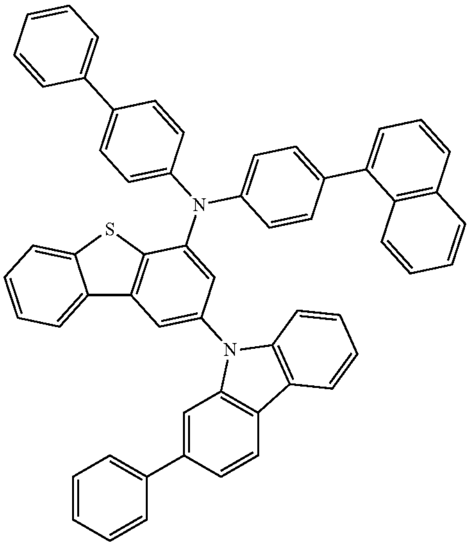
2-45
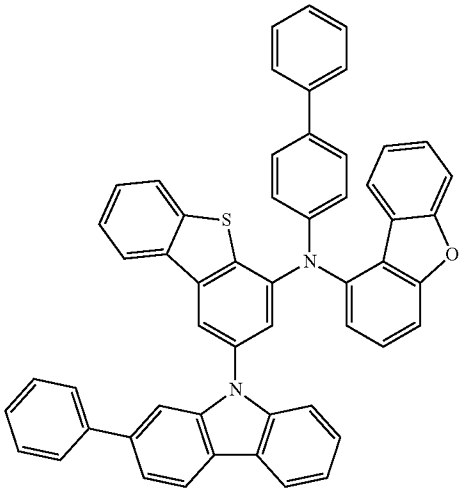
2-46
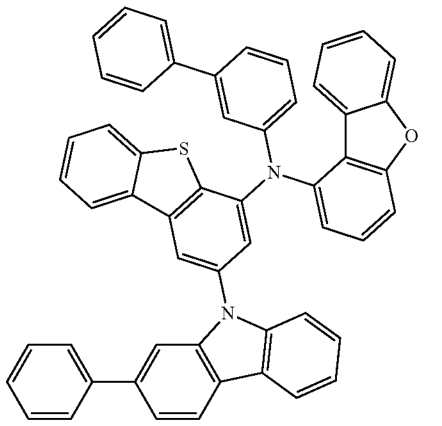

-continued
2-47
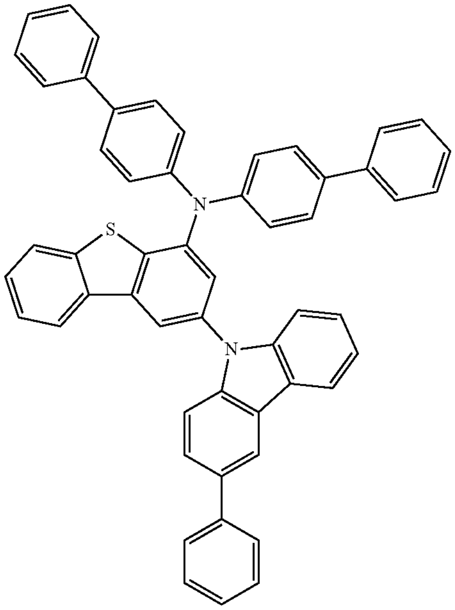
2-48
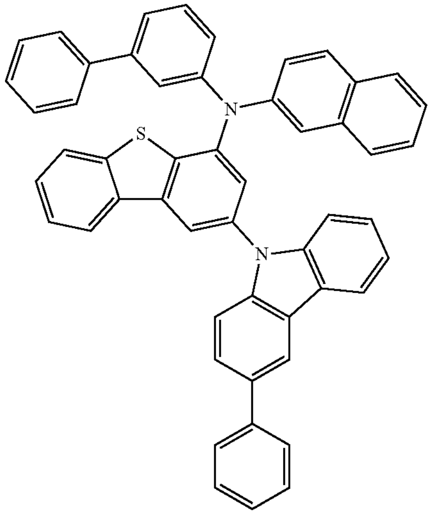
2-49
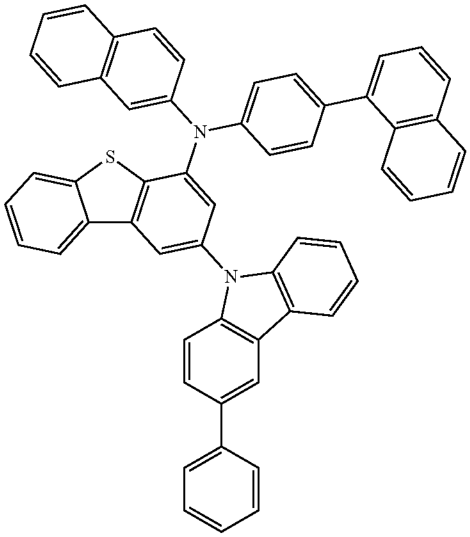
-continued
2-50
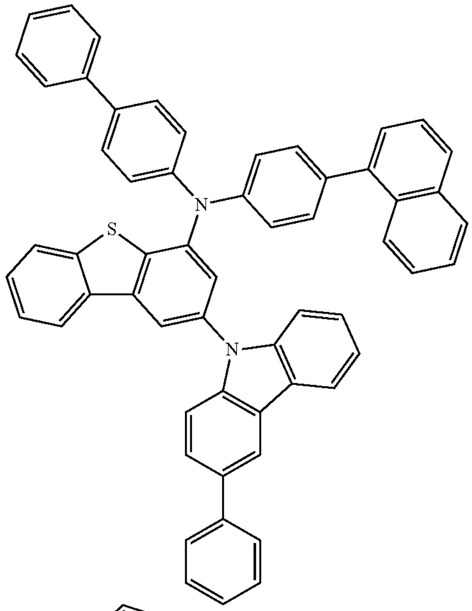
2-51
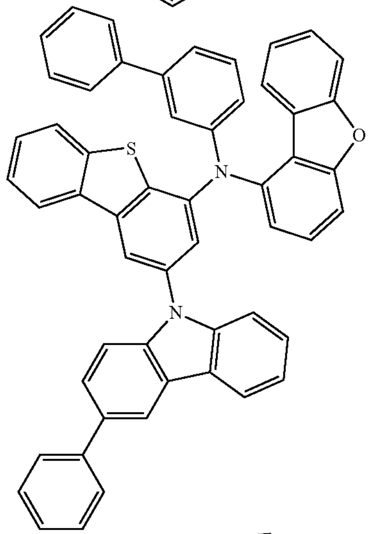
2-52
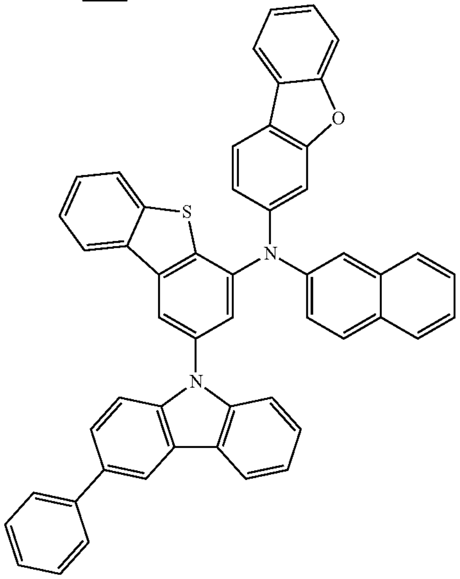

-continued
2-53
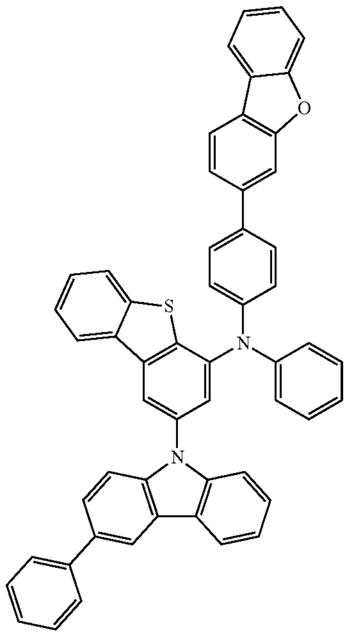
2-54
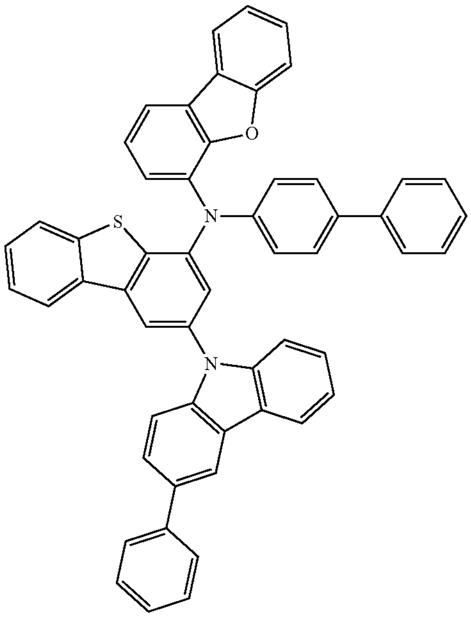
-continued
2-55
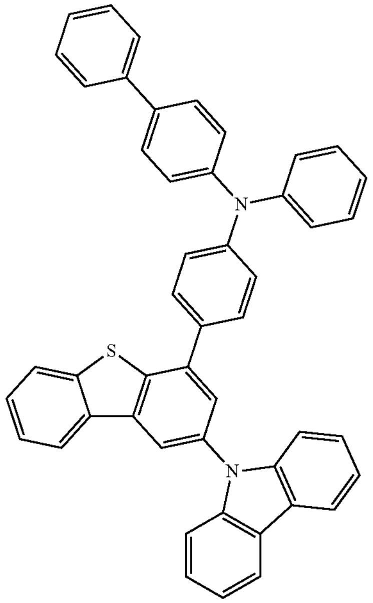
2-56
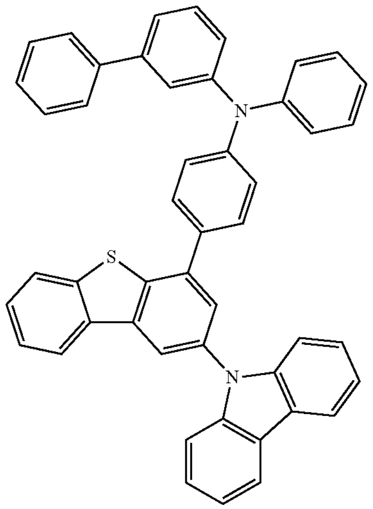

-continued
2-57
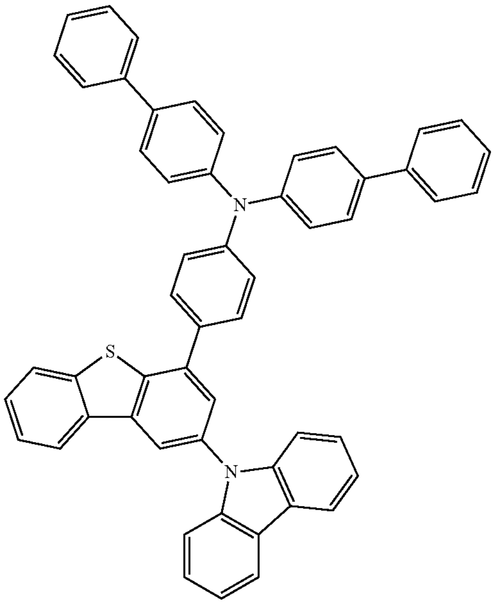
2-58
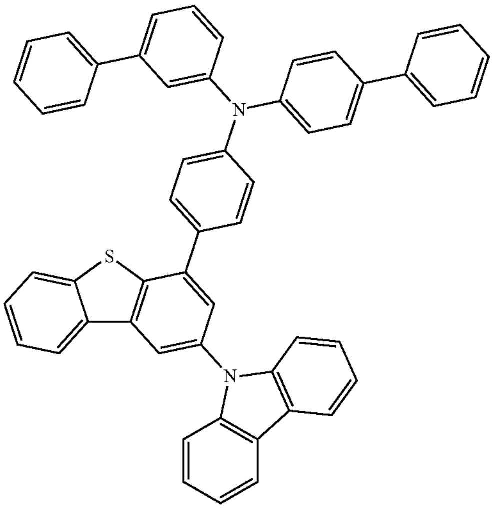
2-59
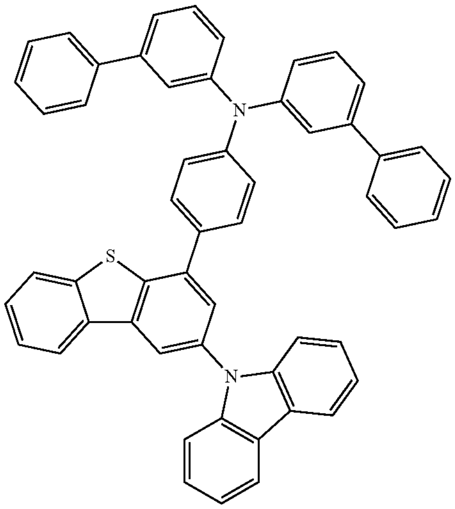
-continued
2-60
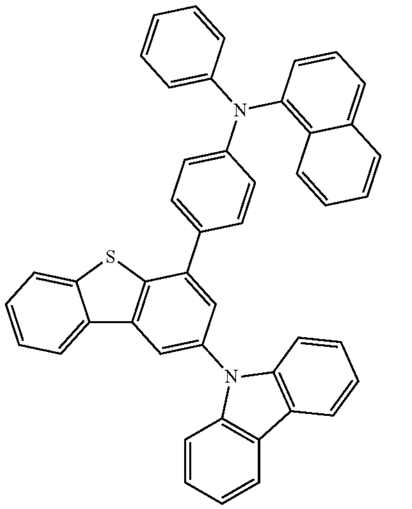
2-61
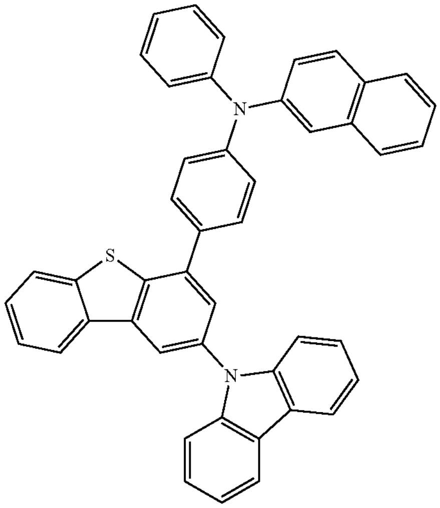
2-62
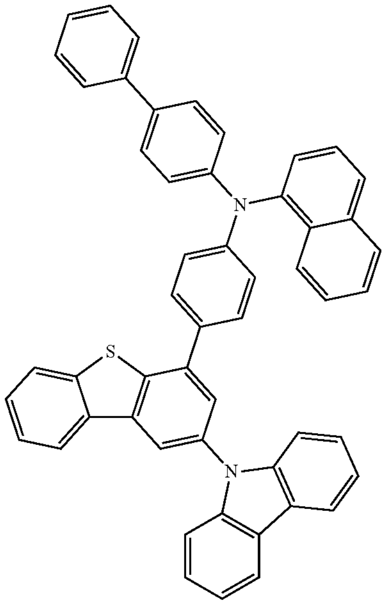

-continued
2-63
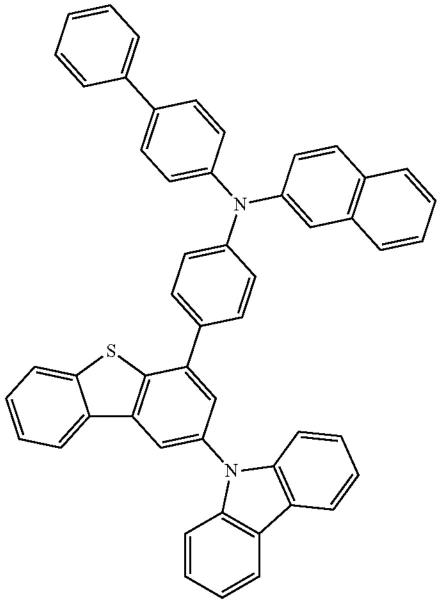
2-64
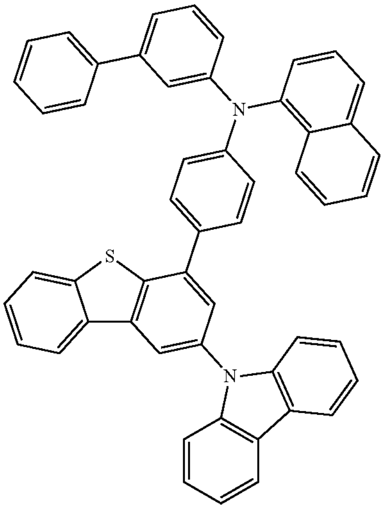
2-65
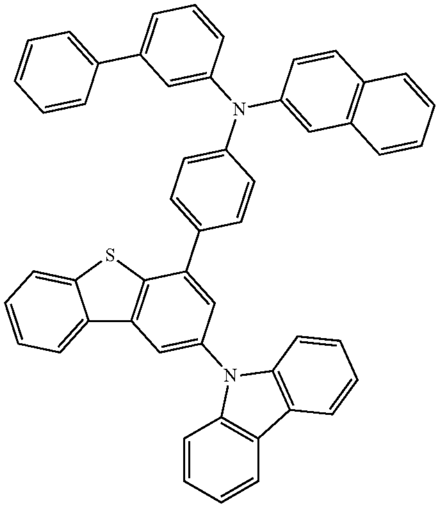
-continued
2-66
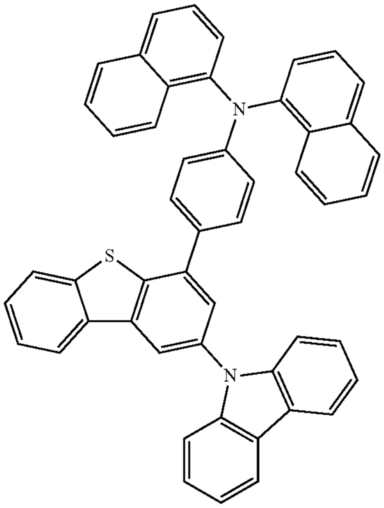
2-67
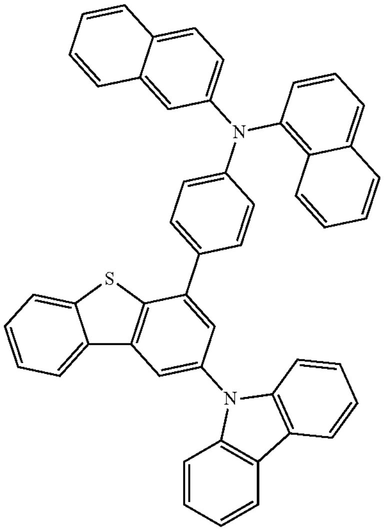
2-68
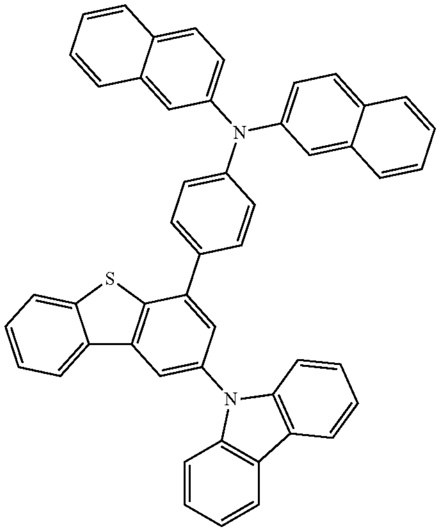

-continued
2-69
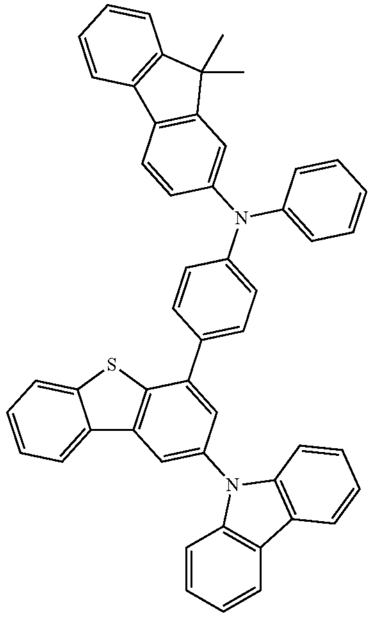
2-70
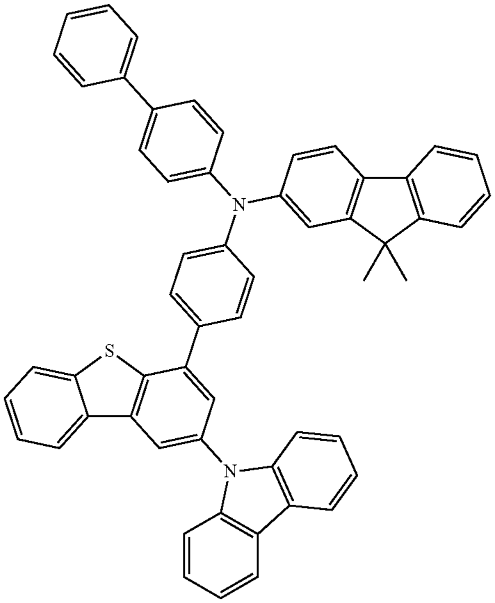
-continued
2-71
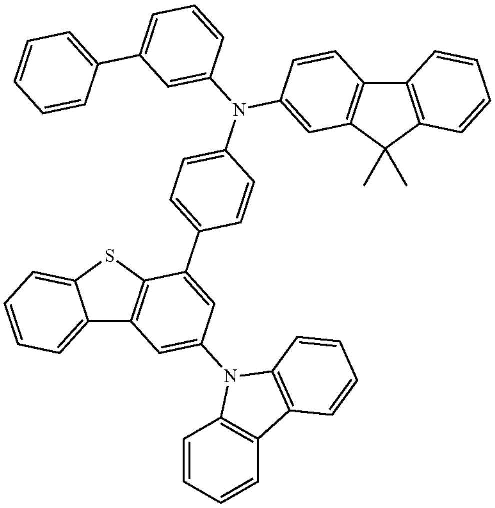
2-72
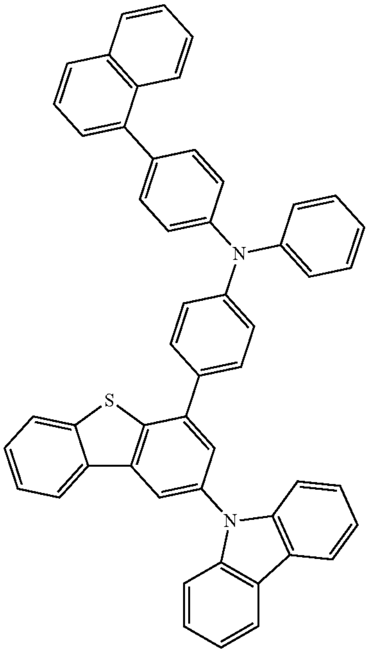

2-73
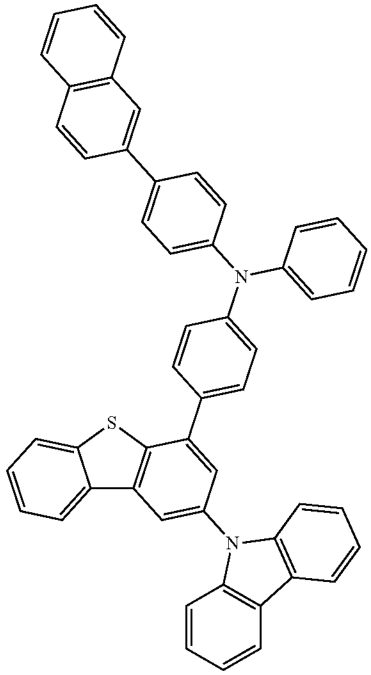
2-74
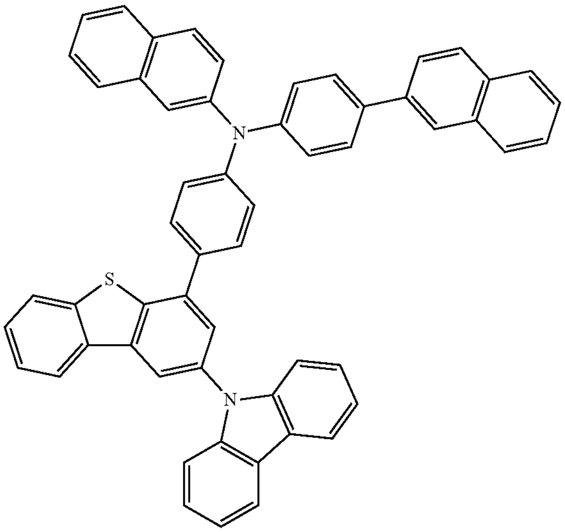
2-75
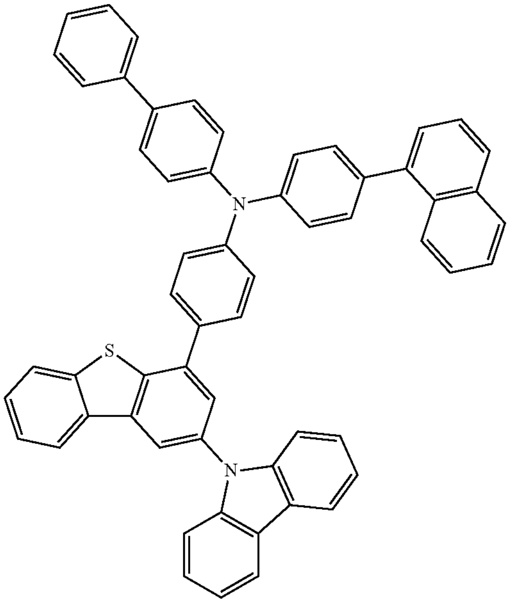
2-76
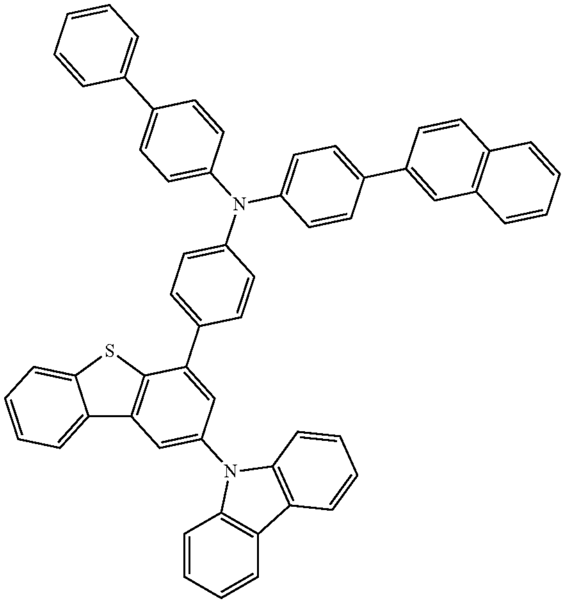

-continued
2-77
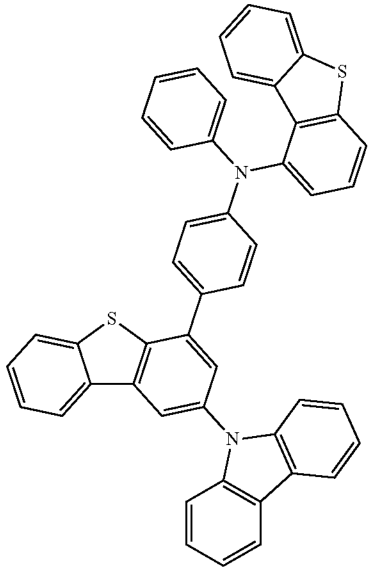
2-78
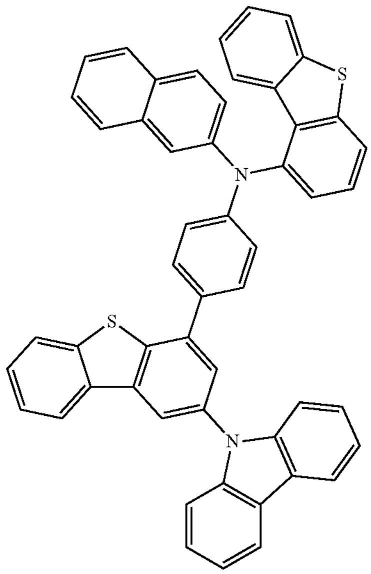
-continued
2-79
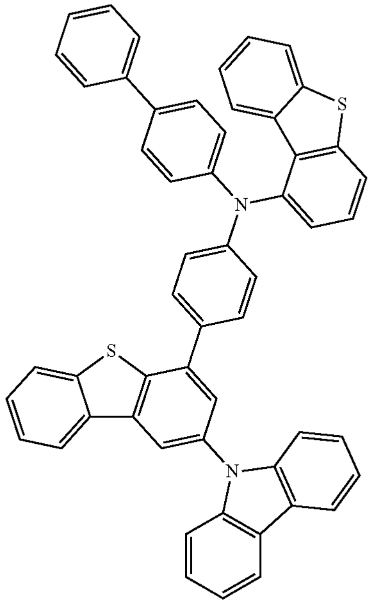
2-80
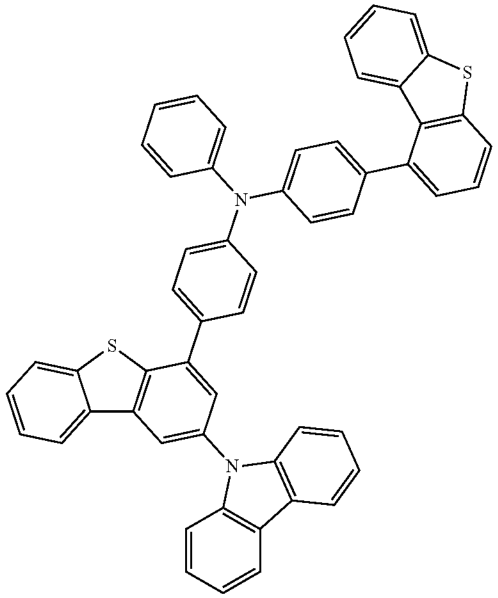

2-81
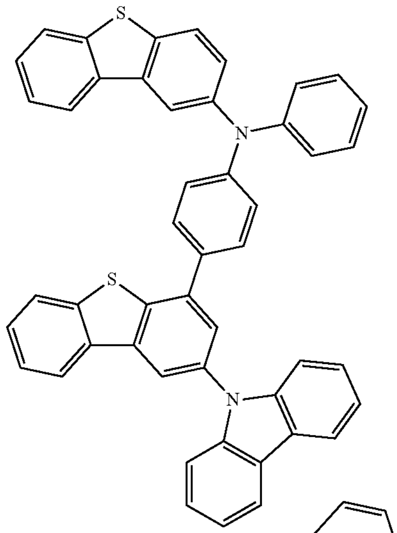
2-82
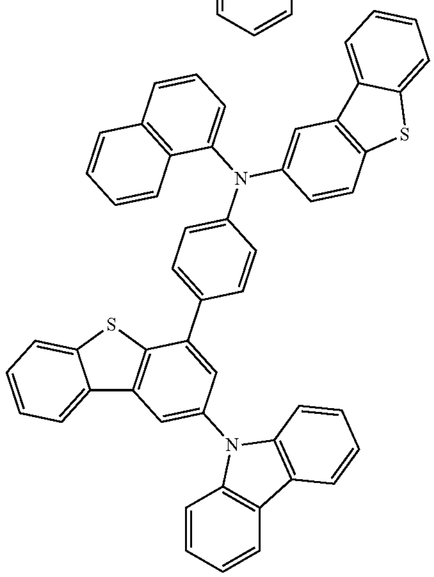
2-83
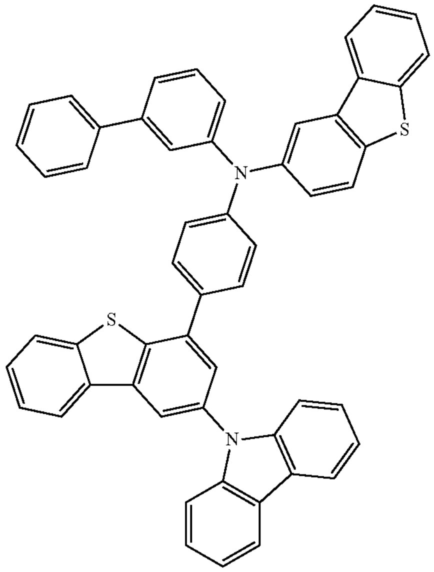
2-84
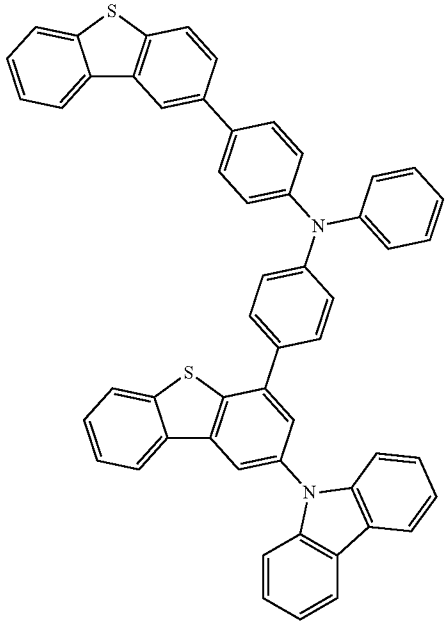
2-85
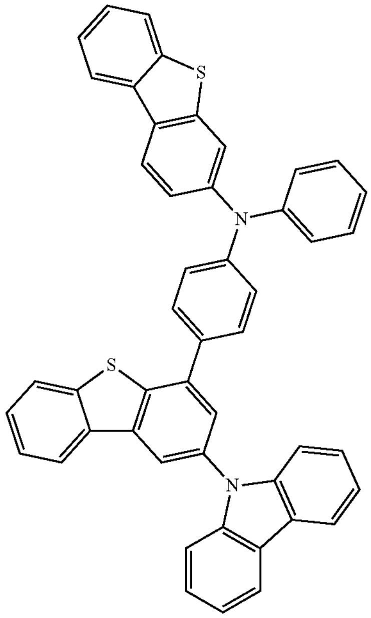

-continued
2-86
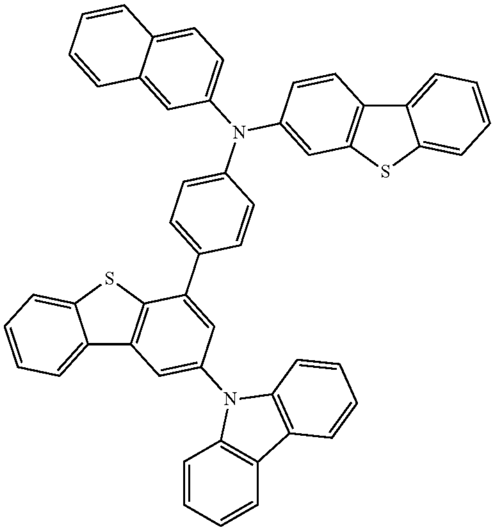
2-87
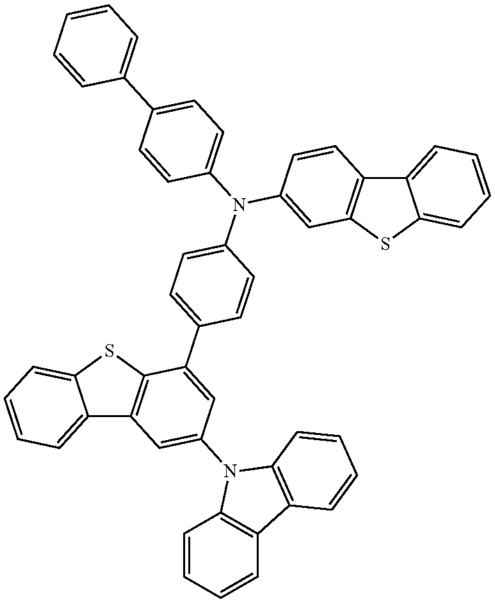
2-88
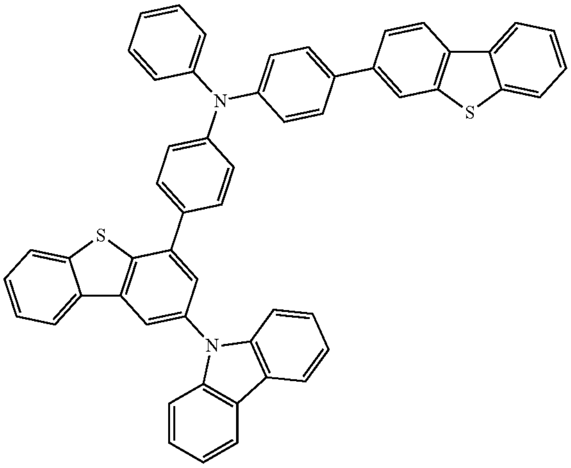
-continued
2-89
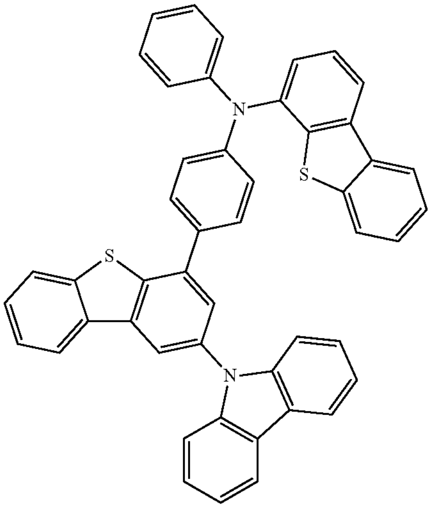
2-90
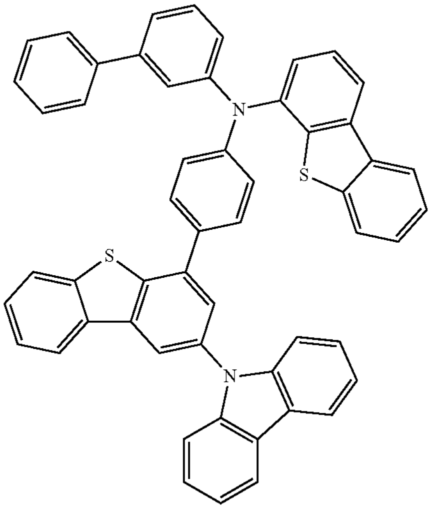
2-91
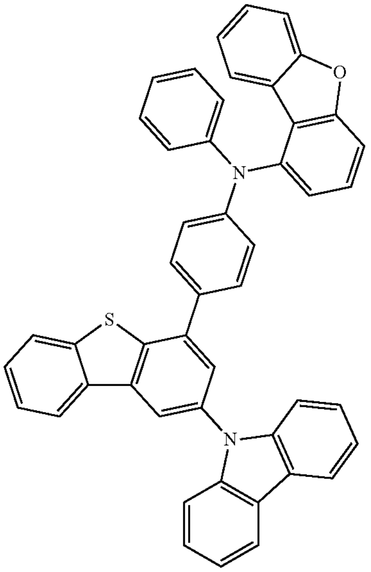

-continued
2-92
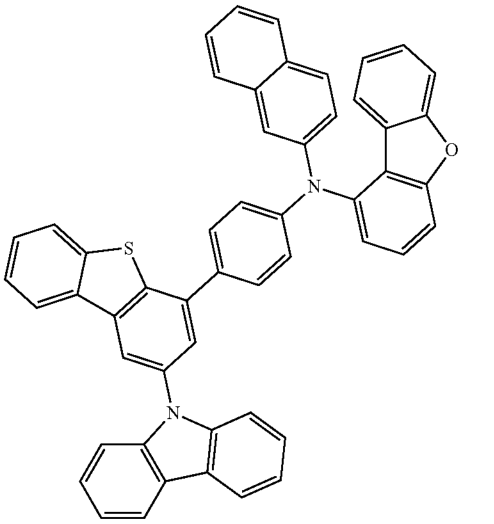
2-93
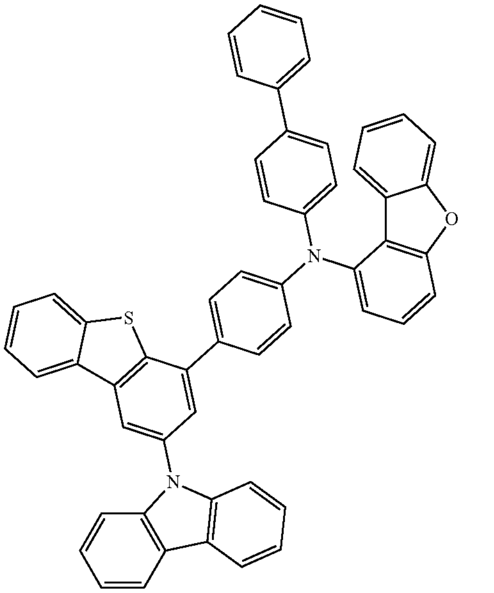
2-94
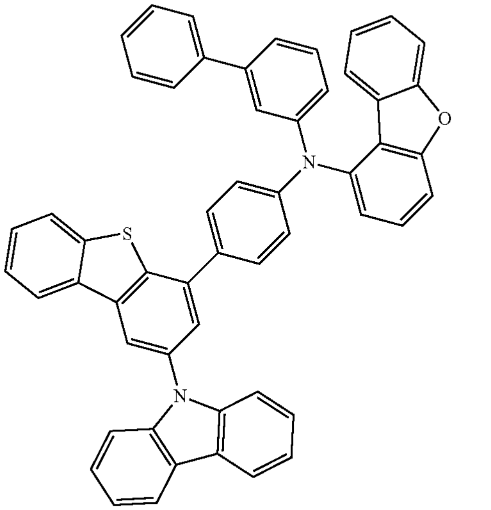
-continued
2-95
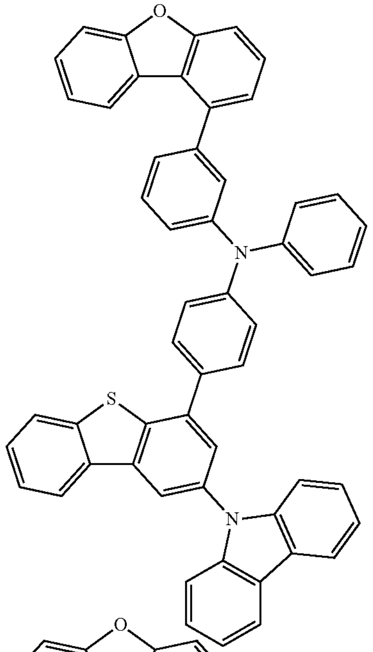
2-96
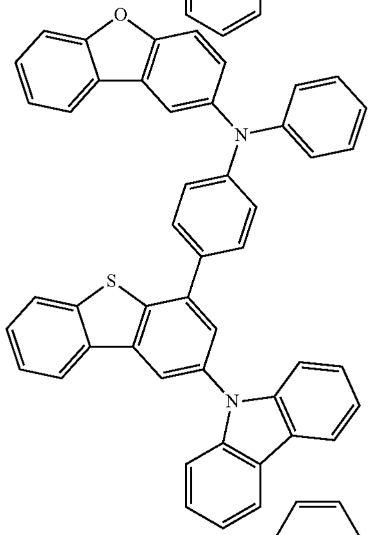
2-97
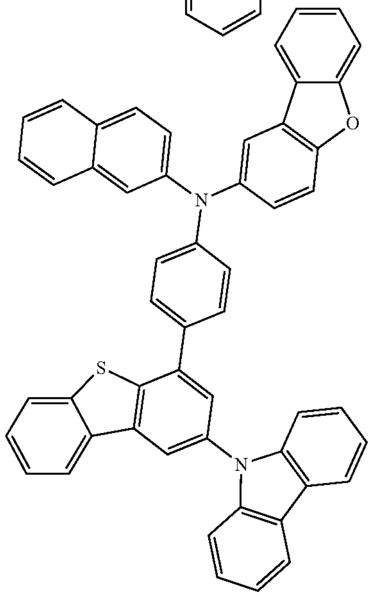

2-98
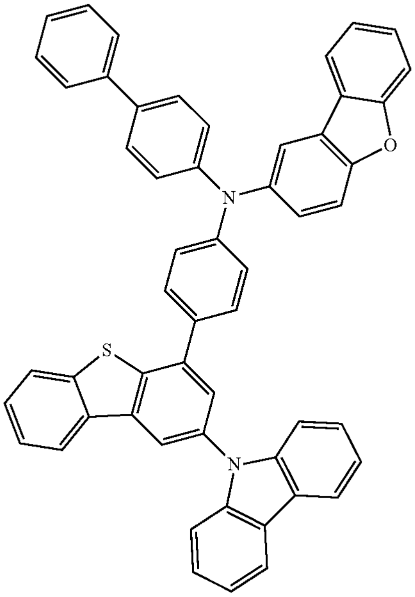
2-99
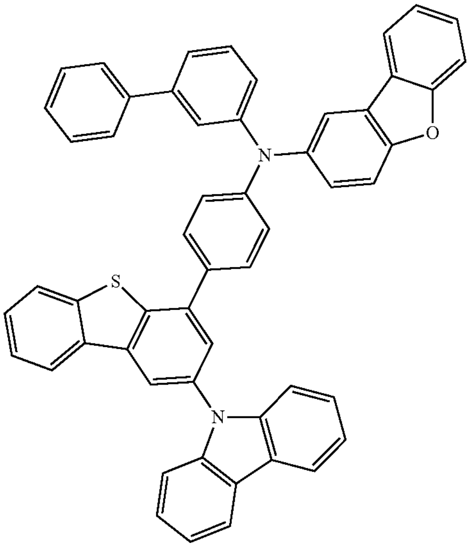
2-100
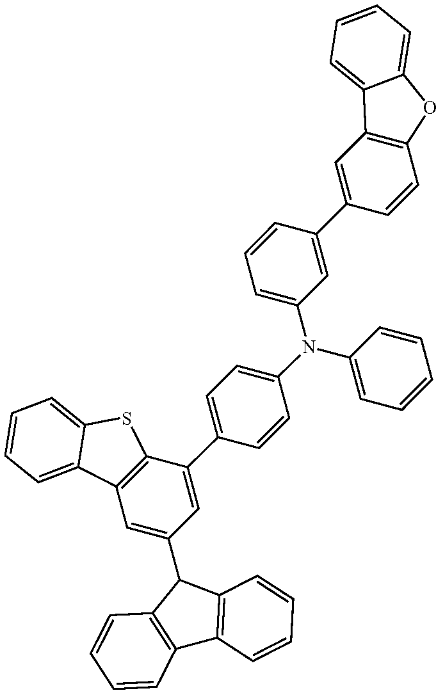
2-101
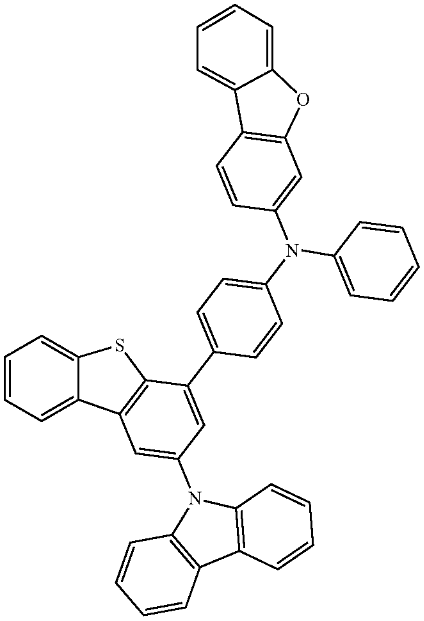

-continued
2-102
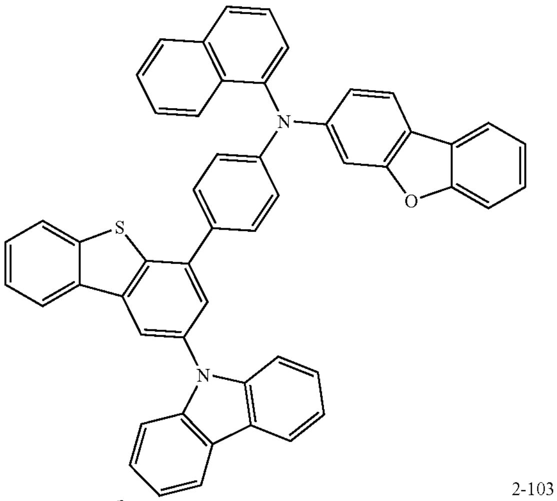
2-103
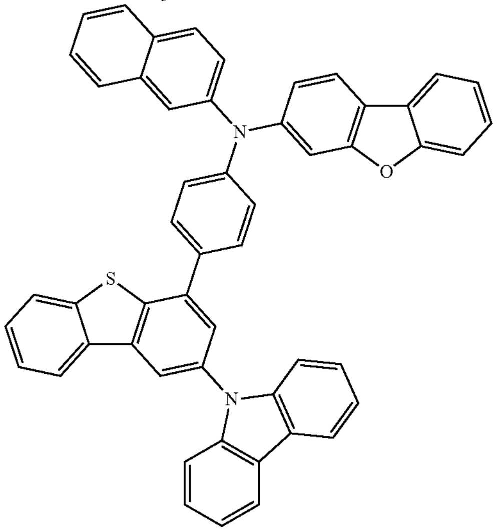
2-104
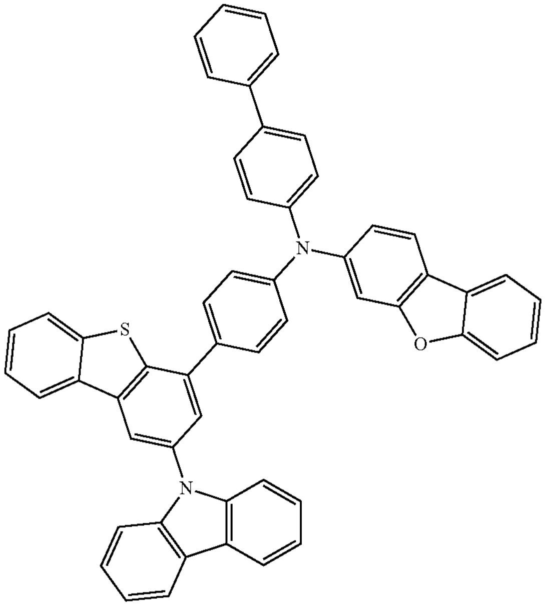
-continued
2-105
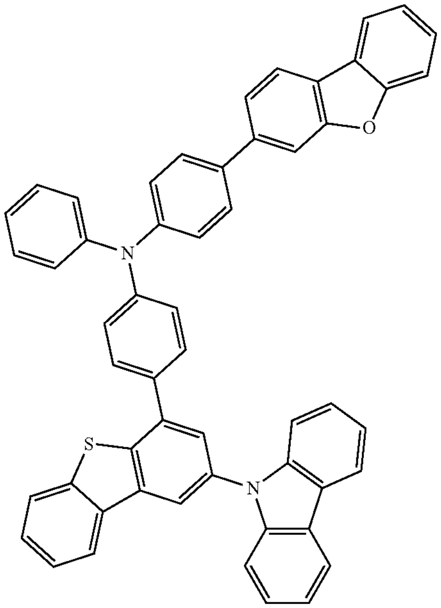
2-106
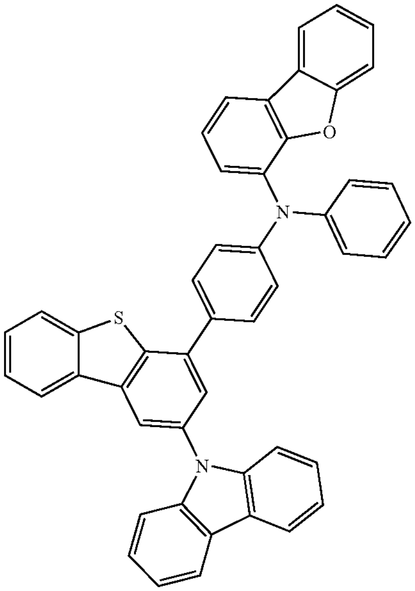

-continued
2-107
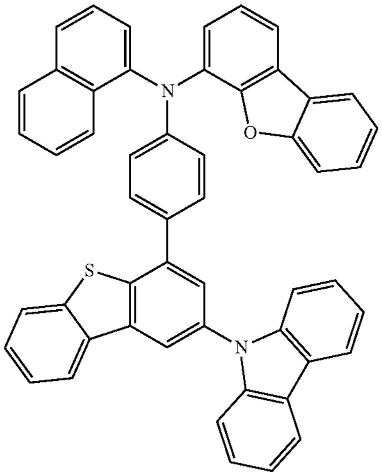
2-108
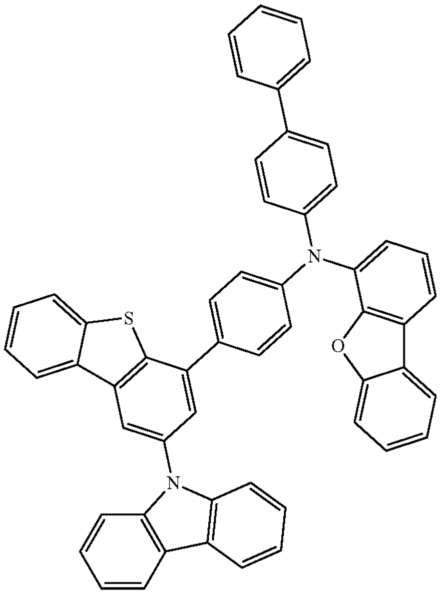
2-109
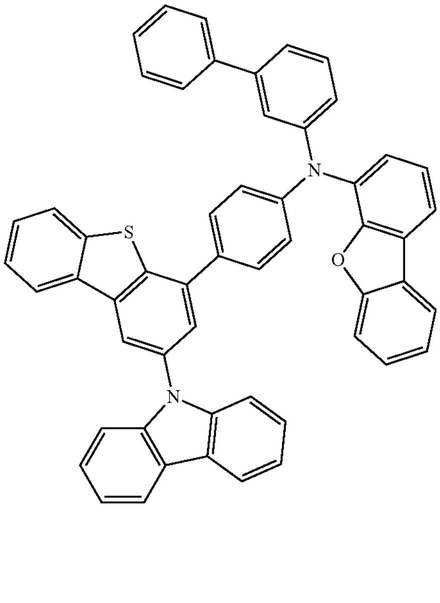
-continued
2-110
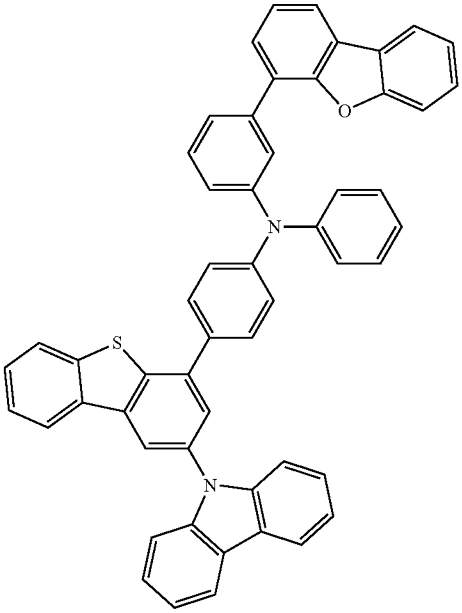
2-111
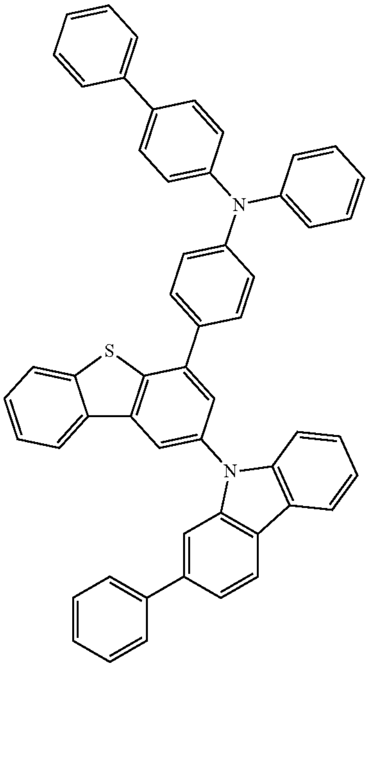

-continued
2-112
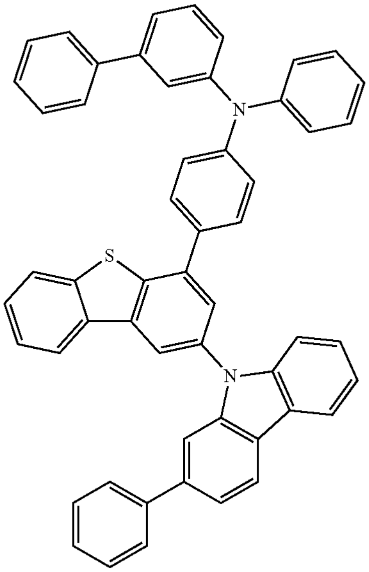
2-113
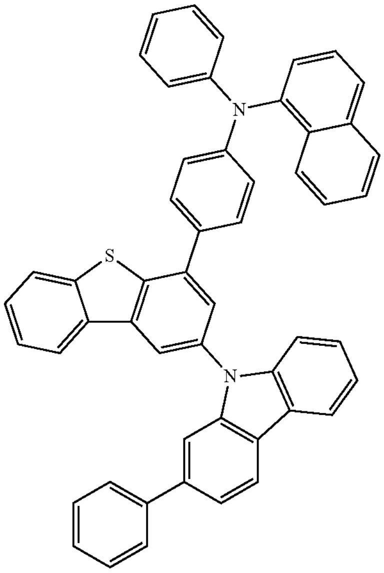
-continued
2-114
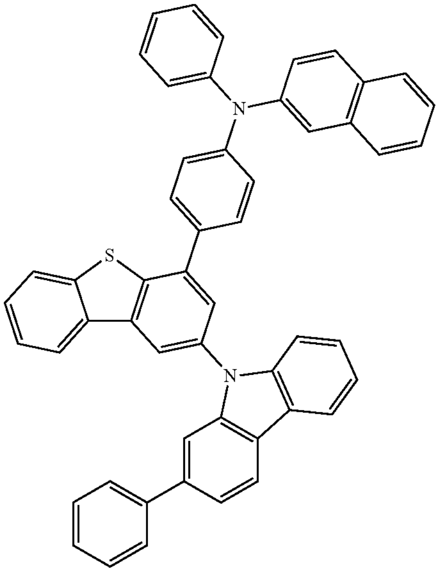
2-115
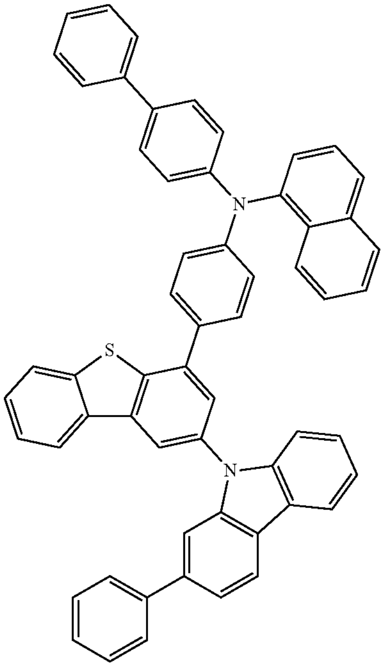

-continued
2-116
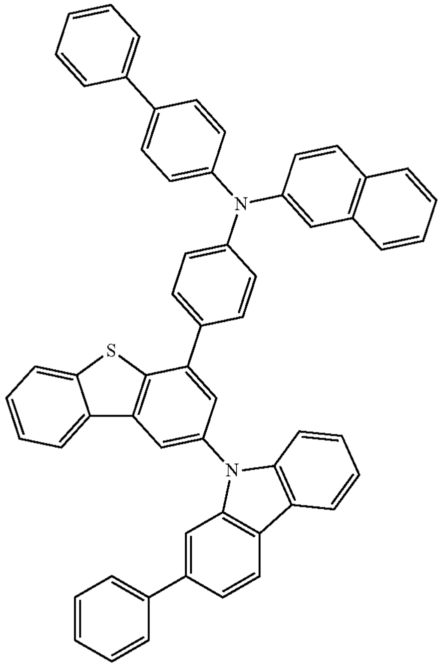
2-117
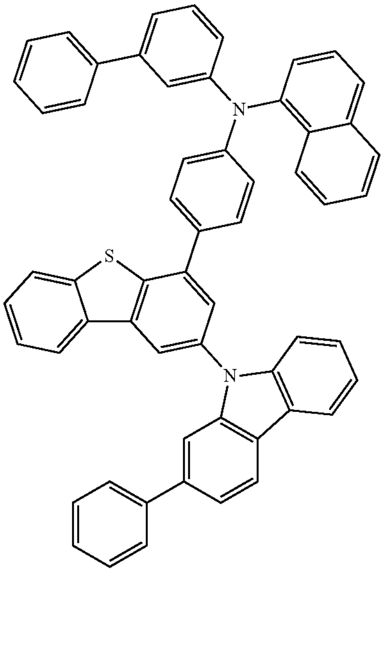
-continued
2-118
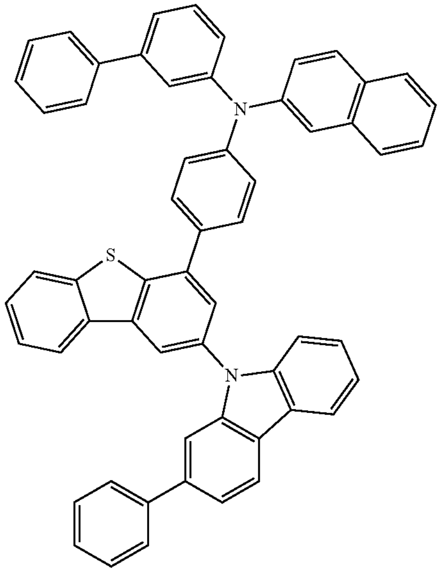
2-119
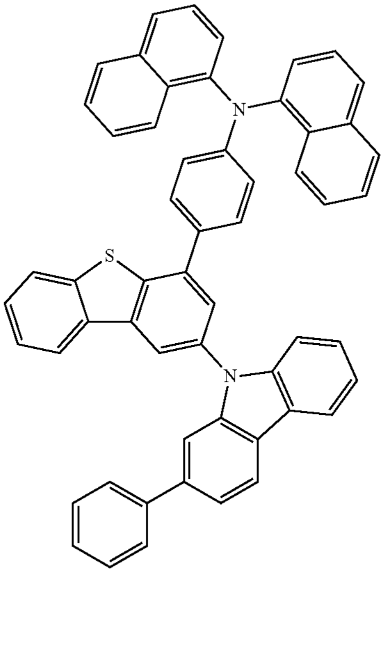

-continued
2-120
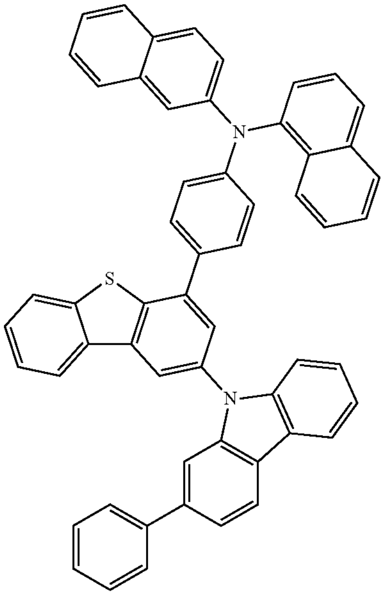
2-121
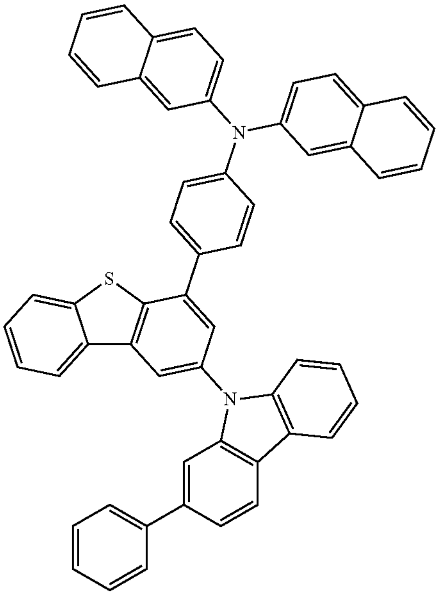
-continued
2-122
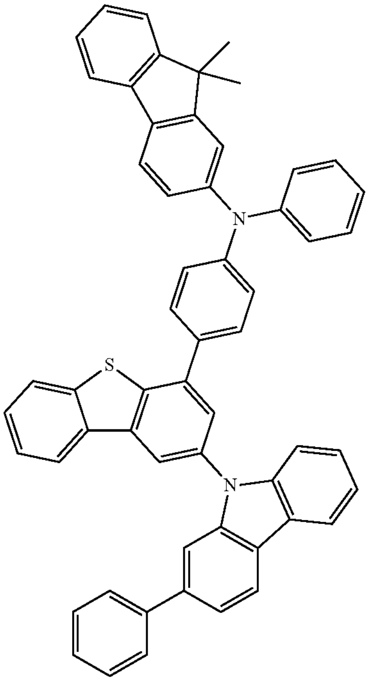
2-123
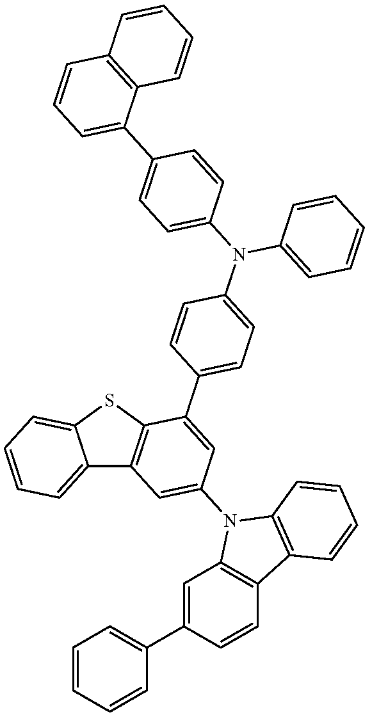

-continued
2-124
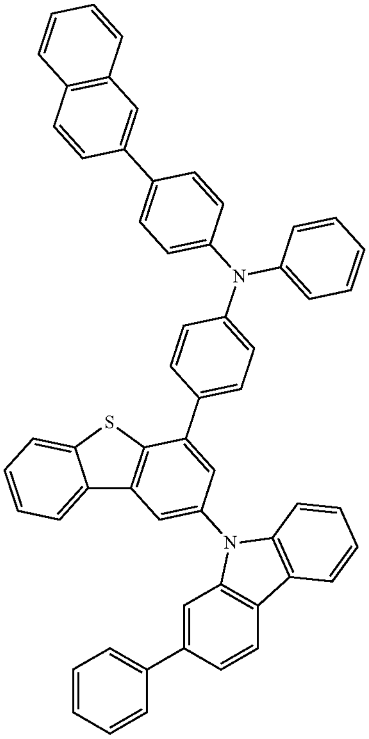
2-125
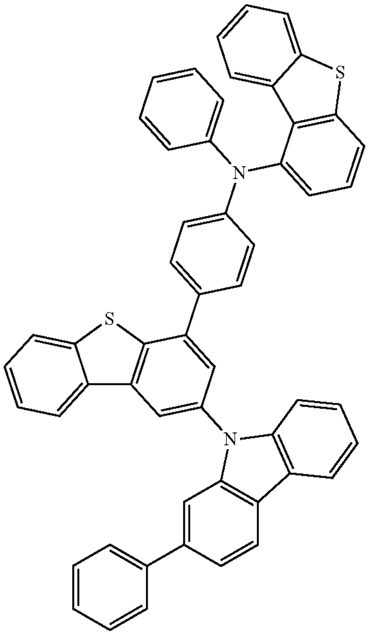
-continued
2-126
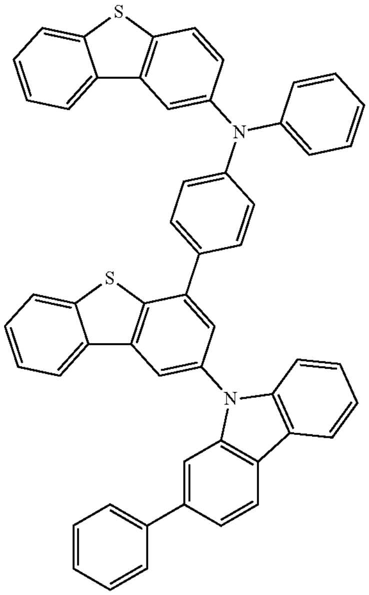
2-127
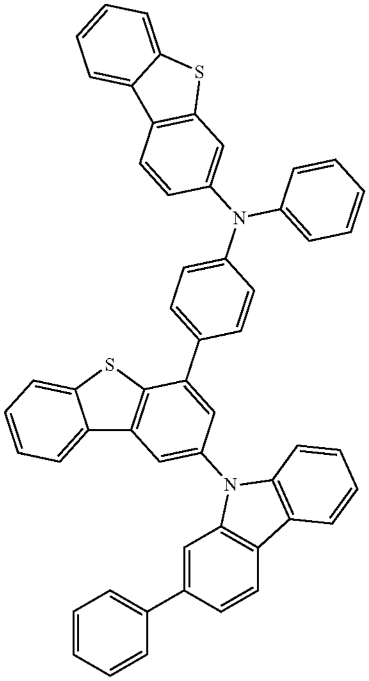

-continued
2-128
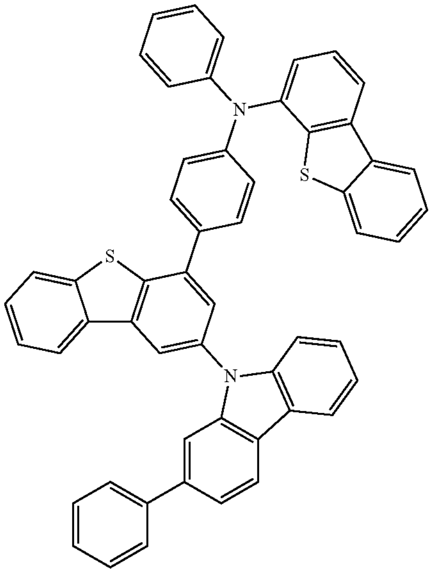
2-129
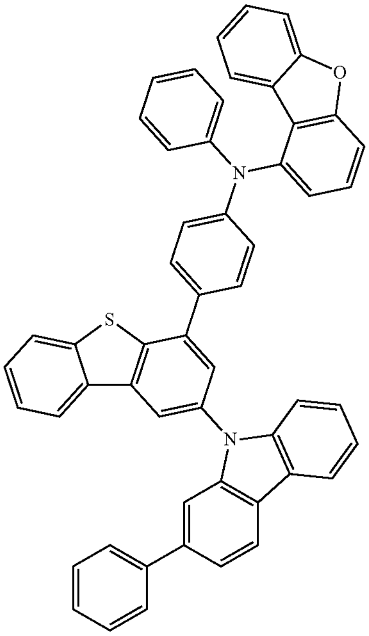
-continued
2-130
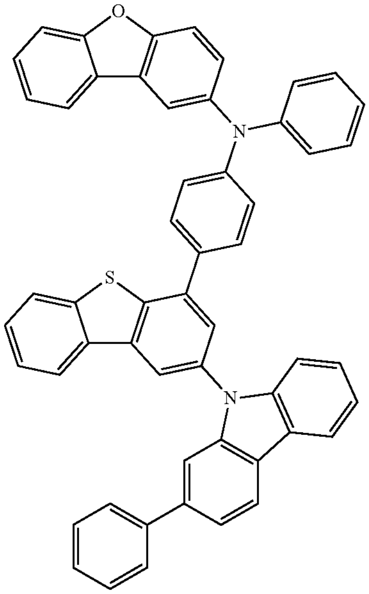
2-131
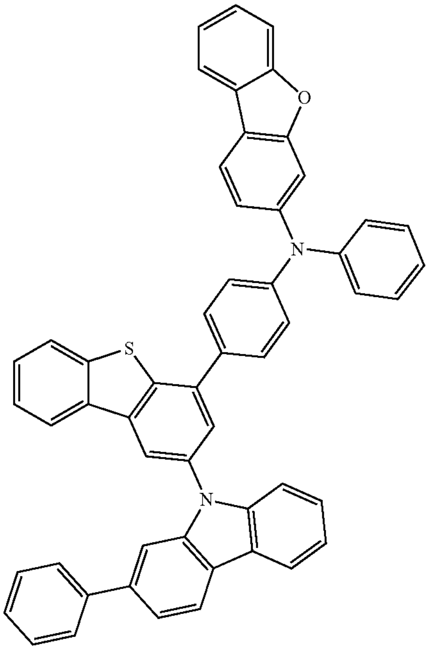

-continued
2-132
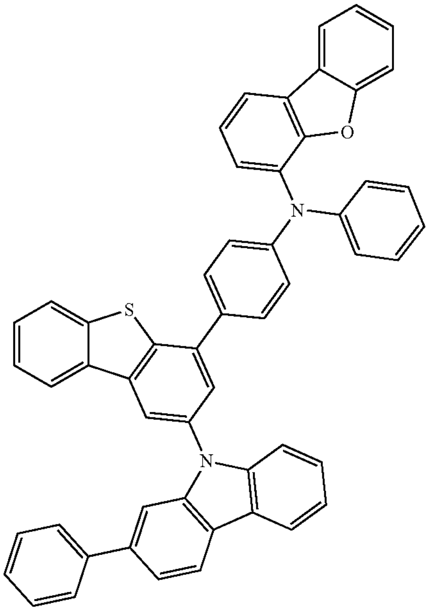
2-133
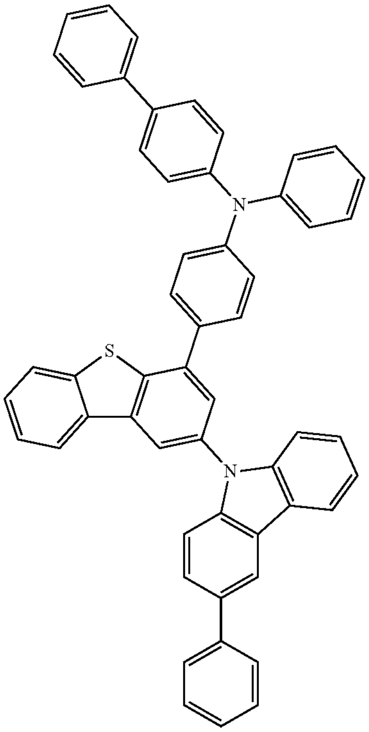
-continued
2-134
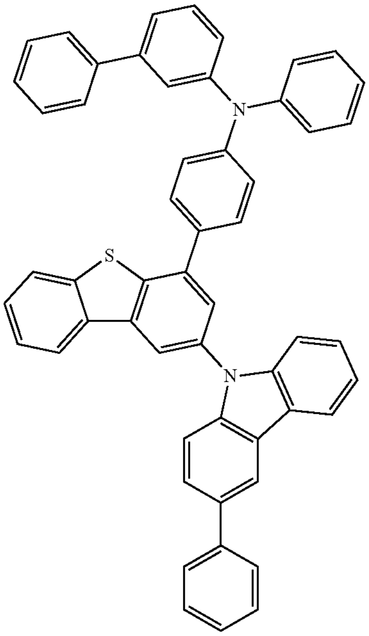
2-135
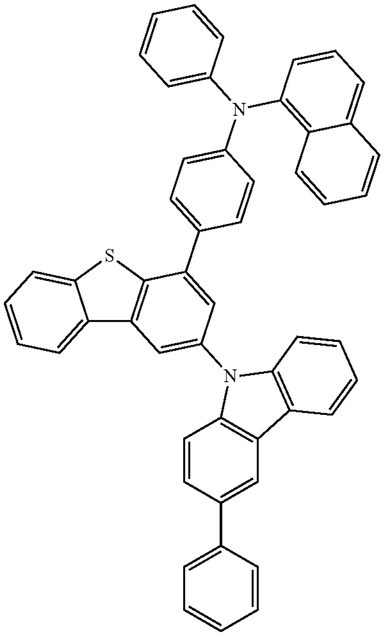

-continued
2-136
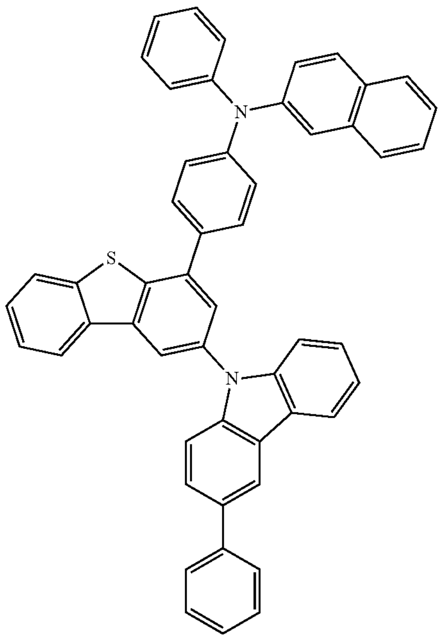
2-137
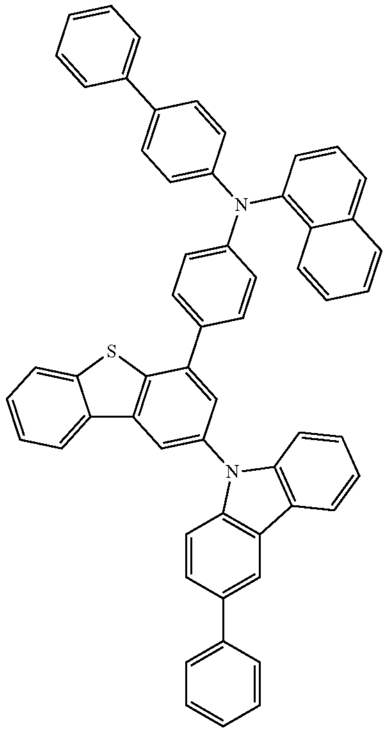
-continued
2-138
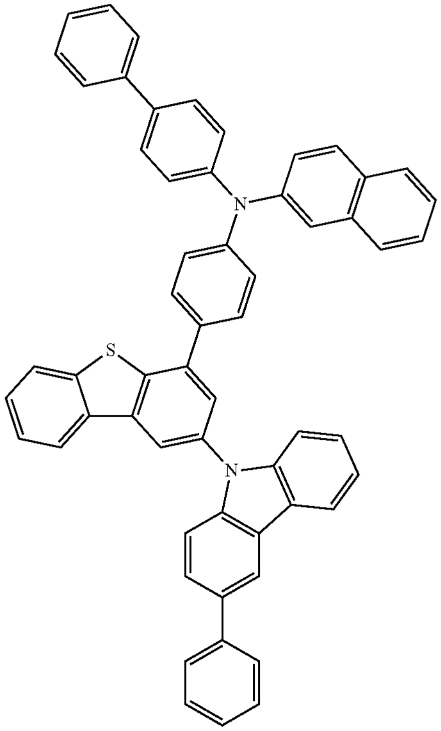
2-139
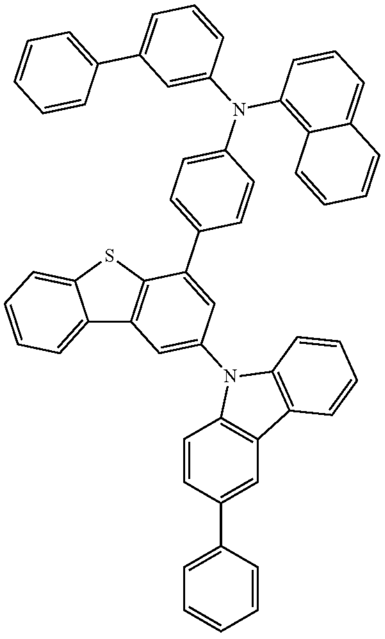

-continued
2-140
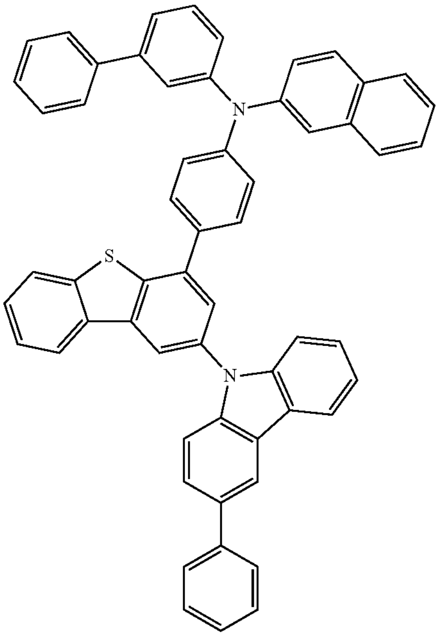
2-141
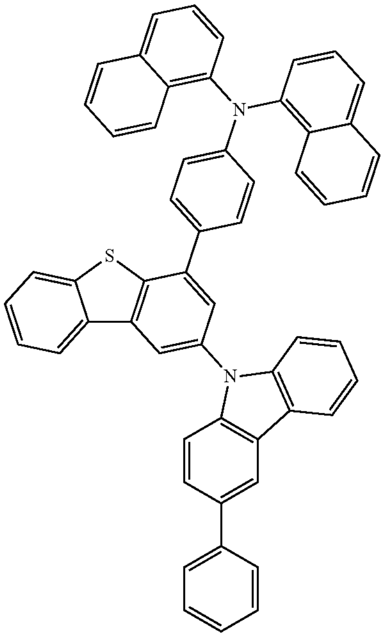
-continued
2-142
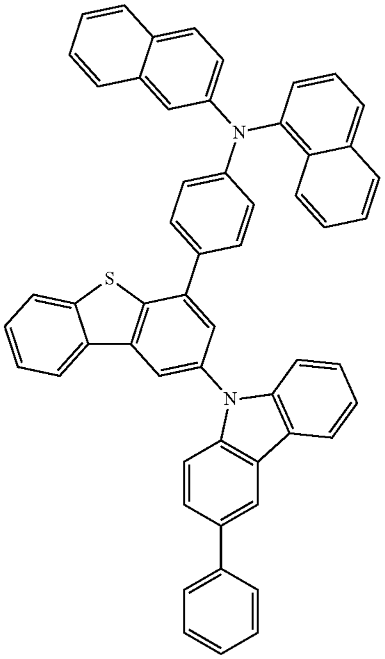
2-143
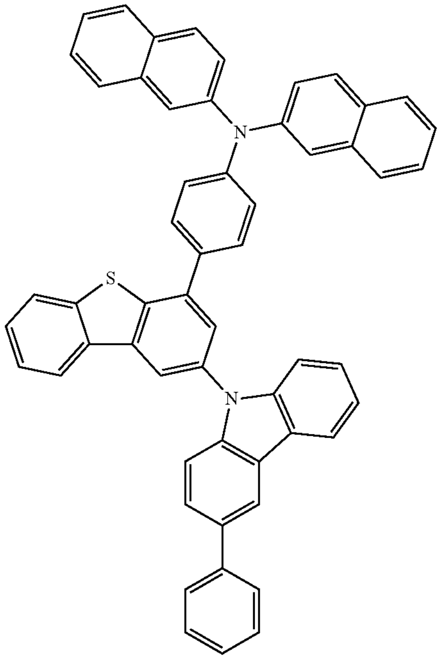

-continued
2-144
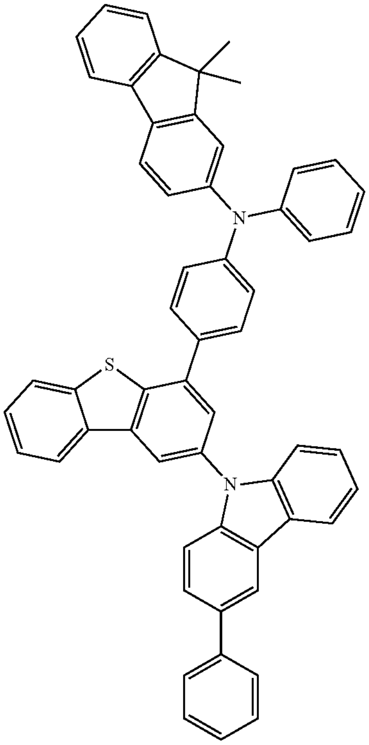
2-145
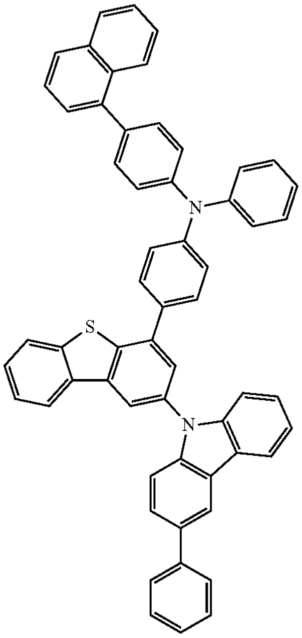
-continued
2-146
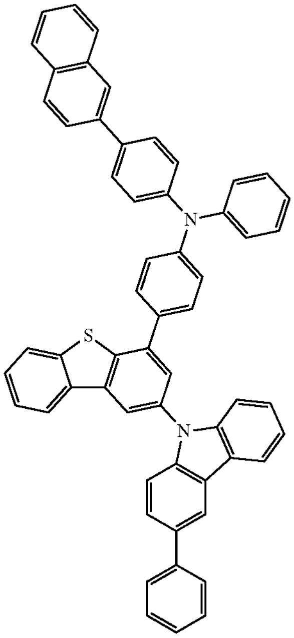
2-147
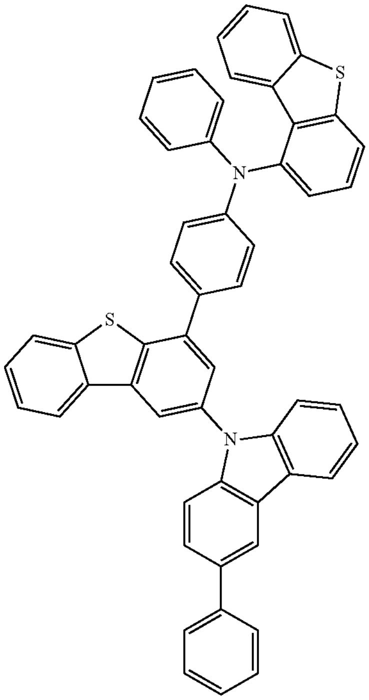

-continued
2-148
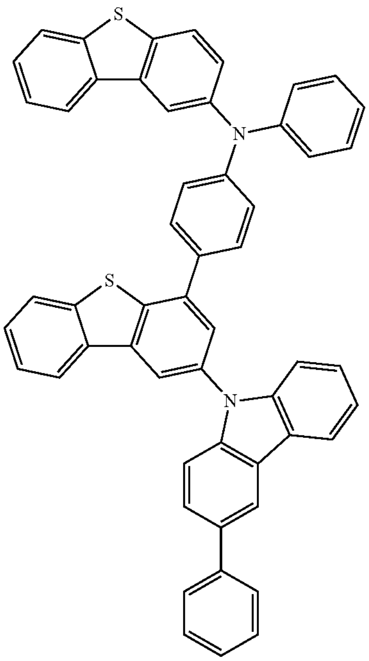
2-149
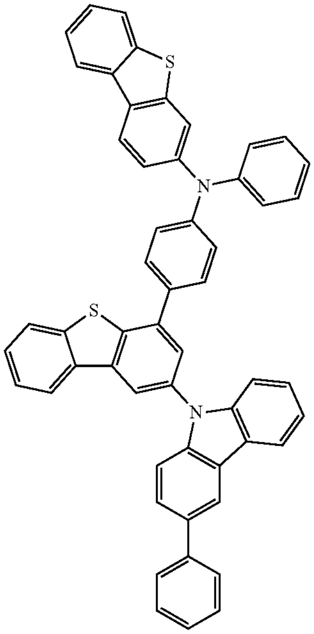
-continued
2-150
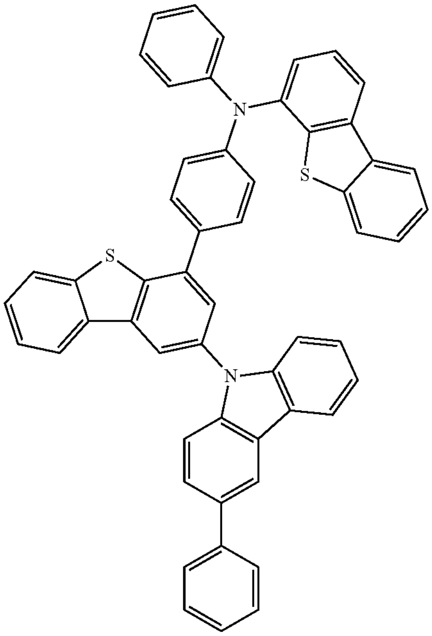
2-151
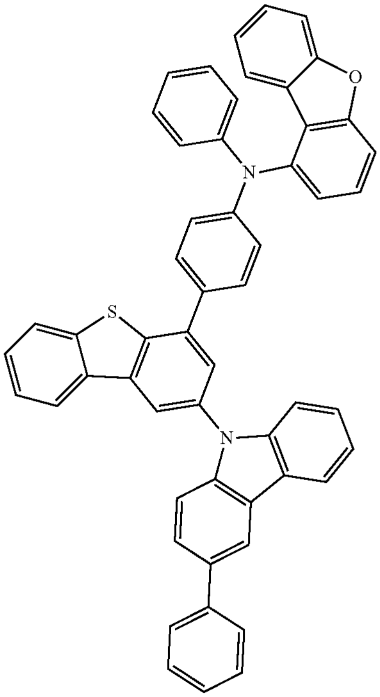

2-152
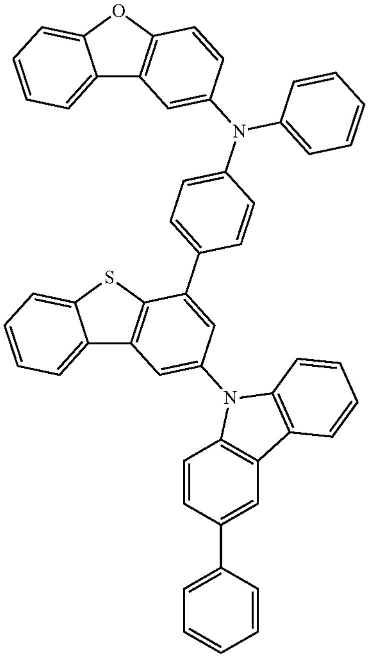
2-153
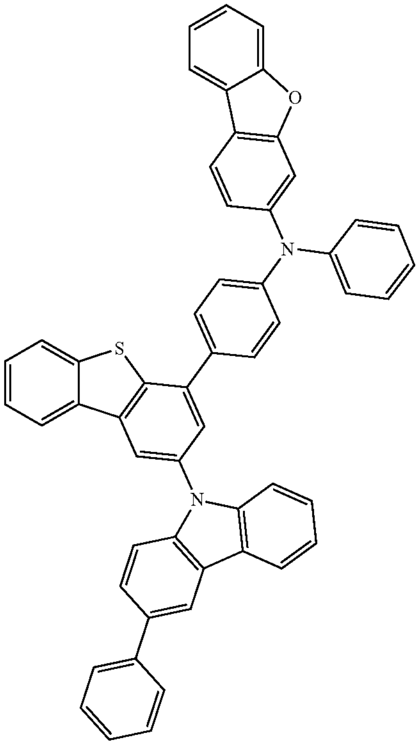
2-154
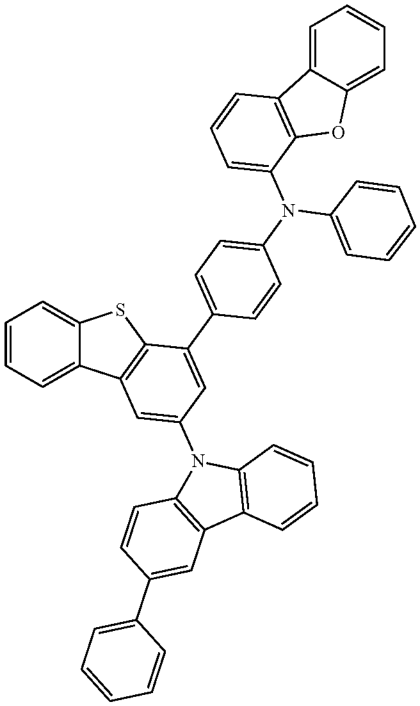
2-155
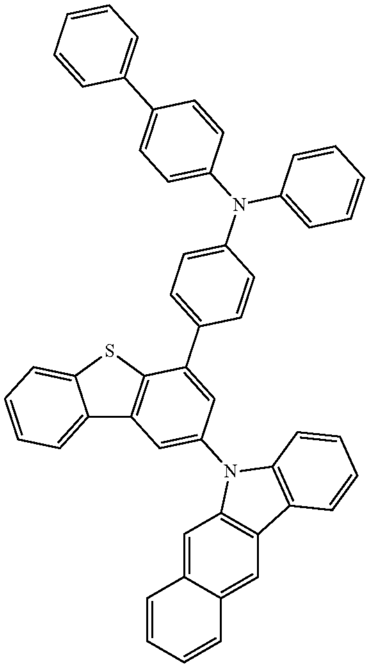

-continued
2-156
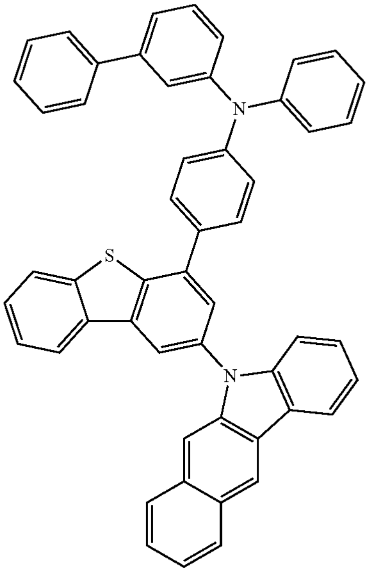
2-157
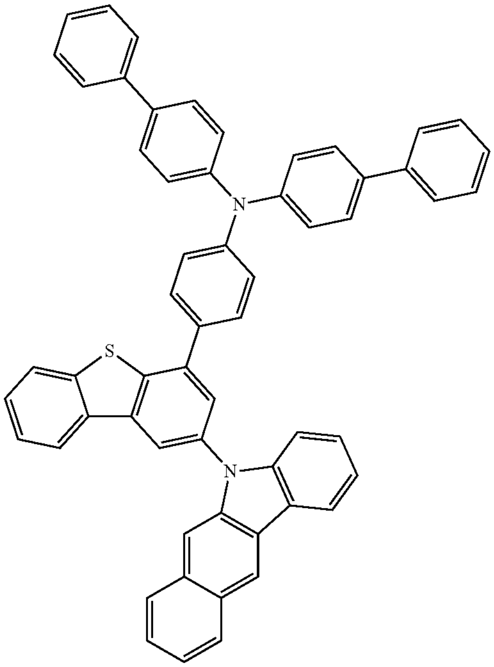
-continued
2-158
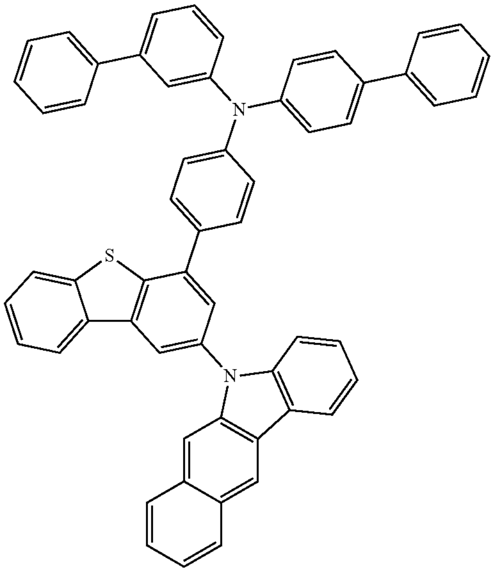
2-159
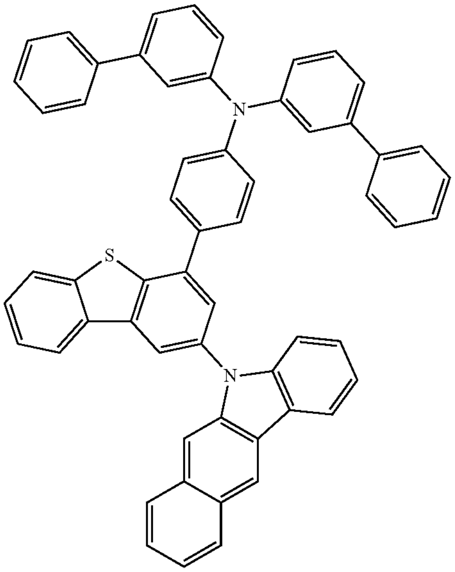

-continued
2-160
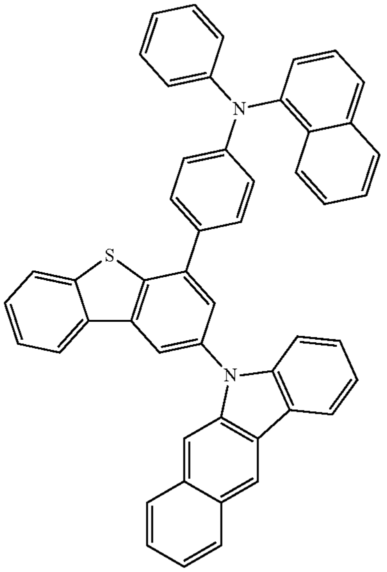
2-161
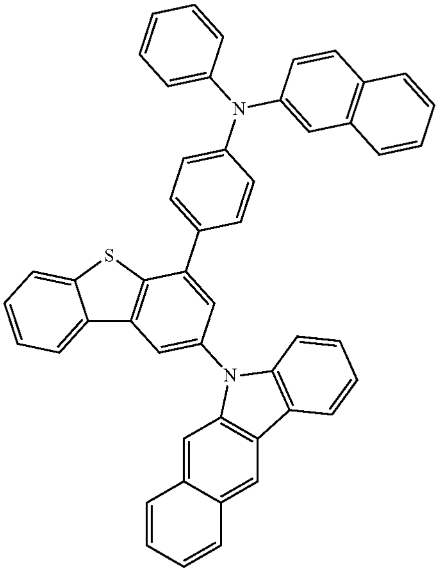
-continued
2-162
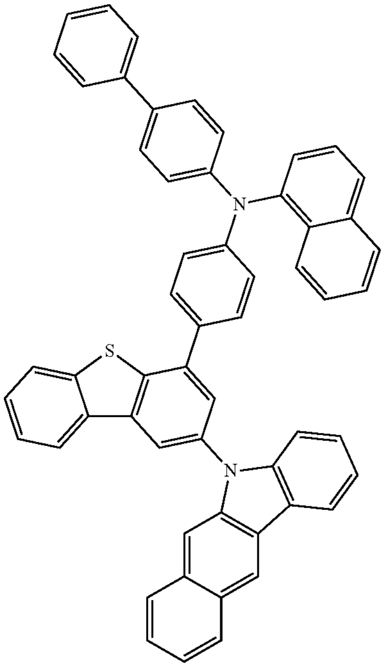
2-163
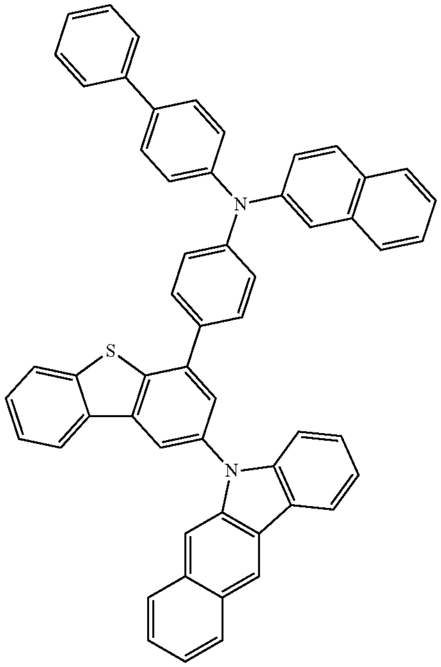

-continued
2-164
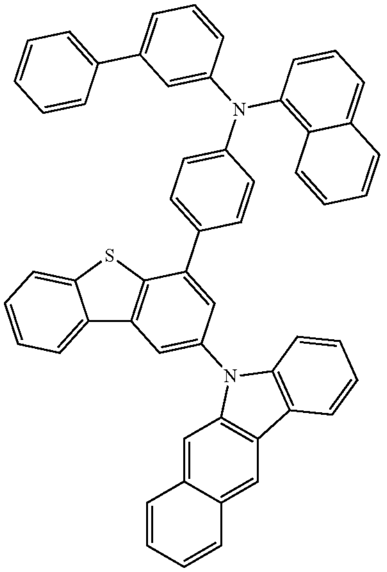
2-165
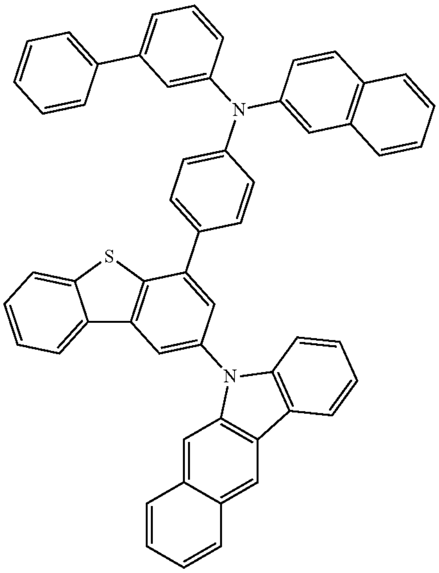
-continued
2-166
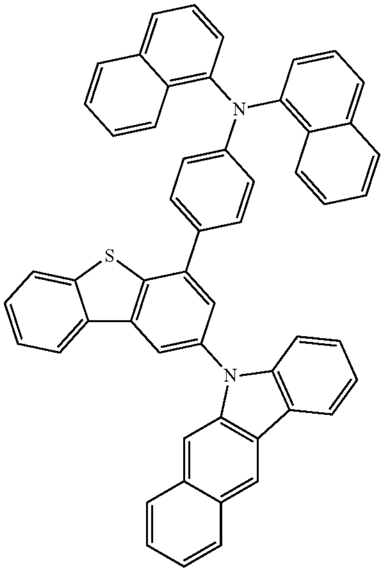
2-167
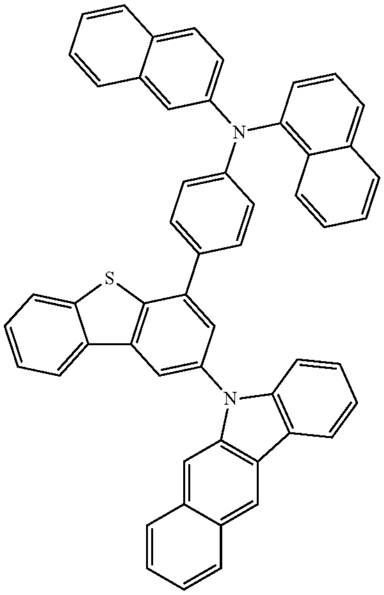

-continued
2-168
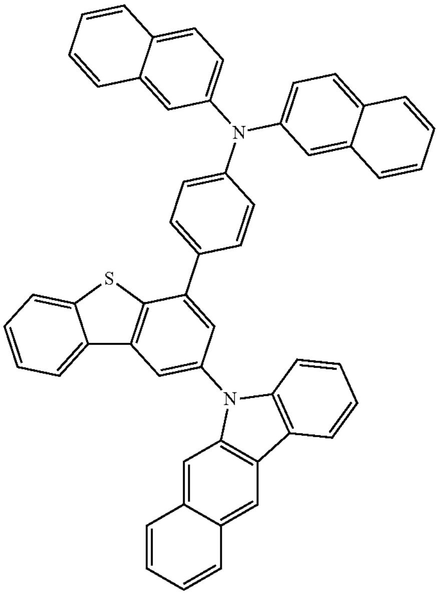
2-169
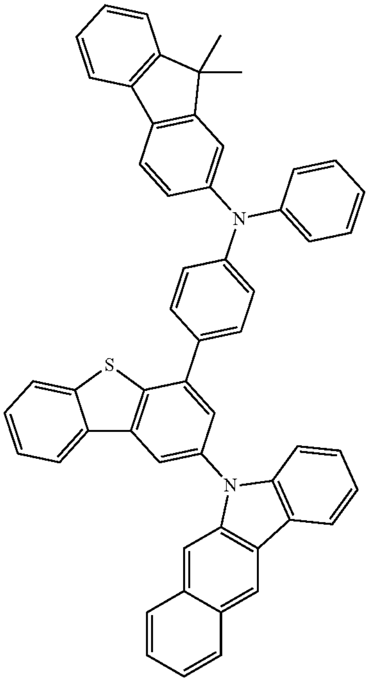
-continued
2-170
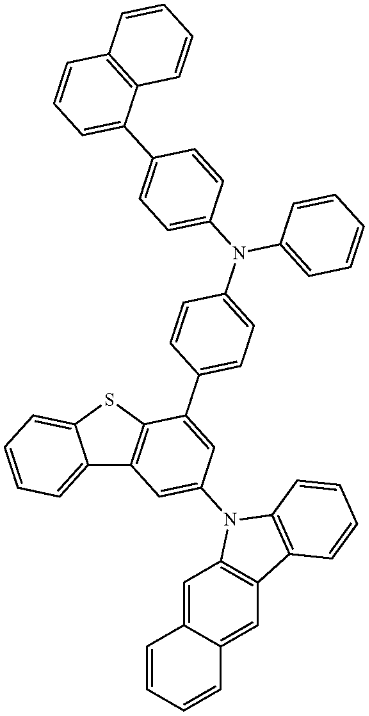
2-171
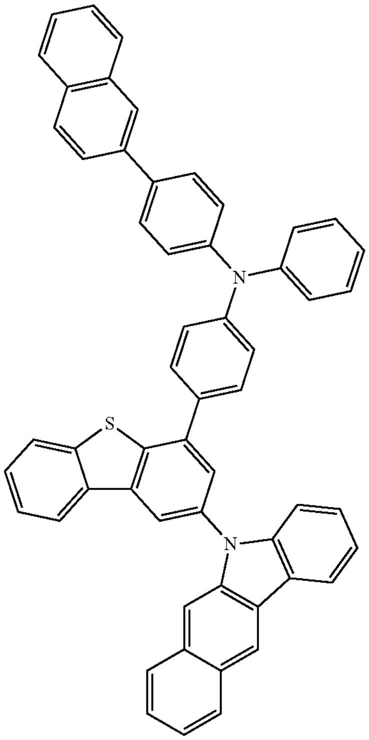

-continued
2-172
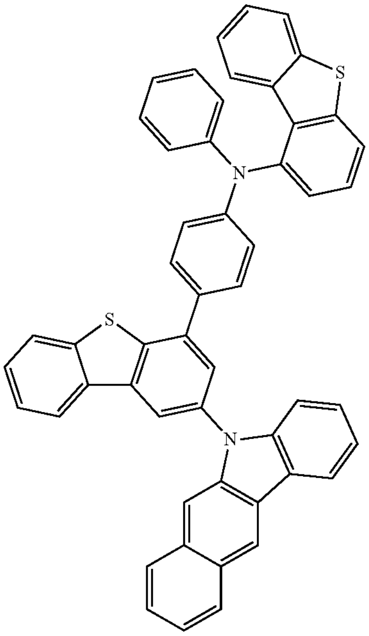
2-173
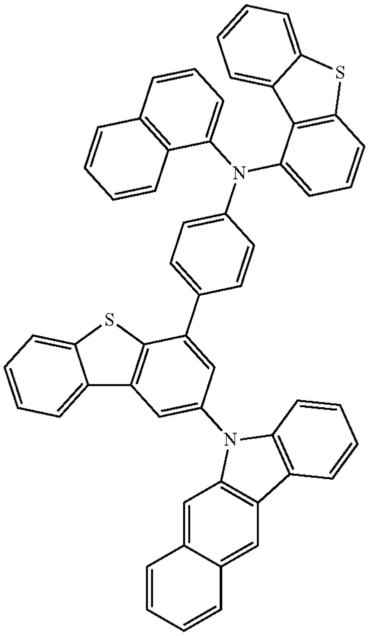
-continued
2-174
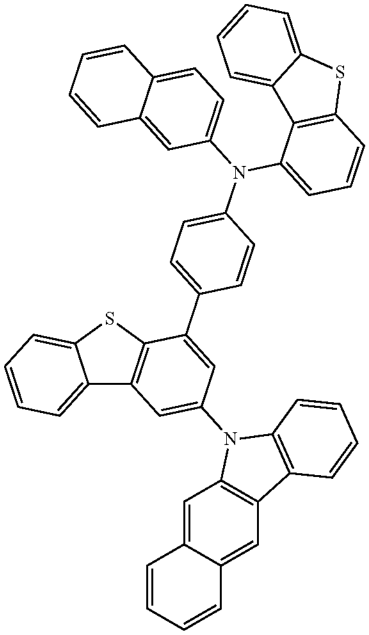
2-175
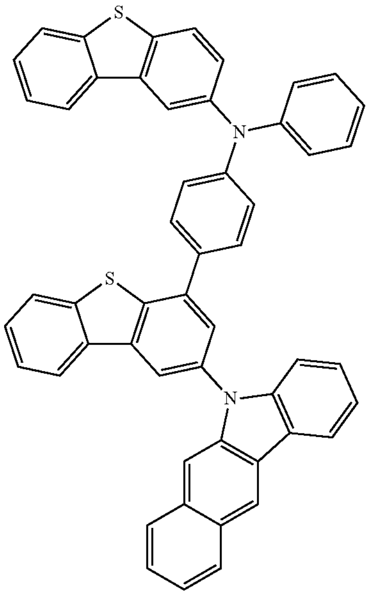

-continued
2-176
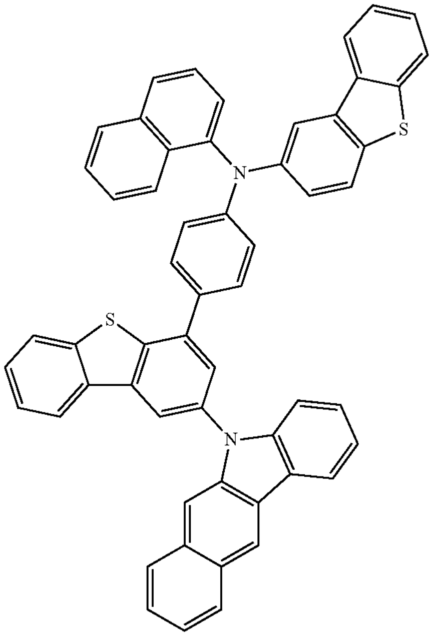
2-177
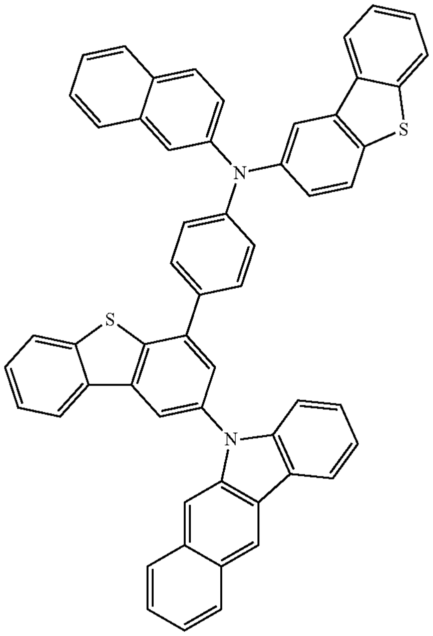
-continued
2-178
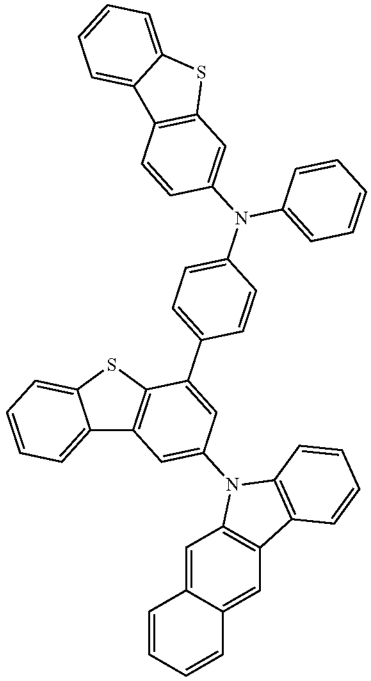
2-179
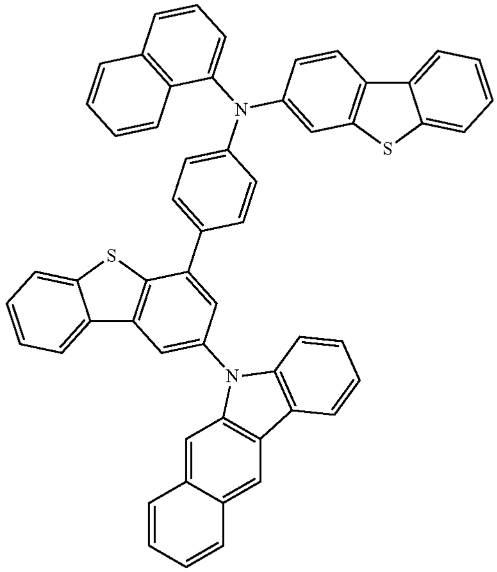

-continued
2-180
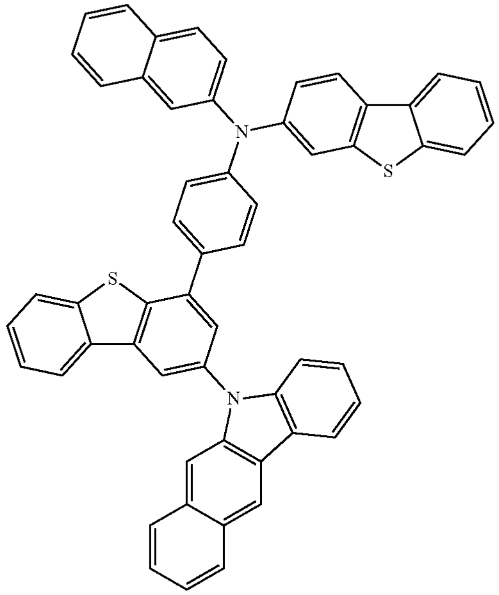
2-181
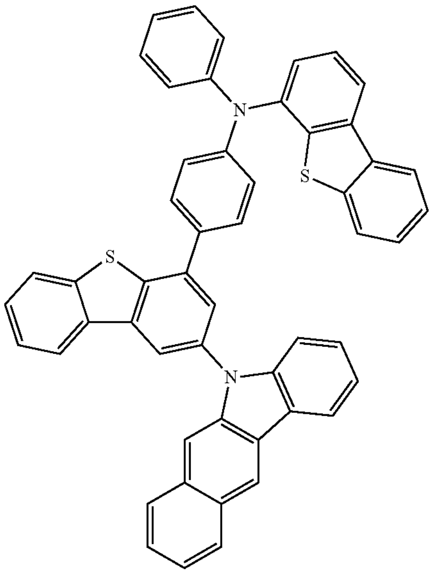
-continued
2-182
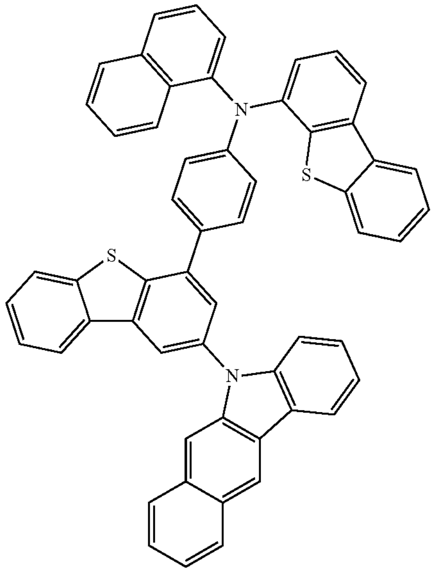
2-183
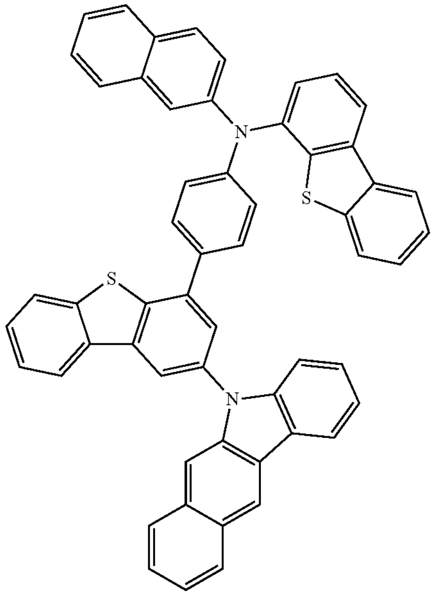

-continued
2-184
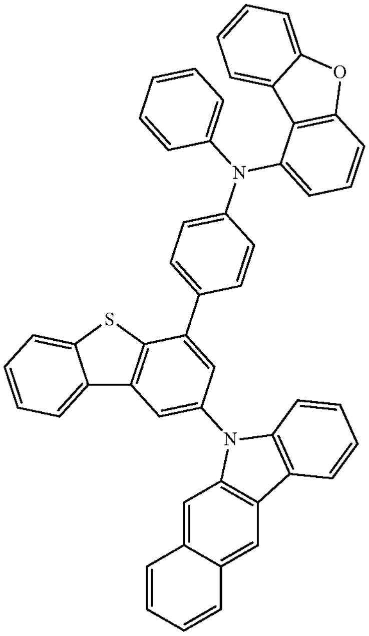
2-185
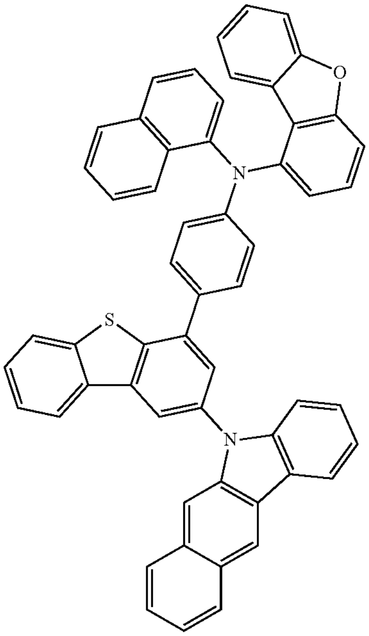
-continued
2-186
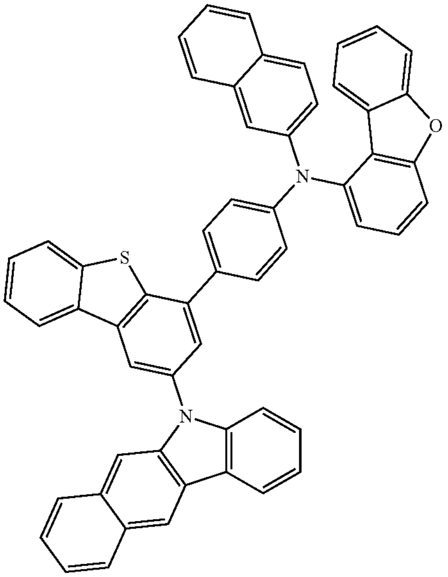
2-187
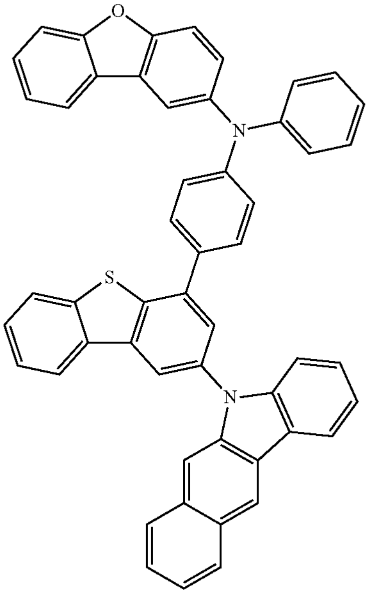

-continued
2-188
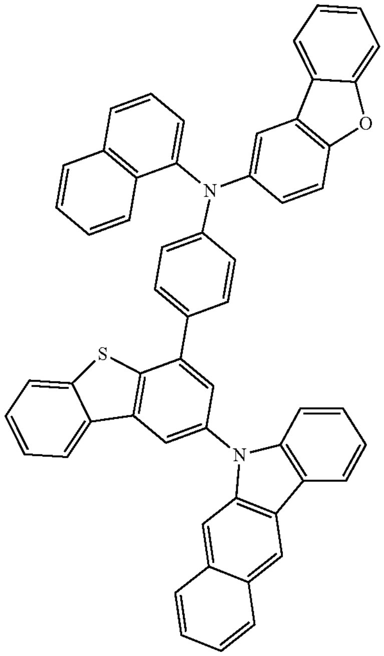
2-189
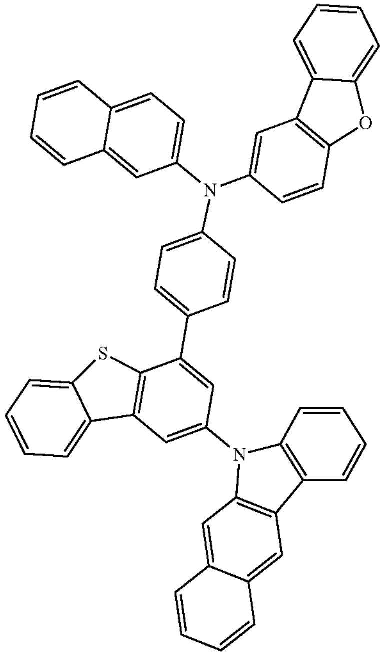
-continued
2-190
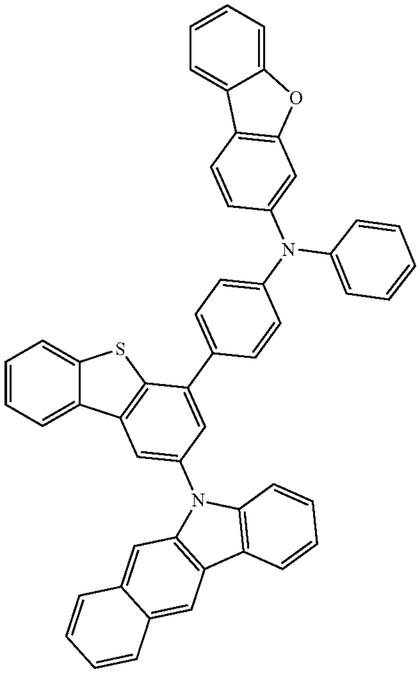
2-191
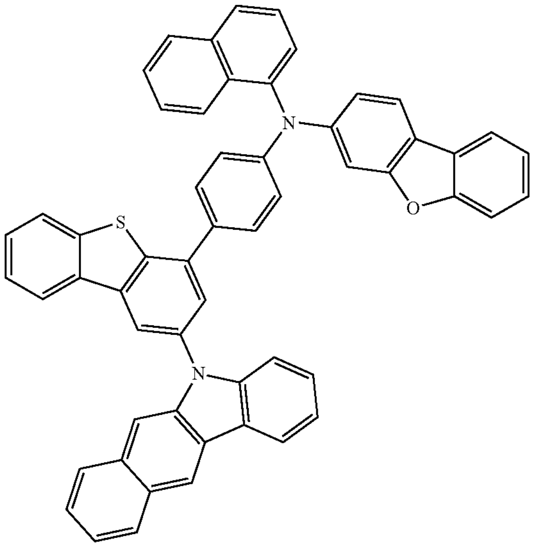

-continued
2-192
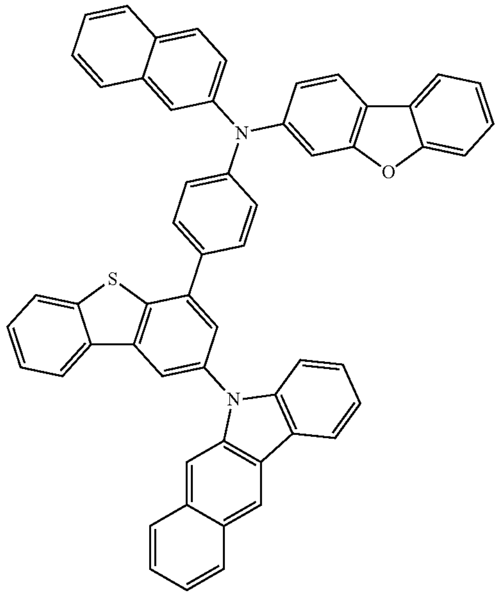
2-193
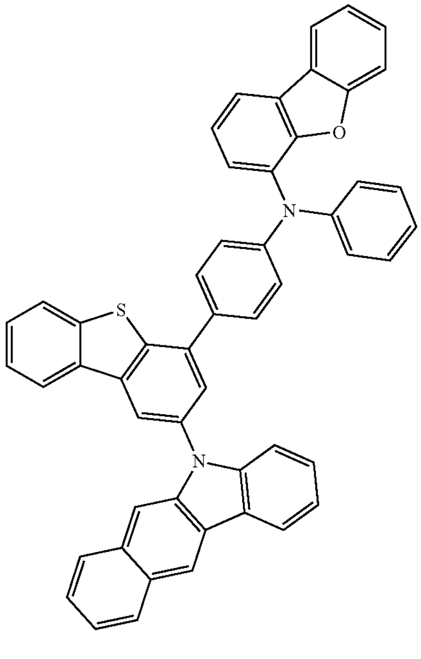
-continued
2-194
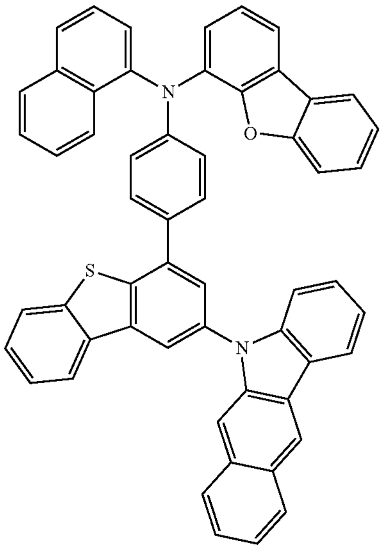
2-195
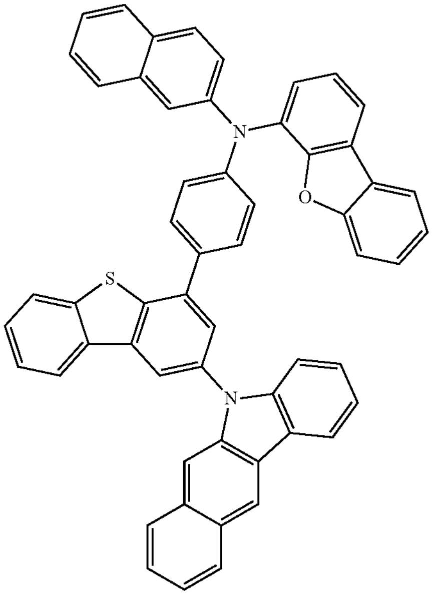
2-196
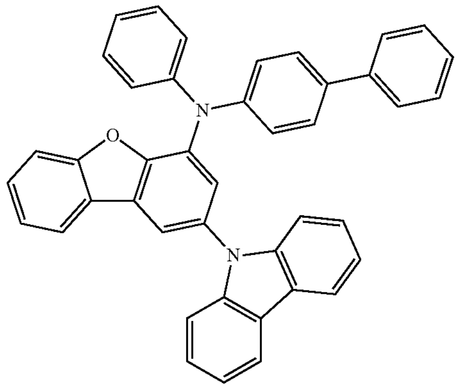

-continued
2-197
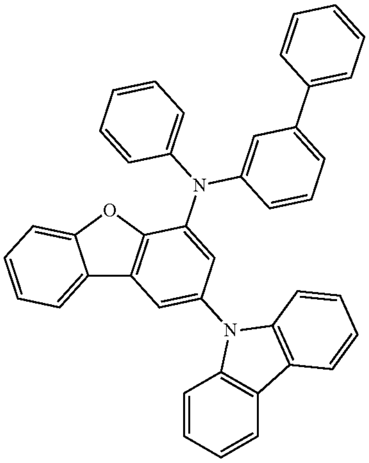
2-198
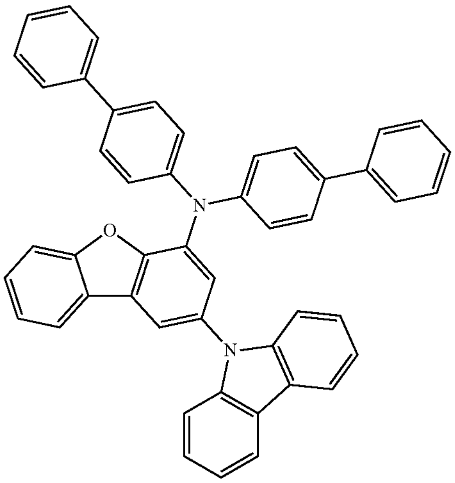
2-199
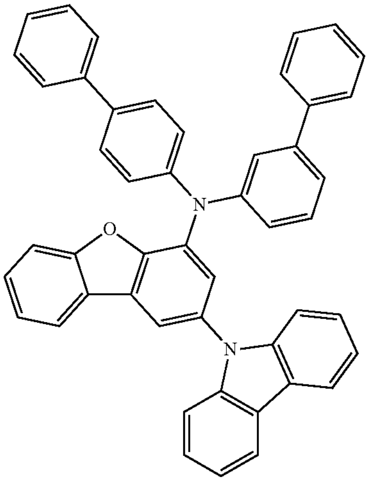
-continued
2-200
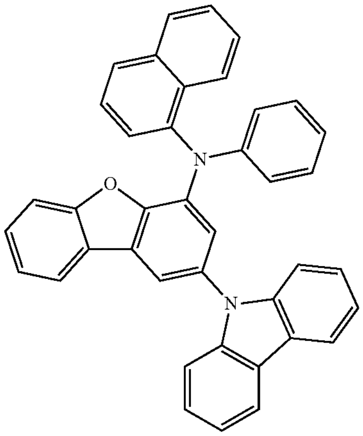
2-201
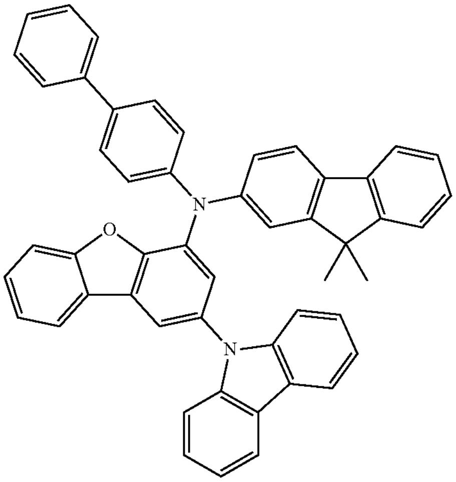
2-202
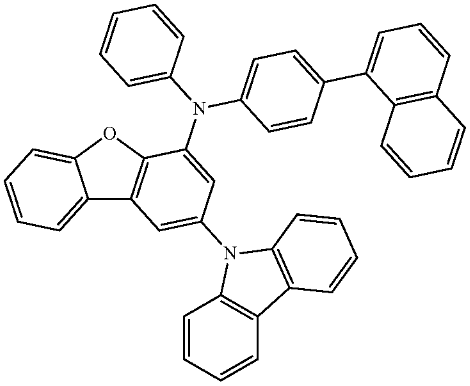

-continued
2-203
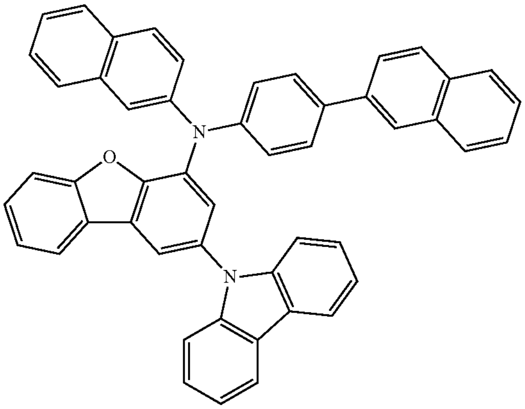
2-204
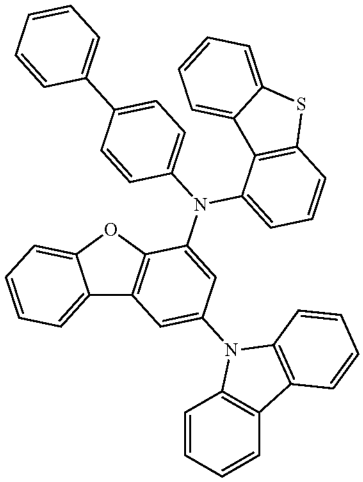
2-205
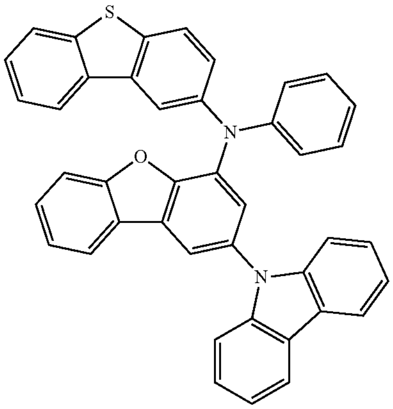
-continued
2-206
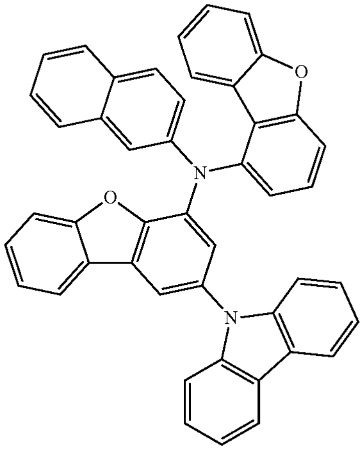
2-207
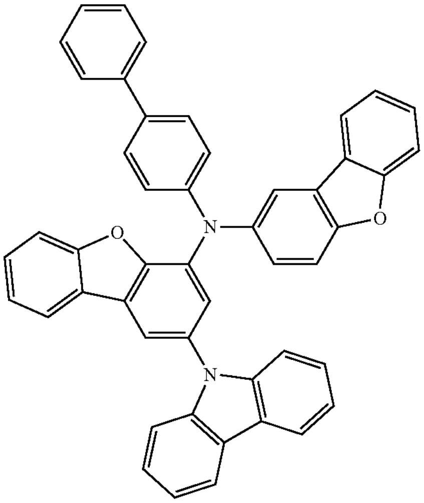
2-208
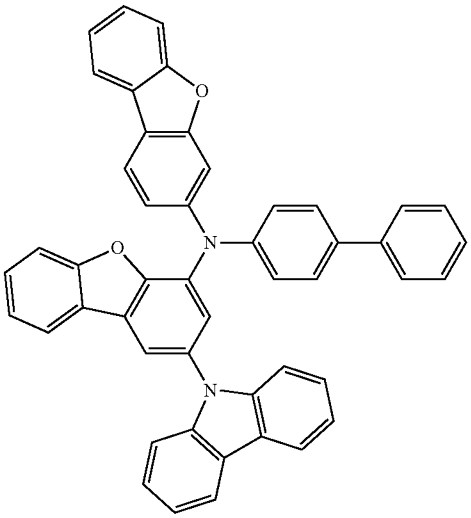

-continued
2-209
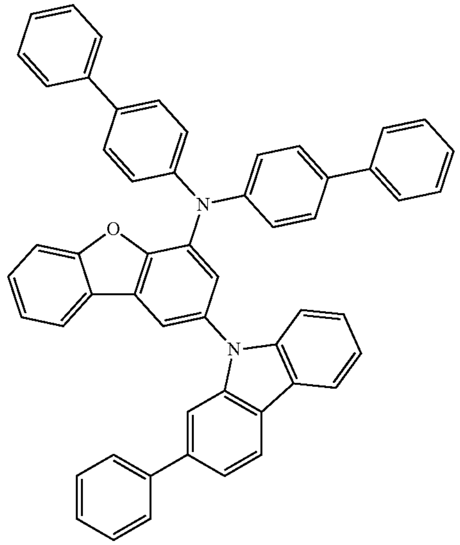
2-210
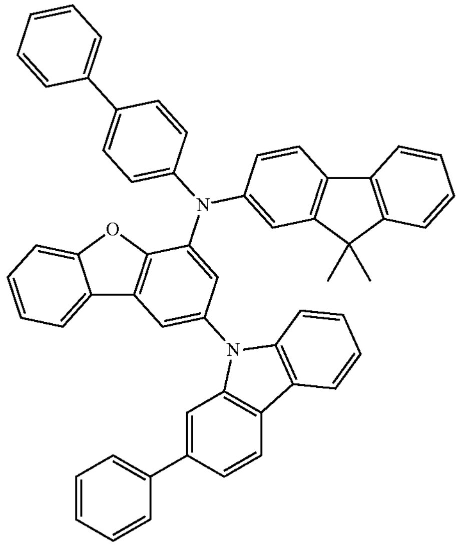
2-211
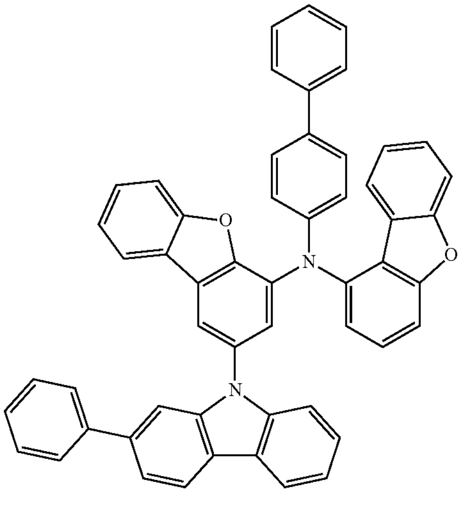
-continued
2-212
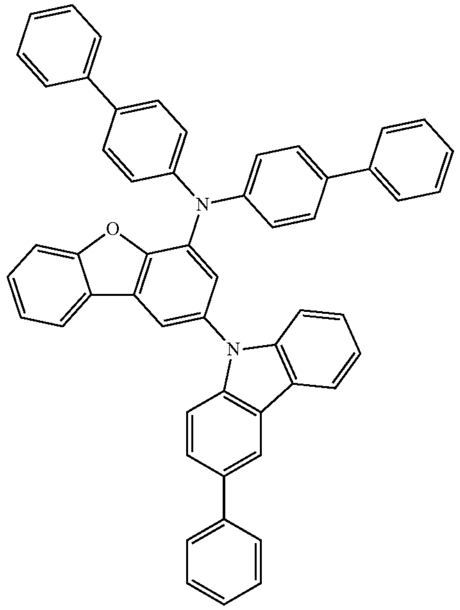
2-213
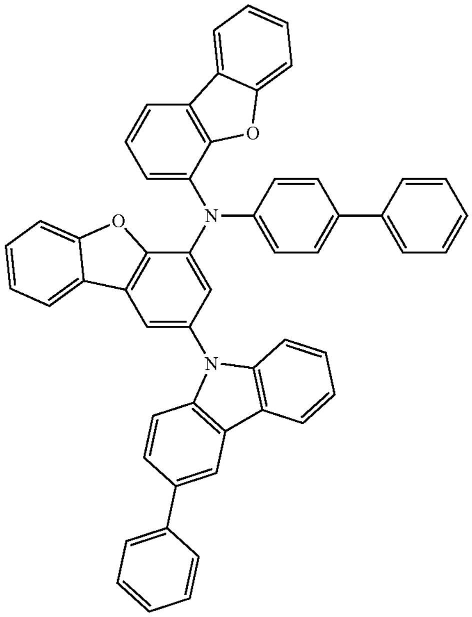

-continued
2-214
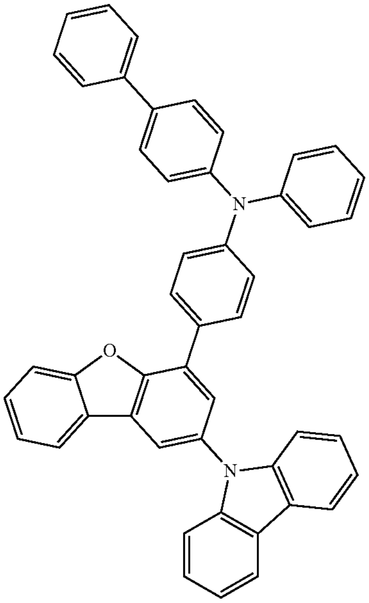
2-215
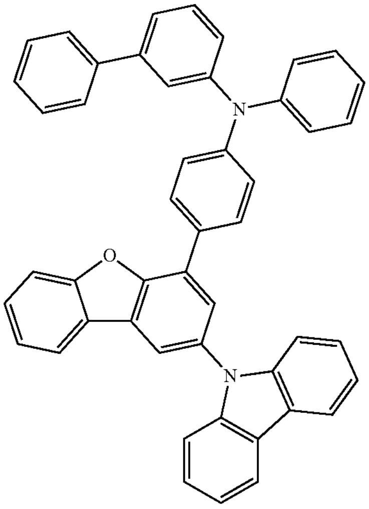
-continued
2-216
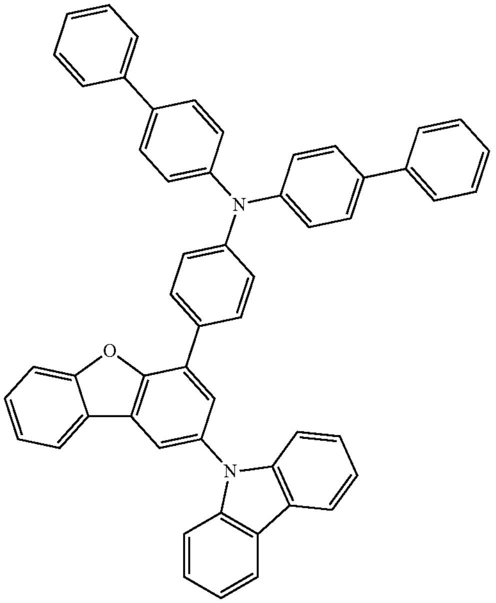
2-217
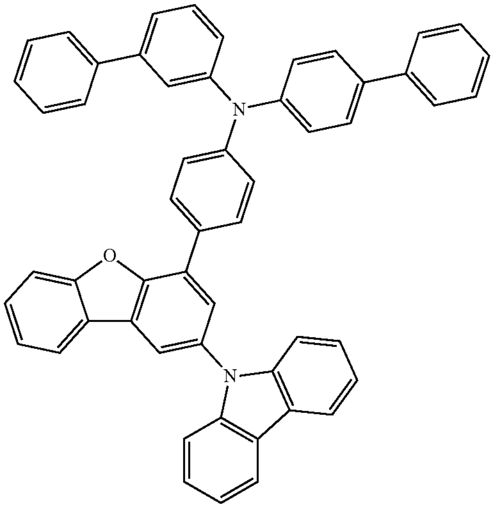
2-218
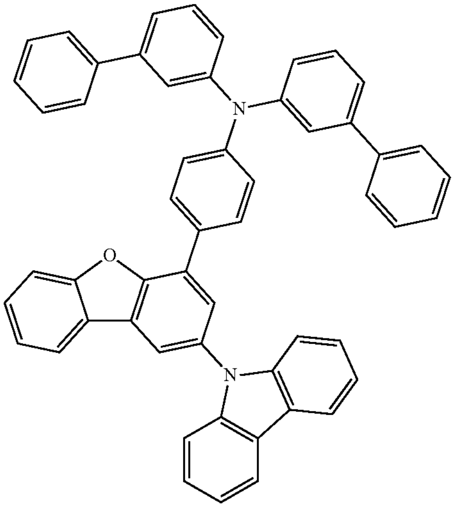

-continued
2-219
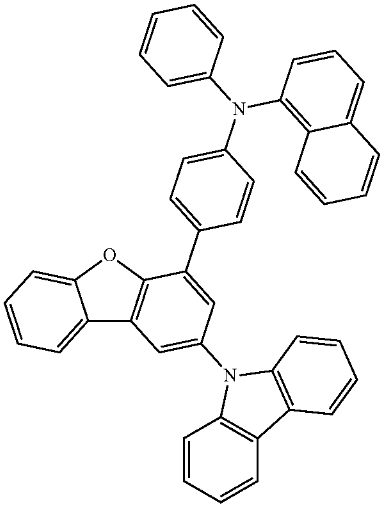
2-220
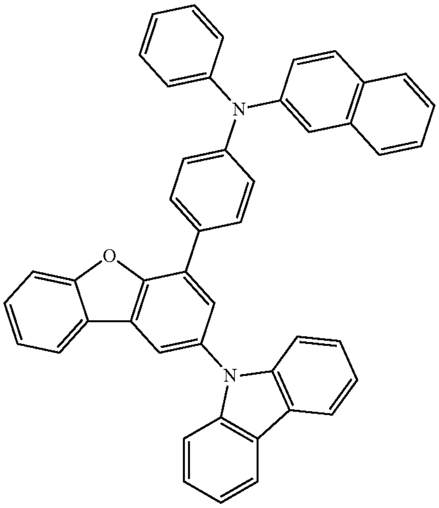
2-221
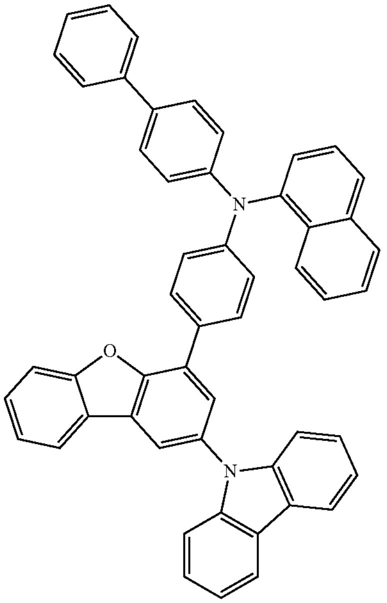
-continued
2-222
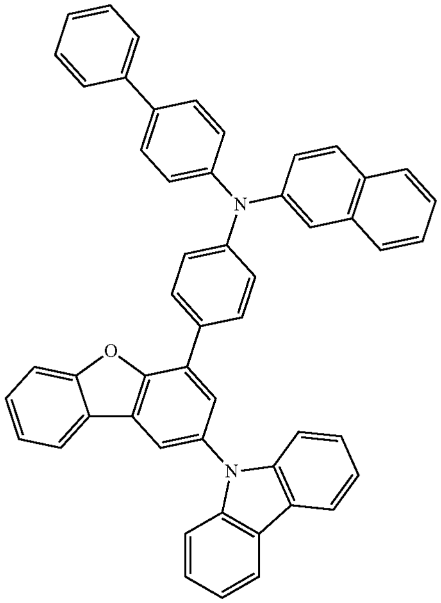
2-223
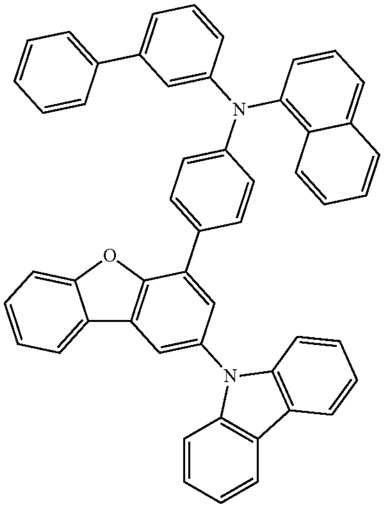
2-224
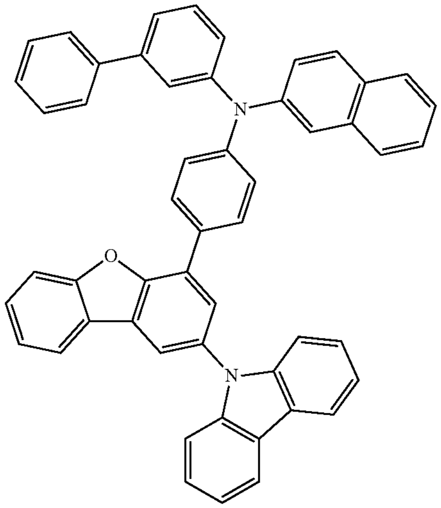

-continued
2-225
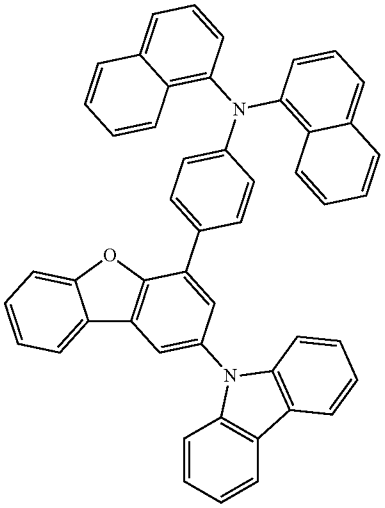
2-226
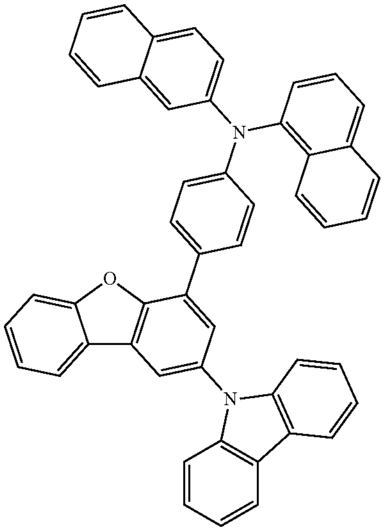
2-227
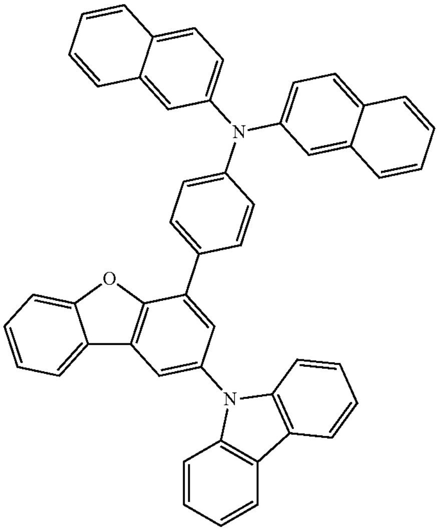
-continued
2-228
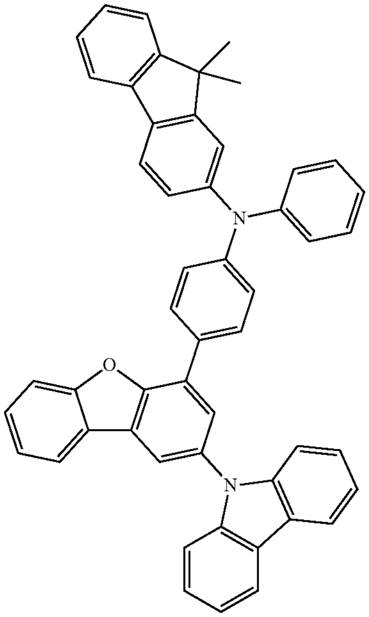
2-229
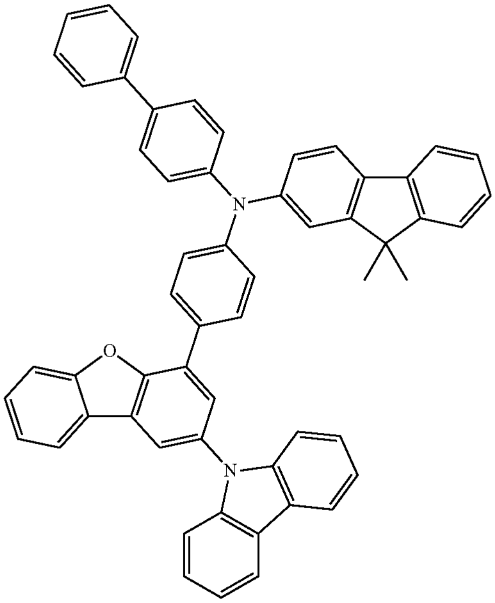

-continued
2-230
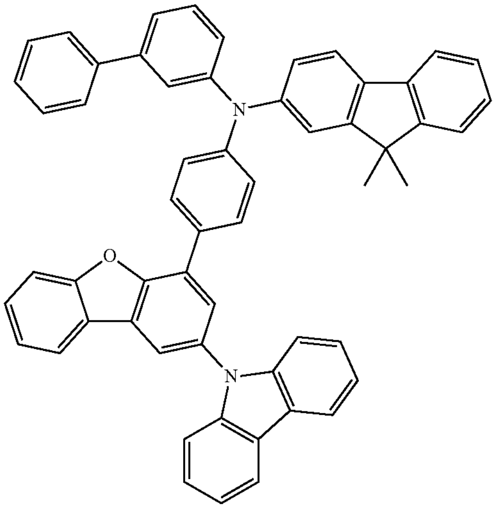
2-231
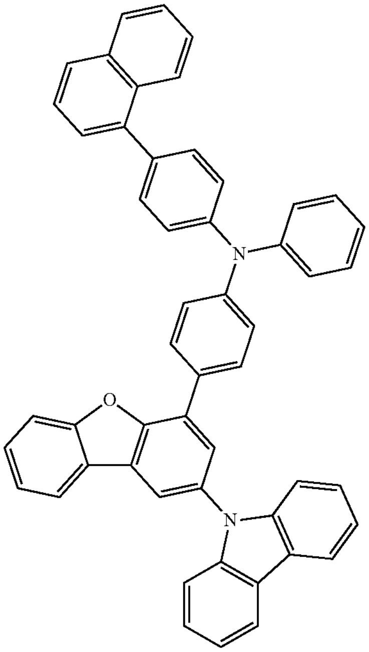
-continued
2-232
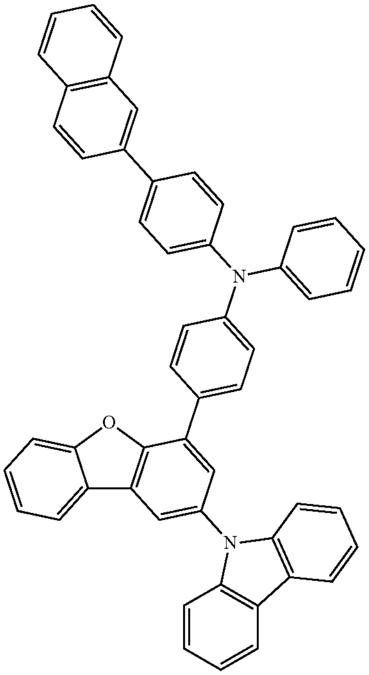
2-233
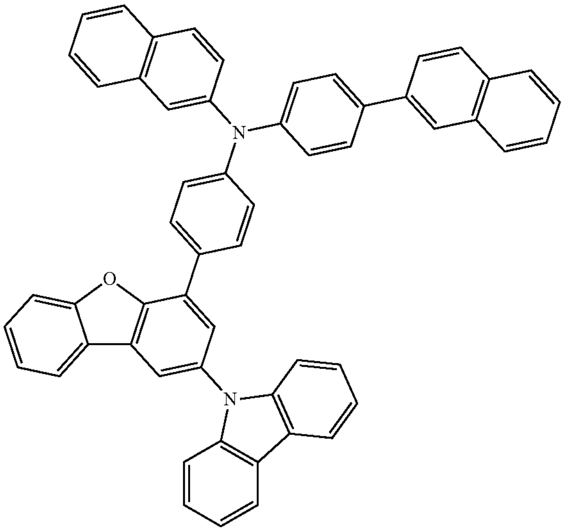

-continued
2-234
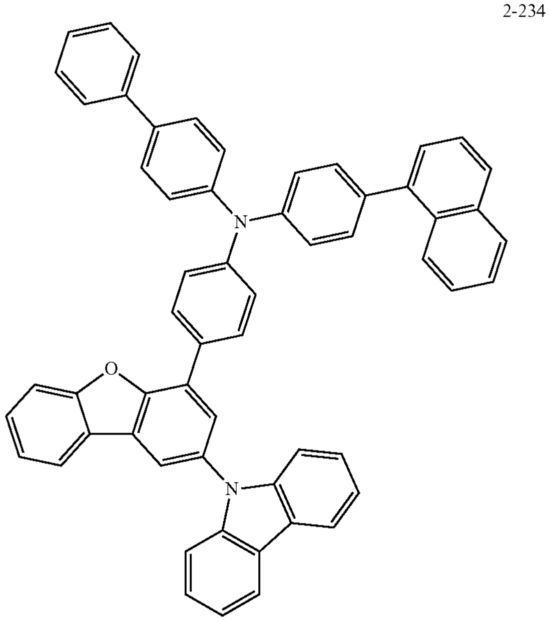
2-235
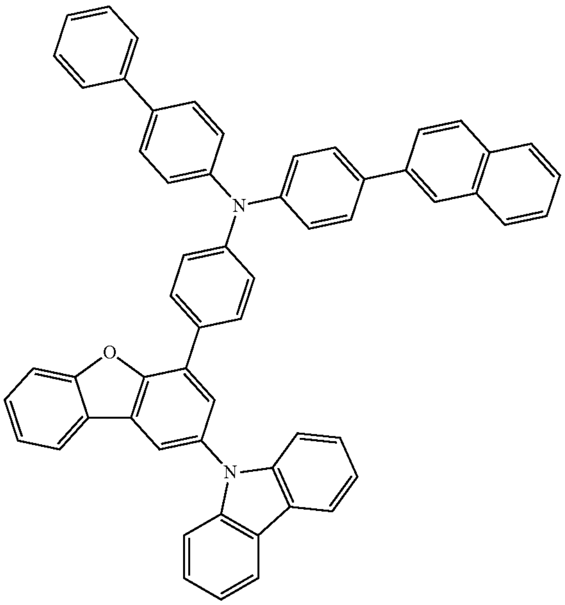
-continued
2-236
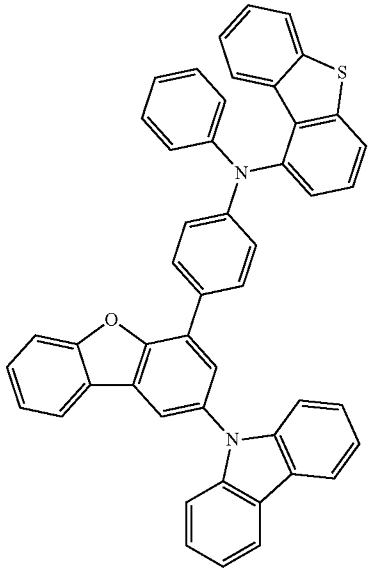
2-237
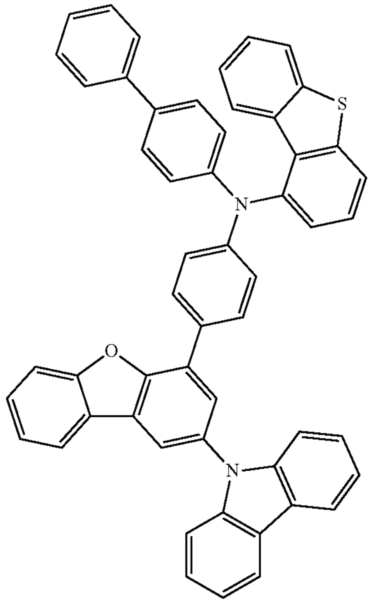

-continued
2-238
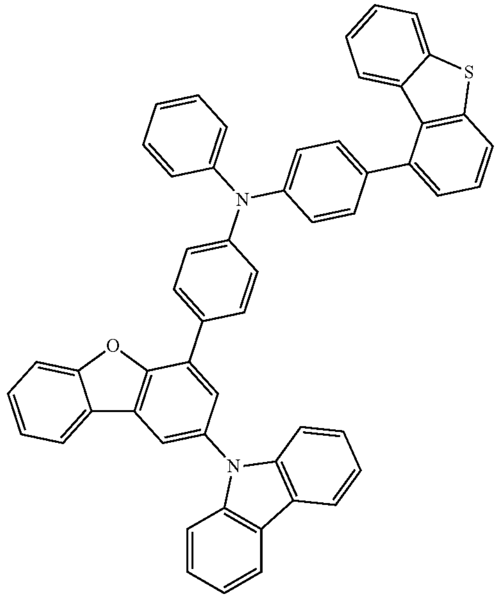
2-239
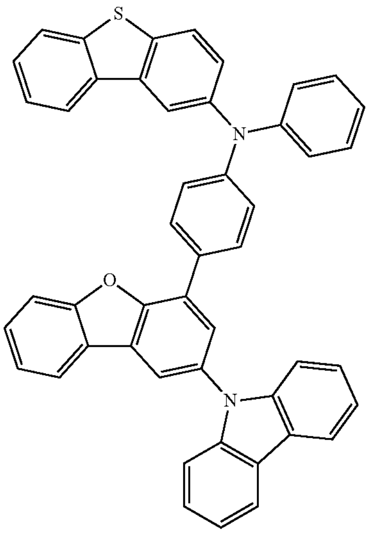
-continued
2-240
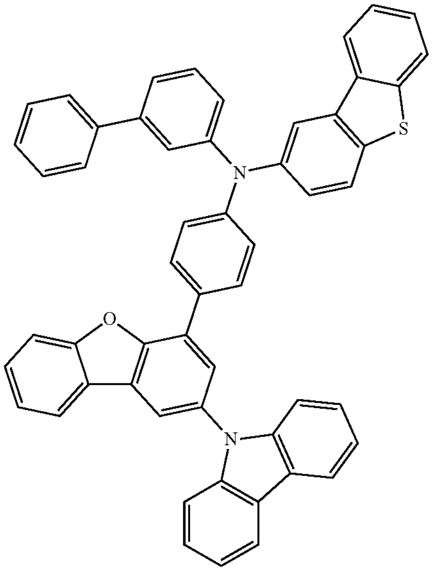
2-241
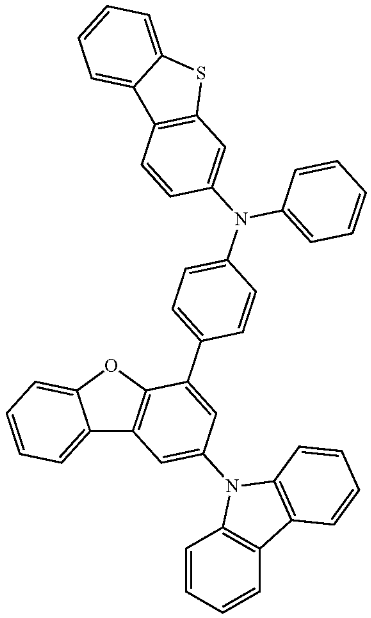

-continued
2-242
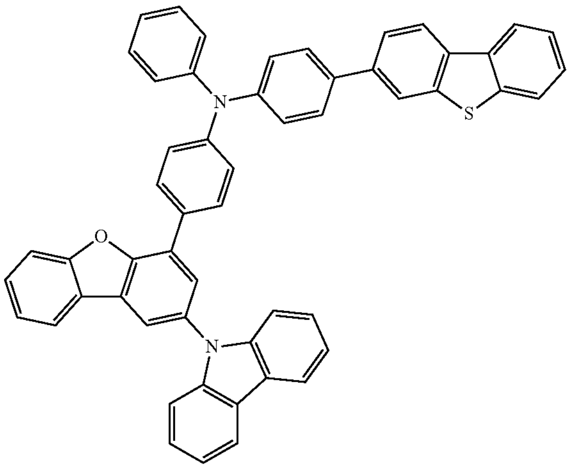
2-243
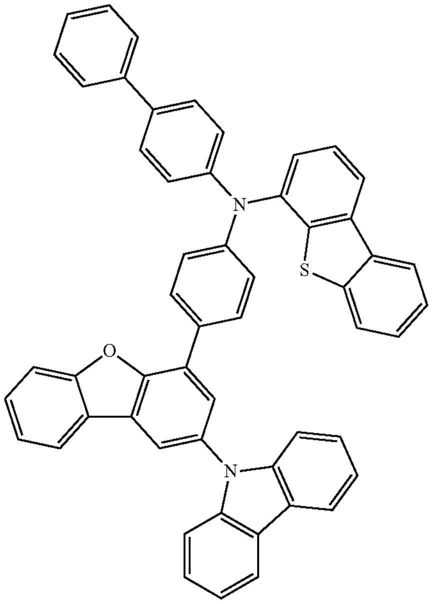
2-244
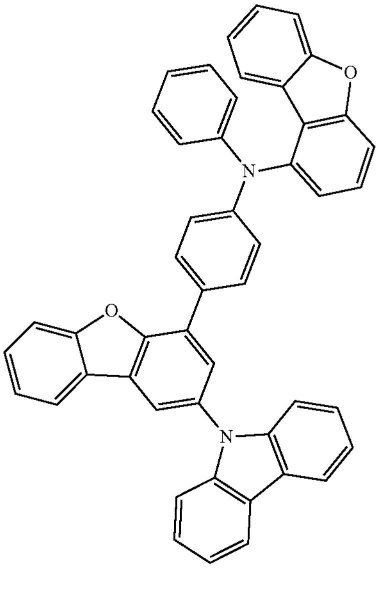
-continued
2-245
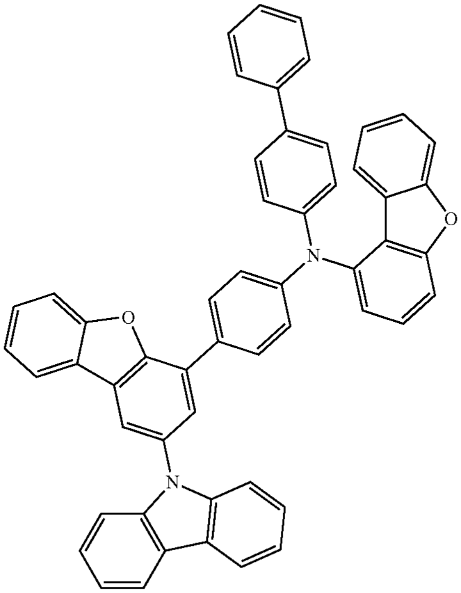
2-246
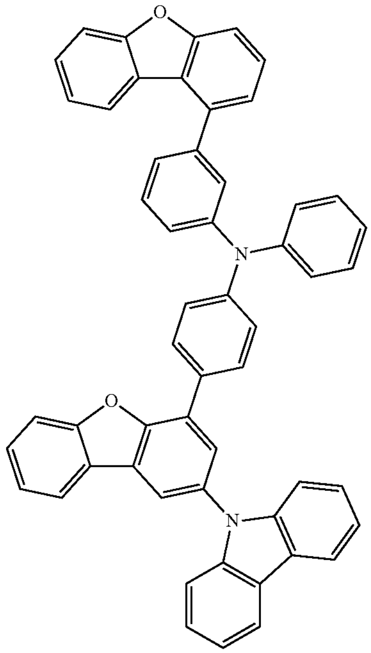

-continued
2-247
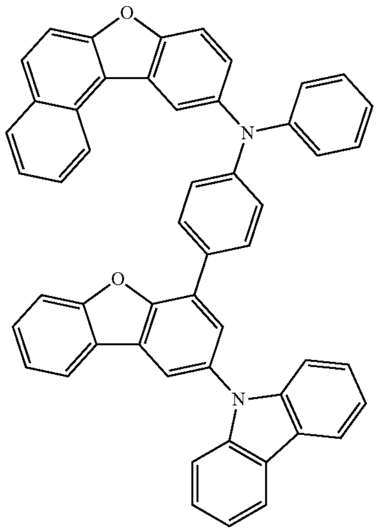
2-248
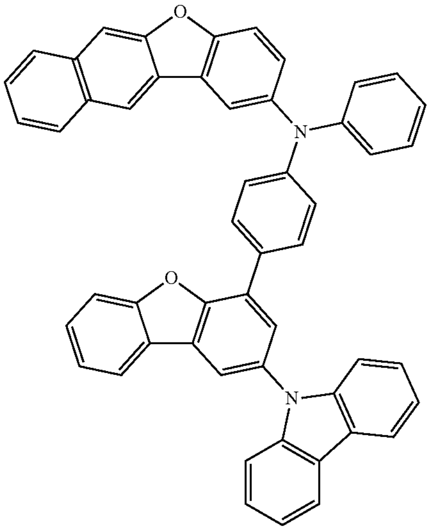
2-249
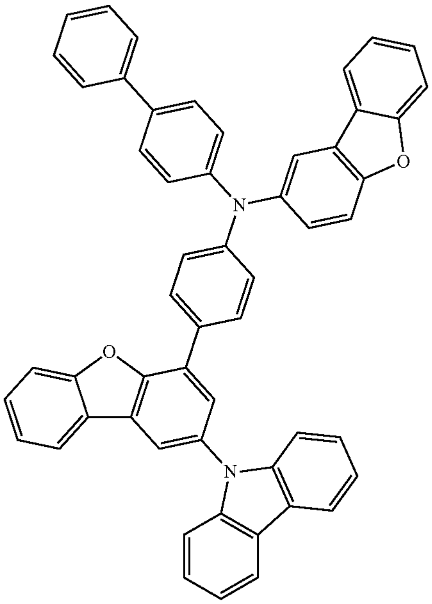
-continued
2-250
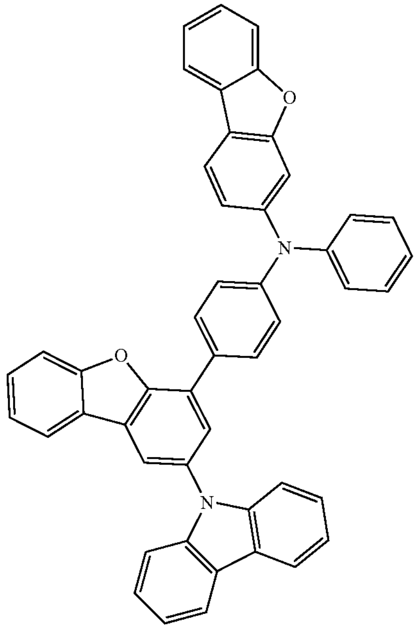
2-251
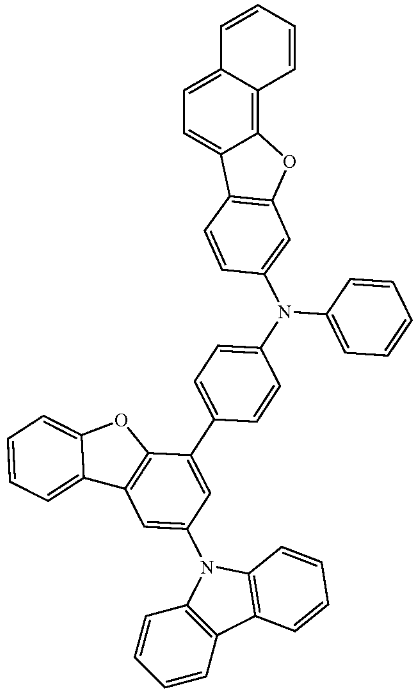

-continued
2-252
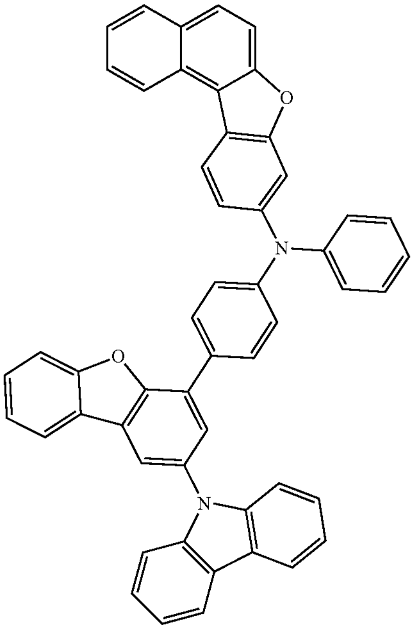
2-253
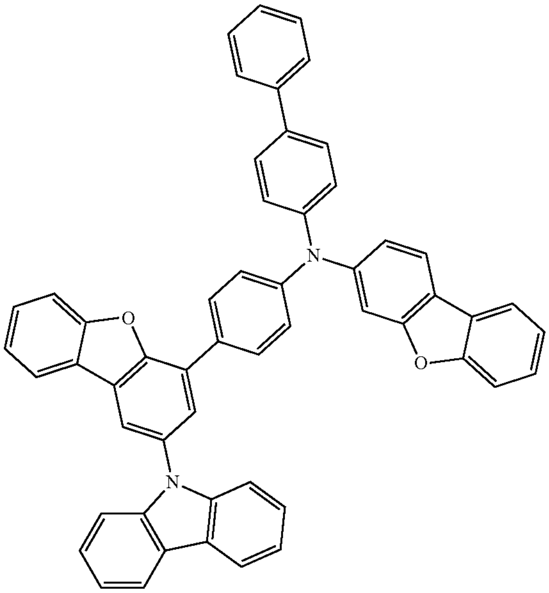
-continued
2-254
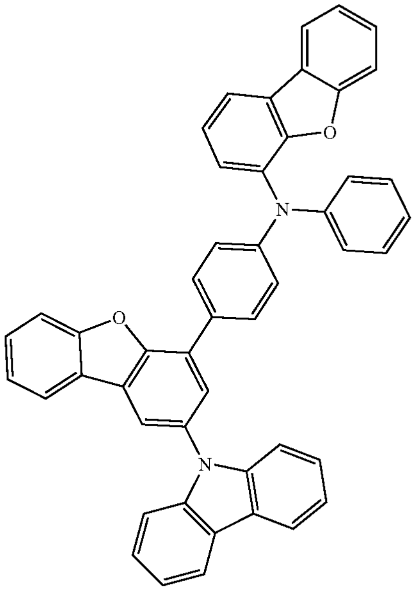
2-255
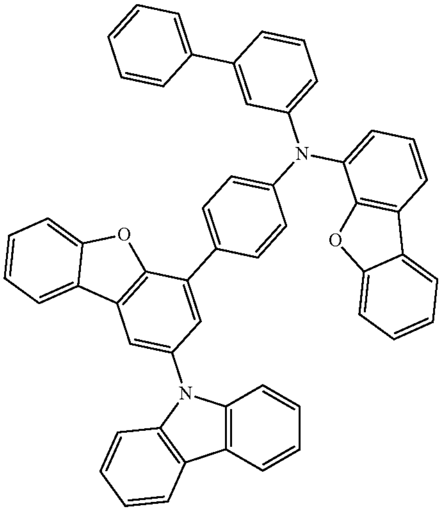

-continued
2-256
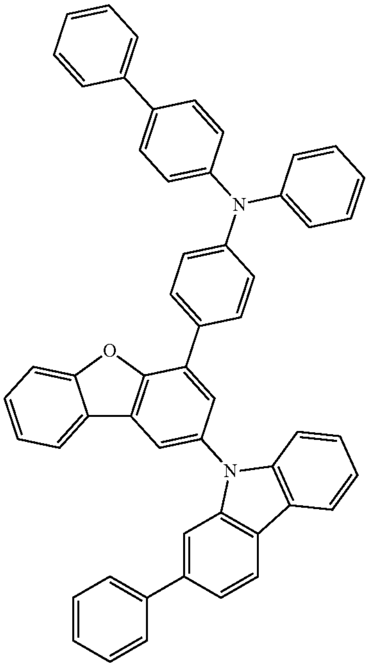
2-257
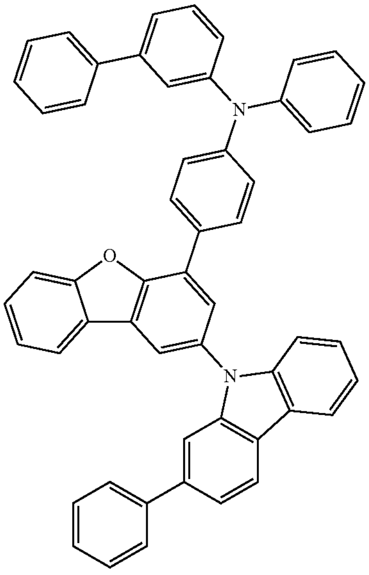
-continued
2-258
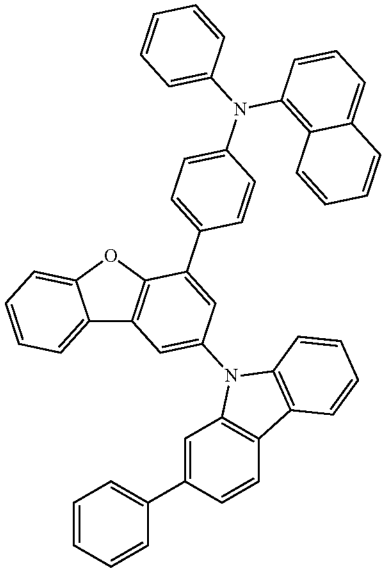
2-259
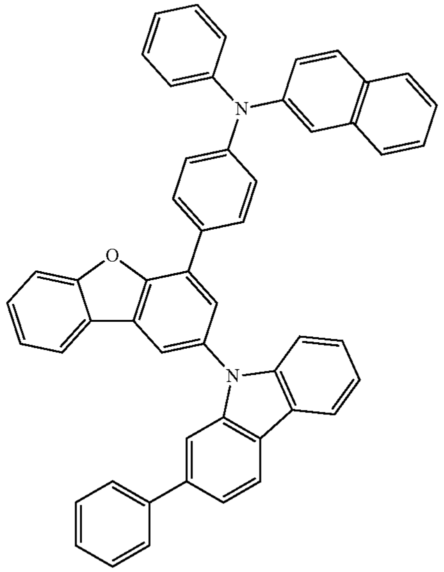

-continued
2-260
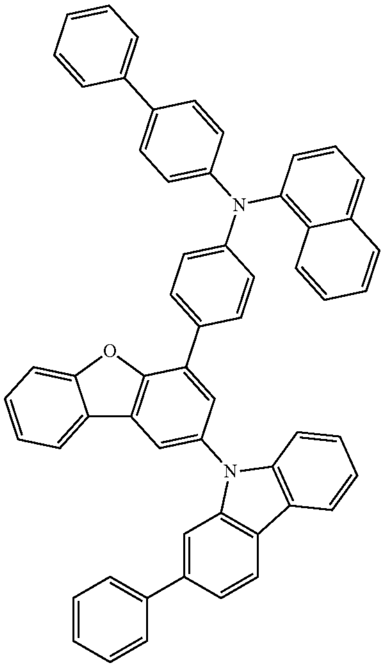
2-261
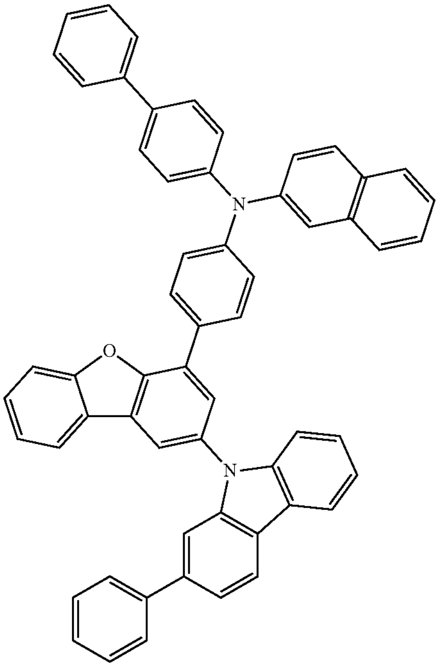
-continued
2-262
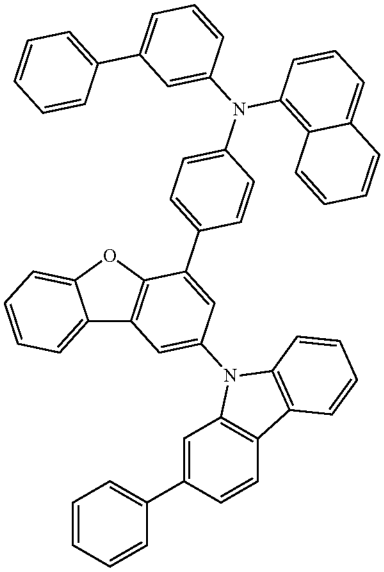
2-263
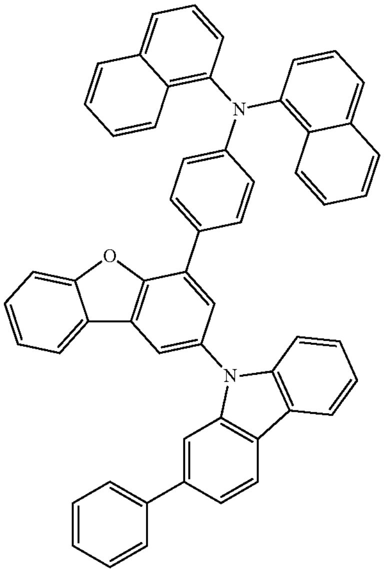

-continued
2-264
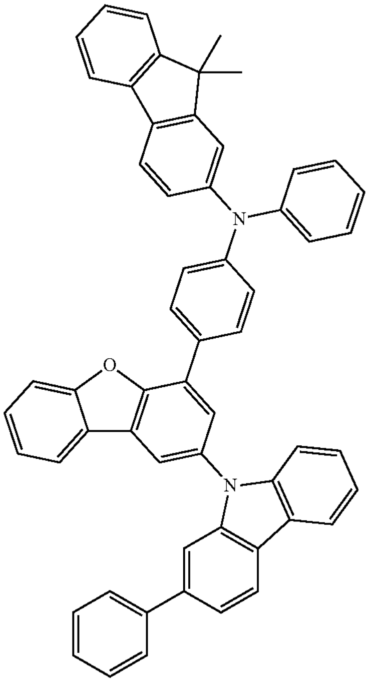
2-265
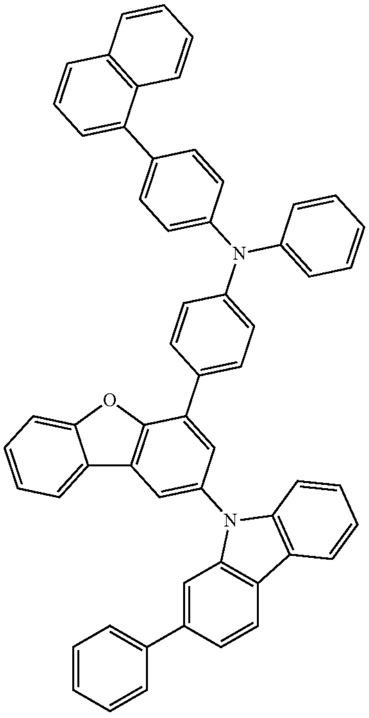
-continued
2-266
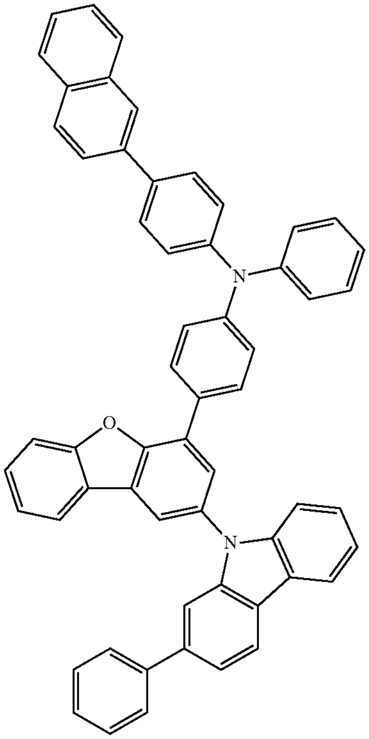
2-267
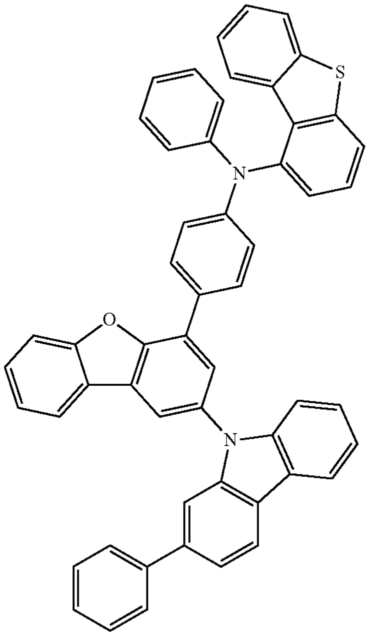

-continued
2-268
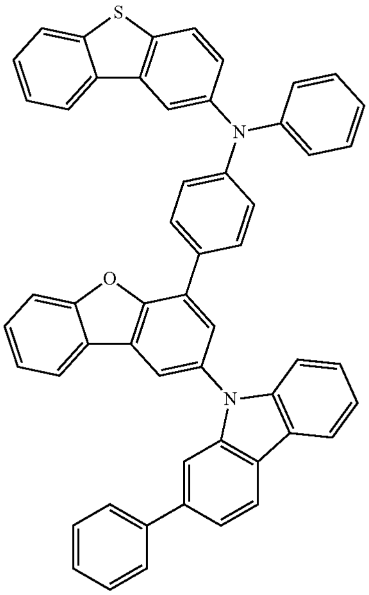
2-269
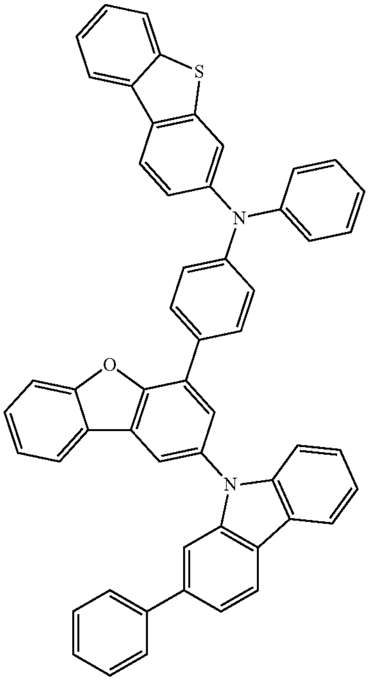
-continued
2-270
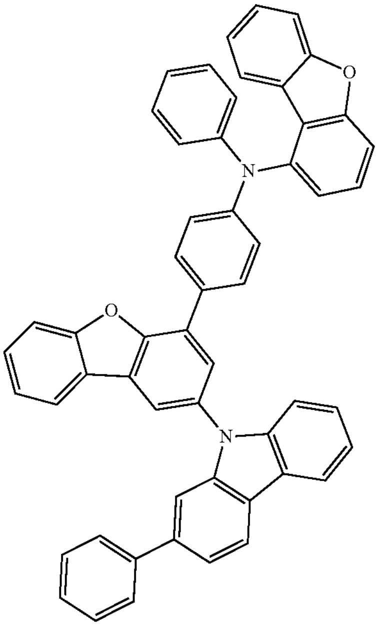
2-271
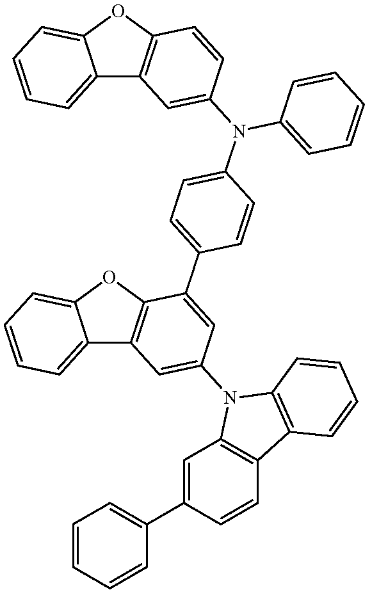

-continued
2-272
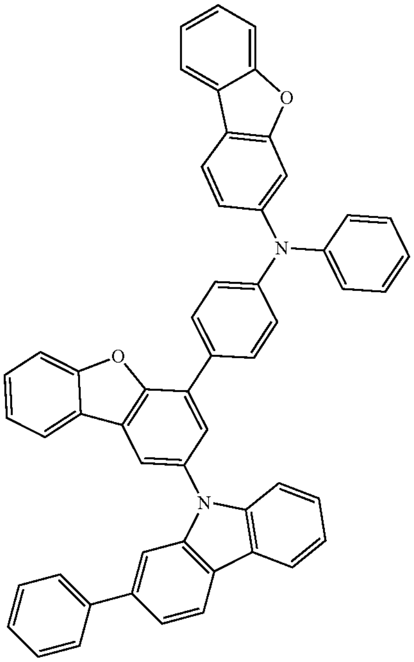
2-273
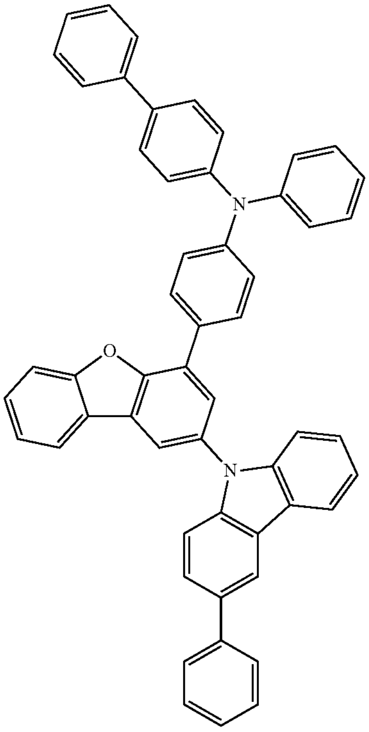
-continued
2-274
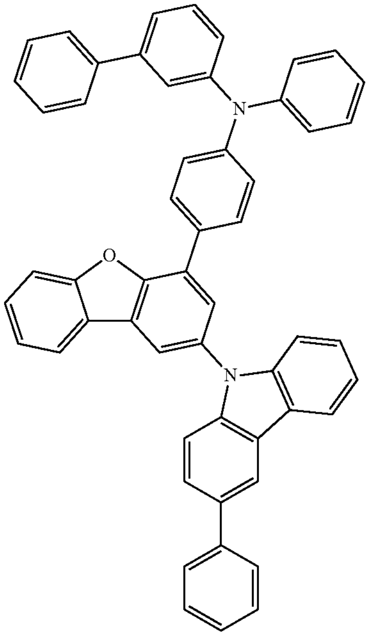
2-275
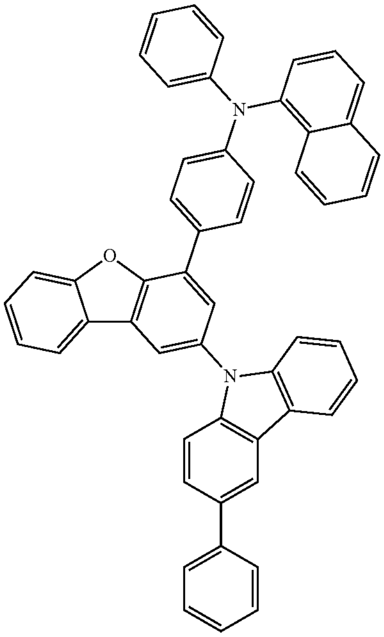

2-276
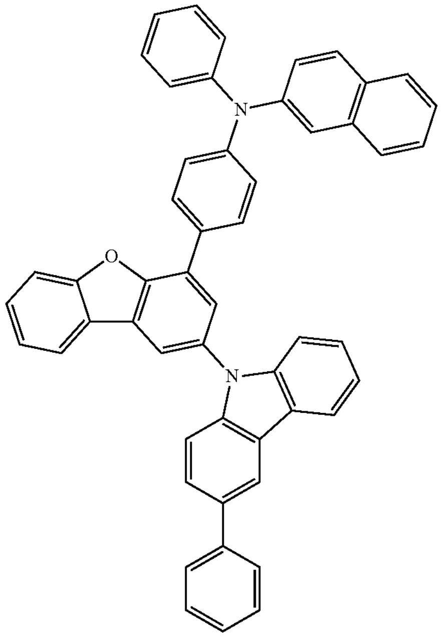
2-277
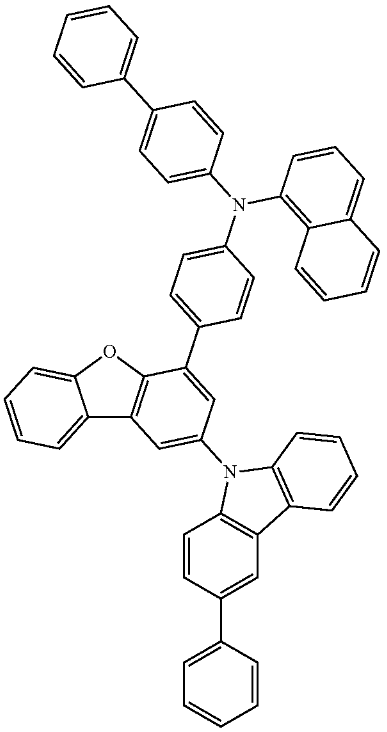
2-278
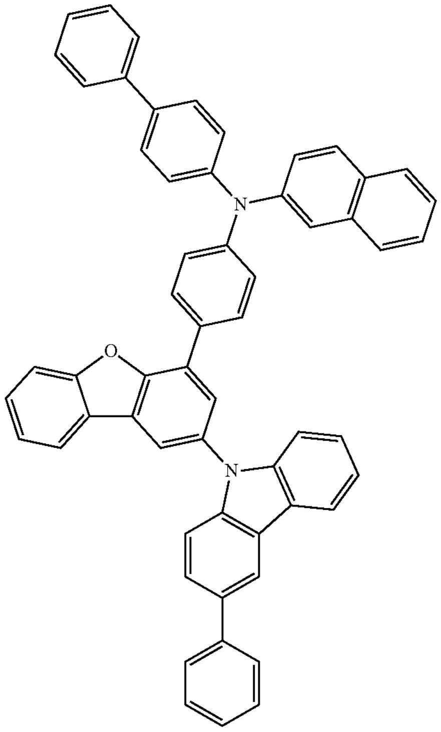
2-279
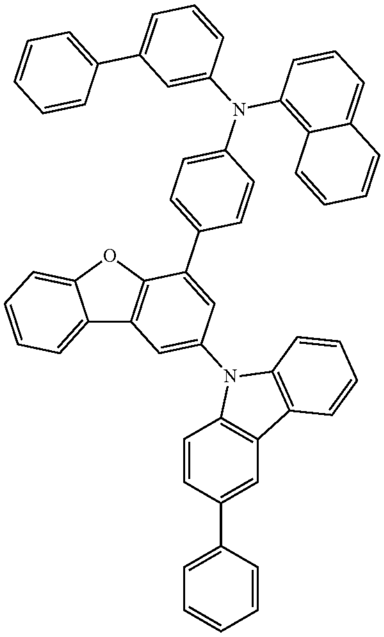

-continued
2-280
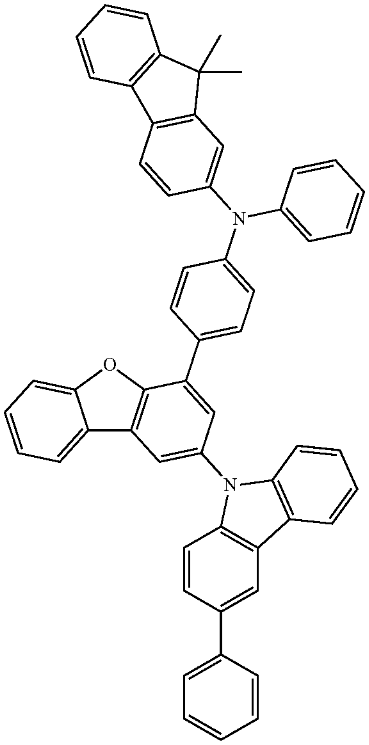
2-281
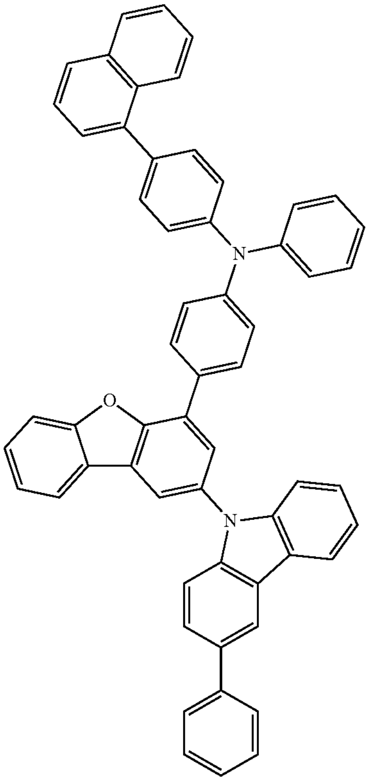
-continued
2-282
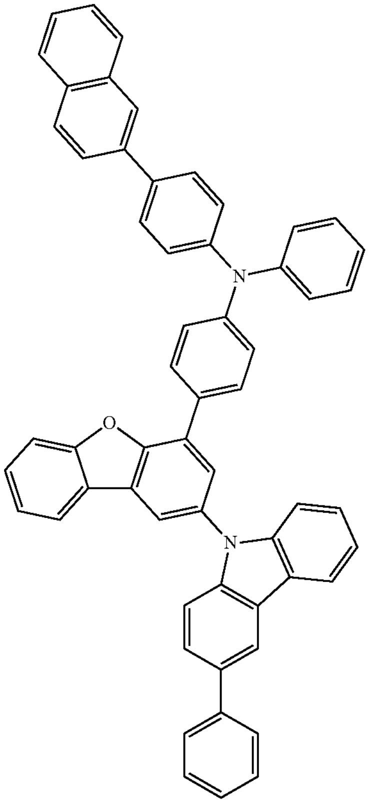
2-283
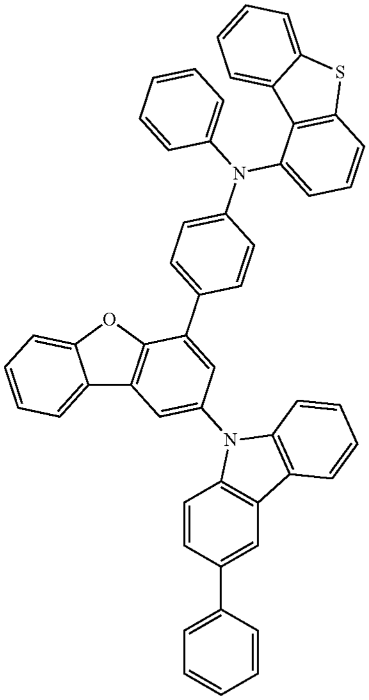

-continued
2-284
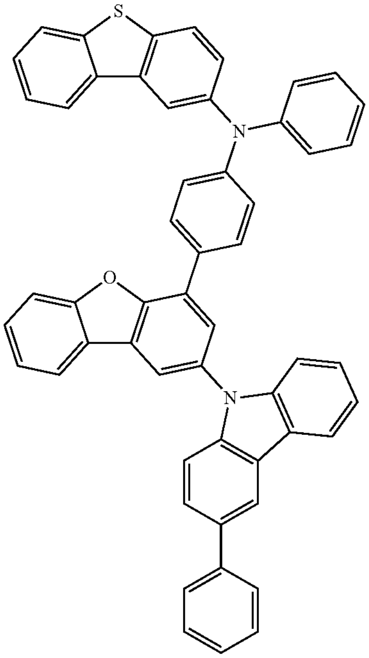
2-285
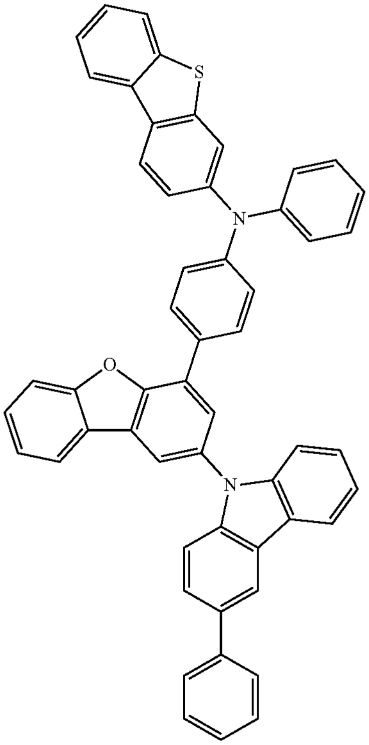
-continued
2-286
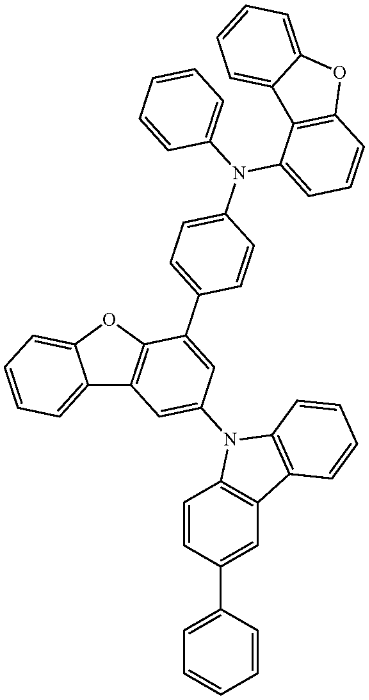
2-287
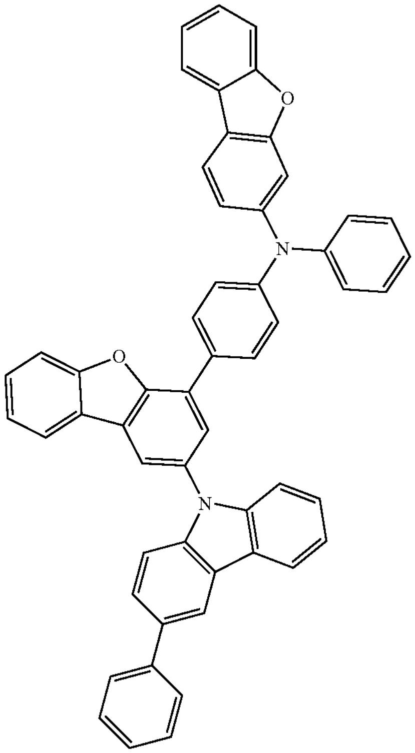

2-288
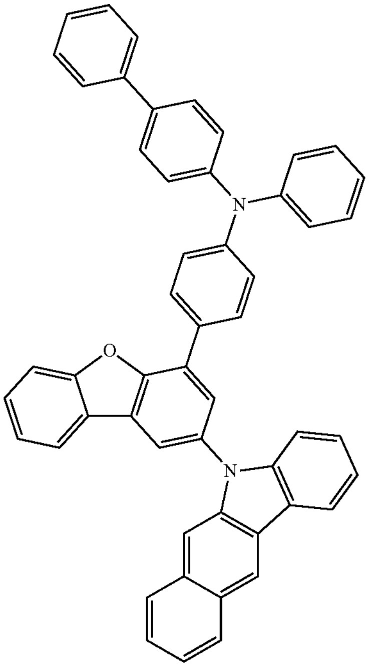
2-289
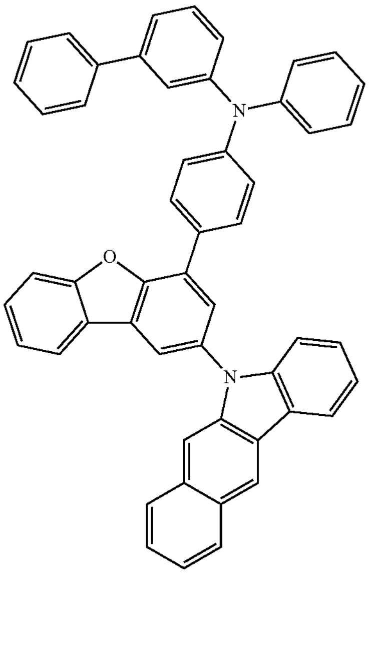
2-290
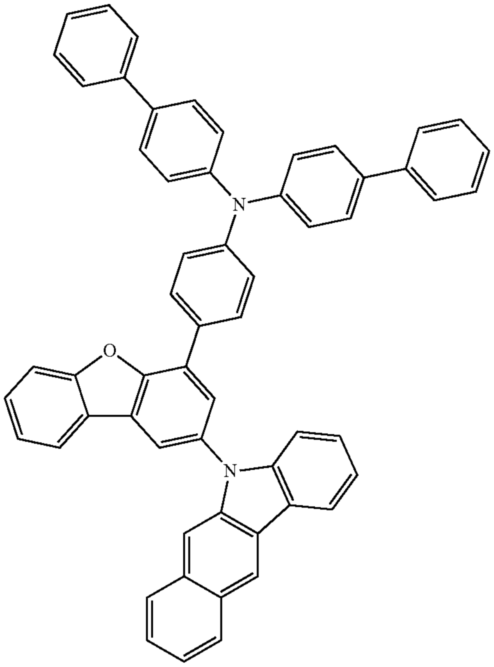
2-291
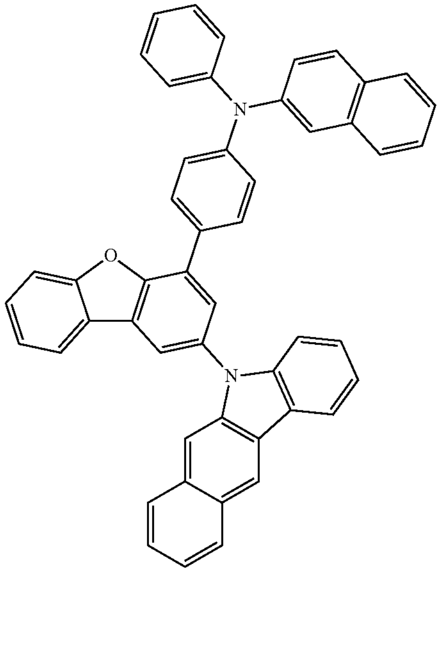

-continued
2-292
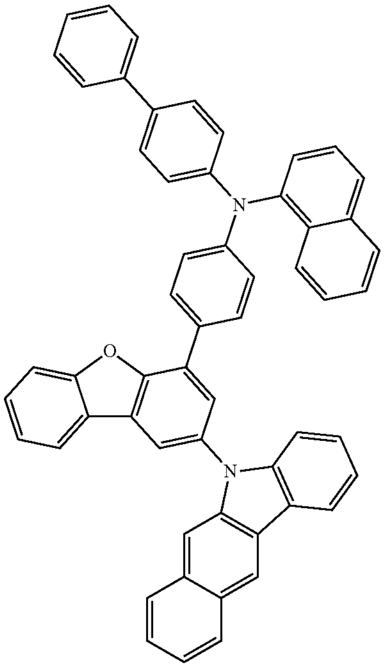
2-293
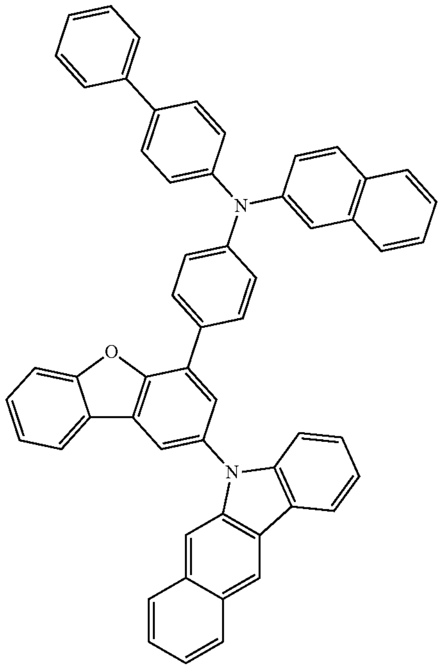
-continued
2-294
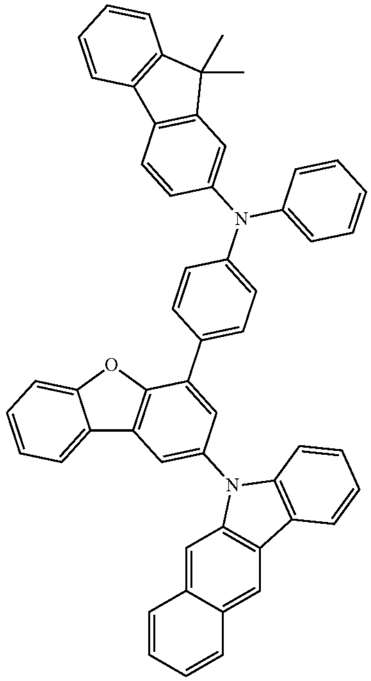
2-295
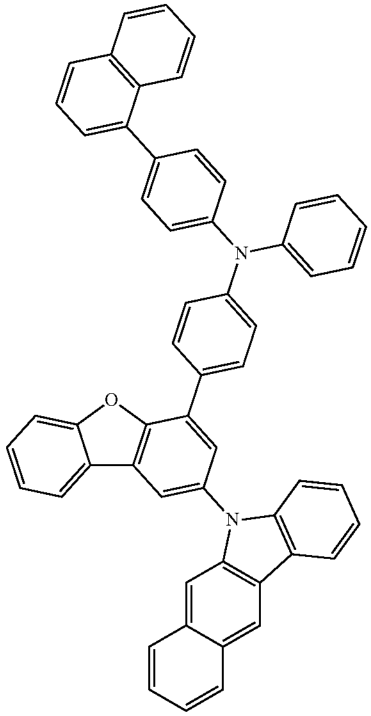

-continued
2-296
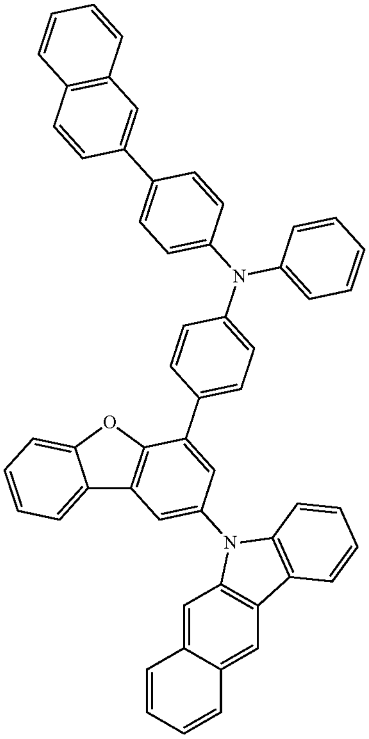
2-297
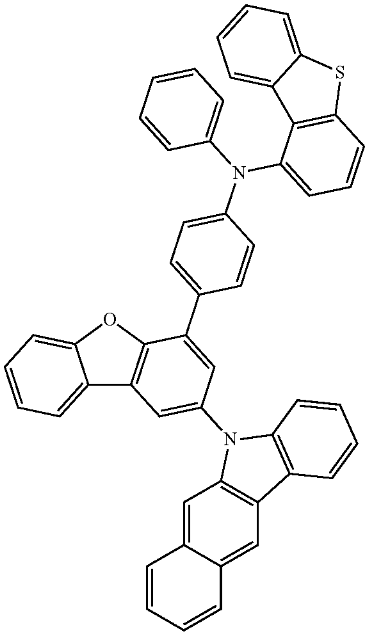
-continued
2-298
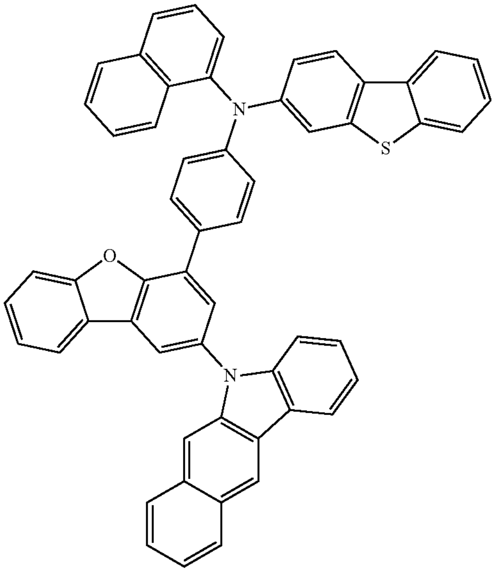
2-299
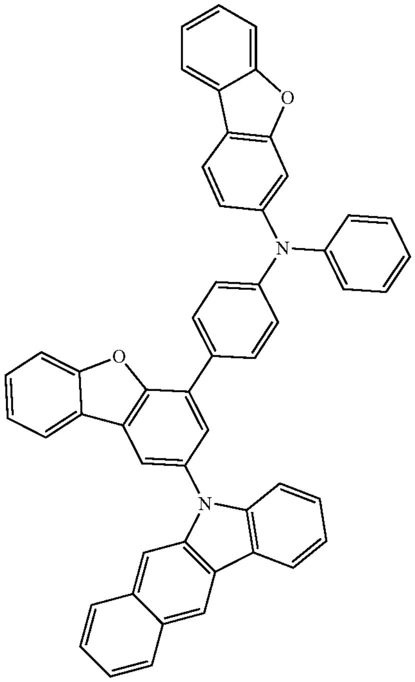

-continued 2-300

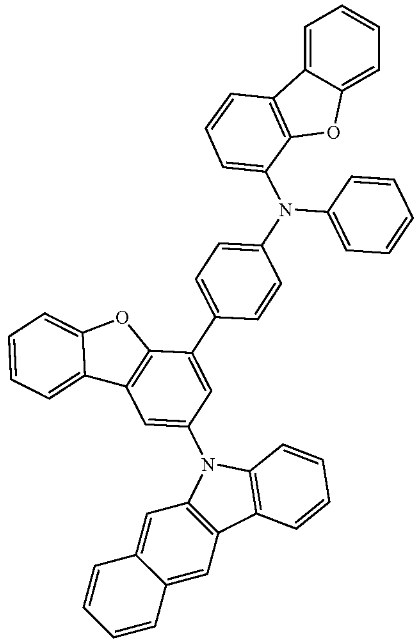

In one embodiment of the present specification, the organic material layer may include Compound (A) of Chemical Formula 1 and Compound (B) represented by Chemical Formula 3.

In one embodiment of the present specification, X3 and X4 of Chemical Formula 3 are each independently O; S; or CR'R".

In one embodiment of the present specification, X3 is 0 or S.

In one embodiment of the present specification, X4 is CR'R", and R' and R" may be each independently a substituted or unsubstituted alkyl group having 1 to 60 carbon atoms; or a substituted or unsubstituted aryl group having 6 to 60 carbon atoms.

In one embodiment of the present specification, X4 is CR'R", and R' and R" may be each independently a substituted or unsubstituted alkyl group having 1 to 30 carbon atoms; or a substituted or unsubstituted aryl group having 6 to 30 carbon atoms.

In one embodiment of the present specification, X4 is CR'R", and R' and R" may be each independently a substituted or unsubstituted alkyl group having 1 to 10 carbon atoms; or a substituted or unsubstituted aryl group having 6 to 20 carbon atoms.

In one embodiment of the present specification, X4 is CR'R", and R' and R" may be each independently an alkyl group having 1 to 10 carbon atoms; or an aryl group having 6 to 20 carbon atoms.

In one embodiment of the present specification, X4 is CR'R", and R' and R" may be each independently a methyl group; or a phenyl group.

In one embodiment of the present specification, R31 may be hydrogen; deuterium; a halogen group; a cyano group; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms.

In one embodiment of the present specification, R31 may be hydrogen; deuterium; a halogen group; a cyano group; a substituted or unsubstituted alkyl group having 1 to 30 carbon atoms; a substituted or unsubstituted aryl group having 6 to 30 carbon atoms; or a substituted or unsubstituted heteroaryl group having 2 to 30 carbon atoms.

In one embodiment of the present specification, R31 may be hydrogen; or deuterium.

In one embodiment of the present specification, R31 is hydrogen.

In one embodiment of the present specification, L2 may be a direct bond; a substituted or unsubstituted arylene group having 6 to 40 carbon atoms; or a substituted or unsubstituted heteroarylene group having 2 to 40 carbon atoms.

In one embodiment of the present specification, L2 may be a direct bond; a substituted or unsubstituted arylene group having 6 to 30 carbon atoms; or a substituted or unsubstituted heteroarylene group having 2 to 30 carbon atoms.

In one embodiment of the present specification, L2 may be a direct bond; a substituted or unsubstituted phenylene group; a substituted or unsubstituted biphenylene group; a substituted or unsubstituted divalent naphthyl group; a substituted or unsubstituted divalent triphenylene group; a substituted or unsubstituted divalent fluorenyl group; a substituted or unsubstituted divalent dibenzofuran group; a substituted or unsubstituted divalent dibenzothiophene group; or a substituted or unsubstituted benzonaphthofuran group.

In one embodiment of the present specification, L2 may be a direct bond; a phenylene group; a biphenylene group; a divalent naphthyl group; a divalent triphenylene group; a divalent fluorenyl group; a divalent dibenzofuran group; a divalent dibenzothiophene group; or a benzonaphthofuran group.

In one embodiment of the present specification, L2 may be a substituted or unsubstituted arylene group having 6 to 40 carbon atoms; or a substituted or unsubstituted heteroarylene group having 2 to 40 carbon atoms.

In one embodiment of the present specification, L2 may be a substituted or unsubstituted phenylene group; a substituted or unsubstituted biphenylene group; a substituted or unsubstituted divalent naphthyl group; a substituted or unsubstituted divalent triphenylene group; a substituted or unsubstituted divalent fluorenyl group; a substituted or unsubstituted divalent dibenzofuran group; a substituted or unsubstituted divalent dibenzothiophene group; or a substituted or unsubstituted benzonaphthofuran group.

In one embodiment of the present specification, L2 may be a phenylene group; a biphenylene group; a divalent naphthyl group; a divalent triphenylene group; a divalent fluorenyl group; a divalent dibenzofuran group; a divalent dibenzothiophene group; or a benzonaphthofuran group.

In one embodiment of the present specification, A2 may be a substituted or unsubstituted aryl group having 6 to 60 carbon atoms; a substituted or unsubstituted heteroaryl group having 2 to 60 carbon atoms; or a substituted or unsubstituted amine group.

In one embodiment of the present specification, A2 may be a substituted or unsubstituted aryl group having 6 to 60 carbon atoms; or a substituted or unsubstituted heteroaryl group having 2 to 60 carbon atoms.

In another embodiment, A2 may be a substituted or unsubstituted amine group.

In one embodiment of the present specification, A2 may be an amine group unsubstituted or substituted with one or more substituents selected from the group consisting of a substituted or unsubstituted aryl group and a substituted or unsubstituted heteroaryl group.

In one embodiment of the present specification, A2 may be an amine group unsubstituted or substituted with one or more substituents selected from the group consisting of an unsubstituted aryl group, an aryl group substituted with an alkyl group, an aryl group substituted with an aryl group, an aryl group substituted with a heteroaryl group, and a heteroaryl group.

In one embodiment of the present specification, A2 may be an amine group unsubstituted or substituted with one or more substituents selected from the group consisting of a phenyl group, a biphenyl group, a terphenyl group, a naphthyl group, a triphenylene group, a fluorenyl group substituted with an alkyl group, a fluorenyl group substituted with an aryl group, a phenyl group substituted with an alkyl group, a phenyl group substituted with a naphthyl group, a phenyl group substituted with a fluorenyl group substituted with an alkyl group, a phenyl group substituted with a dibenzofuran group, a phenyl group substituted with a dibenzothiophene group, a dibenzofuran group, and a dibenzothiophene group.

In one embodiment of the present specification, Chemical Formula 3 may be represented by the following Chemical Formula 3-1.

[Chemical Formula 3-1]

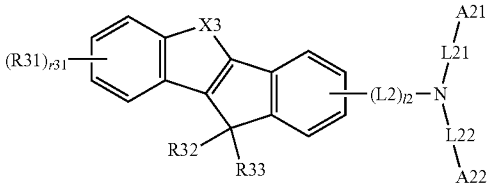

In Chemical Formula 3-1,

X3, R31, r31, L2 and l2 have the same definitions as in Chemical Formula 3,

L21 and L22 are each independently a direct bond; a substituted or unsubstituted arylene group having 6 to 60 carbon atoms; or a substituted or unsubstituted heteroarylene group having 2 to 60 carbon atoms, A21 and A22 are each independently a substituted or unsubstituted aryl group having 6 to 60 carbon atoms; or a substituted or unsubstituted heteroaryl group having 2 to 60 carbon atoms, and R32 and R33 are each independently a substituted or unsubstituted alkyl group having 1 to 60 carbon atoms; or a substituted or unsubstituted aryl group having 6 to 60 carbon atoms.

In one embodiment of the present specification, L21 and L22 may be each independently a direct bond; a substituted or unsubstituted arylene group having 6 to 30 carbon atoms; or a substituted or unsubstituted heteroarylene group having 2 to 30 carbon atoms.

In one embodiment of the present specification, L21 and L22 may be each independently a direct bond; or a substituted or unsubstituted arylene group having 6 to 30 carbon atoms.

In one embodiment of the present specification, L21 and L22 may be each independently a direct bond; a substituted or unsubstituted phenylene group; or a substituted or unsubstituted biphenylene group.

In one embodiment of the present specification, L21 and L22 may be each independently a direct bond; a phenylene group; or a biphenylene group.

In one embodiment of the present specification, A21 and A22 may be each independently a substituted or unsubstituted phenyl group; a substituted or unsubstituted biphenyl group; a substituted or unsubstituted terphenyl group; a substituted or unsubstituted naphthyl group; a substituted or unsubstituted triphenylene group; a substituted or unsubstituted fluorenyl group; a substituted or unsubstituted dibenzofuran group; or a substituted or unsubstituted dibenzothiophene group.

In one embodiment of the present specification, A21 and A22 may be each independently a phenyl group unsubstituted or substituted with an alkyl group, an aryl group or a heteroaryl group; a biphenyl group; a terphenyl group; a naphthyl group; a triphenylene group; a fluorenyl group unsubstituted or substituted with an alkyl group or an aryl group; a dibenzofuran group; or a dibenzothiophene group.

In one embodiment of the present specification, R32 and R33 may be each independently a substituted or unsubstituted alkyl group having 1 to 30 carbon atoms; or a substituted or unsubstituted aryl group having 6 to 30 carbon atoms.

In one embodiment of the present specification, R32 and R33 may be each independently a substituted or unsubstituted alkyl group having 1 to 10 carbon atoms; or a substituted or unsubstituted aryl group having 6 to 20 carbon atoms.

In one embodiment of the present specification, R32 and R33 may be each independently an alkyl group having 1 to 10 carbon atoms; or an aryl group having 6 to 20 carbon atoms.

In one embodiment of the present specification, R32 and R33 may be each independently a methyl group; or a phenyl group.

In one embodiment of the present specification, Chemical Formula 3 may be represented by any one of the following compounds, but is not limited thereto.

3-1

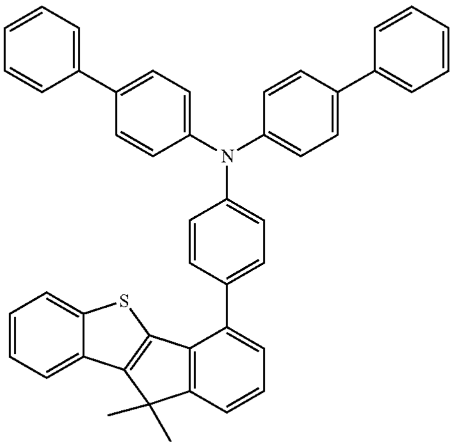

-continued
3-2
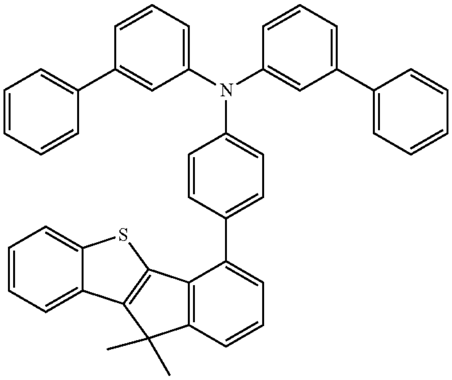
3-3
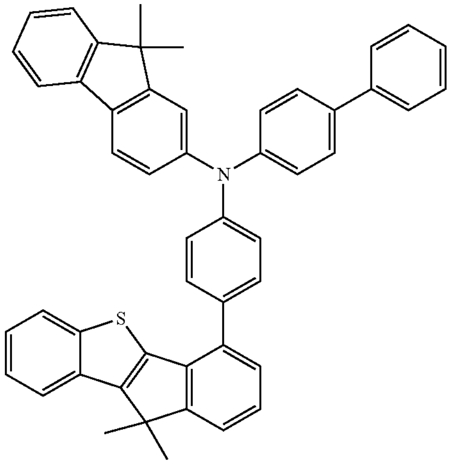
3-4
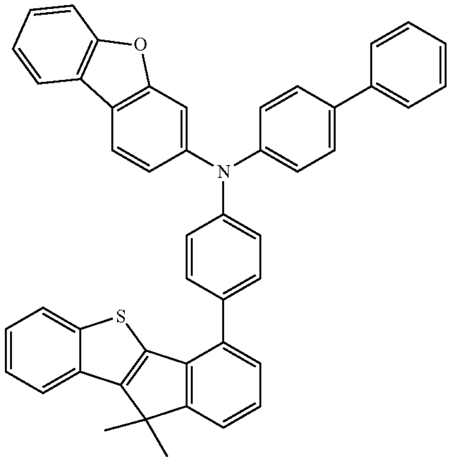
-continued
3-5
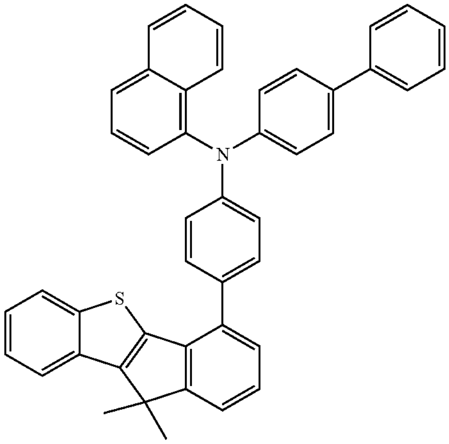
3-6
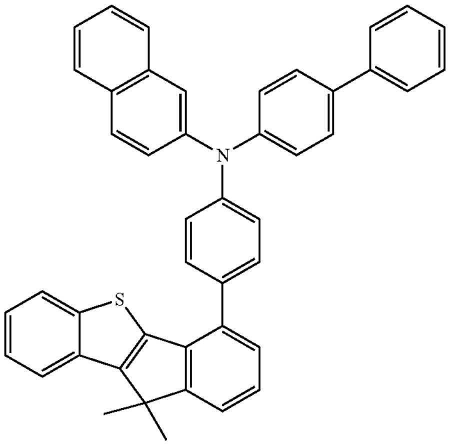
3-7
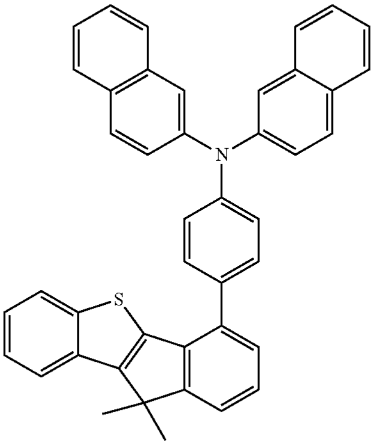

-continued
3-8
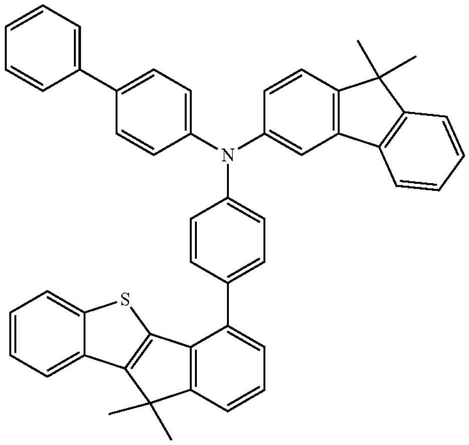
3-9
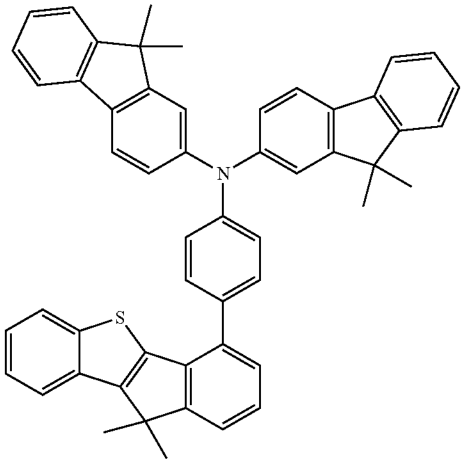
3-10
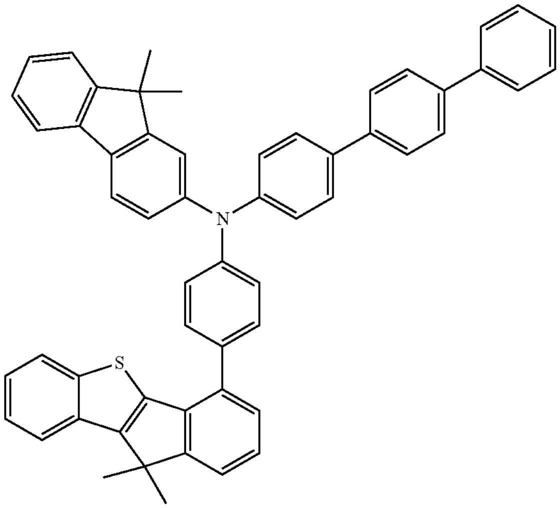
-continued
3-11
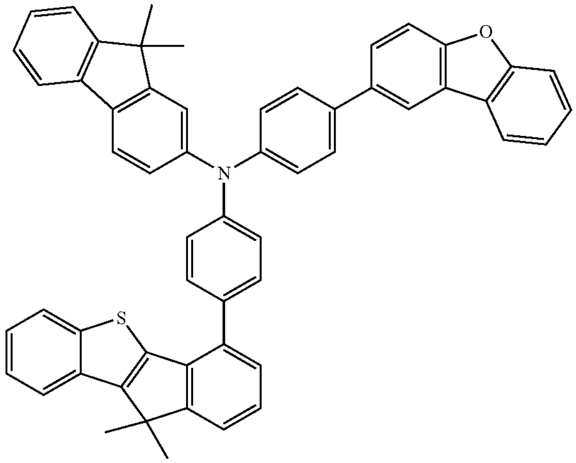
3-12
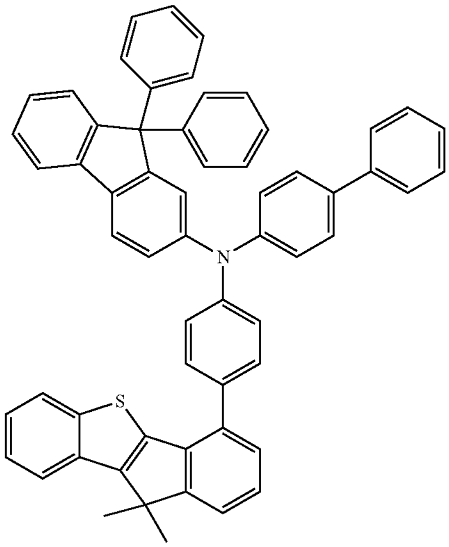
3-13
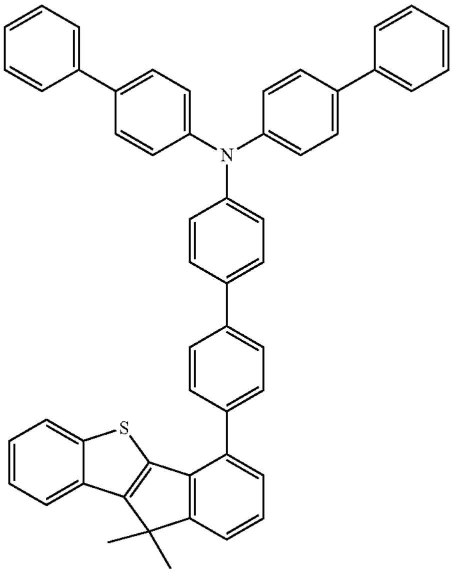

-continued
3-14
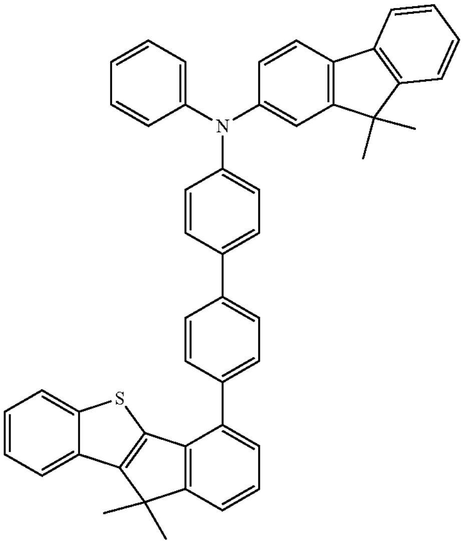
3-15
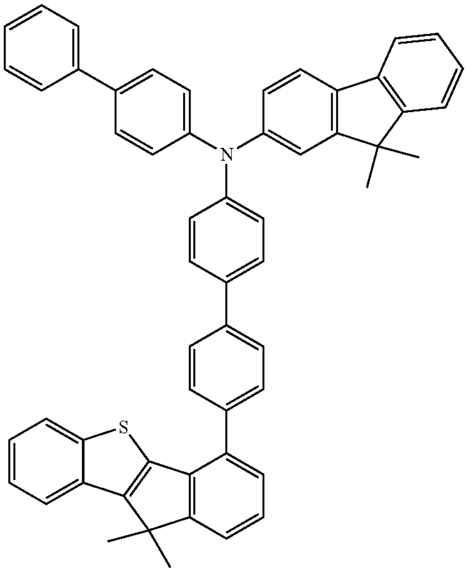
-continued
3-16
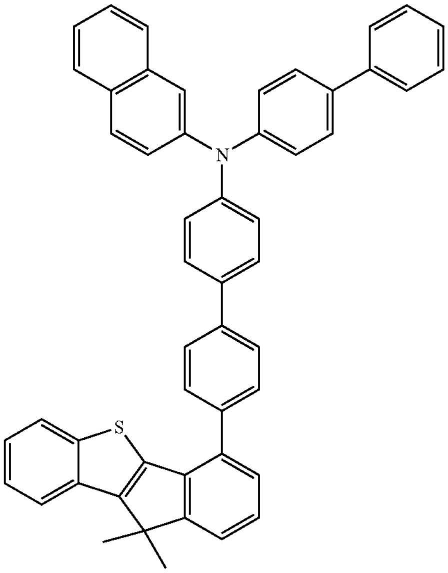
3-17
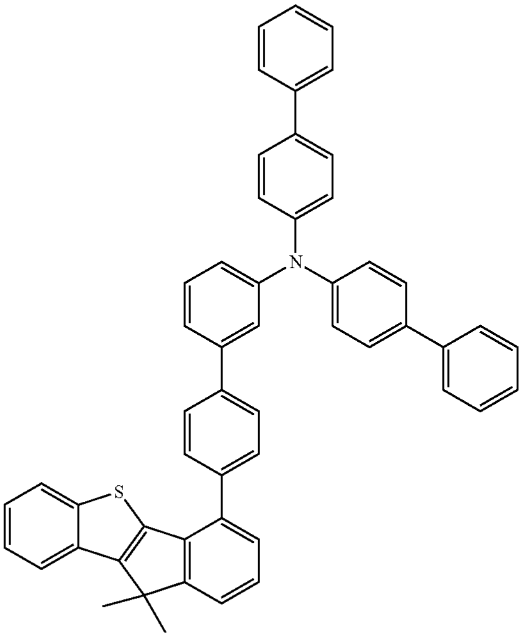

-continued
3-18
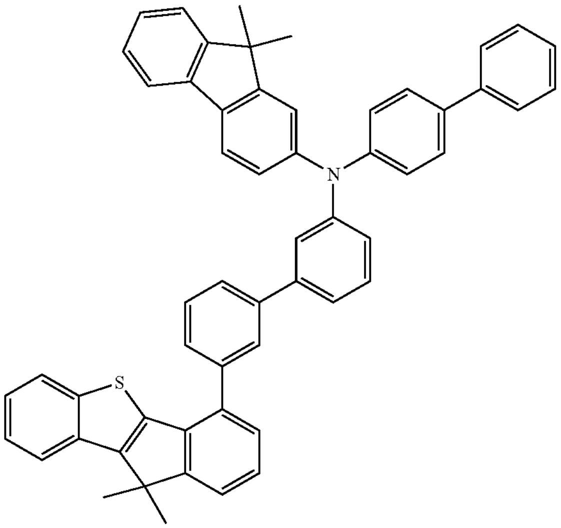
3-19
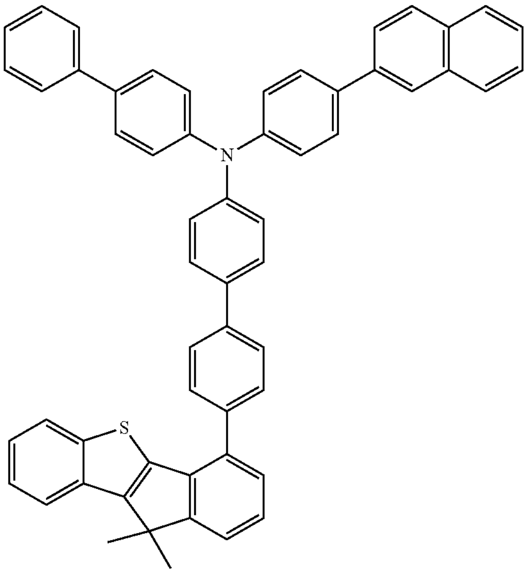
3-20
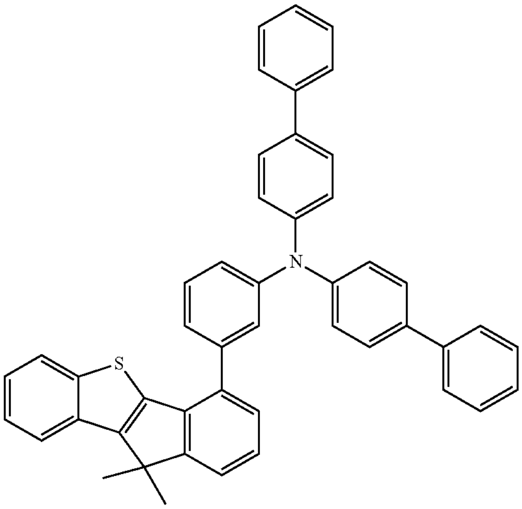
-continued
3-21
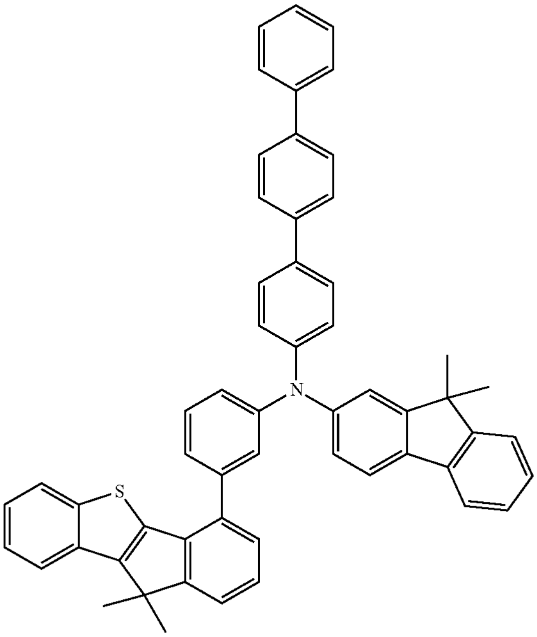
3-22
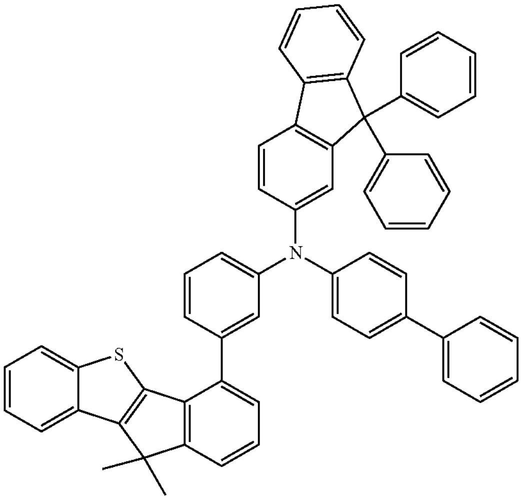

-continued
3-23
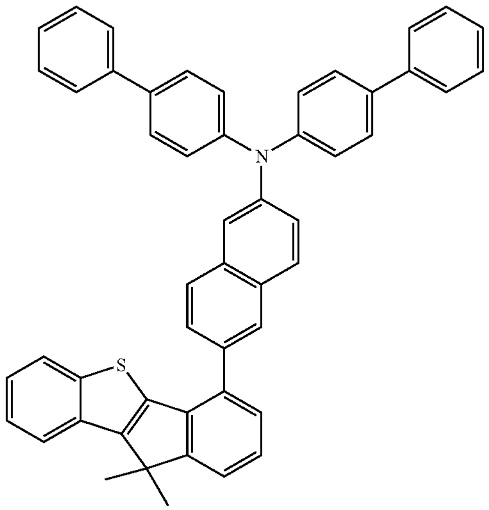
3-24
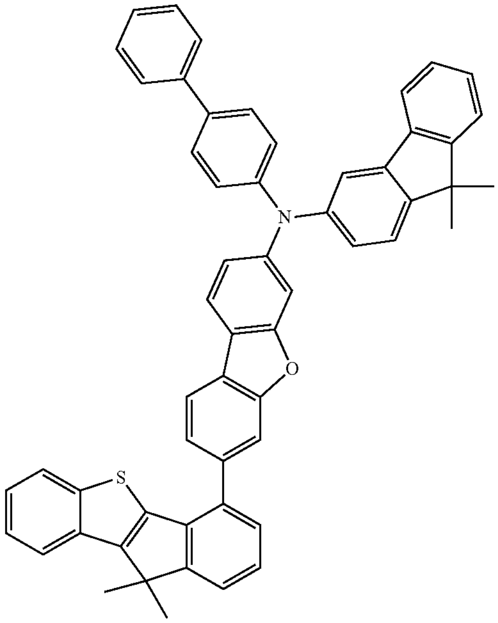
-continued
3-25
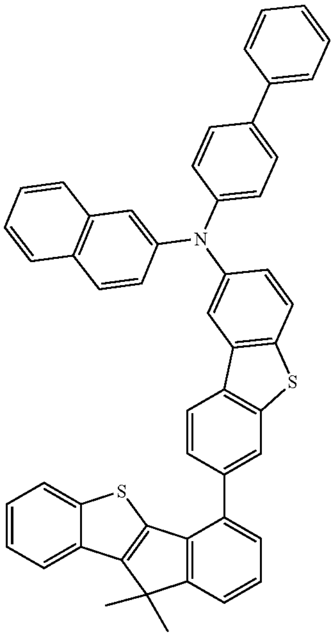
3-26
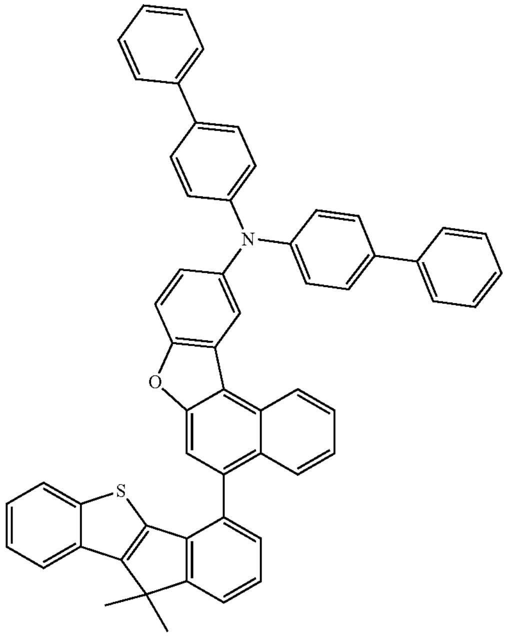

3-27
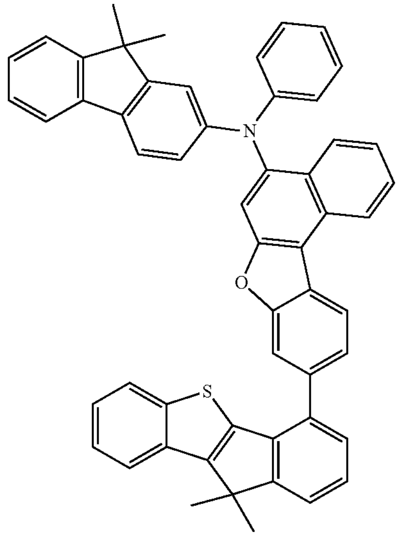
3-28
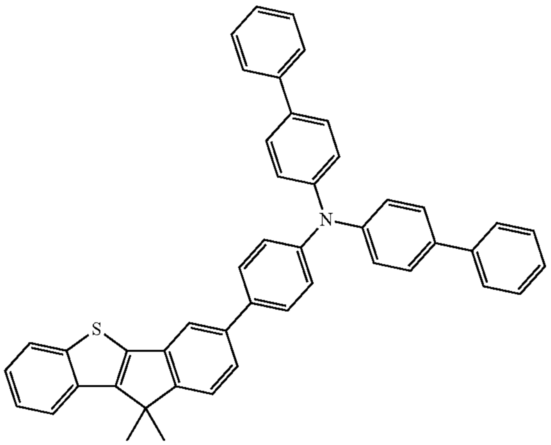
3-29
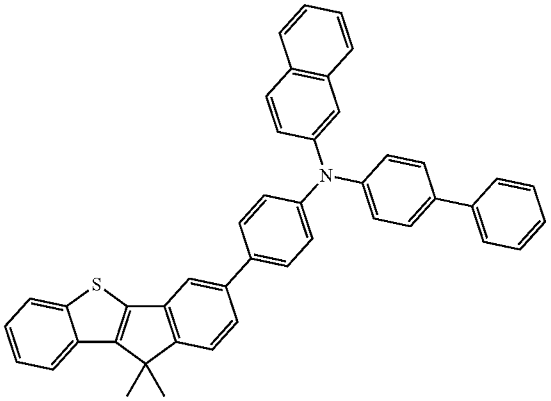
3-30
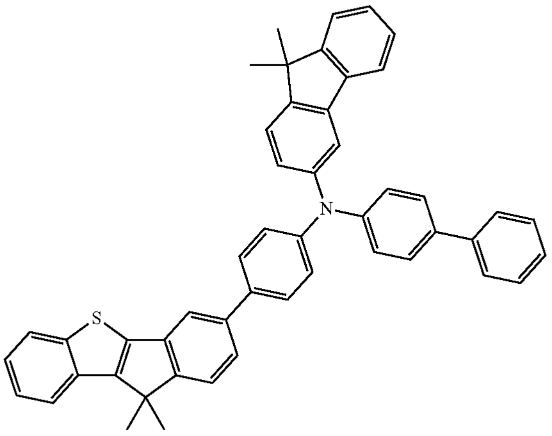
3-31
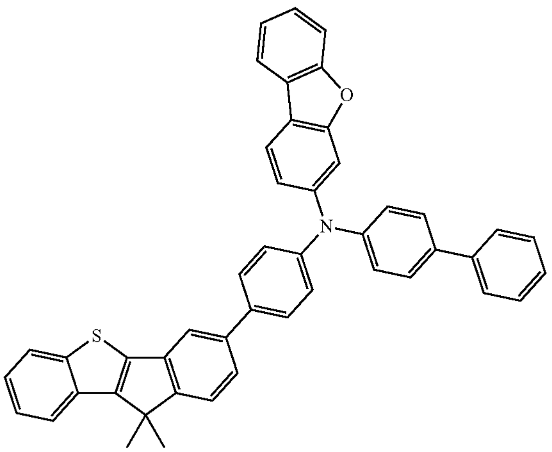
3-32
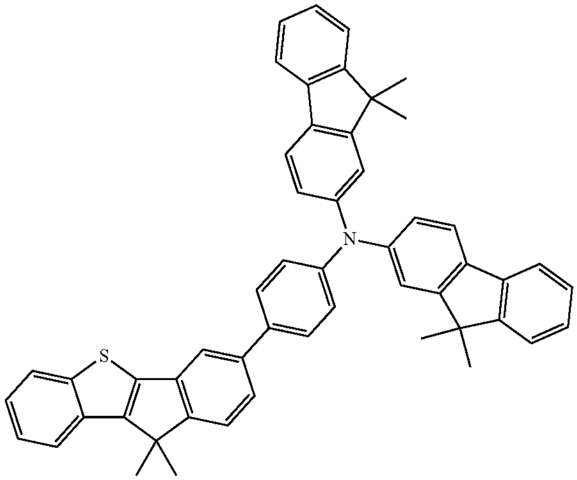

3-33
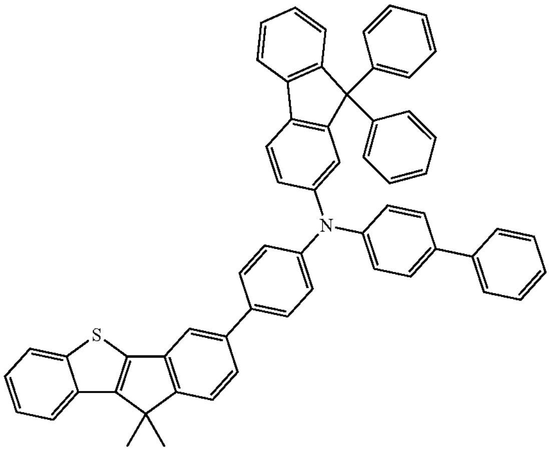
3-34
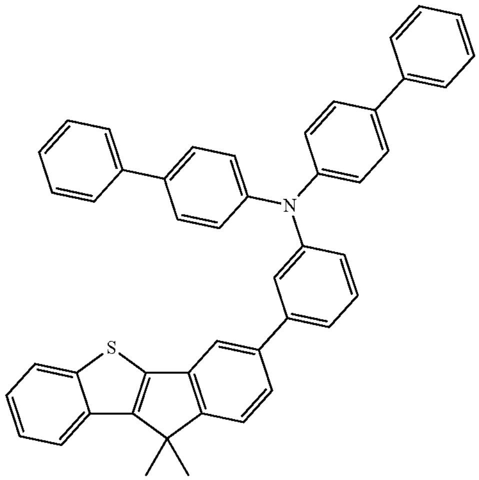
3-35
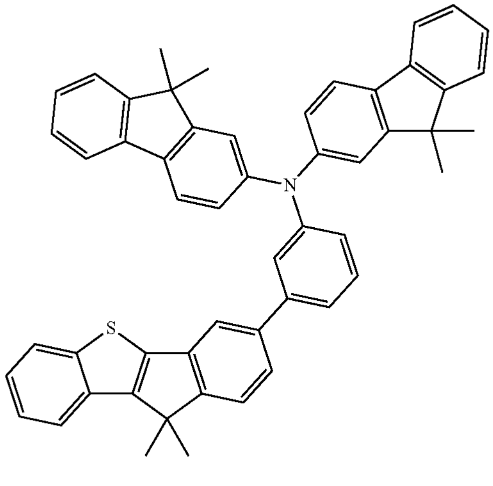
3-36
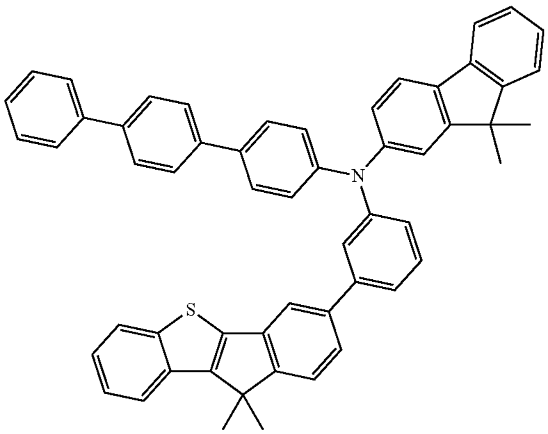
3-37
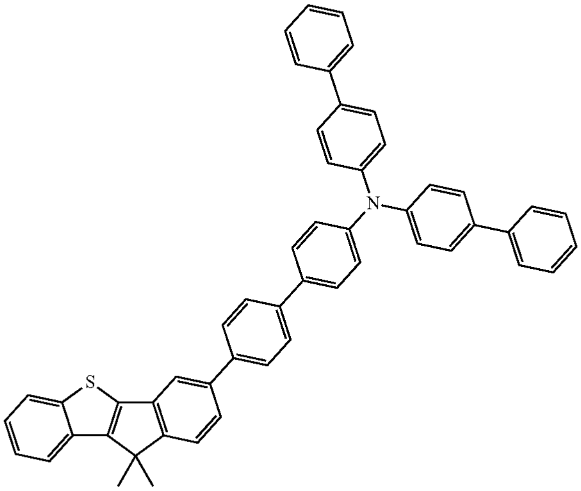
3-38
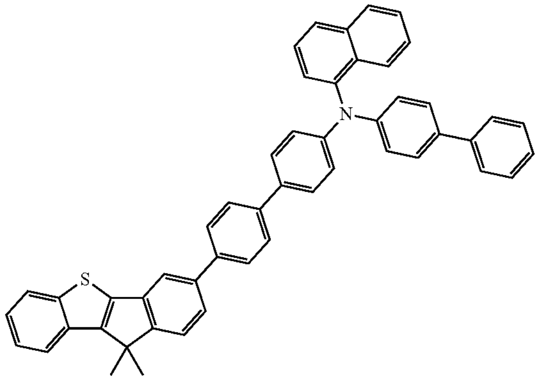

3-39
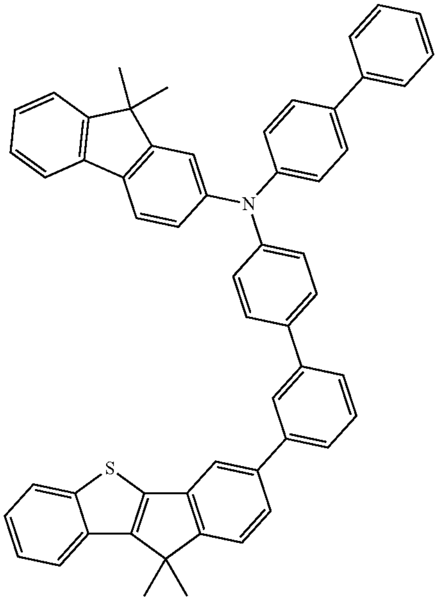
3-40
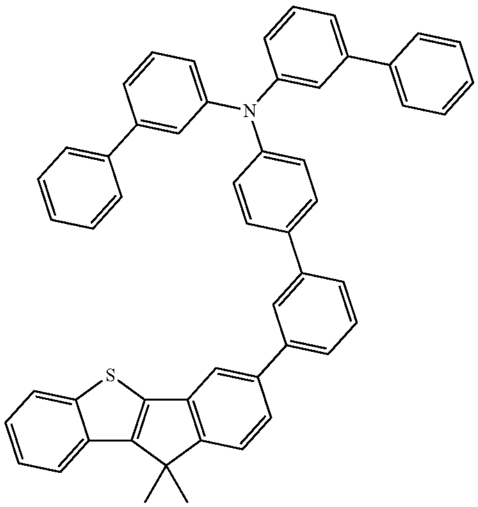
3-41
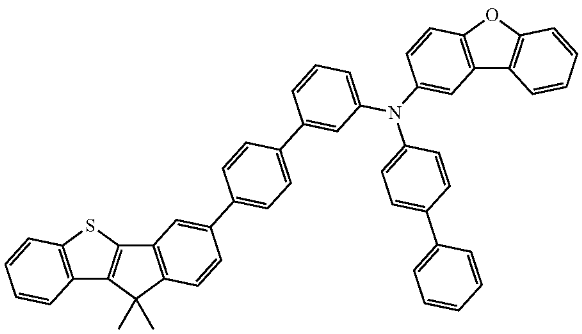
3-42
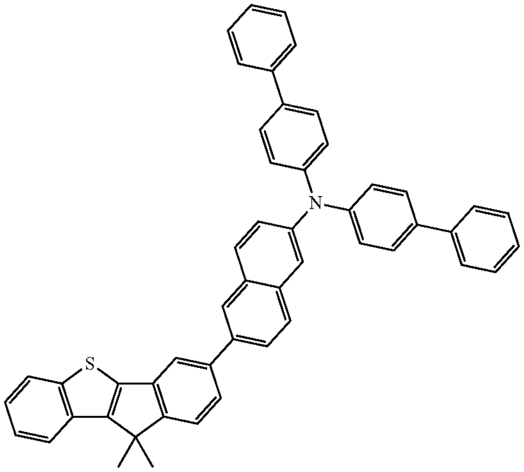
3-43
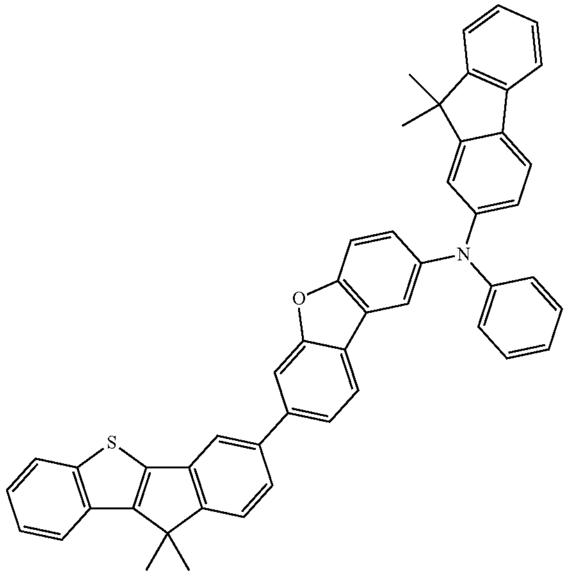
3-44
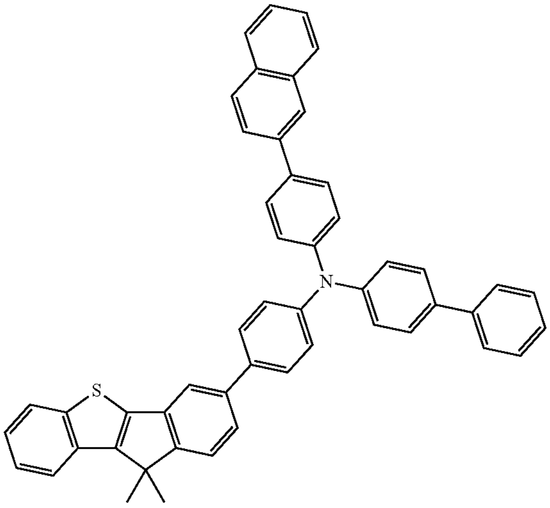

-continued
3-45
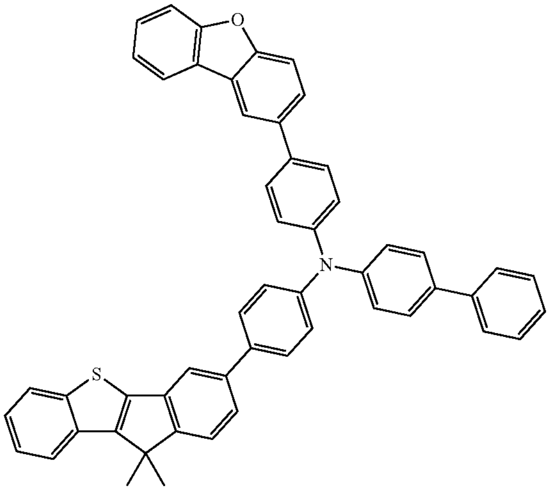
3-46
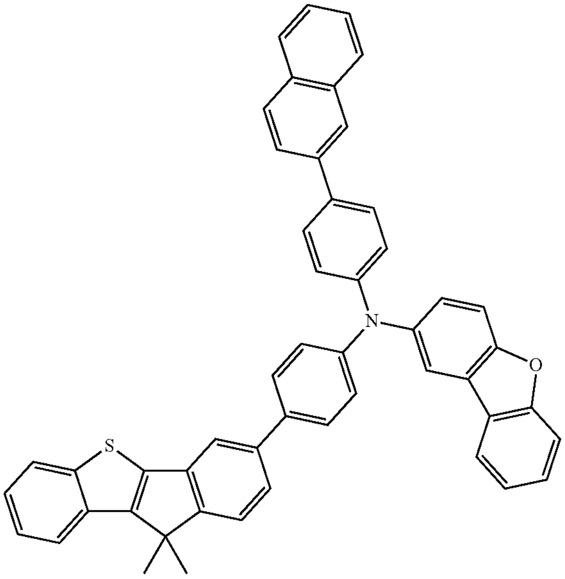
3-47
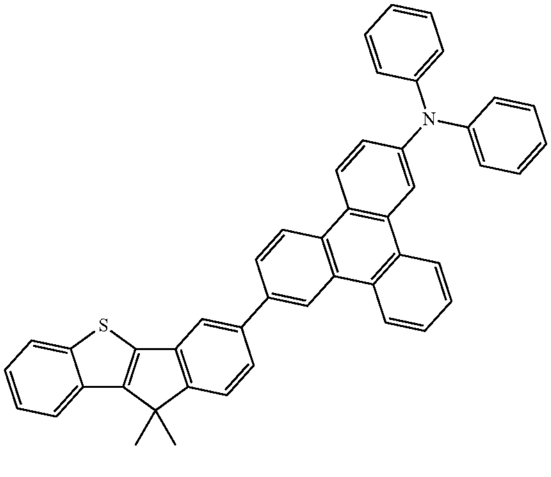
-continued
3-48
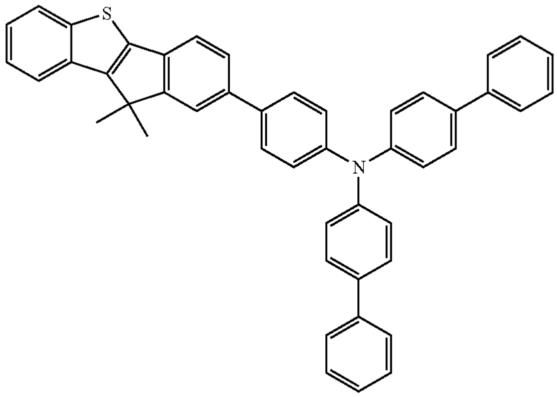
3-49
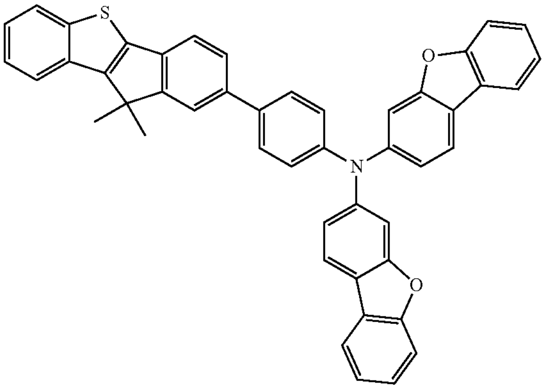
3-50
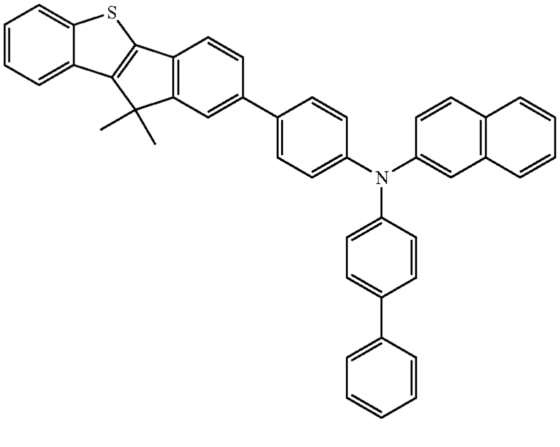

-continued
3-51
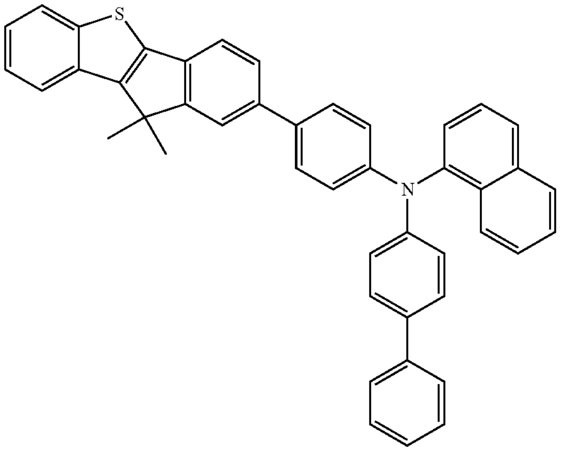
3-52
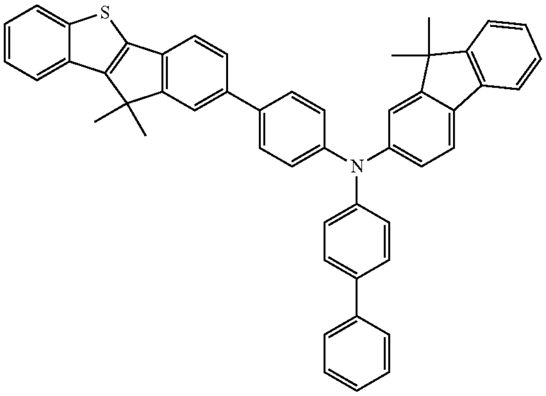
3-53
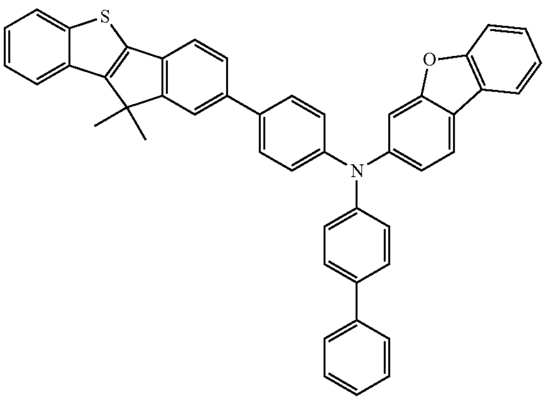
-continued
3-54
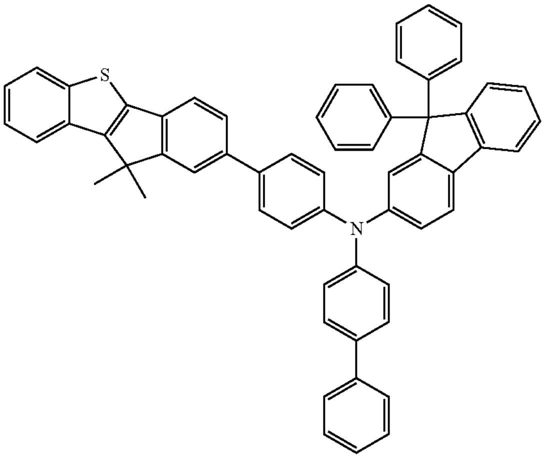
3-55
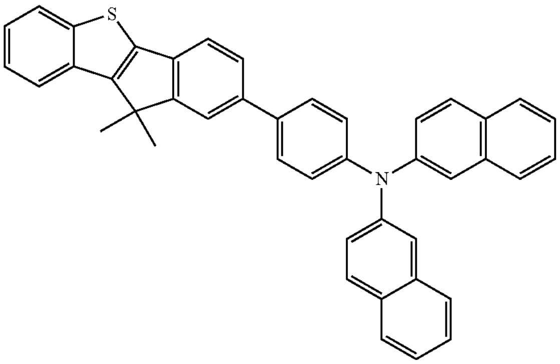
3-56
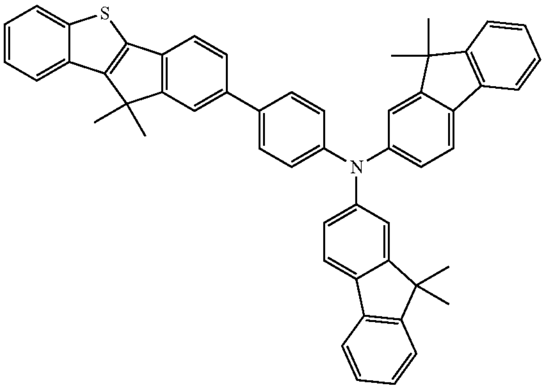
3-57
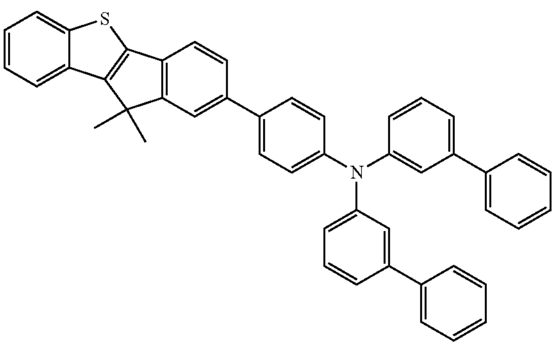

-continued
3-58
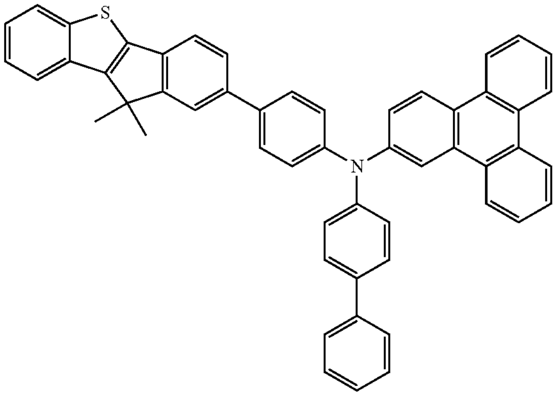
3-59
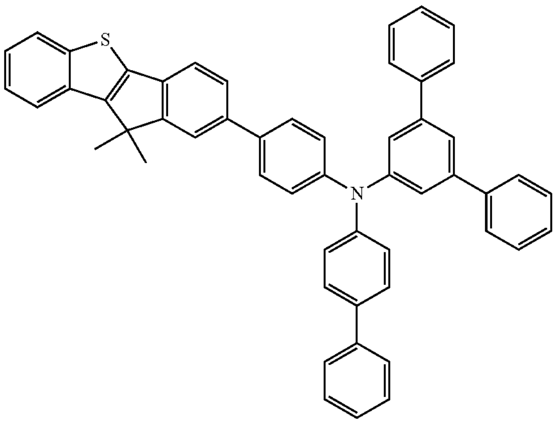
3-60
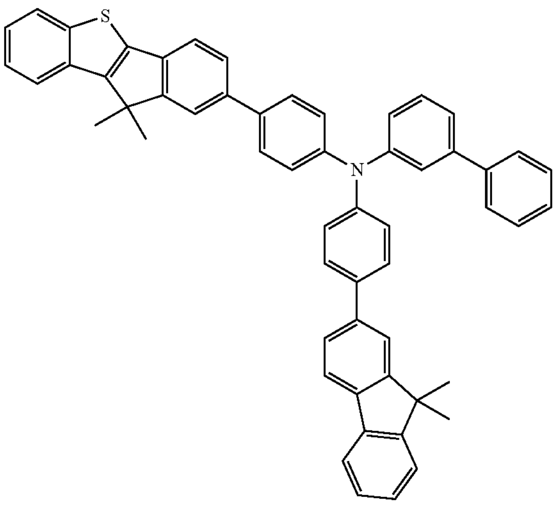
-continued
3-61
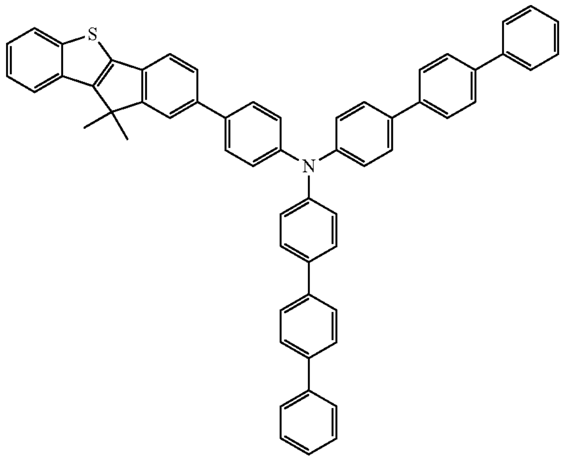
3-62
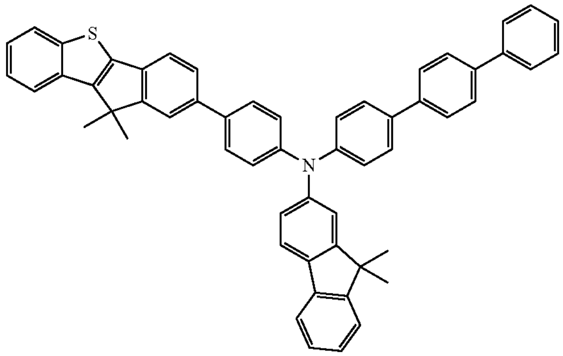
3-63
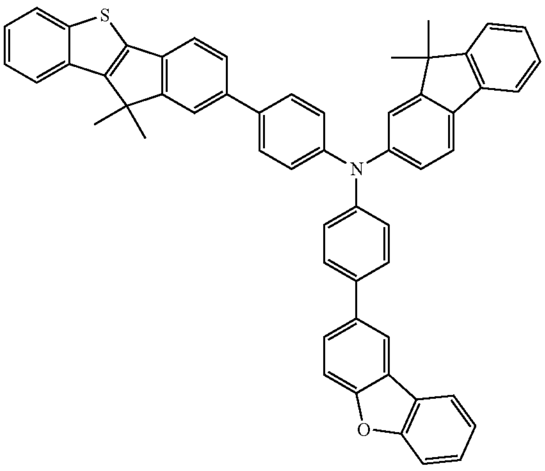

-continued
3-64
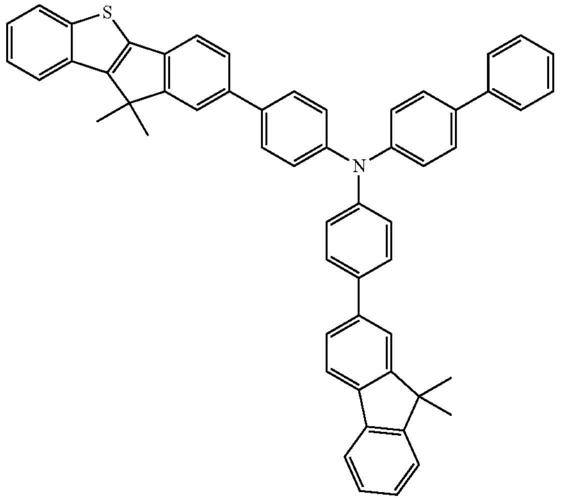
3-65
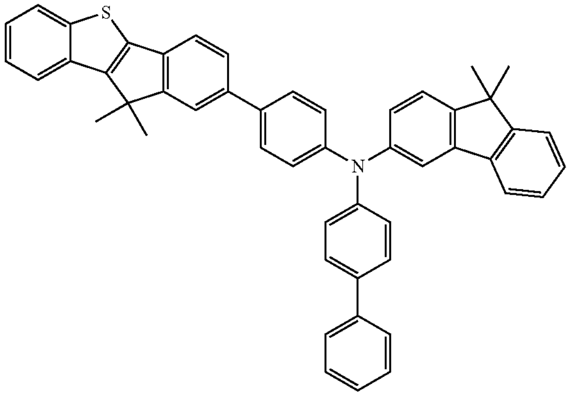
3-66
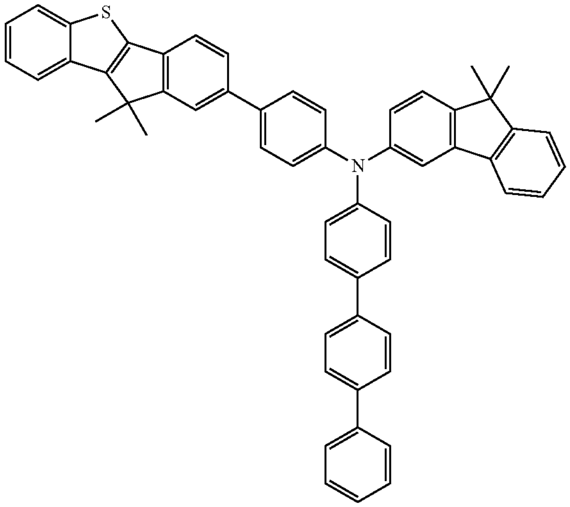
-continued
3-67
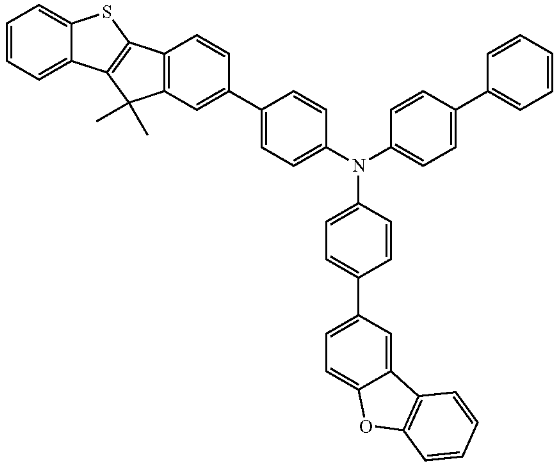
3-68
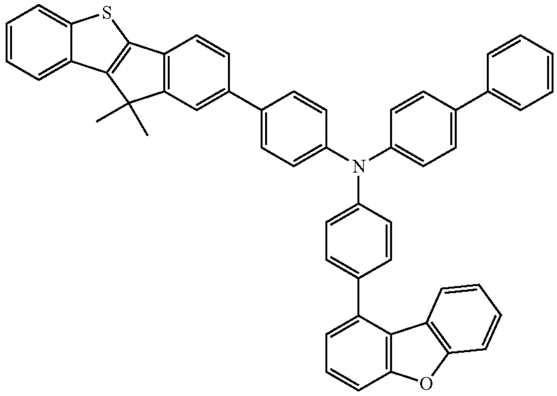
3-69
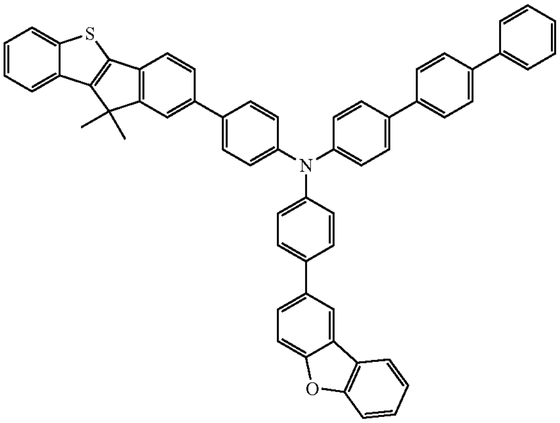

-continued
3-70
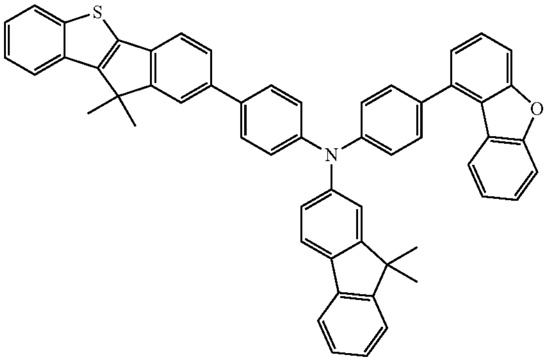
3-71
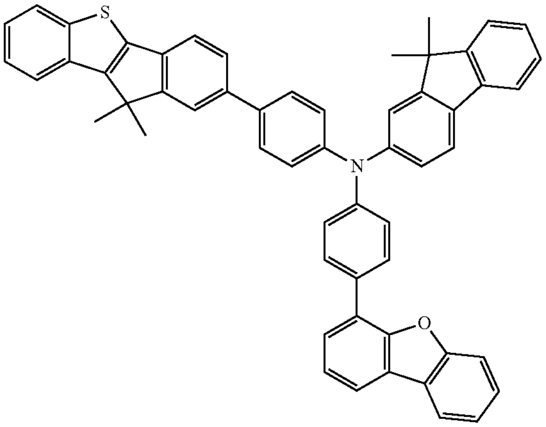
3-72
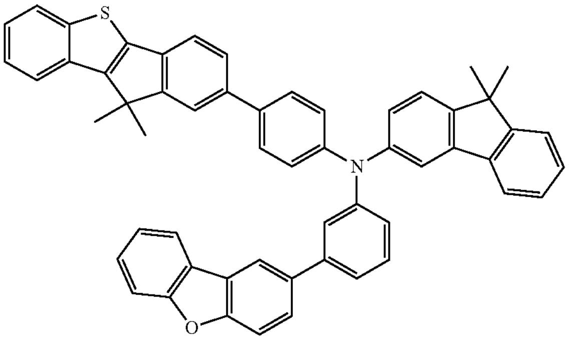
3-73
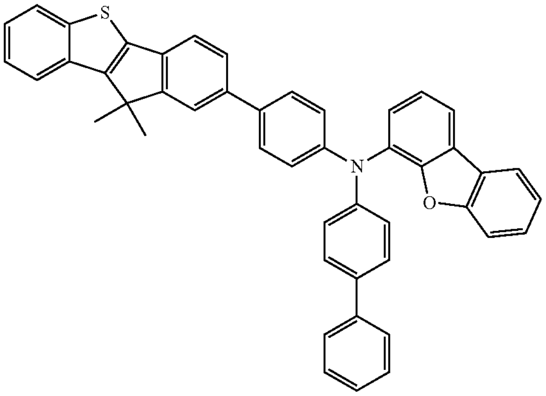
-continued
3-74
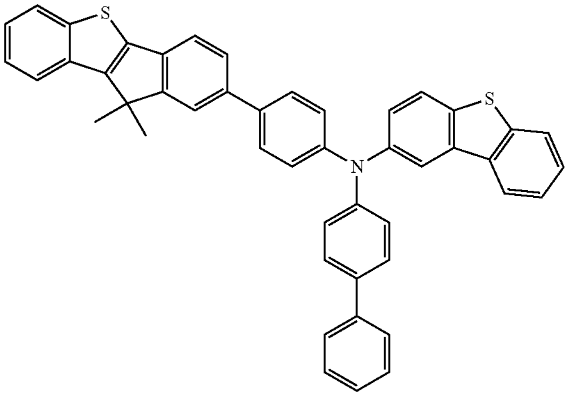
3-75
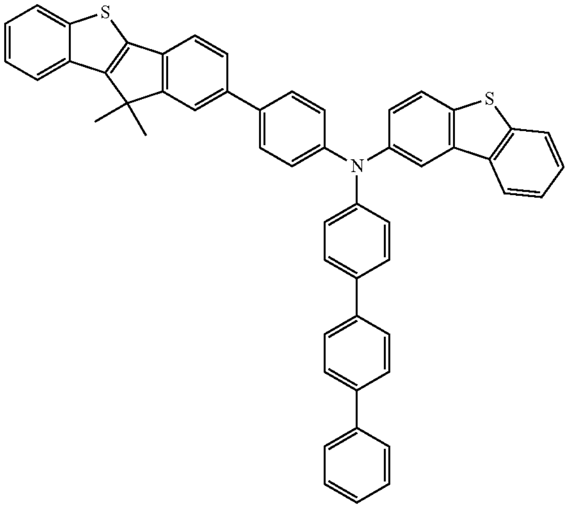
3-76
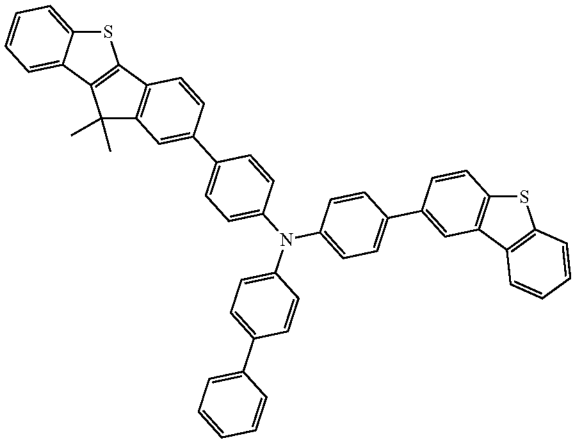

-continued
3-77
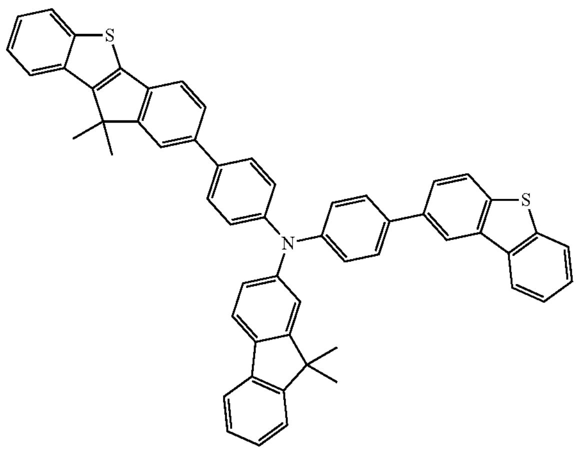
3-78
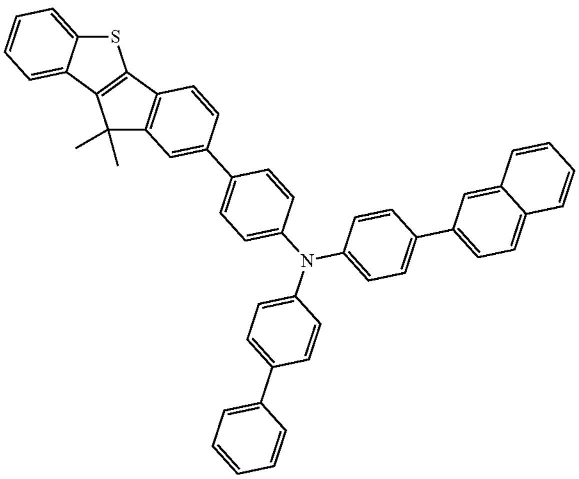
3-79
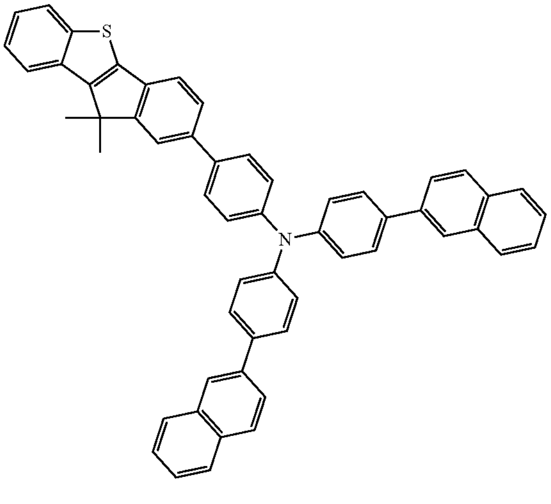
-continued
3-80
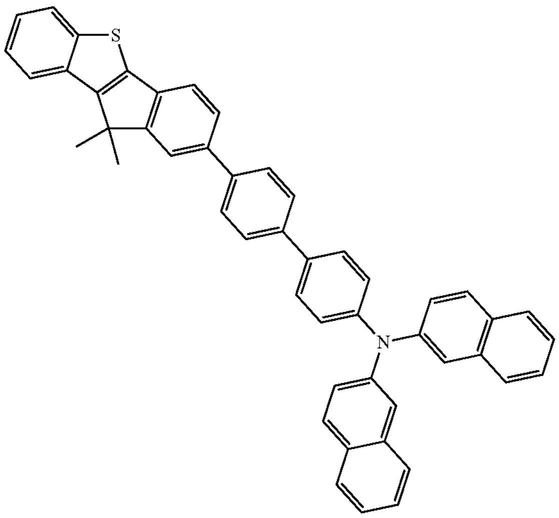
3-81
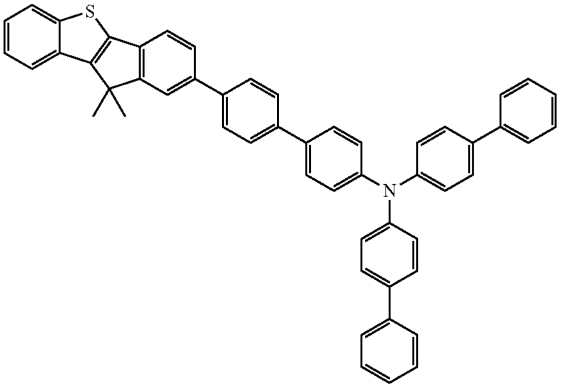
3-82
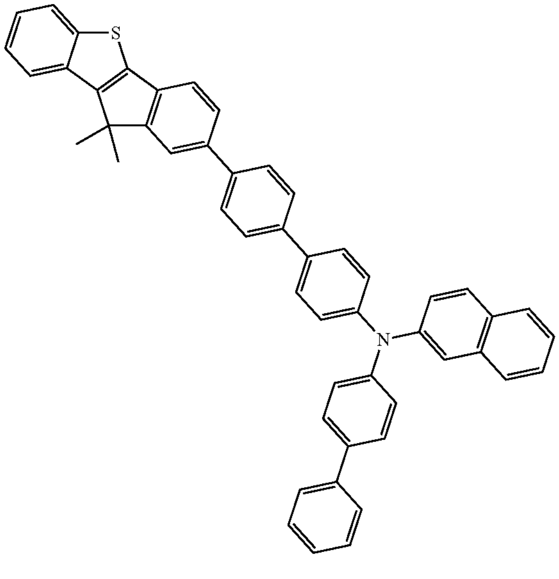

-continued
3-83
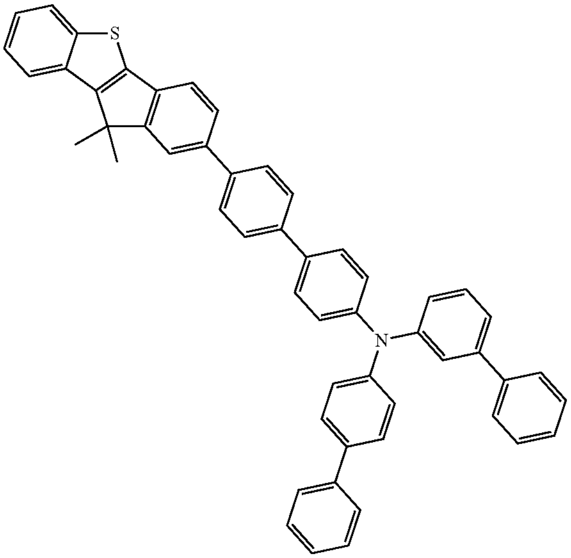
3-84
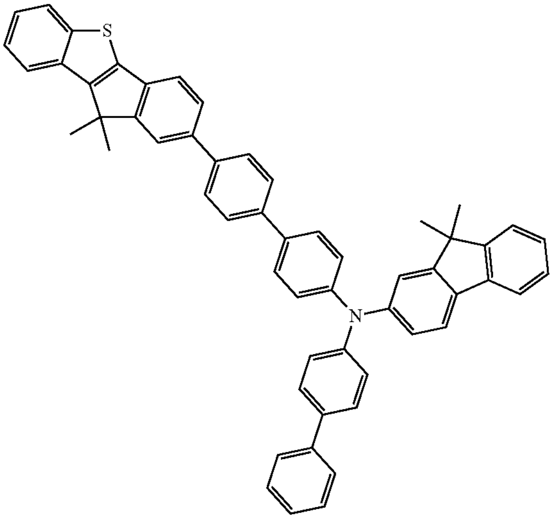
3-85
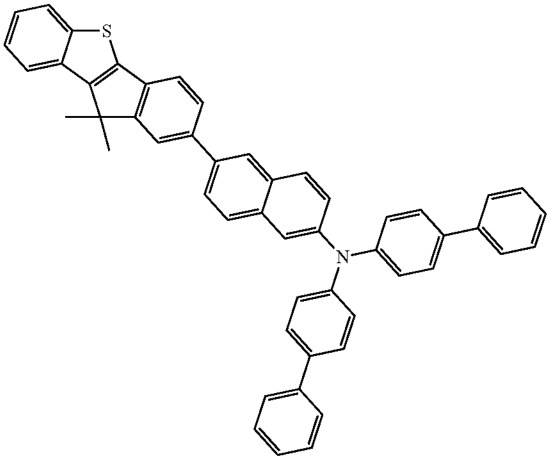
-continued
3-86
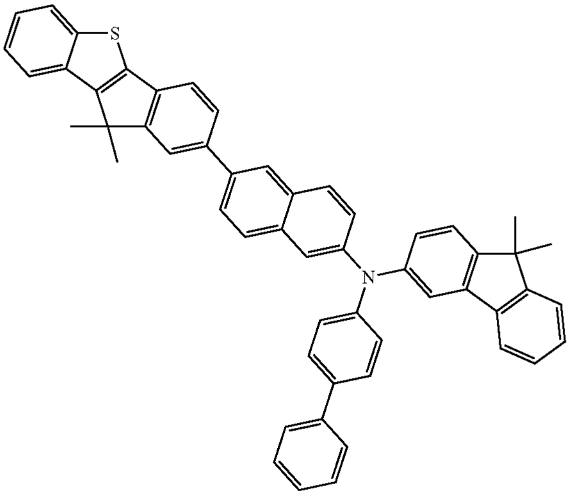
3-87
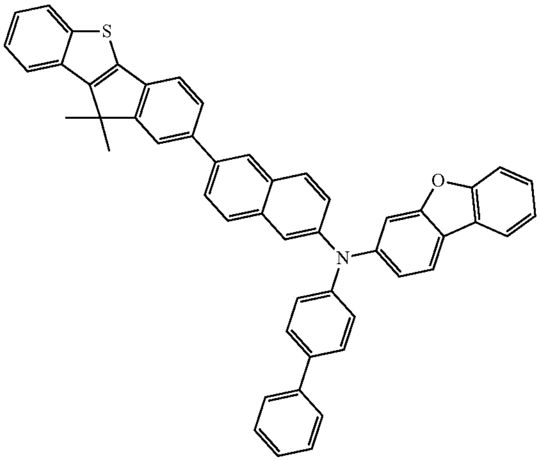
3-88
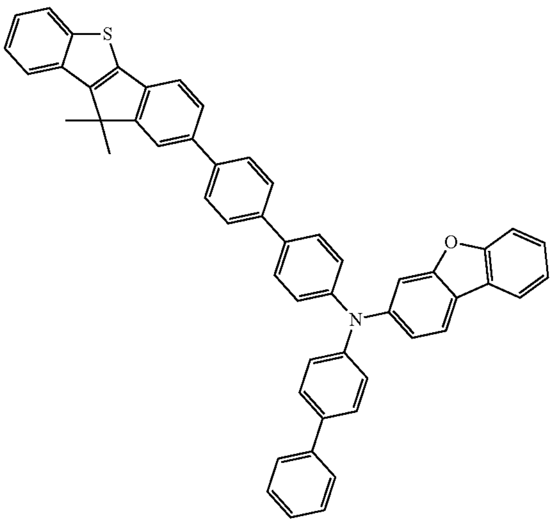

-continued
3-89
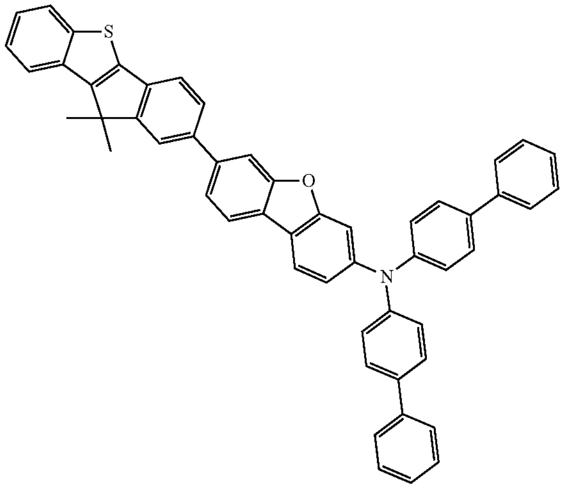
3-90
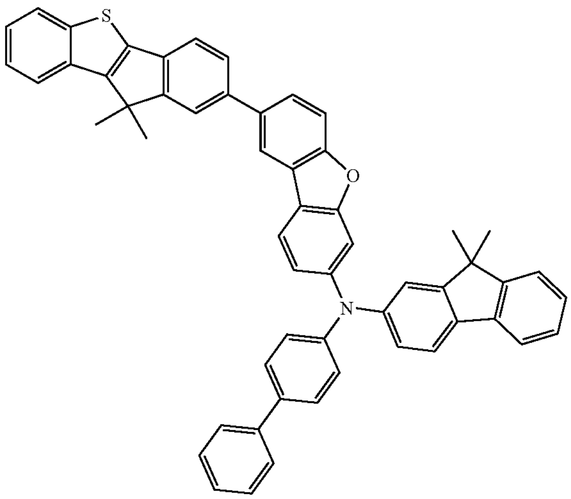
3-91
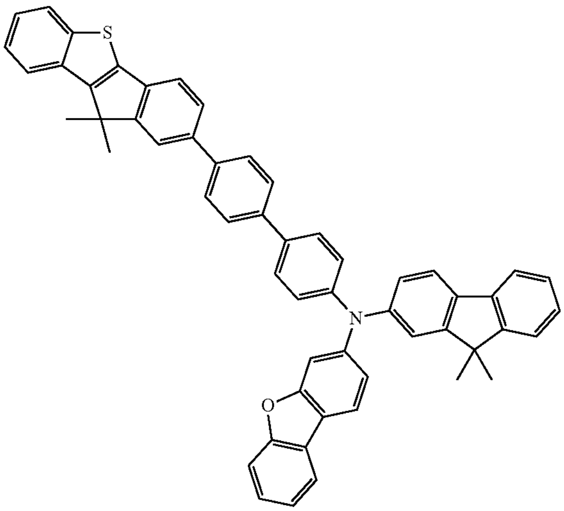
-continued
3-92
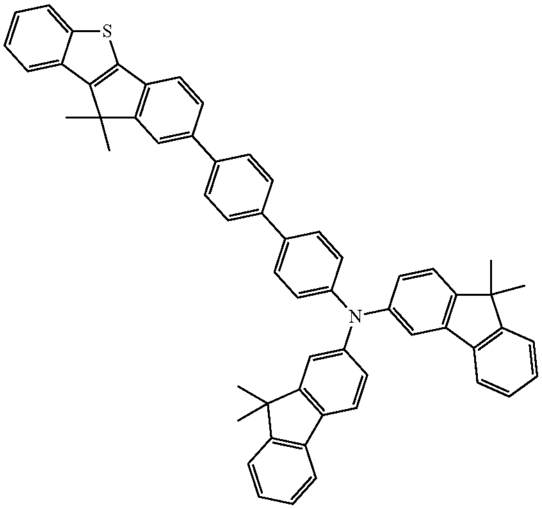
3-93
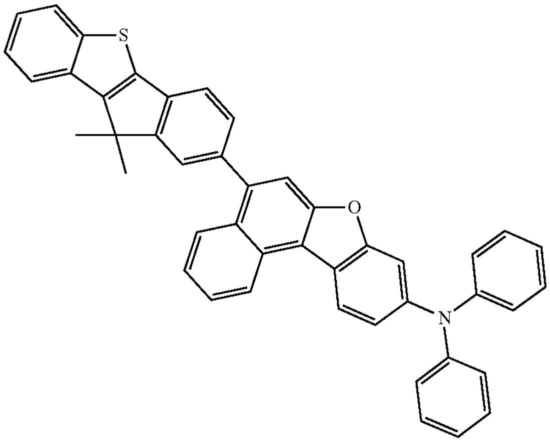
3-94
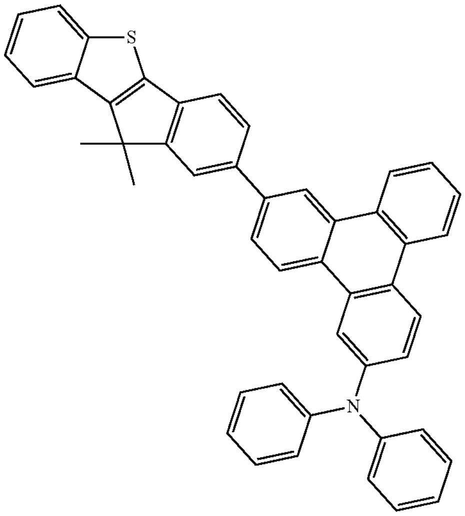

-continued
3-95
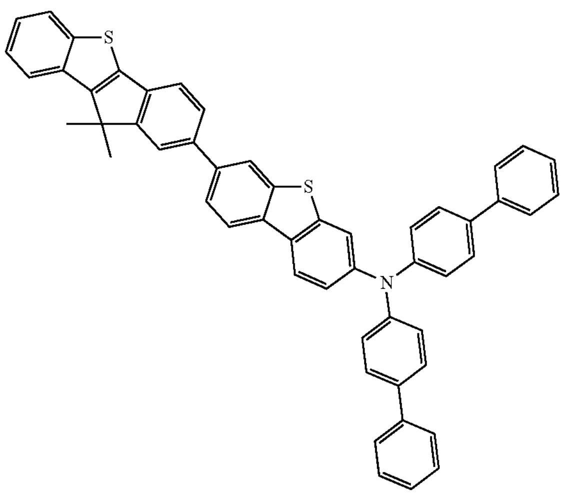
3-96
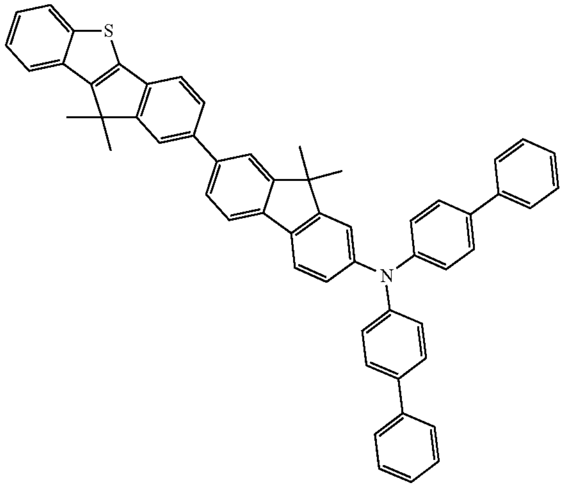
3-97
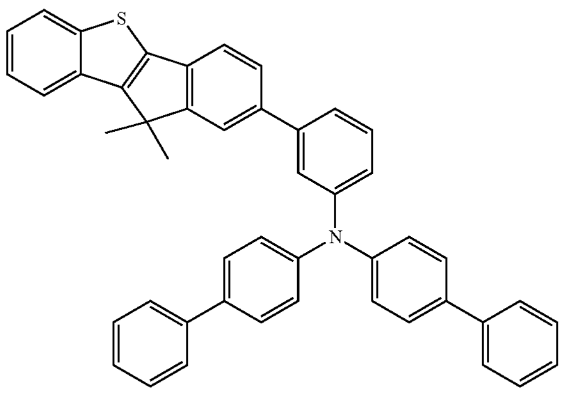
-continued
3-98
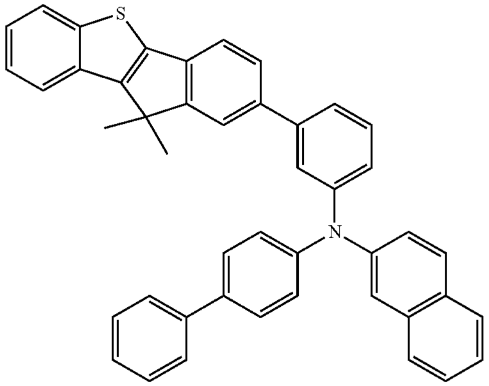
3-99
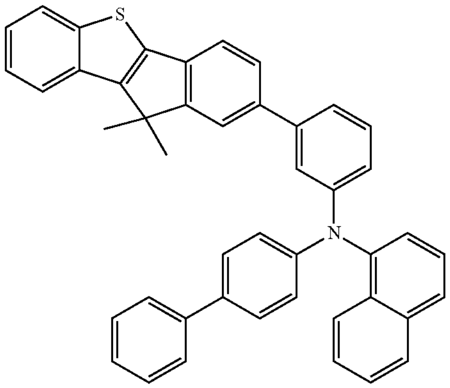
3-100
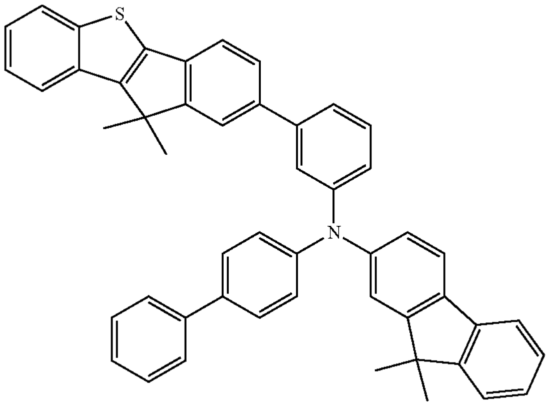
3-101
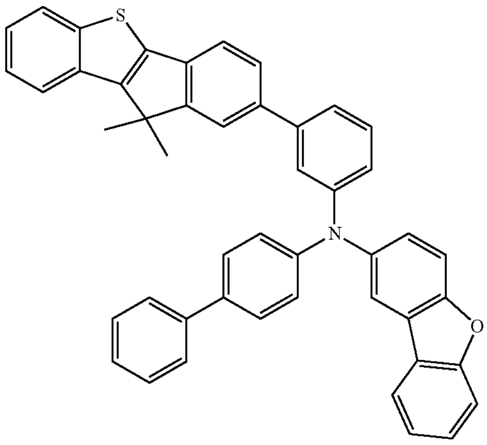

-continued
3-102
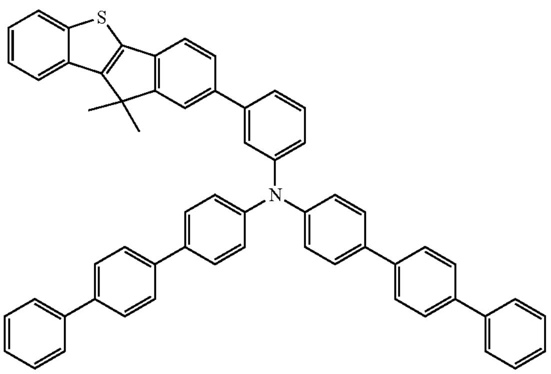
3-103
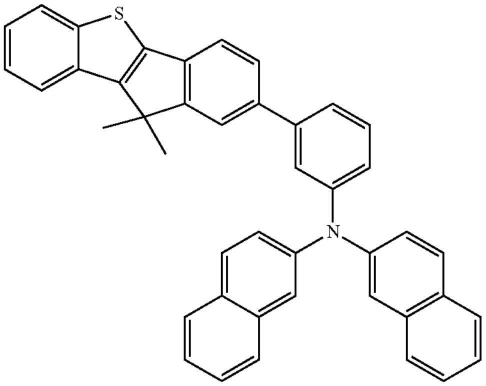
3-104
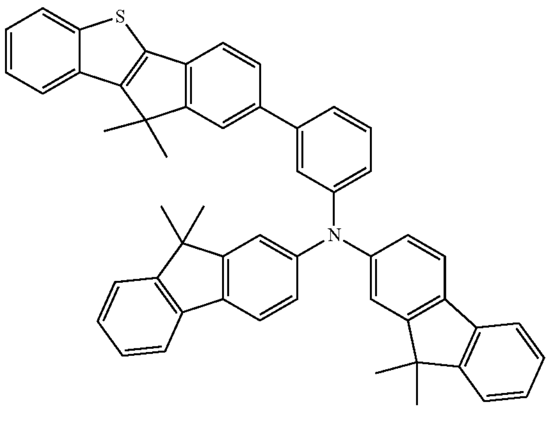
-continued
3-105
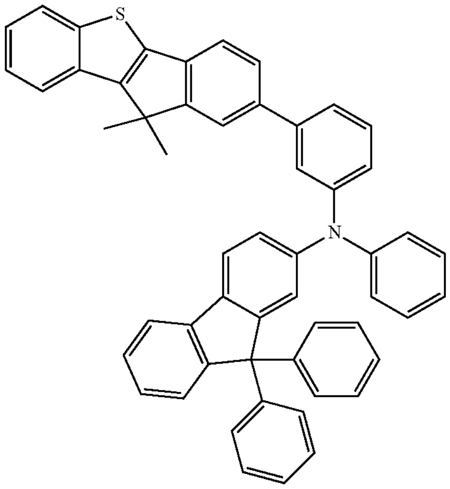
3-106
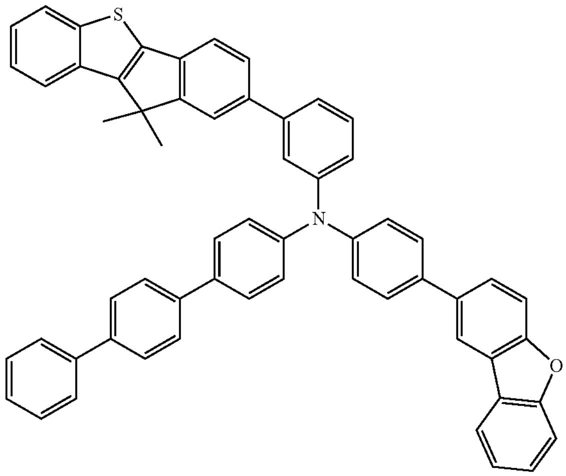
3-107
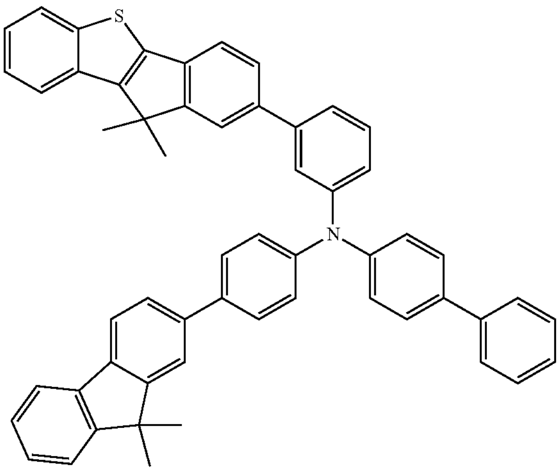

-continued
3-108
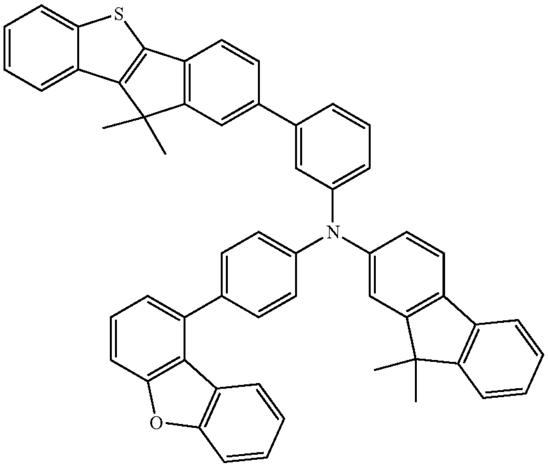
3-109
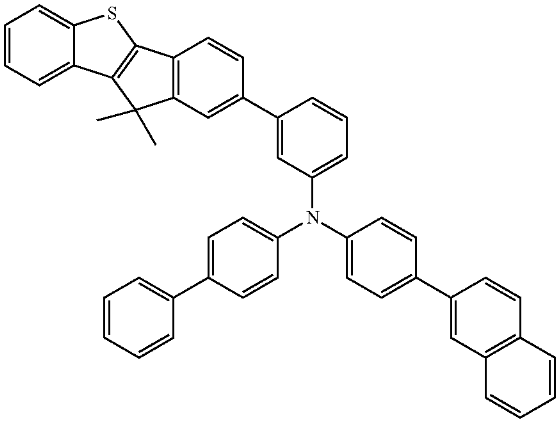
3-110
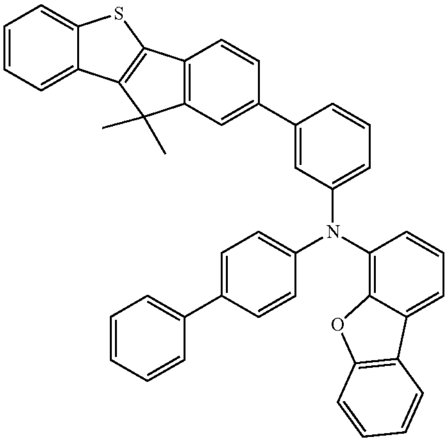
-continued
3-111
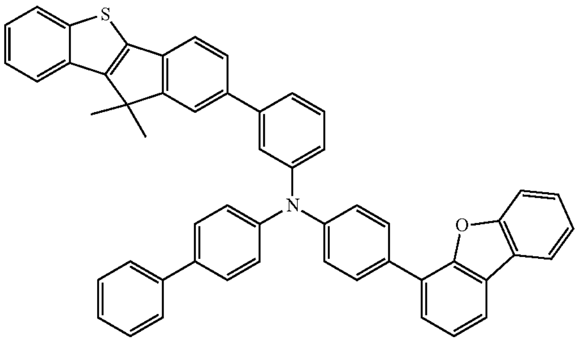
3-112
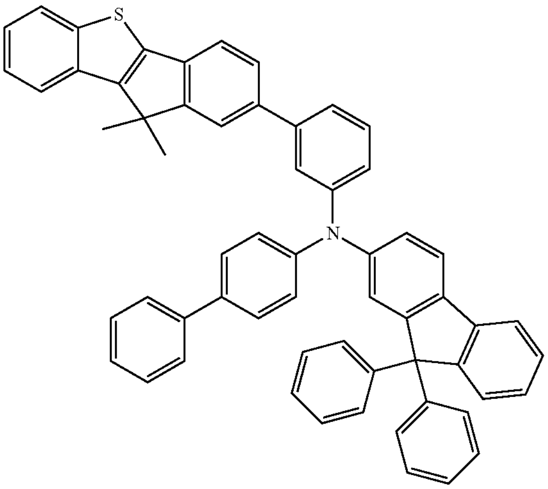
3-113
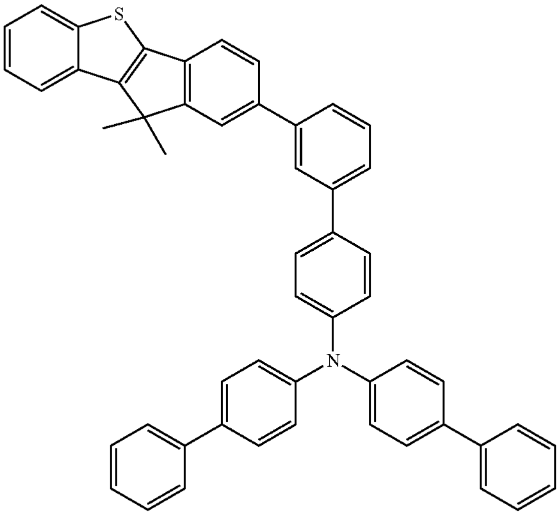

-continued
3-114
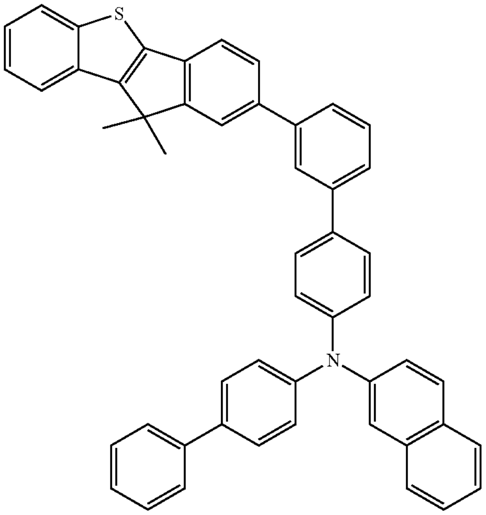
3-115
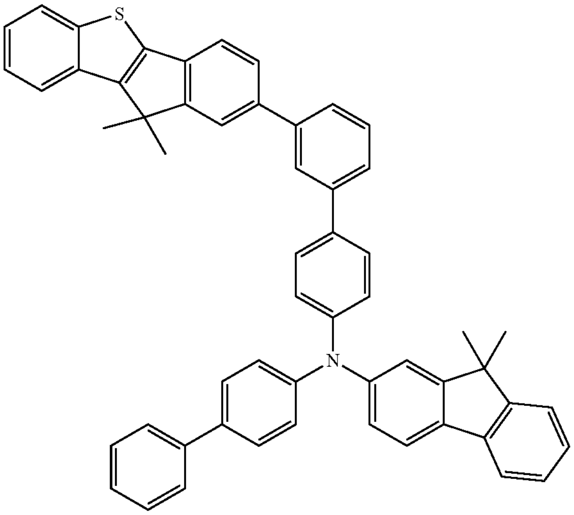
3-116
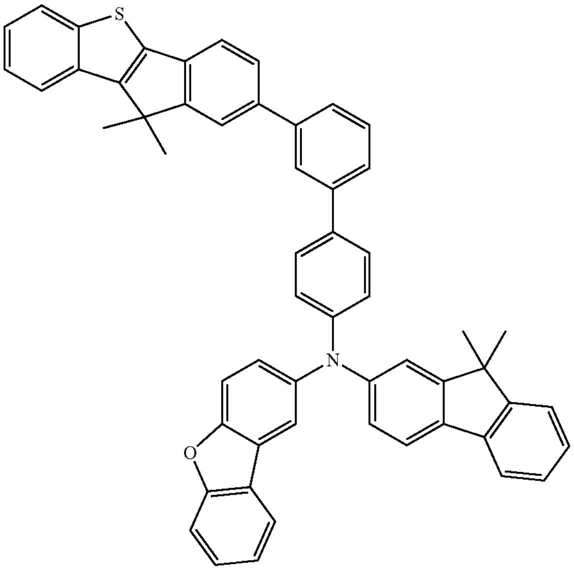
-continued
3-117
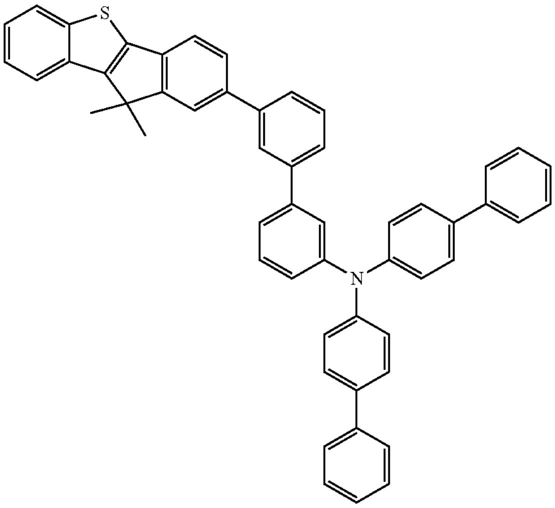
3-118
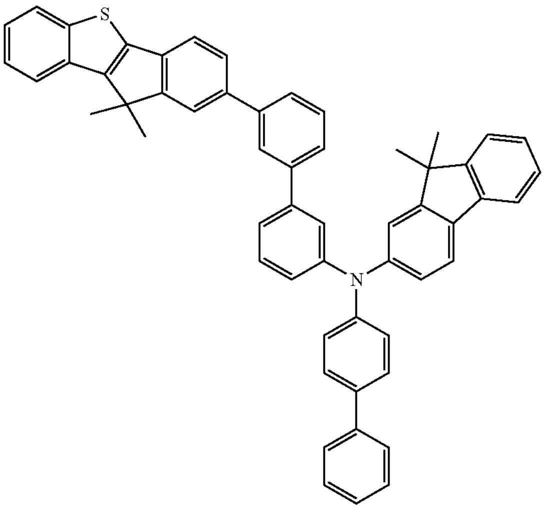
3-119
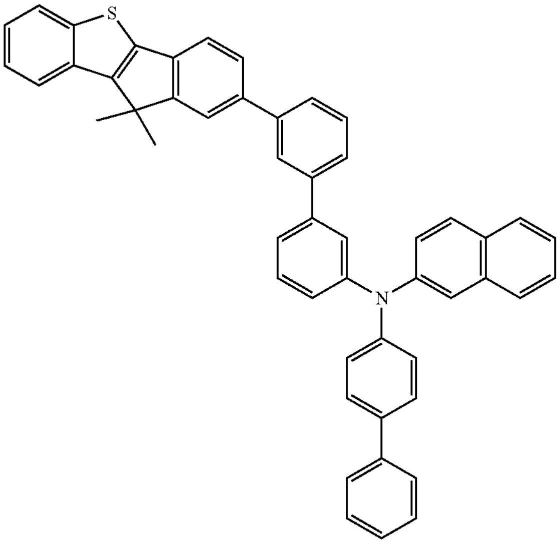

-continued
3-120
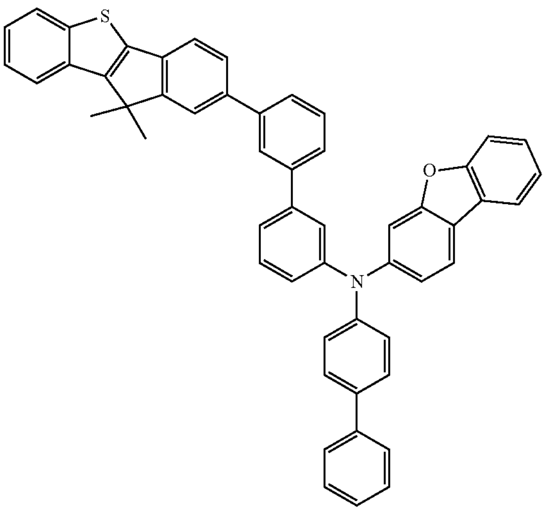
3-121
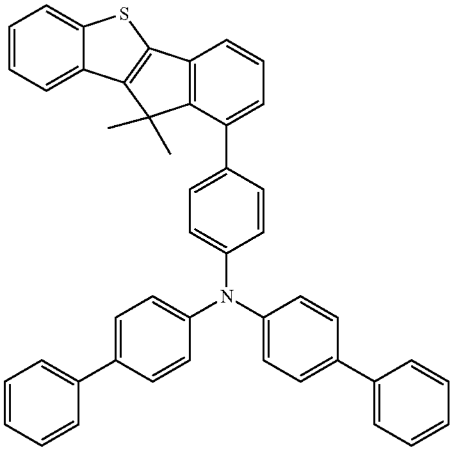
3-122
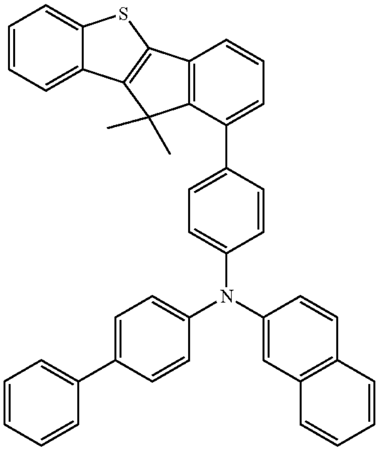
-continued
3-123
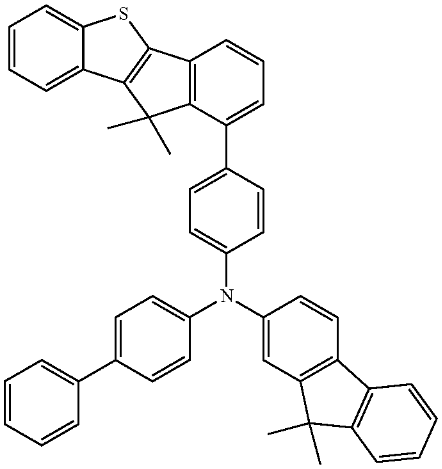
3-124
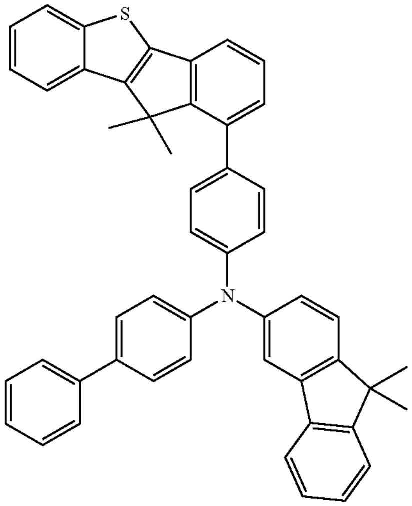
3-125
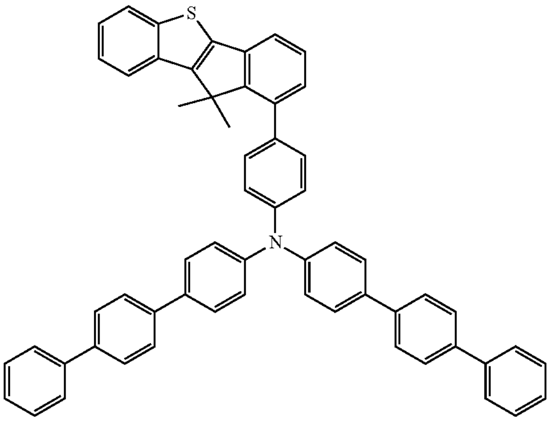

-continued
3-126
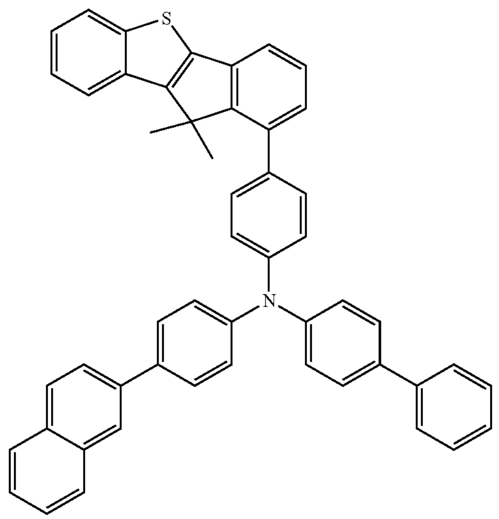
3-127
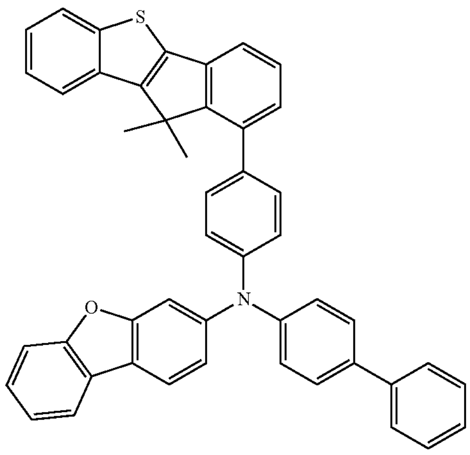
3-128
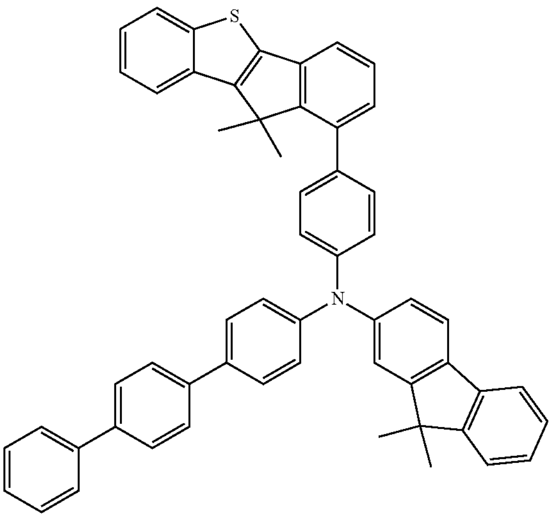
-continued
3-129
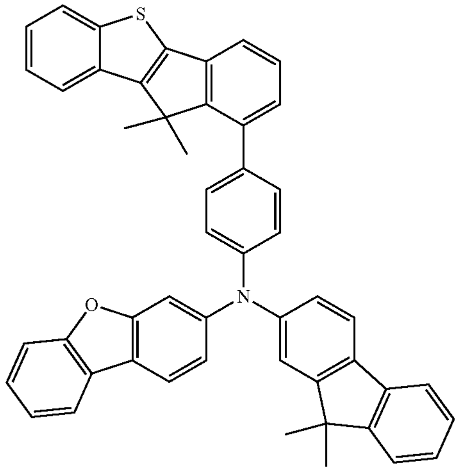
3-130
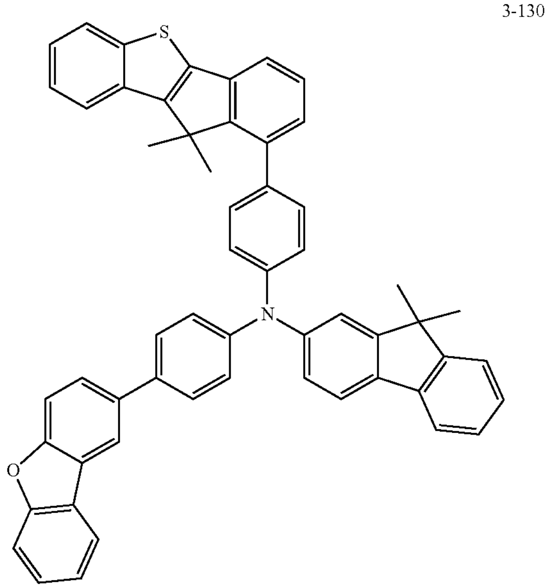
3-131
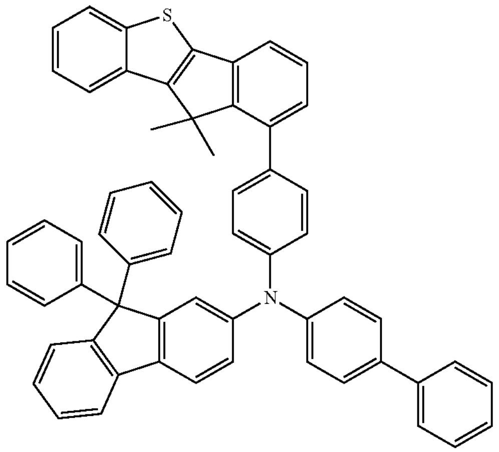

-continued
3-132
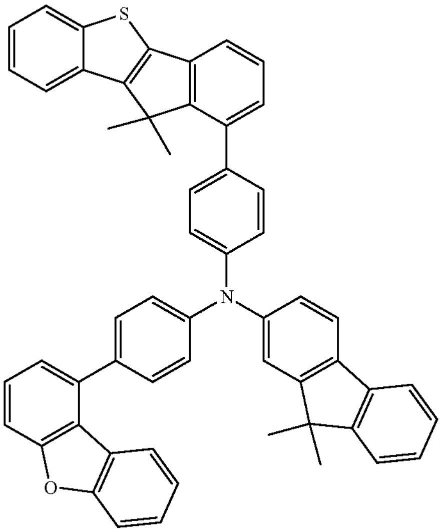
3-133
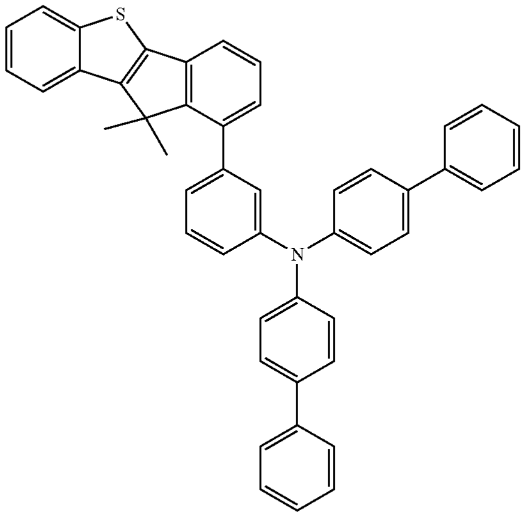
3-134
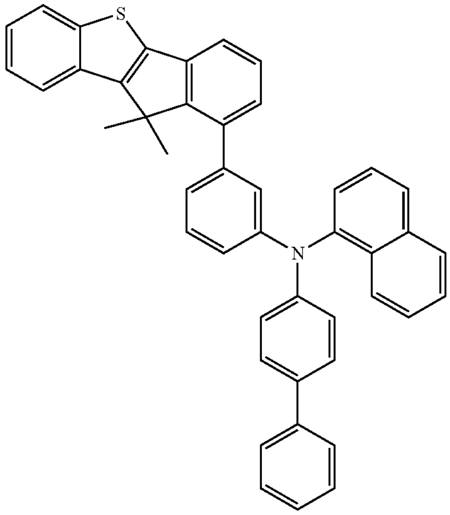
-continued
3-135
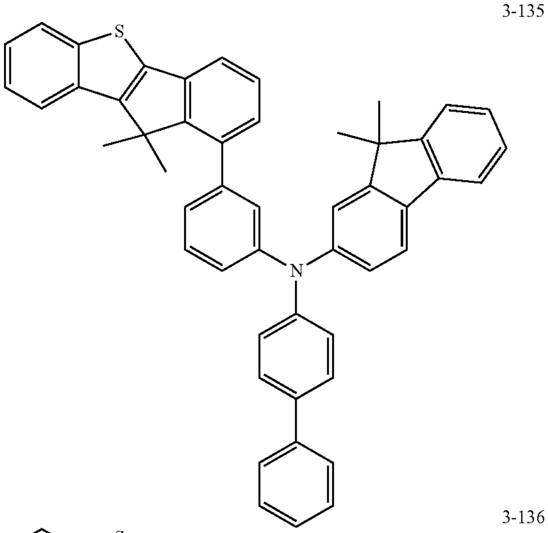
3-136
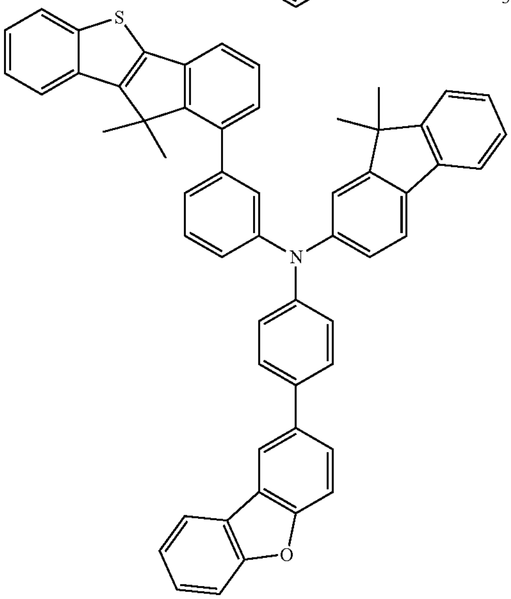
3-137
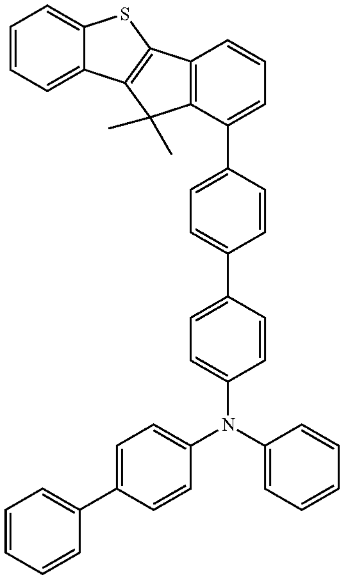

-continued
3-138
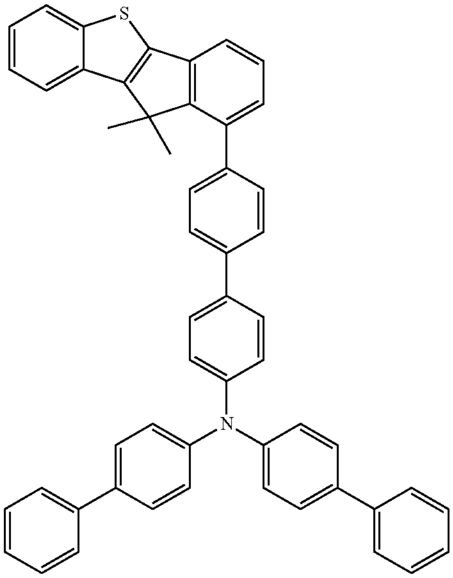
3-139
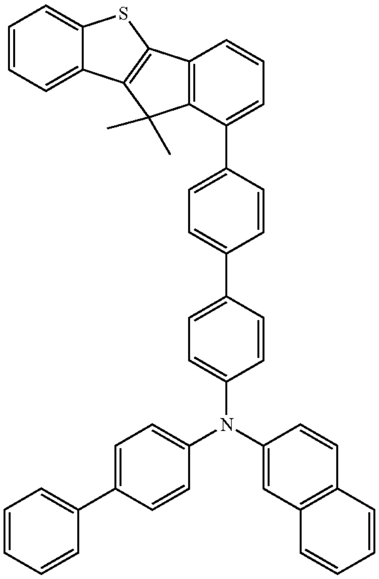
-continued
3-140
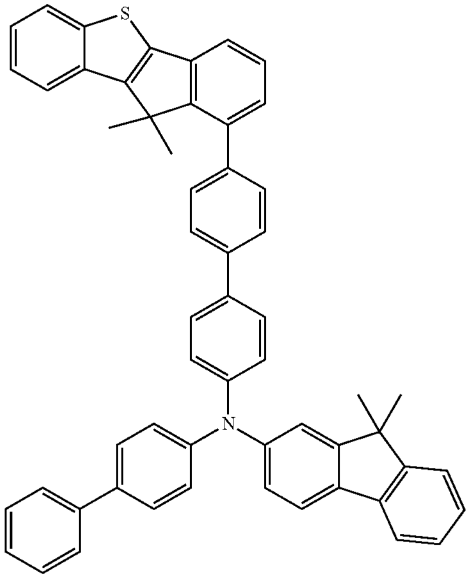
3-141
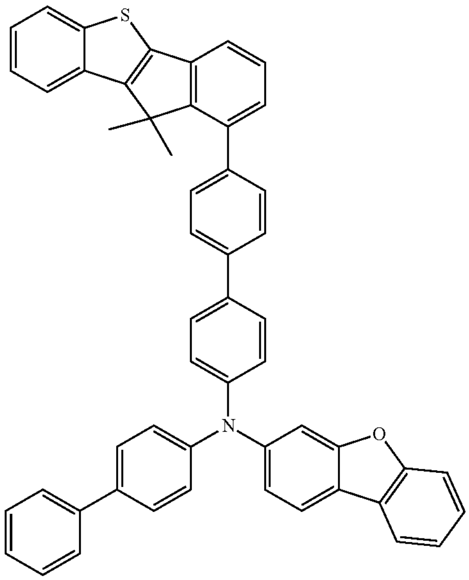

3-142
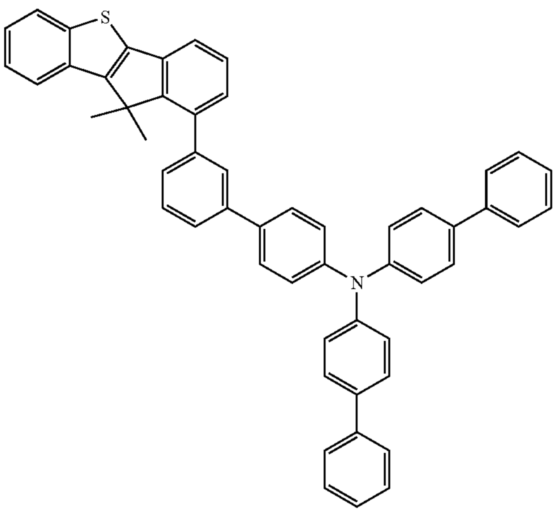
3-143
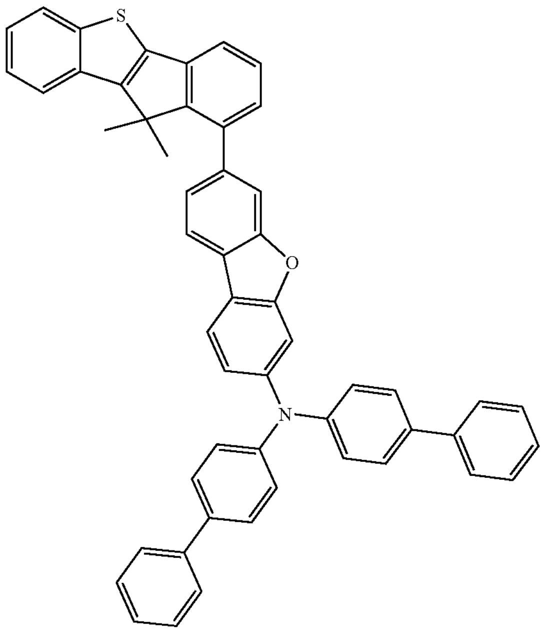
3-144
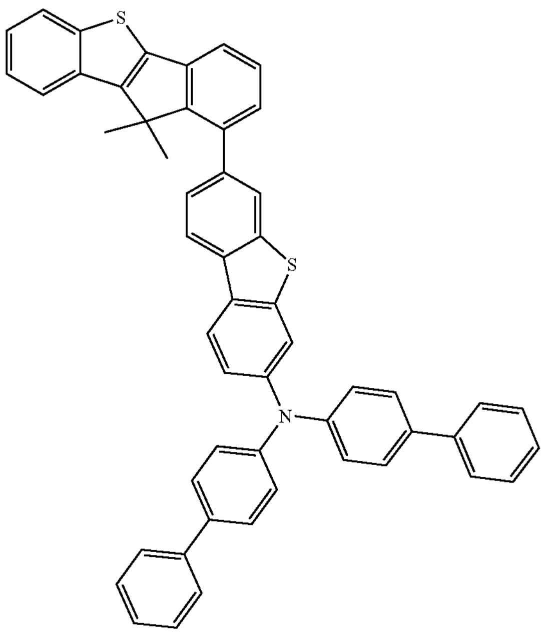
3-145
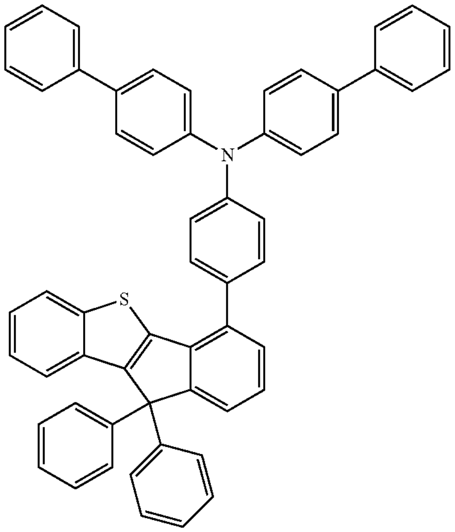

-continued
3-146
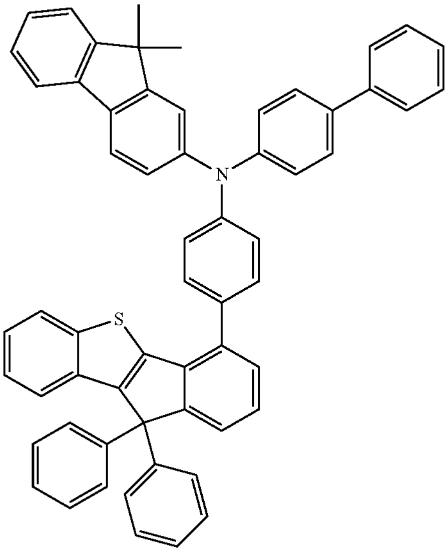
3-147
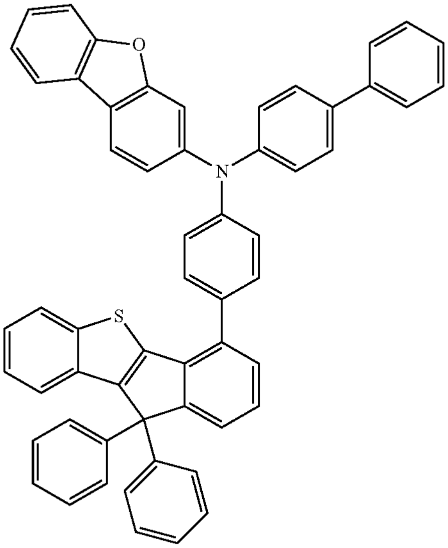
3-148
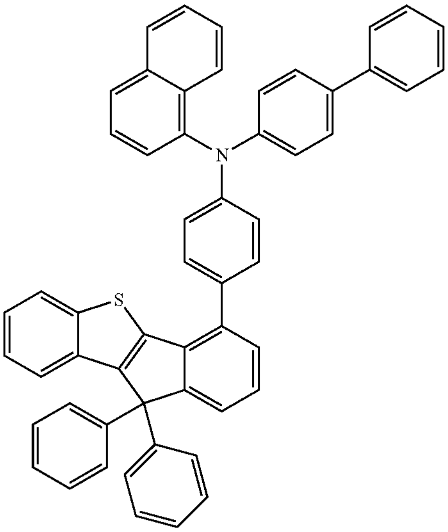
-continued
3-149
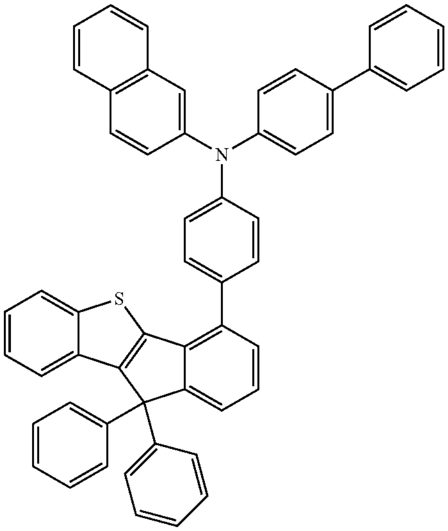
3-150
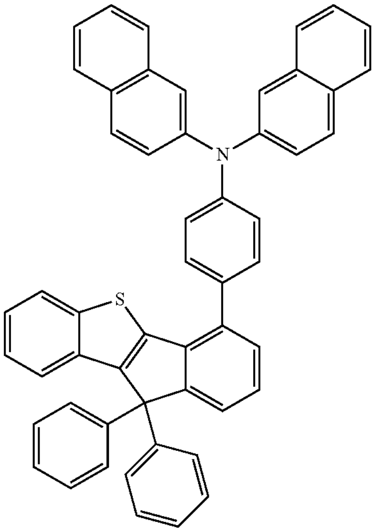
3-151
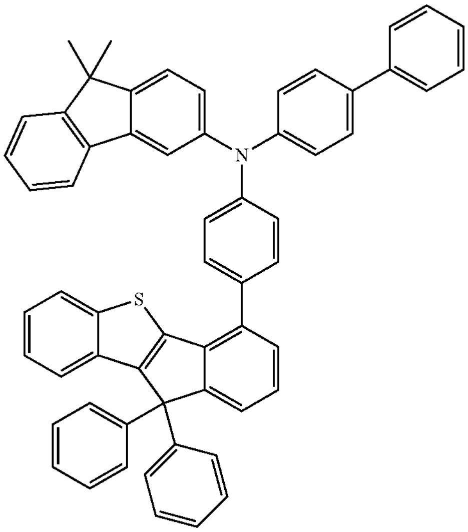

-continued
3-152
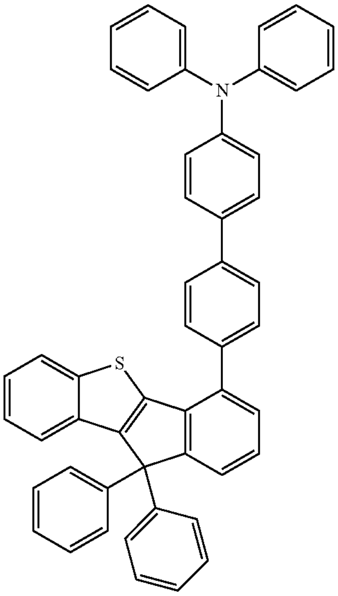
3-153
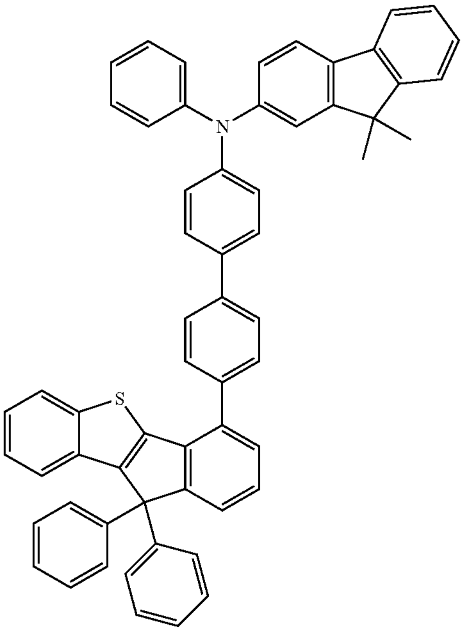
-continued
3-154
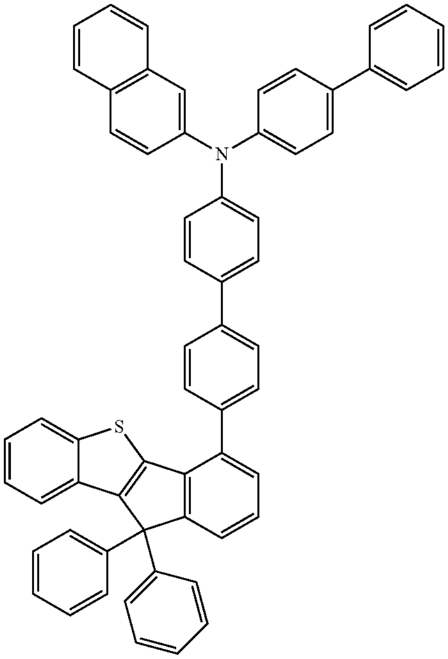
3-155
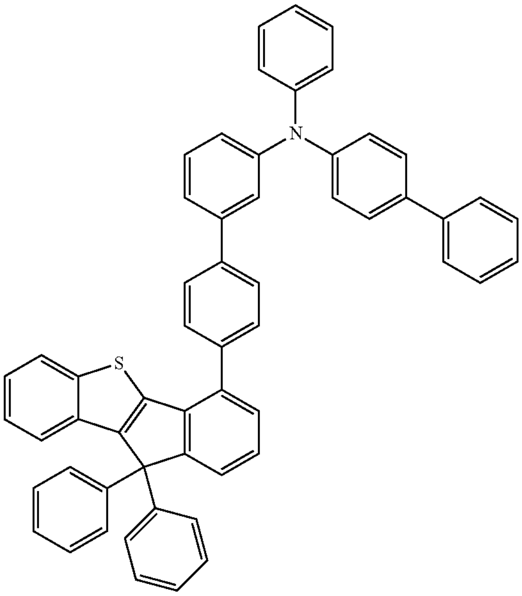

-continued
3-156
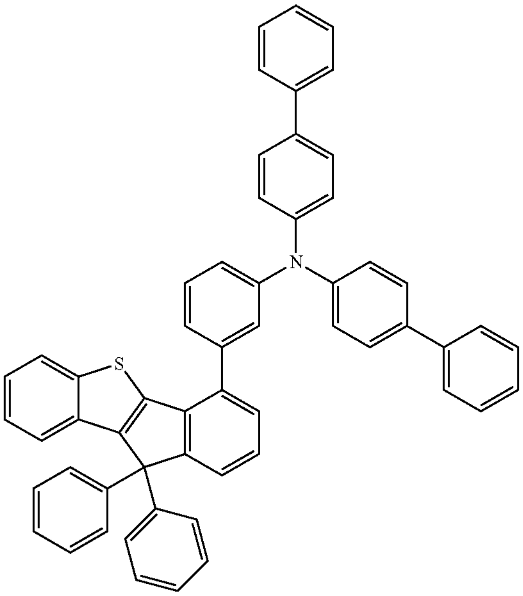
3-157
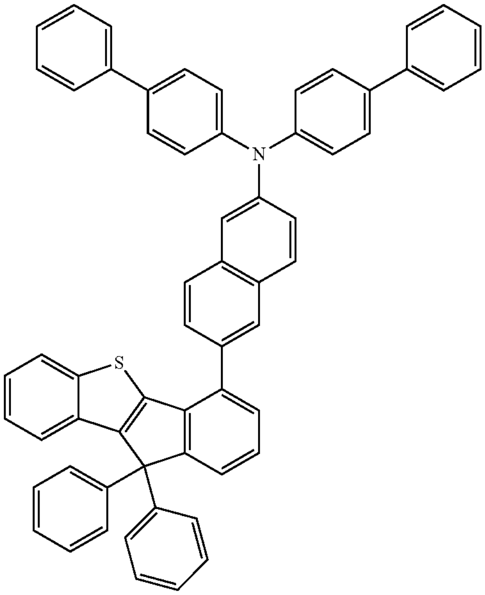
-continued
3-158
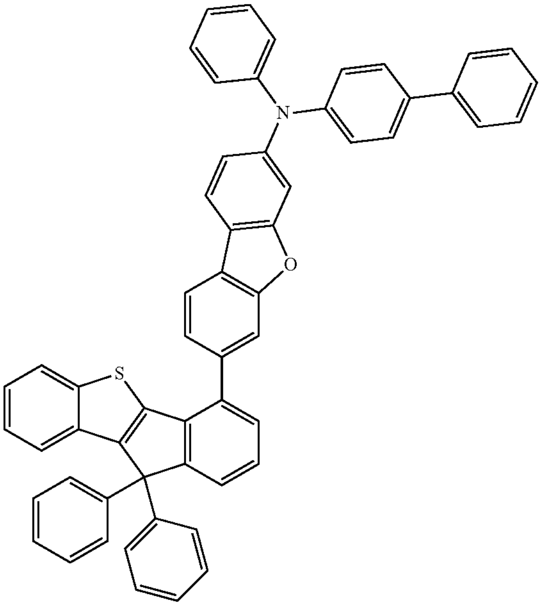
3-159
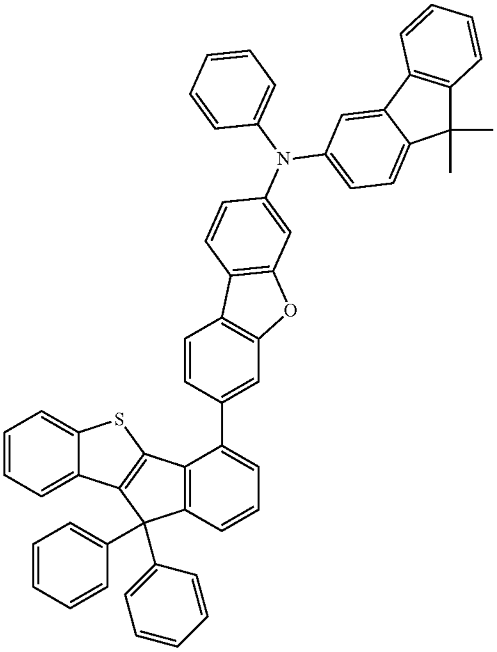

-continued
3-160
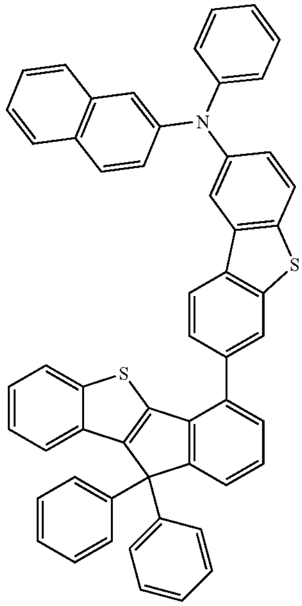
3-161
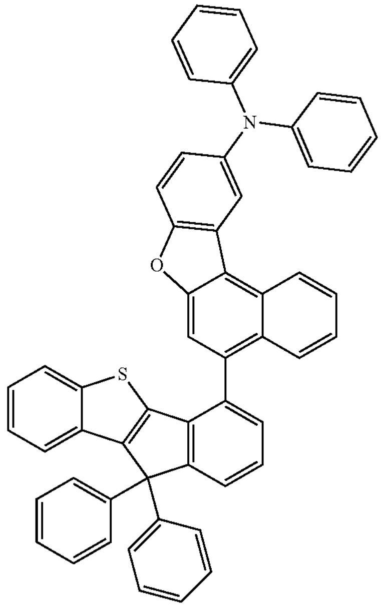
3-162
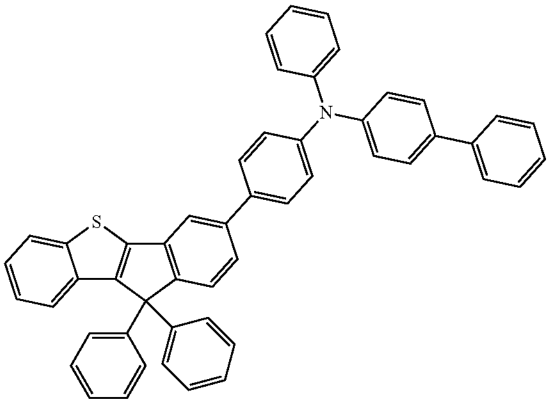
-continued
3-163
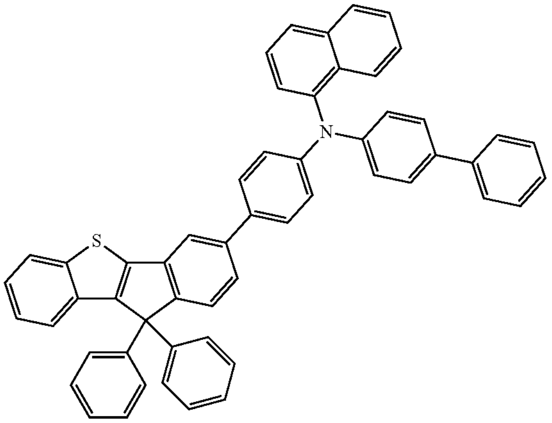
3-164
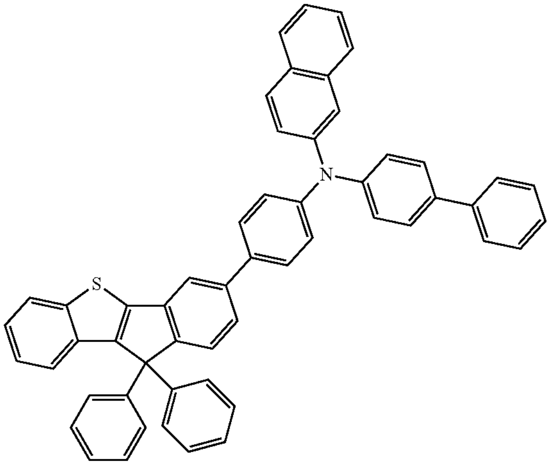
3-165
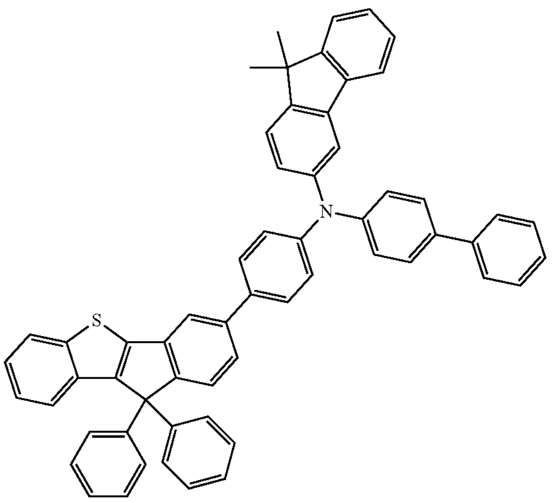

-continued
3-166
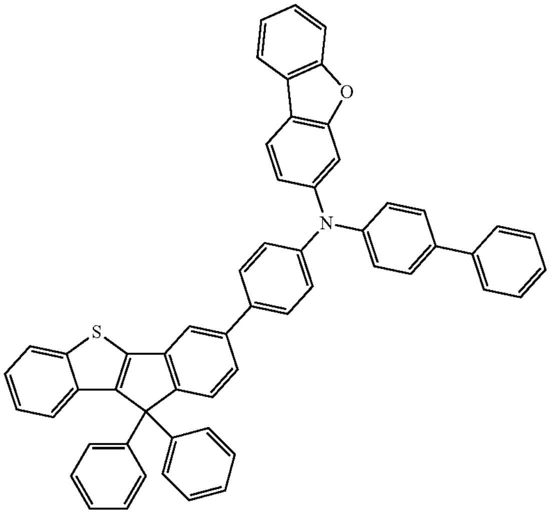
3-167
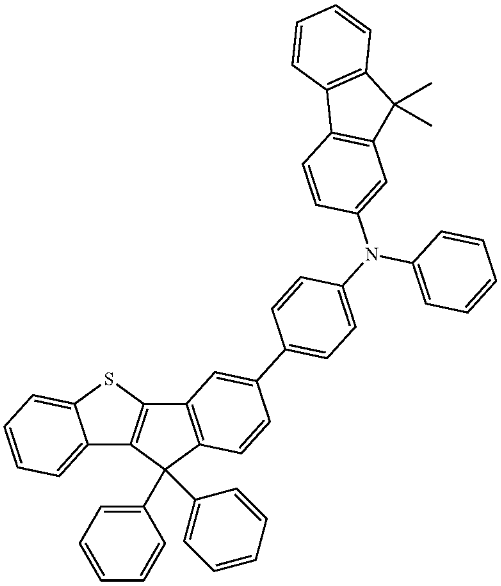
-continued
3-168
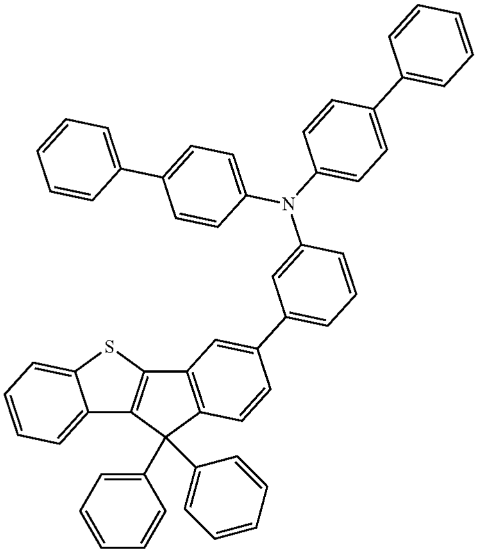
3-169
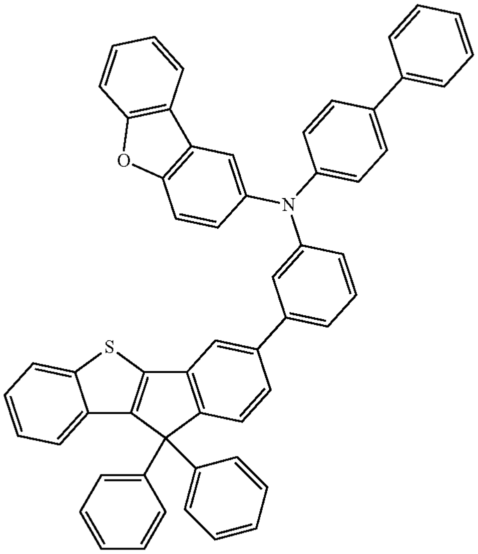
3-170
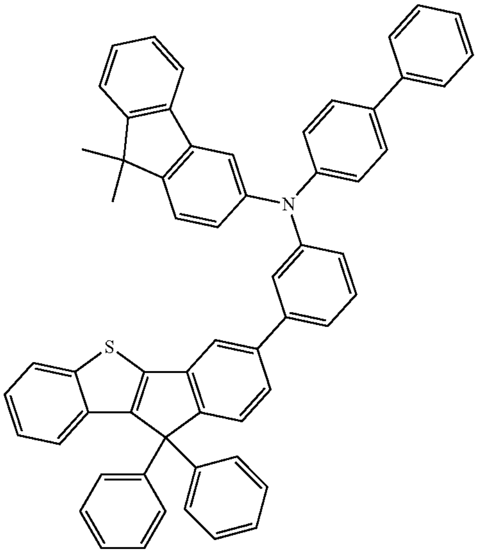

-continued
3-171
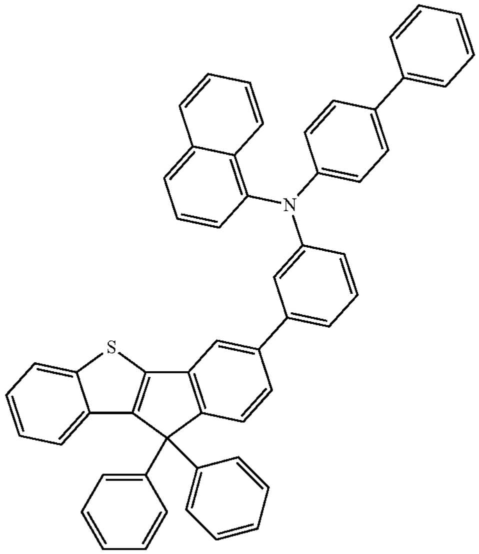
3-172
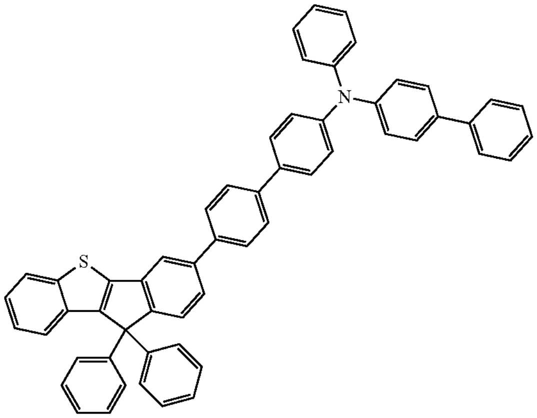
3-173
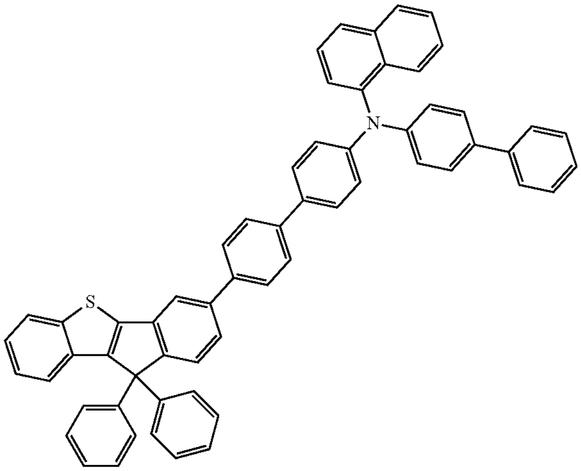
-continued
3-174
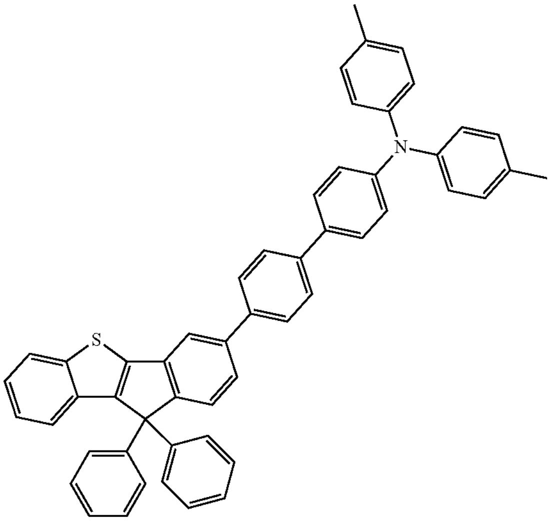
3-175
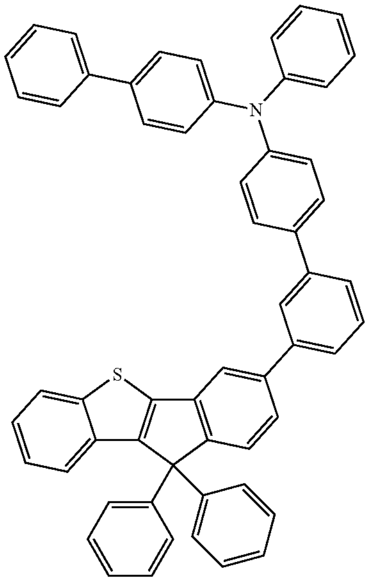

-continued
3-176
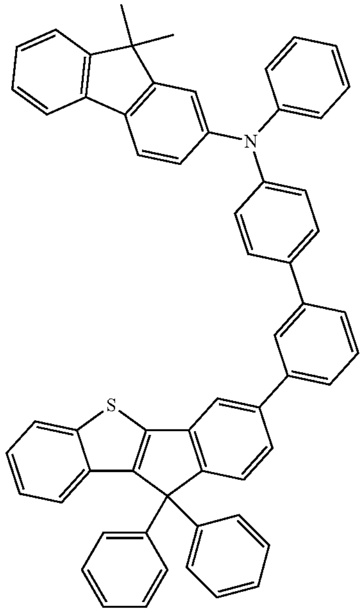
3-177
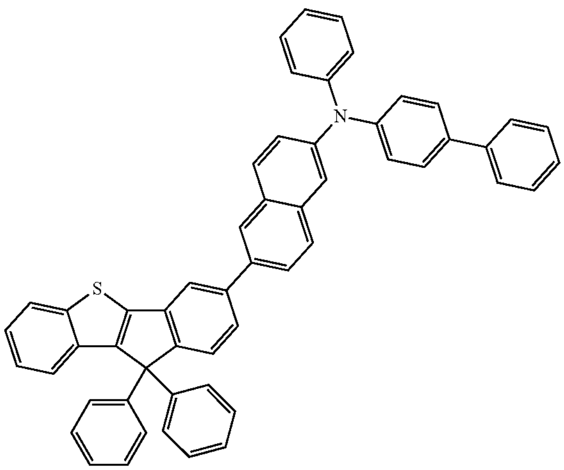
-continued
3-178
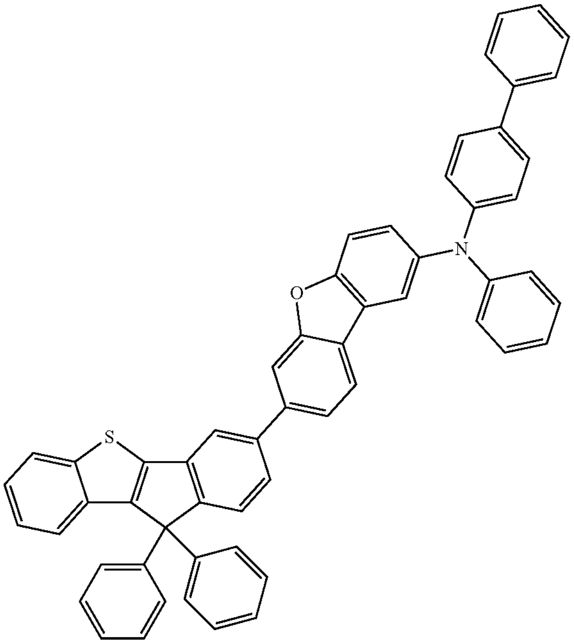
3-179
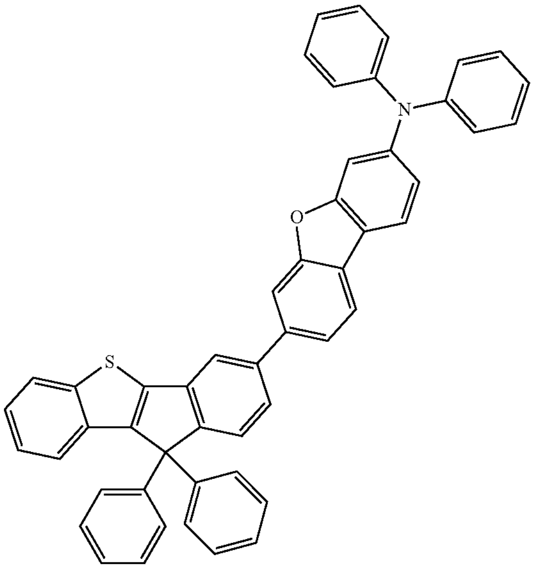

-continued
3-180
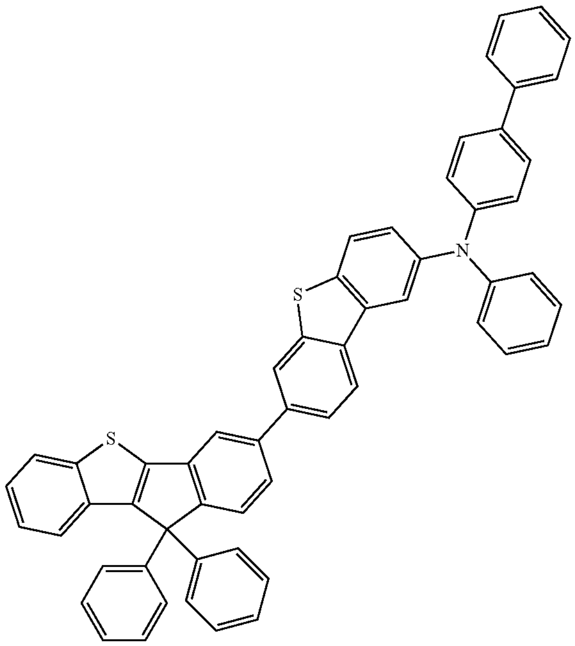
3-181
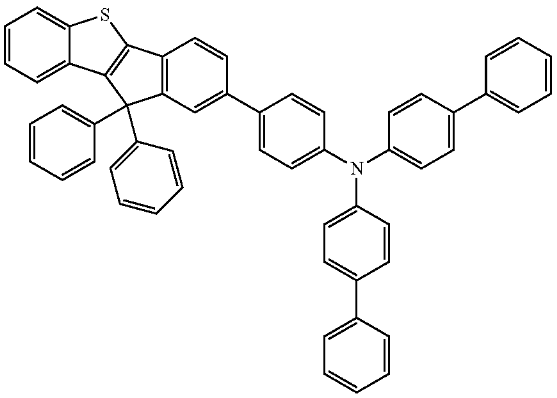
3-182
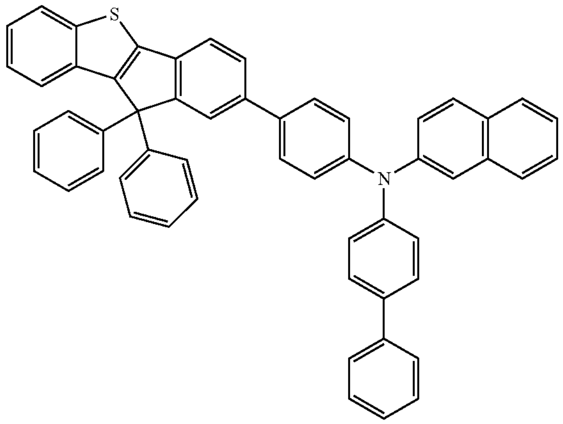
-continued
3-183
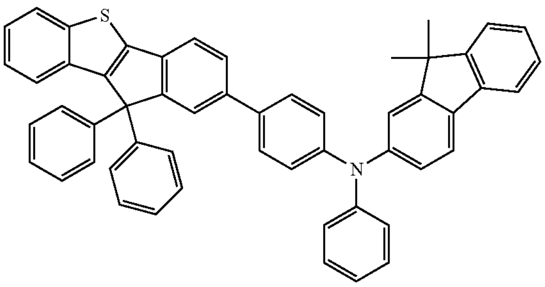
3-184
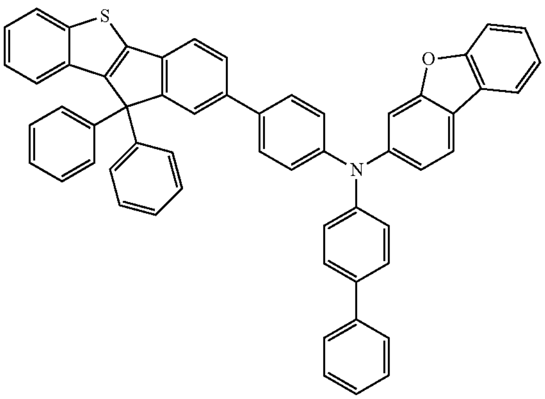
3-185
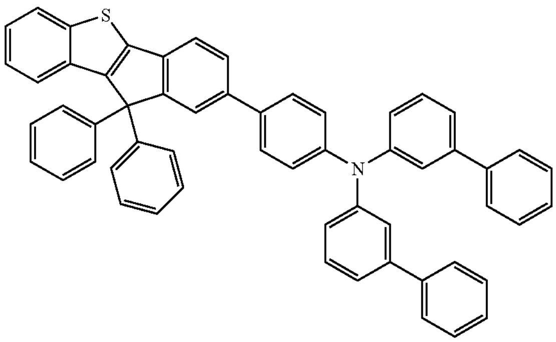

-continued
3-186
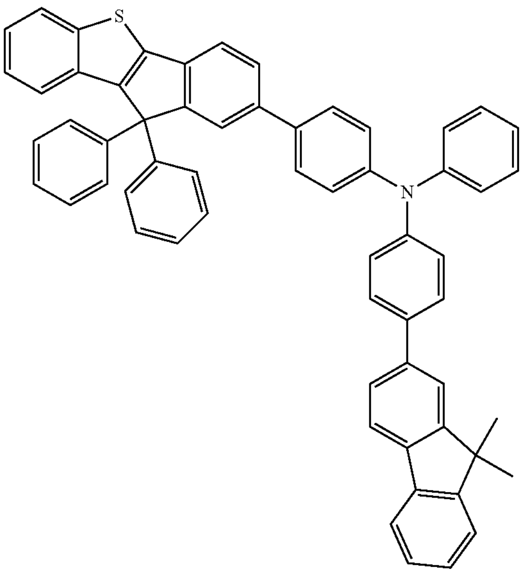
3-187
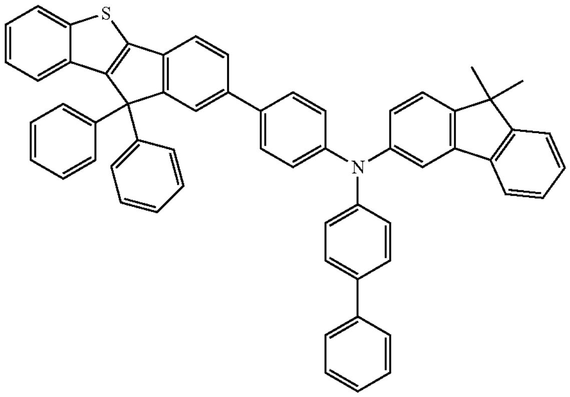
3-188
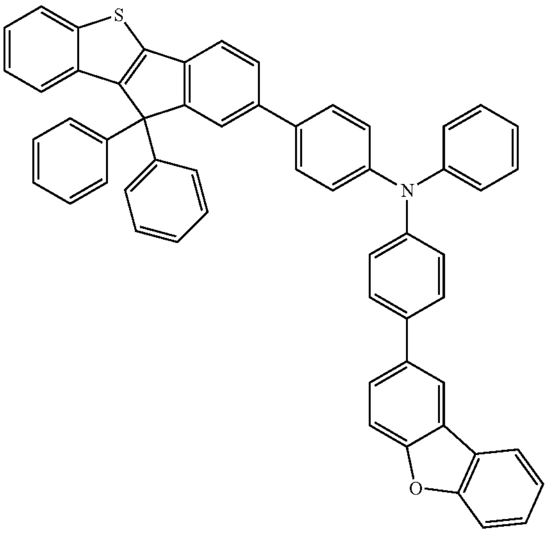
-continued
3-189
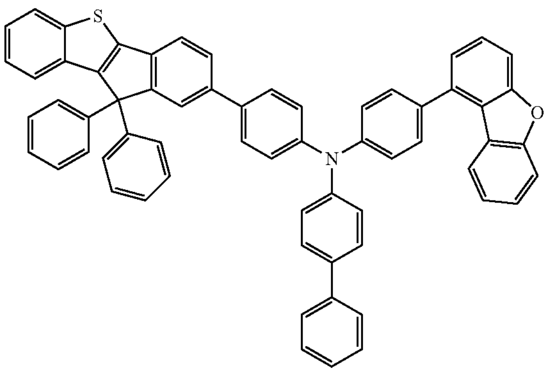
3-190
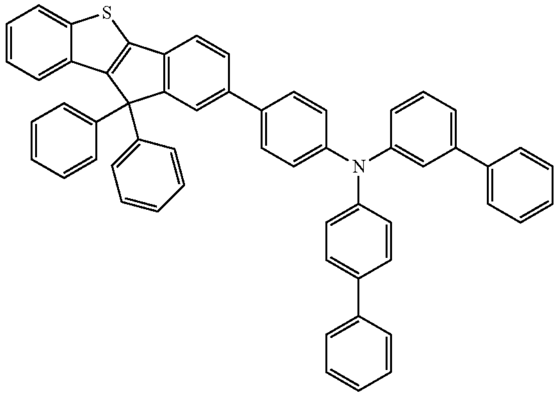
3-191
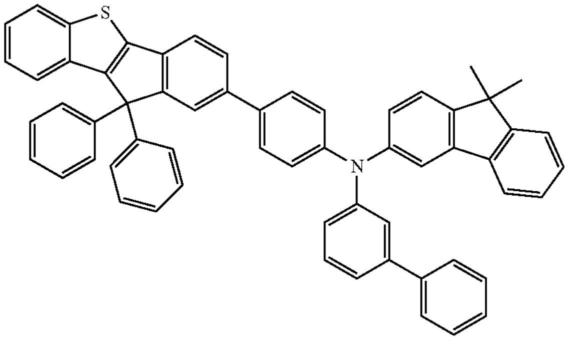
3-192
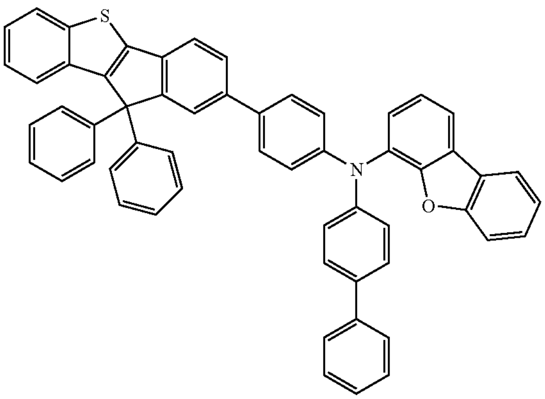

-continued
3-193
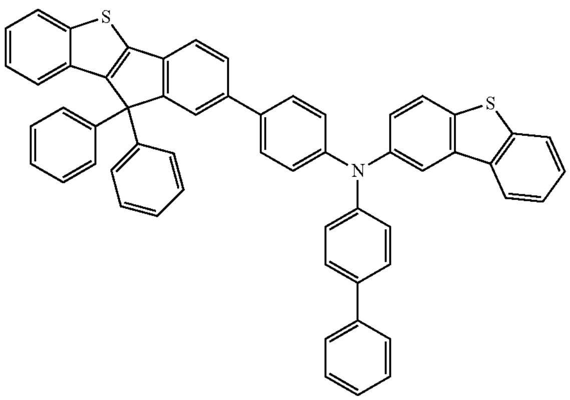
3-194
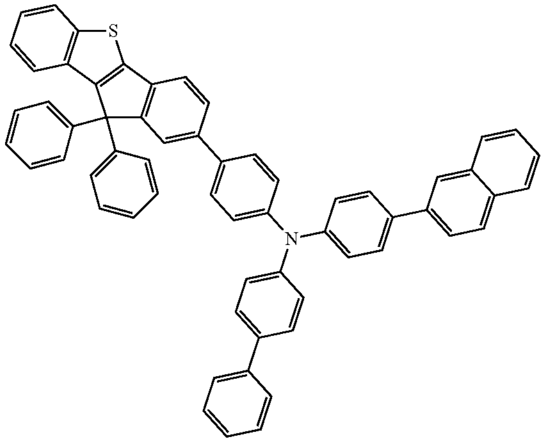
3-195
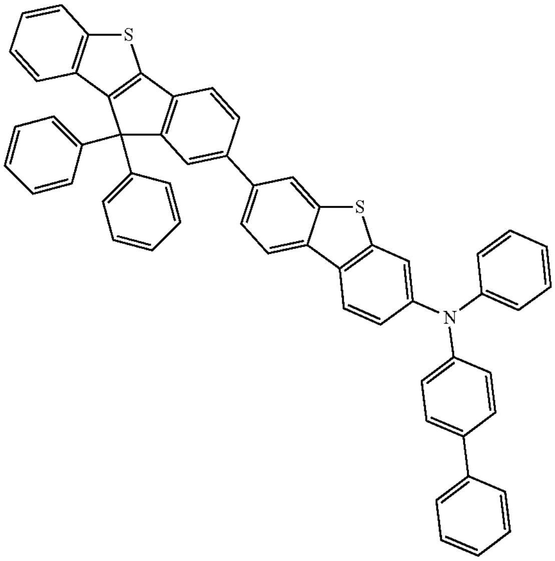
-continued
3-196
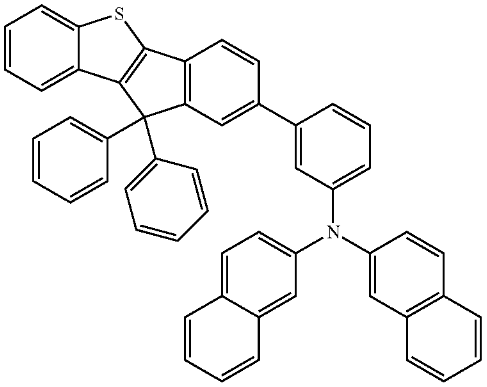
3-197
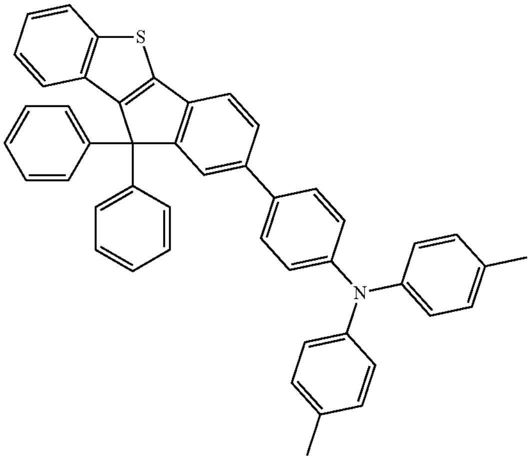
3-198
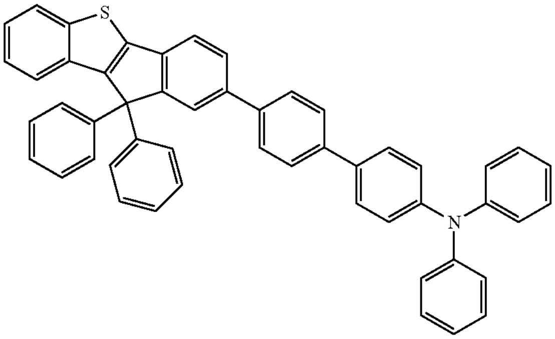

-continued
3-199
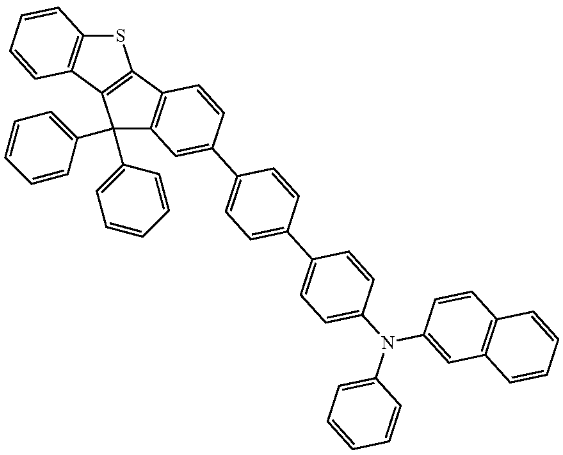
3-200
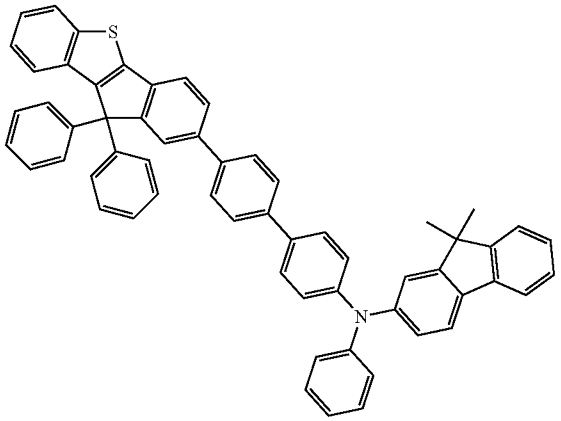
3-201
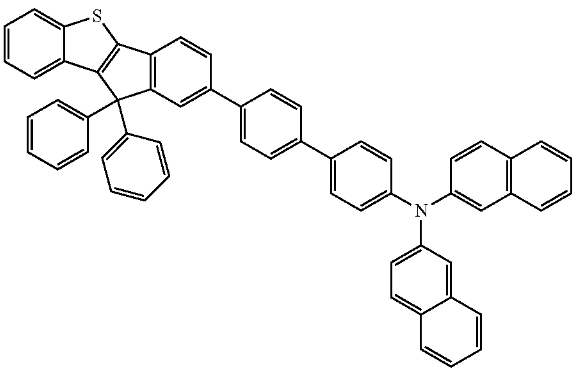
-continued
3-202
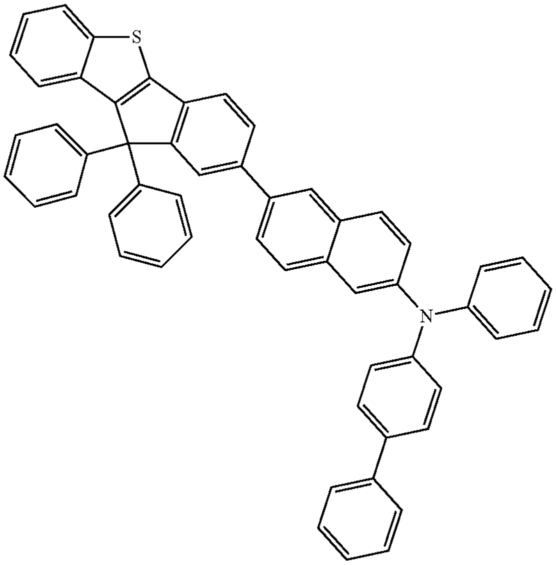
3-203
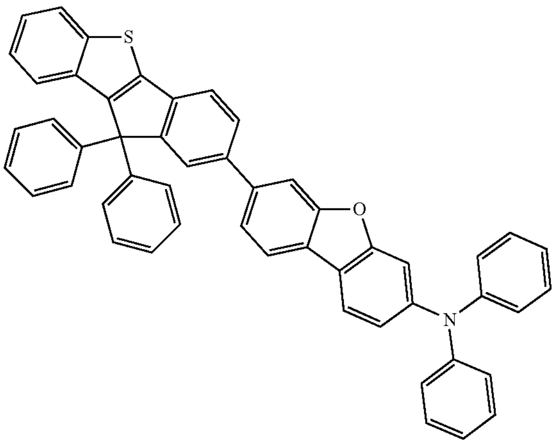
3-204
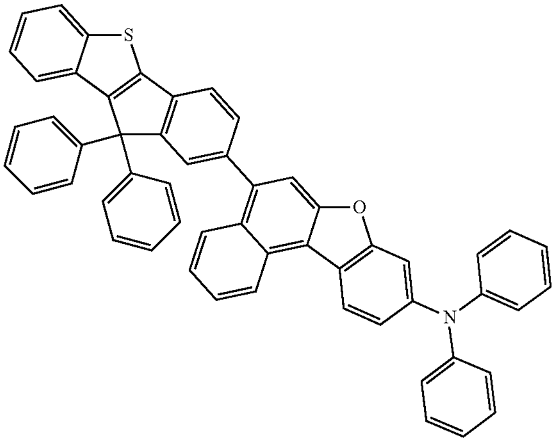

-continued
3-205
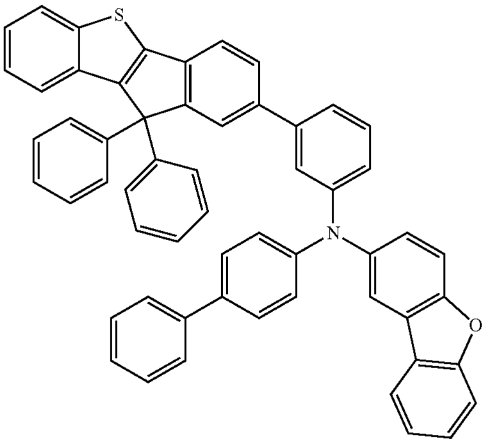
3-206
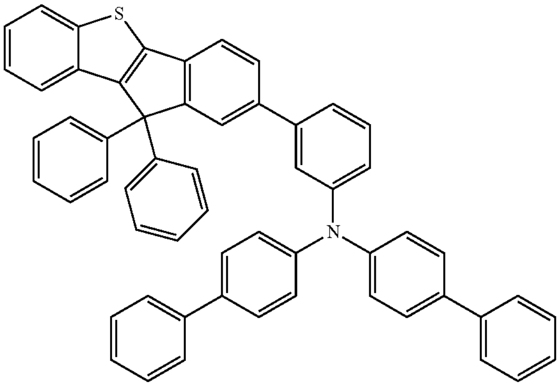
3-207
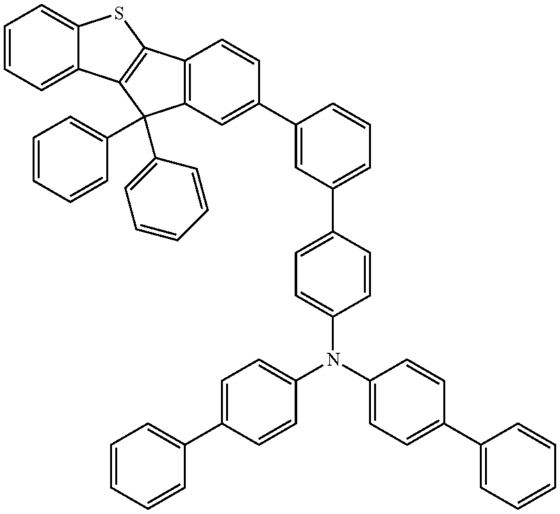
-continued
3-208
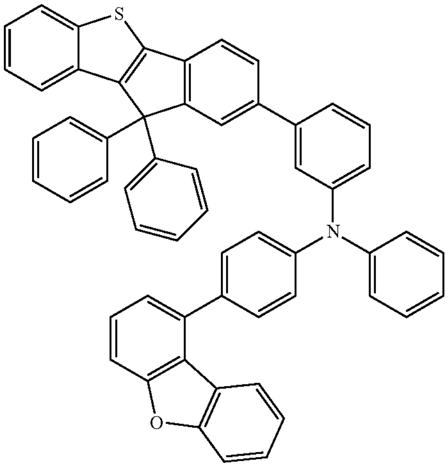
3-209
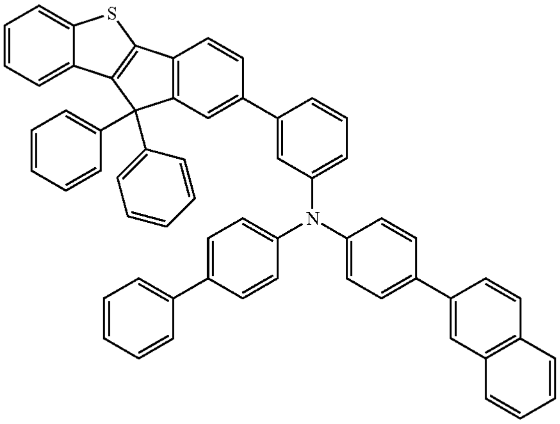
3-210
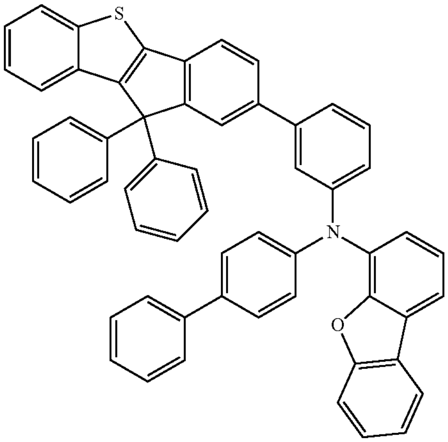

-continued
3-211
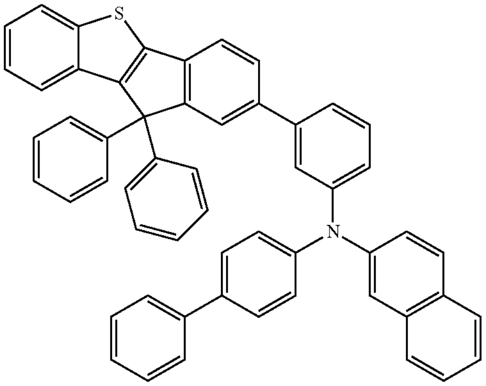
3-212
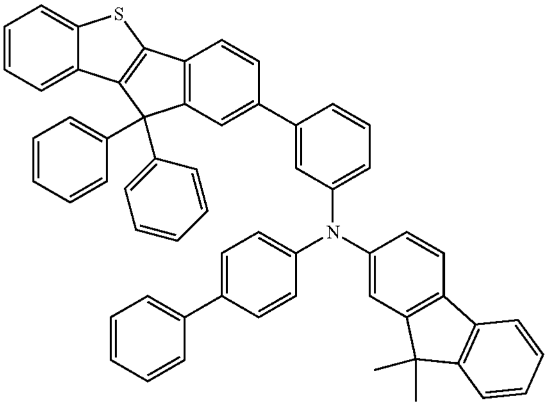
3-213
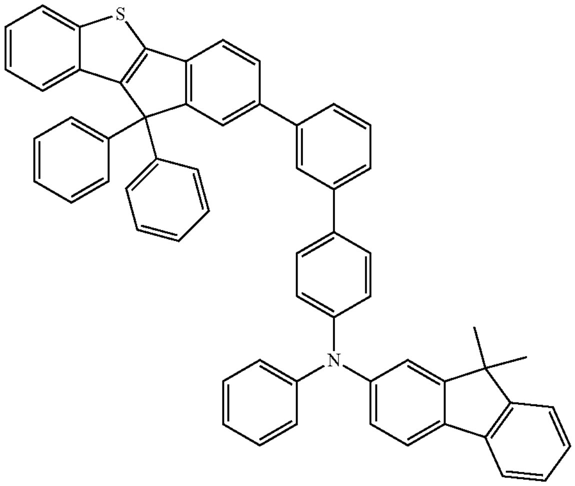
-continued
3-214
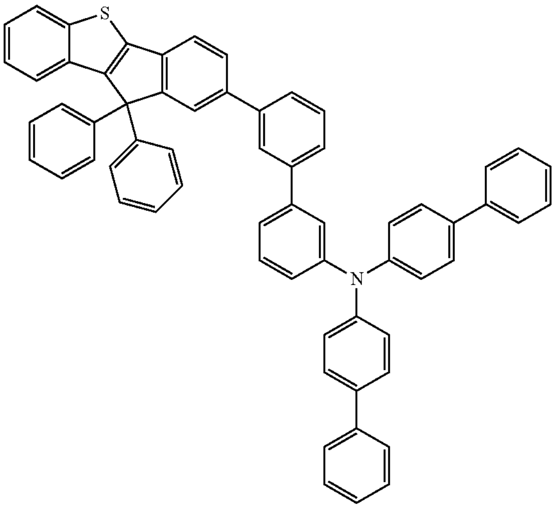
3-215
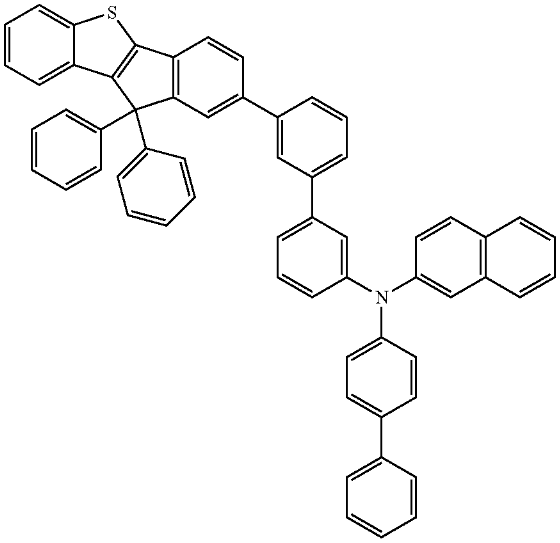
3-216
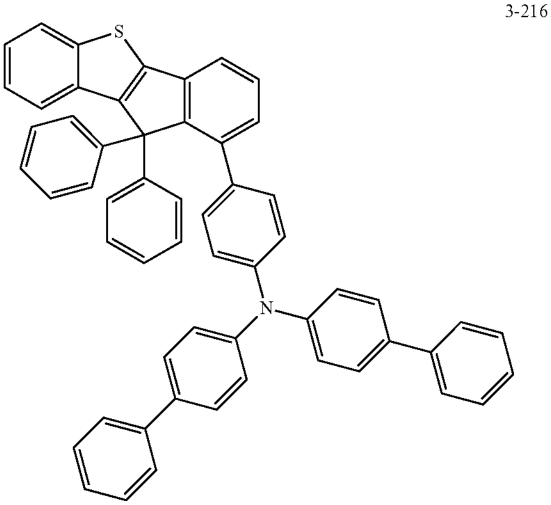

-continued
3-217
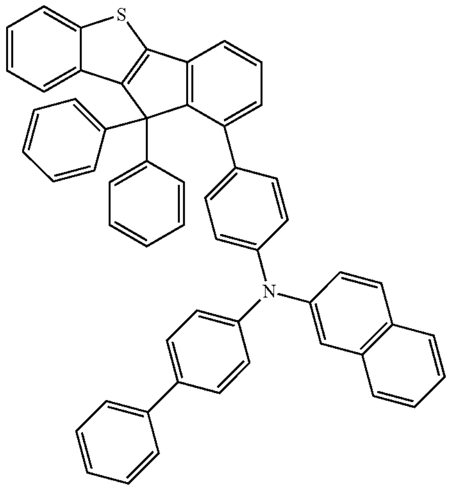
3-218
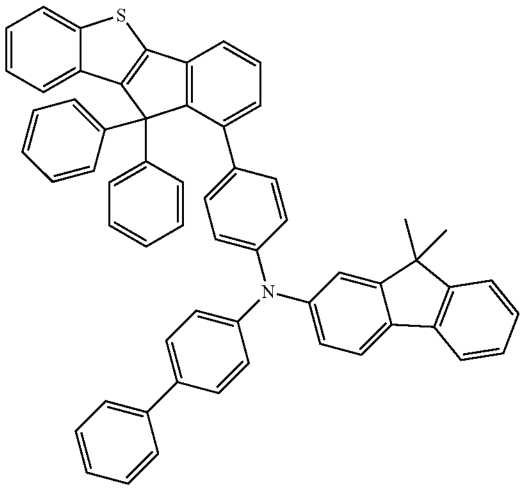
3-219
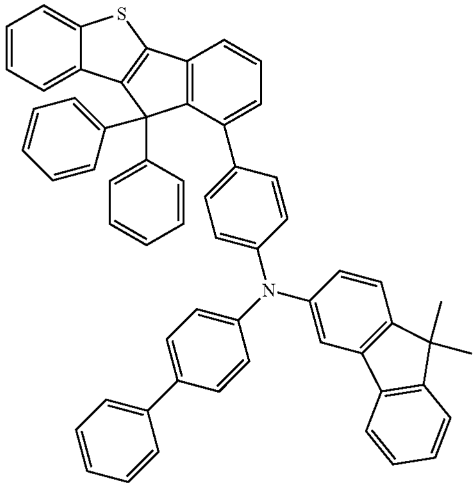
-continued
3-220
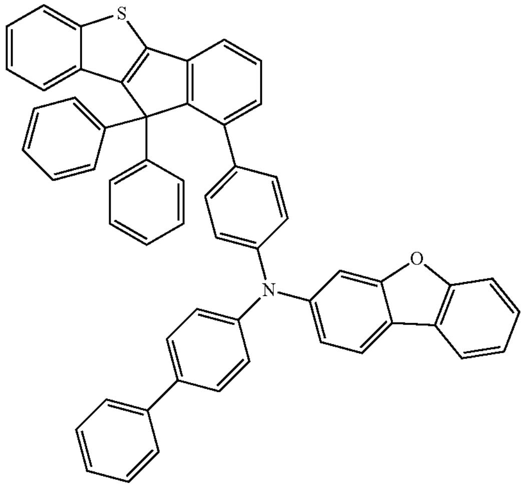
3-221
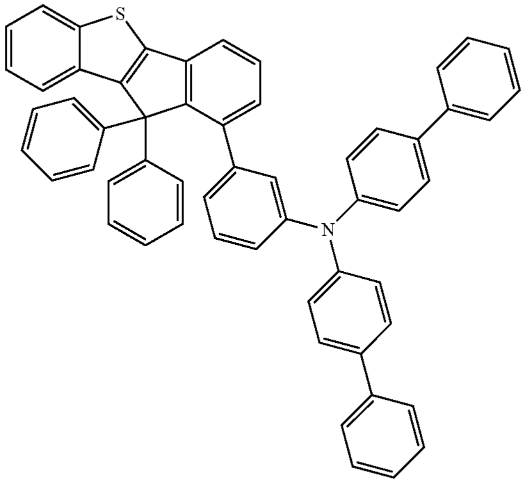
3-222
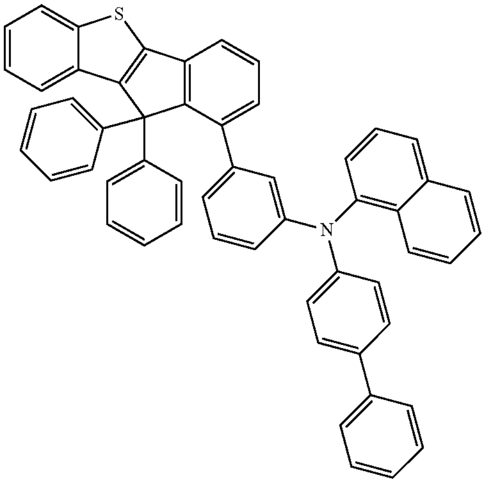

3-223
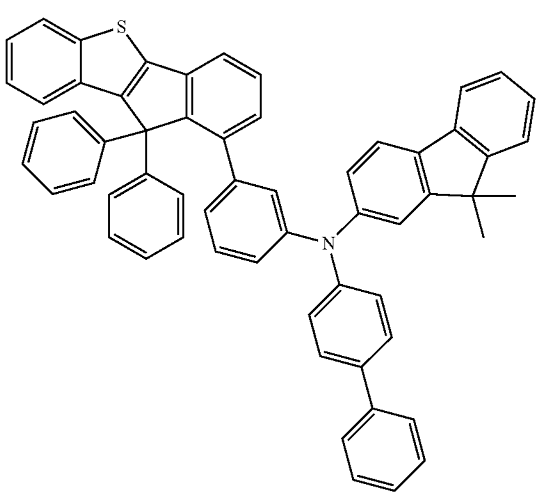
3-224
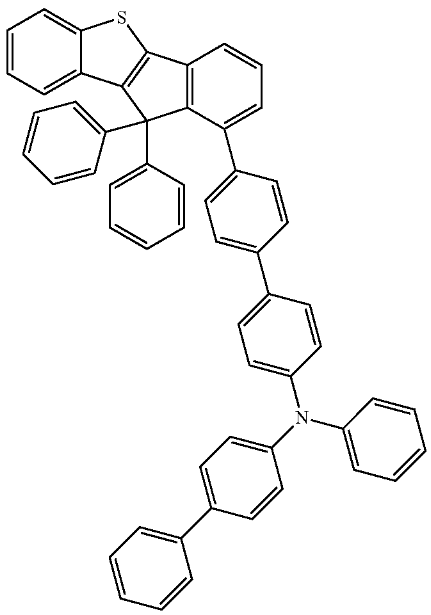
3-225
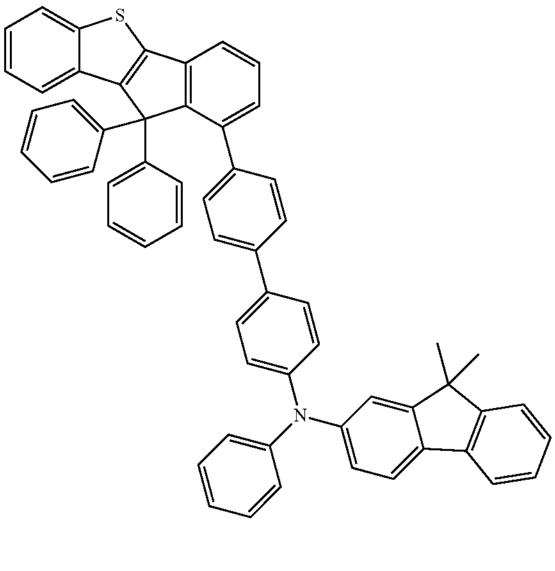
3-226
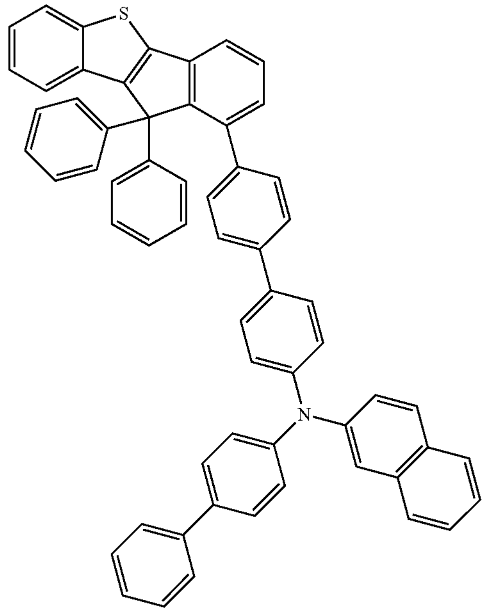
3-227
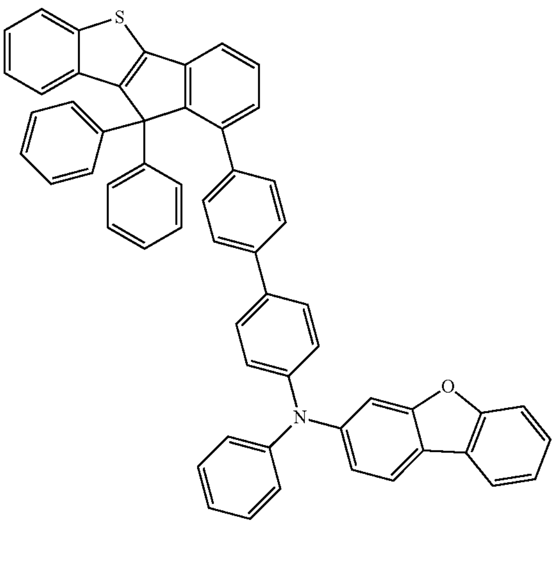

-continued
3-228
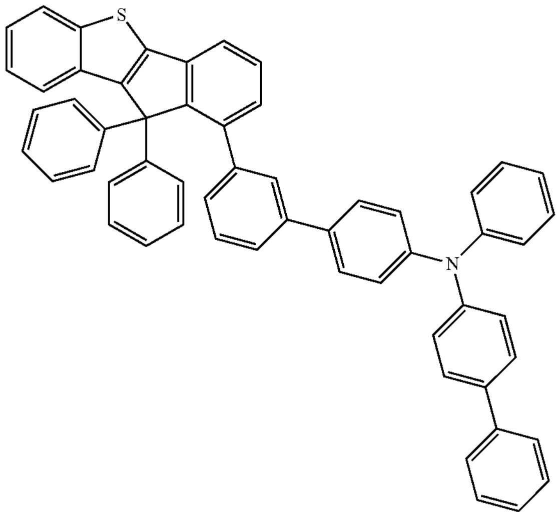
3-229
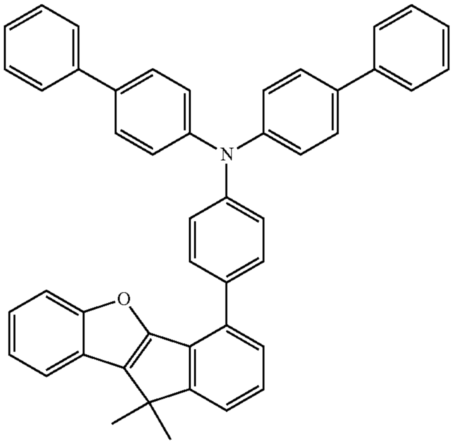
3-230
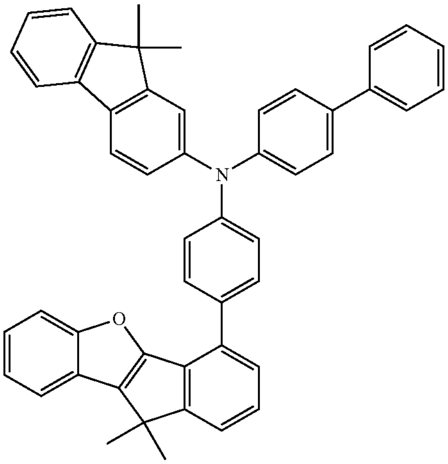
-continued
3-231
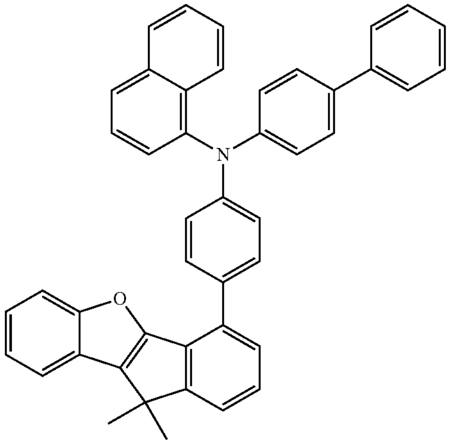
3-232
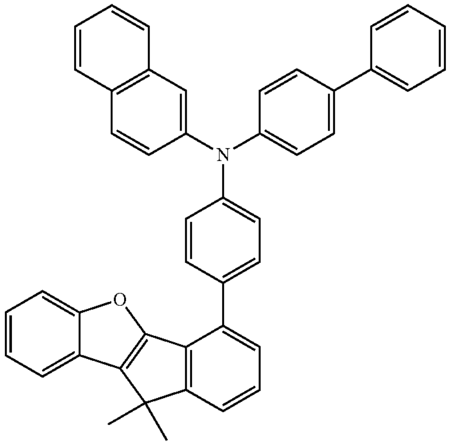
3-233
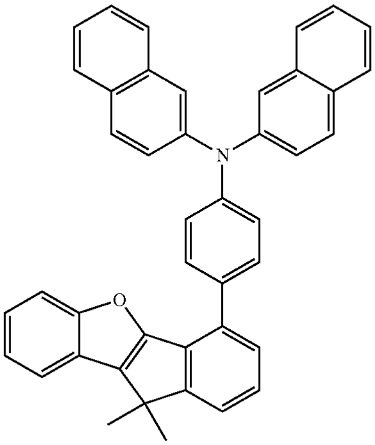

-continued
3-234
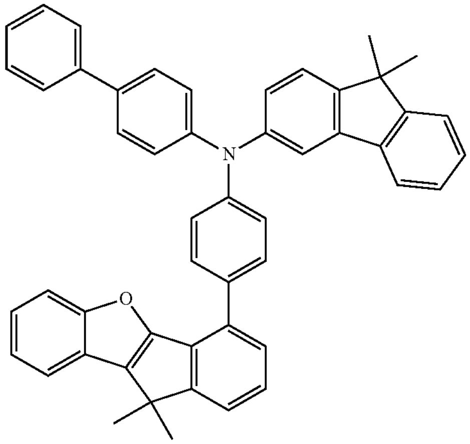
3-235
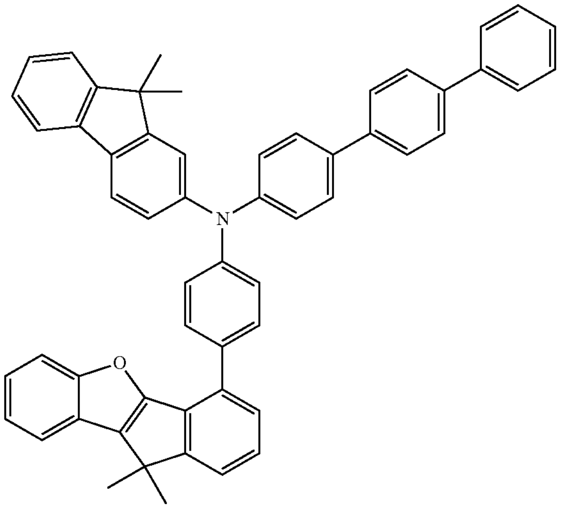
3-236
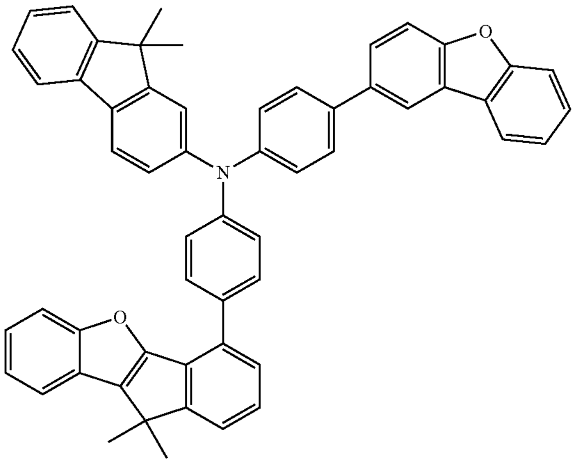
-continued
3-237
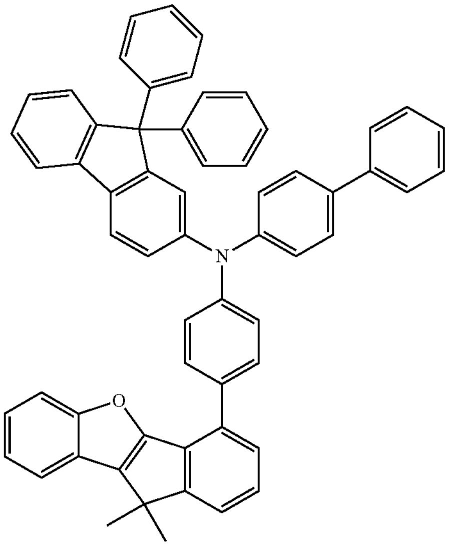
3-238
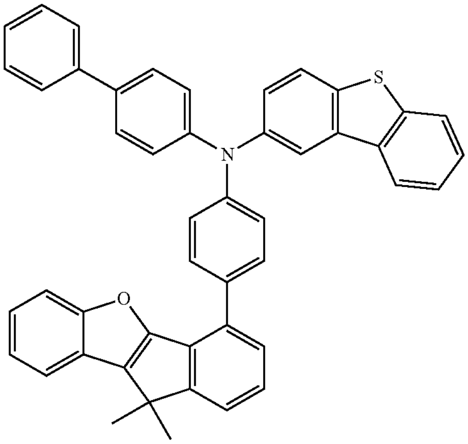
3-239
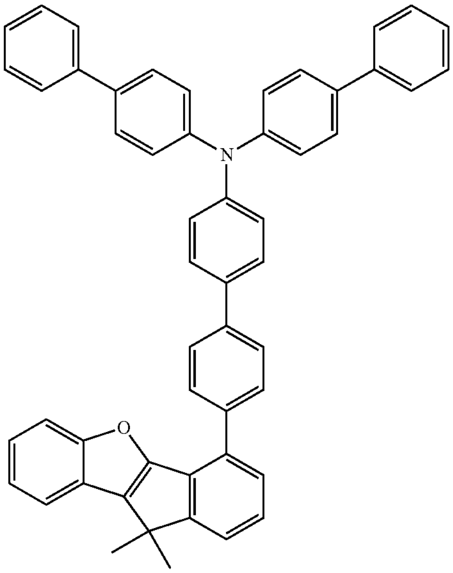

-continued
3-240
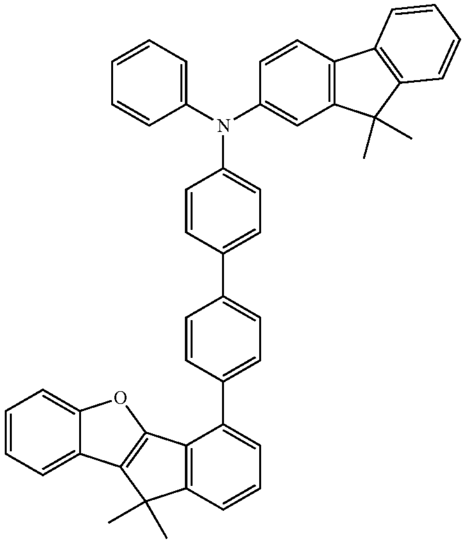
3-241
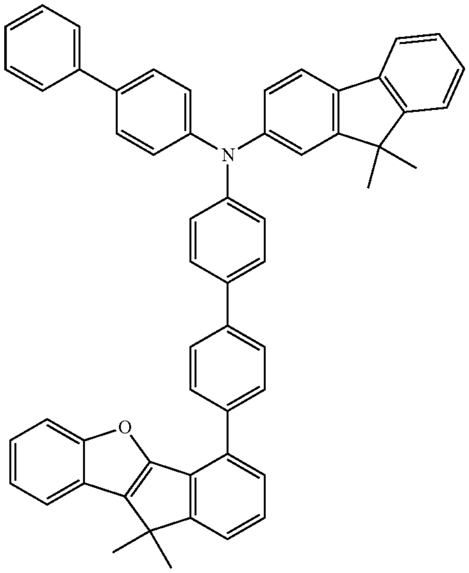
-continued
3-242
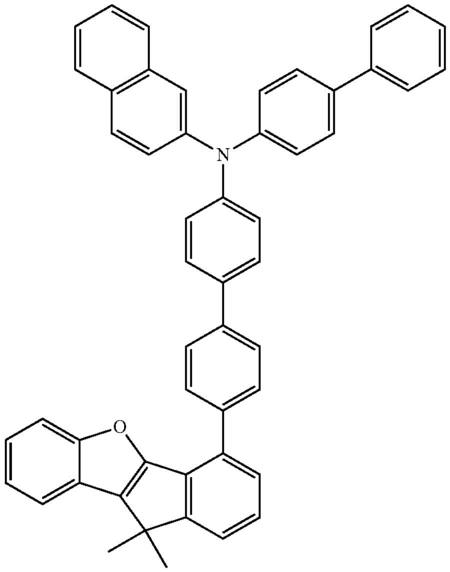
3-243
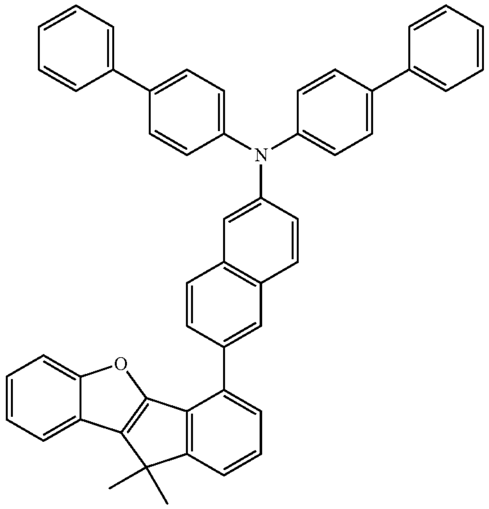
3-244
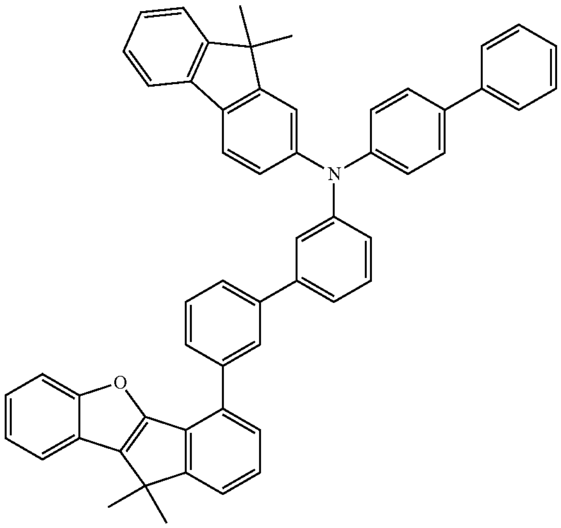

-continued
3-245
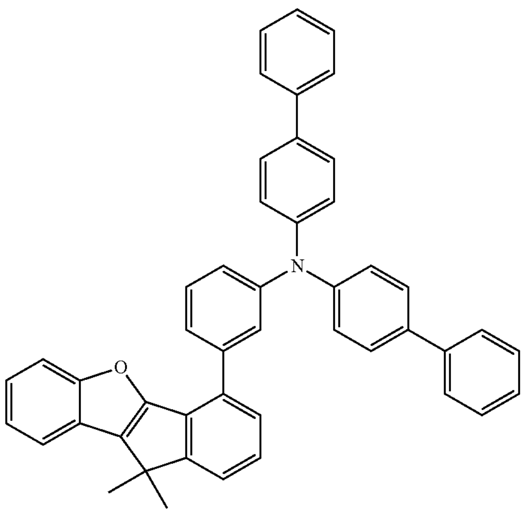
3-246
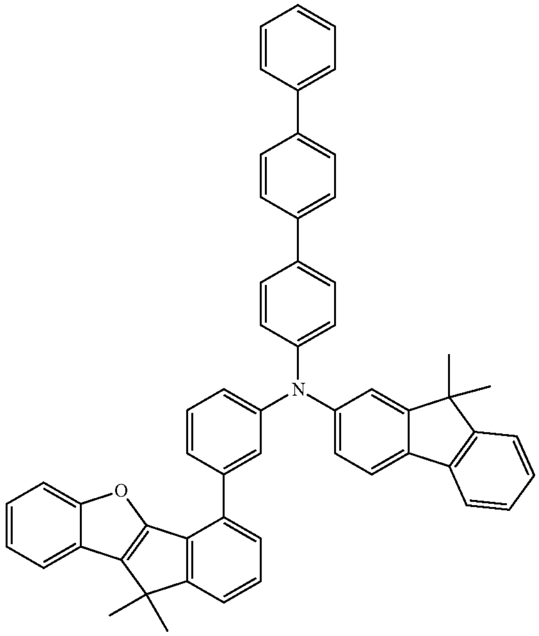
3-247
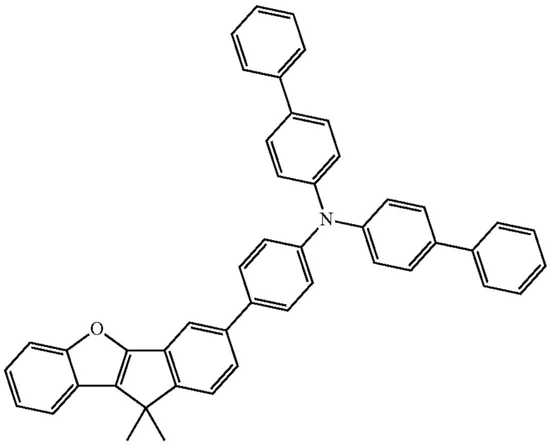
-continued
3-248
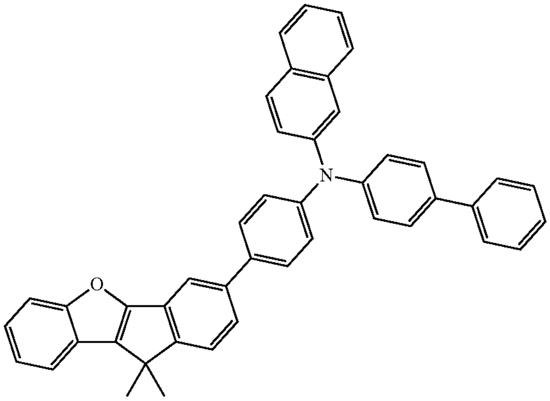
3-249
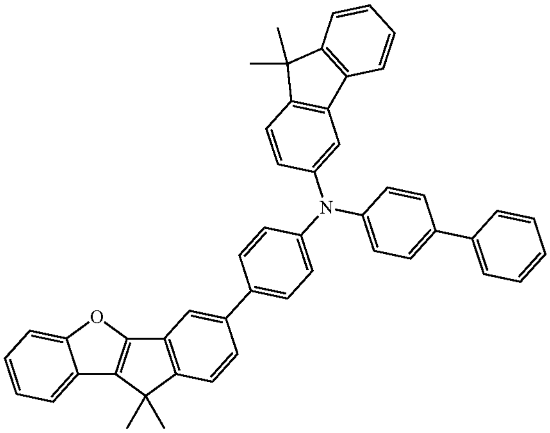
3-250
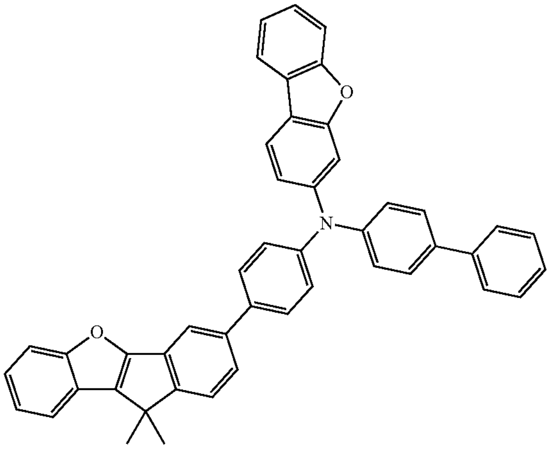

3-251
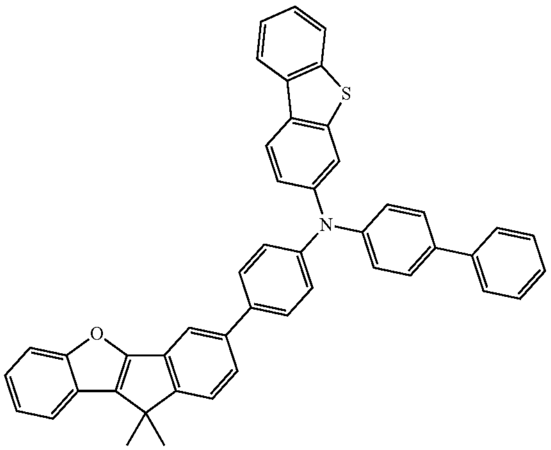
3-252
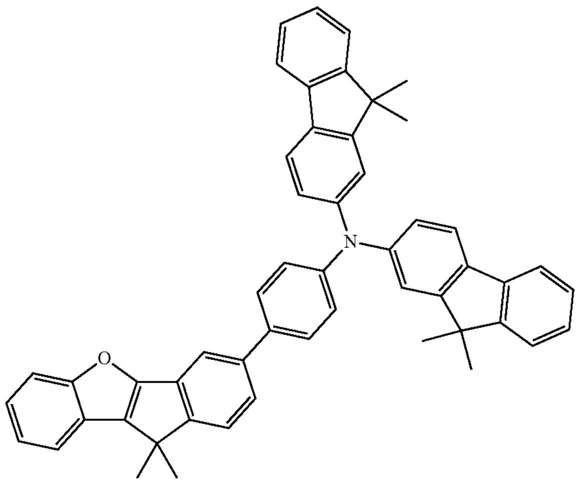
3-253
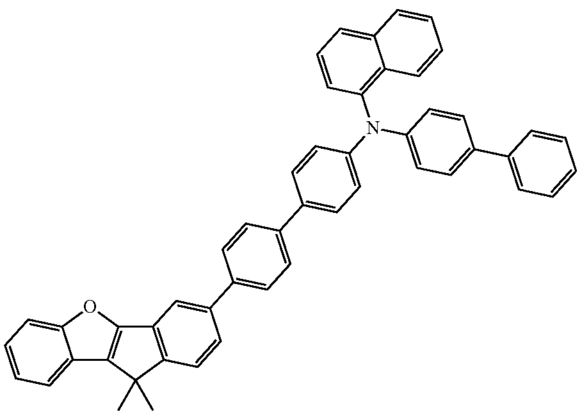
3-254
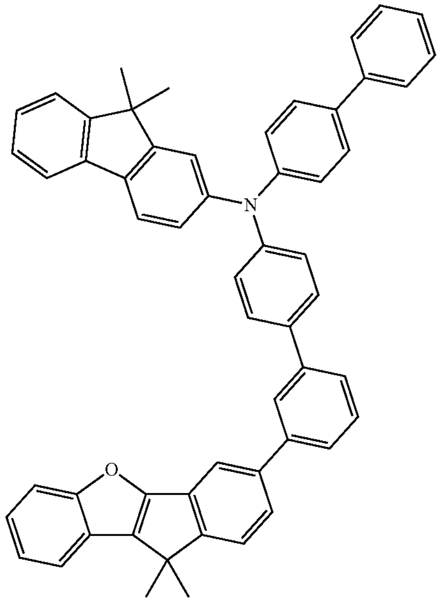
3-255
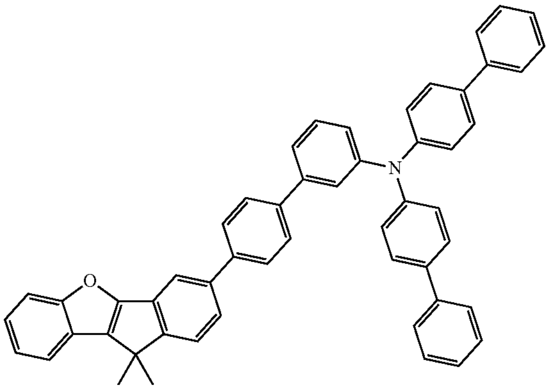
3-256
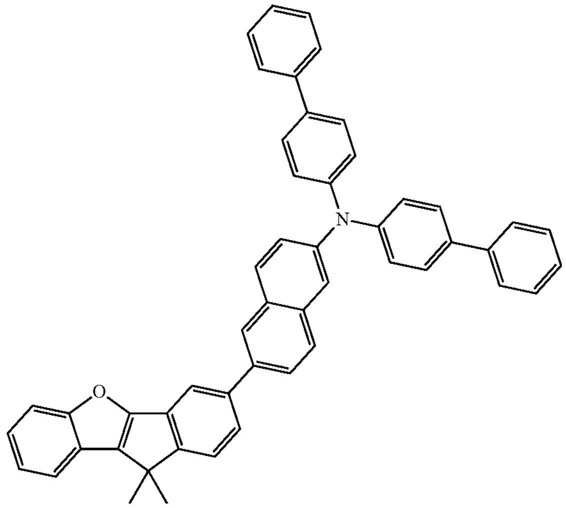

3-257
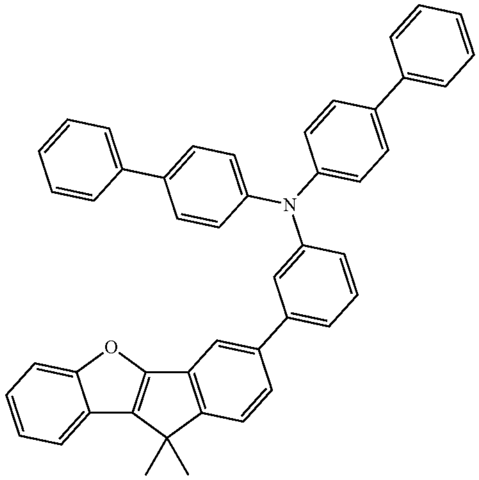
3-258
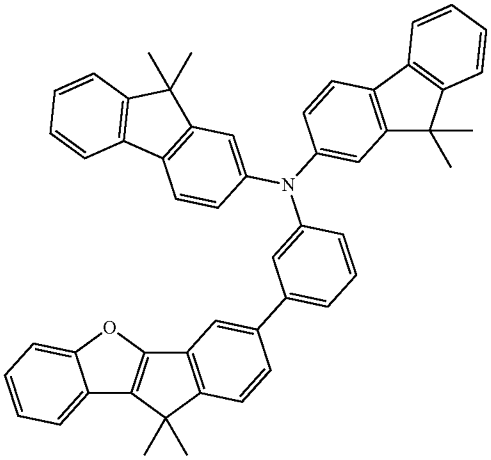
3-259
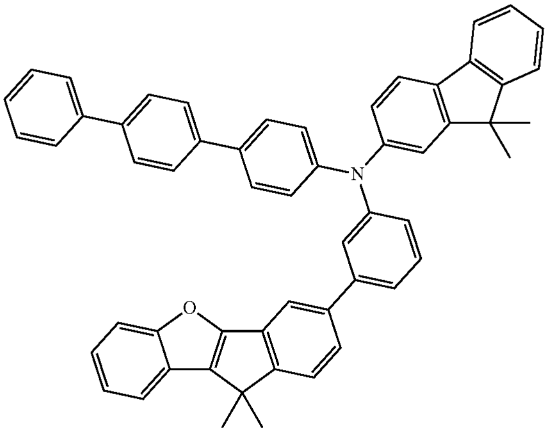
3-260
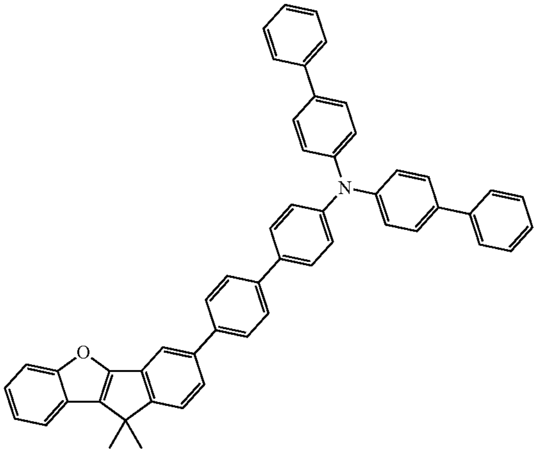
3-261
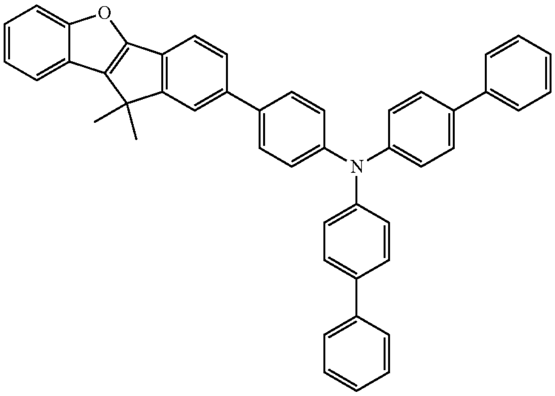
3-262
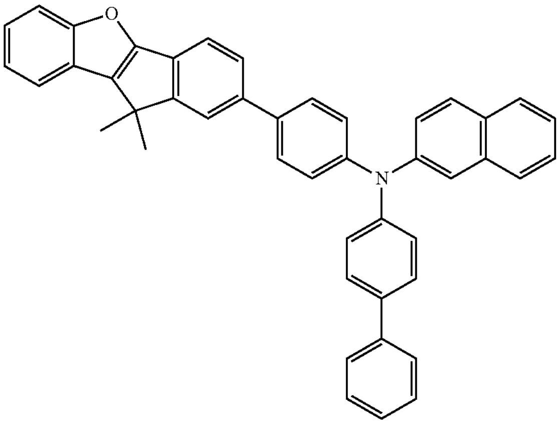

-continued
3-263
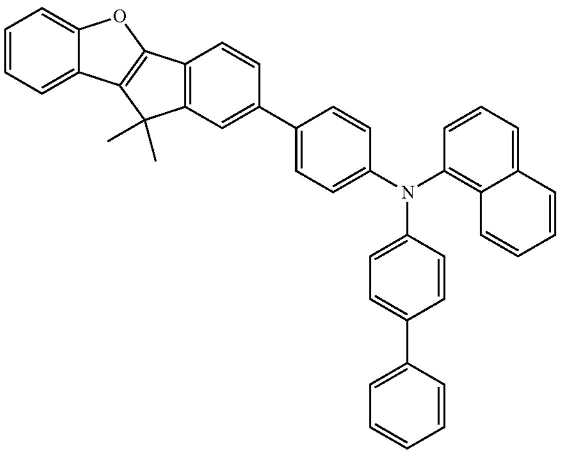
3-264
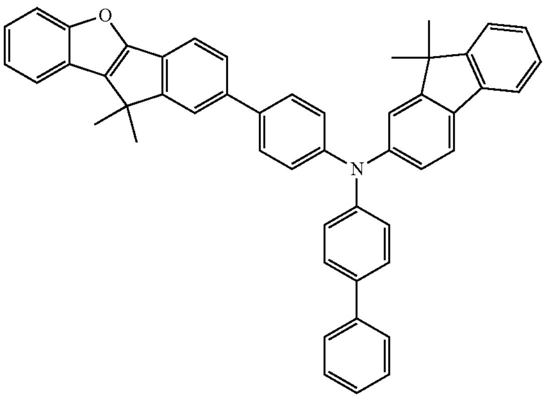
3-265
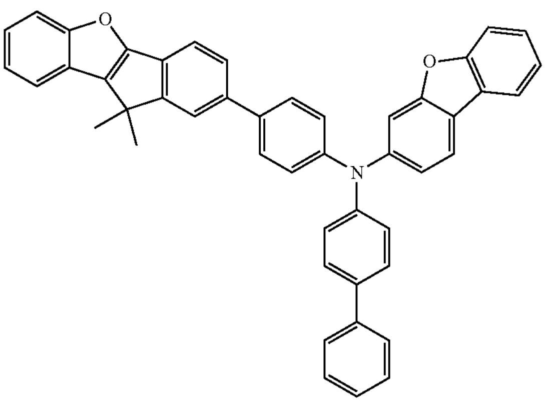
-continued
3-266
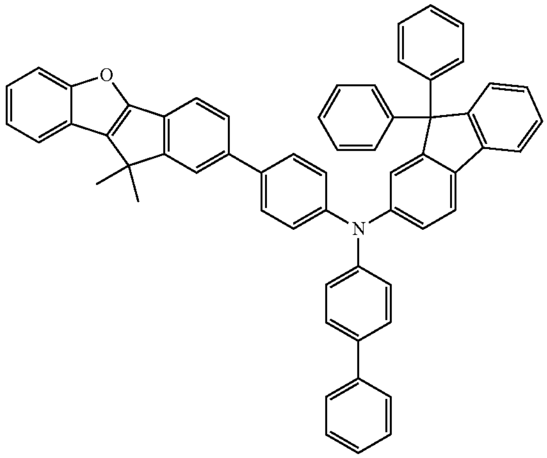
3-267
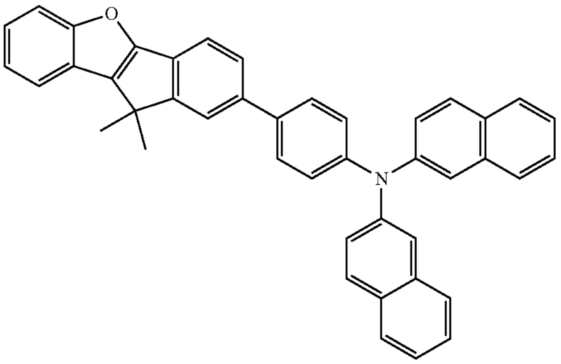
3-268
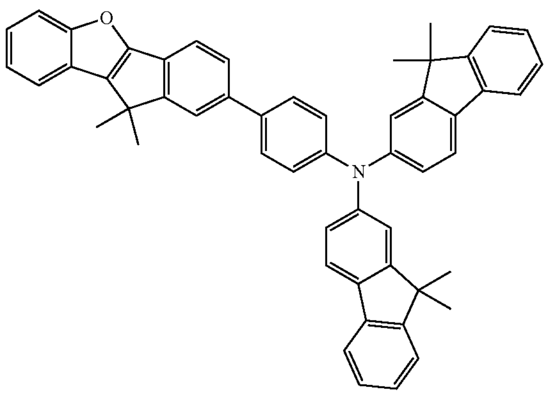

-continued
3-269
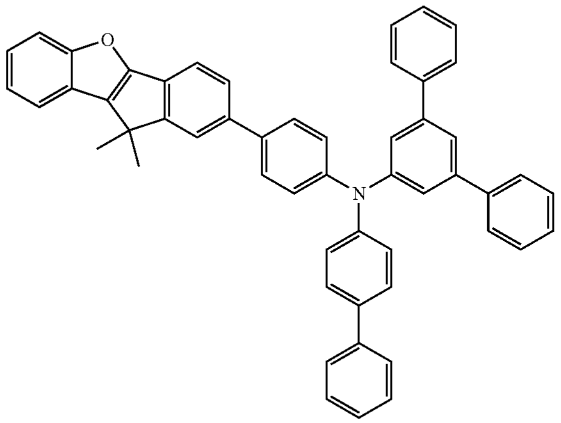
3-270
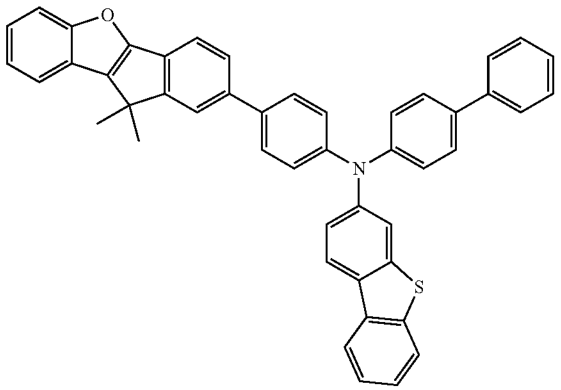
3-271
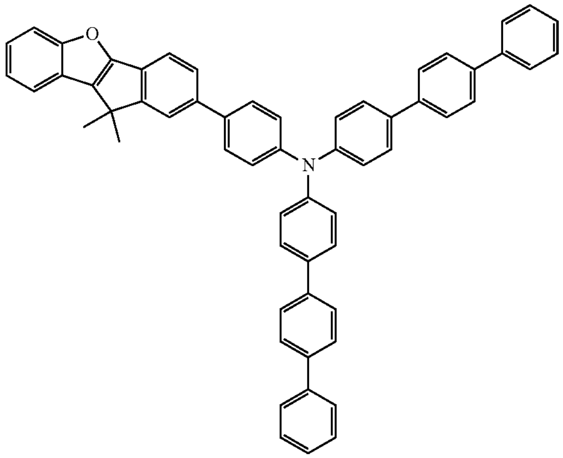
-continued
3-272
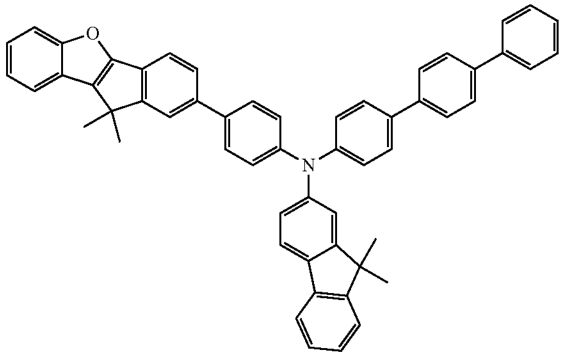
3-273
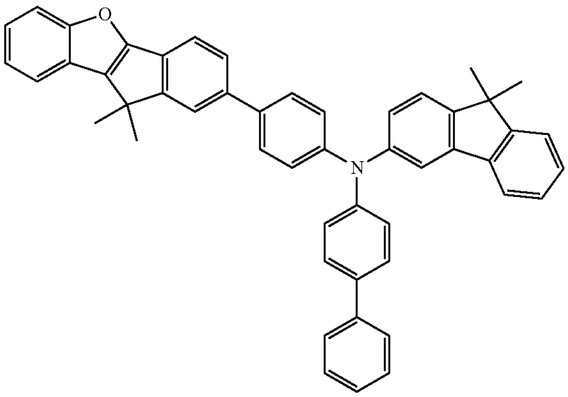
3-274
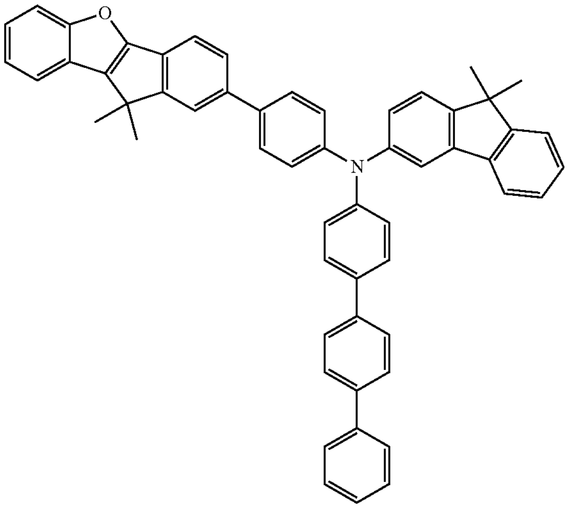

-continued
3-275
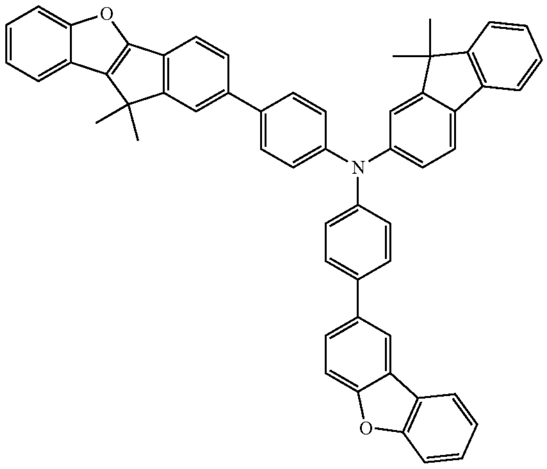
3-276
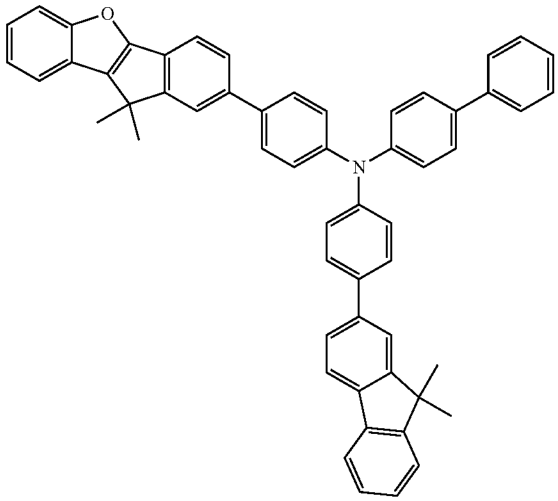
3-277
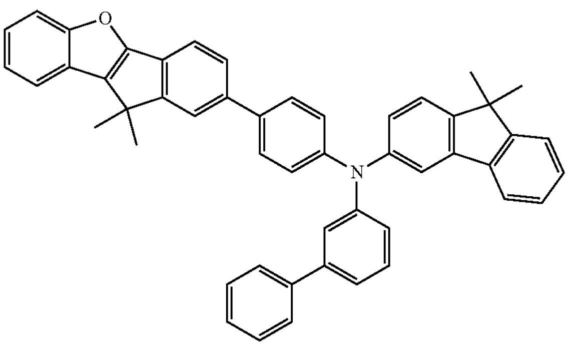
-continued
3-278
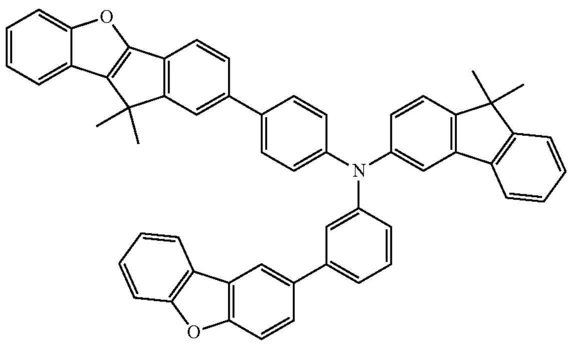
3-279
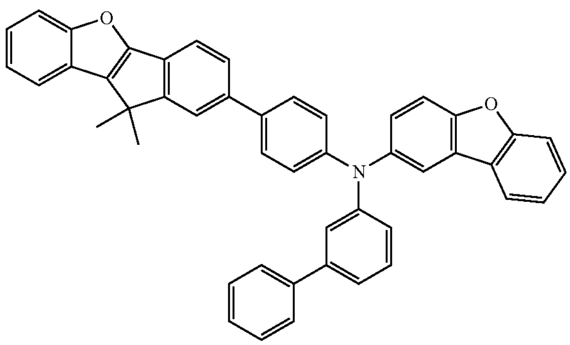
3-280
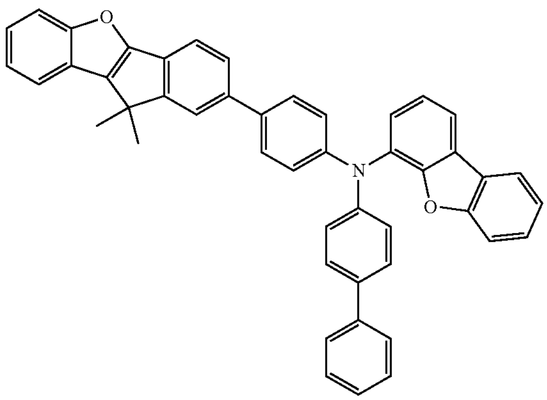
3-281
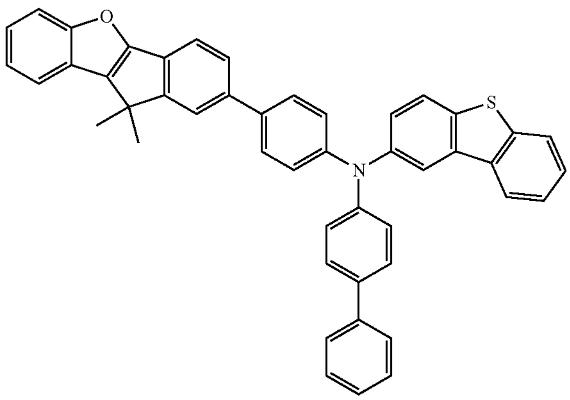

-continued
3-282
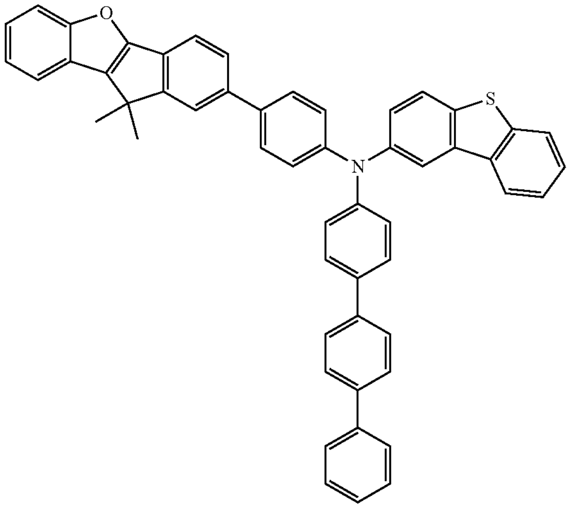
3-283
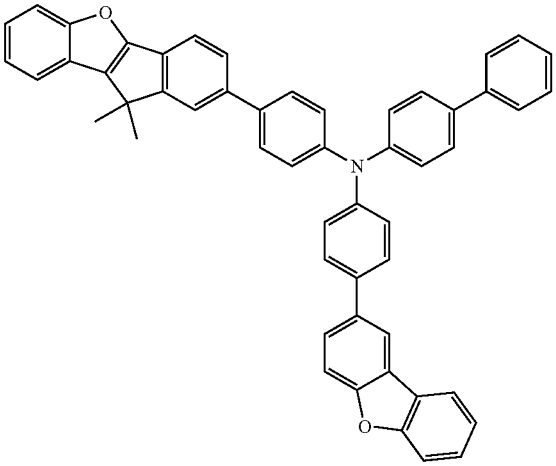
3-284
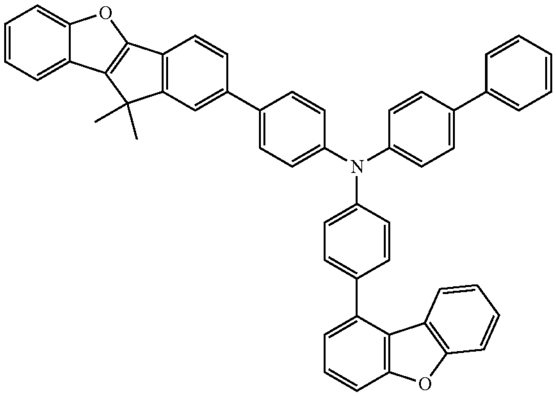
-continued
3-285
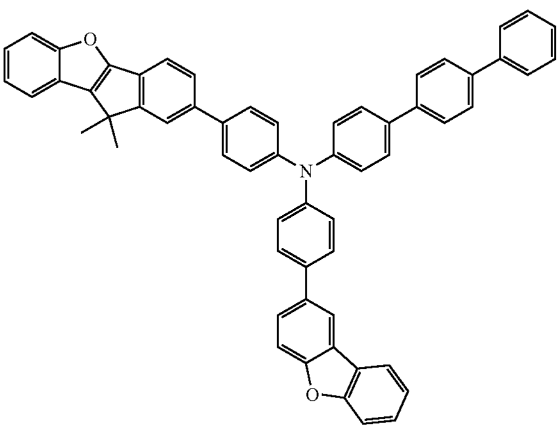
3-286
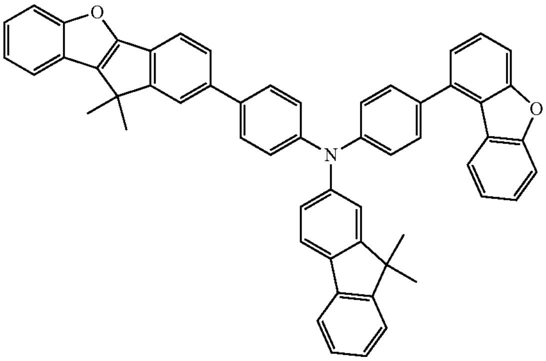
3-287
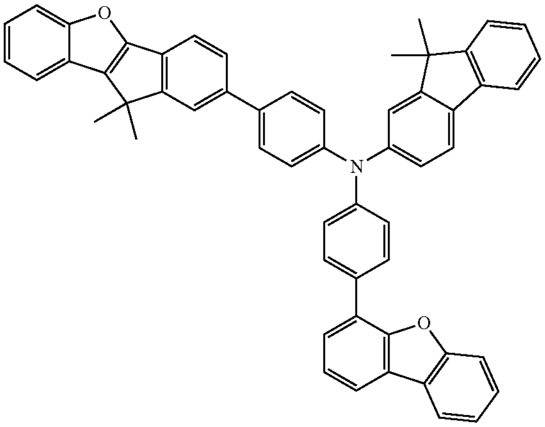

-continued
3-288
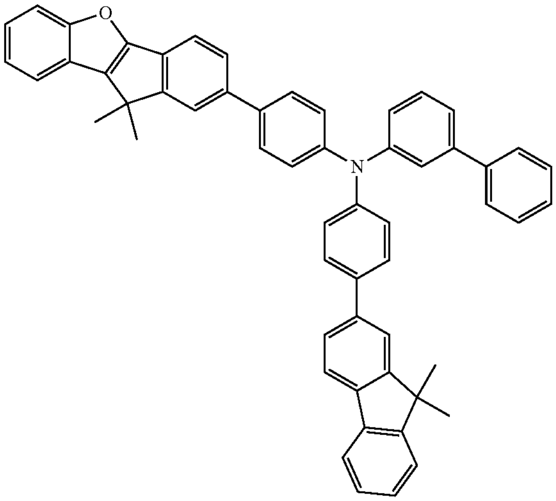
3-289
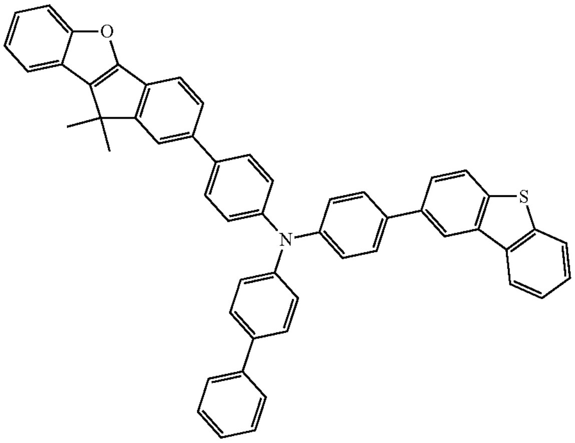
3-290
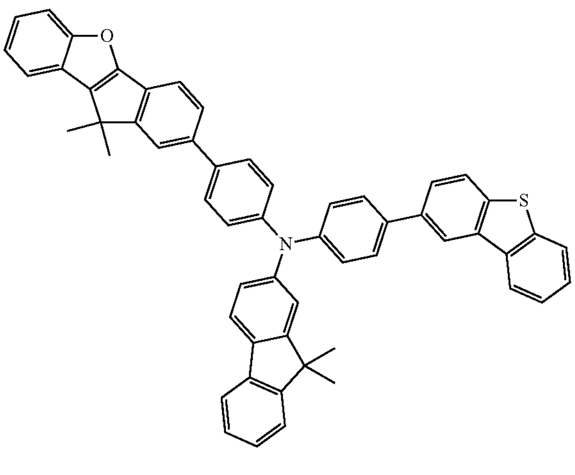
-continued
3-291
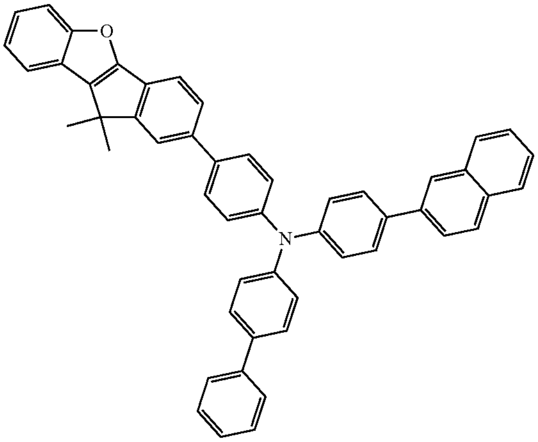
3-292
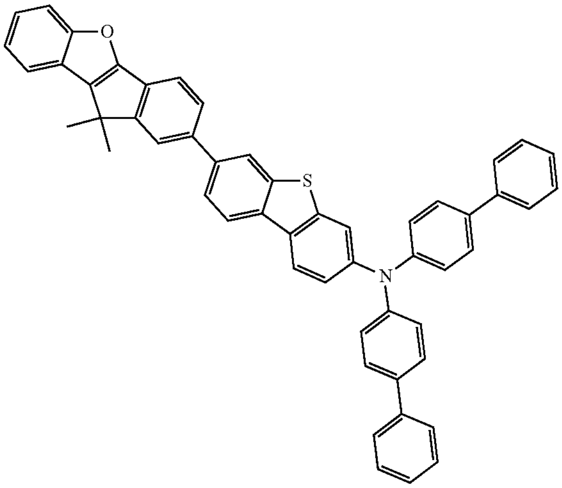
3-293
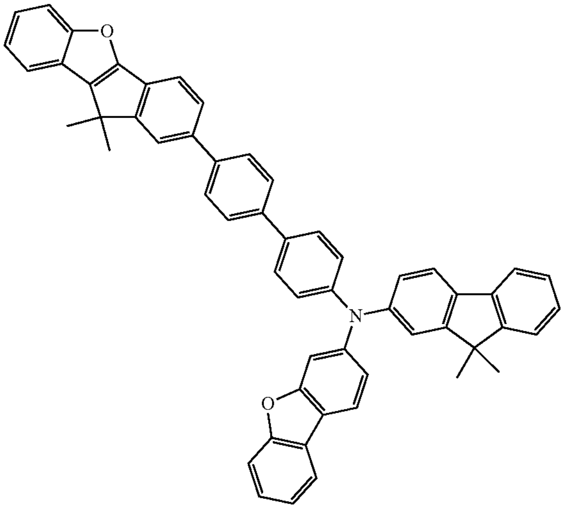

-continued
3-294
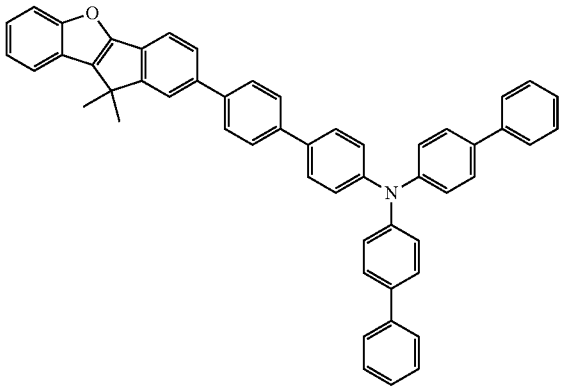
3-295
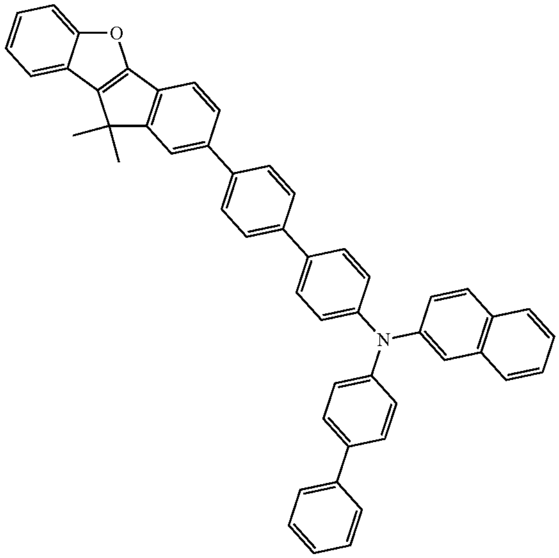
3-296
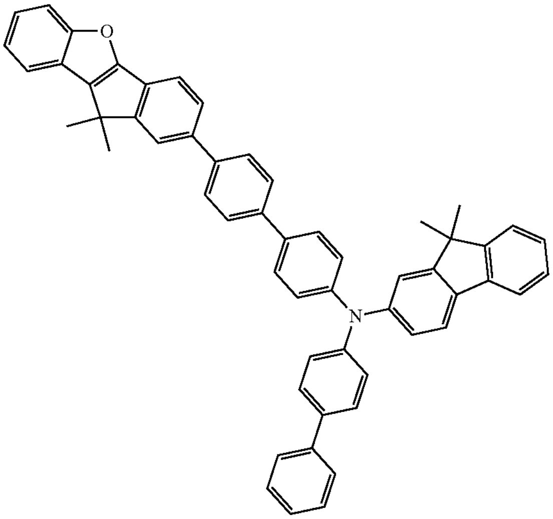
-continued
3-297
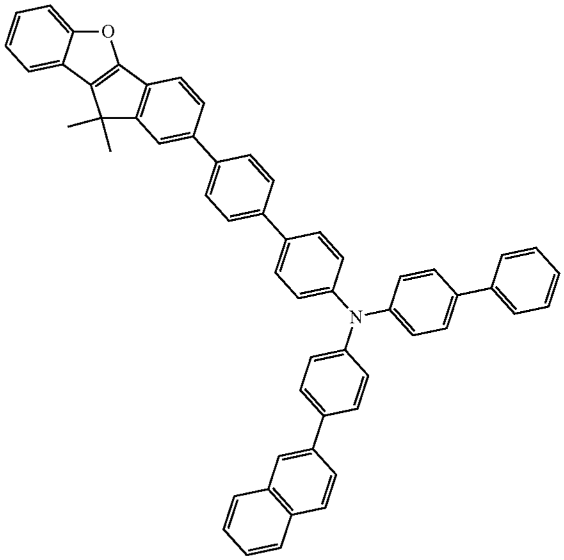
3-298
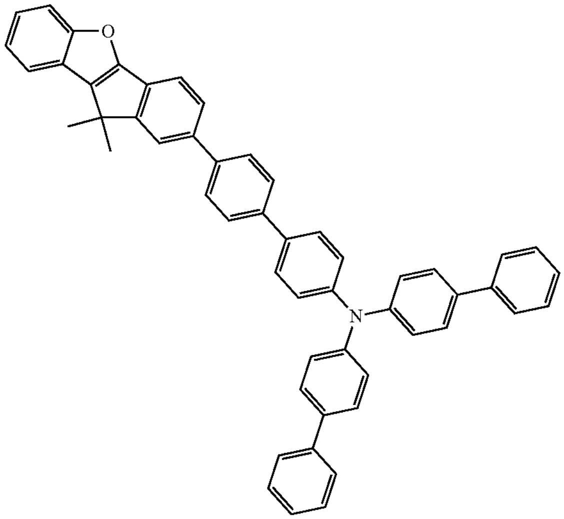
3-299
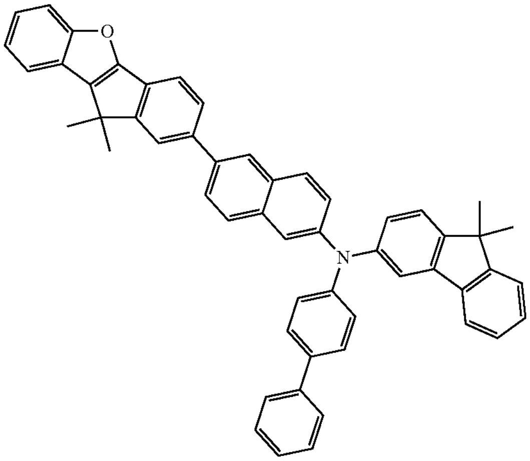

-continued
3-300
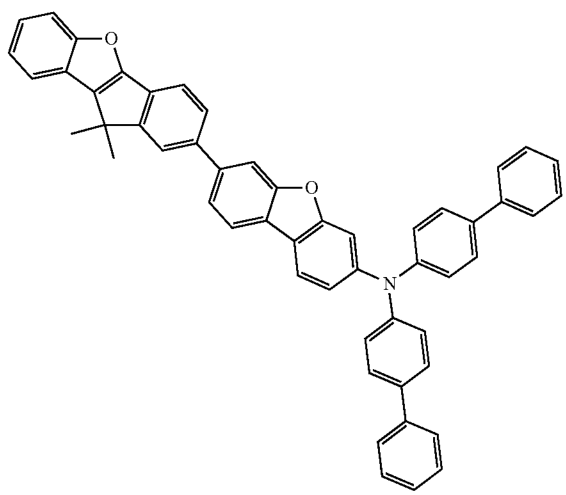
3-301
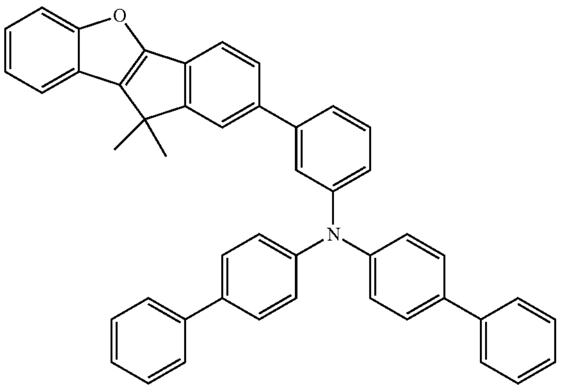
3-302
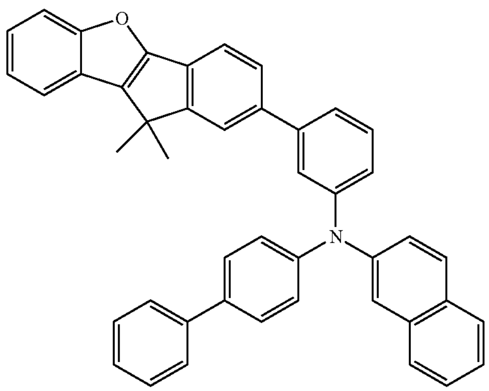
-continued
3-303
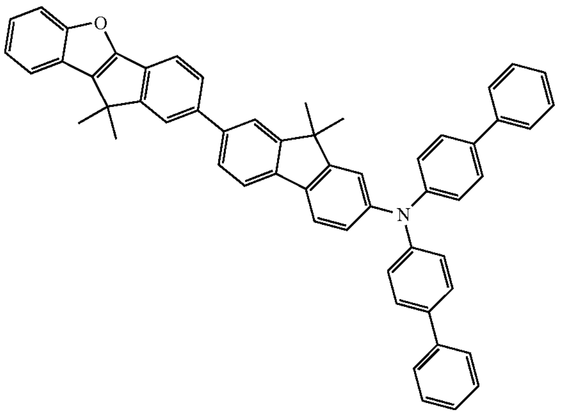
3-304
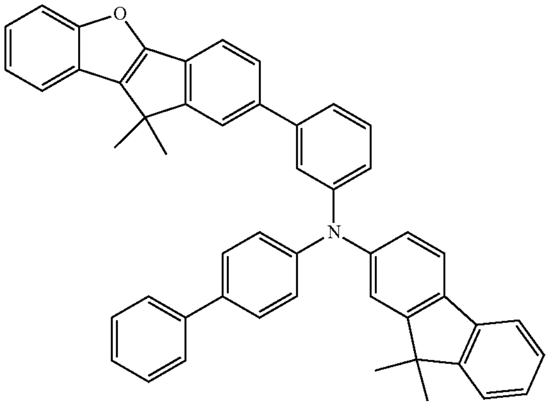
3-305
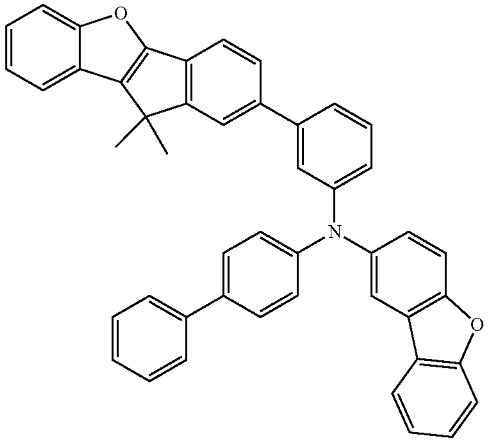

3-306
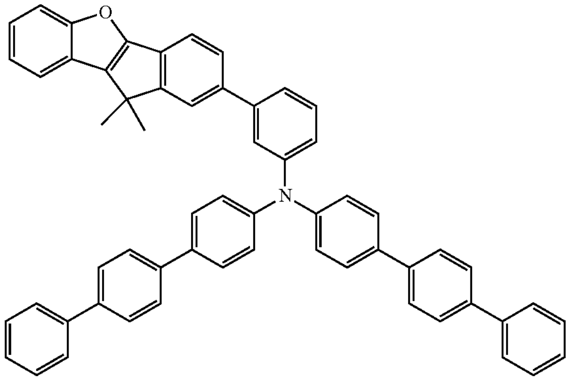
3-307
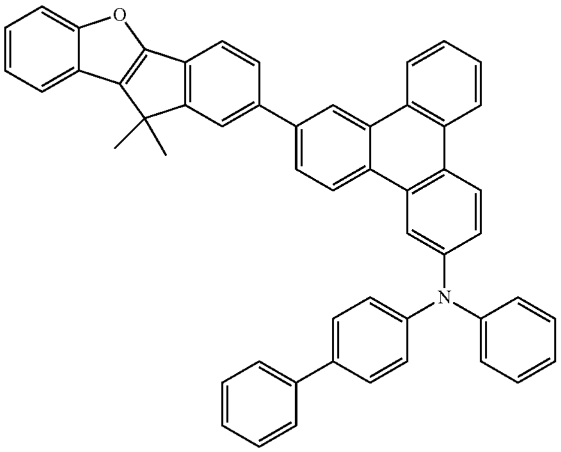
3-308
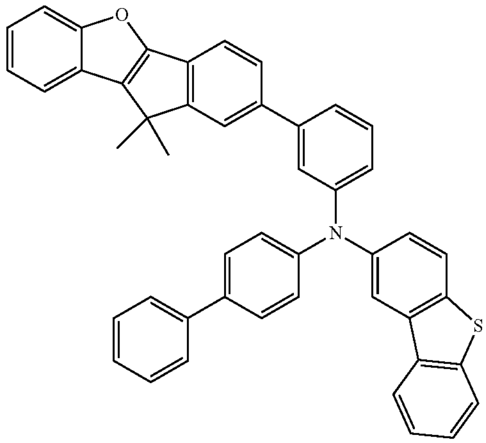
3-309
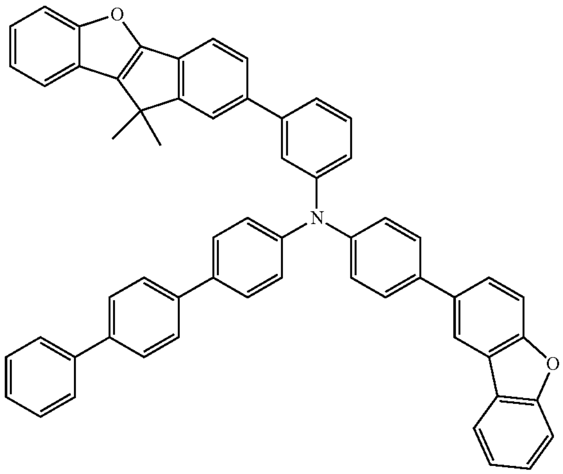
3-310
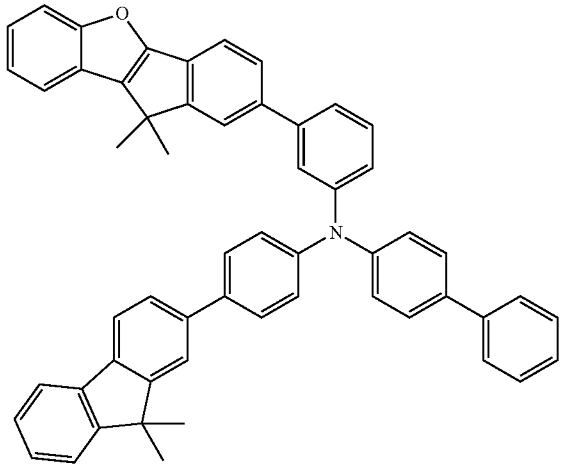
3-311
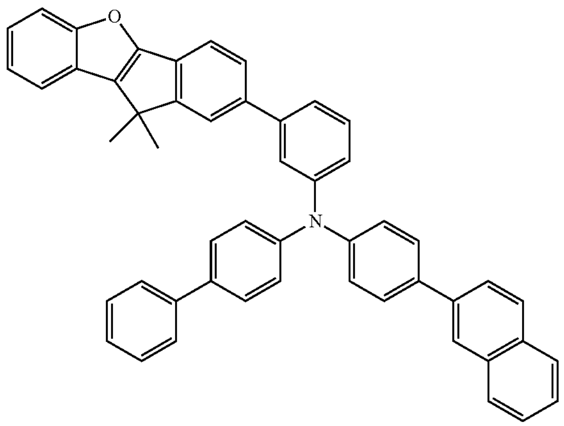

-continued
3-312
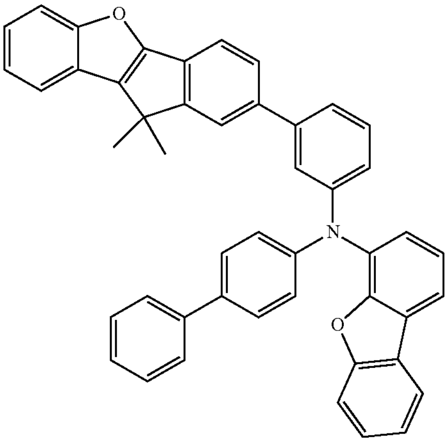
3-313
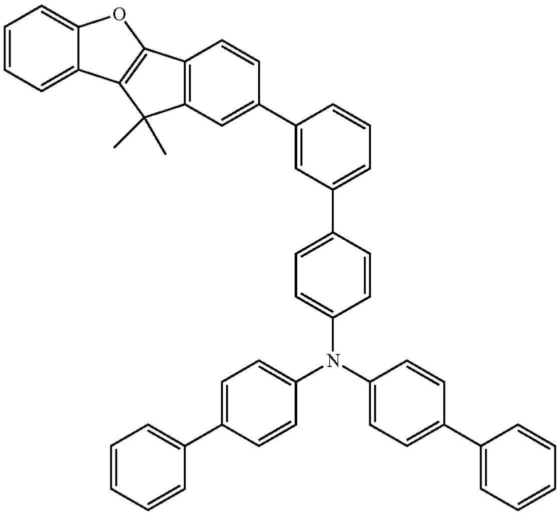
3-314
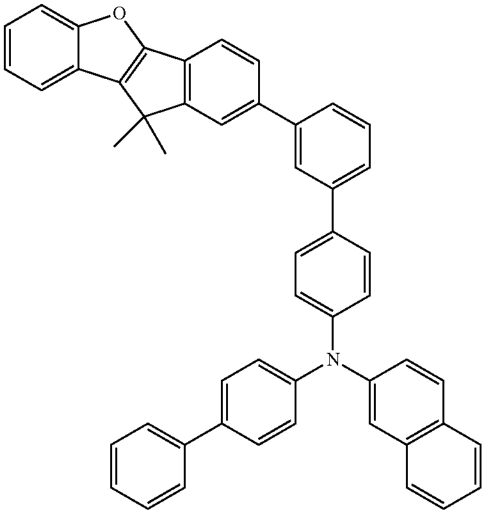
-continued
3-315
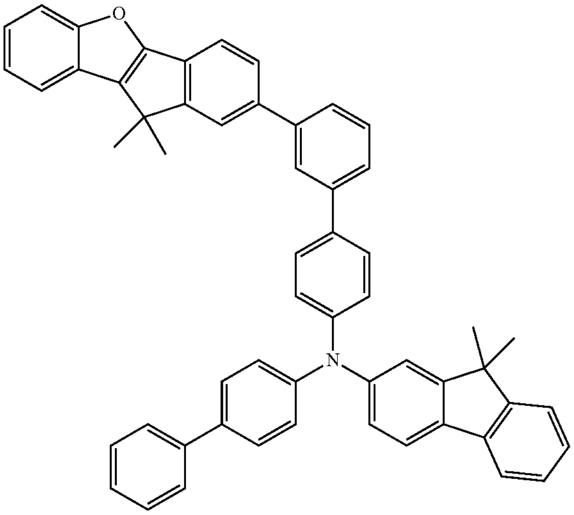
3-316
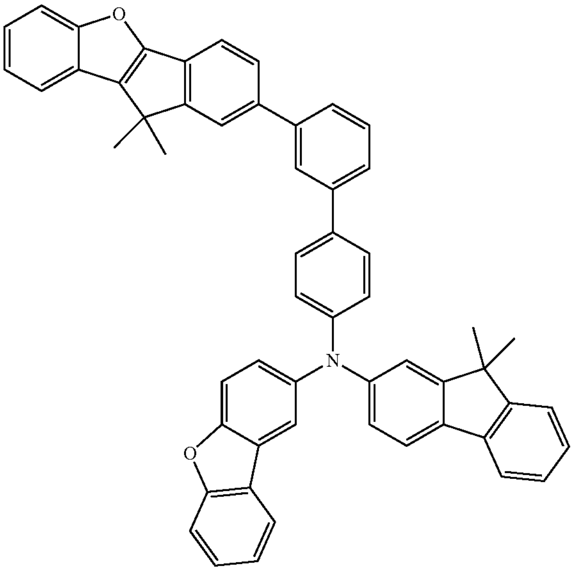
3-317
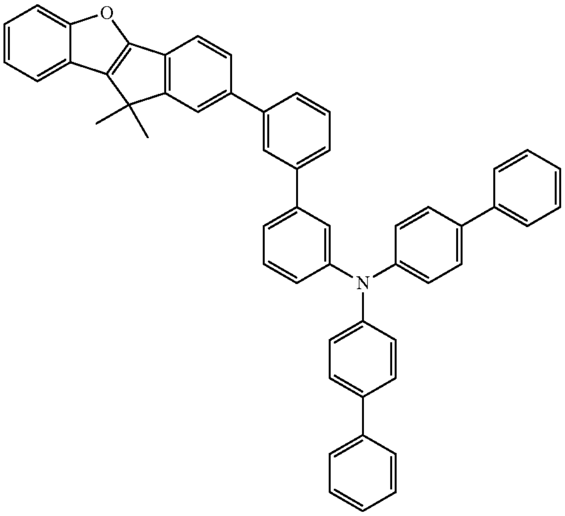

-continued
3-318
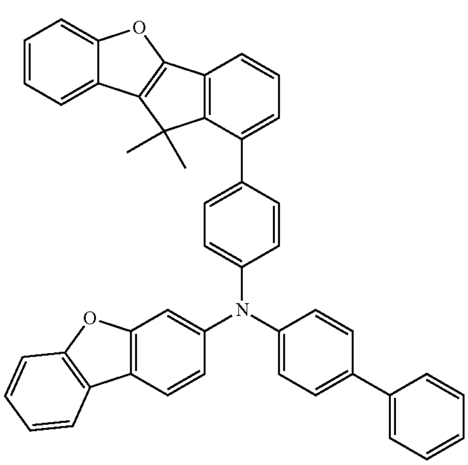
3-319
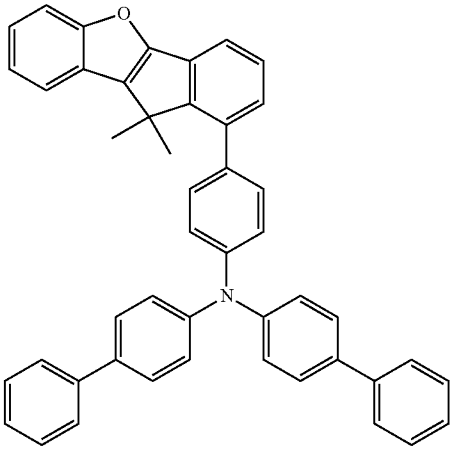
3-320
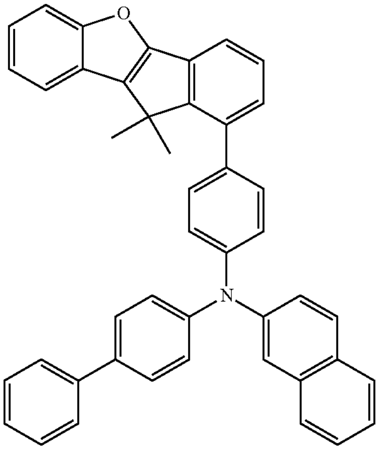
-continued
3-321
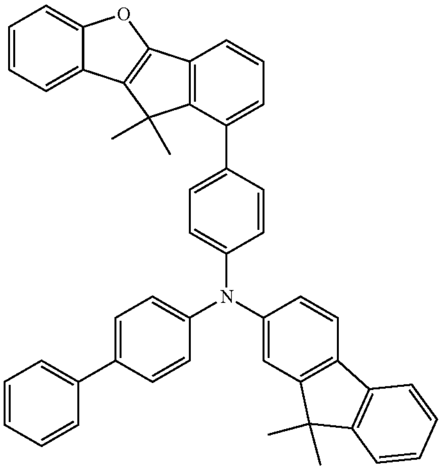
3-322
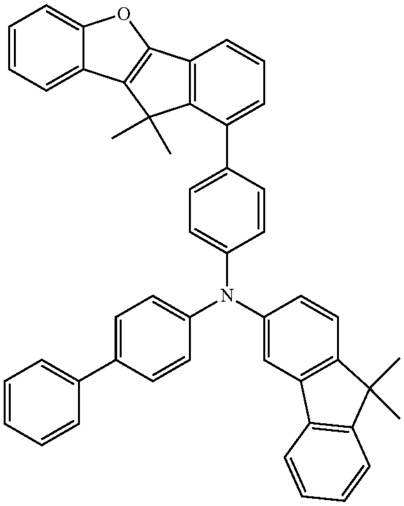
3-323
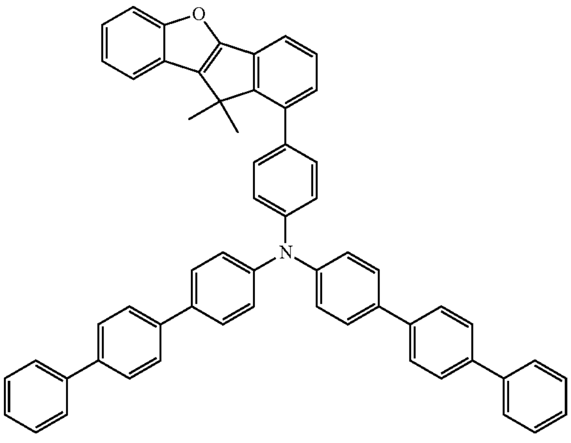

-continued
3-324
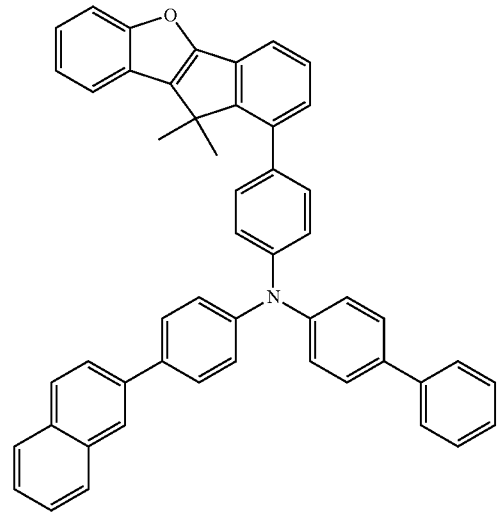
3-325
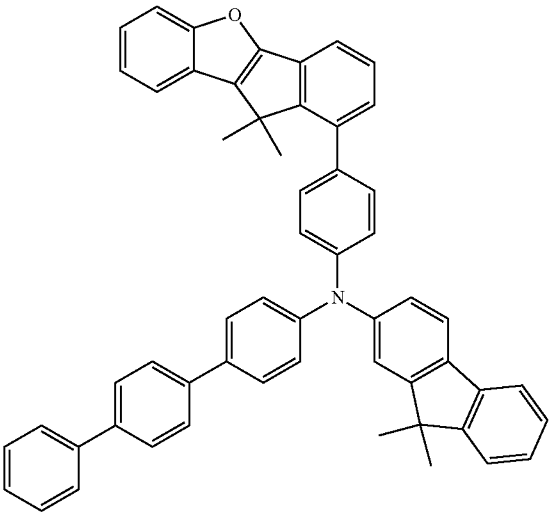
3-326
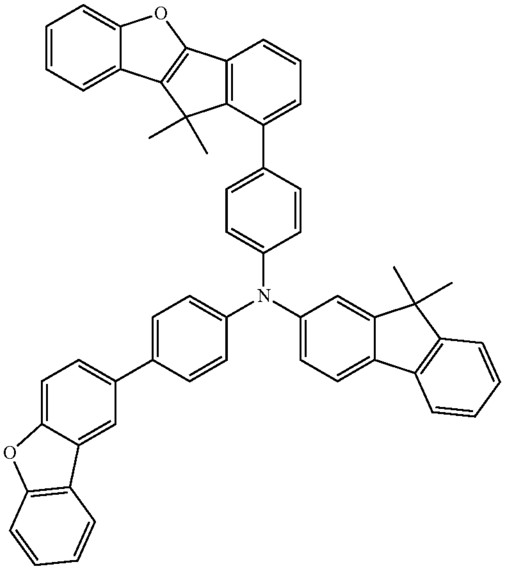
-continued
3-327
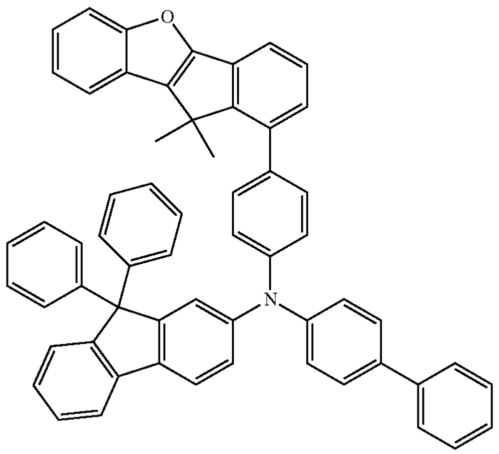
3-328
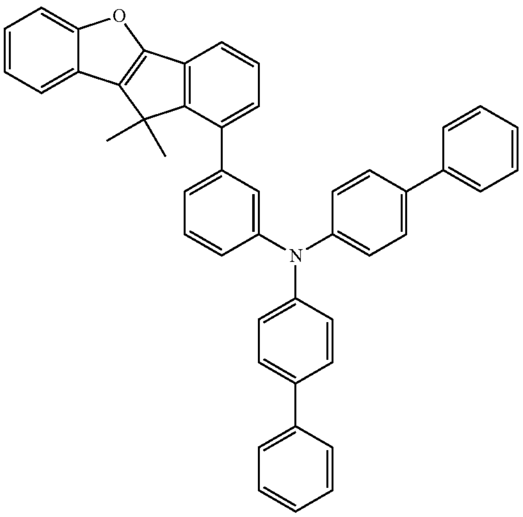
3-329
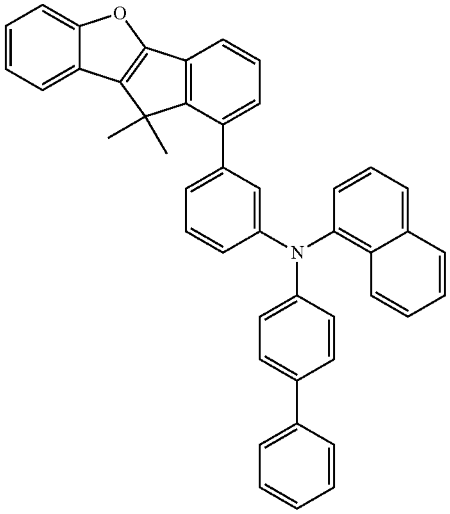

-continued
3-330
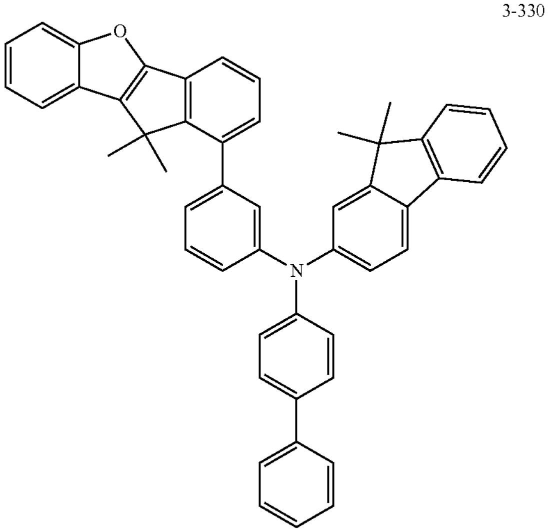
-continued
3-332
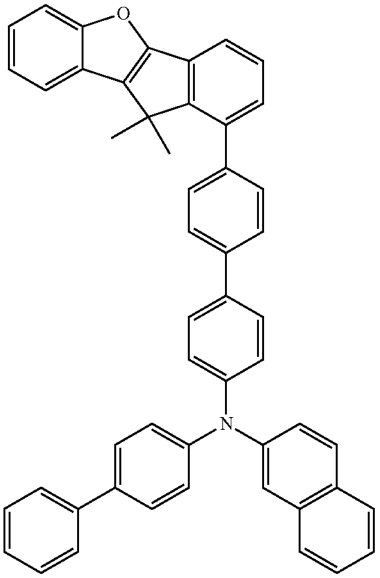
3-331
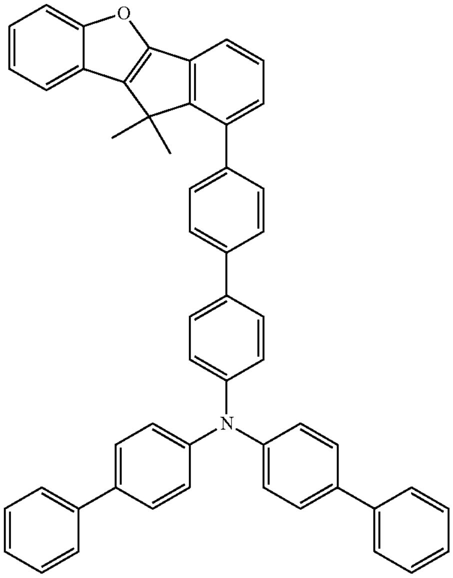
3-333
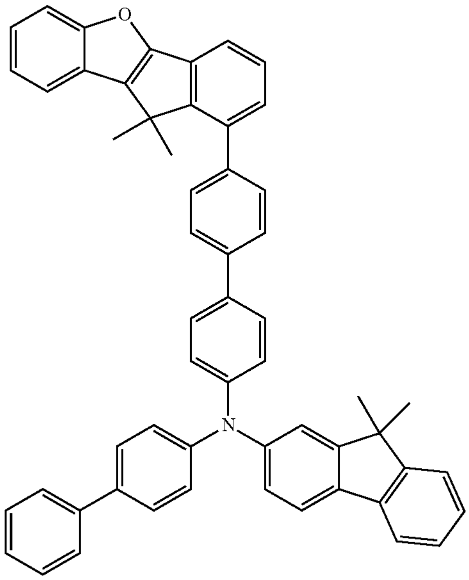

-continued
3-334
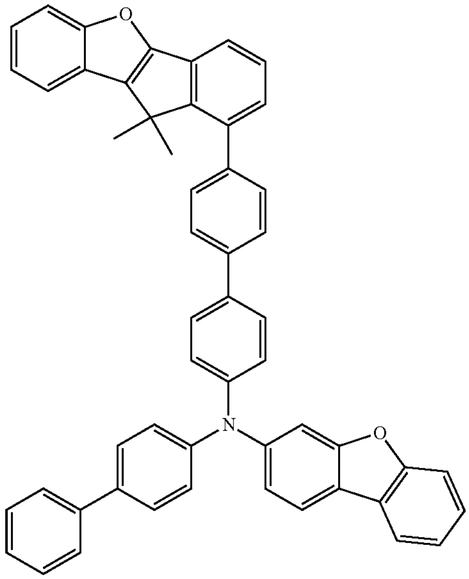
3-335
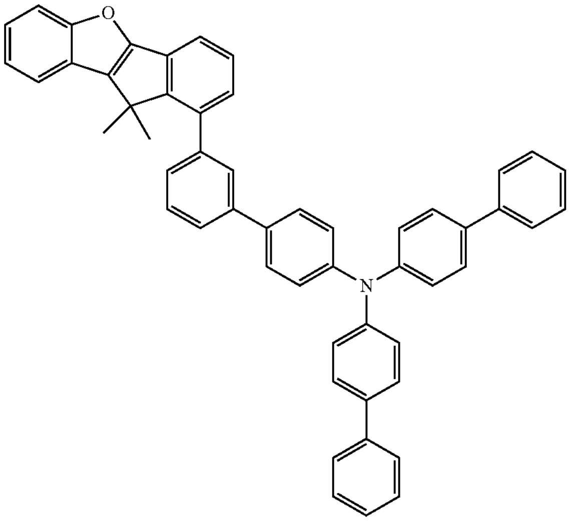
-continued
3-336
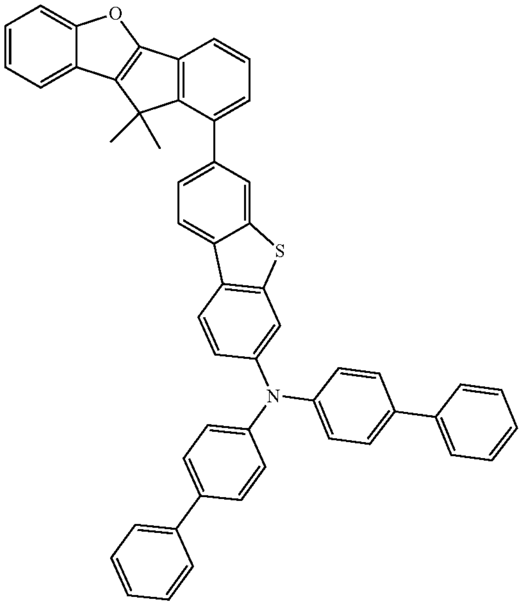
3-337
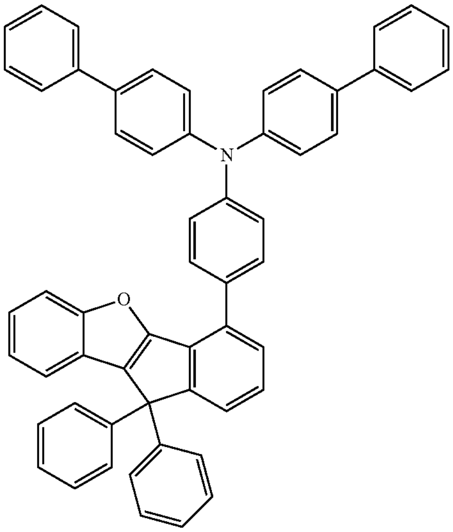

3-338
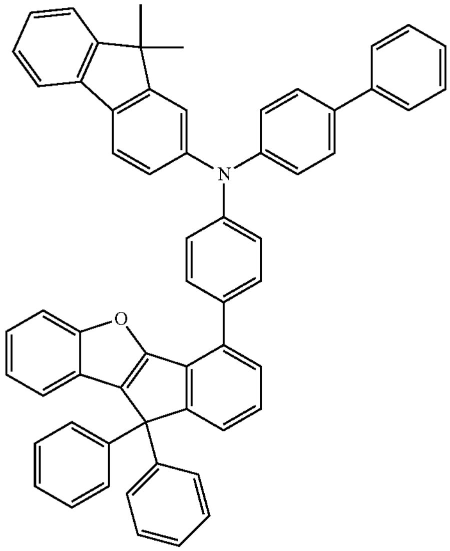
3-339
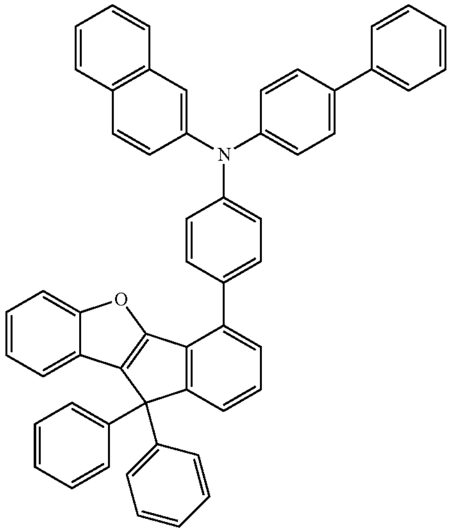
3-340
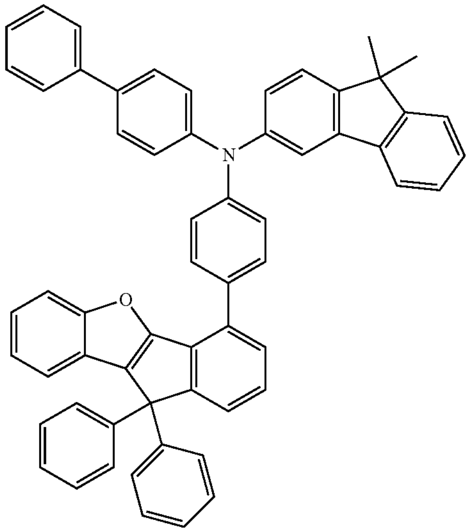
3-341
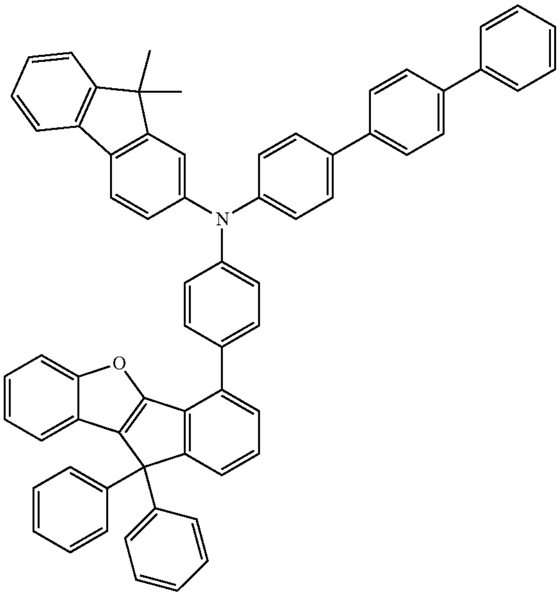
3-342
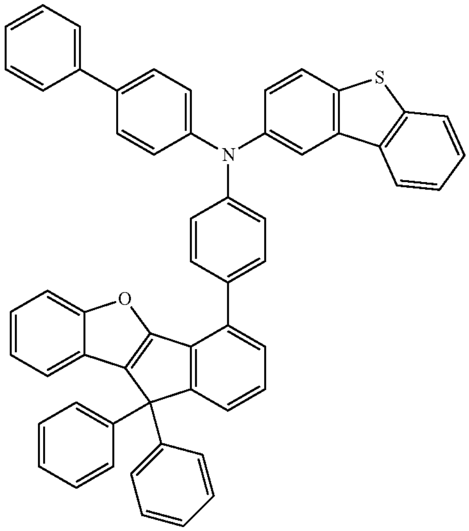

3-343
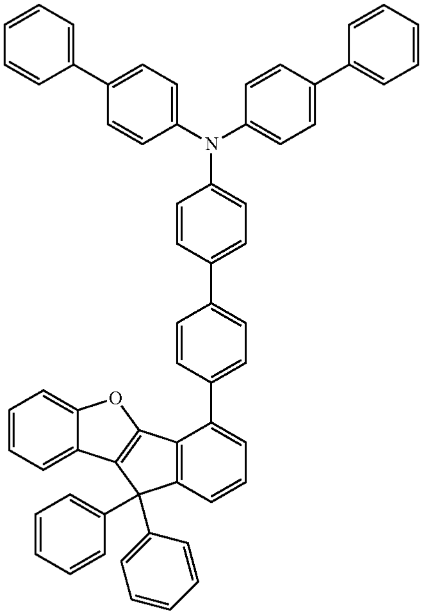
3-344
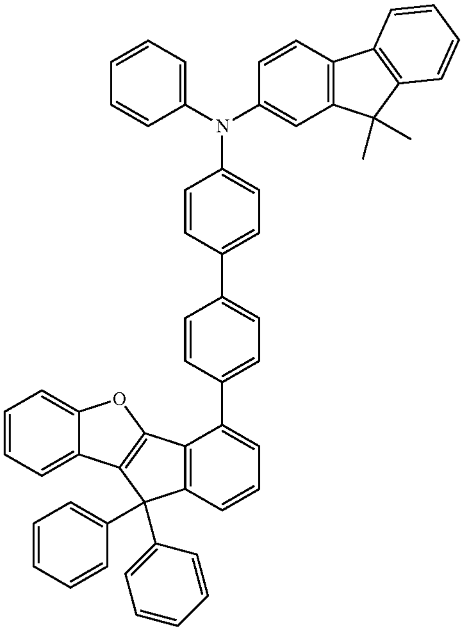
3-345
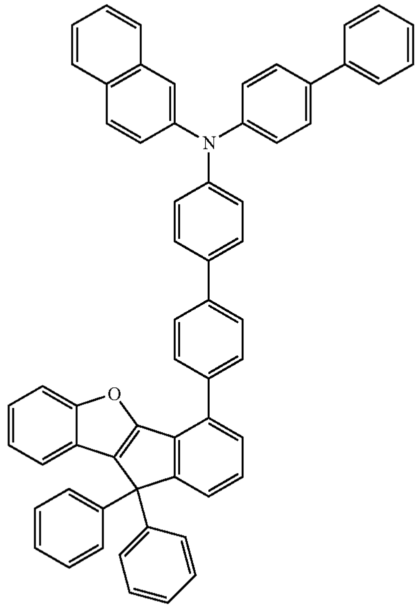
3-346
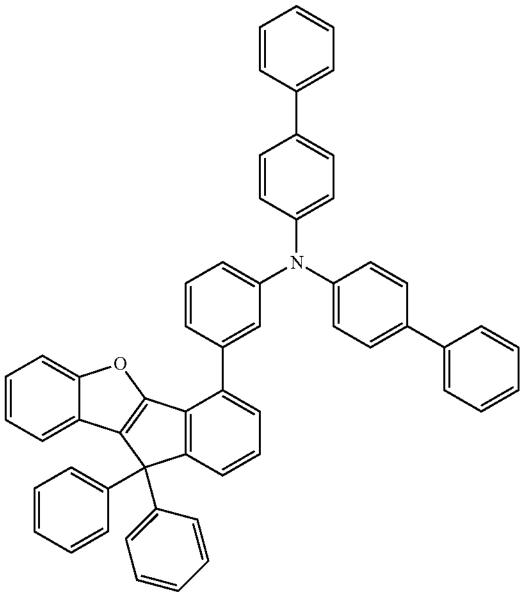

-continued
3-347
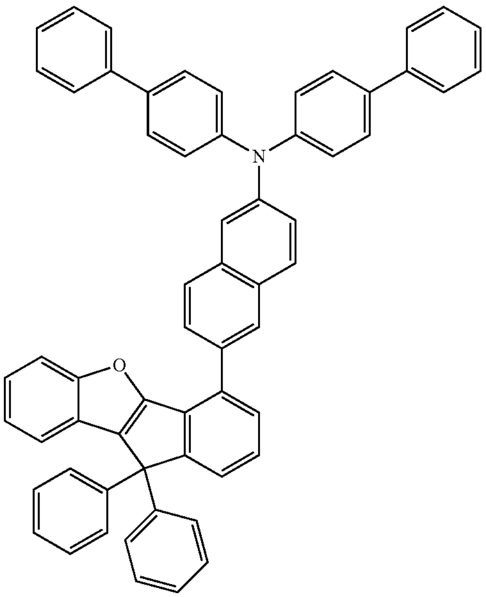
3-348
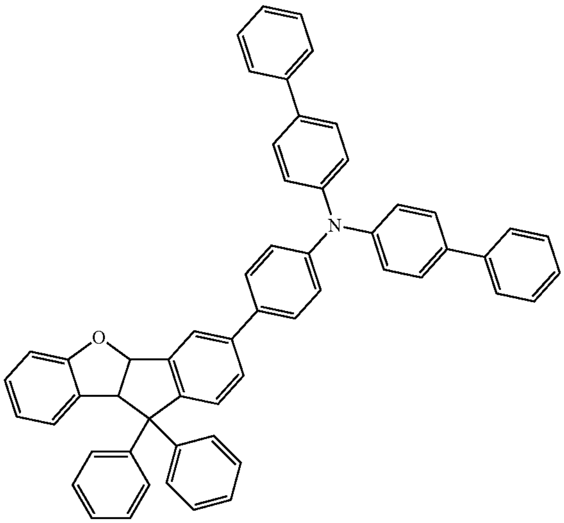
3-349
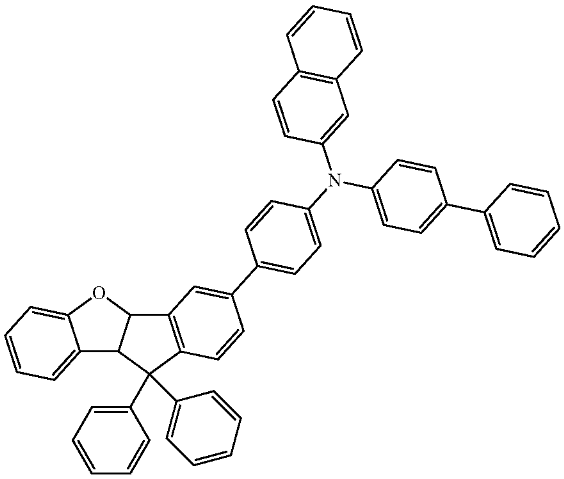
-continued
3-350
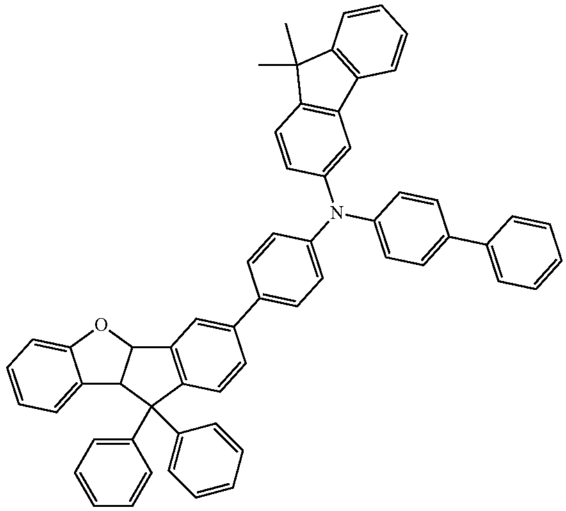
3-351
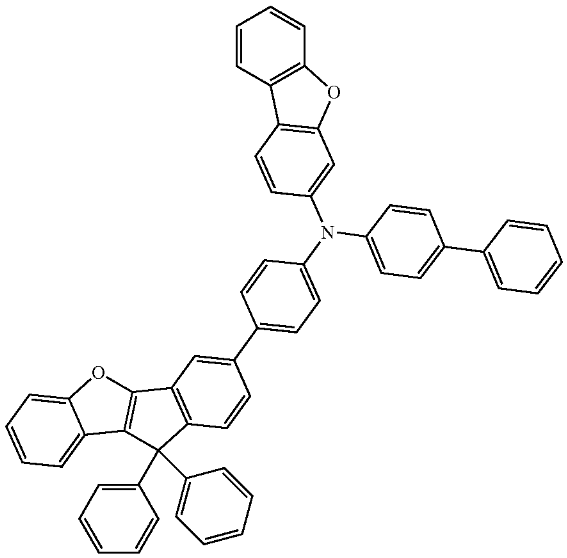

-continued
3-352
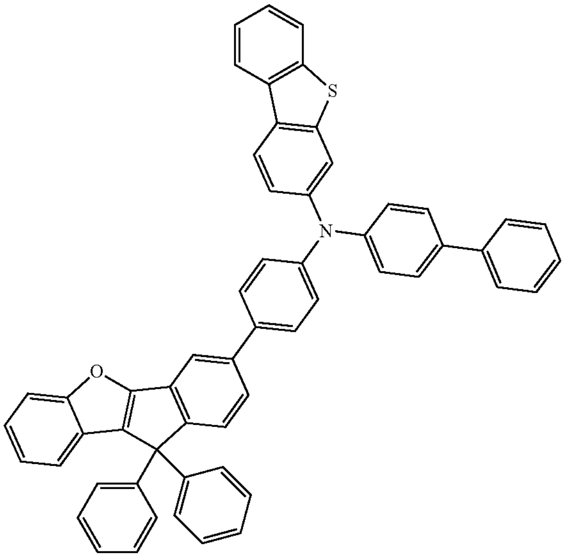
3-353
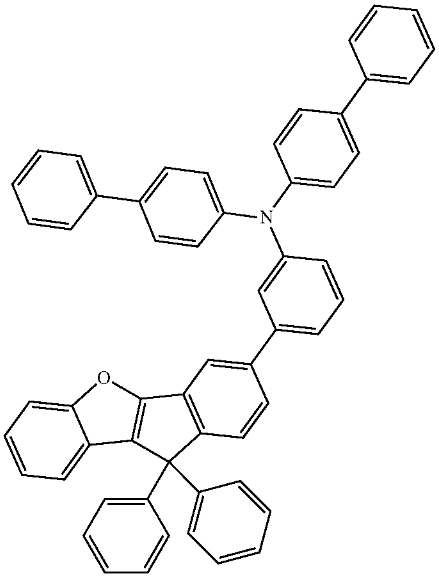
-continued
3-354
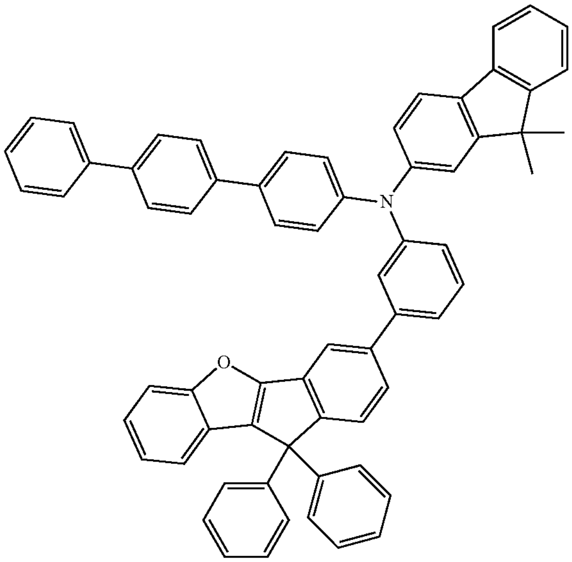
3-355
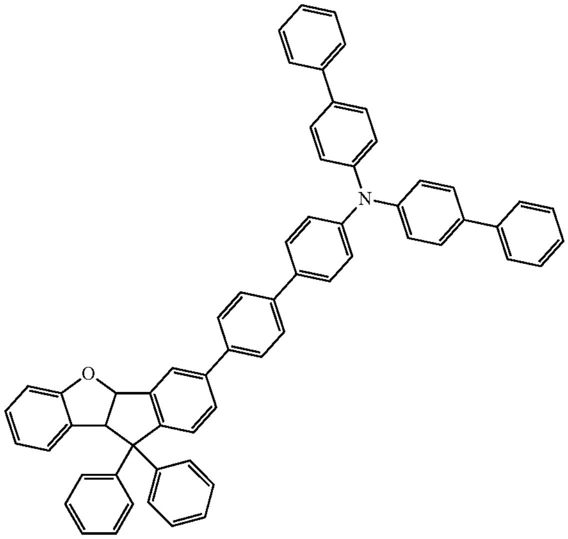
3-356
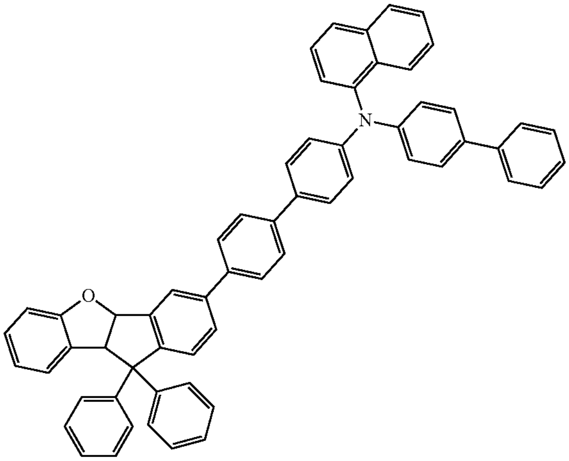

-continued
3-357
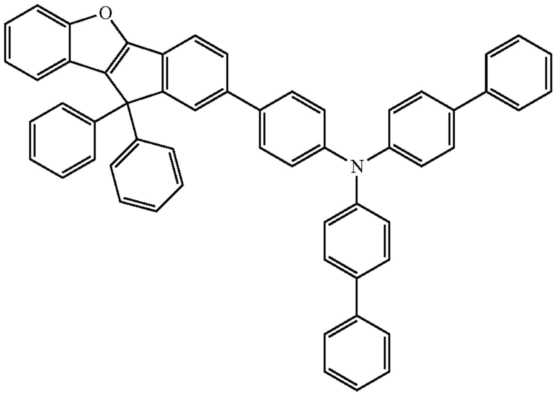
3-358
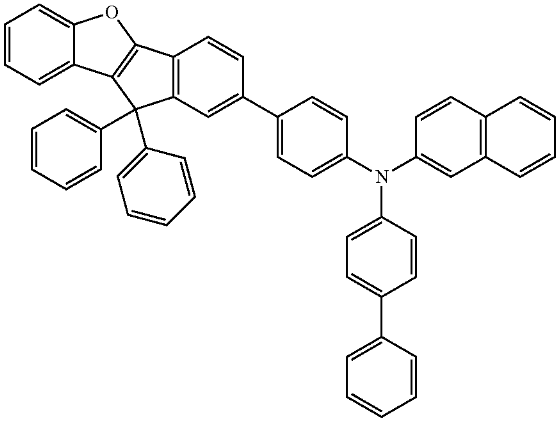
3-359
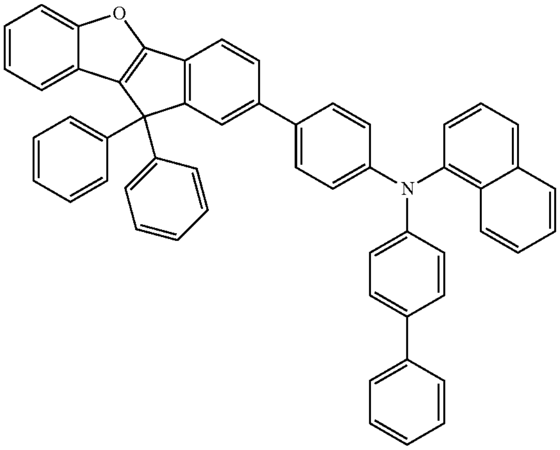
-continued
3-360
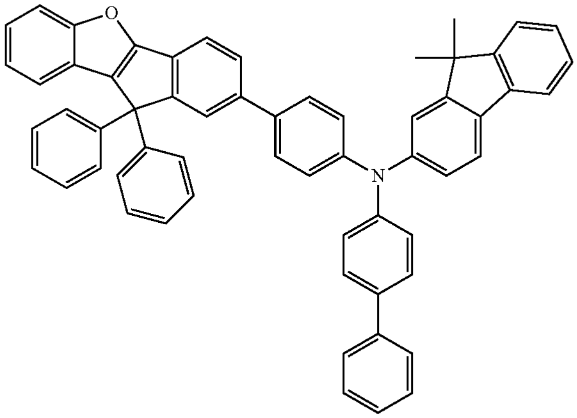
3-361
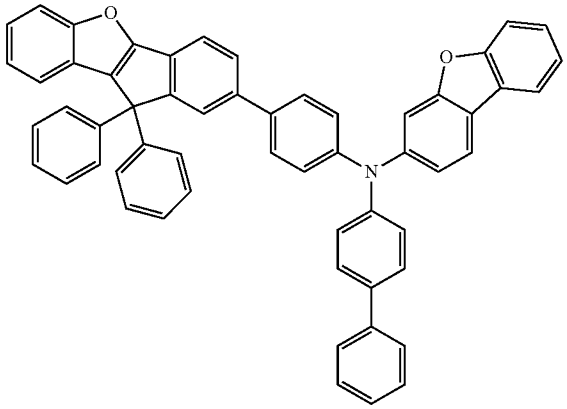
3-362
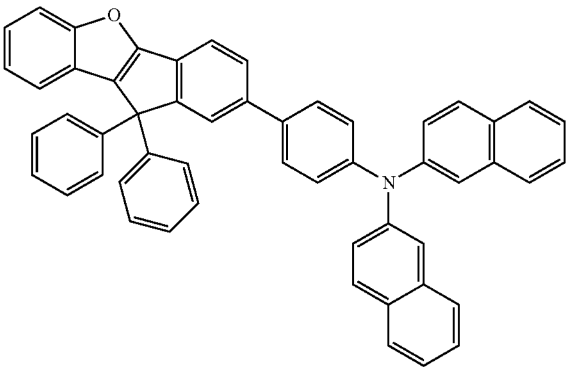

-continued
3-363
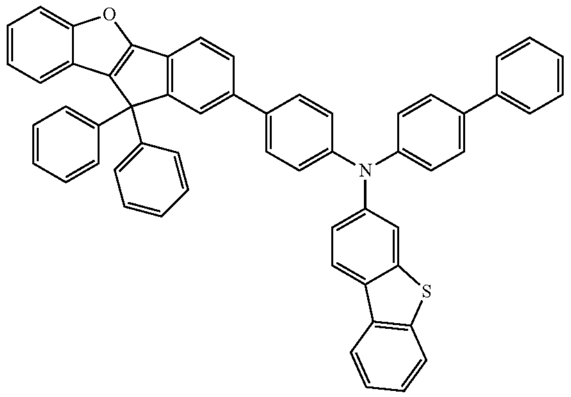
3-364
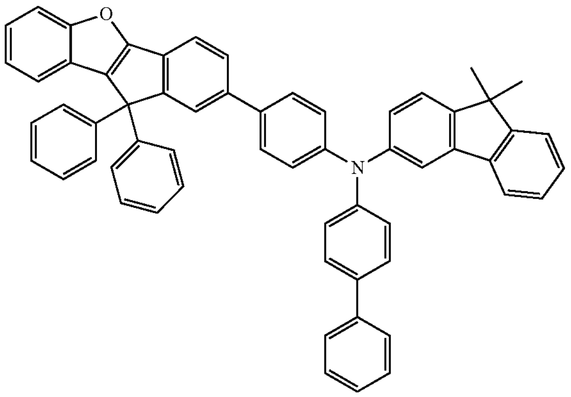
3-365
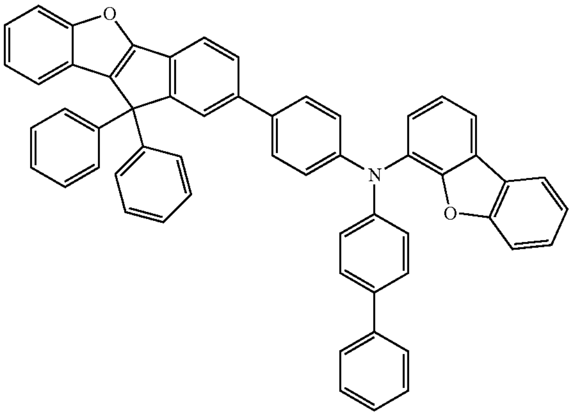
-continued
3-366
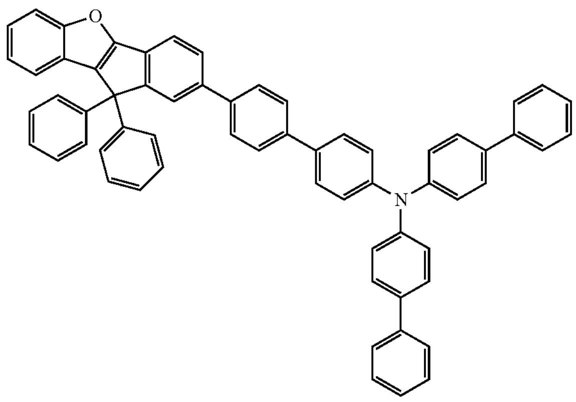
3-367
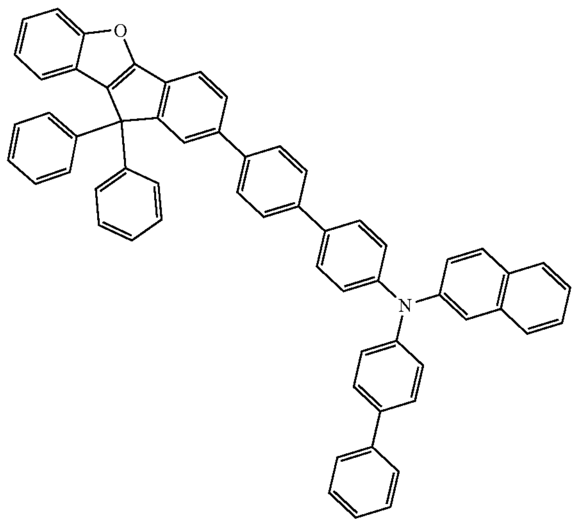
3-368
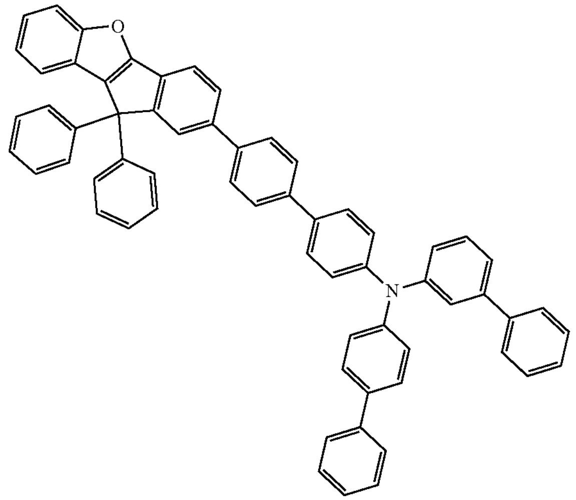

-continued
3-369
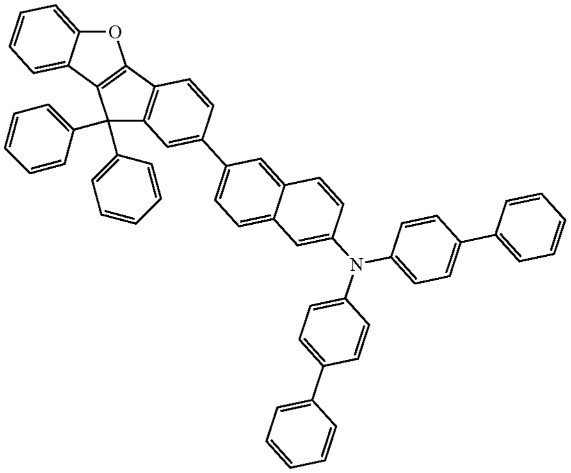
3-370
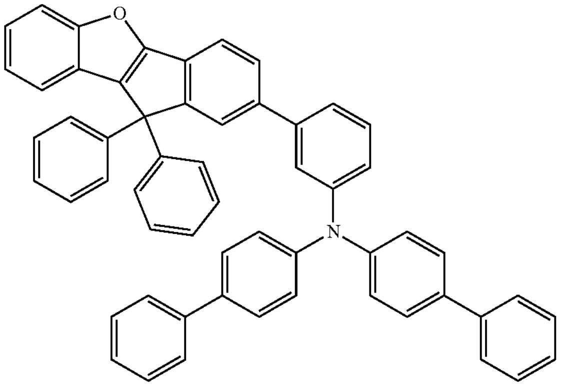
3-371
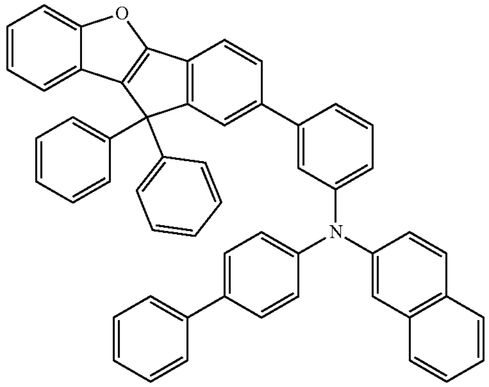
-continued
3-372
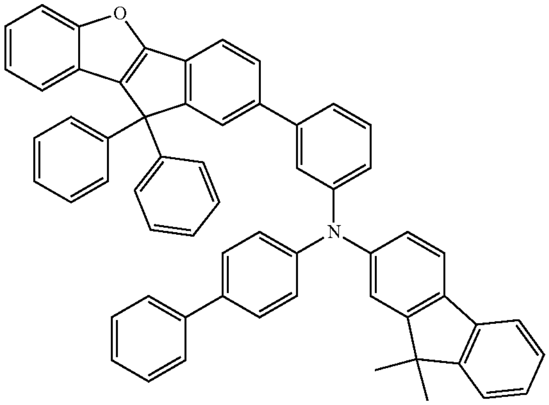
3-373
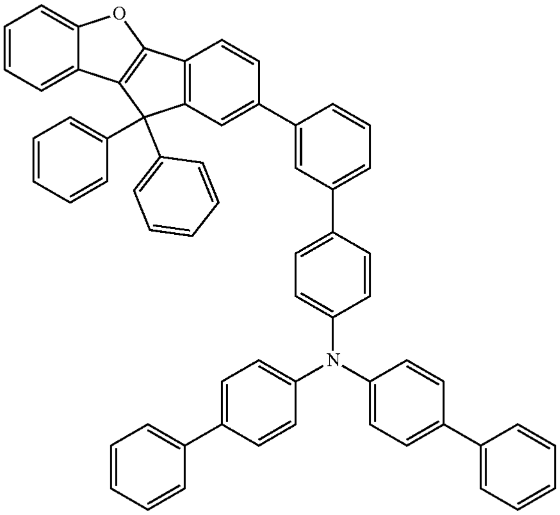
3-374
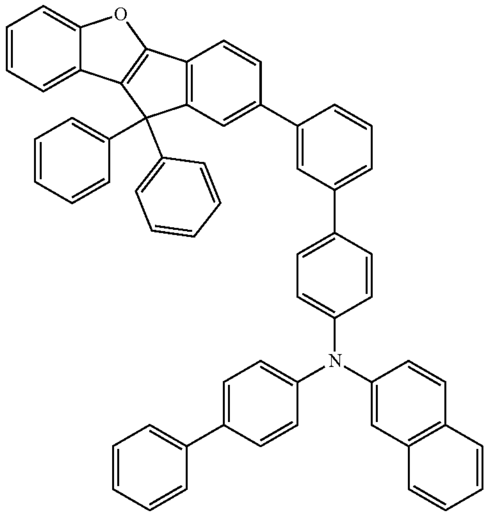

-continued
3-375
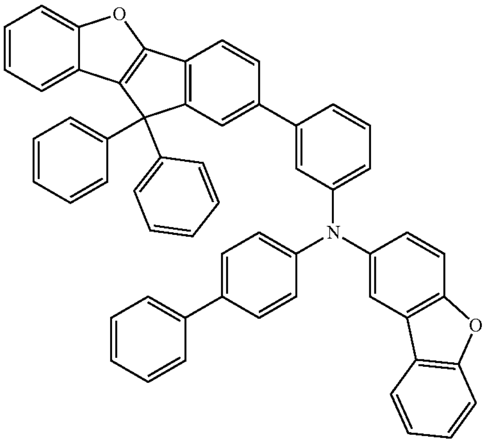
3-376
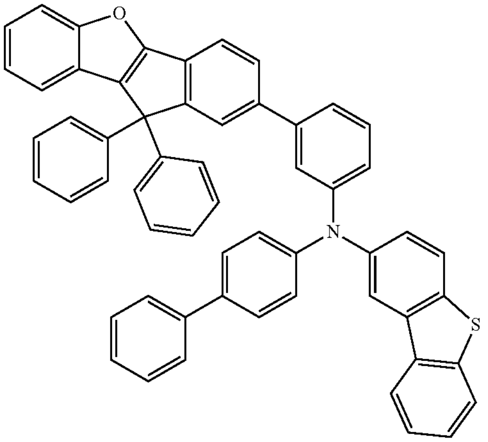
3-377
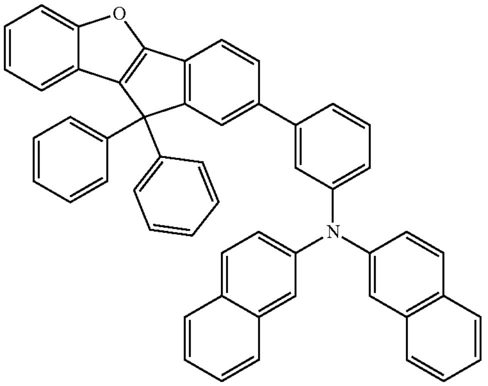
-continued
3-378
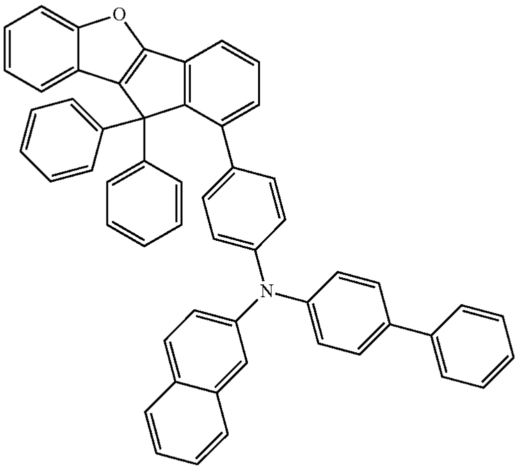
3-379
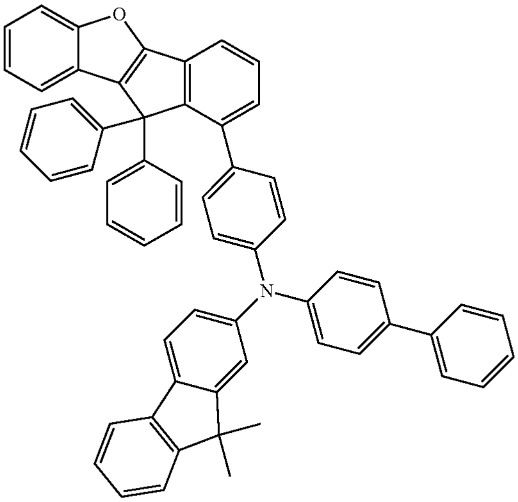
3-380
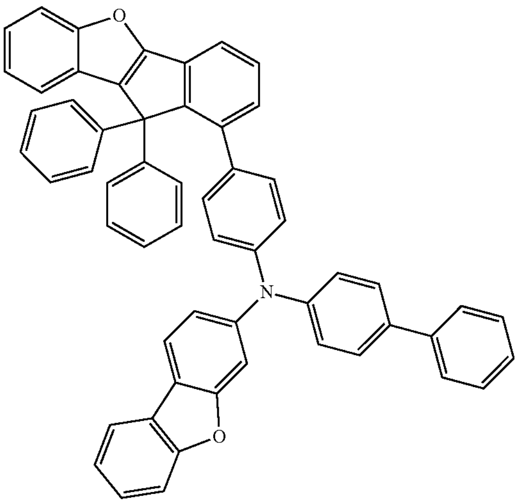

-continued 3-381

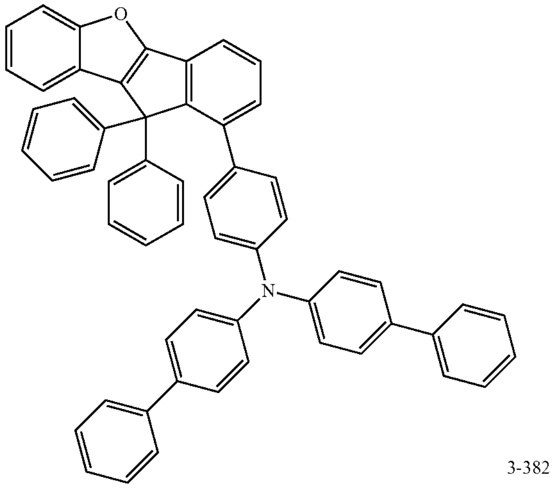

3-382

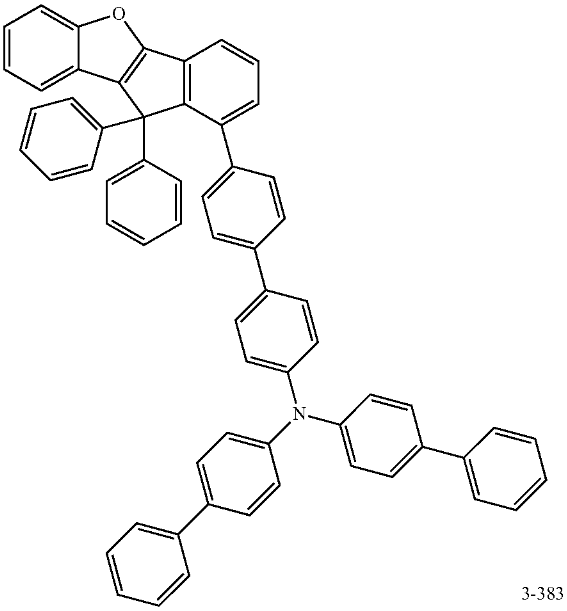

3-383

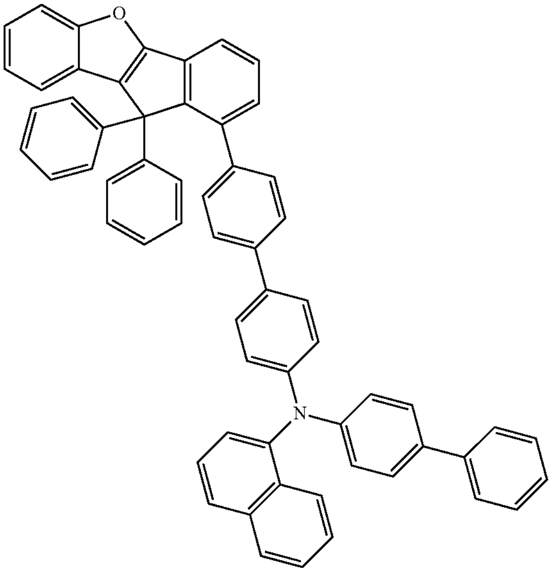

-continued 3-384

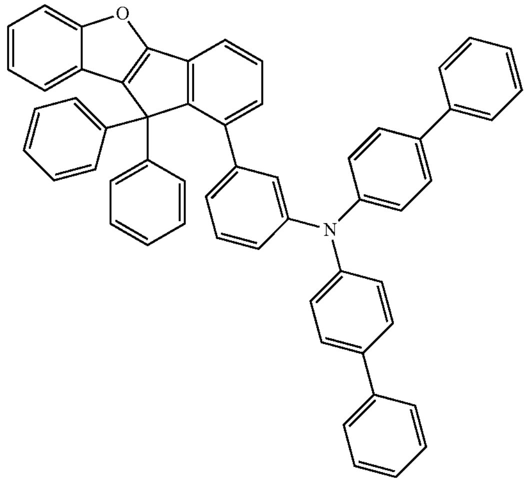

In one embodiment of the present specification, the organic material layer may include Compound (A) of Chemical Formula 1 and Compound (B) represented by Chemical Formula 4.

In one embodiment of the present specification, L3 to L6 may be each independently a direct bond; a substituted or unsubstituted arylene group having 6 to 40 carbon atoms; or a substituted or unsubstituted heteroarylene group having 2 to 40 carbon atoms.

In one embodiment of the present specification, L3 to L6 may be each independently a direct bond; or a substituted or unsubstituted arylene group having 6 to 40 carbon atoms.

In one embodiment of the present specification, L3 to L6 may be each independently a direct bond; a substituted or unsubstituted phenylene group; a substituted or unsubstituted biphenylene group; or a substituted or unsubstituted anthracenylene group.

In one embodiment of the present specification, L4 may be a direct bond; a substituted or unsubstituted phenylene group; a substituted or unsubstituted biphenylene group; or a substituted or unsubstituted anthracenylene group.

In one embodiment of the present specification, L3 may be a direct bond; or a substituted or unsubstituted phenylene group.

In one embodiment of the present specification, L5 and L6 may be each independently a direct bond; or a substituted or unsubstituted phenylene group.

In one embodiment of the present specification, A3 may be a substituted or unsubstituted aryl group having 6 to 60 carbon atoms; or a substituted or unsubstituted heteroaryl group having 2 to 60 carbon atoms.

In one embodiment of the present specification, A3 may be a substituted or unsubstituted aryl group having 6 to 40 carbon atoms; or a substituted or unsubstituted heteroaryl group having 2 to 40 carbon atoms.

In one embodiment of the present specification, A3 may be a substituted or unsubstituted phenyl group; a substituted or unsubstituted biphenyl group; a substituted or unsubstituted terphenyl group; a substituted or unsubstituted naphthyl group; a substituted or unsubstituted fluorenyl group; a substituted or unsubstituted dibenzofuran group; or a substituted or unsubstituted dibenzothiophene group.

In one embodiment of the present specification, A3 may be a phenyl group; a biphenyl group; a terphenyl group; a naphthyl group; a fluorenyl group unsubstituted or substituted with an alkyl group or an aryl group; 9,9'-spirobi[fluorene]; spiro[fluorene-9,9'-xanthene]; a dibenzofuran group; or a dibenzothiophene group.

In one embodiment of the present specification, A4 may be a cyano group; a substituted or unsubstituted aryl group having 6 to 60 carbon atoms; or a substituted or unsubstituted heteroaryl group having 2 to 60 carbon atoms.

In one embodiment of the present specification, A4 may be a cyano group; a substituted or unsubstituted phenyl group; a substituted or unsubstituted biphenyl group; a substituted or unsubstituted terphenyl group; a substituted or unsubstituted naphthyl group; a substituted or unsubstituted anthracenyl group; a substituted or unsubstituted triphenylene group; a substituted or unsubstituted phenanthrenyl group; a substituted or unsubstituted fluorenyl group; a substituted or unsubstituted carbazole group; a substituted or unsubstituted dibenzofuran group; or a substituted or unsubstituted dibenzothiophene group.

In one embodiment of the present specification, A4 may be a cyano group; a phenyl group unsubstituted or substituted with a cyano group or an aryl group; a biphenyl group; a terphenyl group; a naphthyl group unsubstituted or substituted with an aryl group; an anthracenyl group unsubstituted or substituted with an aryl group; a triphenylene group; a phenanthrenyl group; a fluorenyl group unsubstituted or substituted with an alkyl group or an aryl group; 9,9'-spirobi[fluorene]; spiro[fluorene-9,9'-xanthene]; a carbazole group unsubstituted or substituted with an aryl group; a dibenzofuran group; or a dibenzothiophene group.

When A4 is substituted or unsubstituted carbazole, a bonding position of the carbazole may be N of the pyrrole ring or C of the benzene ring.

In one embodiment of the present specification, A5 and A6 are each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms, or groups adjacent to each other may bond to form a substituted or unsubstituted ring.

In one embodiment of the present specification, A5 and A6 may be each independently a substituted or unsubstituted alkyl group having 1 to 30 carbon atoms; a substituted or unsubstituted aryl group having 6 to 30 carbon atoms; or a substituted or unsubstituted heteroaryl group having 2 to 30 carbon atoms.

In one embodiment of the present specification, A5 and A6 may be each independently a substituted or unsubstituted alkyl group having 1 to 30 carbon atoms; or a substituted or unsubstituted aryl group having 6 to 30 carbon atoms.

In one embodiment of the present specification, A5 and A6 may be each independently a substituted or unsubstituted alkyl group having 1 to 10 carbon atoms; or a substituted or unsubstituted aryl group having 6 to 20 carbon atoms.

In one embodiment of the present specification, A5 and A6 may be each independently a substituted or unsubstituted methyl group; or a substituted or unsubstituted phenyl group.

In another embodiment, A5 and A6 may bond to each other to form a substituted or unsubstituted ring.

In one embodiment of the present specification, A5 and A6 may bond to each other to form a substituted or unsubstituted aliphatic hydrocarbon ring; a substituted or unsubstituted aliphatic heteroring; a substituted or unsubstituted aromatic hydrocarbon ring; or a substituted or unsubstituted aromatic heteroring.

In one embodiment of the present specification, A5 and A6 may bond to each other to form

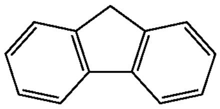

or

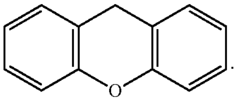

.

In one embodiment of the present specification, Chemical Formula 4 may be represented by the following Chemical Formula 4-1.

[Chemical Formula 4-1]

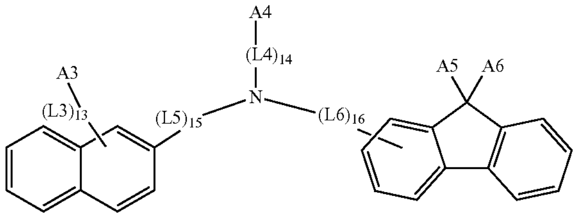

In Chemical Formula 4-1, each substituent has the same definition as in Chemical Formula 4.

In one embodiment of the present specification, Chemical Formula 4 may be represented by any one of the following compounds, but is not limited thereto.

4-1

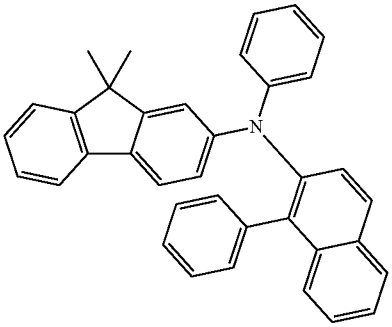

4-2

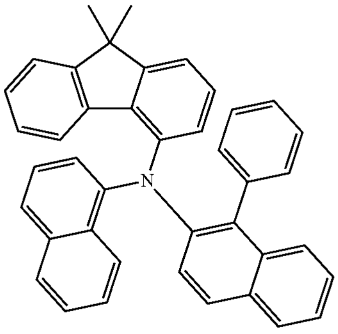

-continued
4-3
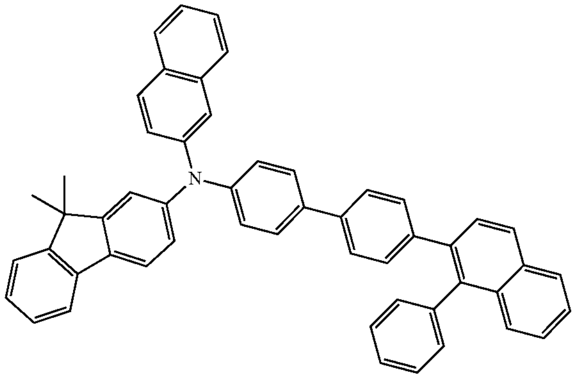
4-4
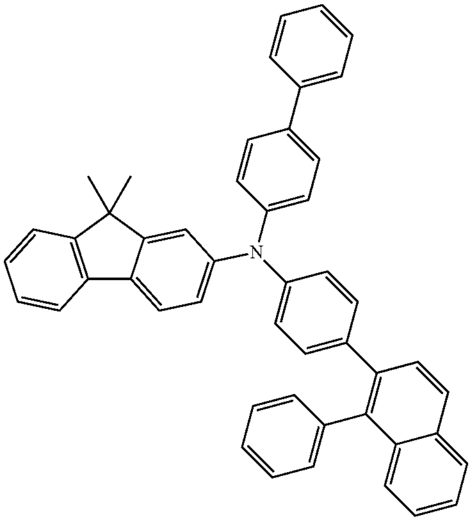
4-5
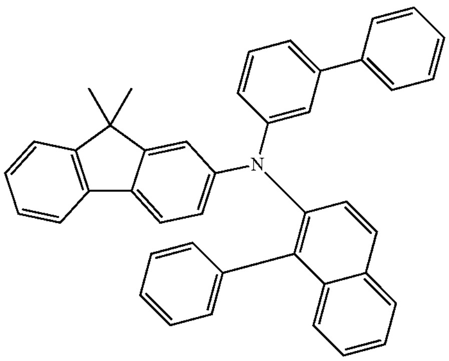
-continued
4-6
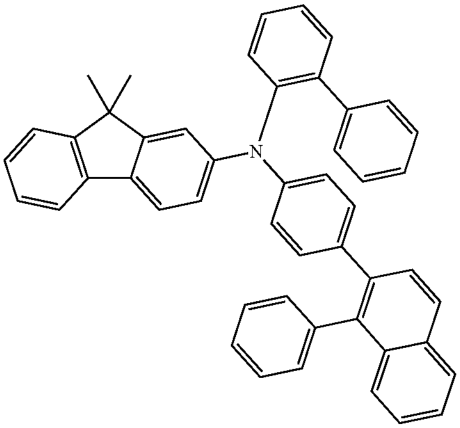
4-7
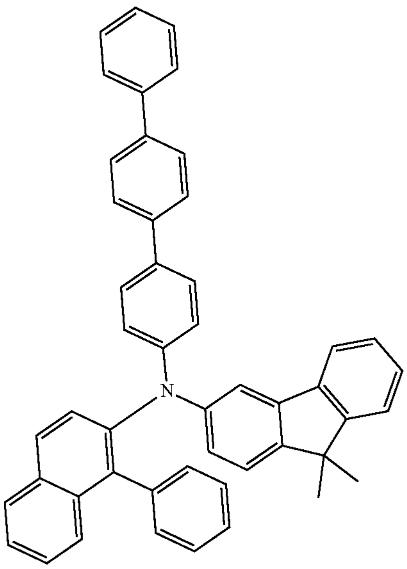
4-8
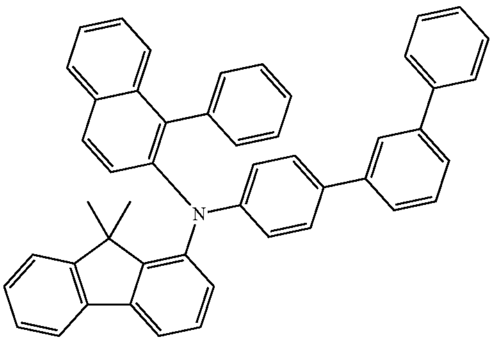

-continued
4-9
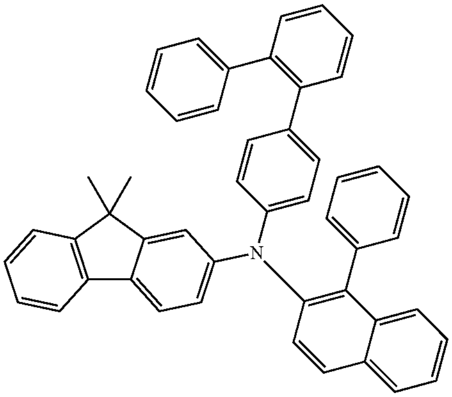
4-10
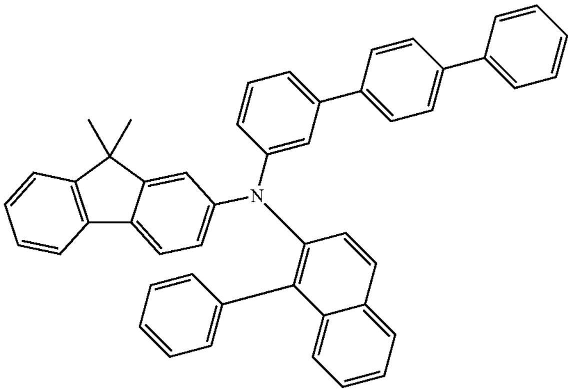
4-11
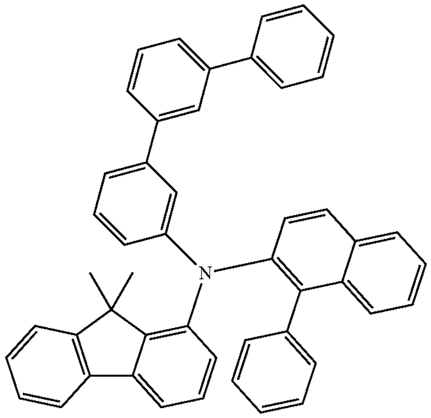
-continued
4-12
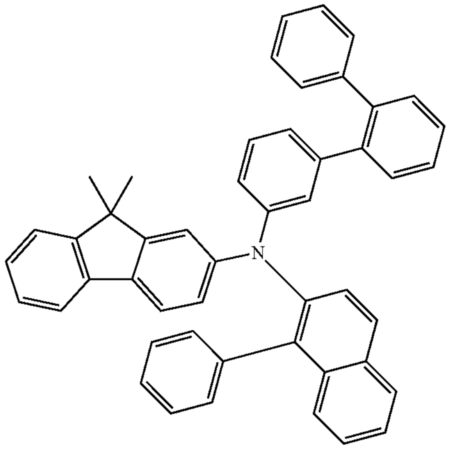
4-13
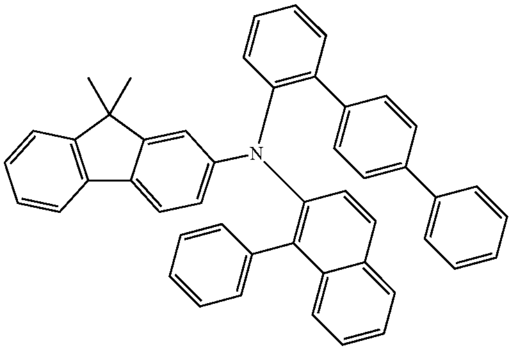
4-14
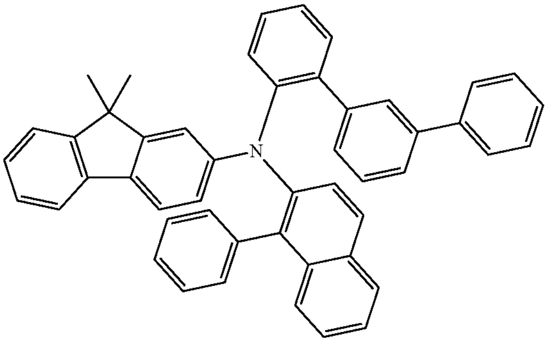
4-15
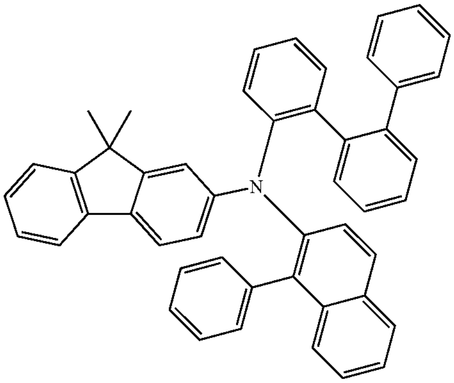

-continued
4-16
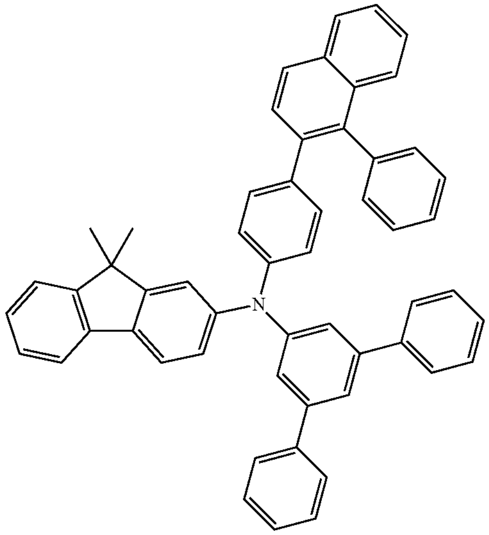
4-17
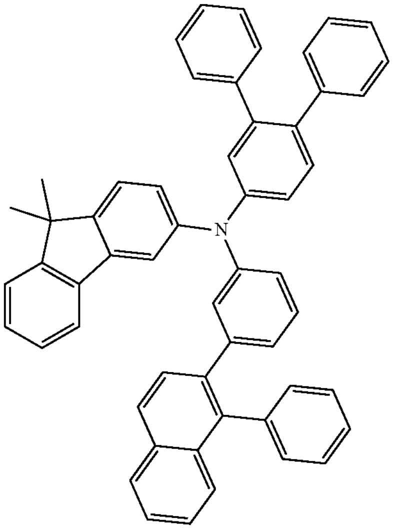
4-18
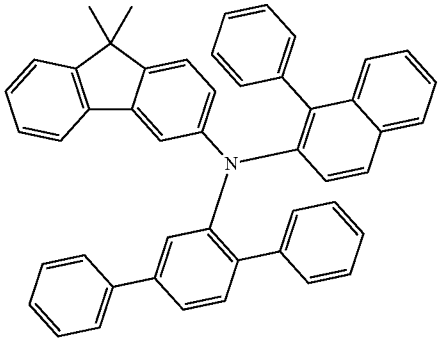
-continued
4-19
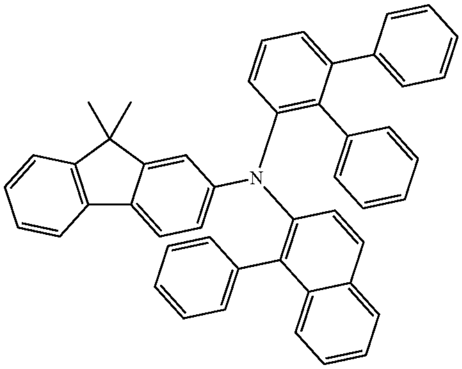
4-20
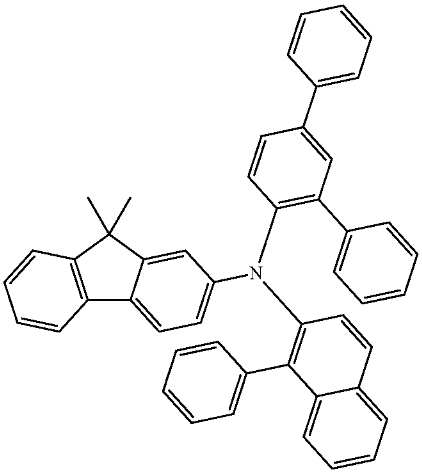
4-21
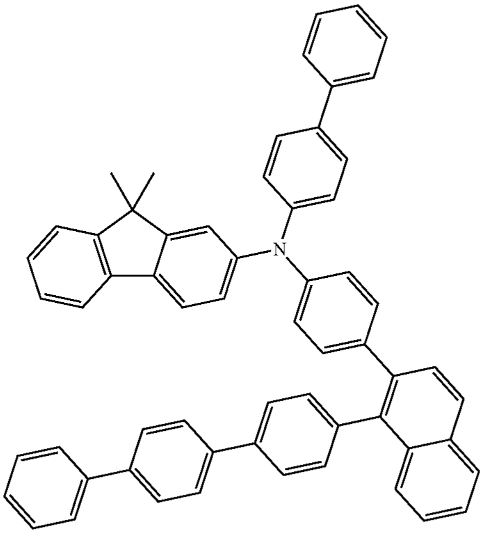

-continued
4-22
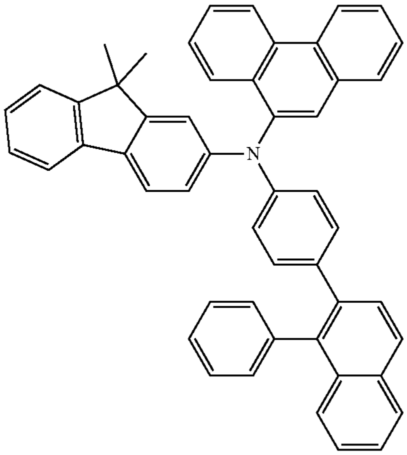
4-23
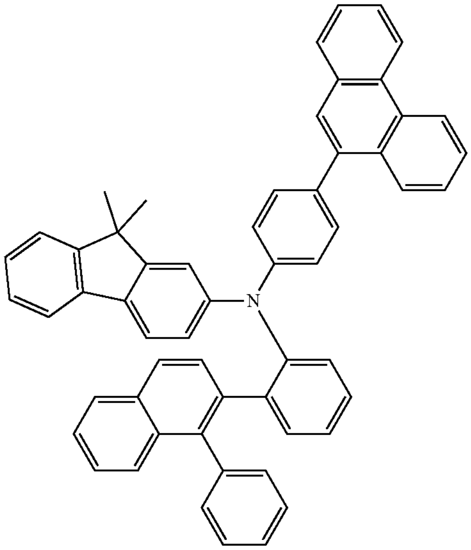
4-24
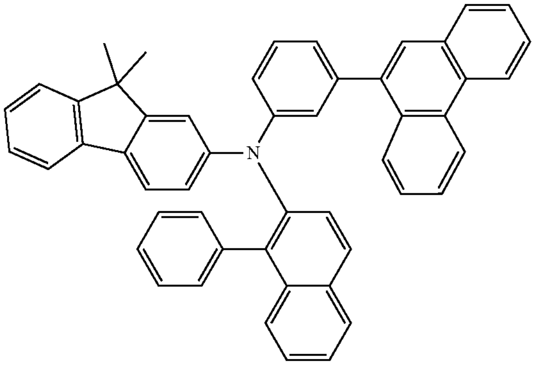
-continued
4-25
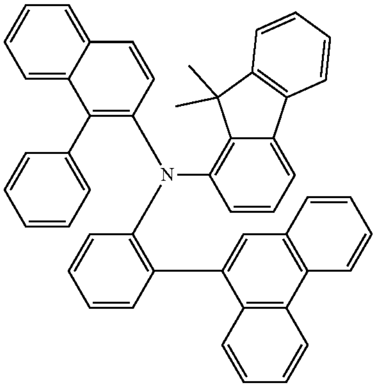
4-26
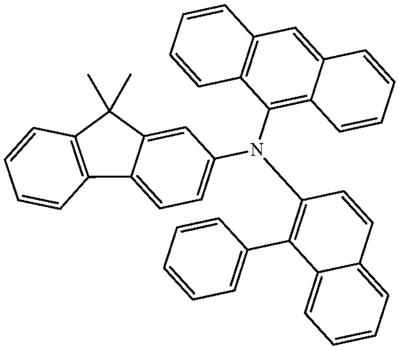
4-27
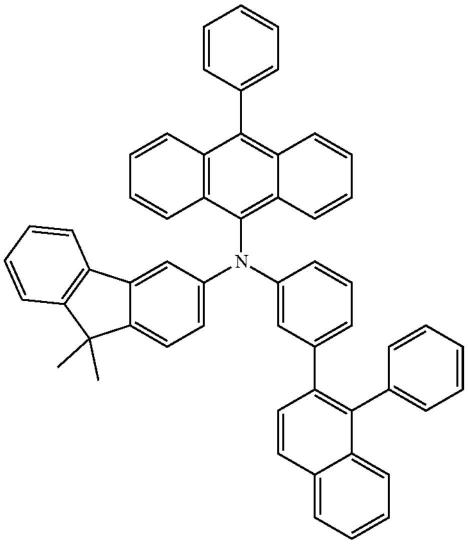

-continued
4-28
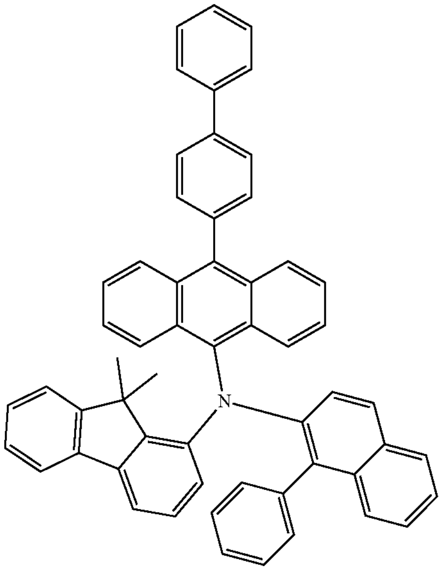
4-29
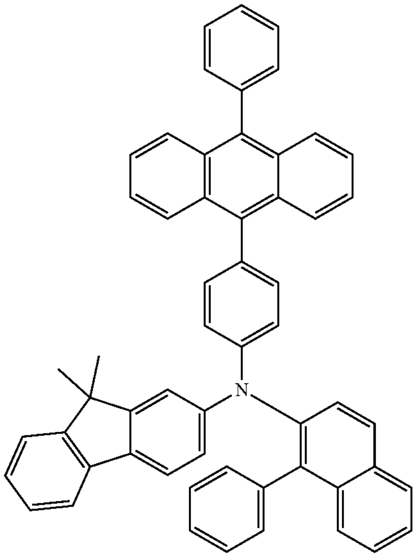
4-30
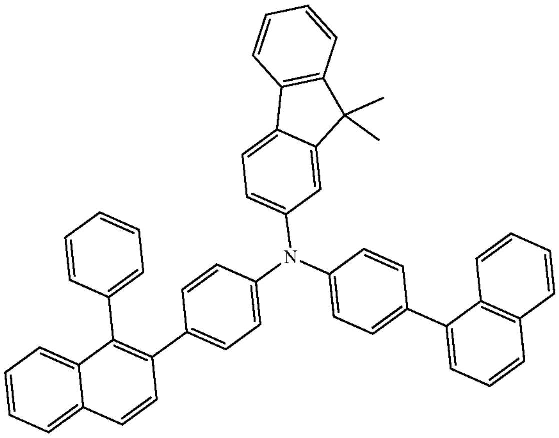
-continued
4-31
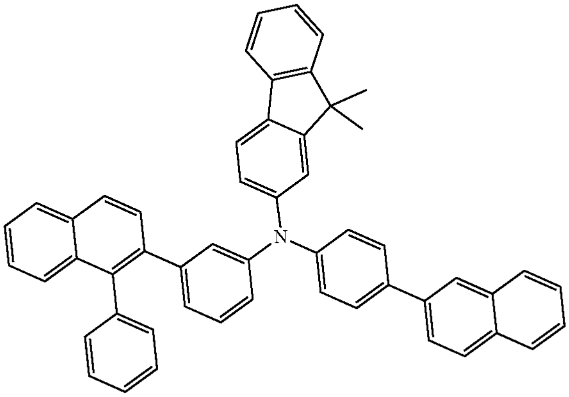
4-32
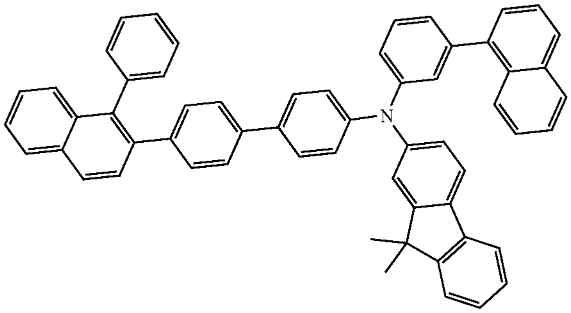
4-33
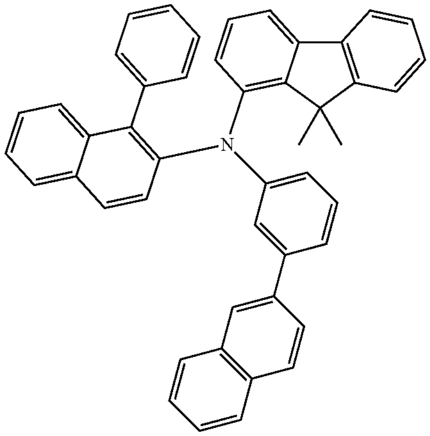
4-34
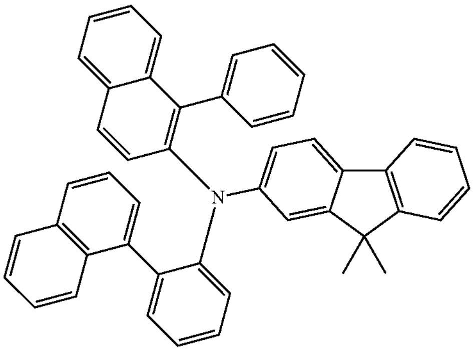

4-35
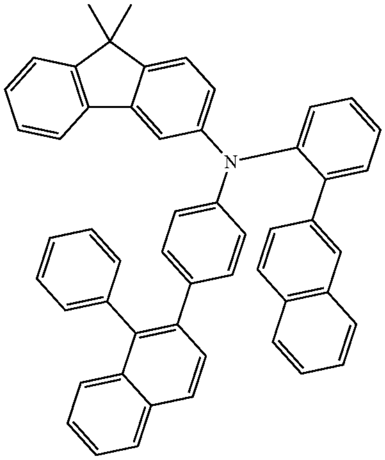
4-36
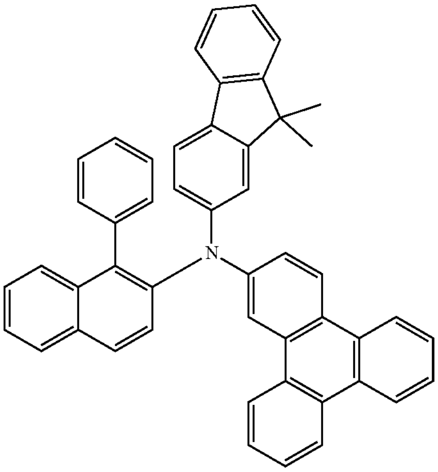
4-37
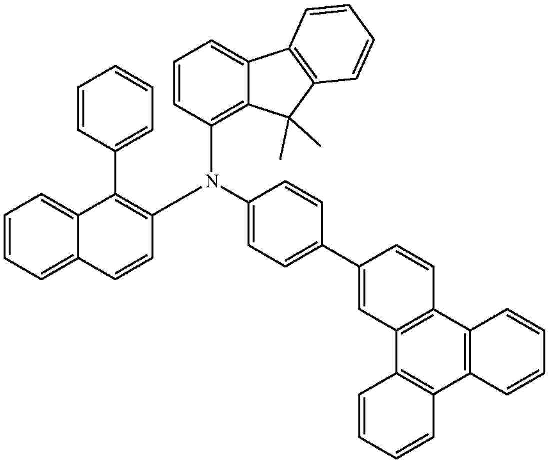
4-38
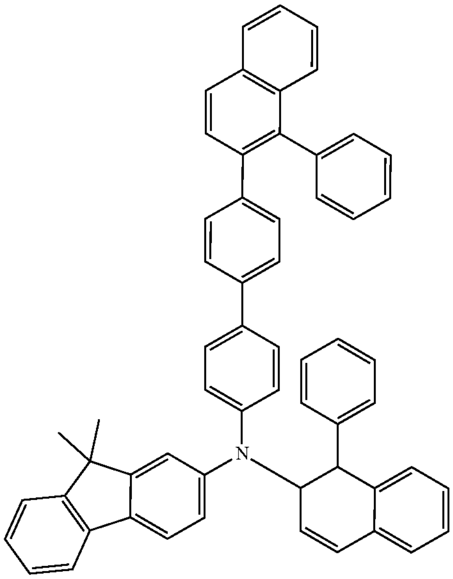
4-39
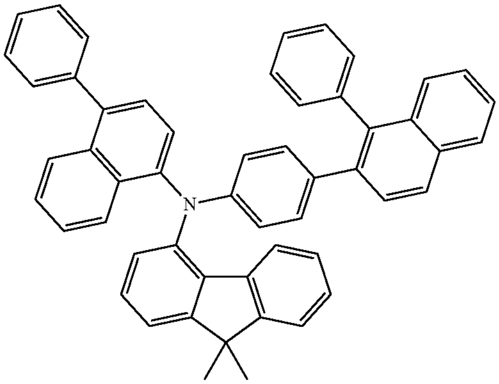
4-40
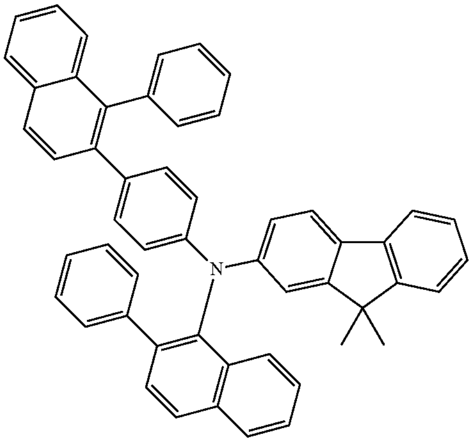

-continued
4-41
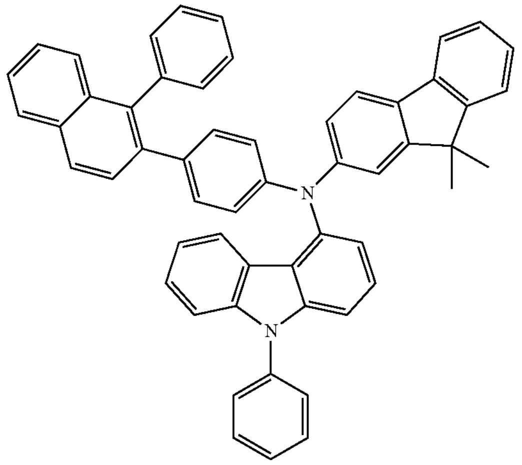
4-42
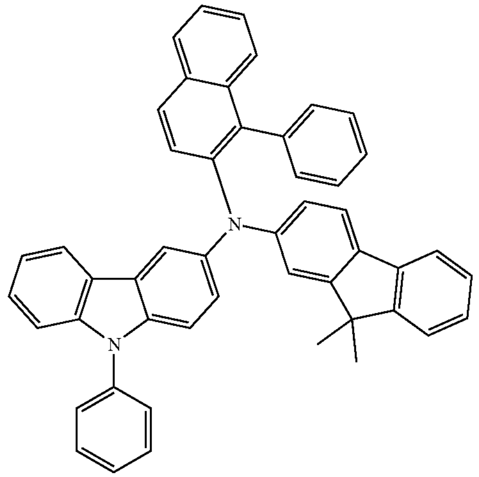
4-43
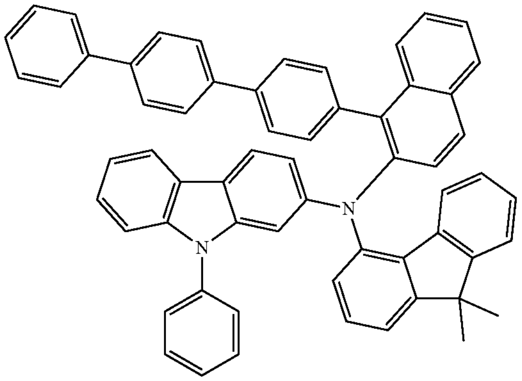
-continued
4-44
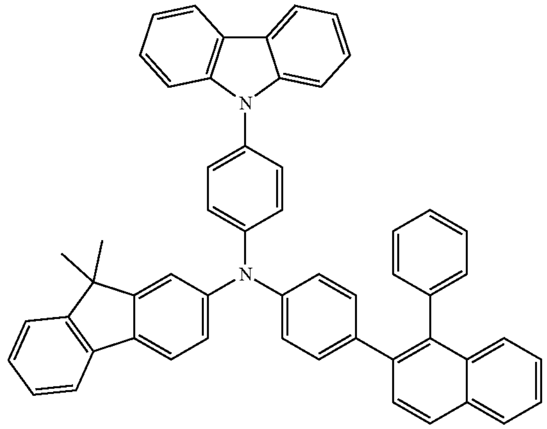
4-45
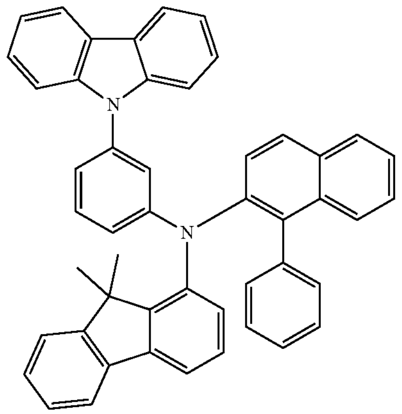
4-46
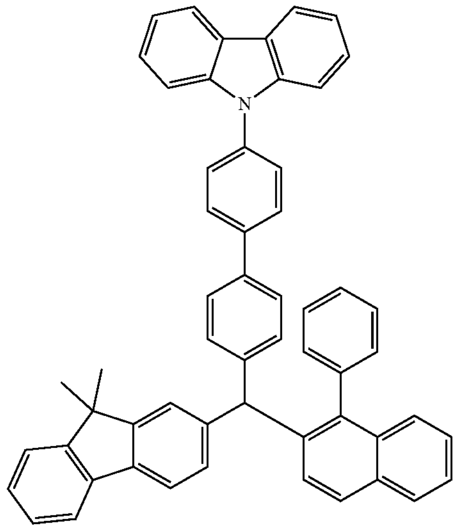

-continued
4-47
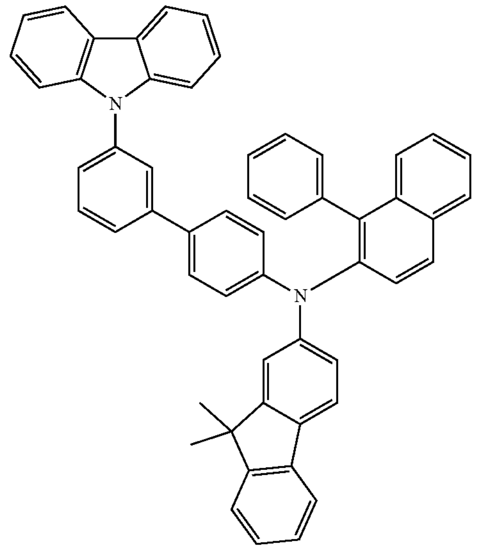
4-48
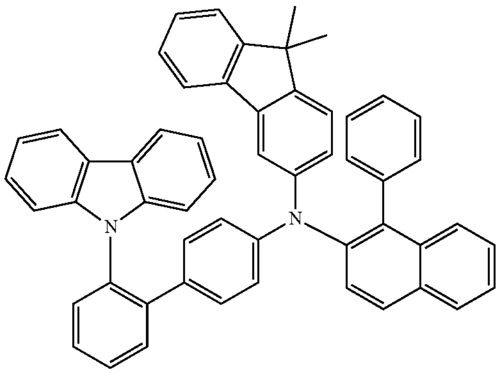
4-49
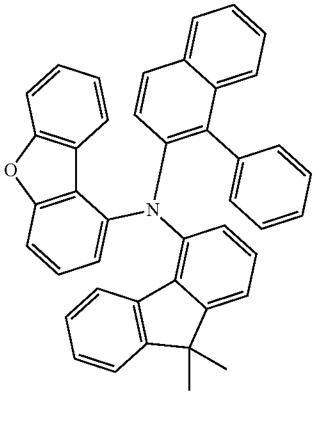
-continued
4-50
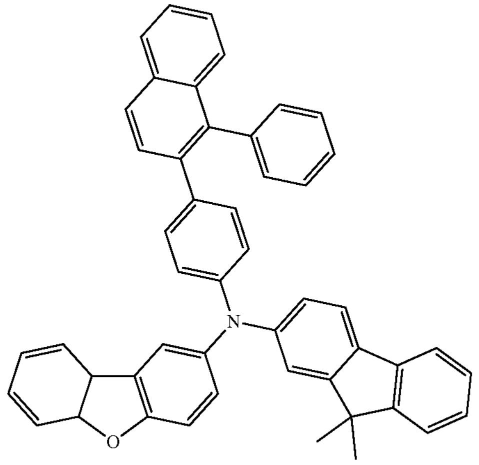
4-51
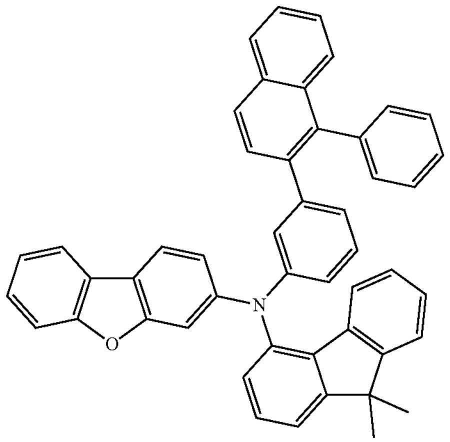
4-52
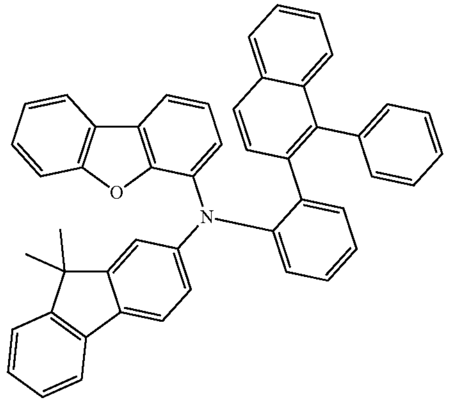

4-53
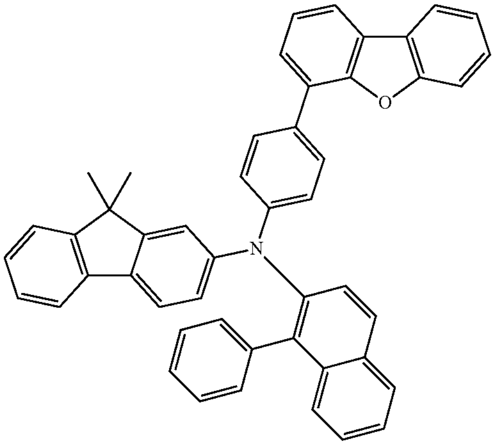
4-54
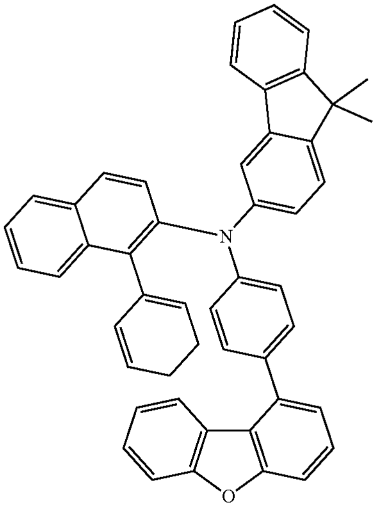
4-55
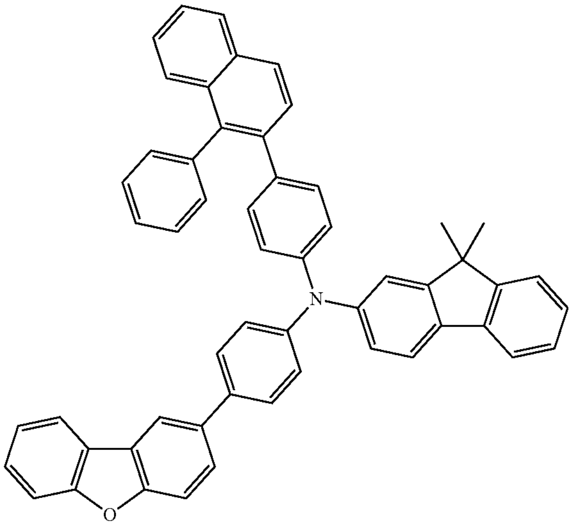
4-56
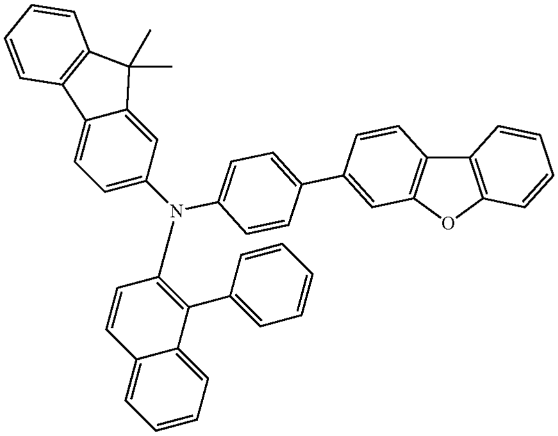
4-57
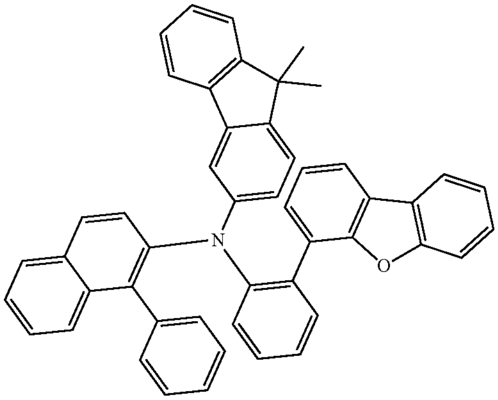
4-58
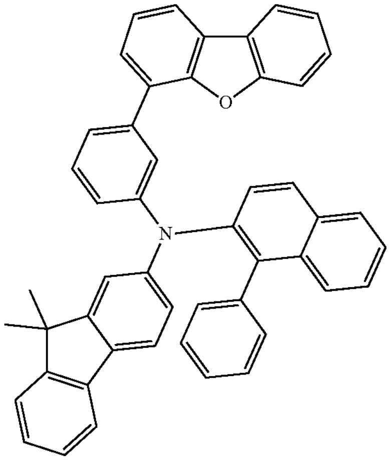

-continued
4-59
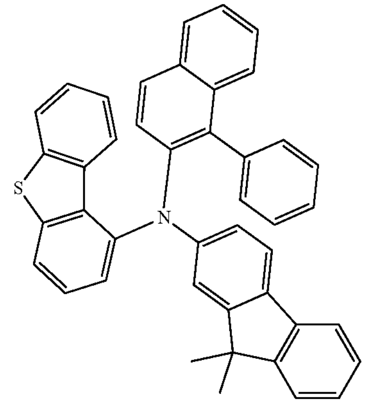
4-60
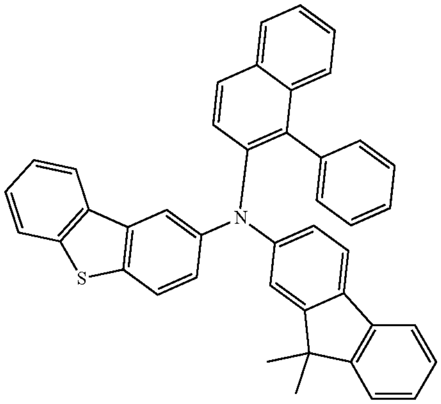
4-61
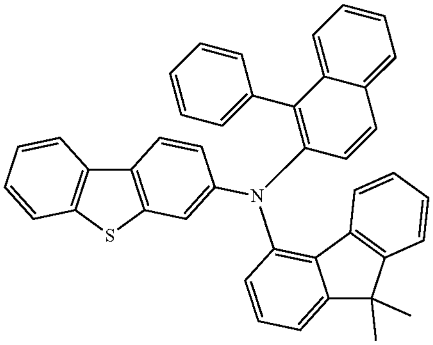
4-62
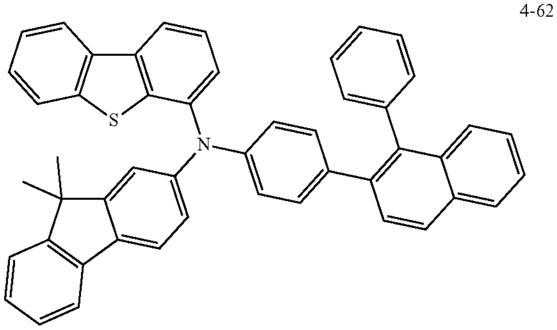
-continued
4-63
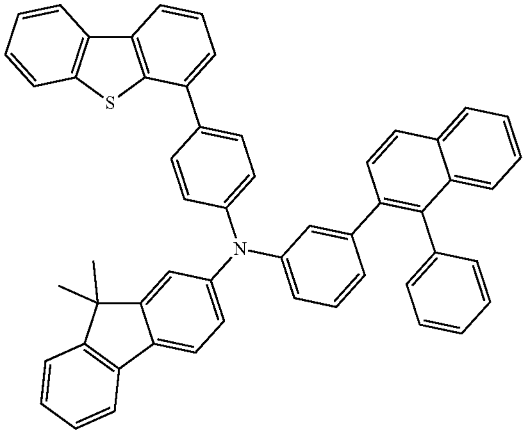
4-64
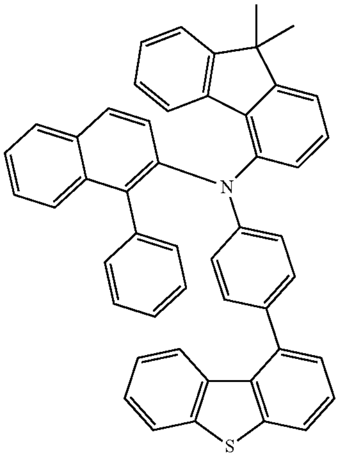
4-65
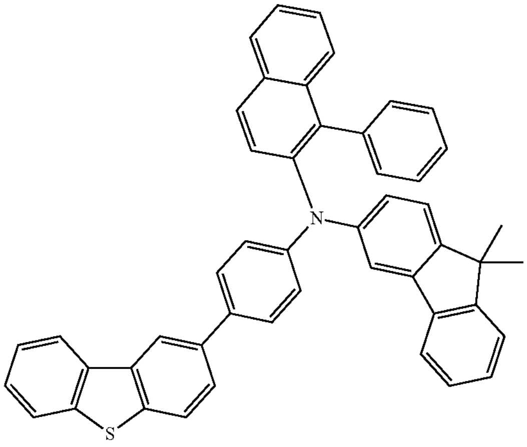

-continued
4-66
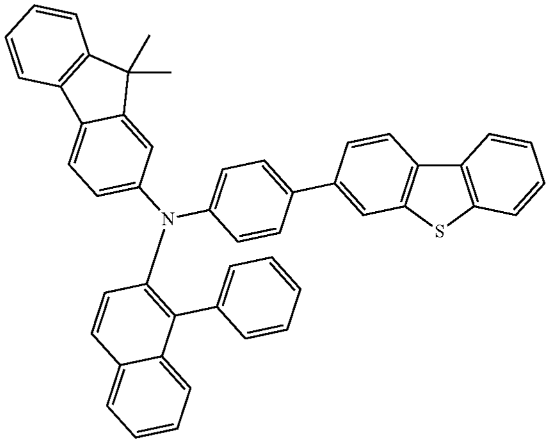
4-67
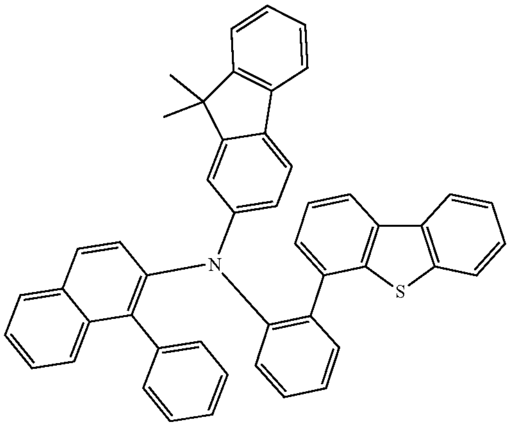
4-68
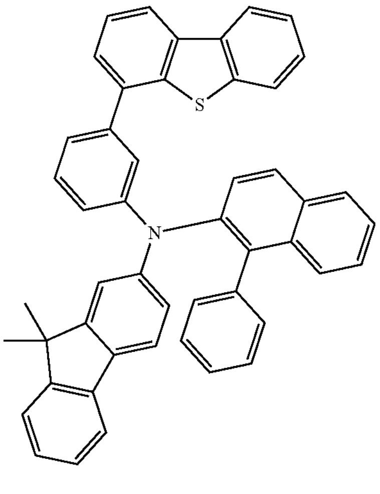
-continued
4-69
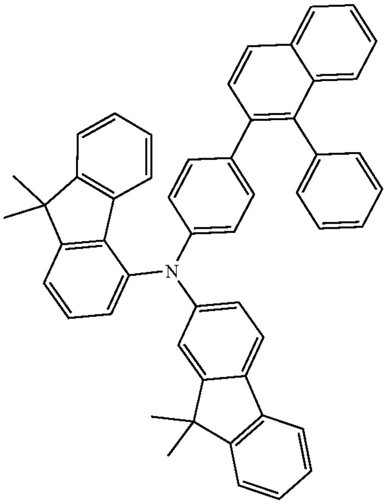
4-70
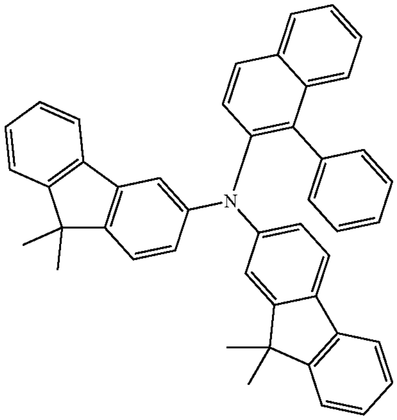
4-71
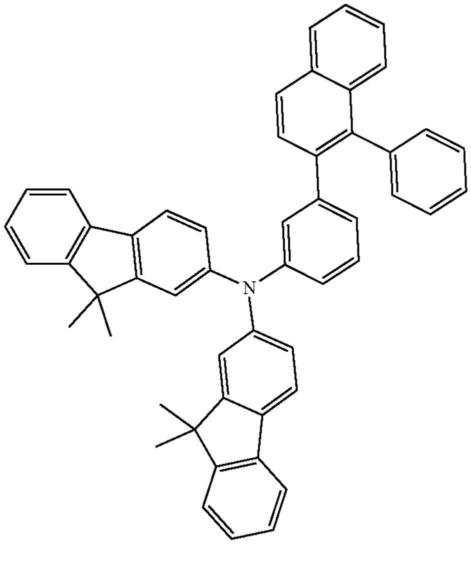

-continued
4-72
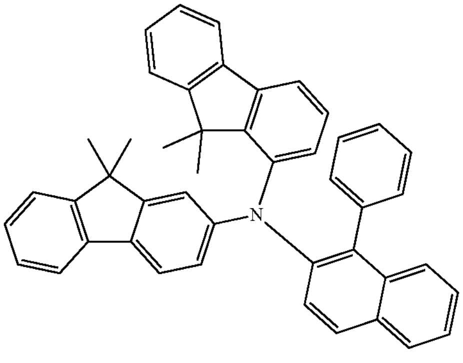
4-73
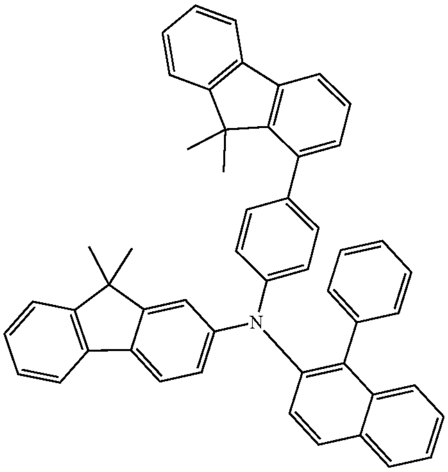
4-74
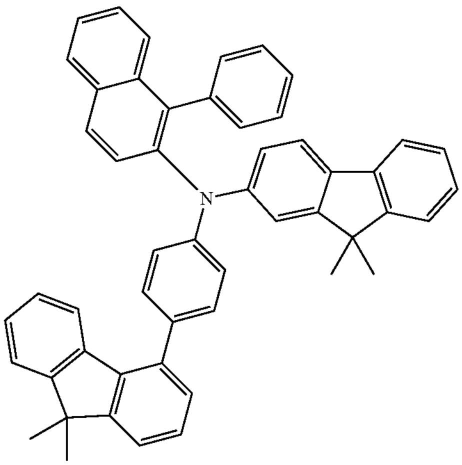
-continued
4-75
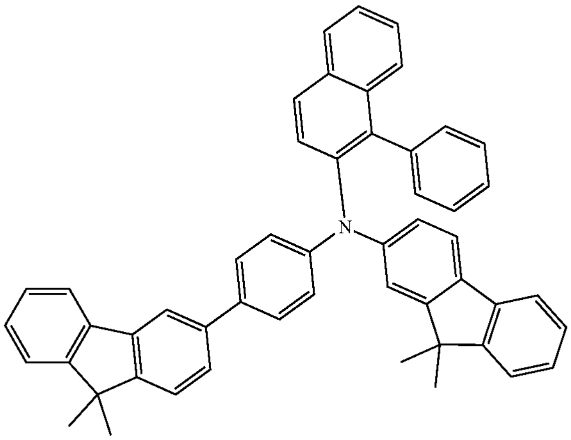
4-76
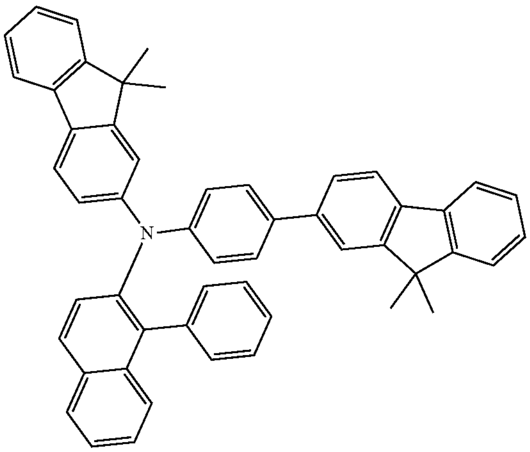
4-77
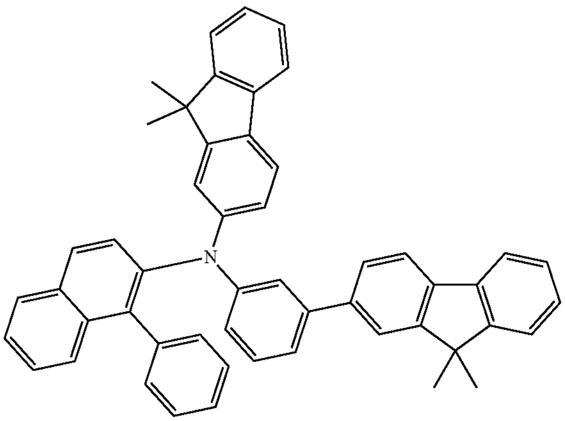

-continued
4-78
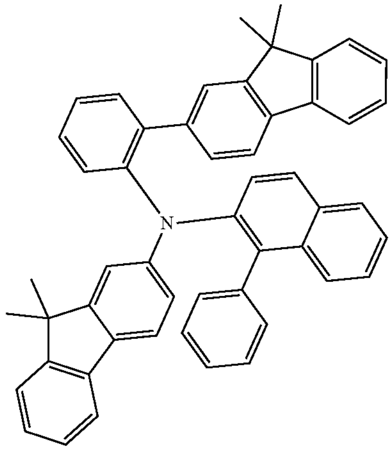
4-79
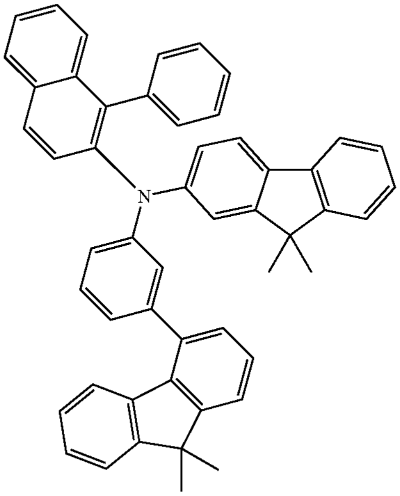
4-80
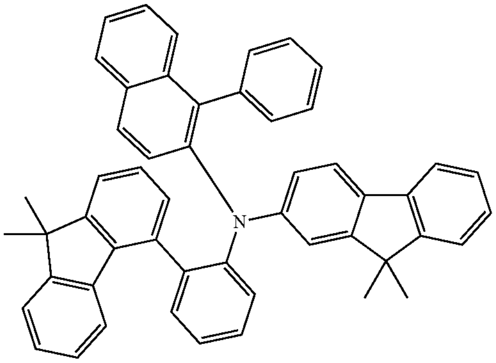
-continued
4-81
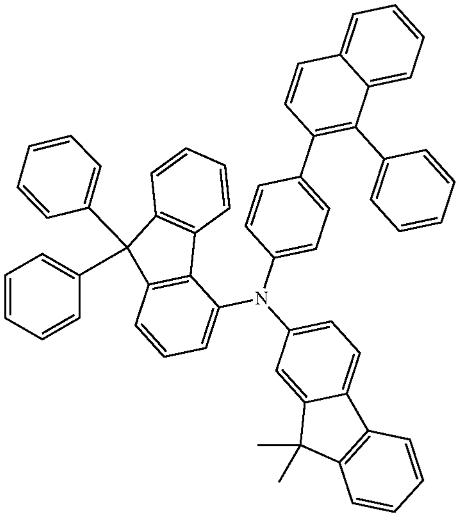
4-82
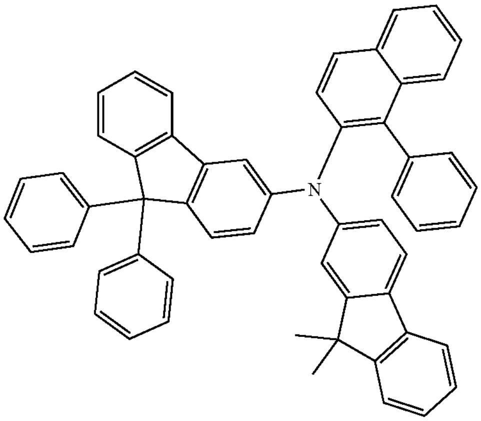
4-83
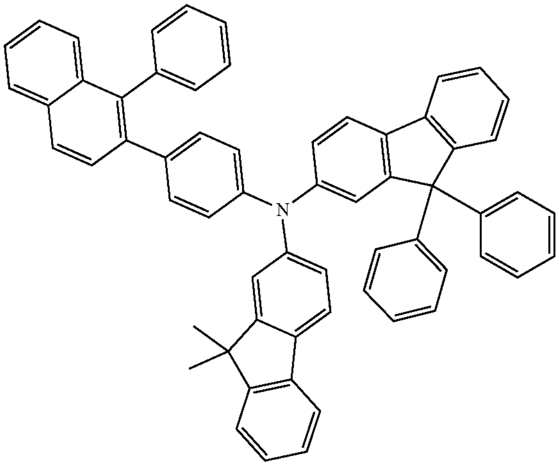

-continued
4-84
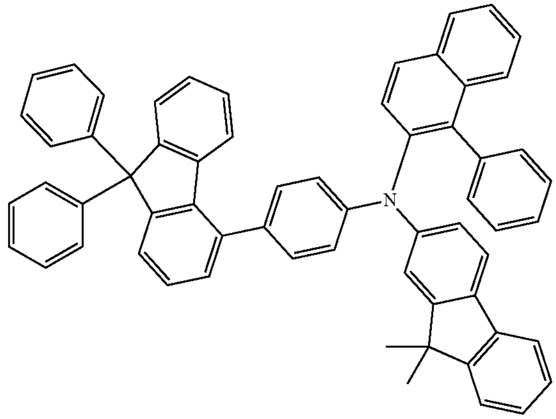
4-85
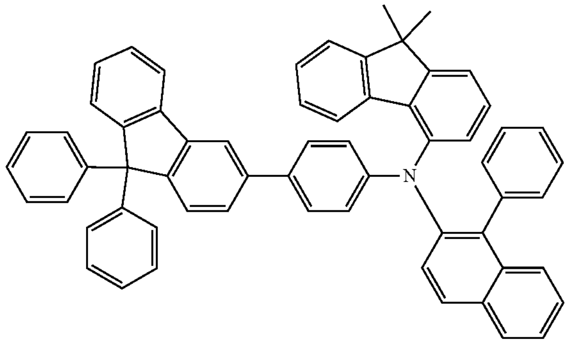
4-86
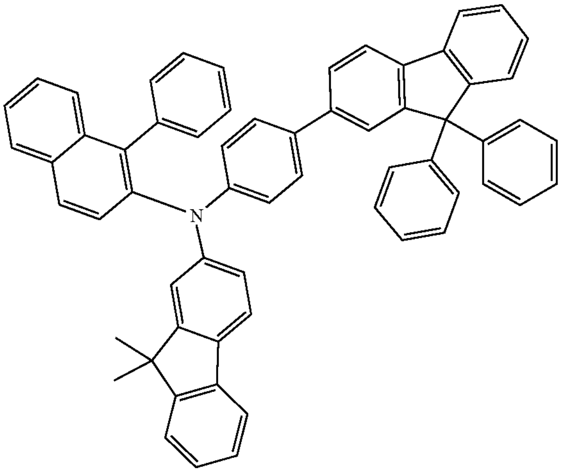
-continued
4-87
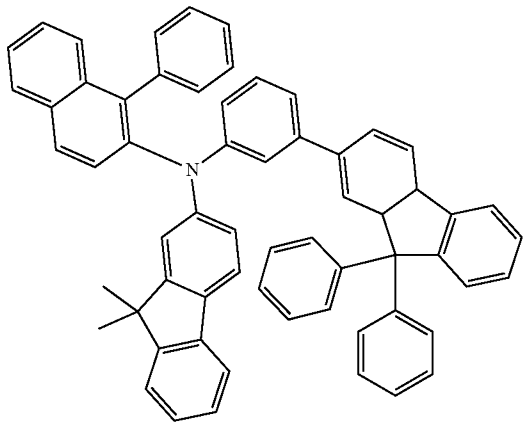
4-88
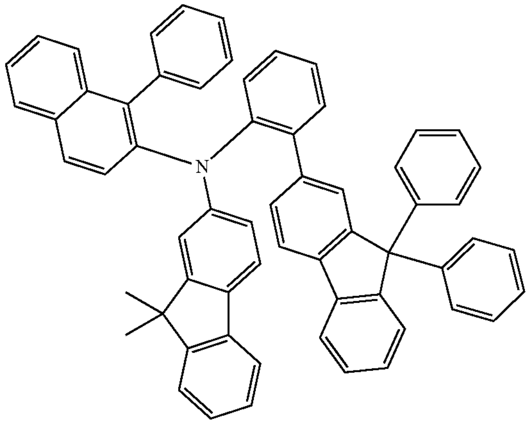
4-89
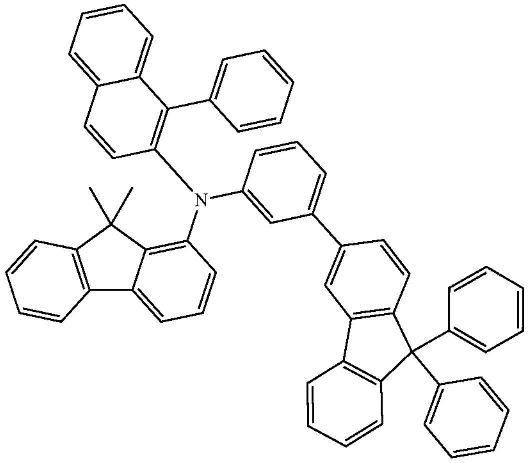

-continued
4-90
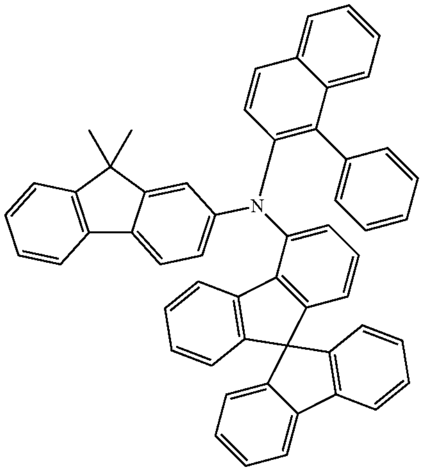
4-91
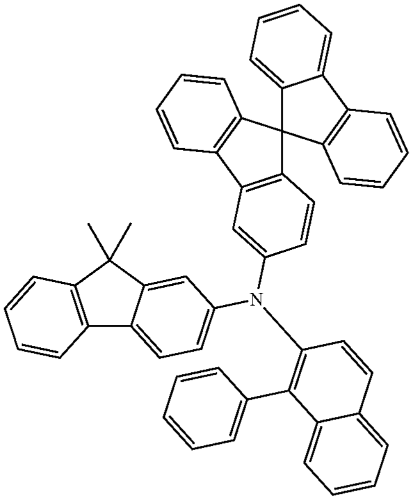
4-92
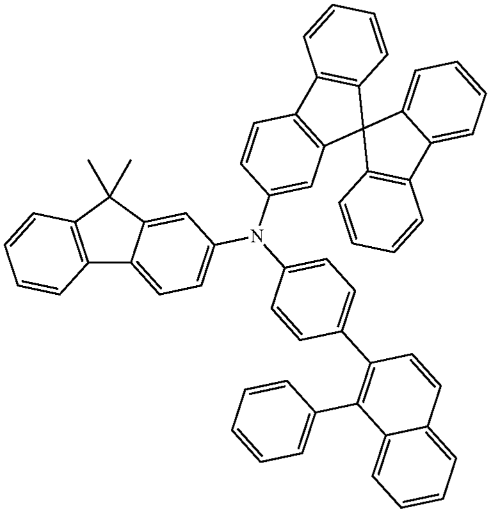
-continued
4-93
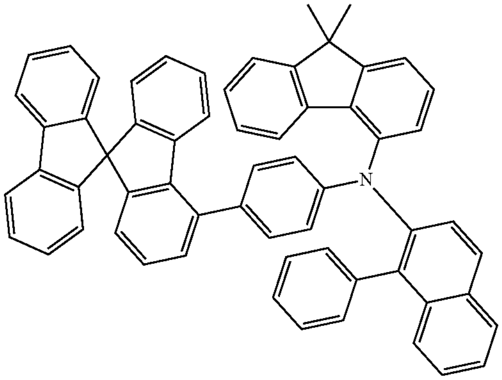
4-94
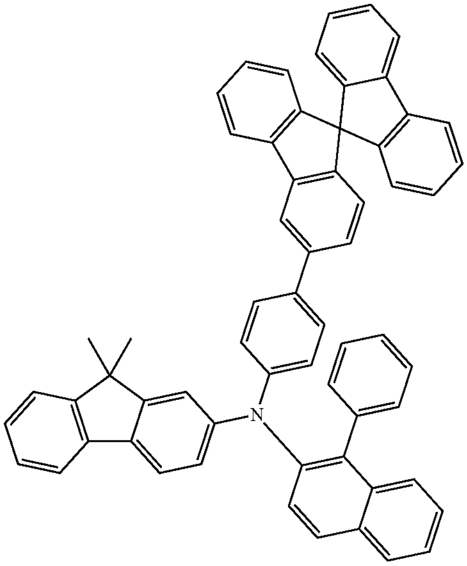
4-95
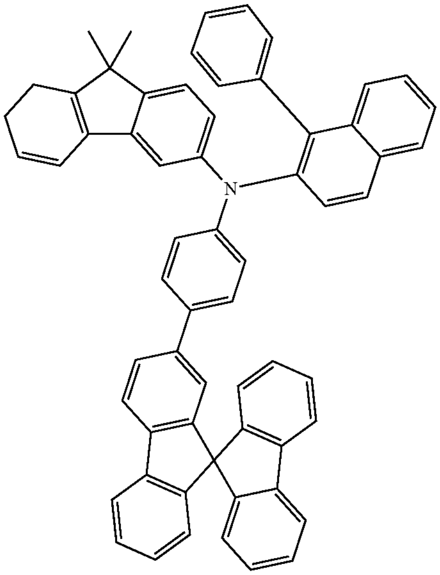

-continued
4-96
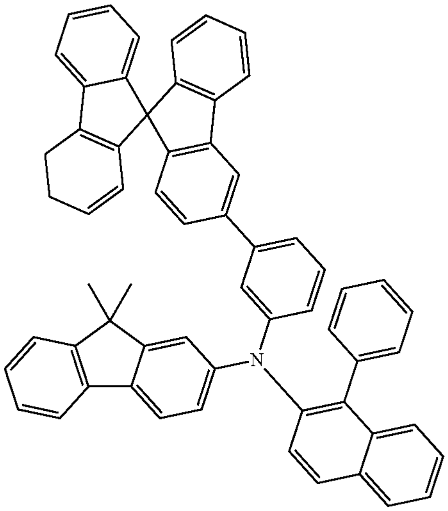
4-97
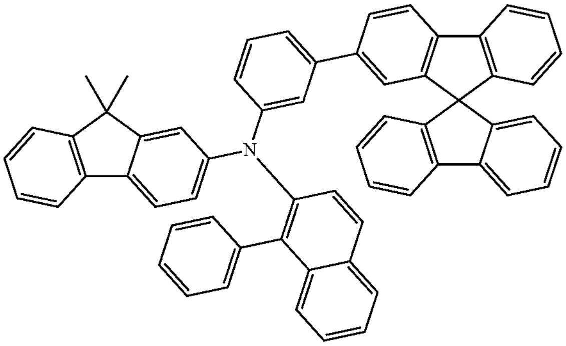
4-98
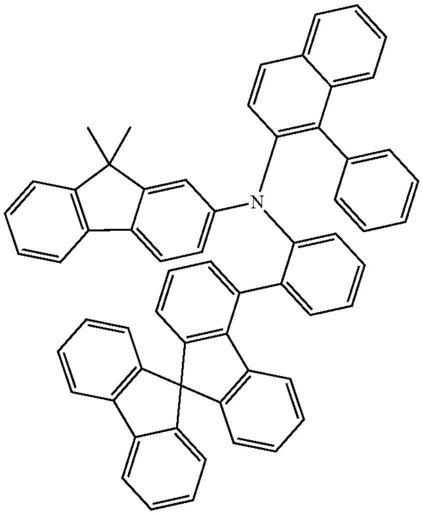
-continued
4-99
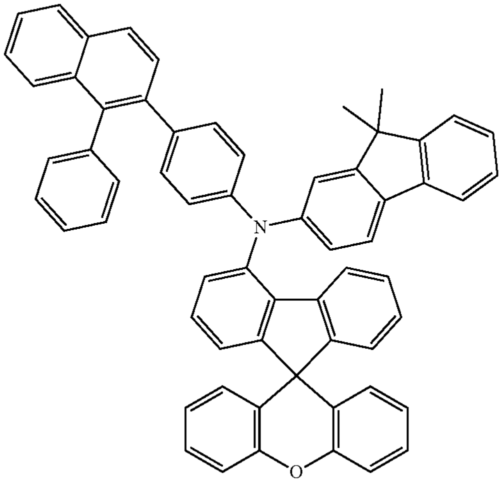
4-100
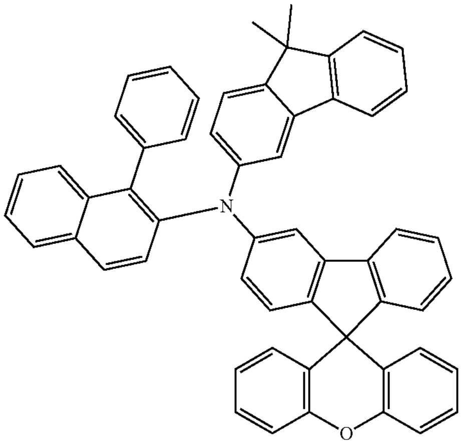
4-101
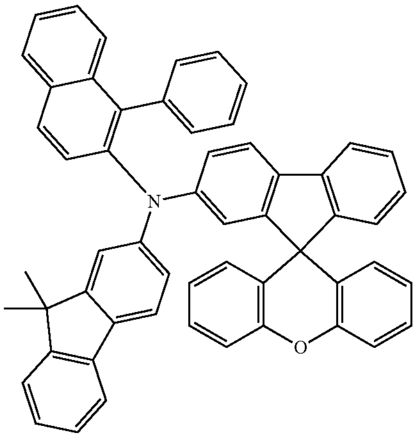

-continued
4-102
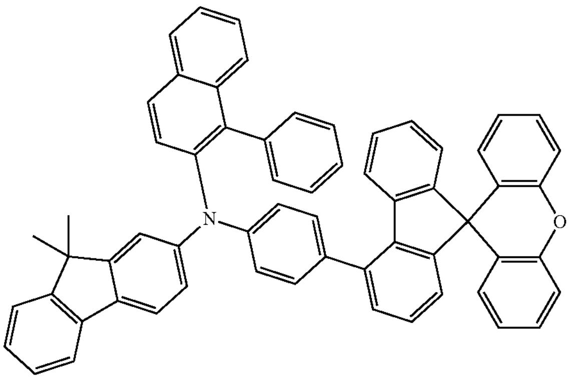
4-103
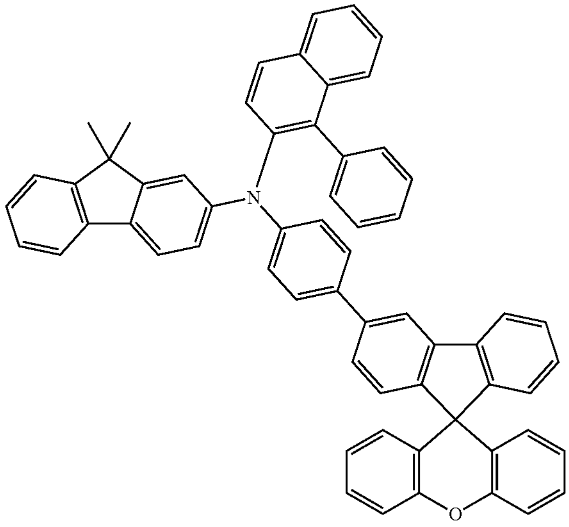
4-104
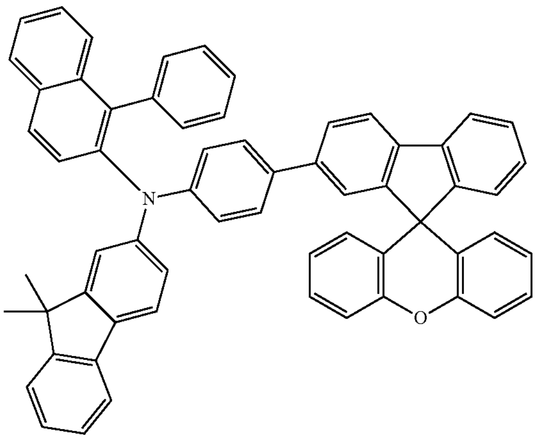
-continued
4-105
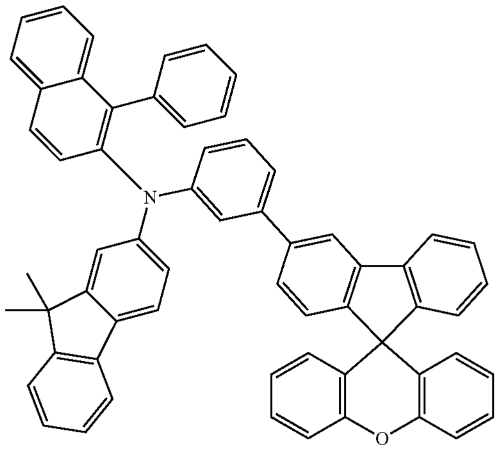
4-106
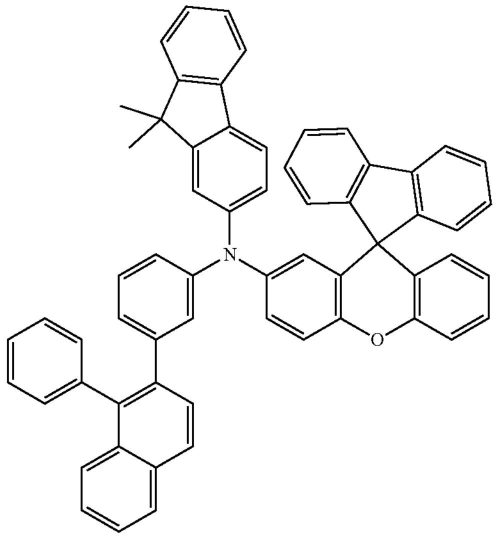
4-107
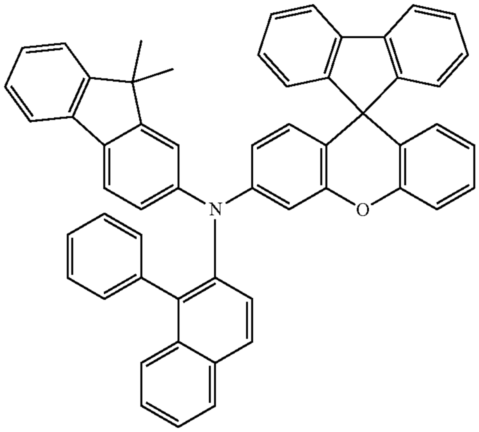

-continued
4-108
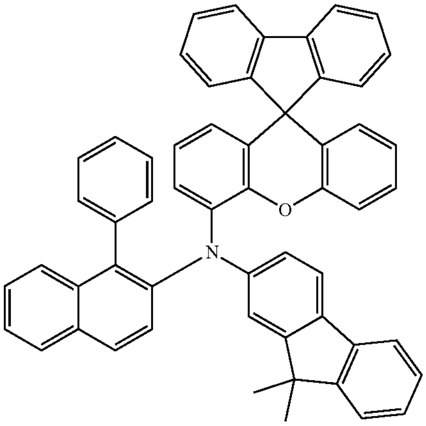
4-109
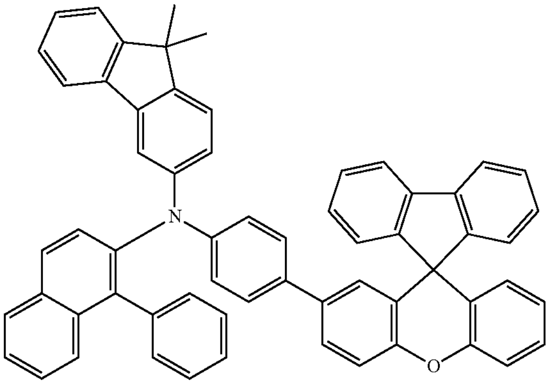
4-110
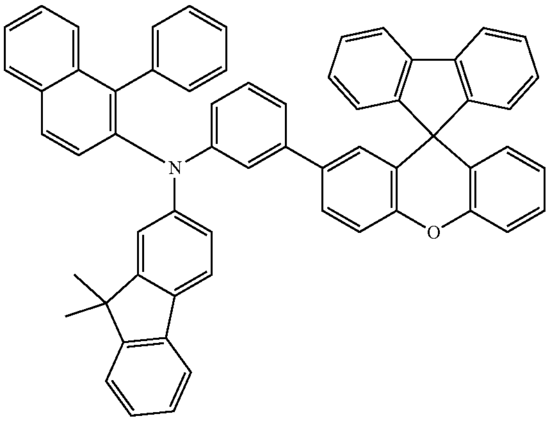
4-111
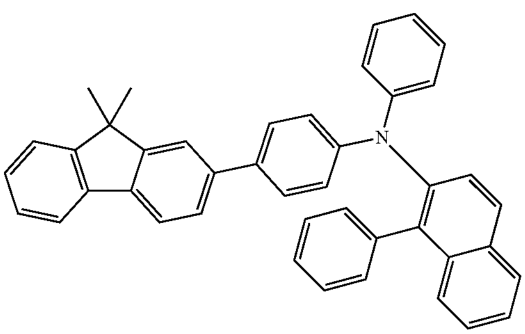
-continued
4-112
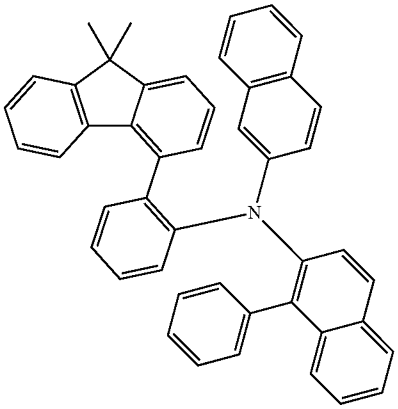
4-113
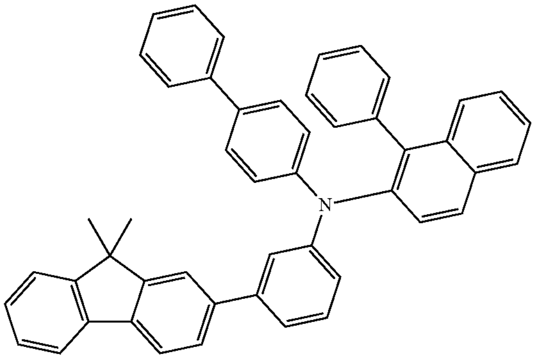
4-114
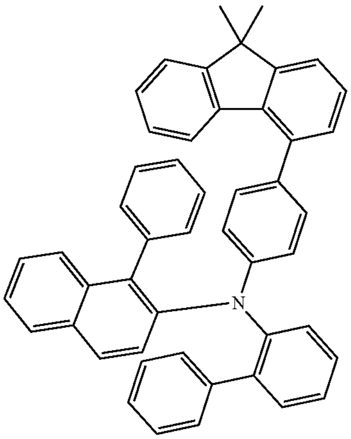
4-115
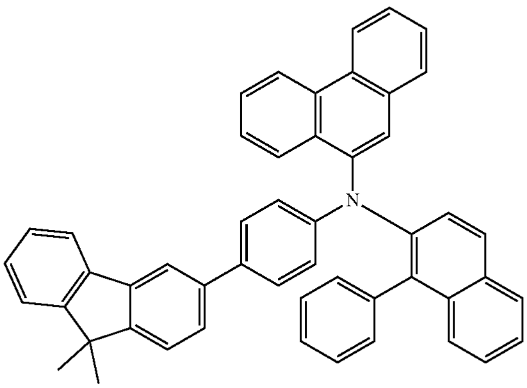

-continued
4-116
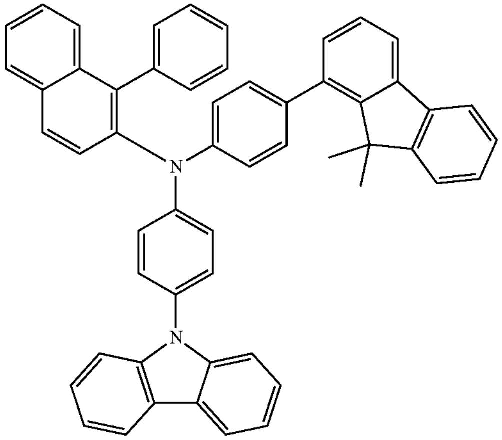
4-117
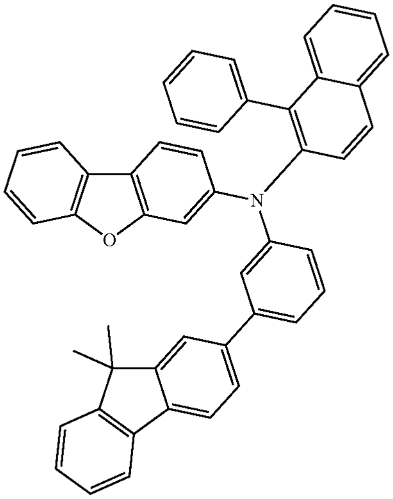
4-118
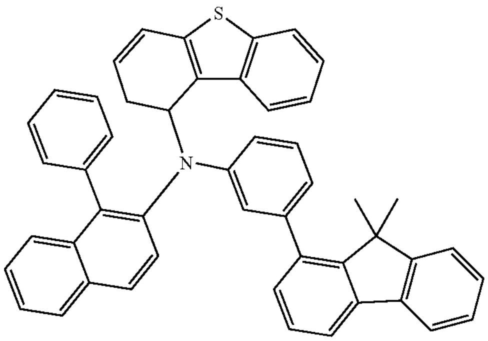
-continued
4-119
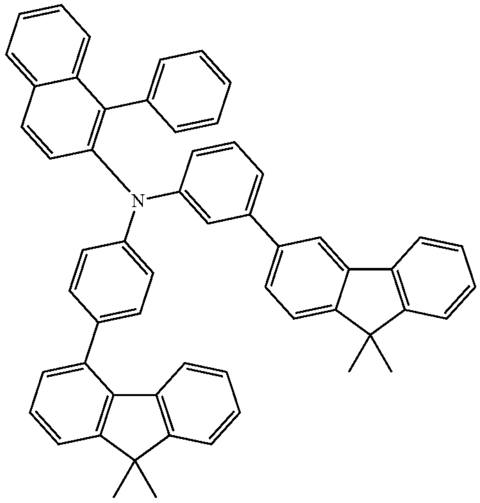
4-120
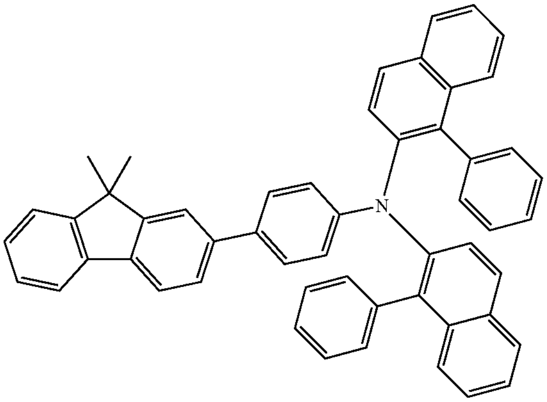
4-121
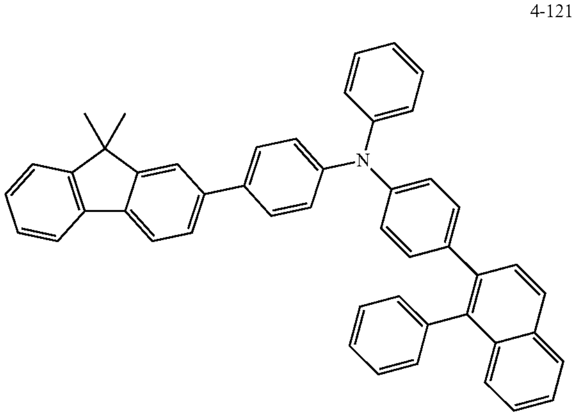

-continued
4-122
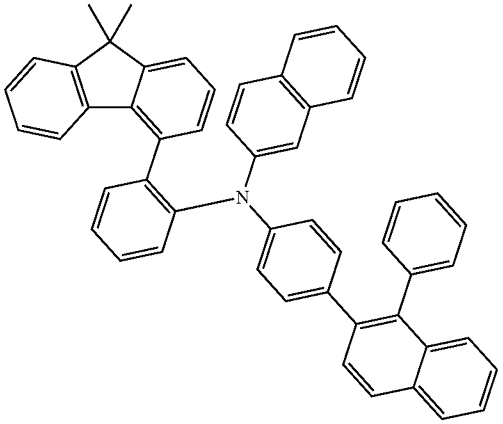
4-123
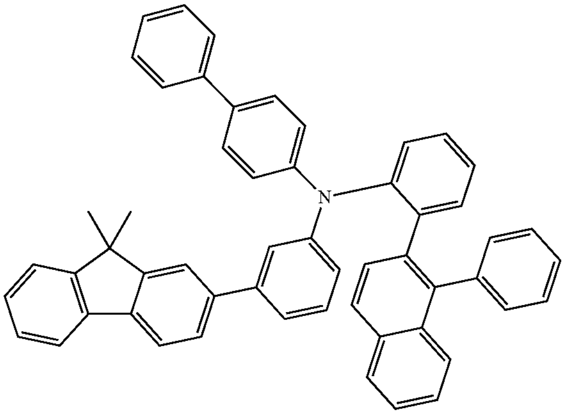
4-124
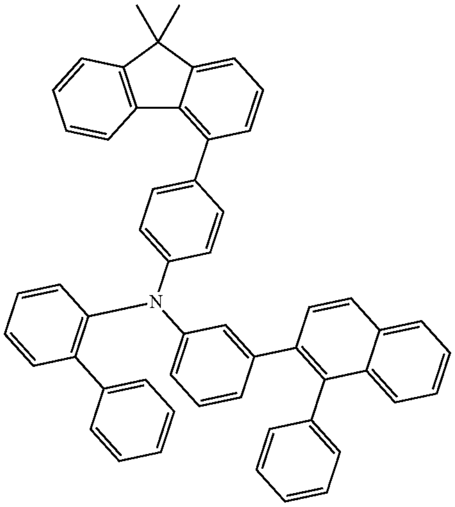
-continued
4-125
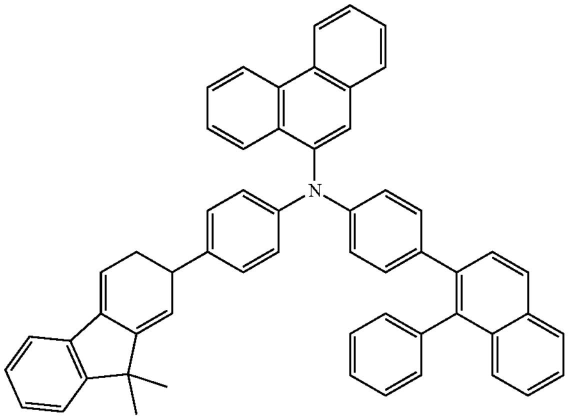
4-126
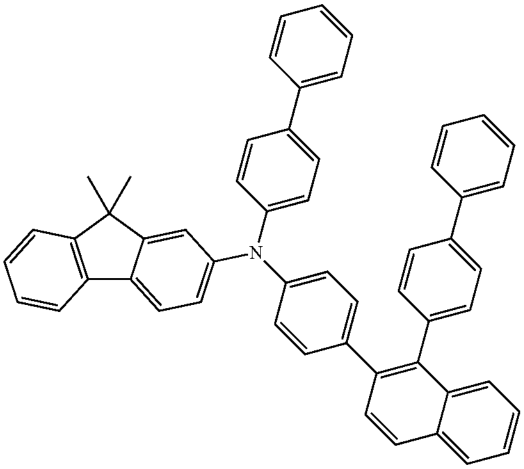
4-127
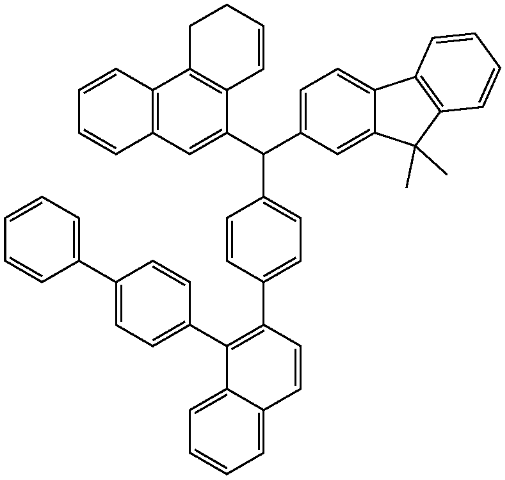

-continued
4-128
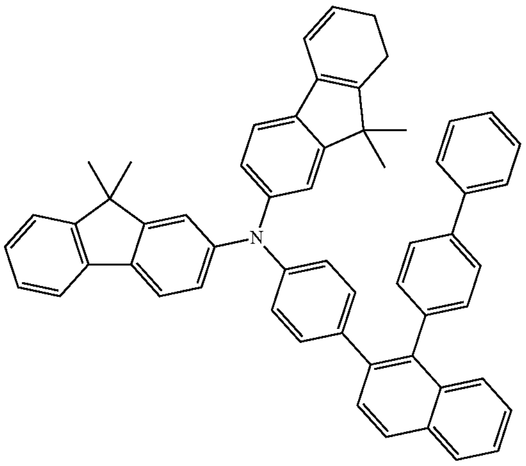
4-129
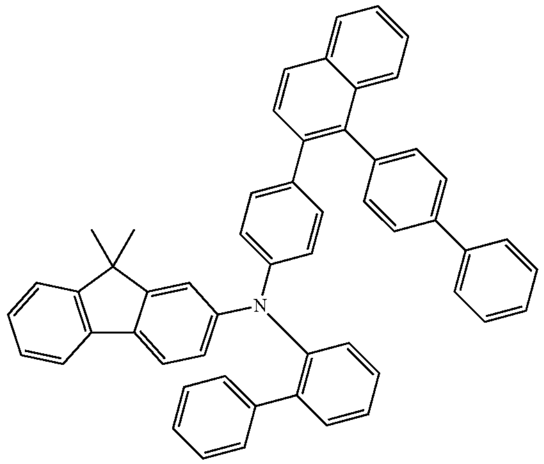
4-130
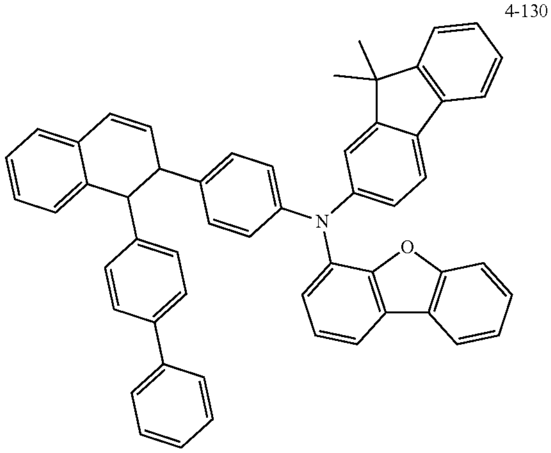
-continued
4-131
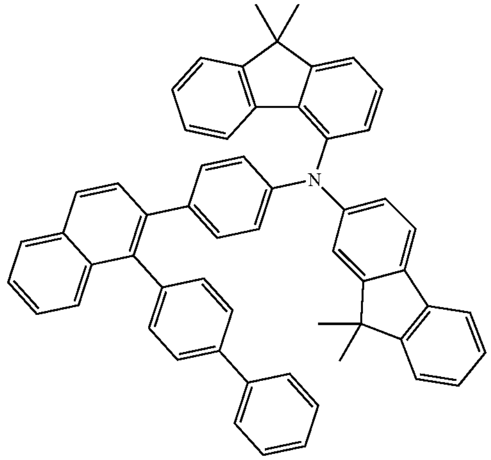
4-132
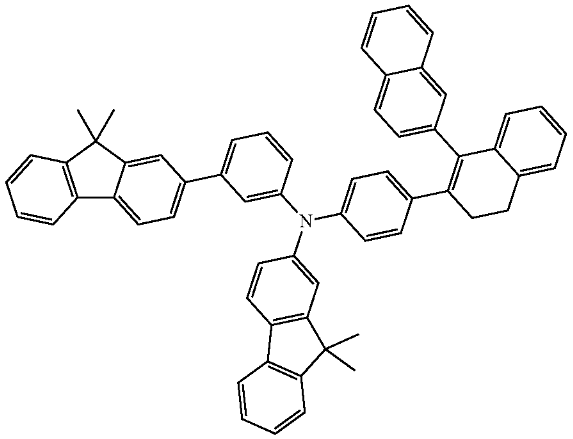
4-133
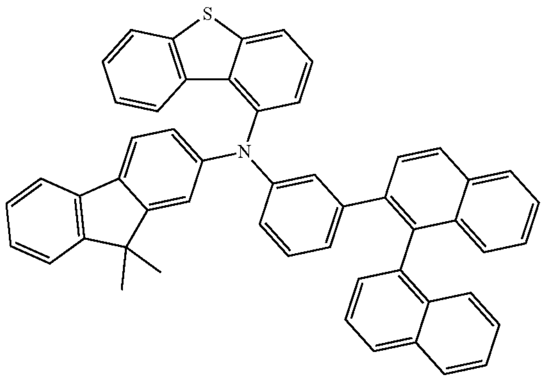
4-134
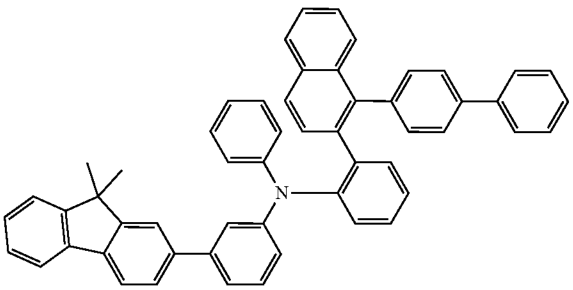

-continued
4-135
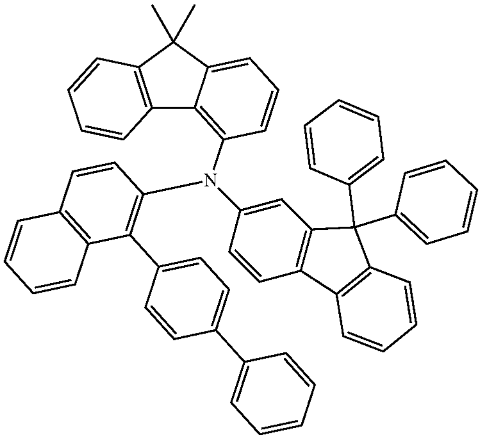
4-136
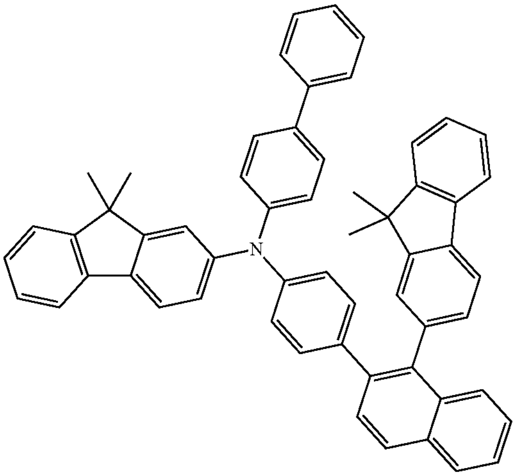
4-137
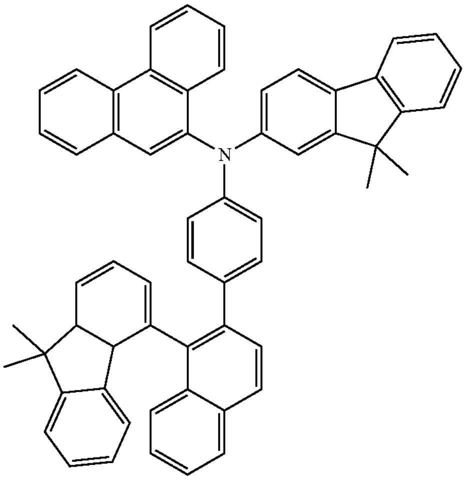
-continued
4-138
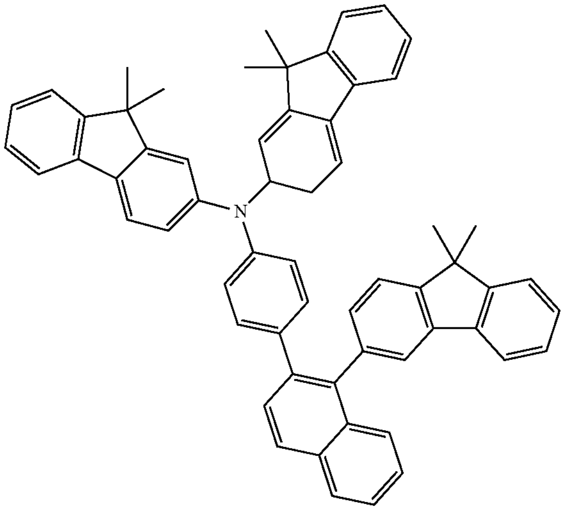
4-139
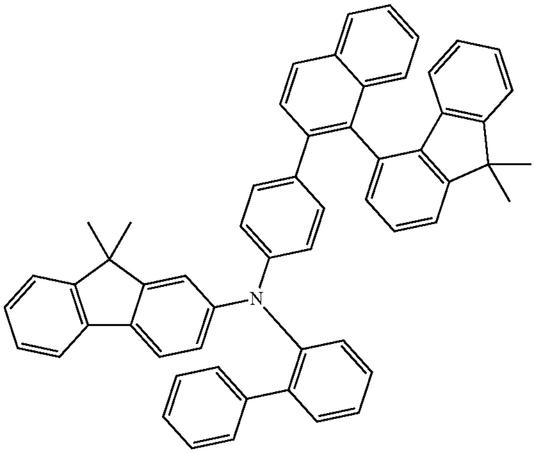
4-140
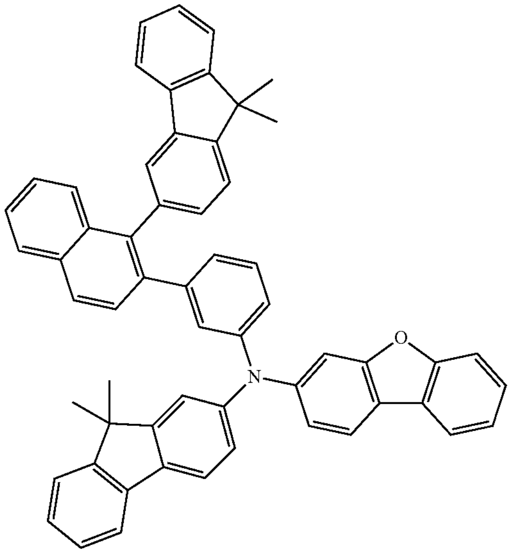

-continued
4-141
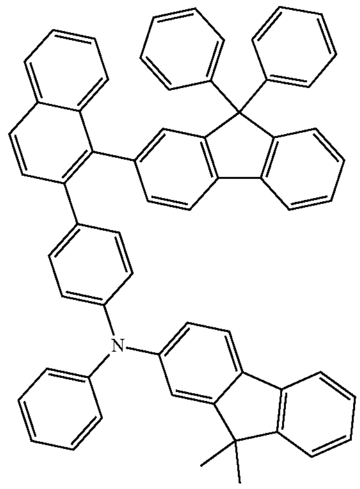
4-142
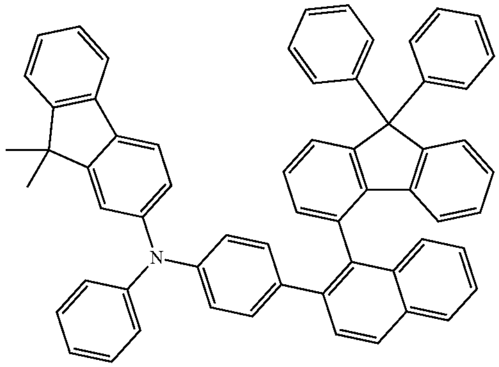
4-143
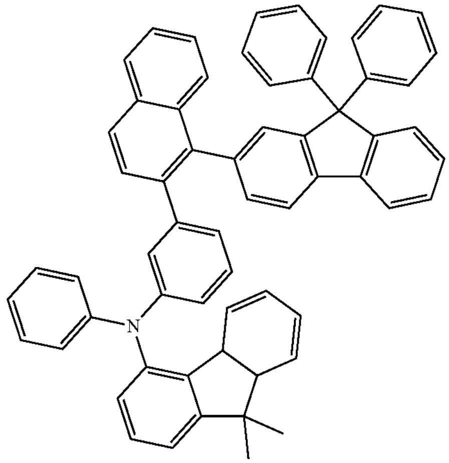
-continued
4-144
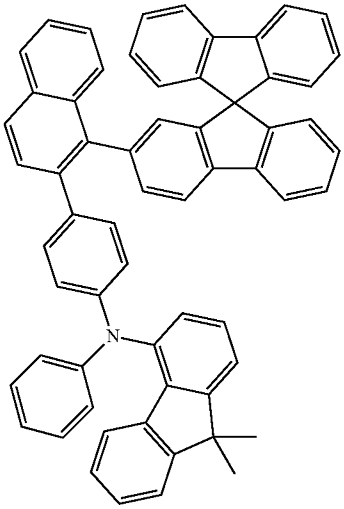
4-145
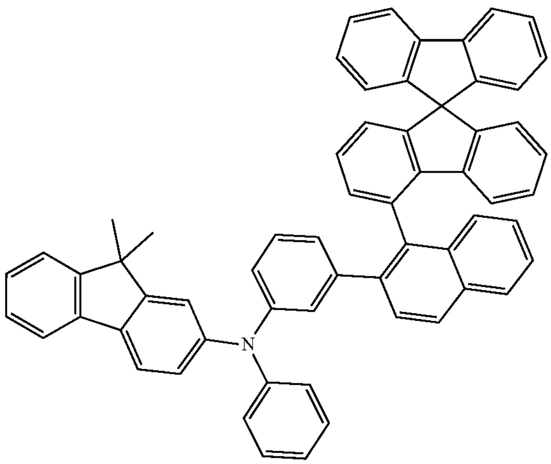
4-146
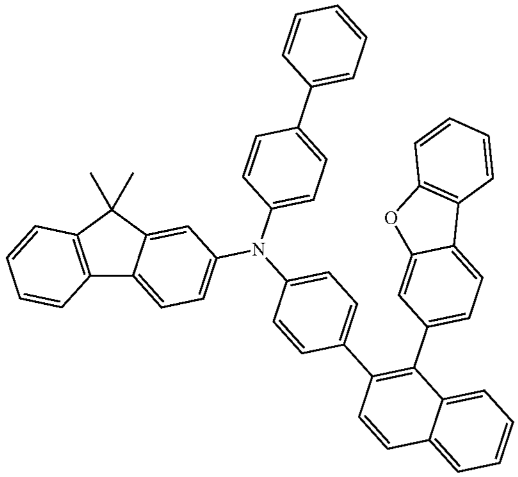

4-147
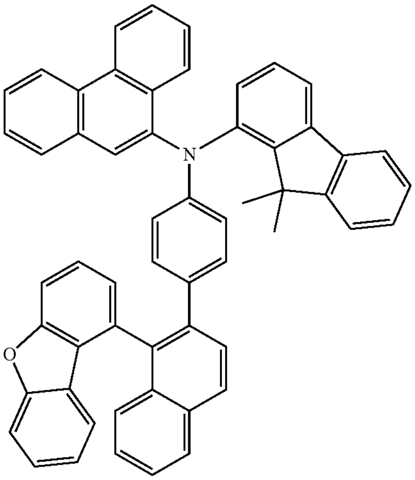
4-148
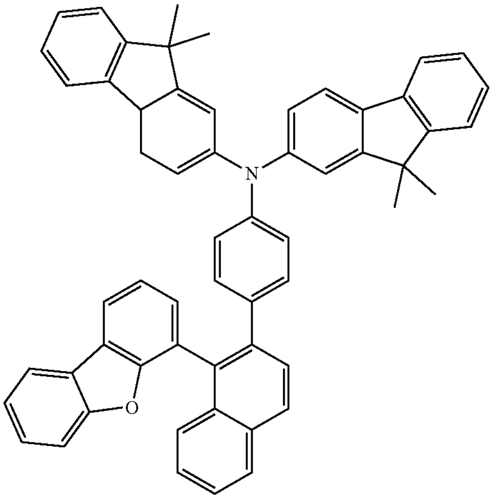
4-149
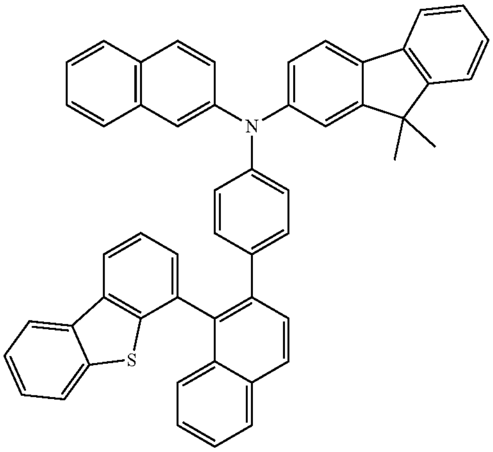
4-150
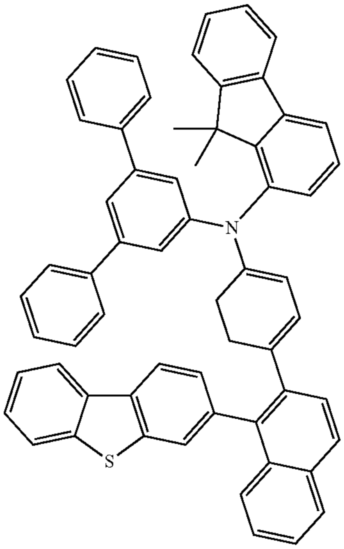
4-151
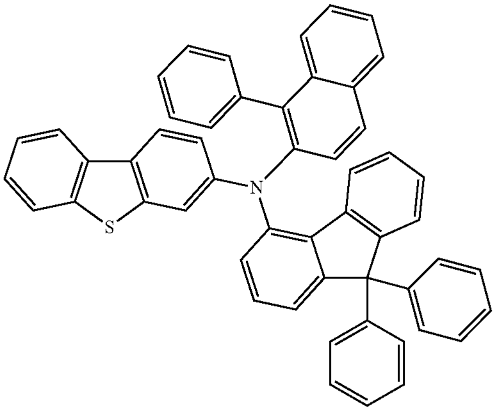
4-152
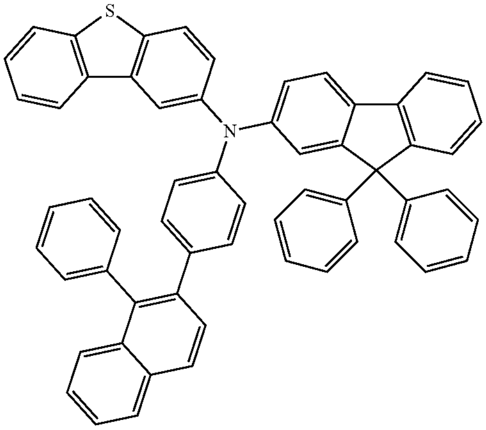

4-153
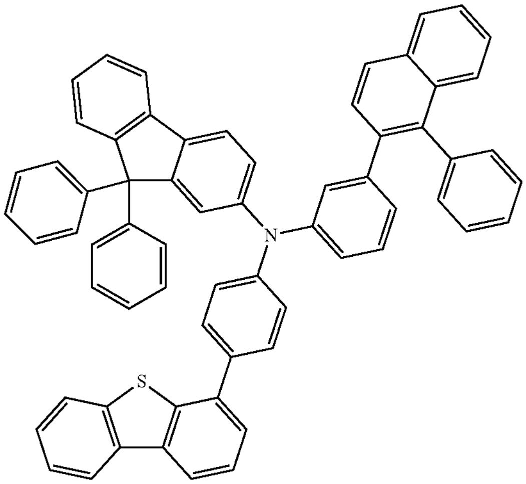
4-154
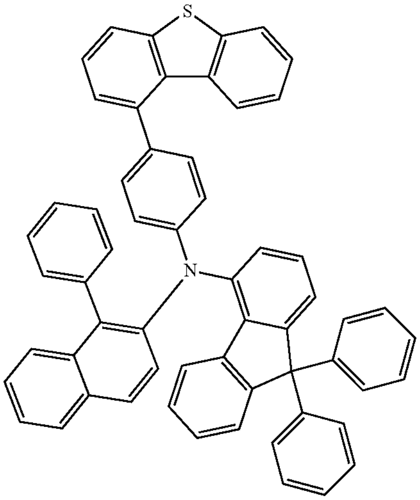
4-155
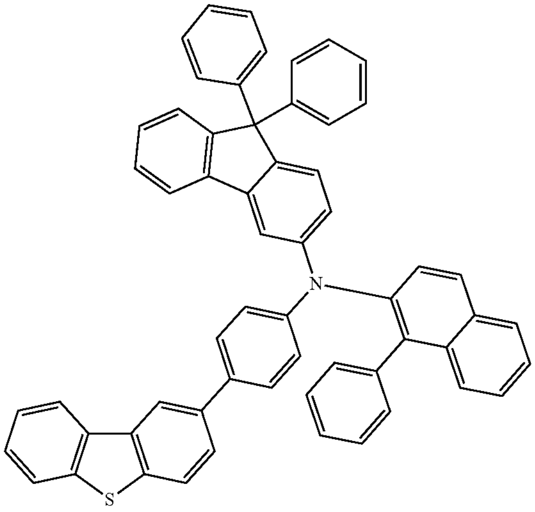
4-156
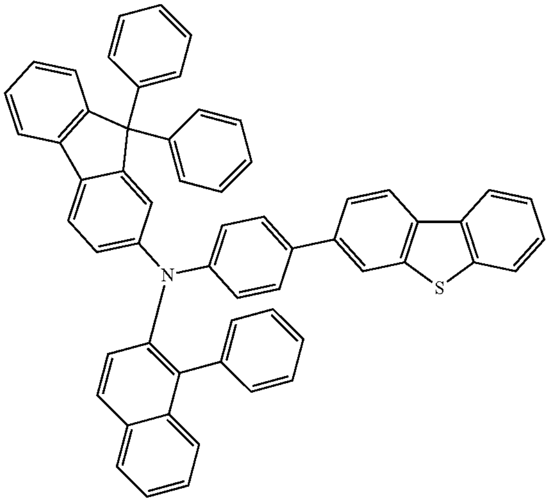
4-157
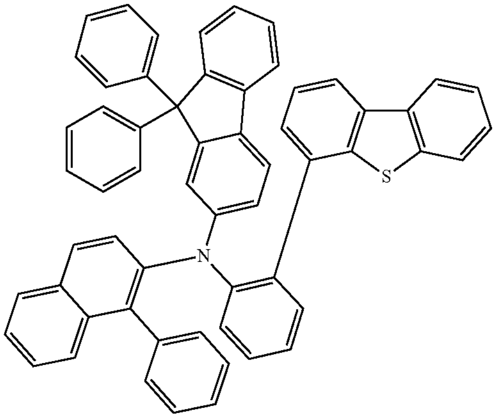
4-158
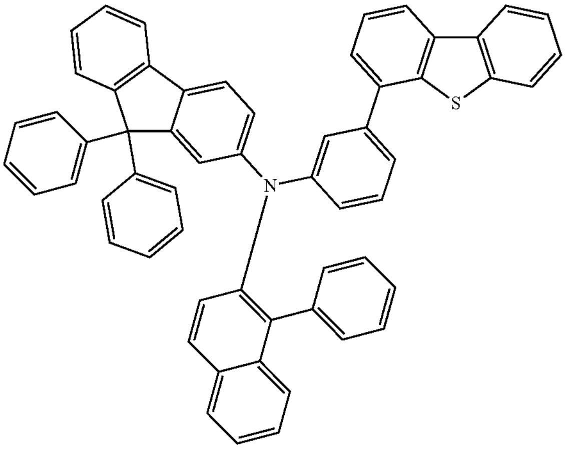

-continued
4-159
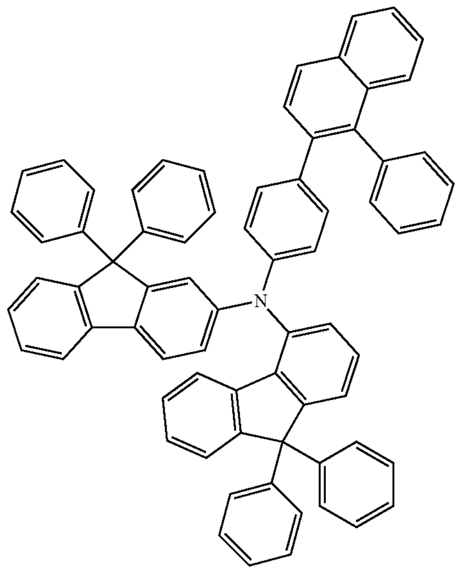
4-160
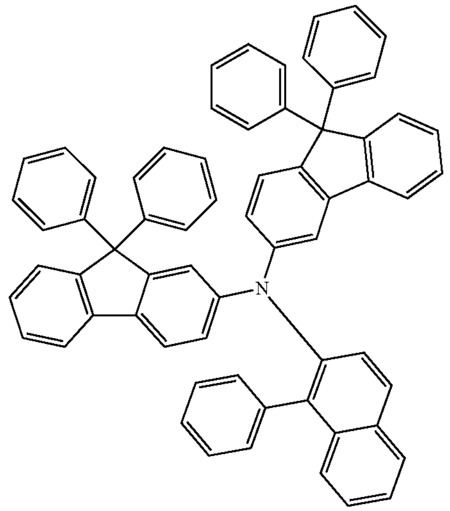
4-161
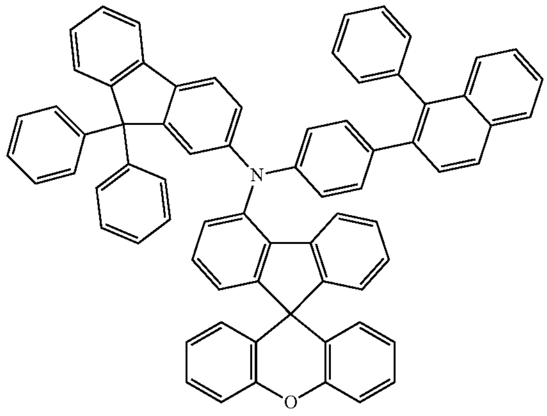
-continued
4-162
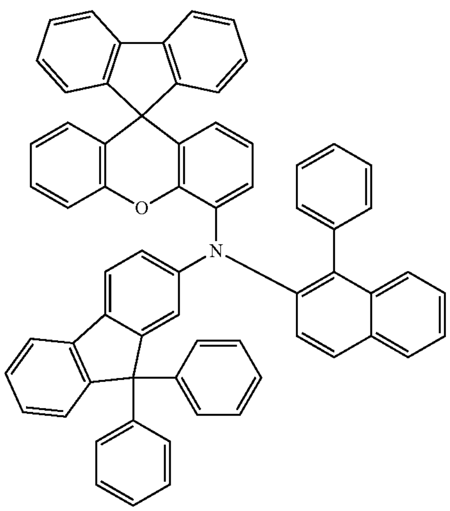
4-163
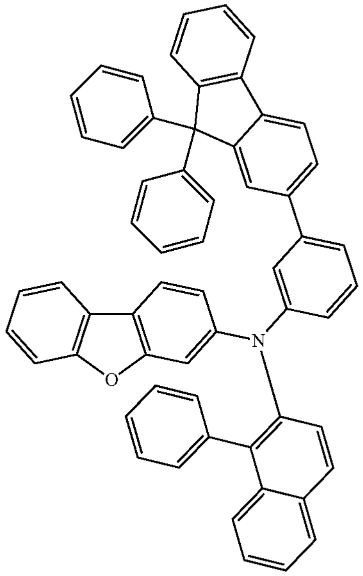
4-164
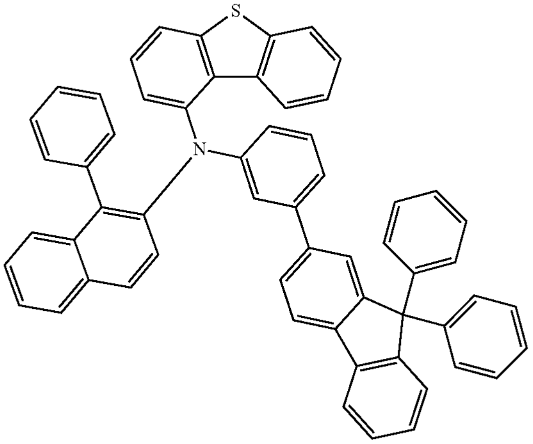

-continued
4-165
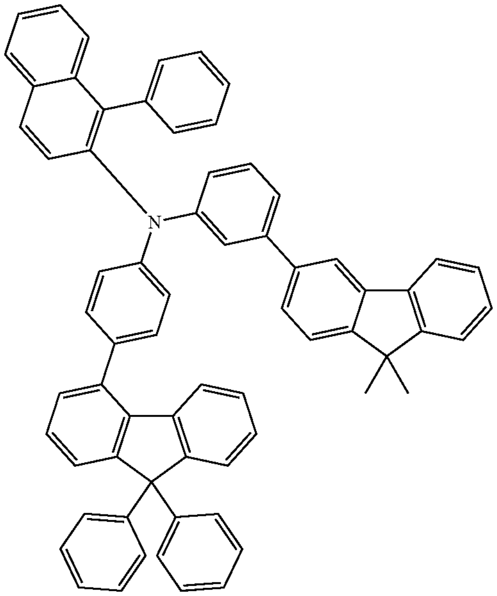
4-166
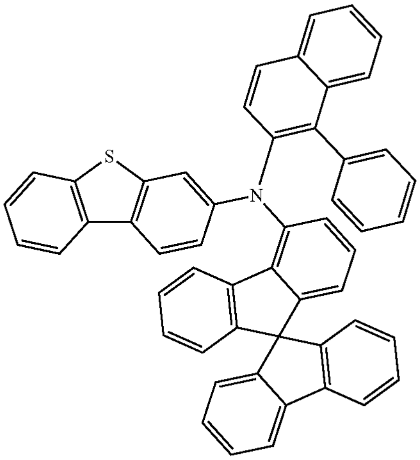
4-167
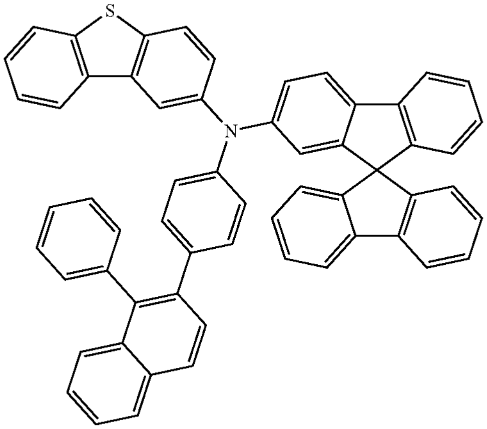
-continued
4-168
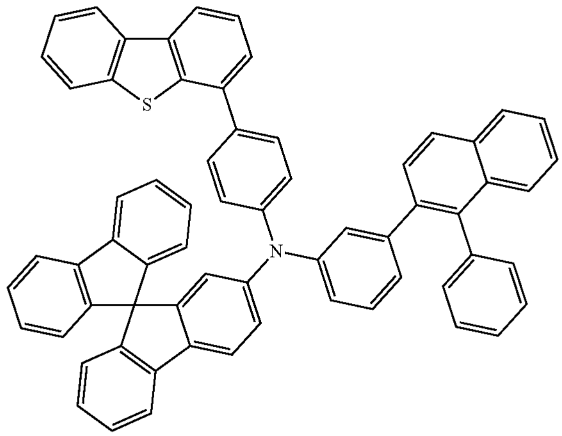
4-169
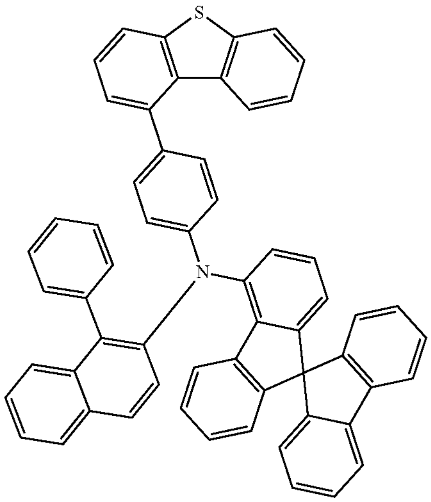
4-170
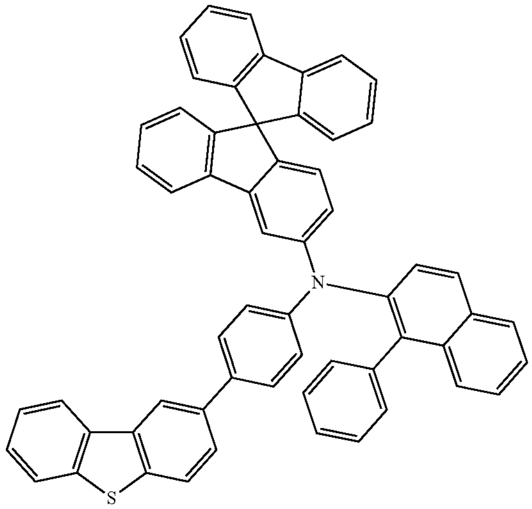

-continued
4-171
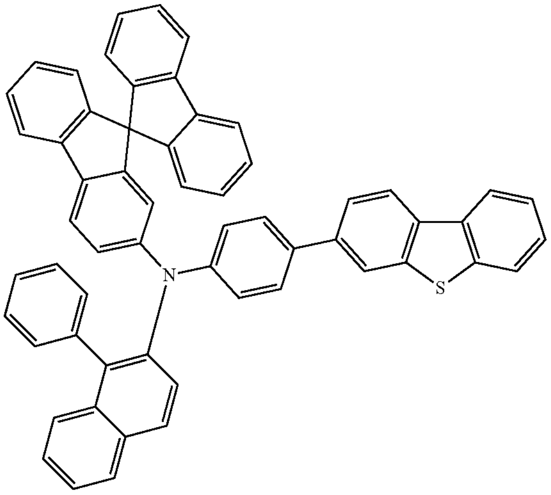
4-172
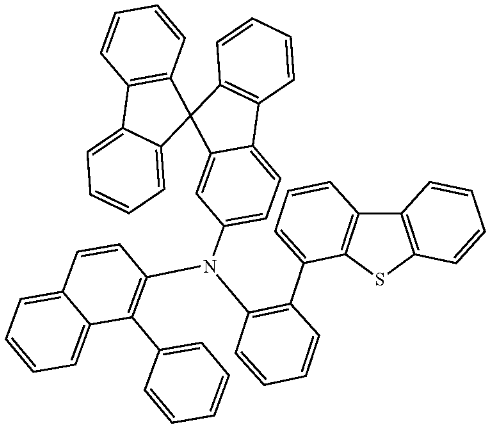
4-173
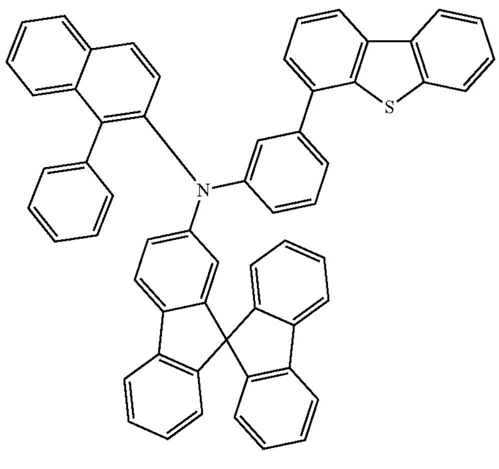
-continued
4-174
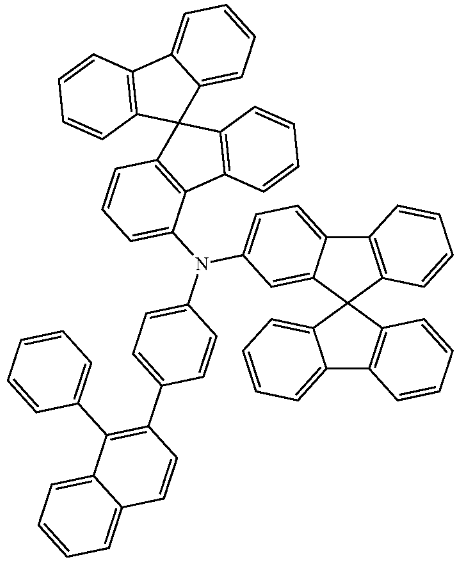
4-175
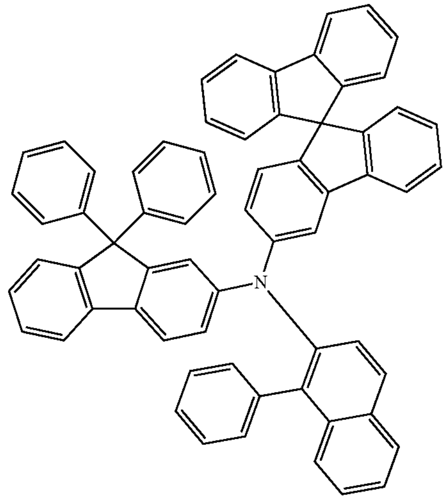
4-176
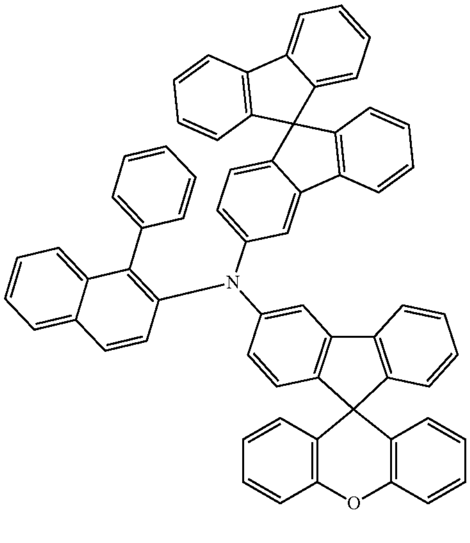

-continued
4-177
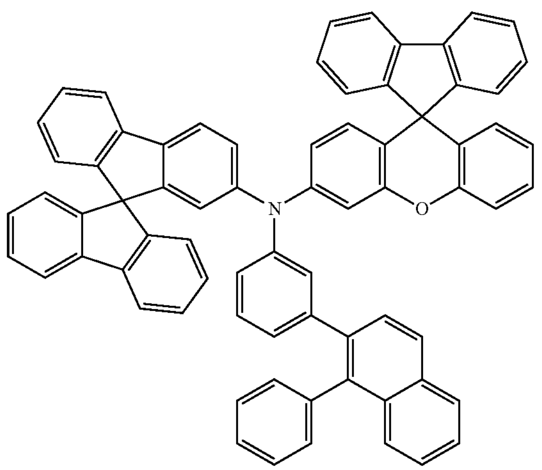
4-178
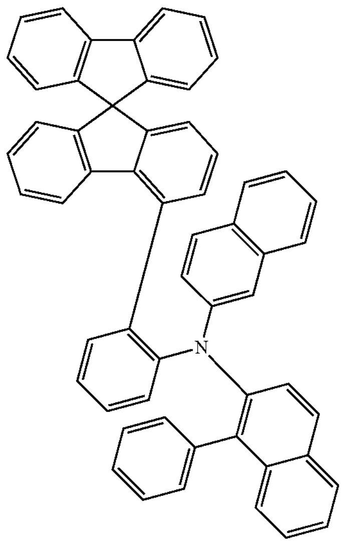
4-179
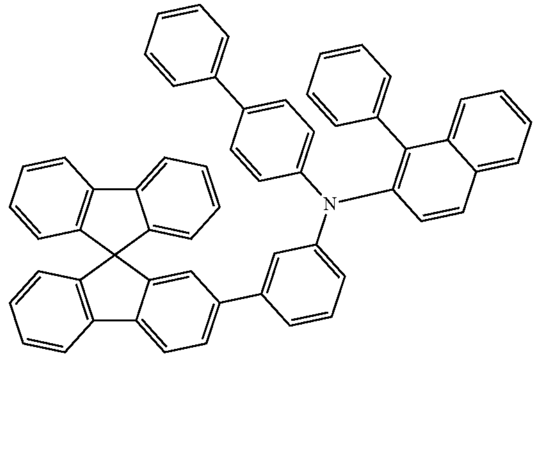
-continued
4-180
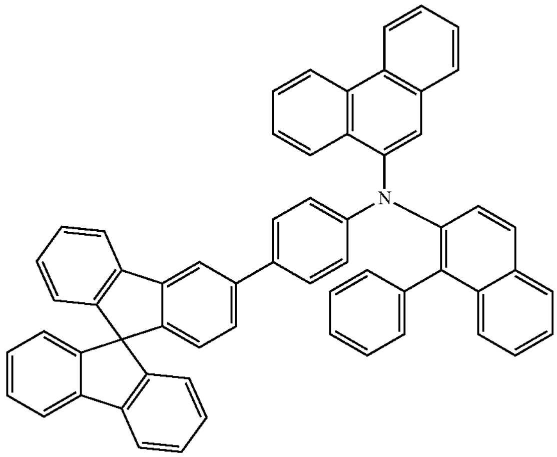
4-181
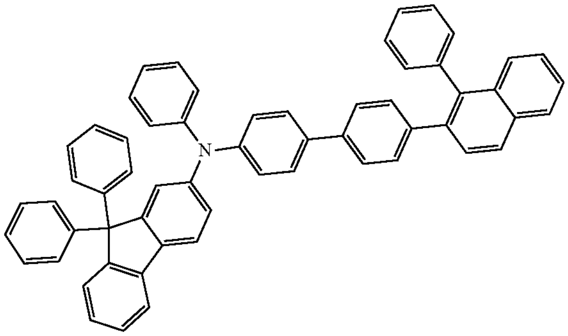
4-182
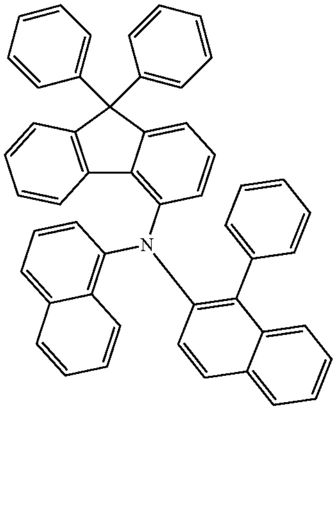

-continued
4-183
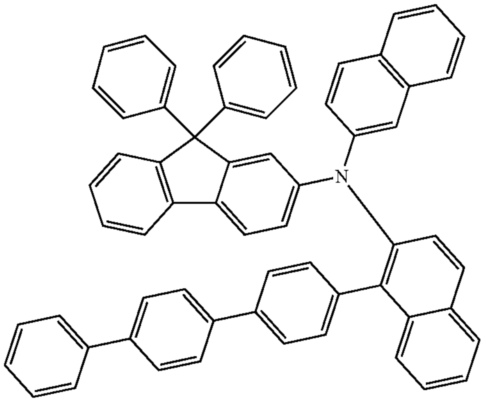
4-184
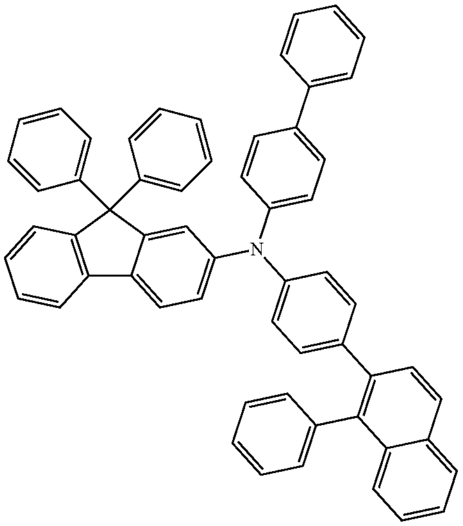
4-185
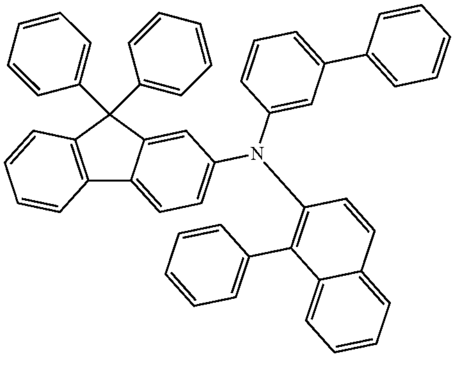
-continued
4-186
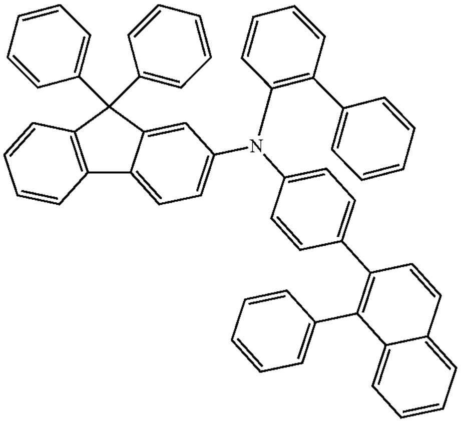
4-187
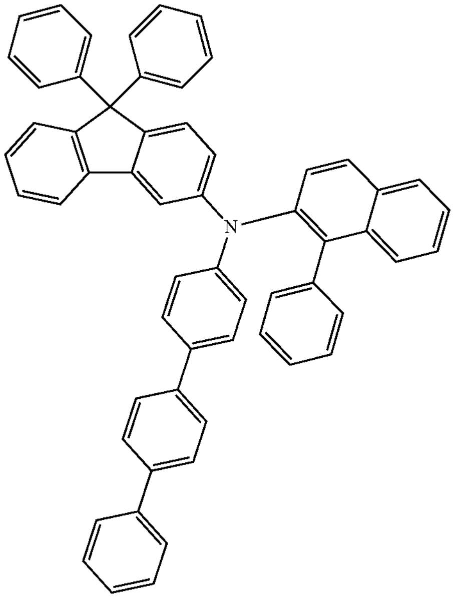
4-188
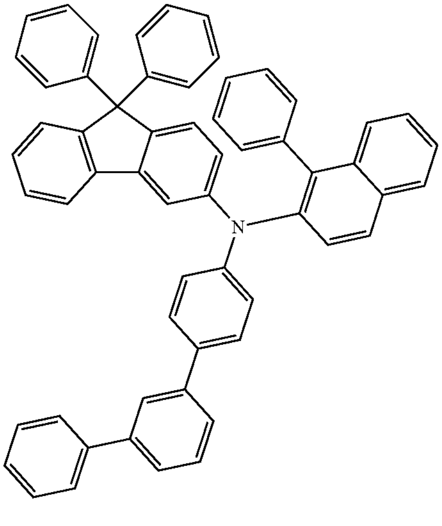

-continued
4-189
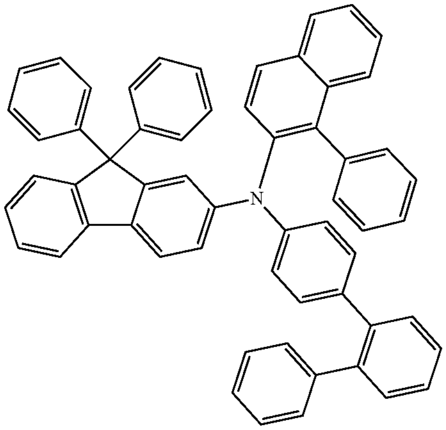
4-190
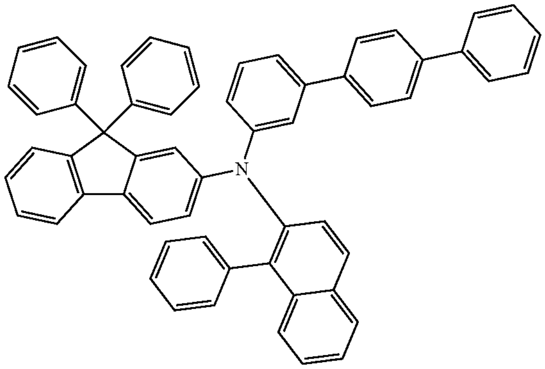
4-191
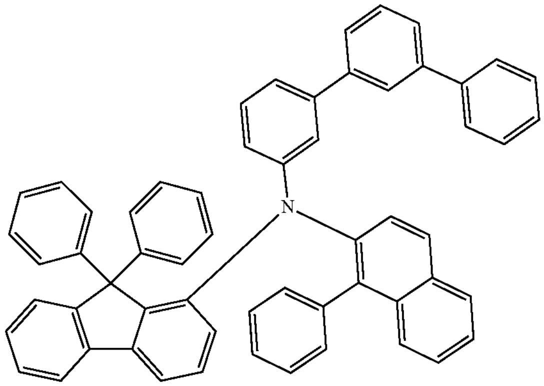
-continued
4-192
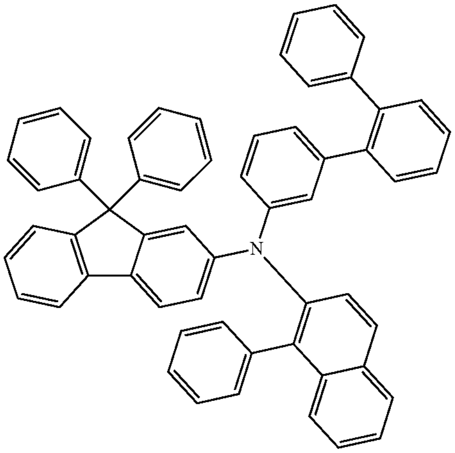
4-193
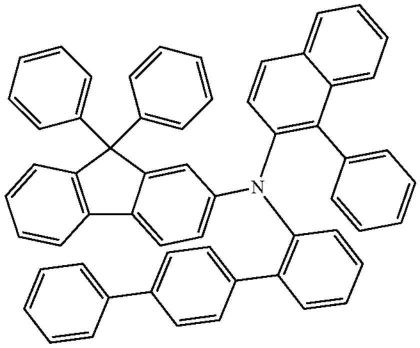
4-194
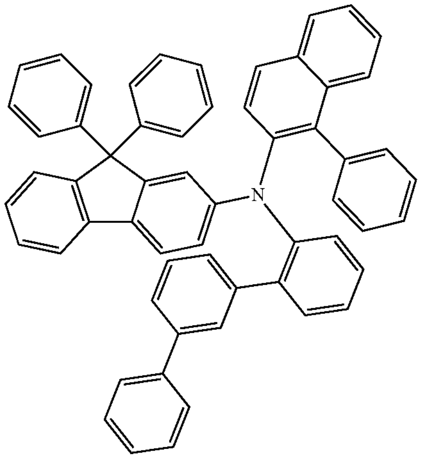

-continued
4-195
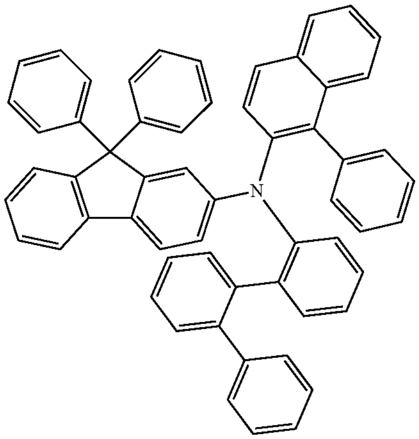
4-196
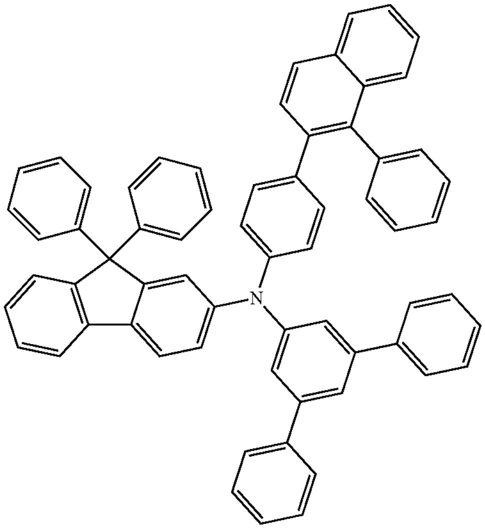
4-197
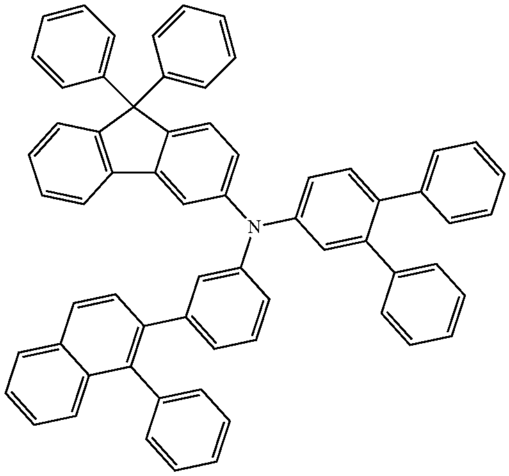
-continued
4-198
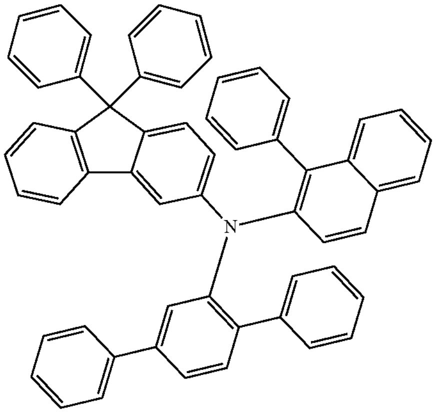
4-199
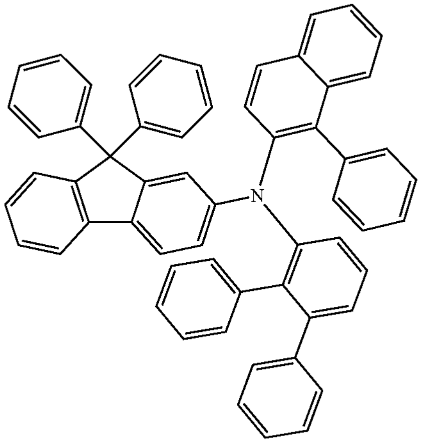
4-200
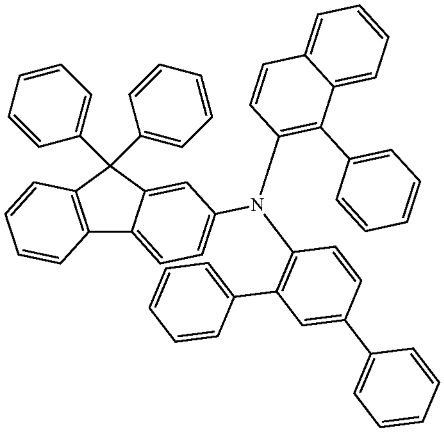

-continued
4-201
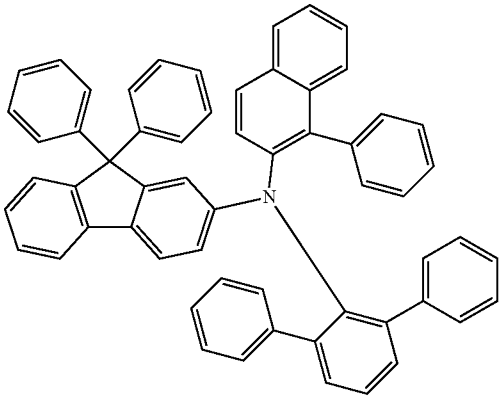
4-202
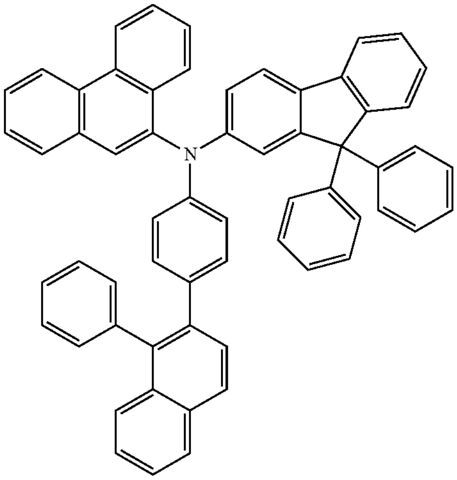
4-203
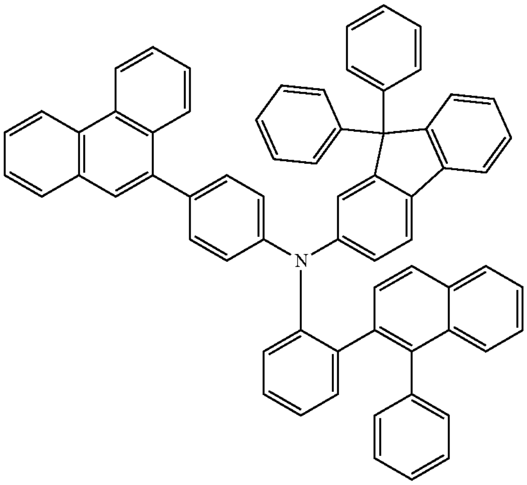
-continued
4-204
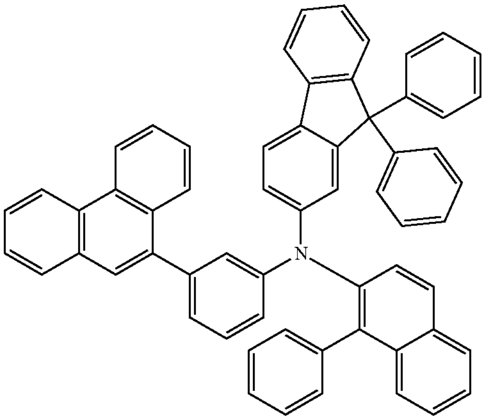
4-205
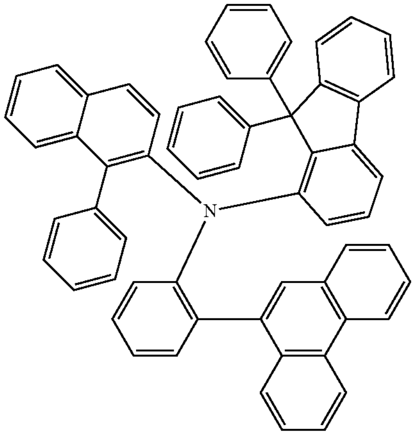
4-206
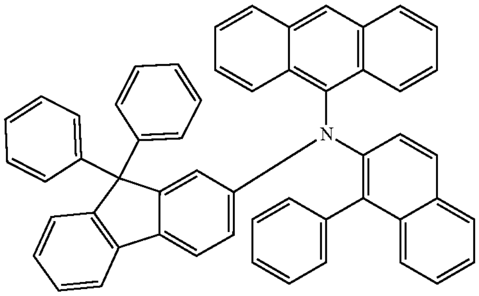
4-207
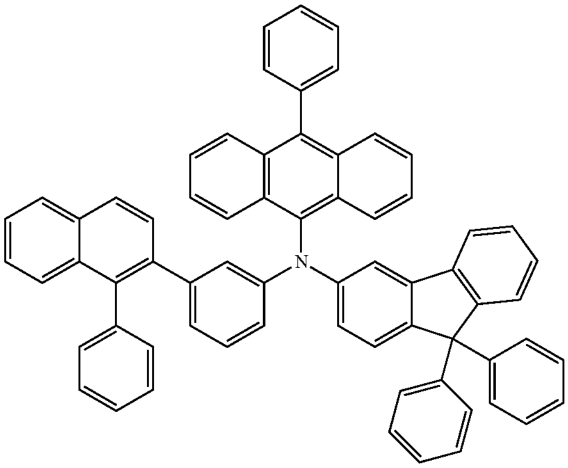

4-208
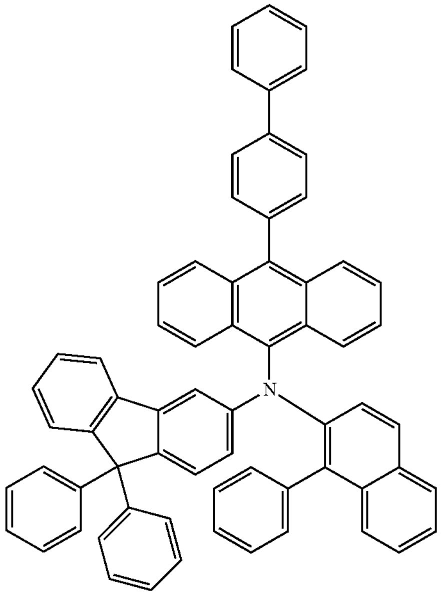
4-209
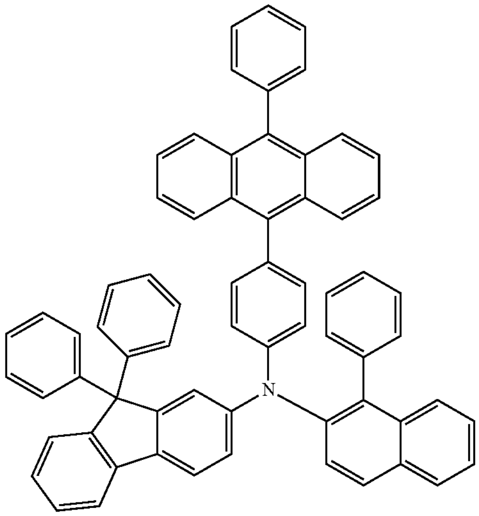
4-210
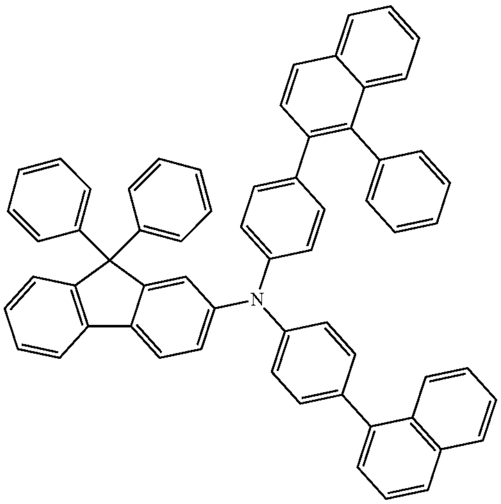
4-211
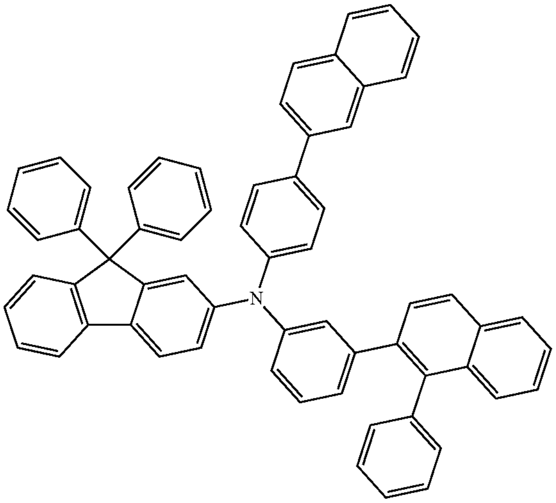
4-212
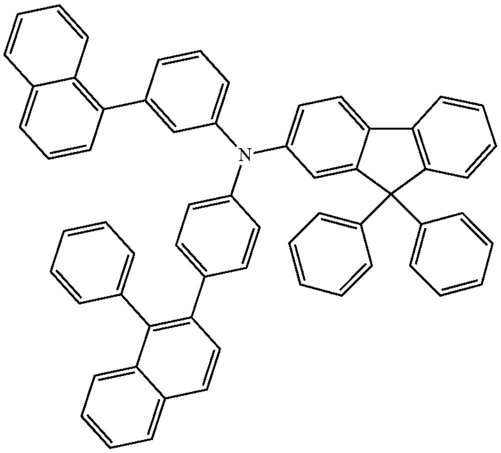
4-213
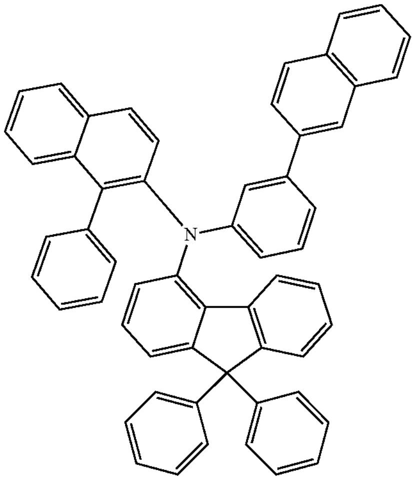

-continued
4-214
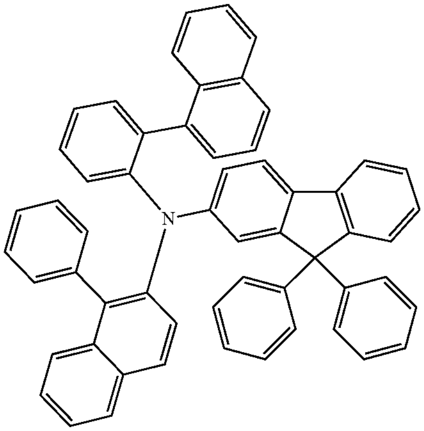
4-215
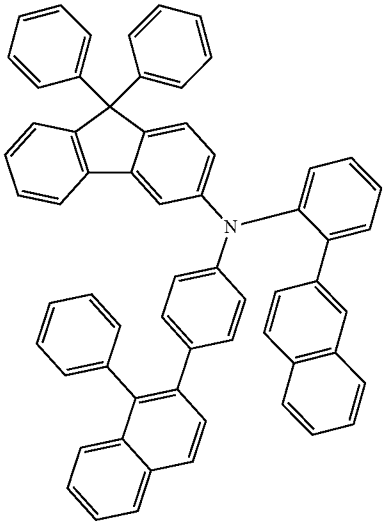
4-216
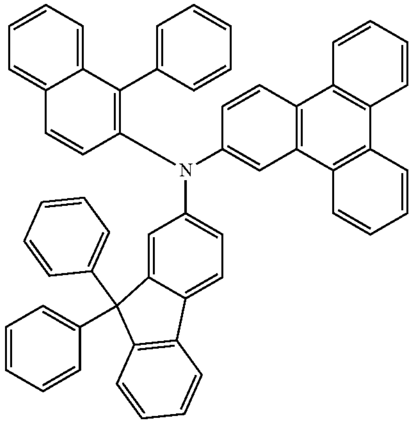
-continued
4-217
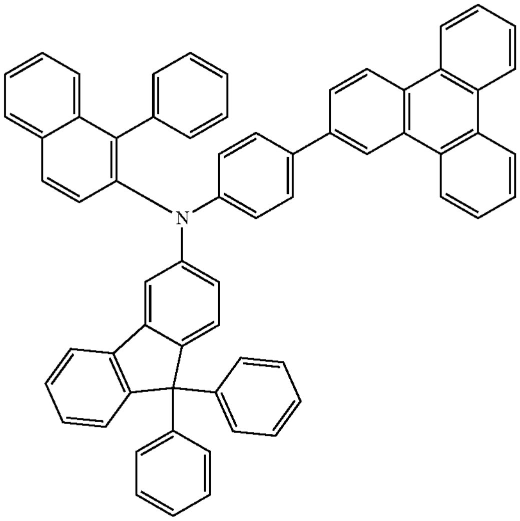
4-218
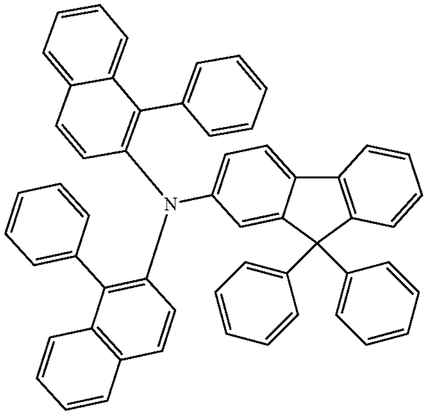
4-219
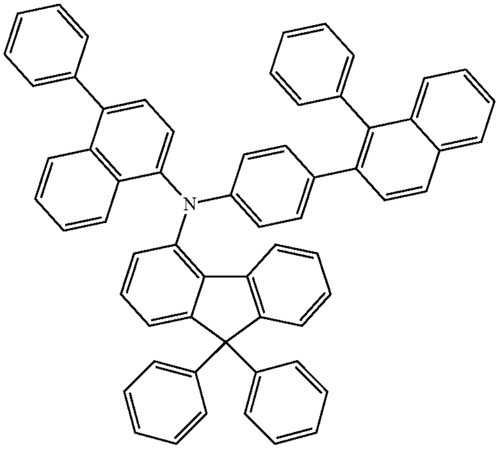

4-220
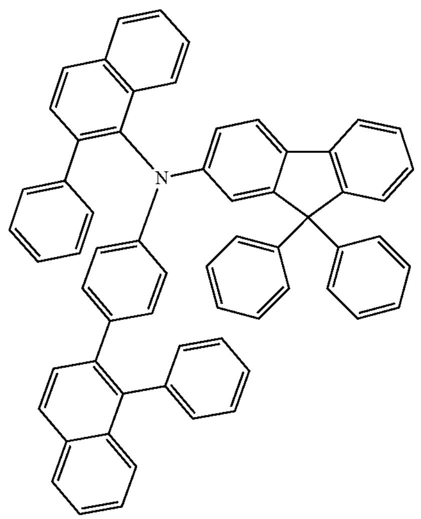
4-221
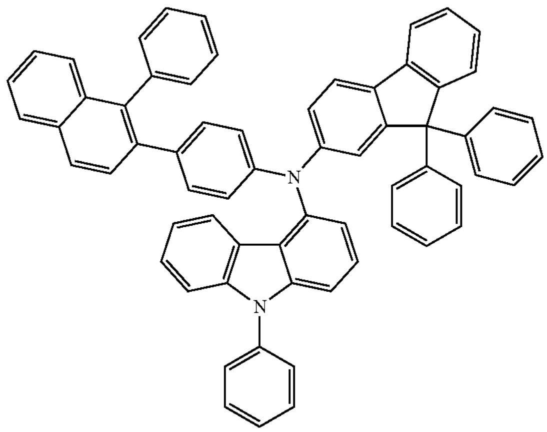
4-222
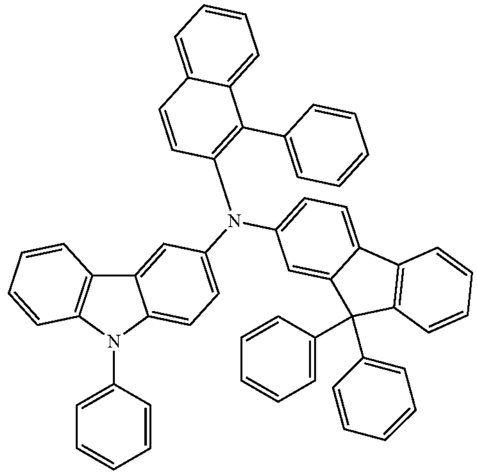
4-223
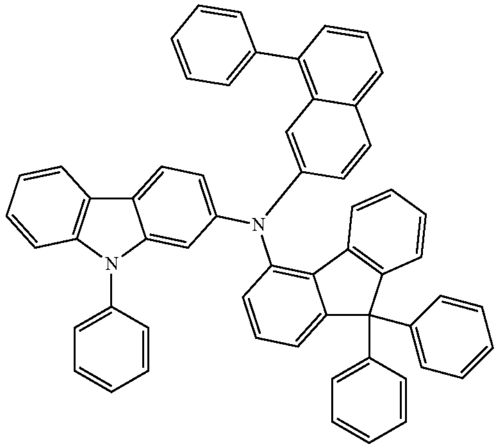
4-224
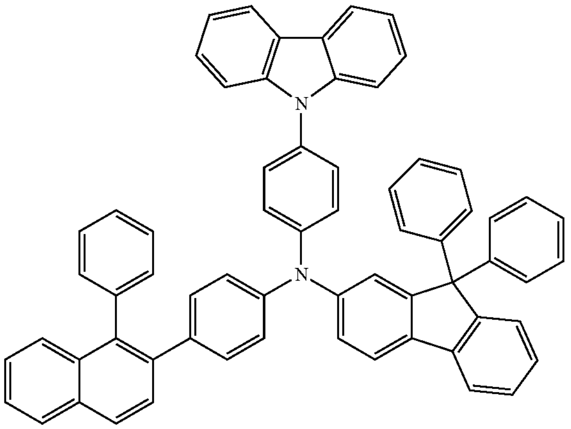
4-225
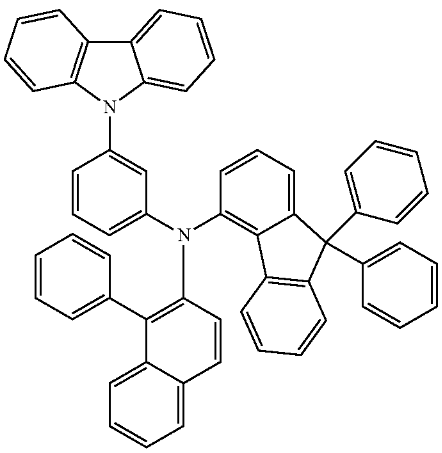

-continued
4-226
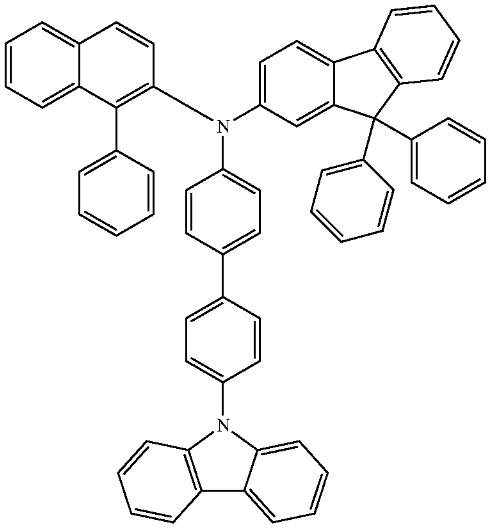
4-227
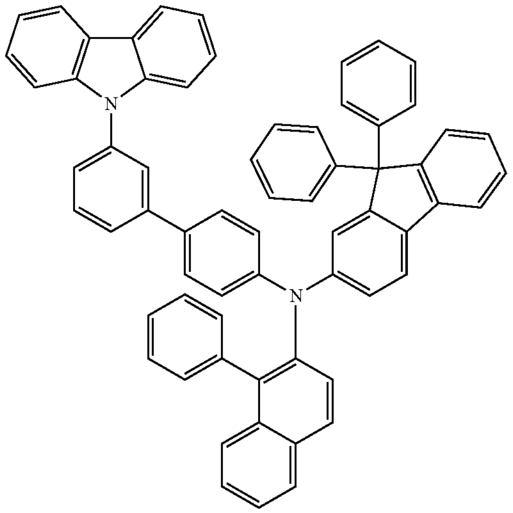
4-228
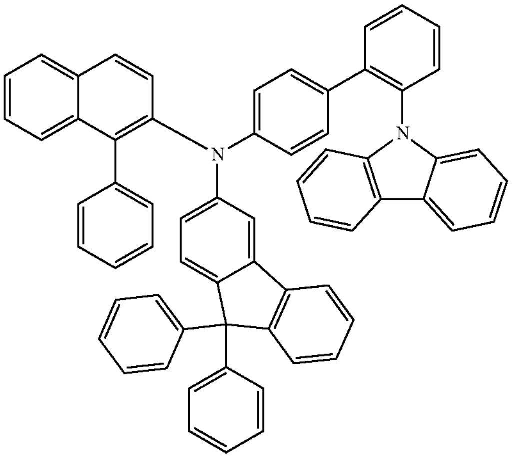
-continued
4-229
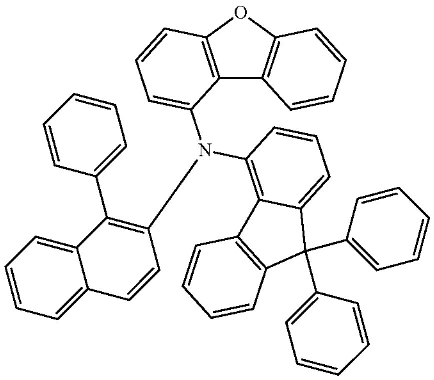
4-230
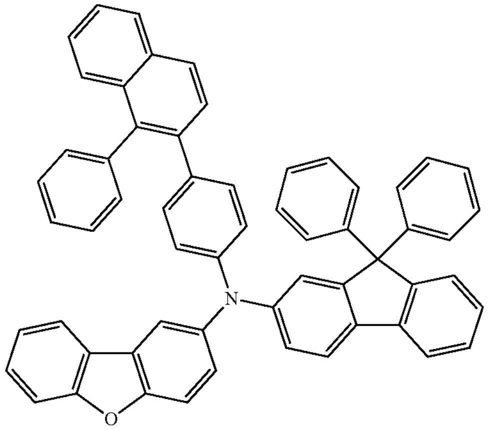
4-231
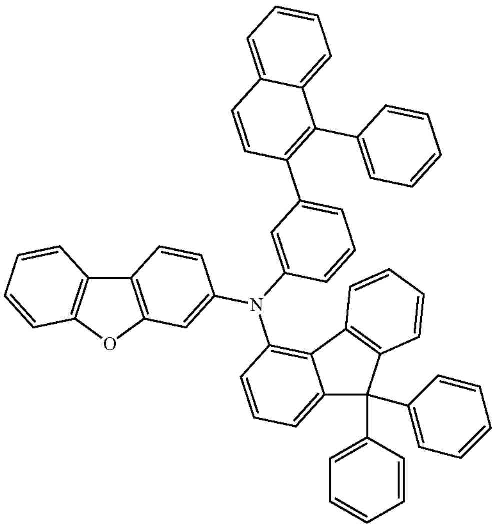

4-232
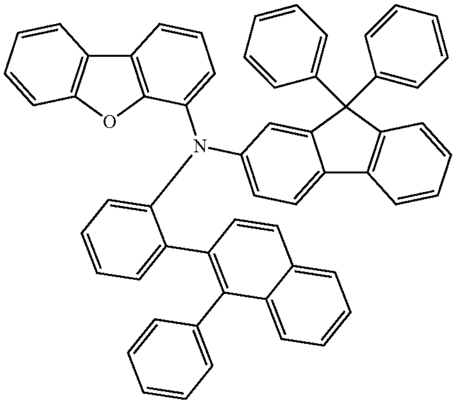
4-233
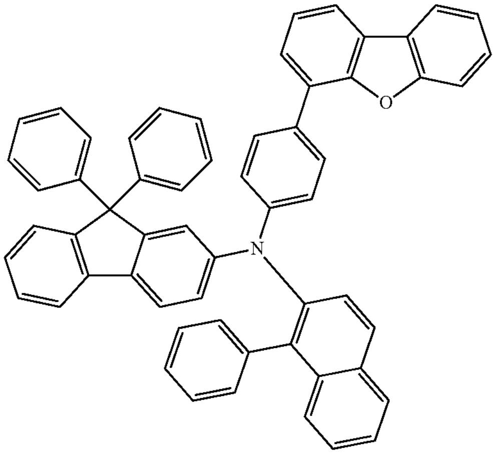
4-234
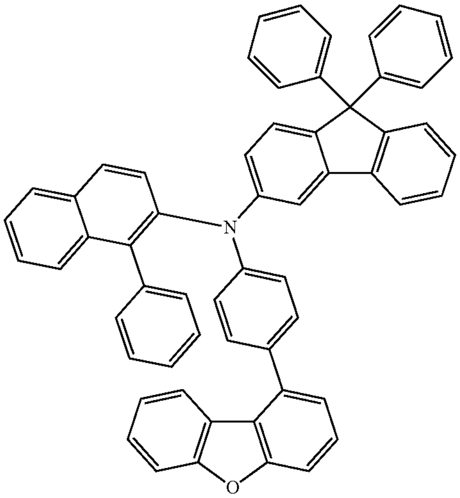
4-235
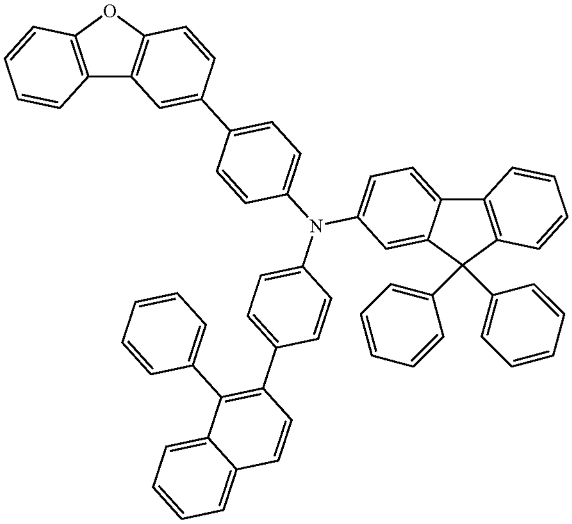
4-236
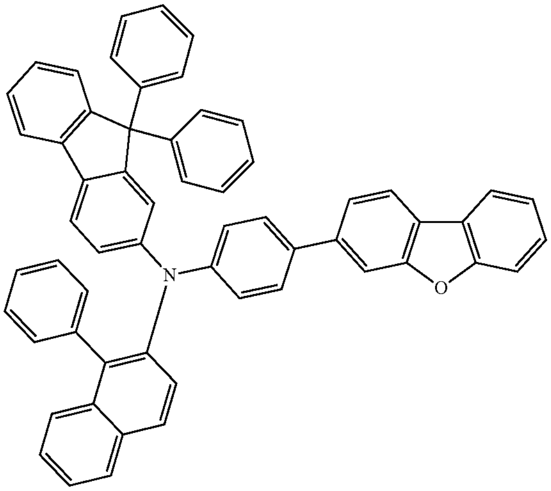
4-237
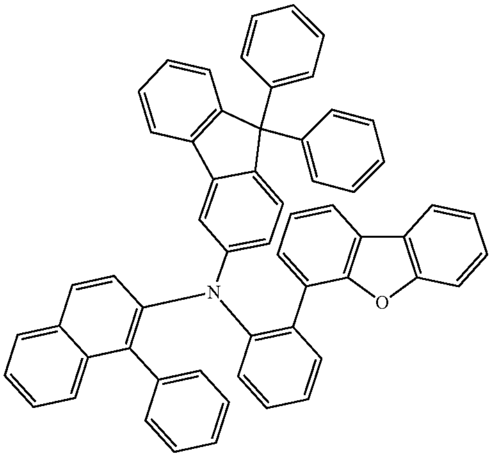

-continued
4-238
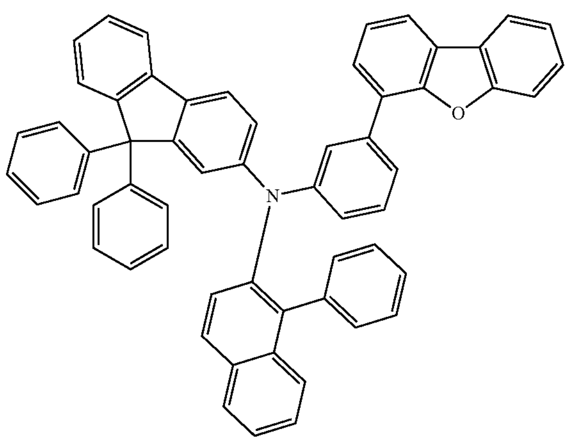
4-239
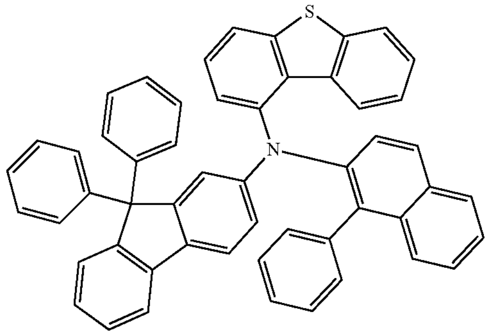
4-240
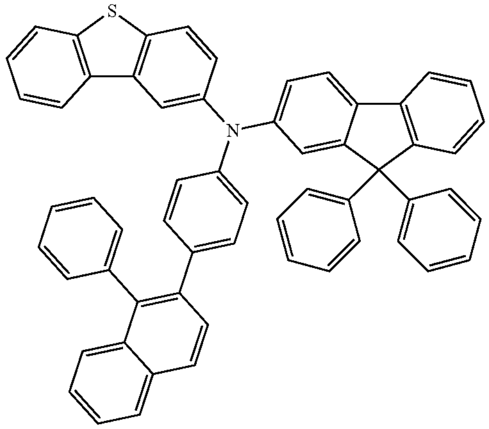
4-241
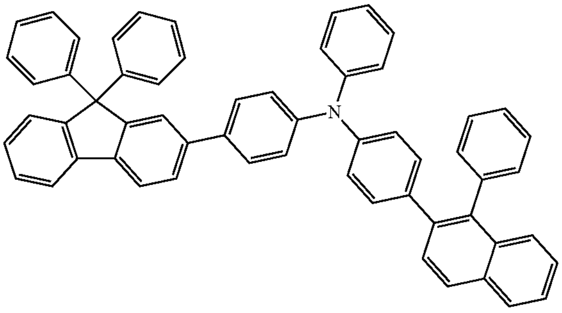
-continued
2-242
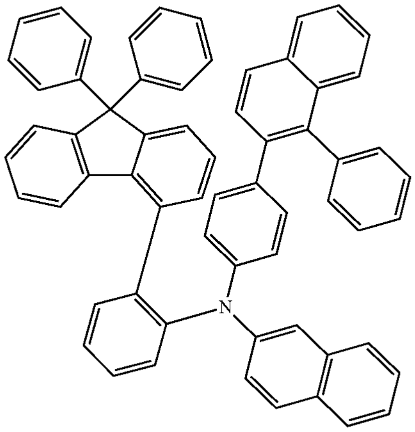
4-243
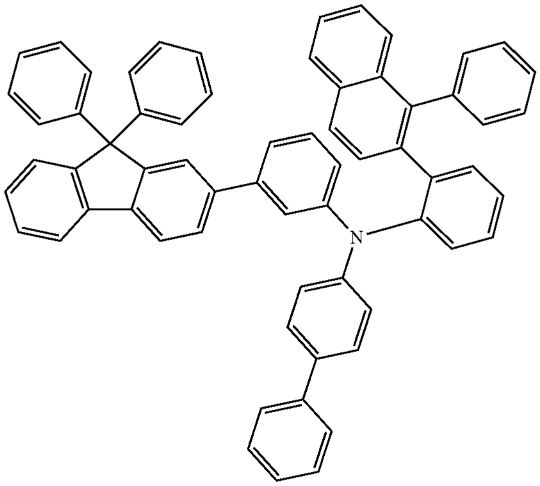
4-244
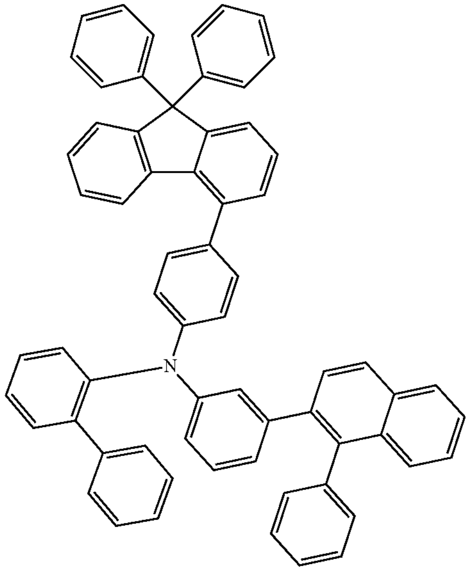

-continued
4-245
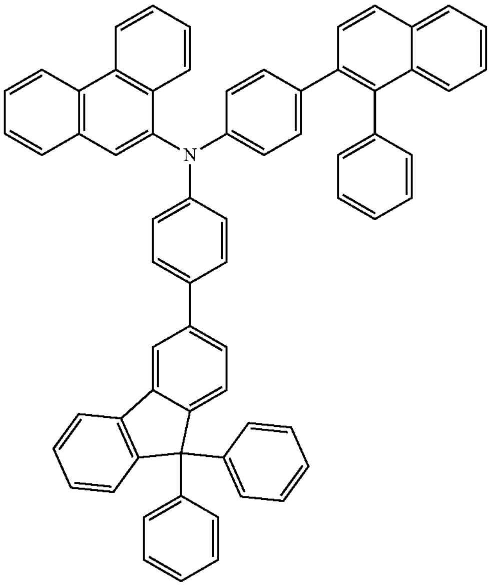
4-246
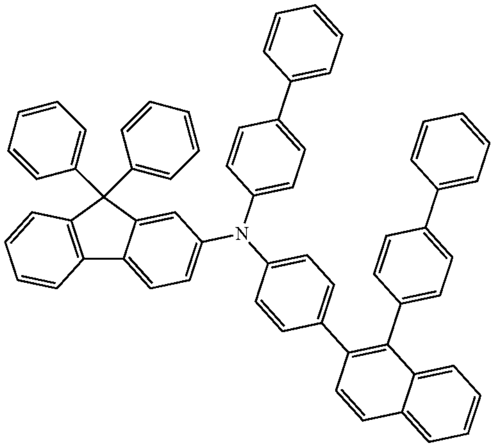
4-247
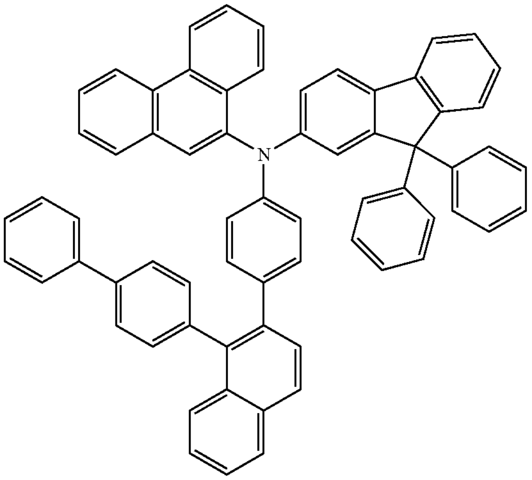
-continued
4-248
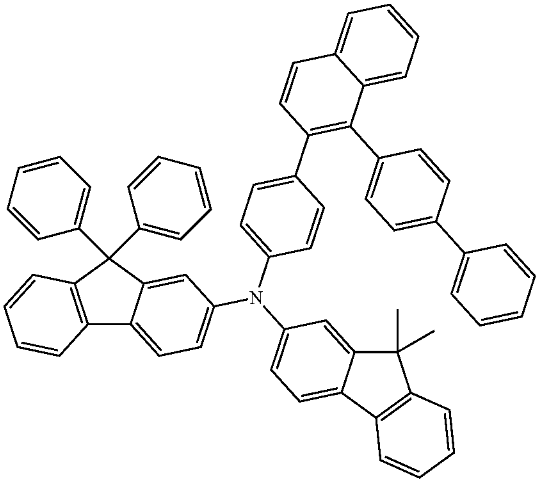
4-249
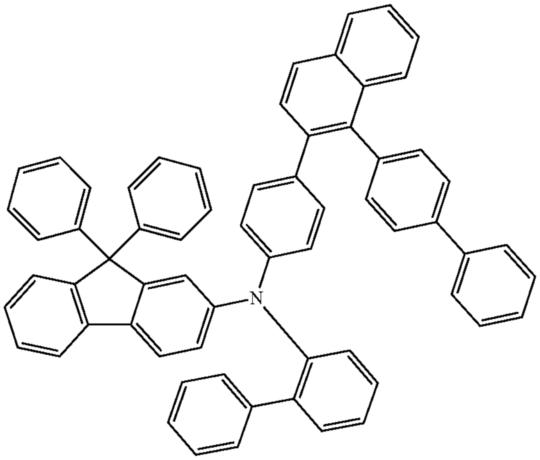
4-250
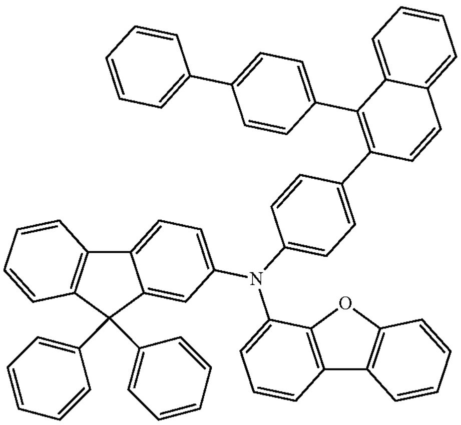

4-251
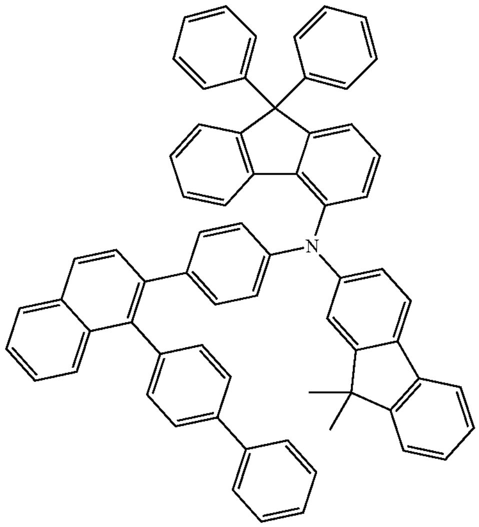
4-252
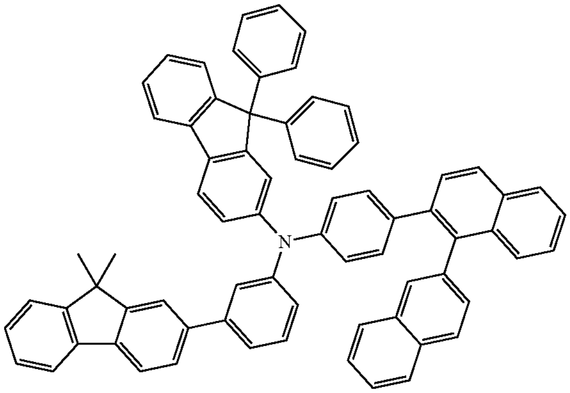
4-253
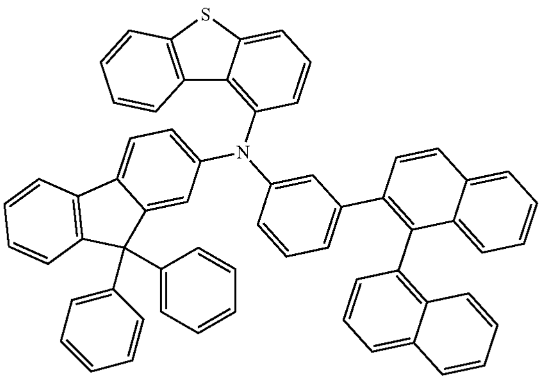
4-254
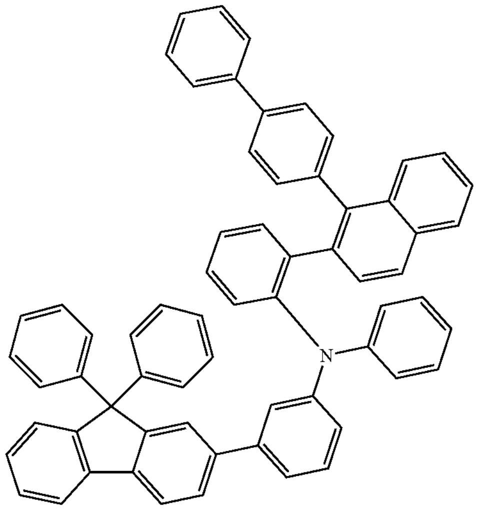
4-255
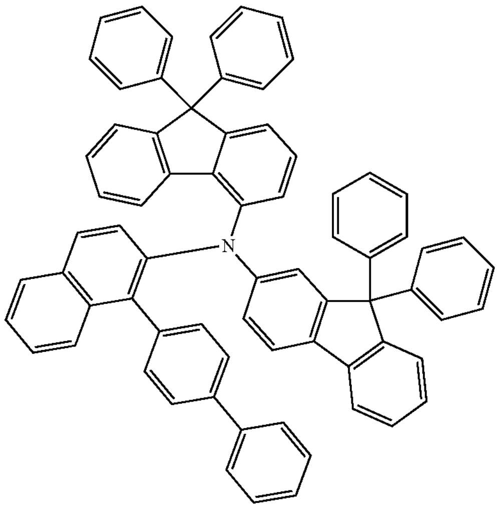
4-256
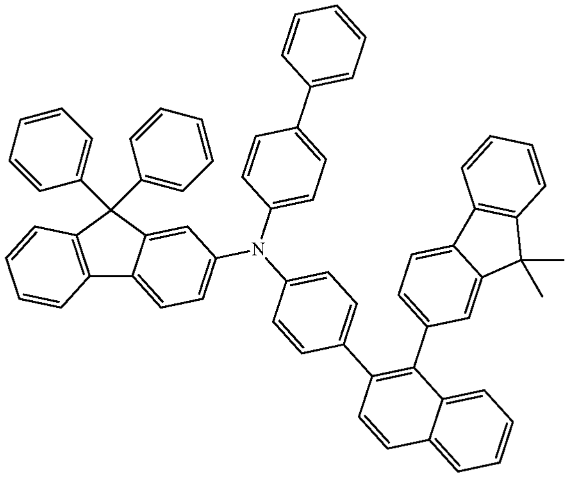

4-257
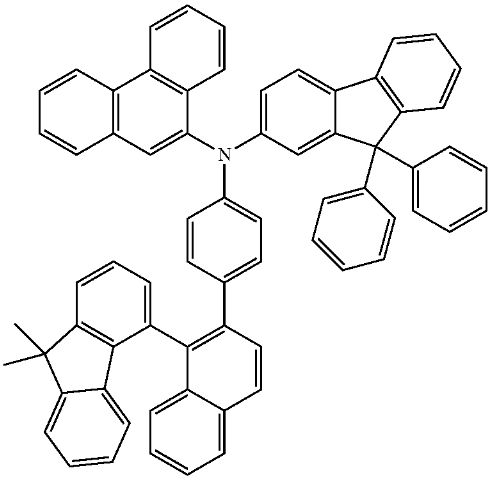
4-258
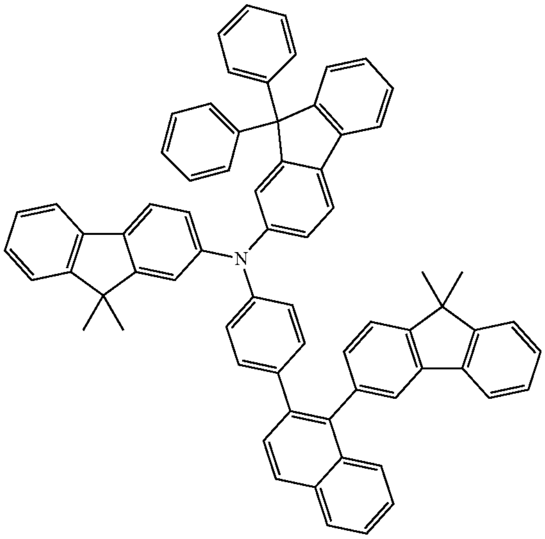
4-259
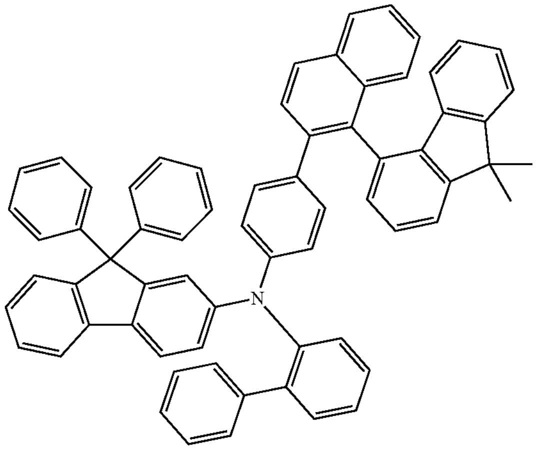
4-260
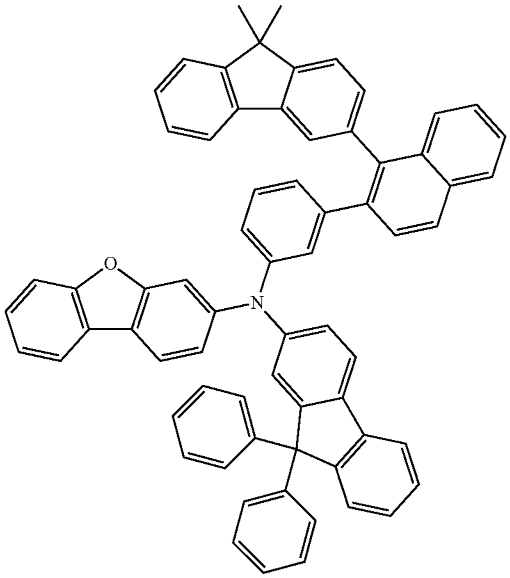
4-261
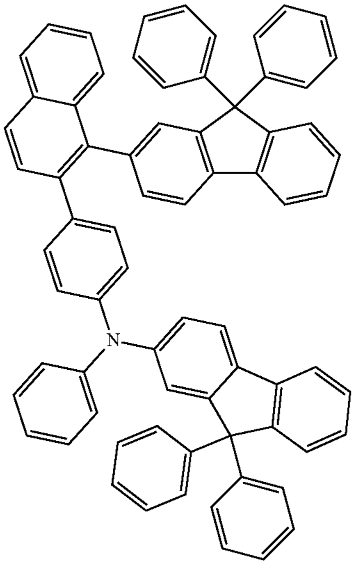
4-262
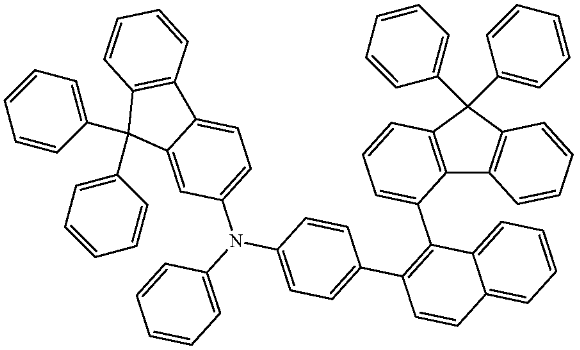

-continued
4-263
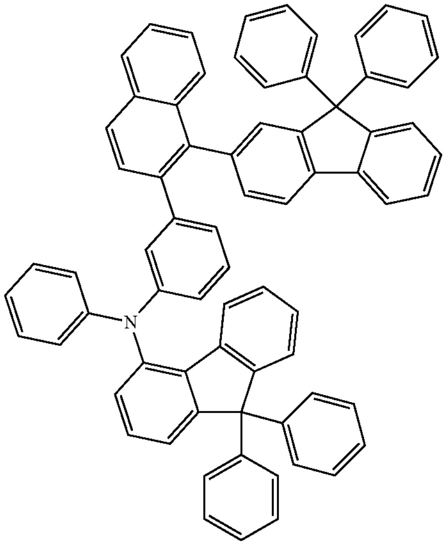
4-264
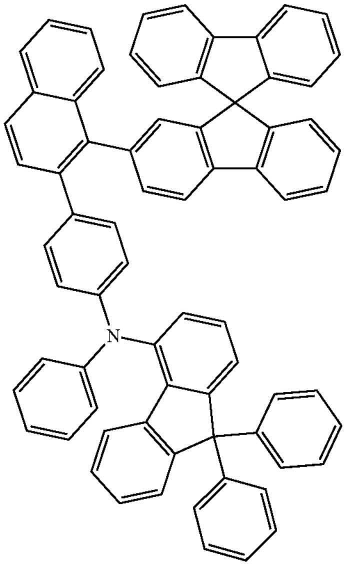
4-265
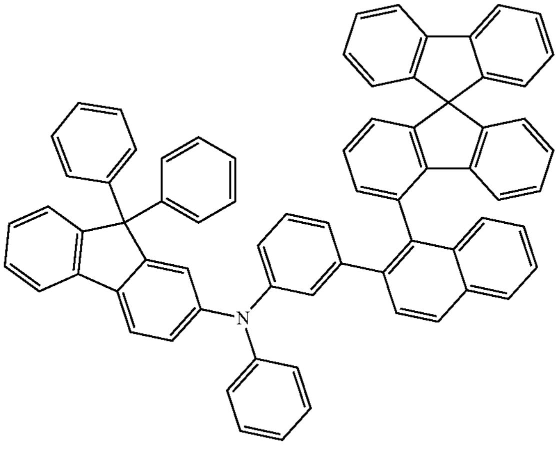
-continued
4-266
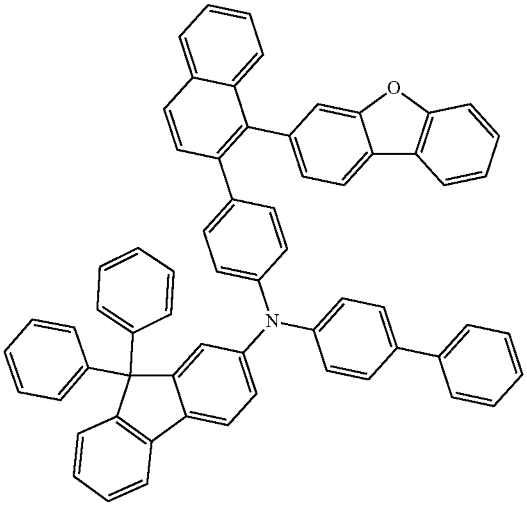
4-267
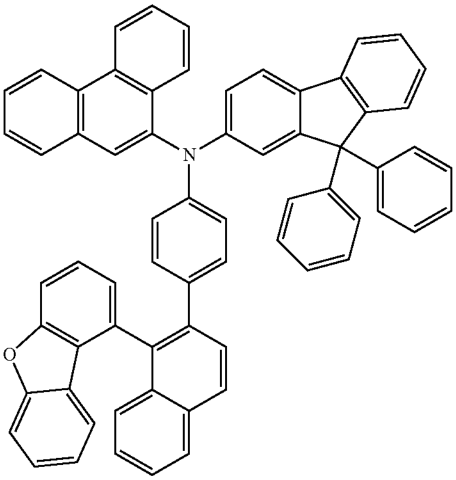
4-268
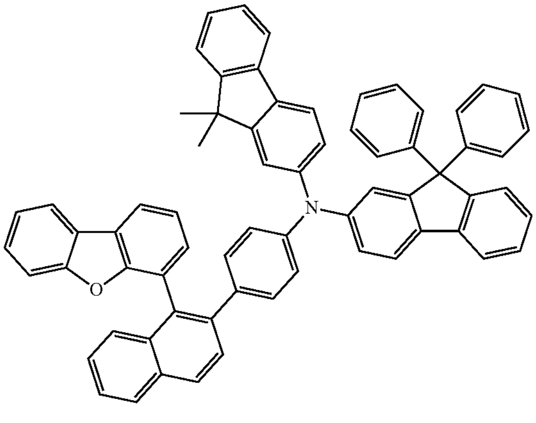

-continued
4-269
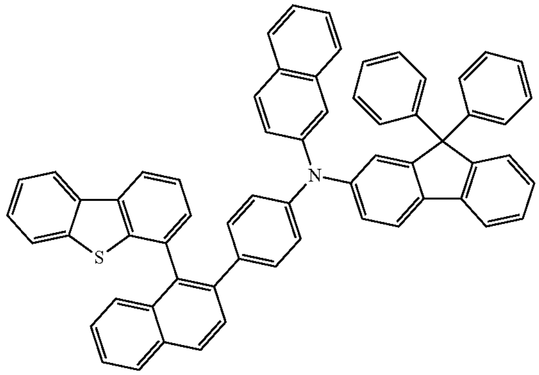
4-270
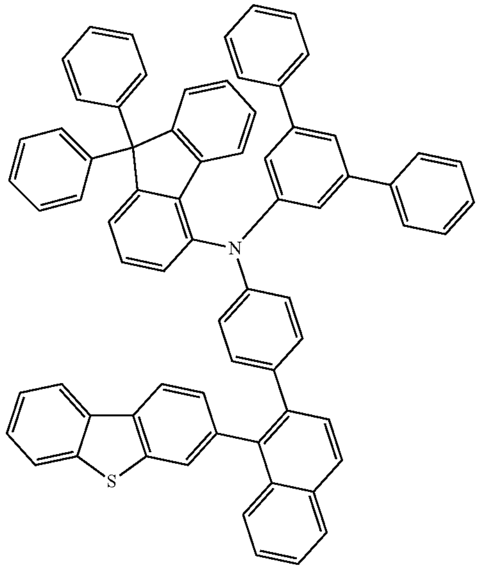
4-271
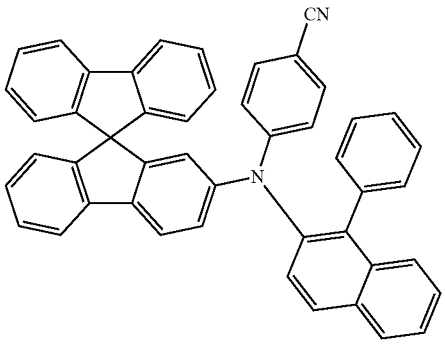
-continued
4-272
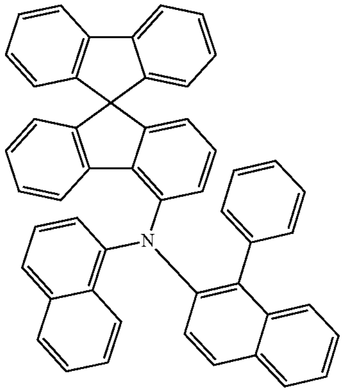
4-273
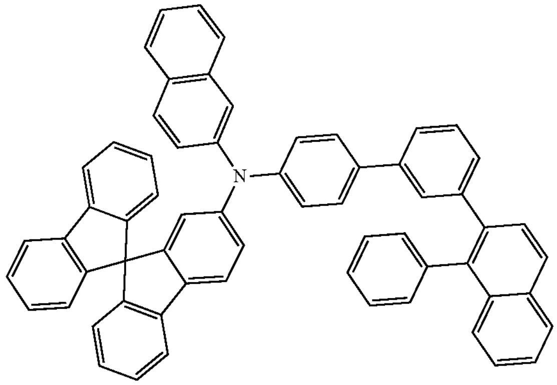
4-274
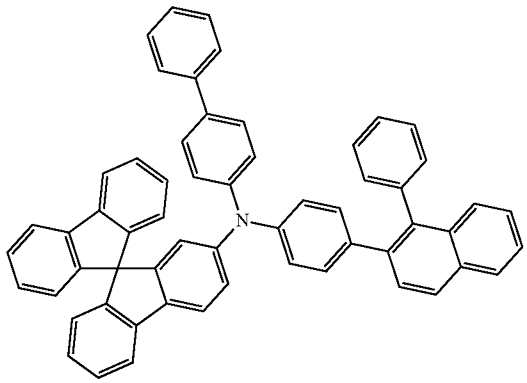

-continued
4-275
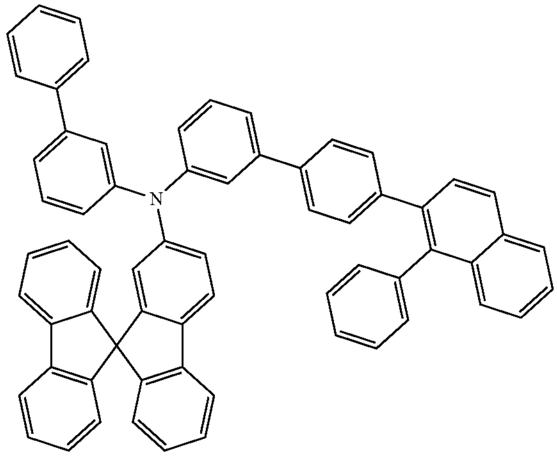
4-276
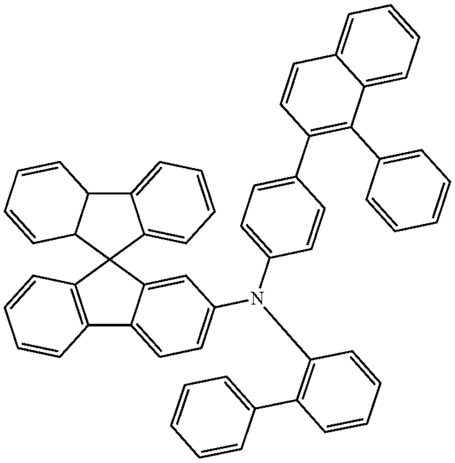
4-277
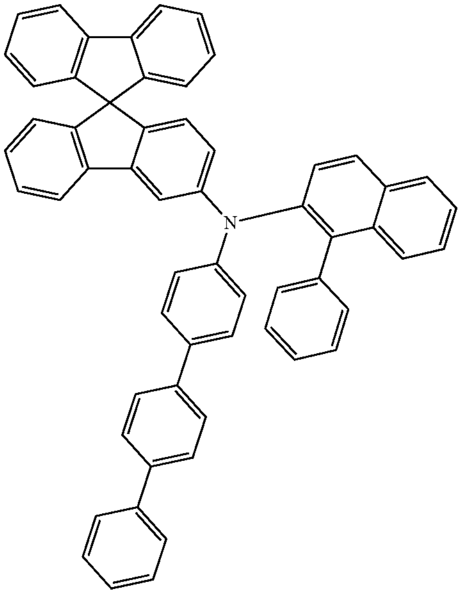
-continued
4-278
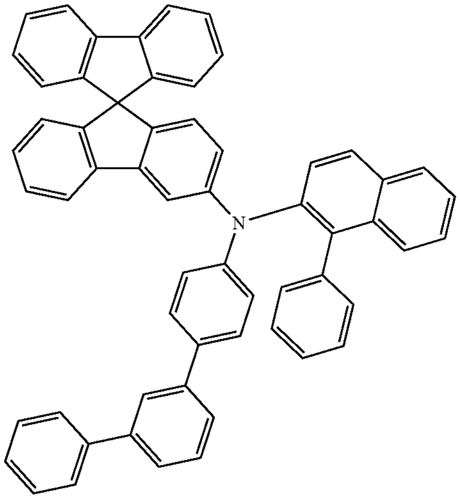
4-279
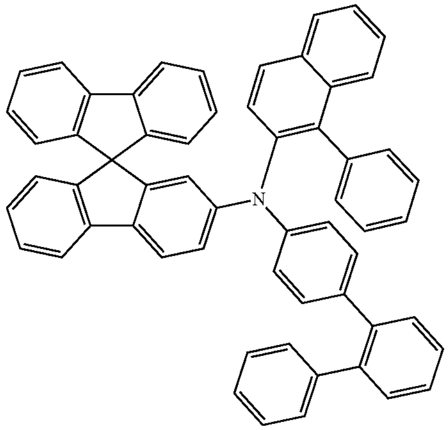
4-280
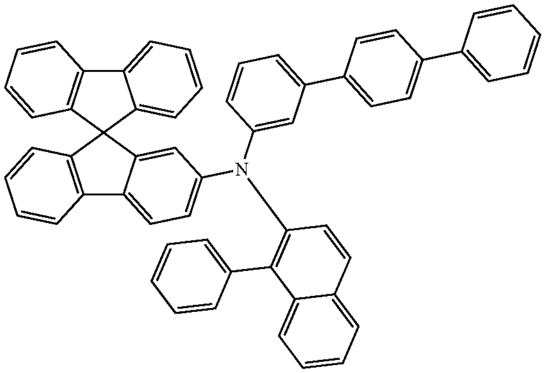

-continued
4-281
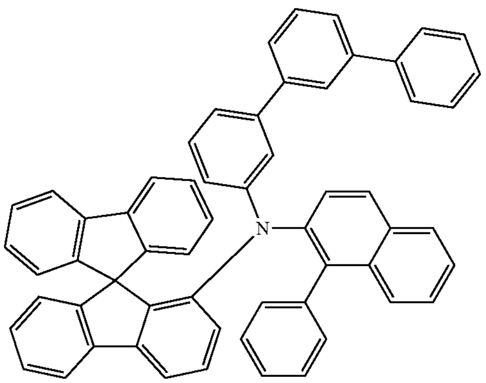
4-282
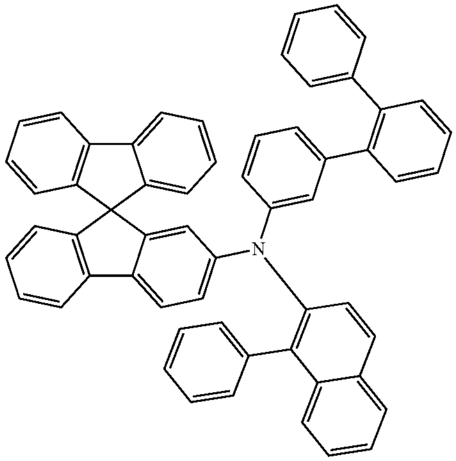
4-283
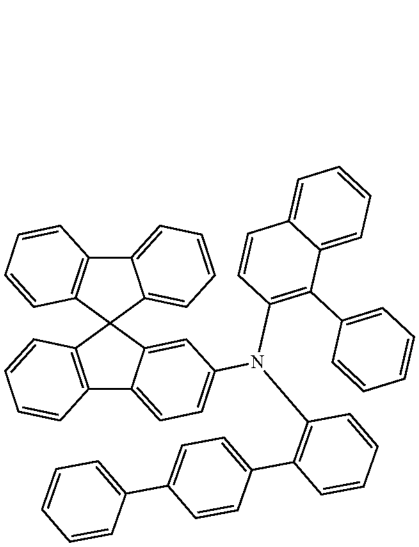
-continued
4-284
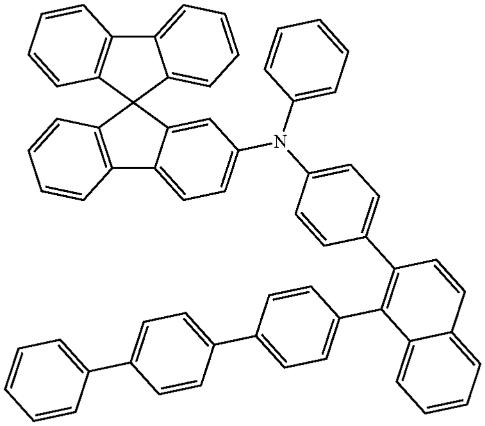
4-285
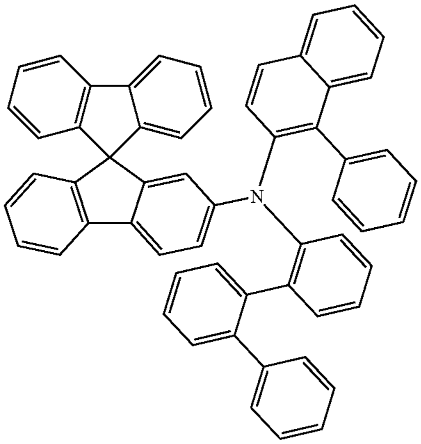
4-286
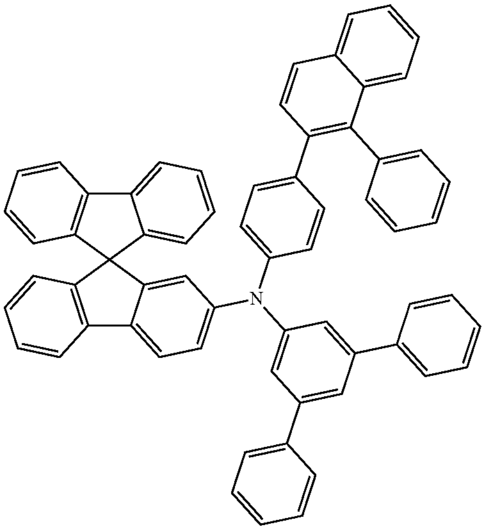

-continued
4-287
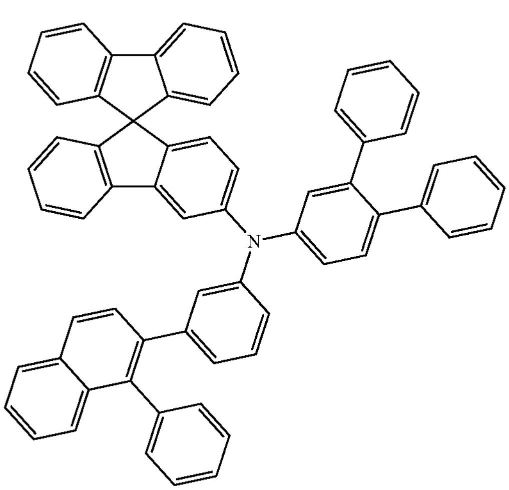
4-288
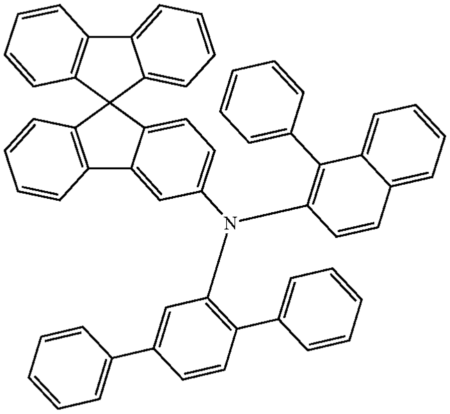
4-289
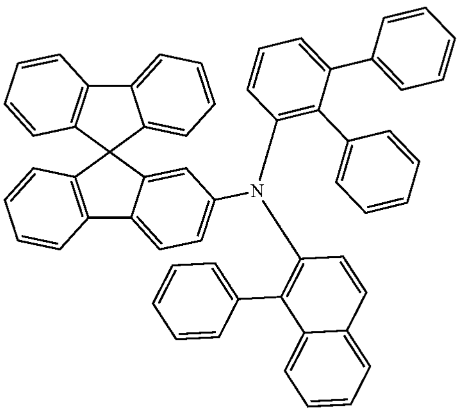
-continued
4-290
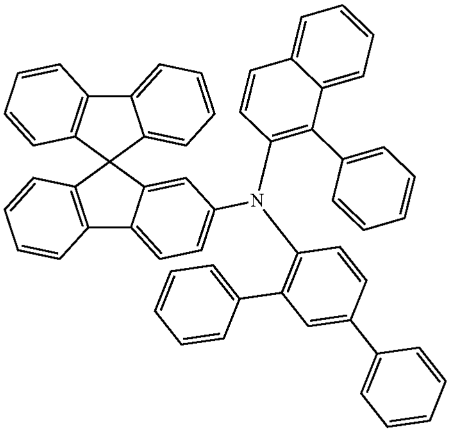
4-291
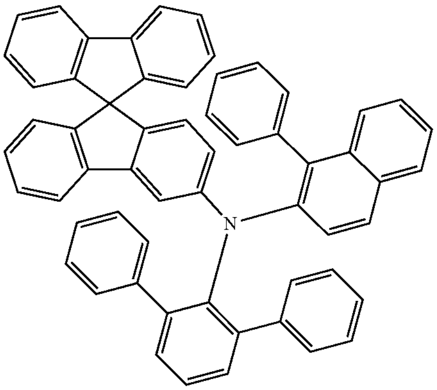
4-292
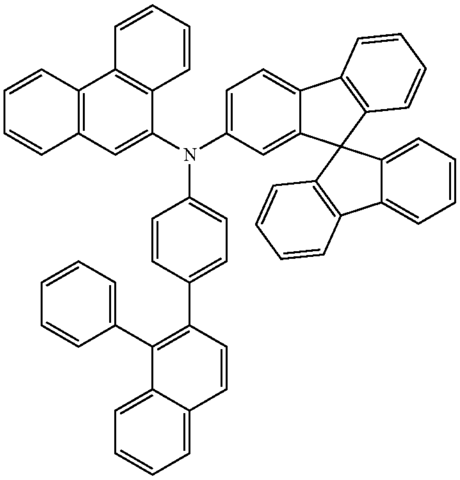

-continued
4-293
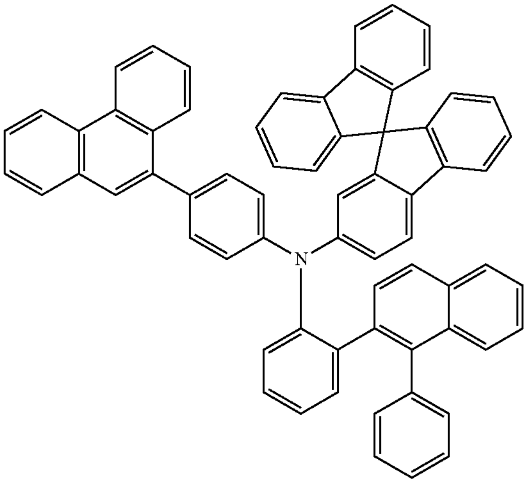
4-294
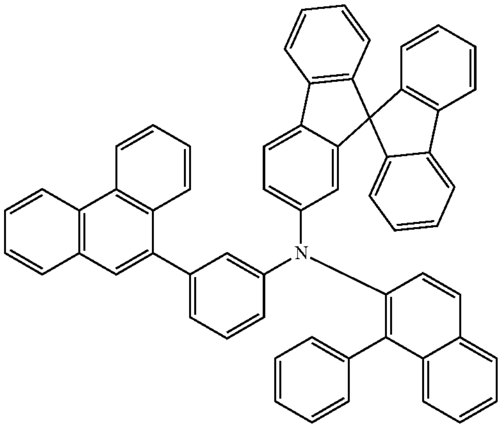
4-295
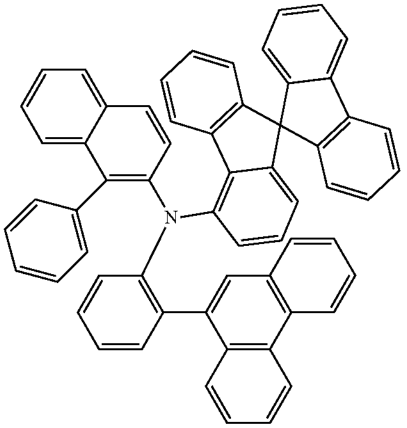
-continued
4-296
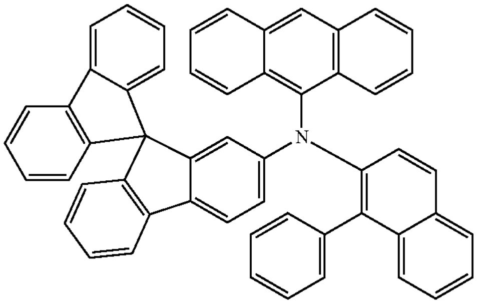
4-297
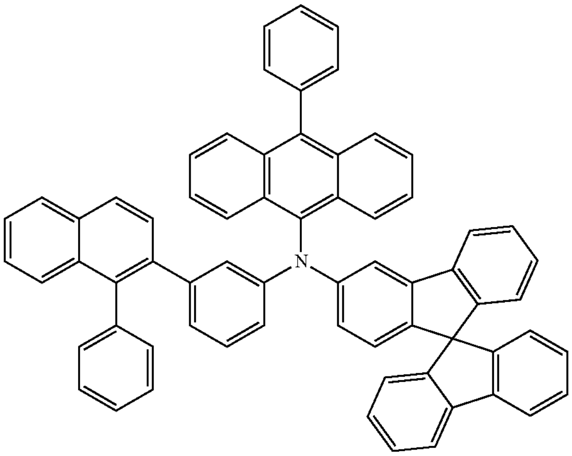
4-298
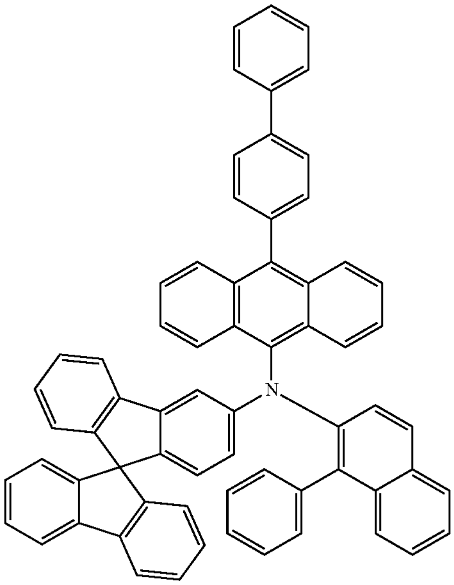

-continued
4-299
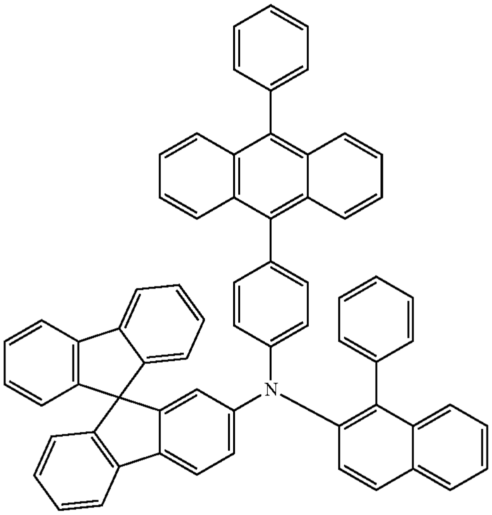
4-300
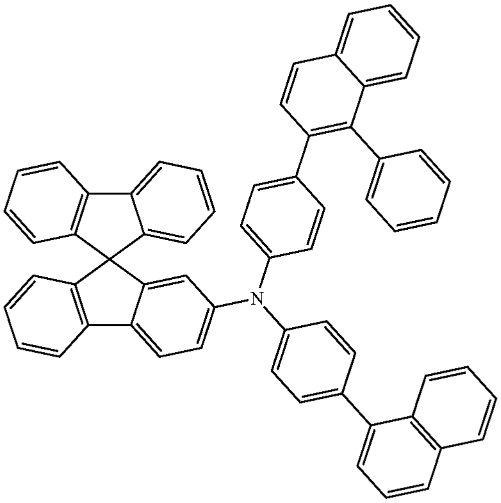
4-301
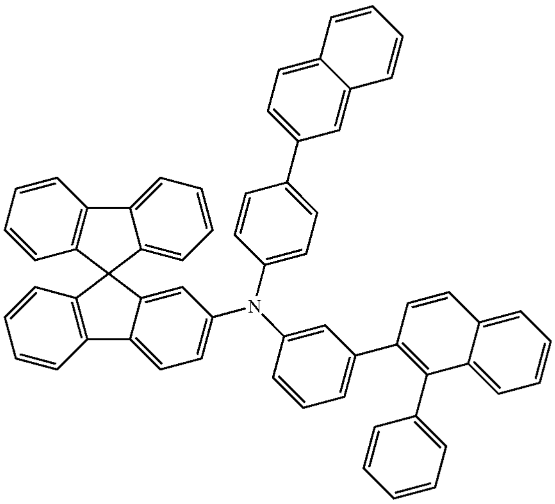
-continued
4-302
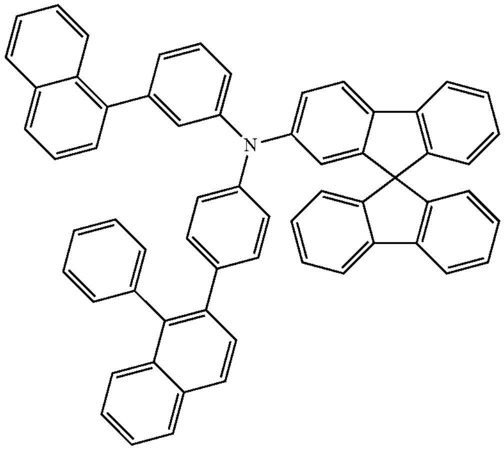
4-303
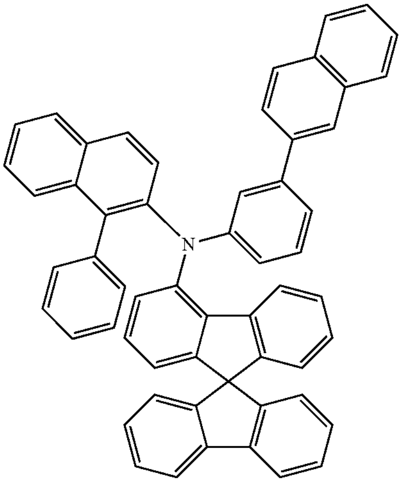
4-304
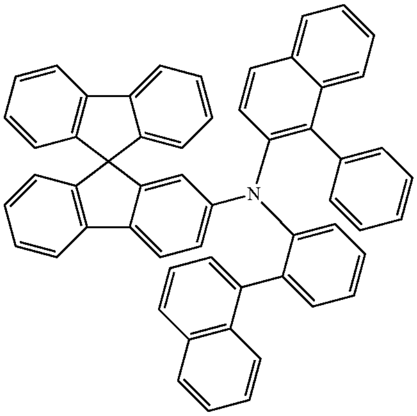

-continued
4-305
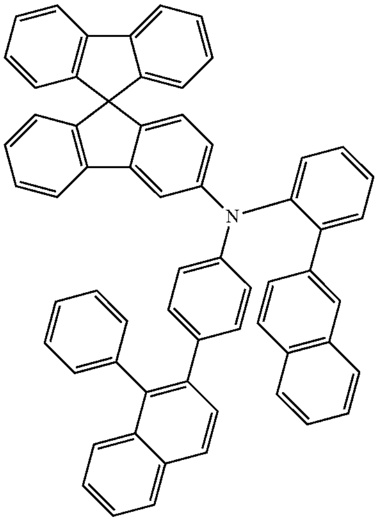
4-306
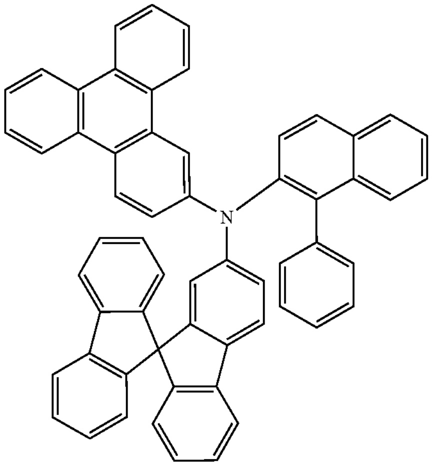
4-307
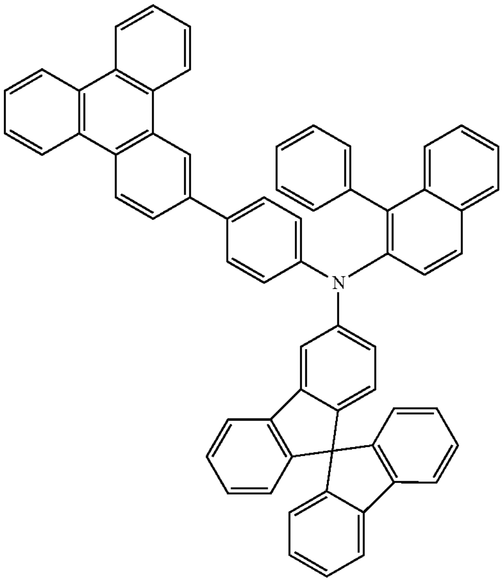
-continued
4-308
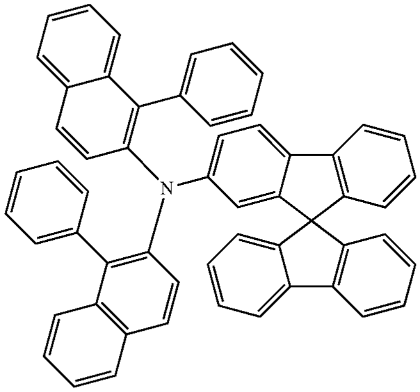
4-309
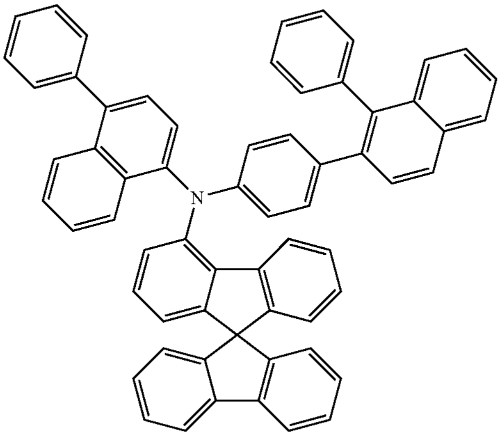
4-310
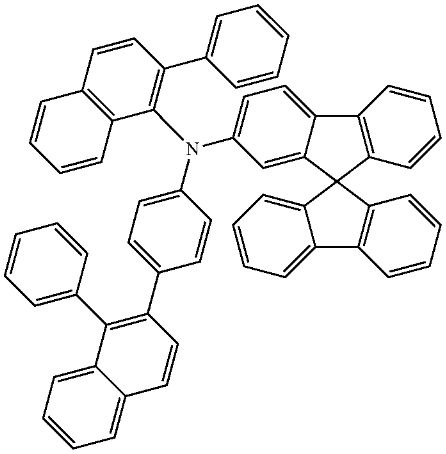

-continued
4-311
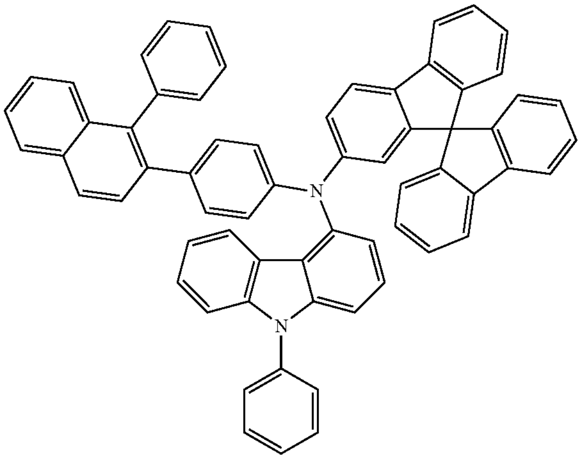
4-312
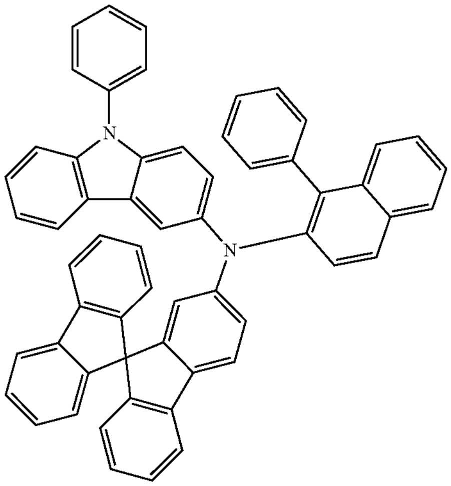
4-313
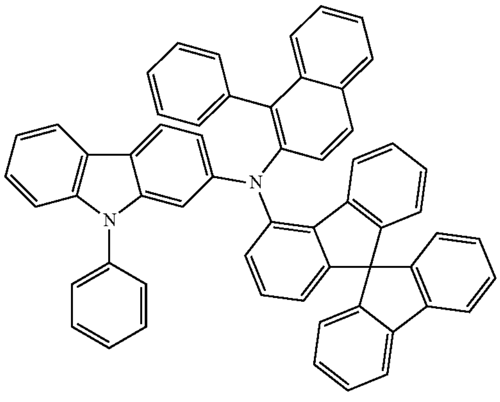
-continued
4-314
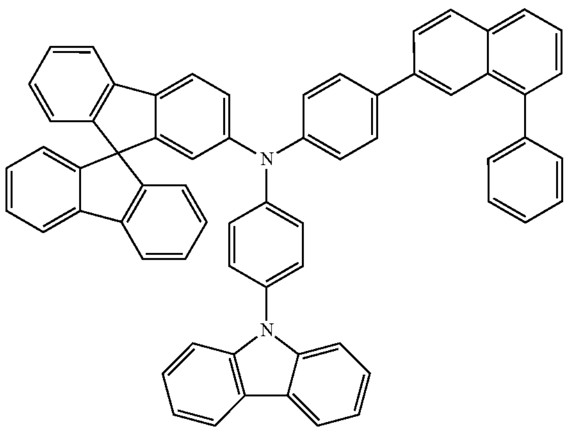
4-315
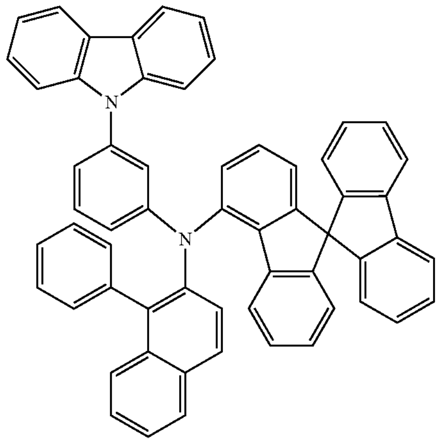
4-316
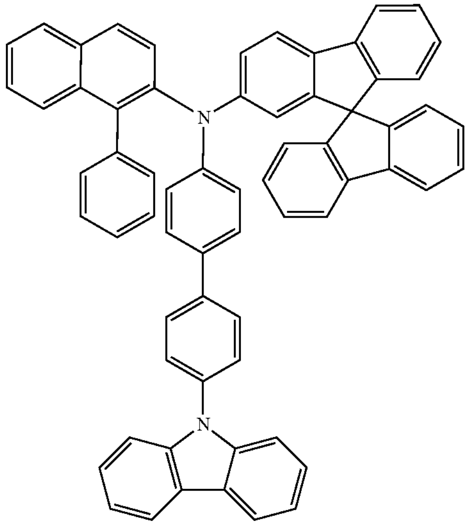

-continued
4-317
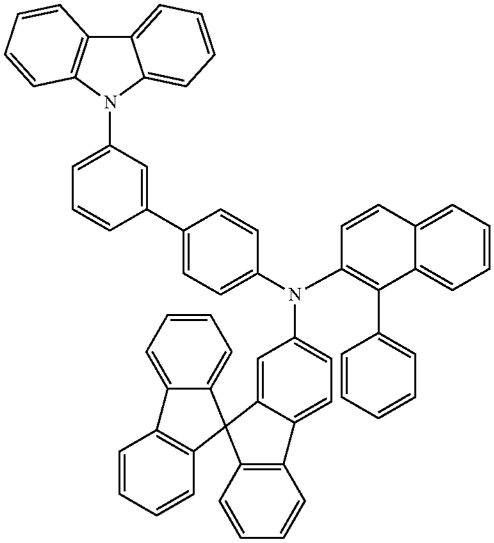
4-318
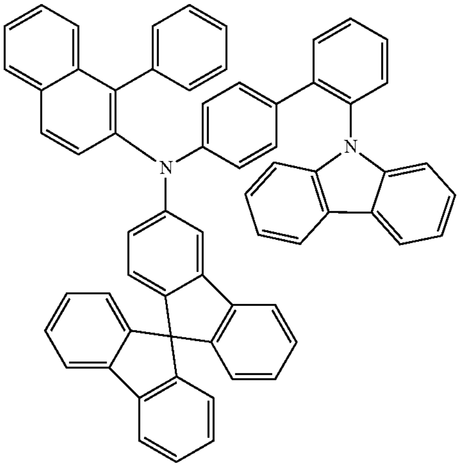
4-319
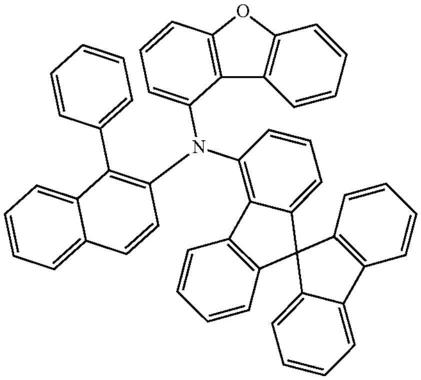
-continued
4-320
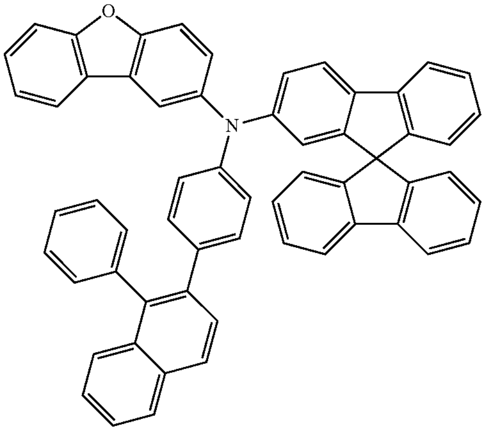
4-321
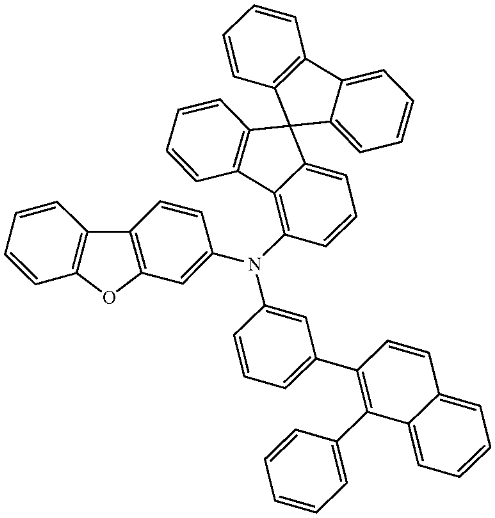
4-322
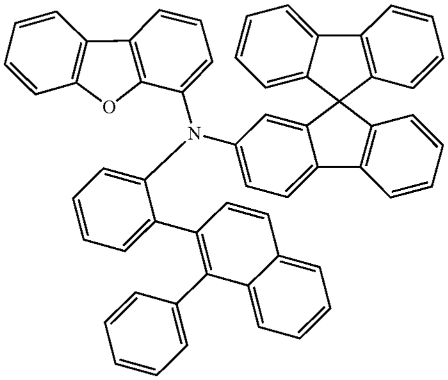

-continued
4-323
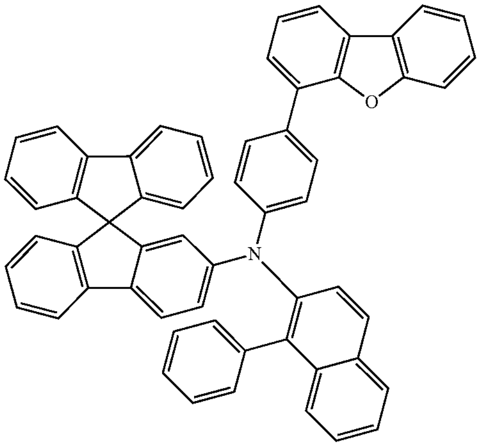
4-324
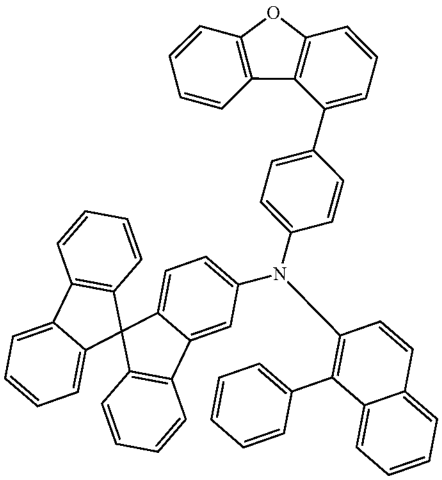
4-325
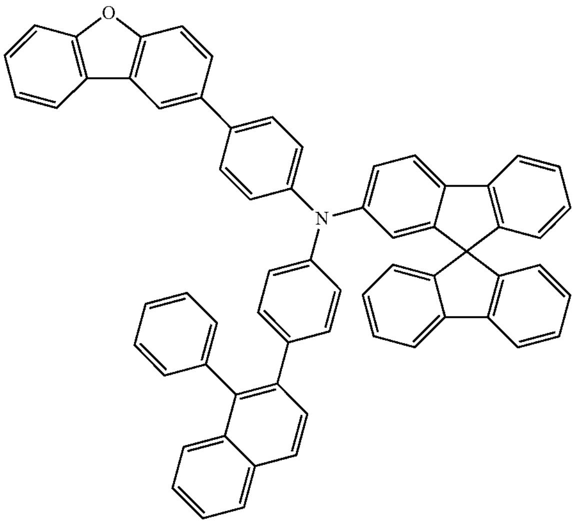
-continued
4-326
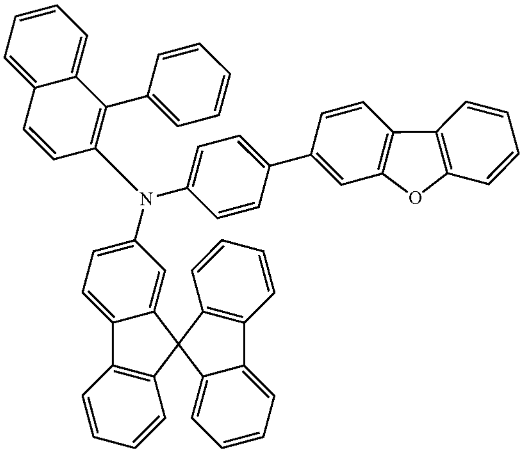
4-327
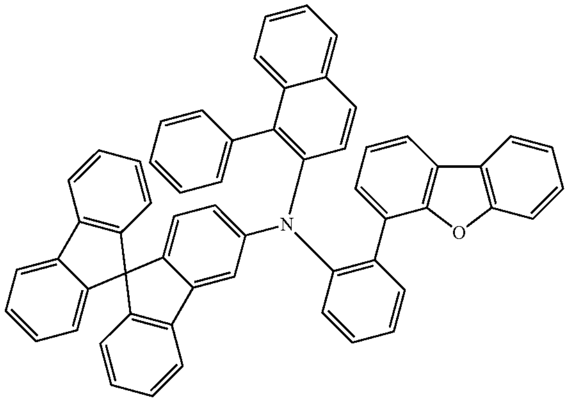
4-328
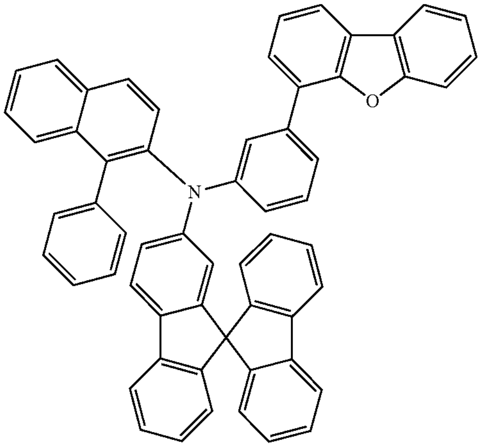

-continued
4-329
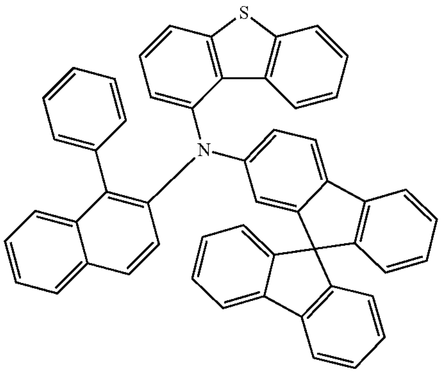
4-330
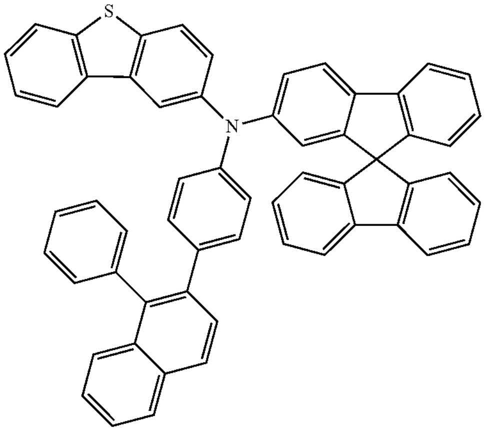
4-331
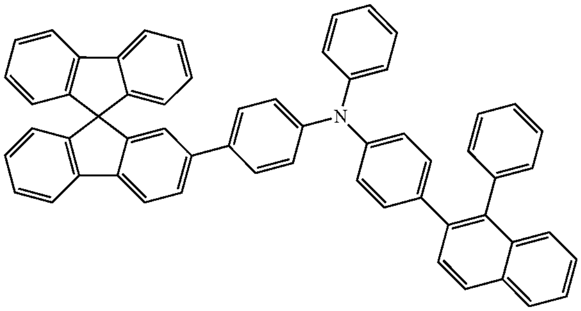
4-332
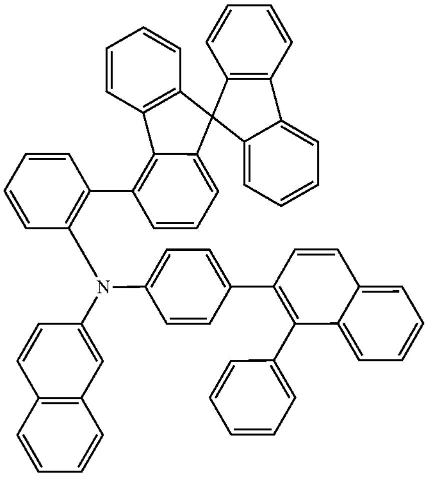
-continued
4-333
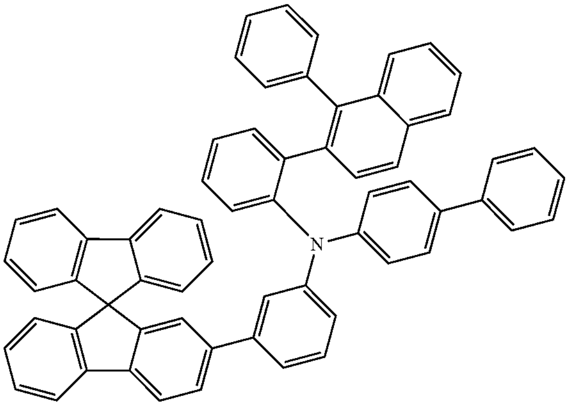
4-334
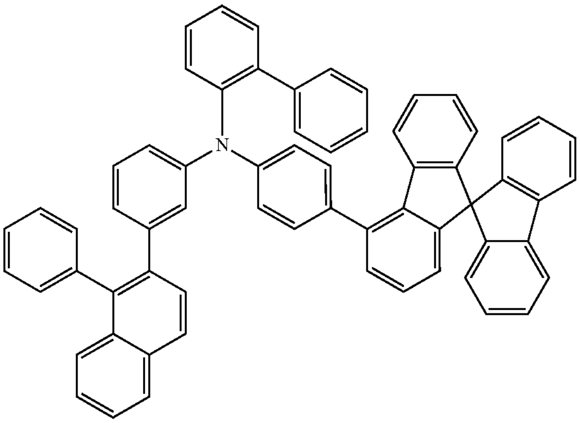
4-335
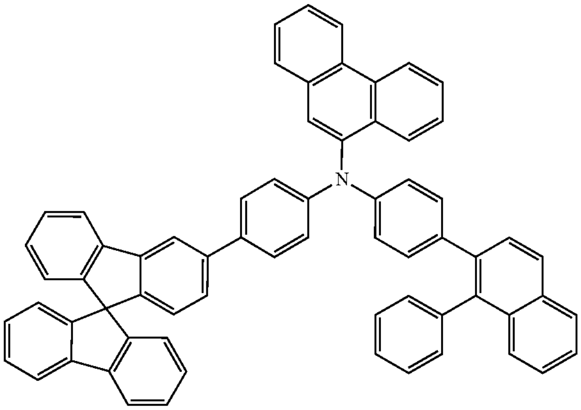

-continued
4-336
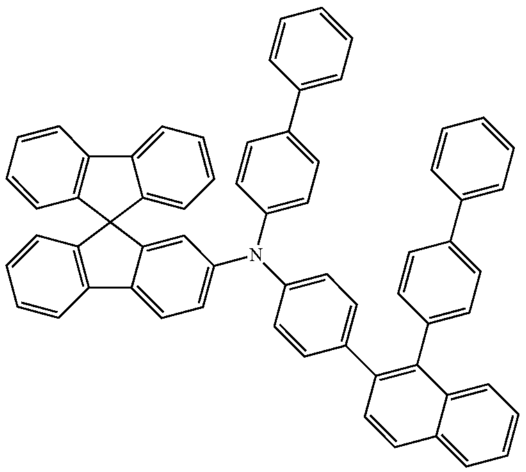
4-337
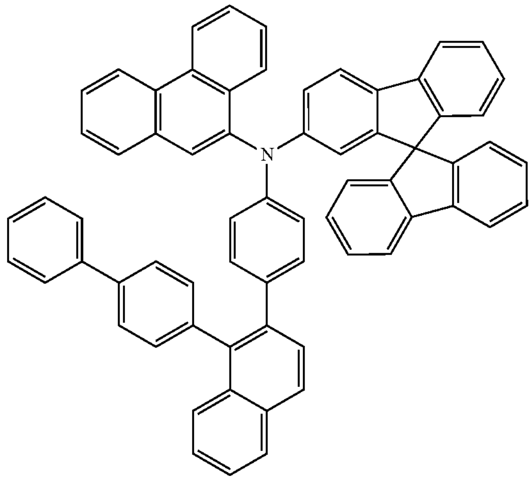
4-338
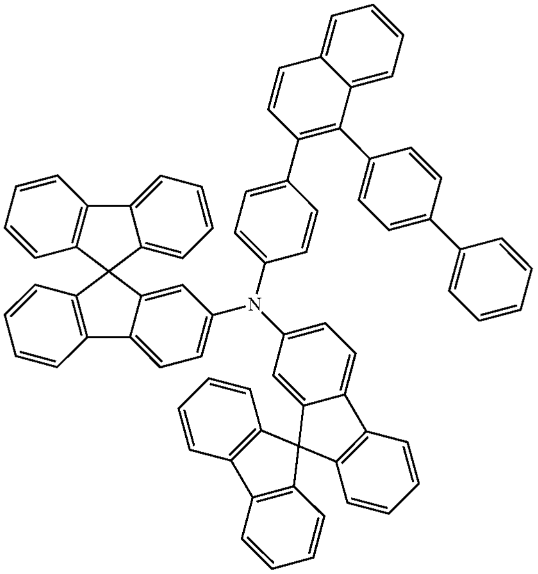
-continued
4-339
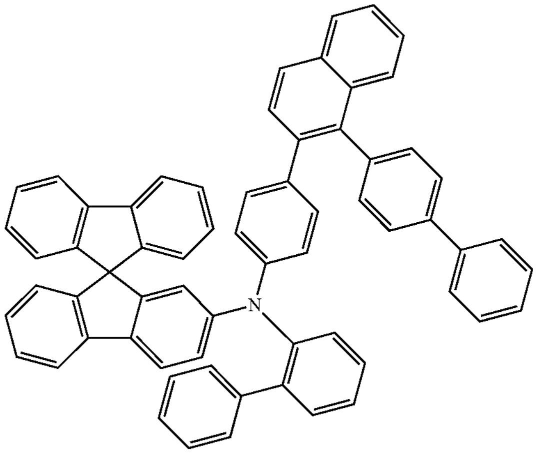
4-340
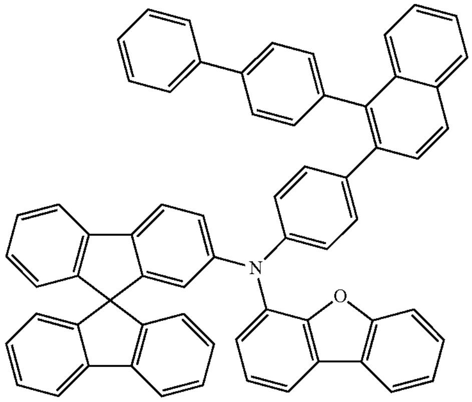
4-341
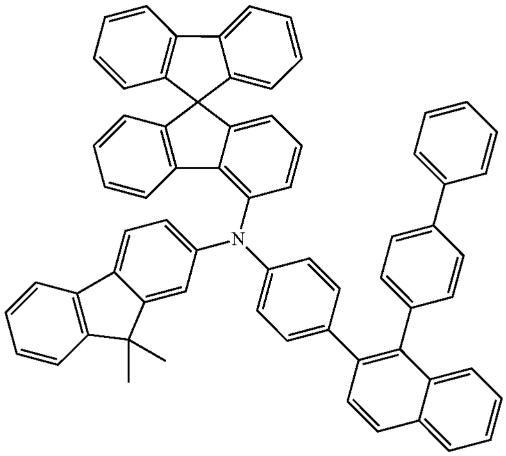

-continued
4-342
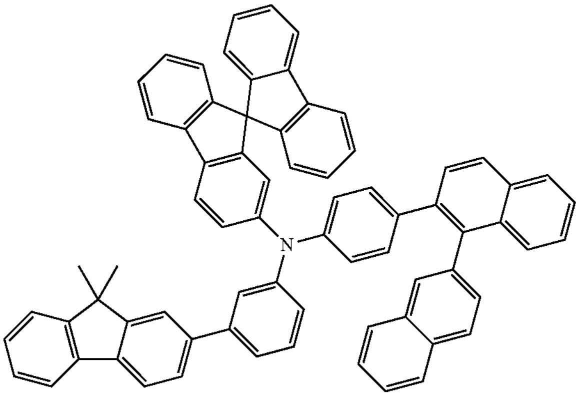
4-343
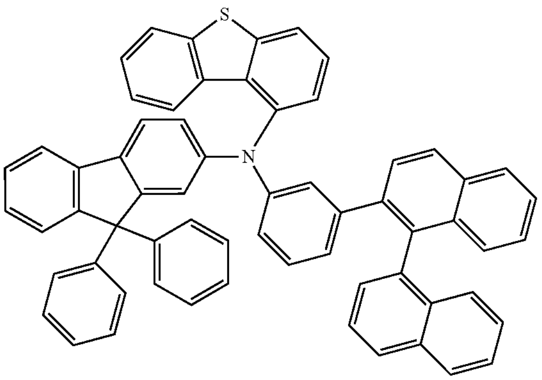
4-344
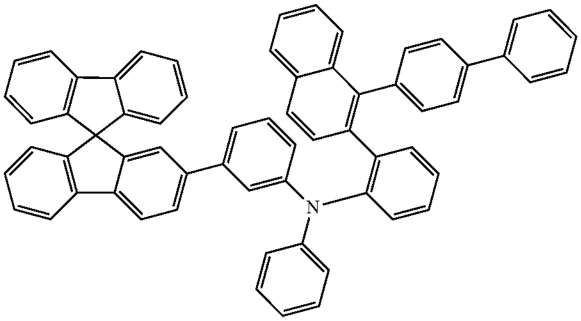
-continued
4-345
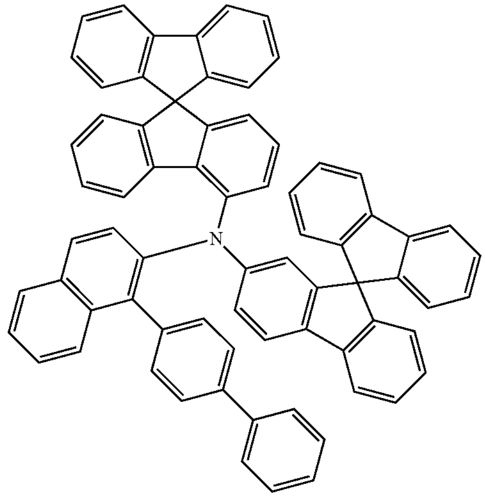
4-346
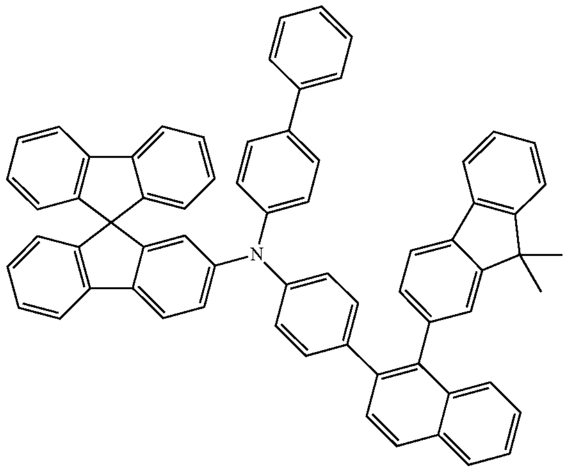
4-347
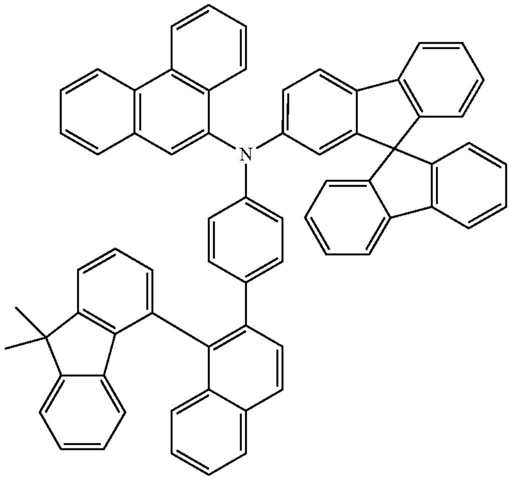

4-348
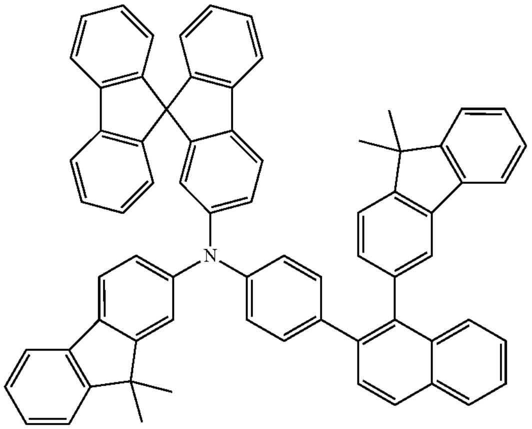
4-349
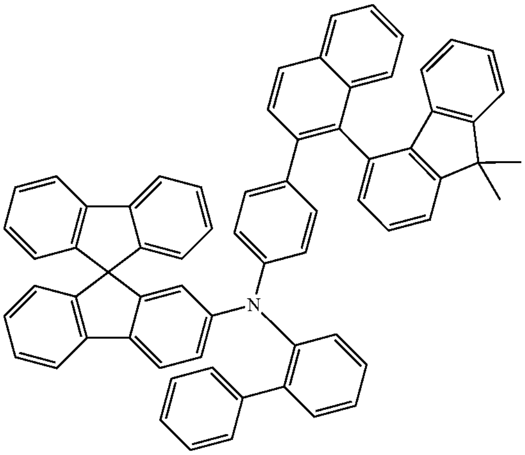
4-350
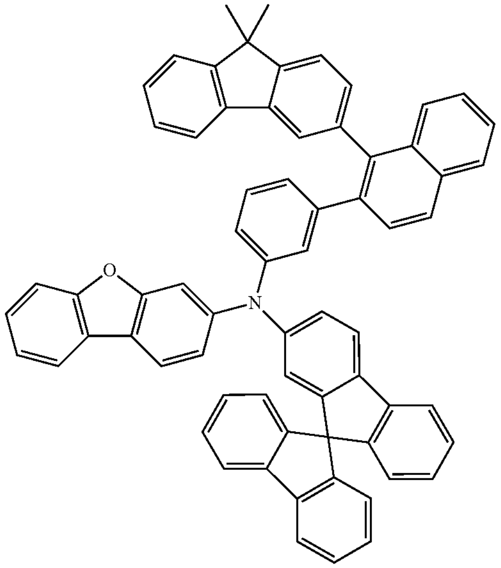
4-351
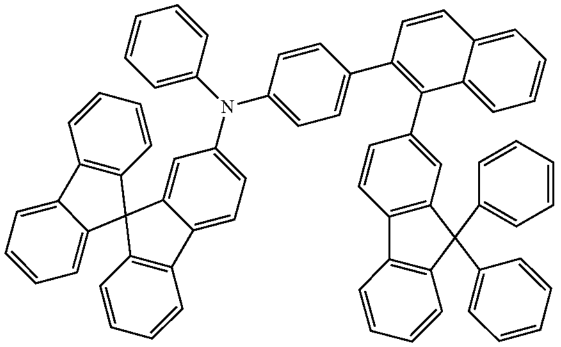
4-352
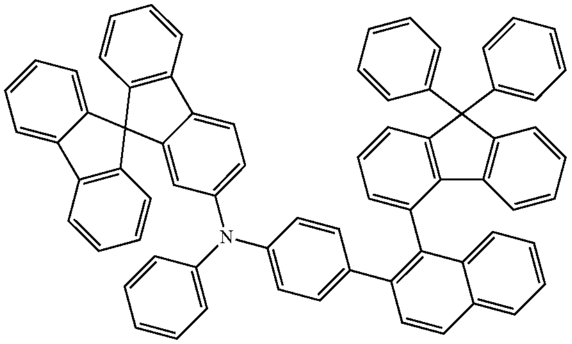
4-353
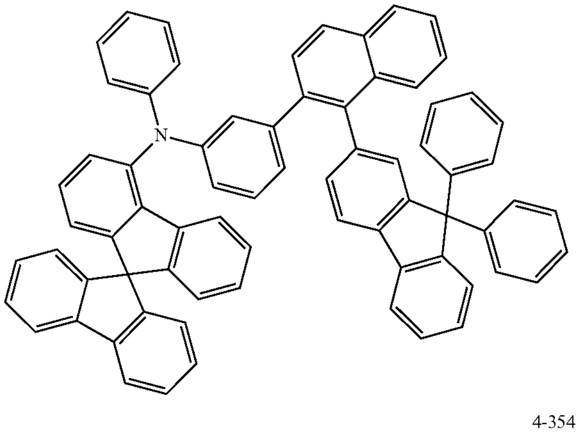
4-354
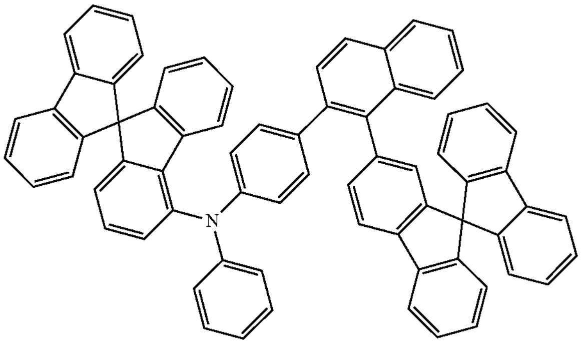

-continued 4-355

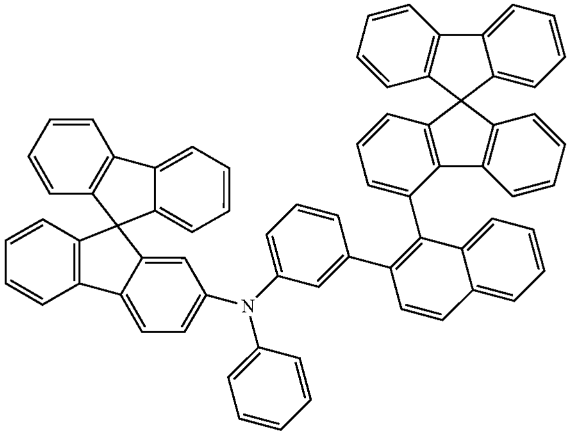

4-356

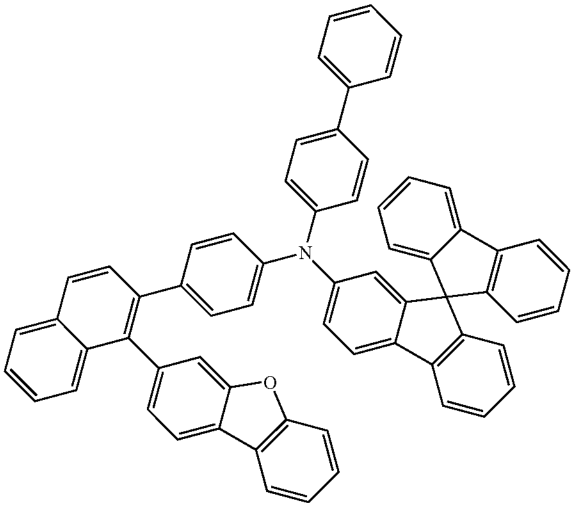

4-357

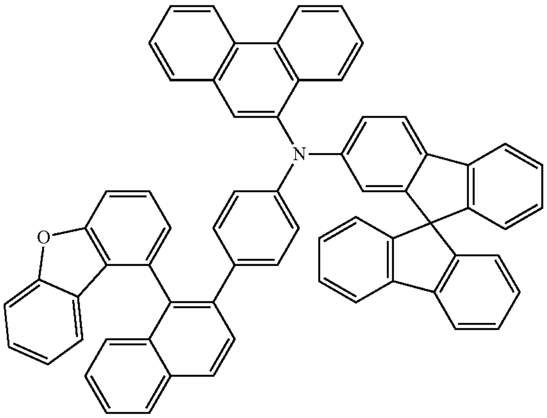

-continued 4-358

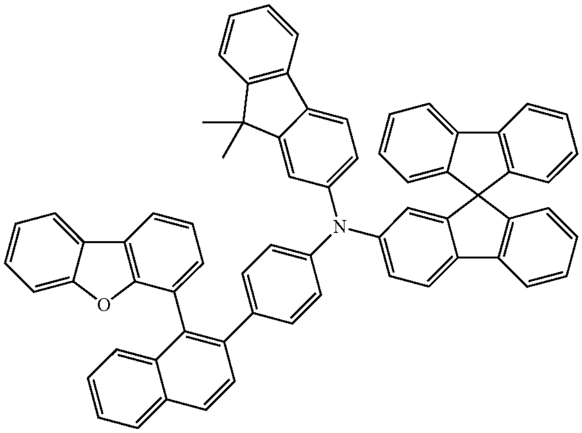

4-359

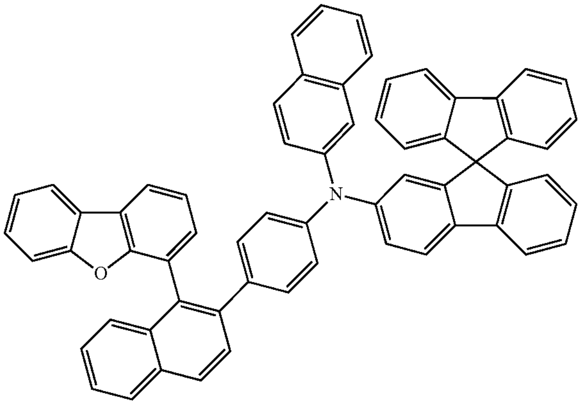

4-360

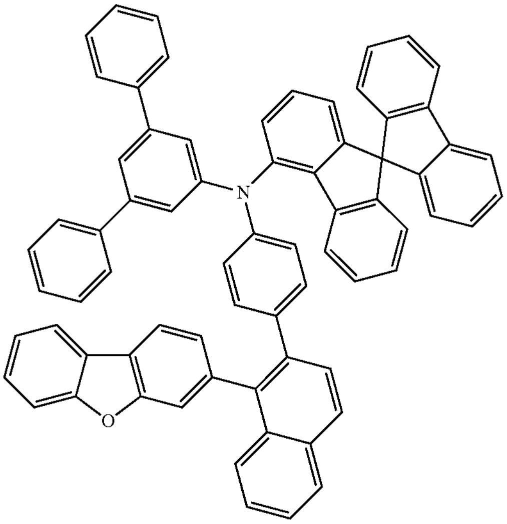

In one embodiment of the present specification, the organic material layer may include Compound (A) and Compound (B) in a weight ratio of 1:10 to 10:1, and the weight ratio may be preferably from 1:8 to 8:1, 1:5 to 5:1 or 1:2 to 2:1.

In one embodiment of the present specification, the organic material layer includes Compound (A) and Compound (B), and a phosphorescent dopant may be used therewith.

In one embodiment of the present specification, the organic material layer includes Compound (A) and Compound (B), and an iridium-based dopant may be used therewith.

As a material of the phosphorescent dopant, those known in the art may be used. For example, phosphorescent dopant materials represented by LL'MX', LL'L"M, LMX'X", $L_2MX'$ and $L_3M$ may be used, however, the scope of the present disclosure is not limited to these examples.

Herein, L, L', L", X' and X" are a bidentate ligand different from each other, and M is a metal forming an octahedral complex.

M may include iridium, platinum, osmium and the like.

L, L' and L" are an anionic bidentate ligand coordinated to M as the iridium-based dopant by sp2 carbon and heteroatom, and nonlimiting examples of L, L' and L" may include 1-phenylisoquinoline, 2-(1-naphthyl)benzoxazole, 2-phenylbenzoxazole, 2-phenylbenzothiazole, 7,8-benzoquinoline, thiophene group pyrizine, phenylpyridine, benzothiophene group pyrizine, 3-methoxy-2-phenylpyridine, thiophene group pyrizine, tolylpyridine and the like.

X' and X" may function to trap electrons or holes, and nonlimiting examples of X' and X" may include acetylacetonate (acac), hexafluoroacetylacetonate, salicylidene, picolinate, 8-hydroxyquinolinate and the like.

In one embodiment of the present specification, as the iridium-based dopant, $(piq)_2(Ir)$ (acac) may be used as a red phosphorescent dopant.

In one embodiment of the present specification, a content of the dopant may be from 1% to 15%, preferably from 1% to 10% and more preferably from 1% to 5% based on the whole light emitting layer.

The organic light emitting device according to one embodiment of the present specification may be manufactured using common organic light emitting device manufacturing methods and materials except that one or more of the organic material layers are formed using Compound (A) and Compound (B) described above.

Compound (A) and Compound (B) may be formed into an organic material layer through a solution coating method as well as a vacuum deposition method when manufacturing the organic light emitting device. Herein, the solution coating method means spin coating, dip coating, inkjet printing, screen printing, a spray method, roll coating and the like, but is not limited thereto.

The organic material layer of the organic light emitting device of the present disclosure may be formed in a single layer structure, but may be formed in a multilayer structure in which two or more organic material layers are laminated. For example, the organic light emitting device of the present disclosure may have a structure including a hole injection layer, a hole transfer layer, a light emitting layer, an electron transfer layer, an electron injection layer and the like as the organic material layer. However, the structure of the organic light emitting device is not limited thereto, and may include a smaller number of organic material layers.

Specifically, the organic light emitting device according to one embodiment of the present application includes a first electrode; a second electrode; and one or more organic material layers provided between the first electrode and the second electrode, and one or more layers of the organic material layers include Compound (A) and Compound (B).

In one embodiment of the present specification, the first electrode may be an anode, and the second electrode may be a cathode.

In another embodiment of the present specification, the first electrode may be a cathode, and the second electrode may be an anode.

In the organic light emitting device of the present specification, the organic material layer includes a light emitting layer, and the light emitting layer may include Compound (A) and Compound (B).

In another organic light emitting device, the organic material layer includes a light emitting layer, the light emitting layer includes a host, and the host may include Compound (A) and Compound (B).

When combining Compound (A) and Compound (B) to form a host, more favorable efficiency and lifetime are obtained compared when using a single host. In one device, each host has physical properties of having relatively faster electron migration or relatively faster hole migration. Such properties make it difficult to control a charge balance in a light emitting layer when using one type of host. However, such relative properties of a single host may be compensated by mixing two hosts, and driving, lifetime and efficiency of a device may be effectively improved. Therefore, when using two types of hosts, results of lifetime, efficiency and driving vary depending on the changes in the ratio, and how to combine different hosts is the most important task.

In one embodiment of the present specification, Compound (A) may be used as an N-type host material, and Compound (B) may be used as a P-type host material.

In one embodiment of the present specification, the organic light emitting device may be a blue organic light emitting device, and Compound (A) and Compound (B) may be used as a material of the blue organic light emitting device. For example, Compound (A) and Compound (B) may be included in a host material of a light emitting layer of the blue organic light emitting device.

In another embodiment of the present specification, the organic light emitting device may be a green organic light emitting device, and Compound (A) and Compound (B) may be used as a material of the green organic light emitting device. For example, Compound (A) and Compound (B) may be included in a host material of a light emitting layer of the green organic light emitting device.

In another embodiment of the present specification, the organic light emitting device may be a red organic light emitting device, and Compound (A) and Compound (B) may be used as a material of the red organic light emitting device. For example, Compound (A) and Compound (B) may be included in a host material of a light emitting layer of the red organic light emitting device.

The organic light emitting device of the present disclosure may further include one, two or more layers selected from the group consisting of a light emitting layer, a hole injection layer, a hole transfer layer, an electron injection layer, an electron transfer layer, an electron blocking layer and a hole blocking layer.

FIG. 1 to FIG. 3 illustrate a lamination order of electrodes and organic material layers of an organic light emitting device according to one embodiment of the present specification. However, the scope of the present application is not limited to these diagrams, and structures of organic light emitting devices known in the art may also be used in the present application.

FIG. 1 illustrates an organic light emitting device in which an anode (200), an organic material layer (300) and a cathode (400) are consecutively laminated on a substrate (100). However, the structure is not limited to such a structure, and as illustrated in FIG. 2, an organic light emitting device in which a cathode, an organic material layer and an anode are consecutively laminated on a substrate may also be obtained.

FIG. 3 illustrates a case of the organic material layer being a multilayer. The organic light emitting device according to FIG. 3 includes a hole injection layer (301), a hole transfer layer (302), a light emitting layer (303), a hole blocking layer (304), an electron transfer layer (305) and an electron injection layer (306). However, the scope of the present application is not limited to such a lamination structure, and as necessary, layers other than the light emitting layer may not be included, and other necessary functional layers may be further added.

The organic material layer including Compound (A) and Compound (B) may further include other materials as necessary.

In the organic light emitting device according to one embodiment of the present specification, materials other than Compound (A) and Compound (B) are illustrated below, however, these are for illustrative purposes only and not for limiting the scope of the present application, and the materials may be replaced by materials known in the art.

As the anode material, materials having relatively large work function may be used, and transparent conductive oxides, metals, conductive polymers or the like may be used. Specific examples of the anode material include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene](PEDOT), polypyrrole and polyaniline, and the like, but are not limited thereto.

As the cathode material, materials having relatively small work function may be used, and metals, metal oxides, conductive polymers or the like may be used. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

As the hole injection material, known hole injection materials may be used, and for example, phthalocyanine compounds such as copper phthalocyanine disclosed in U.S. Pat. No. 4,356,429, or starburst-type amine derivatives such as tris (4-carbazoyl-9-ylphenyl)amine (TCTA), 4,4', 4"-tri[phenyl(m-tolyl)amino]triphenylamine (m-MTDATA) or 1,3,5-tris[4-(3-methylphenylphenylamino)phenyl]benzene (m-MTDAPB) described in the literature [Advanced Material, 6, p. 677 (1994)], polyaniline/dodecylbenzene sulfonic acid, poly(3,4-ethylenedioxythiophene)/poly(4-styrenesulfonate), polyaniline/camphor sulfonic acid or polyaniline/poly(4-styrenesulfonate) that are conductive polymers having solubility, and the like, may be used.

As the hole transfer material, pyrazoline derivatives, arylamine-based derivatives, stilbene derivatives, triphenyldiamine derivatives and the like may be used, and low molecular or high molecular materials may also be used.

As the electron transfer material, metal complexes of oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and derivatives thereof, and the like, may be used, and high molecular materials may also be used as well as low molecular materials.

As examples of the electron injection material, LiF is typically used in the art, however, the present application is not limited thereto.

As the light emitting material, red, green or blue light emitting materials may be used, and as necessary, two or more light emitting materials may be mixed and used. Herein, two or more light emitting materials may be used by being deposited as individual sources of supply or by being premixed and deposited as one source of supply. In addition, fluorescent materials may also be used as the light emitting material, however, phosphorescent materials may also be used. As the light emitting material, materials emitting light by bonding electrons and holes injected from an anode and a cathode, respectively, may be used alone, however, materials having a host material and a dopant material involving in light emission together may also be used.

When mixing light emitting material hosts, same series hosts may be mixed, or different series hosts may be mixed. For example, any two or more types of materials among N-type host materials or P-type host materials may be selected and used as a host material of a light emitting layer.

The organic light emitting device according to one embodiment of the present specification may be a top-emission type, a bottom-emission type or a dual-emission type depending on the materials used.

The polycyclic compound according to one embodiment of the present specification may also be used in an organic electronic device including an organic solar cell, an organic photo conductor, an organic transistor and the like under a similar principle used in the organic light emitting device.

In addition, by introducing various substituents to the structures of Chemical Formula 1 and Chemical Formulae 2 to 4, the energy band gap may be finely controlled, and meanwhile, properties at interfaces between organic materials are enhanced, and material applications may become diverse.

Another embodiment of the present specification provides a composition for an organic material layer of an organic light emitting device, the composition including Compound (A) represented by Chemical Formula 1 and Compound (B) represented by any one of Chemical Formulae 2 to 4.

Specific descriptions on Compound (A) represented by Chemical Formula 1 and Compound (B) represented by any one of Chemical Formulae 2 to 4 are the same as the descriptions provided above.

Compound (A) represented by Chemical Formula 1 and Compound (B) represented by any one of Chemical Formulae 2 to 4 may have a weight ratio of 1:10 to 10:1, 1:8 to 8:1, 1:5 to 5:1 or 1:2 to 2:1 in the composition, however, the weight ratio is not limited thereto.

In one embodiment of the present specification, the composition has a form in which two or more compounds are simply mixed, and materials in a powder state may be mixed before forming the organic material layer of the organic light emitting device, or compounds in a liquid state may be mixed at an appropriate temperature or higher. The composition is in a solid state below a melting point of each material, and may be maintained in a liquid state by adjusting a temperature.

The composition may further include materials known in the art such as a solvent and an additive.

The composition may be used when forming an organic material of an organic light emitting device, and particularly, may be more preferably used when forming a host of a light emitting layer.

Hereinafter, the present specification will be described in more detail with reference to examples, however, these are for illustrative purposes only, and the scope of the present application is not limited thereto.

[Preparation Example 1] Preparation of Compound 1-1

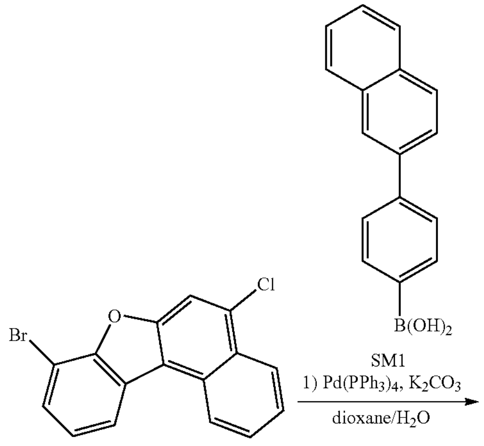

1-1-3

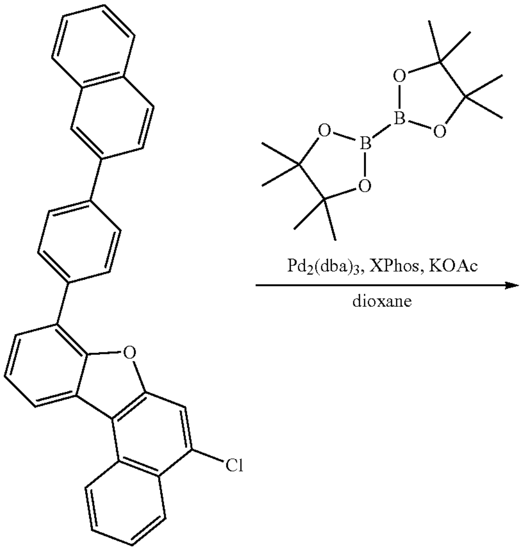

1-1-2

-continued

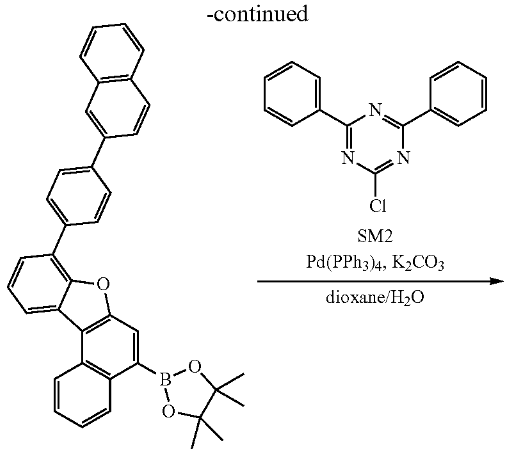

1-1-1

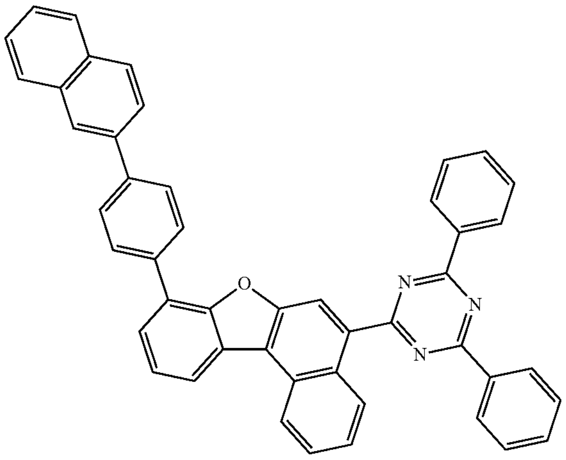

1-1

Synthesis of Compound 1-1-2

Compound 1-1-3 (8-bromo-5-chloronaphtho[2,1-b] benzofuran) (5 g, 13.5 mmol), Compound SM1 ((4-(naphthalen-2-yl)phenyl)boronic acid) (4.6 g, 16.2 mmol), $Pd(PPh_3)_4$ (tetrakis(triphenylphosphine)palladium(0)) (0.8 g, 0.67 mmol) and $K_2CO_3$ (3.7 g, 27 mmol) were introduced to a 250 mL round bottom flask, and after creating a nitrogen atmosphere, 1,4-dioxane (80 mL) and $H_2O$ (20 mL) were introduced thereto, and the mixture was stirred for 12 hours at 120° C. After the reaction was finished, the reaction temperature was lowered to room temperature, and the result was washed with water, and extracted with methylene chloride. The extracted organic solution was dried with $Mg_2SO_4$, and then concentrated. The result was silica gel columned and recrystallized to obtain white solid Compound 1-1-2 (2.9 g, 6.5 mmol, yield 48%).

Synthesis of Compound 1-1-1

Compound 1-1-2 (2.9 g, 6.5 mmol), 4,4,4',4',5,5,5',5'-octamethyl-2,2'-bi(1,3,2-dioxaborolane) (2.5 g, 9.8 mmol), $Pd_2(dba)_3$ (tris(dibenzylideneacetone)dipalladium(0)) (0.3 g, 0.3 mmol), XPhos (2-dicyclohexylphosphino-2',4',6'-triisopropylbiphenyl) (1.2 g, 2.6 mmol) and KOAc (1.3 g, 13 mmol) were introduced to a 100 mL round bottom flask, and after creating a nitrogen atmosphere, 1,4-dioxane (50 mL) was introduced thereto, and the mixture was stirred for 3 hours at 110° C. After the reaction was finished, the reaction temperature was lowered to room temperature, and the result was washed with water, and extracted with methylene chloride. The extracted organic solution was dried with $Mg_2SO_4$, and then concentrated. The result was silica gel columned and recrystallized to obtain white solid Compound 1-1-1 (3.0 g, 5.54 mmol, yield 85%).

Synthesis of Compound 1-1

Compound 1-1-1 (3.0 g, 5.54 mmol), Compound SM2 (2-chloro-4,6-diphenyl-1,3,5-triazine) (1.8 g, 6.6 mmol), $Pd(PPh_3)_4$ (0.3 g, 0.27 mmol) and $K_2CO_3$ (1.5 g, 11 mmol) were introduced to a 100 mL round bottom flask, and after creating a nitrogen atmosphere, 1,4-dioxane (40 mL) and $H_2O$ (10 mL) were introduced thereto, and the mixture was stirred for 4 hours at 120° C. After the reaction was finished, the reaction temperature was lowered to room temperature, and the result was washed with water, and extracted with methylene chloride. The extracted organic solution was dried with $Mg_2SO_4$, and then concentrated. The result was silica gel columned and recrystallized to obtain yellow solid Compound 1-1 (3.1 g, 4.7 mmol, yield 85%).

Target compounds were synthesized in the same manner as in Preparation Example 1 except that Intermediate A of the following Table 1 was used instead of Compound SM1, and Intermediate B of the following Table 1 was used instead of Compound SM2.

TABLE 1

| Compound No. | Intermediate A | Intermediate B | Target Compound | Yield |
|---|---|---|---|---|
| 1-7 | 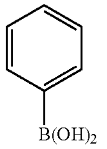 | 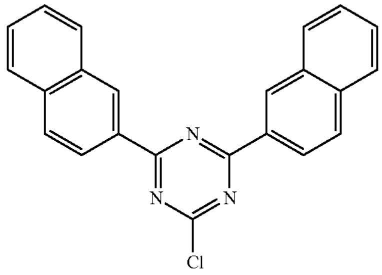 [SMILES: Clc1nc(-c2ccc3ccccc3c2)nc(-c2ccc3ccccc3c2)n1] | 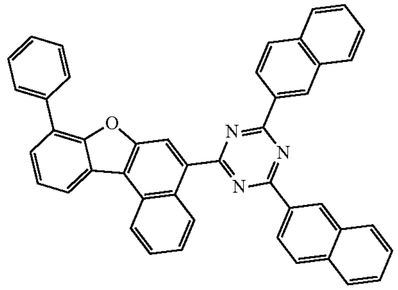 [SMILES: c1ccc(-c2cccc3c2oc2cc(-c4nc(-c5ccc6ccccc6c5)nc(-c5ccc6ccccc6c5)n4)c4ccccc4c23)cc1] | 20% |
| 1-23 | 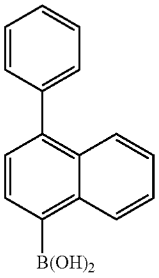 [SMILES: OB(O)c1ccc(-c2ccccc2)c2ccccc12] | 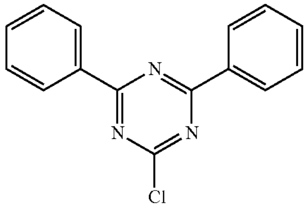 [SMILES: Clc1nc(-c2ccccc2)nc(-c2ccccc2)n1] | 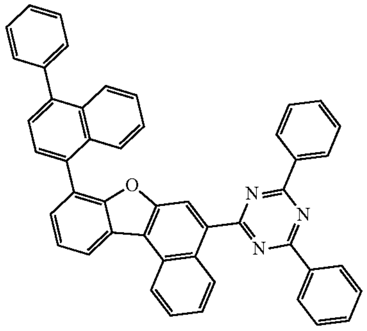 [SMILES: c1ccc(-c2nc(-c3ccccc3)nc(-c3cc4oc5c(-c6ccc(-c7ccccc7)c7ccccc67)cccc5c4c4ccccc34)n2)cc1] | 26% |
| 1-26 | 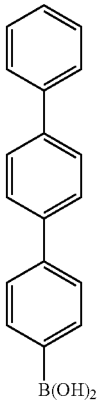 [SMILES: OB(O)c1ccc(-c2ccc(-c3ccccc3)cc2)cc1] | 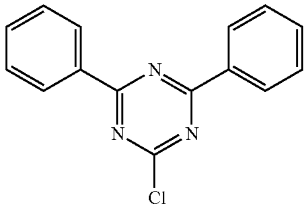 [SMILES: Clc1nc(-c2ccccc2)nc(-c2ccccc2)n1] | 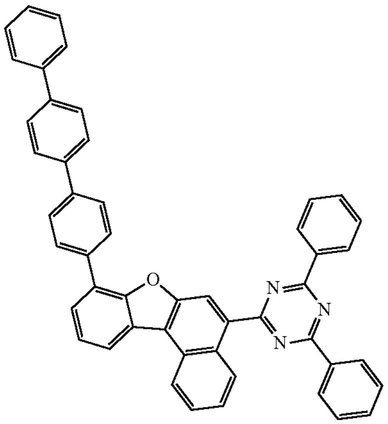 [SMILES: c1ccc(-c2ccc(-c3ccc(-c4cccc5c4oc4cc(-c6nc(-c7ccccc7)nc(-c7ccccc7)n6)c6ccccc6c45)cc3)cc2)cc1] | 22% |

TABLE 1-continued
| Compound No. | Intermediate A | Intermediate B | Target Compound | Yield |
|---|---|---|---|---|
| 1-29 | 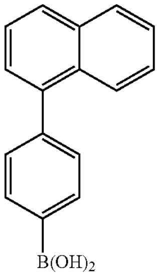 [SMILES: OB(O)c1ccc(-c2cccc3ccccc23)cc1] | 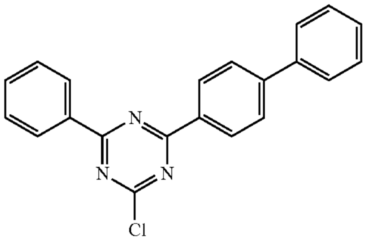 [SMILES: Clc1nc(-c2ccccc2)nc(-c2ccc(-c3ccccc3)cc2)n1] | 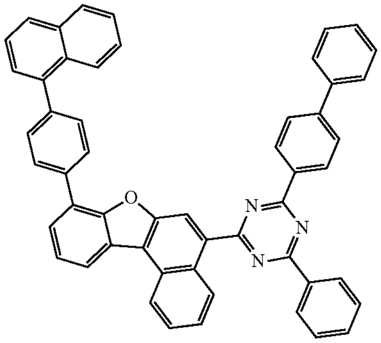 [SMILES: c1ccc(-c2ccc(-c3nc(-c4ccccc4)nc(-c4cc5oc6c(-c7ccc(-c8cccc9ccccc89)cc7)cccc6c5c5ccccc45)n3)cc2)cc1] | 23% |
| 1-34 | 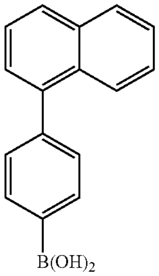 [SMILES: OB(O)c1ccc(-c2cccc3ccccc23)cc1] | 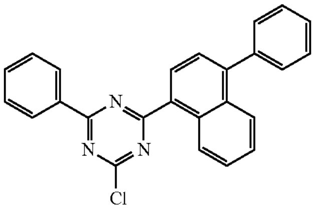 [SMILES: Clc1nc(-c2ccccc2)nc(-c2ccc(-c3ccccc3)c3ccccc23)n1] | 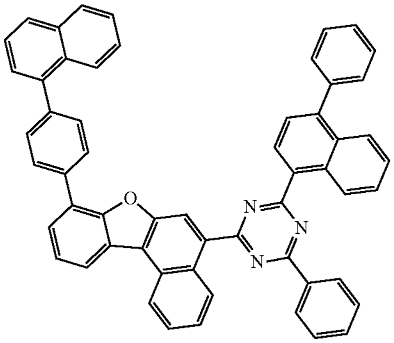 [SMILES: c1ccc(-c2nc(-c3ccc(-c4ccccc4)c4ccccc34)nc(-c3cc4oc5c(-c6ccc(-c7cccc8ccccc78)cc6)cccc5c4c4ccccc34)n2)cc1] | 25% |
| 1-35 | 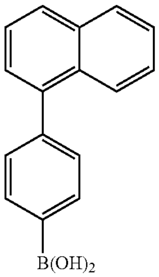 [SMILES: OB(O)c1ccc(-c2cccc3ccccc23)cc1] | 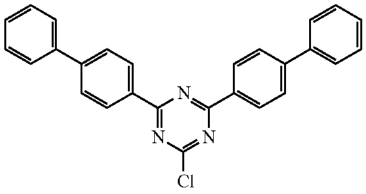 [SMILES: Clc1nc(-c2ccc(-c3ccccc3)cc2)nc(-c2ccc(-c3ccccc3)cc2)n1] | 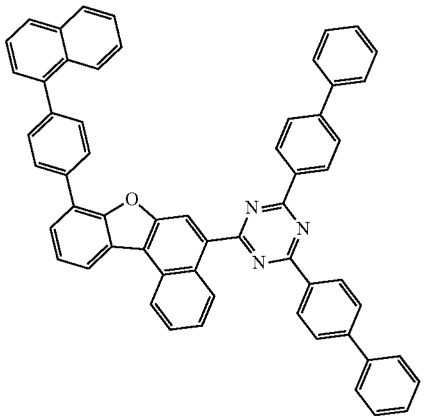 [SMILES: c1ccc(-c2ccc(-c3nc(-c4ccc(-c5ccccc5)cc4)nc(-c4cc5oc6c(-c7ccc(-c8cccc9ccccc89)cc7)cccc6c5c5ccccc45)n3)cc2)cc1] | 24% |
| 1-39 | 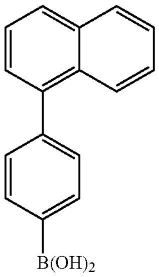 [SMILES: OB(O)c1ccc(-c2cccc3ccccc23)cc1] | 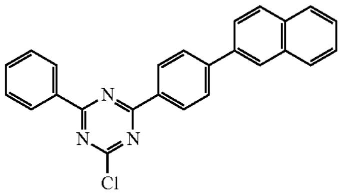 [SMILES: Clc1nc(-c2ccccc2)nc(-c2ccc(-c3ccc4ccccc4c3)cc2)n1] | 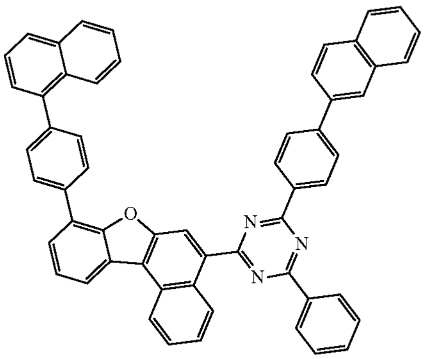 [SMILES: c1ccc(-c2nc(-c3ccc(-c4ccc5ccccc5c4)cc3)nc(-c3cc4oc5c(-c6ccc(-c7cccc8ccccc78)cc6)cccc5c4c4ccccc34)n2)cc1] | 22% |

TABLE 1-continued
| Compound No. | Intermediate A | Intermediate B | Target Compound | Yield |
| --- | --- | --- | --- | --- |
| 1-40 | 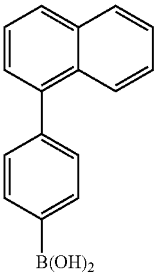 [SMILES: OB(O)c1ccc(-c2cccc3ccccc23)cc1] | 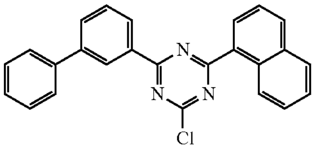 [SMILES: Clc1nc(-c2cccc(-c3ccccc3)c2)nc(-c2cccc3ccccc23)n1] | 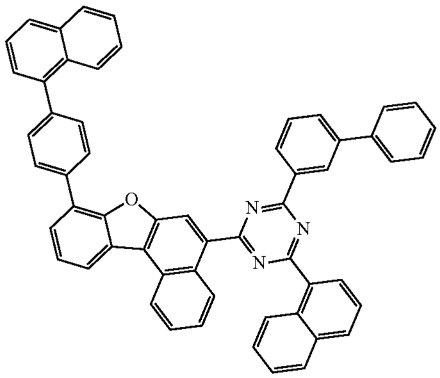 [SMILES: c1ccc(-c2cccc(-c3nc(-c4cccc5ccccc45)nc(-c4cc5oc6c(-c7ccc(-c8cccc9ccccc89)cc7)cccc6c5c5ccccc45)n3)c2)cc1] | 26% |
| 1-45 | 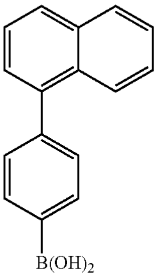 [SMILES: OB(O)c1ccc(-c2cccc3ccccc23)cc1] | 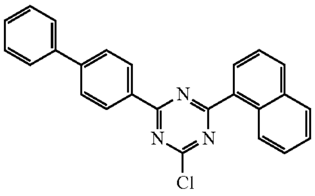 [SMILES: Clc1nc(-c2ccc(-c3ccccc3)cc2)nc(-c2cccc3ccccc23)n1] | 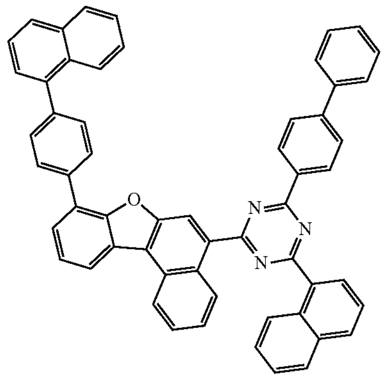 [SMILES: c1ccc(-c2ccc(-c3nc(-c4cccc5ccccc45)nc(-c4cc5oc6c(-c7ccc(-c8cccc9ccccc89)cc7)cccc6c5c5ccccc45)n3)cc2)cc1] | 23% |
[Preparation Example 2] Preparation of Compound 2-57
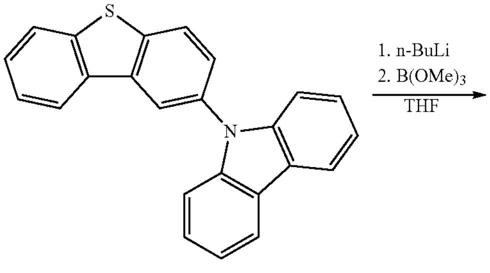
2-57-2

-continued

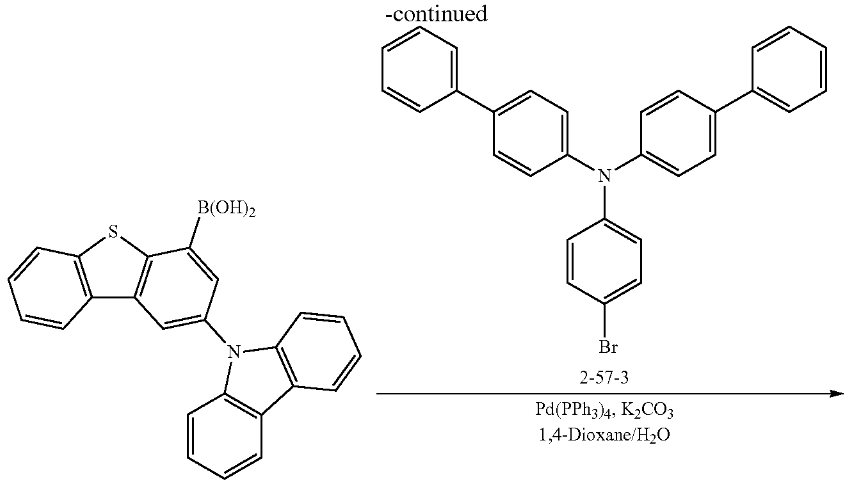

2-57-1

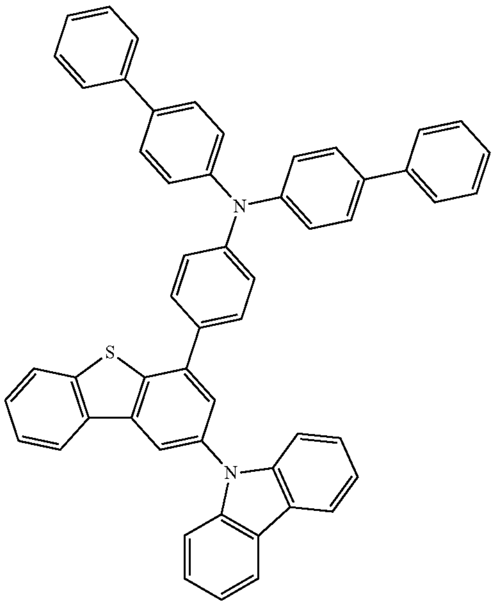

2-57

Synthesis of Compound 2-57-1

Under the nitrogen atmosphere, Compound 2-57-2 (9-(dibenzo[b,d]thiophen-2-yl)-9H-carbazole) (20 g, 57.2 mmol) was introduced to a 500 ml round bottom flask, and after introducing THF (tetrahydrofuran) (200 ml) thereto, the mixture was stirred at −78° C. After that, a 2.5 M n-butyllithium solution (n-BuLi) (23 ml, 57.2 mmol) was slowly dropped thereto, and after stirring for 30 minutes, trimethyl borate ($B(Ome)_3$) (9.6 ml, 85.8 mmol) was slowly dropped thereto, and the result was stirred. After the reaction was completed, the result was extracted with EA (ethyl acetate)/$H_2O$, concentrated, treated with $MgSO_4$ and then concentrated to obtain white solid Compound 2-57-1 (19.1 g, 48.6 mmol, yield 85.0%).

Synthesis of Compound 2-57

Compound 2-57-1 (15 g, 38.1 mmol), Compound 2-57-3 (N-([1,1'-biphenyl]-4-yl)-N-(4-bromophenyl)-[1,1'-biphenyl]-4-amine) (18.1 g, 38.1 mmol), $Pd(PPh_3)_4$(2.2 g, 1.9 mmol) and $K_2CO_3$ (13.1 g, 95.3 mmol) were introduced to a 500 ml round bottom flask, and after introducing 1,4-dioxane/$H_2O$ (200 ml/40 ml) thereto, the mixture was stirred at 160° C. After the reaction was completed, the temperature was lowered to room temperature, and the result was extracted with MC/$H_2O$ and then concentrated. The result was purified by a MC (methylene chloride):hexane=1:1 (v/v) column to obtain white solid Compound 2-57 (26.3 g, 35.3 mmol, yield 92.7%).

Target compounds were synthesized in the same manner as in Preparation Example 2 except that Intermediate C of the following Table 2 was used instead of Compound 2-57-2, and Intermediate D of the following Table 2 was used instead of Compound 2-57-3.

TABLE 2
| Compound No. | Intermediate C | Intermediate D | Target Compound | Yield |
|---|---|---|---|---|
| 2-55 | 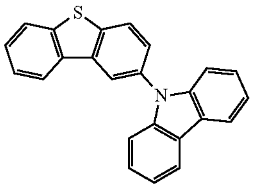 [SMILES: c1ccc2c(c1)sc1ccc(-n3c4ccccc4c4ccccc43)cc12] | 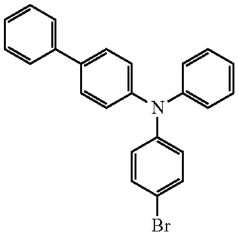 [SMILES: Brc1ccc(N(c2ccccc2)c2ccc(-c3ccccc3)cc2)cc1] | 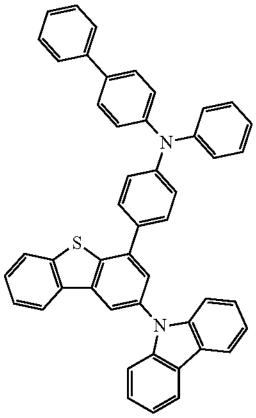 [SMILES: c1ccc(-c2ccc(N(c3ccccc3)c3ccc(-c4cc(-n5c6ccccc6c6ccccc65)cc5c4sc4ccccc45)cc3)cc2)cc1] | 91% |
| 2-56 | 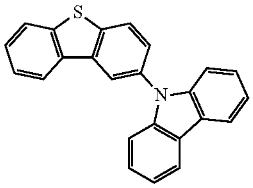 [SMILES: c1ccc2c(c1)sc1ccc(-n3c4ccccc4c4ccccc43)cc12] | 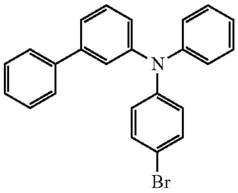 [SMILES: Brc1ccc(N(c2ccccc2)c2cccc(-c3ccccc3)c2)cc1] | 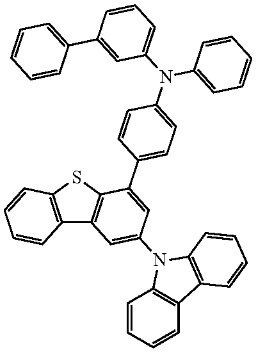 [SMILES: c1ccc(-c2cccc(N(c3ccccc3)c3ccc(-c4cc(-n5c6ccccc6c6ccccc65)cc5c4sc4ccccc45)cc3)c2)cc1] | 90% |
| 2-111 | 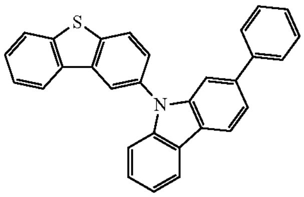 [SMILES: c1ccc(-c2ccc3c4ccccc4n(-c4ccc5sc6ccccc6c5c4)c3c2)cc1] | 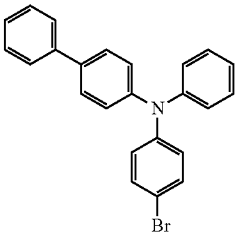 [SMILES: Brc1ccc(N(c2ccccc2)c2ccc(-c3ccccc3)cc2)cc1] | 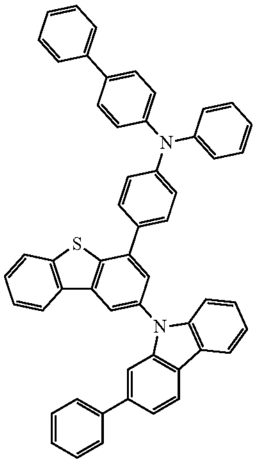 [SMILES: c1ccc(-c2ccc(N(c3ccccc3)c3ccc(-c4cc(-n5c6ccccc6c6ccc(-c7ccccc7)cc65)cc5c4sc4ccccc45)cc3)cc2)cc1] | 90% |

TABLE 2-continued
| Compound No. | Intermediate C | Intermediate D | Target Compound | Yield |
|---|---|---|---|---|
| 2-112 | 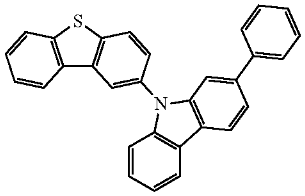 [SMILES: c1ccc(-c2ccc3c4ccccc4n(-c4ccc5sc6ccccc6c5c4)c3c2)cc1] | 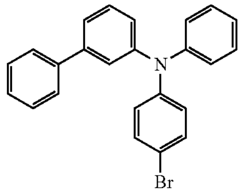 [SMILES: Brc1ccc(N(c2ccccc2)c2cccc(-c3ccccc3)c2)cc1] | 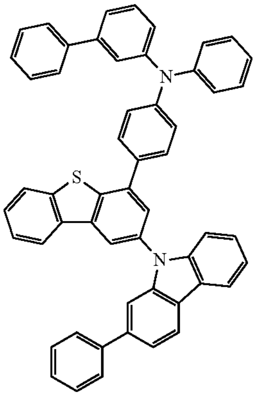 [SMILES: c1ccc(-c2cccc(N(c3ccccc3)c3ccc(-c4cc(-n5c6ccccc6c6ccc(-c7ccccc7)cc65)cc5c4sc4ccccc45)cc3)c2)cc1] | 90% |
| 2-133 | 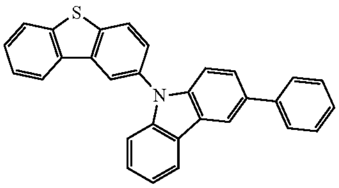 [SMILES: c1ccc(-c2ccc3c(c2)c2ccccc2n3-c2ccc3sc4ccccc4c3c2)cc1] | 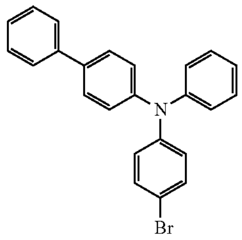 [SMILES: Brc1ccc(N(c2ccccc2)c2ccc(-c3ccccc3)cc2)cc1] | 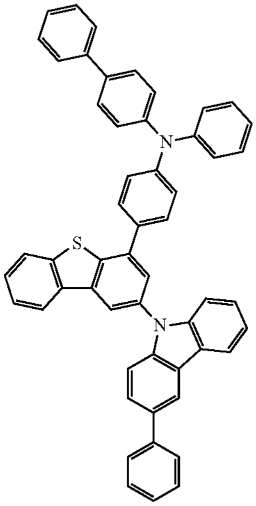 [SMILES: c1ccc(-c2ccc(N(c3ccccc3)c3ccc(-c4cc(-n5c6ccccc6c6cc(-c7ccccc7)ccc65)cc5c4sc4ccccc45)cc3)cc2)cc1] | 85% |
| 2-160 | 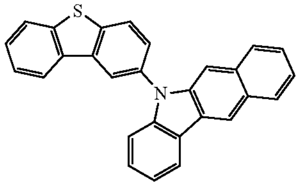 [SMILES: c1ccc2cc3c(cc2c1)c1ccccc1n3-c1ccc2sc3ccccc3c2c1] | 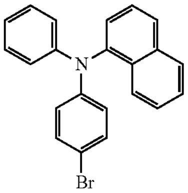 [SMILES: Brc1ccc(N(c2ccccc2)c2cccc3ccccc23)cc1] | 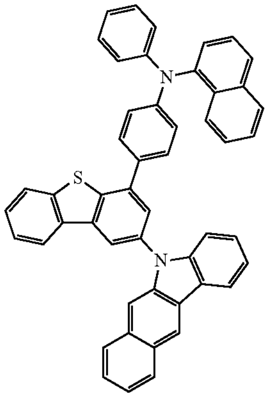 [SMILES: c1ccc(N(c2ccc(-c3cc(-n4c5ccccc5c5cc6ccccc6cc54)cc4c3sc3ccccc34)cc2)c2cccc3ccccc23)cc1] | 80% |

[Preparation Example 3] Preparation of Compound 3-1

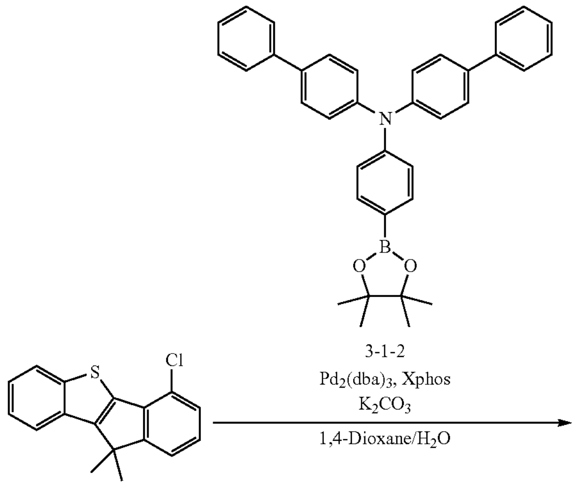

3-1-1

-continued

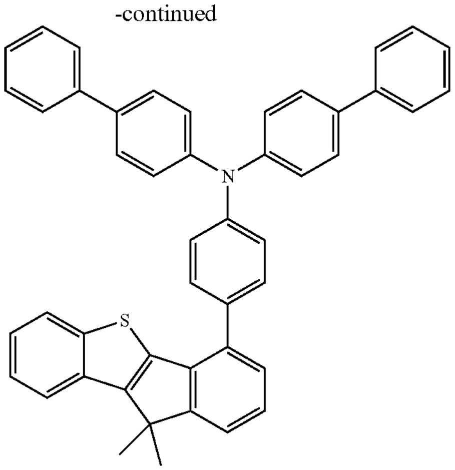

3-1

Synthesis of Compound 3-1

After dissolving Compound 3-1-1 (4-chloro-10,10-dimethyl-10H-benzo[b]indeno[2,1-d]thiophene) (5 g, 17.56 mmol), Compound 3-1-2 (N-([1,1'-biphenyl]-4-yl)-N-(4-(4,4,5,5-tetramethyl-1,3,2-dioxaborolan-2-yl)phenyl)-[1,1'-biphenyl]-4-amine) (9 g, 17.56 mmol), $Pd_2(dba)_3$ (1.6 g, 1.75 mmol), XPhos (1.7 g, 3.52 mmol) and $K_2CO_3$ (5 g, 35.12 mmol) in 1,4-dioxane/$H_2O$ (70 mL/15 mL), the mixture was stirred for 15 hours at 100° C. The mixture solution completed with the reaction was dissolved in an excess amount of DCM (dichloromethane), and extracted with water. The organic layer was dried with anhydrous $MgSO_4$, and then silica gel filtered. For the filtered filtrate, the solvent was removed using a rotary evaporator, and the result was column chromatographed <MC/Hex (hexane)=1/2> to obtain yellow solid Compound 3-1 (5.6 g, yield 50%).

Target compounds were synthesized in the same manner as in Preparation Example 3 except that Intermediate E of the following Table 3 was used instead of Compound 3-1-1, and Intermediate F of the following Table 3 was used instead of Compound 3-1-2.

TABLE 3
| Compound No. | Intermediate E | Intermediate F | Target Compound | Yield |
|---|---|---|---|---|
| 3-1 | 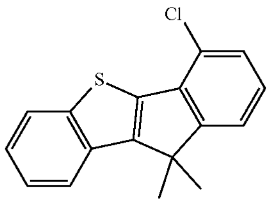 | 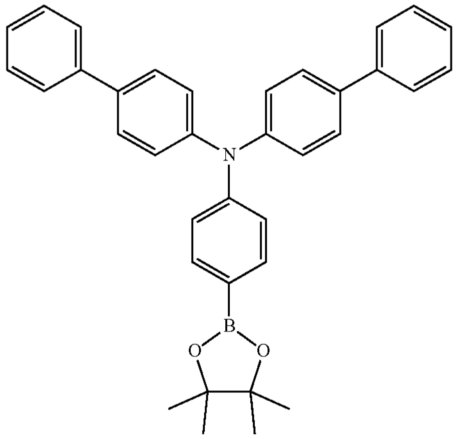 [SMILES: CC1(C)OB(c2ccc(N(c3ccc(-c4ccccc4)cc3)c3ccc(-c4ccccc4)cc3)cc2)OC1(C)C] | 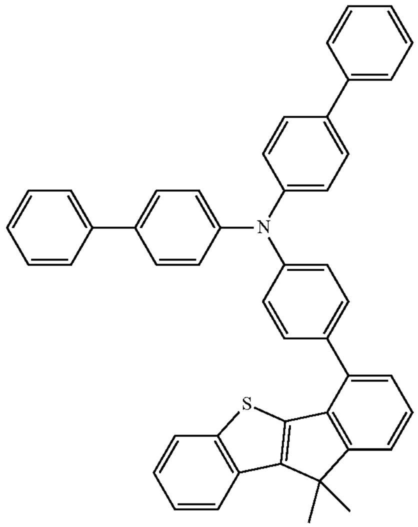 [SMILES: CC1(C)c2cccc(-c3ccc(N(c4ccc(-c5ccccc5)cc4)c4ccc(-c5ccccc5)cc4)cc3)c2-c2sc3ccccc3c21] | 50% |

TABLE 3-continued
| Compound No. | Intermediate E | Intermediate F | Target Compound | Yield |
|---|---|---|---|---|
| 3-28 | 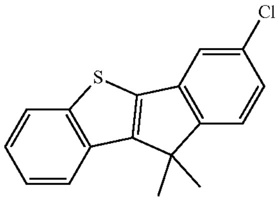 | 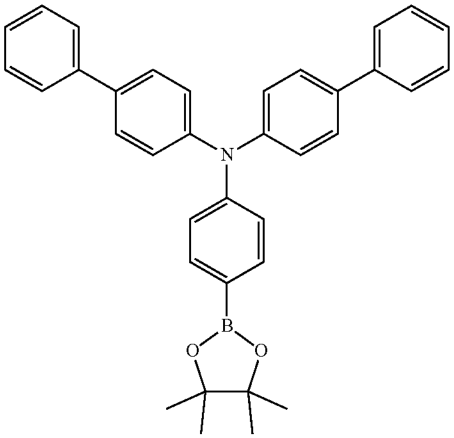 [SMILES: CC1(C)OB(c2ccc(N(c3ccc(-c4ccccc4)cc3)c3ccc(-c4ccccc4)cc3)cc2)OC1(C)C] | 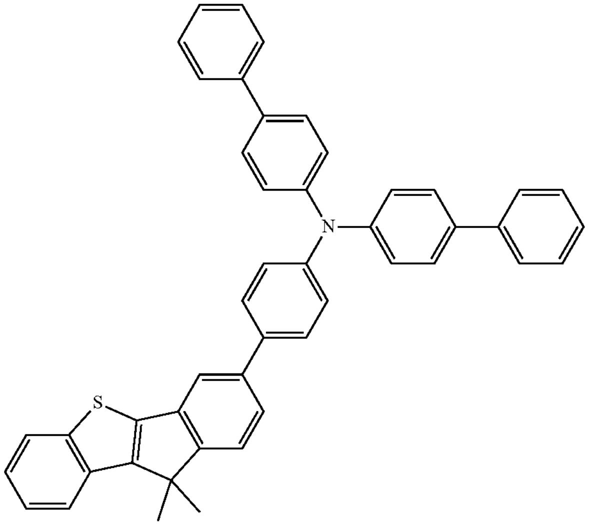 | 57% |

TABLE 3-continued
| Compound No. | Intermediate E | Intermediate F | Target Compound | Yield |
| --- | --- | --- | --- | --- |
| 3-48 | 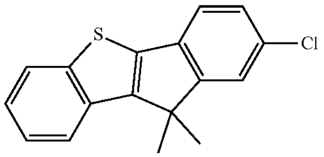 | 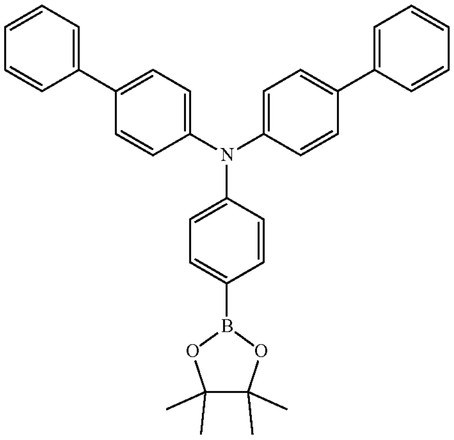 [SMILES: CC1(C)OB(c2ccc(N(c3ccc(-c4ccccc4)cc3)c3ccc(-c4ccccc4)cc3)cc2)OC1(C)C] | 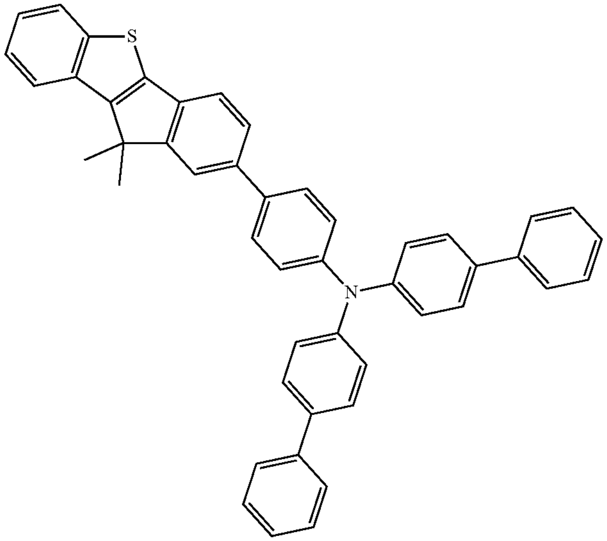 [SMILES: CC1(C)c2cc(-c3ccc(N(c4ccc(-c5ccccc5)cc4)c4ccc(-c5ccccc5)cc4)cc3)ccc2-c2sc3ccccc3c21] | 70% |

TABLE 3-continued
| Compound No. | Intermediate E | Intermediate F | Target Compound | Yield |
| --- | --- | --- | --- | --- |
| 3-50 | 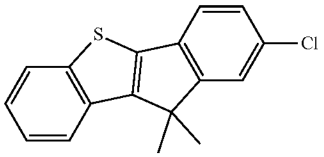 | 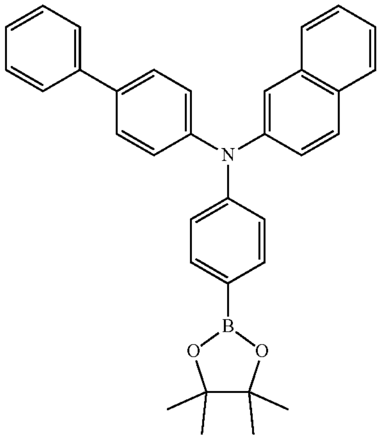 [SMILES: CC1(C)OB(c2ccc(N(c3ccc(-c4ccccc4)cc3)c3ccc4ccccc4c3)cc2)OC1(C)C] | 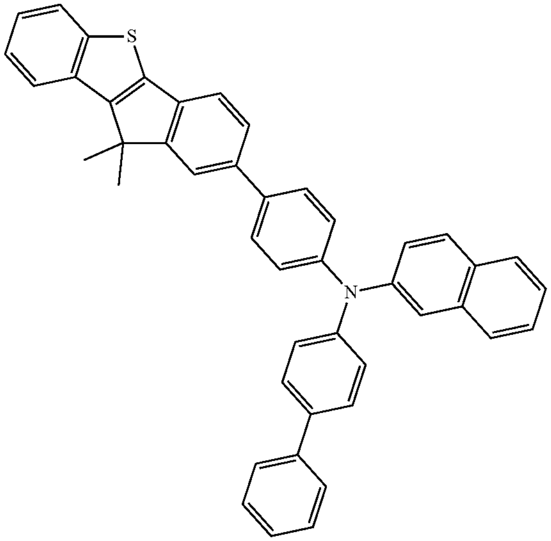 [SMILES: CC1(C)c2cc(-c3ccc(N(c4ccc(-c5ccccc5)cc4)c4ccc5ccccc5c4)cc3)ccc2-c2sc3ccccc3c21] | 65% |

TABLE 3-continued
| Compound No. | Intermediate E | Intermediate F | Target Compound | Yield |
|---|---|---|---|---|
| 3-52 | 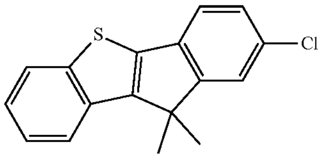 | 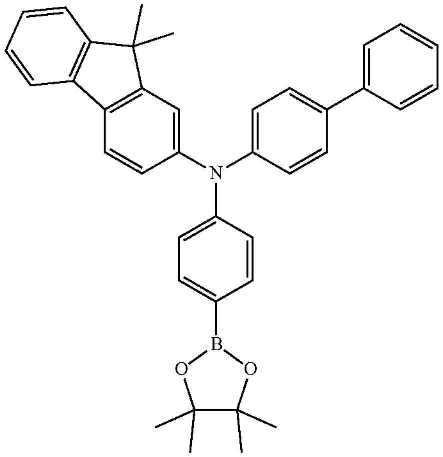 [SMILES: CC1(C)c2ccccc2-c2ccc(N(c3ccc(B4OC(C)(C)C(C)(C)O4)cc3)c3ccc(-c4ccccc4)cc3)cc21] | 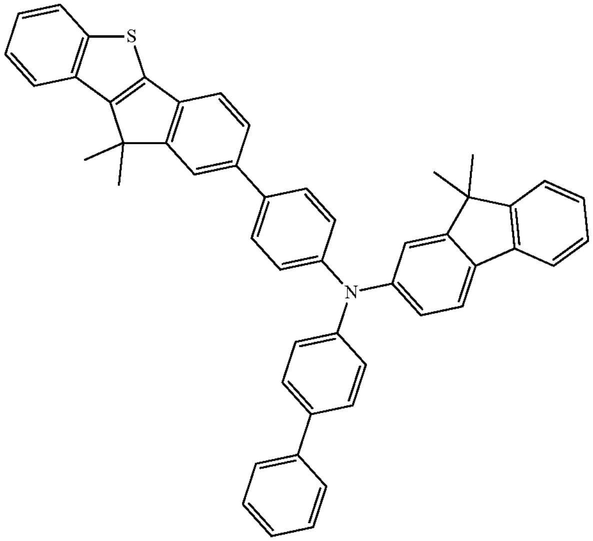 [SMILES: CC1(C)c2ccccc2-c2ccc(N(c3ccc(-c4ccccc4)cc3)c3ccc(-c4ccc5c(c4)C(C)(C)c4c-5sc5ccccc45)cc3)cc21] | 59% |
| 3-61 | 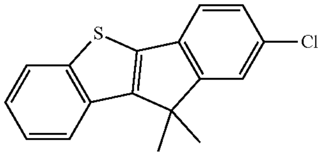 | 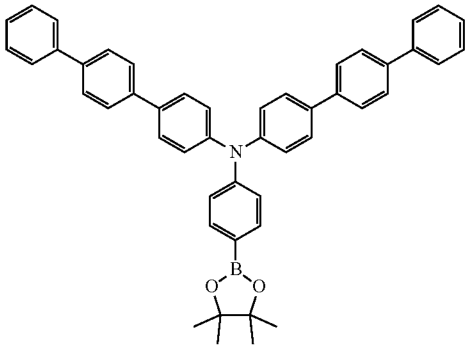 [SMILES: CC1(C)OB(c2ccc(N(c3ccc(-c4ccc(-c5ccccc5)cc4)cc3)c3ccc(-c4ccc(-c5ccccc5)cc4)cc3)cc2)OC1(C)C] | 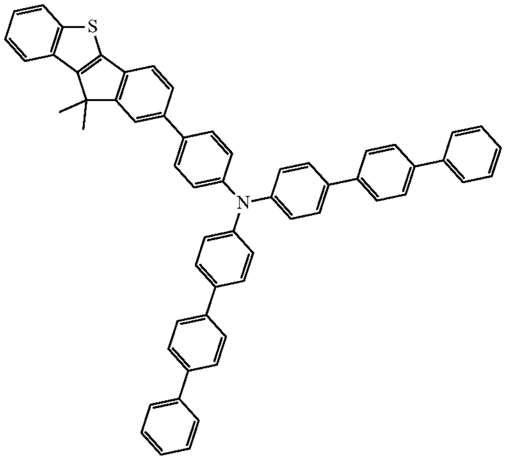 [SMILES: CC1(C)c2cc(-c3ccc(N(c4ccc(-c5ccc(-c6ccccc6)cc5)cc4)c4ccc(-c5ccc(-c6ccccc6)cc5)cc4)cc3)ccc2-c2sc3ccccc3c21] | 55% |

TABLE 3-continued
| Compound No. | Intermediate E | Intermediate F | Target Compound | Yield |
|---|---|---|---|---|
| 3-62 | 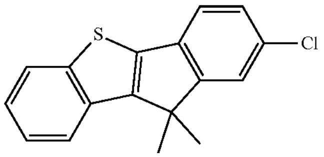 | 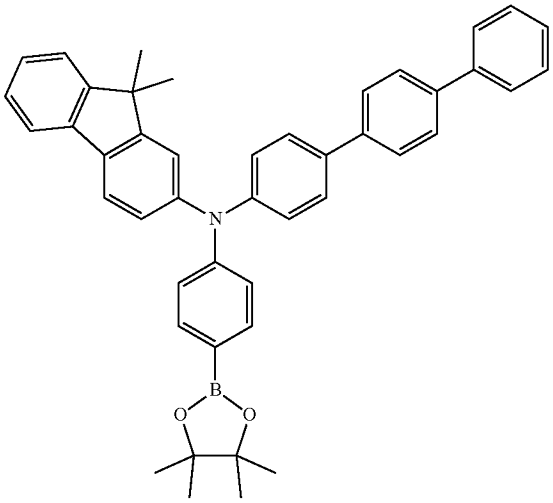 [SMILES: CC1(C)c2ccccc2-c2ccc(N(c3ccc(B4OC(C)(C)C(C)(C)O4)cc3)c3ccc(-c4ccc(-c5ccccc5)cc4)cc3)cc21] | 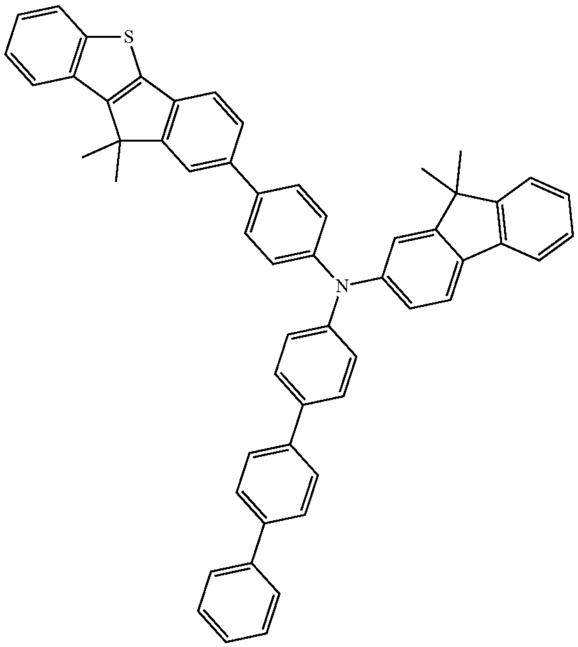 [SMILES: CC1(C)c2ccccc2-c2ccc(N(c3ccc(-c4ccc(-c5ccccc5)cc4)cc3)c3ccc(-c4ccc5c(c4)C(C)(C)c4c-5sc5ccccc45)cc3)cc21] | 66% |

TABLE 3-continued
| Compound No. | Intermediate E | Intermediate F | Target Compound | Yield |
|---|---|---|---|---|
| 3-63 | 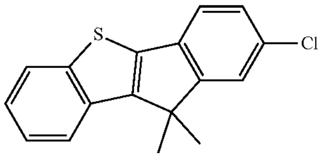 | 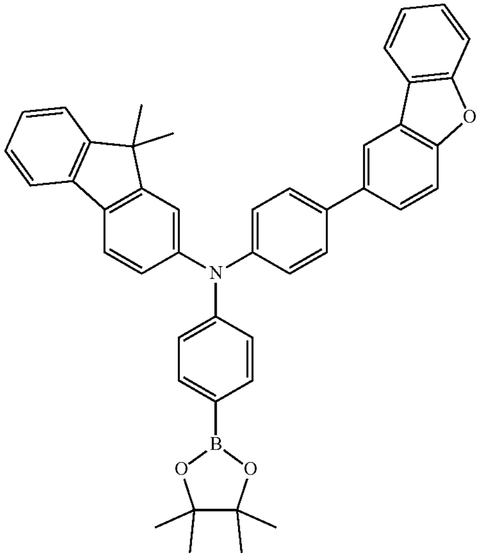 [SMILES: CC1(C)c2ccccc2-c2ccc(N(c3ccc(B4OC(C)(C)C(C)(C)O4)cc3)c3ccc(-c4ccc5oc6ccccc6c5c4)cc3)cc21] | 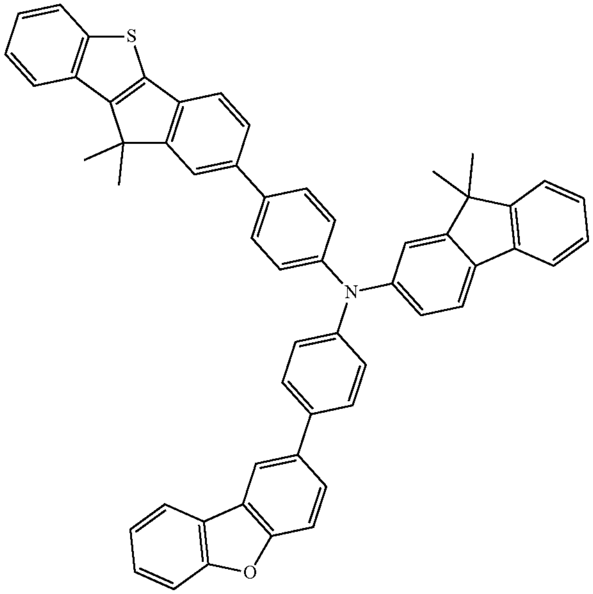 [SMILES: CC1(C)c2ccccc2-c2ccc(N(c3ccc(-c4ccc5c(c4)C(C)(C)c4c-5sc5ccccc45)cc3)c3ccc(-c4ccc5oc6ccccc6c5c4)cc3)cc21] | 55% |

TABLE 3-continued
| Compound No. | Intermediate E | Intermediate F | Target Compound | Yield |
|---|---|---|---|---|
| 3-78 | 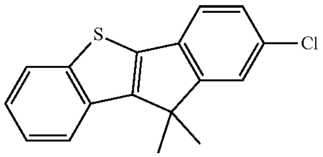 | 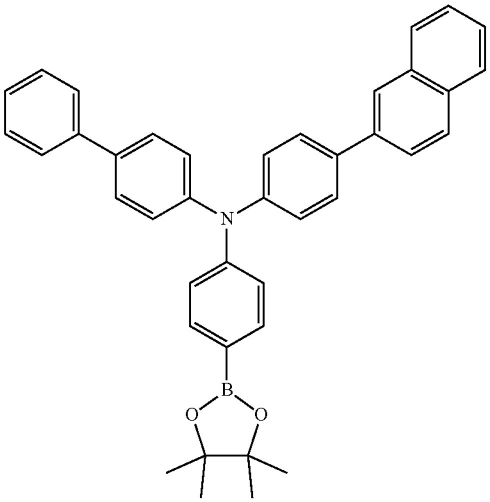 [SMILES: CC1(C)OB(c2ccc(N(c3ccc(-c4ccccc4)cc3)c3ccc(-c4ccc5ccccc5c4)cc3)cc2)OC1(C)C] | 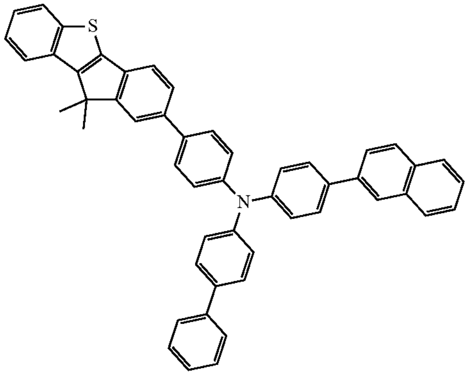 [SMILES: CC1(C)c2cc(-c3ccc(N(c4ccc(-c5ccccc5)cc4)c4ccc(-c5ccc6ccccc6c5)cc4)cc3)ccc2-c2sc3ccccc3c21] | 45% |
| 3-97 | 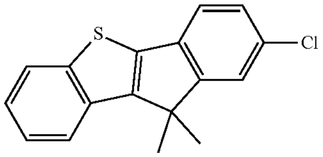 | 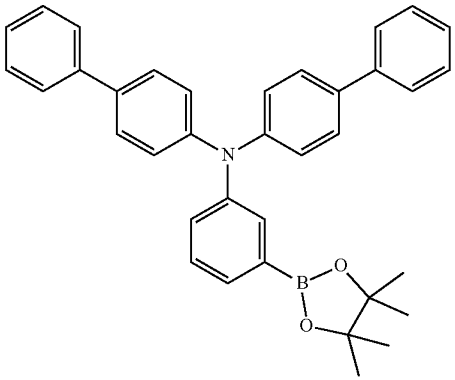 [SMILES: CC1(C)OB(c2cccc(N(c3ccc(-c4ccccc4)cc3)c3ccc(-c4ccccc4)cc3)c2)OC1(C)C] | 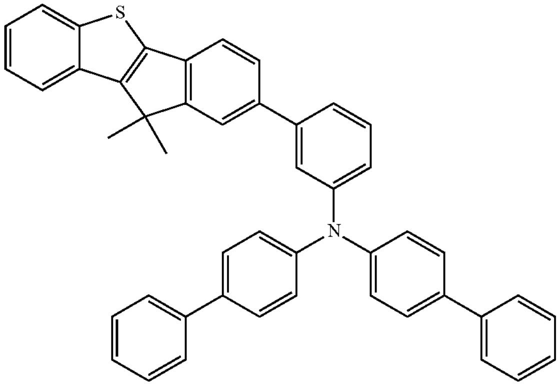 [SMILES: CC1(C)c2cc(-c3cccc(N(c4ccc(-c5ccccc5)cc4)c4ccc(-c5ccccc5)cc4)c3)ccc2-c2sc3ccccc3c21] | 59% |

TABLE 3-continued
| Compound No. | Intermediate E | Intermediate F | Target Compound | Yield |
|---|---|---|---|---|
| 3-121 | 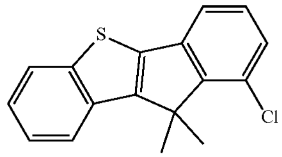 [SMILES: CC1(C)c2c(Cl)cccc2-c2sc3ccccc3c21] | 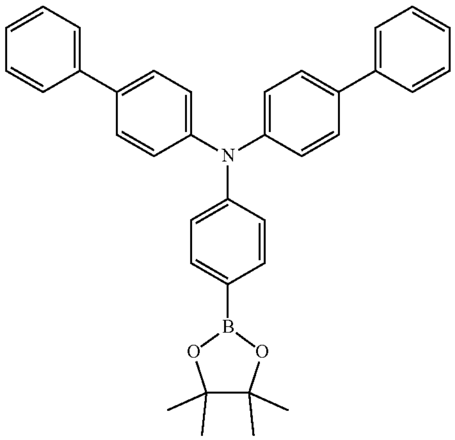 [SMILES: CC1(C)OB(c2ccc(N(c3ccc(-c4ccccc4)cc3)c3ccc(-c4ccccc4)cc3)cc2)OC1(C)C] | 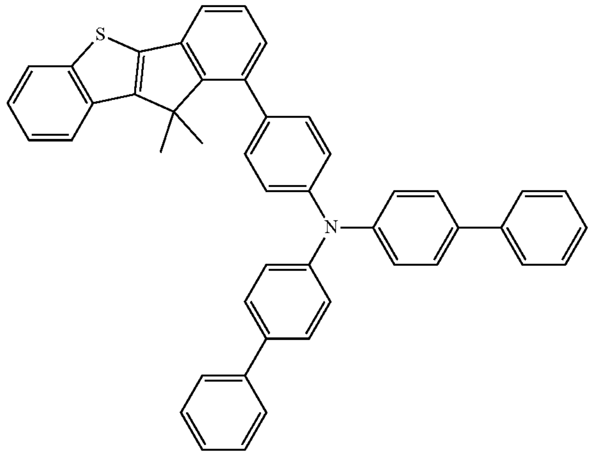 [SMILES: CC1(C)c2c(-c3ccc(N(c4ccc(-c5ccccc5)cc4)c4ccc(-c5ccccc5)cc4)cc3)cccc2-c2sc3ccccc3c21] | 66% |
| 3-145 | 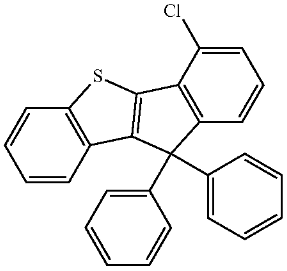 [SMILES: Clc1cccc2c1-c1sc3ccccc3c1C2(c1ccccc1)c1ccccc1] | 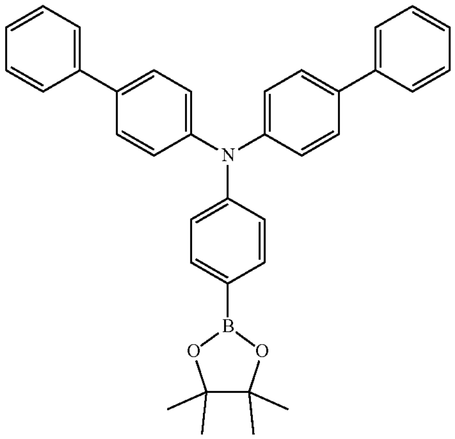 [SMILES: CC1(C)OB(c2ccc(N(c3ccc(-c4ccccc4)cc3)c3ccc(-c4ccccc4)cc3)cc2)OC1(C)C] | 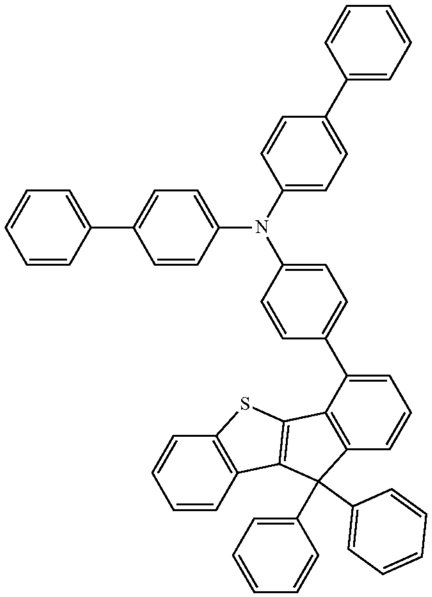 [SMILES: c1ccc(-c2ccc(N(c3ccc(-c4ccccc4)cc3)c3ccc(-c4cccc5c4-c4sc6ccccc6c4C5(c4ccccc4)c4ccccc4)cc3)cc2)cc1] | 57% |

TABLE 3-continued
| Compound No. | Intermediate E | Intermediate F | Target Compound | Yield |
|---|---|---|---|---|
| 3-162 | 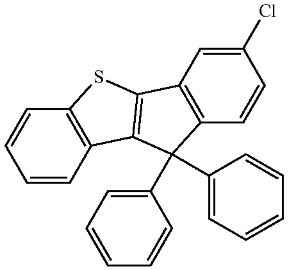 [SMILES: Clc1ccc2c(c1)-c1sc3ccccc3c1C2(c1ccccc1)c1ccccc1] | 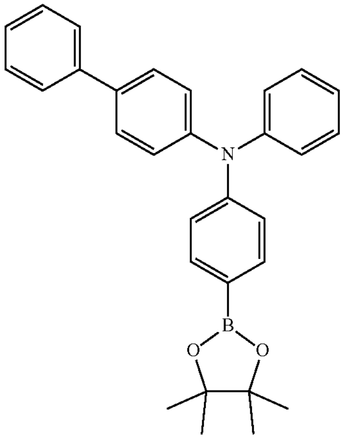 [SMILES: CC1(C)OB(c2ccc(N(c3ccccc3)c3ccc(-c4ccccc4)cc3)cc2)OC1(C)C] | 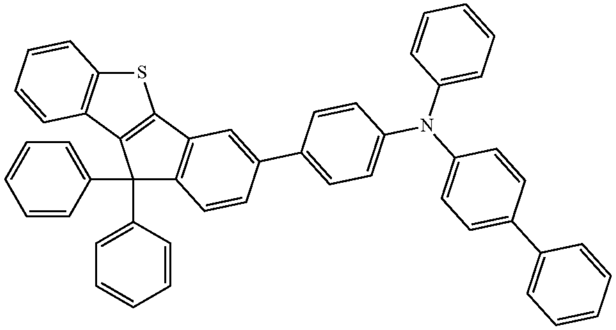 [SMILES: c1ccc(-c2ccc(N(c3ccccc3)c3ccc(-c4ccc5c(c4)-c4sc6ccccc6c4C5(c4ccccc4)c4ccccc4)cc3)cc2)cc1] | 62% |
| 3-181 | 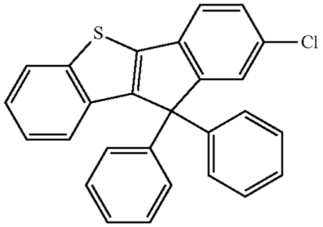 [SMILES: Clc1ccc2c(c1)C(c1ccccc1)(c1ccccc1)c1c-2sc2ccccc12] | 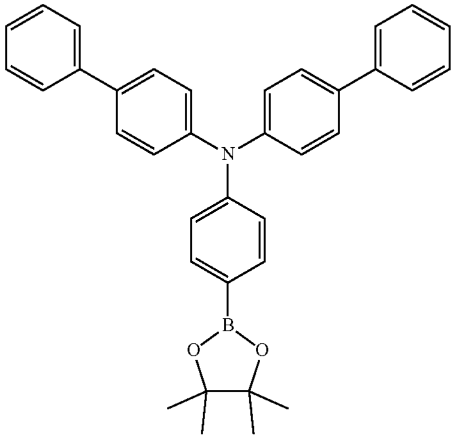 [SMILES: CC1(C)OB(c2ccc(N(c3ccc(-c4ccccc4)cc3)c3ccc(-c4ccccc4)cc3)cc2)OC1(C)C] | 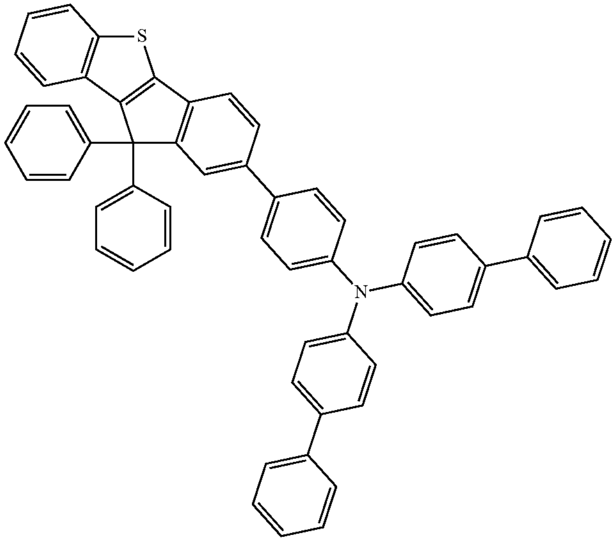 [SMILES: c1ccc(-c2ccc(N(c3ccc(-c4ccccc4)cc3)c3ccc(-c4ccc5c(c4)C(c4ccccc4)(c4ccccc4)c4c-5sc5ccccc45)cc3)cc2)cc1] | 45% |

TABLE 3-continued
| Compound No. | Intermediate E | Intermediate F | Target Compound | Yield |
|---|---|---|---|---|
| 3-182 | 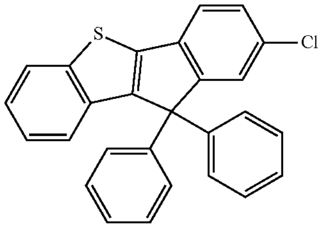 [SMILES: Clc1ccc2c(c1)C(c1ccccc1)(c1ccccc1)c1c-2sc2ccccc12] | 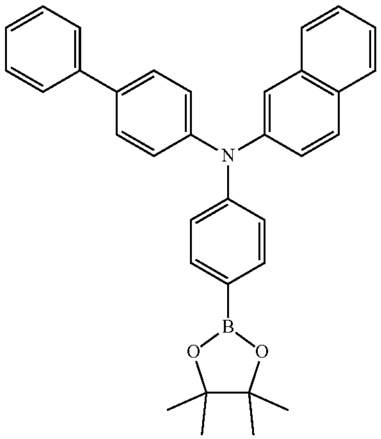 [SMILES: CC1(C)OB(c2ccc(N(c3ccc(-c4ccccc4)cc3)c3ccc4ccccc4c3)cc2)OC1(C)C] | 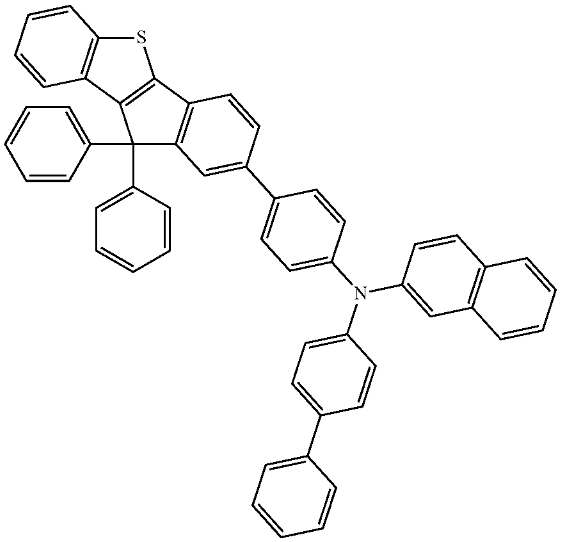 [SMILES: c1ccc(-c2ccc(N(c3ccc(-c4ccc5c(c4)C(c4ccccc4)(c4ccccc4)c4c-5sc5ccccc45)cc3)c3ccc4ccccc4c3)cc2)cc1] | 51% |
| 3-216 | 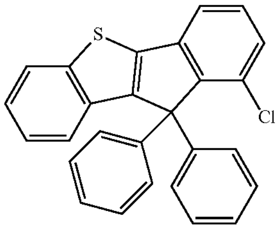 [SMILES: Clc1cccc2c1C(c1ccccc1)(c1ccccc1)c1c-2sc2ccccc12] | 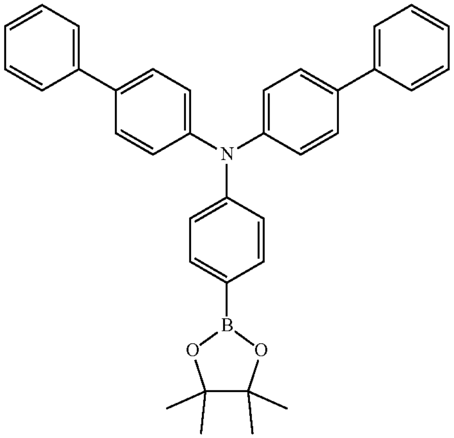 [SMILES: CC1(C)OB(c2ccc(N(c3ccc(-c4ccccc4)cc3)c3ccc(-c4ccccc4)cc3)cc2)OC1(C)C] | 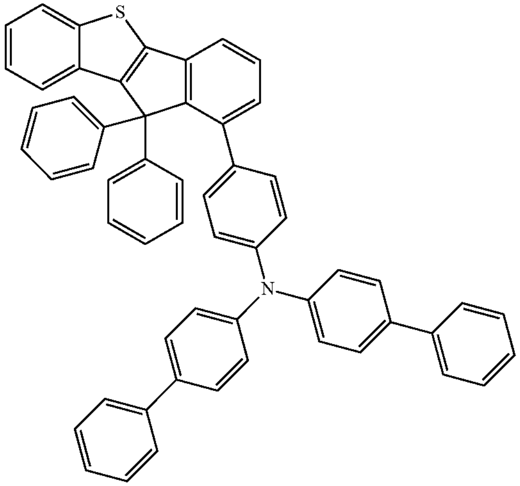 [SMILES: c1ccc(-c2ccc(N(c3ccc(-c4ccccc4)cc3)c3ccc(-c4cccc5c4C(c4ccccc4)(c4ccccc4)c4c-5sc5ccccc45)cc3)cc2)cc1] | 52% |

TABLE 3-continued
| Compound No. | Intermediate E | Intermediate F | Target Compound | Yield |
| --- | --- | --- | --- | --- |
| 3-229 | 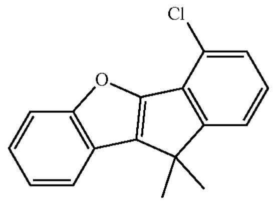 [SMILES: CC1(C)c2cccc(Cl)c2-c2oc3ccccc3c21] | 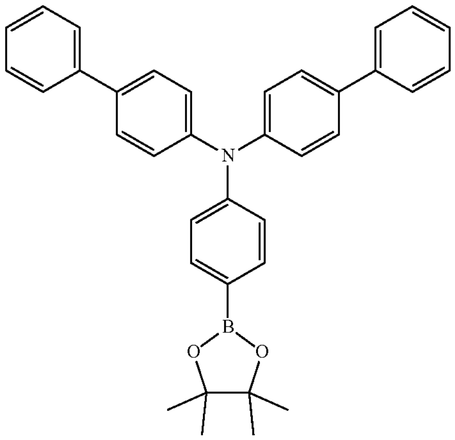 [SMILES: CC1(C)OB(c2ccc(N(c3ccc(-c4ccccc4)cc3)c3ccc(-c4ccccc4)cc3)cc2)OC1(C)C] | 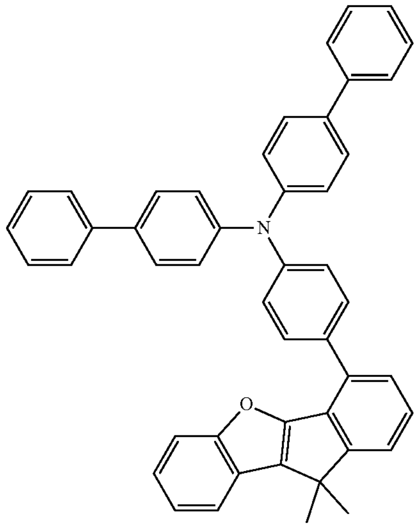 [SMILES: CC1(C)c2cccc(-c3ccc(N(c4ccc(-c5ccccc5)cc4)c4ccc(-c5ccccc5)cc4)cc3)c2-c2oc3ccccc3c21] | 48% |
| 3-247 | 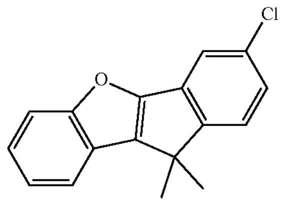 [SMILES: CC1(C)c2ccc(Cl)cc2-c2oc3ccccc3c21] | 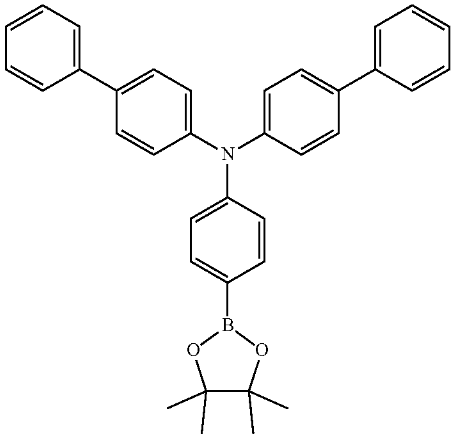 [SMILES: CC1(C)OB(c2ccc(N(c3ccc(-c4ccccc4)cc3)c3ccc(-c4ccccc4)cc3)cc2)OC1(C)C] | 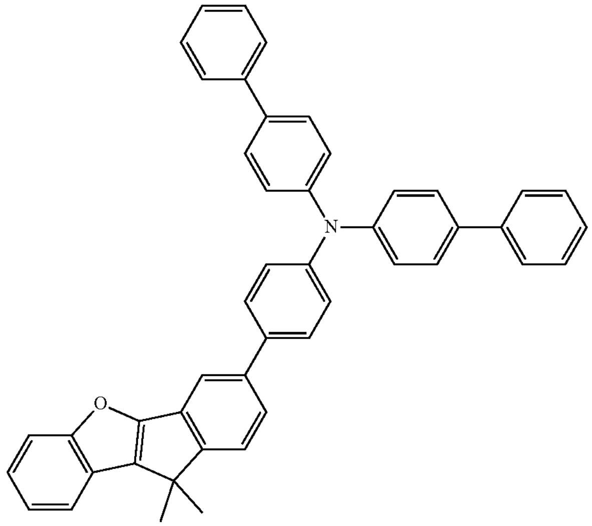 [SMILES: CC1(C)c2ccc(-c3ccc(N(c4ccc(-c5ccccc5)cc4)c4ccc(-c5ccccc5)cc4)cc3)cc2-c2oc3ccccc3c21] | 61% |

TABLE 3-continued
| Compound No. | Intermediate E | Intermediate F | Target Compound | Yield |
|---|---|---|---|---|
| 3-261 | 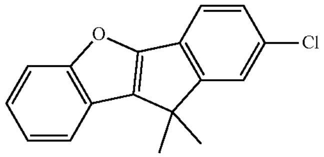 [SMILES: CC1(C)c2cc(Cl)ccc2-c2oc3ccccc3c21] | 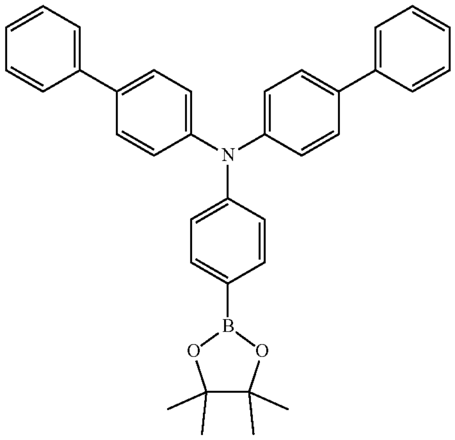 [SMILES: CC1(C)OB(c2ccc(N(c3ccc(-c4ccccc4)cc3)c3ccc(-c4ccccc4)cc3)cc2)OC1(C)C] | 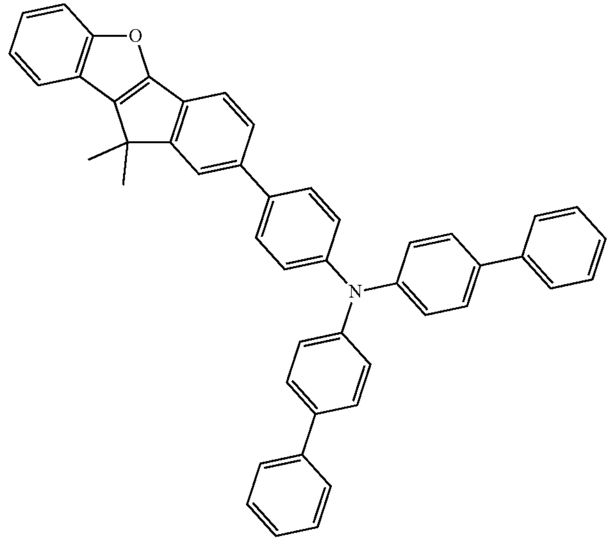 [SMILES: CC1(C)c2cc(-c3ccc(N(c4ccc(-c5ccccc5)cc4)c4ccc(-c5ccccc5)cc4)cc3)ccc2-c2oc3ccccc3c21] | 55% |

TABLE 3-continued
| Compound No. | Intermediate E | Intermediate F | Target Compound | Yield |
|---|---|---|---|---|
| 3-264 | 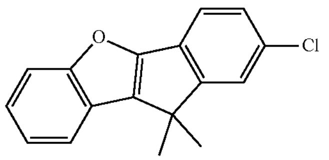 [SMILES: CC1(C)c2cc(Cl)ccc2-c2oc3ccccc3c21] | 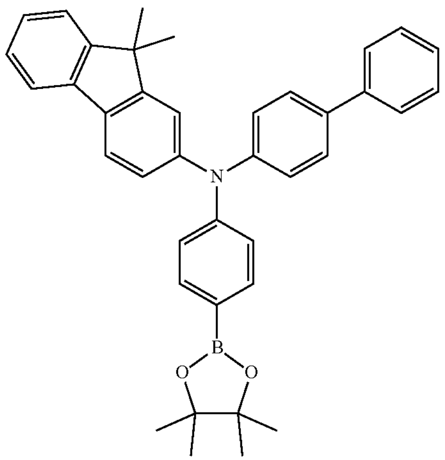 [SMILES: CC1(C)c2ccccc2-c2ccc(N(c3ccc(B4OC(C)(C)C(C)(C)O4)cc3)c3ccc(-c4ccccc4)cc3)cc21] | 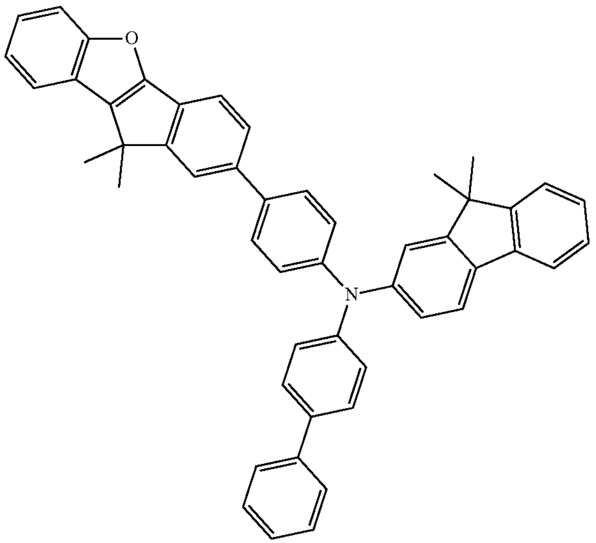 | 59% |

TABLE 3-continued
| Compound No. | Intermediate E | Intermediate F | Target Compound | Yield |
| --- | --- | --- | --- | --- |
| 3-276 | 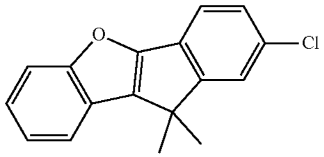 [SMILES: CC1(C)c2cc(Cl)ccc2-c2oc3ccccc3c21] | 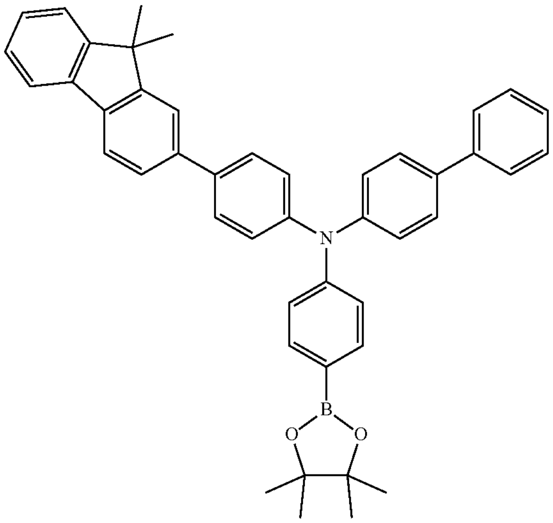 [SMILES: CC1(C)c2ccccc2-c2ccc(-c3ccc(N(c4ccc(B5OC(C)(C)C(C)(C)O5)cc4)c4ccc(-c5ccccc5)cc4)cc3)cc21] | 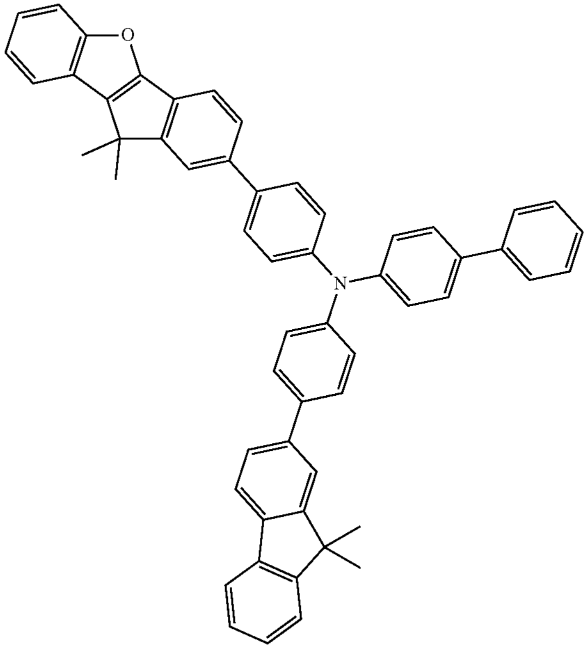 [SMILES: CC1(C)c2ccccc2-c2ccc(-c3ccc(N(c4ccc(-c5ccccc5)cc4)c4ccc(-c5ccc6c(c5)C(C)(C)c5c-6oc6ccccc56)cc4)cc3)cc21] | 58% |

TABLE 3-continued
| Compound No. | Intermediate E | Intermediate F | Target Compound | Yield |
|---|---|---|---|---|
| 3-294 | 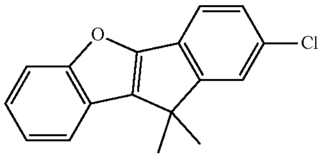 [SMILES: CC1(C)c2cc(Cl)ccc2-c2oc3ccccc3c21] | 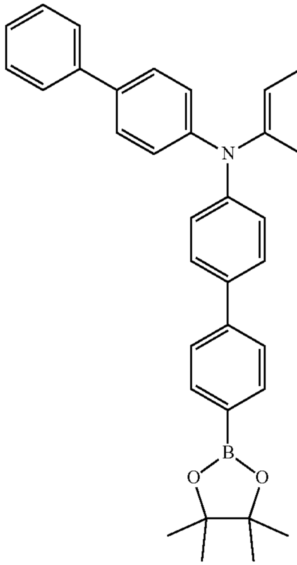 | 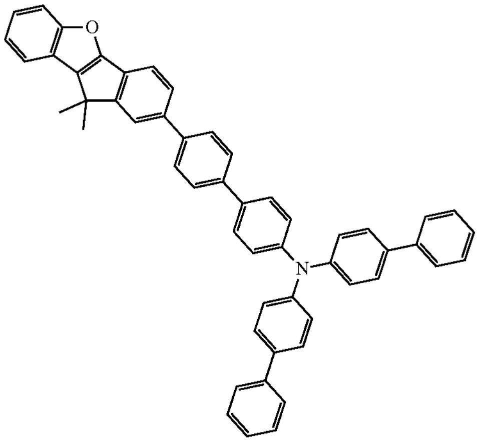 [SMILES: CC1(C)c2cc(-c3ccc(-c4ccc(N(c5ccc(-c6ccccc6)cc5)c5ccc(-c6ccccc6)cc5)cc4)cc3)ccc2-c2oc3ccccc3c21] | 60% |

[Preparation Example 4] Preparation of Compound 4-125

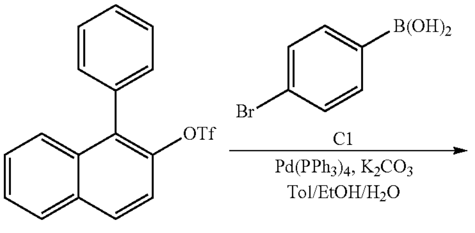

4-125-2

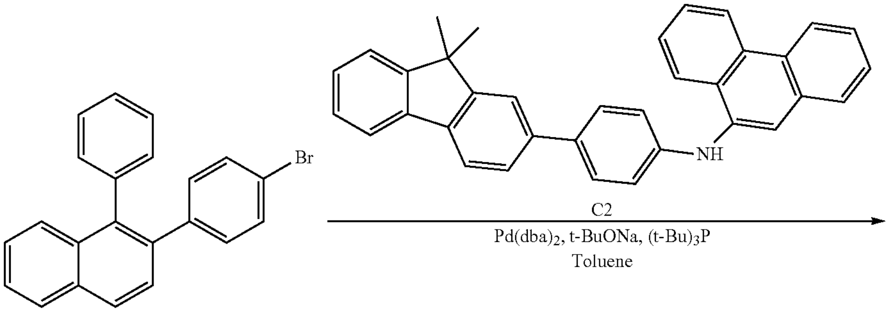

4-125-1

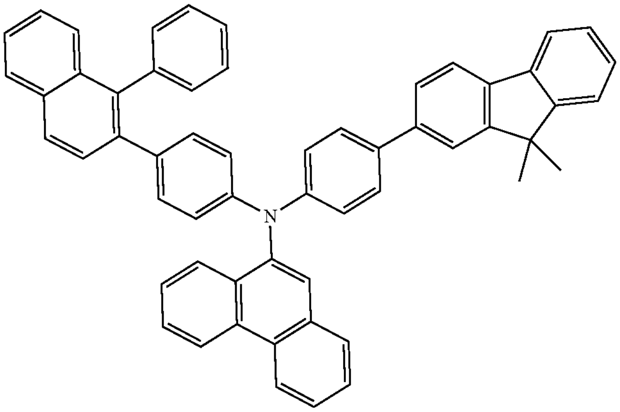

4-125

Synthesis of Compound 4-125-1

After dissolving Compound 4-125-2 (1-phenylnaphthalen-2-yl trifluoromethanesulfonate) (21.7 g, 61.52 mmol) and Compound C1 ((4-bromophenyl)boronic acid) (12.97 g, 64.60 mmol) in toluene (300 ml), ethanol (60 ml) and $H_2O$ (60 ml), $Pd(PPh_3)_4$ (3.56 g, 3.08 mmol) and $K_2CO_3$ (25.51 g, 184.56 mmol) were introduced thereto, and the mixture was stirred for 2 hours under reflux. After the reaction was completed, MC was introduced to the reaction solution for dissolution, and the result was extracted with distilled water and the organic layer was dried with anhydrous $MgSO_4$. Then, the solvent was removed using a rotary evaporator, and the result was purified by column chromatography using dichloromethane and hexane as a developing solvent to obtain Compound 4-125-1 (16.35 g, yield 74%).

Synthesis of Compound 4-125

After dissolving Compound 4-125-1 (7.14 g, 19.87 mmol) and Compound C2 (N-(4-9,9-dimethyl-9H-fluoren-2-yl) phenyl)phenanthren-9-amine) (9.17 g, 19.87 mmol) in toluene (140 ml), $Pd(dba)_2$ (1.14 g, 1.99 mmol), $P(t\text{-}Bu)_3$ (1.65 ml, 3.97 mmol) and t-BuONa (3.82 g, 39.74 mmol) were introduced thereto, and the mixture was stirred for 12 hours under reflux. After the reaction was completed, MC was introduced to the reaction solution for dissolution, and the result was extracted with distilled water and the organic layer was dried with anhydrous $MgSO_4$. Then, the solvent was removed using a rotary evaporator, and the result was purified by column chromatography using dichloromethane and hexane as a developing solvent to obtain Compound 4-125 (12.79 g, yield 87%).

Target compounds were synthesized in the same manner as in Preparation Example 4 except that Intermediate G of the following Table 4 was used instead of Compound 4-125-2, Intermediate H of the following Table 4 was used instead of Compound C1, and Intermediate I of the following Table 4 was used instead of Compound C2.

TABLE 4
| Compound No. | Intermediate G | Intermediate H | Intermediate I | Target Compound | Yield |
|---|---|---|---|---|---|
| 4-3 | 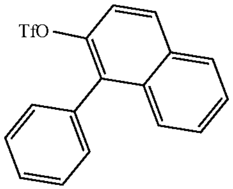 [SMILES: O=S(=O)(Oc1ccc2ccccc2c1-c1ccccc1)C(F)(F)F] | 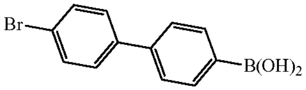 [SMILES: OB(O)c1ccc(-c2ccc(Br)cc2)cc1] | 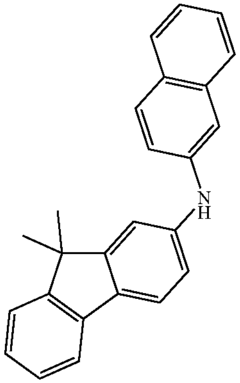 [SMILES: CC1(C)c2ccccc2-c2ccc(Nc3ccc4ccccc4c3)cc21] | 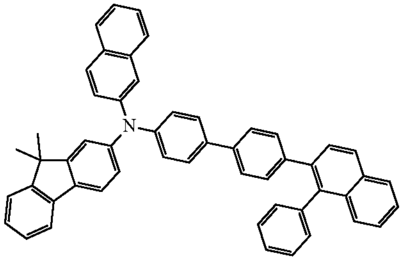 [SMILES: CC1(C)c2ccccc2-c2ccc(N(c3ccc(-c4ccc(-c5ccc6ccccc6c5-c5ccccc5)cc4)cc3)c3ccc4ccccc4c3)cc21] | 81% |
| 4-16 | 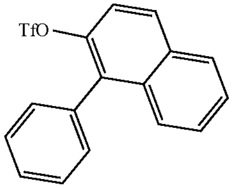 [SMILES: O=S(=O)(Oc1ccc2ccccc2c1-c1ccccc1)C(F)(F)F] | 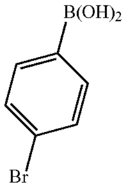 | 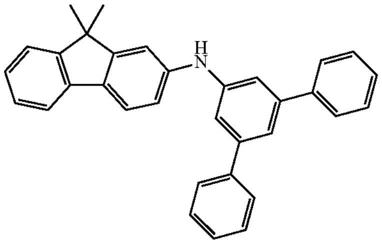 [SMILES: CC1(C)c2ccccc2-c2ccc(Nc3cc(-c4ccccc4)cc(-c4ccccc4)c3)cc21] | 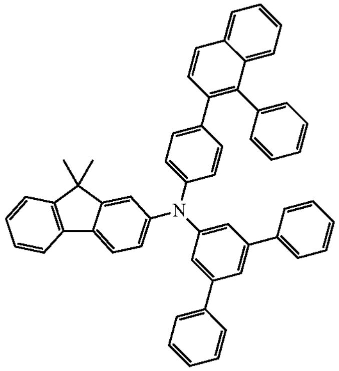 [SMILES: CC1(C)c2ccccc2-c2ccc(N(c3ccc(-c4ccc5ccccc5c4-c4ccccc4)cc3)c3cc(-c4ccccc4)cc(-c4ccccc4)c3)cc21] | 62% |

TABLE 4-continued
| Compound No. | Intermediate G | Intermediate H | Intermediate I | Target Compound | Yield |
|---|---|---|---|---|---|
| 4-21 | 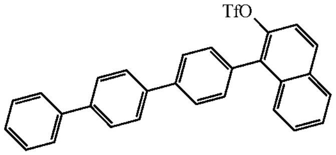 [SMILES: O=S(=O)(Oc1ccc2ccccc2c1-c1ccc(-c2ccc(-c3ccccc3)cc2)cc1)C(F)(F)F] | 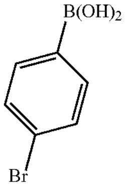 | 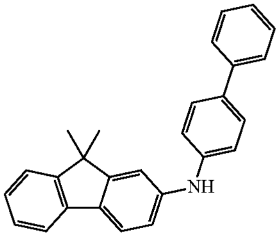 [SMILES: CC1(C)c2ccccc2-c2ccc(Nc3ccc(-c4ccccc4)cc3)cc21] | 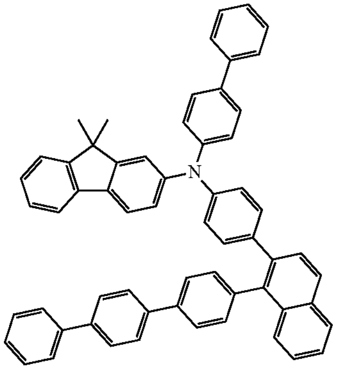 [SMILES: CC1(C)c2ccccc2-c2ccc(N(c3ccc(-c4ccccc4)cc3)c3ccc(-c4ccc5ccccc5c4-c4ccc(-c5ccc(-c6ccccc6)cc5)cc4)cc3)cc21] | 76% |
| 4-22 | 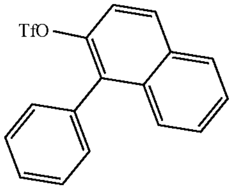 [SMILES: O=S(=O)(Oc1ccc2ccccc2c1-c1ccccc1)C(F)(F)F] | 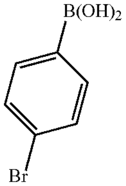 | 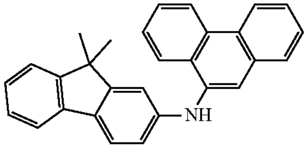 [SMILES: CC1(C)c2ccccc2-c2ccc(Nc3cc4ccccc4c4ccccc34)cc21] | 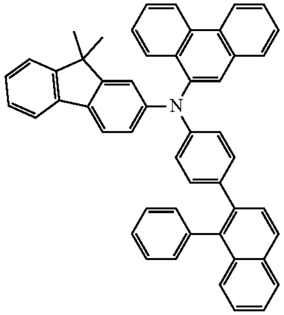 [SMILES: CC1(C)c2ccccc2-c2ccc(N(c3ccc(-c4ccc5ccccc5c4-c4ccccc4)cc3)c3cc4ccccc4c4ccccc34)cc21] | 78% |

TABLE 4-continued
| Compound No. | Intermediate G | Intermediate H | Intermediate I | Target Compound | Yield |
| --- | --- | --- | --- | --- | --- |
| 4-30 | 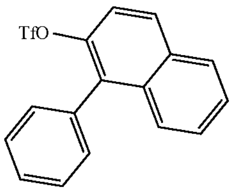 [SMILES: O=S(=O)(Oc1ccc2ccccc2c1-c1ccccc1)C(F)(F)F] | 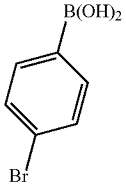 | 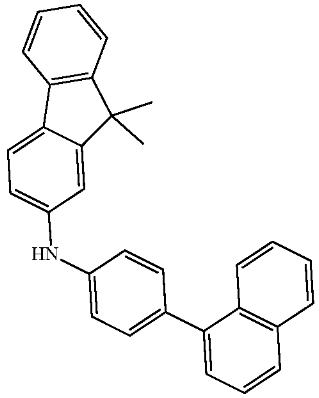 [SMILES: CC1(C)c2ccccc2-c2ccc(Nc3ccc(-c4cccc5ccccc45)cc3)cc21] | 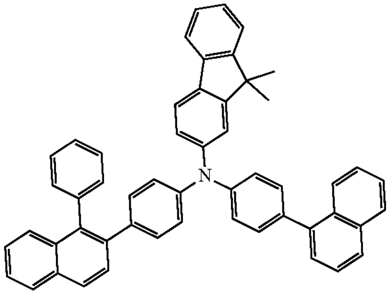 [SMILES: CC1(C)c2ccccc2-c2ccc(N(c3ccc(-c4ccc5ccccc5c4-c4ccccc4)cc3)c3ccc(-c4cccc5ccccc45)cc3)cc21] | 86% |
| 4-32 | 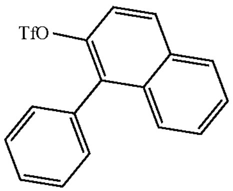 [SMILES: O=S(=O)(Oc1ccc2ccccc2c1-c1ccccc1)C(F)(F)F] | 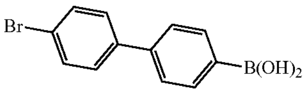 [SMILES: OB(O)c1ccc(-c2ccc(Br)cc2)cc1] | 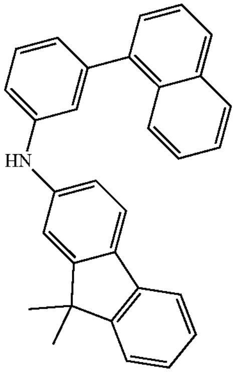 [SMILES: CC1(C)c2ccccc2-c2ccc(Nc3cccc(-c4cccc5ccccc45)c3)cc21] | 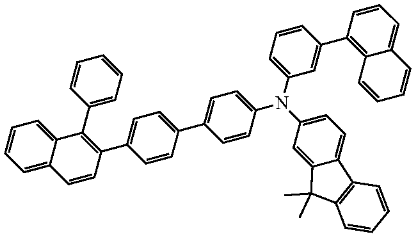 [SMILES: CC1(C)c2ccccc2-c2ccc(N(c3ccc(-c4ccc(-c5ccc6ccccc6c5-c5ccccc5)cc4)cc3)c3cccc(-c4cccc5ccccc45)c3)cc21] | 91% |

TABLE 4-continued
| Compound No. | Intermediate G | Intermediate H | Intermediate I | Target Compound | Yield |
| --- | --- | --- | --- | --- | --- |
| 4-38 | 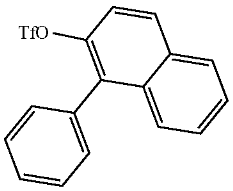 [SMILES: O=S(=O)(Oc1ccc2ccccc2c1-c1ccccc1)C(F)(F)F] | 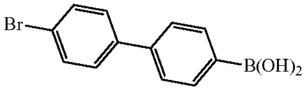 | 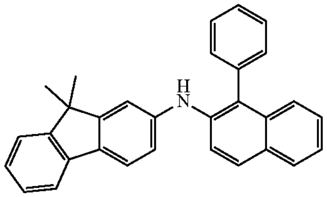 [SMILES: CC1(C)c2ccccc2-c2ccc(Nc3ccc4ccccc4c3-c3ccccc3)cc21] | 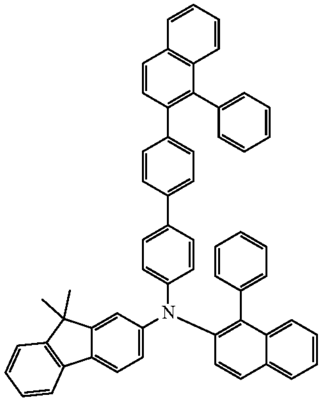 [SMILES: CC1(C)c2ccccc2-c2ccc(N(c3ccc(-c4ccc(-c5ccc6ccccc6c5-c5ccccc5)cc4)cc3)c3ccc4ccccc4c3-c3ccccc3)cc21] | 62% |
| 4-69 | 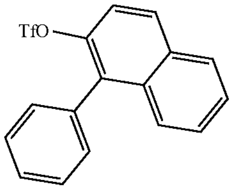 [SMILES: O=S(=O)(Oc1ccc2ccccc2c1-c1ccccc1)C(F)(F)F] | 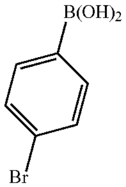 | 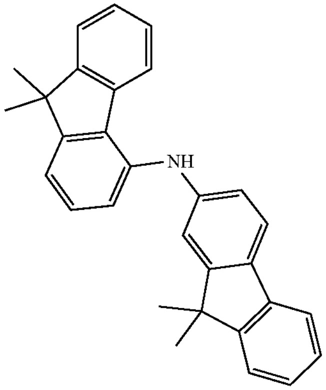 [SMILES: CC1(C)c2ccccc2-c2ccc(Nc3cccc4c3-c3ccccc3C4(C)C)cc21] | 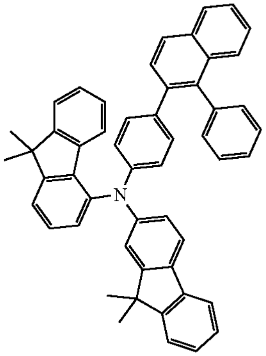 [SMILES: CC1(C)c2ccccc2-c2ccc(N(c3ccc(-c4ccc5ccccc5c4-c4ccccc4)cc3)c3cccc4c3-c3ccccc3C4(C)C)cc21] | 78% |

TABLE 4-continued
| Compound No. | Intermediate G | Intermediate H | Intermediate I | Target Compound | Yield |
|---|---|---|---|---|---|
| 4-81 | 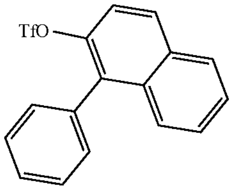 [SMILES: O=S(=O)(Oc1ccc2ccccc2c1-c1ccccc1)C(F)(F)F] | 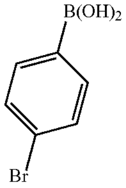 | 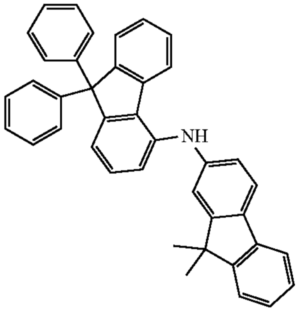 [SMILES: CC1(C)c2ccccc2-c2ccc(Nc3cccc4c3-c3ccccc3C4(c3ccccc3)c3ccccc3)cc21] | 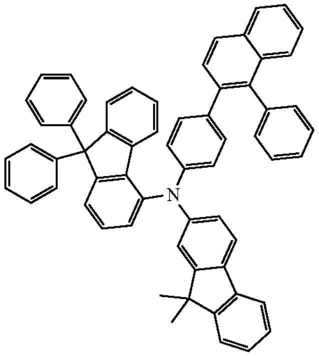 [SMILES: CC1(C)c2ccccc2-c2ccc(N(c3ccc(-c4ccc5ccccc5c4-c4ccccc4)cc3)c3cccc4c3-c3ccccc3C4(c3ccccc3)c3ccccc3)cc21] | 77% |
| 4-83 | 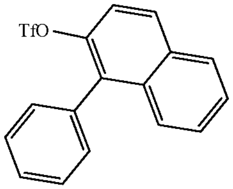 [SMILES: O=S(=O)(Oc1ccc2ccccc2c1-c1ccccc1)C(F)(F)F] | 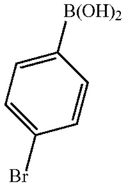 | 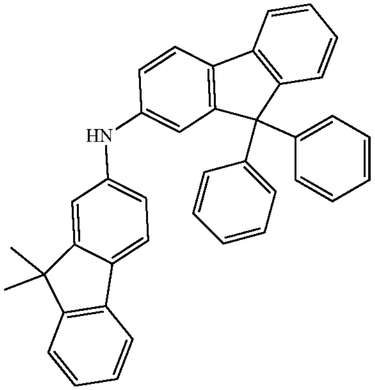 [SMILES: CC1(C)c2ccccc2-c2ccc(Nc3ccc4c(c3)C(c3ccccc3)(c3ccccc3)c3ccccc3-4)cc21] | 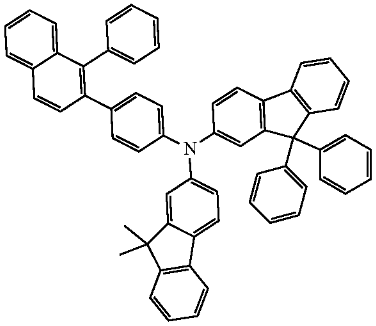 [SMILES: CC1(C)c2ccccc2-c2ccc(N(c3ccc(-c4ccc5ccccc5c4-c4ccccc4)cc3)c3ccc4c(c3)C(c3ccccc3)(c3ccccc3)c3ccccc3-4)cc21] | 69% |

TABLE 4-continued
| Compound No. | Intermediate G | Intermediate H | Intermediate I | Target Compound | Yield |
| --- | --- | --- | --- | --- | --- |
| 4-92 | 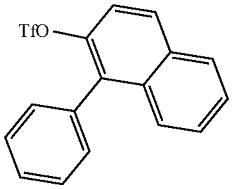 [SMILES: O=S(=O)(Oc1ccc2ccccc2c1-c1ccccc1)C(F)(F)F] | 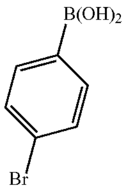 | 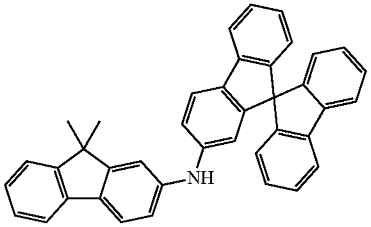 [SMILES: CC1(C)c2ccccc2-c2ccc(Nc3ccc4c(c3)C3(c5ccccc5-c5ccccc53)c3ccccc3-4)cc21] | 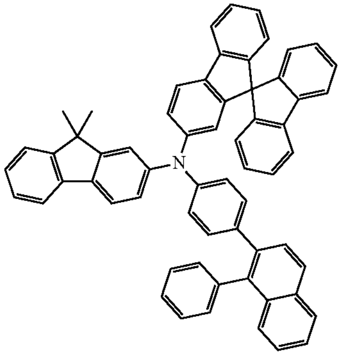 | 83% |

The following Tables 5 to 8 and Tables 9 to 12 show FD-MS and $^1$H-NMR data for the compounds each synthesized using the above-described preparation methods, and through the following data, syntheses of the target compounds were identified.

TABLE 5

| Compound | FD-MS | Compound | FD-MS |
|---|---|---|---|
| 1-1 | m/z = 651.23 ($C_{47}H_{29}N_3O$ = 651.75) | 1-2 | m/z = 651.23 ($C_{47}H_{29}N_3O$ = 651.75) |
| 1-3 | m/z = 651.23 ($C_{47}H_{29}N_3O$ = 651.75) | 1-4 | m/z = 651.23 ($C_{47}H_{29}N_3O$ = 651.75) |
| 1-5 | m/z = 691.23 ($C_{49}H_{29}N_3O_2$ = 691.77) | 1-6 | m/z = 727.26 ($C_{53}H_{33}N_3O$ = 727.85) |
| 1-7 | m/z = 625.22 ($C_{45}H_{27}N_3O$ = 625.72) | 1-8 | m/z = 651.23 ($C_{47}H_{29}N_3O$ = 651.75) |
| 1-9 | m/z = 691.26 ($C_{50}H_{33}N_3O$ = 691.82) | 1-10 | m/z = 717.28 ($C_{52}H_{35}N_3O$ = 717.85) |
| 1-11 | m/z = 767.29 ($C_{56}H_{37}N_3O$ = 767.91) | 1-12 | m/z = 765.28 ($C_{56}H_{35}N_3O$ = 765.90) |
| 1-13 | m/z = 651.23 ($C_{47}H_{29}N_3O$ = 651.75) | 1-14 | m/z = 727.26 ($C_{53}H_{33}N_3O$ = 727.85) |
| 1-15 | m/z = 767.29 ($C_{56}H_{37}N_3O$ = 767.91) | 1-16 | m/z = 765.28 ($C_{56}H_{35}N_3O$ = 765.90) |
| 1-17 | m/z = 630.18 ($C_{44}H_{26}N_2OS$ = 630.76) | 1-18 | m/z = 630.18 ($C_{44}H_{26}N_2OS$ = 630.76) |
| 1-19 | m/z = 651.23 ($C_{47}H_{29}N_3O$ = 651.75) | 1-20 | m/z = 651.23 ($C_{47}H_{29}N_3O$ = 651.75) |
| 1-21 | m/z = 651.23 ($C_{47}H_{29}N_3O$ = 651.75) | 1-22 | m/z = 651.23 ($C_{47}H_{29}N_3O$ = 651.75) |
| 1-23 | m/z = 651.23 ($C_{47}H_{29}N_3O$ = 651.75) | 1-24 | m/z = 717.28 ($C_{52}H_{35}N_3O$ = 717.85) |
| 1-25 | m/z = 651.23 ($C_{47}H_{29}N_3O$ = 651.75) | 1-26 | m/z = 677.25 ($C_{49}H_{31}N_3O$ = 677.79) |
| 1-27 | m/z = 727.26 ($C_{53}H_{33}N_3O$ = 727.85) | 1-28 | m/z = 631.17 ($C_{43}H_{25}N_3OS$ = 631.74) |
| 1-29 | m/z = 727.26 ($C_{53}H_{33}N_3O$ = 727.85) | 1-30 | m/z = 651.23 ($C_{47}H_{29}N_3O$ = 651.75) |
| 1-31 | m/z = 701.25 ($C_{51}H_{31}N_3O$ = 701.81) | 1-32 | m/z = 817.27 ($C_{59}H_{35}N_3O_2$ = 817.93) |
| 1-33 | m/z = 651.23 ($C_{47}H_{29}N_3O$ = 651.75) | 1-34 | m/z = 777.28 ($C_{57}H_{35}N_3O$ = 777.91) |
| 1-35 | m/z = 803.29 ($C_{59}H_{37}N_3O$ = 803.94) | 1-36 | m/z = 803.29 ($C_{59}H_{37}N_3O$ = 803.94) |
| 1-37 | m/z = 803.29 ($C_{59}H_{37}N_3O$ = 803.94) | 1-38 | m/z = 651.23 ($C_{47}H_{29}N_3O$ = 651.75) |
| 1-39 | m/z = 777.28 ($C_{57}H_{35}N_3O$ = 777.91) | 1-40 | m/z = 777.28 ($C_{57}H_{35}N_3O$ = 777.91) |
| 1-41 | m/z = 777.28 ($C_{57}H_{35}N_3O$ = 777.91) | 1-42 | m/z = 817.31 ($C_{60}H_{39}N_3O$ = 817.97) |
| 1-43 | m/z = 843.32 ($C_{62}H_{41}N_3O$ = 844.01) | 1-44 | m/z = 765.28 ($C_{56}H_{35}N_3O$ = 765.90) |
| 1-45 | m/z = 777.28 ($C_{57}H_{35}N_3O$ = 777.91) | 1-46 | m/z = 777.28 ($C_{57}H_{35}N_3O$ = 777.91) |
| 1-47 | m/z = 680.19 ($C_{48}H_{28}N_2OS$ = 680.81) | 1-48 | m/z = 756.22 ($C_{54}H_{32}N_2OS$ = 756.91) |
| 1-49 | m/z = 727.26 ($C_{53}H_{33}N_3O$ = 727.85) | 1-50 | m/z = 727.26 ($C_{53}H_{33}N_3O$ = 727.85) |
| 1-51 | m/z = 741.24 ($C_{53}H_{31}N_3O_2$ = 741.83) | 1-52 | m/z = 727.26 ($C_{53}H_{33}N_3O$ = 727.85) |
| 1-53 | m/z = 777.28 ($C_{57}H_{35}N_3O$ = 777.91) | 1-54 | m/z = 651.23 ($C_{47}H_{29}N_3O$ = 651.75) |
| 1-55 | m/z = 777.28 ($C_{57}H_{35}N_3O$ = 777.91) | 1-56 | m/z = 767.29 ($C_{56}H_{37}N_3O$ = 767.91) |
| 1-57 | m/z = 767.29 ($C_{56}H_{37}N_3O$ = 767.91) | 1-58 | m/z = 727.26 ($C_{53}H_{33}N_3O$ = 727.85) |
| 1-59 | m/z = 889.31 ($C_{66}H_{39}N_3O$ = 890.04) | 1-60 | m/z = 891.32 ($C_{66}H_{41}N_3O$ = 892.05) |
| 1-61 | m/z = 727.26 ($C_{53}H_{33}N_3O$ = 727.85) | 1-62 | m/z = 767.29 ($C_{56}H_{37}N_3O$ = 767.91) |
| 1-63 | m/z = 680.19 ($C_{48}H_{28}N_2OS$ = 680.81) | 1-64 | m/z = 680.19 ($C_{48}H_{28}N_2OS$ = 680.81) |
| 1-65 | m/z = 665.21 ($C_{47}H_{27}N_3O_2$ = 665.74) | 1-66 | m/z = 651.23 ($C_{47}H_{29}N_3O$ = 651.75) |
| 1-67 | m/z = 651.23 ($C_{47}H_{29}N_3O$ = 651.75) | 1-68 | m/z = 727.26 ($C_{53}H_{33}N_3O$ = 727.85) |
| 1-69 | m/z = 651.23 ($C_{47}H_{29}N_3O$ = 651.75) | 1-70 | m/z = 701.25 ($C_{51}H_{31}N_3O$ = 701.81) |
| 1-71 | m/z = 651.23 ($C_{47}H_{29}N_3O$ = 651.75) | 1-72 | m/z = 701.25 ($C_{51}H_{31}N_3O$ = 701.81) |
| 1-73 | m/z = 625.22 ($C_{45}H_{27}N_3O$ = 625.72) | 1-74 | m/z = 651.23 ($C_{47}H_{29}N_3O$ = 651.75) |
| 1-75 | m/z = 691.26 ($C_{50}H_{33}N_3O$ = 691.82) | 1-76 | m/z = 815.29 ($C_{60}H_{37}N_3O$ = 815.96) |
| 1-77 | m/z = 727.26 ($C_{53}H_{33}N_3O$ = 727.85) | 1-78 | m/z = 741.24 ($C_{53}H_{31}N_3O_2$ = 741.83) |
| 1-79 | m/z = 727.26 ($C_{53}H_{33}N_3O$ = 727.85) | 1-80 | m/z = 843.32 ($C_{62}H_{41}N_3O$ = 844.01) |
| 1-81 | m/z = 741.24 ($C_{53}H_{31}N_3O_2$ = 741.83) | 1-82 | m/z = 727.26 ($C_{53}H_{33}N_3O$ = 727.85) |
| 1-83 | m/z = 651.23 ($C_{47}H_{29}N_3O$ = 651.75) | 1-84 | m/z = 727.26 ($C_{53}H_{33}N_3O$ = 727.85) |
| 1-85 | m/z = 777.28 ($C_{57}H_{35}N_3O$ = 777.91) | 1-86 | m/z = 817.31 ($C_{60}H_{39}N_3O$ = 817.97) |
| 1-87 | m/z = 843.32 ($C_{62}H_{41}N_3O$ = 844.01) | 1-88 | m/z = 765.28 ($C_{56}H_{35}N_3O$ = 765.90) |
| 1-89 | m/z = 717.28 ($C_{52}H_{35}N_3O$ = 717.85) | 1-90 | m/z = 777.28 ($C_{57}H_{35}N_3O$ = 777.91) |
| 1-91 | m/z = 727.26 ($C_{53}H_{33}N_3O$ = 727.85) | 1-92 | m/z = 767.29 ($C_{56}H_{37}N_3O$ = 767.91) |
| 1-93 | m/z = 651.23 ($C_{47}H_{29}N_3O$ = 651.75) | 1-94 | m/z = 691.26 ($C_{50}H_{33}N_3O$ = 691.82) |
| 1-95 | m/z = 717.28 ($C_{52}H_{35}N_3O$ = 717.85) | 1-96 | m/z = 727.26 ($C_{53}H_{33}N_3O$ = 727.85) |
| 1-97 | m/z = 843.32 ($C_{62}H_{41}N_3O$ = 844.01) | 1-98 | m/z = 753.28 ($C_{55}H_{35}N_3O$ = 753.89) |
| 1-99 | m/z = 727.26 ($C_{53}H_{33}N_3O$ = 727.85) | 1-100 | m/z = 807.29 ($C_{58}H_{37}N_3O_2$ = 807.93) |
| 1-101 | m/z = 717.28 ($C_{52}H_{35}N_3O$ = 717.85) | 1-102 | m/z = 717.28 ($C_{52}H_{35}N_3O$ = 717.85) |
| 1-103 | m/z = 807.29 ($C_{58}H_{37}N_3O_2$ = 807.93) | 1-104 | m/z = 767.29 ($C_{56}H_{37}N_3O$ = 767.91) |
| 1-105 | m/z = 767.29 ($C_{56}H_{37}N_3O$ = 767.91) | 1-106 | m/z = 843.32 ($C_{62}H_{41}N_3O$ = 844.01) |
| 1-107 | m/z = 741.28 ($C_{54}H_{35}N_3O$ = 741.88) | 1-108 | m/z = 767.29 ($C_{56}H_{37}N_3O$ = 767.91) |
| 1-109 | m/z = 727.26 ($C_{53}H_{33}N_3O$ = 727.85) | 1-110 | m/z = 691.26 ($C_{50}H_{33}N_3O$ = 691.82) |
| 1-111 | m/z = 601.22 ($C_{43}H_{27}N_3O$ = 601.69) | 1-112 | m/z = 670.21 ($C_{47}H_{30}N_2OS$ = 670.82) |
| 1-113 | m/z = 753.28 ($C_{55}H_{35}N_3O$ = 753.89) | 1-114 | m/z = 753.28 ($C_{55}H_{35}N_3O$ = 753.89) |
| 1-115 | m/z = 691.23 ($C_{49}H_{29}N_3O_2$ = 691.77) | 1-116 | m/z = 803.29 ($C_{59}H_{37}N_3O$ = 803.94) |
| 1-117 | m/z = 803.29 ($C_{59}H_{37}N_3O$ = 803.94) | 1-118 | m/z = 803.29 ($C_{59}H_{37}N_3O$ = 803.94) |
| 1-119 | m/z = 677.25 ($C_{49}H_{31}N_3O$ = 677.79) | 1-120 | m/z = 727.26 ($C_{53}H_{33}N_3O$ = 727.85) |
| 1-121 | m/z = 869.34 ($C_{64}H_{43}N_3O$ = 870.05) | 1-122 | m/z = 869.34 ($C_{64}H_{43}N_3O$ = 870.05) |
| 1-123 | m/z = 706.21 ($C_{50}H_{30}N_2OS$ = 706.85) | 1-124 | m/z = 822.27 ($C_{59}H_{38}N_2OS$ = 823.01) |
| 1-125 | m/z = 741.24 ($C_{53}H_{31}N_3O_2$ = 741.83) | 1-126 | m/z = 691.23 ($C_{49}H_{29}N_3O_2$ = 691.77) |
| 1-127 | m/z = 781.24 ($C_{55}H_{31}N_3O_3$ = 781.85) | 1-128 | m/z = 691.23 ($C_{49}H_{29}N_3O_2$ = 691.77) |
| 1-129 | m/z = 707.20 ($C_{49}H_{29}N_3OS$ = 707.84) | 1-130 | m/z = 707.20 ($C_{49}H_{29}N_3OS$ = 707.84) |
| 1-131 | m/z = 757.22 ($C_{53}H_{31}N_3OS$ = 757.90) | 1-132 | m/z = 736.16 ($C_{50}H_{28}N_2OS_2$ = 736.90) |
| 1-133 | m/z = 667.21 ($C_{47}H_{29}N_3S$ = 667.82) | 1-134 | m/z = 617.19 ($C_{43}H_{27}N_3S$ = 617.76) |
| 1-135 | m/z = 667.21 ($C_{47}H_{29}N_3S$ = 667.82) | 1-136 | m/z = 667.21 ($C_{47}H_{29}N_3S$ = 667.82) |
| 1-137 | m/z = 707.20 ($C_{49}H_{29}N_3OS$ = 707.84) | 1-138 | m/z = 743.24 ($C_{53}H_{33}N_3S$ = 743.91) |
| 1-139 | m/z = 641.19 ($C_{45}H_{27}N_3S$ = 641.78) | 1-140 | m/z = 667.21 ($C_{47}H_{29}N_3S$ = 667.82) |
| 1-141 | m/z = 667.21 ($C_{47}H_{29}N_3S$ = 667.82) | 1-142 | m/z = 743.24 ($C_{53}H_{33}N_3S$ = 743.91) |

TABLE 5-continued

| Compound | FD-MS | Compound | FD-MS |
|---|---|---|---|
| 1-143 | m/z = 743.24 ($C_{53}H_{33}N_3S$ = 743.91) | 1-144 | m/z = 667.21 ($C_{47}H_{29}N_3S$ = 667.82) |
| 1-145 | m/z = 646.15 ($C_{44}H_{26}N_2S_2$ = 646.82) | 1-146 | m/z = 646.15 ($C_{44}H_{26}N_2S_2$ = 646.82) |
| 1-147 | m/z = 667.21 ($C_{47}H_{29}N_3S$ = 667.82) | 1-148 | m/z = 667.21 ($C_{47}H_{29}N_3S$ = 667.82) |
| 1-149 | m/z = 667.21 ($C_{47}H_{29}N_3S$ = 667.82) | 1-150 | m/z = 693.22 ($C_{49}H_{31}N_3S$ = 693.86) |
| 1-151 | m/z = 743.24 ($C_{53}H_{33}N_3S$ = 743.91) | 1-152 | m/z = 647.15 ($C_{43}H_{25}N_3S_2$ = 647.81) |
| 1-153 | m/z = 743.24 ($C_{53}H_{33}N_3S$ = 743.91) | 1-154 | m/z = 793.26 ($C_{57}H_{35}N_3S$ = 793.97) |
| 1-155 | m/z = 819.27 ($C_{59}H_{37}N_3S$ = 820.01) | 1-156 | m/z = 819.27 ($C_{59}H_{37}N_3S$ = 820.01) |
| 1-157 | m/z = 819.27 ($C_{59}H_{37}N_3S$ = 820.01) | 1-158 | m/z = 743.24 ($C_{53}H_{33}N_3S$ = 743.91) |
| 1-159 | m/z = 793.26 ($C_{57}H_{35}N_3S$ = 793.97) | 1-160 | m/z = 793.26 ($C_{57}H_{35}N_3S$ = 793.97) |
| 1-161 | m/z = 793.26 ($C_{57}H_{35}N_3S$ = 793.97) | 1-162 | m/z = 833.29 ($C_{60}H_{39}N_3S$ = 834.04) |
| 1-163 | m/z = 859.30 ($C_{62}H_{41}N_3S$ = 860.07) | 1-164 | m/z = 907.30 ($C_{66}H_{41}N_3S$ = 908.12) |
| 1-165 | m/z = 793.26 ($C_{57}H_{35}N_3S$ = 793.97) | 1-166 | m/z = 793.26 ($C_{57}H_{35}N_3S$ = 793.97) |
| 1-167 | m/z = 696.17 ($C_{48}H_{28}N_2S_2$ = 696.88) | 1-168 | m/z = 772.20 ($C_{54}H_{32}N_2S_2$ = 772.98) |
| 1-169 | m/z = 743.24 ($C_{53}H_{33}N_3S$ = 743.91) | 1-170 | m/z = 743.24 ($C_{53}H_{33}N_3S$ = 743.91) |
| 1-171 | m/z = 757.22 ($C_{53}H_{31}N_3OS$ = 757.90) | 1-172 | m/z = 743.24 ($C_{53}H_{33}N_3S$ = 743.91) |
| 1-173 | m/z = 793.26 ($C_{57}H_{35}N_3S$ = 793.97) | 1-174 | m/z = 667.21 ($C_{47}H_{29}N_3S$ = 667.82) |
| 1-175 | m/z = 793.26 ($C_{57}H_{35}N_3S$ = 793.97) | 1-176 | m/z = 783.27 ($C_{56}H_{37}N_3S$ = 783.98) |
| 1-177 | m/z = 783.27 ($C_{56}H_{37}N_3S$ = 783.98) | 1-178 | m/z = 743.24 ($C_{53}H_{33}N_3S$ = 743.91) |
| 1-179 | m/z = 783.27 ($C_{56}H_{37}N_3S$ = 783.98) | 1-180 | m/z = 907.30 ($C_{66}H_{41}N_3S$ = 908.12) |
| 1-181 | m/z = 681.19 ($C_{47}H_{27}N_3OS$ = 681.80) | 1-182 | m/z = 667.21 ($C_{47}H_{29}N_3S$ = 667.82) |
| 1-183 | m/z = 667.21 ($C_{47}H_{29}N_3S$ = 667.82) | 1-184 | m/z = 743.24 ($C_{53}H_{33}N_3S$ = 743.91) |
| 1-185 | m/z = 743.24 ($C_{53}H_{33}N_3S$ = 743.91) | 1-186 | m/z = 757.22 ($C_{53}H_{31}N_3OS$ = 757.90) |
| 1-187 | m/z = 743.24 ($C_{53}H_{33}N_3S$ = 743.91) | 1-188 | m/z = 859.30 ($C_{62}H_{41}N_3S$ = 860.07) |
| 1-189 | m/z = 757.22 ($C_{53}H_{31}N_3OS$ = 757.90) | 1-190 | m/z = 743.24 ($C_{53}H_{33}N_3S$ = 743.91) |
| 1-191 | m/z = 667.21 ($C_{47}H_{29}N_3S$ = 667.82) | 1-192 | m/z = 743.24 ($C_{53}H_{33}N_3S$ = 743.91) |
| 1-193 | m/z = 793.26 ($C_{57}H_{35}N_3S$ = 793.97) | 1-194 | m/z = 833.29 ($C_{60}H_{39}N_3S$ = 834.04) |
| 1-195 | m/z = 859.30 ($C_{62}H_{41}N_3S$ = 860.07) | 1-196 | m/z = 781.26 ($C_{56}H_{35}N_3S$ = 781.96) |
| 1-197 | m/z = 733.26 ($C_{52}H_{35}N_3S$ = 733.92) | 1-198 | m/z = 793.26 ($C_{57}H_{35}N_3S$ = 793.97) |
| 1-199 | m/z = 743.24 ($C_{53}H_{33}N_3S$ = 743.91) | 1-200 | m/z = 783.27 ($C_{56}H_{37}N_3S$ = 783.98) |
| 1-201 | m/z = 667.21 ($C_{47}H_{29}N_3S$ = 667.82) | 1-202 | m/z = 707.24 ($C_{50}H_{33}N_3S$ = 707.88) |
| 1-203 | m/z = 733.26 ($C_{52}H_{35}N_3S$ = 733.92) | 1-204 | m/z = 743.24 ($C_{53}H_{33}N_3S$ = 743.91) |
| 1-205 | m/z = 859.30 ($C_{62}H_{41}N_3S$ = 860.07) | 1-206 | m/z = 769.26 ($C_{55}H_{35}N_3S$ = 769.95) |
| 1-207 | m/z = 743.24 ($C_{53}H_{33}N_3S$ = 743.91) | 1-208 | m/z = 823.27 ($C_{58}H_{37}N_3OS$ = 824.00) |
| 1-209 | m/z = 651.23 ($C_{47}H_{29}N_3O$ = 651.75) | 1-210 | m/z = 677.25 ($C_{49}H_{31}N_3O$ = 677.79) |
| 1-211 | m/z = 615.19 ($C_{43}H_{25}N_3O_2$ = 615.68) | 1-212 | m/z = 601.22 ($C_{43}H_{27}N_3O$ = 601.69) |
| 1-213 | m/z = 677.25 ($C_{49}H_{31}N_3O$ = 677.79) | 1-214 | m/z = 525.18 ($C_{37}H_{23}N_3O$ = 525.60) |
| 1-215 | m/z = 525.18 ($C_{37}H_{23}N_3O$ = 525.60) | 1-216 | m/z = 816.29 ($C_{59}H_{36}N_4O$ = 816.94) |
| 1-217 | m/z = 690.24 ($C_{49}H_{30}N_4O$ = 690.79) | 1-218 | m/z = 766.27 ($C_{55}H_{34}N_4O$ = 766.88) |
| 1-219 | m/z = 766.27 ($C_{55}H_{34}N_4O$ = 766.88) | 1-220 | m/z = 740.26 ($C_{53}H_{32}N_4O$ = 740.85) |
| 1-221 | m/z = 782.25 ($C_{55}H_{34}N_4S$ = 782.95) | 1-222 | m/z = 756.23 ($C_{53}H_{32}N_4S$ = 756.91) |
| 1-223 | m/z = 740.26 ($C_{53}H_{32}N_4O$ = 740.85) | 1-224 | m/z = 740.26 ($C_{53}H_{32}N_4O$ = 740.85) |
| 1-225 | m/z = 541.16 ($C_{37}H_{23}N_3S$ = 541.66) | 1-226 | m/z = 541.16 ($C_{37}H_{23}N_3S$ = 541.66) |
| 1-227 | m/z = 641.19 ($C_{45}H_{27}N_3S$ = 641.78) | 1-228 | m/z = 717.22 ($C_{51}H_{31}N_3S$ = 717.88) |

TABLE 6

| Compound | FD-MS | Compound | FD-MS |
|---|---|---|---|
| 2-1 | m/z = 592.7600 (C42H28N2S, 592.1973) | 2-2 | m/z = 592.7600 (C42H28N2S, 592.1973) |
| 2-3 | m/z = 668.8580 (C48H32N2S, 668.2286) | 2-4 | m/z = 668.8580 (C48H32N2S, 668.2286) |
| 2-5 | m/z = 668.8580 (C48H32N2S, 668.2286) | 2-6 | m/z = 566.7220 (C40H26N2S, 566.1817) |
| 2-7 | m/z = 642.8200 (C46H30N2S, 642.2130) | 2-8 | m/z = 642.8200 (C46H30N2S, 642.2130) |
| 2-9 | m/z = 642.8200 (C46H30N2S, 642.2130) | 2-10 | m/z = 642.8200 (C46H30N2S, 642.2130) |
| 2-11 | m/z = 632.2286 (C45H32N2S, 632.2286) | 2-12 | m/z = 708.9230 (C51H36N2S, 708.2599) |
| 2-13 | m/z = 642.8200 (C46H30N2S, 642.2130) | 2-14 | m/z = 642.8200 (C46H30N2S, 642.2130) |
| 2-15 | m/z = 692.8800 (C50H32N2S, 692.2286) | 2-16 | m/z = 692.8800 (C50H32N2S, 692.2286) |
| 2-17 | m/z = 718.9180 (C52H34N2S, 718.2443) | 2-18 | m/z = 718.9180 (C52H34N2S, 718.2443) |
| 2-19 | m/z = 672.8640 (C46H28N2S2, 672.1694) | 2-20 | m/z = 698.9020 (C48H30N2S2, 698.1850) |
| 2-21 | m/z = 698.9020 (C48H30N2S2, 698.1850) | 2-22 | m/z = 698.9020 (C48H30N2S2, 698.1850) |
| 2-23 | m/z = 672.8640 (C46H28N2S2, 672.1694) | 2-24 | m/z = 698.9020 (C48H30N2S2, 698.1850) |
| 2-25 | m/z = 698.9020 (C48H30N2S2, 698.1850) | 2-26 | m/z = 698.9020 (C48H30N2S2, 698.1850) |
| 2-27 | m/z = 656.8030 (C46H28N2OS, 656.1922) | 2-28 | m/z = 682.8410 (C48H30N2OS, 682.2079) |
| 2-29 | m/z = 682.8410 (C48H30N2OS, 682.2079) | 2-30 | m/z = 656.8030 (C46H28N2OS, 656.1922) |
| 2-31 | m/z = 682.8410 (C48H30N2OS, 682.2079) | 2-32 | m/z = 682.8410 (C48H30N2OS, 682.2079) |
| 2-33 | m/z = 656.8030 (C46H28N2OS, 656.1922) | 2-34 | m/z = 682.8410 (C48H30N2OS, 682.2079) |
| 2-35 | m/z = 682.8410 (C48H30N2OS, 682.2079) | 2-36 | m/z = 682.8410 (C48H30N2OS, 682.2079) |
| 2-37 | m/z = 682.8410 (C48H30N2OS, 682.2079) | 2-38 | m/z = 682.8410 (C48H30N2OS, 682.2079) |
| 2-39 | m/z = 682.8410 (C48H30N2OS, 682.2079) | 2-40 | m/z = 744.9560 (C54H36N2S, 744.2599) |
| 2-41 | m/z = 718.9180 (C52H34N2S, 718.2443) | 2-42 | m/z = 785.9210 (C57H40N2S, 784.2912) |
| 2-43 | m/z = 718.9180 (C52H34N2S, 718.2443) | 2-44 | m/z = 795.0160 (C58H38N2S, 794.2756) |
| 2-45 | m/z = 758.9390 (C54H34N2OS, 758.2392) | 2-46 | m/z = 758.9390 (C54H34N2OS, 758.2392) |
| 2-47 | m/z = 744.9560 (C54H36N2S, 744.2599) | 2-48 | m/z = 718.9180 (C52H34N2S, 718.2443) |
| 2-49 | m/z = 768.9780 (C56H36N2S, 768.2599) | 2-50 | m/z = 795.0160 (C58H38N2S, 794.2756) |
| 2-51 | m/z = 758.9390 (C54H34N2OS, 758.2392) | 2-52 | m/z = 732.9010 (C52H32N2OS, 732.2235) |
| 2-53 | m/z = 758.9390 (C54H34N2OS, 758.2392) | 2-54 | m/z = 758.9390 (C54H34N2OS, 758.2392) |

TABLE 6-continued

| Compound | FD-MS | Compound | FD-MS |
|---|---|---|---|
| 2-55 | m/z = 668.8580 (C48H32N2S, 668.2286) | 2-56 | m/z = 668.8580 (C48H32N2S, 668.2286) |
| 2-57 | m/z = 744.9560 (C54H36N2S, 744.2599) | 2-58 | m/z = 744.9560 (C54H36N2S, 744.2599) |
| 2-59 | m/z = 744.9560 (C54H36N2S, 744.2599) | 2-60 | m/z = 642.8200 (C46H30N2S, 642.2130) |
| 2-61 | m/z = 642.8200 (C46H30N2S, 642.2130) | 2-62 | m/z = 718.9180 (C52H34N2S, 718.2443) |
| 2-63 | m/z = 718.9180 (C52H34N2S, 718.2443) | 2-64 | m/z = 718.9180 (C52H34N2S, 718.2443) |
| 2-65 | m/z = 718.9180 (C52H34N2S, 718.2443) | 2-66 | m/z = 692.8800 (C50H32N2S, 692.2286) |
| 2-67 | m/z = 692.8800 (C50H32N2S, 692.2286) | 2-68 | m/z = 692.8800 (C50H32N2S, 692.2286) |
| 2-69 | m/z = 708.9230 (C51H36N2S, 708.2599) | 2-70 | m/z = 785.0210 (C57H40N2S, 784.2912) |
| 2-71 | m/z = 785.0210 (C57H40N2S, 784.2912) | 2-72 | m/z = 718.9180 (C52H34N2S, 718.2443) |
| 2-73 | m/z = 718.9180 (C52H34N2S, 718.2443) | 2-74 | m/z = 768.9780 (C56H36N2S, 768.2599) |
| 2-75 | m/z = 795.0160 (C58H38N2S, 794.2756) | 2-76 | m/z = 795.0160 (C58H38N2S, 794.2756) |
| 2-77 | m/z = 698.9020 (C48H30N2S2, 698.1850) | 2-78 | m/z = 748.9620 (C52H32N2S2, 748.2007) |
| 2-79 | m/z = 775.0000 (C54H34N2S2, 774.2163) | 2-80 | m/z = 775.0000 (C54H34N2S2, 774.2163) |
| 2-81 | m/z = 698.9020 (C48H30N2S2, 698.1850) | 2-82 | m/z = 748.9620 (C52H32N2S2, 748.2007) |
| 2-83 | m/z = 775.0000 (C54H34N2S2, 774.2163) | 2-84 | m/z = 775.0000 (C54H34N2S2, 774.2163) |
| 2-85 | m/z = 698.9020 (C48H30N2S2, 698.1850) | 2-86 | m/z = 748.9620 (C52H32N2S2, 748.2007) |
| 2-87 | m/z = 775.0000 (C54H34N2S2, 774.2163) | 2-88 | m/z = 775.0000 (C54H34N2S2, 774.2163) |
| 2-89 | m/z = 698.9020 (C48H30N2S2, 698.1850) | 2-90 | m/z = 748.9620 (C52H32N2S2, 748.2007) |
| 2-91 | m/z = 682.8410 (C48H30N2OS, 682.2079) | 2-92 | m/z = 732.9010 (C52H32N2OS, 732.2235) |
| 2-93 | m/z = 758.9390 (C54H34N2OS, 758.2392) | 2-94 | m/z = 758.9390 (C54H34N2OS, 758.2392) |
| 2-95 | m/z = 758.9390 (C54H34N2OS, 758.2392) | 2-96 | m/z = 682.8410 (C48H30N2OS, 682.2079) |
| 2-97 | m/z = 732.9010 (C52H32N2OS, 732.2235) | 2-98 | m/z = 758.9390 (C54H34N2OS, 758.2392) |
| 2-99 | m/z = 758.9390 (C54H34N2OS, 758.2392) | 2-100 | m/z = 758.9390 (C54H34N2OS, 758.2392) |
| 2-101 | m/z = 682.8410 (C48H30N2OS, 682.2079) | 2-102 | m/z = 732.9010 (C52H32N2OS, 732.2235) |
| 2-103 | m/z = 732.9010 (C52H32N2OS, 732.2235) | 2-104 | m/z = 758.9390 (C54H34N2OS, 758.2392) |
| 2-105 | m/z = 758.9390 (C54H34N2OS, 758.2392) | 2-106 | m/z = 682.8410 (C48H30N2OS, 682.2079) |
| 2-107 | m/z = 732.9010 (C52H32N2OS, 732.2235) | 2-108 | m/z = 758.9390 (C54H34N2OS, 758.2392) |
| 2-109 | m/z = 758.9390 (C54H34N2OS, 758.2392) | 2-110 | m/z = 758.9390 (C54H34N2OS, 758.2392) |
| 2-111 | m/z = 744.9560 (C54H36N2S, 744.2599) | 2-112 | m/z = 744.9560 (C54H36N2S, 744.2599) |
| 2-113 | m/z = 718.9180 (C52H34N2S, 718.2443) | 2-114 | m/z = 718.9180 (C52H34N2S, 718.2443) |
| 2-115 | m/z = 795.0160 (C58H38N2S, 794.2756) | 2-116 | m/z = 795.0160 (C58H38N2S, 794.2756) |
| 2-117 | m/z = 795.0160 (C58H38N2S, 794.2756) | 2-118 | m/z = 795.0160 (C58H38N2S, 794.2756) |
| 2-119 | m/z = 768.9780 (C56H36N2S, 768.2599) | 2-120 | m/z = 768.9780 (C56H36N2S, 768.2599) |
| 2-121 | m/z = 768.9780 (C56H36N2S, 768.2599) | 2-122 | m/z = 785.0210 (C57H40N2S, 784.2912) |
| 2-123 | m/z = 795.0160 (C58H38N2S, 794.2756) | 2-124 | m/z = 795.0160 (C58H38N2S, 794.2756) |
| 2-125 | m/z = 775.0000 (C54H34N2S2, 774.2163) | 2-126 | m/z = 775.0000 (C54H34N2S2, 774.2163) |
| 2-127 | m/z = 775.0000 (C54H34N2S2, 774.2163) | 2-128 | m/z = 775.0000 (C54H34N2S2, 774.2163) |
| 2-129 | m/z = 758.9390 (C54H34N2OS, 758.2392) | 2-130 | m/z = 758.9390 (C54H34N2OS, 758.2392) |
| 2-131 | m/z = 758.9390 (C54H34N2OS, 758.2392) | 2-132 | m/z = 758.9390 (C54H34N2OS, 758.2392) |
| 2-133 | m/z = 744.9560 (C54H36N2S, 744.2599) | 2-134 | m/z = 744.9560 (C54H36N2S, 744.2599) |
| 2-135 | m/z = 718.9180 (C52H34N2S, 718.2443) | 2-136 | m/z = 718.9180 (C52H34N2S, 718.2443) |
| 2-137 | m/z = 795.0160 (C58H38N2S, 794.2756) | 2-138 | m/z = 795.0160 (C58H38N2S, 794.2756) |
| 2-139 | m/z = 795.0160 (C58H38N2S, 794.2756) | 2-140 | m/z = 795.0160 (C58H38N2S, 794.2756) |
| 2-141 | m/z = 768.9780 (C56H36N2S, 768.2599) | 2-142 | m/z = 768.9780 (C56H36N2S, 768.2599) |
| 2-143 | m/z = 768.9780 (C56H36N2S, 768.2599) | 2-144 | m/z = 785.0210 (C57H40N2S, 784.2912) |
| 2-145 | m/z = 795.0160 (C58H38N2S, 794.2756) | 2-146 | m/z = 795.0160 (C58H38N2S, 794.2756) |
| 2-147 | m/z = 775.0000 (C54H34N2S2, 774.2163) | 2-148 | m/z = 775.0000 (C54H34N2S2, 774.2163) |
| 2-149 | m/z = 775.0000 (C54H34N2S2, 774.2163) | 2-150 | m/z = 775.0000 (C54H34N2S2, 774.2163) |
| 2-151 | m/z = 758.9390 (C54H34N2OS, 758.2392) | 2-152 | m/z = 758.9390 (C54H34N2OS, 758.2392) |
| 2-153 | m/z = 758.9390 (C54H34N2OS, 758.2392) | 2-154 | m/z = 758.9390 (C54H34N2OS, 758.2392) |
| 2-155 | m/z = 718.9180 (C52H34N2S, 718.2443) | 2-156 | m/z = 718.9180 (C52H34N2S, 718.2443) |
| 2-157 | m/z = 795.0160 (C58H38N2S, 794.2756) | 2-158 | m/z = 795.0160 (C58H38N2S, 794.2756) |
| 2-159 | m/z = 795.0160 (C58H38N2S, 794.2756) | 2-160 | m/z = 692.8800 (C50H32N2S, 692.2286) |
| 2-161 | m/z = 692.8800 (C50H32N2S, 692.2286) | 2-162 | m/z = 768.9780 (C56H36N2S, 768.2599) |
| 2-163 | m/z = 768.9780 (C56H36N2S, 768.2599) | 2-164 | m/z = 768.9780 (C56H36N2S, 768.2599) |
| 2-165 | m/z = 768.9780 (C56H36N2S, 768.2599) | 2-166 | m/z = 742.9400 (C54H34N2S, 742.2443) |
| 2-167 | m/z = 742.9400 (C54H34N2S, 742.2443) | 2-168 | m/z = 742.9400 (C54H34N2S, 742.2443) |
| 2-169 | m/z = 758.9830 (C55H38N2S, 758.2756) | 2-170 | m/z = 768.9780 (C56H36N2S, 768.2599) |
| 2-171 | m/z = 768.9780 (C56H36N2S, 768.2599) | 2-172 | m/z = 748.9620 (C52H32N2S2, 748.2007) |
| 2-173 | m/z = 799.0220 (C56H34N2S2, 798.2163) | 2-174 | m/z = 799.0220 (C56H34N2S2, 798.2163) |
| 2-175 | m/z = 748.9620 (C52H32N2S2, 748.2007) | 2-176 | m/z = 799.0220 (C56H34N2S2, 798.2163) |
| 2-177 | m/z = 799.0220 (C56H34N2S2, 798.2163) | 2-178 | m/z = 748.9620 (C52H32N2S2, 748.2007) |
| 2-179 | m/z = 799.0220 (C56H34N2S2, 798.2163) | 2-180 | m/z = 799.0220 (C56H34N2S2, 798.2163) |
| 2-181 | m/z = 748.9620 (C52H32N2S2, 748.2007) | 2-182 | m/z = 799.0220 (C56H34N2S2, 798.2163) |
| 2-183 | m/z = 799.0220 (C56H34N2S2, 798.2163) | 2-184 | m/z = 732.9010 (C52H32N2OS, 732.2235) |
| 2-185 | m/z = 782.9610 (C56H34N2OS, 782.2392) | 2-186 | m/z = 782.9610 (C56H34N2OS, 782.2392) |
| 2-187 | m/z = 732.9010 (C52H32N2OS, 732.2235) | 2-188 | m/z = 782.9610 (C56H34N2OS, 782.2392) |
| 2-189 | m/z = 782.9610 (C56H34N2OS, 782.2392) | 2-190 | m/z = 732.9010 (C52H32N2OS, 732.2235) |
| 2-191 | m/z = 782.9610 (C56H34N2OS, 782.2392) | 2-192 | m/z = 782.9610 (C56H34N2OS, 782.2392) |
| 2-193 | m/z = 732.9010 (C52H32N2OS, 732.2235) | 2-194 | m/z = 782.9610 (C56H34N2OS, 782.2392) |
| 2-195 | m/z = 782.9610 (C56H34N2OS, 782.2392) | 2-196 | m/z = 576.6990 (C42H28N2O, 576.2202) |
| 2-197 | m/z = 576.6990 (C42H28N2O, 576.2202) | 2-198 | m/z = 652.7970 (C48H32N2O, 652.2515) |
| 2-199 | m/z = 652.7970 (C48H32N2O, 652.2515) | 2-200 | m/z = 550.6610 (C40H26N2O, 550.2045) |
| 2-201 | m/z = 692.8620 (C51H36N2O, 692.2828) | 2-202 | m/z = 626.7590 (C46H30N2O, 626.2358) |
| 2-203 | m/z = 676.8190 (C50H32N2O, 676.2515) | 2-204 | m/z = 682.8410 (C48H30N2OS, 682.2079) |
| 2-205 | m/z = 606.7430 (C42H26N2OS, 606.1766) | 2-206 | m/z = 640.7420 (C46H28N2O2, 640.2151) |
| 2-207 | m/z = 666.7800 (C48H30N2O2, 666.2307) | 2-208 | m/z = 666.7800 (C48H30N2O2, 666.2307) |
| 2-209 | m/z = 728.8950 (C54H36N2O, 728.2828) | 2-210 | m/z = 768.9600 (C57H40N2O, 768.3141) |

TABLE 6-continued

| Compound | FD-MS | Compound | FD-MS |
|---|---|---|---|
| 2-211 | m/z = 742.8780 (C54H34N2O2, 742.2620) | 2-212 | m/z = 728.8950 (C54H36N2O, 728.2828) |
| 2-213 | m/z = 742.8780 (C54H34N2O2, 742.2620) | 2-214 | m/z = 652.7970 (C48H32N2O, 652.2515) |
| 2-215 | m/z = 652.7970 (C48H32N2O, 652.2515) | 2-216 | m/z = 728.8950 (C54H36N2O, 728.2828) |
| 2-217 | m/z = 728.8950 (C54H36N2O, 728.2828) | 2-218 | m/z = 728.8950 (C54H36N2O, 728.2828) |
| 2-219 | m/z = 626.7590 (C46H30N2O, 626.2358) | 2-220 | m/z = 626.7590 (C46H30N2O, 626.2358) |
| 2-221 | m/z = 702.8570 (C52H34N2O, 702.2671) | 2-222 | m/z = 702.8570 (C52H34N2O, 702.2671) |
| 2-223 | m/z = 702.8570 (C52H34N2O, 702.2671) | 2-224 | m/z = 702.8570 (C52H34N2O, 702.2671) |
| 2-225 | m/z = 676.8190 (C50H32N2O, 676.2515) | 2-226 | m/z = 676.8190 (C50H32N2O, 676.2515) |
| 2-227 | m/z = 676.8190 (C50H32N2O, 676.2515) | 2-228 | m/z = 692.8620 (C51H36N2O, 692.2828) |
| 2-229 | m/z = 768.9600 (C57H40N2O, 768.3141) | 2-230 | m/z = 768.9600 (C57H40N2O, 768.3141) |
| 2-231 | m/z = 702.8570 (C52H34N2O, 702.2671) | 2-232 | m/z = 702.8570 (C52H34N2O, 702.2671) |
| 2-233 | m/z = 752.9170 (C56H36N2O, 752.2828) | 2-234 | m/z = 778.9550 (C58H38N2O, 778.2984) |
| 2-235 | m/z = 778.9550 (C58H38N2O, 778.2984) | 2-236 | m/z = 682.8410 (C48H30N2OS, 682.2079) |
| 2-237 | m/z = 758.9390 (C54H34N2OS, 758.2392) | 2-238 | m/z = 758.9390 (C54H34N2OS, 758.2392) |
| 2-239 | m/z = 682.8410 (C48H30N2OS, 682.2079) | 2-240 | m/z = 758.9390 (C54H34N2OS, 758.2392) |
| 2-241 | m/z = 682.8410 (C48H30N2OS, 682.2079) | 2-242 | m/z = 758.9390 (C54H34N2OS, 758.2392) |
| 2-243 | m/z = 758.9390 (C54H34N2OS, 758.2392) | 2-244 | m/z = 666.7800 (C48H30N2O2, 666.2307) |
| 2-245 | m/z = 742.8780 (C54H34N2O2, 742.2620) | 2-246 | m/z = 742.8780 (C54H34N2O2, 742.2620) |
| 2-247 | m/z = 716.8400 (C52H32N2O2, 716.2464) | 2-248 | m/z = 716.8400 (C52H32N2O2, 716.2464) |
| 2-249 | m/z = 742.8780 (C54H34N2O2, 742.2620) | 2-250 | m/z = 666.7800 (C48H30N2O2, 666.2307) |
| 2-251 | m/z = 716.8400 (C52H32N2O2, 716.2464) | 2-252 | m/z = 716.8400 (C52H32N2O2, 716.2464) |
| 2-253 | m/z = 742.8780 (C54H34N2O2, 742.2620) | 2-254 | m/z = 666.7800 (C48H30N2O2, 666.2307) |
| 2-255 | m/z = 742.8780 (C54H34N2O2, 742.2620) | 2-256 | m/z = 728.8950 (C54H36N2O, 728.2828) |
| 2-257 | m/z = 728.8950 (C54H36N2O, 728.2828) | 2-258 | m/z = 702.8570 (C52H34N2O, 702.2671) |
| 2-259 | m/z = 702.8570 (C52H34N2O, 702.2671) | 2-260 | m/z = 778.9550 (C58H38N2O, 778.2984) |
| 2-261 | m/z = 778.9550 (C58H38N2O, 778.2984) | 2-262 | m/z = 778.9550 (C58H38N2O, 778.2984) |
| 2-263 | m/z = 752.9170 (C56H36N2O, 752.2828) | 2-264 | m/z = 768.9600 (C57H40N2O, 768.3141) |
| 2-265 | m/z = 778.9550 (C58H38N2O, 778.2984) | 2-266 | m/z = 778.9550 (C58H38N2O, 778.2984) |
| 2-267 | m/z = 758.9390 (C54H34N2OS, 758.2392) | 2-268 | m/z = 758.9390 (C54H34N2OS, 758.2392) |
| 2-269 | m/z = 758.9390 (C54H34N2OS, 758.2392) | 2-270 | m/z = 742.8780 (C54H34N2O2, 742.2620) |
| 2-271 | m/z = 742.8780 (C54H34N2O2, 742.2620) | 2-272 | m/z = 742.8780 (C54H34N2O2, 742.2620) |
| 2-273 | m/z = 728.8950 (C54H36N2O, 728.2828) | 2-274 | m/z = 728.8950 (C54H36N2O, 728.2828) |
| 2-275 | m/z = 702.8570 (C52H34N2O, 702.2671) | 2-276 | m/z = 702.8570 (C52H34N2O, 702.2671) |
| 2-277 | m/z = 778.9550 (C58H38N2O, 778.2984) | 2-278 | m/z = 778.9550 (C58H38N2O, 778.2984) |
| 2-279 | m/z = 778.9550 (C58H38N2O, 778.2984) | 2-280 | m/z = 768.9600 (C57H40N2O, 768.3141) |
| 2-281 | m/z = 778.9550 (C58H38N2O, 778.2984) | 2-282 | m/z = 778.9550 (C58H38N2O, 778.2984) |
| 2-283 | m/z = 758.9390 (C54H34N2OS, 758.2392) | 2-284 | m/z = 758.9390 (C54H34N2OS, 758.2392) |
| 2-285 | m/z = 758.9390 (C54H34N2OS, 758.2392) | 2-286 | m/z = 742.8780 (C54H34N2O2, 742.2620) |
| 2-287 | m/z = 742.8780 (C54H34N2O2, 742.2620) | 2-288 | m/z = 702.8570 (C52H34N2O, 702.2671) |
| 2-289 | m/z = 702.8570 (C52H34N2O, 702.2671) | 2-290 | m/z = 778.9550 (C58H38N2O, 778.2984) |
| 2-291 | m/z = 676.8190 (C50H32N2O, 676.2515) | 2-292 | m/z = 752.9170 (C56H36N2O, 752.2828) |
| 2-293 | m/z = 752.9170 (C56H36N2O, 752.2828) | 2-294 | m/z = 742.9220 (C55H38N2O, 742.2984) |
| 2-295 | m/z = 752.9170 (C56H36N2O, 752.2828) | 2-296 | m/z = 752.9170 (C56H36N2O, 752.2828) |
| 2-297 | m/z = 732.9010 (C52H32N2OS, 732.2235) | 2-298 | m/z = 782.9610 (C56H34N2OS, 782.2392) |
| 2-299 | m/z = 716.8400 (C52H32N2O2, 716.2464) | 2-300 | m/z = 716.8400 (C52H32N2O2, 716.2464) |

TABLE 7

| Compound | FD-MS | Compound | FD-MS |
|---|---|---|---|
| 3-1 | m/z = 645.25 ($C_{47}H_{35}NS$ = 645.85) | 3-2 | m/z = 645.25 ($C_{47}H_{35}NS$ = 645.85) |
| 3-3 | m/z = 685.28 ($C_{50}H_{39}NS$ = 685.92) | 3-4 | m/z = 659.23 ($C_{47}H_{33}NOS$ = 659.84) |
| 3-5 | m/z = 619.82 ($C_{45}H_{33}NS$ = 619.23) | 3-6 | m/z = 619.82 ($C_{45}H_{33}NS$ = 619.23) |
| 3-7 | m/z = 593.22 ($C_{43}H_{31}NS$ = 593.78) | 3-8 | m/z = 685.28 ($C_{50}H_{39}NS$ = 685.92) |
| 3-9 | m/z = 725.31 ($C_{53}H_{43}NS$ = 725.98) | 3-10 | m/z = 761.31 ($C_{56}H_{43}NS$ = 762.01) |
| 3-11 | m/z = 775.29 ($C_{56}H_{41}NOS$ = 776.00) | 3-12 | m/z = 809.31 ($C_{60}H_{43}NS$ = 810.06) |
| 3-13 | m/z = 721.28 ($C_{53}H_{39}NS$ = 721.95) | 3-14 | m/z = 685.28 ($C_{50}H_{39}NS$ = 685.92) |
| 3-15 | m/z = 761.31 ($C_{56}H_{43}NS$ = 762.01) | 3-16 | m/z = 695.26 ($C_{51}H_{37}NS$ = 695.91) |
| 3-17 | m/z = 721.28 ($C_{53}H_{39}NS$ = 721.95) | 3-18 | m/z = 761.31 ($C_{56}H_{43}NS$ = 762.01) |
| 3-19 | m/z = 771.30 ($C_{57}H_{41}NS$ = 772.01) | 3-20 | m/z = 645.25 ($C_{47}H_{35}NS$ = 645.85) |
| 3-21 | m/z = 761.31 ($C_{56}H_{43}NS$ = 762.01) | 3-22 | m/z = 809.31 ($C_{60}H_{43}NS$ = 810.06) |
| 3-23 | m/z = 695.26 ($C_{51}H_{37}NS$ = 695.91) | 3-24 | m/z = 775.29 ($C_{56}H_{41}NOS$ = 776.00) |
| 3-25 | m/z = 725.22 ($C_{51}H_{35}NS_2$ = 725.96) | 3-26 | m/z = 785.28 ($C_{57}H_{39}NOS$ = 785.99) |
| 3-27 | m/z = 749.28 ($C_{54}H_{39}NOS$ = 749.96) | 3-28 | m/z = 645.25 ($C_{47}H_{35}NS$ = 645.85) |
| 3-29 | m/z = 619.82 ($C_{45}H_{33}NS$ = 619.23) | 3-30 | m/z = 685.28 ($C_{50}H_{39}NS$ = 685.92) |
| 3-31 | m/z = 659.23 ($C_{47}H_{33}NOS$ = 659.84) | 3-32 | m/z = 725.31 ($C_{53}H_{43}NS$ = 725.98) |
| 3-33 | m/z = 809.31 ($C_{60}H_{43}NS$ = 810.06) | 3-34 | m/z = 645.25 ($C_{47}H_{35}NS$ = 645.85) |
| 3-35 | m/z = 725.31 ($C_{53}H_{43}NS$ = 725.98) | 3-36 | m/z = 761.31 ($C_{56}H_{43}NS$ = 762.01) |
| 3-37 | m/z = 721.28 ($C_{53}H_{39}NS$ = 721.95) | 3-38 | m/z = 695.26 ($C_{51}H_{37}NS$ = 695.91) |
| 3-39 | m/z = 761.31 ($C_{56}H_{43}NS$ = 762.01) | 3-40 | m/z = 721.28 ($C_{53}H_{39}NS$ = 721.95) |
| 3-41 | m/z = 735.26 ($C_{53}H_{37}NOS$ = 735.93) | 3-42 | m/z = 695.26 ($C_{51}H_{37}NS$ = 695.91) |
| 3-43 | m/z = 699.26 ($C_{50}H_{37}NOS$ = 699.90) | 3-44 | m/z = 695.26 ($C_{51}H_{37}NS$ = 695.91) |
| 3-45 | m/z = 735.26 ($C_{53}H_{37}NOS$ = 735.93) | 3-46 | m/z = 709.24 ($C_{51}H_{35}NOS$ = 709.89) |
| 3-47 | m/z = 643.23 ($C_{47}H_{33}NS$ = 643.84) | 3-48 | m/z = 645.25 ($C_{47}H_{35}NS$ = 645.85) |
| 3-49 | m/z = 673.21 ($C_{47}H_{31}NO_2S$ = 673.82) | 3-50 | m/z = 619.82 ($C_{45}H_{33}NS$ = 619.23) |

TABLE 7-continued

| Compound | FD-MS | Compound | FD-MS |
|---|---|---|---|
| 3-51 | m/z = 619.82 ($C_{45}H_{33}NS$ = 619.23) | 3-52 | m/z = 685.28 ($C_{50}H_{39}NS$ = 685.92) |
| 3-53 | m/z = 659.23 ($C_{47}H_{33}NOS$ = 659.84) | 3-54 | m/z = 809.31 ($C_{60}H_{43}NS$ = 810.06) |
| 3-55 | m/z = 593.22 ($C_{43}H_{31}NS$ = 593.78) | 3-56 | m/z = 725.22 ($C_{51}H_{35}NS_2$ = 725.96) |
| 3-57 | m/z = 645.25 ($C_{47}H_{35}NS$ = 645.85) | 3-58 | m/z = 719.26 ($C_{53}H_{37}NS$ = 719.93) |
| 3-59 | m/z = 721.28 ($C_{53}H_{39}NS$ = 721.95) | 3-60 | m/z = 761.31 ($C_{56}H_{43}NS$ = 762.01) |
| 3-61 | m/z = 797.31 ($C_{59}H_{38}N_4O_2$ = 798.04) | 3-62 | m/z = 761.31 ($C_{56}H_{43}NS$ = 762.01) |
| 3-63 | m/z = 775.29 ($C_{56}H_{41}NOS$ = 776.00) | 3-64 | m/z = 761.31 ($C_{56}H_{43}NS$ = 762.01) |
| 3-65 | m/z = 685.28 ($C_{50}H_{39}NS$ = 685.92) | 3-66 | m/z = 761.31 ($C_{56}H_{43}NS$ = 762.01) |
| 3-67 | m/z = 735.26 ($C_{53}H_{37}NOS$ = 735.93) | 3-68 | m/z = 735.26 ($C_{53}H_{37}NOS$ = 735.93) |
| 3-69 | m/z = 811.29 ($C_{59}H_{41}NOS$ = 812.03) | 3-70 | m/z = 775.29 ($C_{56}H_{41}NOS$ = 776.00) |
| 3-71 | m/z = 775.29 ($C_{56}H_{41}NOS$ = 776.00) | 3-72 | m/z = 775.29 ($C_{56}H_{41}NOS$ = 776.00) |
| 3-73 | m/z = 659.23 ($C_{47}H_{33}NOS$ = 659.84) | 3-74 | m/z = 675.21 ($C_{44}H_{33}NS_2$ = 675.90) |
| 3-75 | m/z = 751.24 ($C_{53}H_{37}NS_2$ = 752.00) | 3-76 | m/z = 751.24 ($C_{53}H_{37}NS_2$ = 752.00) |
| 3-77 | m/z = 791.27 ($C_{56}H_{41}NS_2$ = 792.06) | 3-78 | m/z = 695.26 ($C_{51}H_{37}NS$ = 695.91) |
| 3-79 | m/z = 745.28 ($C_{55}H_{39}NS$ = 745.99) | 3-80 | m/z = 669.25 ($C_{49}H_{35}NS$ = 669.87) |
| 3-81 | m/z = 721.28 ($C_{53}H_{39}NS$ = 721.95) | 3-82 | m/z = 695.26 ($C_{51}H_{37}NS$ = 695.91) |
| 3-83 | m/z = 721.28 ($C_{53}H_{39}NS$ = 721.95) | 3-84 | m/z = 761.31 ($C_{56}H_{43}NS$ = 762.01) |
| 3-85 | m/z = 695.26 ($C_{51}H_{37}NS$ = 695.91) | 3-86 | m/z = 735.26 ($C_{53}H_{37}NOS$ = 735.93) |
| 3-87 | m/z = 709.24 ($C_{51}H_{35}NOS$ = 709.89) | 3-88 | m/z = 735.26 ($C_{53}H_{37}NOS$ = 735.93) |
| 3-89 | m/z = 735.26 ($C_{53}H_{37}NOS$ = 735.93) | 3-90 | m/z = 775.29 ($C_{56}H_{41}NOS$ = 776.00) |
| 3-91 | m/z = 775.29 ($C_{56}H_{41}NOS$ = 776.00) | 3-92 | m/z = 801.34 ($C_{59}H_{47}NO$ = 801.08) |
| 3-93 | m/z = 633.21 ($C_{45}H_{31}NOS$ = 633.80) | 3-94 | m/z = 643.24 ($C_{47}H_{33}NS$ = 643.84) |
| 3-95 | m/z = 751.24 ($C_{53}H_{37}NS_2$ = 752.00) | 3-96 | m/z = 761.31 ($C_{56}H_{43}NS$ = 762.01) |
| 3-97 | m/z = 645.25 ($C_{47}H_{35}NS$ = 645.85) | 3-98 | m/z = 619.82 ($C_{45}H_{33}NS$ = 619.23) |
| 3-99 | m/z = 619.82 ($C_{45}H_{33}NS$ = 619.23) | 3-100 | m/z = 685.28 ($C_{50}H_{39}NS$ = 685.92) |
| 3-101 | m/z = 659.23 ($C_{47}H_{33}NOS$ = 659.84) | 3-102 | m/z = 797.31 ($C_{49}H_{43}NS$ = 798.04) |
| 3-103 | m/z = 593.22 ($C_{43}H_{31}NS$ = 593.78) | 3-104 | m/z = 725.22 ($C_{51}H_{35}NS_2$ = 725.96) |
| 3-105 | m/z = 733.28 ($C_{54}H_{39}NS$ = 733.96) | 3-106 | m/z = 811.29 ($C_{59}H_{41}NOS$ = 812.03) |
| 3-107 | m/z = 761.31 ($C_{56}H_{43}NS$ = 762.01) | 3-108 | m/z = 775.29 ($C_{56}H_{41}NOS$ = 776.00) |
| 3-109 | m/z = 695.26 ($C_{51}H_{37}NS$ = 695.91) | 3-110 | m/z = 659.23 ($C_{47}H_{33}NOS$ = 659.84) |
| 3-111 | m/z = 735.26 ($C_{53}H_{37}NOS$ = 735.93) | 3-112 | m/z = 809.31 ($C_{69}H_{43}NS$ = 810.06) |
| 3-113 | m/z = 721.28 ($C_{53}H_{39}NS$ = 721.95) | 3-114 | m/z = 695.26 ($C_{51}H_{37}NS$ = 695.91) |
| 3-115 | m/z = 761.31 ($C_{56}H_{43}NS$ = 762.01) | 3-116 | m/z = 775.29 ($C_{56}H_{41}NOS$ = 776.00) |
| 3-117 | m/z = 721.28 ($C_{53}H_{39}NS$ = 721.95) | 3-118 | m/z = 761.31 ($C_{56}H_{43}NS$ = 762.01) |
| 3-119 | m/z = 695.26 ($C_{51}H_{37}NS$ = 695.91) | 3-120 | m/z = 735.26 ($C_{53}H_{37}NOS$ = 735.93) |
| 3-121 | m/z = 645.25 ($C_{47}H_{35}NS$ = 645.85) | 3-122 | m/z = 619.82 ($C_{45}H_{33}NS$ = 619.23) |
| 3-123 | m/z = 685.28 ($C_{50}H_{39}NS$ = 685.92) | 3-124 | m/z = 685.28 ($C_{50}H_{39}NS$ = 685.92) |
| 3-125 | m/z = 797.31 ($C_{49}H_{43}NS$ = 798.04) | 3-126 | m/z = 695.26 ($C_{51}H_{37}NS$ = 695.91) |
| 3-127 | m/z = 659.23 ($C_{47}H_{33}NOS$ = 659.84) | 3-128 | m/z = 761.31 ($C_{56}H_{43}NS$ = 762.01) |
| 3-129 | m/z = 669.25 ($C_{49}H_{35}NS$ = 669.87) | 3-130 | m/z = 775.29 ($C_{56}H_{41}NOS$ = 776.00) |
| 3-131 | m/z = 809.31 ($C_{60}H_{43}NS$ = 810.06) | 3-132 | m/z = 775.29 ($C_{56}H_{41}NOS$ = 776.00) |
| 3-133 | m/z = 645.25 ($C_{47}H_{35}NS$ = 645.85) | 3-134 | m/z = 619.82 ($C_{45}H_{33}NS$ = 619.23) |
| 3-135 | m/z = 685.28 ($C_{50}H_{39}NS$ = 685.92) | 3-136 | m/z = 775.29 ($C_{56}H_{41}NOS$ = 776.00) |
| 3-137 | m/z = 645.25 ($C_{47}H_{35}NS$ = 645.85) | 3-138 | m/z = 721.28 ($C_{53}H_{39}NS$ = 721.95) |
| 3-139 | m/z = 695.26 ($C_{51}H_{37}NS$ = 695.91) | 3-140 | m/z = 761.31 ($C_{56}H_{43}NS$ = 762.01) |
| 3-141 | m/z = 735.26 ($C_{53}H_{37}NOS$ = 735.93) | 3-142 | m/z = 721.28 ($C_{53}H_{39}NS$ = 721.95) |
| 3-143 | m/z = 735.26 ($C_{53}H_{37}NOS$ = 735.93) | 3-144 | m/z = 751.24 ($C_{53}H_{37}NS_2$ = 752.00) |
| 3-145 | m/z = 769.28 ($C_{57}H_{39}NS$ = 769.99) | 3-146 | m/z = 809.31 ($C_{60}H_{43}NS$ = 810.06) |
| 3-147 | m/z = 783.26 ($C_{57}H_{37}NOS$ = 783.97) | 3-148 | m/z = 743.26 ($C_{55}H_{37}NS$ = 743.95) |
| 3-149 | m/z = 743.26 ($C_{55}H_{37}NS$ = 743.95) | 3-150 | m/z = 717.25 ($C_{53}H_{35}NS$ = 717.92) |
| 3-151 | m/z = 809.31 ($C_{60}H_{43}NS$ = 810.06) | 3-152 | m/z = 693.25 ($C_{51}H_{35}NS$ = 693.90) |
| 3-153 | m/z = 809.31 ($C_{60}H_{43}NS$ = 810.06) | 3-154 | m/z = 819.30 ($C_{61}H_{41}NS$ = 820.05) |
| 3-155 | m/z = 769.28 ($C_{57}H_{39}NS$ = 769.99) | 3-156 | m/z = 769.28 ($C_{57}H_{39}NS$ = 769.99) |
| 3-157 | m/z = 819.30 ($C_{61}H_{41}NS$ = 820.05) | 3-158 | m/z = 783.26 ($C_{57}H_{37}NOS$ = 783.97) |
| 3-159 | m/z = 823.29 ($C_{60}H_{41}NOS$ = 824.04) | 3-160 | m/z = 773.22 ($C_{55}H_{35}NS_2$ = 774.00) |
| 3-161 | m/z = 757.24 ($C_{55}H_{35}NOS$ = 757.94) | 3-162 | m/z = 693.25 ($C_{51}H_{35}NS$ = 693.90) |
| 3-163 | m/z = 743.26 ($C_{55}H_{37}NS$ = 743.95) | 3-164 | m/z = 743.26 ($C_{55}H_{37}NS$ = 743.95) |
| 3-165 | m/z = 809.31 ($C_{60}H_{43}NS$ = 810.06) | 3-166 | m/z = 783.26 ($C_{57}H_{37}NOS$ = 783.97) |
| 3-167 | m/z = 743.26 ($C_{55}H_{37}NS$ = 743.95) | 3-168 | m/z = 769.28 ($C_{57}H_{39}NS$ = 769.99) |
| 3-169 | m/z = 783.26 ($C_{57}H_{37}NOS$ = 783.97) | 3-170 | m/z = 809.31 ($C_{60}H_{43}NS$ = 810.06) |
| 3-171 | m/z = 743.26 ($C_{55}H_{37}NS$ = 743.95) | 3-172 | m/z = 769.28 ($C_{57}H_{39}NS$ = 769.99) |
| 3-173 | m/z = 819.30 ($C_{61}H_{41}NS$ = 820.05) | 3-174 | m/z = 721.28 ($C_{53}H_{39}NS$ = 721.96) |
| 3-175 | m/z = 769.28 ($C_{57}H_{39}NS$ = 769.99) | 3-176 | m/z = 809.31 ($C_{60}H_{43}NS$ = 810.06) |
| 3-177 | m/z = 743.26 ($C_{55}H_{37}NS$ = 743.95) | 3-178 | m/z = 783.26 ($C_{57}H_{37}NOS$ = 783.97) |
| 3-179 | m/z = 707.23 ($C_{51}H_{33}NOS$ = 707.88) | 3-180 | m/z = 799.24 ($C_{57}H_{37}NS_2$ = 800.04) |
| 3-181 | m/z = 769.28 ($C_{57}H_{39}NS$ = 769.99) | 3-182 | m/z = 743.26 ($C_{55}H_{37}NS$ = 743.95) |
| 3-183 | m/z = 743.26 ($C_{55}H_{37}NS$ = 743.95) | 3-184 | m/z = 783.26 ($C_{57}H_{37}NOS$ = 783.97) |
| 3-185 | m/z = 769.28 ($C_{57}H_{39}NS$ = 769.99) | 3-186 | m/z = 809.31 ($C_{60}H_{43}NS$ = 810.06) |
| 3-187 | m/z = 809.31 ($C_{60}H_{43}NS$ = 810.06) | 3-188 | m/z = 783.26 ($C_{57}H_{37}NOS$ = 783.97) |
| 3-189 | m/z = 859.29 ($C_{63}H_{41}NOS$ = 860.07) | 3-190 | m/z = 769.28 ($C_{57}H_{39}NS$ = 769.99) |
| 3-191 | m/z = 809.31 ($C_{60}H_{43}NS$ = 810.06) | 3-192 | m/z = 783.26 ($C_{57}H_{37}NOS$ = 783.97) |
| 3-193 | m/z = 799.24 ($C_{57}H_{37}NS_2$ = 800.04) | 3-194 | m/z = 819.30 ($C_{61}H_{41}NS$ = 820.05) |
| 3-195 | m/z = 799.24 ($C_{57}H_{37}NS_2$ = 800.04) | 3-196 | m/z = 717.25 ($C_{53}H_{35}NS$ = 717.92) |
| 3-197 | m/z = 645.25 ($C_{47}H_{35}NS$ = 645.85) | 3-198 | m/z = 693.25 ($C_{51}H_{35}NS$ = 693.90) |
| 3-199 | m/z = 743.26 ($C_{55}H_{37}NS$ = 743.95) | 3-200 | m/z = 809.31 ($C_{60}H_{43}NS$ = 810.06) |
| 3-201 | m/z = 793.28 ($C_{59}H_{39}NS$ = 794.01) | 3-202 | m/z = 743.26 ($C_{55}H_{37}NS$ = 743.95) |
| 3-203 | m/z = 707.23 ($C_{51}H_{33}NOS$ = 707.88) | 3-204 | m/z = 757.24 ($C_{55}H_{35}NOS$ = 757.94) |
| 3-205 | m/z = 783.26 ($C_{57}H_{37}NOS$ = 783.97) | 3-206 | m/z = 769.28 ($C_{57}H_{39}NS$ = 769.99) |

TABLE 7-continued

| Compound | FD-MS | Compound | FD-MS |
|---|---|---|---|
| 3-207 | m/z = 845.31 ($C_{63}H_{43}NS$ = 846.09) | 3-208 | m/z = 783.26 ($C_{57}H_{37}NOS$ = 783.97) |
| 3-209 | m/z = 819.30 ($C_{61}H_{41}NS$ = 820.05) | 3-210 | m/z = 783.26 ($C_{57}H_{37}NOS$ = 783.97) |
| 3-211 | m/z = 743.26 ($C_{55}H_{37}NS$ = 743.95) | 3-212 | m/z = 809.31 ($C_{60}H_{43}NS$ = 810.06) |
| 3-213 | m/z = 809.31 ($C_{60}H_{43}NS$ = 810.06) | 3-214 | m/z = 845.31 ($C_{63}H_{43}NS$ = 846.09) |
| 3-215 | m/z = 769.28 ($C_{57}H_{39}NS$ = 769.99) | 3-216 | m/z = 769.28 ($C_{57}H_{39}NS$ = 769.99) |
| 3-217 | m/z = 743.26 ($C_{55}H_{37}NS$ = 743.95) | 3-218 | m/z = 809.31 ($C_{60}H_{43}NS$ = 810.06) |
| 3-219 | m/z = 809.31 ($C_{60}H_{43}NS$ = 810.06) | 3-220 | m/z = 783.26 ($C_{57}H_{37}NOS$ = 783.97) |
| 3-221 | m/z = 769.28 ($C_{57}H_{39}NS$ = 769.99) | 3-222 | m/z = 743.26 ($C_{55}H_{37}NS$ = 743.95) |
| 3-223 | m/z = 769.28 ($C_{57}H_{39}NS$ = 769.99) | 3-224 | m/z = 769.28 ($C_{57}H_{39}NS$ = 769.99) |
| 3-225 | m/z = 769.28 ($C_{57}H_{39}NS$ = 769.99) | 3-226 | m/z = 783.26 ($C_{57}H_{37}NOS$ = 783.97) |
| 3-227 | m/z = 783.26 ($C_{57}H_{37}NOS$ = 783.97) | 3-228 | m/z = 769.28 ($C_{57}H_{39}NS$ = 769.99) |
| 3-229 | m/z = 629.27 ($C_{47}H_{395}NO$ = 629.79) | 3-230 | m/z = 669.30 ($C_{50}H_{39}NO$ = 669.85) |
| 3-231 | m/z = 603.26 ($C_{45}H_{33}NO$ = 603.75) | 3-232 | m/z = 603.26 ($C_{45}H_{33}NO$ = 603.75) |
| 3-233 | m/z = 577.24 ($C_{43}H_{31}NO$ = 577.71) | 3-234 | m/z = 669.30 ($C_{50}H_{39}NO$ = 669.85) |
| 3-235 | m/z = 745.33 ($C_{56}H_{43}NO$ = 745.95) | 3-236 | m/z = 759.31 ($C_{56}H_{41}NO_2$ = 759.93) |
| 3-237 | m/z = 793.33 ($C_{60}H_{43}NO$ = 793.99) | 3-238 | m/z = 659.23 ($C_{47}H_{33}NOS$ = 659.84) |
| 3-239 | m/z = 705.30 ($C_{53}H_{39}NO$ = 705.88) | 3-240 | m/z = 669.30 ($C_{50}H_{39}NO$ = 669.85) |
| 3-241 | m/z = 745.33 ($C_{56}H_{43}NO$ = 745.95) | 3-242 | m/z = 679.29 ($C_{51}H_{37}NO$ = 679.85) |
| 3-243 | m/z = 679.29 ($C_{51}H_{37}NO$ = 679.85) | 3-244 | m/z = 679.29 ($C_{51}H_{37}NO$ = 679.85) |
| 3-245 | m/z = 629.27 ($C_{47}H_{395}NO$ = 629.79) | 3-246 | m/z = 745.33 ($C_{56}H_{43}NO$ = 745.95) |
| 3-247 | m/z = 629.27 ($C_{47}H_{395}NO$ = 629.79) | 3-248 | m/z = 603.26 ($C_{45}H_{33}NO$ = 603.75) |
| 3-249 | m/z = 669.30 ($C_{50}H_{39}NO$ = 669.85) | 3-250 | m/z = 643.25 ($C_{50}H_{39}NO_2$ = 643.77) |
| 3-251 | m/z = 659.23 ($C_{47}H_{33}NOS$ = 659.84) | 3-252 | m/z = 709.33 ($C_{53}H_{43}NO$ = 709.97) |
| 3-253 | m/z = 679.29 ($C_{51}H_{37}NO$ = 679.85) | 3-254 | m/z = 745.33 ($C_{56}H_{43}NO$ = 745.95) |
| 3-255 | m/z = 705.30 ($C_{53}H_{39}NO$ = 705.88) | 3-256 | m/z = 679.29 ($C_{51}H_{37}NO$ = 679.85) |
| 3-257 | m/z = 629.27 ($C_{47}H_{395}NO$ = 629.79) | 3-258 | m/z = 709.33 ($C_{53}H_{43}NO$ = 709.97 |
| 3-259 | m/z = 745.33 ($C_{56}H_{43}NO$ = 745.95) | 3-260 | m/z = 705.30 ($C_{53}H_{39}NO$ = 705.88) |
| 3-261 | m/z = 629.27 ($C_{47}H_{395}NO$ = 629.79) | 3-262 | m/z = 603.26 ($C_{45}H_{33}NO$ = 603.75) |
| 3-263 | m/z = 603.26 ($C_{45}H_{33}NO$ = 603.75) | 3-264 | m/z = 669.30 ($C_{50}H_{39}NO$ = 669.85) |
| 3-265 | m/z = 643.25 ($C_{50}H_{39}NO_2$ = 643.77) | 3-266 | m/z = 793.33 ($C_{60}H_{43}NO$ = 793.99) |
| 3-267 | m/z = 577.24 ($C_{43}H_{31}NO$ = 577.71) | 3-268 | m/z = 709.33 ($C_{53}H_{43}NO$ = 709.97) |
| 3-269 | m/z = 705.30 ($C_{53}H_{39}NO$ = 705.88) | 3-270 | m/z = 659.23 ($C_{47}H_{33}NOS$ = 659.84) |
| 3-271 | m/z = 781.33 ($C_{59}H_{43}NO$ = 781.98) | 3-272 | m/z = 745.33 ($C_{56}H_{43}NO$ = 745.95) |
| 3-273 | m/z = 669.30 ($C_{50}H_{39}NO$ = 669.85) | 3-274 | m/z = 745.33 ($C_{56}H_{43}NO$ = 745.95) |
| 3-275 | m/z = 759.31 ($C_{56}H_{41}NO_2$ = 759.93) | 3-276 | m/z = 745.33 ($C_{56}H_{43}NO$ = 745.95) |
| 3-277 | m/z = 669.30 ($C_{50}H_{39}NO$ = 669.85) | 3-278 | m/z = 759.31 ($C_{56}H_{41}NO_2$ = 759.93) |
| 3-279 | m/z = 643.25 ($C_{50}H_{39}NO_2$ = 643.77) | 3-280 | m/z = 643.25 ($C_{50}H_{39}NO_2$ = 643.77) |
| 3-281 | m/z = 659.23 ($C_{47}H_{33}NOS$ = 659.84) | 3-282 | m/z = 735.26 ($C_{53}H_{37}NOS$ = 735.93) |
| 3-283 | m/z = 719.28 ($C_{53}H_{37}NO_2$ = 719.87) | 3-284 | m/z = 719.28 ($C_{53}H_{37}NO_2$ = 719.87) |
| 3-285 | m/z = 795.31 ($C_{50}H_{39}NO_2$ = 795.96) | 3-286 | m/z = 759.31 ($C_{56}H_{41}NO_2$ = 759.93) |
| 3-287 | m/z = 759.31 ($C_{56}H_{41}NO_2$ = 759.93) | 3-288 | m/z = 745.33 ($C_{56}H_{43}NO$ = 745.95) |
| 3-289 | m/z = 735.26 ($C_{53}H_{37}NOS$ = 735.93) | 3-290 | m/z = 775.29 ($C_{56}H_{41}NOS$ = 776.00) |
| 3-291 | m/z = 679.29 ($C_{51}H_{37}NO$ = 679.85) | 3-292 | m/z = 735.26 ($C_{53}H_{37}NOS$ = 735.93) |
| 3-293 | m/z = 759.31 ($C_{56}H_{41}NO_2$ = 759.93) | 3-294 | m/z = 705.30 ($C_{53}H_{39}NO$ = 705.88) |
| 3-295 | m/z = 679.29 ($C_{51}H_{37}NO$ = 679.85) | 3-296 | m/z = 745.33 ($C_{56}H_{43}NO$ = 745.95) |
| 3-297 | m/z = 755.32 ($C_{57}H_{41}NO$ = 755.94) | 3-298 | m/z = 679.29 ($C_{51}H_{37}NO$ = 679.85) |
| 3-299 | m/z = 719.28 ($C_{53}H_{37}NO_2$ = 719.87) | 3-300 | m/z = 719.28 ($C_{53}H_{37}NO_2$ = 719.87) |
| 3-301 | m/z = 629.27 ($C_{47}H_{395}NO$ = 629.79) | 3-302 | m/z = 603.26 ($C_{45}H_{33}NO$ = 603.75) |
| 3-303 | m/z = 745.33 ($C_{56}H_{43}NO$ = 745.95) | 3-304 | m/z = 669.30 ($C_{50}H_{39}NO$ = 669.85) |
| 3-305 | m/z = 643.25 ($C_{50}H_{39}NO_2$ = 643.77) | 3-306 | m/z = 781.33 ($C_{59}H_{43}NO$ = 781.98) |
| 3-307 | m/z = 703.29 ($C_{53}H_{37}NO$ = 703.87) | 3-308 | m/z = 659.23 ($C_{47}H_{33}NOS$ = 659.84) |
| 3-309 | m/z = 795.31 ($C_{59}H_{41}NO_2$ = 795.96) | 3-310 | m/z = 745.33 ($C_{56}H_{43}NO$ = 745.95) |
| 3-311 | m/z = 679.29 ($C_{51}H_{37}NO$ = 679.85) | 3-312 | m/z = 643.25 ($C_{50}H_{39}NO_2$ = 643.77) |
| 3-313 | m/z = 705.30 ($C_{53}H_{39}NO$ = 705.88) | 3-314 | m/z = 679.29 ($C_{51}H_{37}NO$ = 679.85) |
| 3-315 | m/z = 745.33 ($C_{56}H_{43}NO$ = 745.95) | 3-316 | m/z = 759.31 ($C_{56}H_{41}NO_2$ = 759.93) |
| 3-317 | m/z = 705.30 ($C_{53}H_{39}NO$ = 705.88) | 3-318 | m/z = 643.25 ($C_{50}H_{39}NO_2$ = 643.77) |
| 3-319 | m/z = 629.27 ($C_{47}H_{395}NO$ = 629.79) | 3-320 | m/z = 603.26 ($C_{45}H_{33}NO$ = 603.75) |
| 3-321 | m/z = 669.30 ($C_{50}H_{39}NO$ = 669.85) | 3-322 | m/z = 669.30 ($C_{50}H_{39}NO$ = 669.85) |
| 3-323 | m/z = 781.33 ($C_{59}H_{43}NO$ = 781.98) | 3-324 | m/z = 679.29 ($C_{51}H_{37}NO$ = 679.85) |
| 3-325 | m/z = 745.33 ($C_{56}H_{43}NO$ = 745.95) | 3-326 | m/z = 759.31 ($C_{56}H_{41}NO_2$ = 759.93) |
| 3-327 | m/z = 793.33 ($C_{60}H_{43}NO$ = 793.99) | 3-328 | m/z = 629.27 ($C_{47}H_{395}NO$ = 629.79) |
| 3-329 | m/z = 603.26 ($C_{45}H_{33}NO$ = 603.75) | 3-330 | m/z = 669.30 ($C_{50}H_{39}NO$ = 669.85) |
| 3-331 | m/z = 705.30 ($C_{53}H_{39}NO$ = 705.88) | 3-332 | m/z = 679.29 ($C_{51}H_{37}NO$ = 679.85) |
| 3-333 | m/z = 745.33 ($C_{56}H_{43}NO$ = 745.95) | 3-334 | m/z = 719.28 ($C_{53}H_{37}NO_2$ = 719.87) |
| 3-335 | m/z = 705.30 ($C_{53}H_{39}NO$ = 705.88) | 3-336 | m/z = 735.26 ($C_{53}H_{37}NOS$ = 735.93) |
| 3-337 | m/z = 753.30 ($C_{57}H_{39}NO$ = 753.93) | 3-338 | m/z = 793.33 ($C_{60}H_{43}NO$ = 793.99) |
| 3-339 | m/z = 727.29 ($C_{55}H_{37}NO$ = 727.89) | 3-340 | m/z = 793.33 ($C_{60}H_{43}NO$ = 793.99) |
| 3-341 | m/z = 869.37 ($C_{66}H_{47}NO$ = 870.09) | 3-342 | m/z = 783.26 ($C_{57}H_{37}NOS$ = 783.97) |
| 3-343 | m/z = 829.33 ($C_{63}H_{43}NO$ = 830.02) | 3-344 | m/z = 793.33 ($C_{60}H_{43}NO$ = 793.99) |
| 3-345 | m/z = 803.32 ($C_{61}H_{41}NO$ = 803.98) | 3-346 | m/z = 753.30 ($C_{57}H_{39}NO$ = 753.93) |
| 3-347 | m/z = 803.32 ($C_{61}H_{41}NO$ = 803.98) | 3-348 | m/z = 753.30 ($C_{57}H_{39}NO$ = 753.93) |
| 3-349 | m/z = 727.29 ($C_{55}H_{37}NO$ = 727.89) | 3-350 | m/z = 793.33 ($C_{60}H_{43}NO$ = 793.99) |
| 3-351 | m/z = 767.28 ($C_{57}H_{37}NO_2$ = 767.91) | 3-352 | m/z = 783.26 ($C_{57}H_{37}NOS$ = 783.97) |
| 3-353 | m/z = 753.30 ($C_{57}H_{39}NO$ = 753.93) | 3-354 | m/z = 869.37 ($C_{66}H_{47}NO$ = 870.09) |
| 3-355 | m/z = 829.33 ($C_{63}H_{43}NO$ = 830.02) | 3-356 | m/z = 803.32 ($C_{61}H_{41}NO$ = 803.98) |
| 3-357 | m/z = 753.30 ($C_{57}H_{39}NO$ = 753.93) | 3-358 | m/z = 727.29 ($C_{55}H_{37}NO$ = 727.89) |
| 3-359 | m/z = 727.29 ($C_{55}H_{37}NO$ = 727.89) | 3-360 | m/z = 793.33 ($C_{60}H_{43}NO$ = 793.99) |
| 3-361 | m/z = 767.28 ($C_{57}H_{37}NO_2$ = 767.91) | 3-362 | m/z = 701.27 ($C_{53}H_{35}NO$ = 701.85) |

TABLE 7-continued

| Compound | FD-MS | Compound | FD-MS |
|---|---|---|---|
| 3-363 | m/z = 783.26 ($C_{57}H_{37}NOS$ = 783.97) | 3-364 | m/z = 793.33 ($C_{60}H_{43}NO$ = 793.99) |
| 3-365 | m/z = 767.28 ($C_{57}H_{37}NO_2$ = 767.91) | 3-366 | m/z = 829.33 ($C_{63}H_{43}NO$ = 830.02) |
| 3-367 | m/z = 803.32 ($C_{61}H_{41}NO$ = 803.98) | 3-368 | m/z = 829.33 ($C_{63}H_{43}NO$ = 830.02) |
| 3-369 | m/z = 803.32 ($C_{61}H_{41}NO$ = 803.98) | 3-370 | m/z = 753.30 ($C_{57}H_{39}NO$ = 753.93) |
| 3-371 | m/z = 727.29 ($C_{55}H_{37}NO$ = 727.89) | 3-372 | m/z = 793.33 ($C_{60}H_{43}NO$ = 793.99) |
| 3-373 | m/z = 829.33 ($C_{63}H_{43}NO$ = 830.02) | 3-374 | m/z = 803.32 ($C_{61}H_{41}NO$ = 803.98) |
| 3-375 | m/z = 767.28 ($C_{57}H_{37}NO_2$ = 767.91) | 3-376 | m/z = 783.26 ($C_{57}H_{37}NOS$ = 783.97) |
| 3-377 | m/z = 701.27 ($C_{53}H_{35}NO$ = 701.85) | 3-378 | m/z = 727.29 ($C_{55}H_{37}NO$ = 727.89) |
| 3-379 | m/z = 793.33 ($C_{60}H_{43}NO$ = 793.99) | 3-380 | m/z = 767.28 ($C_{57}H_{37}NO2$ = 767.91) |
| 3-381 | m/z = 753.30 ($C_{57}H_{39}NO$ = 753.93) | 3-382 | m/z = 829.33 ($C_{63}H_{43}NO$ = 830.02) |
| 3-383 | m/z = 803.32 ($C_{61}H_{41}NO$ = 803.98) | 3-384 | m/z = 753.30 ($C_{57}H_{39}NO$ = 753.93) |

TABLE 8

| Compound | FD-MS | Compound | FD-MS |
|---|---|---|---|
| 4-1 | m/z = 487.65 (C37H29N = 487.23) | 4-3 | m/z = 689.90 (C53H39N = 689.31) |
| 4-5 | m/z = 563.74 (C43H33N = 563.26) | 4-13 | m/z = 639.84 (C49H37N = 639.29) |
| 4-16 | m/z = 715.94 (C55H41N = 715.32) | 4-21 | m/z = 792.04 (C61H45N = 791.36) |
| 4-22 | m/z = 663.86 (C51H37N = 663.29) | 4-24 | m/z = 663.86 (C51H37N = 663.29) |
| 4-30 | m/z = 689.90 (C53H39N = 689.31) | 4-32 | m/z = 766.00 (C59H43N = 765.34) |
| 4-38 | m/z = 766.00 (C59H43N = 765.34) | 4-43 | m/z = 805.04 (C61H44N2 = 804.35) |
| 4-49 | m/z = 577.73 (C43H31NO = 577.24) | 4-60 | m/z = 593.79 (C43H31NS = 593.22) |
| 4-69 | m/z = 679.91 (C52H41N = 679.32) | 4-70 | m/z = 603.81 (C46H37N = 603.29) |
| 4-81 | m/z = 804.05 (C62H45N = 803.36) | 4-83 | m/z = 804.05 (C62H45N = 803.36) |
| 4-86 | m/z = 804.05 (C62H45N = 803.36) | 4-91 | m/z = 725.93 (C56H39N = 725.31) |
| 4-92 | m/z = 802.03 (C62H43N = 801.34) | 4-100 | m/z = 741.93 (C56H39NO = 741.30) |
| 4-125 | m/z = 739.96 (C57H41N = 739.32) | 4-126 | m/z = 715.94 (C55H41N = 715.32) |
| 4-136 | m/z = 756.00 (C58H45N = 756.36) | 4-152 | m/z = 794.03 (C59H39NS = 793.28) |
| 4-166 | m/z = 715.91 (C53H33NS = 715.23) | 4-181 | m/z = 763.98 (C59H41N = 763.32) |
| 4-183 | m/z = 814.04 (C63H43N = 813.34) | 4-184 | m/z = 763.98 (C59H41N = 763.32) |
| 4-223 | m/z = 776.98 (C59H40N2 = 776.32) | 4-224 | m/z = 853.08 (C65H44N2 = 852.35) |
| 4-240 | m/z = 794.03 (C59H39NS = 793.28) | 4-241 | m/z = 763.98 (C59H41N = 763.32) |
| 4-252 | m/z = 930.21 (C72H51N = 929.40) | 4-262 | m/z = 928.19 (C72H49N = 927.39) |
| 4-264 | m/z = 926.17 (C72H47N = 925.37) | 4-271 | m/z = 634.78 (C48H30N2 = 634.24) |
| 4-273 | m/z = 812.03 (C63H41N = 811.32) | 4-275 | m/z = 838.07 (C65H43N = 837.34) |
| 4-284 | m/z = 838.07 (C65H43N = 837.34) | 4-308 | m/z = 735.93 (C57H37N = 735.29) |
| 4-324 | m/z = 775.95 (C59H37NO = 775.29) | 4-337 | m/z = 862.09 (C67H43N = 861.34) |
| 4-356 | m/z = 852.05 (C65H41NO = 851.32) | 4-359 | m/z = 842.07 (C63H39NS = 841.23) |

TABLE 9

| Compound | $^1H$ NMR ($CDCl_3$, 200 Mz) |
|---|---|
| 1-2 | δ = 8.55 (m, 2H), 8.28 (d, 2H), 8.00 (d, 2H), 7.95 (d, 1H), 7.92 (d, 1H), 7.85 (d, 2H), 7.75-7.73 (m, 2H), 7.64 (s, 2H), 7.59-7.51 (m, 11H), 7.41~7.40 (m, 2H), 7.25 (d, 2H). |
| 1-20 | δ = 8.55 (m, 2H), 8.28 (d, 4H), 8.00 (m, 2H), 7.92 (d, 1H), 7.73-7.71 (m, 3H), 7.64 (s, 1H), 7.59-7.51 (m, 9H), 7.41~7.40 (m, 2H), 7.25 (s, 4H) . |
| 1-25 | δ = 8.55 (m, 2H), 8.00 (m, 2H), 7.92 (d, 1H), 7.81 (d, 1H), 7.73-7.71 (m, 3H), 7.64 (s, 1H), 7.59-7.51 (m, 9H), 7.41~7.40 (m, 2H), 7.25 (s, 4H). |
| 1-33 | δ = 8.55 (m, 3H), 8.42 (d, 1H), 8.28 (d, 4H), 8.08 (m, 1H), 8.04 (d, 1H), 7.95 (d, 1H), 7.75 (d, 1H), 7.64 (s, 2H), 7.61-7.51 (m, 9H), 7.41~7.40 (m, 2H), 7.25 (s, 4H). |
| 1-38 | δ = 8.55 (m, 3H), 8.42 (d, 1H), 8.28 (d, 4H), 8.08 (m, 1H), 8.04 (d, 1H), 7.95 (d, 1H), 7.75 (d, 1H), 7.64 (s, 2H), 7.61-7.51 (m, 9H), 7.41~7.40 (m, 2H), 7.25 (s, 4H). |
| 1-209 | δ = 8.55 (m, 2H), 8.28 (d, 2H), 8.00 (m, 2H), 7.92 (d, 1H), 7.85 (d, 2H), 7.73 (m, 1H), 7.64 (m, 2H), 7.59-7.51 (m, 11H), 7.41~7.40 (m, 2H), 7.25 (d, 2H) . |
| 1-211 | δ = 8.55 (m, 2H), 8.28 (d, 2H), 7.95 (m, 2H), 7.89 (d, 1H), 7.75 (d, 2H), 7.66 (d, 1H), 7.64 (s, 3H), 7.55-7.51 (m, 8H), 7.41~7.32 (m, 4H) . |
| 1-214 | δ = 8.55 (m, 2H), 8.28 (d, 4H), 7.79 (d, 2H), 7.81 (d, 1H), 7.72-7.71 (m, 2H), 7.64 (s, 1H), 7.55-7.51 (m, 8H), 7.41~7.40 (m, 3H) . |
| 1-225 | δ = 8.55 (m, 2H), 8.11 (d, 1H), 8.08 (s, 2H), 8.05 (d, 1H), 7.55-7.51 (m, 10H), 7.41~7.40 (m, 3H). |

TABLE 10

| Compound | $^1$H NMR ($CDCl_3$, 400 MHz) |
|---|---|
| 2-1 | δ = 8.28 (s, 1H), 8.17~8.15 (d, 2H), 8.12~8.10 (d, 1H), 7.85~7.70 (m, 3H), 7.56~7.54 (m, 4H), 7.52~7.44 (m, 6H), 7.41~7.37 (m, 5H), 7.28~7.21 (m, 6H) |
| 2-14 | δ = 8.29 (s, 1H), 8.18~8.16 (d, 2H), 8.12~8.10 (d, 1H), 7.84-7.71 (m, 3H), 7.55~7.53 (m, 4H), 7.52-7.44 (m, 6H), 7.41~7.37 (m, 5H), 7.27~7.19 (m, 8H) |
| 2-28 | δ = 8.31 (3, 1H), 8.20-8.18 (d, 2H), 8.15-8.14 (d, 1H), 7.90-7.85 (m, 3H), 7.69-7.65 (m, 4H), 7.52-7.44 (m, 6H), 7.41-7.37 (m, 5H), 7.27-7.19 (m, 8H) |
| 2-55 | δ = 8.25 (s, 1H), 8.15-8.14 (d, 2H), 8.12-8.10 (d, 1H), 7.88-7.86 (d, 1H), 7.70-7.66 (m, 3H), 7.55-7.53 (d, 4H), 7.52-7.44 (m, 6H), 7.41-7.37 (m, 6H), 7.28-7.20 (m, 8H) |
| 2-56 | δ = 8.25 (3, 1H), 8.16-8.15 (d, 2H), 8.12-8.10 (d, 1H), 7.88-7.86 (d, 1H), 7.70-7.66 (m, 3H), 7.55-7.53 (d, 4H), 7.52-7.44 (m, 6H), 7.41-7.37 (m, 6H), 7.28-7.20 (m, 8H) |
| 2-57 | δ = 8.26 (3, 1H), 8.16-8.14 (d, 2H), 8.12-8.10 (d, 1H), 7.88-7.86 (d, 1H), 7.70-7.66 (m, 3H), 7.56-7.54 (d, 4H), 7.52-7.44 (m, 8H), 7.41-7.37 (m, 6H), 7.29-7.20 (m, 10H) |
| 2-65 | δ = 8.26 (s, 1H), 8.16-8.14 (d, 2H), 8.12-8.10 (d, 1H), 7.88-7.86 (d, 1H), 7.70-7.66 (m, 3H), 7.56-7.54 (d, 4H), 7.52-7.44 (m, 8H), 7.41-7.37 (m, 6H), 7.29-7.20 (m, 8H) |
| 2-71 | δ = 8.26 (3, 1H), 8.16-8.14 (d, 2H), 8.12-8.10 (d, 1H), 7.88-7.86 (d, 1H), 7.69~7.65 (m, 3H), 7.54~7.44 (m, 12H), 7.41~7.37 (m, 6H), 7.29~7.20 (m, 8H), 1.49 (s, 6H) |
| 2-72 | δ = 8.25 (s, 1H), 8.16~8.14 (d, 2H), 8.12~8.10 (d, 1H), 7.88~7.70 (m, 5H), 7.56~7.54 (m, 4H), 7.52~7.43 (m, 13H), 7.29~7.20 (m, 8H) |
| 2-73 | δ = 8.25 (s, 1H), 8.16~8.14 (d, 2H), 8.12~8.10 (d, 1H), 7.87~7.71 (m, 5H), 7.56~7.54 (m, 4H), 7.52~7.43 (m, 13H), 7.29~7.20 (m, 8H) |
| 2-77 | δ = 8.31 (s, 1H), 8.20~8.18 (d, 2H), 8.15~8.14 (d, 1H), 7.90-7.85 (m, 3H), 7.69-7.65 (m, 4H), 7.52~7.44 (m, 6H), 7.41~7.37 (m, 5H), 7.27-7.19 (m, 8H) |
| 2-79 | δ = 8.29 (s, 1H), 8.17~8.15 (d, 2H), 8.13~8.11 (d, 1H), 7.88-7.81 (m, 3H), 7.65-7.60 (m, 4H), 7.49-7.37 (m, 13H), 7.27-7.19 (m, 10H) |
| 2-91 | δ = 8.29 (s, 1H), 8.19-8.18 (d, 2H), 8.14-8.13 (d, 1H), 7.90-7.86 (m, 3H), 7.67-7.60 (m, 4H), 7.49-7.37 (m, 13H), 7.27-7.19 (m, 10H) |
| 2-94 | δ = 8.29 (s, 1H), 8.17-8.15 (d, 2H), 8.13-8.11 (d, 1H), 7.88-7.81 (m, 3H), 7.65-7.60 (m, 4H), 7.49-7.37 (m, 13H), 7.27-7.19 (m, 10H) |
| 2-95 | δ = 8.27 (3, 1H), 8.16-8.13 (m, 3H), 7.90-7.86 (m, 3H), 7.67-7.50 (m, 6H), 7.45-7.37 (m, 13H), 7.23-7.19 (m, 8H) |
| 2-96 | δ = 8.30 (s, 1H), 8.20-8.19 (d, 2H), 8.15-8.14 (d, 1H), 7.90-7.86 (m, 3H), 7.67-7.60 (m, 4H), 7.49-7.37 (m, 13H), 7.27-7.19 (m, 10H) |
| 2-98 | δ = 8.31 (s, 1H), 8.22-8.20 (d, 2H), 8.16-8.14 (d, 1H), 7.93-7.86 (m, 3H), 7.72-7.63 (m, 4H), 7.55-7.37 (m, 13H), 7.27-7.19 (m, 10H) |
| 2-111 | δ = 8.35 (s, 1H), 8.27-8.24 (m, 2H), 8.18-8.16 (d, 1H), 7.99-7.92 (m, 3H), 7.79-7.66 (m, 4H), 7.59-7.42 (m, 15H), 7.35-7.29 (m, 10H) |
| 2-112 | δ = 8.34 (s, 1H), 8.26-8.23 (m, 2H), 8.18-8.16 (d, 1H), 7.99-7.92 (m, 3H), 7.75-7.65 (m, 4H), 7.58-7.42 (m, 15H), 7.35-7.29 (m, 10H) |
| 2-113 | δ = 8.35 (s, 1H), 8.27-8.24 (m, 2H), 8.18-8.16 (d, 1H), 7.99-7.92 (m, 3H), 7.79-7.66 (m, 4H), 7.59-7.42 (m, 13H), 7.35-7.29 (m, 10H) |
| 2-122 | δ = 8.35 (s, 1H), 8.27-8.24 (m, 2H), 8.18-8.16 (d, 1H), 7.98-7.91 (m, 3H), 7.78-7.67 (m, 4H), 7.60-7.41 (m, 13H), 7.34-7.28 (m, 10H), 1.49 (s, 6H) |
| 2-123 | δ = 8.34 (s, 1H), 8.26-8.23 (m, 2H), 8.17-8.16 (d, 1H), 7.97-7.90 (m, 3H), 7.75-7.65 (m, 4H), 7.58-7.42 (m, 15H), 7.35-7.29 (m, 12H) |
| 2-124 | δ = 8.34 (s, 1H), 8.26-8.23 (m, 2H), 8.17-8.16 (d, 1H), 7.98-7.93 (m, 3H), 7.76-7.66 (m, 4H), 7.59-7.43 (m, 15H), 7.35-7.29 (m, 12H) |
| 2-129 | δ = 8.40 (3, 1H), 8.30-8.26 (m, 2H), 8.20-8.19 (d, 1H), 7.99-7.92 (m, 3H), 7.79-7.66 (m, 4H), 7.59-7.42 (m, 13H), 7.35-7.29 (m, 10H) |
| 2-131 | δ = 8.41 (3, 1H), 8.31-8.27 (m, 2H), 8.20-8.19 (d, 1H), 7.99-7.92 (m, 3H), 7.79-7.66 (m, 4H), 7.59-7.42 (m, 13H), 7.35-7.29 (m, 10H) |
| 2-133 | δ = 8.33-8.30 (m, 2H), 8.25-8.24 (d, 1H), 8.17-8.15 (d, 1H), 7.98-7.93 (m, 3H), 7.76-7.66 (m, 4H), 7.56-7.42 (m, 15H), 7.33-7.29 (m, 10H) |
| 2-137 | δ = 8.33-8.30 (m, 2H), 8.26-8.24 (d, 1H), 8.16-8.15 (d, 1H), 7.99-7.93 (m, 3H), 7.76-7.66 (m, 4H), 7.56-7.42 (m, 15H), 7.33-7.29 (m, 12H) |
| 2-144 | δ = 8.35-8.33 (m, 2H), 8.26-8.25 (d, 1H), 8.18-8.16 (d, 1H), 7.99-7.94 (m, 3H), 7.79-7.70 (m, 4H), 7.56-7.42 (m, 15H), 7.33-7.29 (m, 8H), 1.51 (s, 6H) |
| 2-146 | δ = 8.33-8.30 (m, 2H), 8.25-8.24 (d, 1H), 8.17-8.15 (d, 1H), 7.98-7.93 (m, 3H), 7.76-7.66 (m, 4H), 7.56-7.42 (m, 17H), 7.33-7.29 (m, 10H) |
| 2-153 | δ = 8.36~8.34 (m, 2H), 8.28~8.26 (d, 1H), 8.19~8.18 (d, 1H), 8.00-7.93 (m, 3H), 7.75~7.66 (m, 4H), 7.56-7.42 (m, 15H), 7.33-7.29 (m, 8H) |
| 2-160 | δ = 8.31 (s, 1H), 8.20-8.17 (m, 2H), 8.09~8.08 (d, 1H), 7.96-7.92 (m, 3H), 7.75-7.65 (m, 4H), 7.58-7.42 (m, 11H), 7.30-7.25 (m, 10H) |
| 2-198 | δ = 8.32 (s, 1H), 8.20-8.19 (d, 2H), 8.15-8.14 (d, 1H), 7.97-7.93 (m, 3H), 7.79-7.69 (m, 4H), 7.55-7.39 (m, 13H), 7.25-7.21 (m, 8H) |
| 2-201 | δ = 8.33 (s, 1H), 8.21-8.20 (d, 2H), 8.16-8.14 (d, 1H), 7.99-7.95 (m, 3H), 7.79-7.69 (m, 4H), 7.55-7.39 (m, 13H), 7.24-7.20 (m, 6H), 1.51 (s, 6H) |
| 2-214 | δ = 8.31 (s, 1H), 8.20-8.18 (d, 2H), 8.15-8.14 (d, 1H), 7.94-7.93 (d, 1H), 7.72-7.67 (m, 3H), 7.55-7.44 (m, 10H), 7.41-7.37 (m, 6H), 7.24-7.20 (m, 8H) |
| 2-228 | δ = 8.32 (s, 1H), 8.22-8.21 (d, 2H), 8.17-8.15 (d, 1H), 7.95-7.94 (d, 1H), 7.72-7.68 (m, 3H), 7.54-7.44 (m, 8H), 7.41-7.37 (m, 6H), 7.25-7.20 (m, 8H), 1.50 (s, 6H) |
| 2-231 | δ = 8.30 (s, 1H), 8.19-8.18 (d, 2H), 8.15-8.14 (d, 1H), 7.94-7.93 (d, 1H), 7.72-7.67 (m, 3H), 7.55-7.44 (m, 12H), 7.41-7.37 (m, 6H), 7.25-7.21 (m, 8H) |

TABLE 10-continued

| Compound | $^1$H NMR ($CDCl_3$, 400 MHz) |
|---|---|
| 2-234 | δ = 8.30 (s, 1H), 8.18-8.14 (m, 3H), 7.95-7.93 (d, 1H), 7.72-7.67 (m, 3H), 7.55-7.46 (m, 12H), 7.41-7.35 (m, 10H), 7.25-7.20 (m, 8H) |
| 2-244 | δ = 8.35 (s, 1H), 8.22-8.20 (d, 2H), 8.17-8.15 (d, 1H), 7.99-7.97 (d, 1H), 7.79-7.70 (m, 3H), 7.60-7.47 (m, 8H), 7.43-7.37 (m, 6H), 7.24-7.20 (m, 8H) |
| 2-246 | δ = 8.34 (s, 1H), 8.19-8.18 (d, 2H), 8.15-8.14 (d, 1H), 7.94-7.93 (d, 1H), 7.72-7.67 (m, 3H), 7.55-7.44 (m, 10H), 7.41-7.20 (m, 16H) |
| 2-257 | δ = 8.40 (s, 1H), 8.30-8.27 (m, 2H), 8.20-8.19 (d, 1H), 8.00-7.95 (m, 3H), 7.79-7.70 (m, 4H), 7.58-7.42 (m, 15H), 7.35-7.29 (m, 10H) |

TABLE 11

| Compound | $^1$H NMR ($CDCl_3$, 300 Mz) |
|---|---|
| 3-1 | 1.72 (s, 6H), 6.70 (m, 6H), 7.07-7.10 (m, 4H), 7.20-7.23 (m, 8H), 7.33-7.39 (m, 8H), 7.66 (d, 2H), 7.89 (d, 1H) |
| 3-28 | 1.72 (s, 6H), 6.70 (m, 6H), 7.07-7.10 (m, 4H), 7.20-7.23 (m, 8H), 7.33-7.39 (m, 5H), 7.41 (t, 2H), 7.62 (s, 1H), 7.66 (d, 2H), 7.88 (d, 1H) |
| 3-48 | 1.70 (s, 6H), 6.70 (m, 6H), 7.08 (d, 1H), 7.33-7.39 (m, 7H), 7.41-7.55 (m, 9H), 7.62 (s, 1H), 7.73 (d, 2H), 7.77 (d, 1H), 7.92 (s, 1H), 7.98 (d, 1H) |
| 3-50 | 1.70 (s, 6H), 6.69 (m, 6H), 7.07 (d, 1H), 7.40-7.59 (m, 11H), 7.75-7.88 (m, 8H), 7.98 (d, 1H) |
| 3-52 | 1.70 (s, 6H), 1.75 (s, 6H), 6.58 (d, 1H), 6.65-6.67 (m, 4H), 6.75 (s, 1H), 7.07 (d, 1H), 7.29 (t, 1H), 7.38-7.40 (m, 5H), 7.51-7.56 (m, 8H), 7.62 (d, 1H), 7.74 (d, 1H), 7.76 (d, 1H), 7.87 (d, 1H), 7.93 (s, 1H), 7.98 (d, 1H) |
| 3-61 | 1.71 (s, 6H), 6.70 (m, 6H), 7.08 (d, 1H), 7.25 (dd, 8H), 7.41(t, 2H), 7.44-7.49 (m, 6H), 7.51-7.55 (m, 9H), 7.73 (d, 2H), 7.78 (d, 1H), 7.90 (s, 1H), 7.99 (d, 1H) |
| 3-62 | 1.70 (s, 6H), 1.75 (s, 6H), 6.58 (d, 1H), 6.65-6.67 (m, 4H), 6.75 (s, 1H), 7.07 (d, 1H), 7.25-7 26 (dd, 8H), 7.28 (t, 1H), 7.42-7.48 (m, 3H), 7.51-7.54 (m, 6H), 7.62 (d, 1H), 7.74 (d, 1H), 7.78 (d, 1H), 7.87 (d, 1H), 7.91 (s, 1H), 7.98 (d, 1H) |
| 3-63 | 1.70 (s, 6H), 1.77 (s, 6H), 6.58 (d, 1H), 6.66-6.69 (m, 4H), 6.75 (s, 1H), 7.07 (d, 1H), 7.28-7.30 (m, 4H), 7.51-7.54 (m, 8H), 7.71-7.88 (m, 10H) |
| 3-78 | 1.70 (s, 6H), 6.66-6.69 (m, 6H), 6.75 (s, 1H), 7.05 (d, 1H), 7.42 (t, 1H), 7.51-7.54 (m, 7H), 7.60-7.65 (m, 10H), 7.73-7.80 (m, 3H), 8.00-8.10 (m, 2H) |
| 3-97 | 1.72 (s, 6H), 6.58 (d, 1H), 6.65-6.67 (m, 4H), 6.88-6.89 (m, 2H), 7.07 (d, 1H), 7.44-7.48 (m, 5H), 7.50-7.59 (m, 12H), 7.73-7.76 (m, 2H), 7.93 (s, 1H), 7.98 (d, 1H) |
| 3-121 | 1.70 (s, 6H), 6.66-6.69 (m, 6H), 7.44 (t, 2H), 7.51-7.54 (m, 7H), 7.60-7.65 (m, 9H), 7.67-7.77 (m, 3H), 8.00 (d, 2H) |
| 3-145 | 6.67-6.70 (m, 6H), 7.09-7.12 (m, 5H), 7.20-7.23 (m, 4H), 7.33-7.39 (m, 7H), 7.42-7.60 (m, 13H), 7.73 (d, 2H), 7.90 (s, 1H), 8.12 (d, 1H) |
| 3-162 | 6.65-6.69 (m, 6H), 6.81 (t, 1H), 7.20-7.23 (m, 4H), 7.38-7.40 (m, 8H), 7.45-7.60 (m, 14H), 7.75 (d, 1H), 7.95 (s, 1H), |
| 3-181 | 6.69-6.71 (m, 6H), 7.06-7.11 (m, 5H), 7.20-7.23 (m, 4H), 7.33-7.39 (m, 7H), 7.42-7.60 (m, 13H), 7.73 (d, 2H), 7.89 (s, 1H), 7.98 (d, 1H) |
| 3-182 | 6.69-6.71 (d, 4H), 7.06-7.12 (m, 5H), 7.25-7.27 (m, 4H), 7.34-7.39 (m, 7H), 7.40-7.61 (m, 9H), 7.73-7.77 (m, 4H), 7.87-7.89 (m, 3H), 7.98 (d, 1H) |
| 3-216 | 6.70 (m, 6H), 7.06-7.11 (m, 4H), 7.20-7.23 (m, 5H), 7.33-7.39 (m, 7H), 7.42-7.60 (m, 13H), 7.63 (d, 2H), 7.73 (d, 1H), 7.98 (d, 1H) |
| 3-229 | 1.72 (s, 6H), 6.70 (m, 6H), 7.06-7.10 (m, 5H), 7.20-7.23 (m, 7H), 7.33-7.39 (m, 8H), 7.66 (d, 2H), 7.89 (d, 1H) |
| 3-247 | 1.72 (s, 6H), 6.70 (m, 6H), 7.05-7.08 (m, 4H), 7.21-7.30 (m, 6H), 7.38-7.45 (m, 8H), 7.51-7.55 (m, 2H), 7.62 (s, 1H), 7.65 (d, 1H), 7.90 (d, 1H) |
| 3-261 | 1.70 (s, 6H), 6.68 (m, 6H), 7.07 (d, 1H), 7.32-7.45 (m, 12H), 7.51-7.55 (m, 6H), 7.66 (d, 1H), 7.77 (d, 1H), 7.89 (d, 1H), 7.92 (s, 1H) |
| 3-264 | 1.70 (s, 6H), 1.75 (s, 6H), 6.58 (d, 1H), 6.65-6.67 (m, 4H), 6.75 (s, 1H), 7.07 (d, 1H), 7.28-7.40 (m, 8H), 7.51-7.56 (m, 6H), 7.62-7.66 (m, 3H), 7.77 (d, 1H), 7.87-7.89 (m, 2H) |
| 3-276 | 1.70 (s, 6H), 1.75 (s, 6H), 6.67-6.68 (m, 6H), 6.75 (s, 1H), 7.07 (d, 1H), 7.30-7.41 (m, 7H), 7.51-7.57 (m, 9H), 7.62-7.66 (m, 2H), 7.77 (d, 2H), 7.87-7.92 (m, 4H) |
| 3-294 | 1.72 (s, 6H), 6.70 (m, 6H), 7.08 (d, 1H), 7.25 (m, 6H), 7.38-7.41 (m, 10H), 7.48-7.52 (m, 6H), 7.65 (d, 1H), 7.77 (d, 1H), 7.90 (d, 1H), 7.93 (s, 1H) |
| 3-319 | 1.73 (s, 6H), 6.69 (m, 6H), 7.38-7.41 (m, 10H), 7.50-7.55 (m, 8H), 7.65-7.67 (d, 3H), 7.90 (d, 1H) |
| 3-337 | 6.70 (m, 6H), 7.09-7.11 (m, 4H), 7.26-7.30 (m, 5H), 7.35-7.40 (m, 8H), 7.42-7.59 (m, 13H), 7.66 (d, 2H), 7.90 (d, 1H) |
| 3-348 | 6.70 (m, 6H), 7.11-7.12 (m, 4H), 7.28-7.32 (m, 8H), 7.38-7.40 (m, 6H), 7.48-7.59 (m, 13H), 7.66 (d, 1H), 7.90 (d, 1H) |
| 3-357 | 6.69 (m, 6H), 7.06 (d, 1H), 7.11-7.12 (m, 4H), 7.29-7.32 (m, 8H), 7.37-7.41 (m, 4H), 7.48-7.59 (m, 12H), 7.66 (d, 1H), 7.73 (d, 1H), 7.88 (s, 1H), 7.90 (d, 1H) |
| 3-378 | 6.69 (m, 6H), 7.11-7.12 (m, 4H), 7.29-7.33 (m, 6H), 7.37-7.41 (m, 4H), 7.48-7.59 (m, 9H), 7.63-7.66 (m, 3H), 7.77-7.88 (m, 5H) |

TABLE 11-continued

| Compound | $^1H$ NMR ($CDCl_3$, 300 Mz) |
|---|---|
| 3-381 | 6.71 (m, 6H), 7.10-7.12 (m, 4H), 7.29-7.32 (m, 9H), 7.48-7.59 (m, 12H), 7.62-7.65 (m, 3H), 7.90 (d, 1H) |

TABLE 12

| Compound | $^1H$ NMR (DMSO, 300 MHz) |
|---|---|
| 4-1 | δ = 8.80 (1H, d), 7.97-7.86 (4H, m), 7.76 (1H, d), 7.51-7.20 (14H, m), 7.08 (2H, d), 7.00 (1H, t), 1.69 (6H, s) |
| 4-3 | δ = 8.93 (1H, d), 8.31 (1H, d), 8.26 (1H, d), 7.90-7.86 (2H, m), 7.78-7.65 (5H, m), 7.55-7.28 (21H, m), 7.16 (1H, d), 7.11 (1H, s), 1.69 (6H, s) |
| 4-5 | δ = 8.80 (1H, d), 7.97-7.86 (4H, m), 7.76 (3H, d), 7.55-7.17 (19H, m), 1.69 (6H, m) |
| 4-13 | δ = 8.80 (1H, d), 8.10 (1H, d), 7.97-7.86 (4H, m), 7.76 (3H, d), 7.55-7.16 (22H, m), 1.69 (6H, s) |
| 4-16 | δ = 8.93 (1H, d), 8.31 (1H, d), 8.26 (1H, d), 7.90 (1H, d), 7.86 (1H, d), 7.75-7.28 (29H, m), 7.16 (1H, d), 1.69 (6H, s) |
| 4-21 | δ = 8.93 (1H, d), 8.31 (1H, d), 8.26 (1H, d), 7.90 (1H, d), 7.86 (1H, d), 7.75-7.72 (5H, m), 7.55-7.25 (28H, m), 7.16 (1H, d), 1.69 (6H, s) |
| 4-22 | δ = 8.98 (1H, d), 8.93 (1H, d), 8.84 (1H, d), 8.31 (1H, d), 8.26 (1H, d), 8.11 (1H, d), 7.90 (2H, d), 7.86 (1H, d), 7.72-7.49 (14H, m), 7.41-7.28 (7H, m), 7.16 (1H, d), 1.69 (6H, s) |
| 4-24 | δ = 9.08 (1H, d), 8.84 (1H, d), 8.80 (1H, d), 8.27 (1H, d), 8.05 (1H, s), 7.97-7.86 (5H, m), 7.70-7.17 (21H, m), 1.69 (6H, s) |
| 4-30 | δ = 8.95 (1H, d), 8.93 (1H, d), 8.50 (1H, d), 8.31-8.20 (3H, m), 8.09 (1H, d), 7.90 (1H, d), 7.86 (1H, d), 7.77-7.65 (4H, m), 7.55-7.52 (9H, m), 7.41-7.28 (10H, m), 7.16 (1H, d), 1.69 (6H, s) |
| 4-32 | δ = 8.95 (1H, d), 8.93 (1H, d), 8.50 (1H, d), 8.31-8.20 (3H, m), 8.09 (1H, d), 7.90-7.86 (2H, m), 7.77-7.54 (12H, m), 7.41-7.16 (16H, m), 1.69 (6H, s) |
| 4-38 | δ = 8.93 (1H, d), 8.80 (1H, d), 8.31 (1H, d), 8.26 (1H, d), 7.97-7.86 (4H, m), 7.76-7.65 (4H, m), 7.55-7.16 (25H, m), 1.69 (6H, s) |
| 4-43 | δ = 8.80 (1H, d), 8.39 (1H, d), 8.19 (1H, d), 7.97-7.89 (3H, m), 7.75 (2H, d), 7.62-7.38 (12H, m), 7.28-7.16 (15H, m), 6.40 (1H, d), 1.69 (6H, s) |
| 4-49 | δ = 8.80 (1H, d), 7.98-7.89 (4H, m), 7.76 (1H, d), 7.55-7.16 (18H, m), 6.91 (1H, d), 1.69 (6H, s) |
| 4-60 | δ = 8.80 (1H, d), 8.46 (1H, d), 7.97-7.85 (7H, m), 7.76 (1H, d), 7.56-7.16 (15H, m), 1.69 (6H, s) |
| 4-69 | δ = 8.93 (1H, d), 8.31 (1H, d), 8.26 (1H, d), 7.90-7.86 (3H, m), 7.72 (1H, d), 7.65 (2H, d), 7.55 (7H, d), 7.41-7.16 (13H, m), 1.69 (12H, s) |
| 4-70 | δ = 8.80 (1H, d), 7.97-7.86 (5H, m), 7.76 (1H, d), 7.62 (1H, s), 7.55-7.16 (16H, m), 7.06 (1H, d), 1.69 (12H, s) |
| 4-81 | δ = 8.93 (1H, d), 8.31 (1H, d), 8.26 (1H, d), 7.90-7.86 (3H, m), 7.72 (1H, d), 7.65 (2H, d), 7.55 (7H, d), 7.41-7.10 (23H, m), 1.69 (6H, s) |
| 4-83 | δ = 8.93 (1H, d), 8.31-8.26 (2H, m), 7.90 (2H, d), 7.86 (2H, d), 7.72 (1H, d), 7.65 (2H, d), 7.55 (7H, d), 7.41-7.16 (22H, m), 1.69 (6H, s) |
| 4-86 | δ = 8.80 (1H, d), 8.09 (1H, d), 7.97-7.86 (6H, m), 7.78-7.76 (2H, m), 7.55-7.10 (29H, m), 1.69 (6H, s) |
| 4-91 | δ = 8.80 (1H, d), 7.97-7.86 (7H, m), 7.76 (1H, d), 7.61-7.16 (23H, m), 7.05 (1H, d), 1.69 (6H, s) |
| 4-92 | δ = 8.93 (1H, d), 8.31 (1H, d), 8.26 (1H, d), 7.90-7.85 (4H, m), 7.72 (1H, d), 7.65 (2H, d), 7.55-7.23 (23H, m), 7.16 (1H, d), 7.06 (1H, d), 1.69 (6H, s) |
| 4-100 | δ = 8.80 (1H, d), 7.97-7.89 (4H, m), 7.76 (1H, d), 7.62-7.01 (27H, m), 1.69 (6H, 3) |
| 4-125 | δ = 8.98 (1H, d), 8.93 (1H, d), 8.84 (1H, d), 8.31 (1H, d), 8.26 (1H, d), 8.11 (1H, d), 8.09 (1H, d), 7.90 (2H, d), 7.89 (1H, d), 7.78-7.49 (17H, m), 7.41-7.28 (8H, m), 1.69 (6H, s) |
| 4-126 | δ = 8.93 (1H, d), 8.31 (1H, d), 8.26 (1H, d), 7.90 (1H, d), 7.86 (1H, d), 7.75 (4H, d), 7.72 (1H, d), 7.55-7.25 (24H, m), 7.16 (1H, d), 1.69 (6H, s) |
| 4-136 | δ = 8.93 (1H, d), 8.31 (1H, d), 8.26 (1H, d), 8.09 (1H, d), 7.90-7.86 (4H, m), 7.78-7.72 (4H, m), 7.55-7.28 (20H, m), 7.16 (1H, d), 1.69 (12H, s) |
| 4-152 | δ = 8.93 (1H, d), 8.45 (1H, d), 8.31 (1H, d), 8.26 (1H, d), 7.95-7.85 (5H, m), 7.72-7.10 (30H, m) |
| 4-166 | δ = 8.80 (1H, d), 8.45 (1H, d), 8.01-7.89 (7H, m), 7.76 (1H, d), 7.64 (1H, s), 7.56-7.20 (22H, m) |
| 4-181 | δ = 8.93 (1H, d), 8.31 (1H, d), 8.26 (1H, d), 7.90-7.86 (2H, m), 7.72 (1H, d), 7.65 (2H, d), 7.55 (6H, d), 7.41-7.00 (27H, m) |
| 4-183 | δ = 8.80 (1H, d), 7.97-.7.86 (4H, m), 7.78-7.71 (5H, m), 7.55-7.10 (33H, m) |
| 4-184 | δ = 8.93 (1H, d), 8.31-8.26 (2H, m), 7.90-7.86 (2H, m), 7.75-7.65 (5H, m), 7.55-7.10 (31H, m) |

TABLE 12-continued

| Compound | $^1$H NMR (DMSO, 300 MHz) |
|---|---|
| 4-223 | δ = 8.80 (1H, d), 7.46 (1H, d), 8.19 (1H, d), 7.97-7.89 (3H, m), 7.76 (1H, d), 7.62-7.38 (14H, m), 7.28-7.10 (18H, m), 6.40 (1H, d) |
| 4-224 | δ = 8.93 (1H, d), 8.55 (1H, d), 8.31-8.19 (3H, m), 7.94 (1H, d), 7.86 (1H, d), 7.72-7.16 (36H, m) |
| 4-240 | δ = 8.93 (1H, d), 8.45 (1H, d), 8.31 (1H, d), 8.26 (1H, d), 7.95-7.85 (5H, m), 7.72-7.10 (30H, m) |
| 4-241 | δ = 8.93 (1H, d), 8.31 (1H, d), 8.26 (1H, d), 8.09 (1H, d), 7.90 (1H, d), 7.89 (1H, s), 7.78-7.65 (4H, m), 7.55 (8H, d), 7.41-7.00 (23H, m) |
| 4-252 | δ = 8.93 (1H, d), 8.31 (1H, d), 8.26 (1H, d), 8.09-7.99 (4H, m), 7.90-7.86 (4H, m), 7.78 (1H, d), 7.72 (1H, d), 7.63-7.54 (8H, m), 7.40-7.10 (22H, m), 1.69 (6H, s) |
| 4-262 | δ = 8.93 (1H, d), 8.31 (1H, d), 8.26 (1H, d), 7.90-7.86 (3H, m), 7.72-7.65 (3H, m), 7.54-7.10 (40H, m) |
| 4-264 | δ = 8.93 (1H, d), 8.31 (1H, d), 8.26 (1H, d), 8.08 (1H, d), 7.90-7.89 (4H, d), 7.72 (1H, d), 7.68 (1H, d), 7.55 (6H, d), 7.45-7.00 (30H, m) |
| 4-271 | δ = 8.80 (1H, d), 7.97-7.86 (6H, m), 7.76 (1H, d), 7.55-7.16 (22H, m) |
| 4-273 | δ = 8.93 (1H, d), 8.31 (1H, d), 8.26 (1H, d), 7.94-7.86 (5H, m), 7.78-7.28 (31H, m), 7.16 (1H, d), 7.11 (1H, s) |
| 4-275 | δ = 8.93 (1H, d), 8.31 (1H, d), 8.26 (1H, d), 7.90-7.86 (4H, m), 7.75-7.65 (5H, m), 7.55-7.16 (31H, m) |
| 4-284 | δ = 8.93 (1H, d), 8.31 (1H, d), 8.26 (1H, d), 7.90-7.86 (4H, m), 7.75-.7.72 (3H, m), 7.54-7.24 (30H, m), 7.08-7.00 (3H, m) |
| 4-308 | δ = 8.80 (2H, d), 7.97-7.86 (8H, m), 7.76 (2H, d), 7.51-7.16 (25H, m) |
| 4-324 | δ = 8.80 (1H, d), 7.98-7.69 (9H, m), 7.57-7.20 (26H, m), 7.06 (1H, d) |
| 4-337 | δ = 8.98 (1H, d), 8.93 (1H, d), 8.84 (1H, d), 8.31 (1H, d), 8.26 (1H, d), 8.11 (1H, d), 7.90-7.86 (5H, m), 7.68-7.25 (31H, m), 7.16 (1H, d) |
| 4-356 | δ = 8.93 (1H, d), 8.31 (1H, d), 8.26 (1H, d), 8.03 (1H, d), 7.98 (1H, d), 7.90-7.72 (9H, m), 7.55-7.27 (26H, m), 7.16 (1H, d) |
| 4-359 | δ = 8.93 (1H, d), 8.55 (1H, d), 8.45 (1H, d), 8.32-8.26 (3H, m), 7.93-7.86 (5H, m), 7.78-7.70 (4H, m), 7.56-7.27 (22H, m), 7.16 (1H, d), 7.11 (1H, s) |

EXPERIMENTAL EXAMPLE

Experimental Example 1

1) Manufacture of Organic Light Emitting Device

A glass substrate on which indium tin oxide (ITO) was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and UVO treatment was conducted for 5 minutes using UV in a UV cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), the following 2-TNATA (4,4', 4"-tris[2-naphthyl(phenyl)amino] triphenylamine) as a hole injection layer and the following NPB (N,N'-di(1-naphthyl)-N,N'-diphenyl-(1,1'-biphenyl)-4,4'-diamine) as a hole transfer layer, which are common layers, were formed.

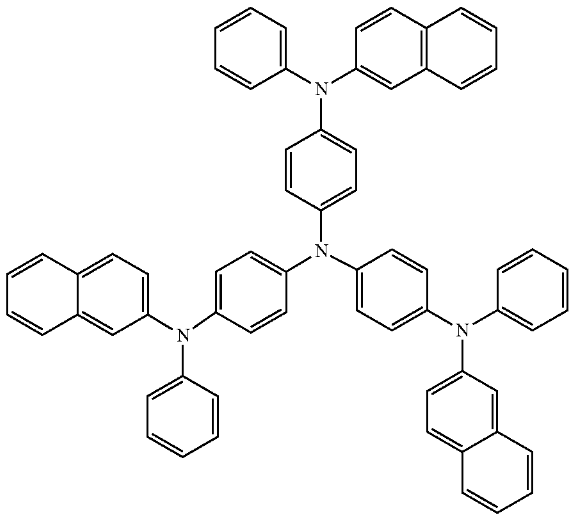

2-TNATA

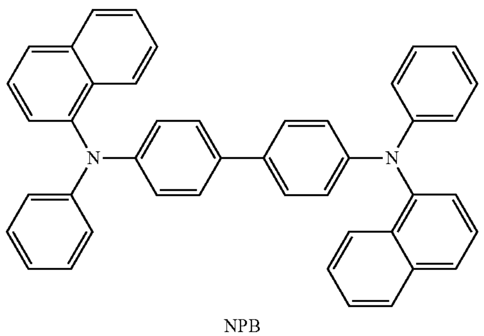

NPB

A light emitting layer was thermal vacuum deposited thereon as follows. The light emitting layer was deposited to 500 Å by depositing two types of compounds described in the following Table 13 in one source of supply as a red host, and doping the following $(piq)_2(Ir)$ (acac) used as a red phosphorescent dopant to the host by 3%. After that, the following BCP was deposited to 60 Å as a hole blocking layer, and $Alq_3$ was deposited to 200 Å thereon as an electron transfer layer. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic electroluminescent device was manufactured.

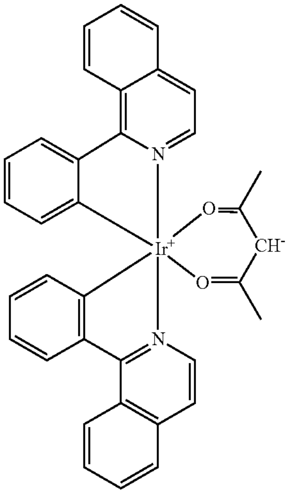

$(piq)_2(Ir)(acac)$

-continued

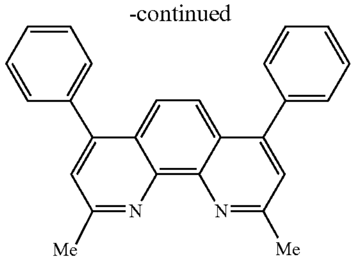

BCP

Meanwhile, all the organic compounds required to manufacture the OLED were vacuum sublimation purified under $10^{-8}$ torr to $10^{-6}$ torr for each material to be used in the OLED (organic light emitting device) manufacture.

2) Driving Voltage and Light Emission Efficiency of Organic Electroluminescent Device For each of the organic electroluminescent devices manufactured as above, electroluminescent (EL) properties were measured using M7000 manufactured by McScience Inc., and with the measurement results, $T_{90}$ was measured when standard luminance was 6,000 cd/$m^2$ through a lifetime measurement system (M6000) manufactured by McScience Inc. Properties of the organic electroluminescent devices of the present disclosure are as shown in the following Table 13.

TABLE 13

| | Compound | Ratio | Driving Voltage (V) | Efficiency (cd/A) | Color Coordinate (x, y) | Lifetime ($T_{90}$) |
|---|---|---|---|---|---|---|
| Comparative Example 1 | 1-1:C | 1:2 | 4.11 | 22.5 | (0.681, 0.318) | 121 |
| Comparative Example 2 | 1-1:D | 1:1 | 4.10 | 23.0 | (0.682, 0.318) | 112 |
| Comparative Example 3 | 1-1:D | 1:2 | 4.05 | 24.1 | (0.682, 0.318) | 108 |
| Comparative Example 4 | 1-1:D | 1:3 | 4.02 | 24.1 | (0.682, 0.318) | 107 |
| Comparative Example 5 | A:2-244 | 2:1 | 4.20 | 23.2 | (0.682, 0.317) | 111 |
| Comparative Example 6 | A:2-244 | 1:1 | 4.23 | 24.0 | (0.682, 0.318) | 105 |
| Comparative Example 7 | A:2-244 | 1:2 | 4.18 | 23.8 | (0.682, 0.317) | 109 |
| Comparative Example 8 | B:4-337 | 2:1 | 4.09 | 24.2 | (0.682, 0.318) | 121 |
| Comparative Example 9 | B:4-337 | 1:1 | 4.13 | 23.9 | (0.682, 0.318) | 112 |
| Comparative Example 10 | B:4-337 | 1:2 | 4.17 | 23.8 | (0.682, 0.317) | 110 |
| Comparative Example 11 | B:C | 1:1 | 4.56 | 18.0 | (0.682, 0.317) | 90 |
| Comparative Example 12 | B:C | 1:2 | 4.42 | 19.1 | (0.682, 0.317) | 88 |
| Comparative Example 13 | B:C | 1:3 | 4.39 | 17.8 | (0.682, 0.317) | 85 |
| Example 1 | 1-1:2-131 | 1:1 | 3.90 | 27.3 | (0.681, 0.318) | 151 |
| Example 2 | 1-1:2-131 | 1:2 | 3.85 | 28.5 | (0.681, 0.317) | 152 |
| Example 3 | 1-1:2-131 | 1.5:1 | 3.91 | 28.1 | (0.681, 0.318) | 149 |

TABLE 13-continued

| | Compound | Ratio | Driving Voltage (V) | Efficiency (cd/A) | Color Coordinate (x, y) | Lifetime ($T_{90}$) |
|---|---|---|---|---|---|---|
| Example 4 | 1-1:2-131 | 2:1 | 3.94 | 28.2 | (0.681, 0.318) | 148 |
| Example 5 | 1-1:2-160 | 1:2 | 3.96 | 27.9 | (0.681, 0.317) | 153 |
| Example 6 | 1-33:2-244 | 2:1 | 3.73 | 29.2 | (0.681, 0.317) | 145 |
| Example 7 | 1-33:2-244 | 1:1 | 3.70 | 28.9 | (0.681, 0.318) | 147 |
| Example 8 | 1-33:2-244 | 1:2 | 3.68 | 28.8 | (0.681, 0.318) | 147 |
| Example 9 | 1-25:2-96 | 2:1 | 3.96 | 28.9 | (0.681, 0.318) | 145 |
| Example 10 | 1-25:2-96 | 1:1 | 3.64 | 28.0 | (0.681, 0.317) | 157 |
| Example 11 | 1-25:2-96 | 1:2 | 3.96 | 28.9 | (0.681, 0.318) | 145 |
| Example 12 | 1-1:3-78 | 3:1 | 3.66 | 28.3 | (0.681, 0.317) | 173 |
| Example 13 | 1-1:3-78 | 2:1 | 3.67 | 28.3 | (0.681, 0.318) | 170 |
| Example 14 | 1-1:3-78 | 1.5:1 | 3.68 | 28.5 | (0.681, 0.317) | 172 |
| Example 15 | 1-1:3-78 | 1:1 | 3.72 | 28.5 | (0.681, 0.318) | 168 |
| Example 16 | 1-1:3-78 | 1:2 | 3.88 | 28.6 | (0.683, 0.316) | 167 |
| Example 17 | 1-1:3-78 | 1:3 | 3.95 | 26.8 | (0.681, 0.318) | 167 |
| Example 18 | 1-194:3-52 | 3:1 | 3.67 | 28.5 | (0.681, 0.318) | 158 |
| Example 19 | 1-194:3-52 | 2:1 | 3.68 | 30.0 | (0.681, 0.318) | 157 |
| Example 20 | 1-194:3-52 | 1.5:1 | 3.70 | 30.8 | (0.681, 0.317) | 155 |
| Example 21 | 1-194:3-52 | 1:1 | 3.71 | 30.5 | (0.681, 0.317) | 149 |
| Example 22 | 1-194:3-52 | 1:2 | 3.88 | 30.6 | (0.683, 0.316) | 148 |
| Example 23 | 1-38:3-97 | 2:1 | 3.70 | 29.0 | (0.681, 0.318) | 158 |
| Example 24 | 1-36:3-61 | 2:1 | 3.69 | 29.8 | (0.681, 0.318) | 151 |
| Example 25 | 1-187:3-161 | 1.5:1 | 3.68 | 29.7 | (0.681, 0.318) | 148 |
| Example 26 | 1-198:3-294 | 1.5:1 | 3.75 | 28.8 | (0.681, 0.318) | 155 |
| Example 27 | 1-199:3-28 | 1.5:1 | 3.72 | 29.0 | (0.681, 0.318) | 161 |
| Example 28 | 1-211:3-182 | 1.5:1 | 3.78 | 26.9 | (0.681, 0.318) | 162 |
| Example 29 | 1-214:4-337 | 3:1 | 3.65 | 28.5 | (0.681, 0.317) | 139 |
| Example 30 | 1-214:4-337 | 2:1 | 3.68 | 30.8 | (0.681, 0.317) | 145 |
| Example 31 | 1-214:4-337 | 1:1 | 3.72 | 27.7 | (0.681, 0.318) | 159 |
| Example 32 | 1-214:4-337 | 1:2 | 3.95 | 26.9 | (0.681, 0.318) | 187 |
| Example 33 | 1-214:4-337 | 1:3 | 4.01 | 25.9 | (0.681, 0.318) | 201 |
| Example 34 | 1-20:4-21 | 3:1 | 3.71 | 27.8 | (0.682, 0.318) | 138 |
| Example 35 | 1-20:4-21 | 2:1 | 3.76 | 30.1 | (0.681, 0.318) | 148 |
| Example 36 | 1-20:4-21 | 1:1 | 3.89 | 29.3 | (0.681, 0.318) | 169 |
| Example 37 | 1-20:4-21 | 1:2 | 3.97 | 27.5 | (0.681, 0.317) | 177 |
| Example 38 | 1-20:4-21 | 1:3 | 4.50 | 27.0 | (0.681, 0.318) | 185 |
| Example 39 | 1-25:4-126 | 3:1 | 3.68 | 26.7 | (0.682, 0.318) | 138 |
| Example 40 | 1-25:4-126 | 2:1 | 3.73 | 29.0 | (0.681, 0.317) | 148 |
| Example 41 | 1-25:4-126 | 1:1 | 3.86 | 28.2 | (0.681, 0.318) | 169 |
| Example 42 | 1-25:4-126 | 1:2 | 3.94 | 26.4 | (0.681, 0.317) | 177 |
| Example 43 | 1-25:4-126 | 1:3 | 4.21 | 26.1 | (0.681, 0.318) | 185 |
| Example 44 | 1-214:4-284 | 3:1 | 3.69 | 26.7 | (0.681, 0.318) | 135 |
| Example 45 | 1-214:4-284 | 2:1 | 3.81 | 28.0 | (0.682, 0.318) | 148 |
| Example 46 | 1-214:4-284 | 1:1 | 3.89 | 28.4 | (0.681, 0.317) | 171 |
| Example 47 | 1-214:4-284 | 1:2 | 4.01 | 25.3 | (0.681, 0.318) | 173 |
| Example 48 | 1-214:4-284 | 1:3 | 4.00 | 24.7 | (0.681, 0.317) | 178 |
| Example 49 | 1-194:4-337 | 2:1 | 3.71 | 28.7 | (0.681, 0.317) | 145 |
| Example 50 | 1-194:4-337 | 1:1 | 3.82 | 28.5 | (0.681, 0.318) | 168 |
| Example 51 | 1-194:4-337 | 1:2 | 3.92 | 26.3 | (0.681, 0.317) | 177 |
| Example 52 | 1-225:4-136 | 2:1 | 3.67 | 29.9 | (0.681, 0.317) | 179 |
| Example 53 | 1-225:4-136 | 1:1 | 3.68 | 30.0 | (0.681, 0.317) | 185 |
| Example 54 | 1-225:4-136 | 1:2 | 3.72 | 29.1 | (0.681, 0.318) | 188 |
| Example 55 | 1-33:4-21 | 1:1 | 3.59 | 30.1 | (0.681, 0.317) | 187 |
| Example 56 | 1-187:4-337 | 1:1 | 4.03 | 25.4 | (0.681, 0.318) | 173 |
| Example 57 | 1-198:4-126 | 1:1 | 3.74 | 29.0 | (0.681, 0.317) | 148 |
| Example 58 | 1-199:4-284 | 1:1 | 3.72 | 27.6 | (0.681, 0.318) | 162 |

A
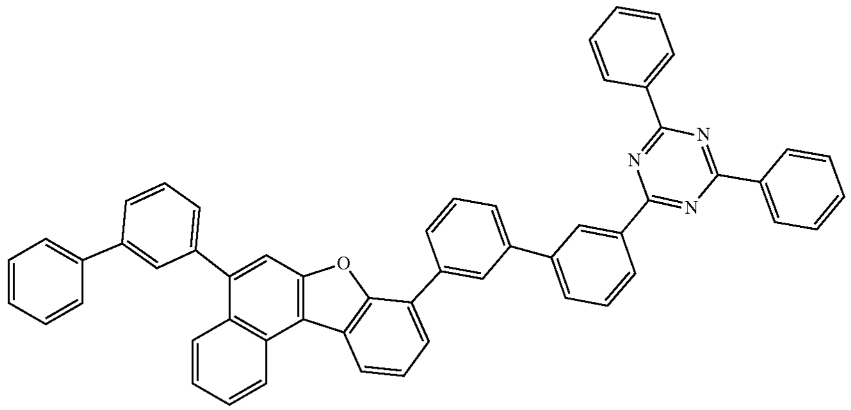
B
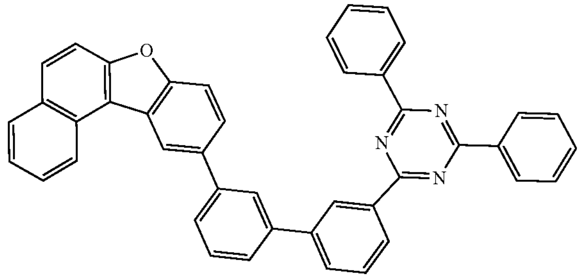
C
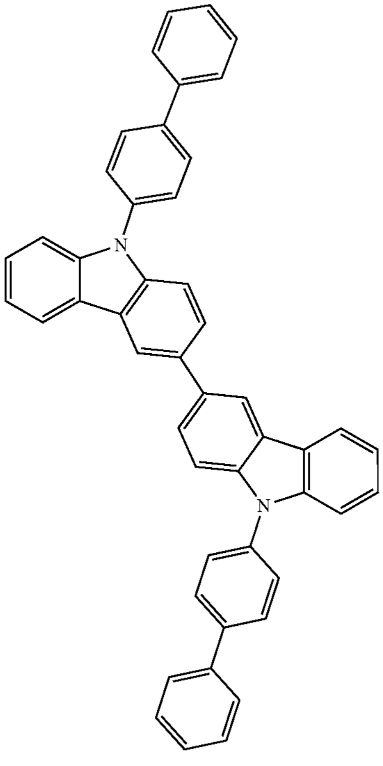

-continued

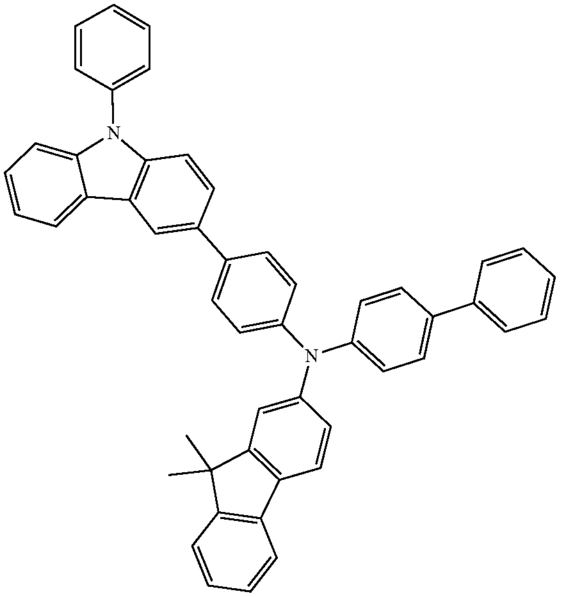

D

As seen from Table 13, it was identified that, when Compound (A) corresponding to Chemical Formula 1 and Compound (B) corresponding to Chemical Formula 2, 3 or 4 were combined and used in the light emitting layer of the light emitting device, superior effects were obtained in the properties of lifetime, efficiency and driving voltage compared to when Compound (A) corresponding to Chemical Formula 1 was used alone.

Particularly, Compound (A) of Chemical Formula 1 provides proper energy level and thermal stability to the device by directly substituting one side benzene ring of a naphthobenzofuran structure with an aryl group and a triazine group, and it was identified that an organic light emitting device with improved lifetime, driving stability and efficiency was manufactured using Compound (A) of Chemical Formula 1.

When including N+P compounds in an organic material layer of an organic light emitting device, superior results may be obtained in efficiency and lifetime by an occurrence of an exciplex phenomenon. The exciplex phenomenon of N+P compounds is a phenomenon of releasing energy having sizes of a donor (P-host) HOMO level and an acceptor (N-host) LUMO level due to electron exchanges between two molecules. When a donor (P-host) having a favorable hole transfer ability and an acceptor (N-host) having a favorable electron transfer ability are used as a host of a light emitting layer, holes are injected to the P-host and electrons are injected to the N-host, and therefore, a driving voltage may be lowered, which resultantly helps with enhancement in the lifetime.

The invention claimed is:

1. An organic light emitting device comprising:

a first electrode;

a second electrode and one or more organic material layers provided between the first electrode and the second electrode, wherein one or more layers of the organic material layers include Compound (A) represented by the following Chemical Formula 1 and Compound (B) represented by any one of the following Chemical Formulae 2 to 4:

[Chemical Formula 1]

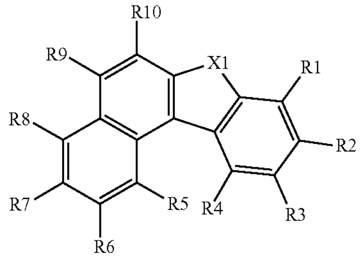

in Chemical Formula 1,

X1 is O; S; or NR;

R1 to R10 are each independently selected from the group consisting of hydrogen; deuterium; a halogen group; a cyano group; a substituted or unsubstituted alkyl group having 1 to 60 carbon atoms; a substituted or unsubstituted alkenyl group having 2 to 60 carbon atoms; a substituted or unsubstituted alkynyl group having 2 to 60 carbon atoms; a substituted or unsubstituted alkoxy group having 1 to 60 carbon atoms; a substituted or unsubstituted cycloalkyl group having 3 to 60 carbon atoms; a substituted or unsubstituted heterocycloalkyl group having 2 to 60 carbon atoms; a substituted or unsubstituted aryl group having 6 to 60 carbon atoms; a substituted or unsubstituted heteroaryl group having 2 to 60 carbon atoms; a substituted or unsubstituted phosphine oxide group; and a substituted or unsubstituted amine group, or adjacent two or more groups bond to form a substituted or unsubstituted ring;

at least one of R1 to R10 is —N-Het, and at least one of the rest of R1 to R10 is $-(L)_m-Ar$;

L is a direct bond; a substituted or unsubstituted arylene group having 6 to 60 carbon atoms; or a substituted or unsubstituted heteroarylene group having 2 to 60 carbon atoms;

Ar is a substituted or unsubstituted aryl group having 6 to 60 carbon atoms; a substituted or unsubstituted heteroaryl group having 2 to 60 carbon atoms; or a substituted or unsubstituted amine group;

N-Het is a monocyclic or polycyclic heteroaryl group having 2 to 60 carbon atoms substituted or unsubstituted, and including one or more Ns;

R is a substituted or unsubstituted aryl group having 6 to 60 carbon atoms;

m is an integer of 1 to 5; and when m is an integer of 2 or greater, substituents in the parentheses are the same as or different from each other,

[Chemical Formula 2]

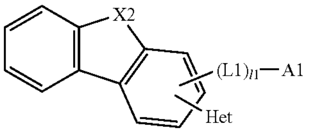

[Chemical Formula 3]

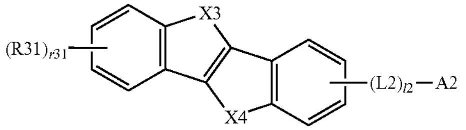

[Chemical Formula 4]

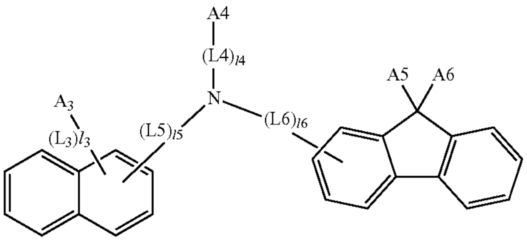

in Chemical Formulae 2 to 4,

X2 is O or S;

X3 and X4 are each independently O; S; or CR'R";

L1 to L6 are each independently a direct bond; a substituted or unsubstituted arylene group having 6 to 60 carbon atoms; or a substituted or unsubstituted heteroarylene group having 2 to 60 carbon atoms;

l1 to l6 are each independently an integer of 1 to 5;

A1 to A4 are each independently a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; a substituted or unsubstituted heteroaryl group having 2 to 60 carbon atoms; or a substituted or unsubstituted amine group;

A5 and A6 are each independently hydrogen; deuterium; a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; or a substituted or unsubstituted heteroaryl group having 2 to 60 carbon atoms, or A5 and A6 bond to form a substituted or unsubstituted ring;

R', R" and R31 are each independently hydrogen; deuterium; a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; or a substituted or unsubstituted heteroaryl group having 2 to 60 carbon atoms;

Het is a substituted or unsubstituted aryl group having 6 to 60 carbon atoms; or a substituted or unsubstituted heteroaryl group having 2 to 60 carbon atoms;

r31 is an integer of 1 to 4; and when l1 to l6 and r31 are each 2 or greater, substituents in the parentheses are the same as or different from each other.

2. The organic light emitting device of claim 1, wherein Chemical Formula 1 is represented by the following Chemical Formula 1-1:

[Chemical Formula 1-1]

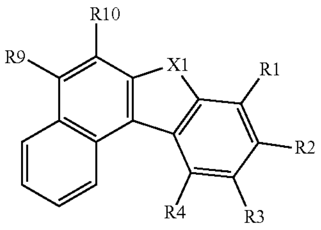

in Chemical Formula 1-1,

X1, R1 to R4, R9 and R10 each have the same definitions as in Chemical Formula 1;

any one of R1 to R4 is —N-Het or $-(L)_m$-Ar;

i) when any one of R1 to R4 is —N-Het, any one of R9 and R10 is $-(L)_m$-Ar;

ii) when any one of R1 to R4 is $-(L)_m$-Ar, any one of R9 and R10 is —N-Het; and N-Het, L, Ar and m each have the same definitions as in Chemical Formula 1.

3. The organic light emitting device of claim 1, wherein Chemical Formula 2 is represented by the following Chemical Formula 2-1:

[Chemical Formula 2-1]

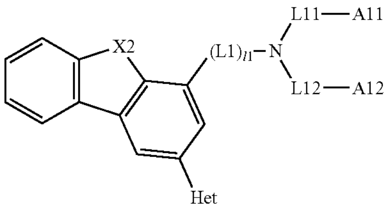

In Chemical Formula 2-1,

X2, Het, L1 and l1 have the same definitions as in Chemical Formula 2;

L11 and L12 are each independently a direct bond; a substituted or unsubstituted arylene group having 6 to 60 carbon atoms; or a substituted or unsubstituted heteroarylene group having 2 to 60 carbon atoms; and A11 and A12 are each independently a substituted or unsubstituted aryl group having 6 to 60 carbon atoms; or a substituted or unsubstituted heteroaryl group having 2 to 60 carbon atoms.

4. The organic light emitting device of claim 1, wherein Chemical Formula 3 is represented by the following Chemical Formula 3-1:

[Chemical Formula 3-1]

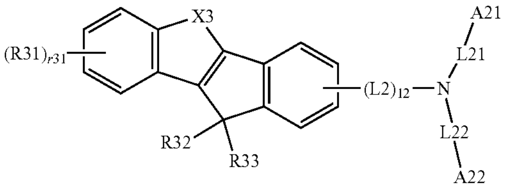

in Chemical Formula 3-1,

X3, R31, r31, L2 and l2 have the same definitions as in Chemical Formula 3;

L21 and L22 are each independently a direct bond; a substituted or unsubstituted arylene group having 6 to 60 carbon atoms; or a substituted or unsubstituted heteroarylene group having 2 to 60 carbon atoms;

A21 and A22 are each independently a substituted or unsubstituted aryl group having 6 to 60 carbon atoms; or a substituted or unsubstituted heteroaryl group having 2 to 60 carbon atoms; and R32 and R33 are each independently a substituted or unsubstituted alkyl group having 1 to 60 carbon atoms; or a substituted or unsubstituted aryl group having 6 to 60 carbon atoms.

5. The organic light emitting device of claim 1, wherein Chemical Formula 4 is represented by the following Chemical Formula 4-1:

[Chemical Formula 4-1]

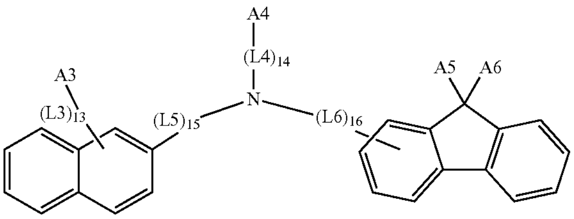

in Chemical Formula 4-1, each substituent has the same definition as in Chemical Formula 4.

6. The organic light emitting device of claim 1, wherein Chemical Formula 1 is represented by any one of the following compounds:

1-1

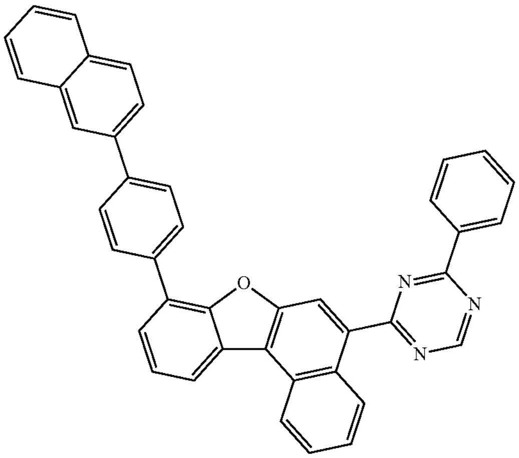

1-2

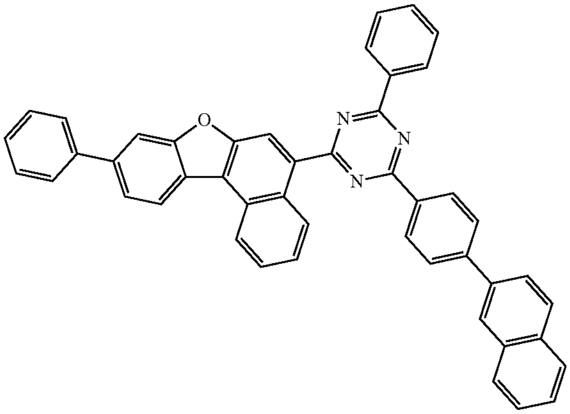

1-3

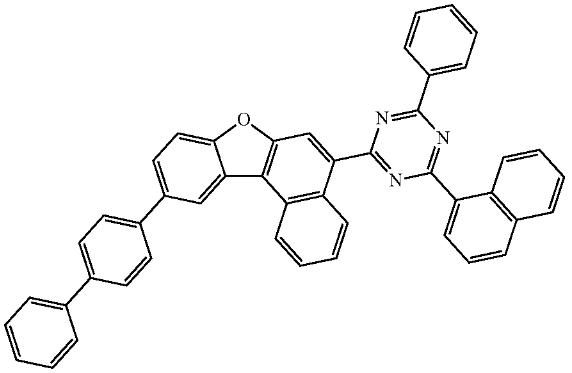

1-4

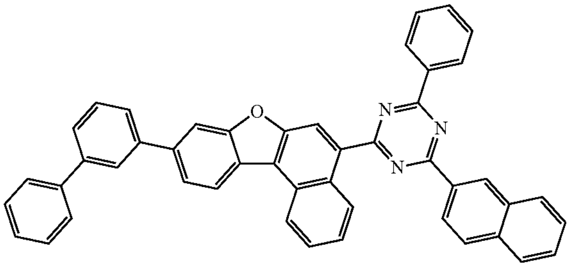

-continued
1-5
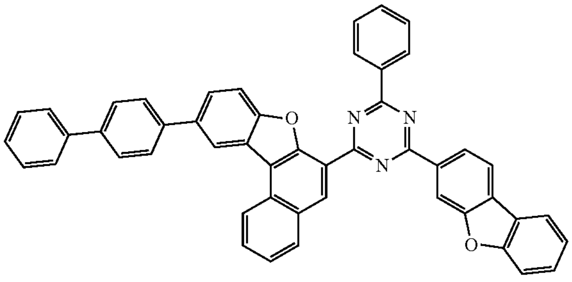
1-6
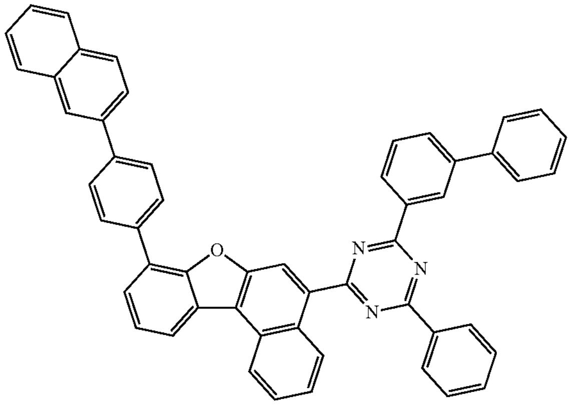
1-7
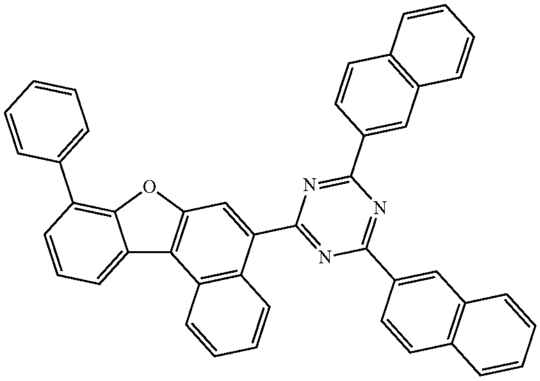
1-8
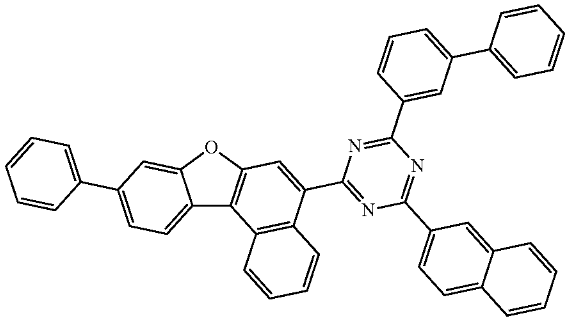
1-9
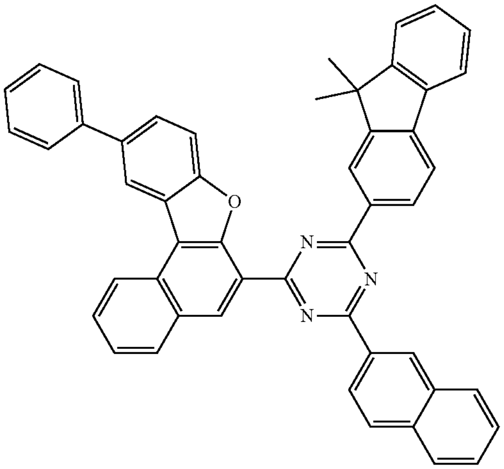
1-10
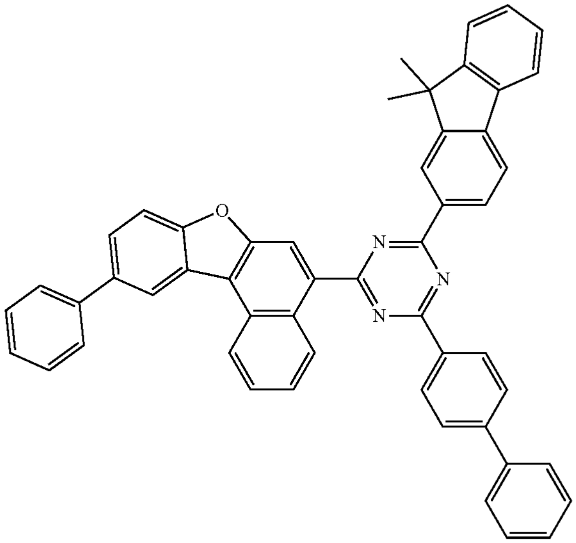

-continued
1-11
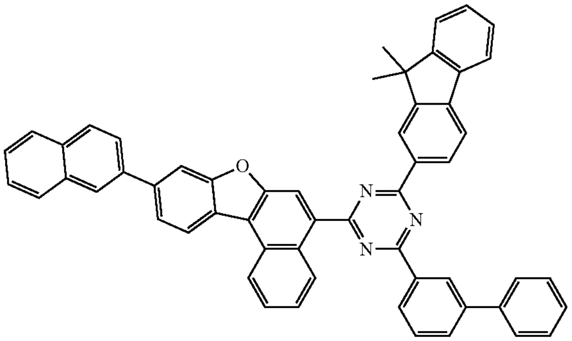
1-12
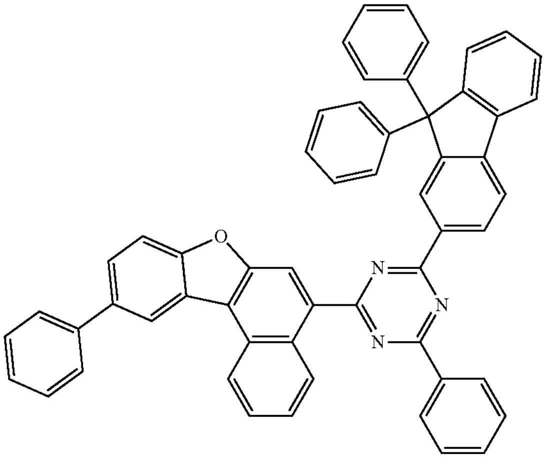
1-13
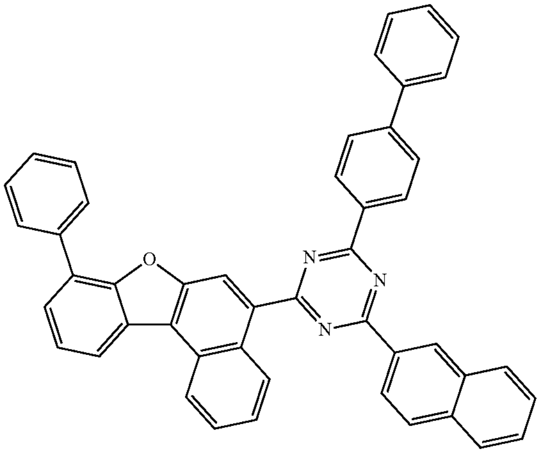
1-14
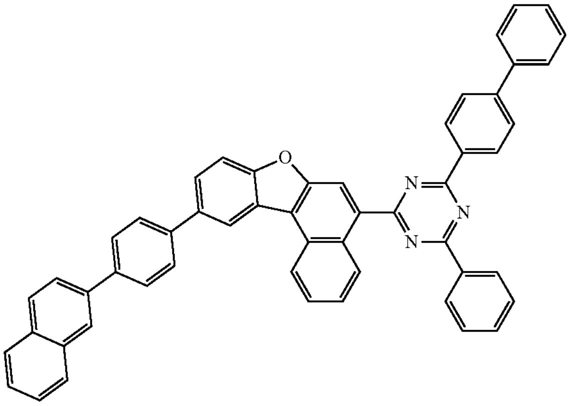
1-15
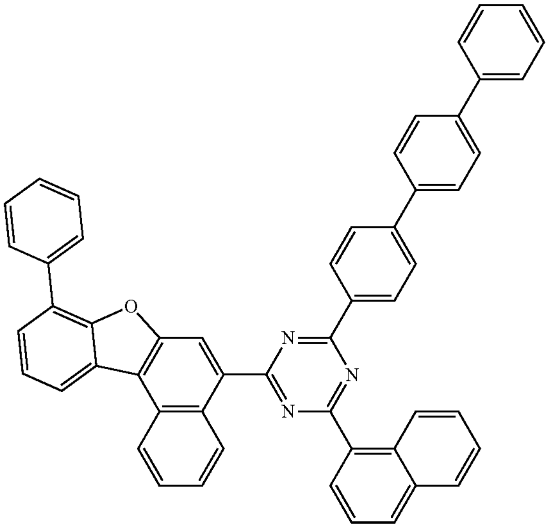
1-16
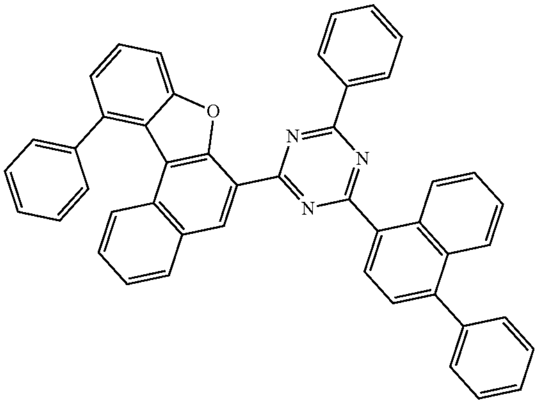

-continued
1-17
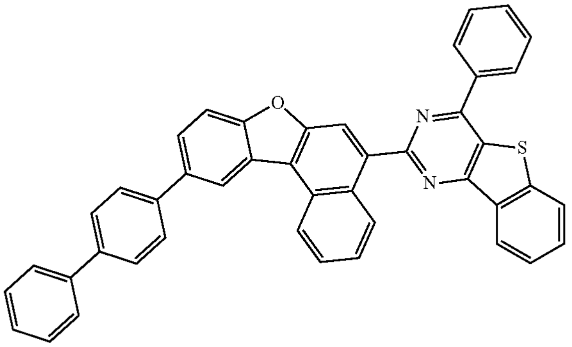
1-18
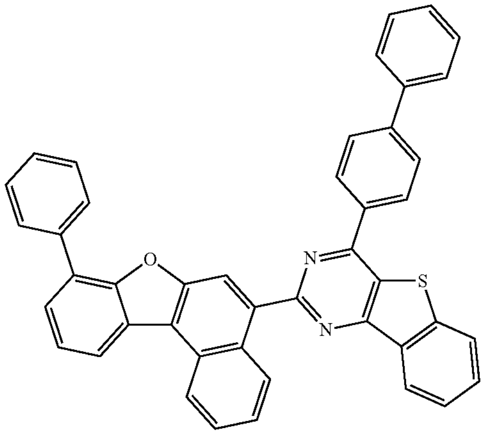
1-19
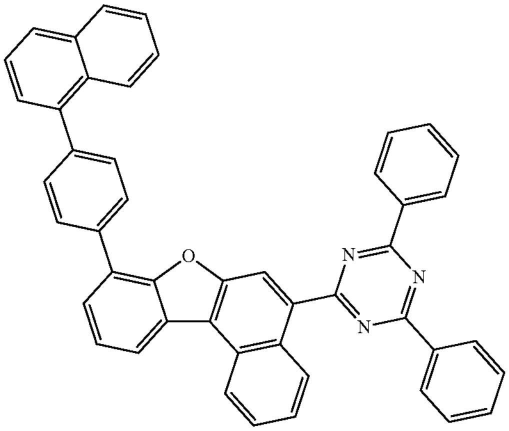
1-20
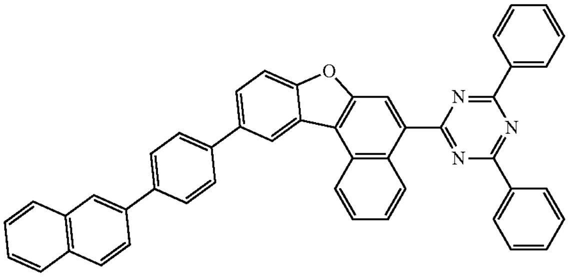
1-21
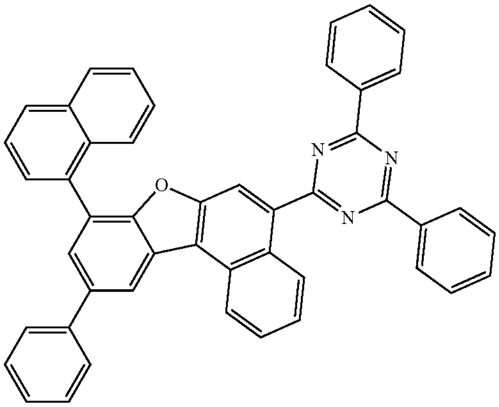
1-22
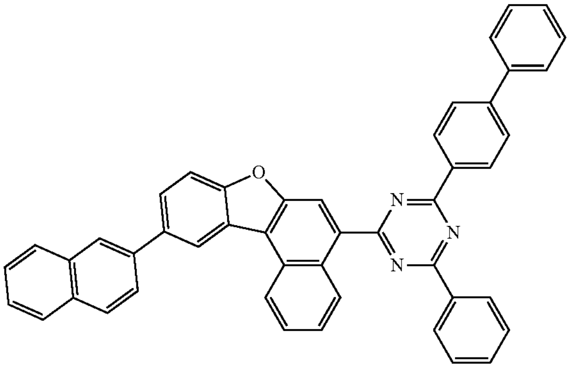

-continued
1-23
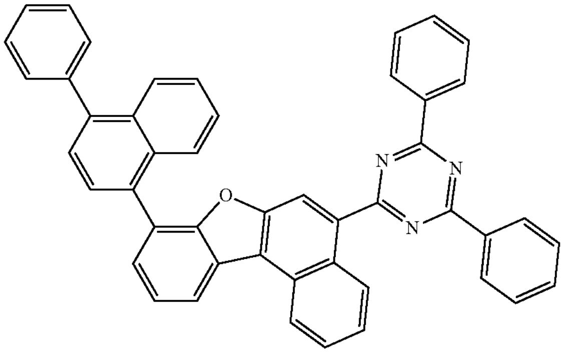
1-24
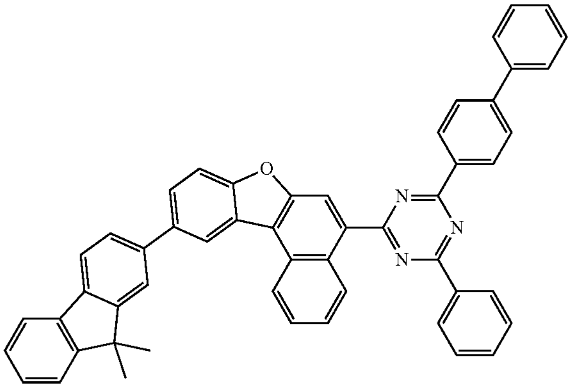
1-25
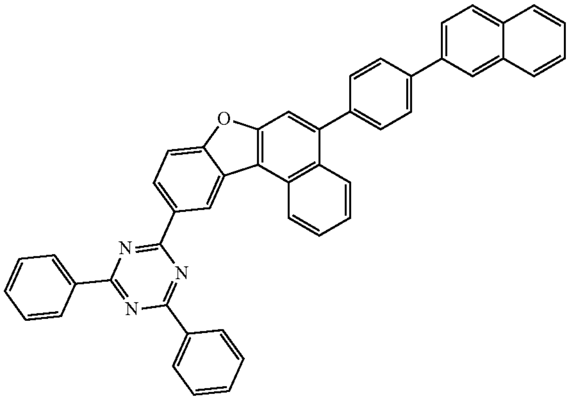
1-26
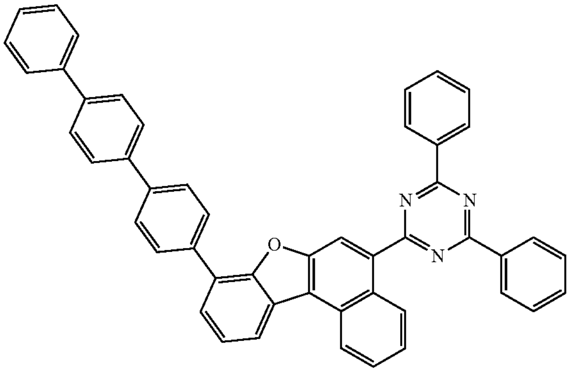
1-27
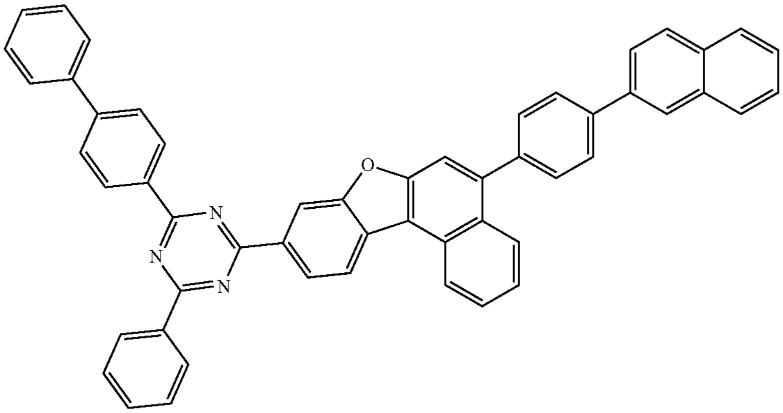

-continued
1-28
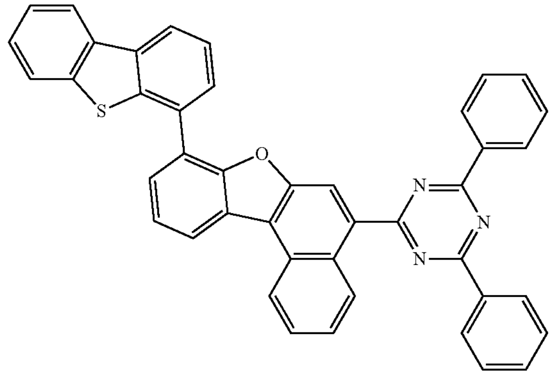
1-29
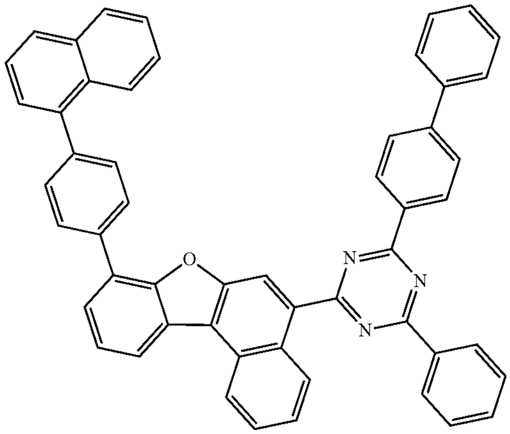
1-30
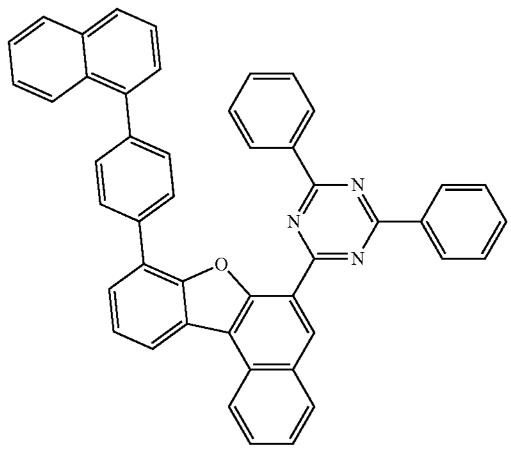
1-31
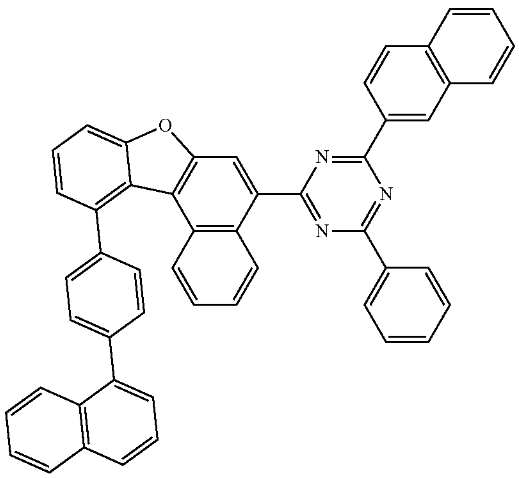
1-32
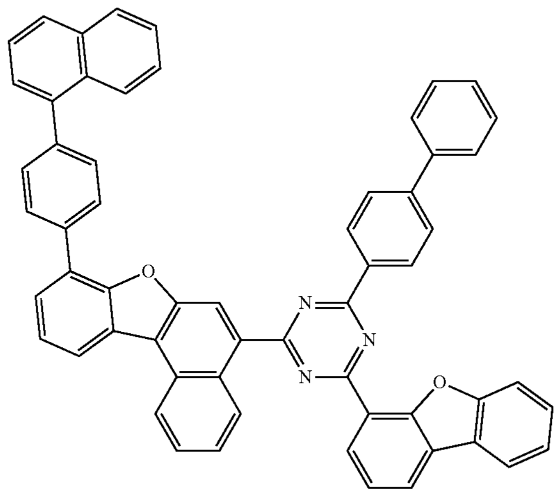
1-33
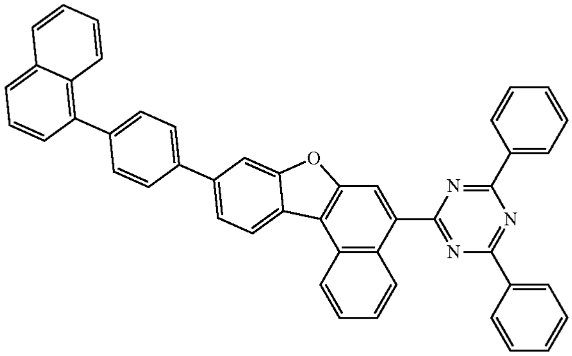

-continued
1-34
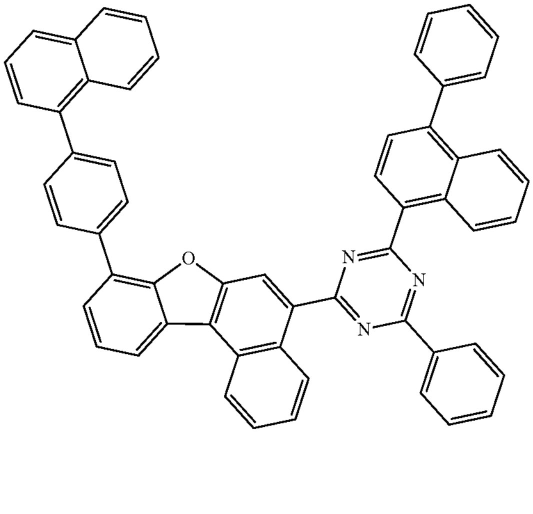
1-35
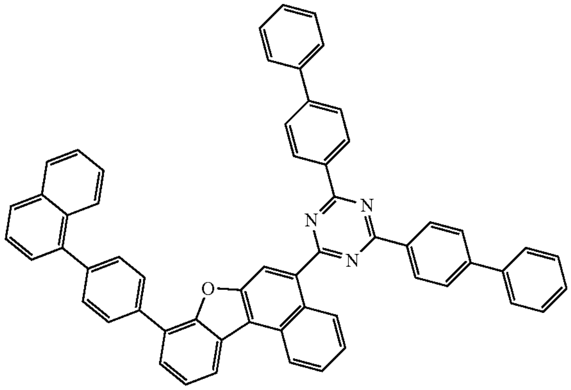
1-36
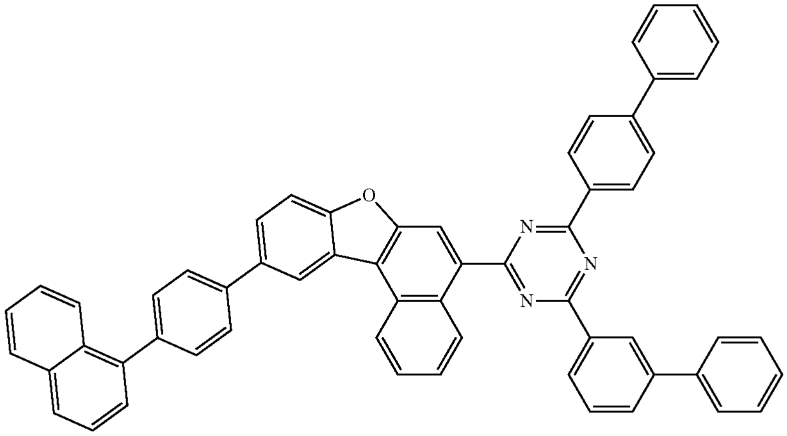
1-37
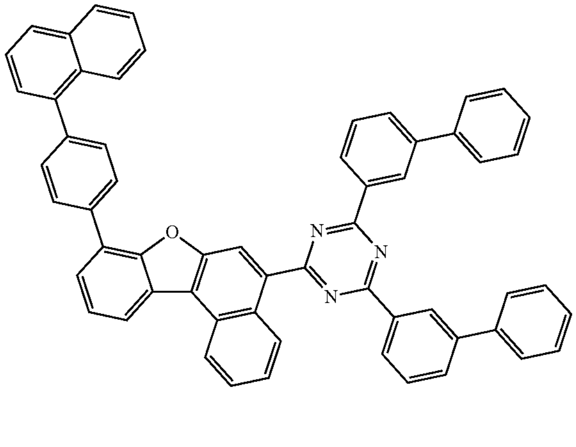
1-38
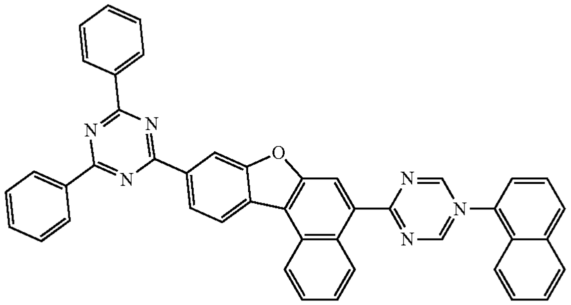

-continued
1-39
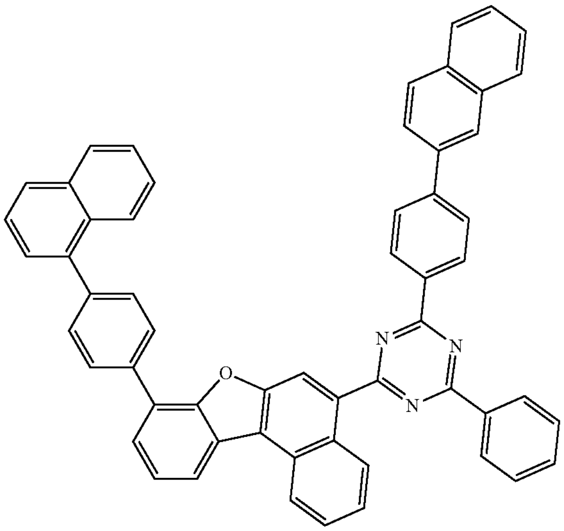
1-40
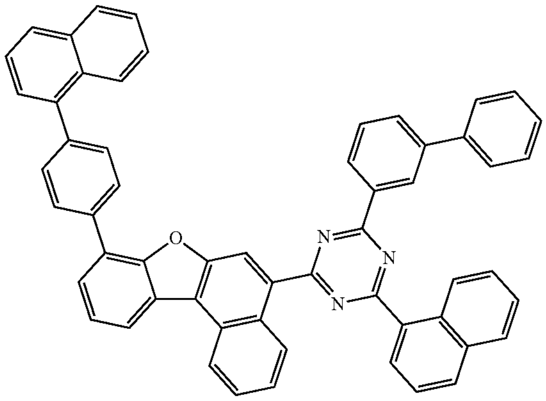
1-41
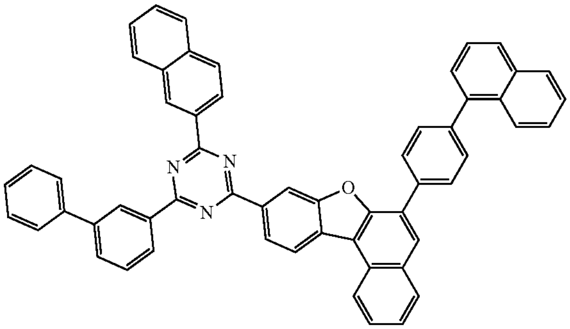
1-42
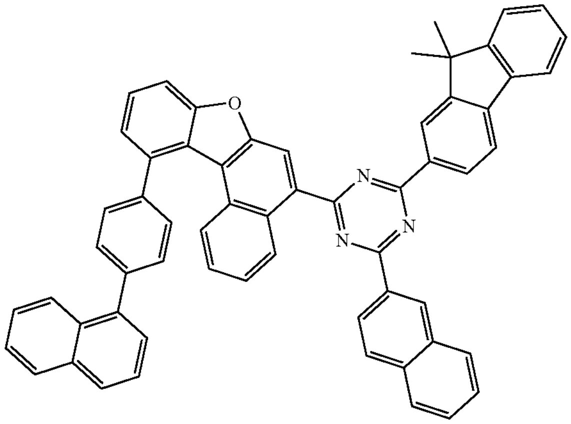
1-43
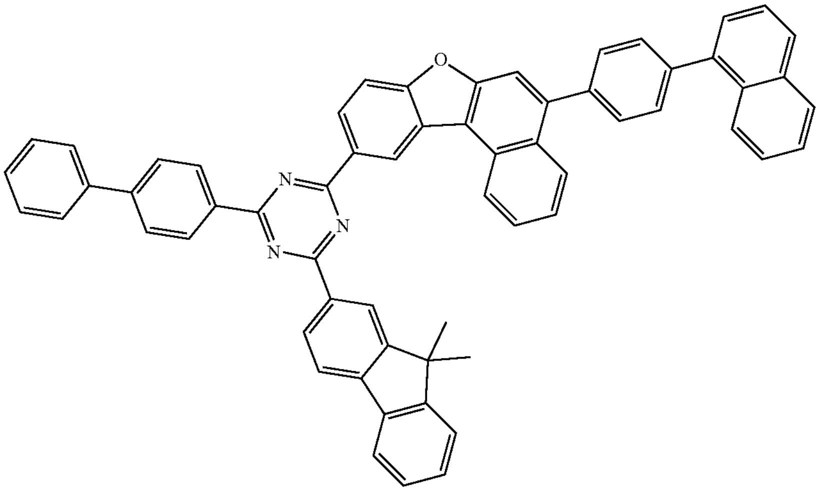

-continued
1-44
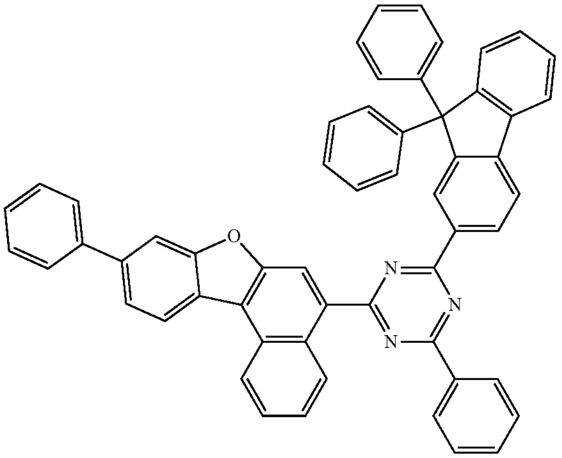
1-45
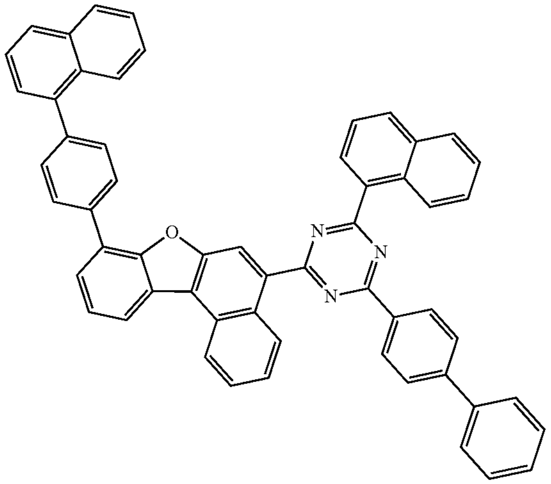
1-46
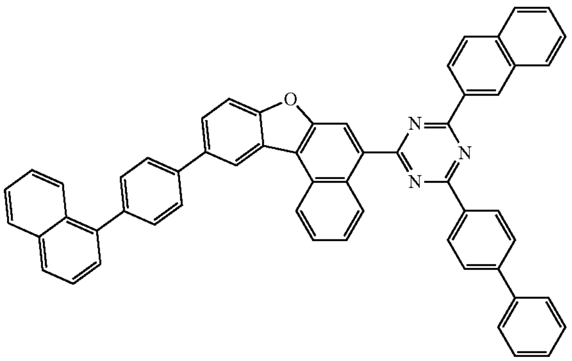
1-47
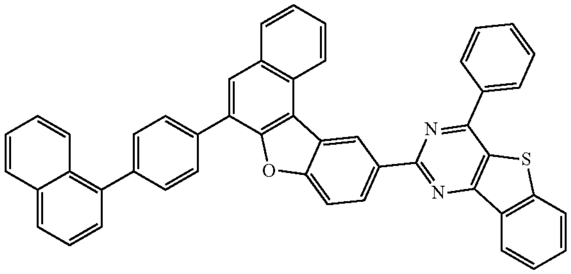
1-48
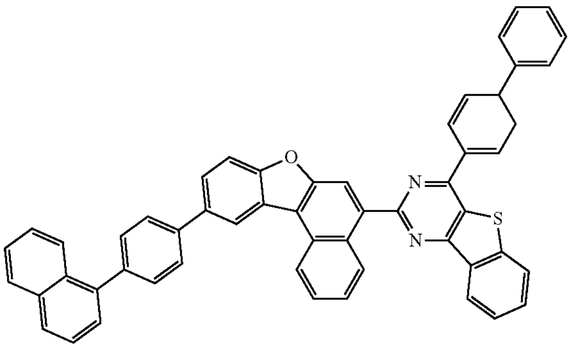
1-49
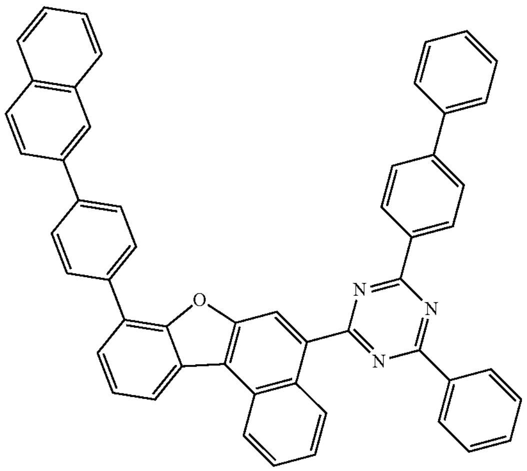

-continued
1-50
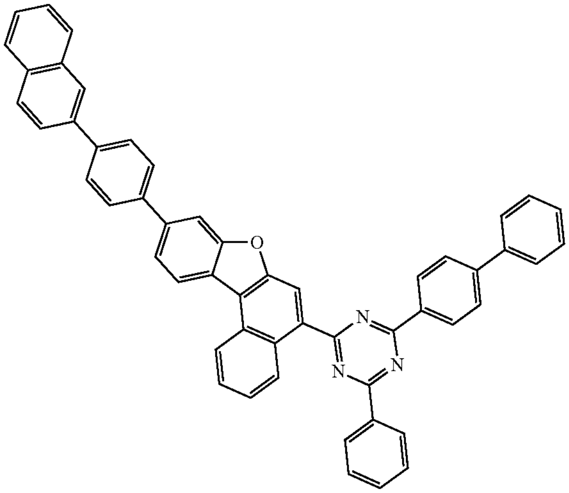
1-51
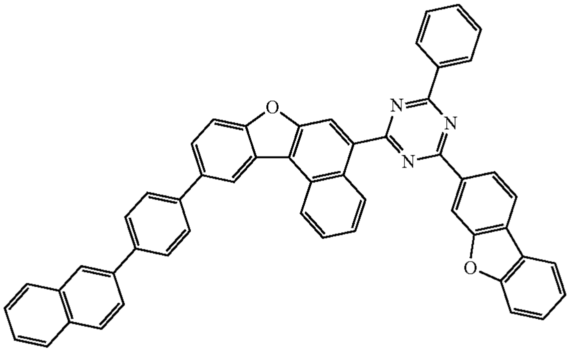
1-52
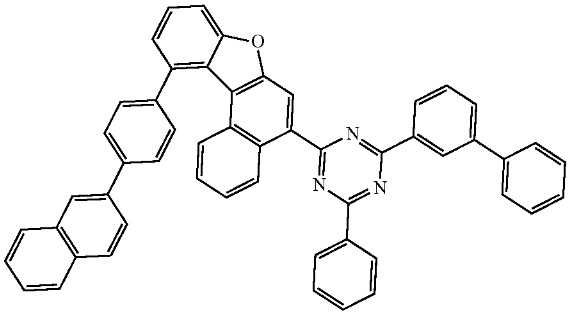
1-53
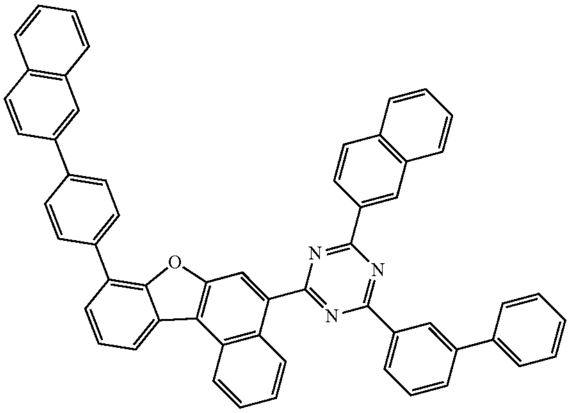
1-54
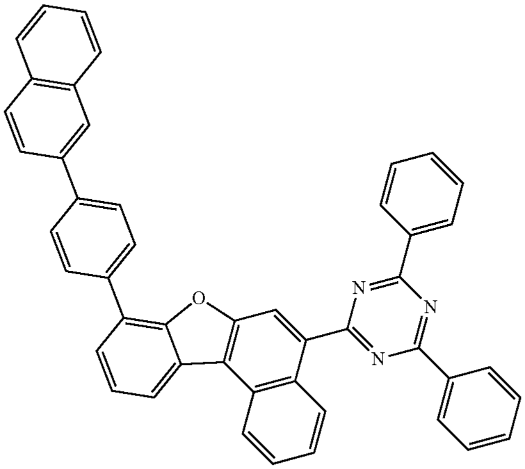
1-55
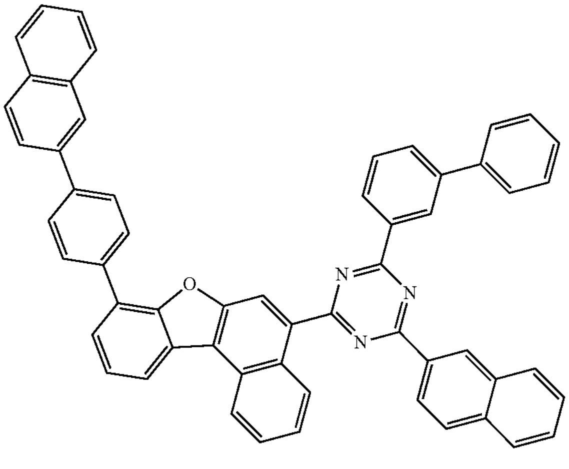

-continued
1-56
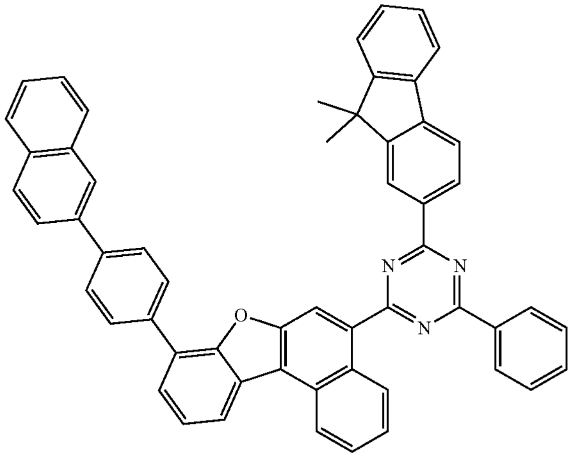
1-57
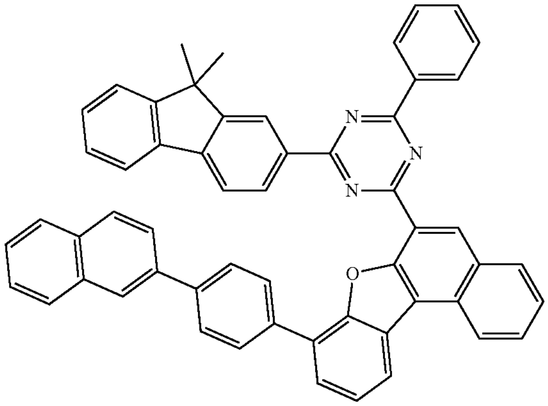
1-58
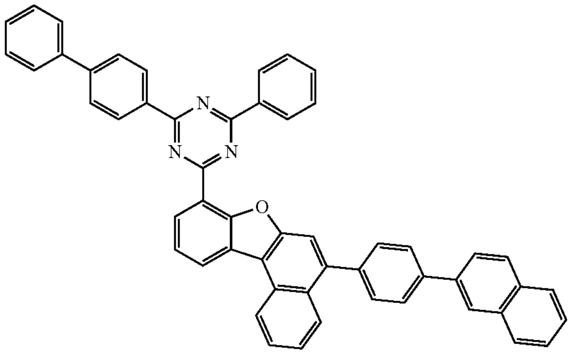
1-59
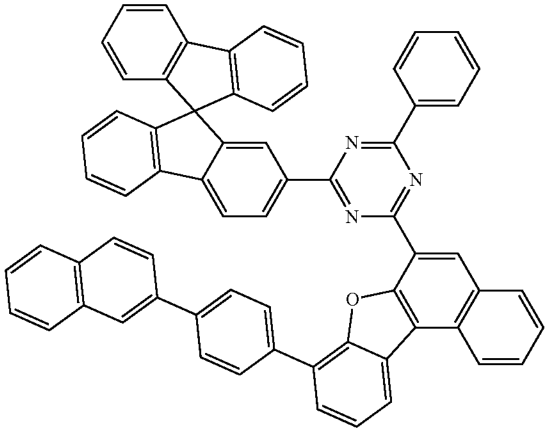
1-60
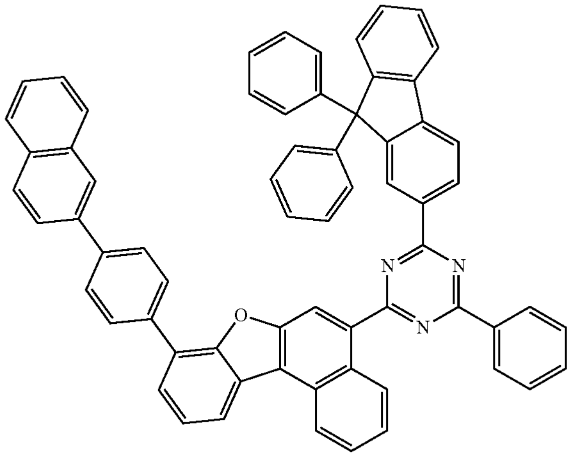
1-61
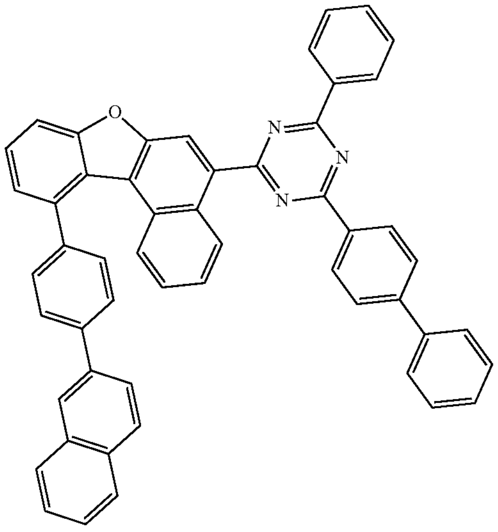

-continued
1-62
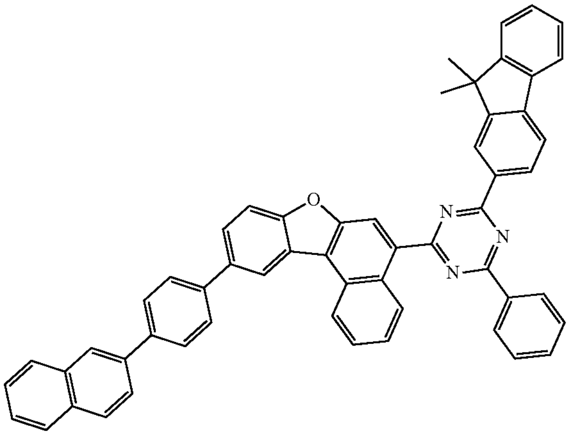
1-63
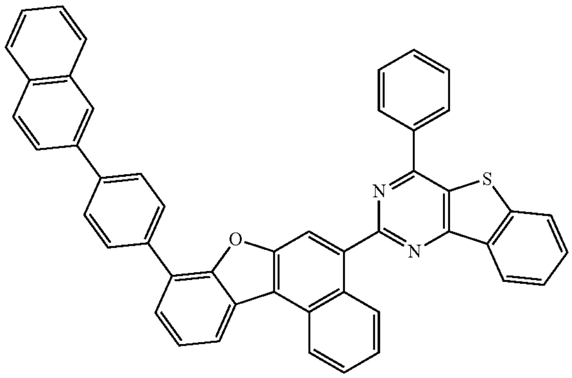
1-64
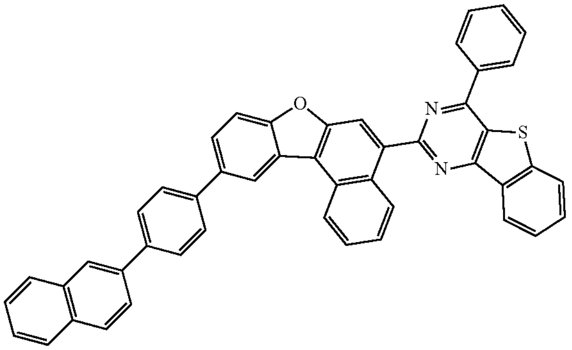
1-65
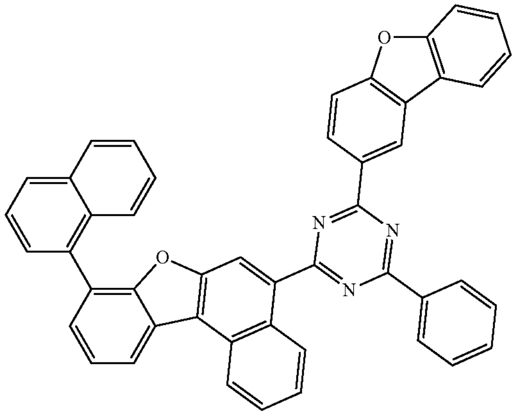
1-66
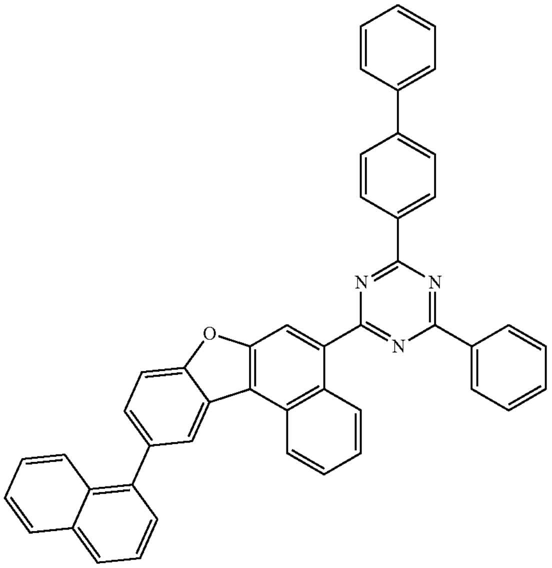
1-67
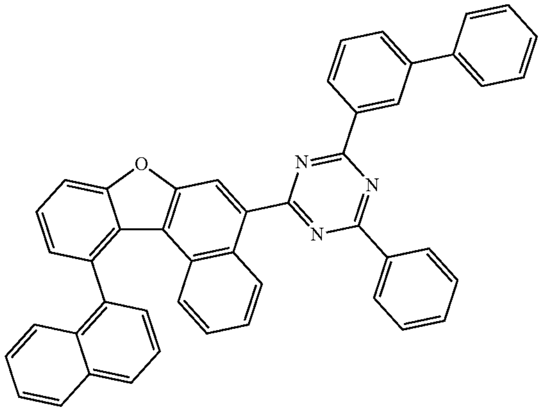

-continued
1-68
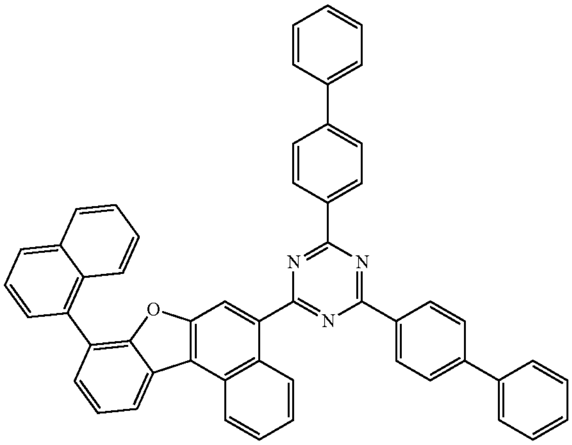
1-69
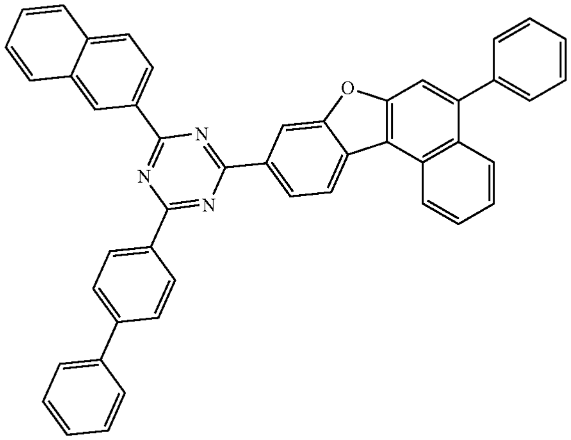
1-70
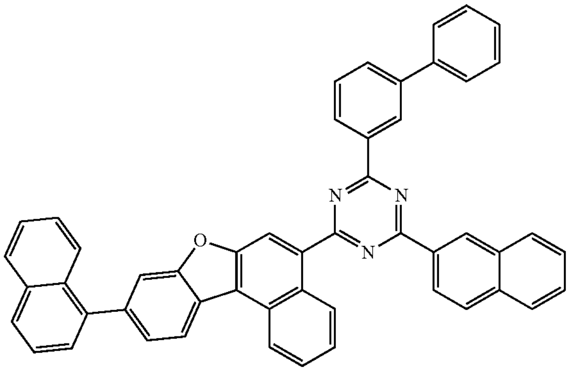
1-71
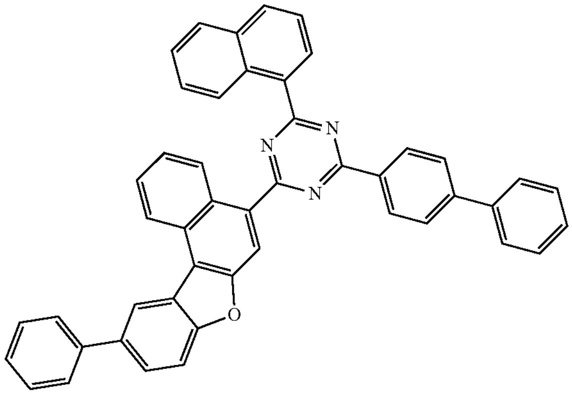
1-72
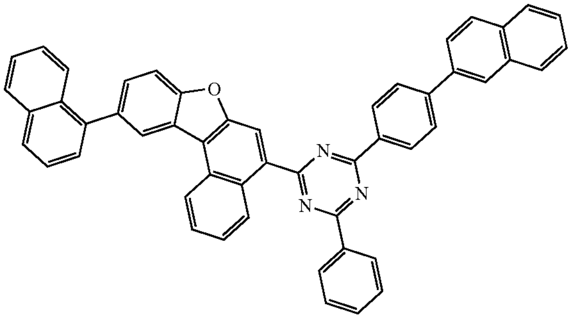
1-73
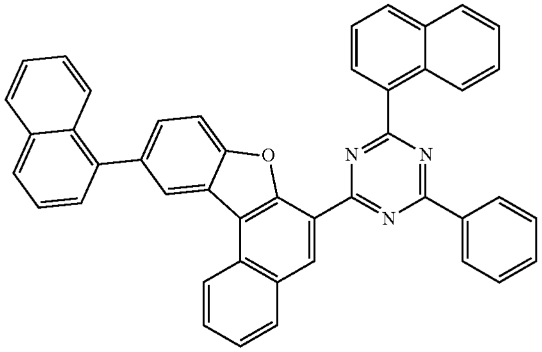

-continued
1-74
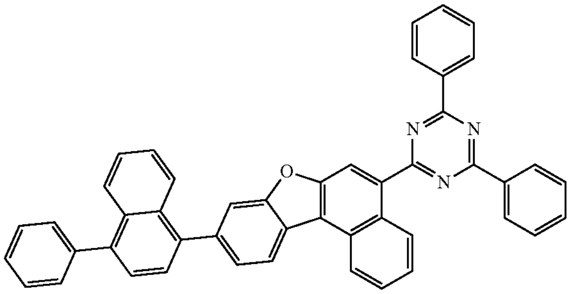
1-75
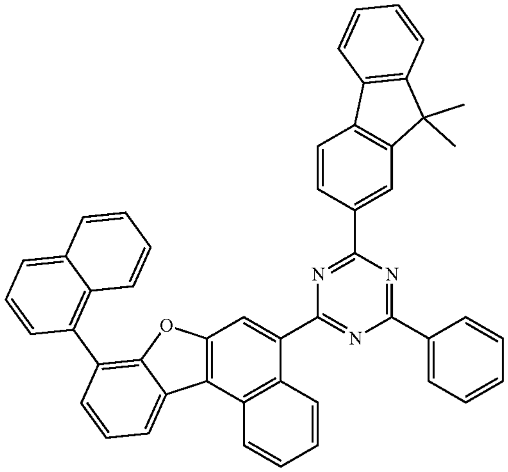
1-76
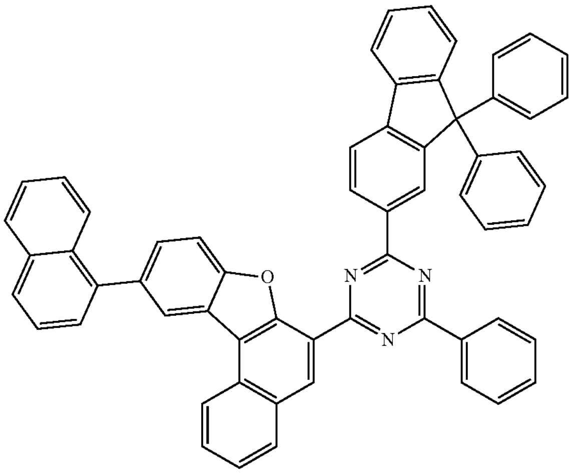
1-77
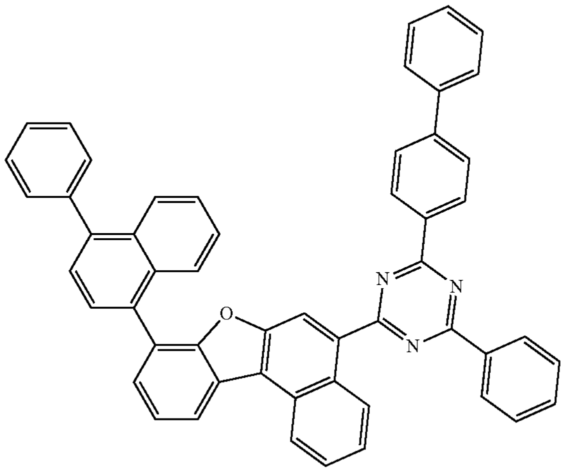
1-78
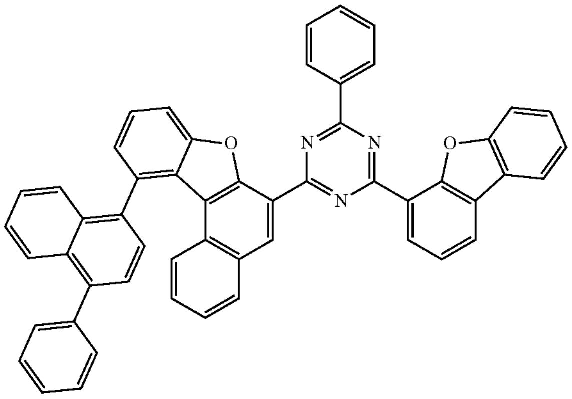
1-79
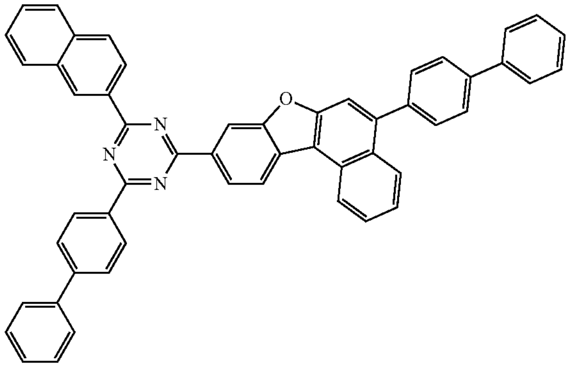

-continued
1-80
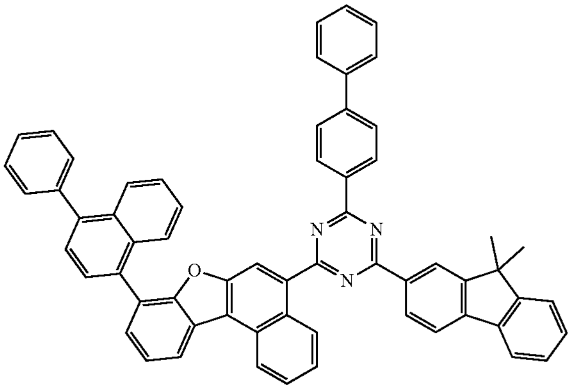
1-81
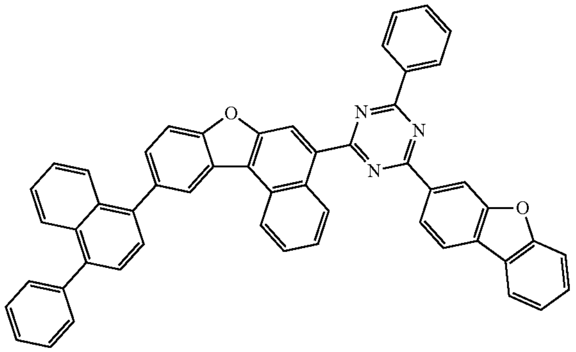
1-82
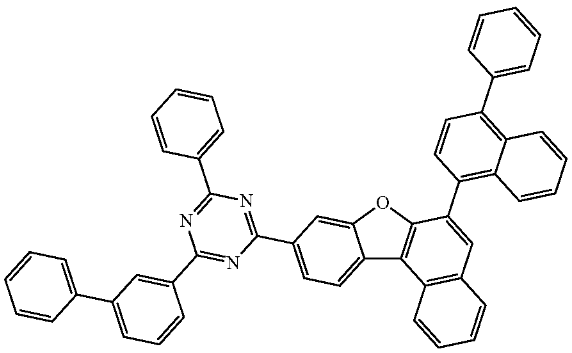
1-83
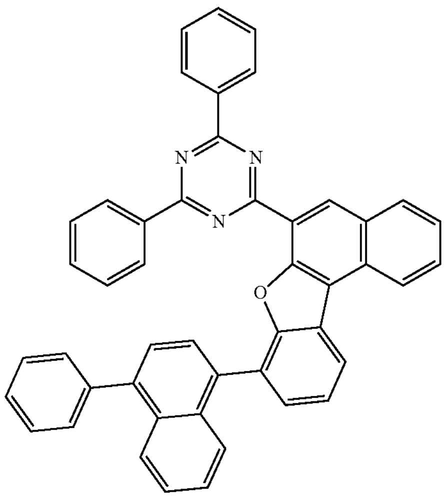
1-84
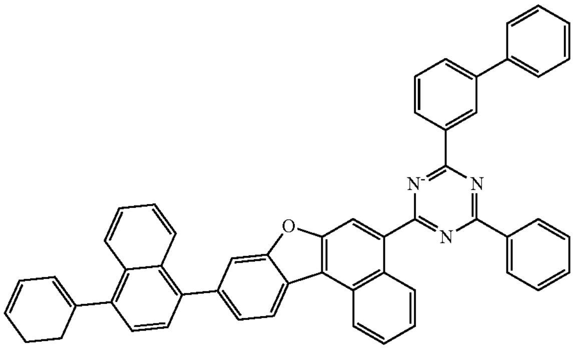
1-85
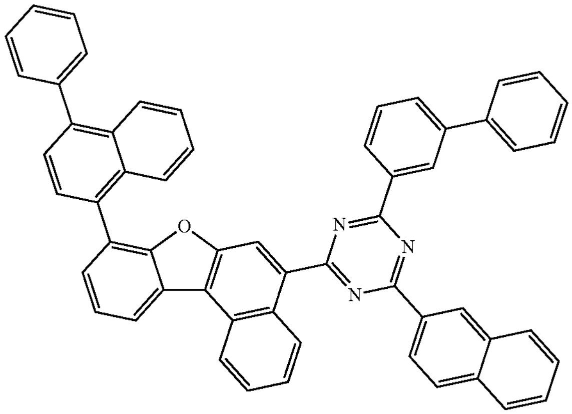

-continued
1-86
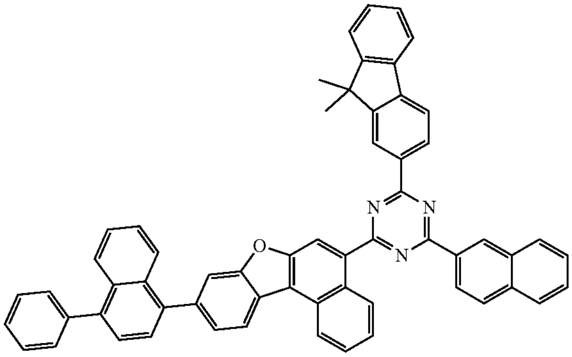
1-87
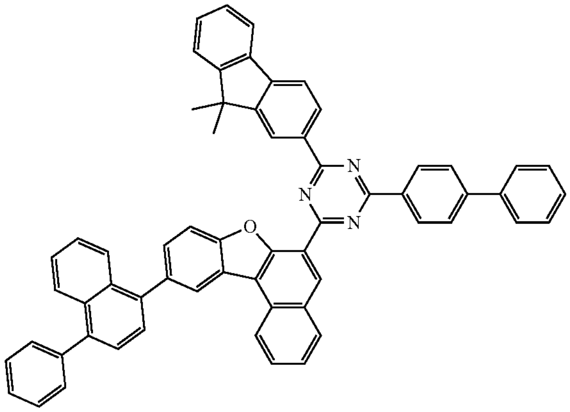
1-88
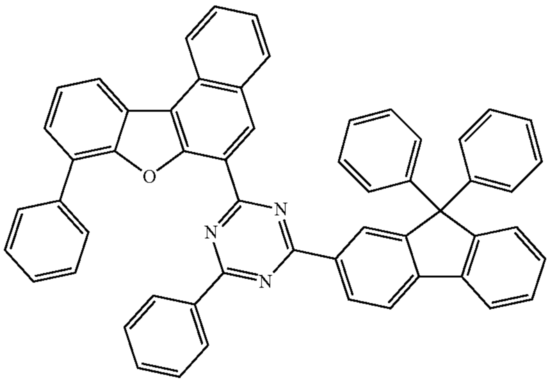
1-89
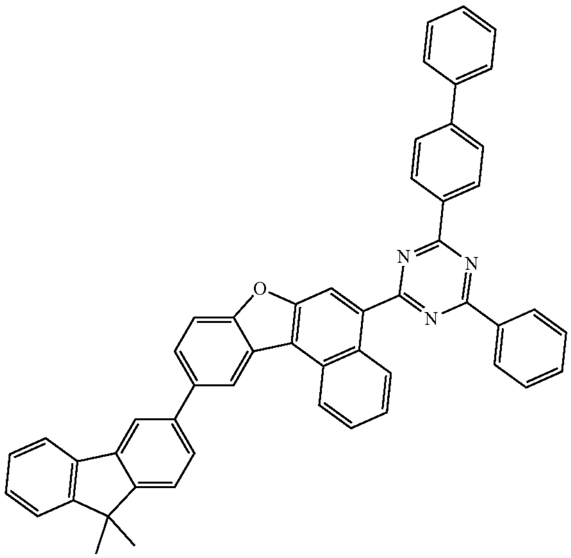
1-90
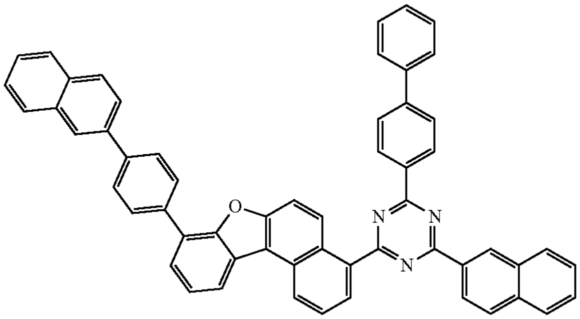
1-91
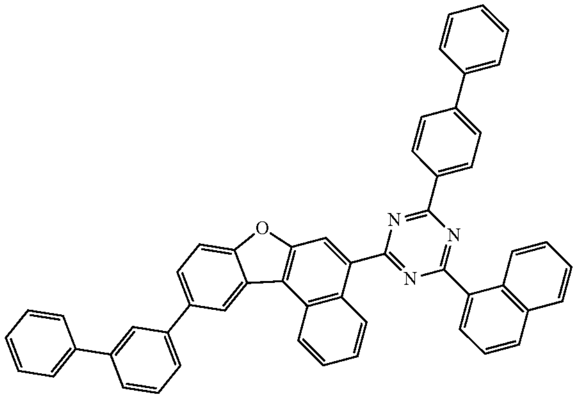

-continued
1-92
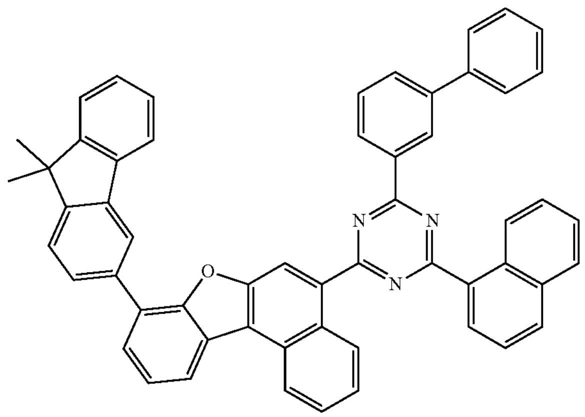
1-93
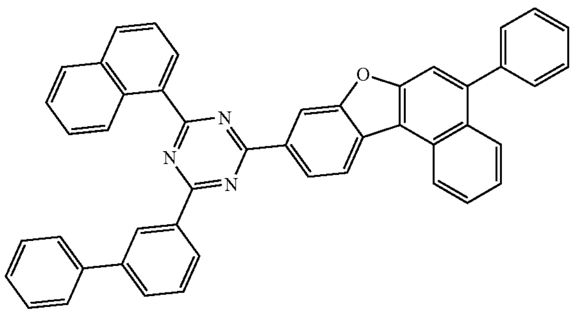
1-94
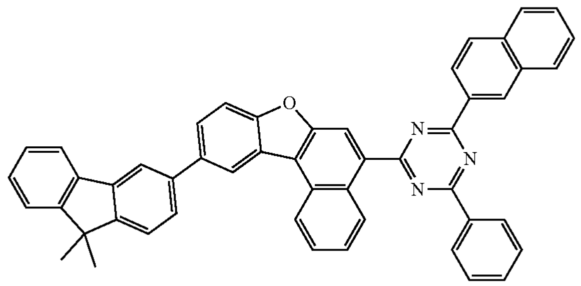
1-95
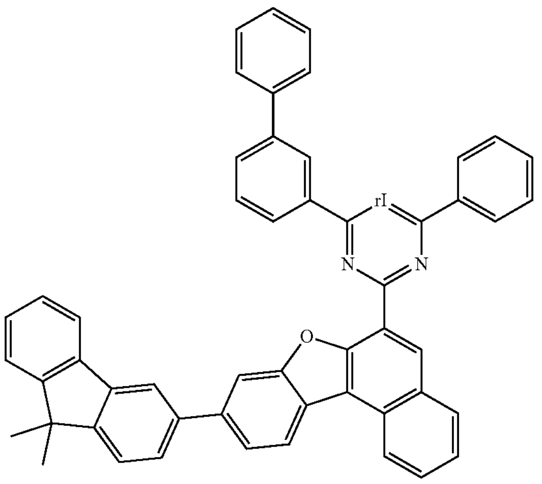
1-96
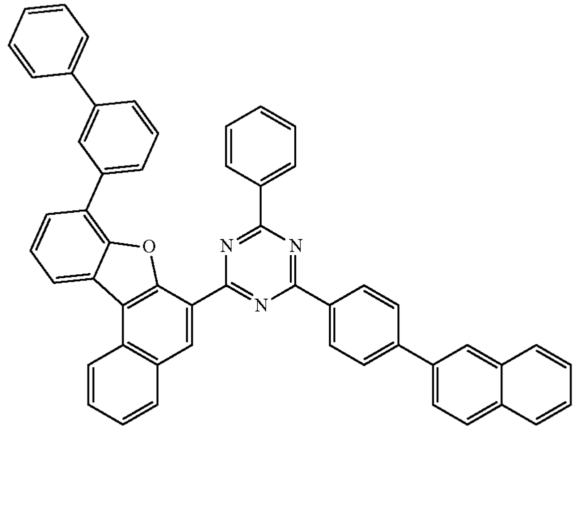
1-97
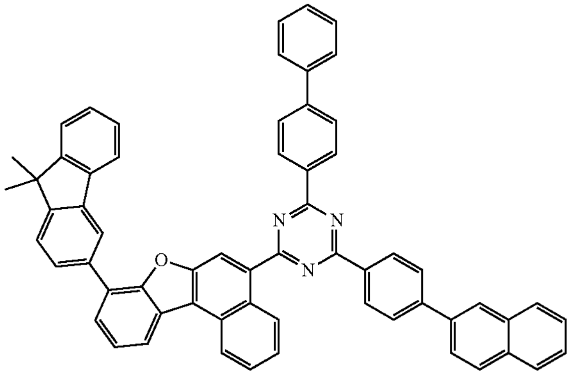

-continued
1-98
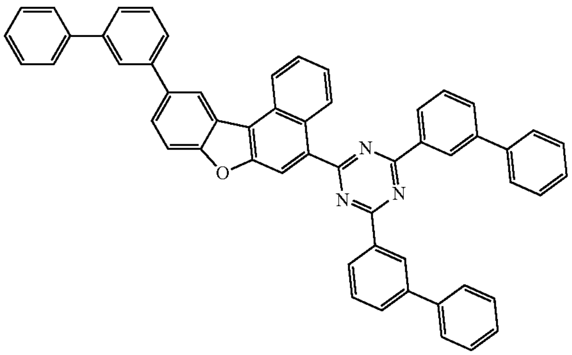
1-99
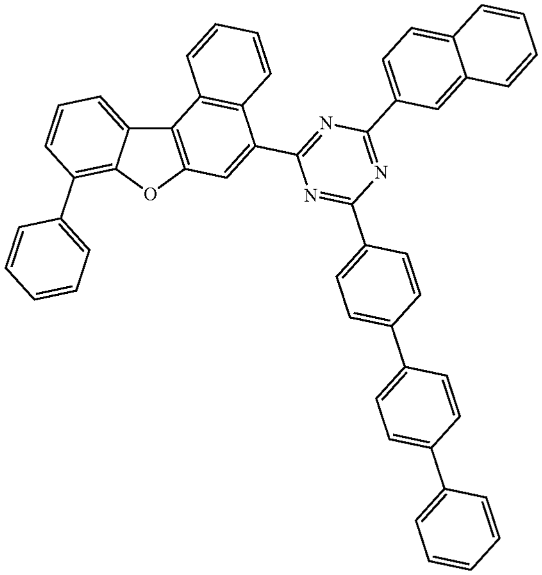
1-100
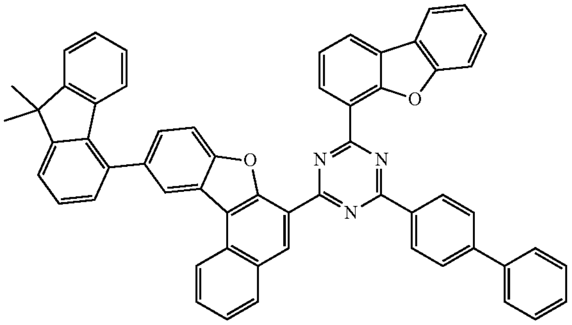
1-101
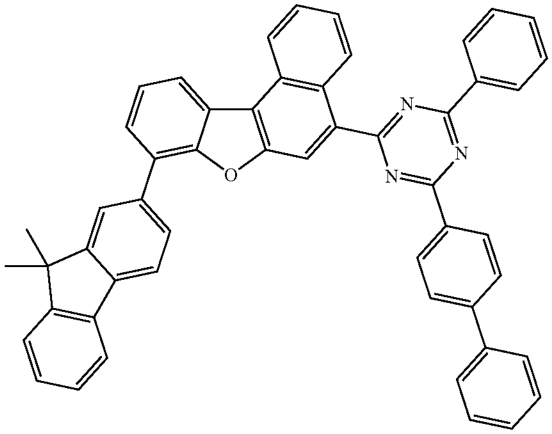
1-102
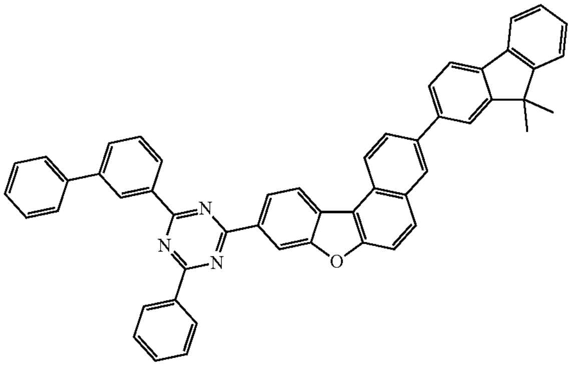
1-103
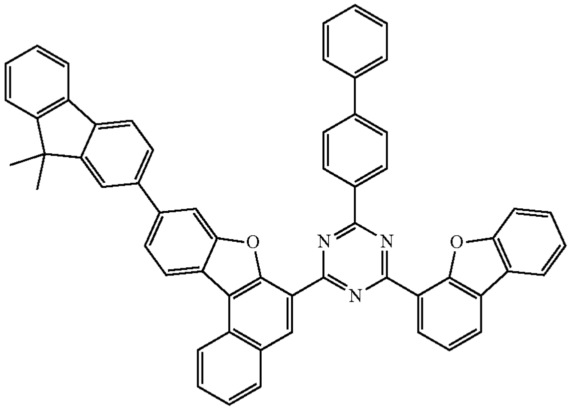

-continued
1-104
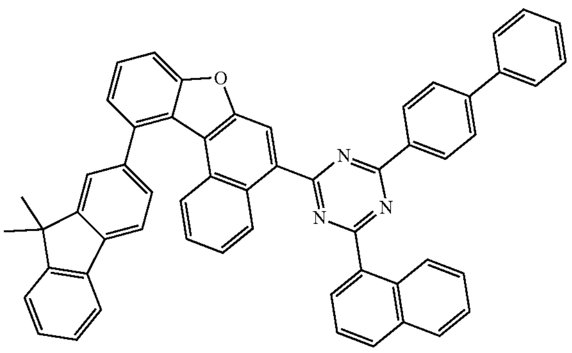
1-105
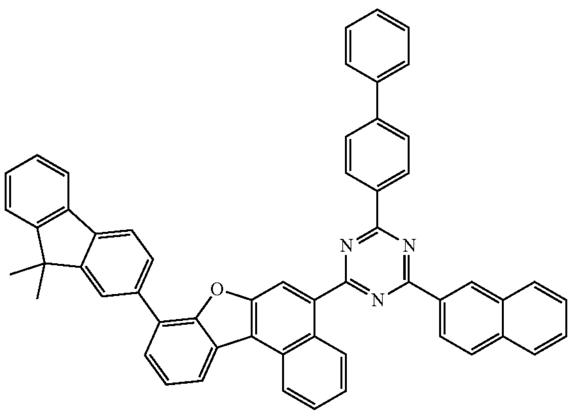
1-106
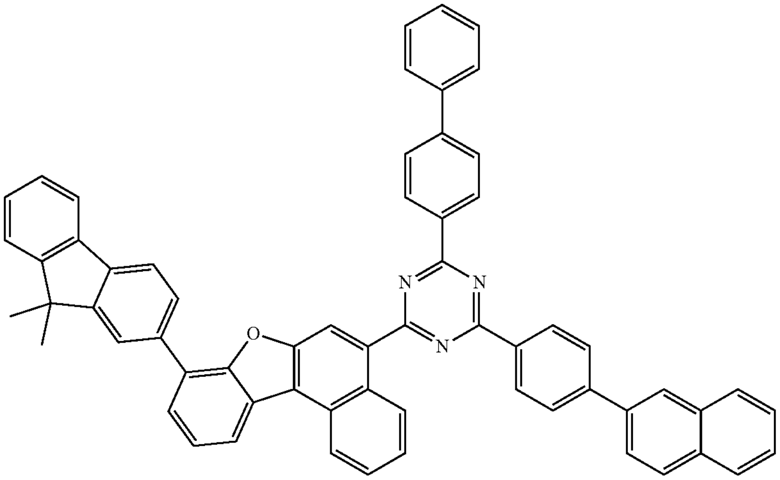
1-107
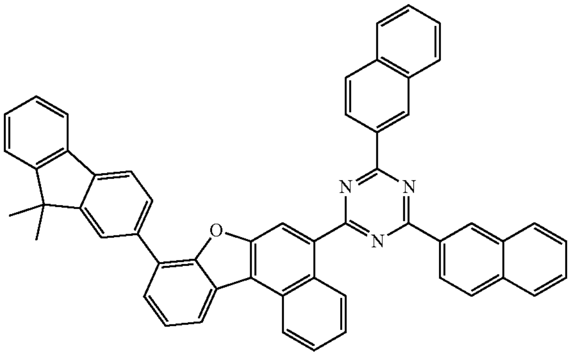
1-108
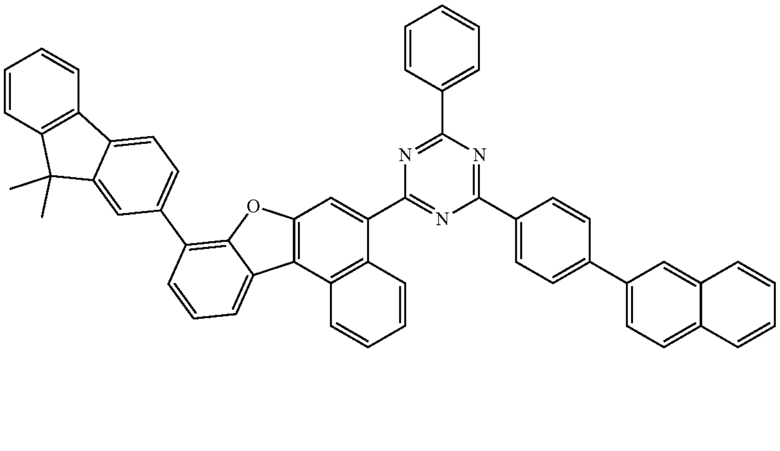

-continued
1-109
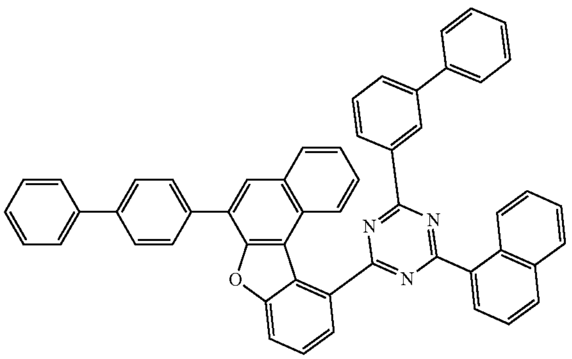
1-110
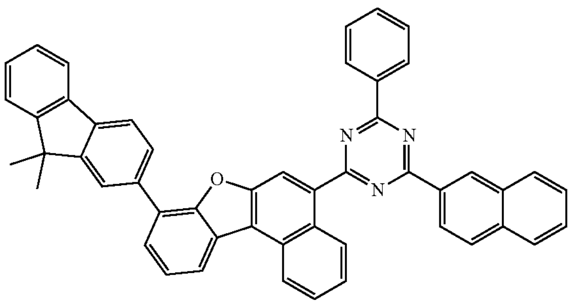
1-111
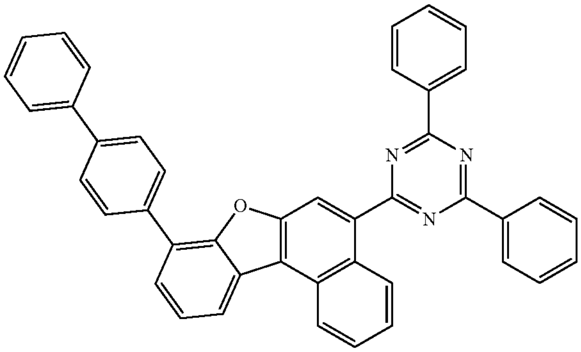
1-112
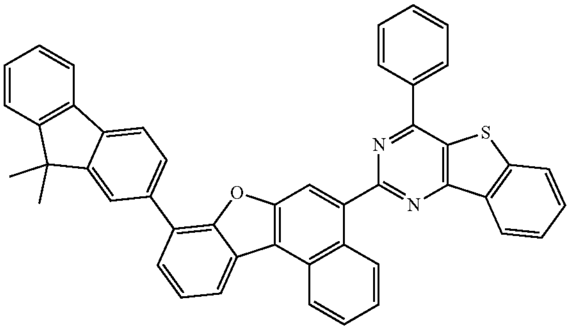
1-113
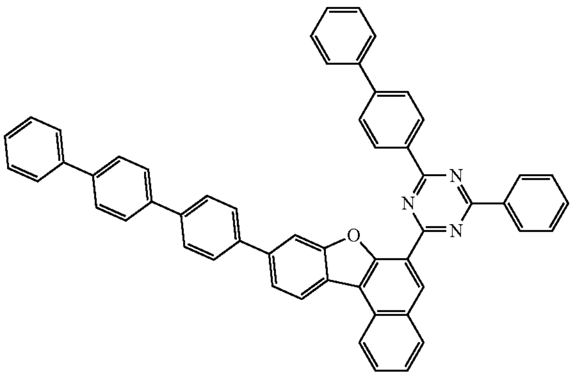
1-114
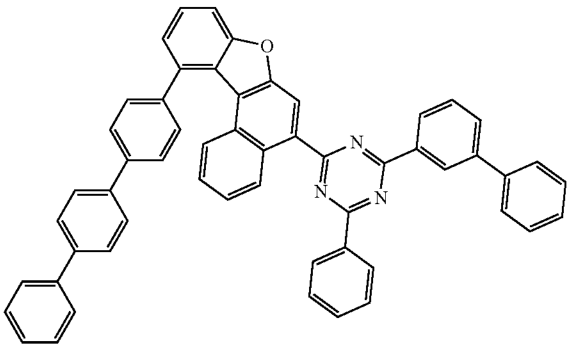
1-115
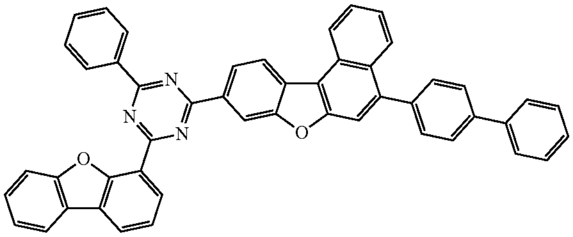
1-116
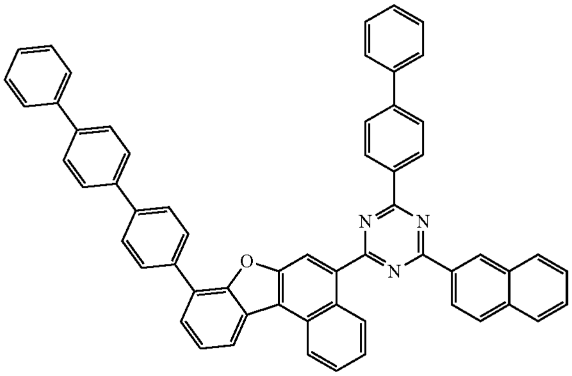

-continued
1-117
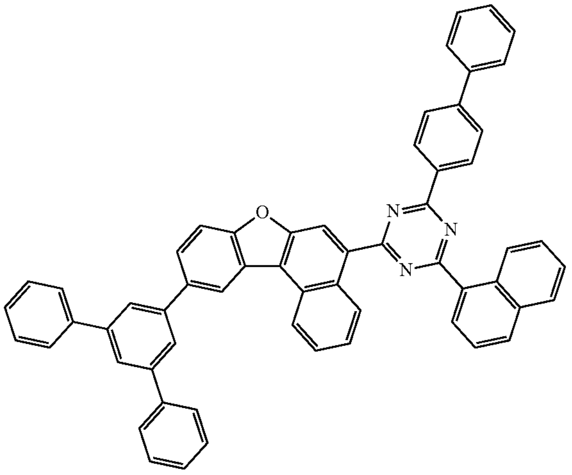
1-118
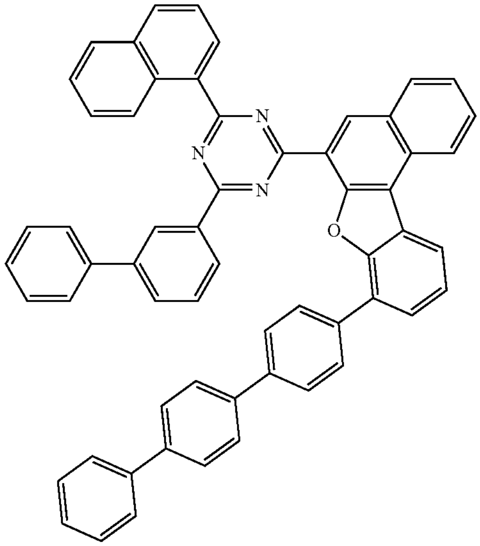
1-119
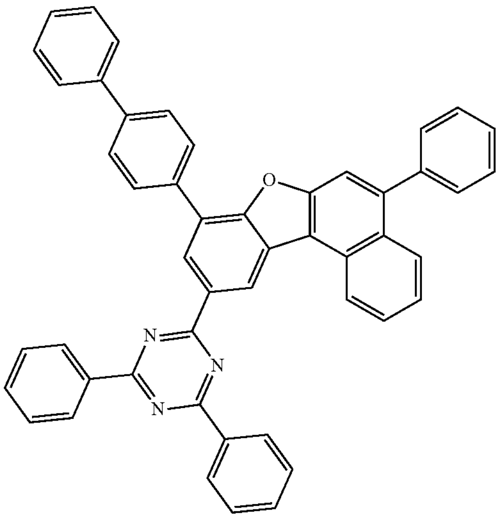
1-120
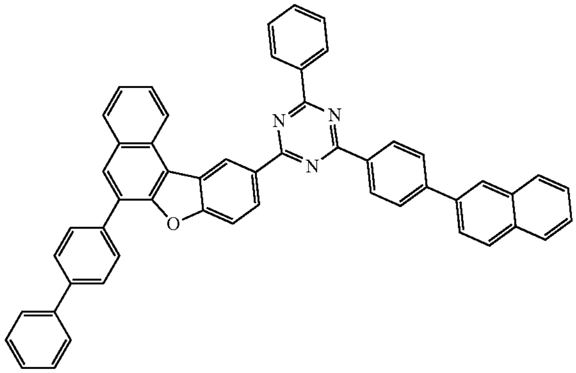
1-121
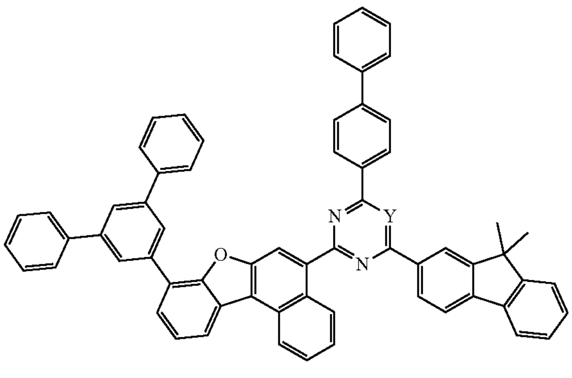
1-122
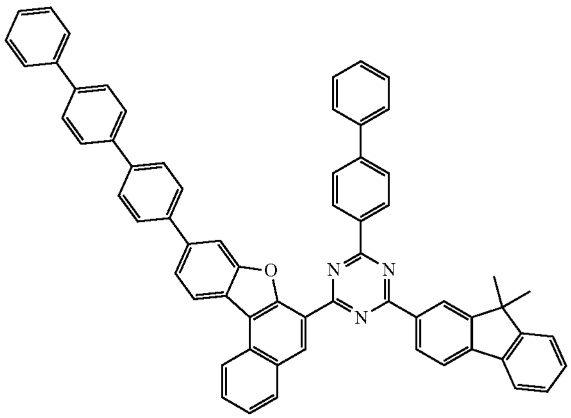

-continued
1-123
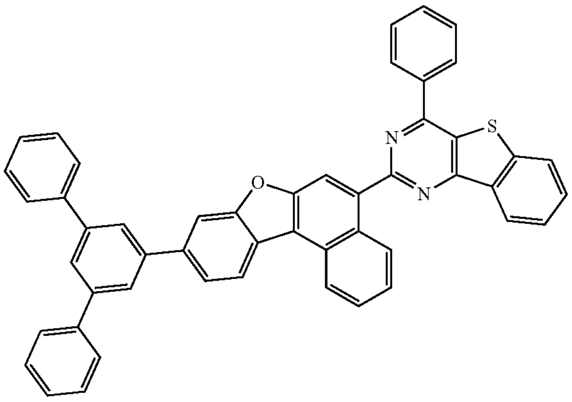
1-124
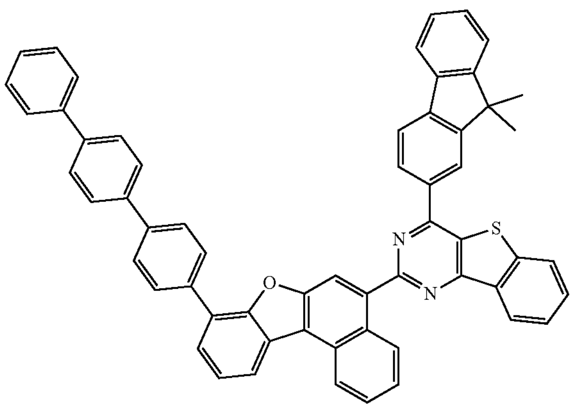
1-125
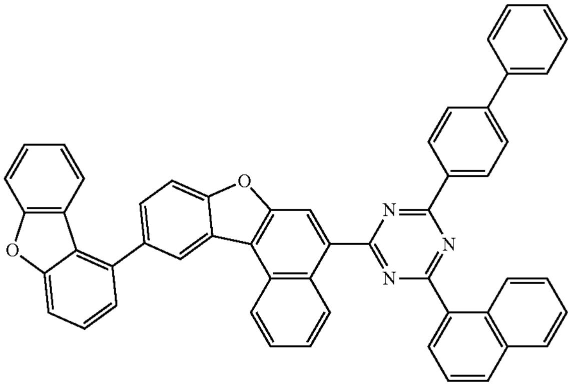
1-126
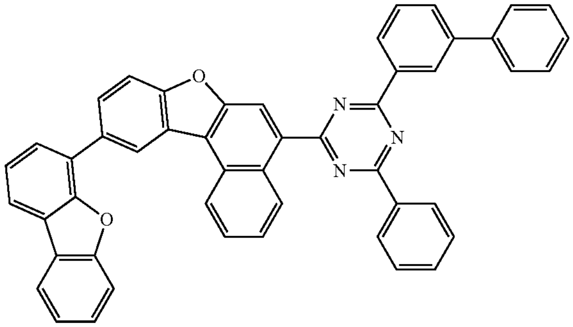
1-127
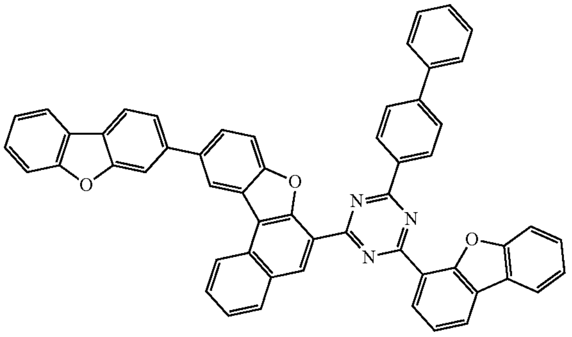
1-128
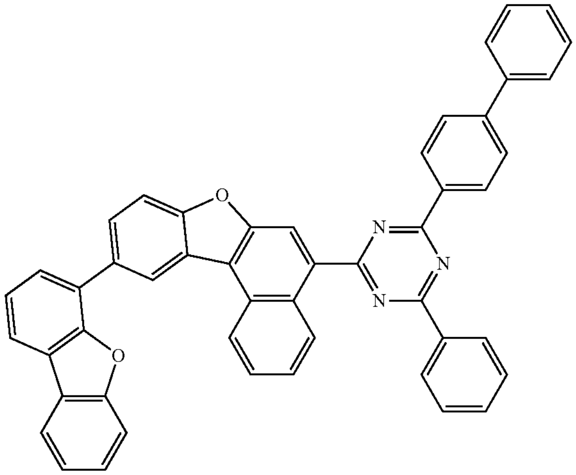

-continued
1-129
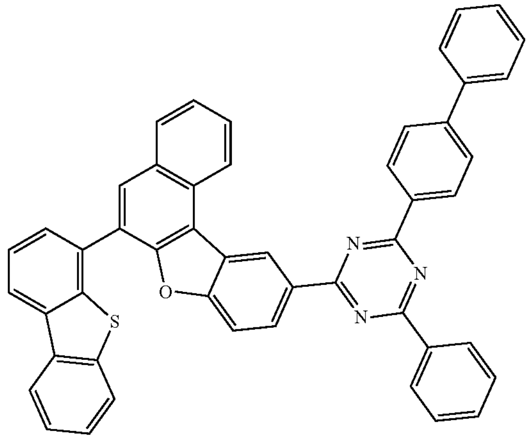
1-130
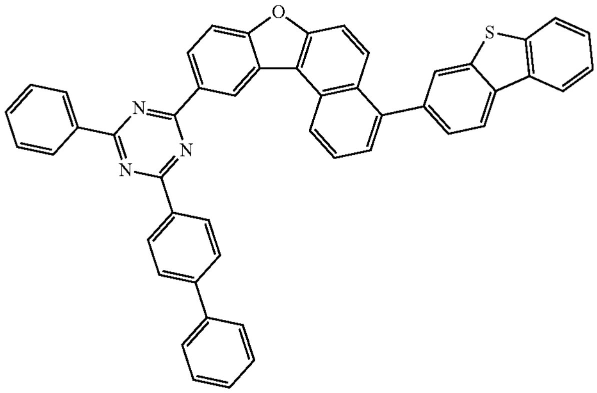
1-131
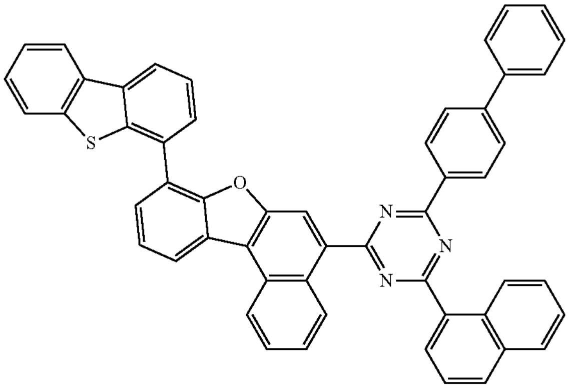
1-132
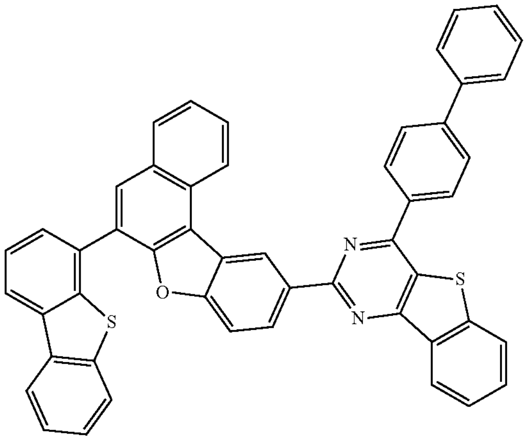
1-133
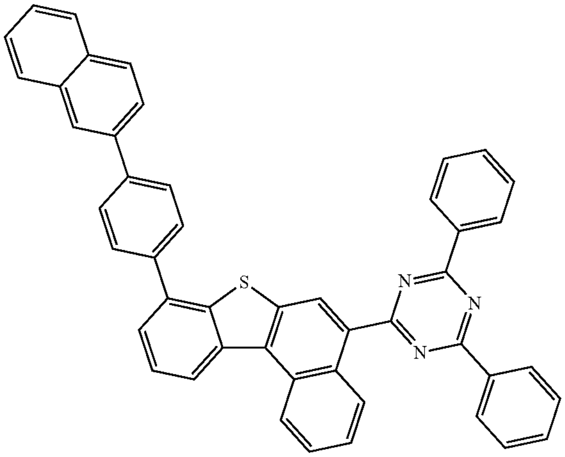
1-134
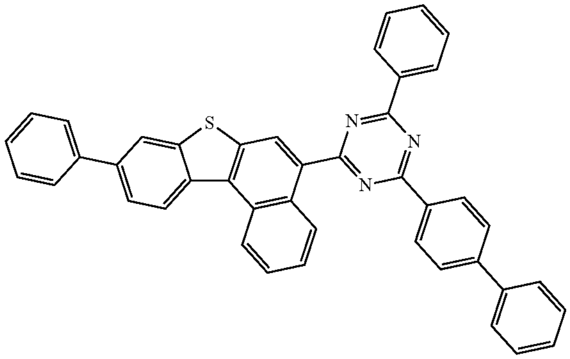

-continued
1-135
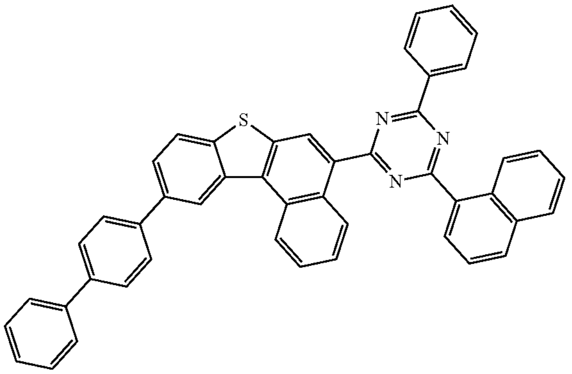
1-136
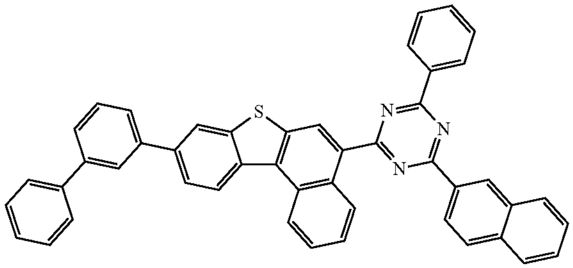
1-137
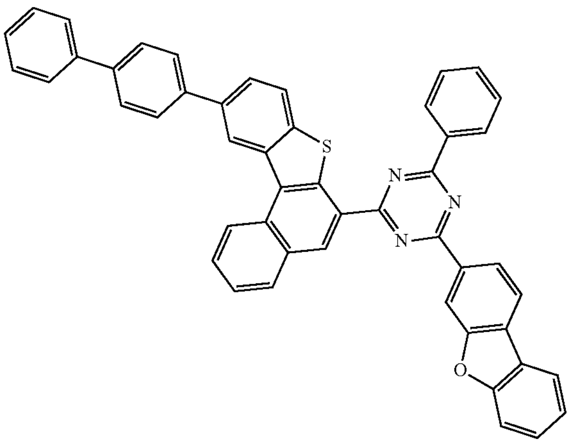
1-138
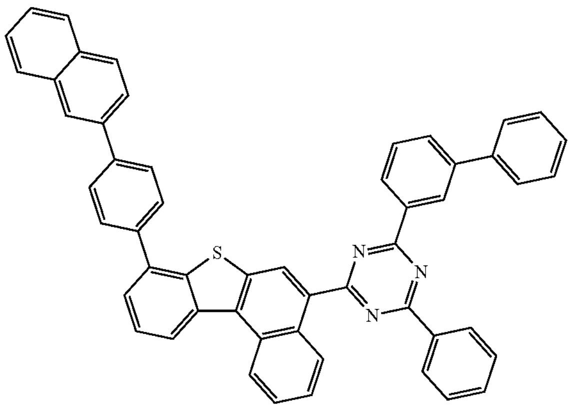
1-139
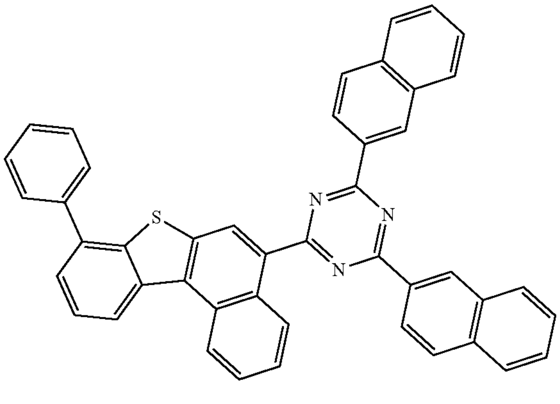
1-140
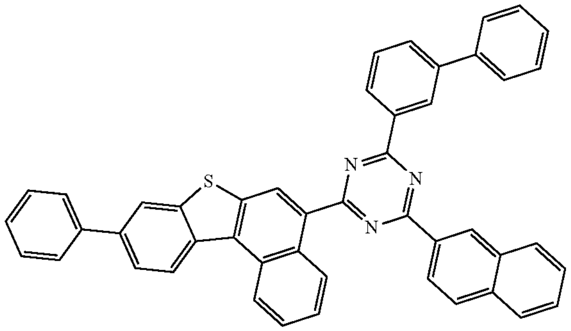

-continued
1-141
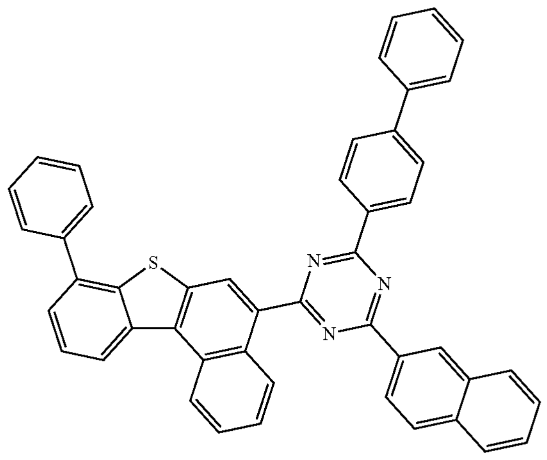
1-142
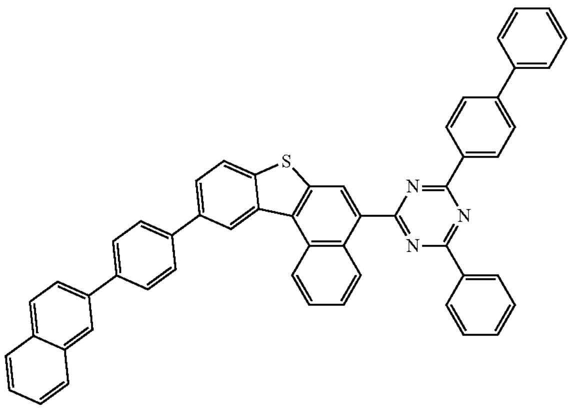
1-143
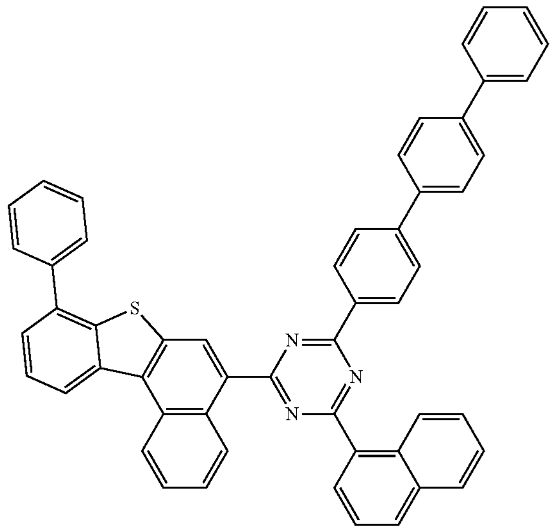
1-144
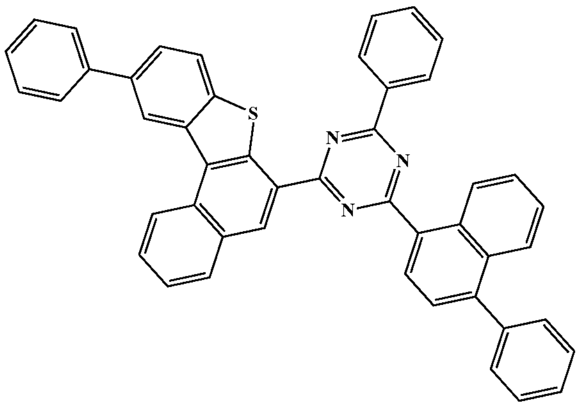
1-145
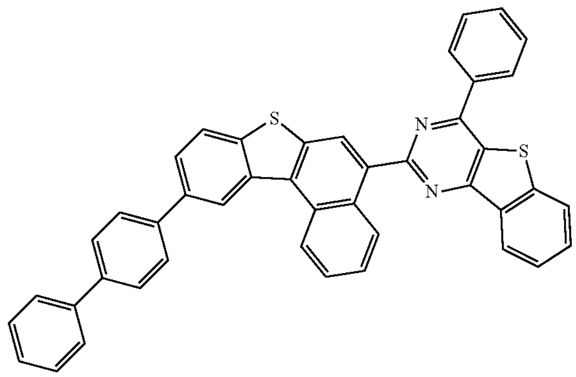
1-146
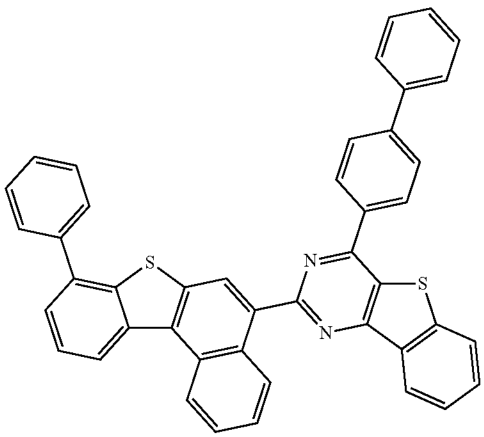

-continued
1-147
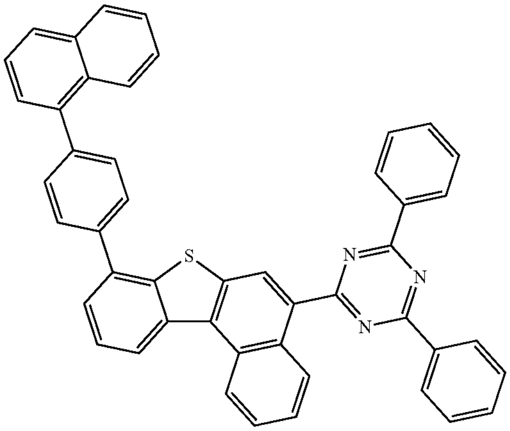
1-148
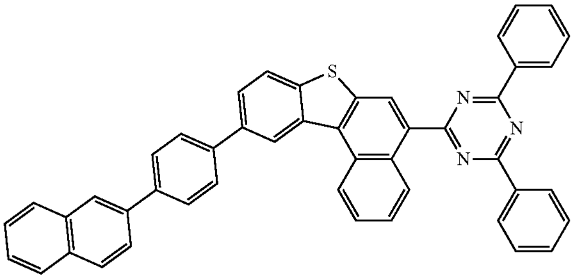
1-149
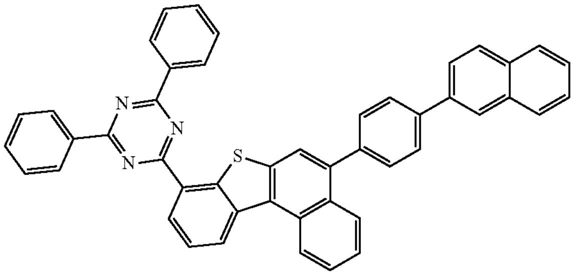
1-150
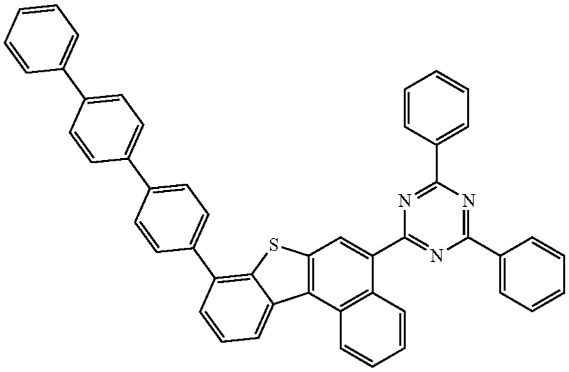
1-151
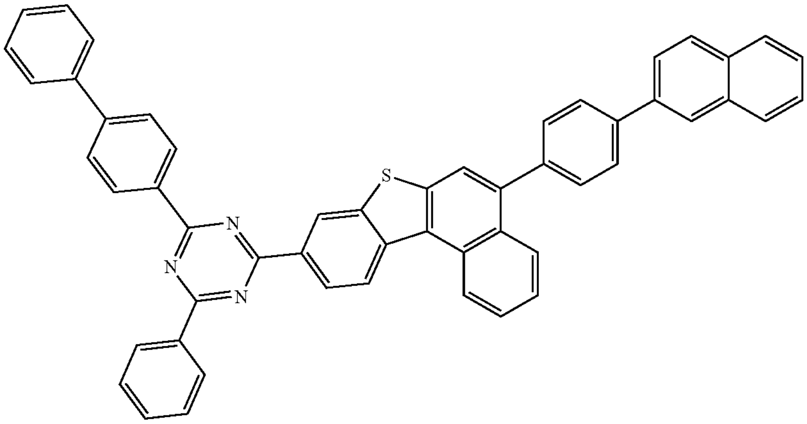

-continued
1-152
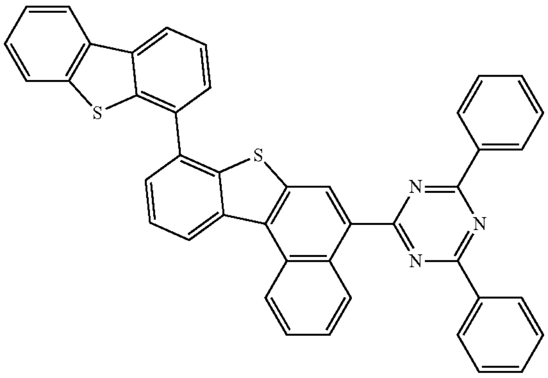
1-153
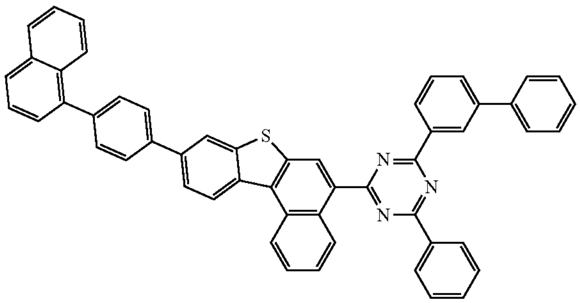
1-154
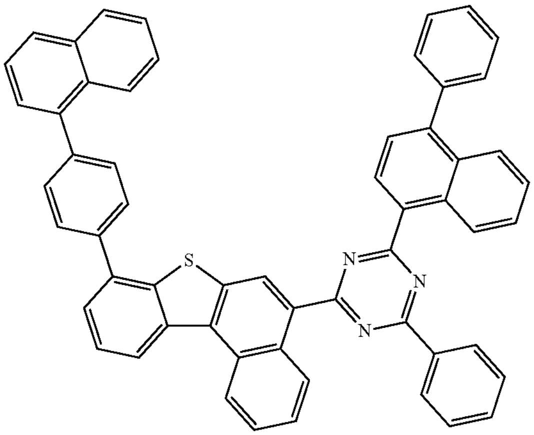
1-155
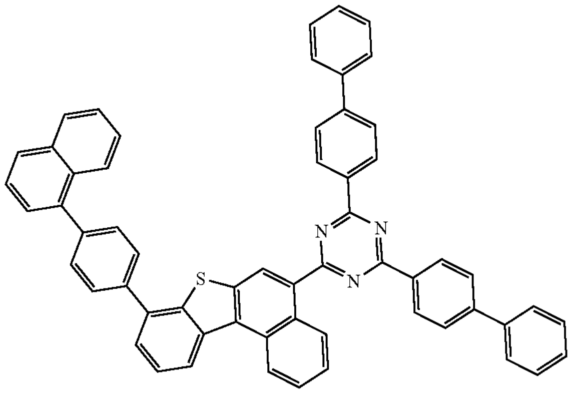
1-156
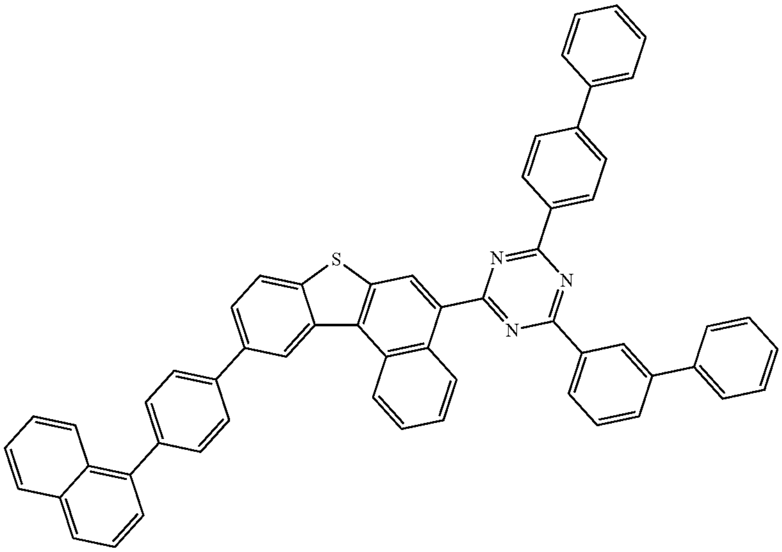

-continued
1-157
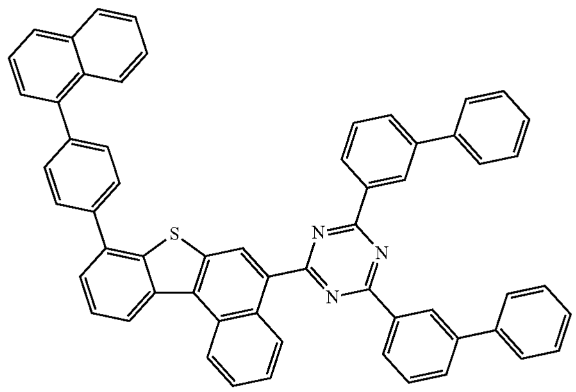
1-158
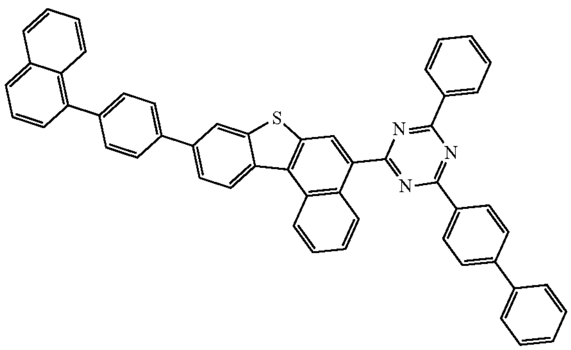
1-159
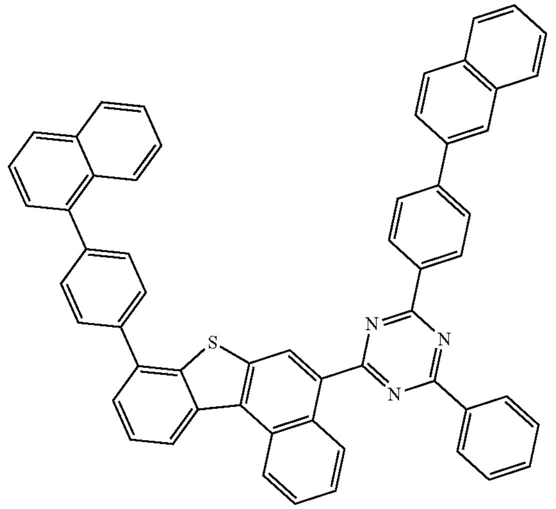
1-160
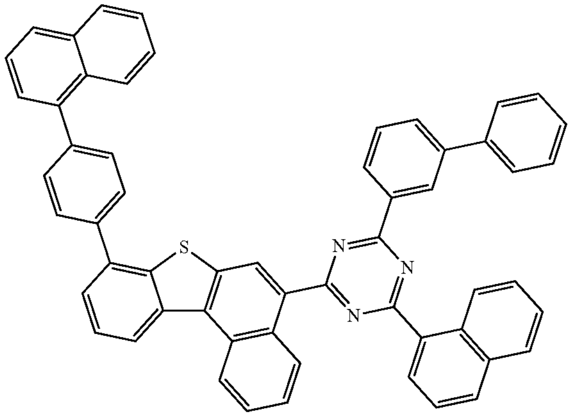
1-161
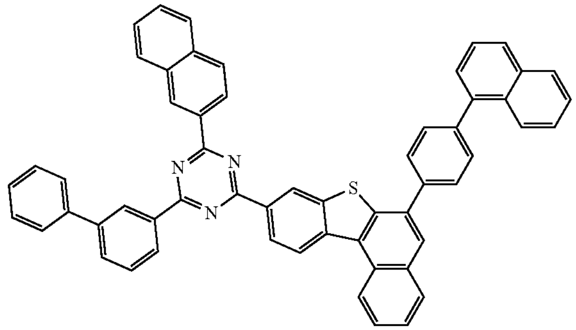
1-162
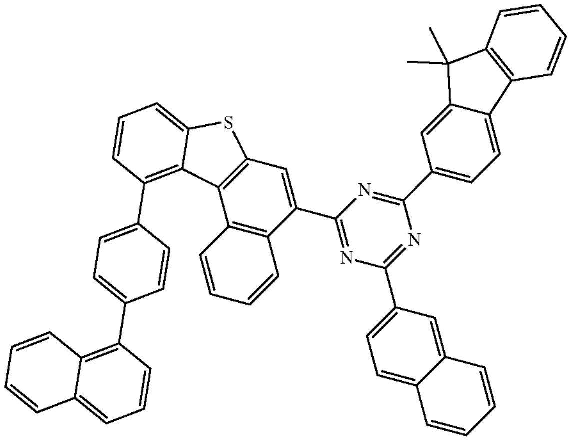

-continued
1-163
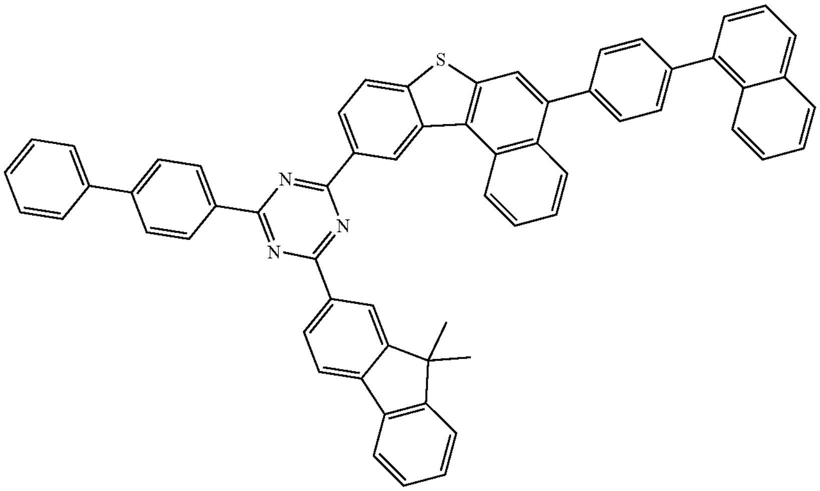
1-164
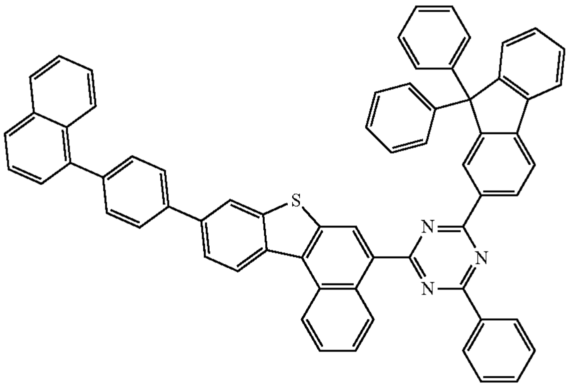
1-165
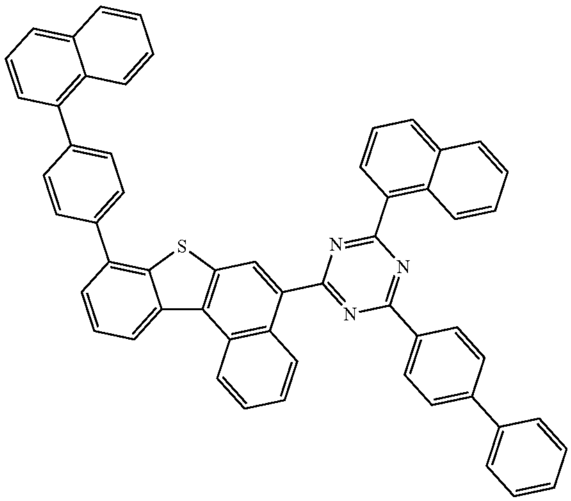
1-166
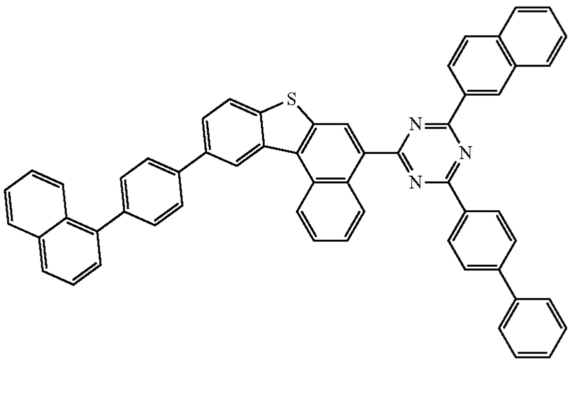
1-167
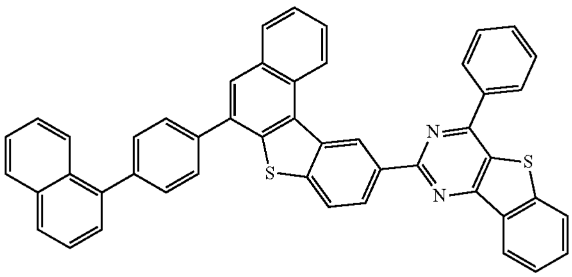

-continued
1-168
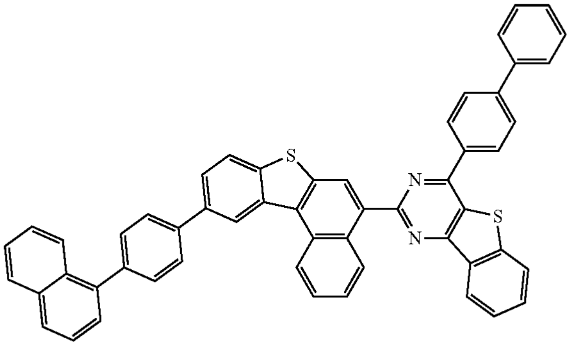
1-169
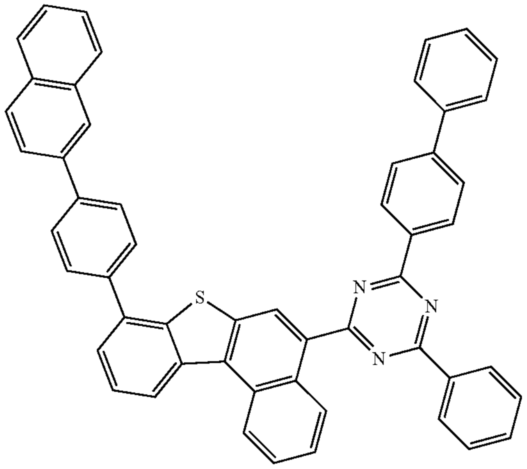
1-170
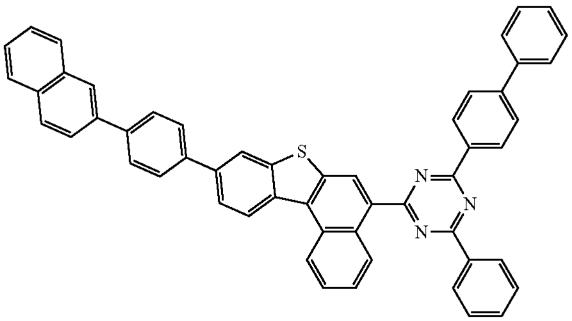
1-171
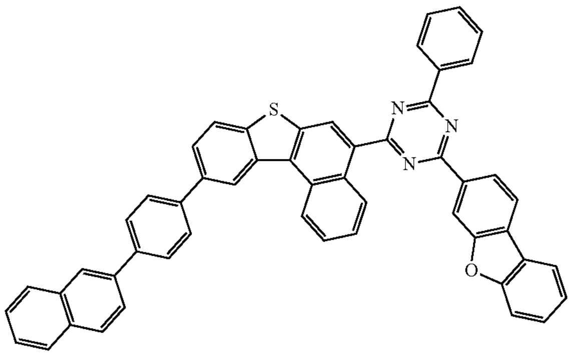
1-172
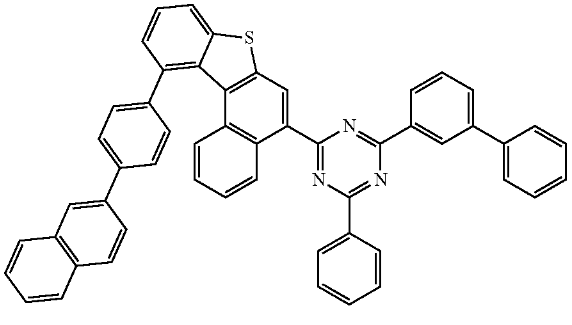
1-173
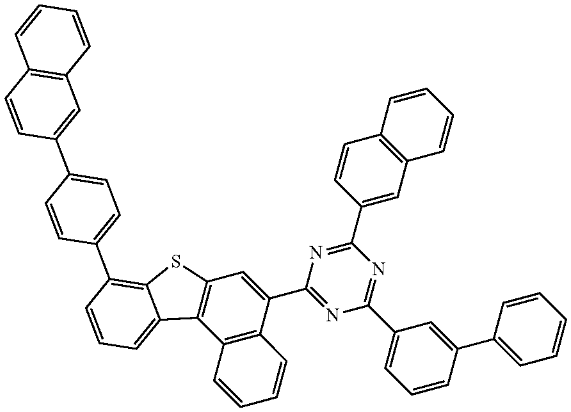

-continued
1-174
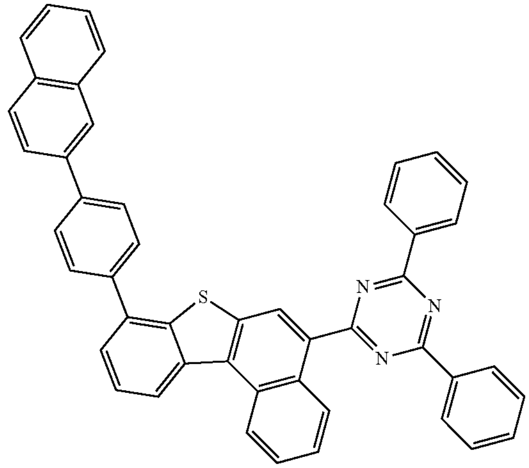
1-175
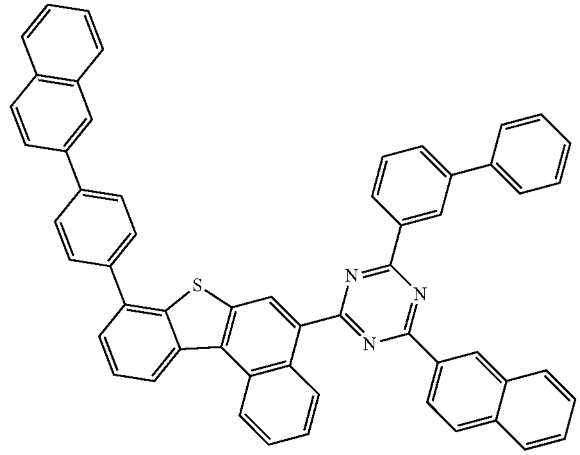
1-176
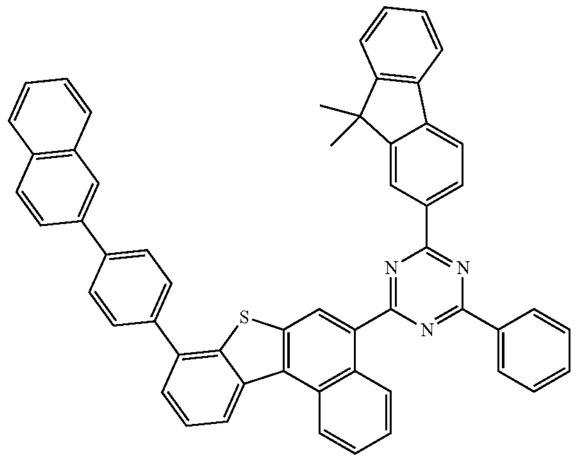
1-177
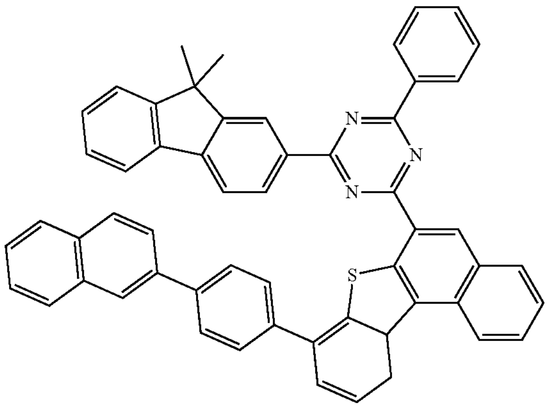
1-178
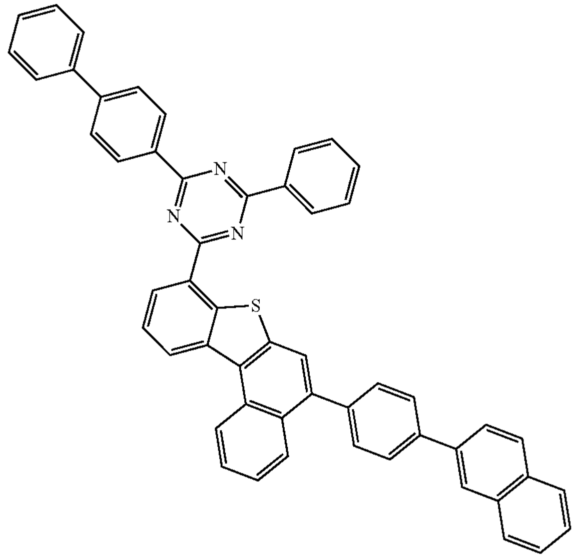
1-179
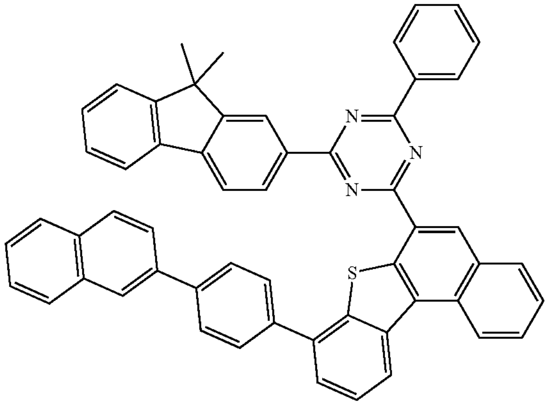

-continued
1-180
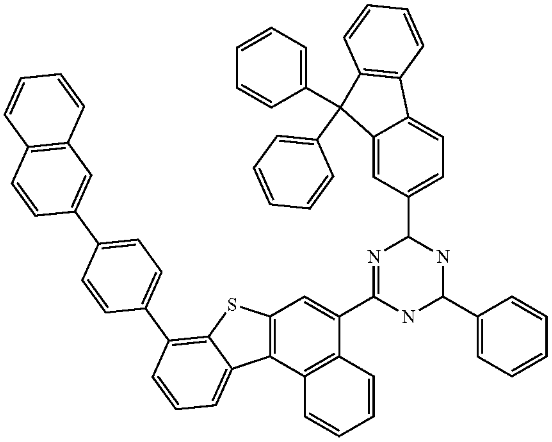
1-181
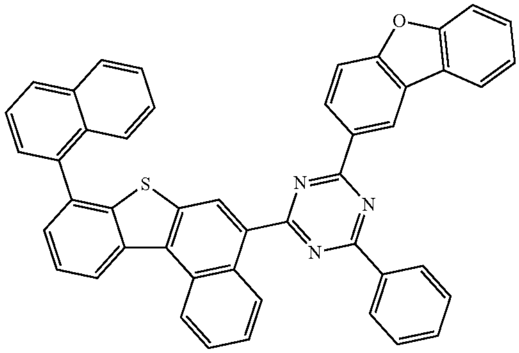
1-182
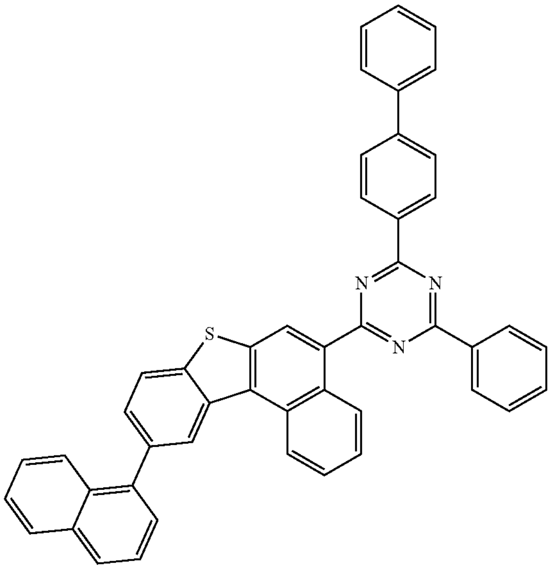
1-183
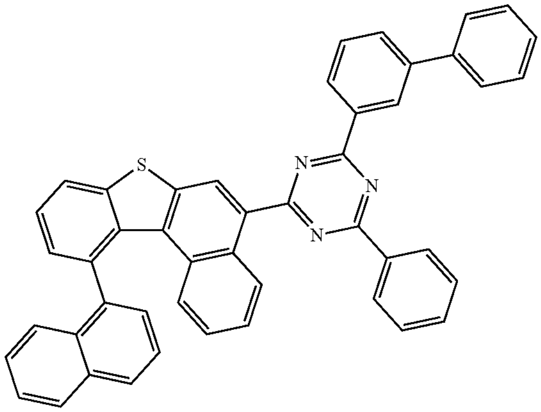
1-184
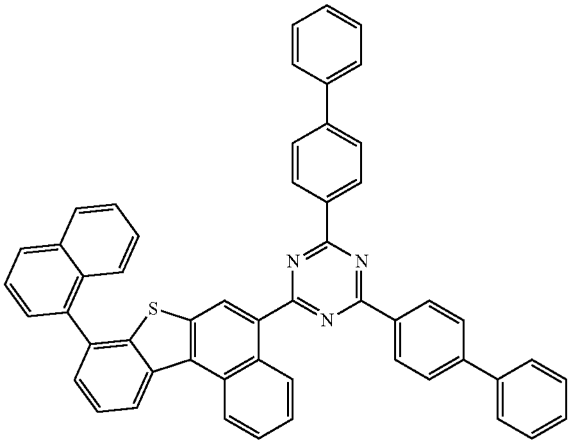
1-185
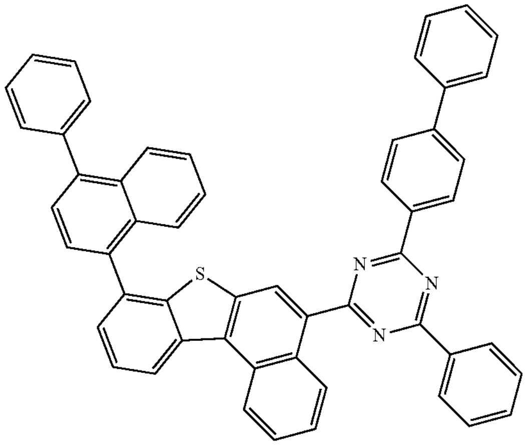

-continued
1-186
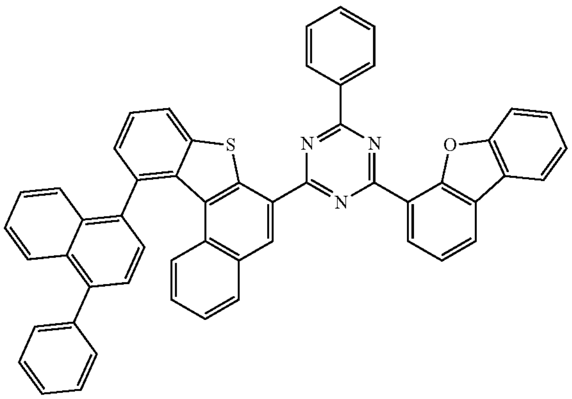
1-187
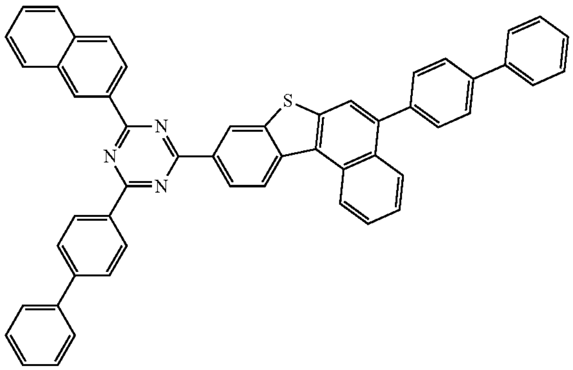
1-188
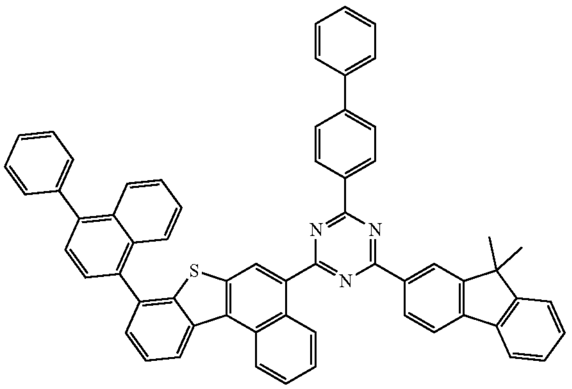
1-189
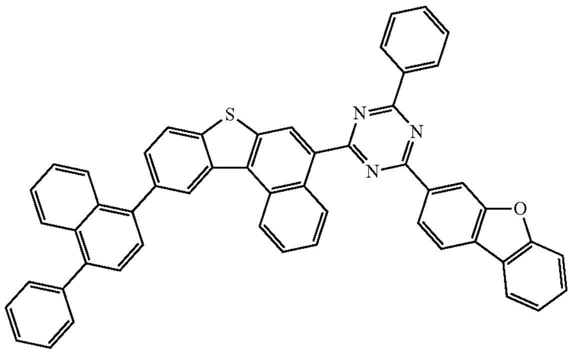
1-190
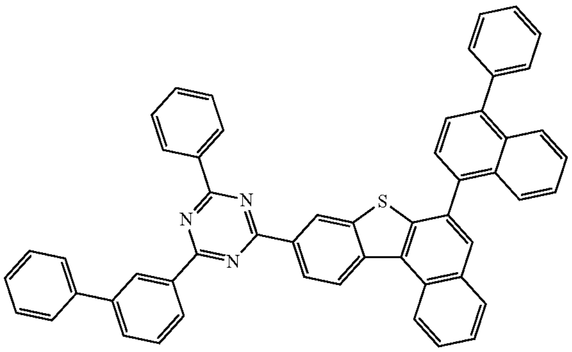
1-191
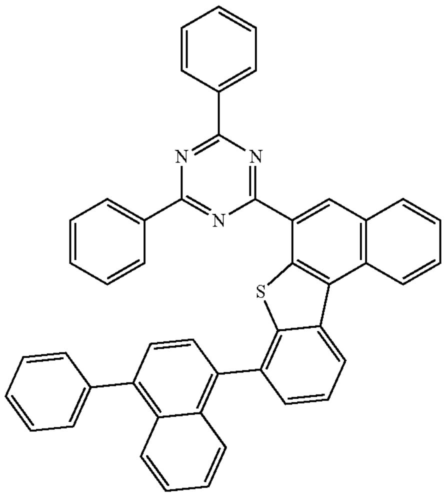

-continued
1-192
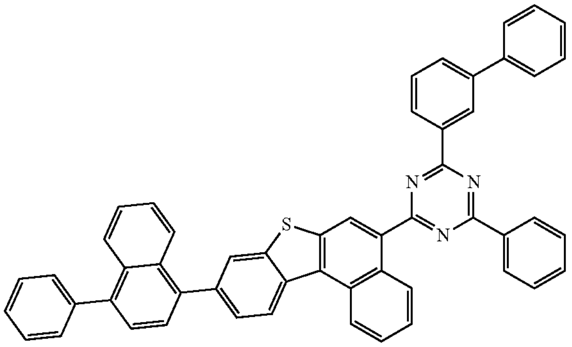
1-193
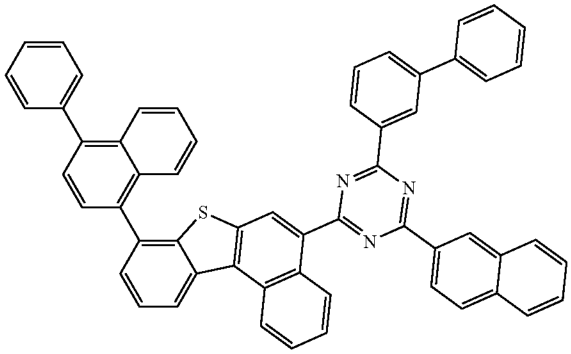
1-194
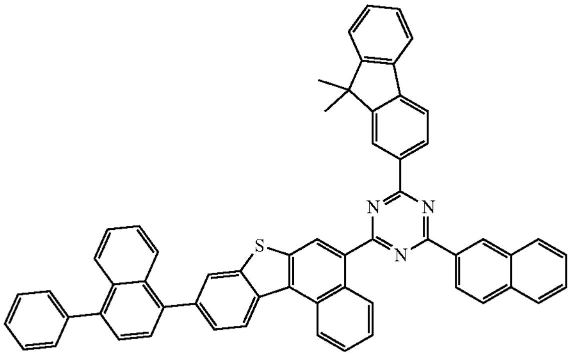
1-195
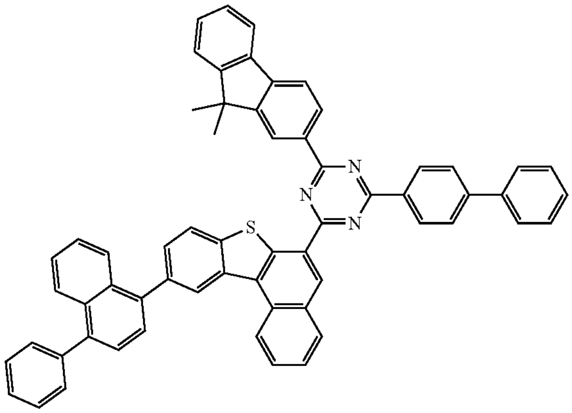
1-196
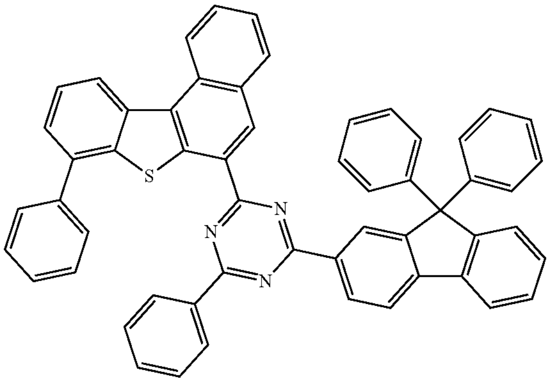
1-197
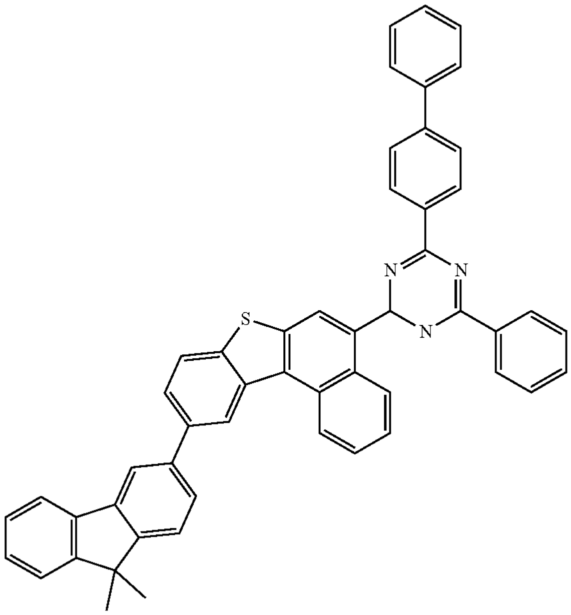

-continued
1-198
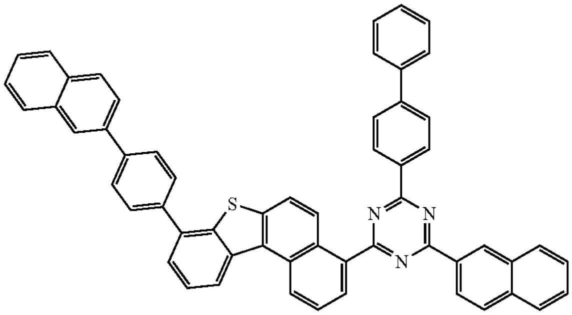
1-199
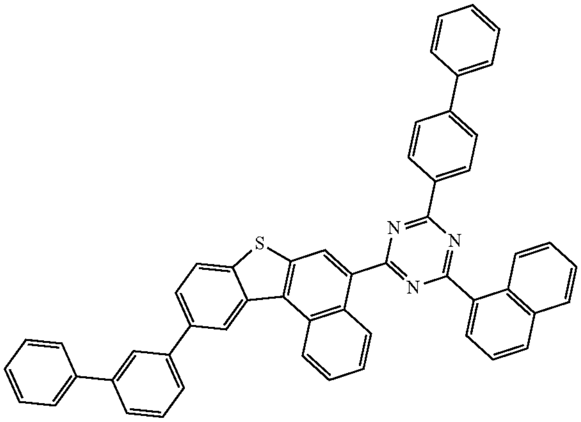
1-200
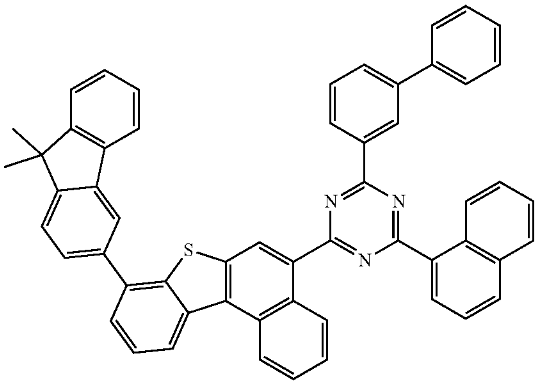
1-201
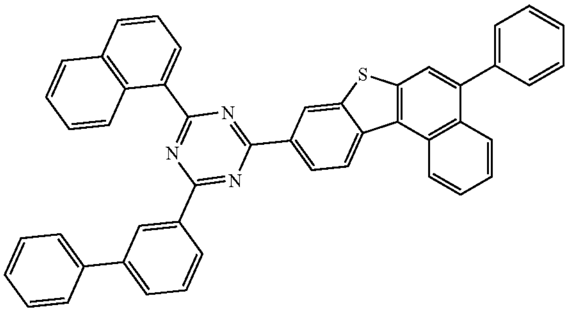
1-202
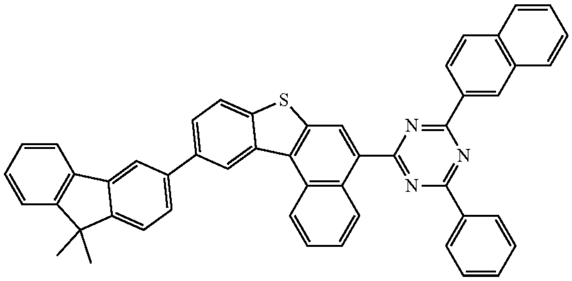
1-203
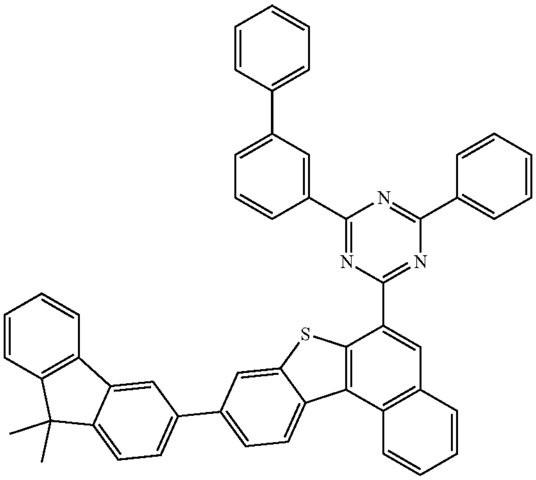

-continued
1-204
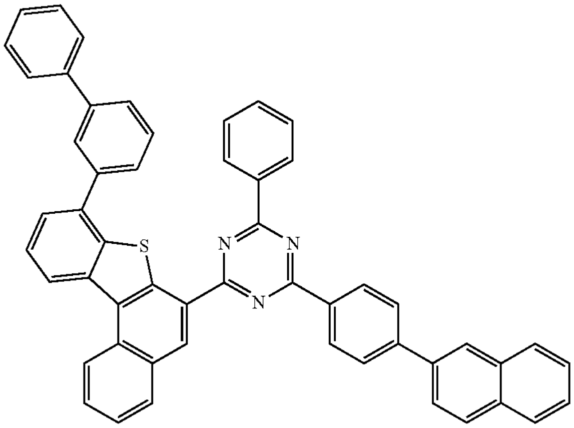
1-205
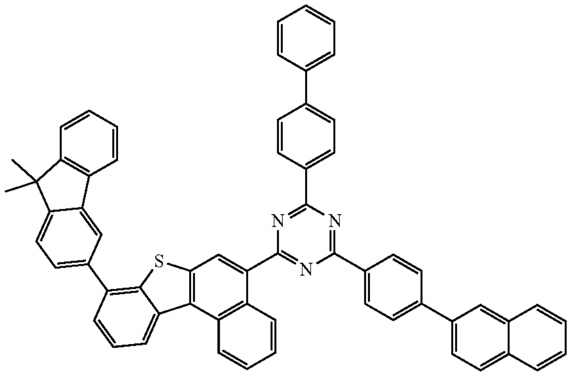
1-206
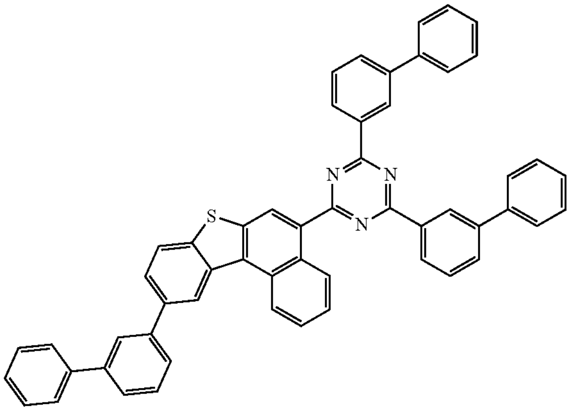
1-207
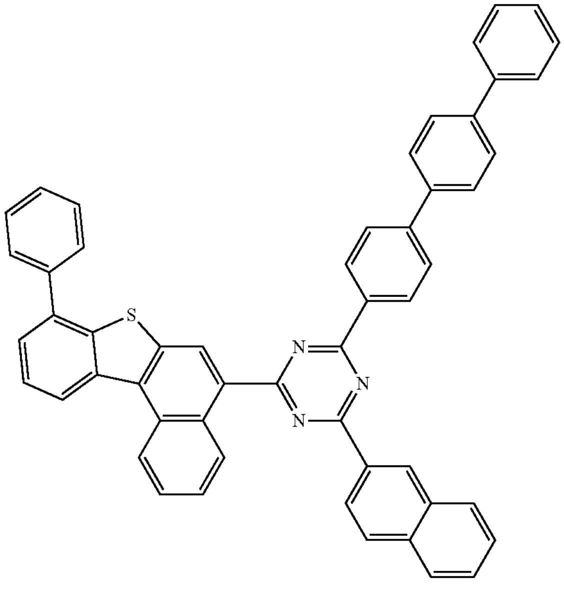
1-208
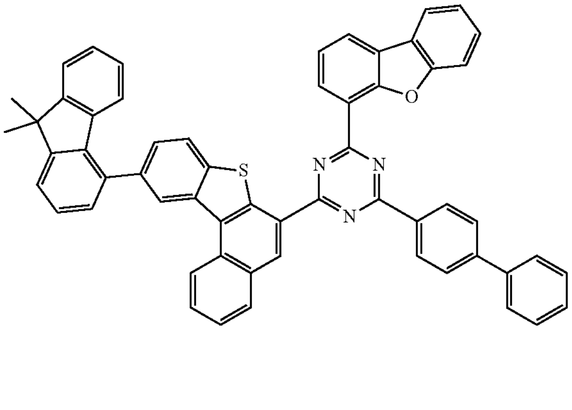
1-209
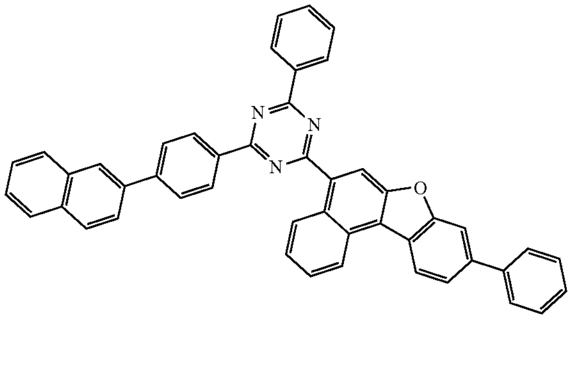

-continued
1-210
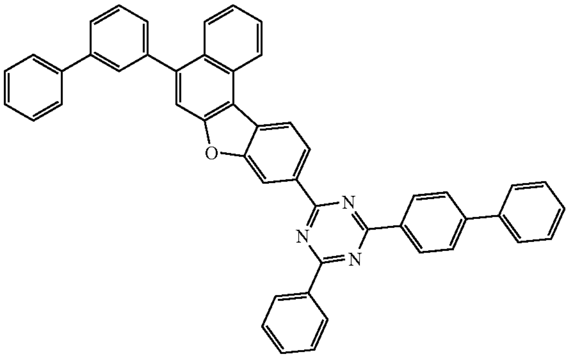
1-211
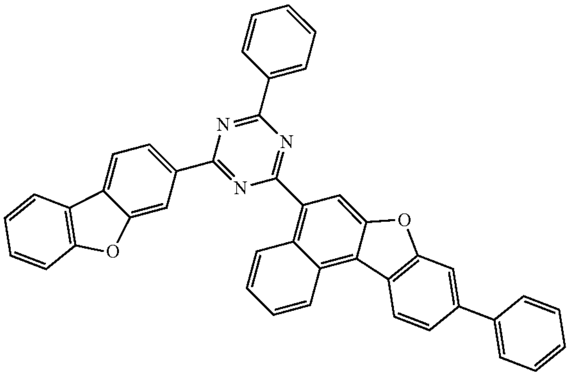
1-212
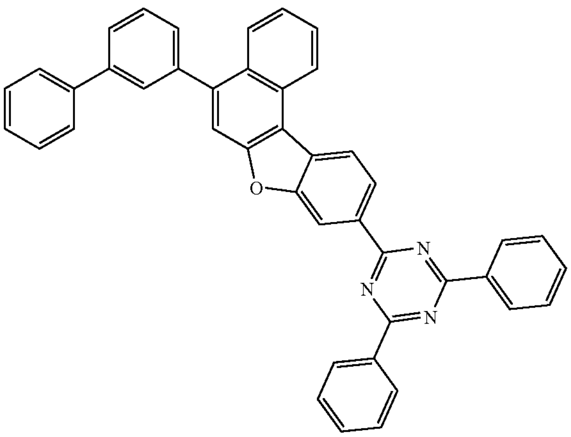
1-213
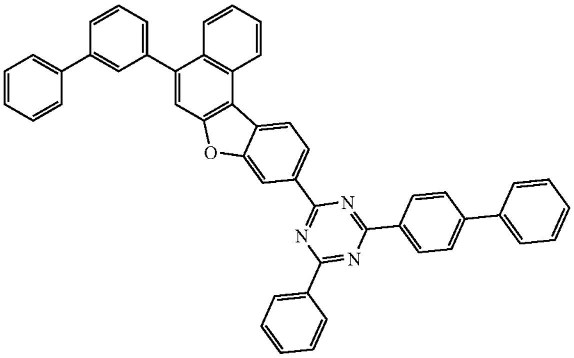
1-214
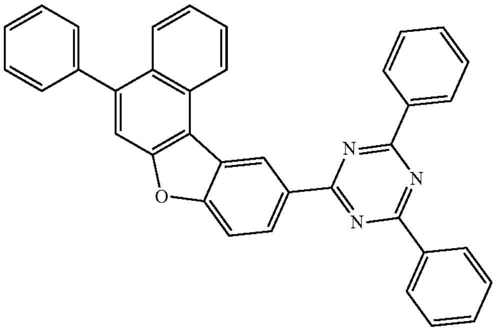
1-215
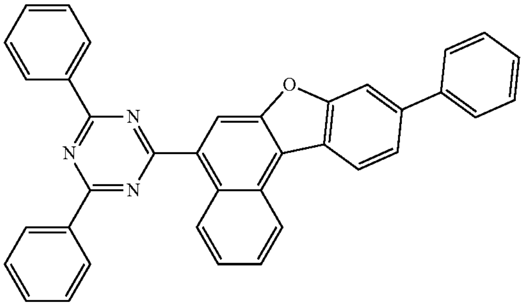

-continued
1-216
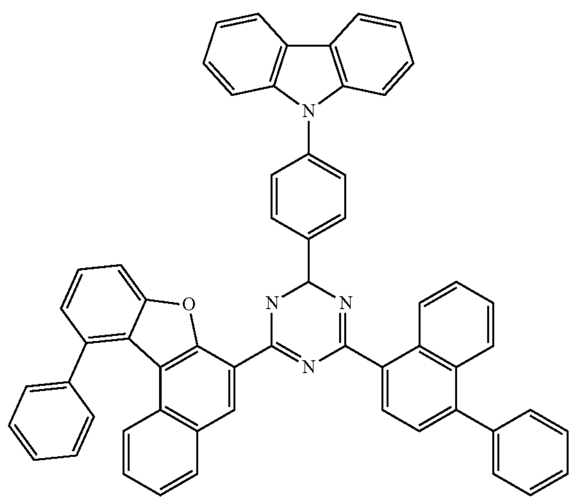
1-217
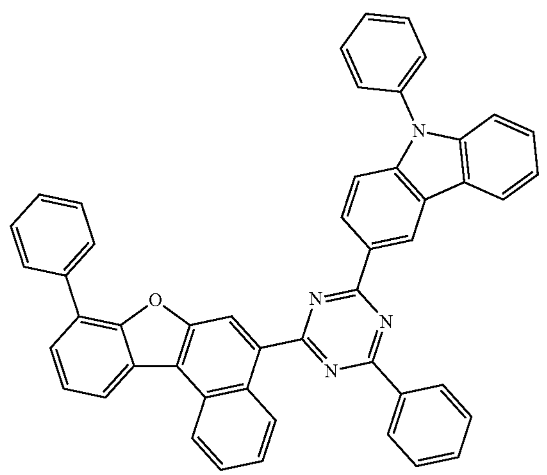
1-218
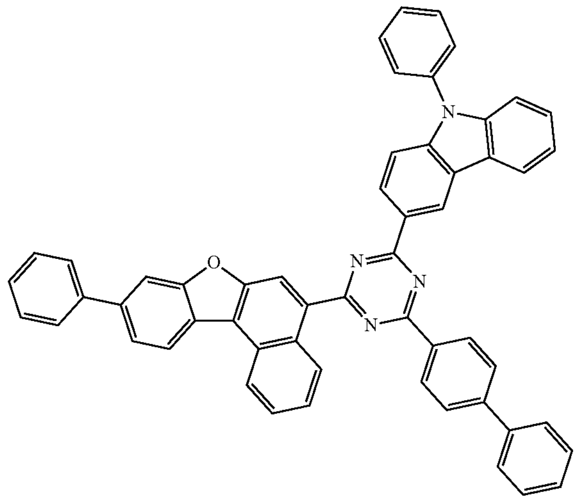
1-219
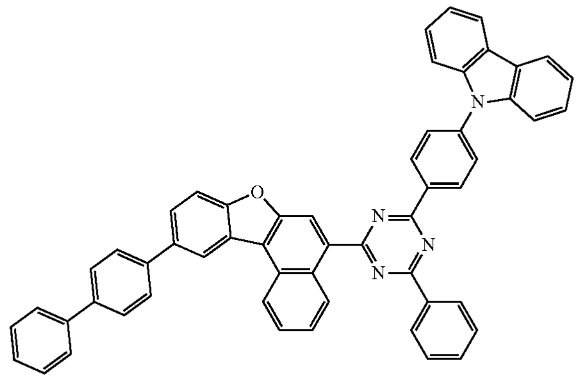
1-220
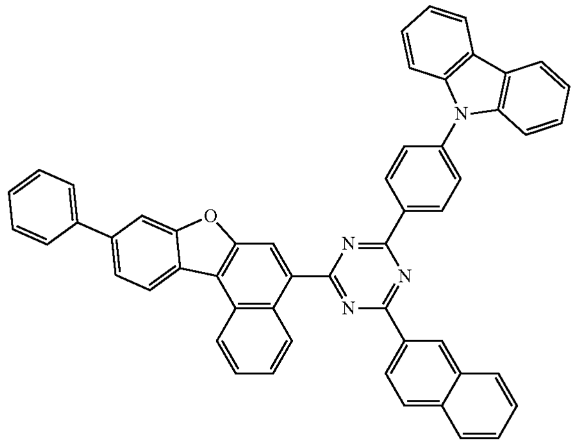
1-221
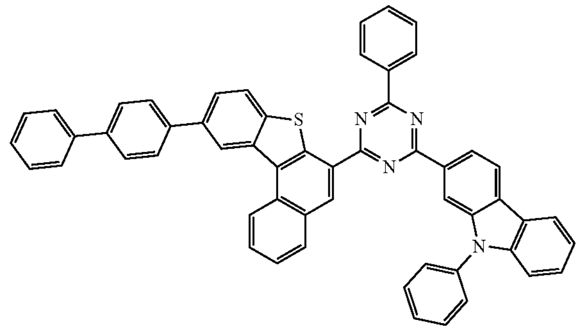

-continued
1-222
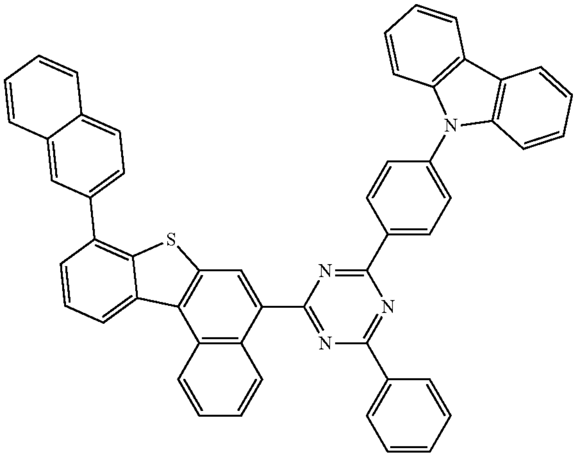
1-223
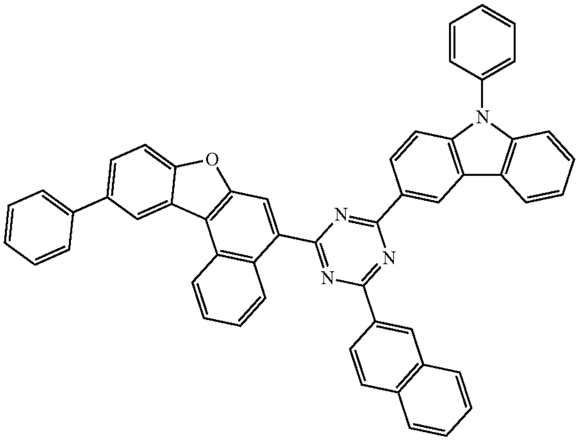
1-224
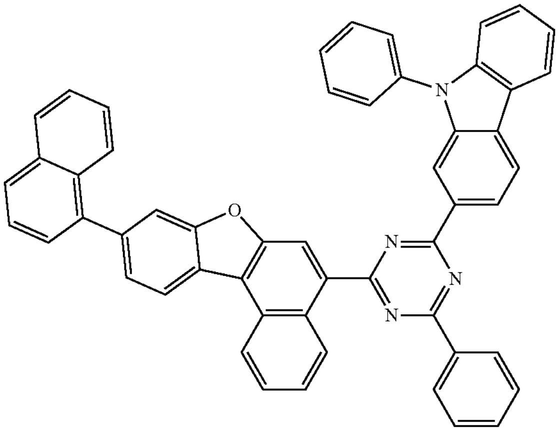
1-225
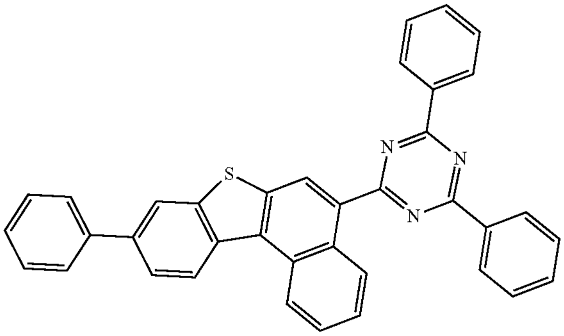
1-226
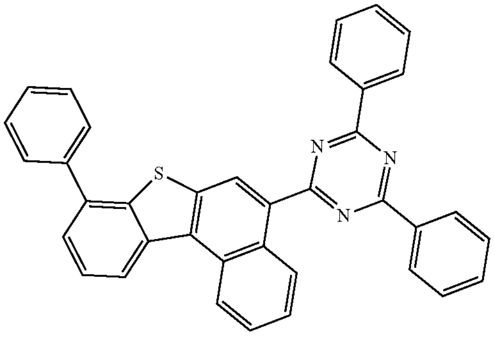
1-227
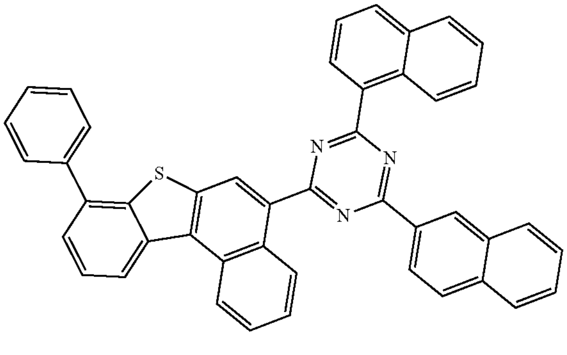

-continued
1-228
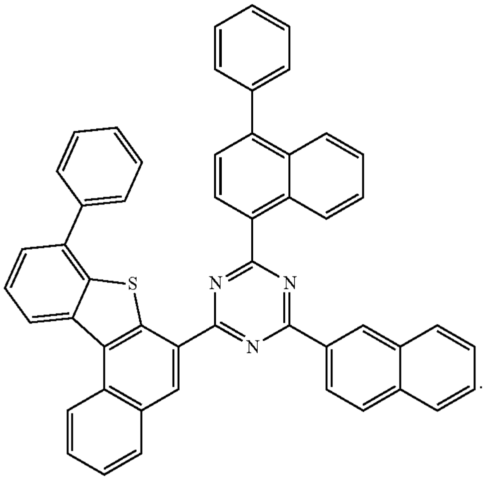
7. The organic light emitting device of claim 1, wherein Chemical Formula 2 is represented by any one of the following compounds:
2-1
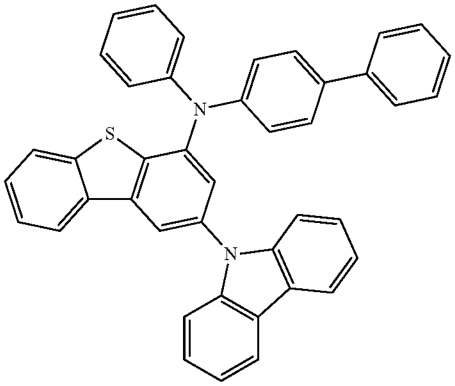
2-2
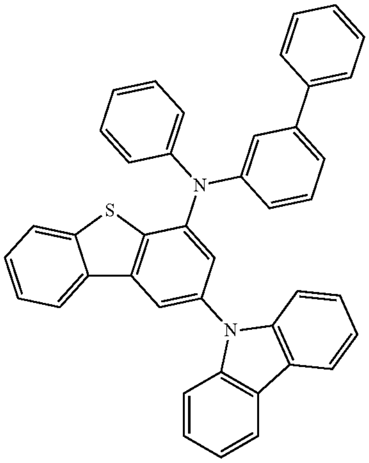
-continued
2-3
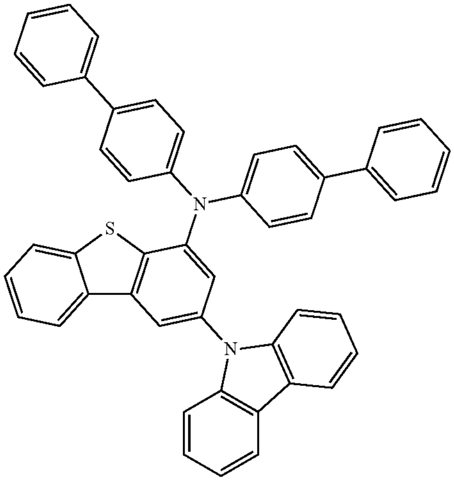
2-4
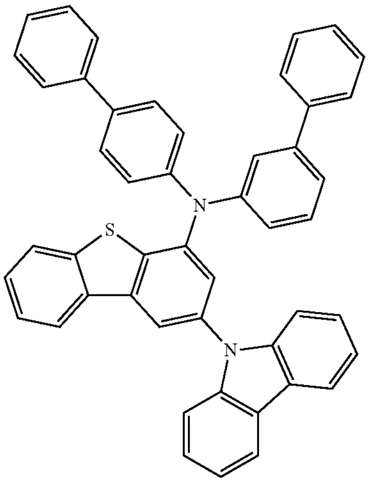

-continued
2-5
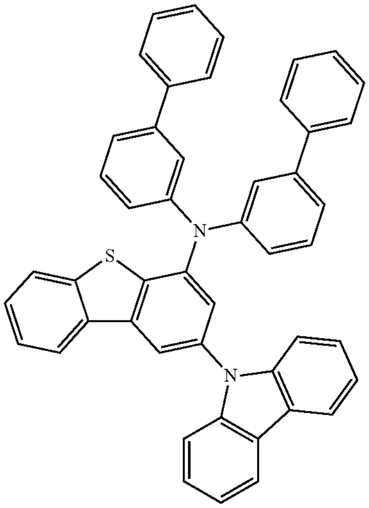
2-6
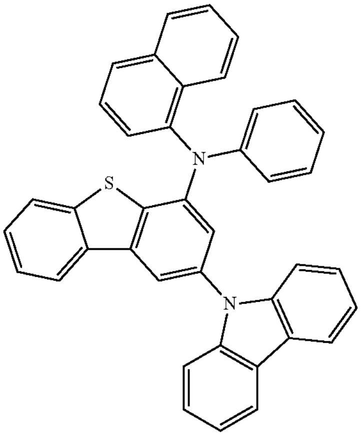
2-7
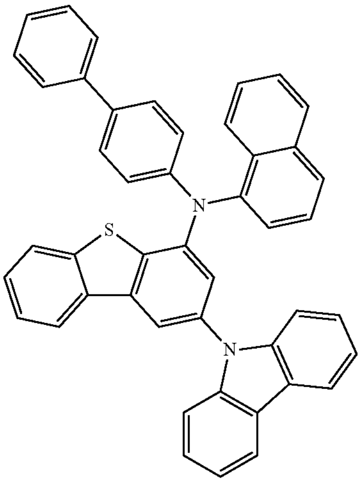
-continued
2-8
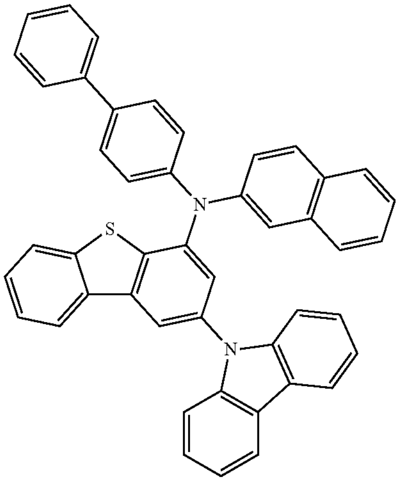
2-9
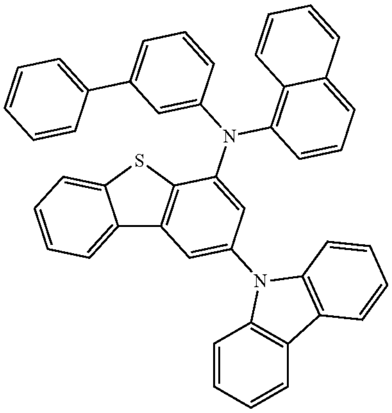
2-10
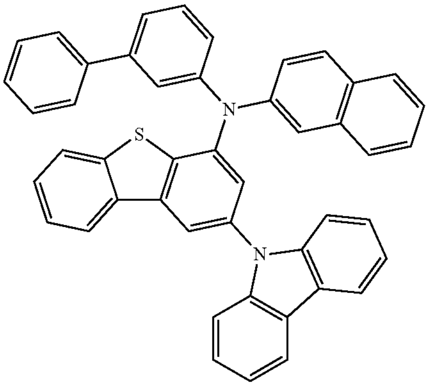

-continued
2-11
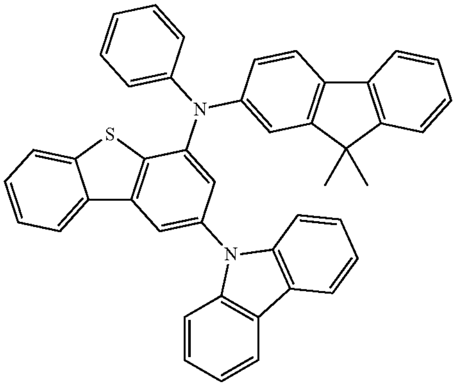
2-12
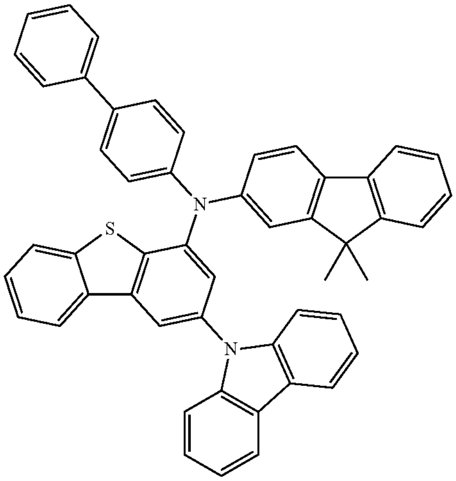
2-13
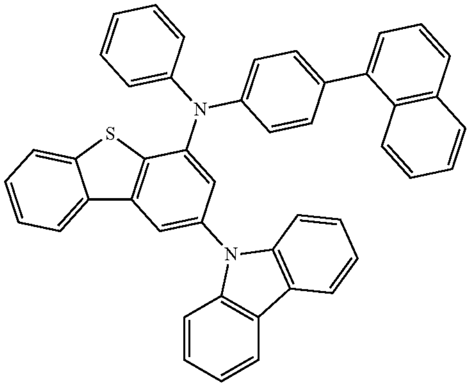
-continued
2-14
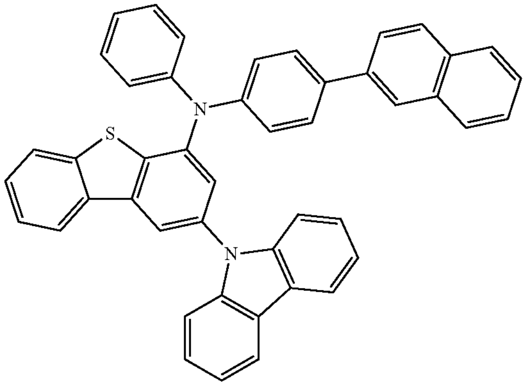
2-15
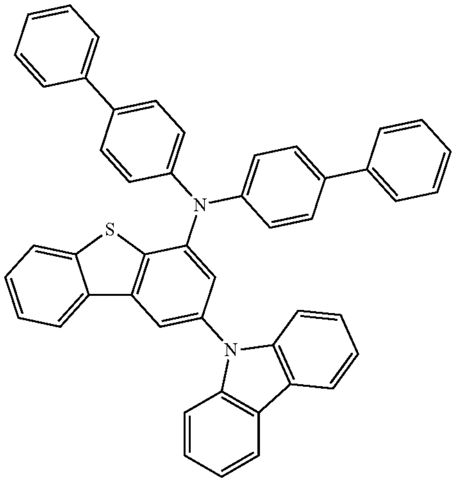
2-16
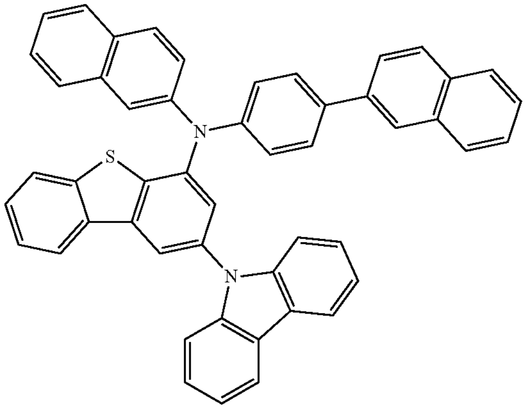

-continued
2-17
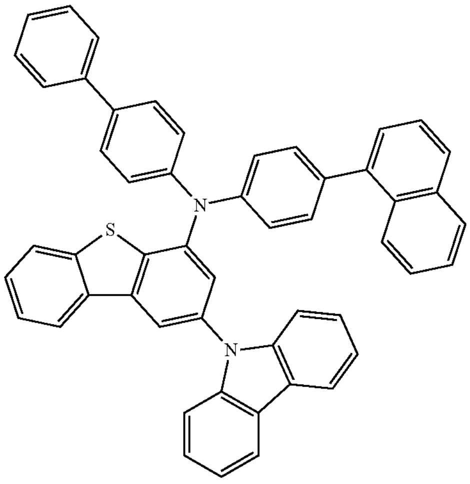
2-18
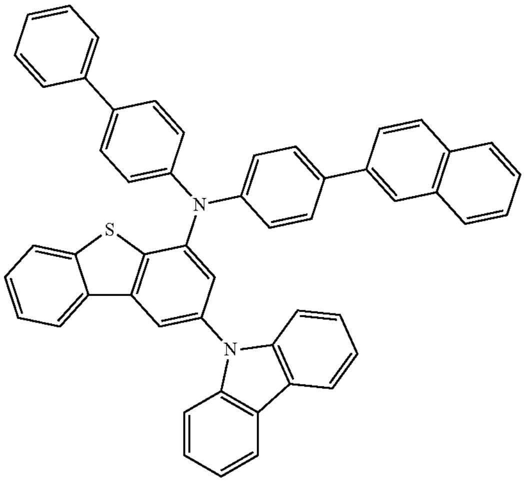
2-19
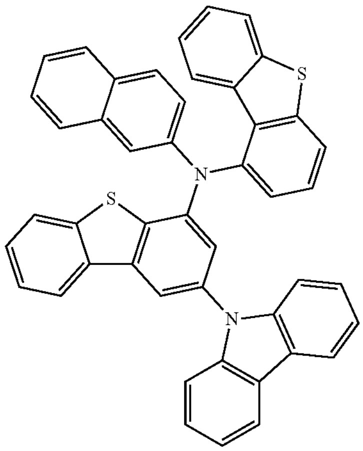
-continued
2-20
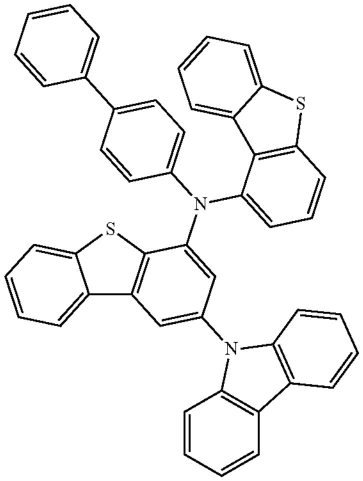
2-21
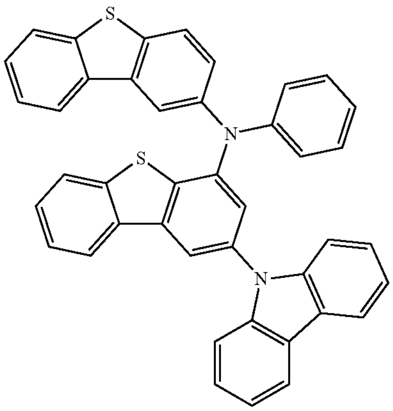
2-22
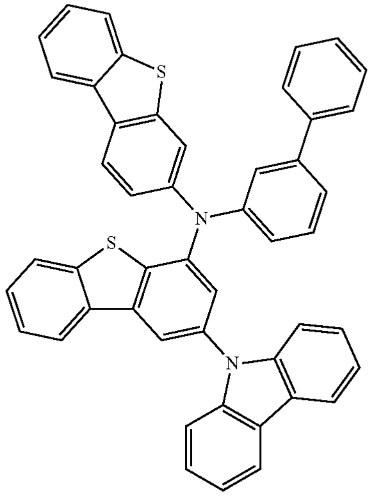

-continued
2-23
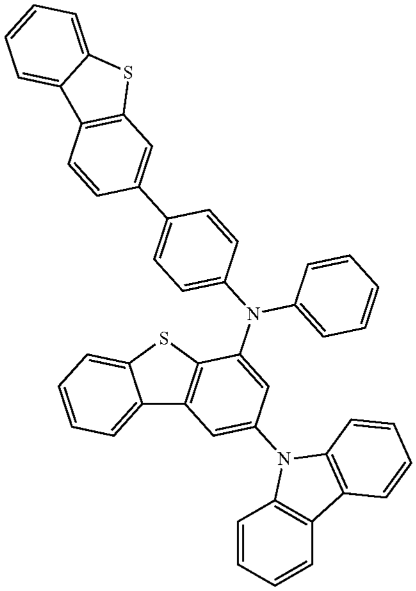
2-24
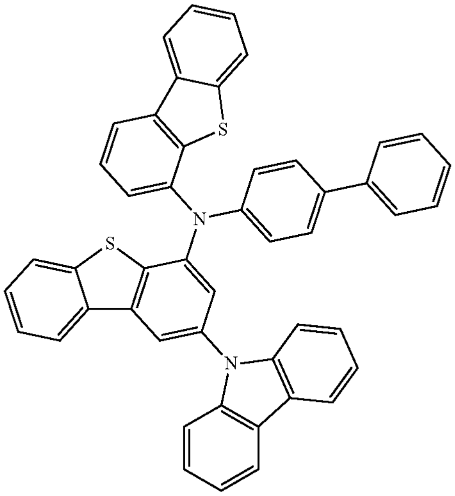
2-25
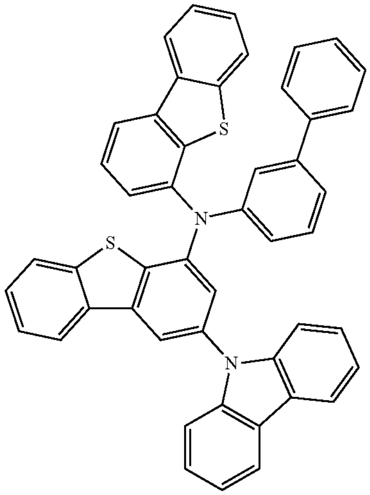
-continued
2-26
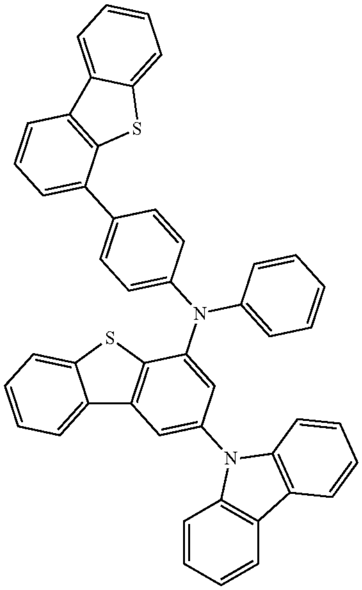
2-27
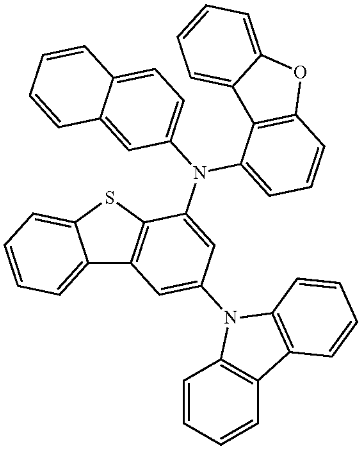
2-28
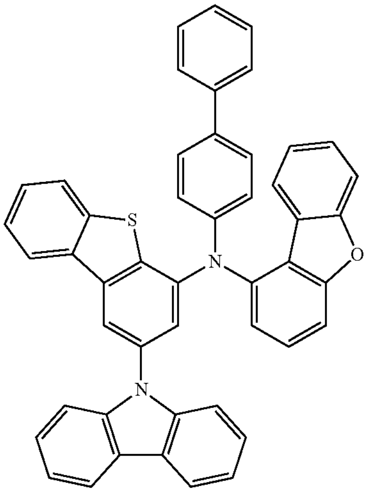

-continued
2-29
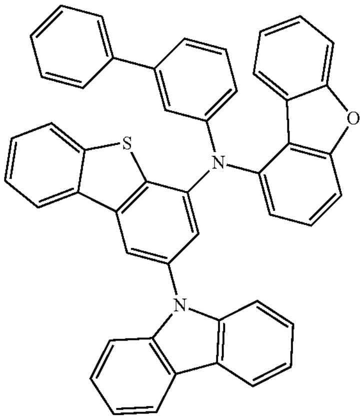
2-30
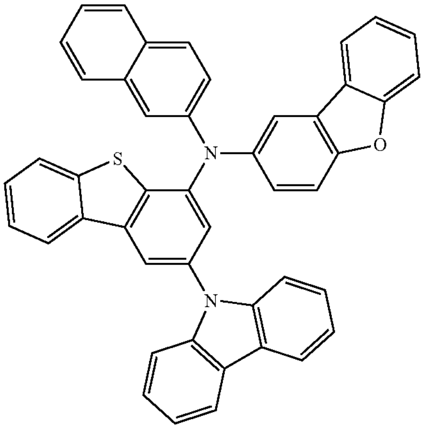
2-31
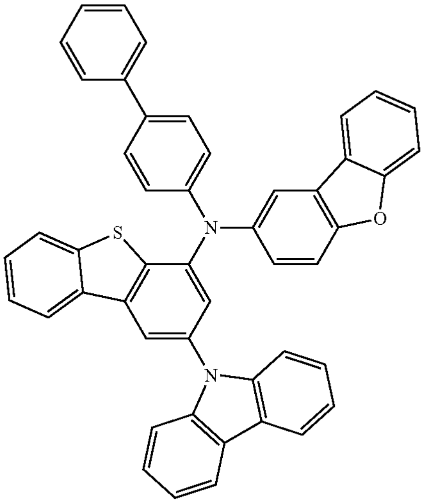
-continued
2-32
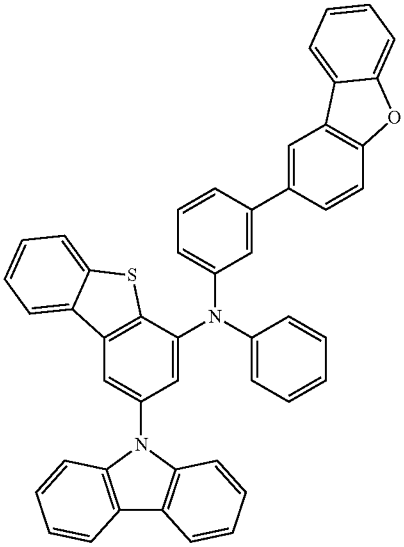
2-33
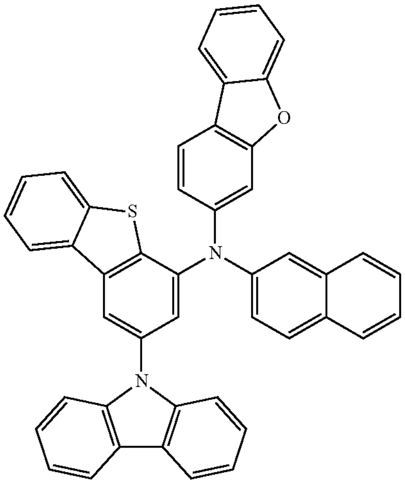
2-34
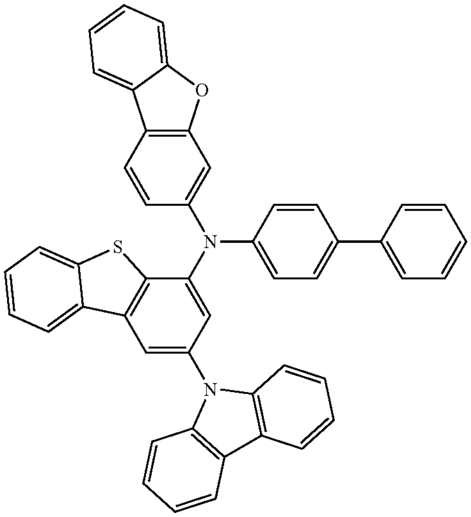

-continued
2-35
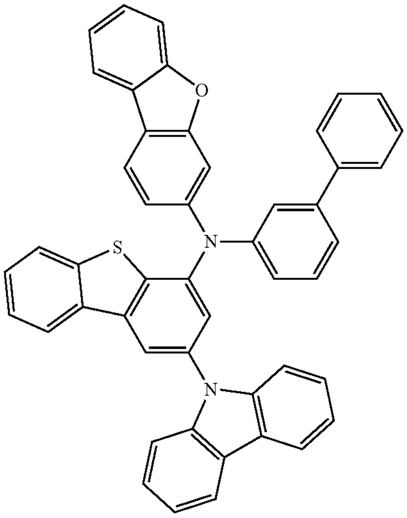
2-36
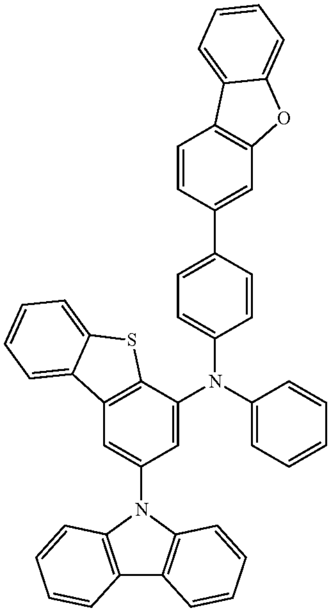
2-37
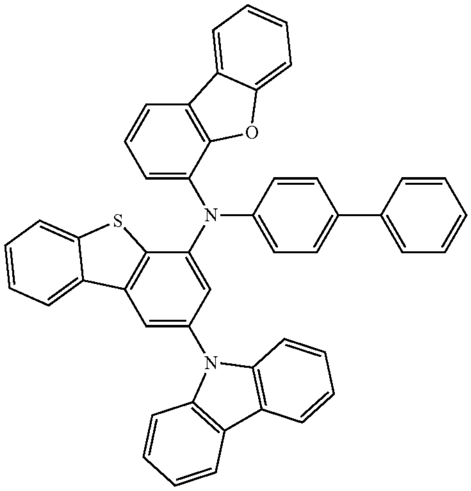
-continued
2-38
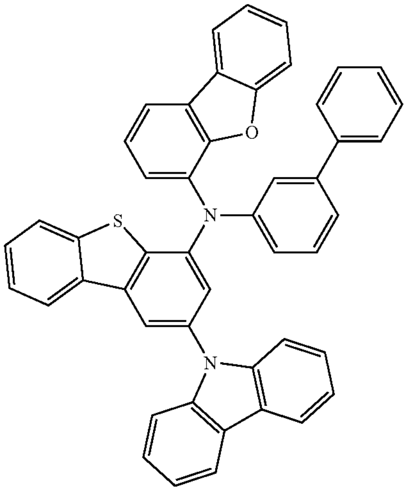
2-39
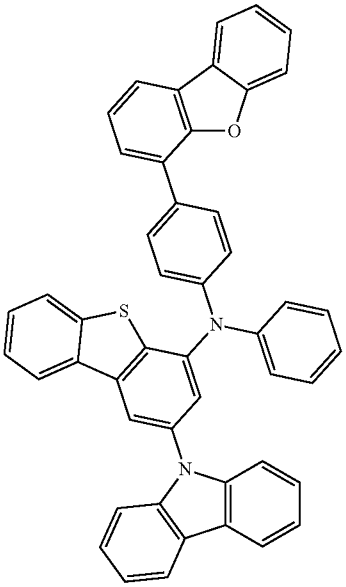
2-40
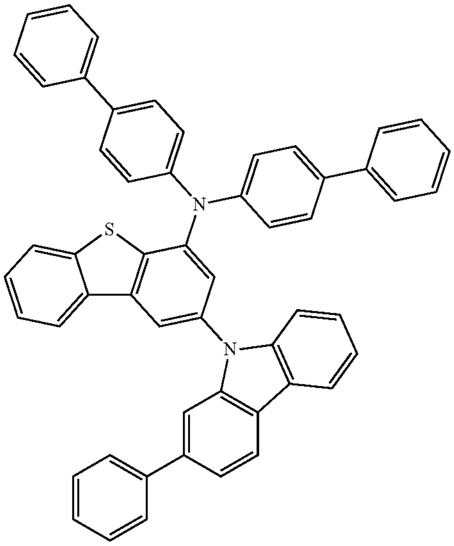

-continued
2-41
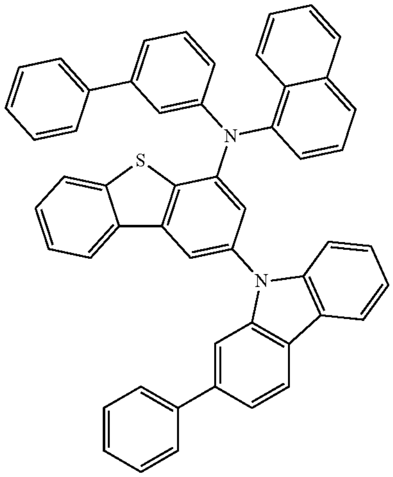
2-42
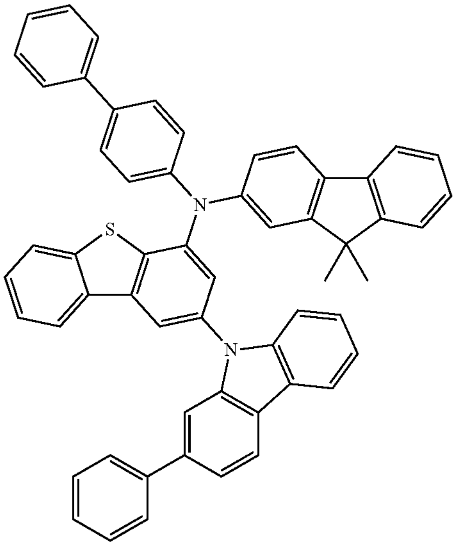
2-43
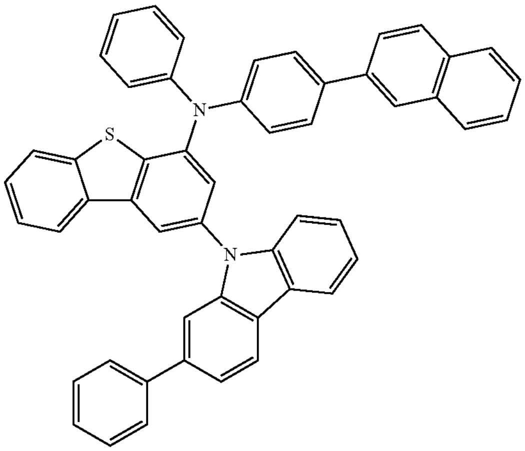
-continued
2-44
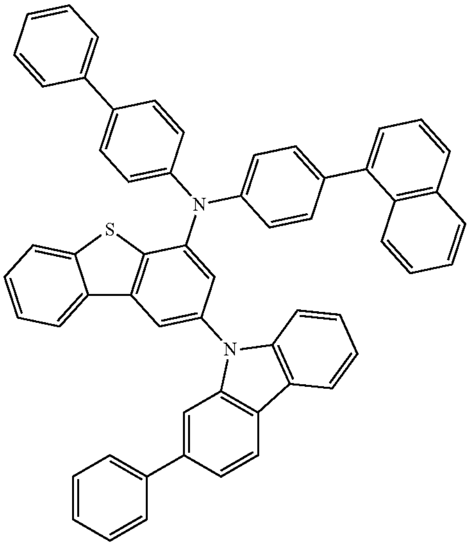
2-45
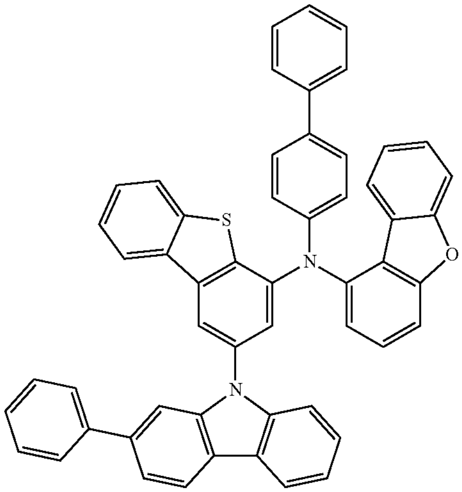
2-46
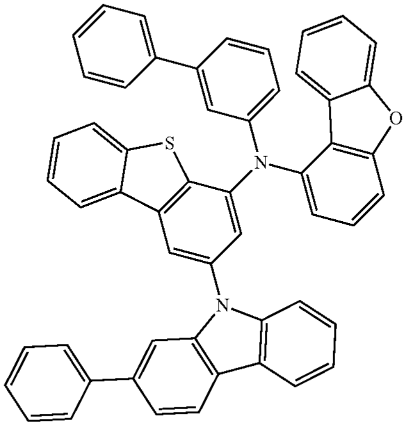

-continued
2-47
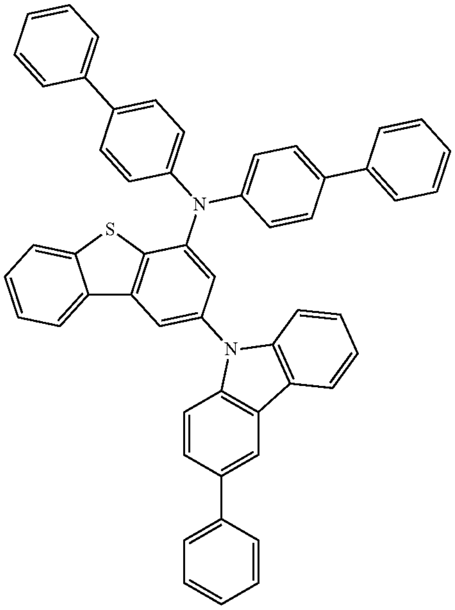
2-48
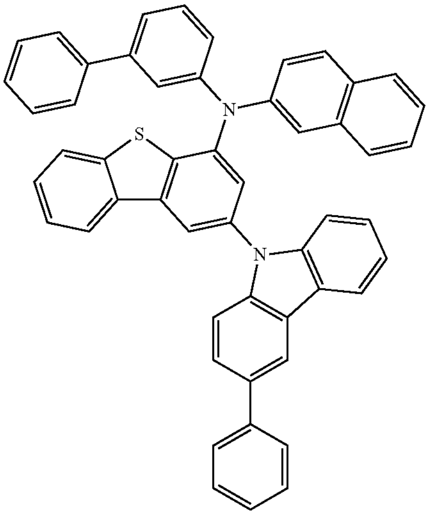
-continued
2-49
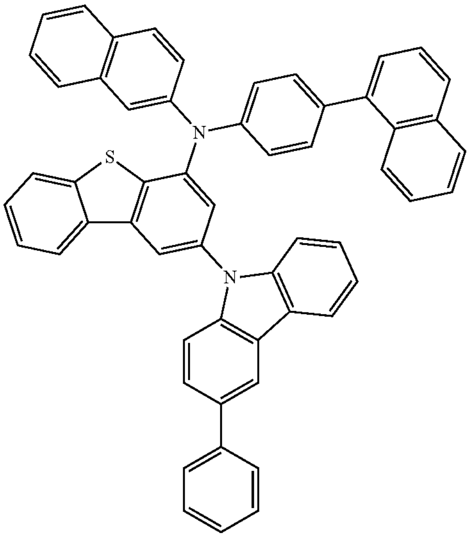
2-50
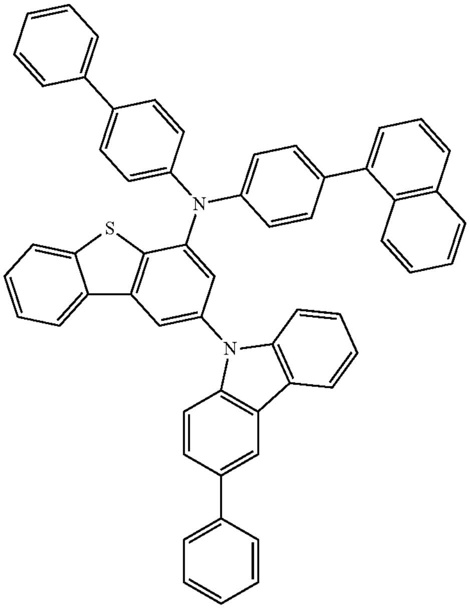

-continued
2-51
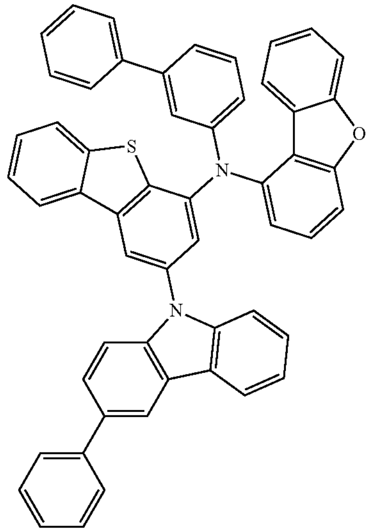
2-52
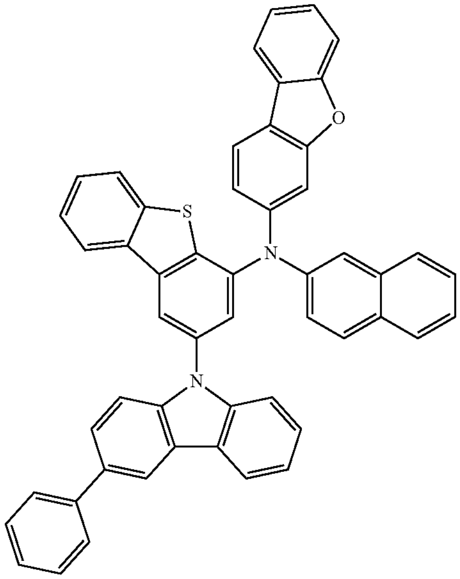
-continued
2-53
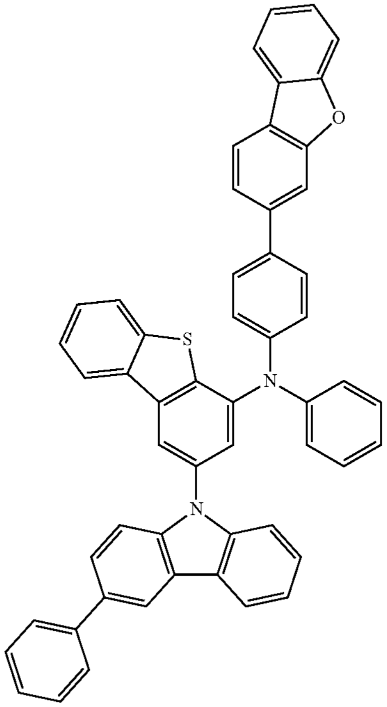
2-54
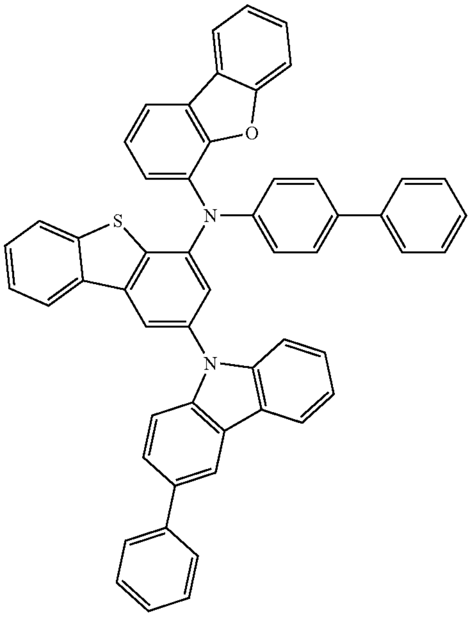

-continued
2-55
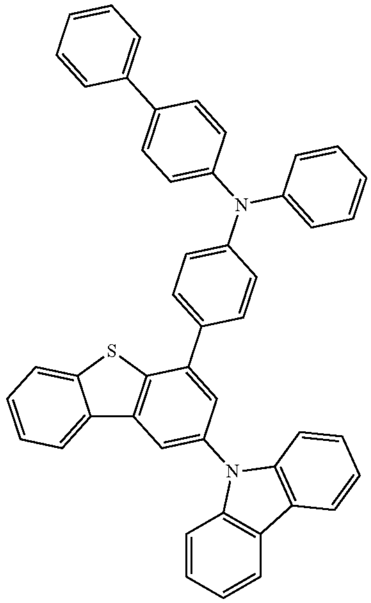
2-56
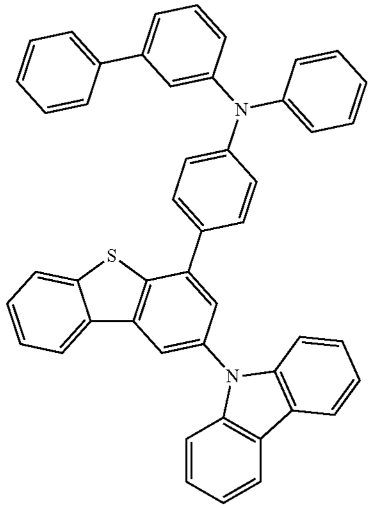
-continued
2-57
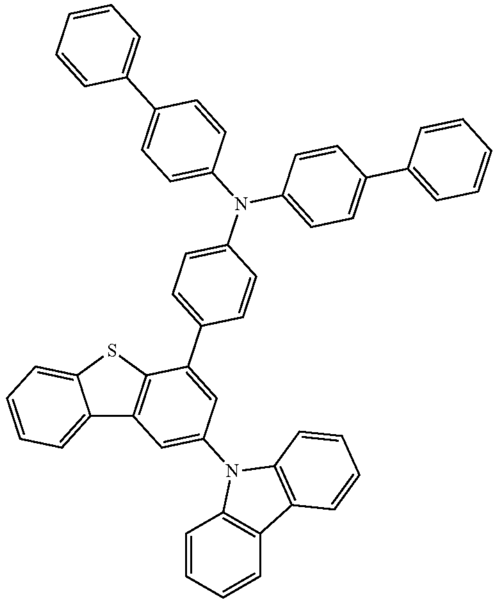
2-58
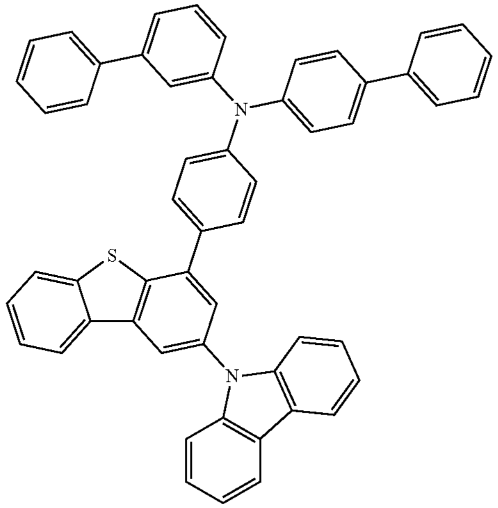
2-59
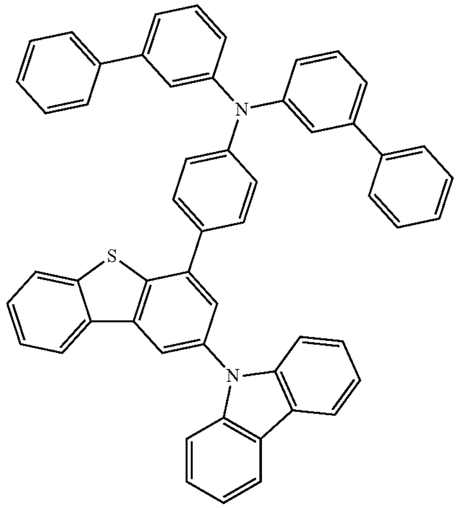

-continued
2-60
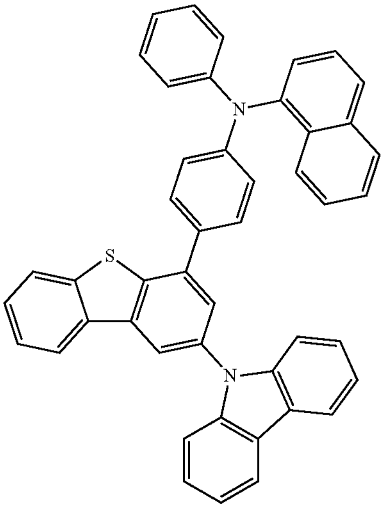
2-61
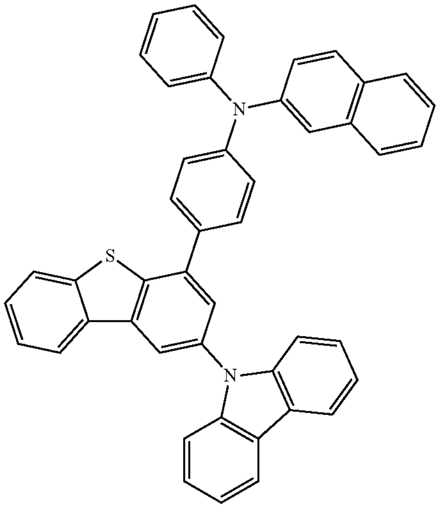
2-62
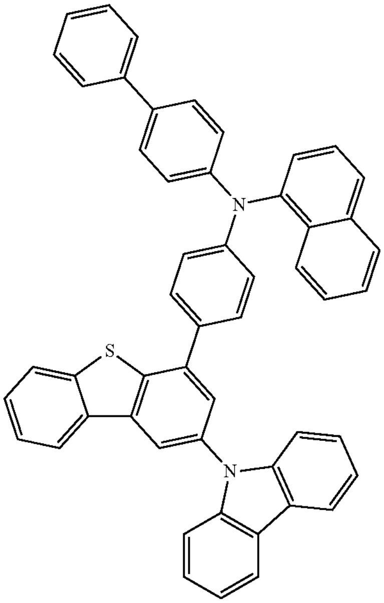
-continued
2-63
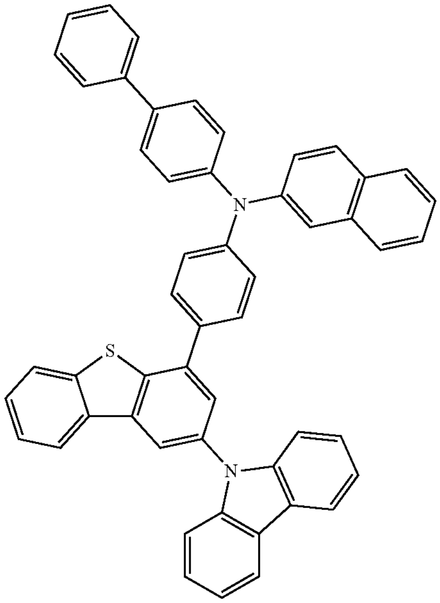
2-64
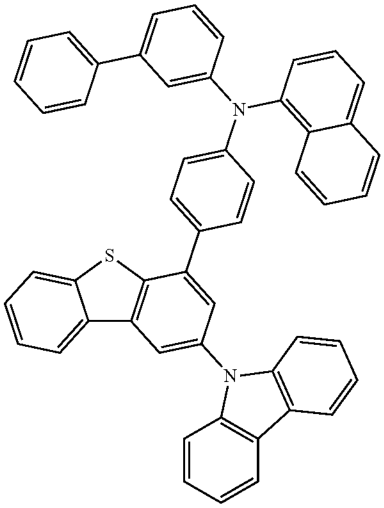
2-65
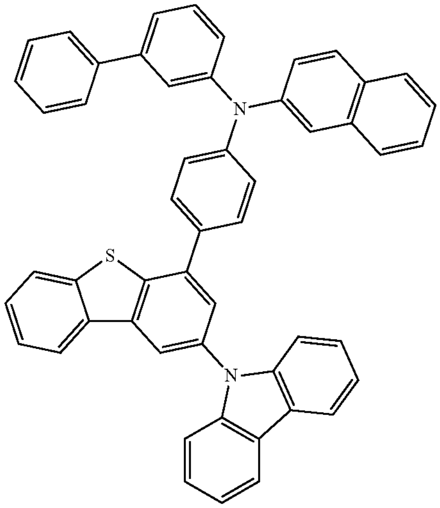

-continued
2-66
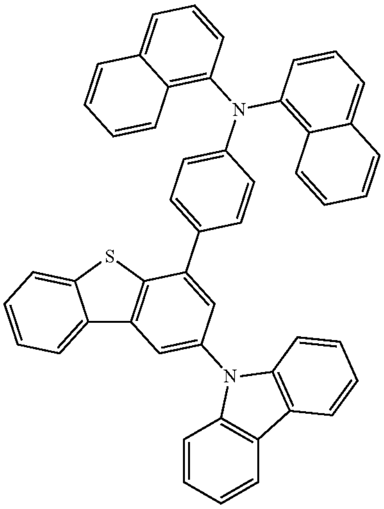
2-67
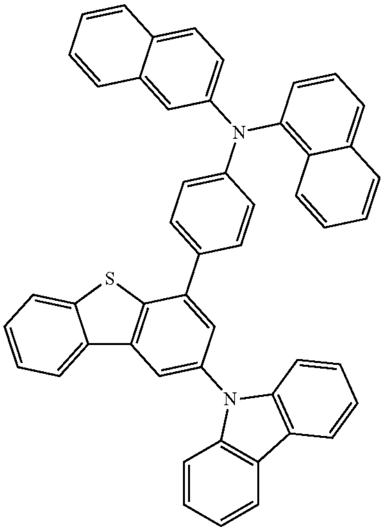
2-68
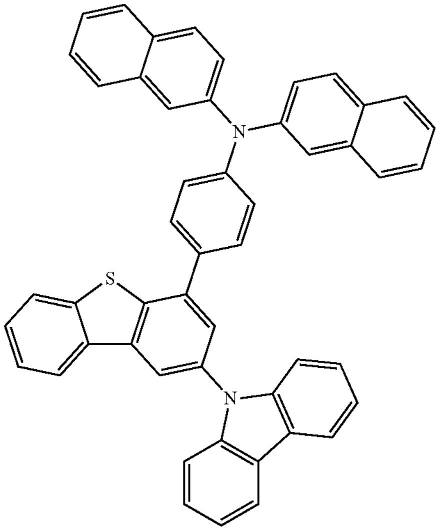
-continued
2-69
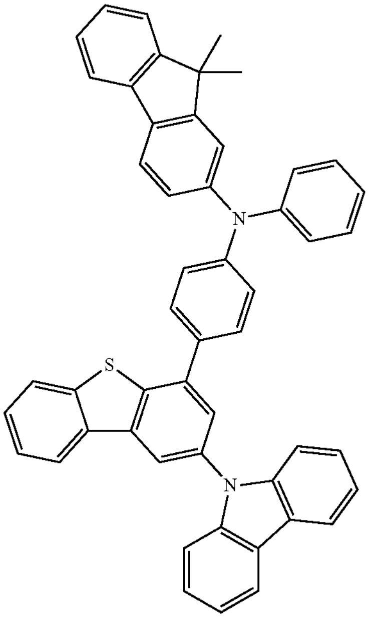
2-70
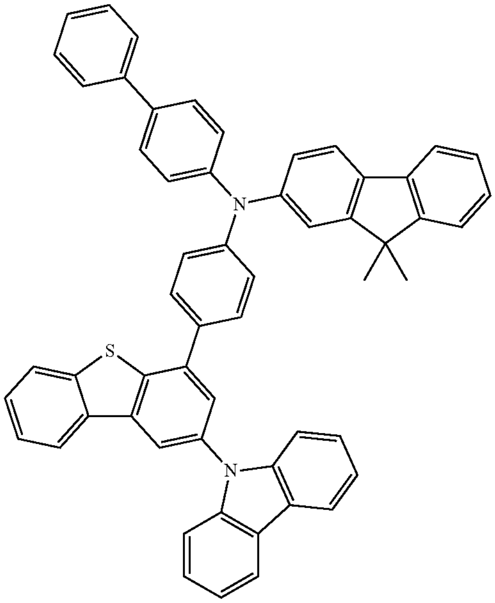

-continued
2-71
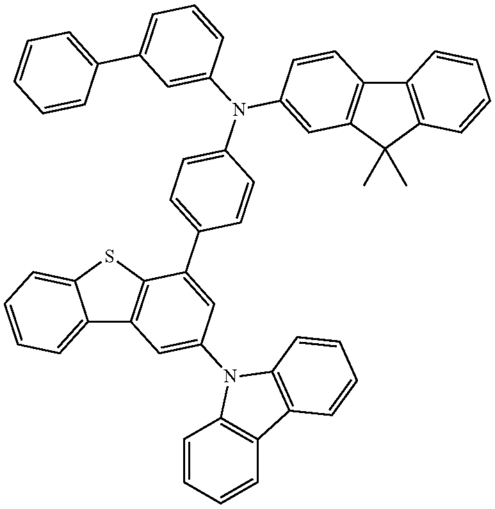
2-72
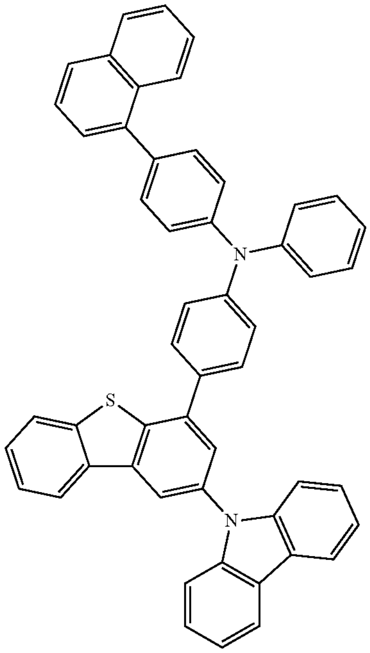
-continued
2-73
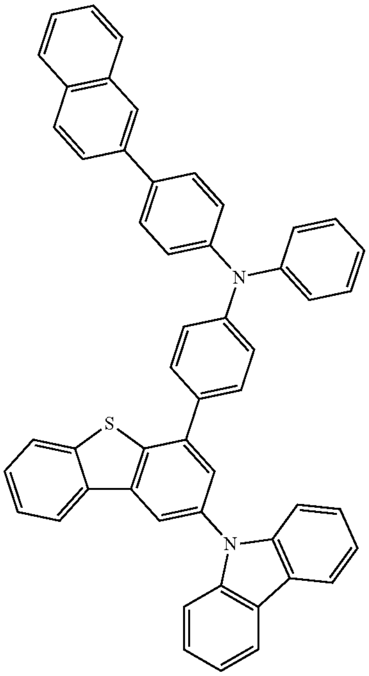
2-74
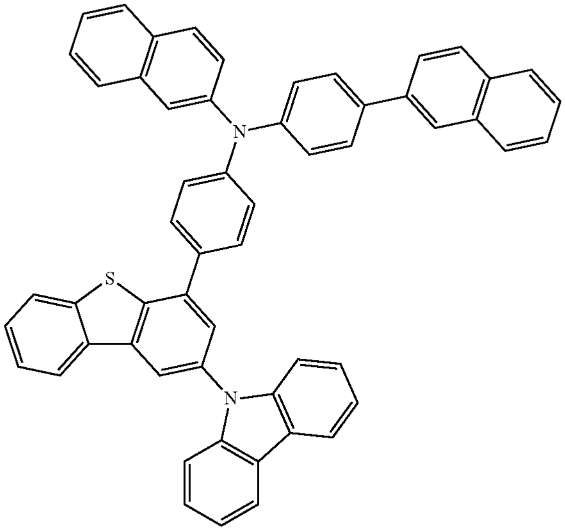

-continued
2-75
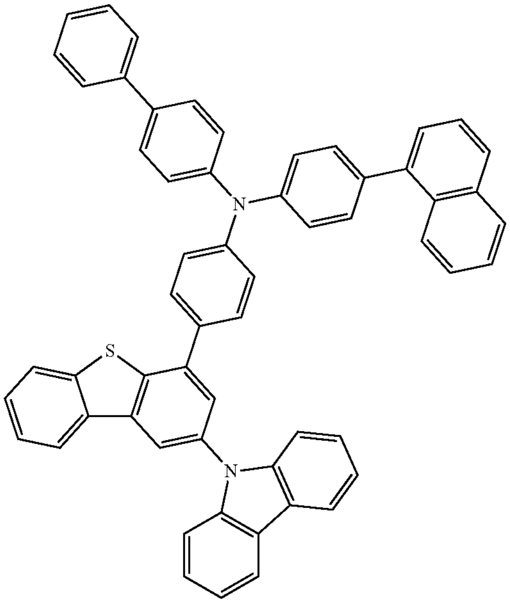
2-76
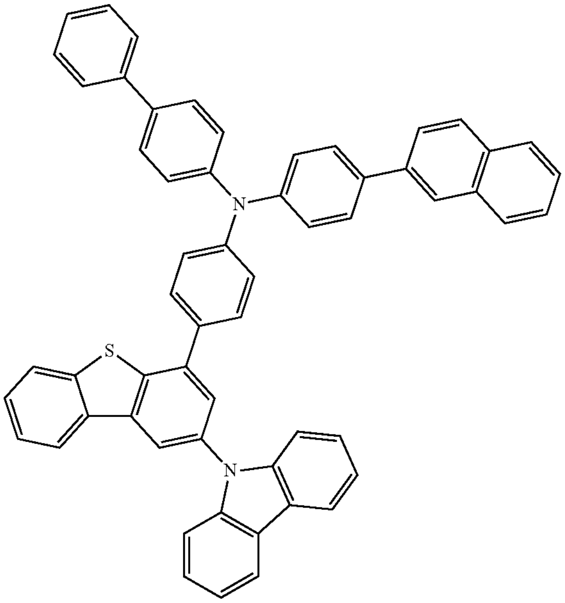
-continued
2-77
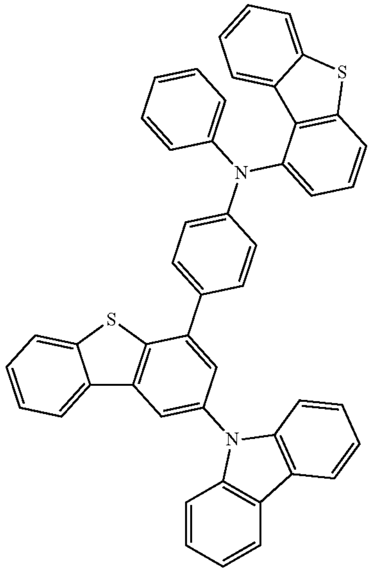
2-78
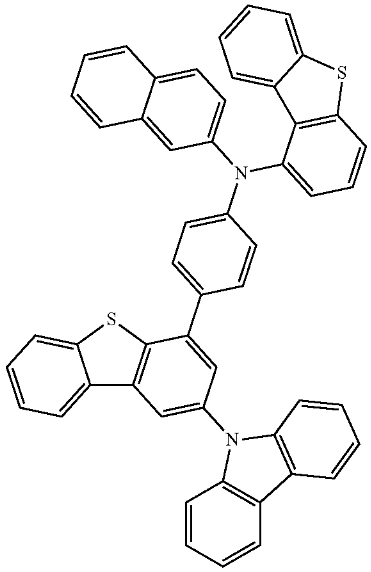

-continued
2-79
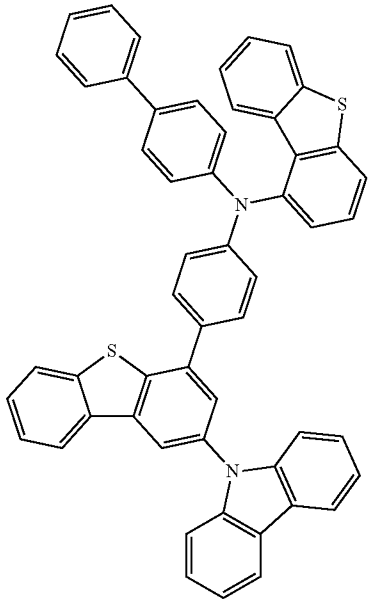
2-80
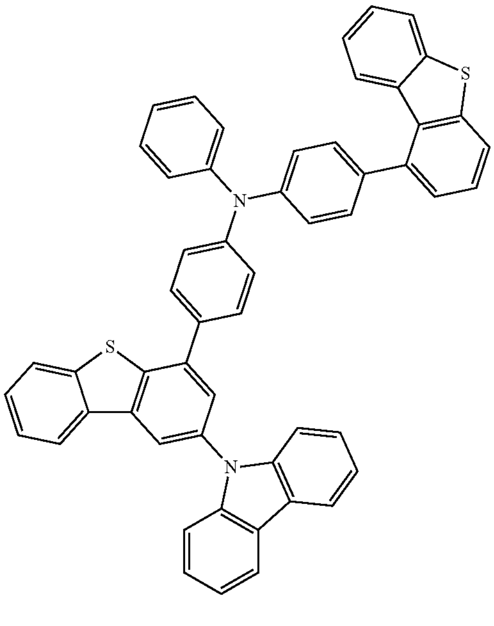
-continued
2-81
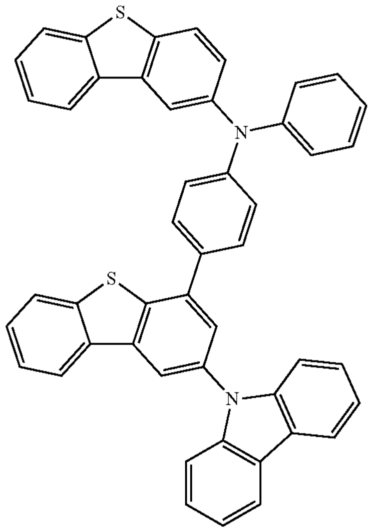
2-82
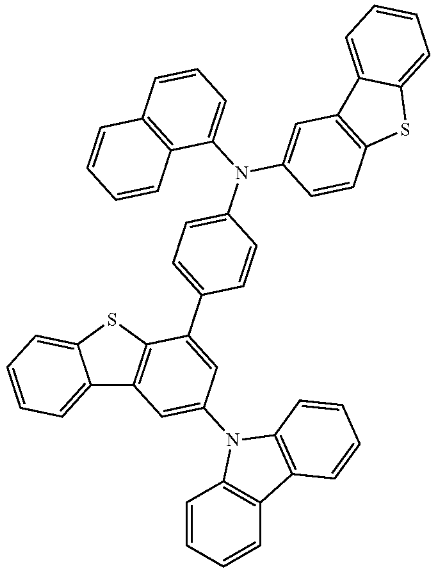

2-83
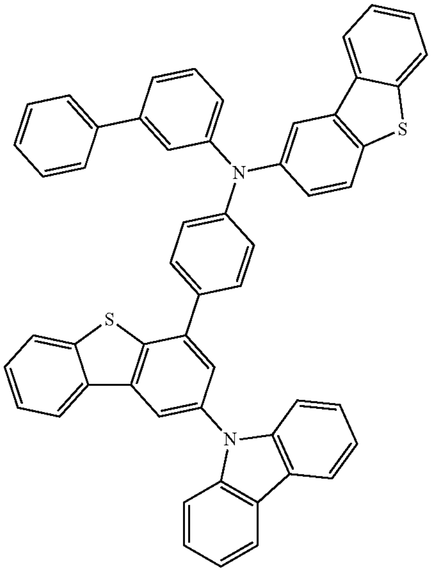
2-84
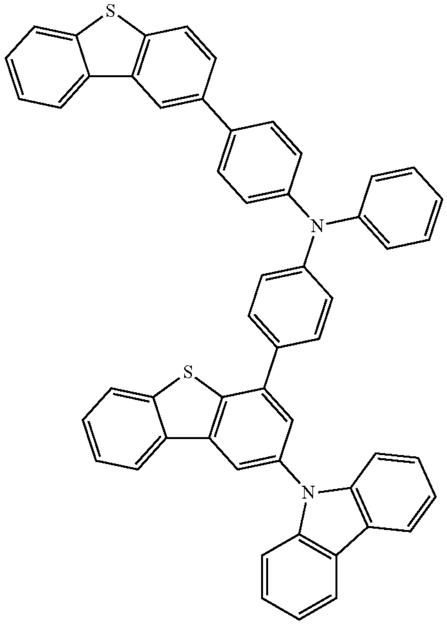
2-85
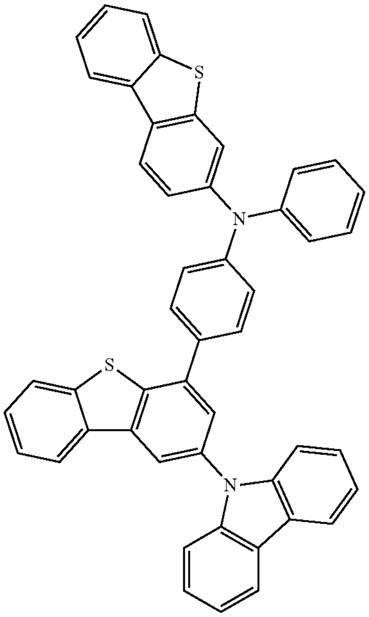
2-86
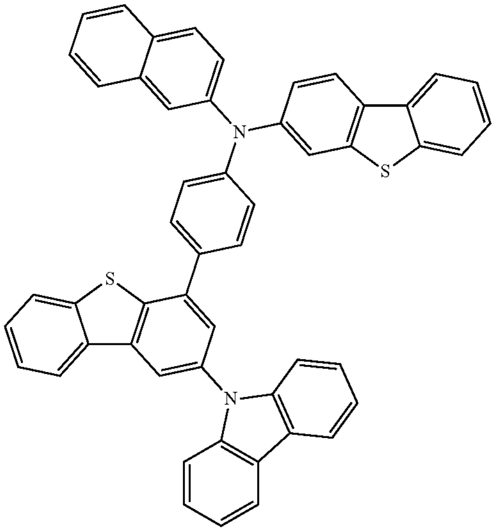

-continued
2-87
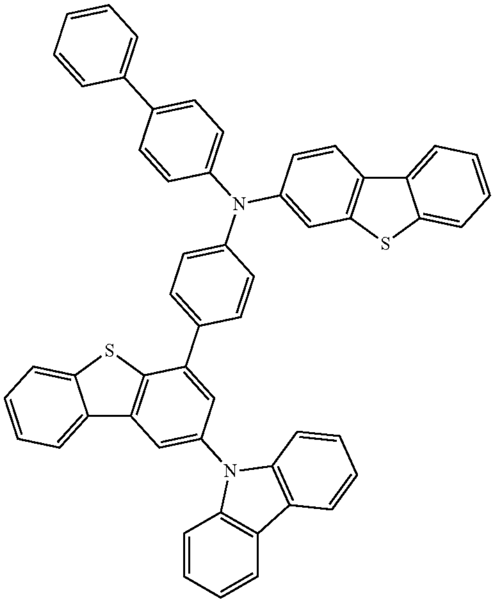
2-88
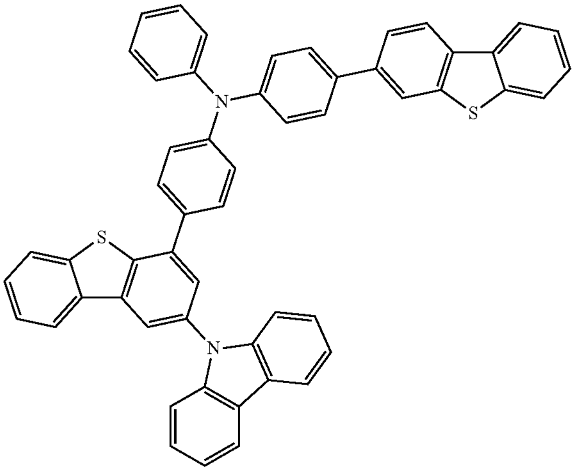
2-89
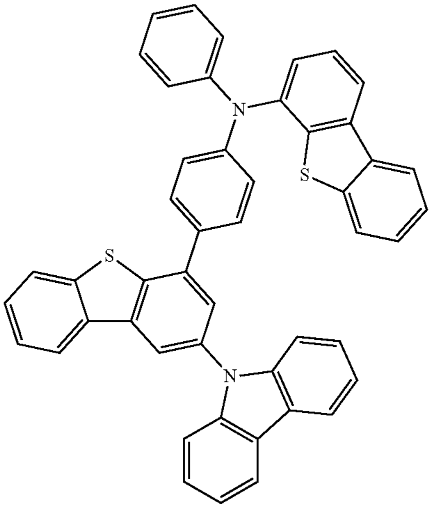
-continued
2-90
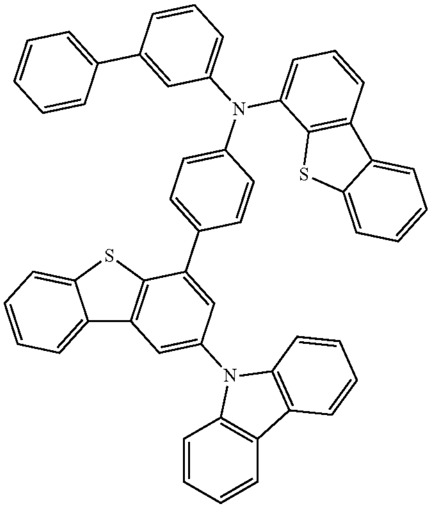
2-91
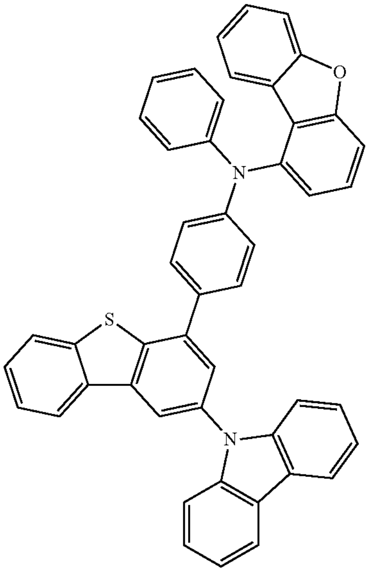
2-92
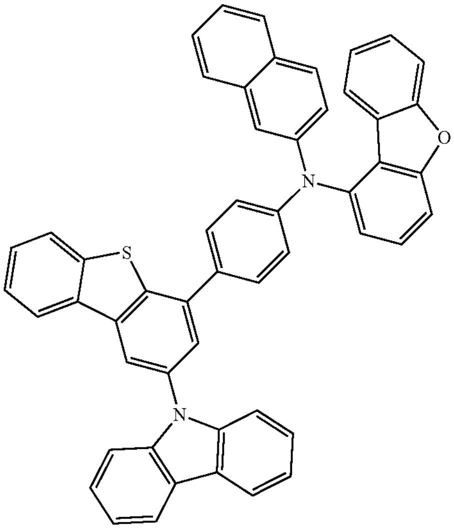

-continued
2-93
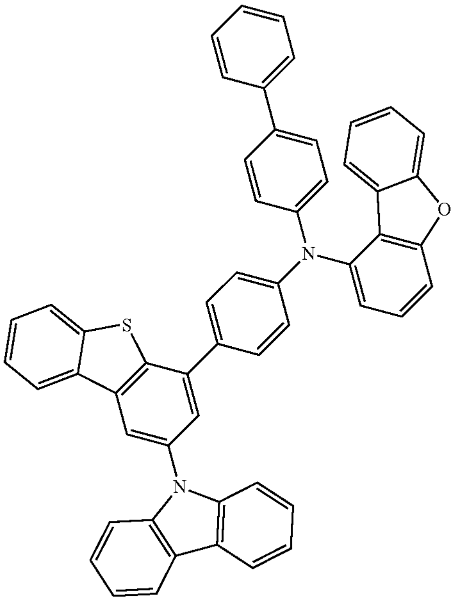
2-94
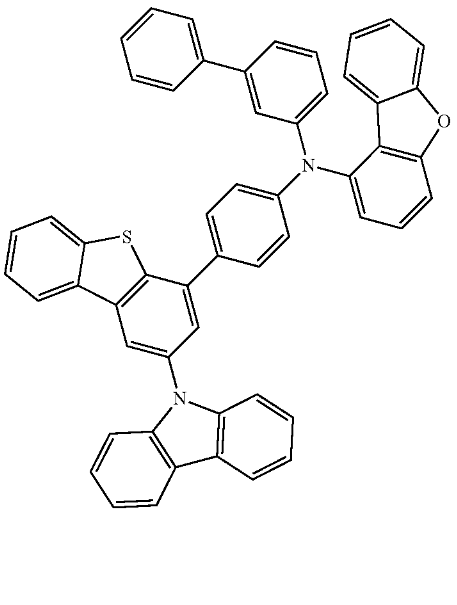
-continued
2-95
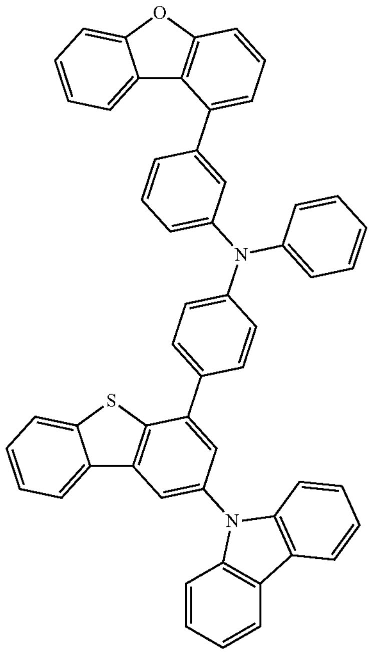
2-96
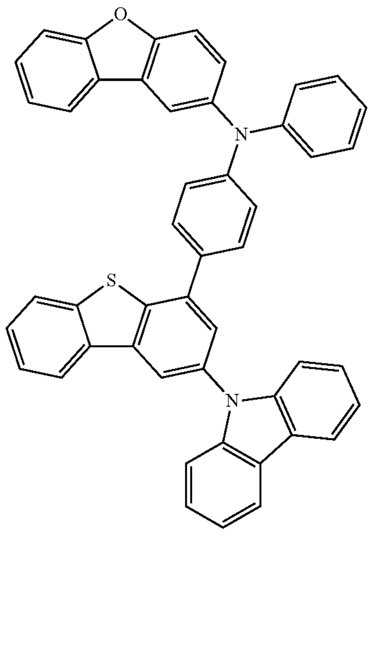

-continued
2-97
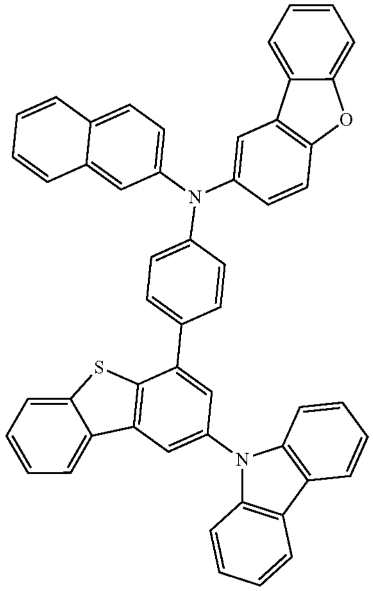
2-98
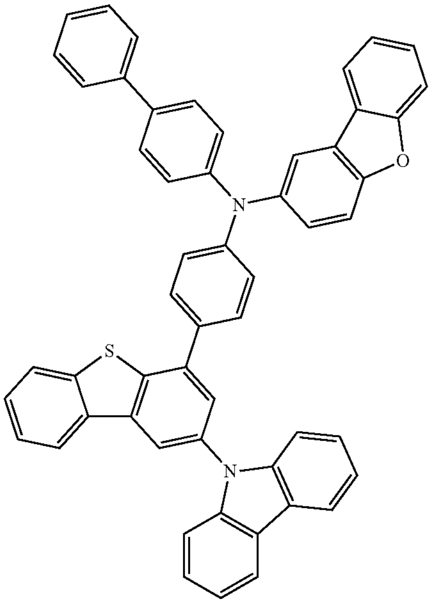
-continued
2-99
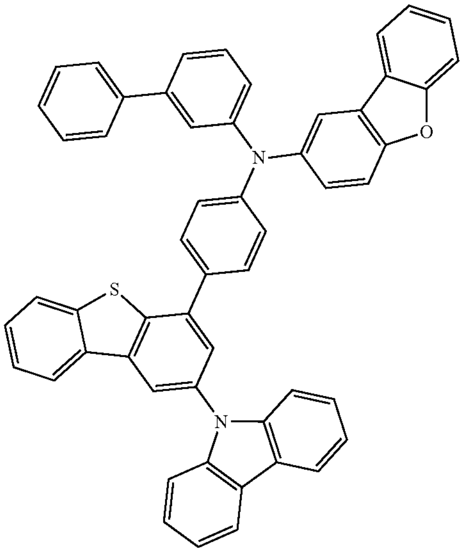
2-100
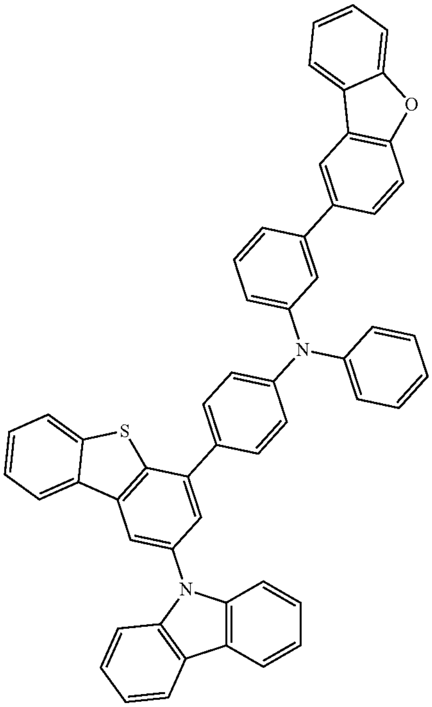

-continued
2-101
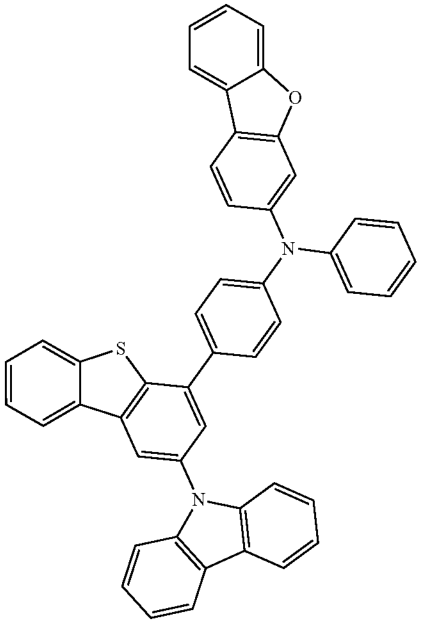
2-102
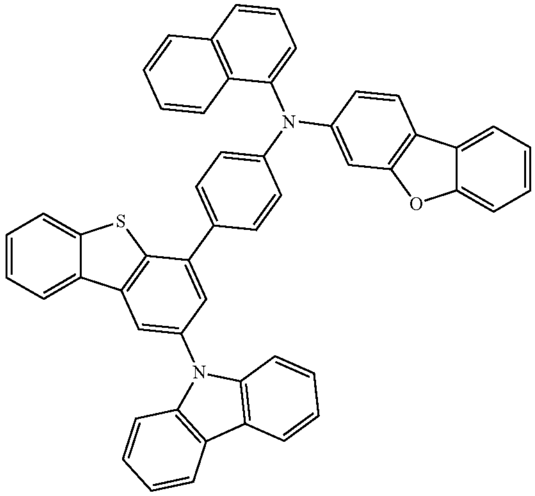
2-103
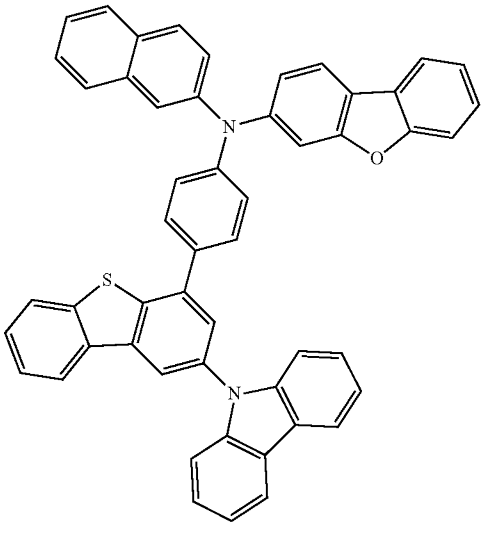
-continued
2-104
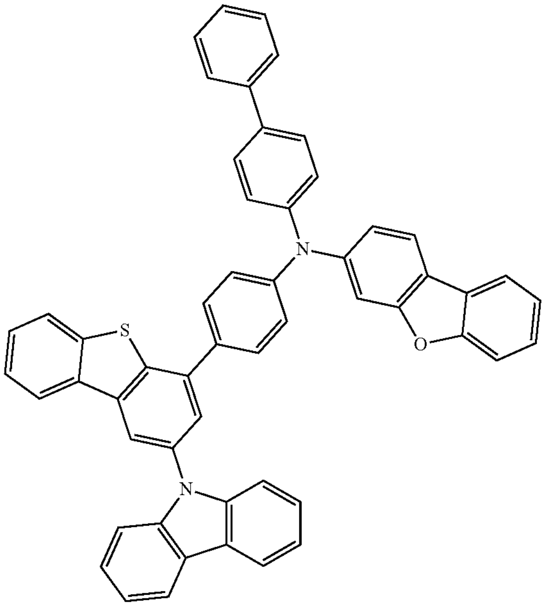
2-105
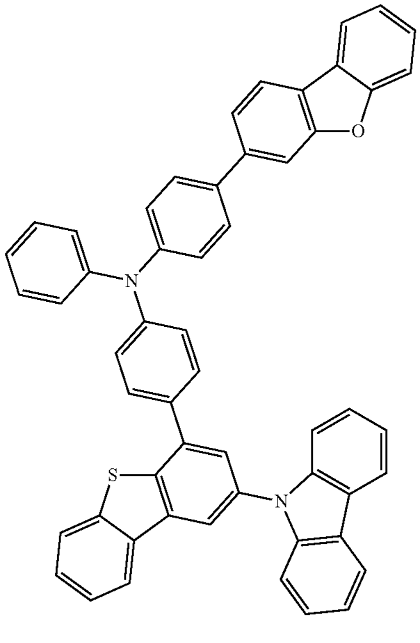

-continued
2-106
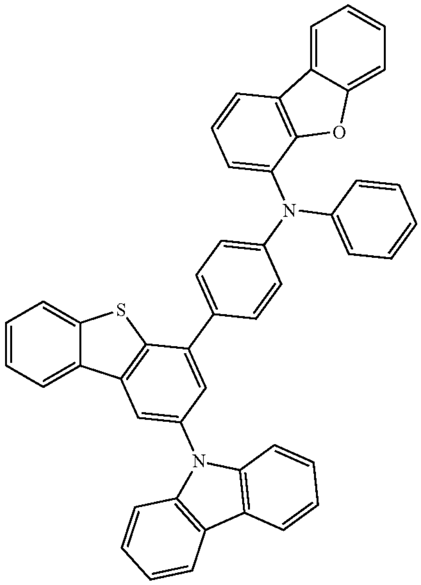
2-107
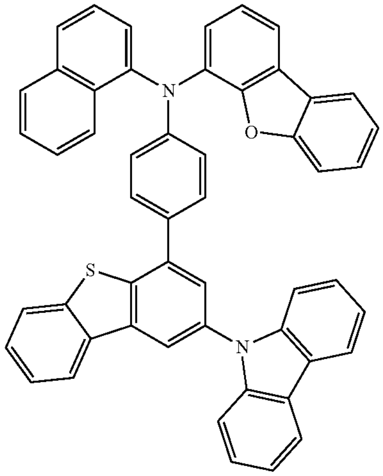
2-108
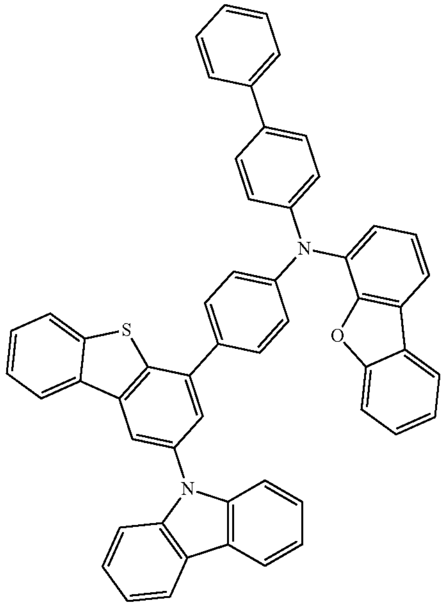
-continued
2-109
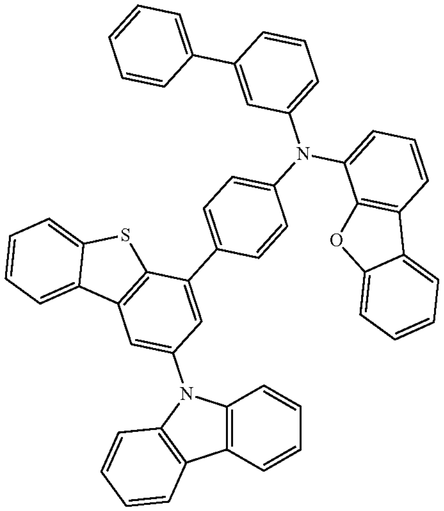
2-110
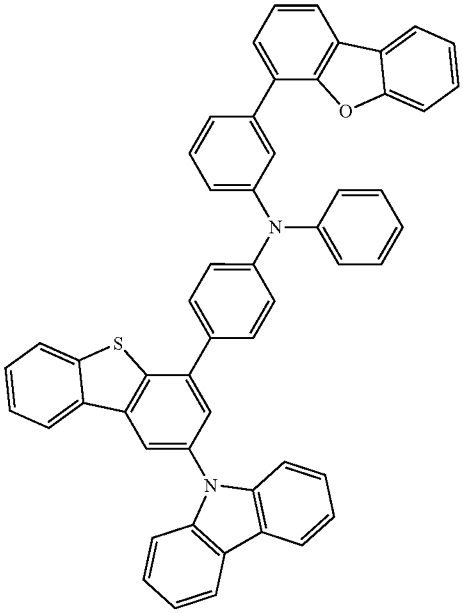

-continued
2-111
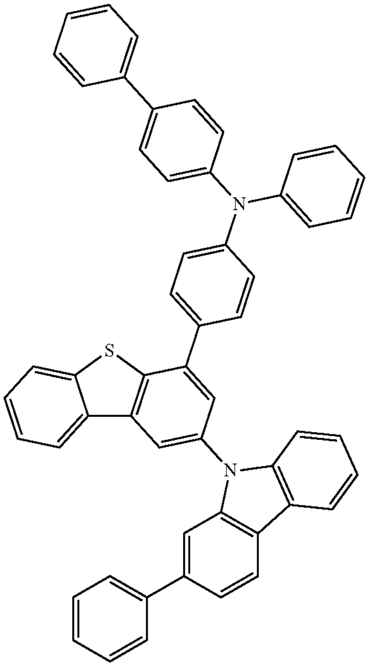
2-112
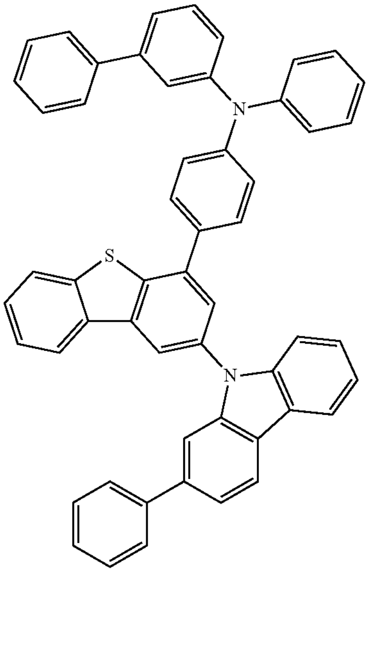
-continued
2-113
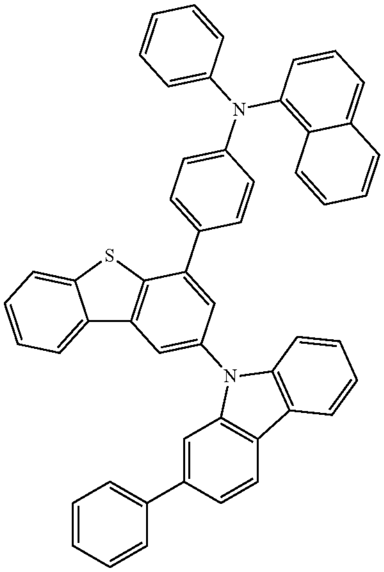
2-114
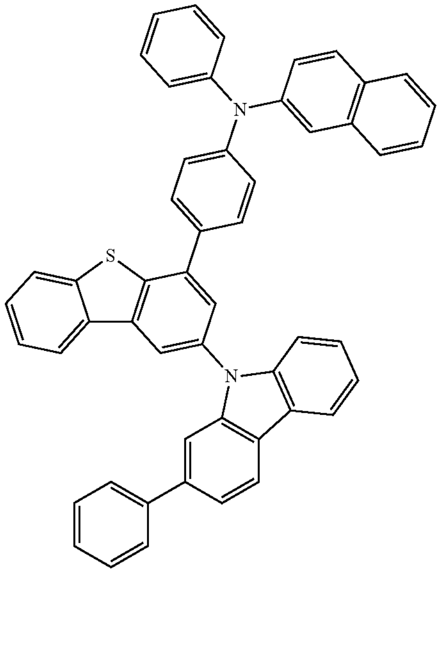

-continued
2-115
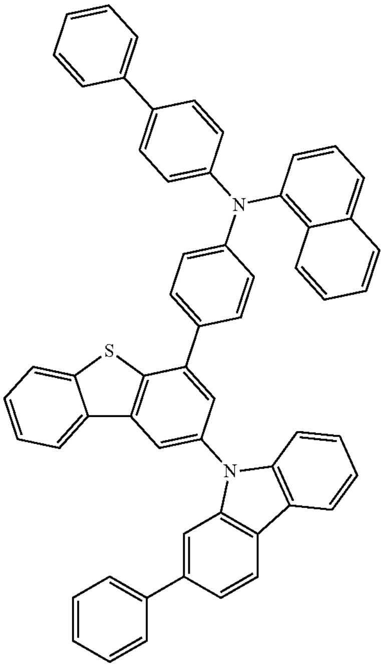
2-116
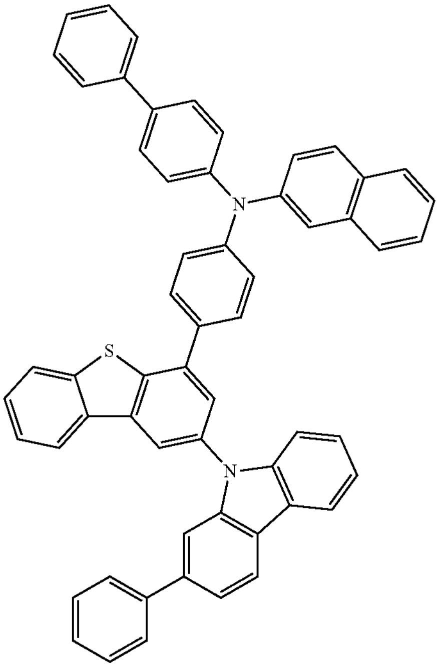
-continued
2-117
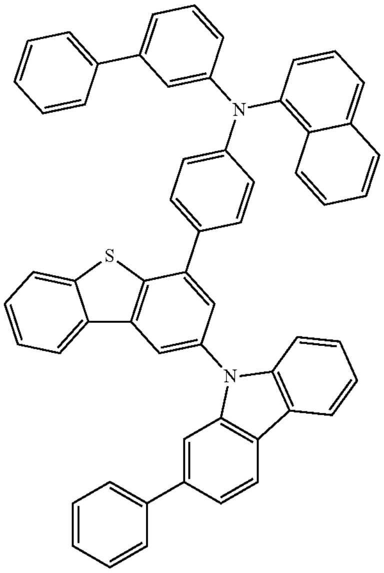
2-118
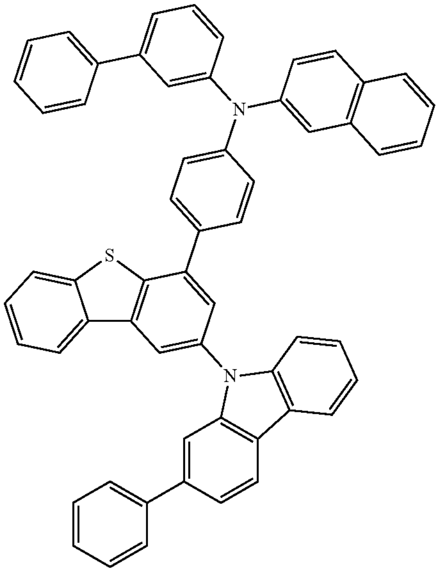

-continued
2-119
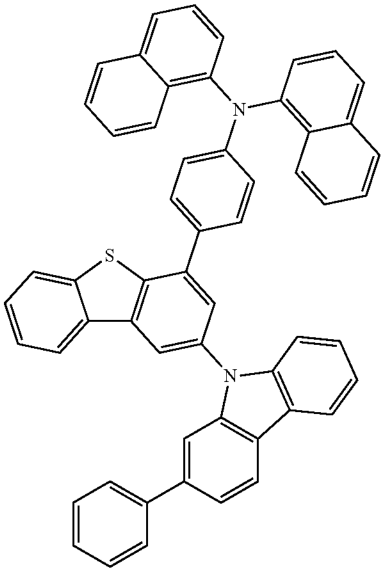
2-120
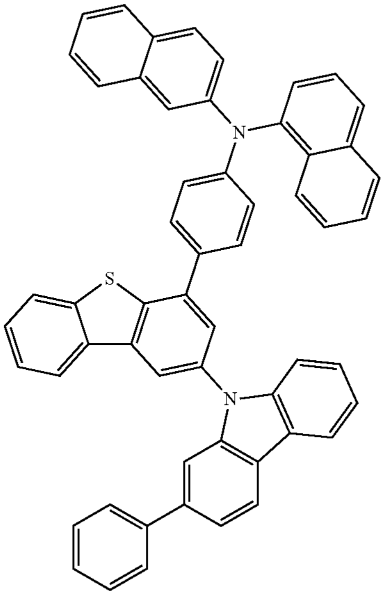
-continued
2-121
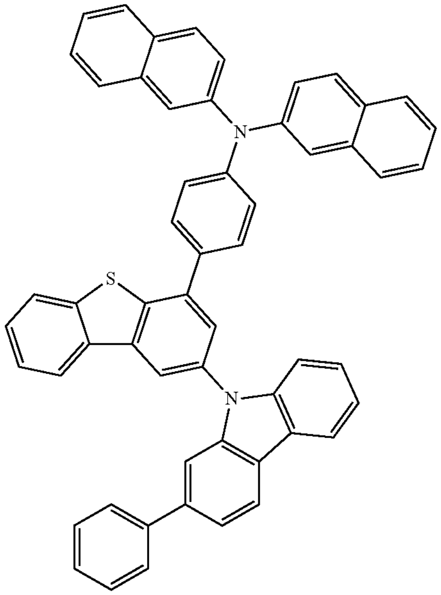
2-122
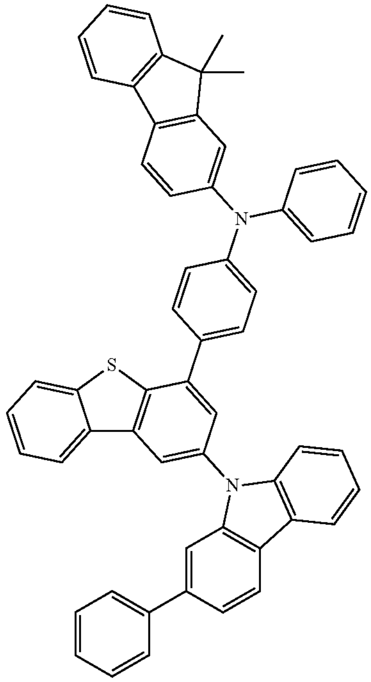

-continued
2-123
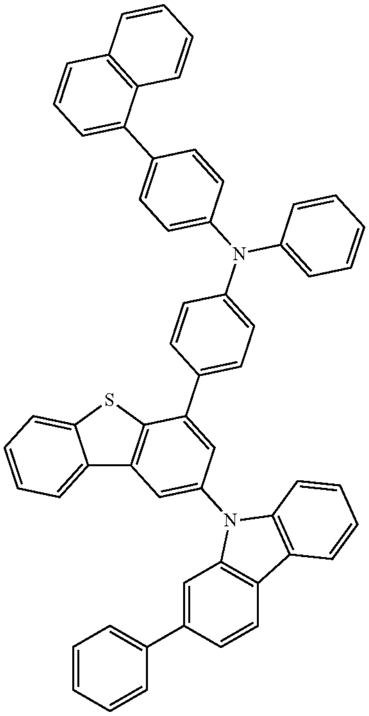
2-124
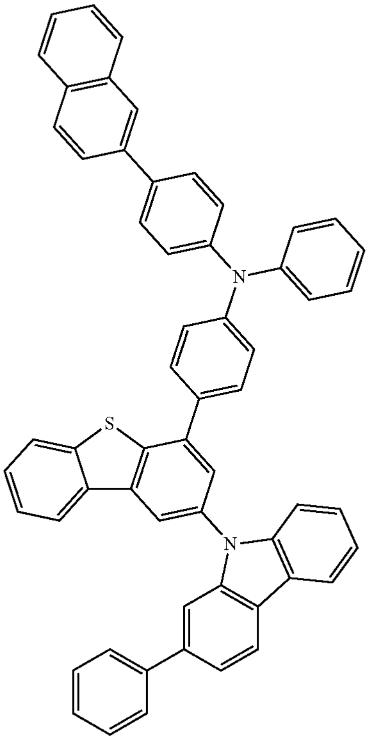
-continued
2-125
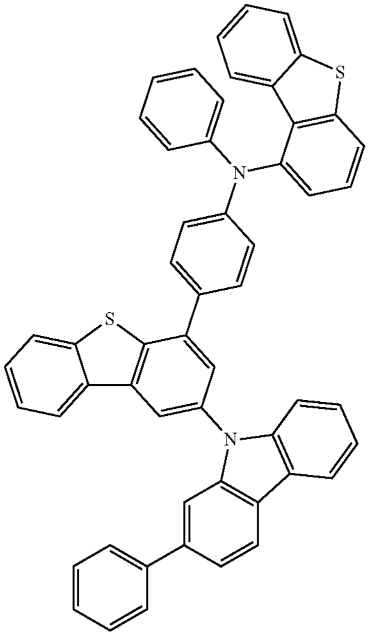
2-126
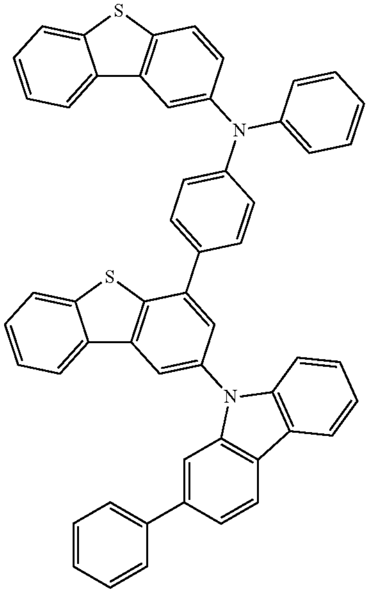

-continued
2-127
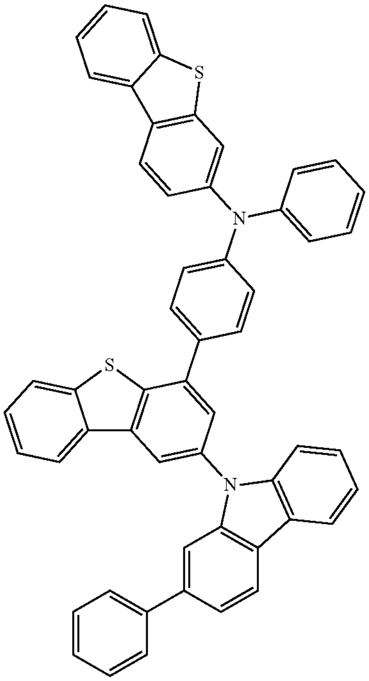
2-128
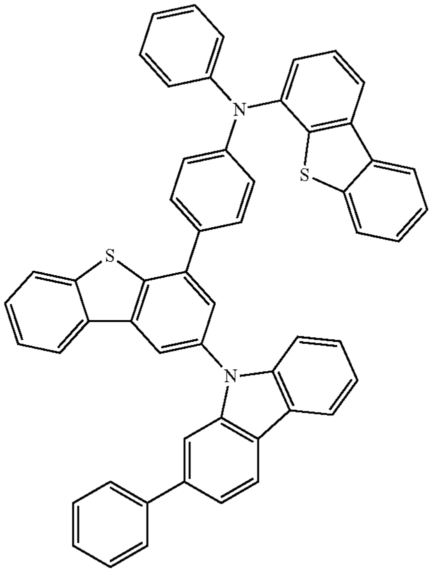
-continued
2-129
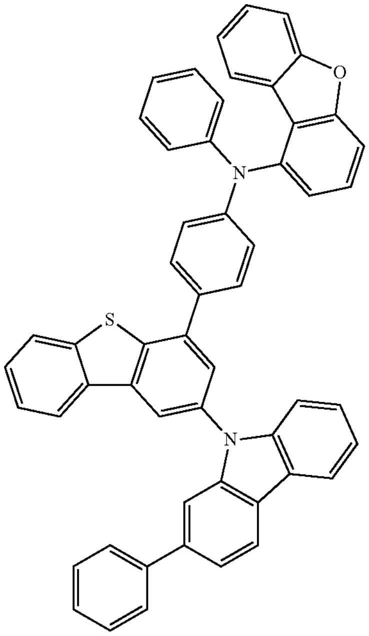
2-130
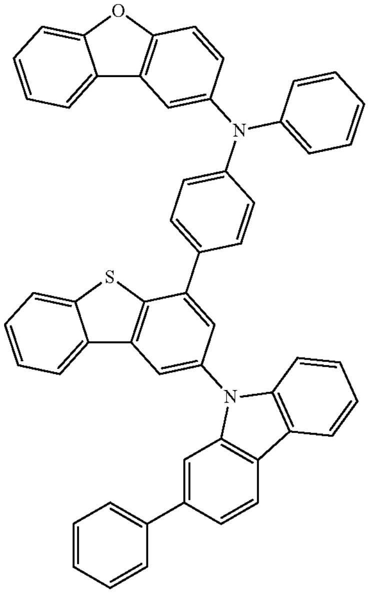

-continued
2-131
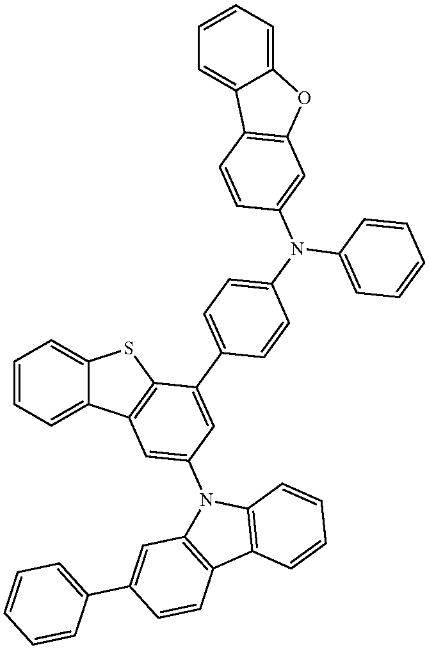
2-132
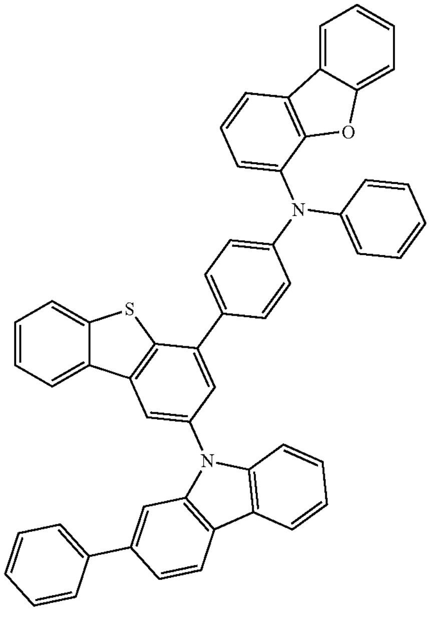
-continued
2-133
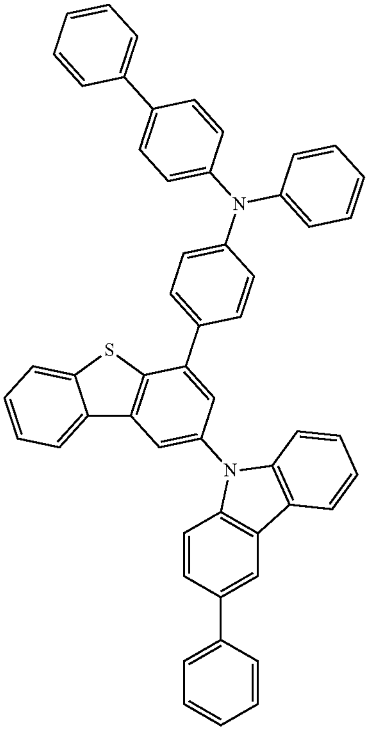
2-134
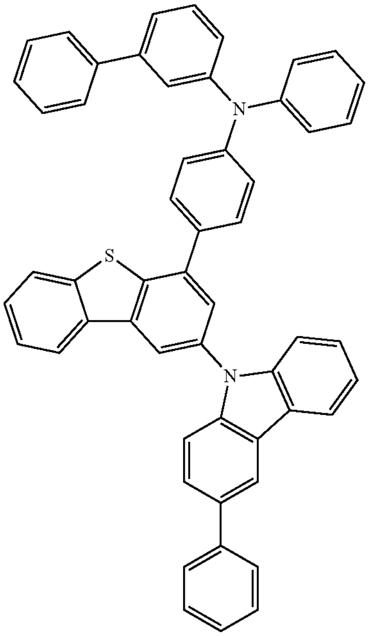

-continued
2-135
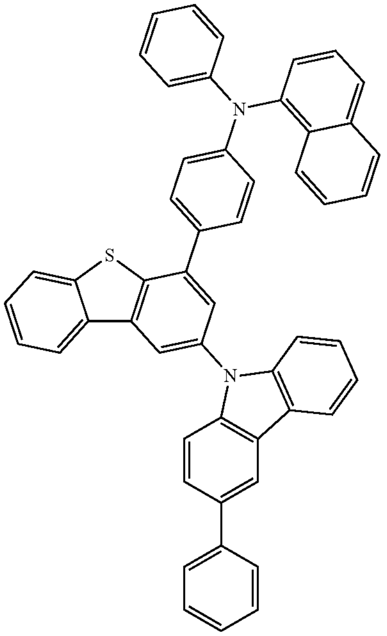
2-136
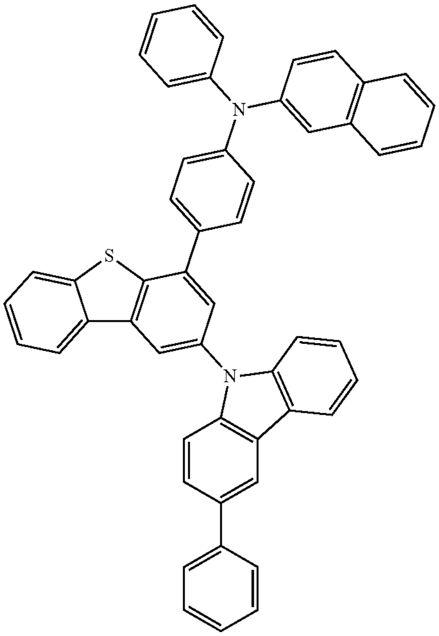
-continued
2-137
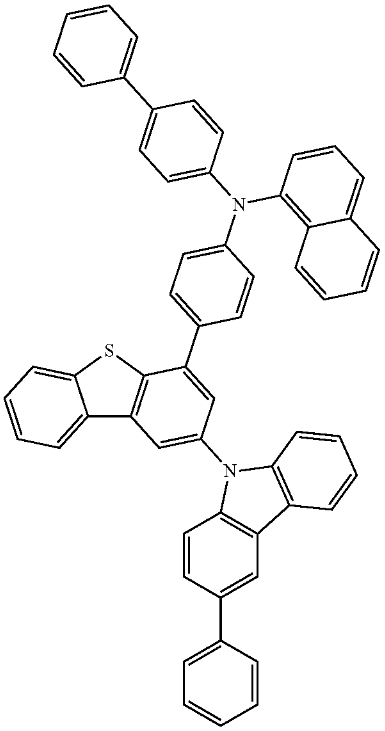
2-138
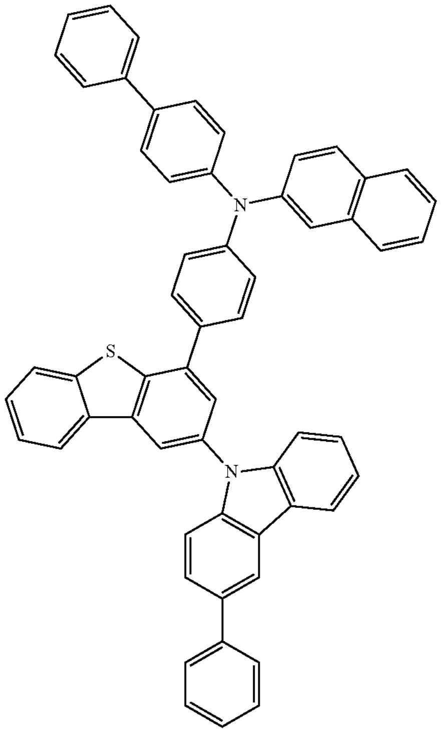

-continued
2-139
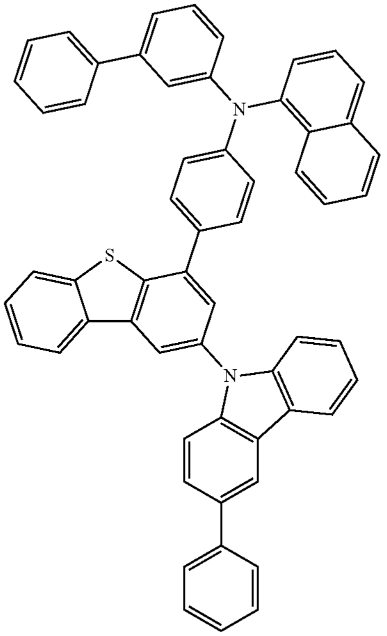
2-140
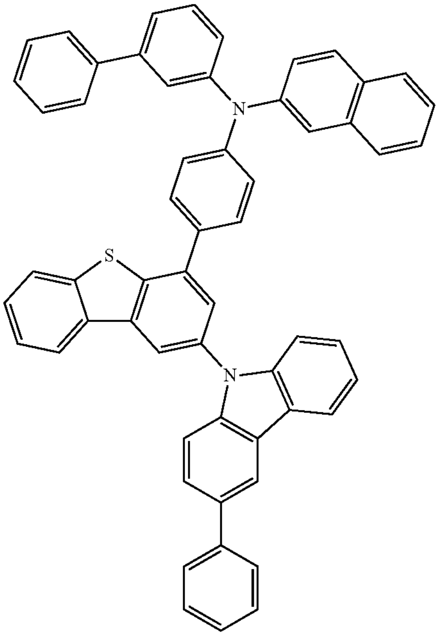
-continued
2-141
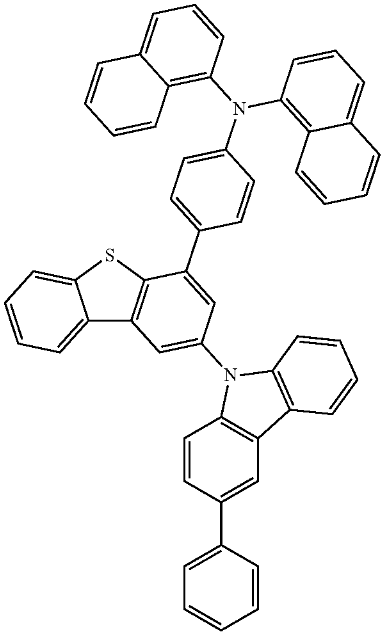
2-142
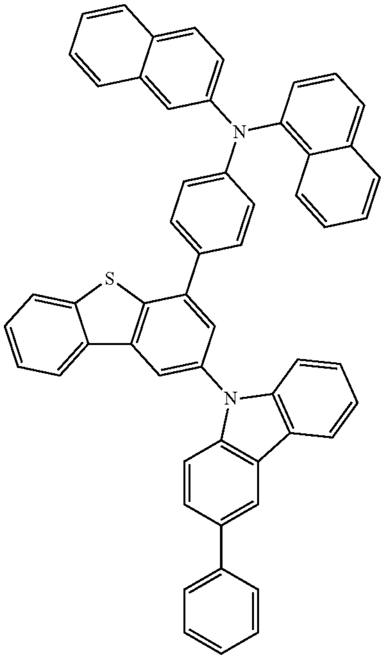

-continued
2-143
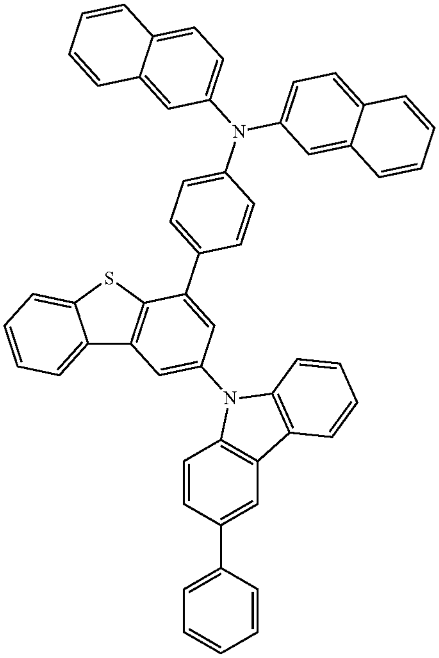
2-144
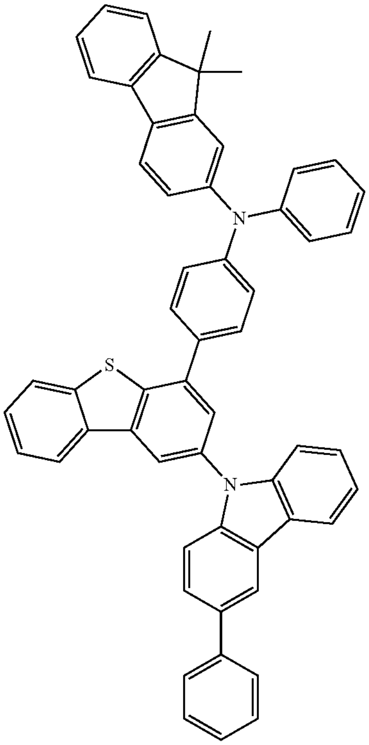
-continued
2-145
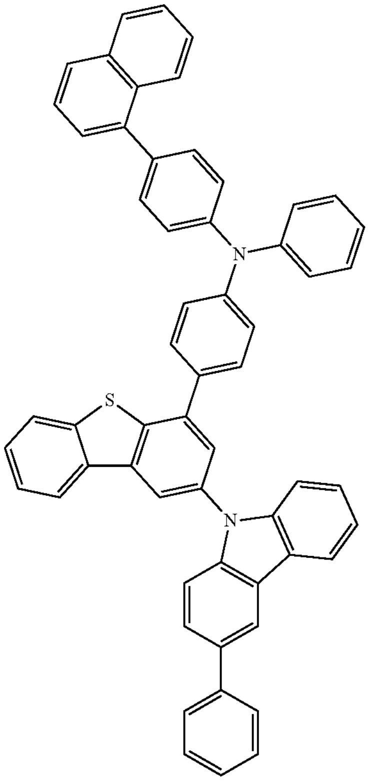
2-146
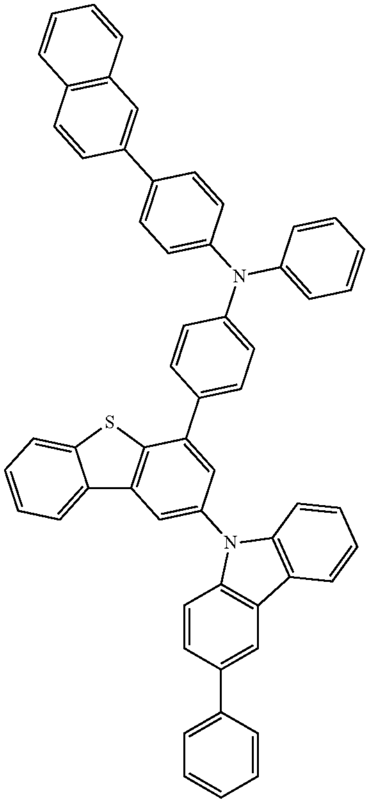

-continued
2-147
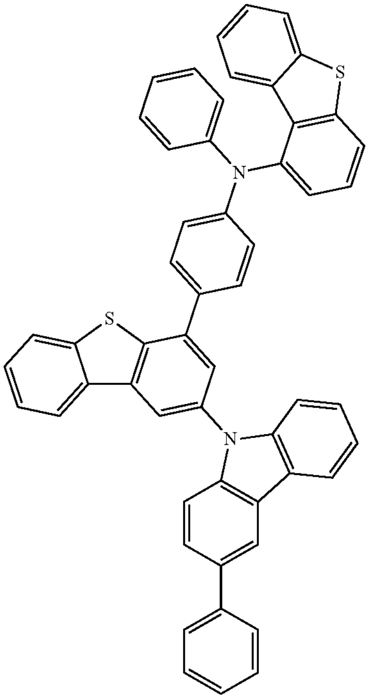
2-148
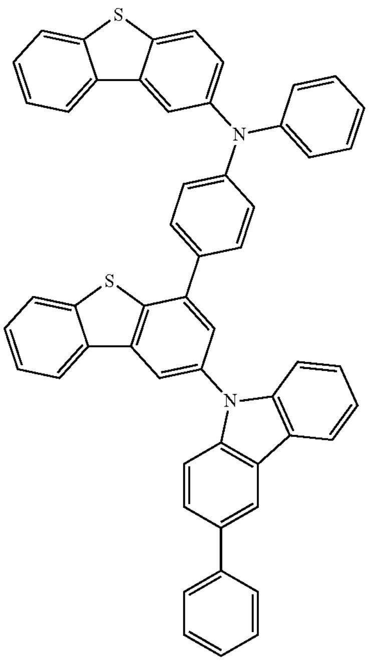
-continued
2-149
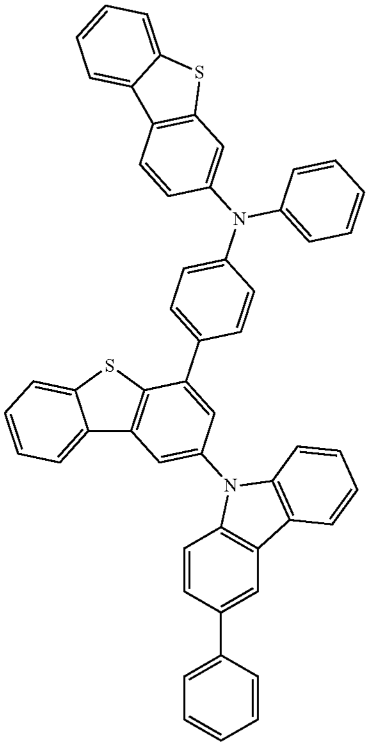
2-150
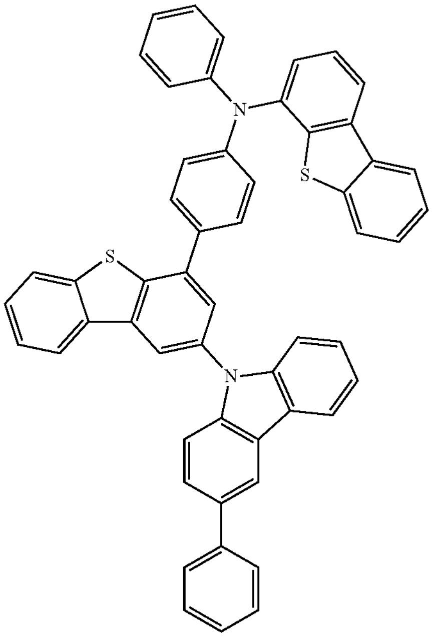

-continued
2-151
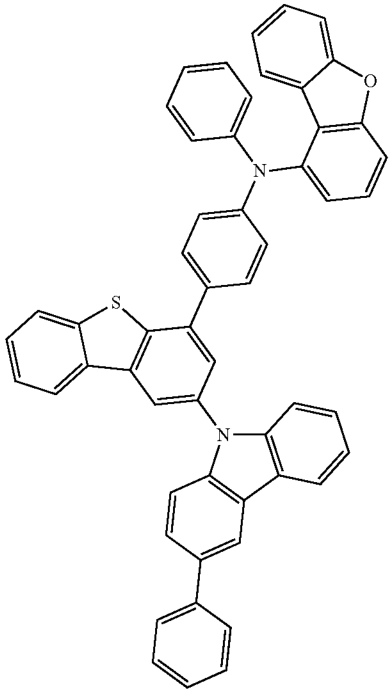
2-152
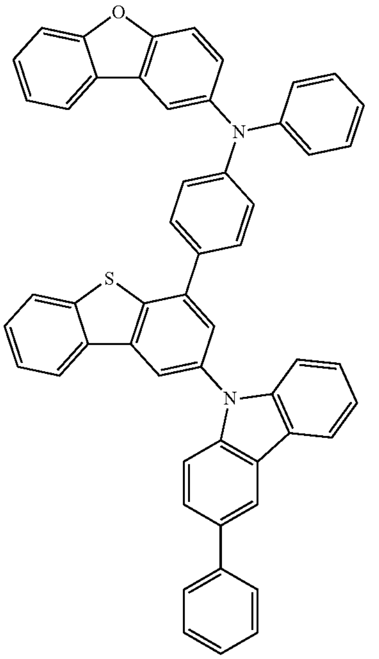
-continued
2-153
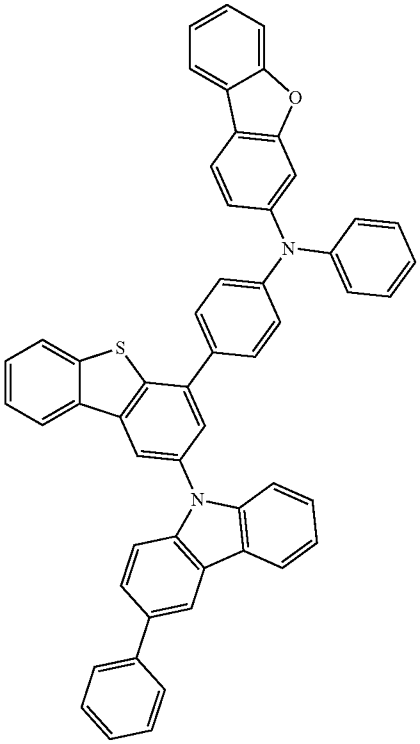
2-154
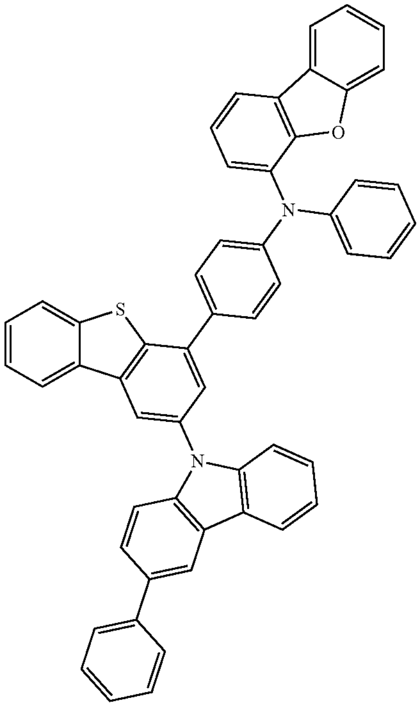

-continued
2-155
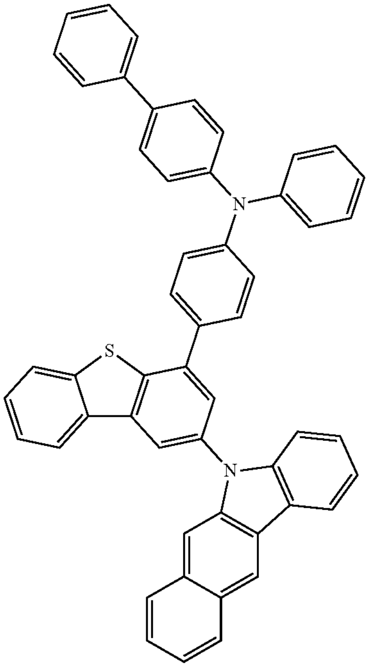
2-156
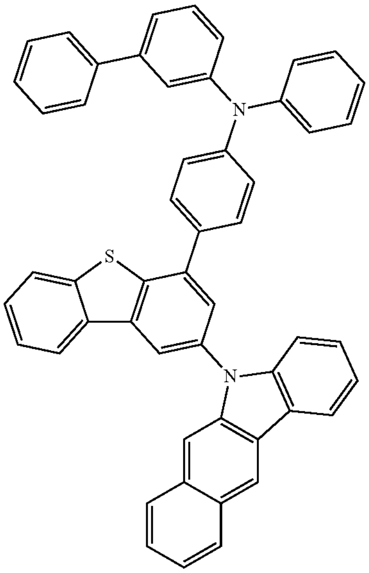
-continued
2-157
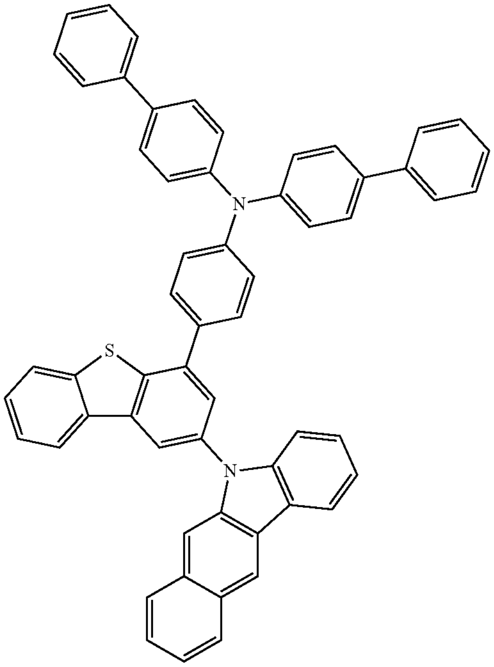
2-158
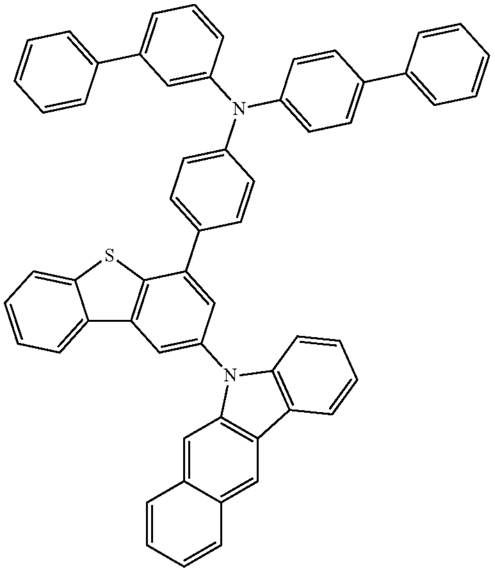

-continued
2-159
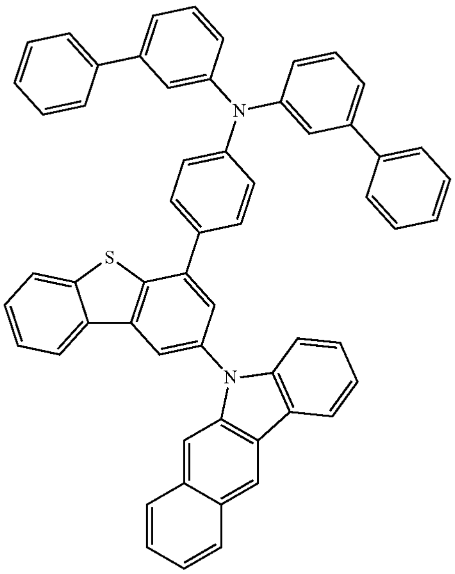
2-160
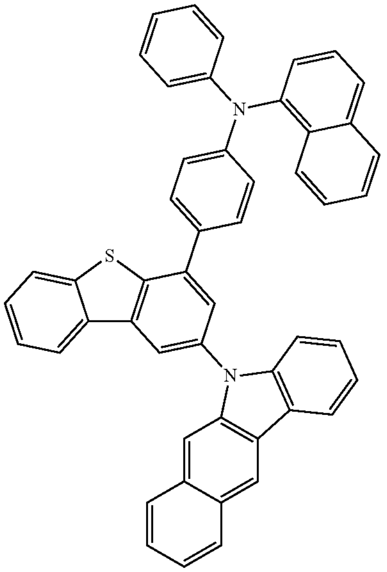
-continued
2-161
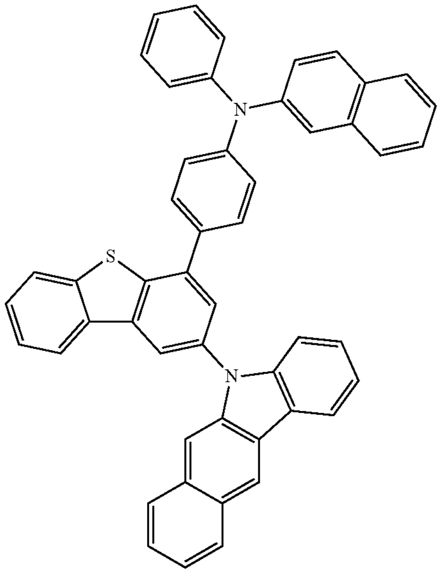
2-162
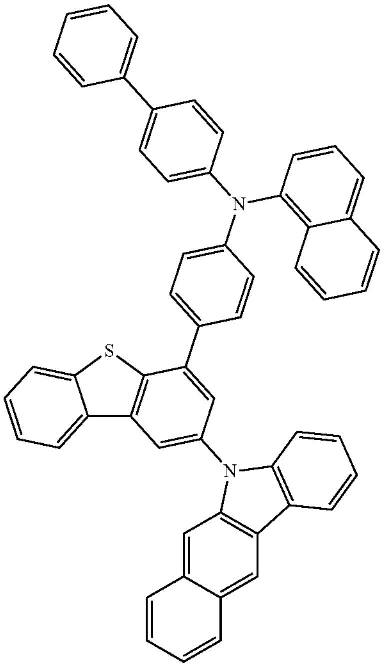

-continued
2-163
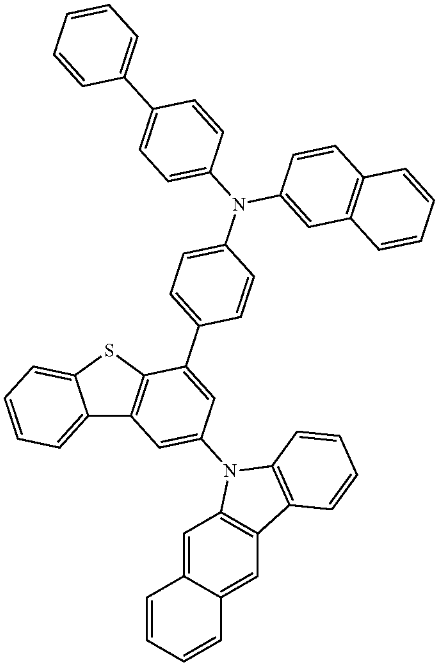
2-164
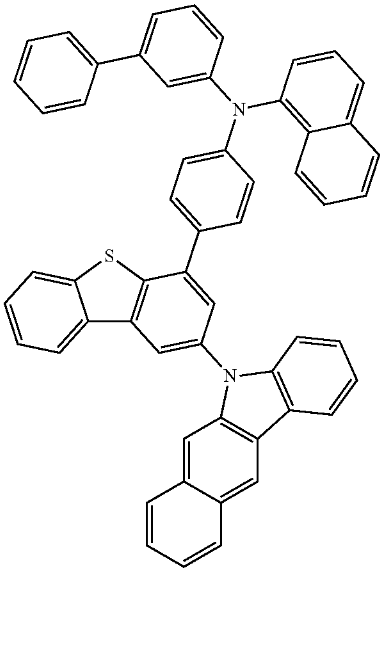
-continued
2-165
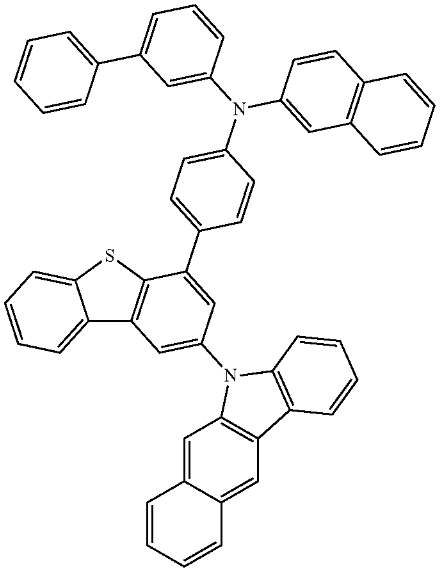
2-166
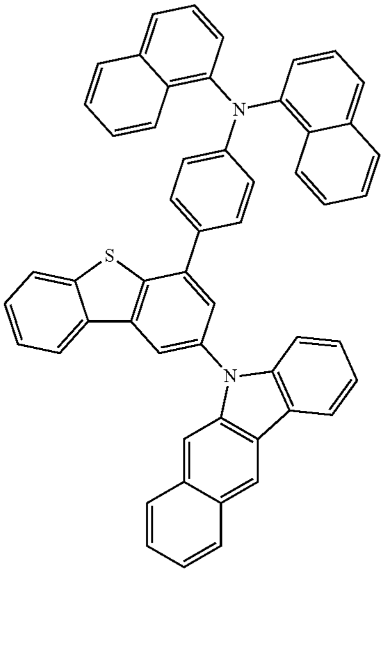

-continued
2-167
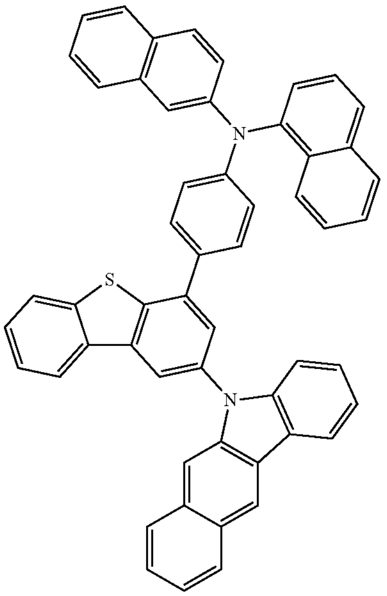
2-168
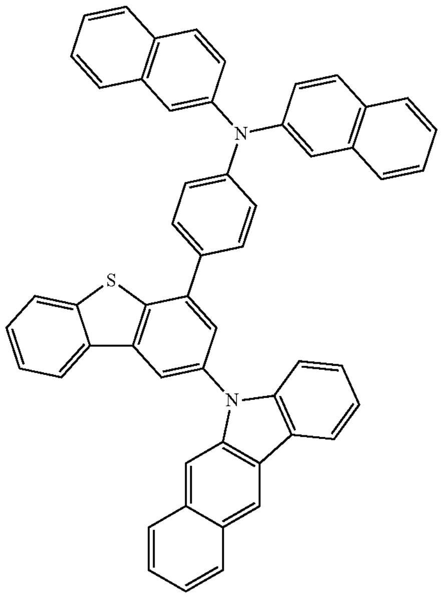
-continued
2-169
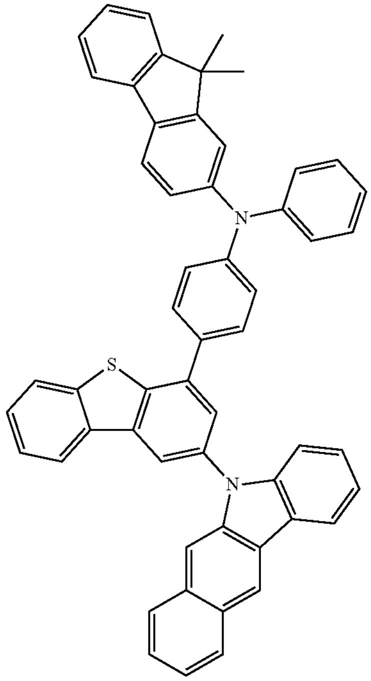
2-170
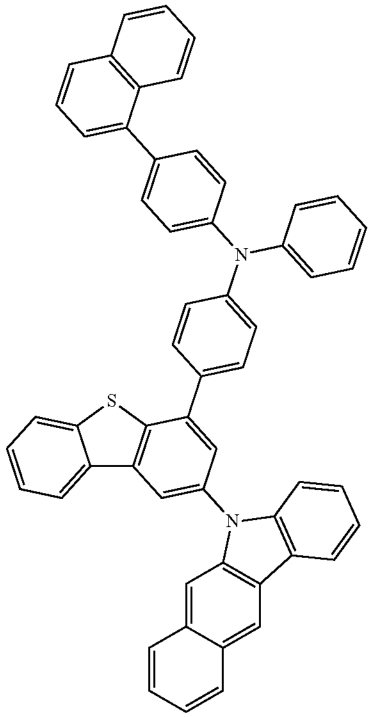

-continued
2-171
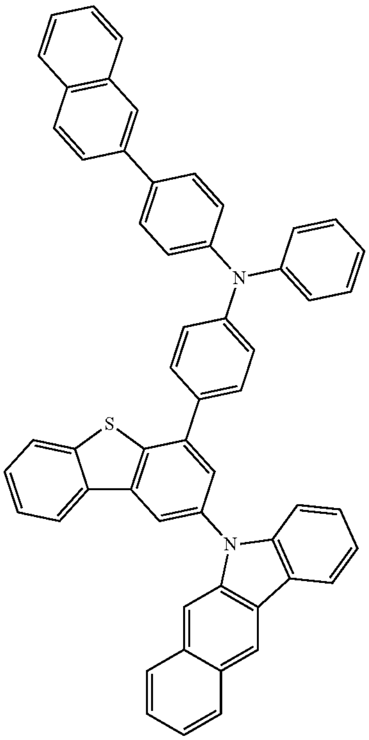
2-172
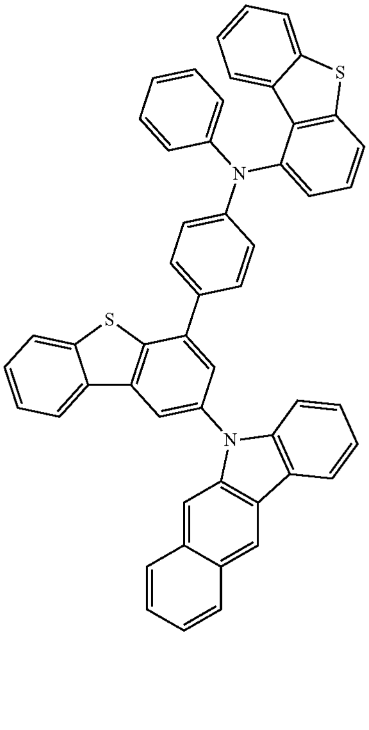
-continued
2-173
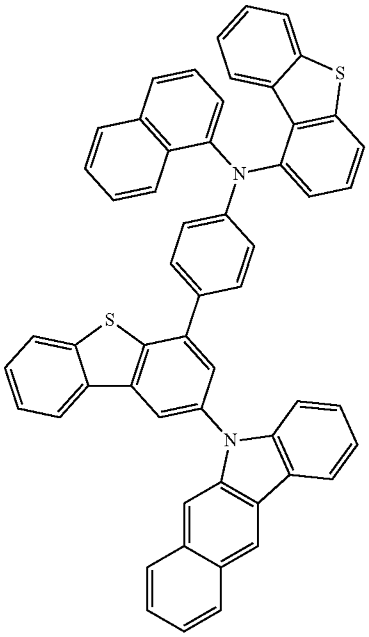
2-174
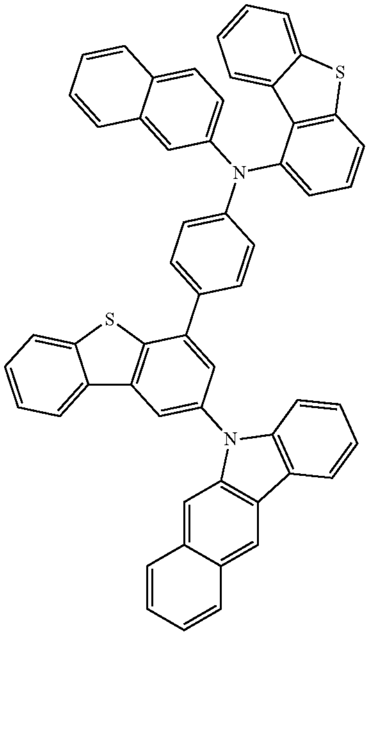

-continued
2-175
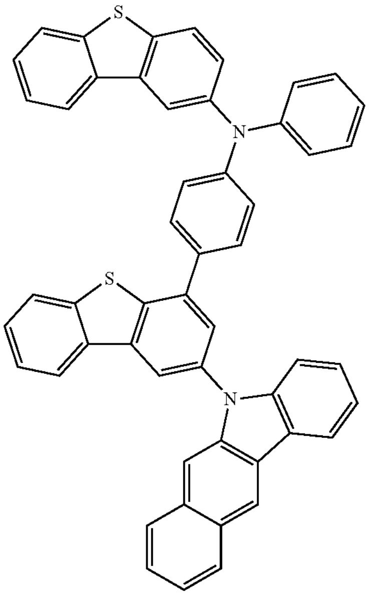
2-176
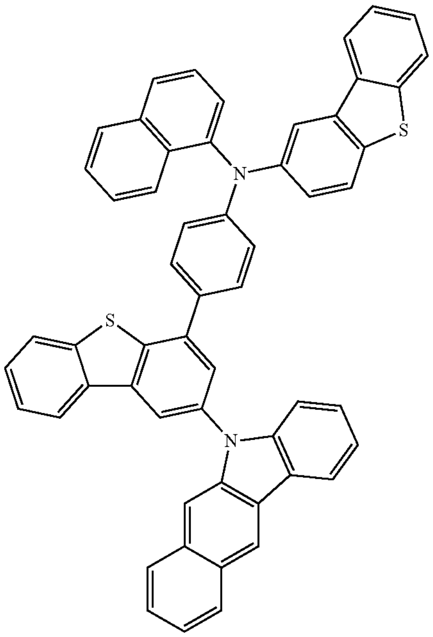
-continued
2-177
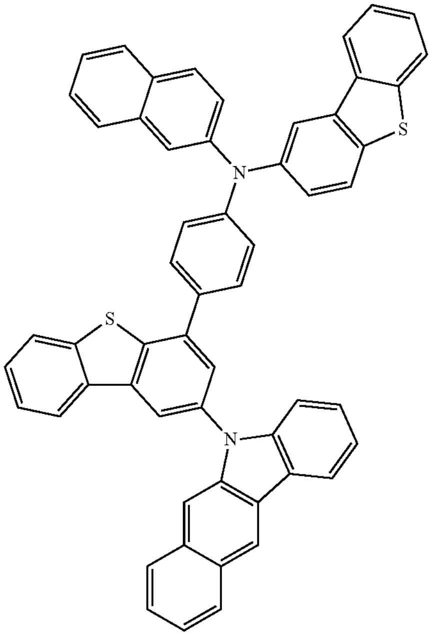
2-178
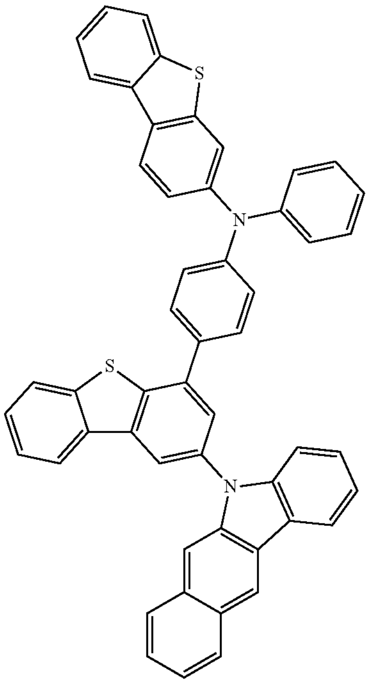

-continued
2-179
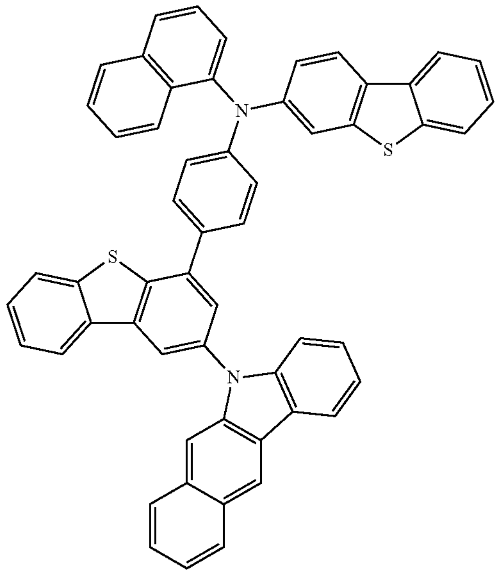
2-180
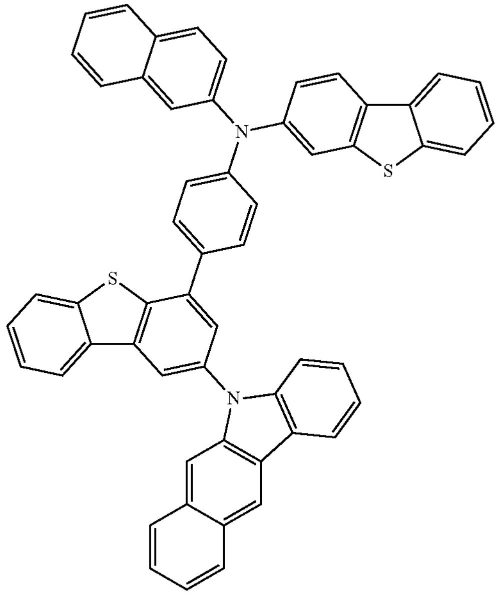
-continued
2-181
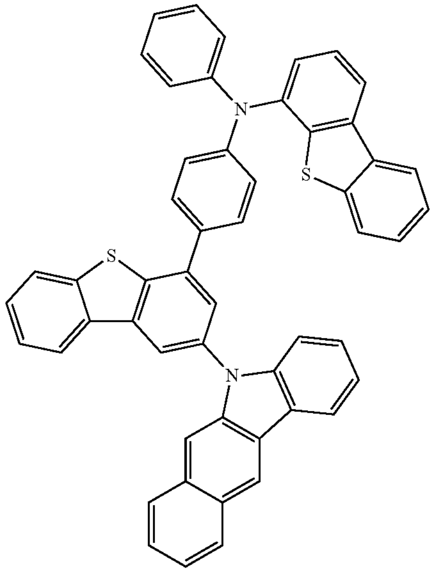
2-182
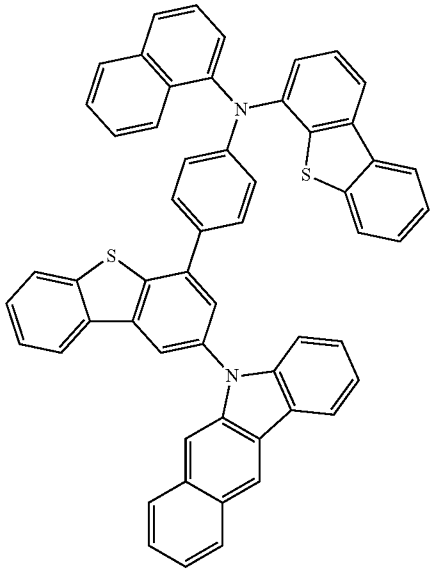

-continued
2-183
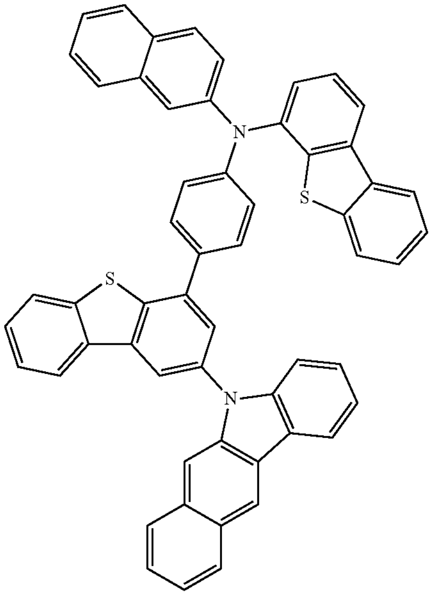
2-184
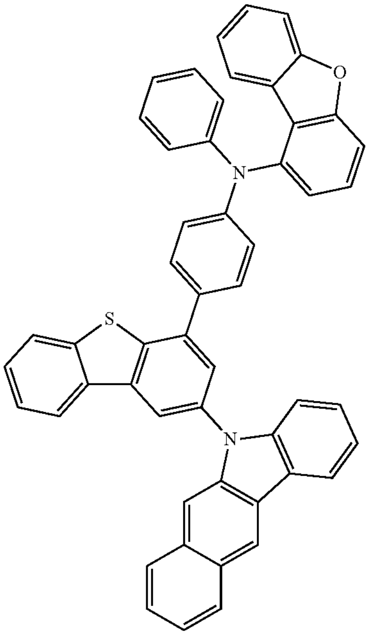
-continued
2-185
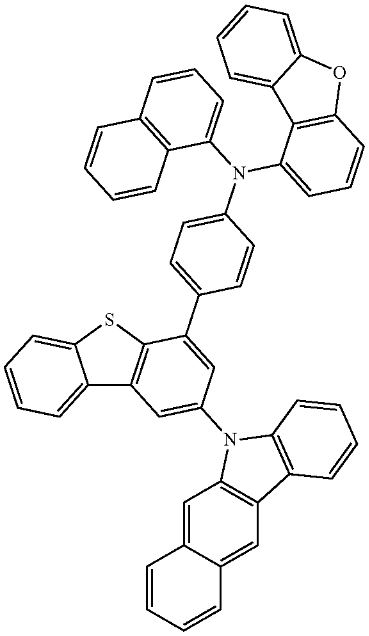
2-186
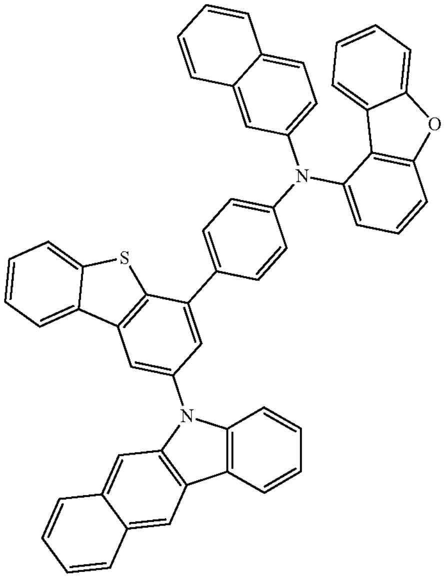

-continued
2-187
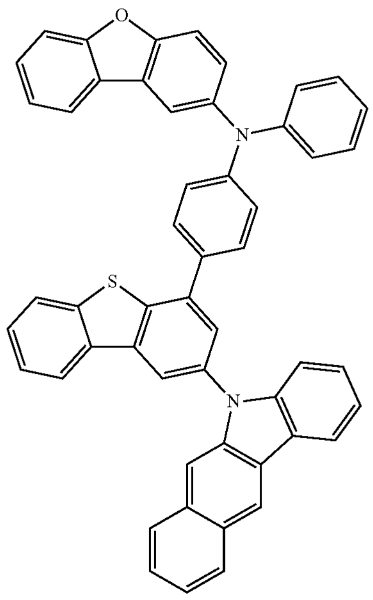
2-188
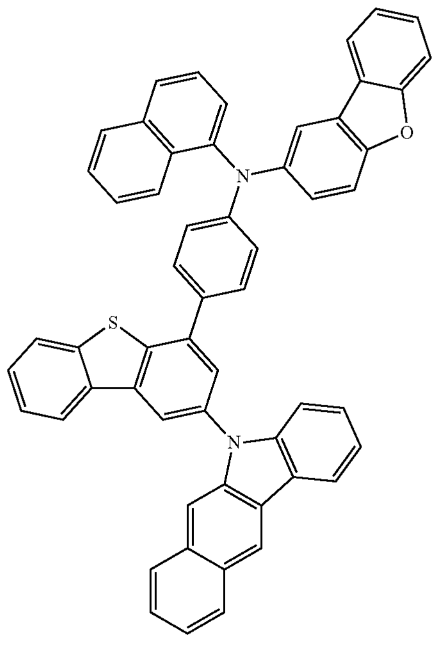
-continued
2-189
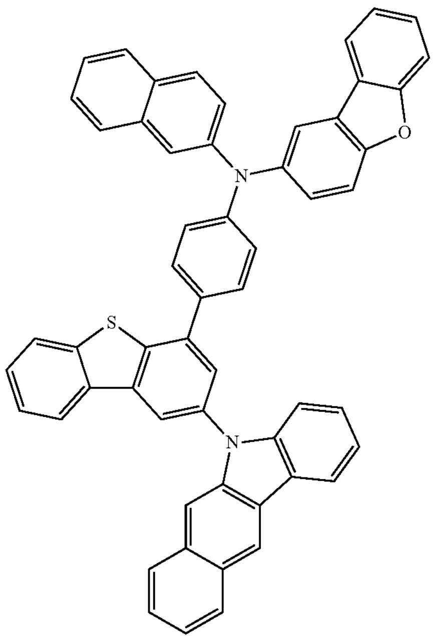
2-190
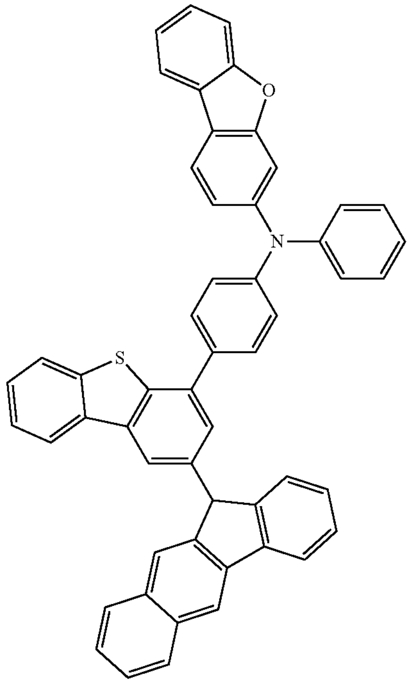

-continued
2-191
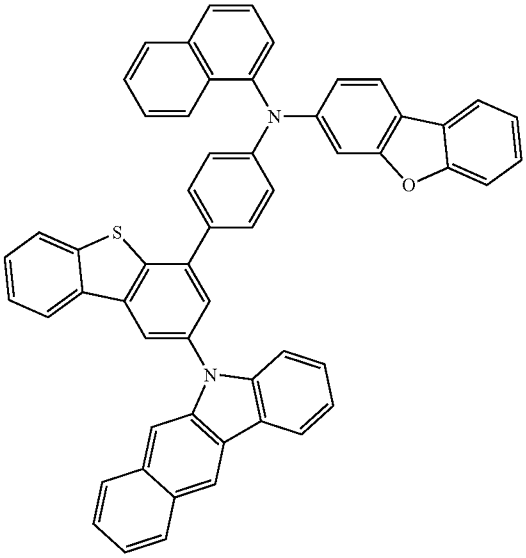
2-192
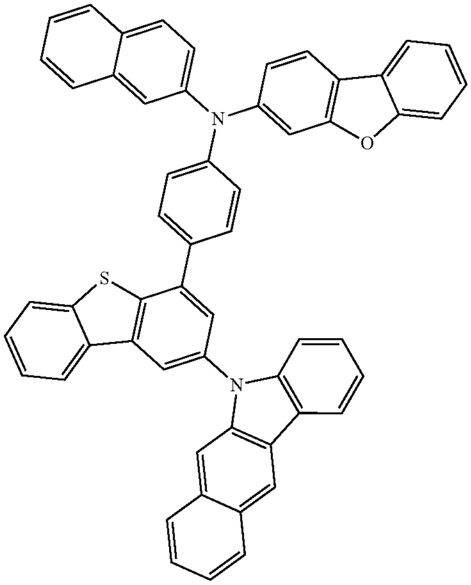
-continued
2-193
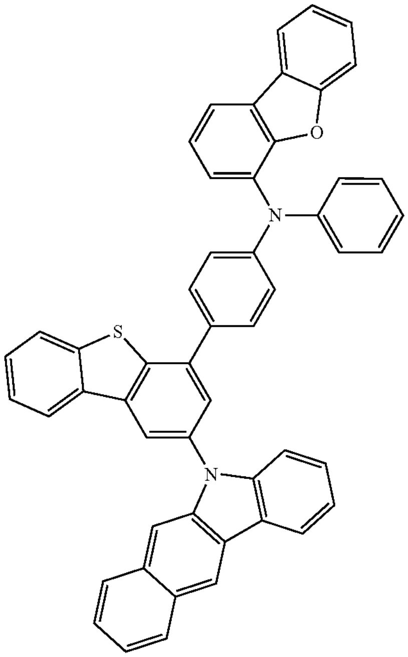
2-194
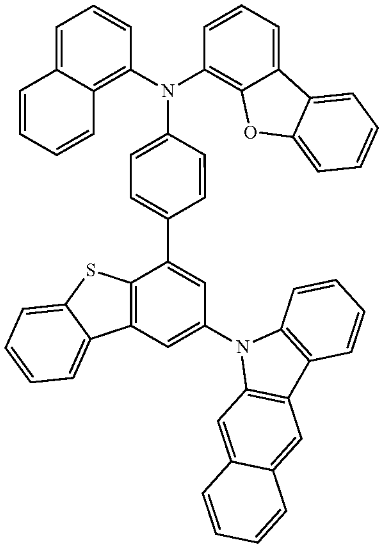

-continued
2-195
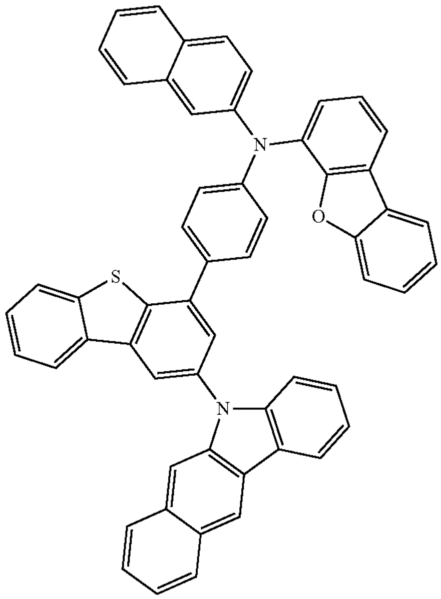
2-196
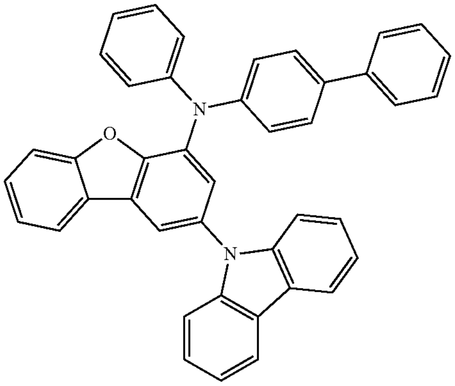
2-197
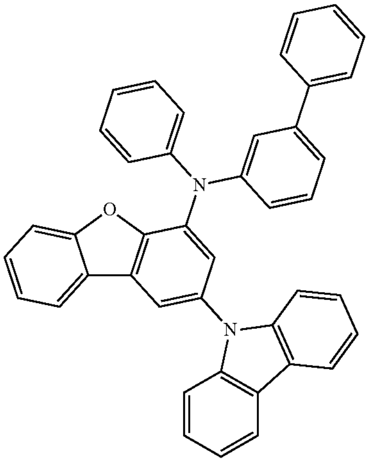
-continued
2-198
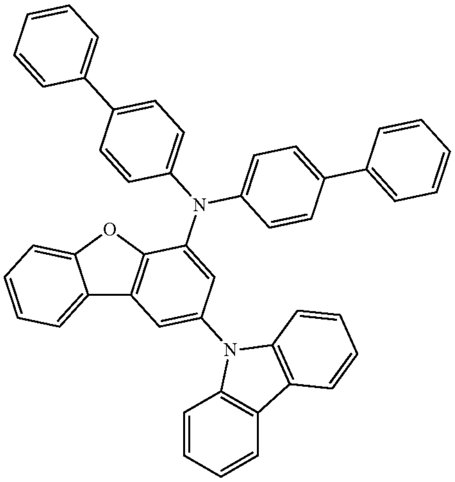
2-199
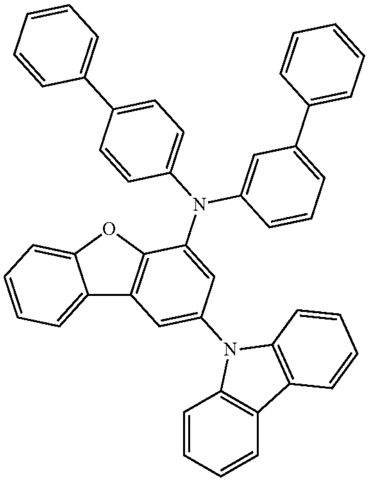
2-200
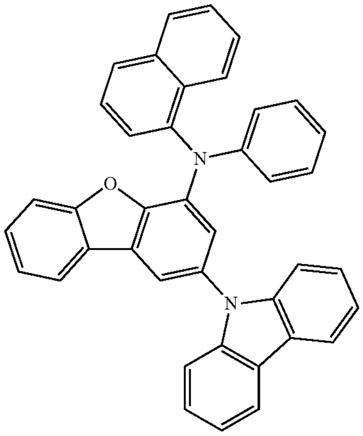

2-201
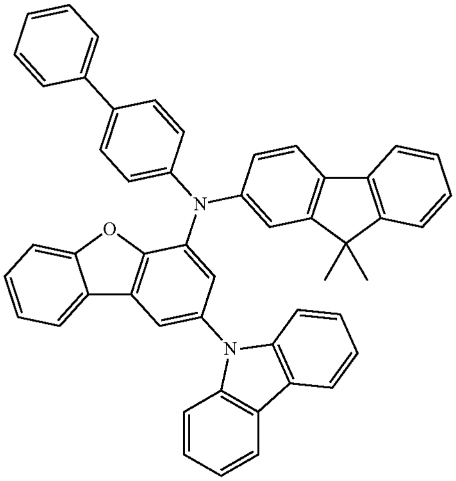
2-202
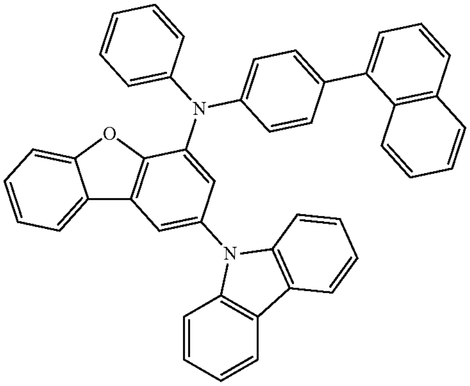
2-203
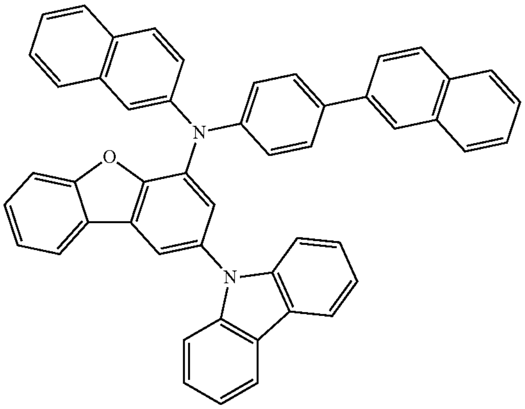
2-204
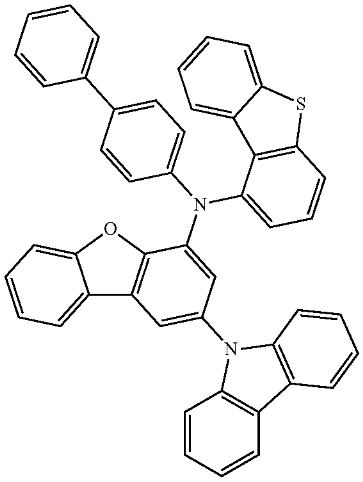
2-205
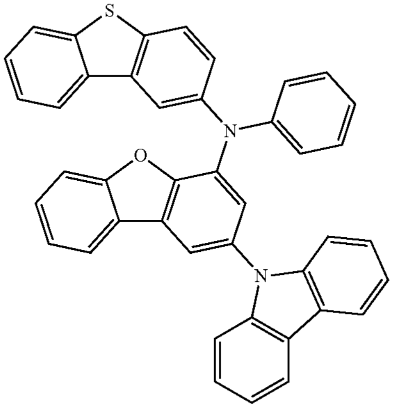
2-206
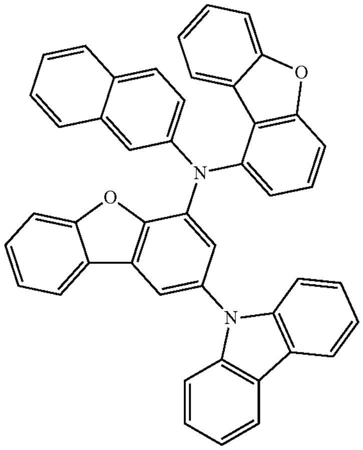

-continued
2-207
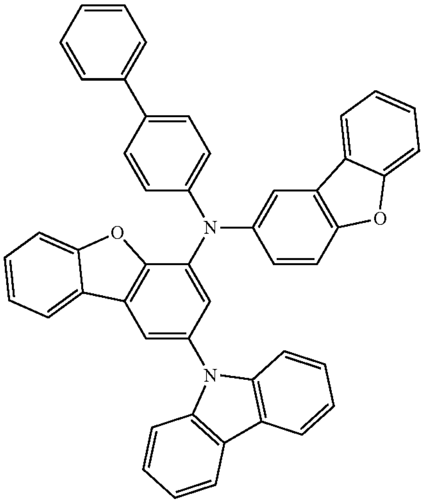
2-208
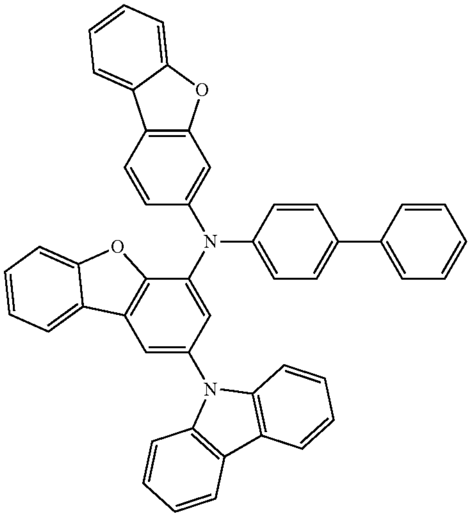
2-209
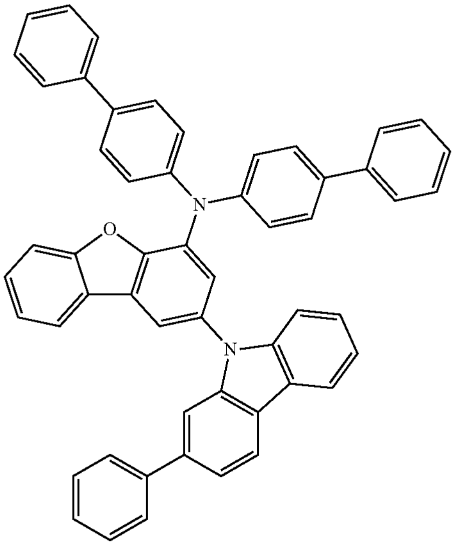
-continued
2-210
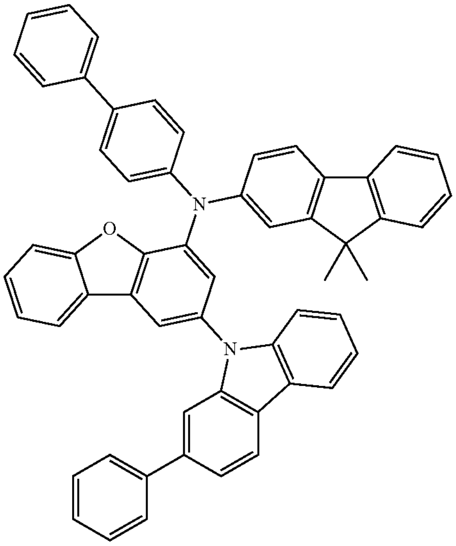
2-211
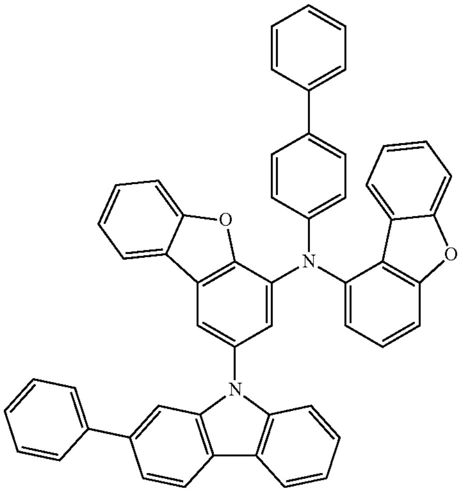
2-212
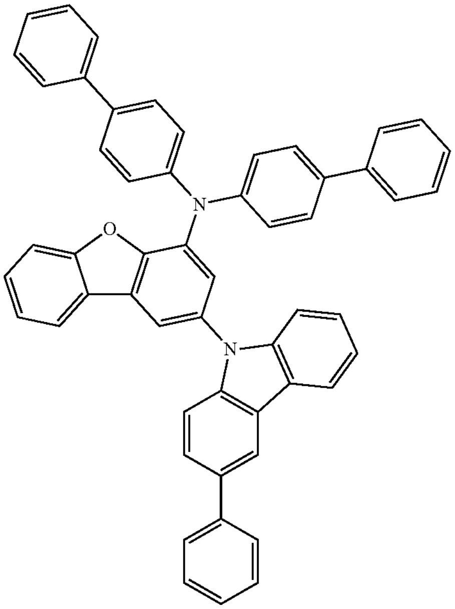

2-213
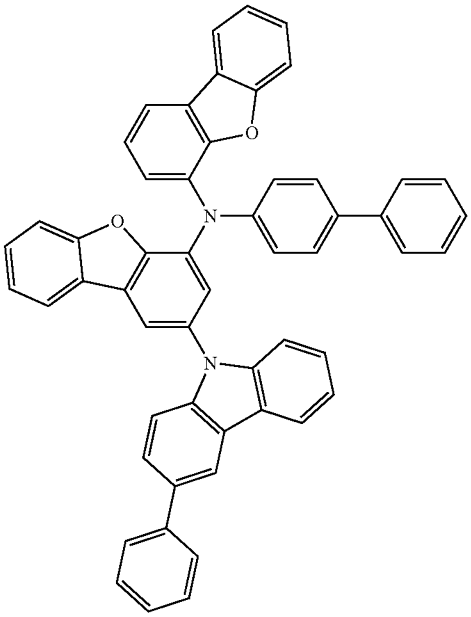
2-214
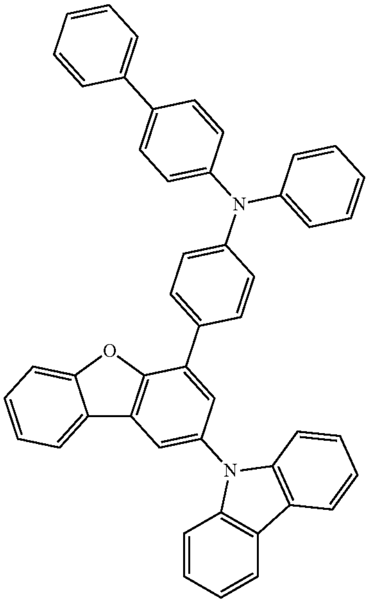
2-215
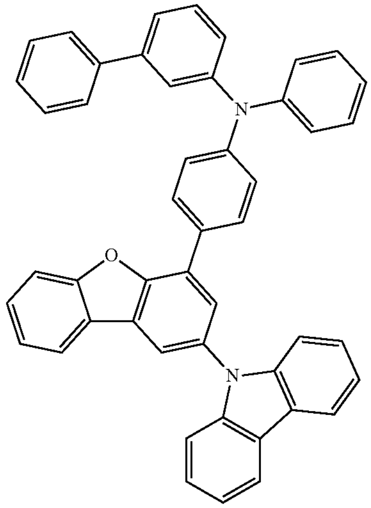
2-216
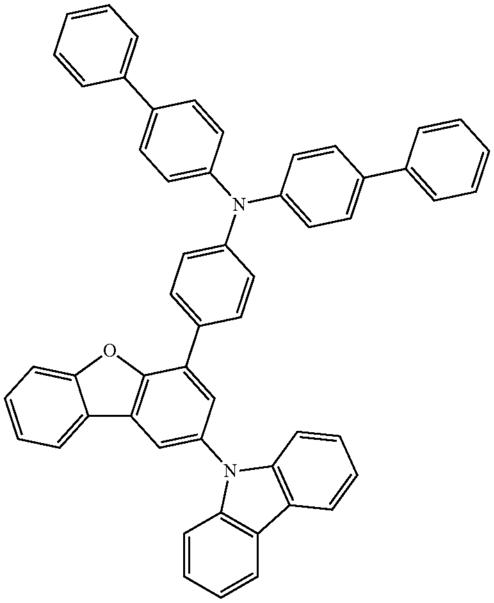
2-217
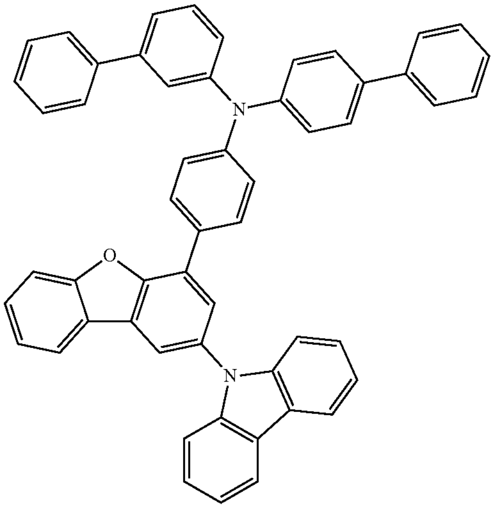

-continued
2-218
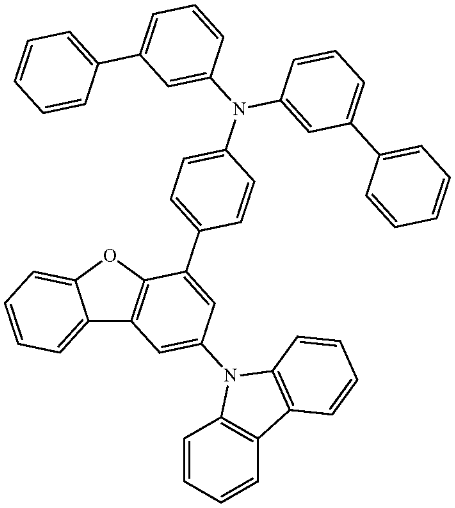
2-219
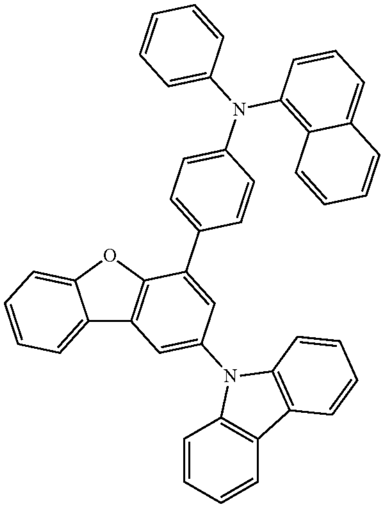
2-220
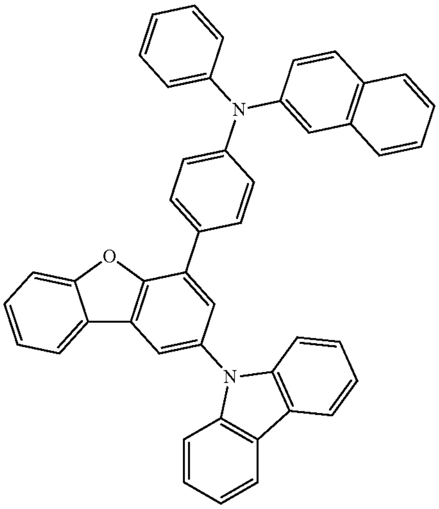
-continued
2-221
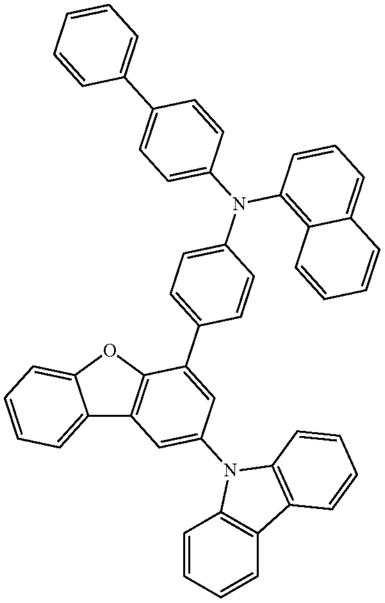
2-222
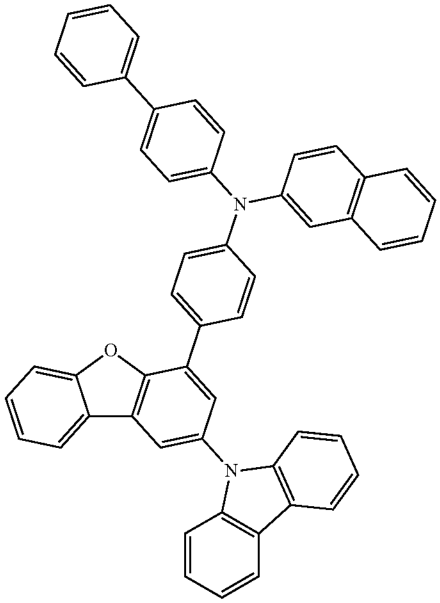

-continued
2-223
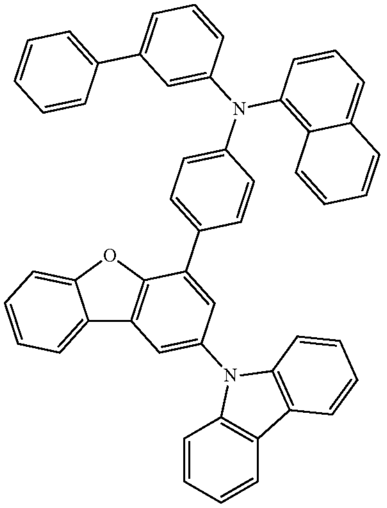
2-224
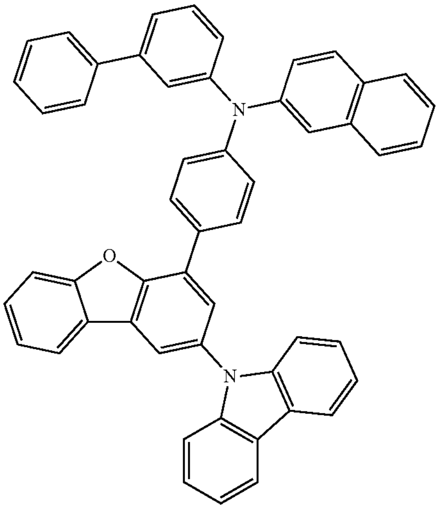
2-225
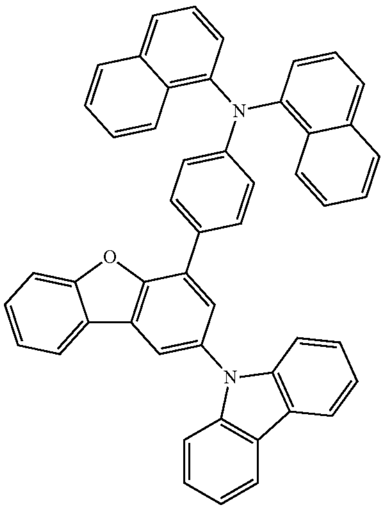
-continued
2-226
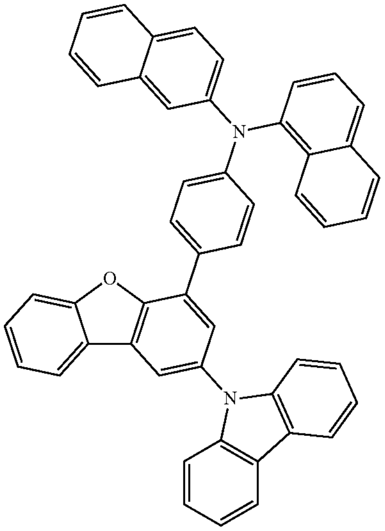
2-227
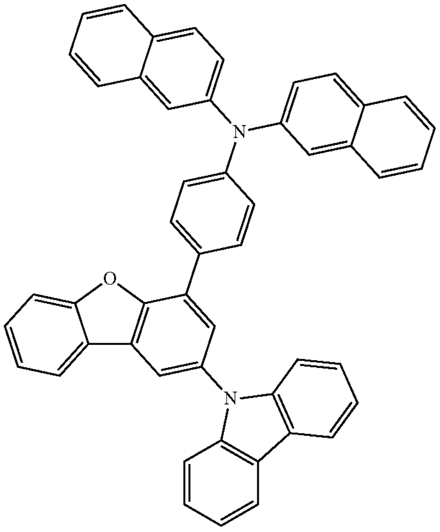

-continued
2-228
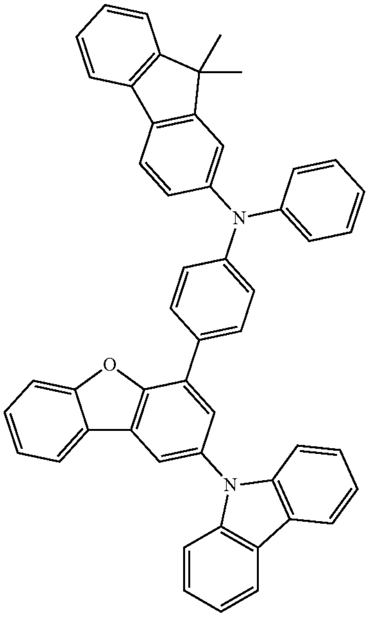
2-229
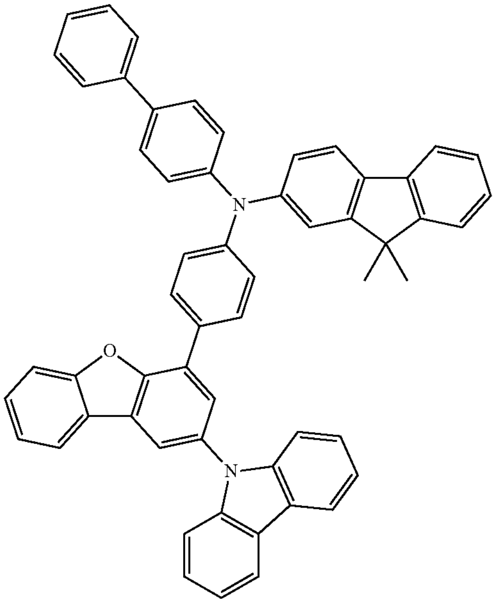
-continued
2-230
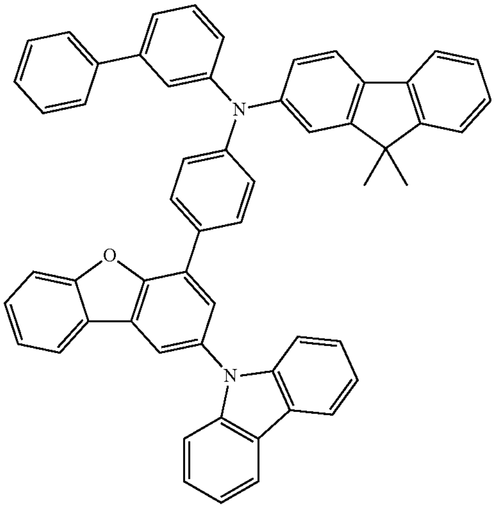
2-231
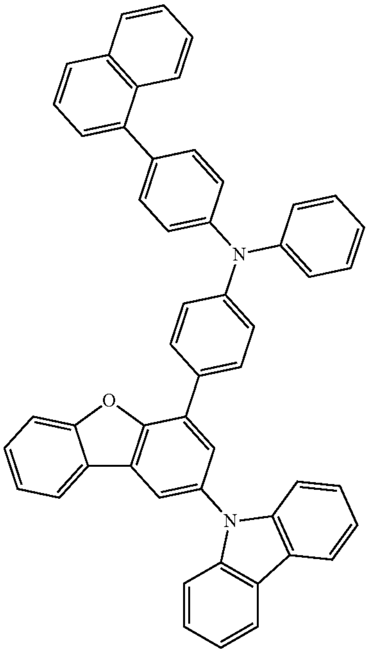

-continued
2-232
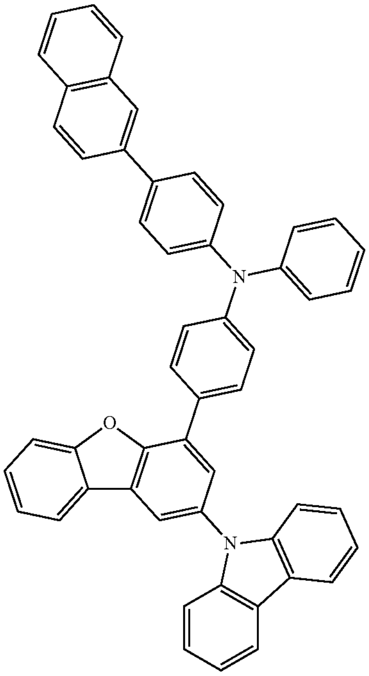
2-233
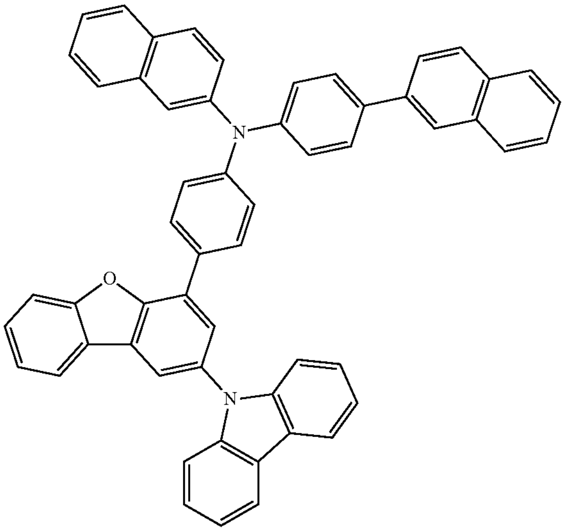
-continued
2-234
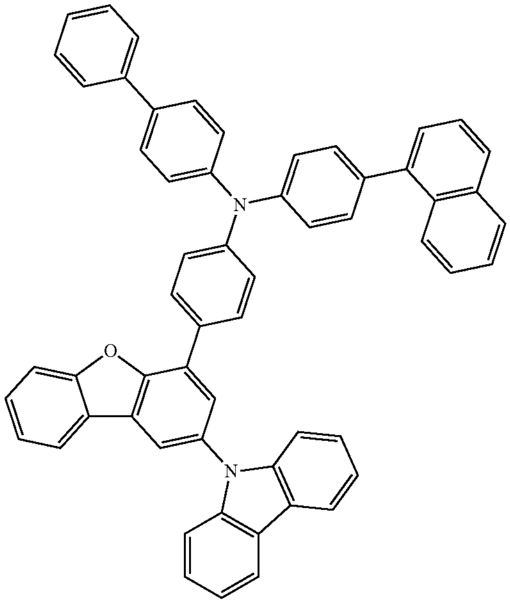
2-235
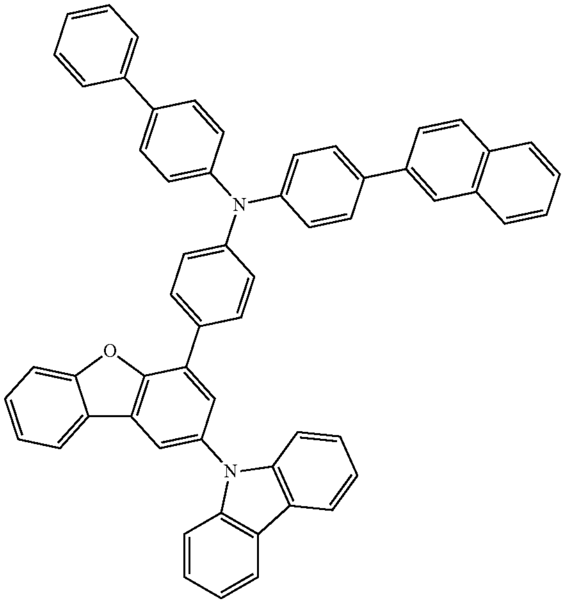

2-236
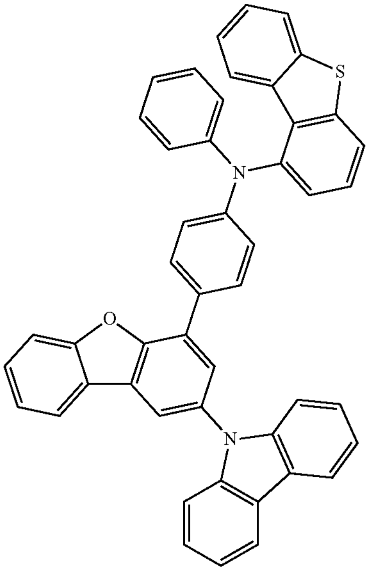
2-237
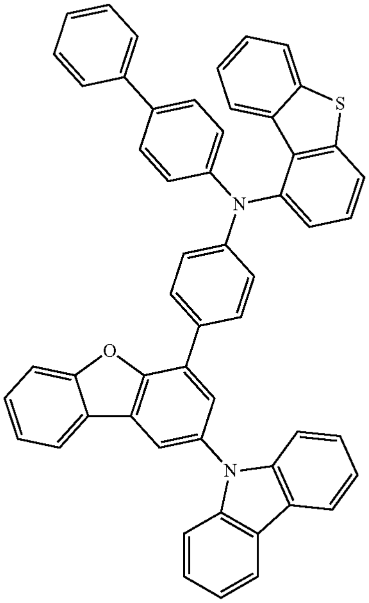
2-238
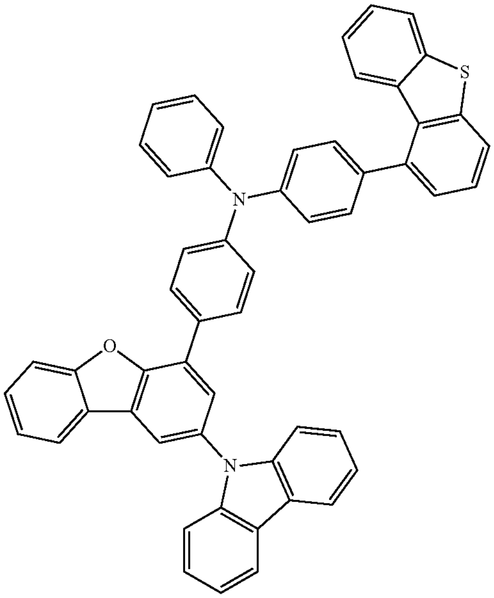
2-239
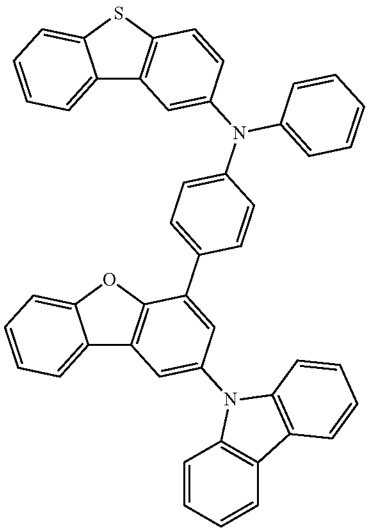

2-240
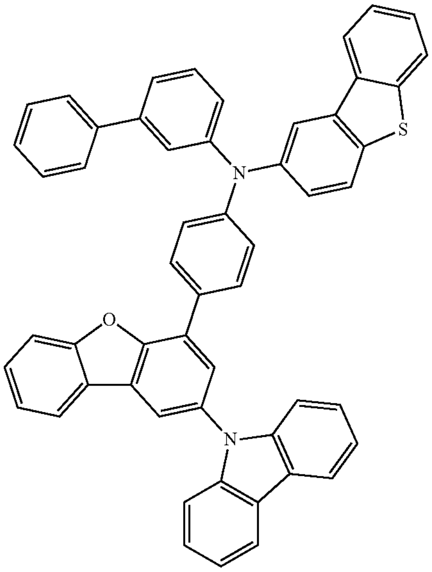
2-241
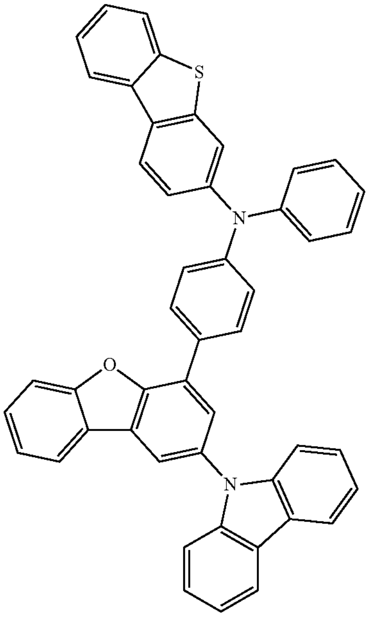
2-242
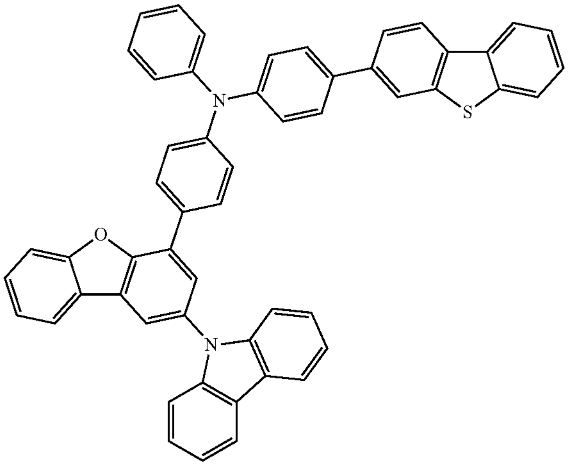
2-243
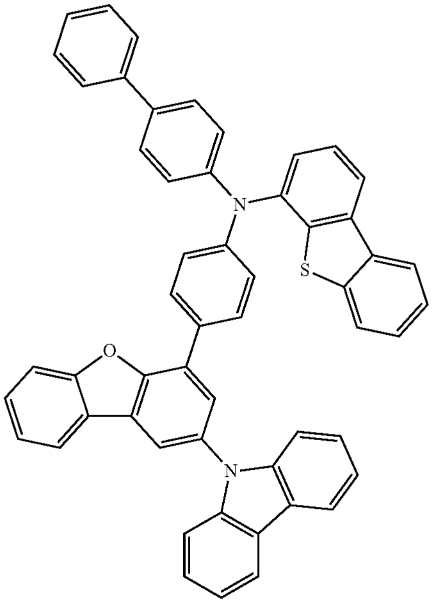
2-244
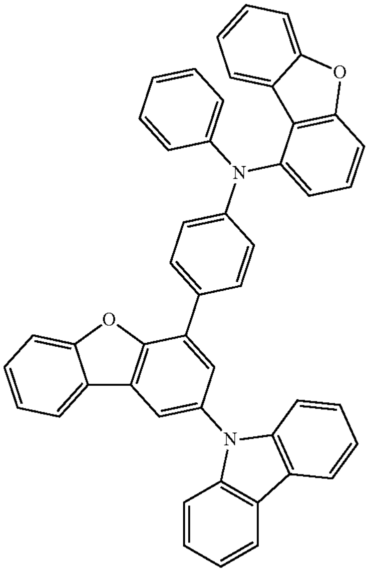

-continued
2-245
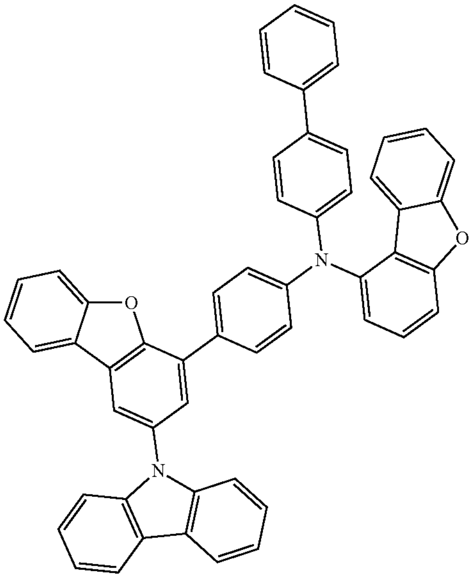
2-246
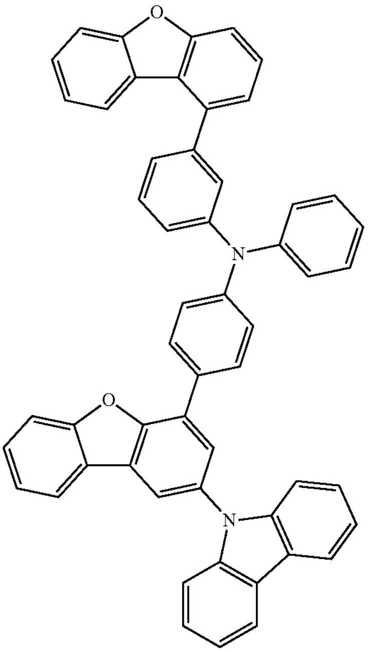
-continued
2-247
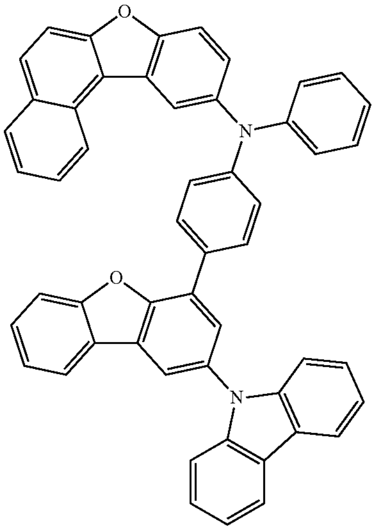
2-248
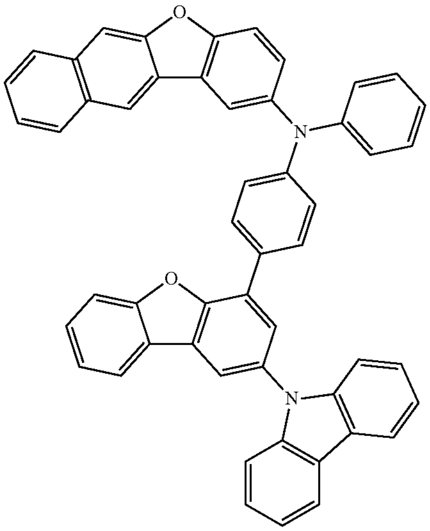
2-249
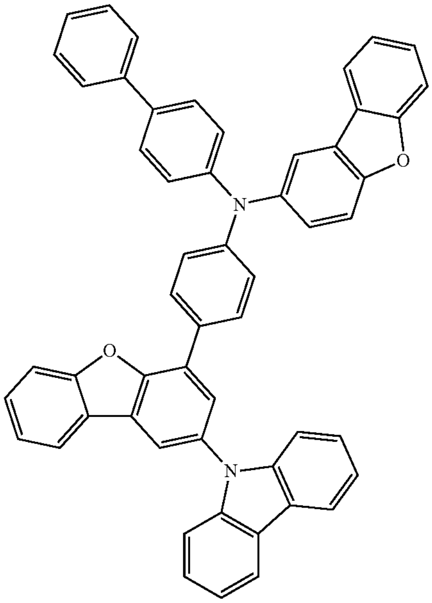

-continued
2-250
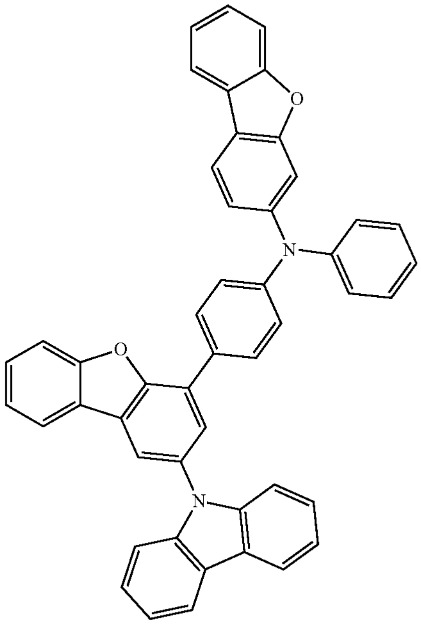
2-251
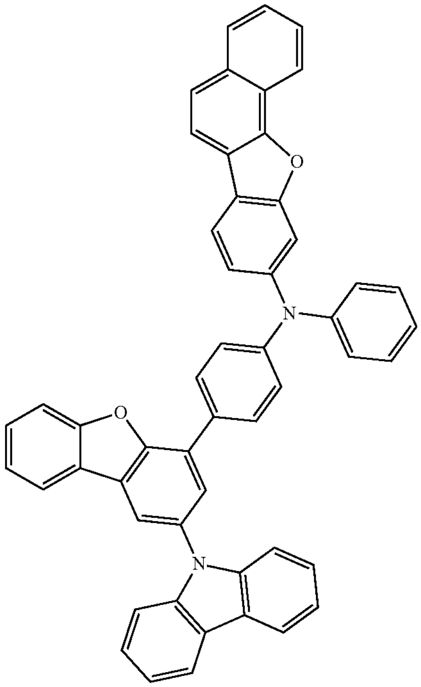
-continued
2-252
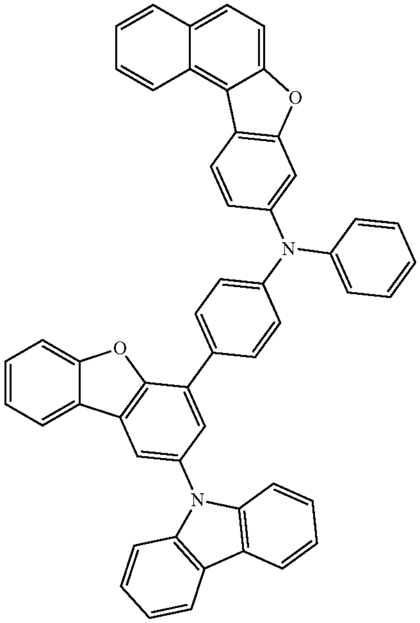
2-253
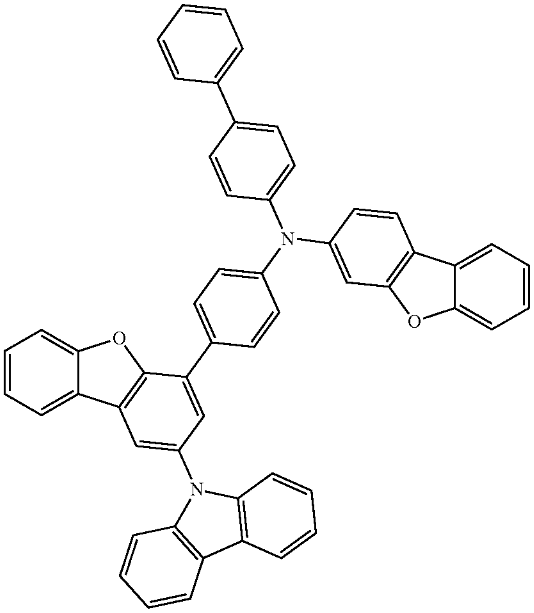

2-254
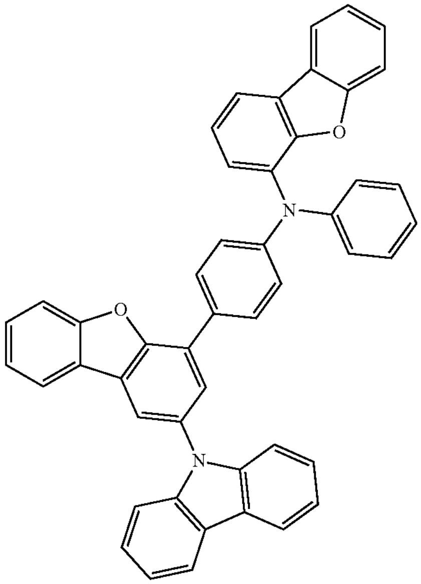
2-255
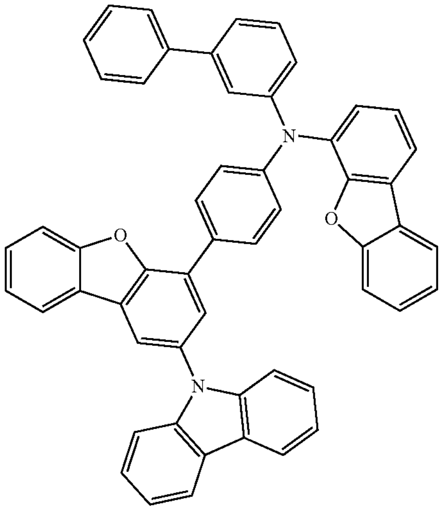
2-256
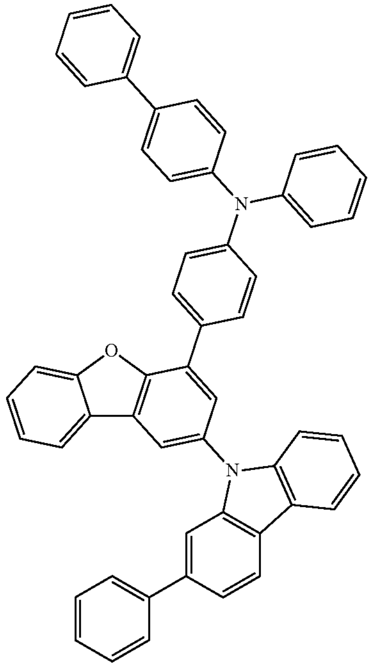
2-257
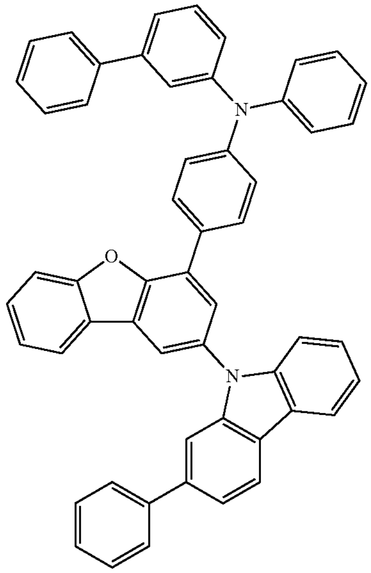

-continued
2-258
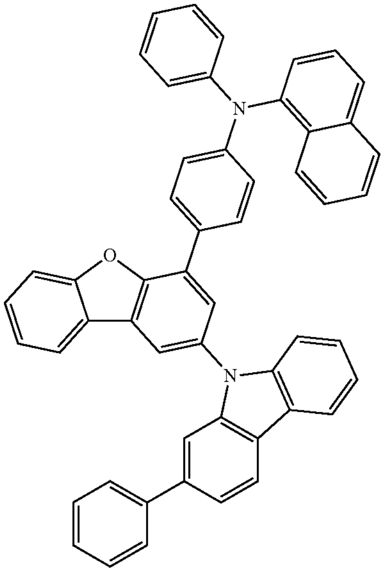
2-259
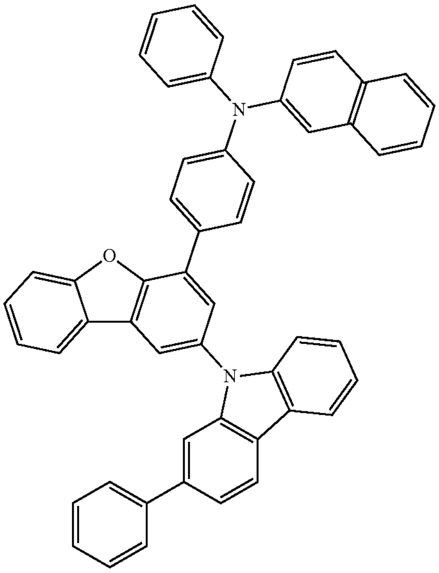
-continued
2-260
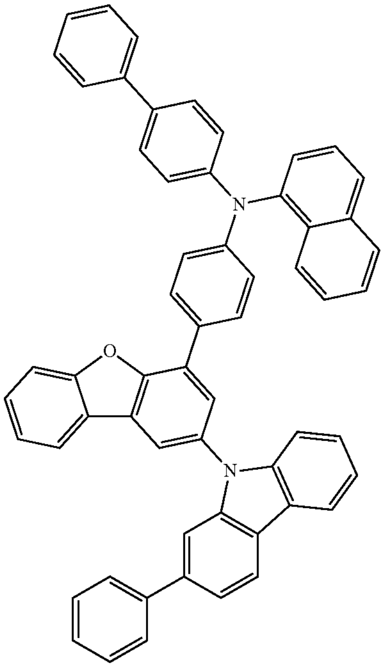
2-261
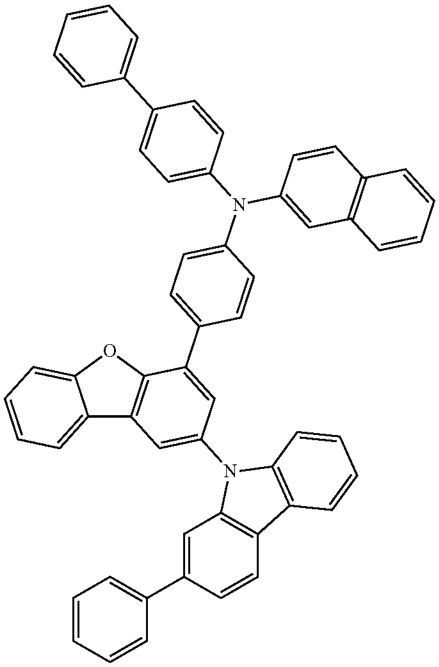

-continued
2-262
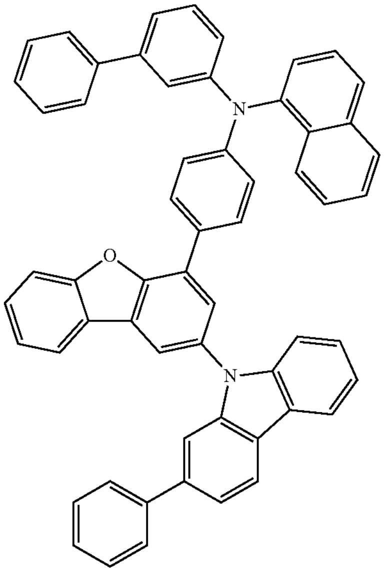
2-263
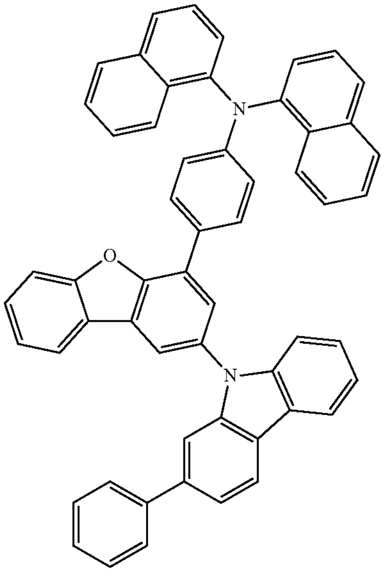
-continued
2-264
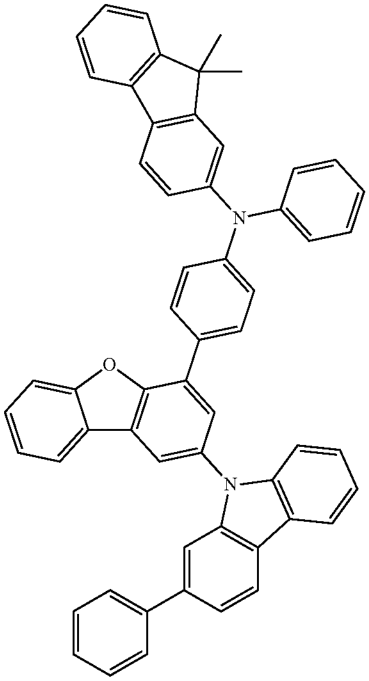
2-265
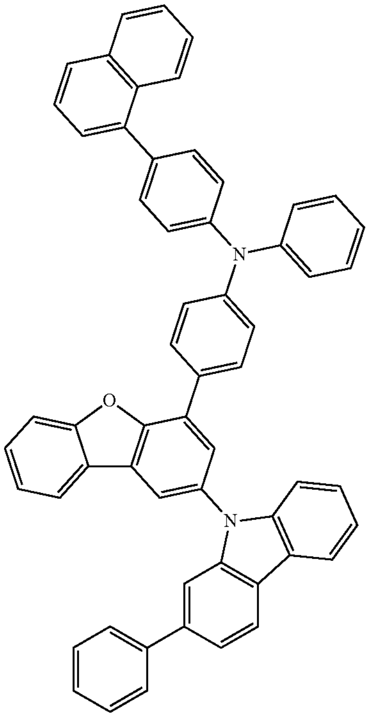

-continued
2-266
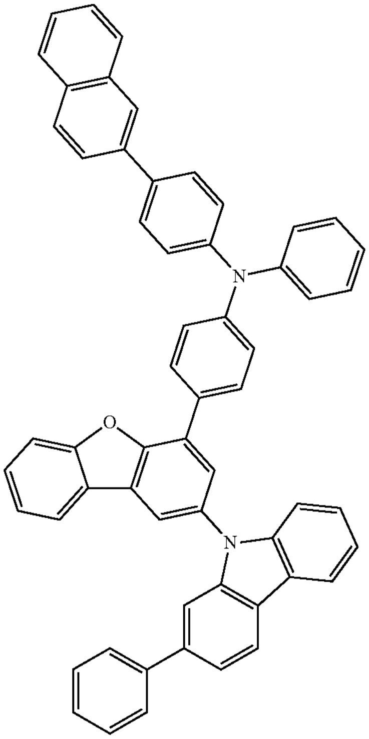
2-267
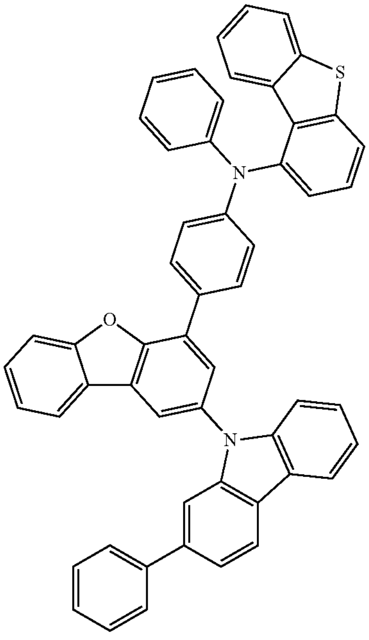
-continued
2-268
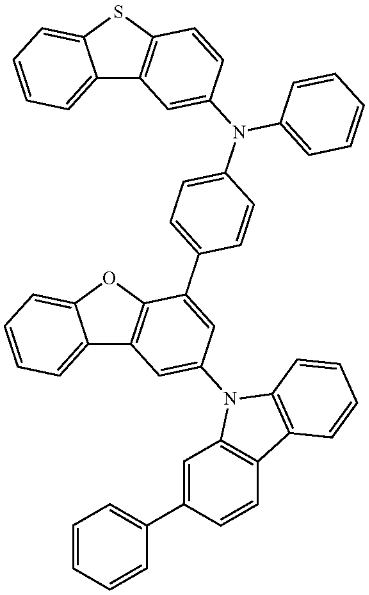
2-269
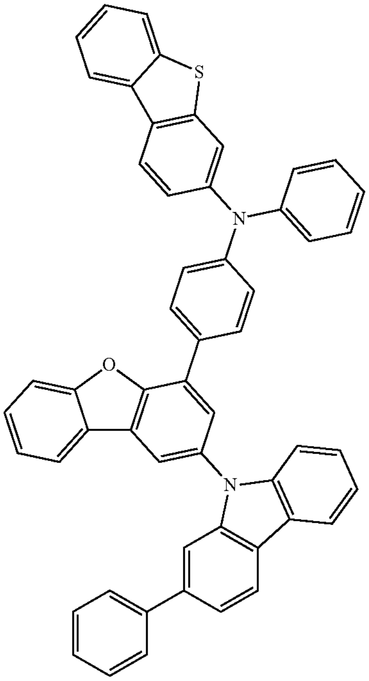

-continued
2-270
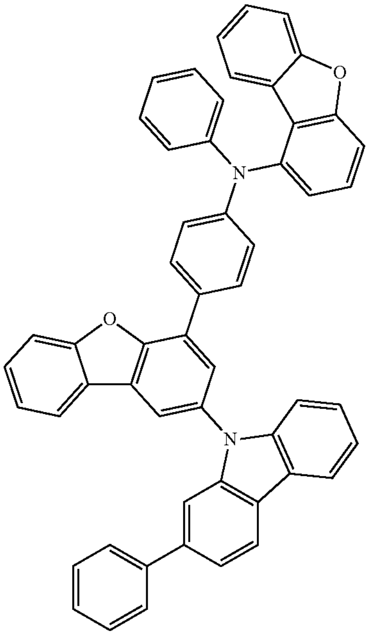
2-271
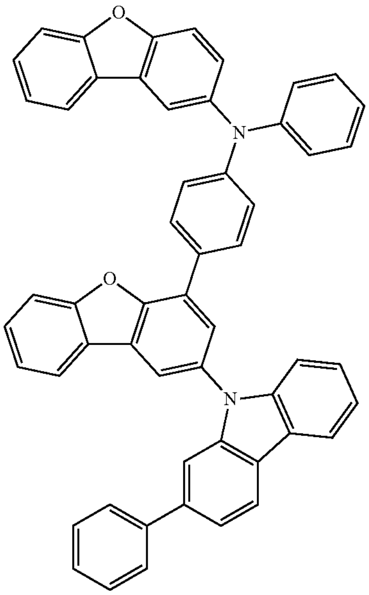
-continued
2-272
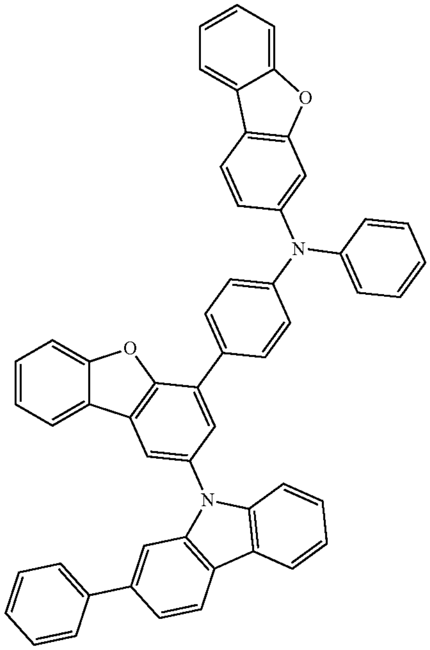
2-273
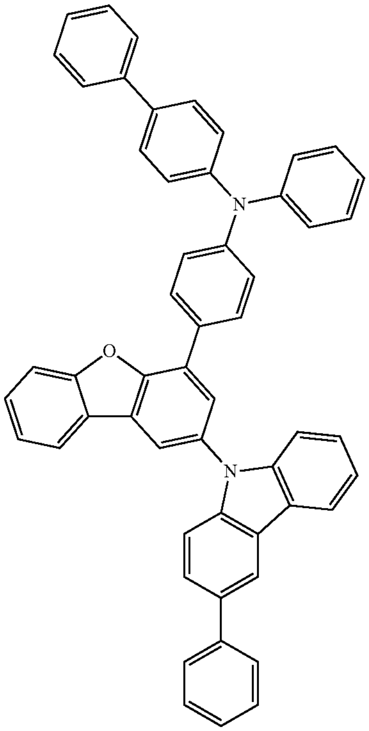

-continued
2-274
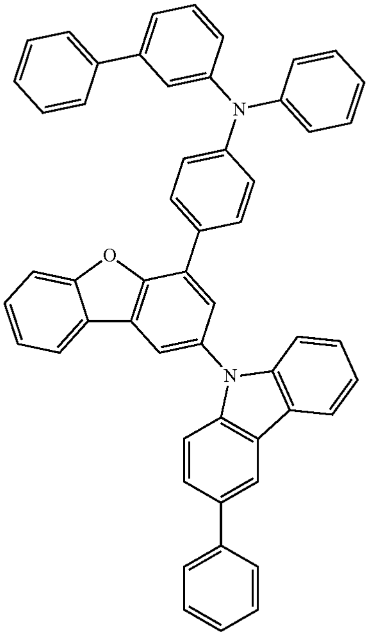
2-275
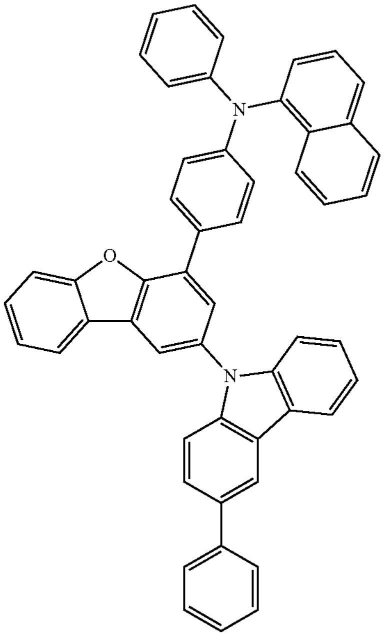
-continued
2-276
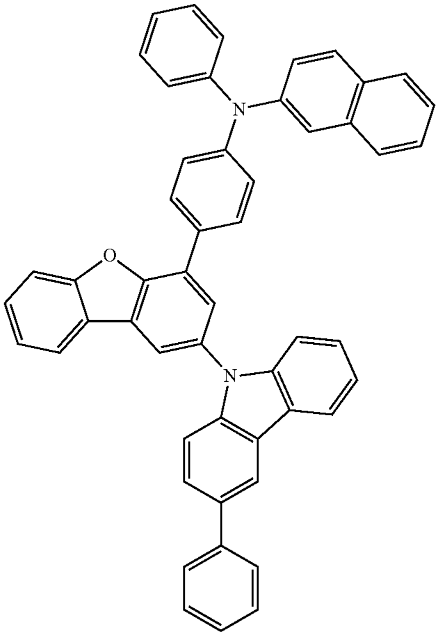
2-277
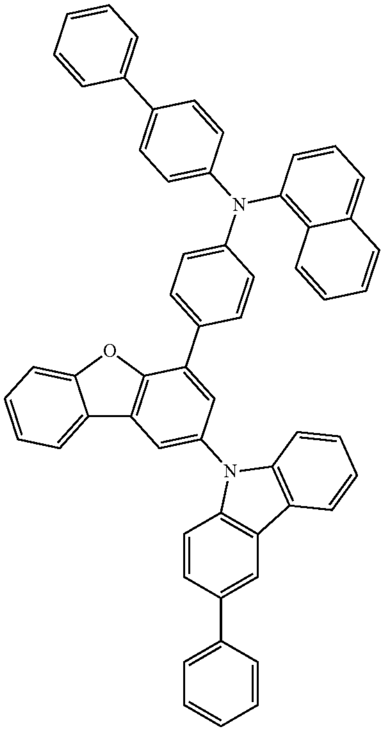

-continued
2-278
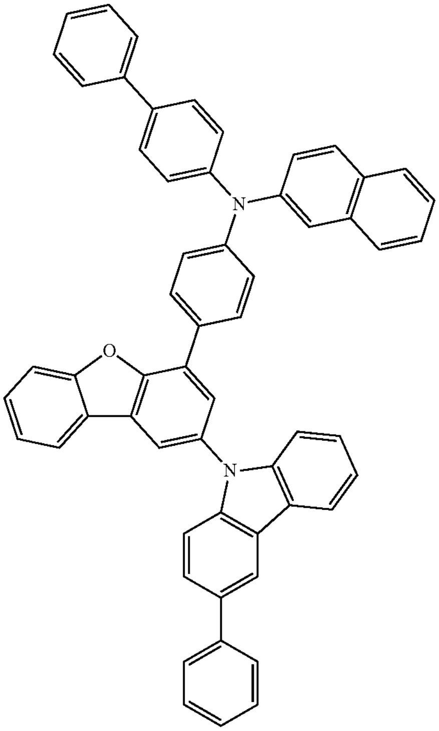
2-279
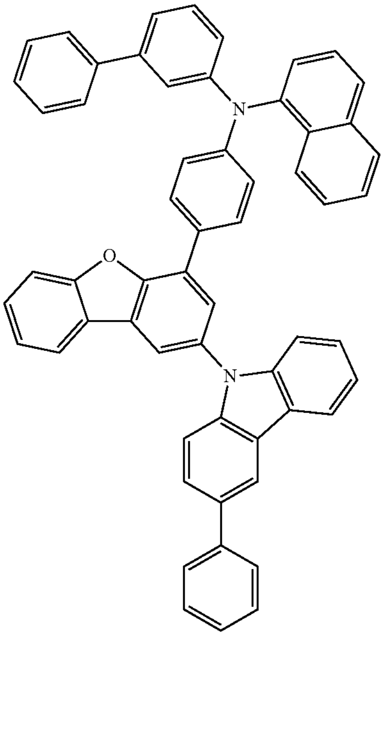
-continued
2-280
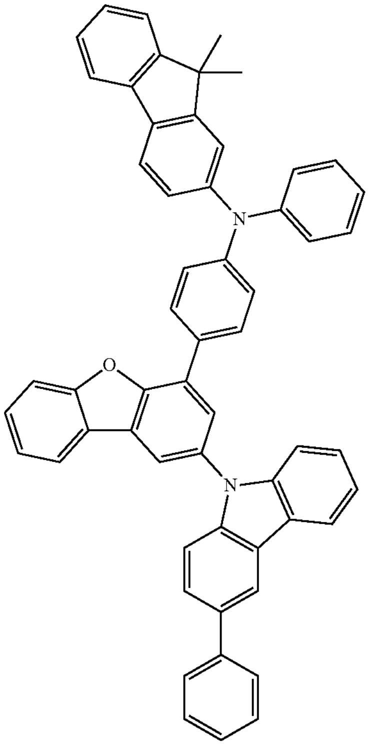
2-281
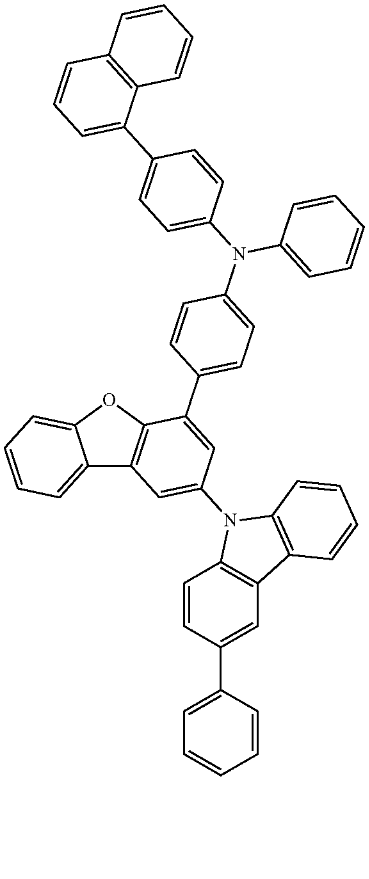

-continued
2-282
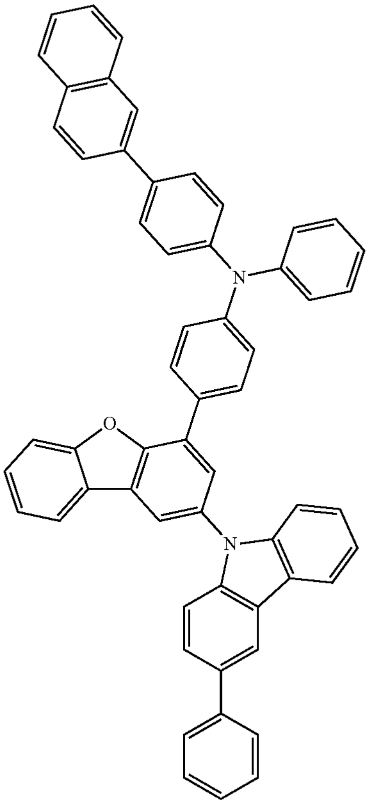
2-283
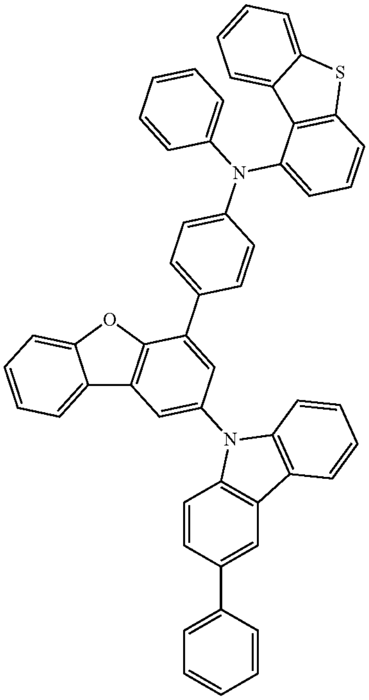
-continued
2-284
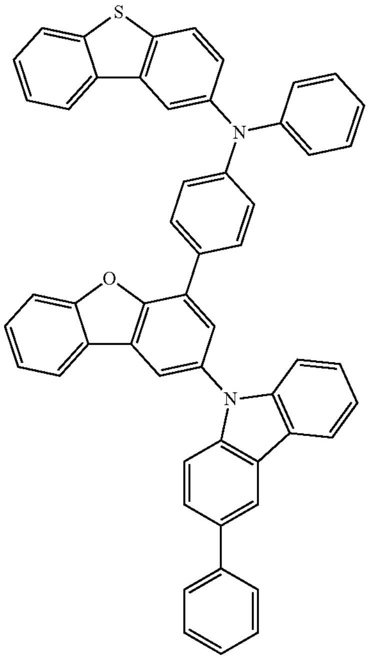
2-285
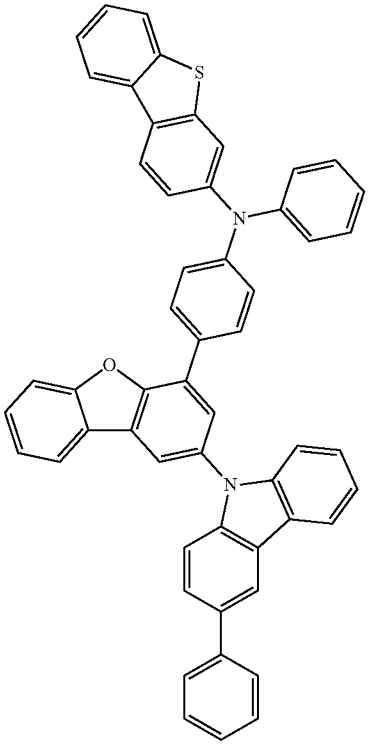

-continued
2-286
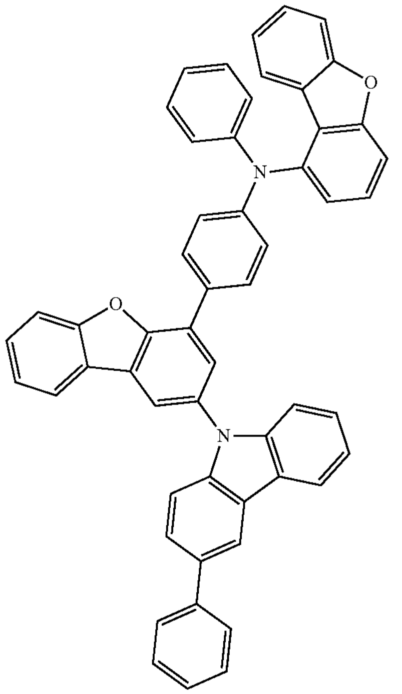
2-287
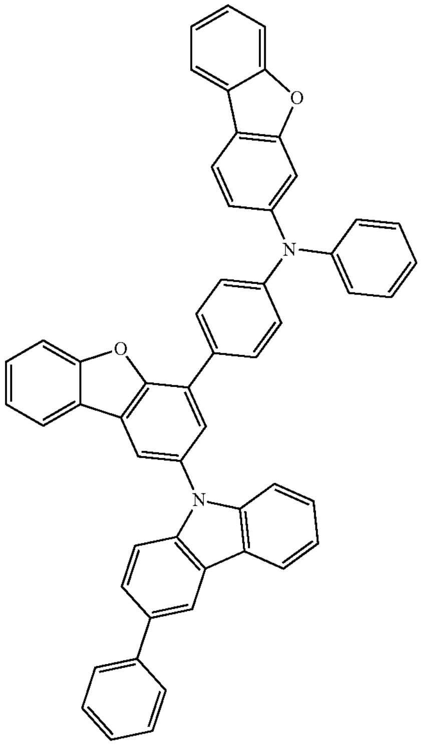
-continued
2-288
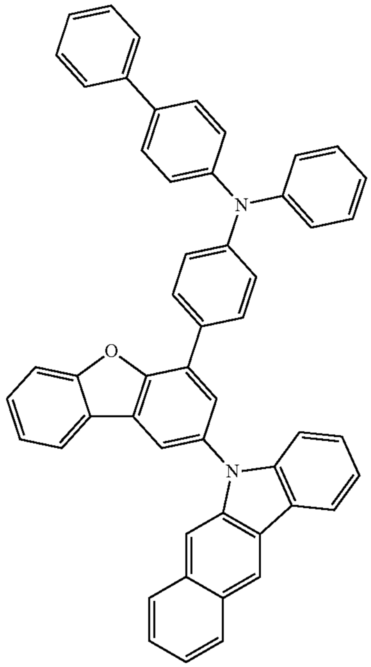
2-289
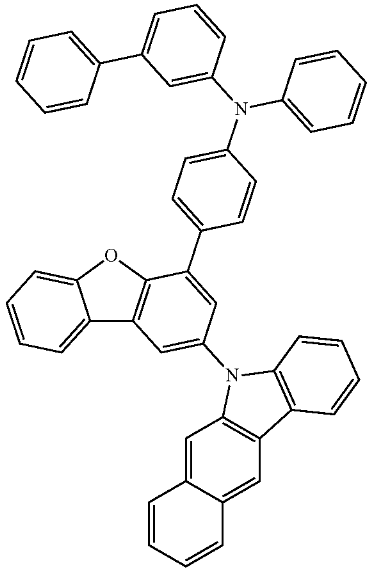

-continued
2-290
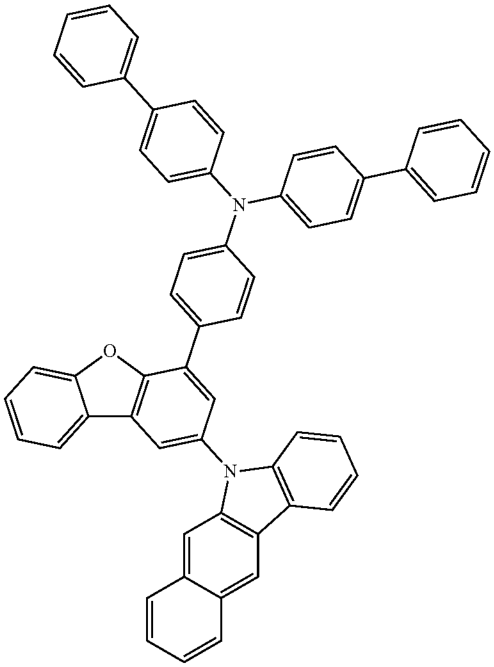
2-291
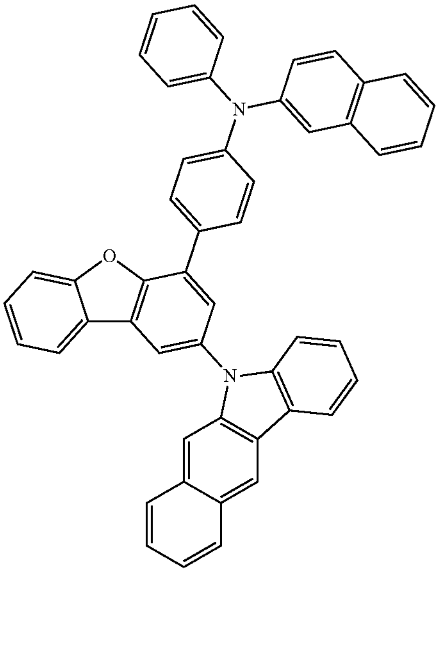
-continued
2-292
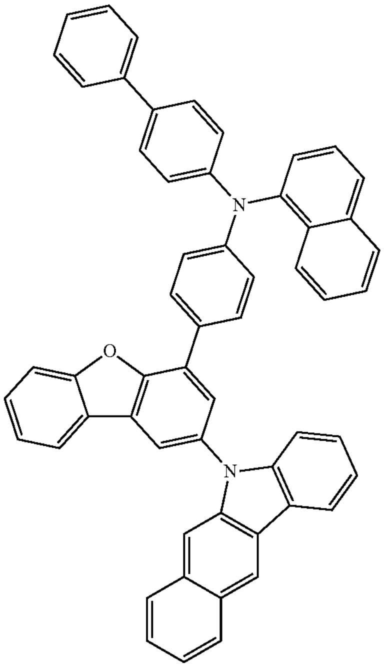
2-293
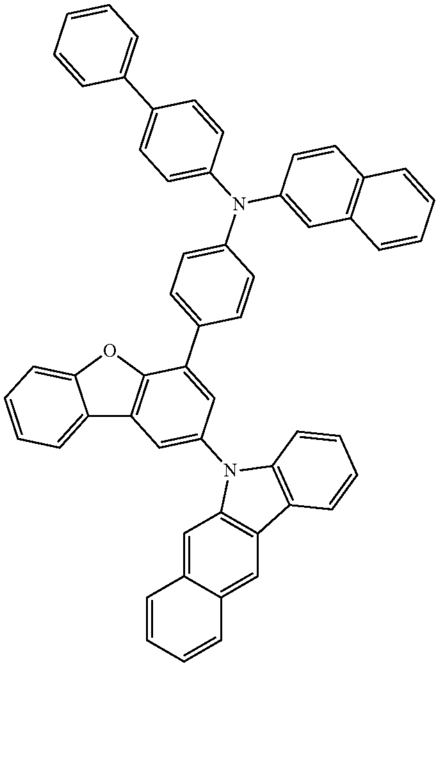

-continued
2-294
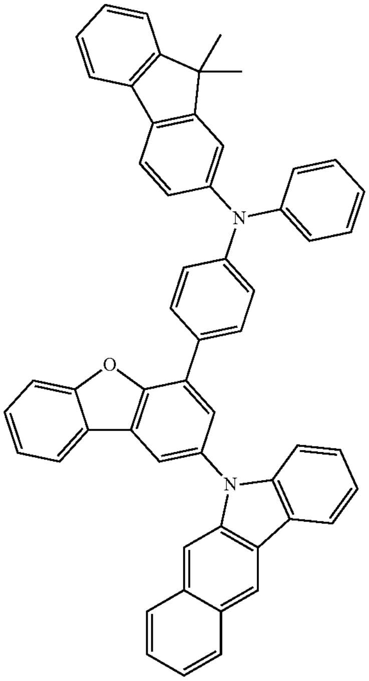
2-295
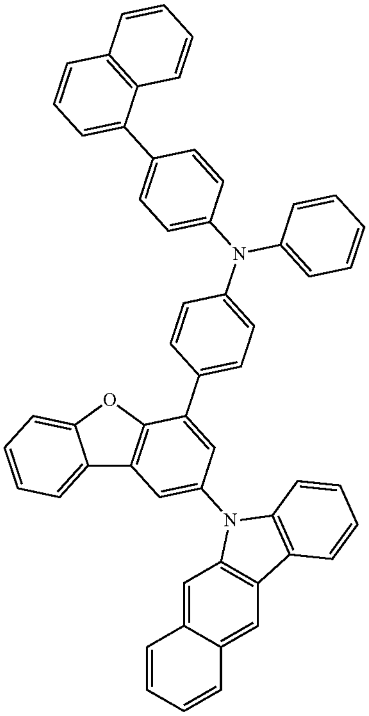
-continued
2-296
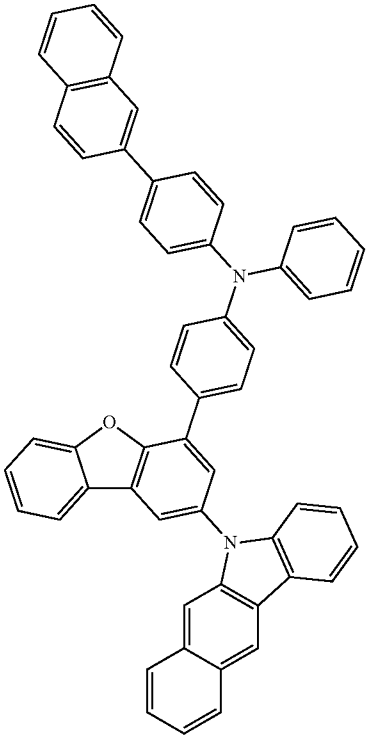
2-297
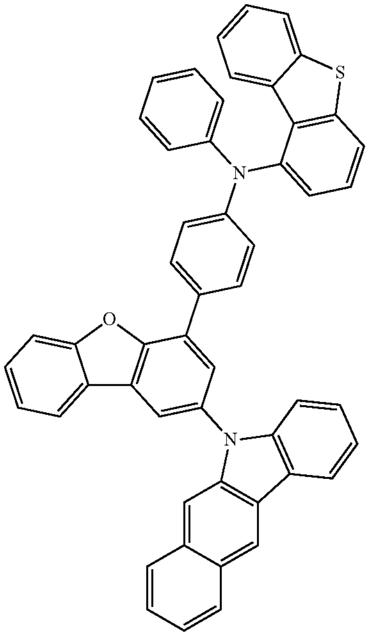

-continued
2-298
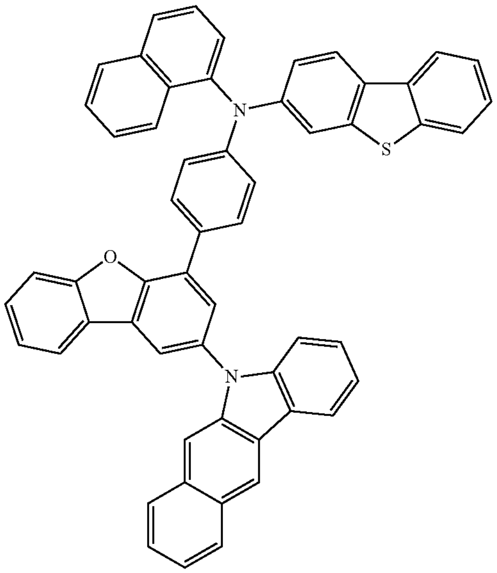
2-299
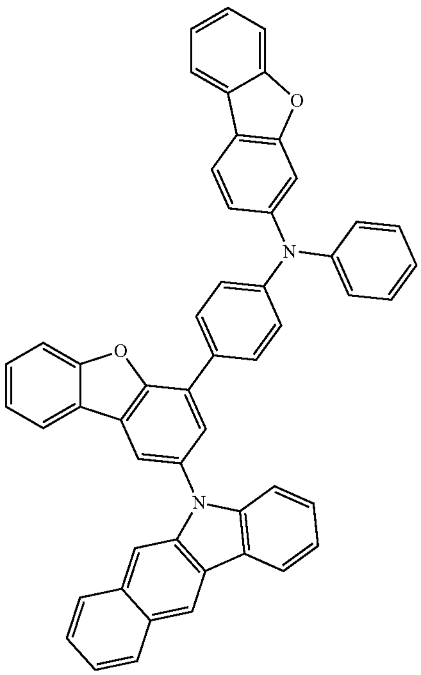
-continued
2-300
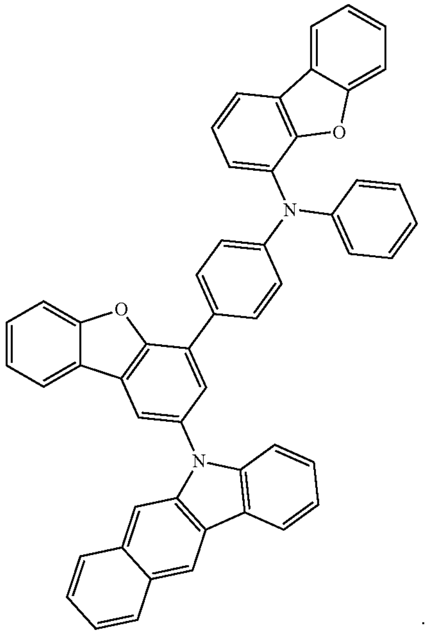
8. The organic light emitting device of claim 1, wherein Chemical Formula 3 is represented by any one of the following compounds:
3-1
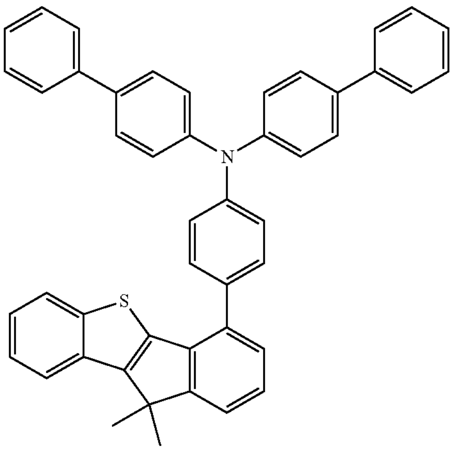
3-2
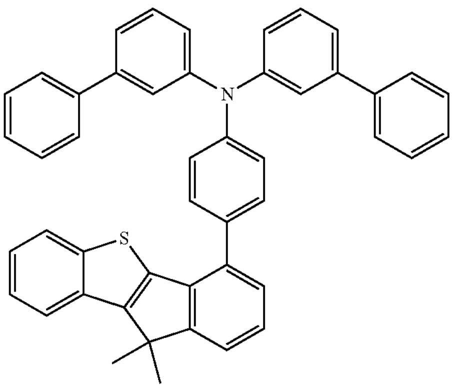

-continued
3-3
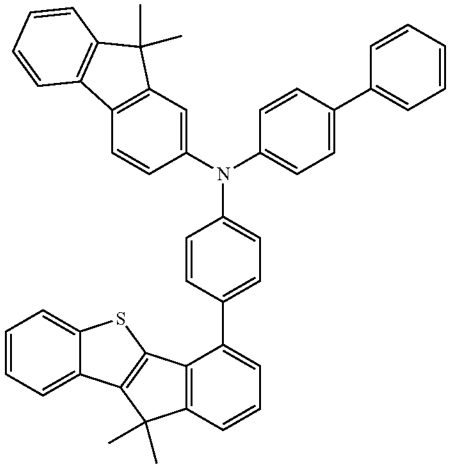
3-4
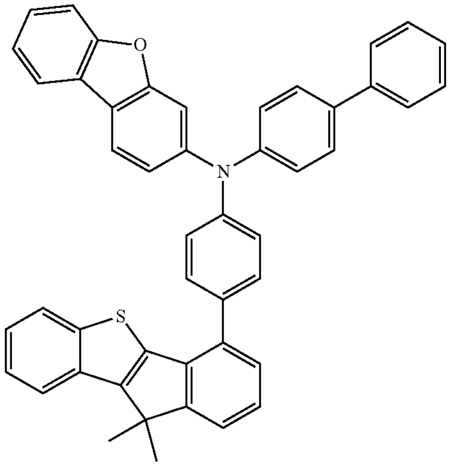
3-5
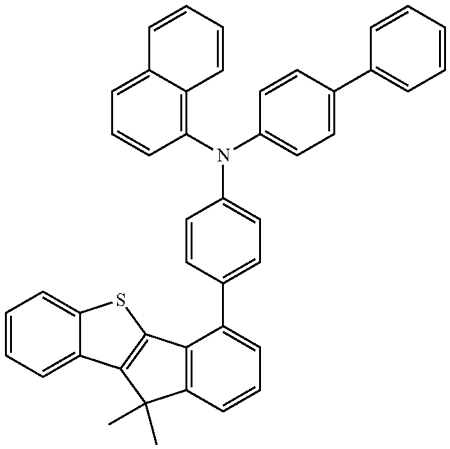
-continued
3-6
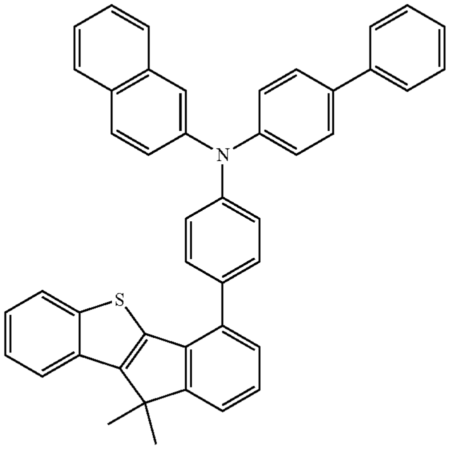
3-7
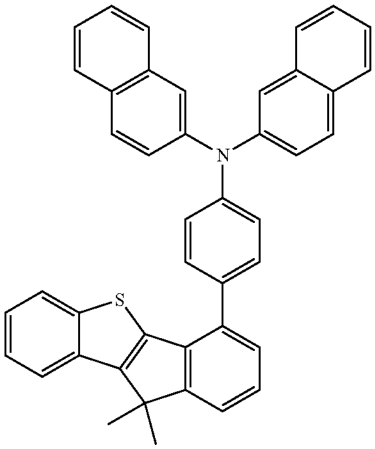
3-8
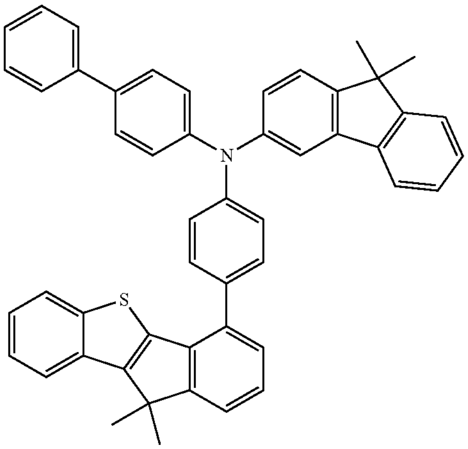

-continued
3-9
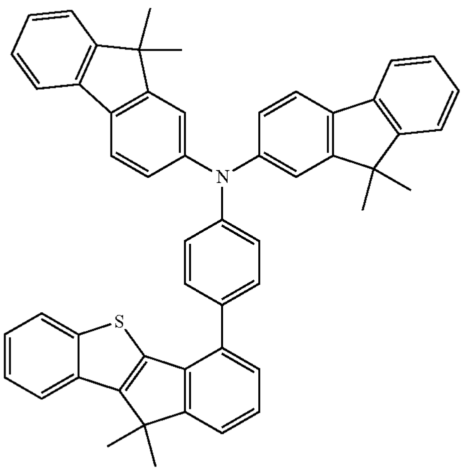
3-10
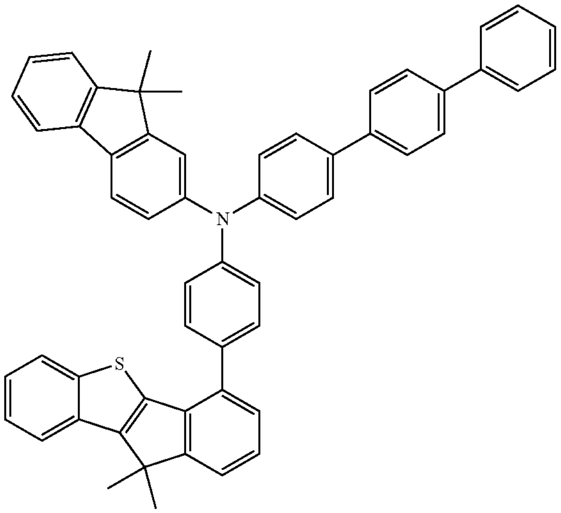
3-11
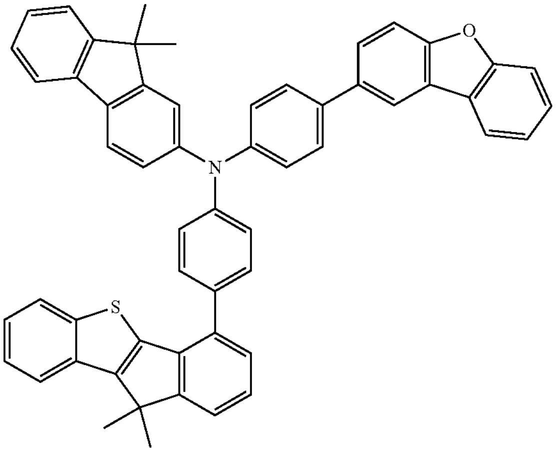
-continued
3-12
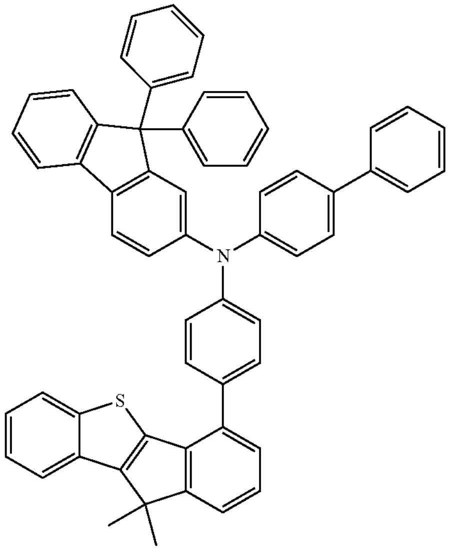
3-13
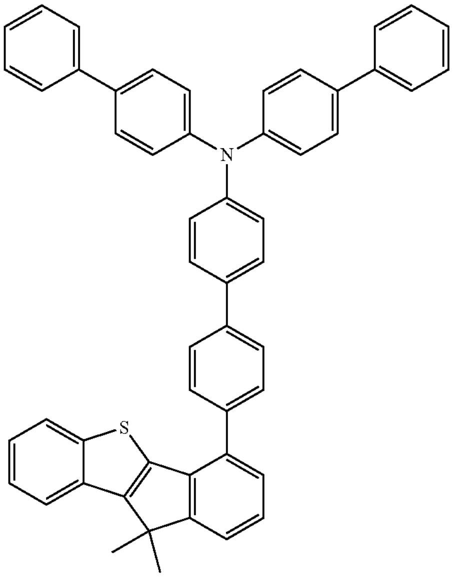

-continued
3-14
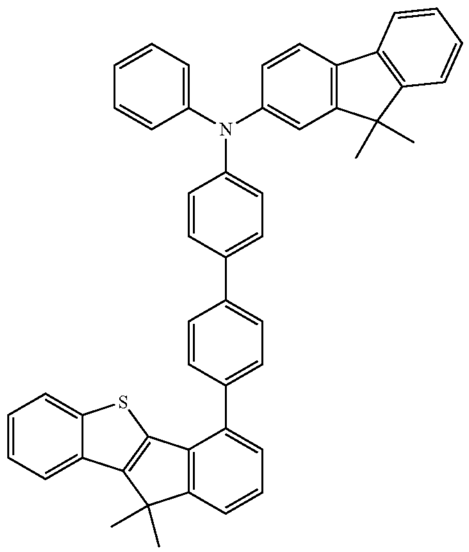
3-15
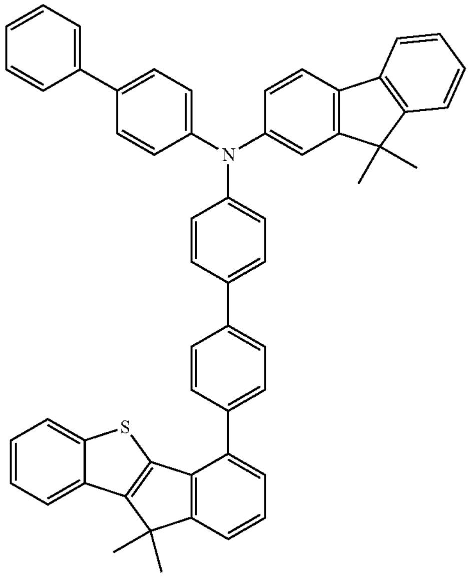
-continued
3-16
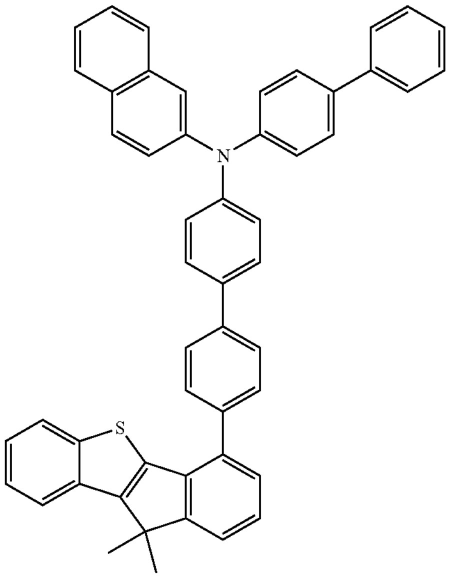
3-17
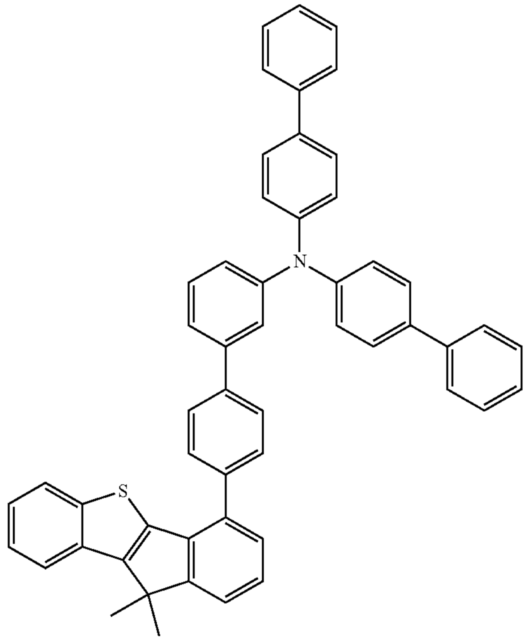

-continued
3-18
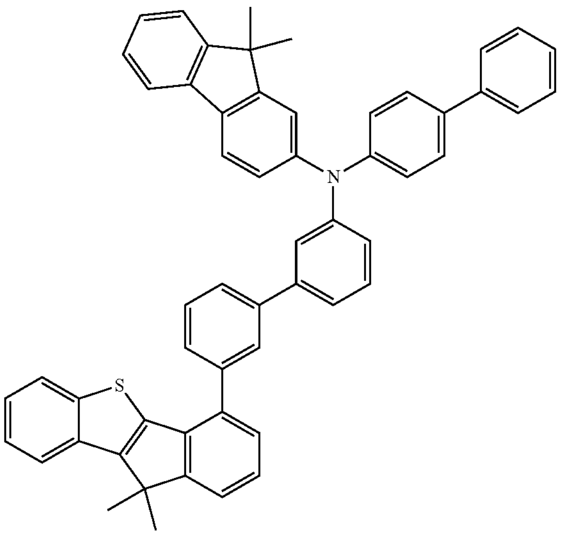
3-19
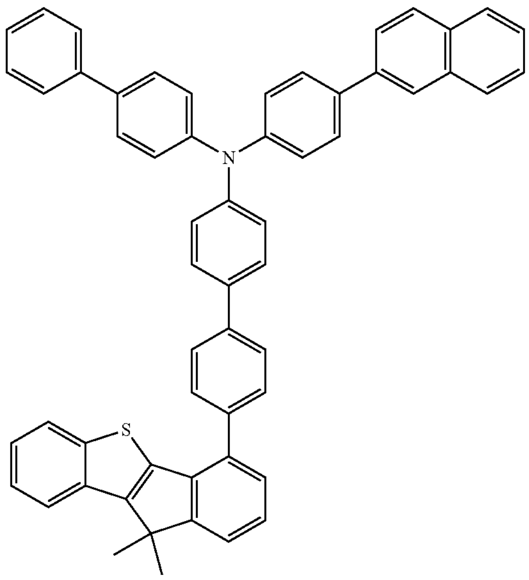
-continued
3-20
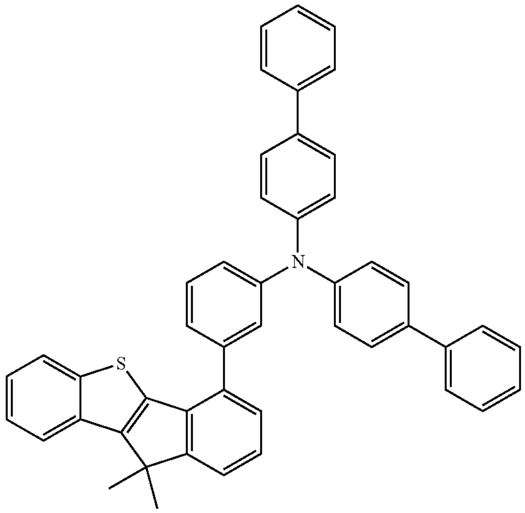
3-21
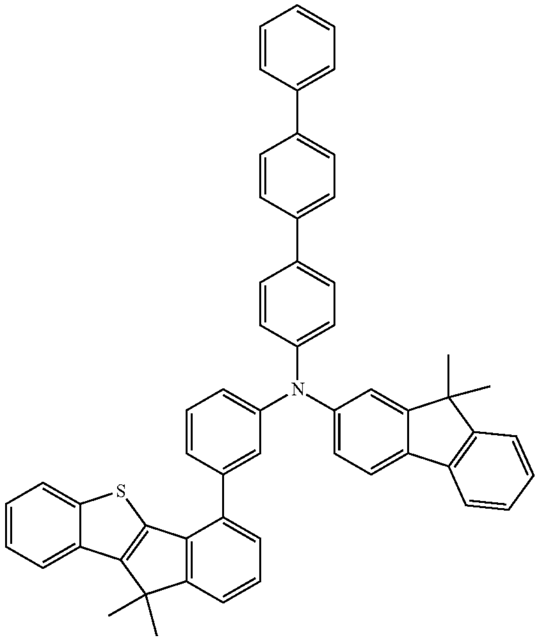

-continued
3-22
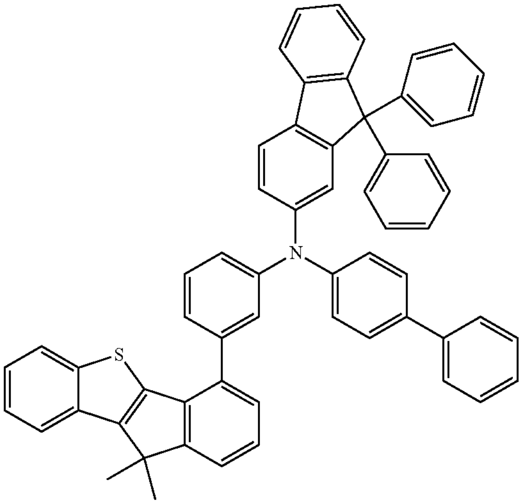
3-23
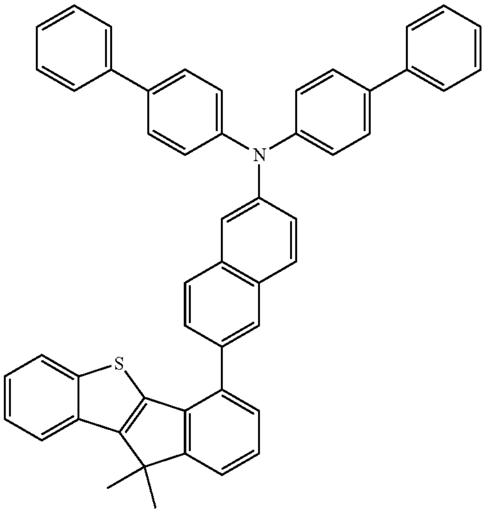
-continued
3-24
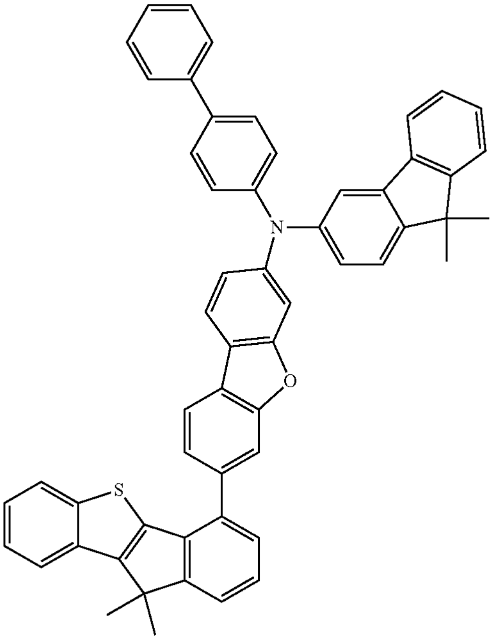
3-25
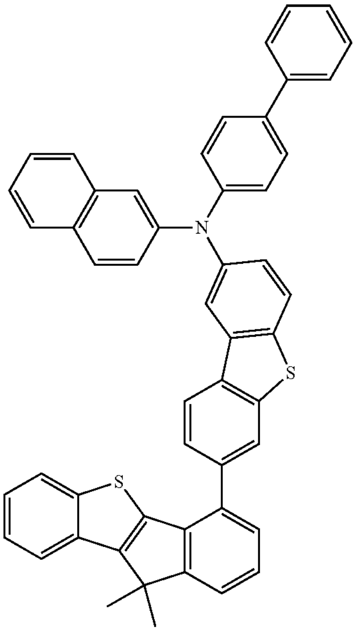

-continued
3-26
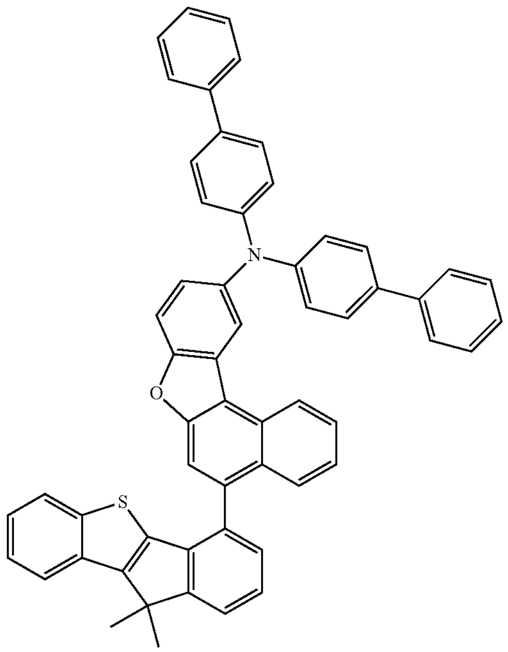
3-27
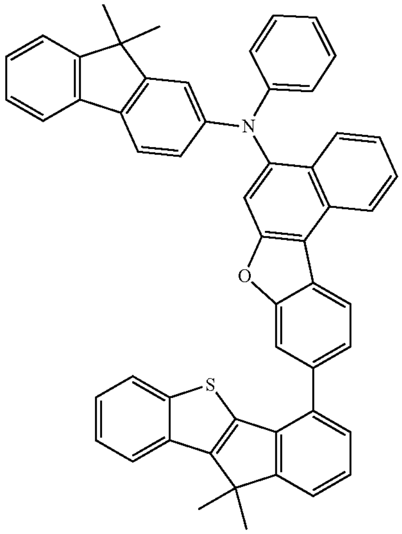
3-28
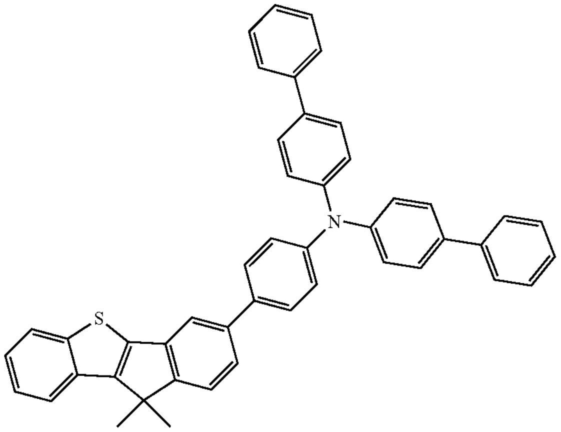
-continued
3-29
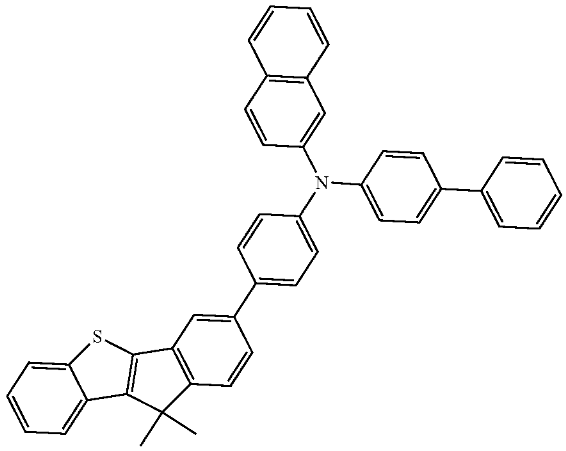
3-30
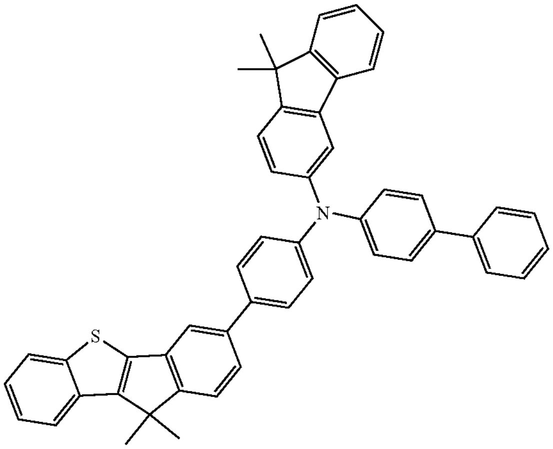
3-31
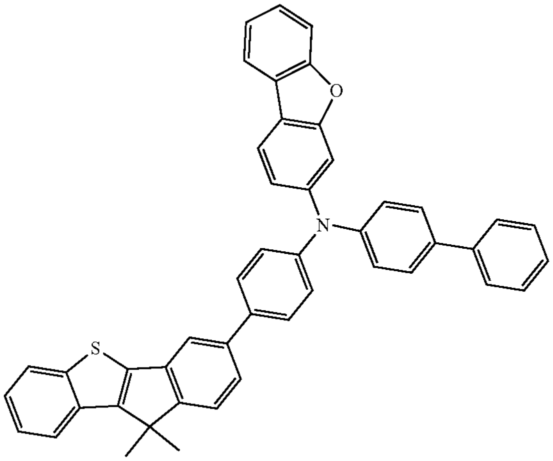

-continued
3-32
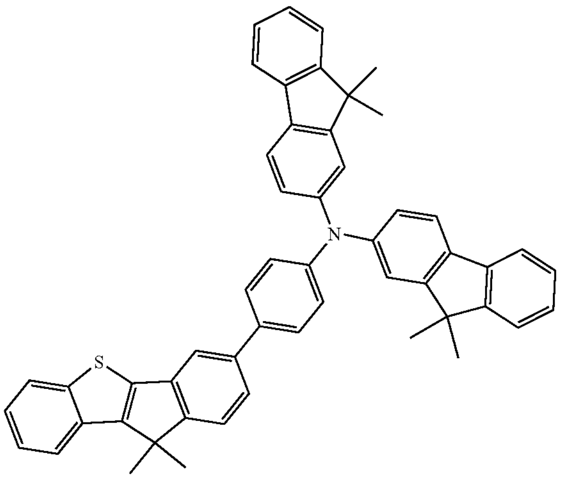
3-33
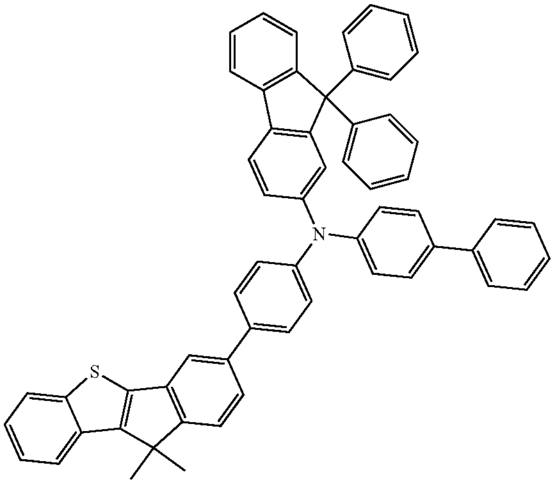
3-34
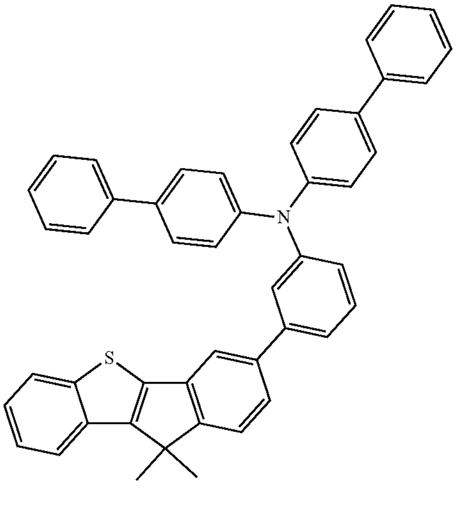
-continued
3-35
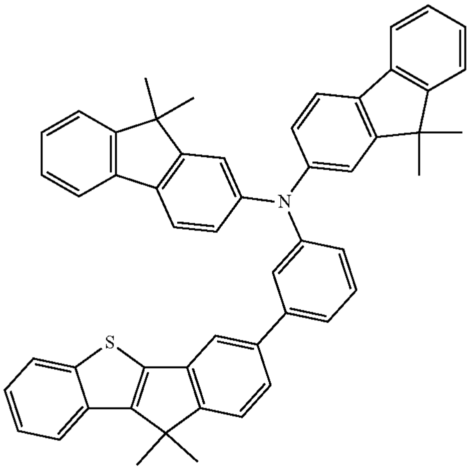
3-36
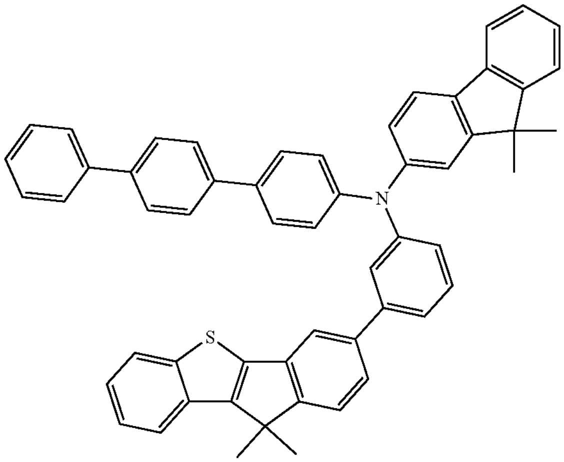
3-37
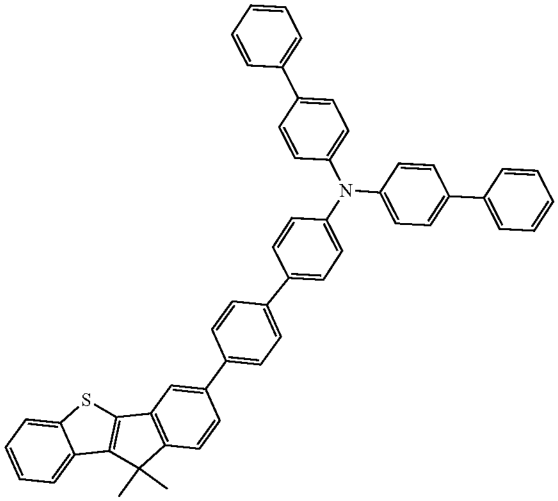

-continued
3-38
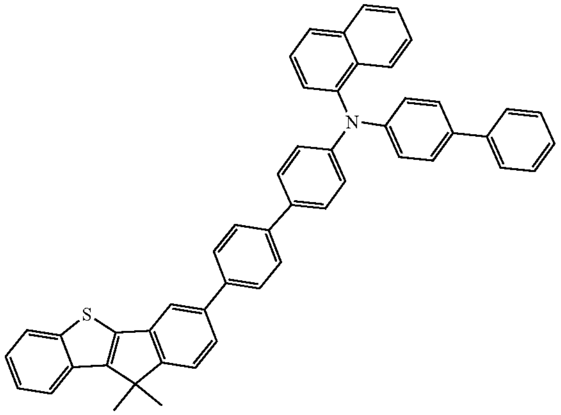
3-39
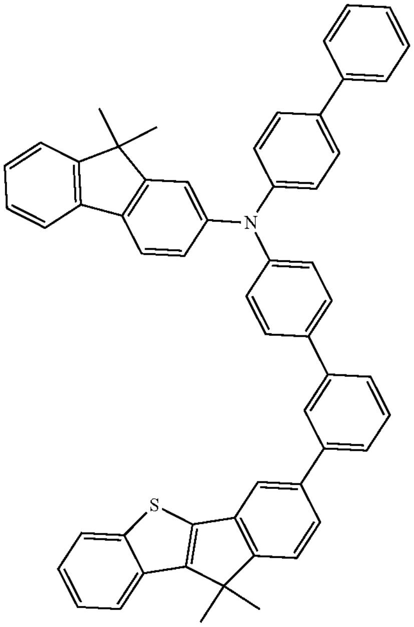
3-40
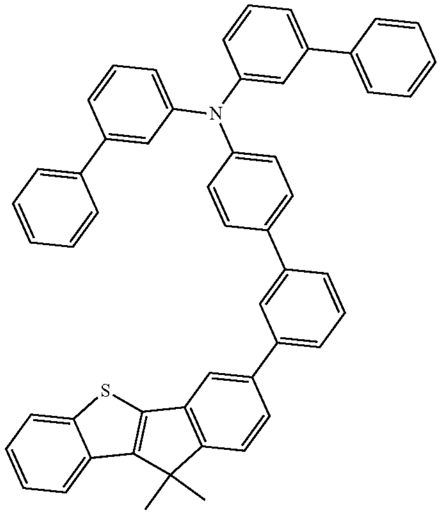
-continued
3-41
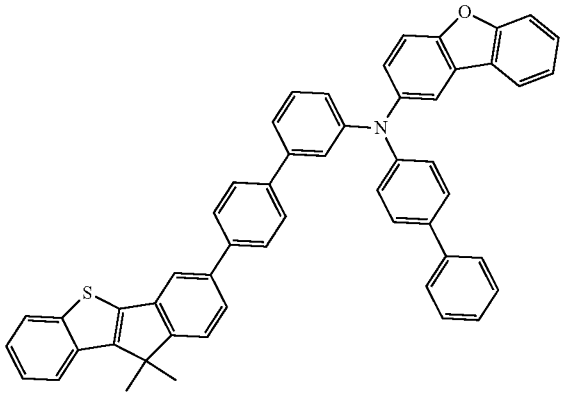
3-42
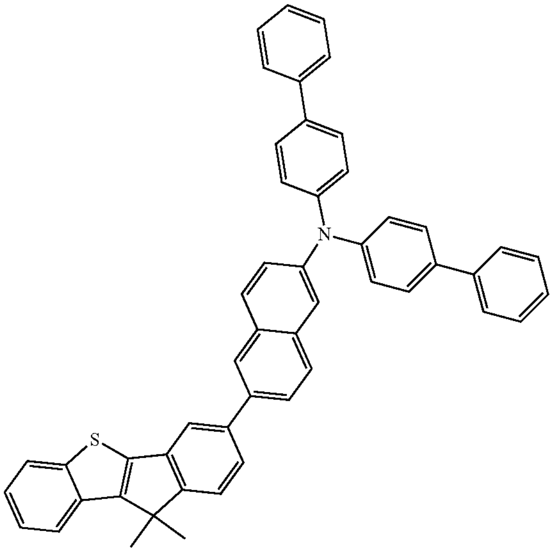
3-43
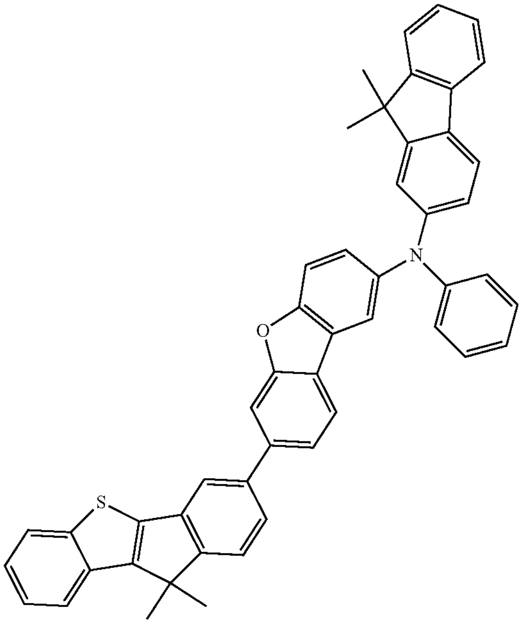

-continued
3-44
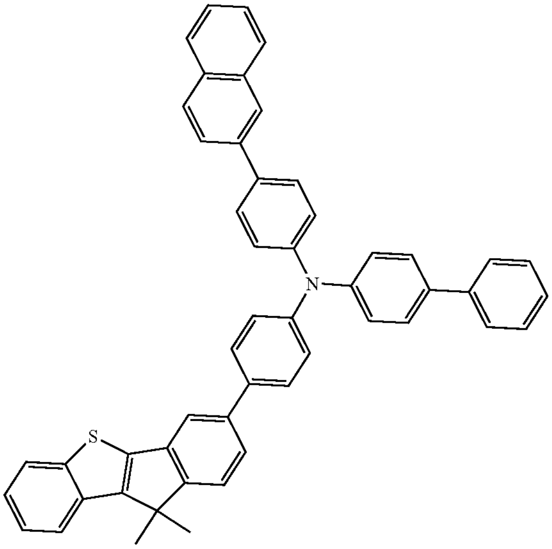
3-45
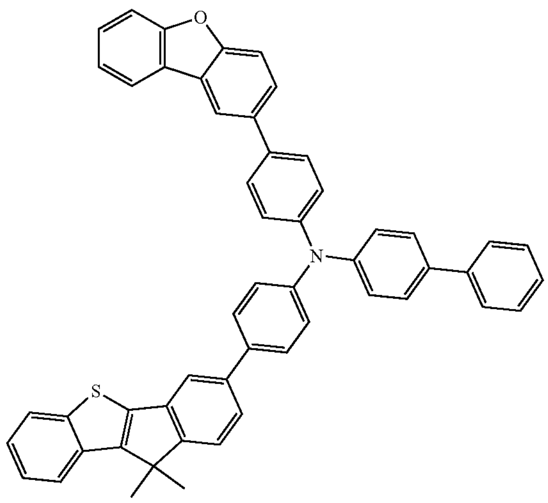
-continued
3-46
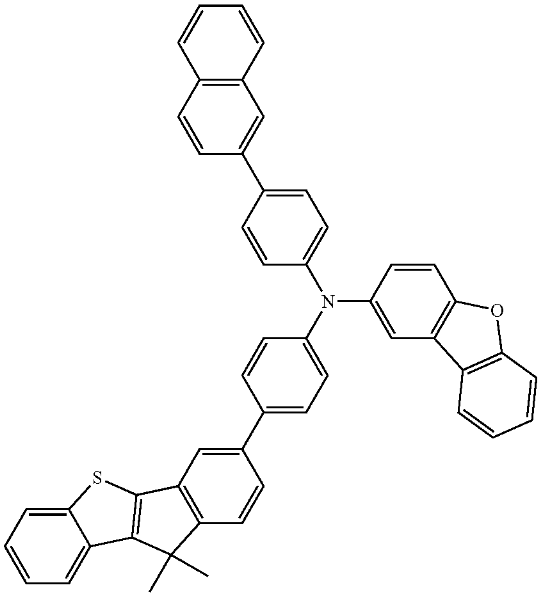
3-47
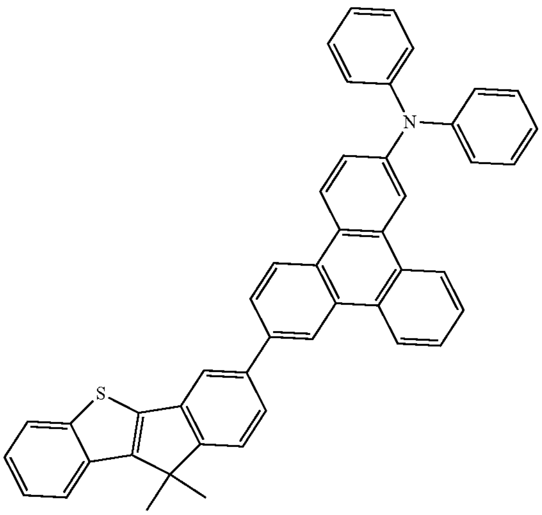
3-48
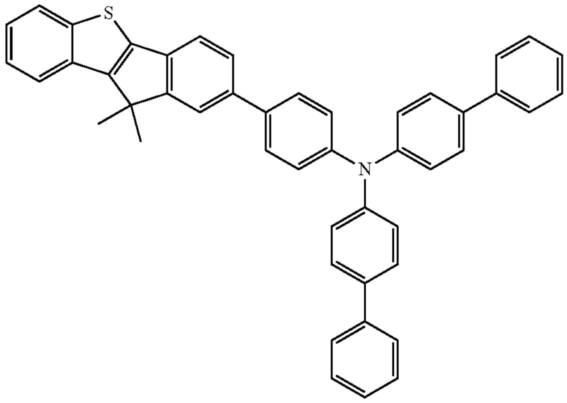

3-49
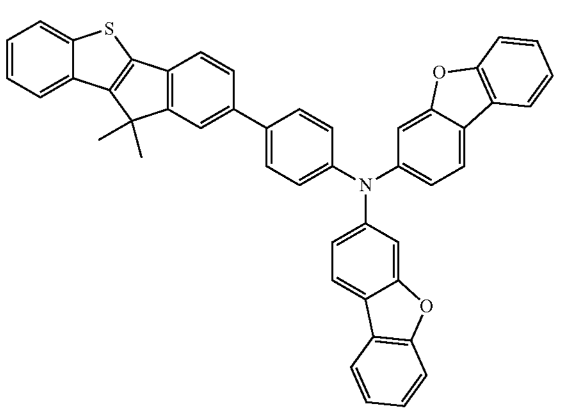
3-50
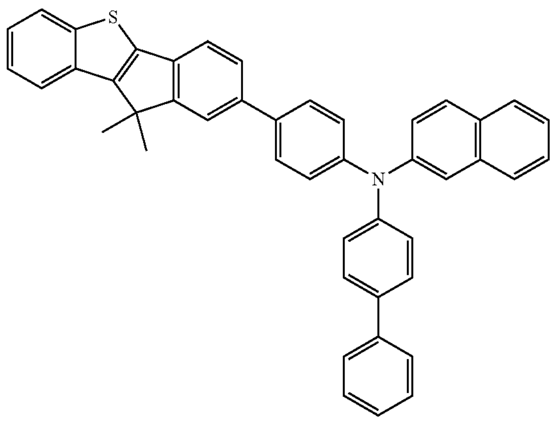
3-51
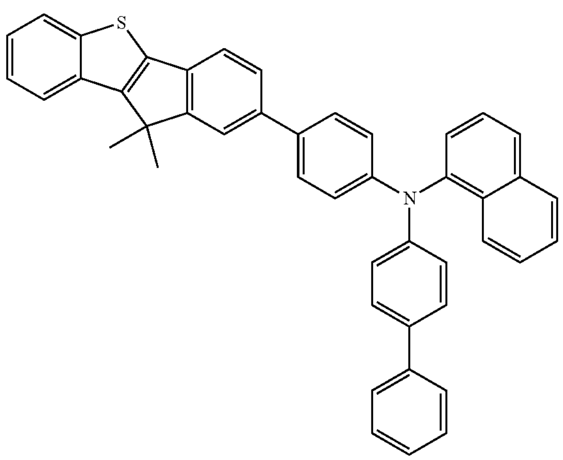
3-52
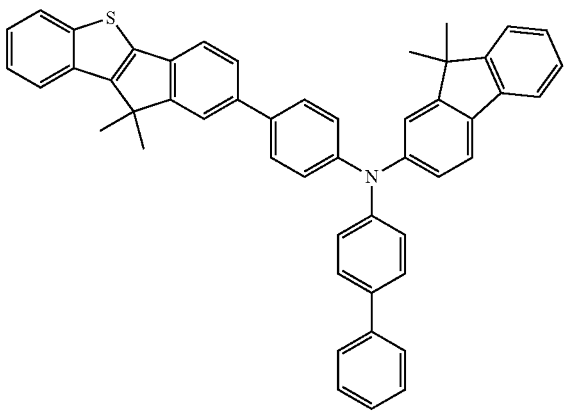
3-53
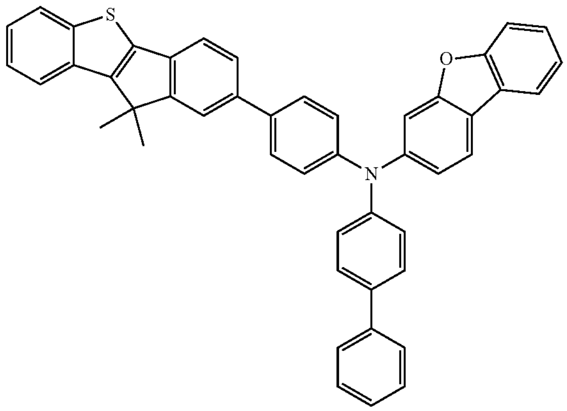
3-54
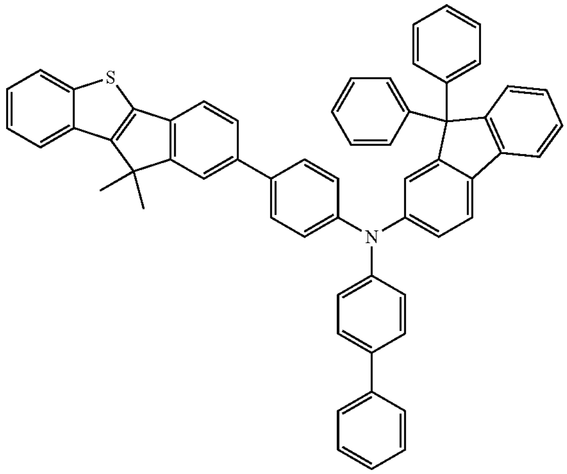

-continued
3-55
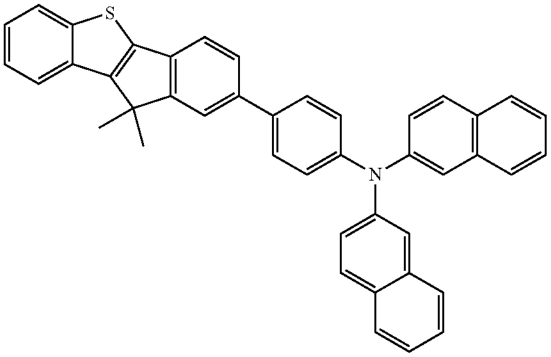
3-56
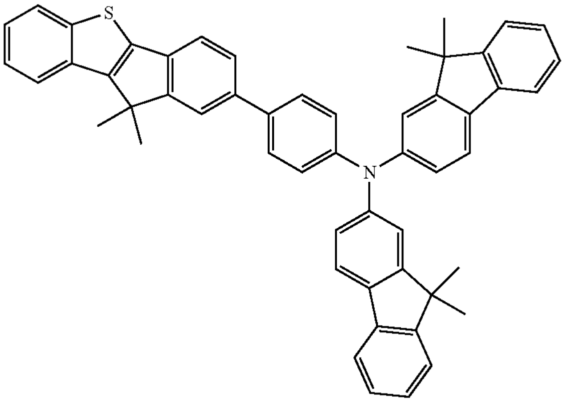
3-57
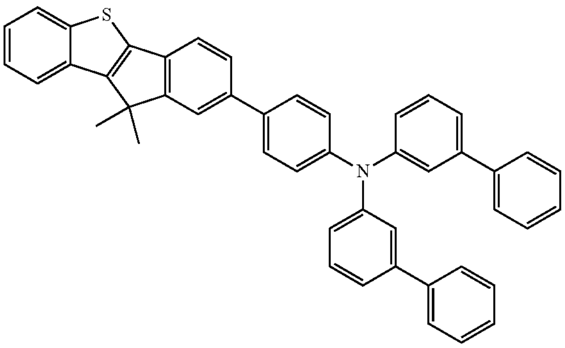
3-58
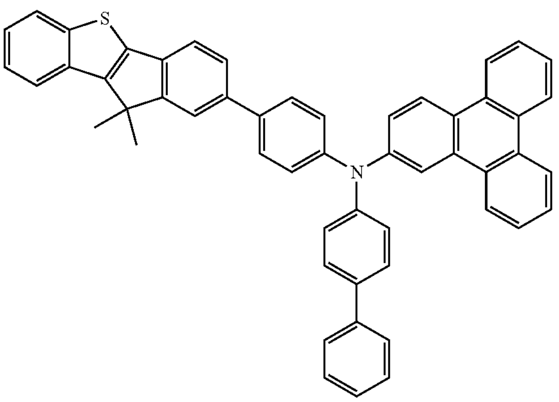
-continued
3-59
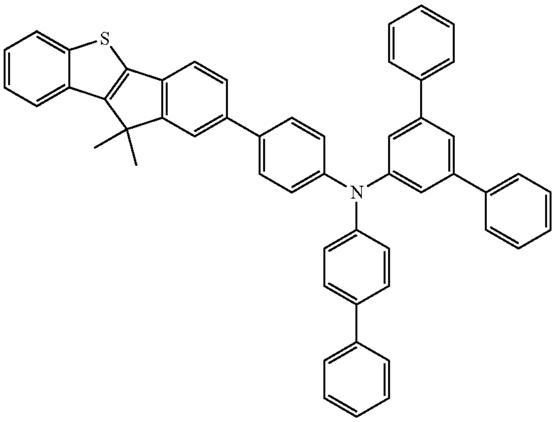
3-60
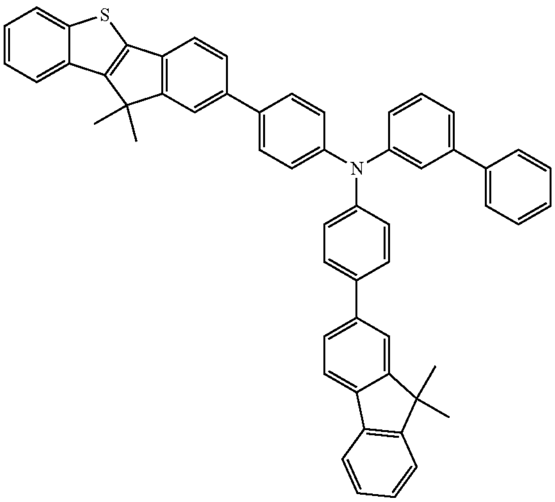
3-61
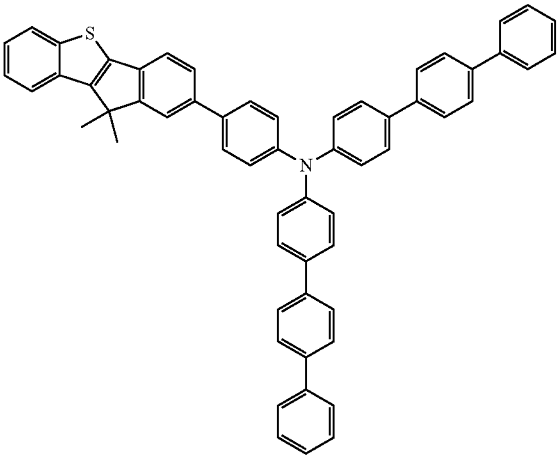

-continued
3-62
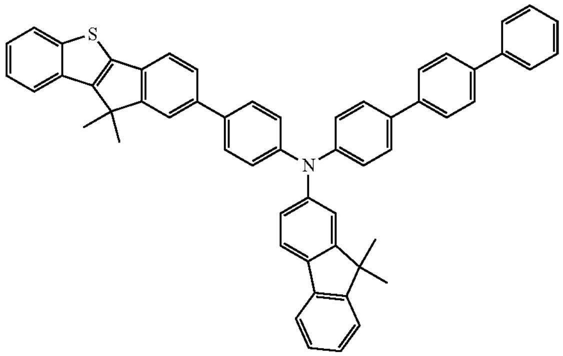
3-63
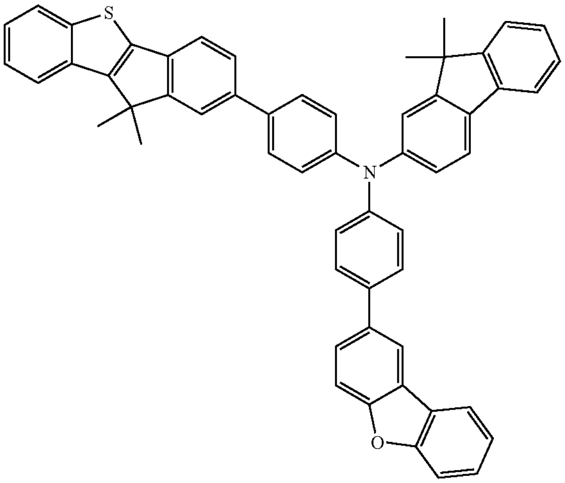
3-64
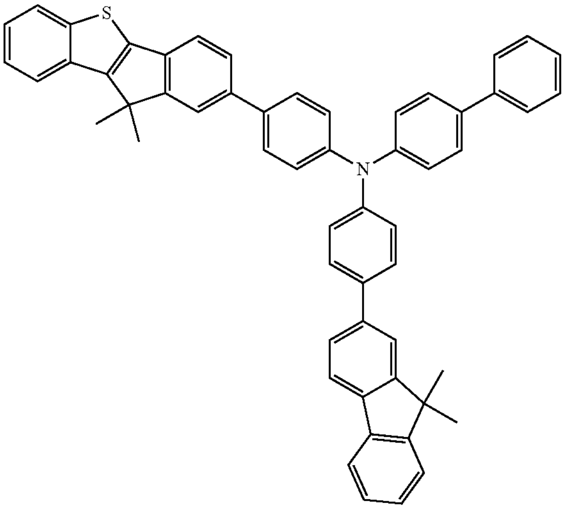
-continued
3-65
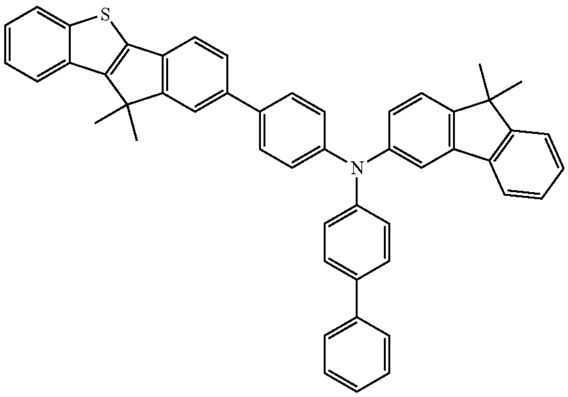
3-66
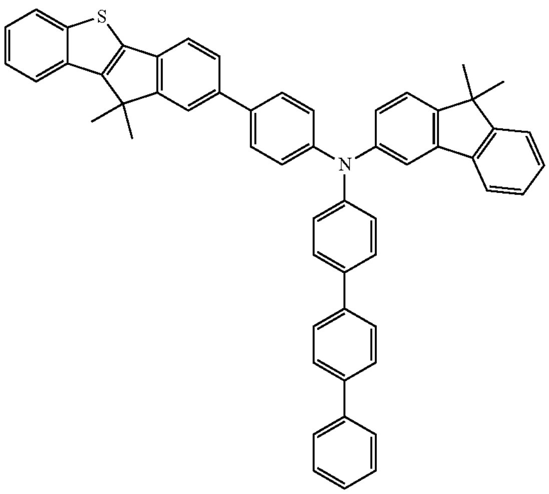
3-67
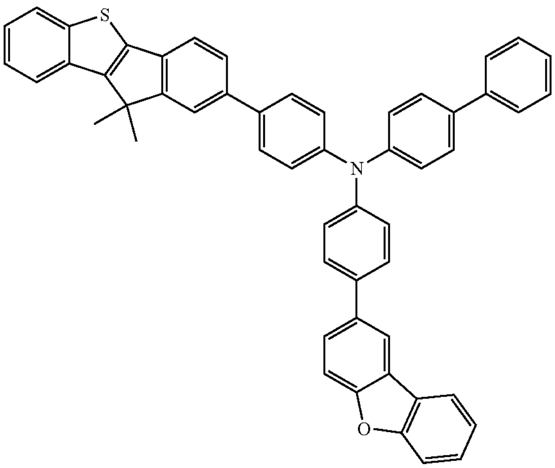

-continued
3-68
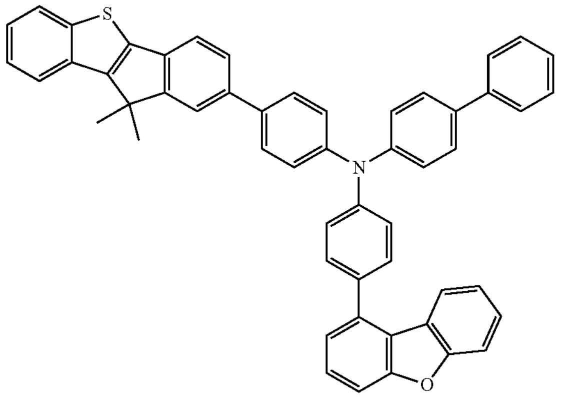
3-69
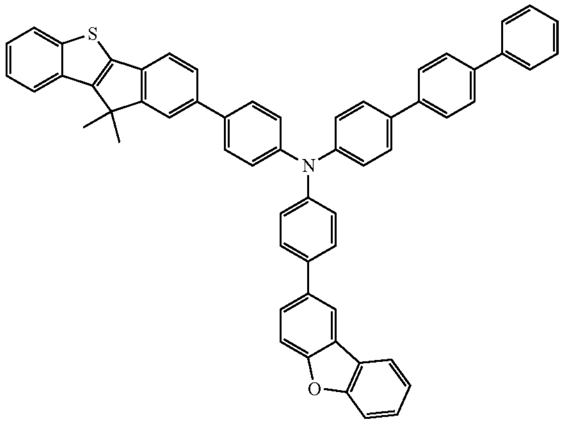
3-70
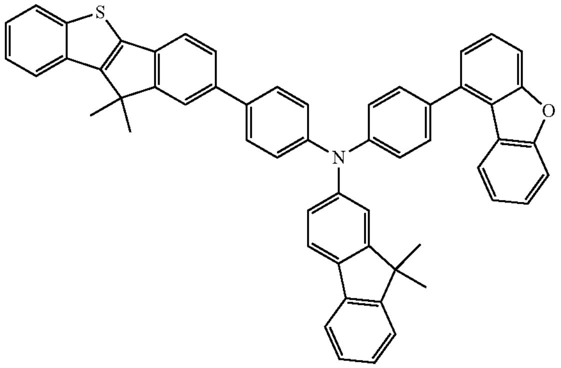
-continued
3-71
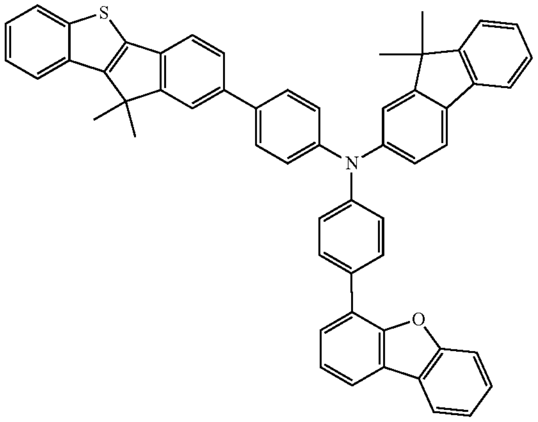
3-72
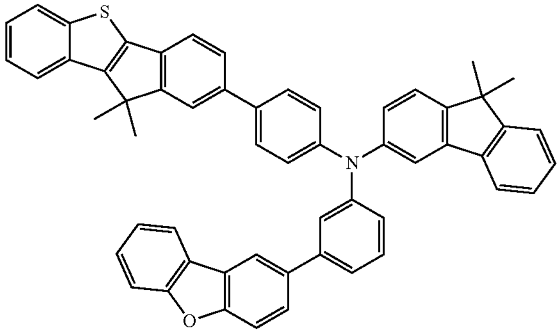
3-73
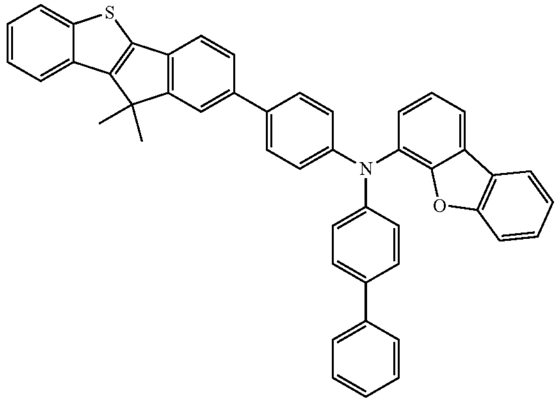
3-74
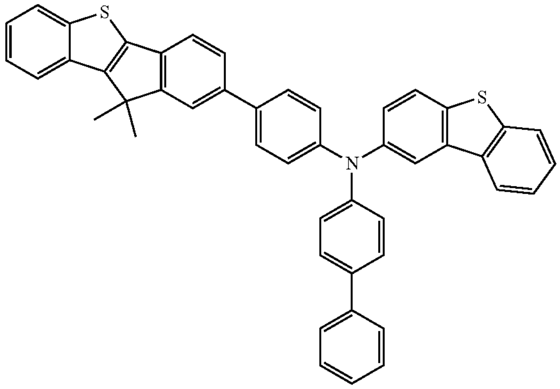

-continued
3-75
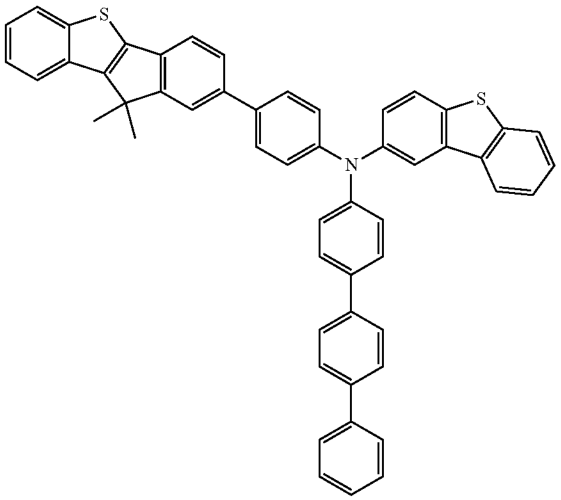
3-76
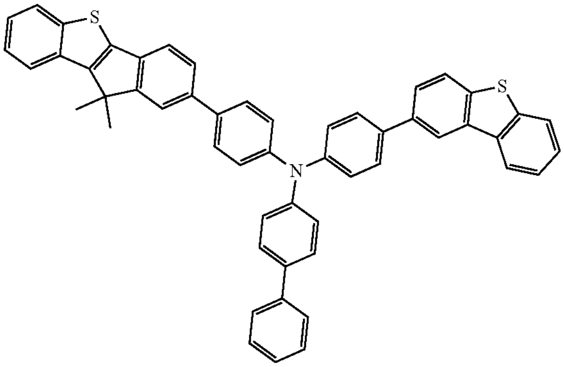
3-77
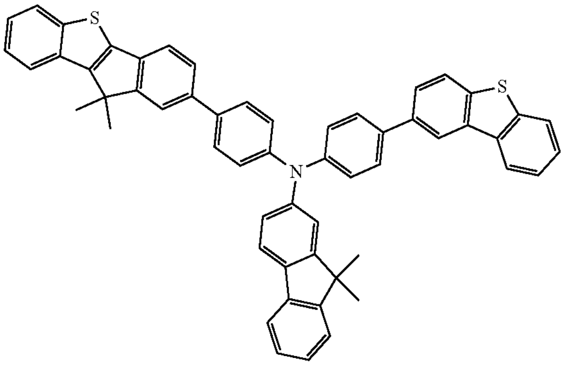
-continued
3-78
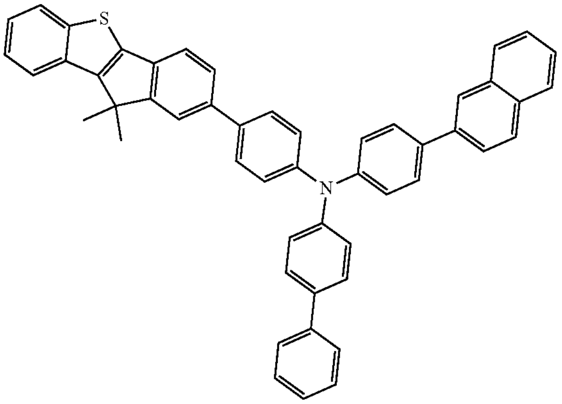
3-79
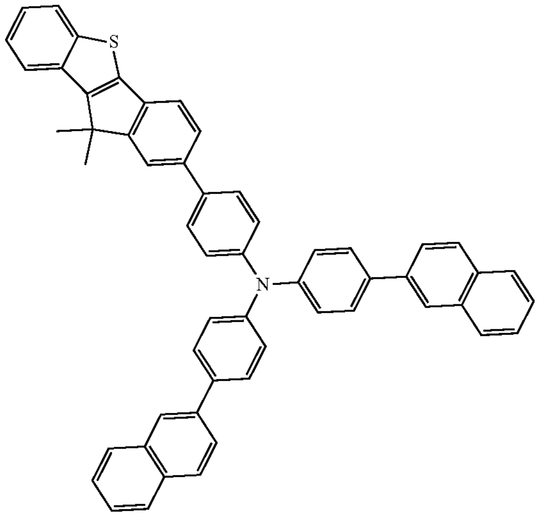
3-80
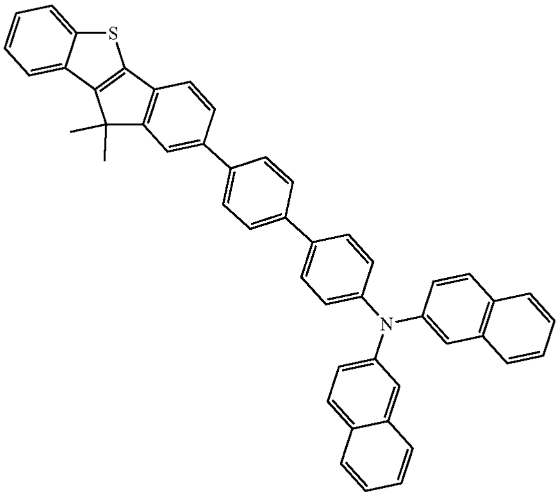

-continued
3-81
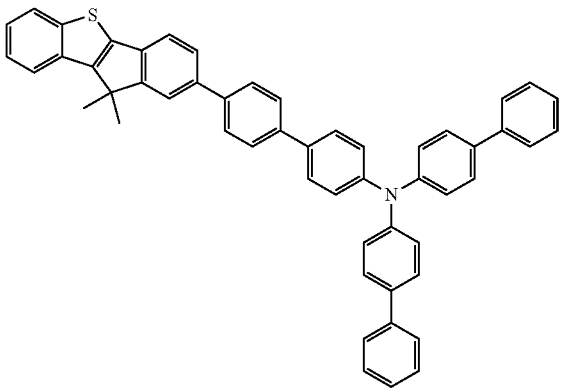
3-82
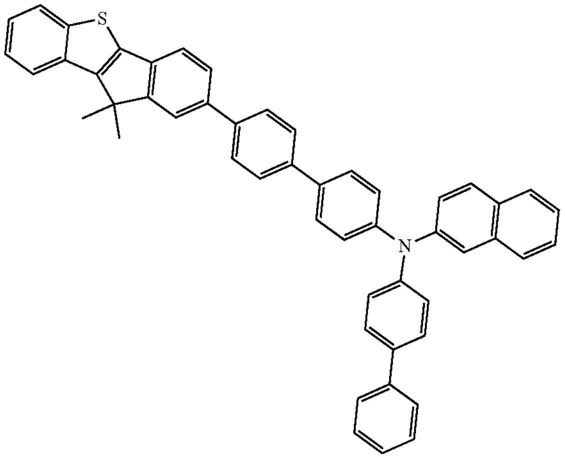
3-83
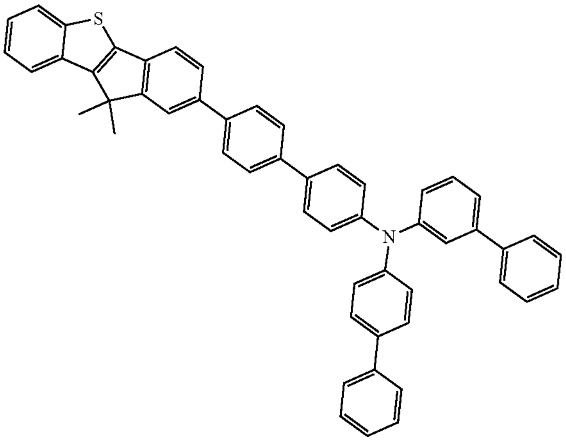
-continued
3-84
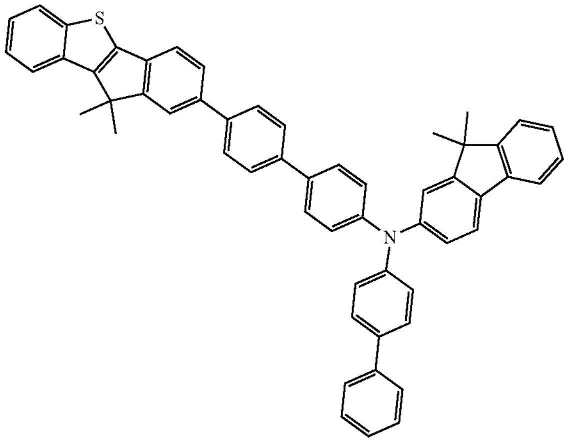
3-85
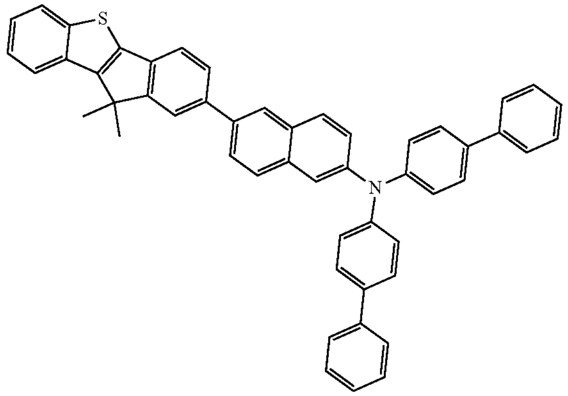
3-86
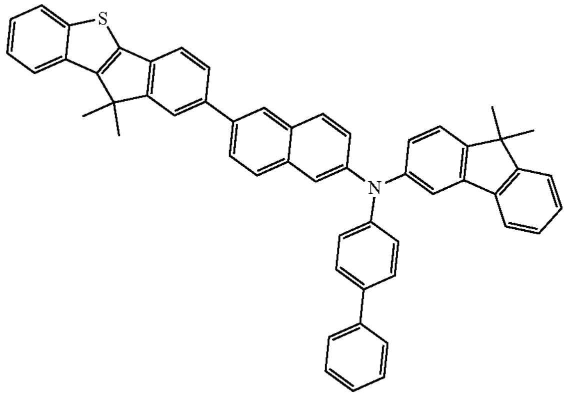

-continued
3-87
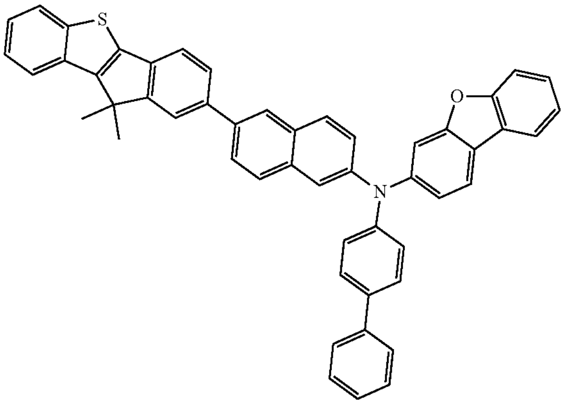
3-88
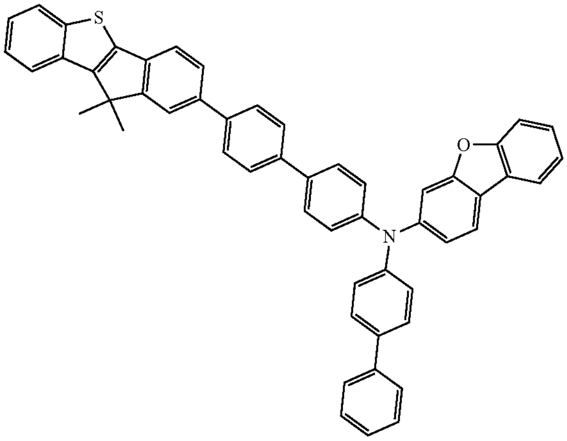
3-89
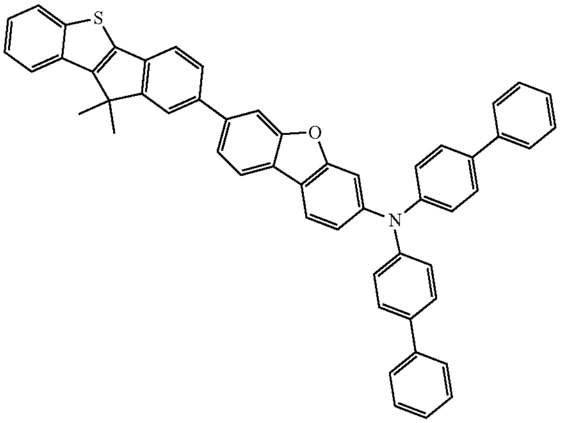
-continued
3-90
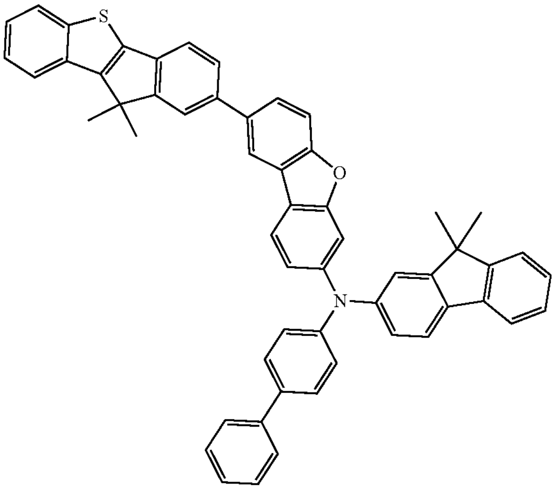
3-91
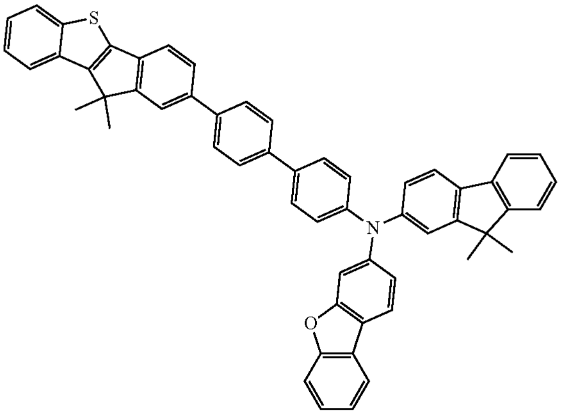
3-92
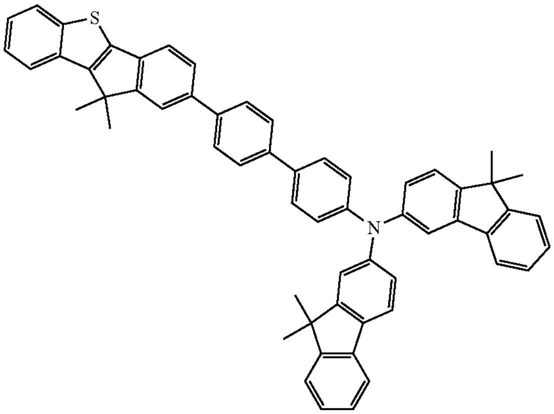

-continued
3-93
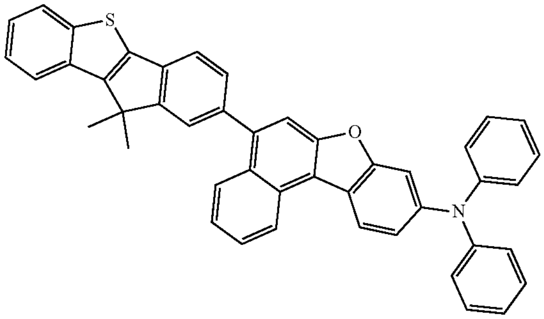
3-94
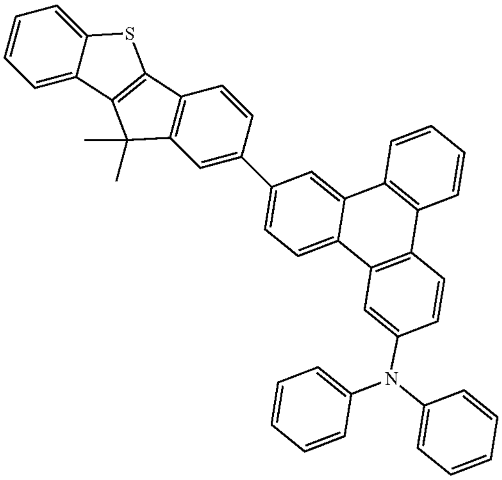
3-95
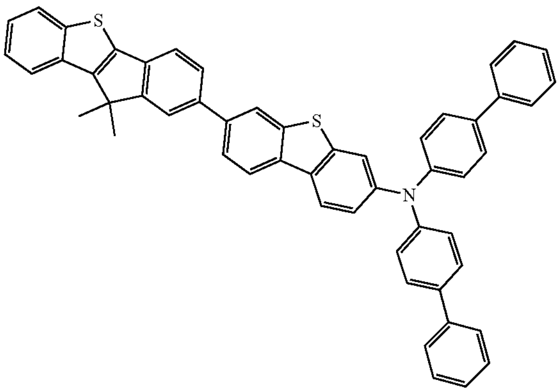
3-96
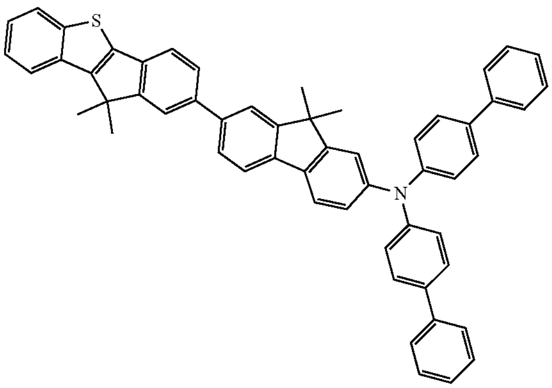
-continued
3-97
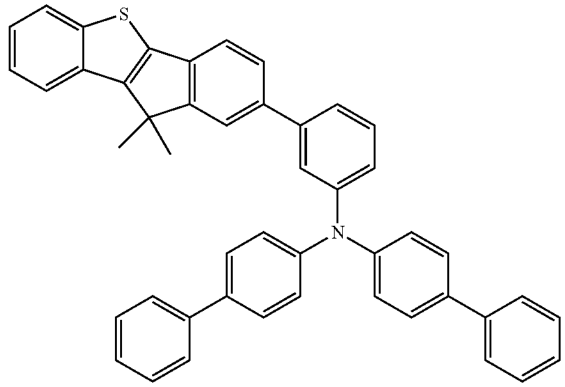
3-98
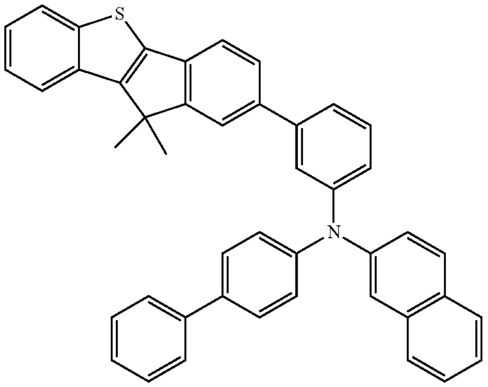
3-99
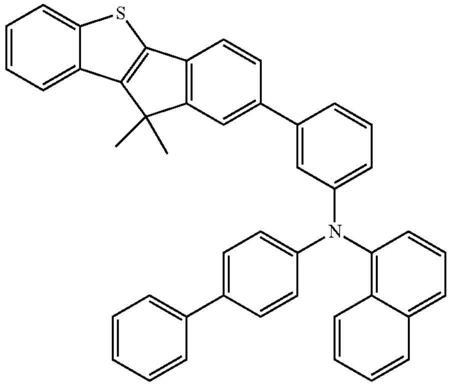
3-100
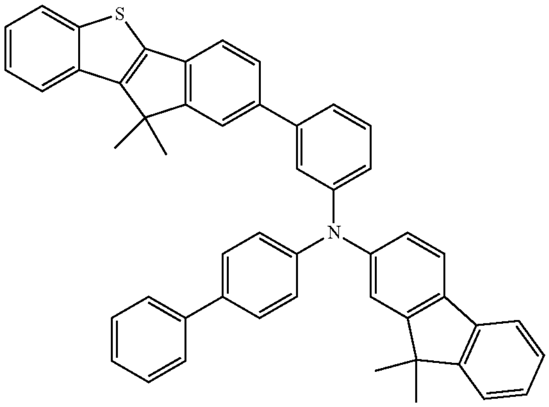

-continued
3-101
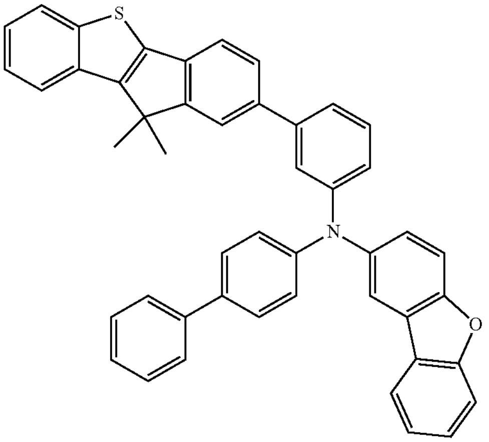
3-102
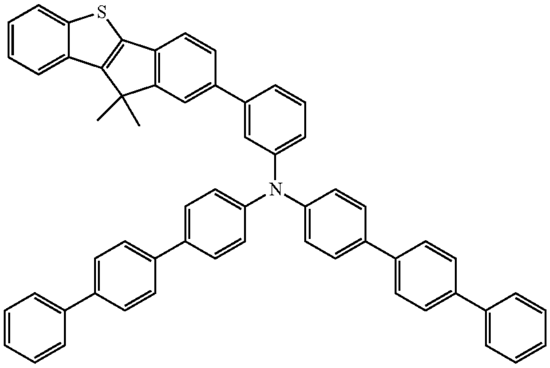
3-103
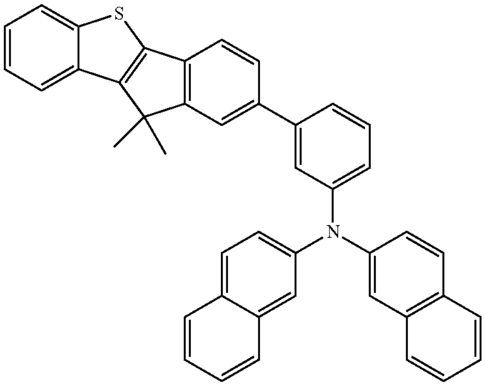
-continued
3-104
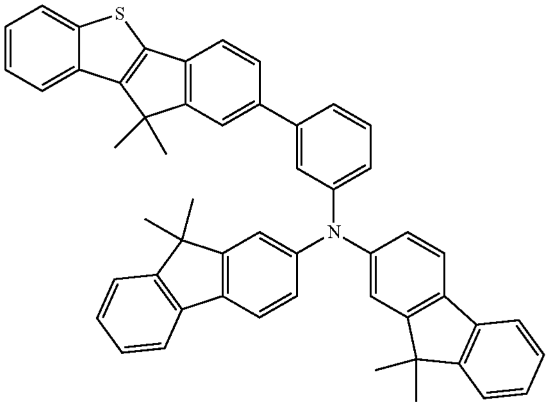
3-105
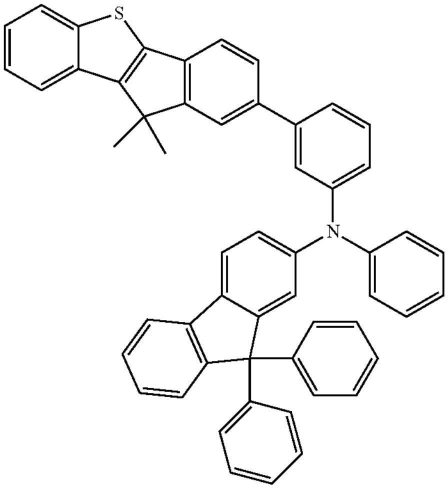
3-106
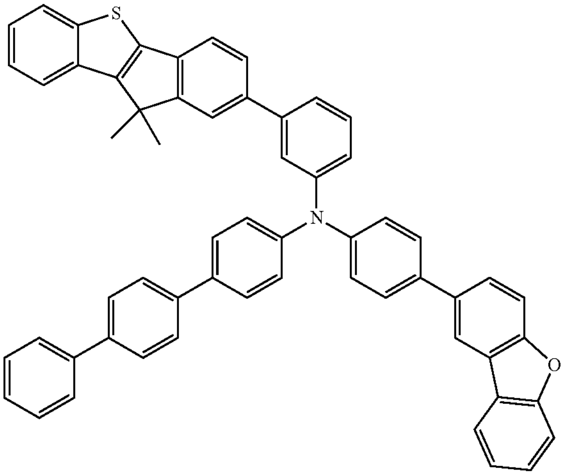

-continued
3-107
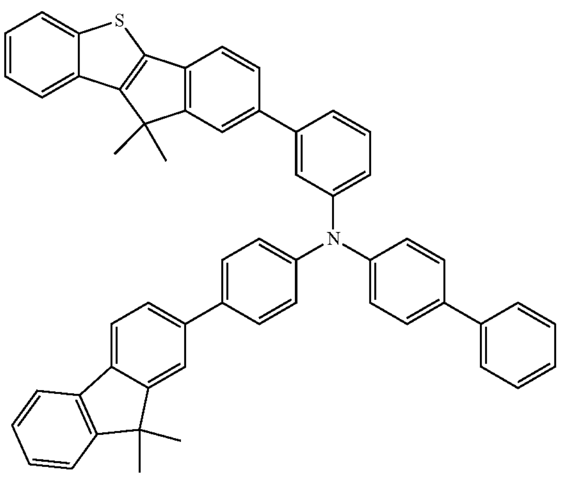
3-108
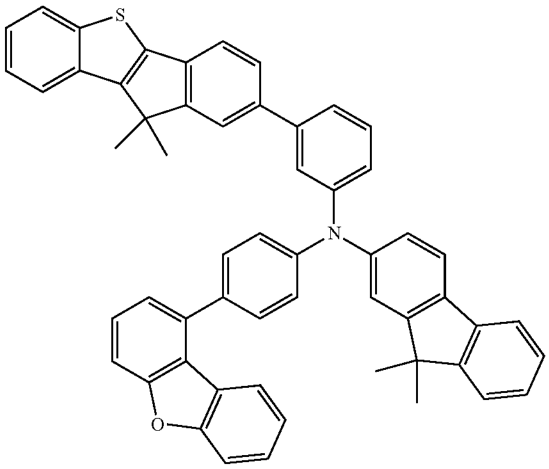
3-109
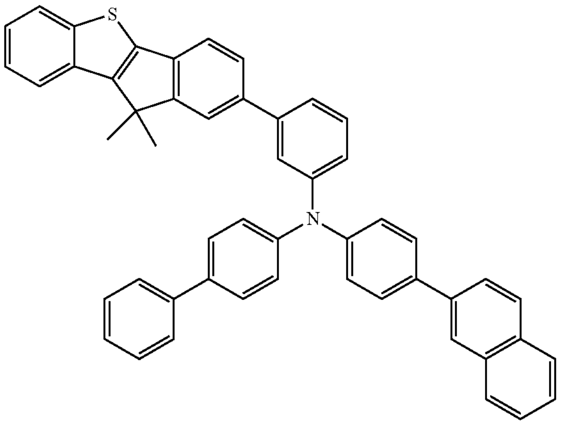
-continued
3-110
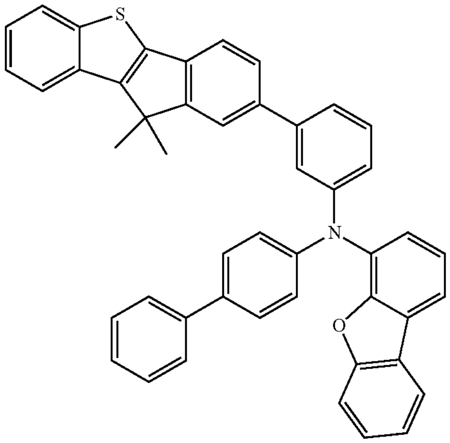
3-111
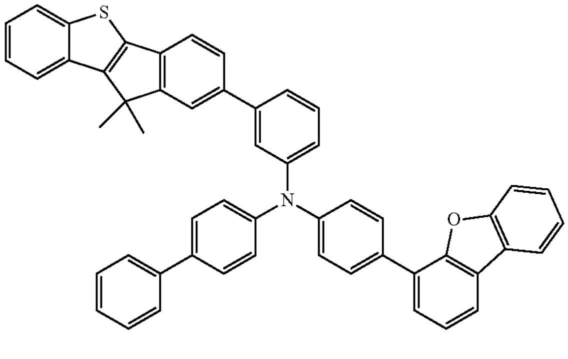
3-112
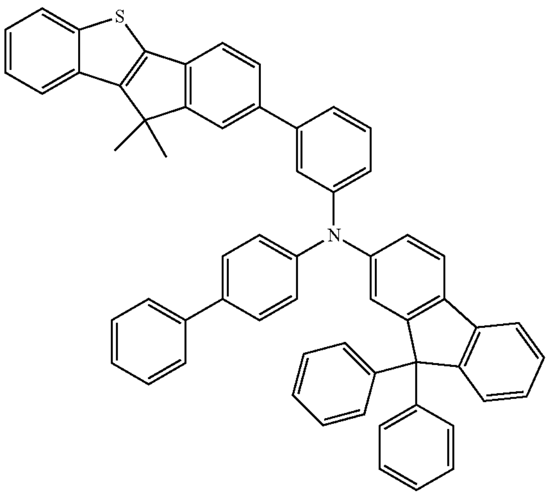

3-113
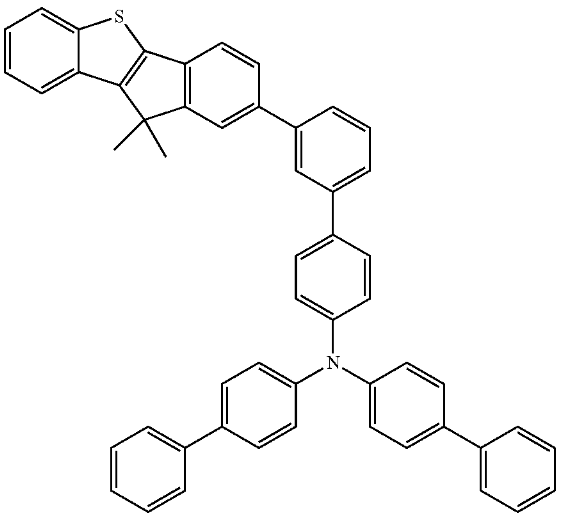
3-114
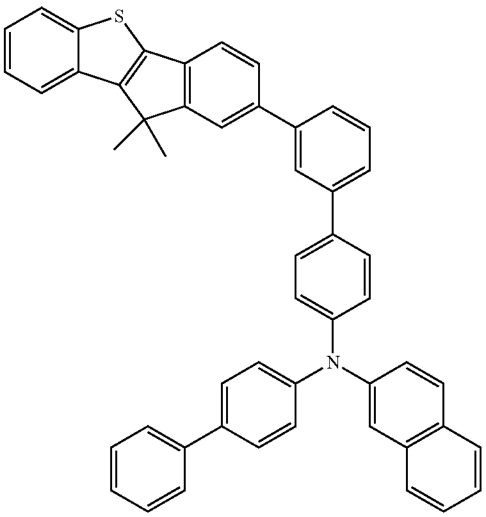
3-115
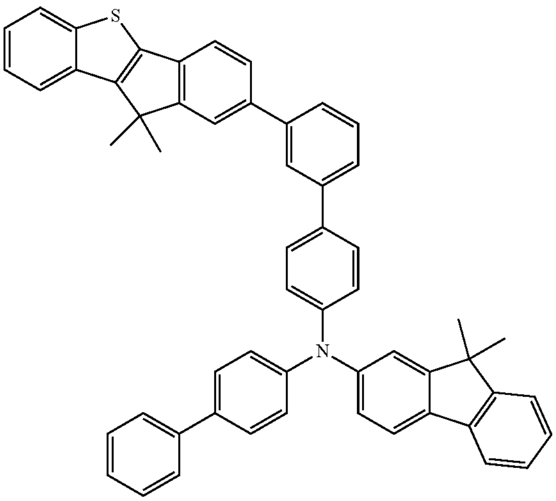
3-116
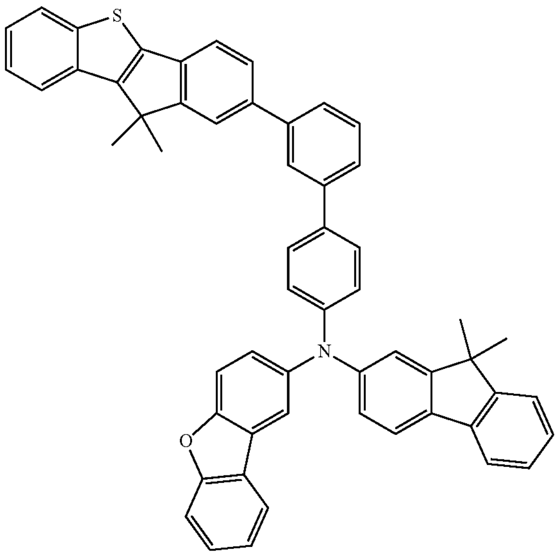
3-117
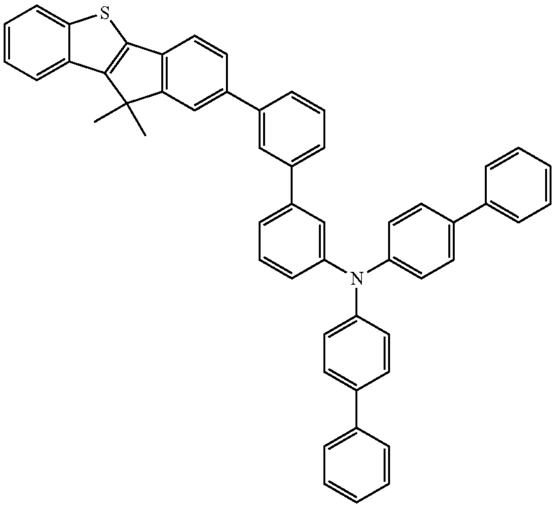
3-118
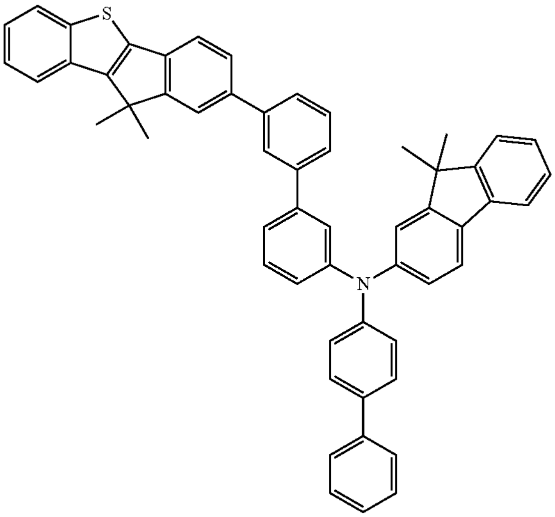

3-119
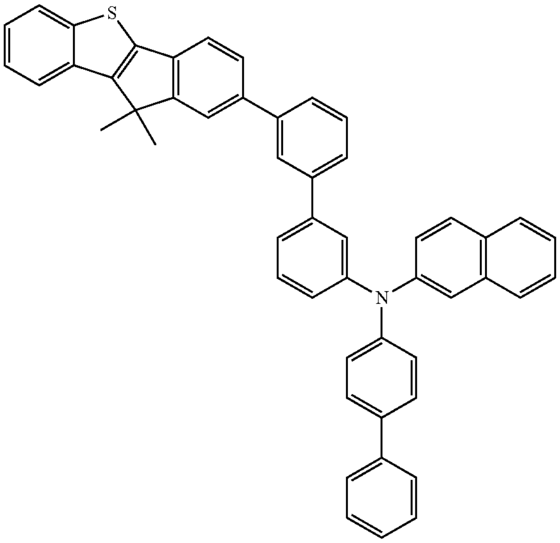
3-120
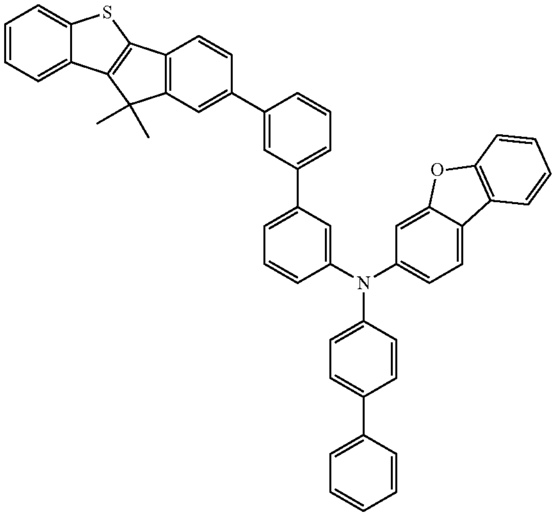
3-121
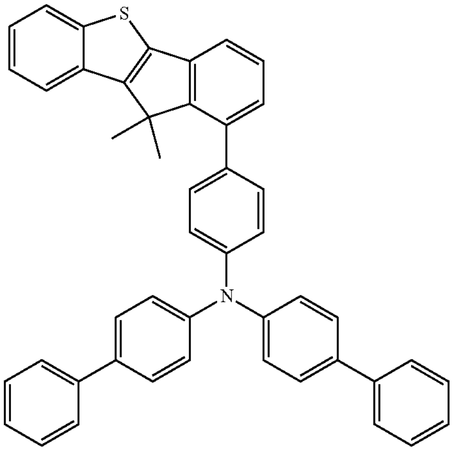
3-122
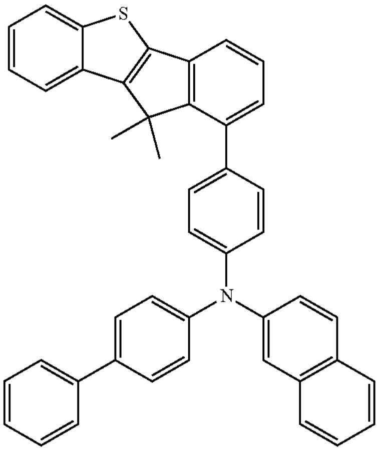
3-123
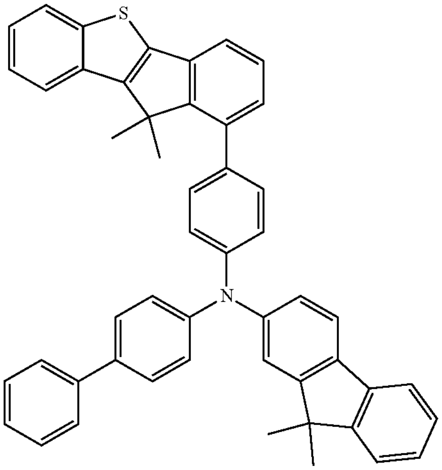
3-124
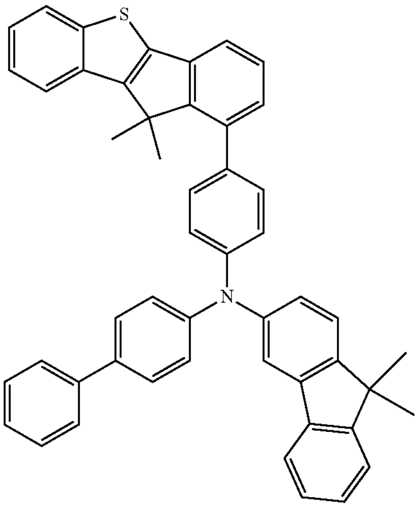

3-125
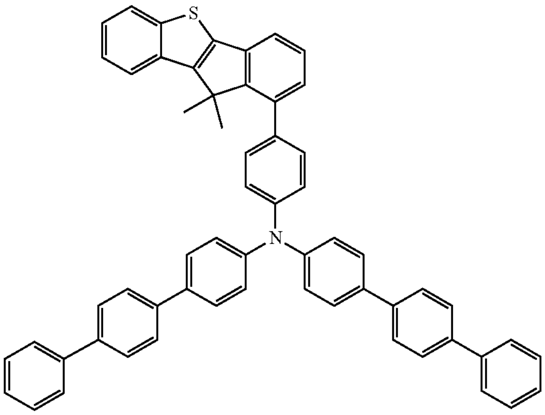
3-126
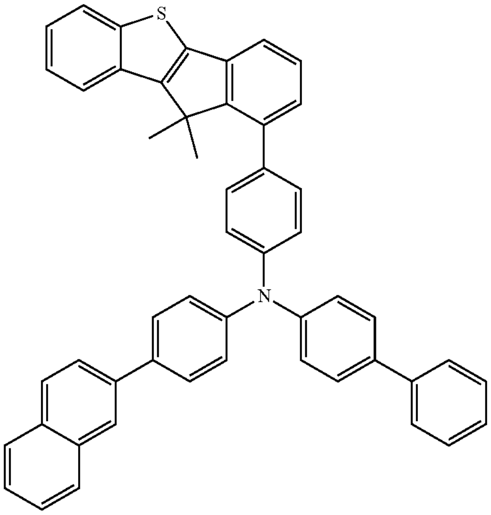
3-127
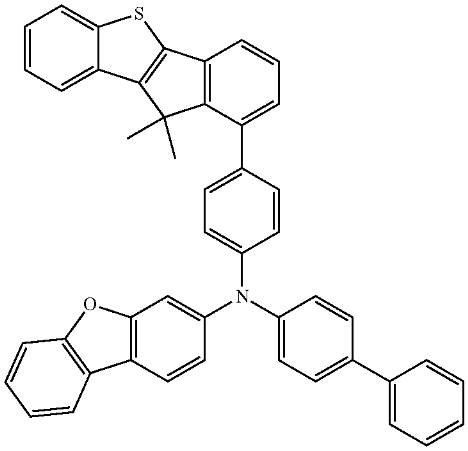
3-128
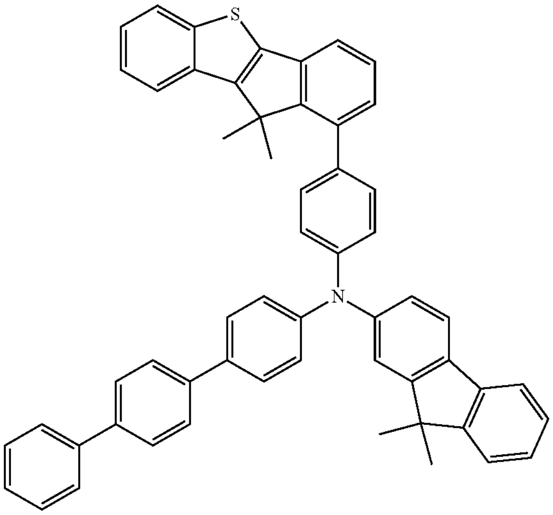
3-129
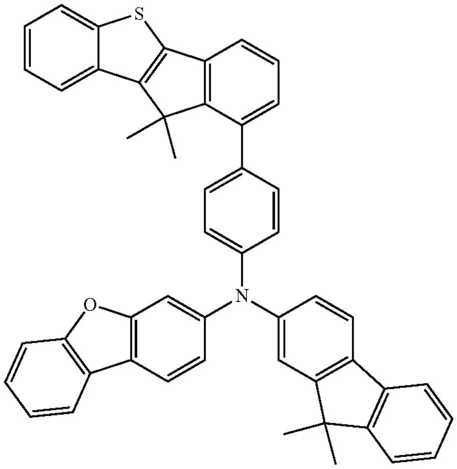
3-130
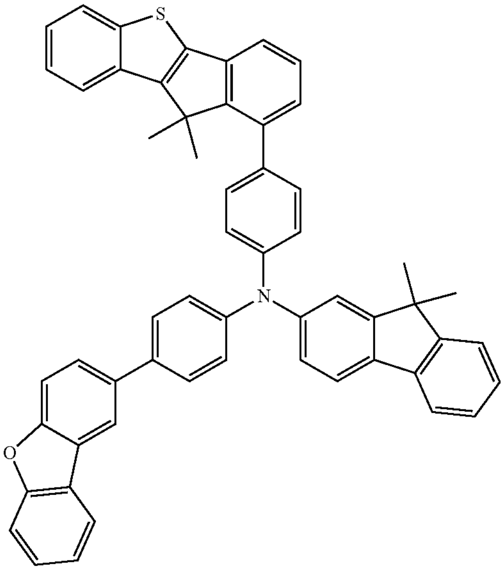

-continued
3-131
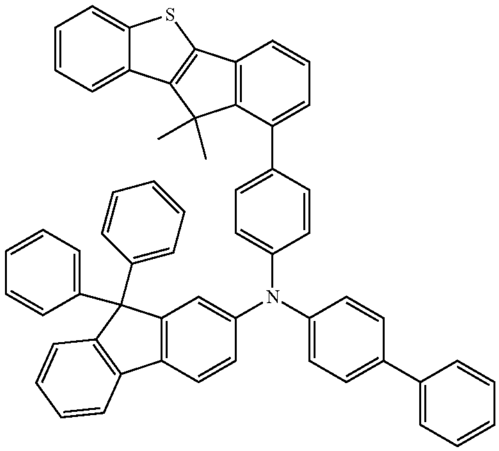
3-132
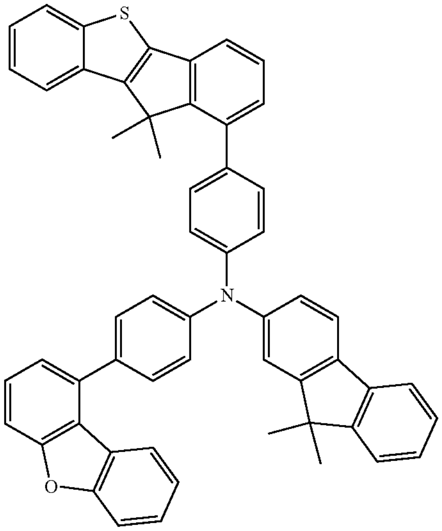
3-133
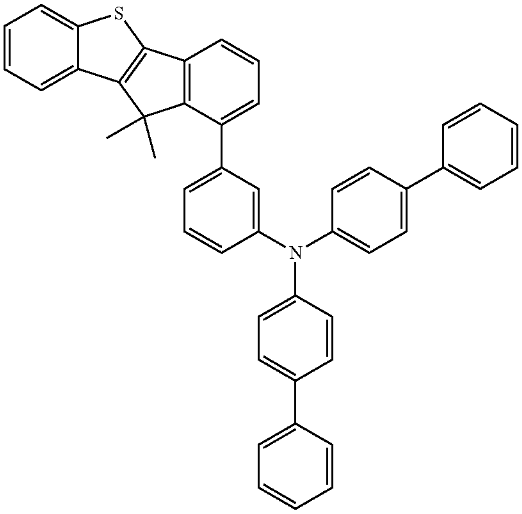
-continued
3-134
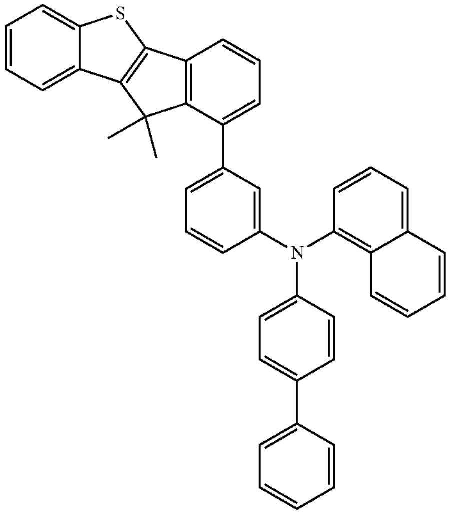
3-135
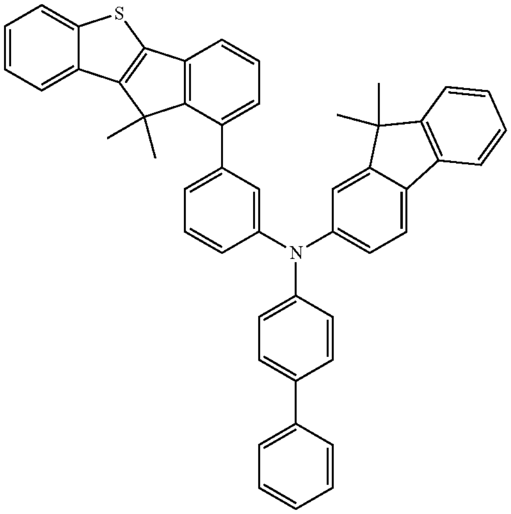
3-136
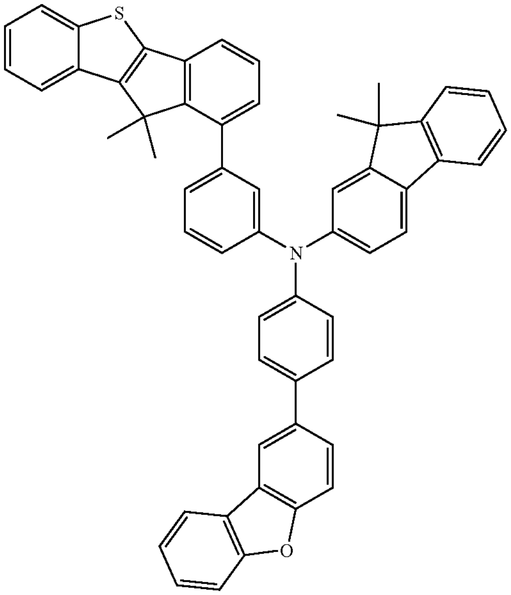

-continued
3-137
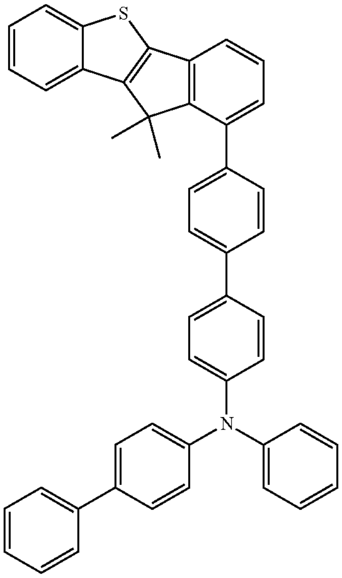
3-138
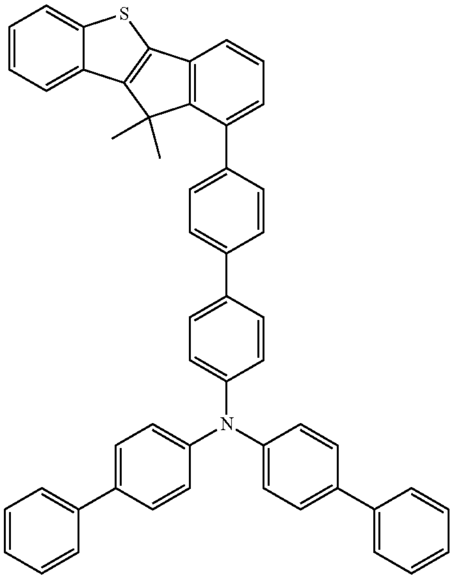
-continued
3-139
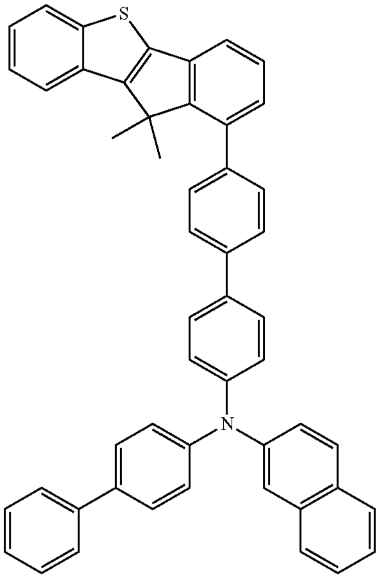
3-140
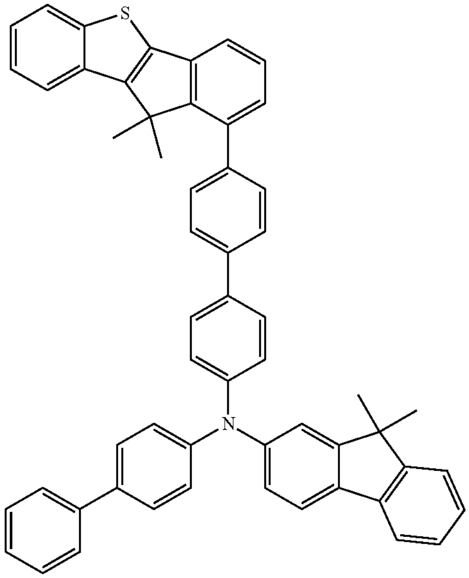

-continued
3-141
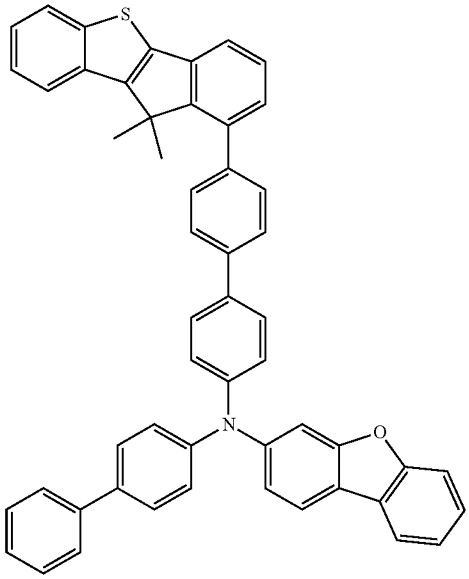
3-142
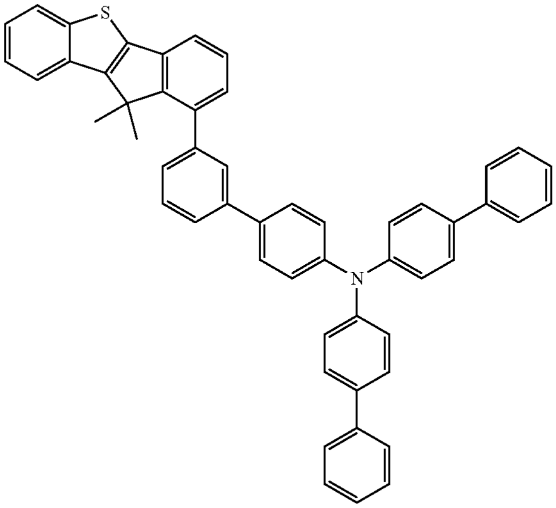
-continued
3-143
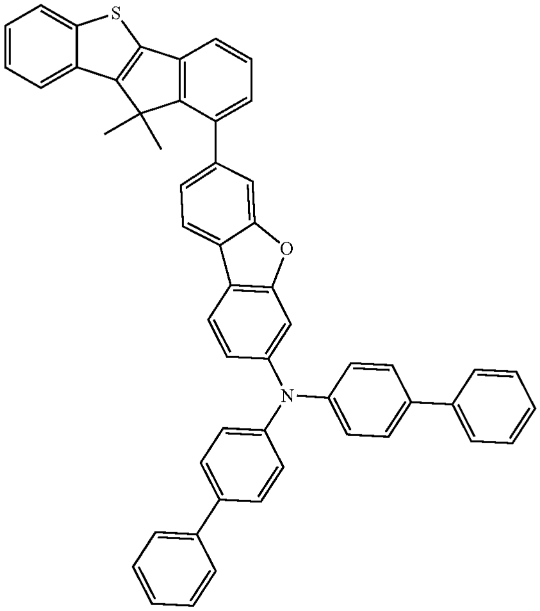
3-144
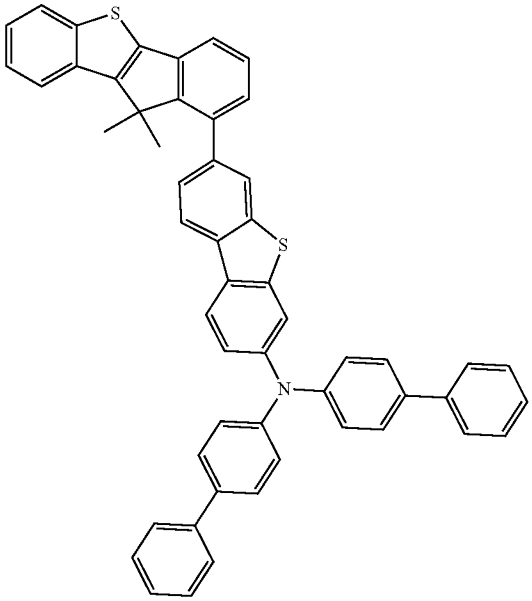

-continued
3-145
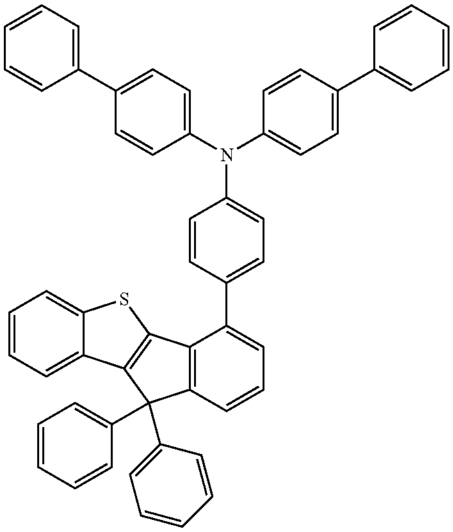
3-146
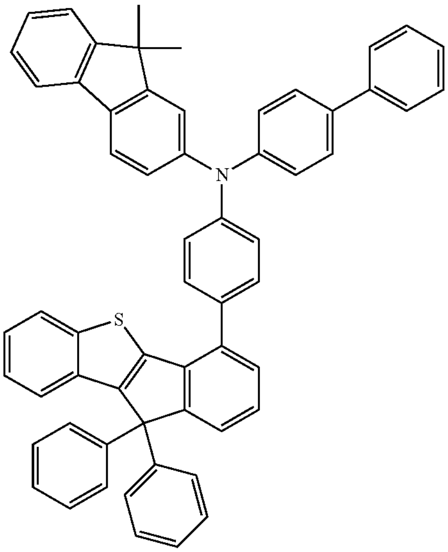
-continued
3-147
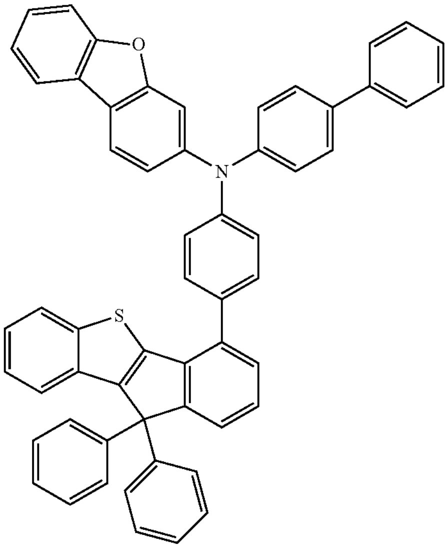
3-148
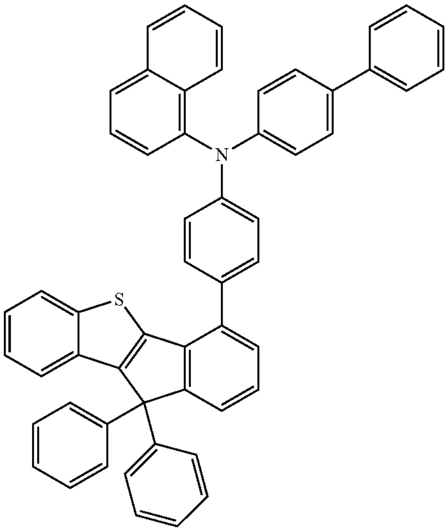
3-149
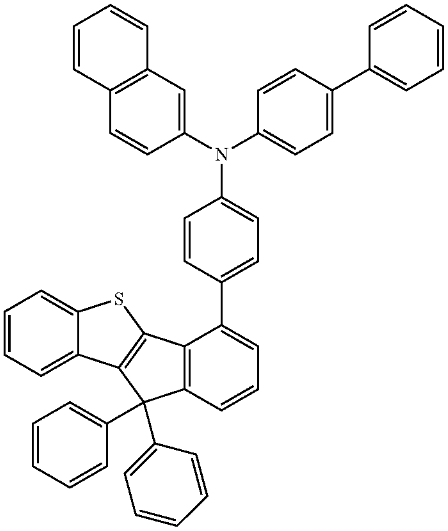

-continued
3-150
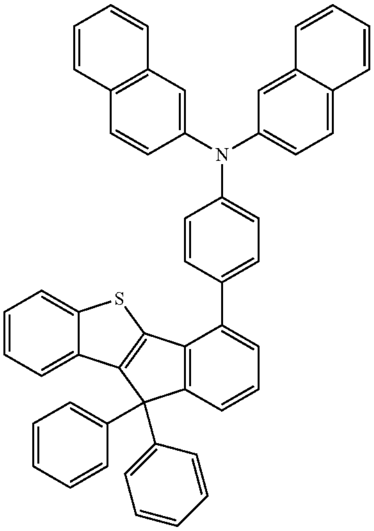
3-151
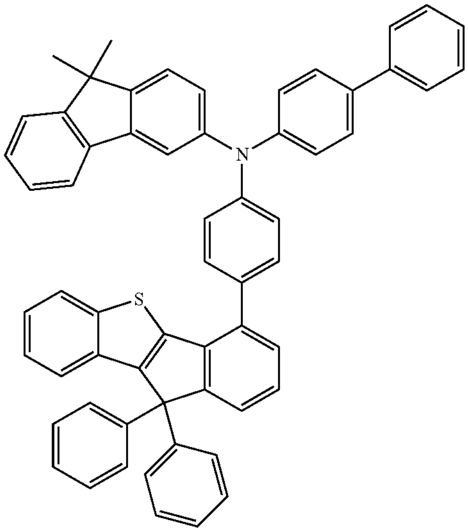
-continued
3-152
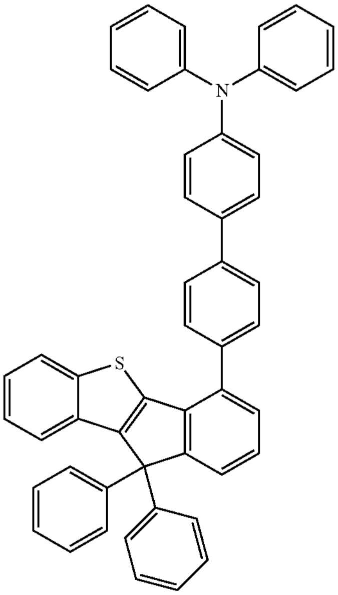
3-153
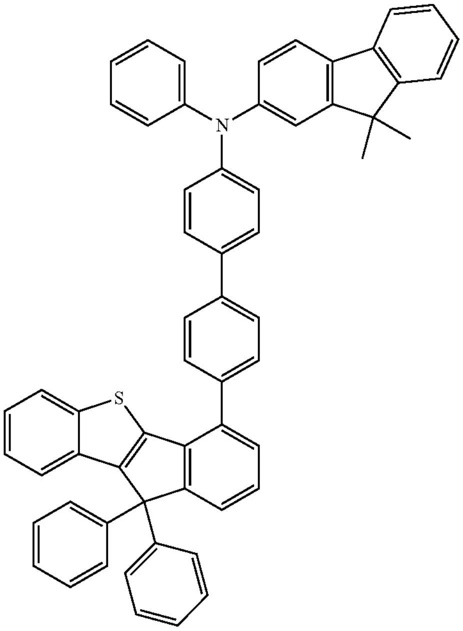

-continued
3-154
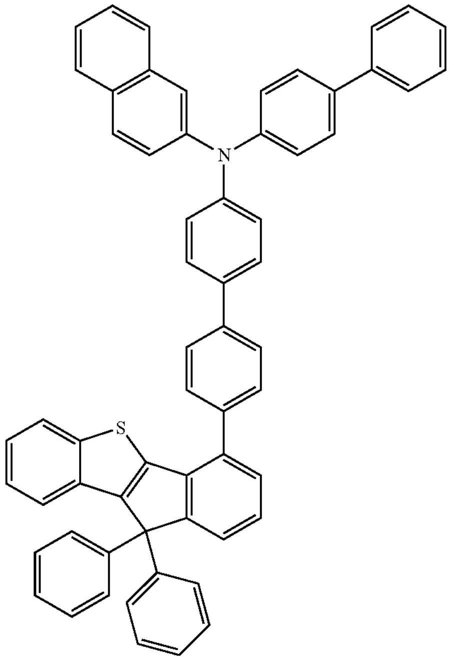
3-155
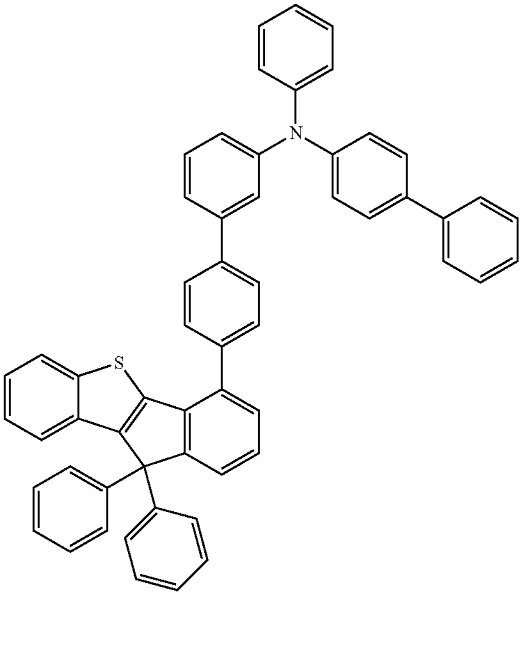
-continued
3-156
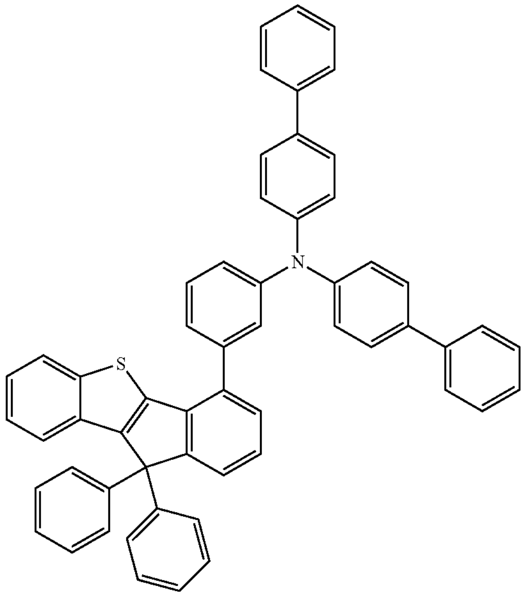
3-157
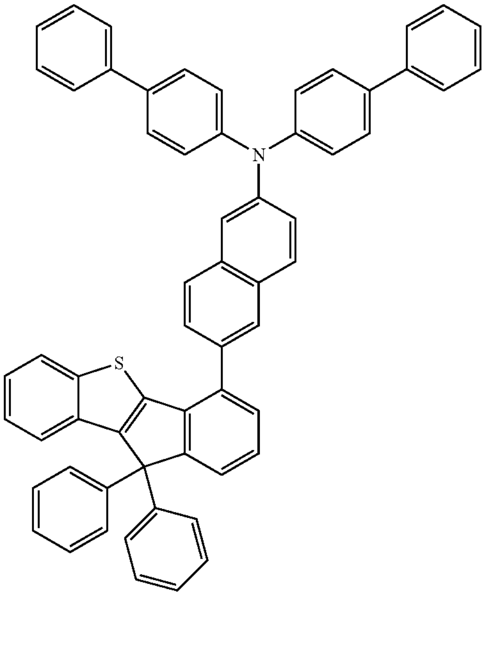

-continued
3-158
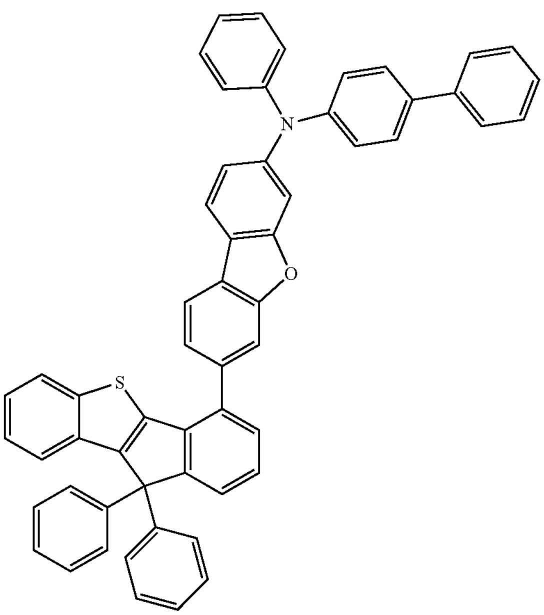
3-159
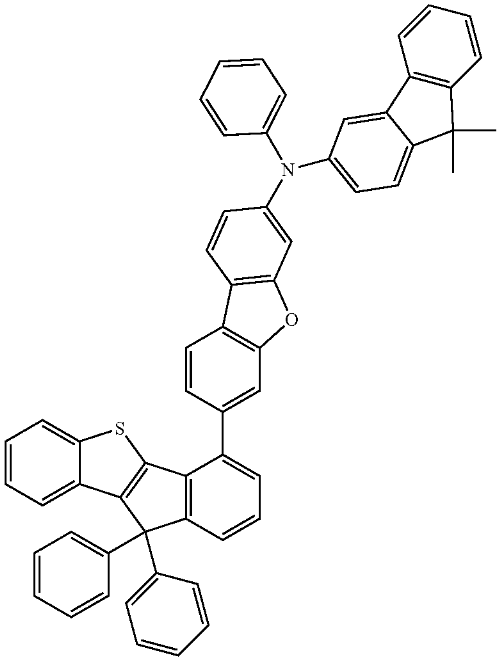
-continued
3-160
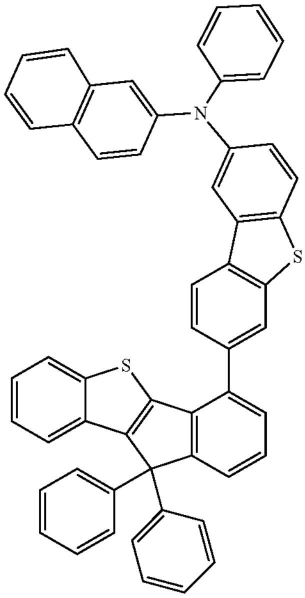
3-161
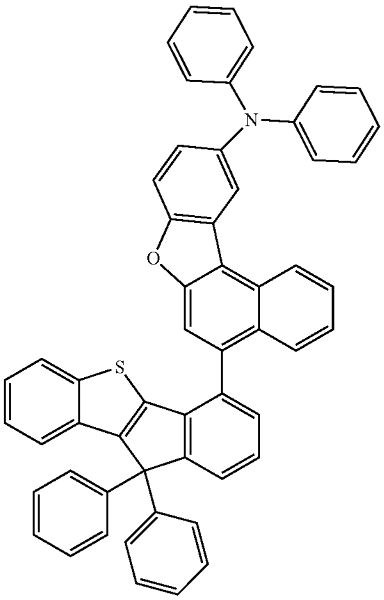
3-162
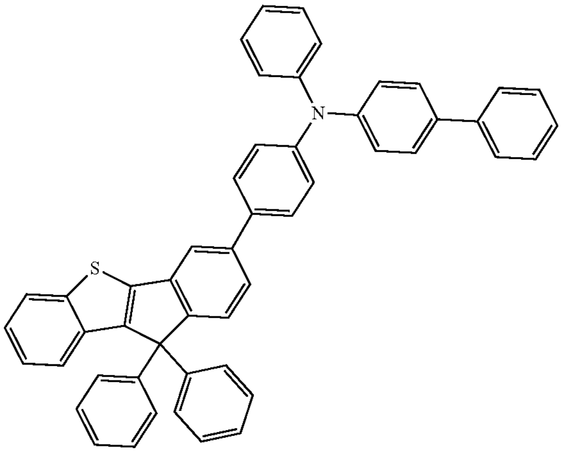

-continued
3-163
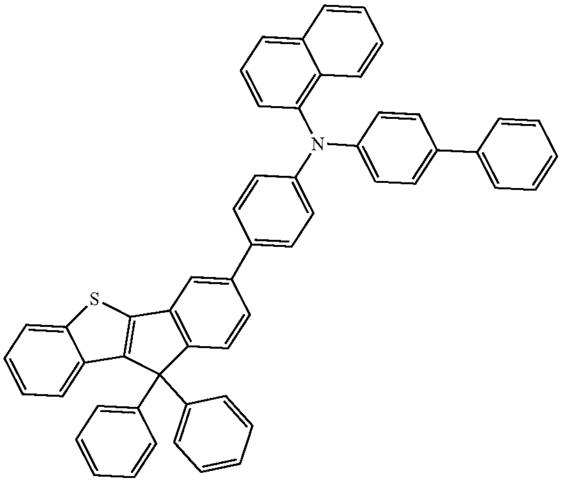
3-164
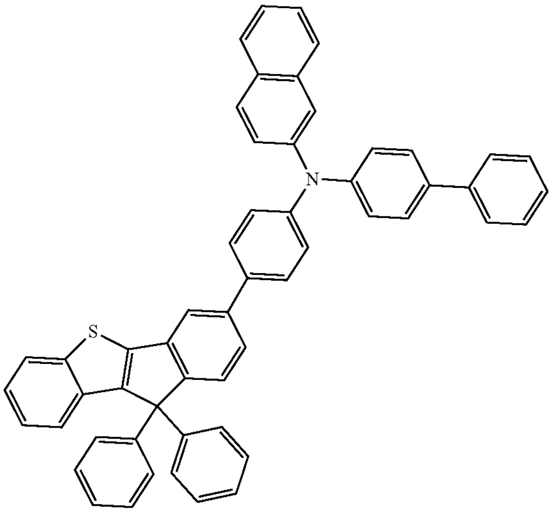
3-165
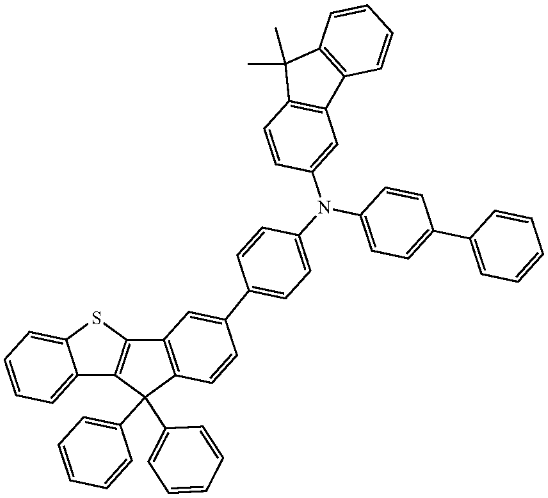
-continued
3-166
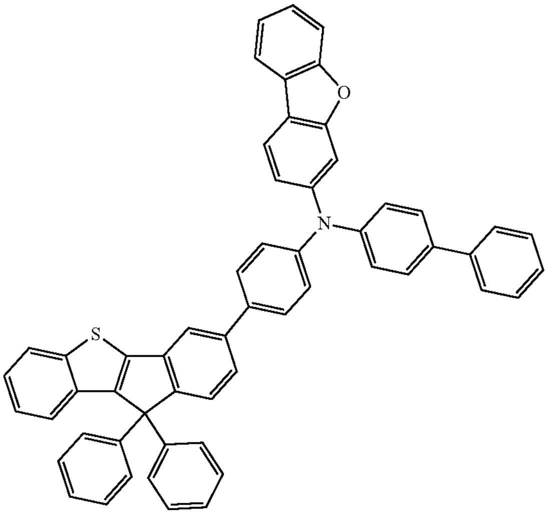
3-167
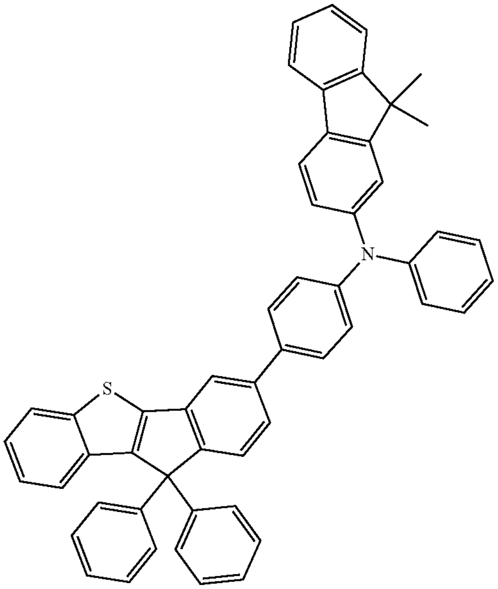

-continued
3-168
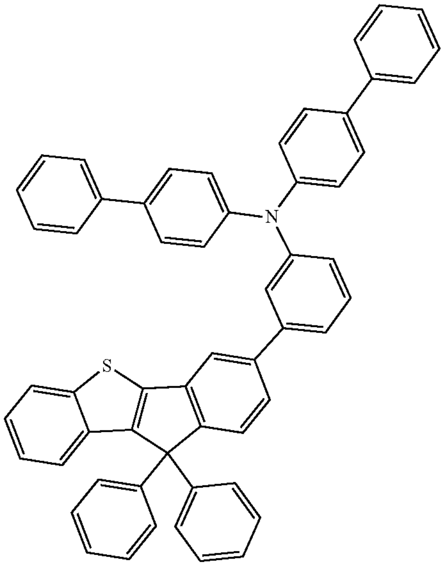
3-169
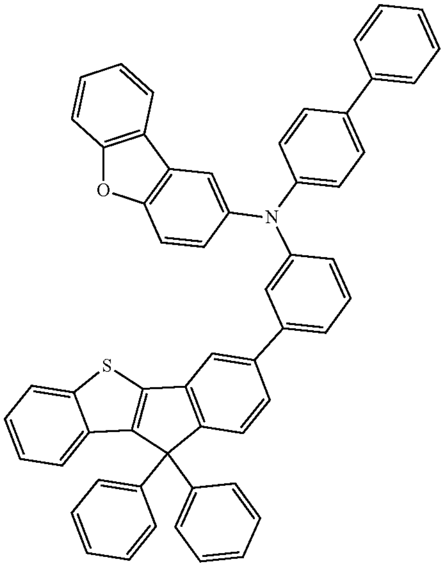
-continued
3-170
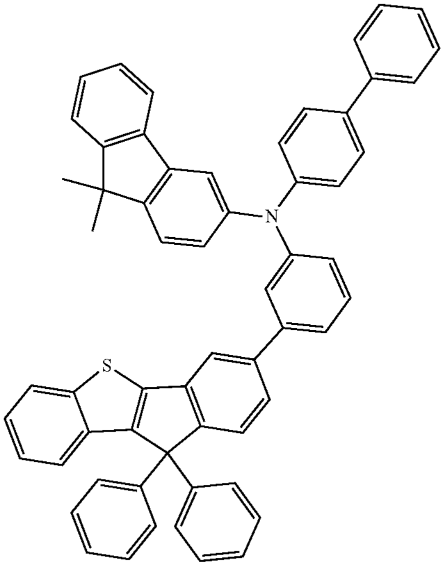
3-171
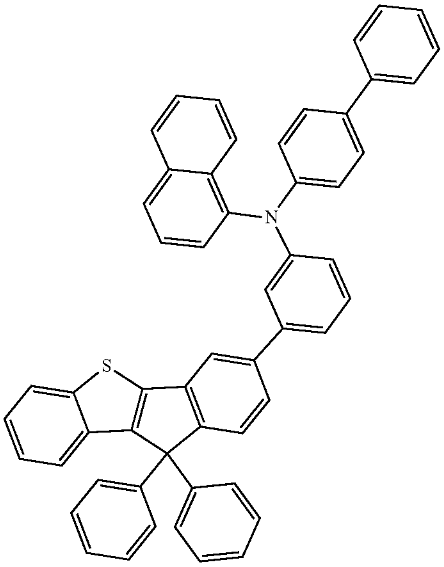
3-172
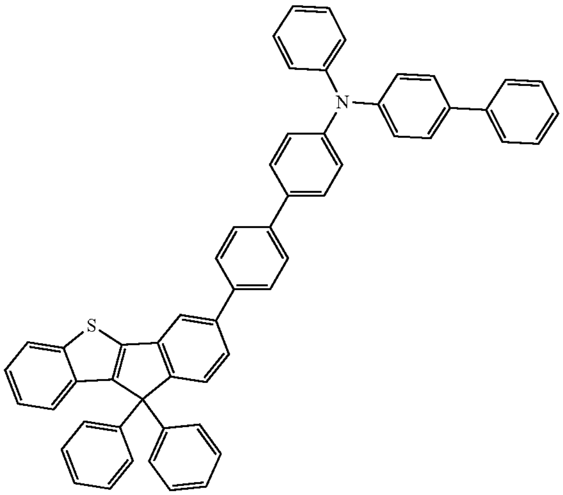

-continued
3-173
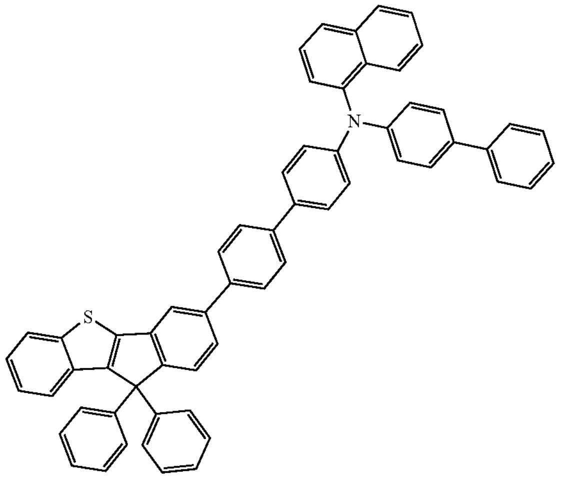
3-174
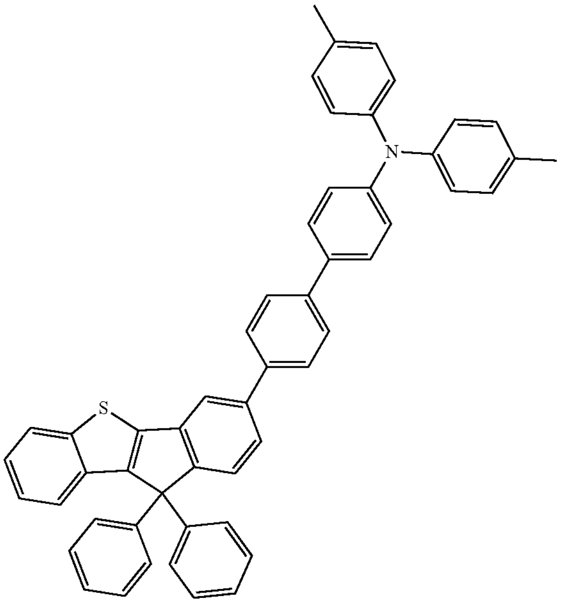
-continued
3-175
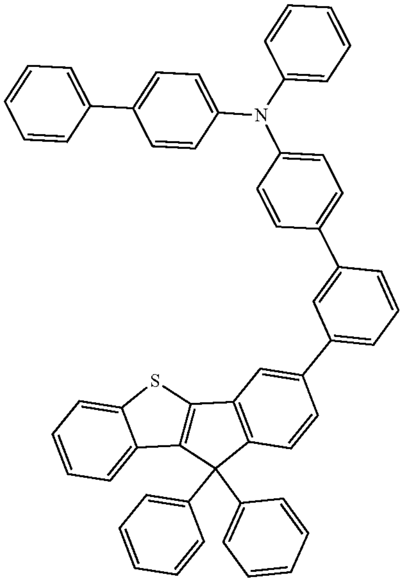
3-176
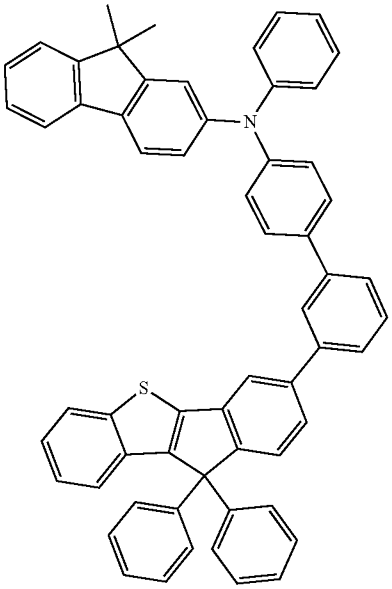
3-177
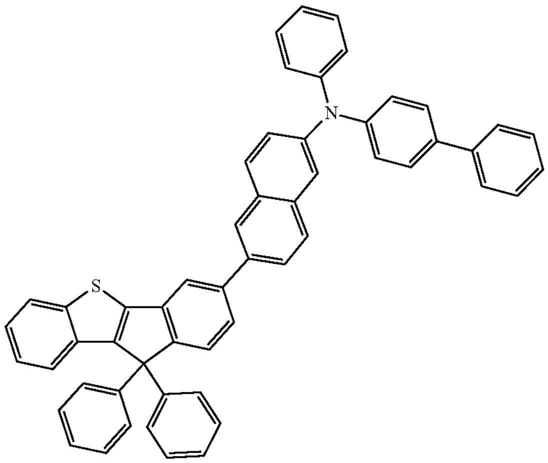

-continued
3-178
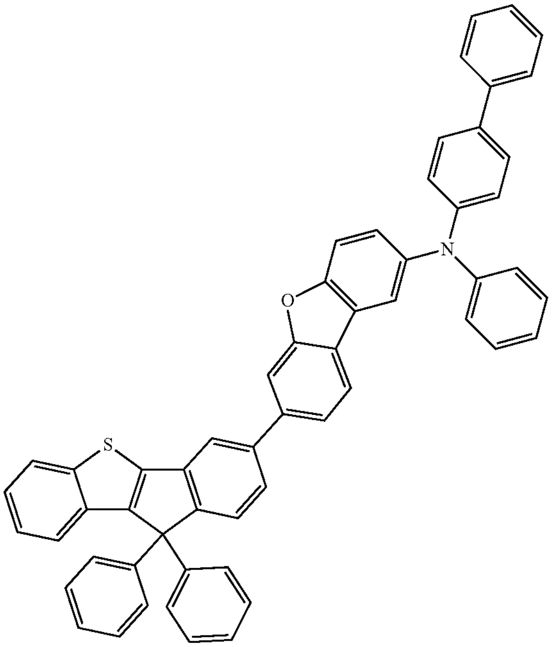
3-179
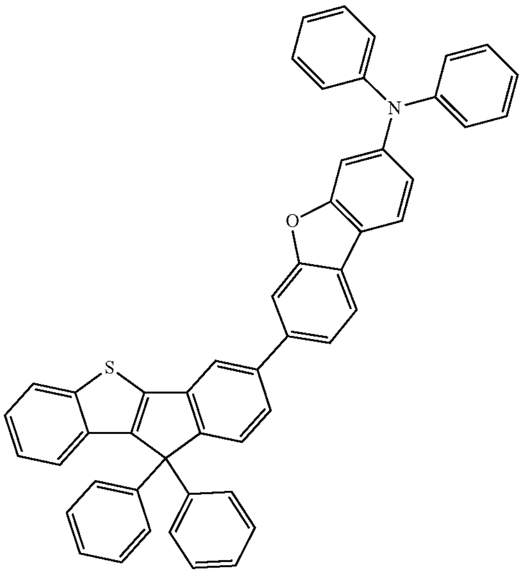
-continued
3-180
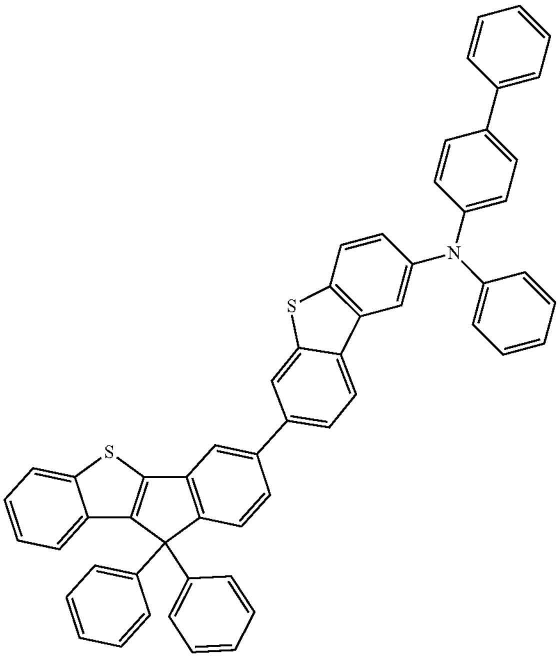
3-181
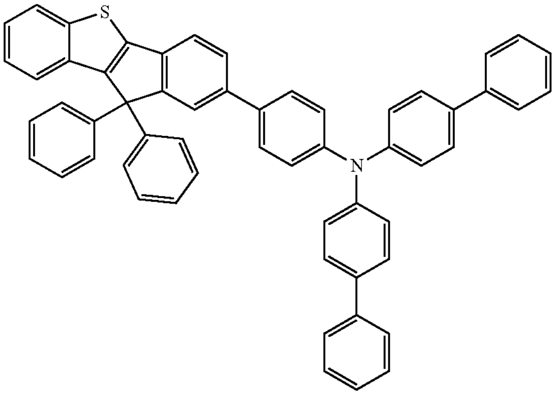
3-182
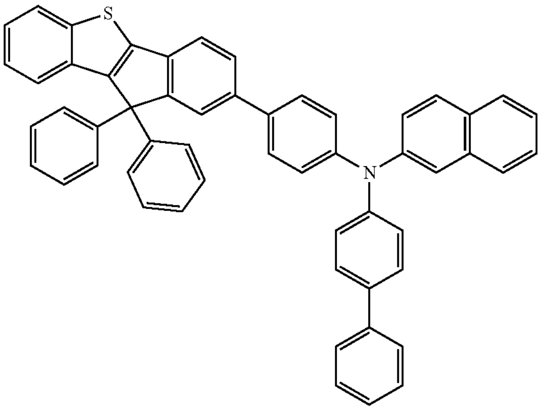

-continued
3-183
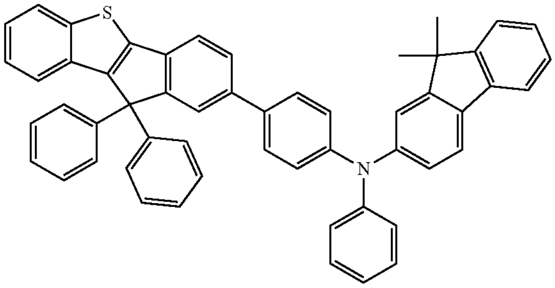
3-184
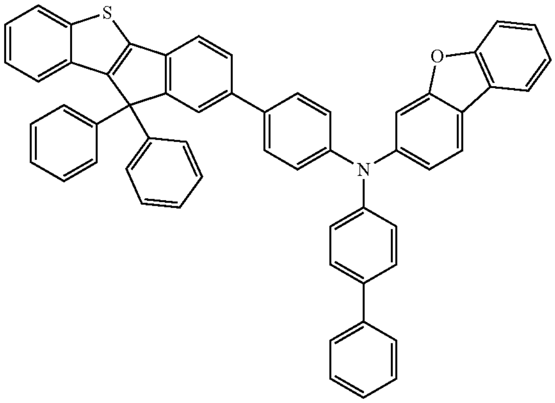
3-185
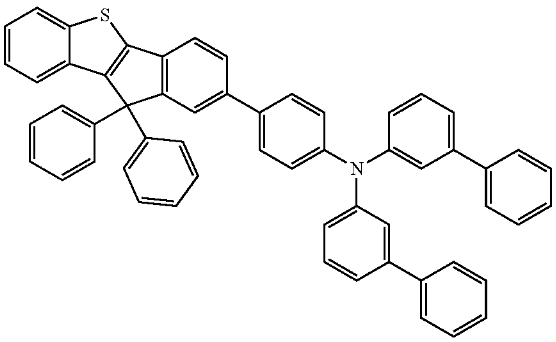
-continued
3-186
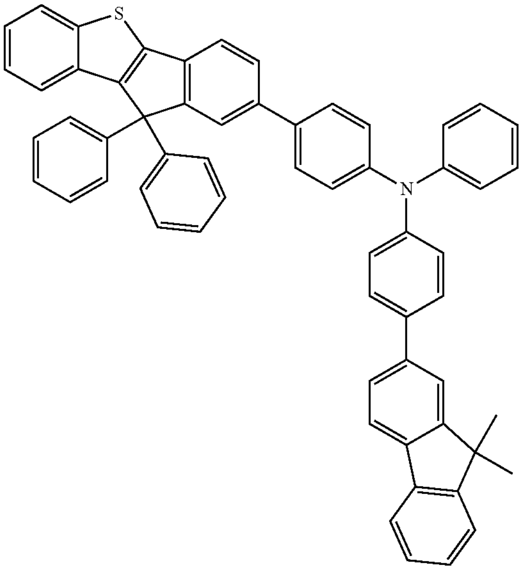
3-187
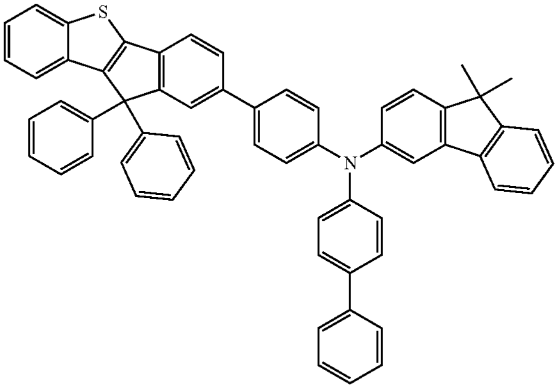
3-188
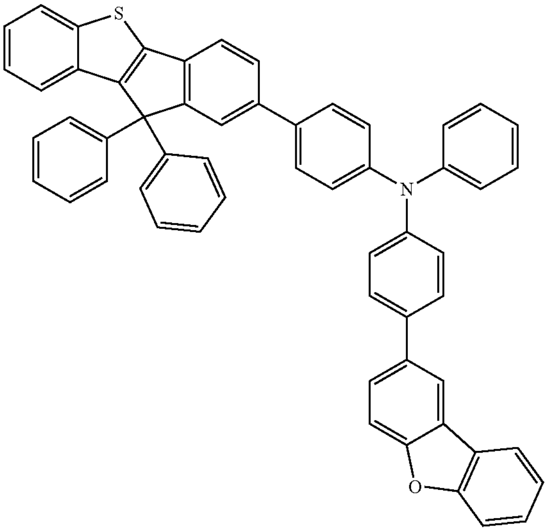

-continued
3-189
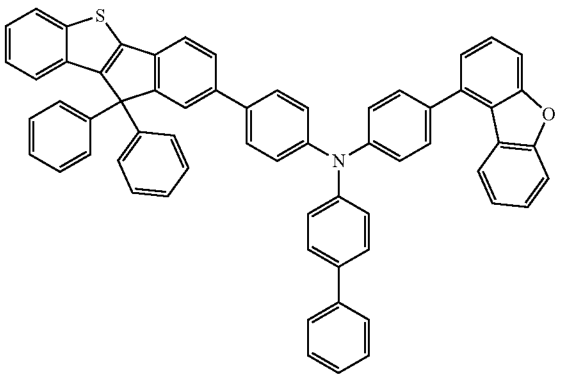
3-190
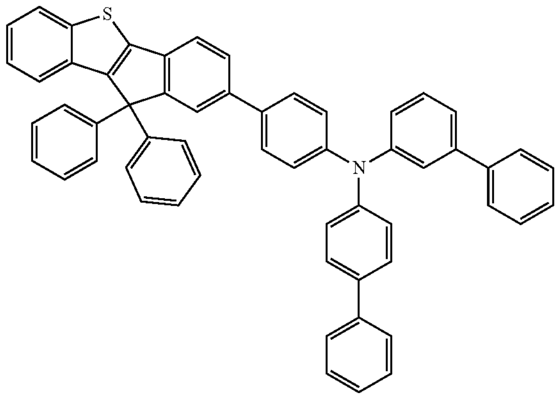
3-191
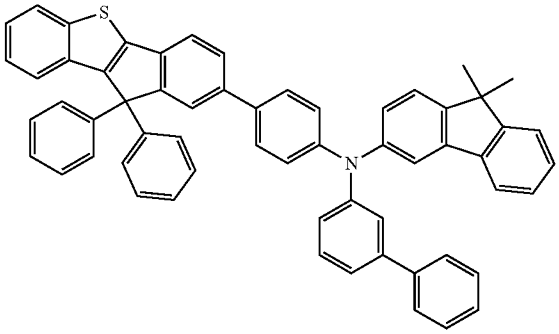
3-192
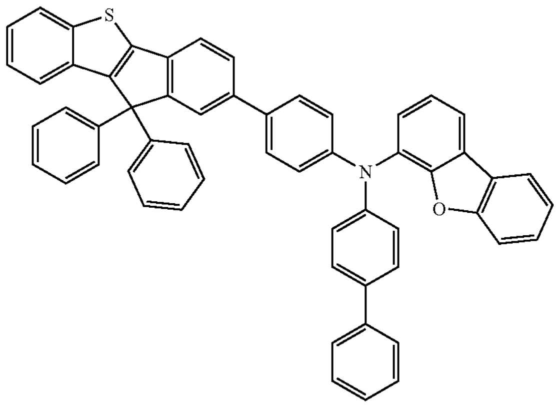
-continued
3-193
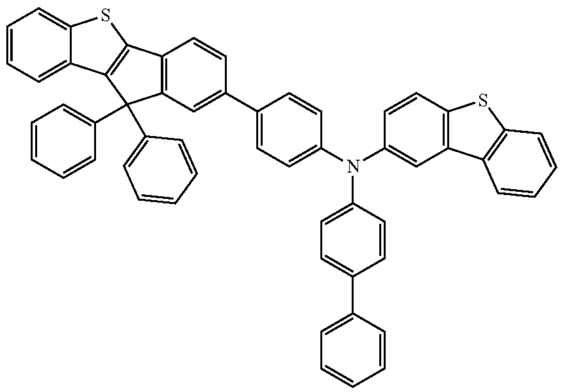
3-194
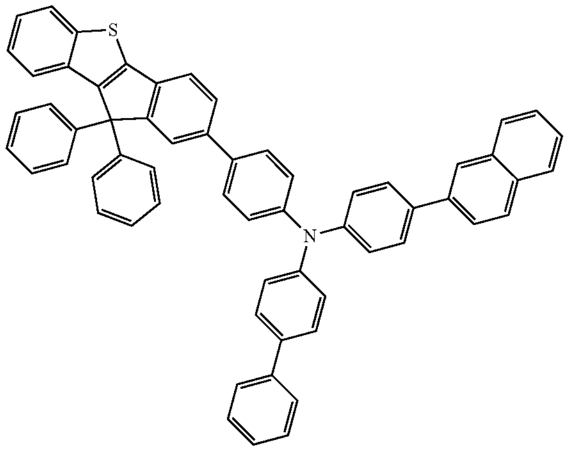
3-195
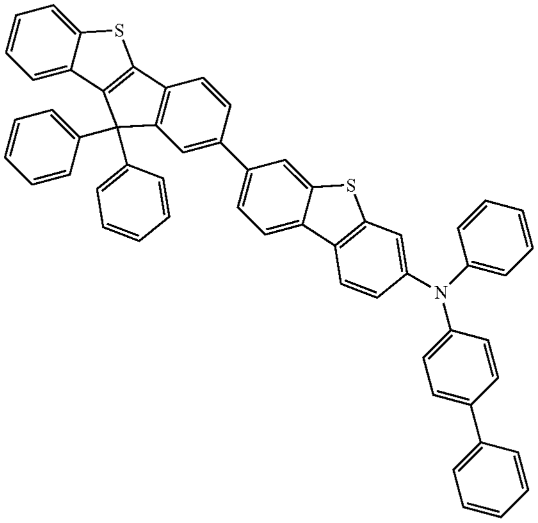

-continued
3-196
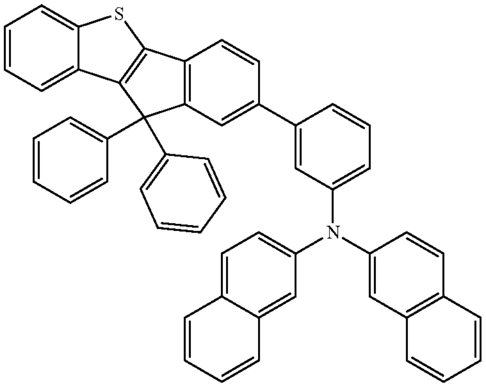
3-197
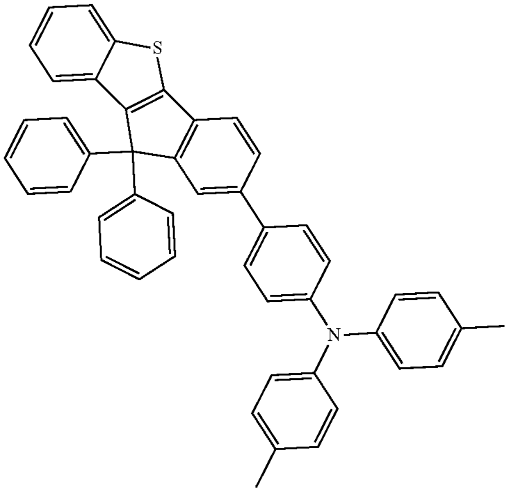
3-198
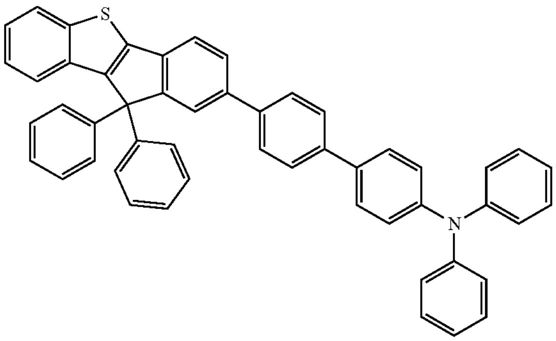
3-199
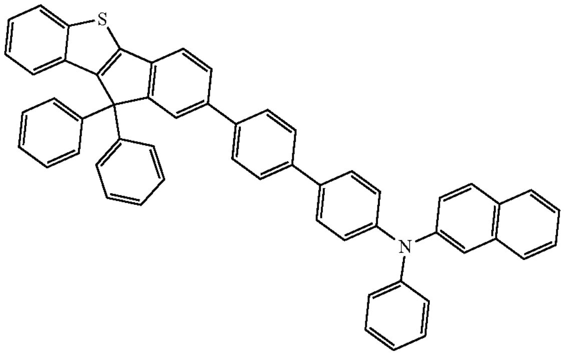
-continued
3-200
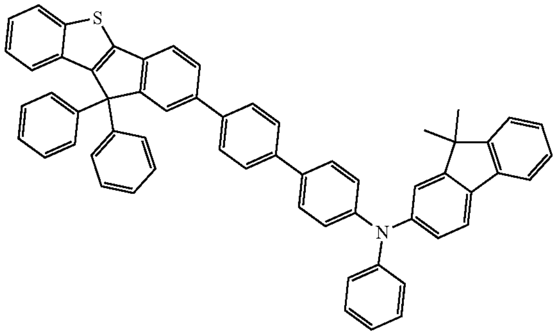
3-201
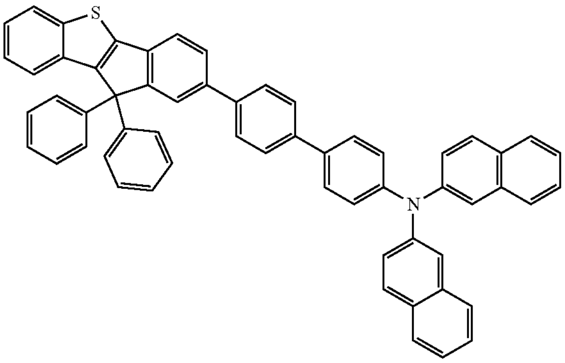
3-202
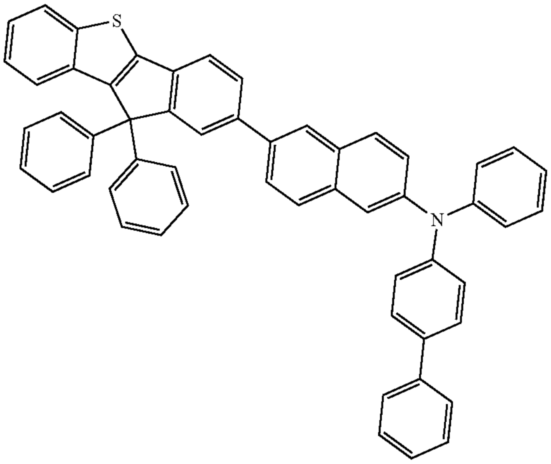
3-203
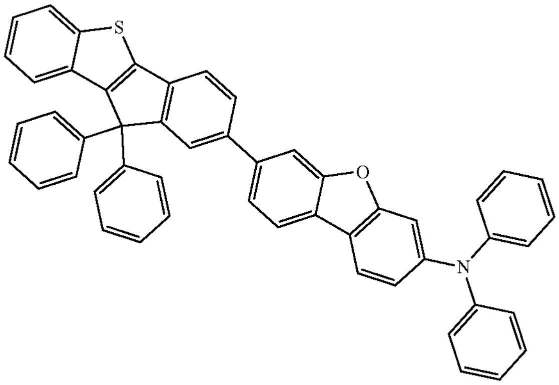

3-204
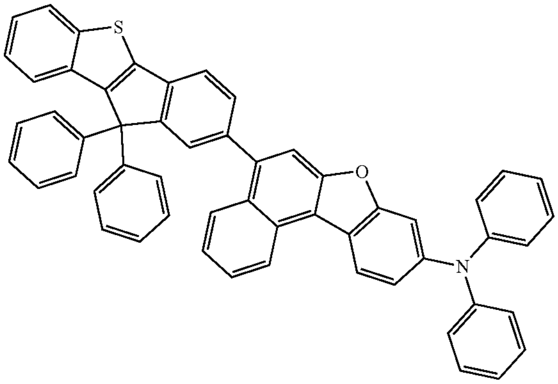
3-205
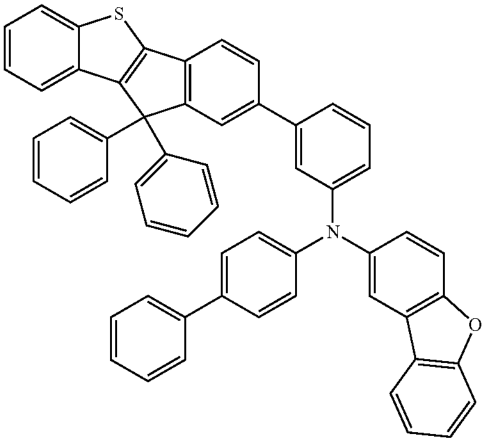
3-206
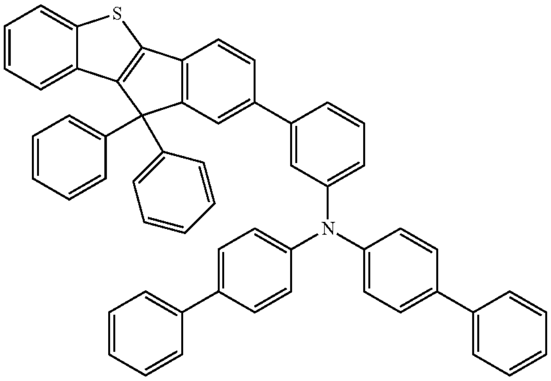
3-207
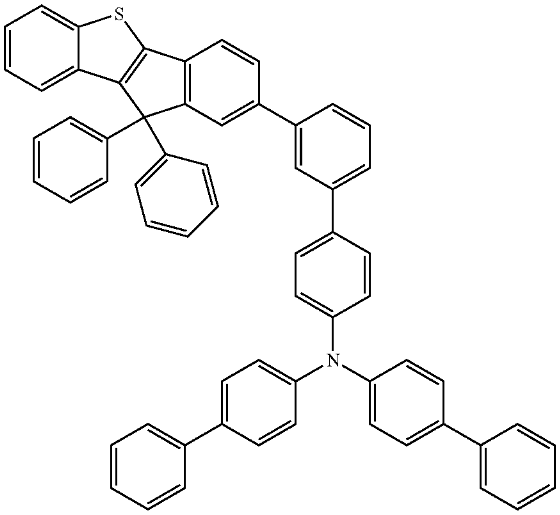
3-208
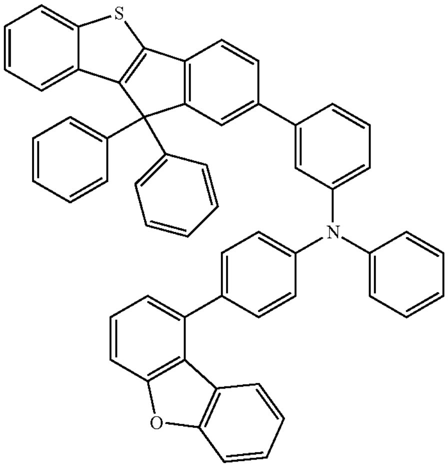
3-209
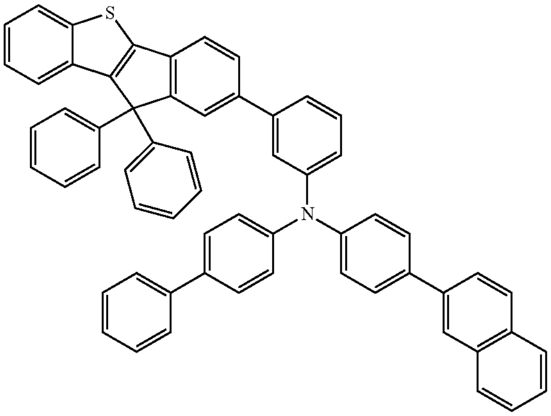

-continued
3-210
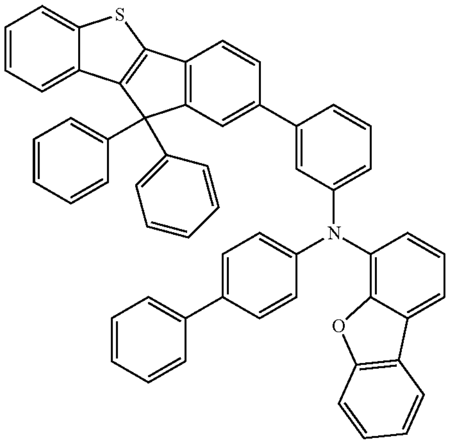
3-211
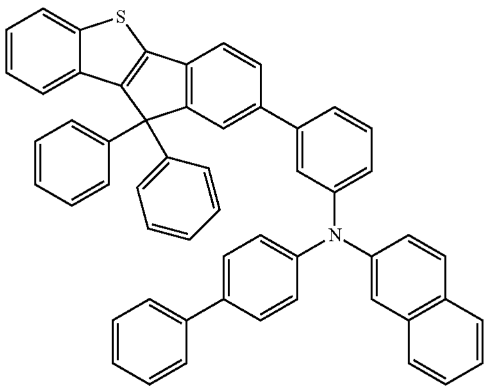
3-212
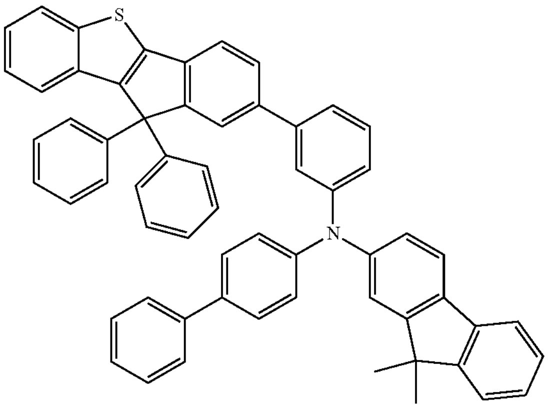
-continued
3-213
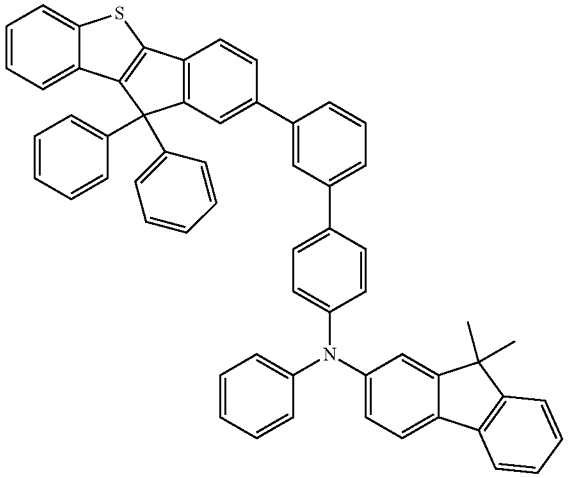
3-214
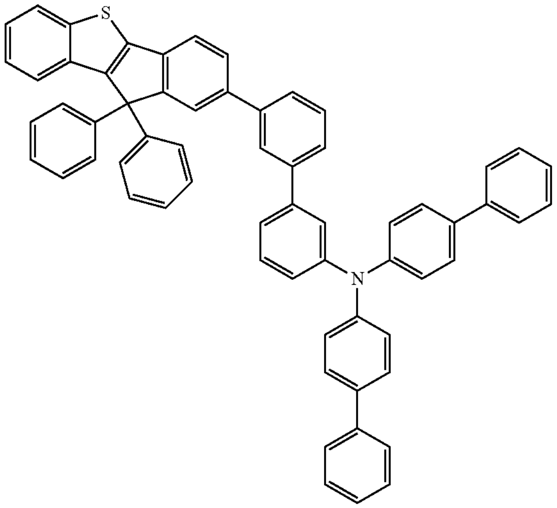
3-215
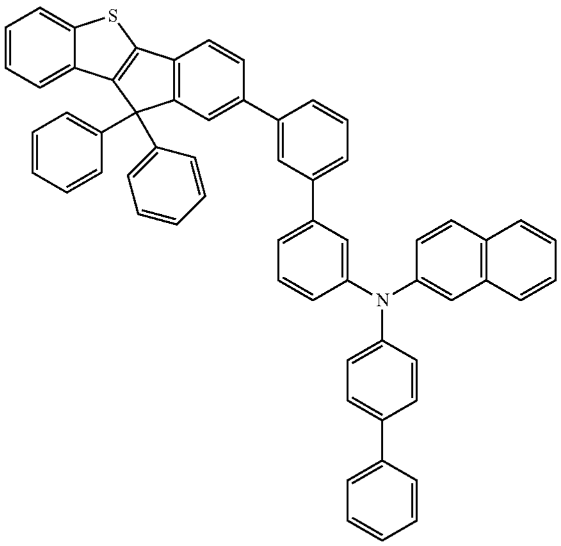

-continued
3-216
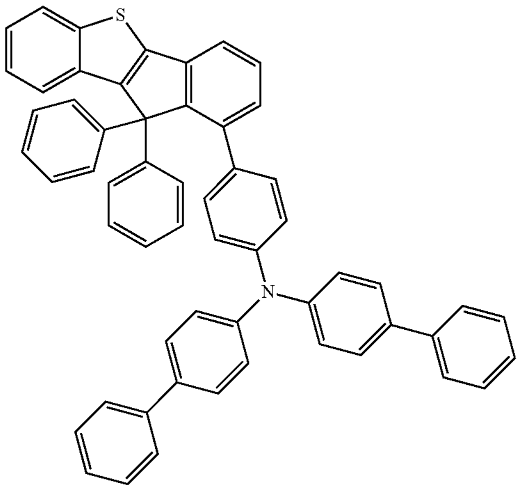
3-217
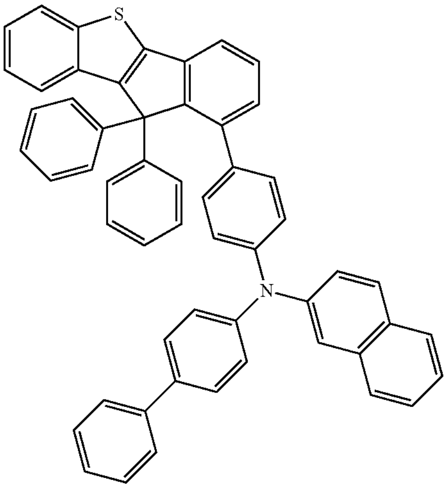
3-218
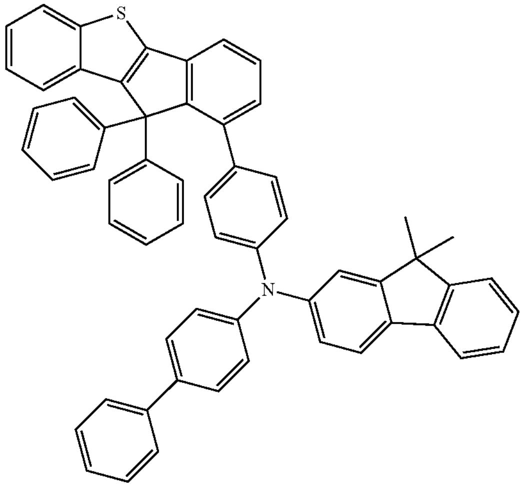
-continued
3-219
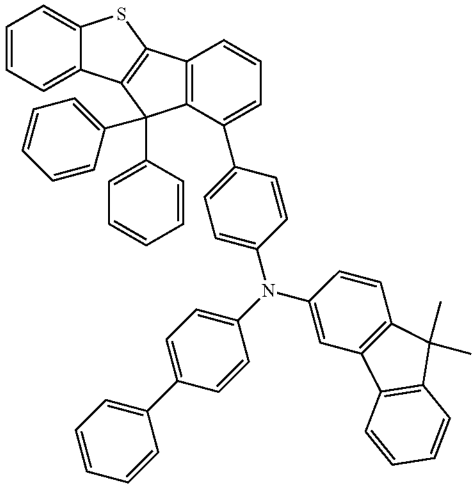
3-220
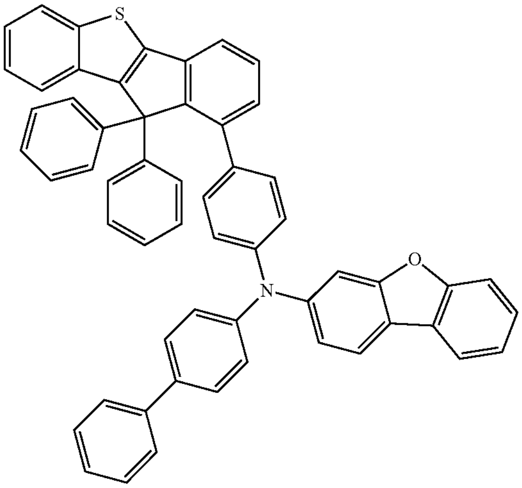
3-221
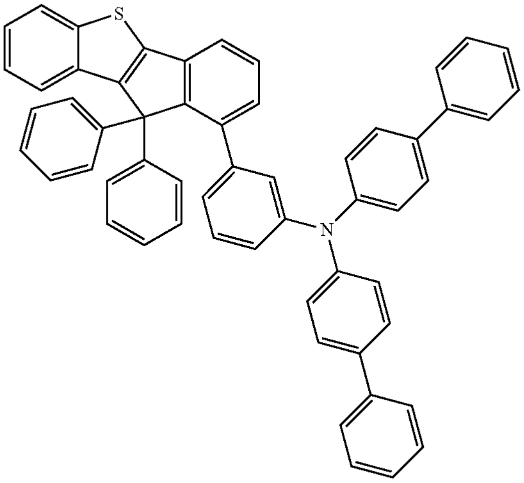

-continued
3-222
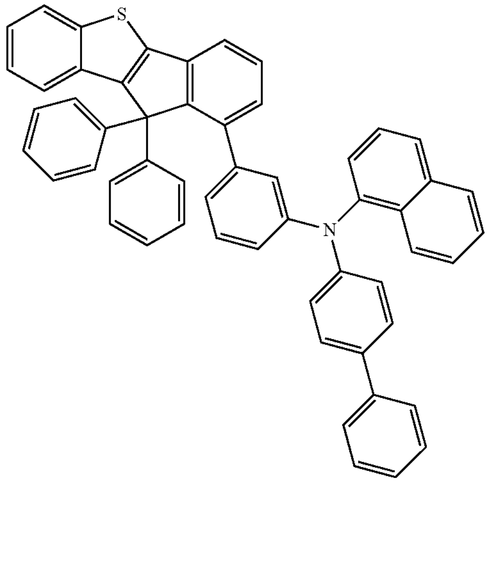
3-223
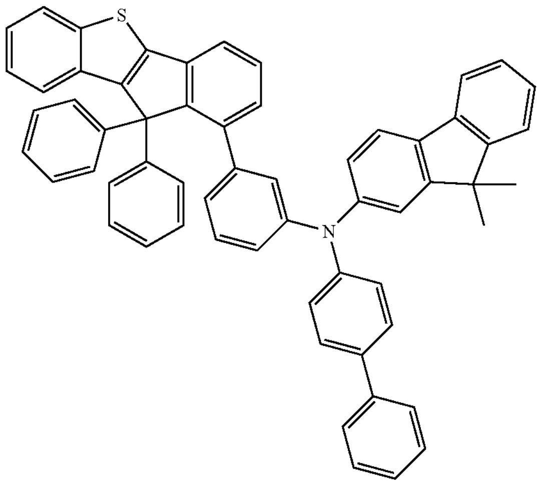
3-224
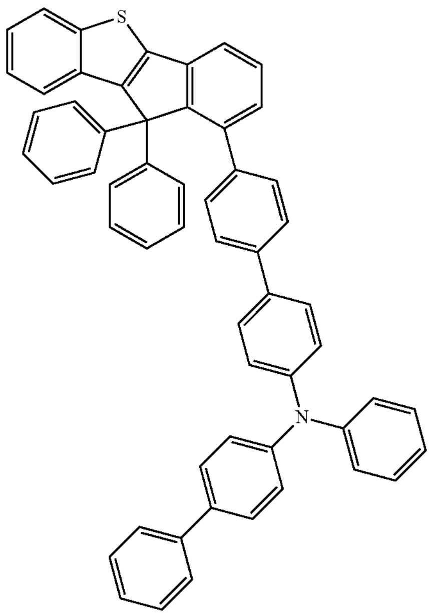
-continued
3-225
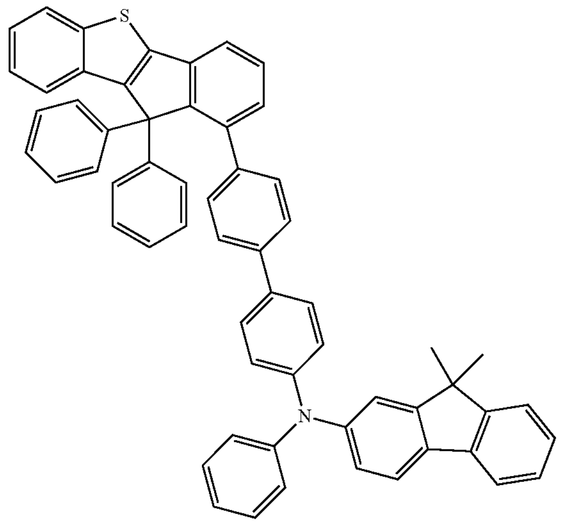
3-226
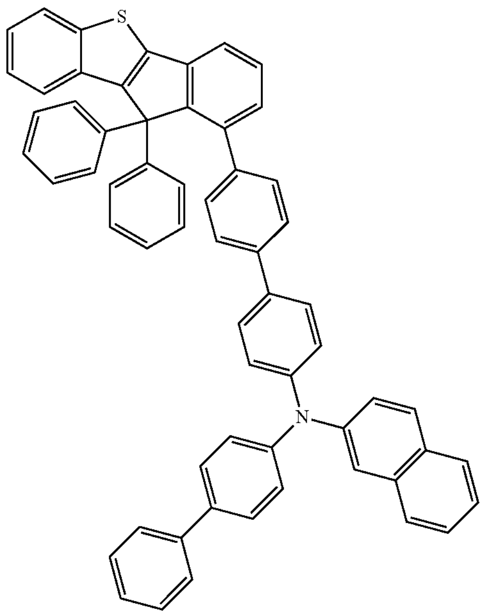

-continued
3-227
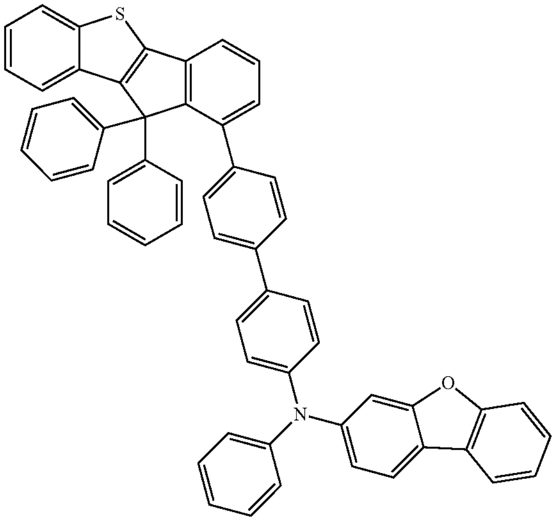
3-228
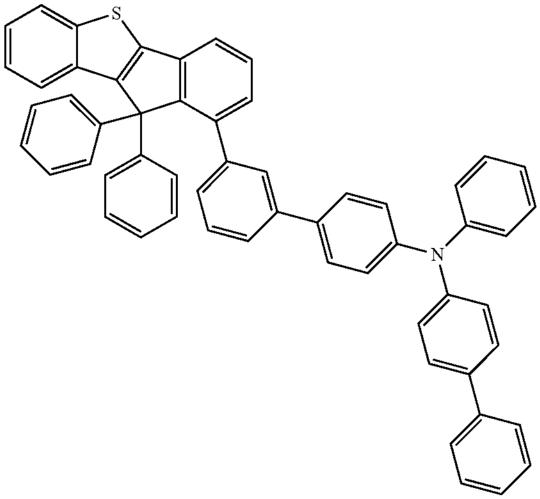
3-229
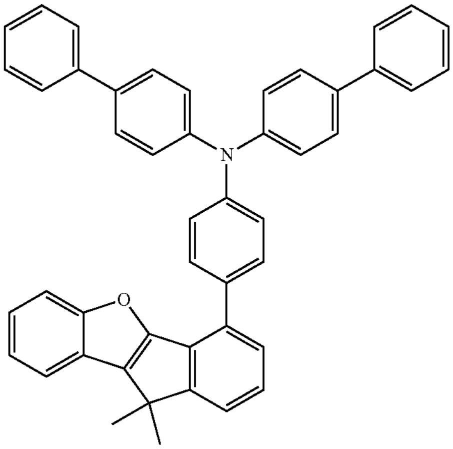
-continued
3-230
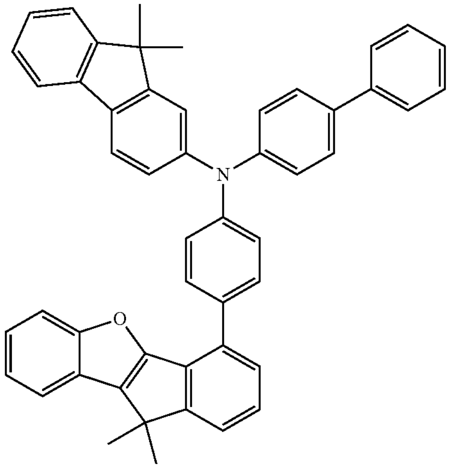
3-231
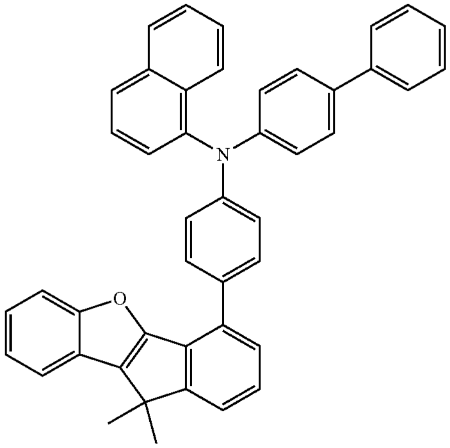
3-232
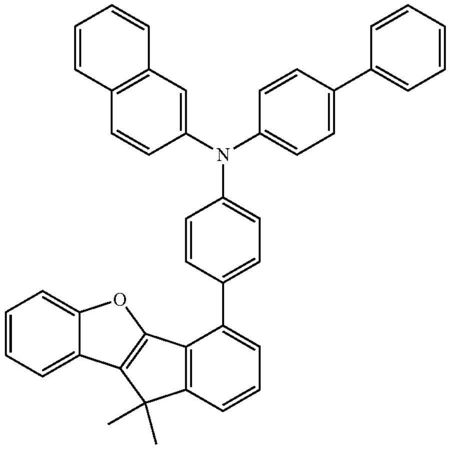

-continued
3-233
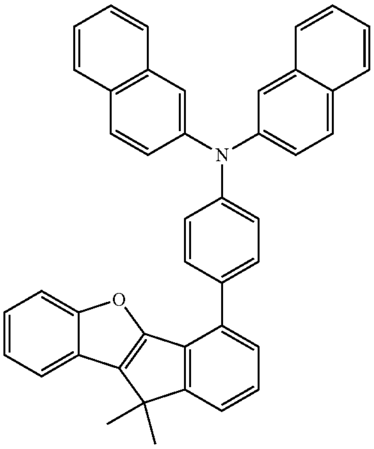
3-234
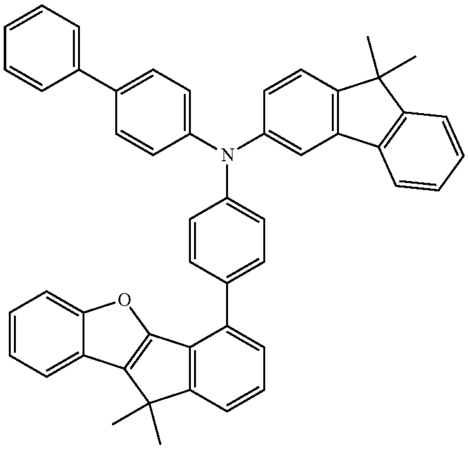
3-235
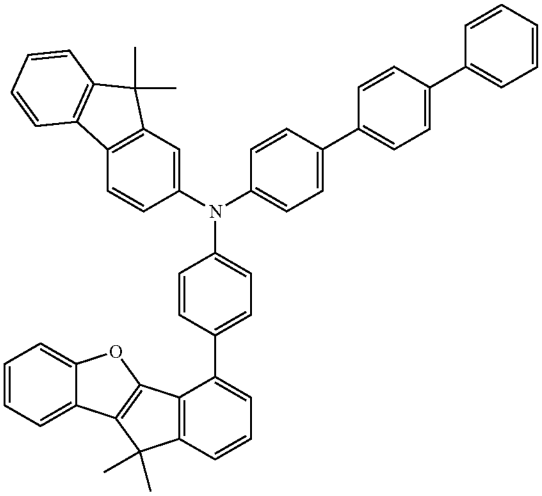
-continued
3-236
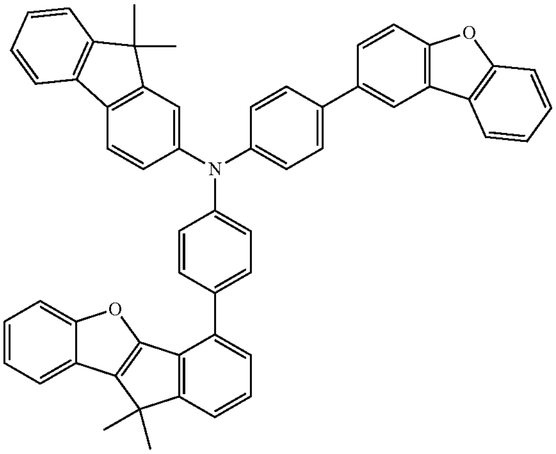
3-237
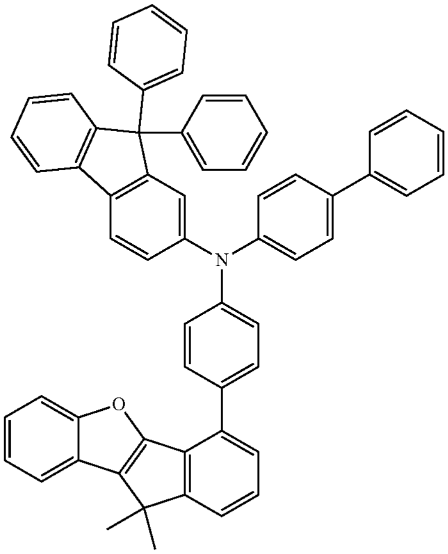
3-238
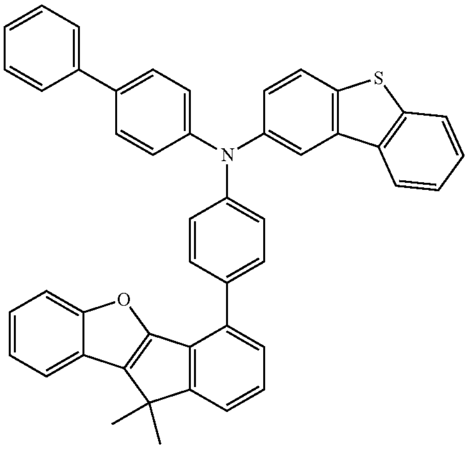

3-239
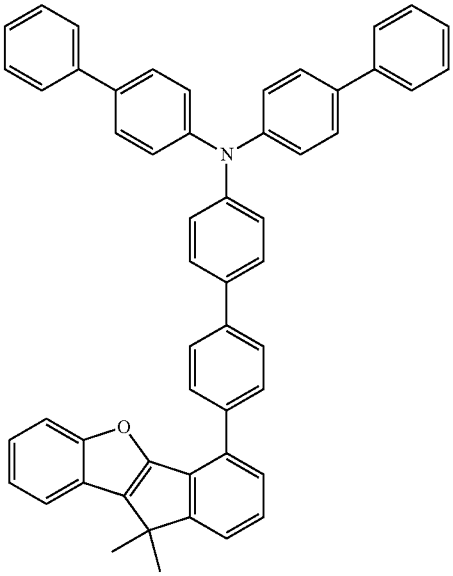
3-240
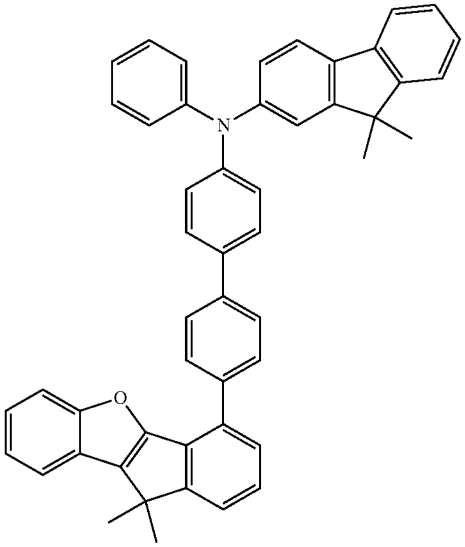
3-241
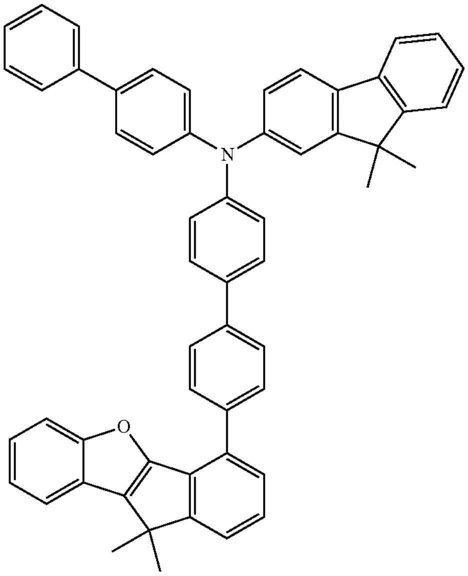
3-242
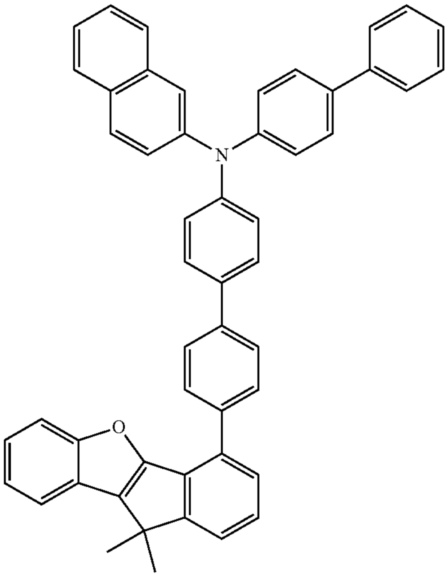

-continued
3-243
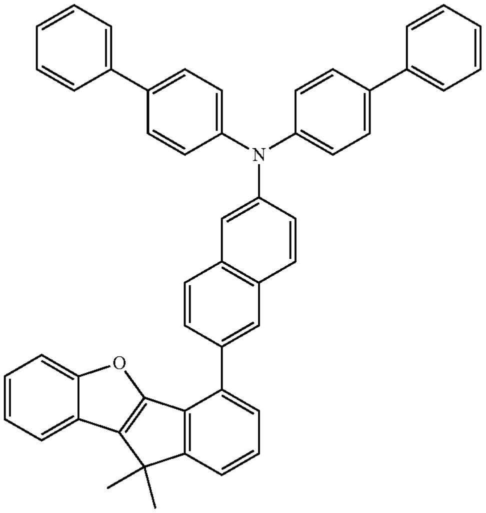
3-244
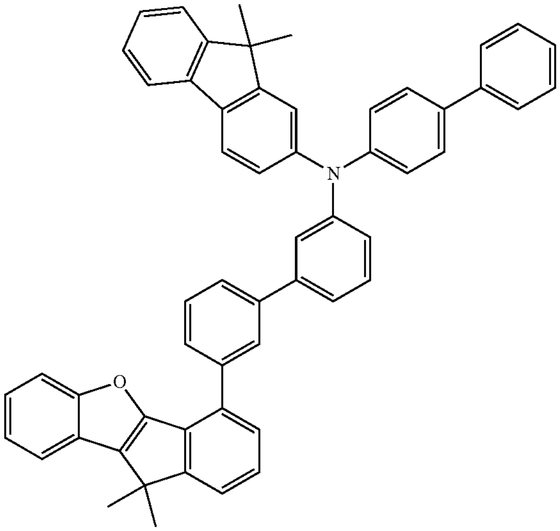
3-245
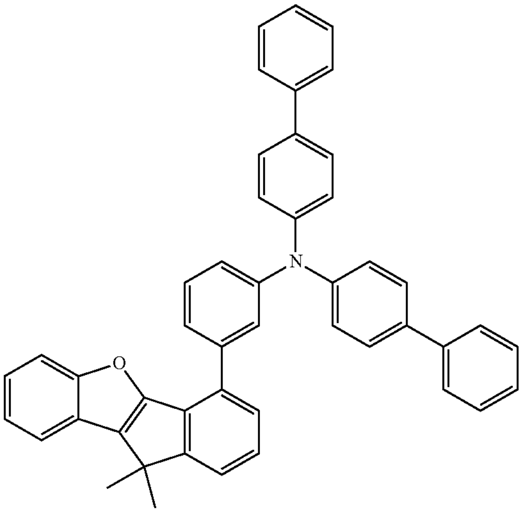
-continued
3-246
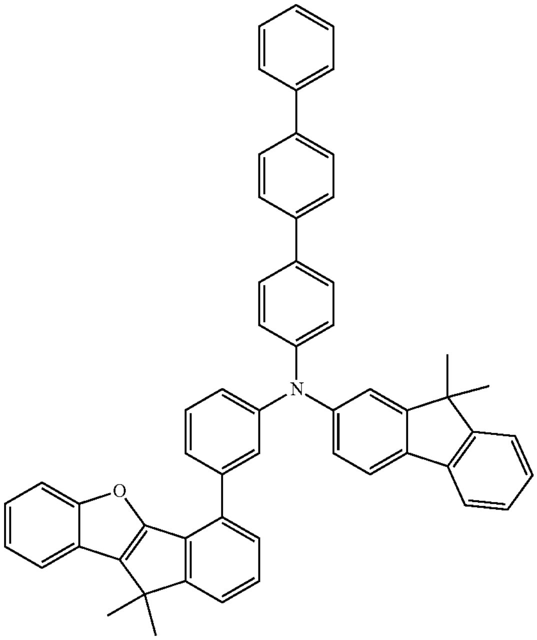
3-247
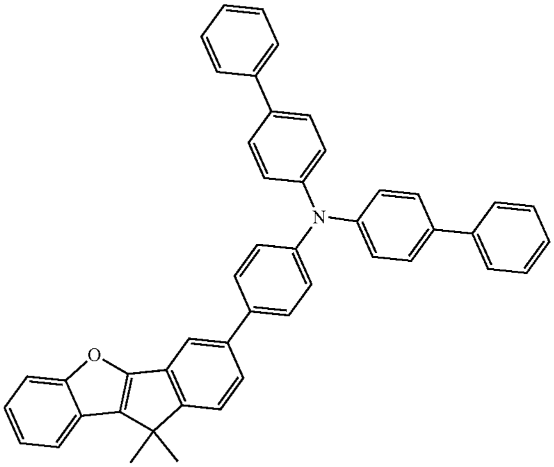
3-248
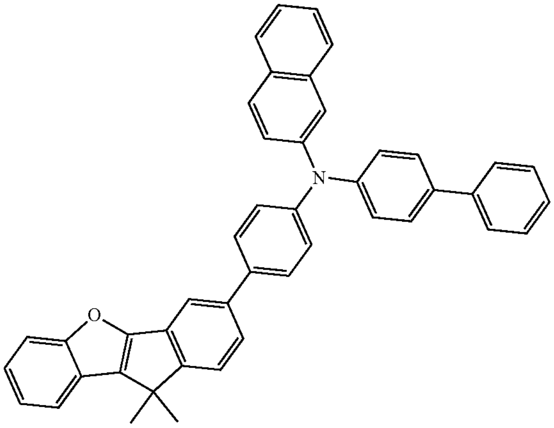

-continued
3-249
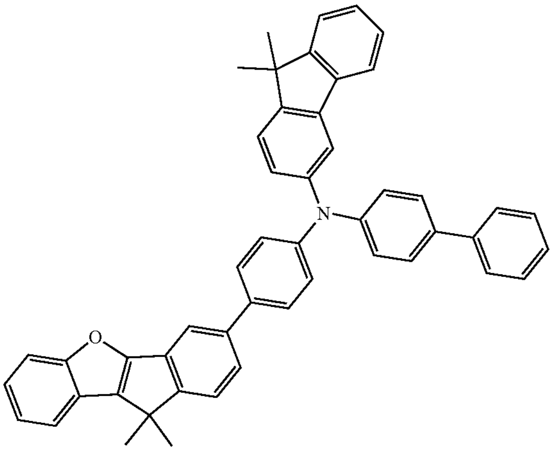
3-250
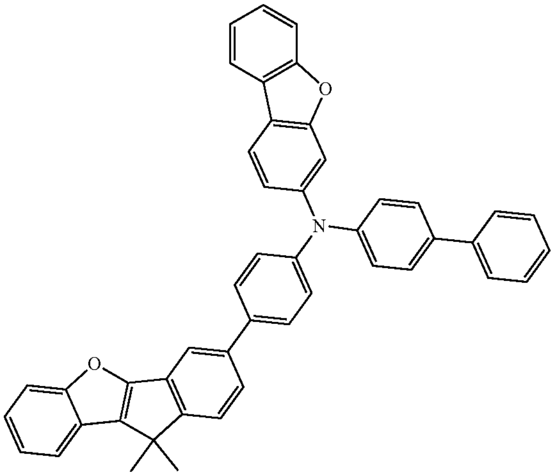
3-251
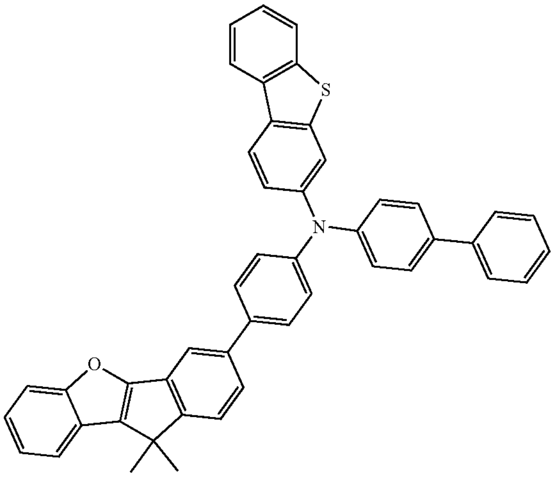
-continued
3-252
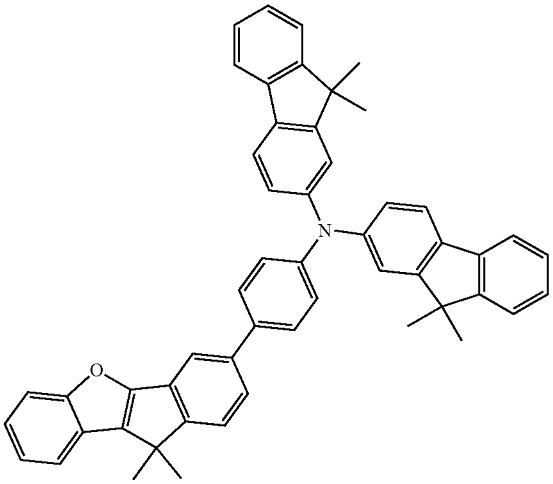
3-253
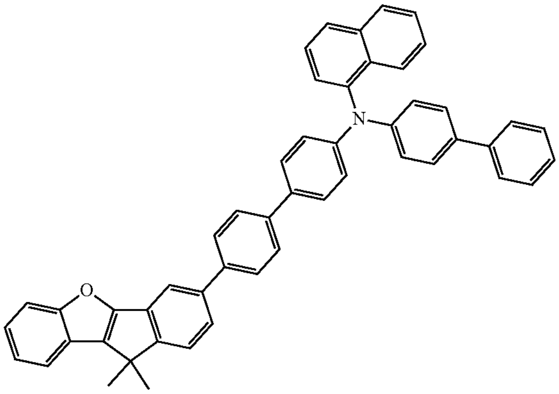
3-254
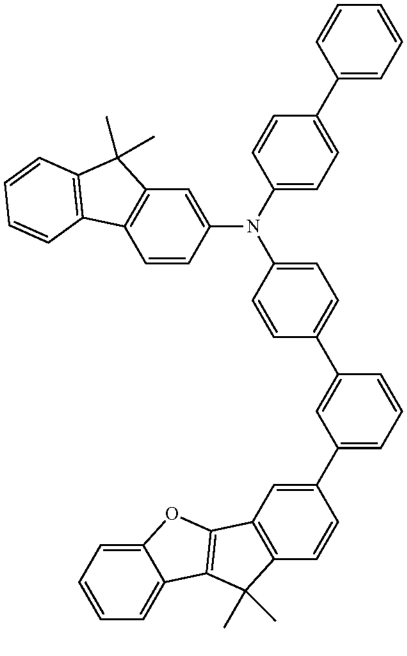

-continued
3-255
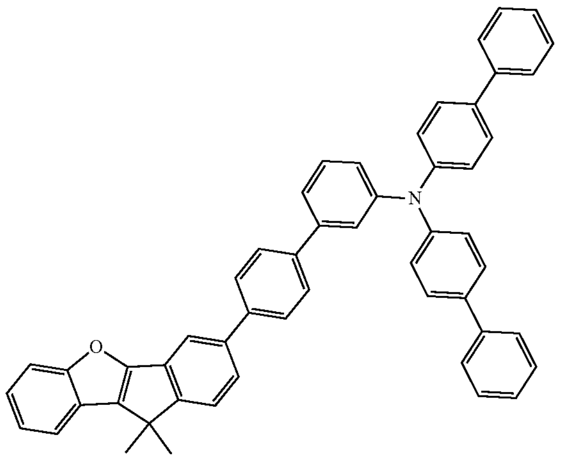
3-256
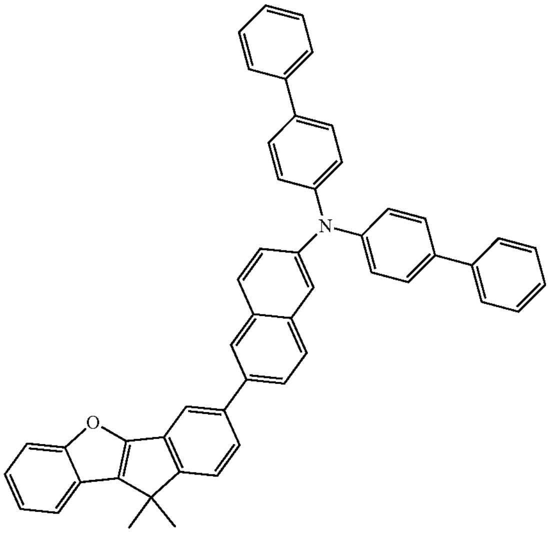
3-257
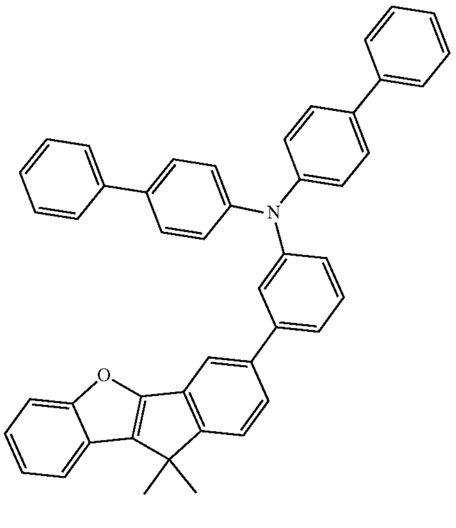
-continued
3-258
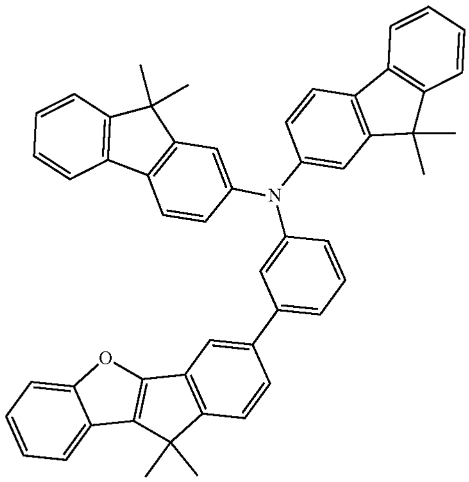
3-259
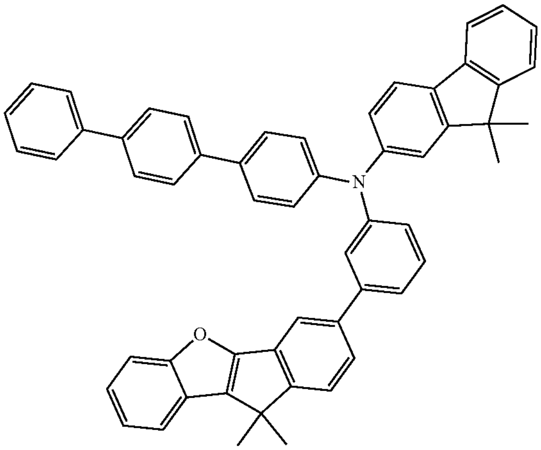
3-360
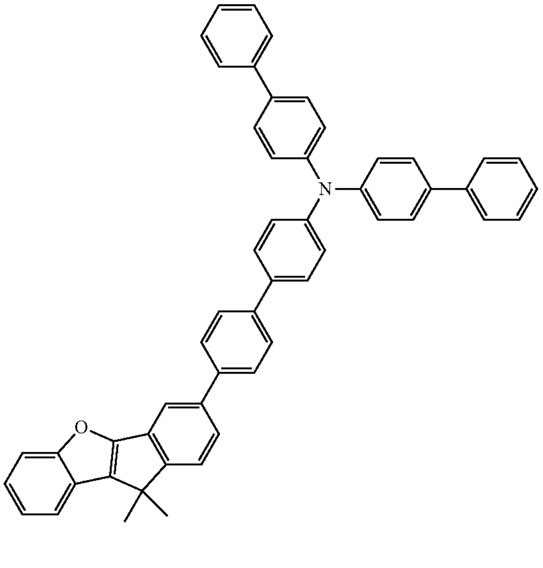

-continued
3-261
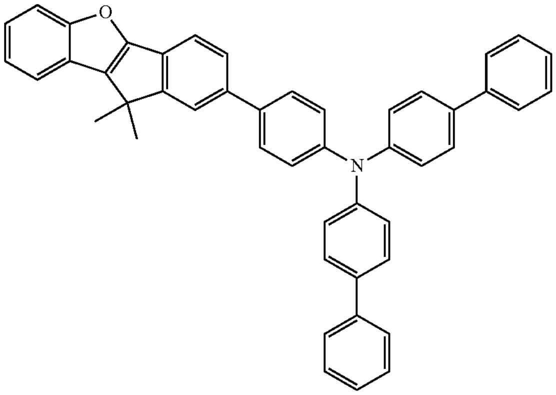
3-262
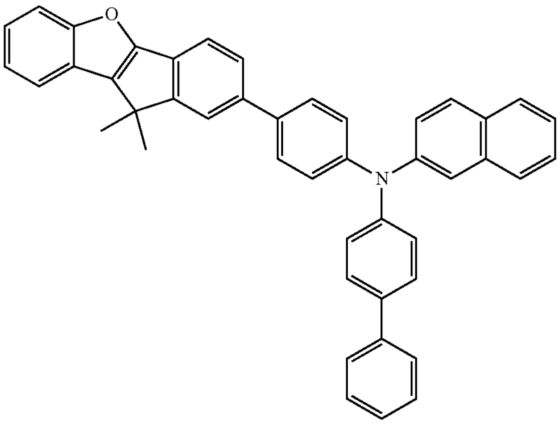
3-263
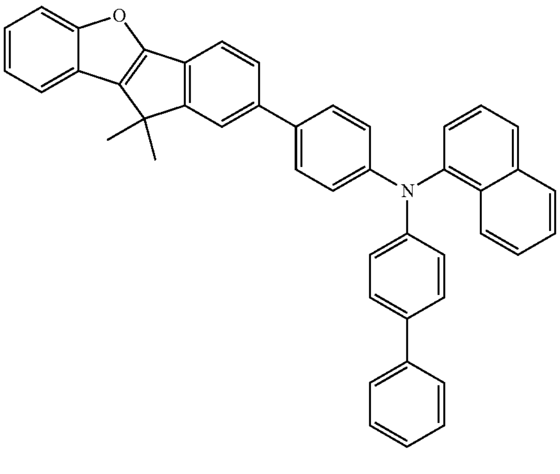
-continued
3-264
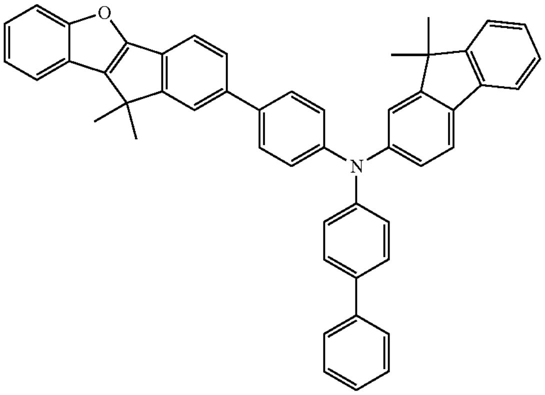
3-265
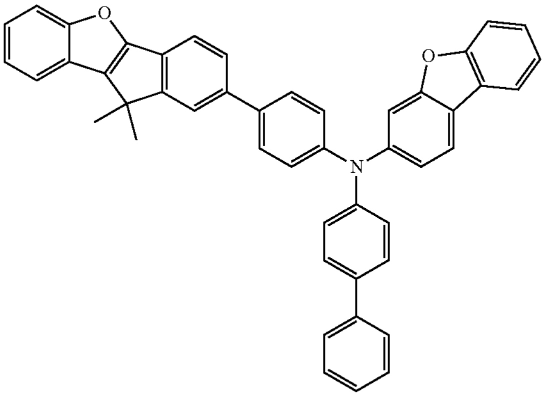
3-266
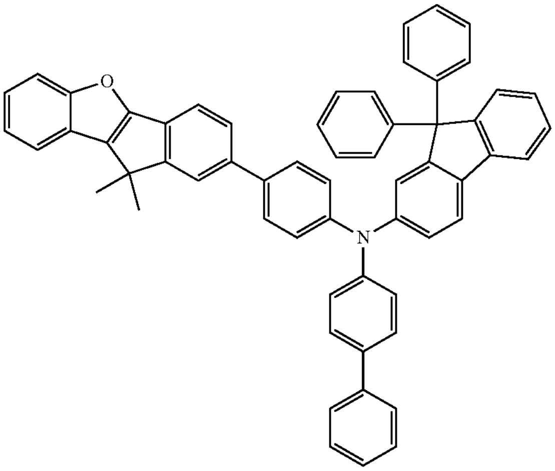

-continued
3-267
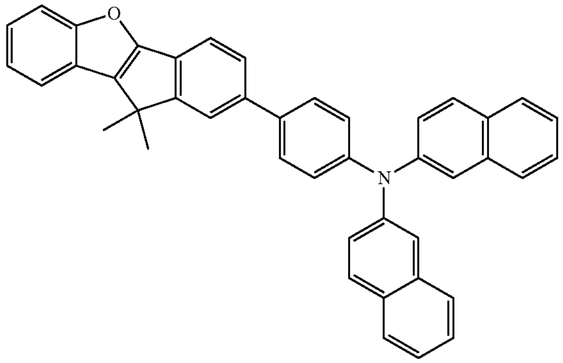
3-268
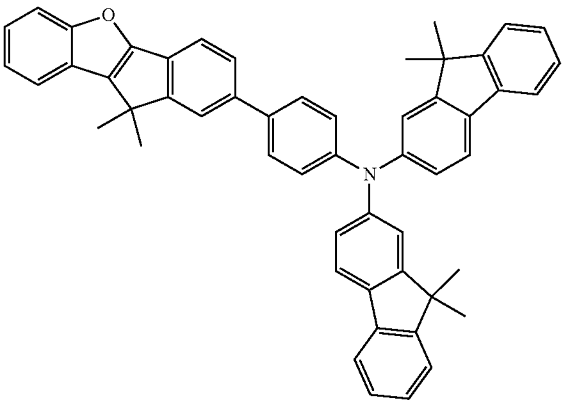
3-269
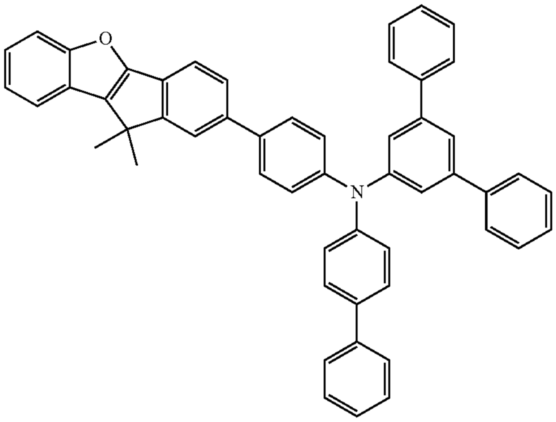
-continued
3-270
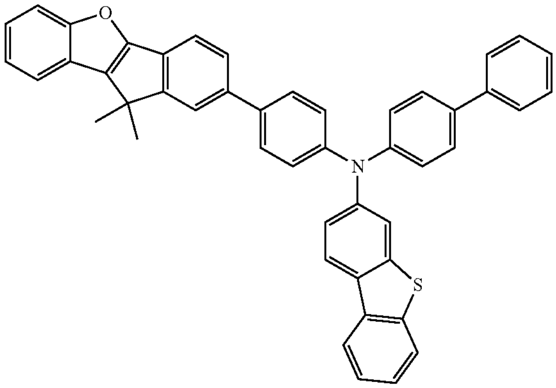
3-271
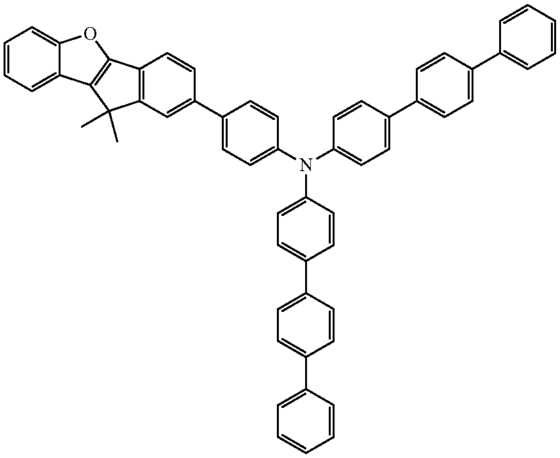
3-272
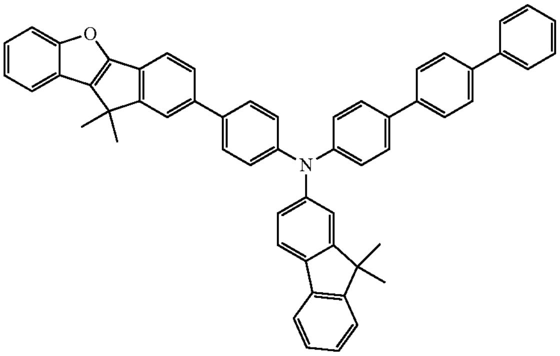

-continued
3-273
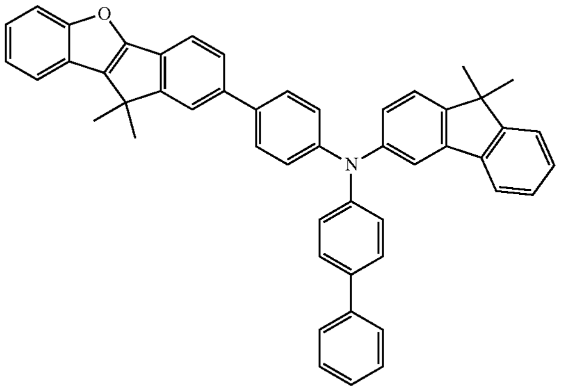
3-274
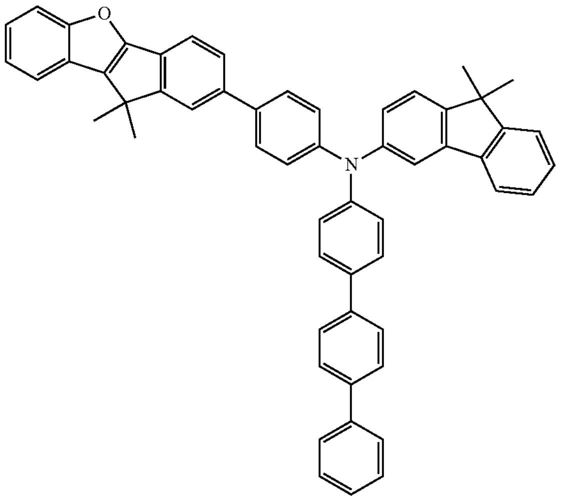
3-275
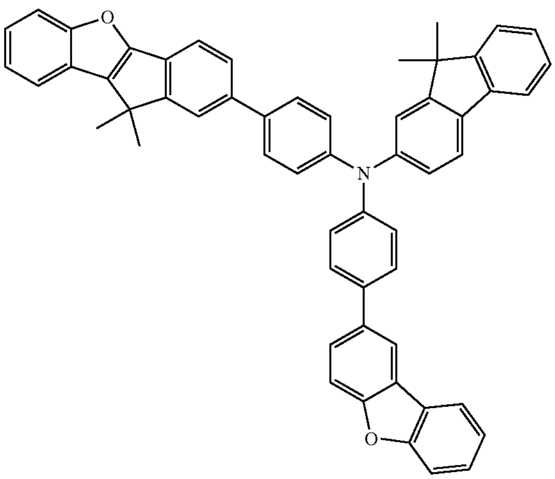
-continued
3-276
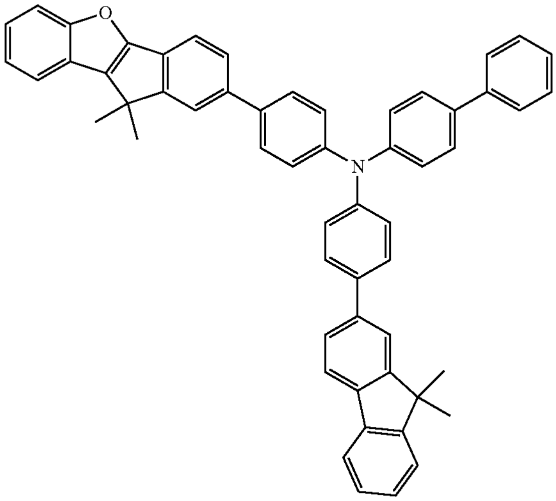
3-277
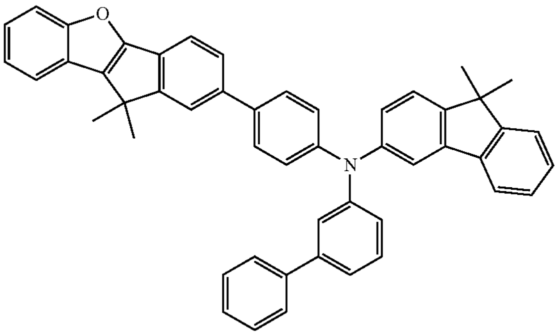
3-278
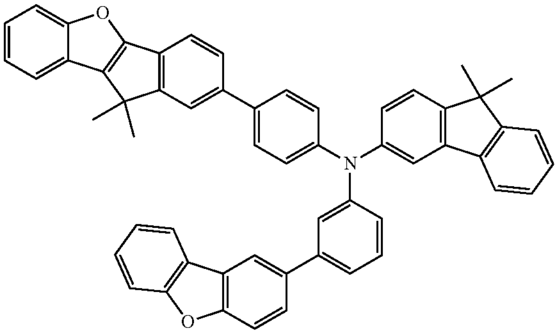
3-279
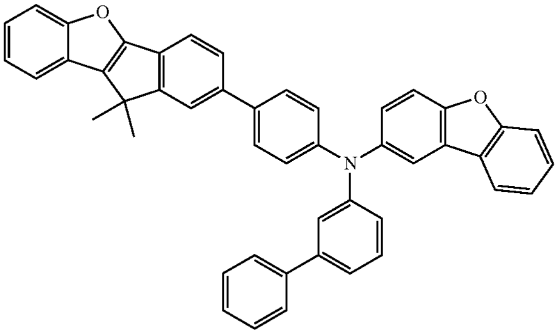

-continued
3-280
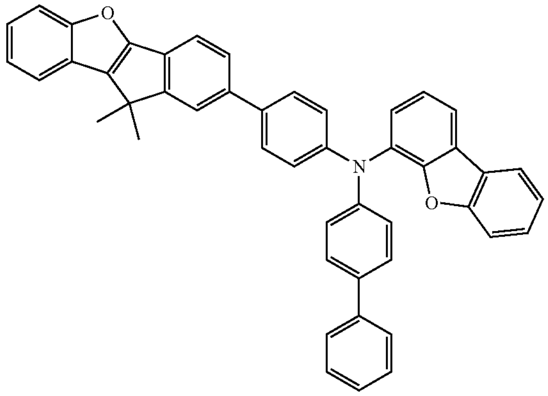
3-281
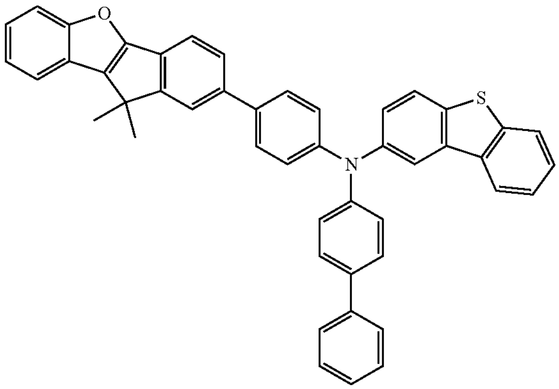
3-282
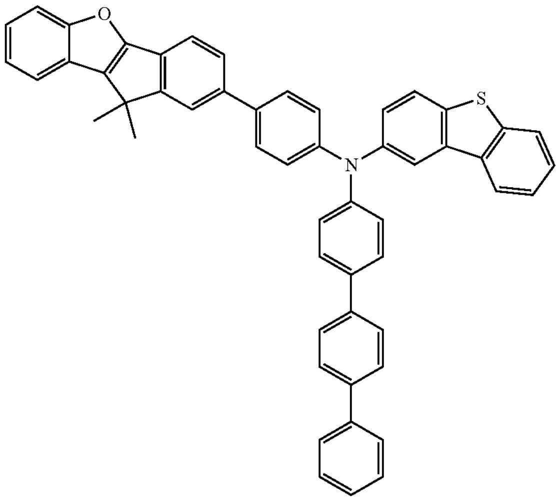
-continued
3-283
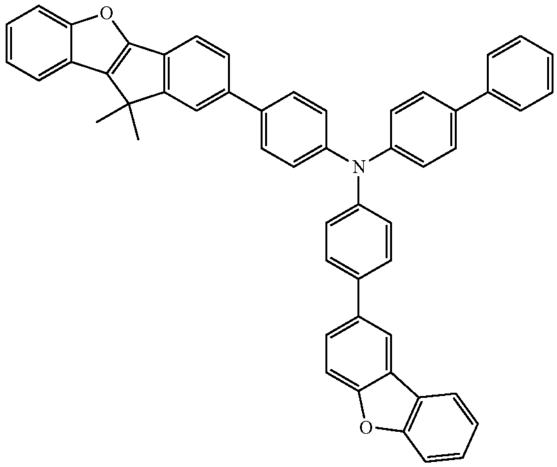
3-284
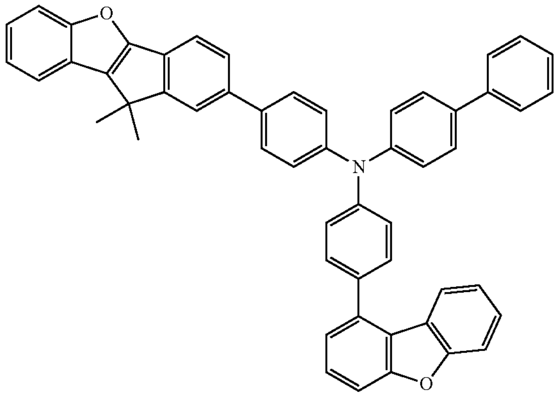
3-285
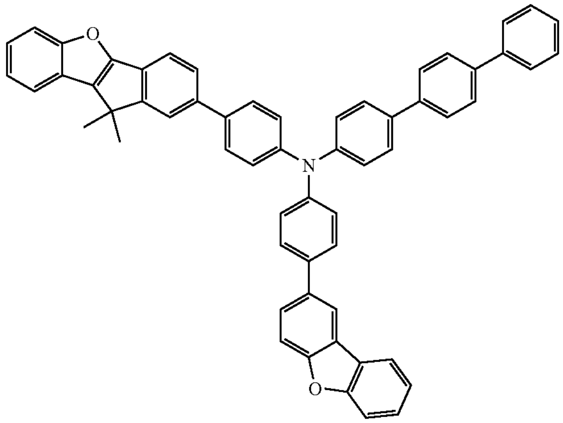

-continued
3-286
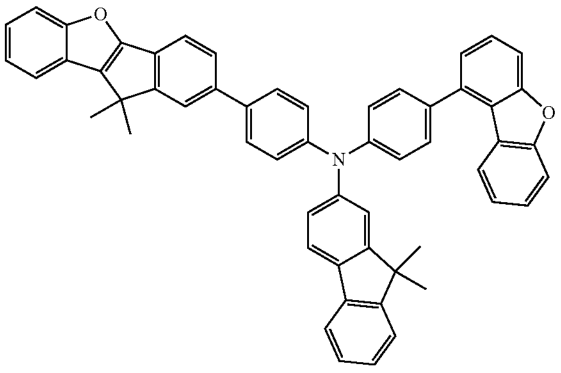
3-287
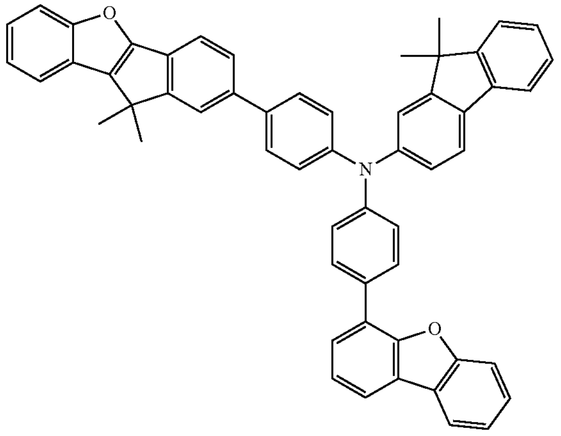
3-288
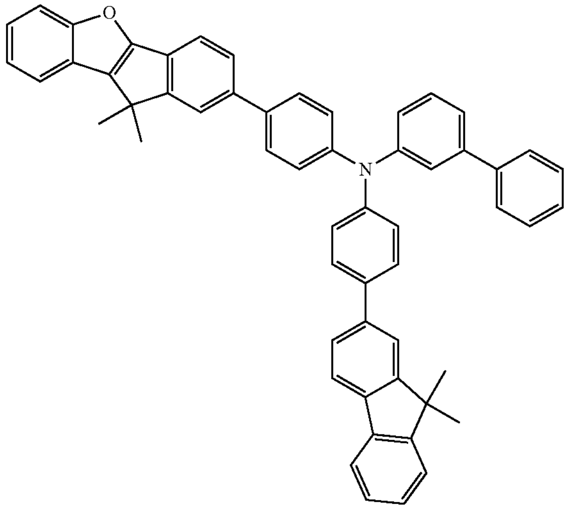
3-289
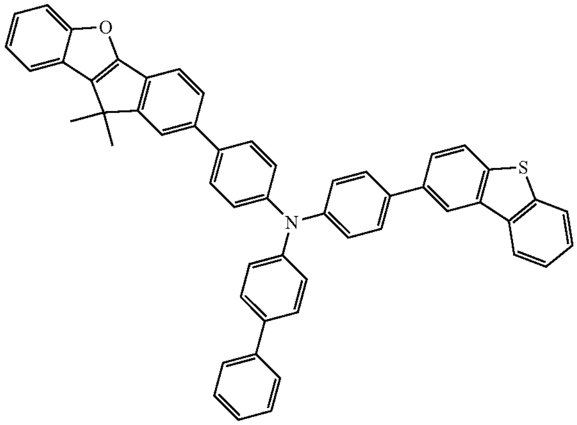
3-290
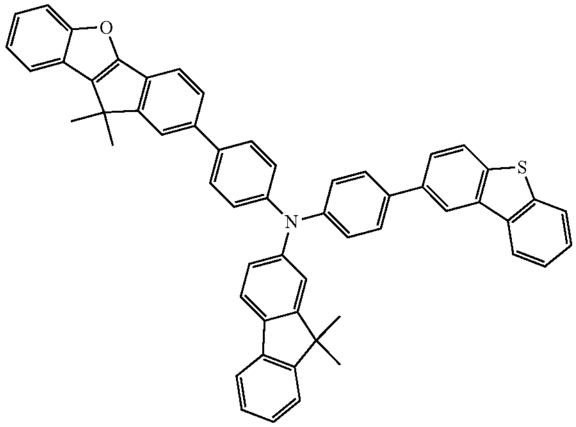
3-291
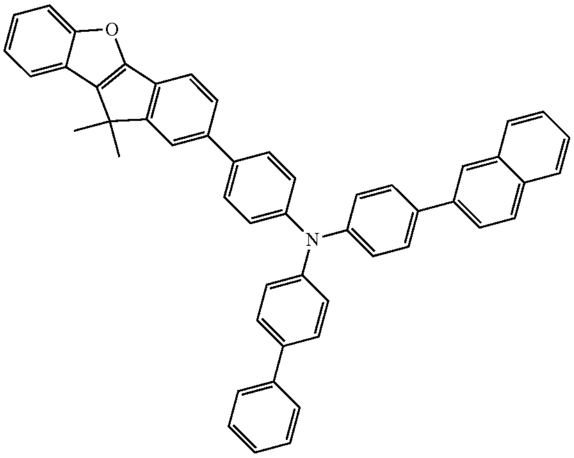

-continued
3-292
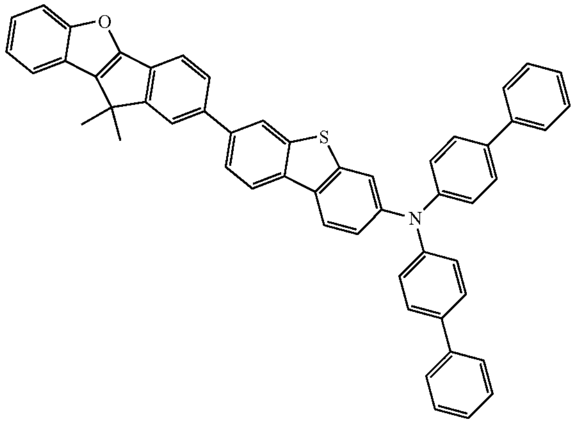
3-293
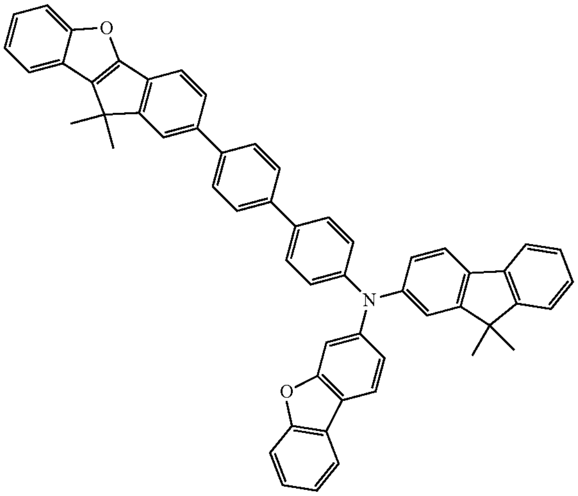
3-294
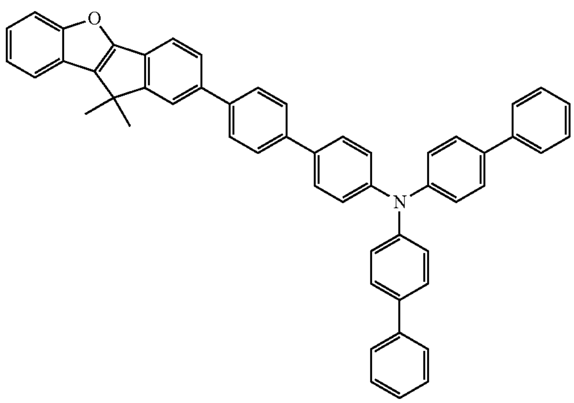
-continued
3-295
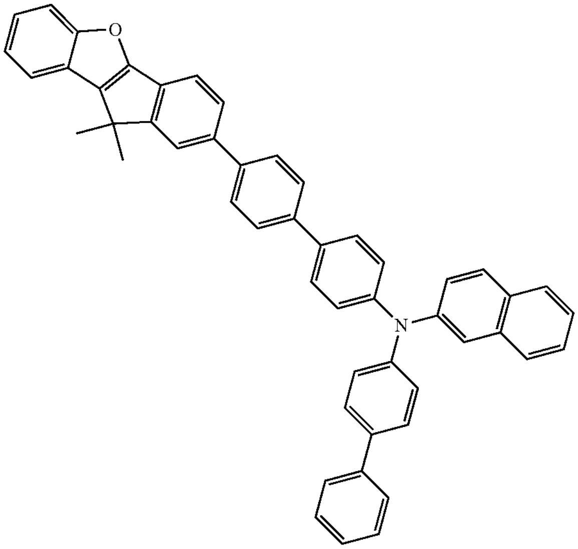
3-296
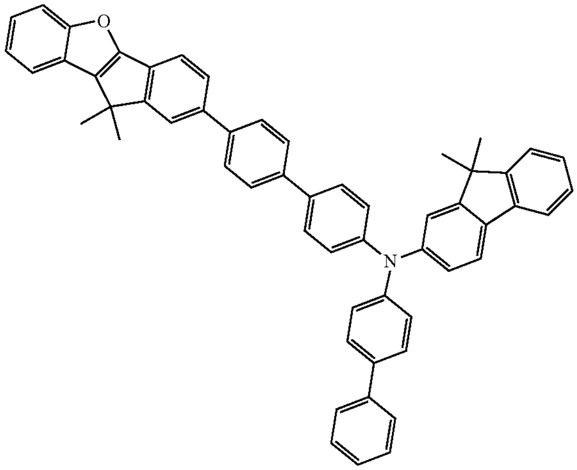
3-297
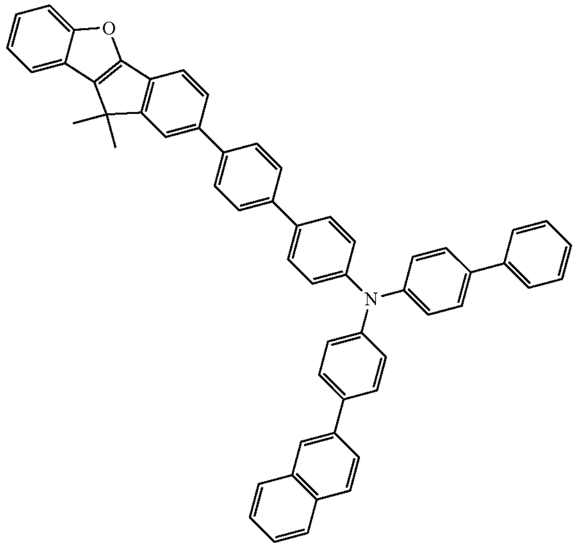

-continued
3-298
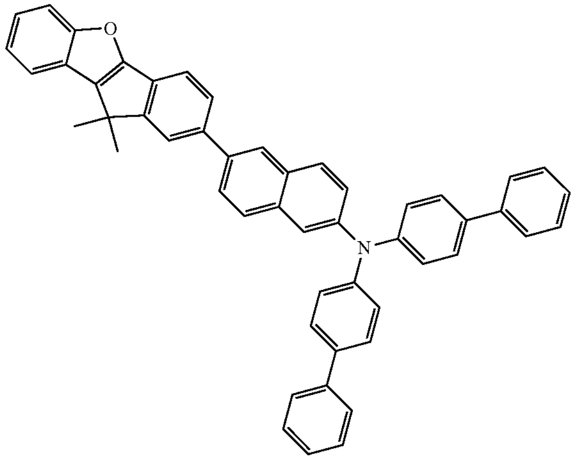
3-299
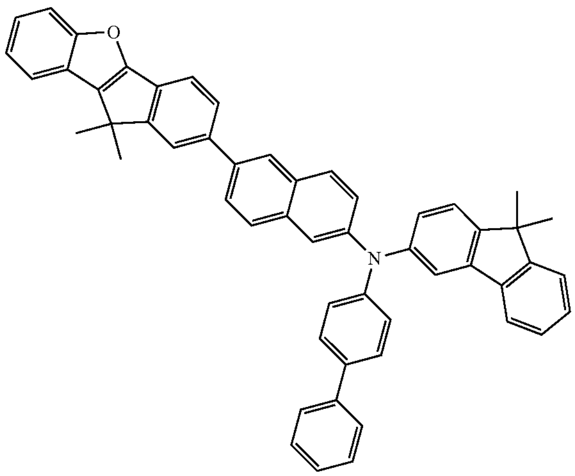
3-300
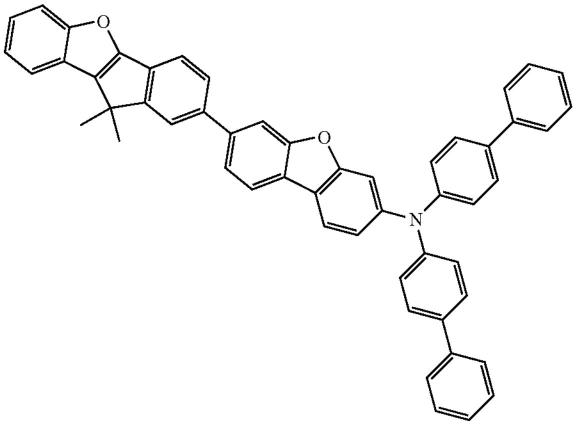
-continued
3-301
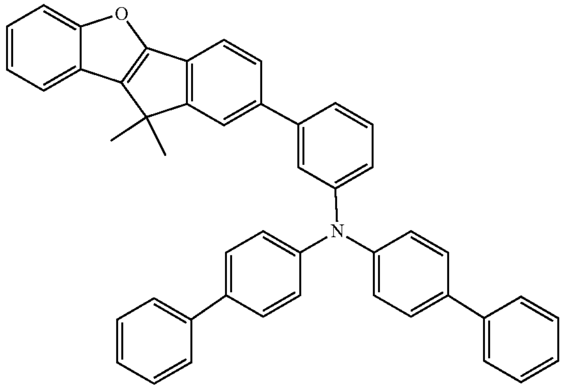
3-302
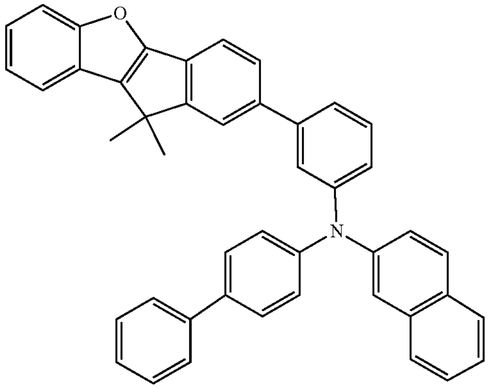
3-303
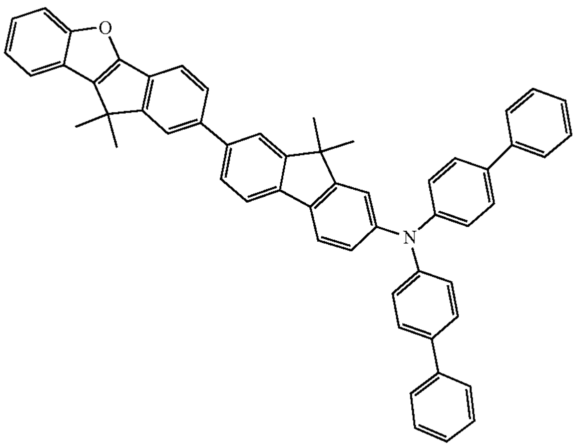

-continued
3-304
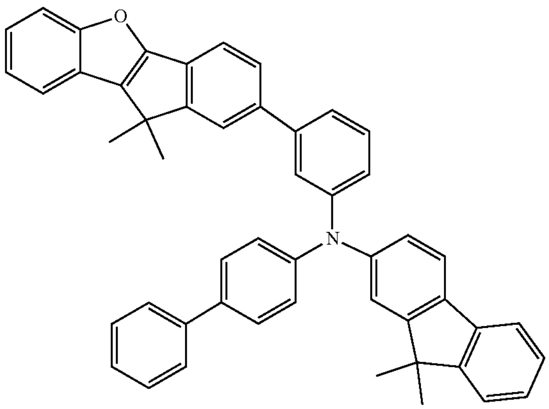
3-305
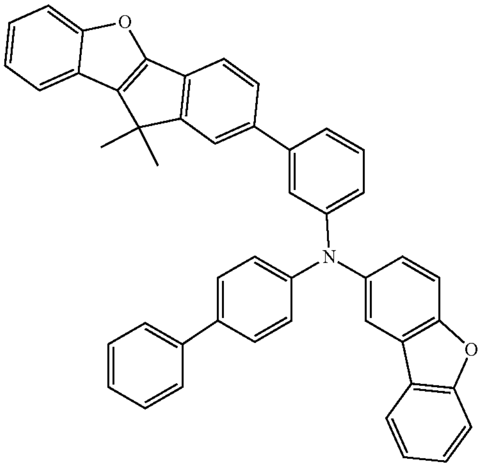
3-306
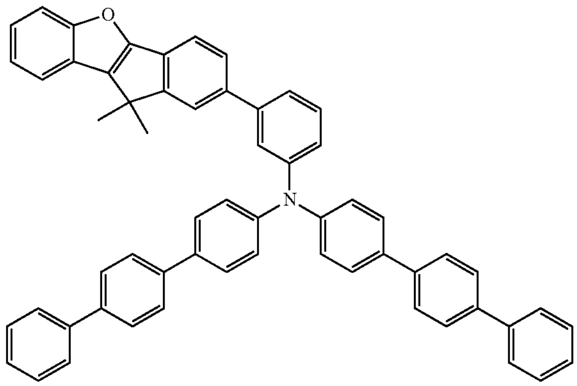
-continued
3-307
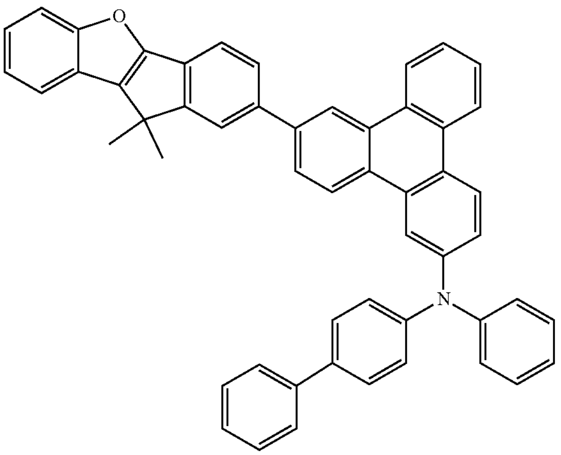
3-308
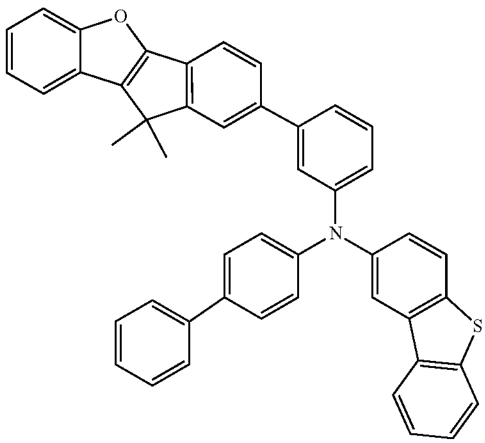
3-309
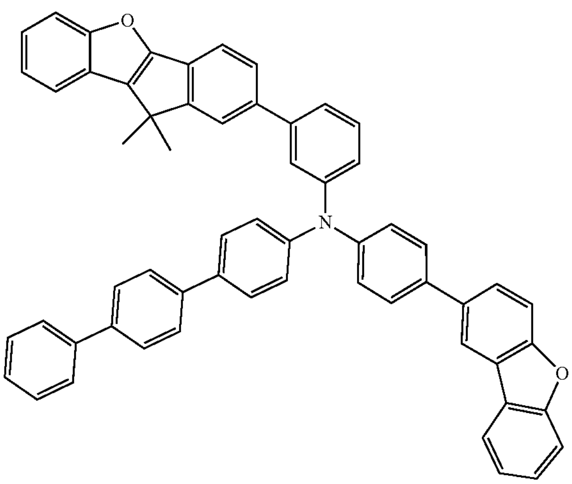

-continued
3-310
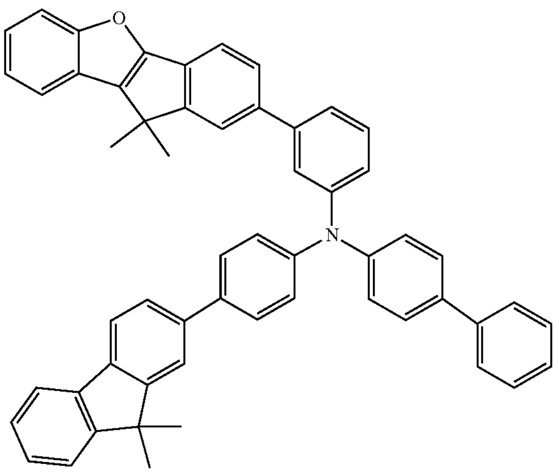
3-311
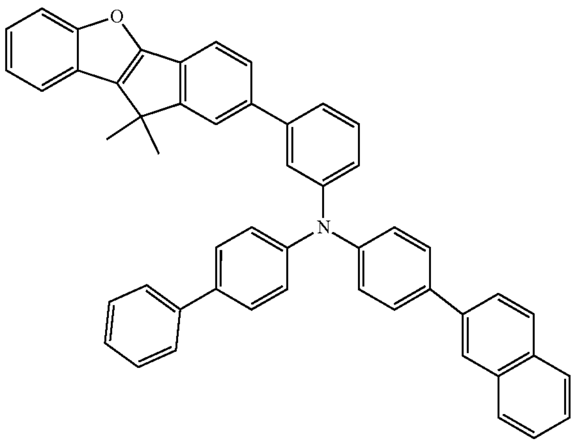
3-312
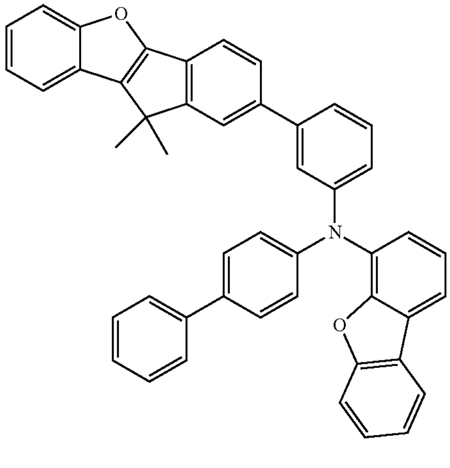
-continued
3-313
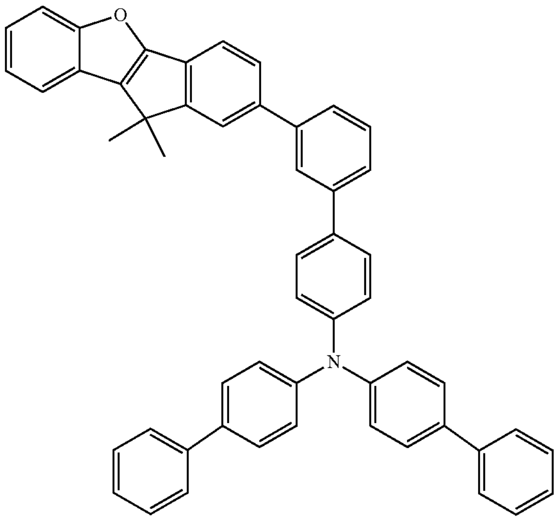
3-314
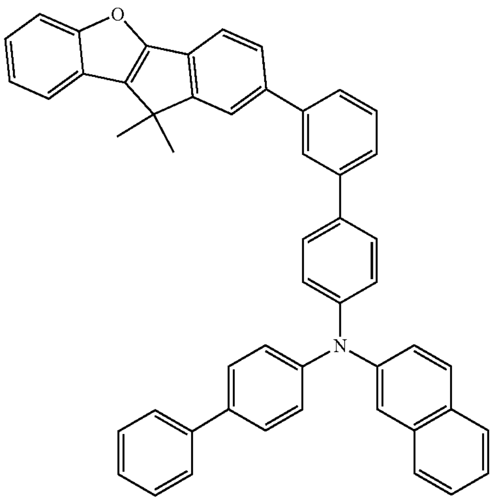
3-315
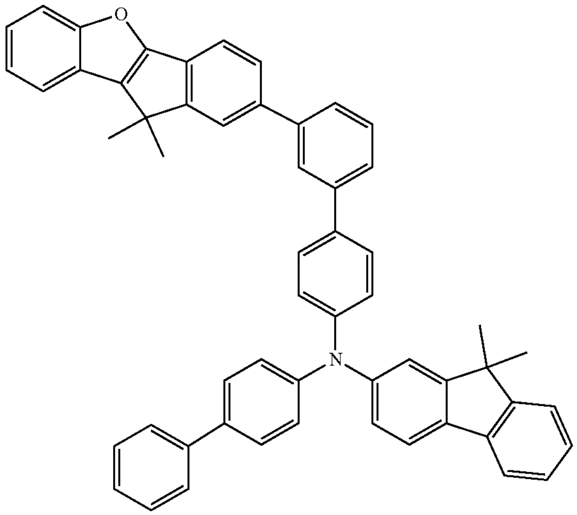

-continued
3-316
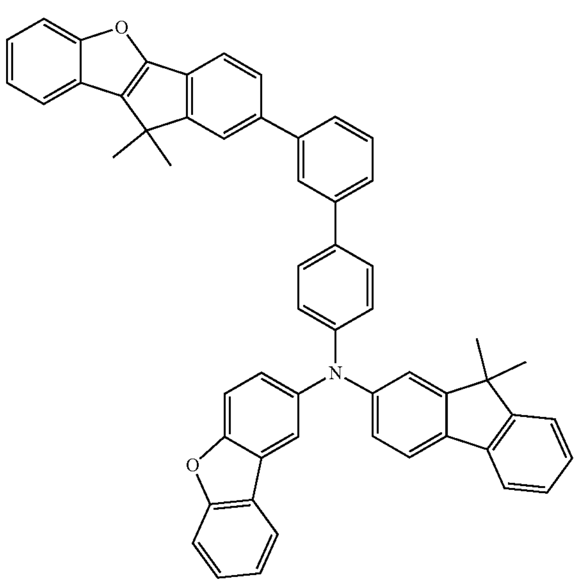
3-317
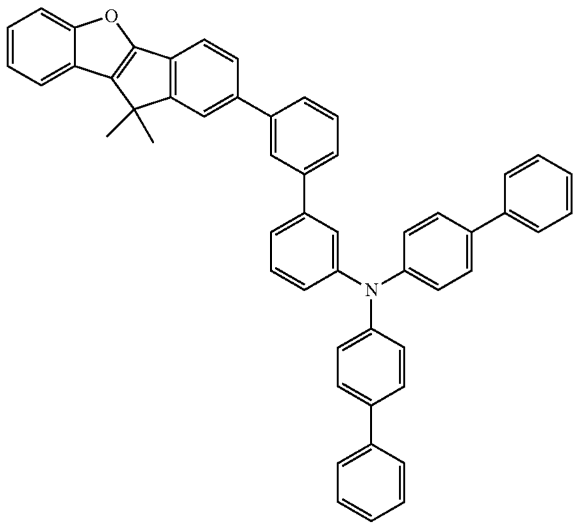
3-318
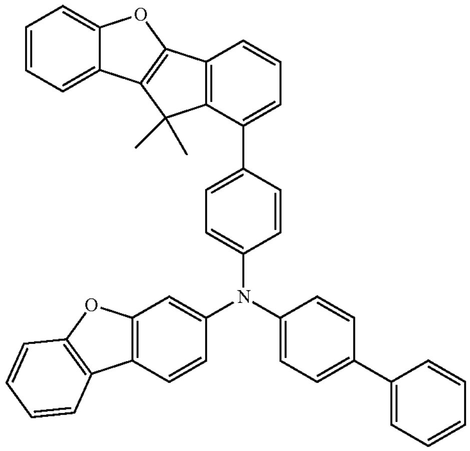
-continued
3-319
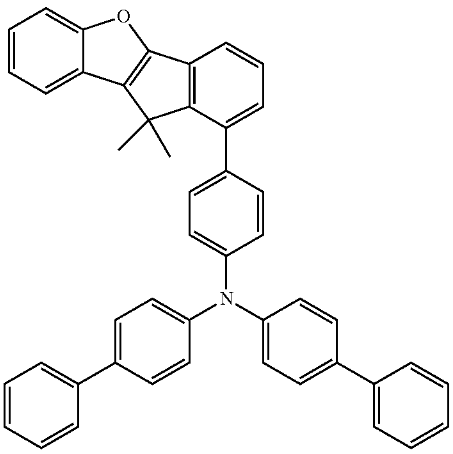
3-320
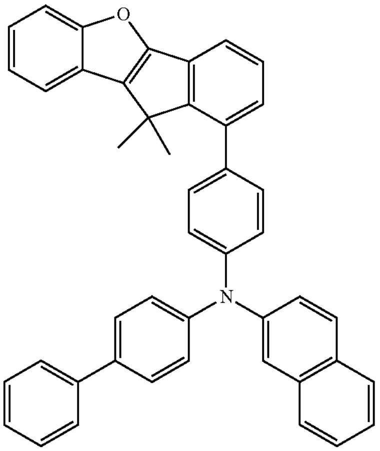
3-321
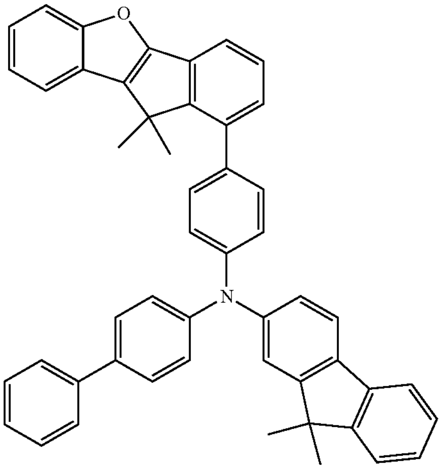

3-322
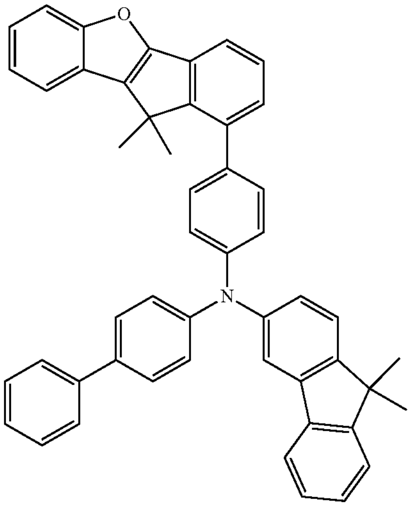
3-323
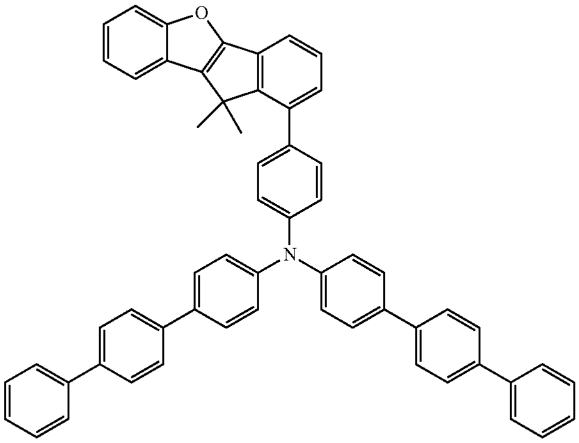
3-324
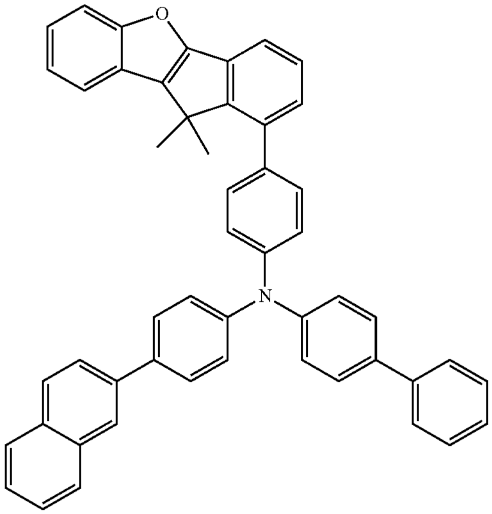
3-325
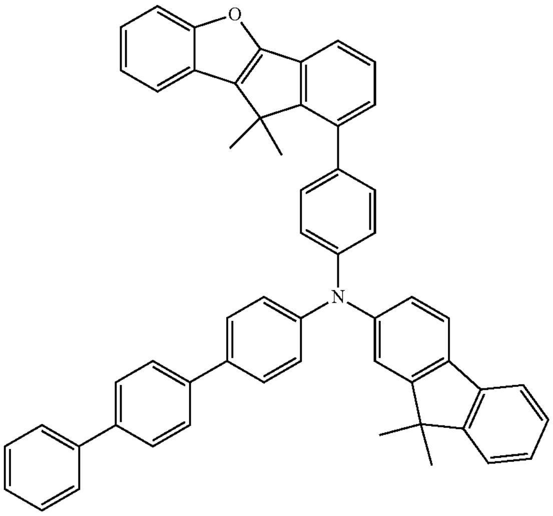
3-326
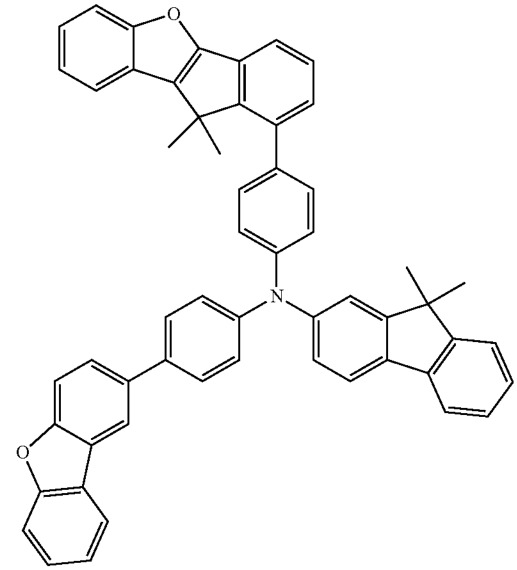
3-327
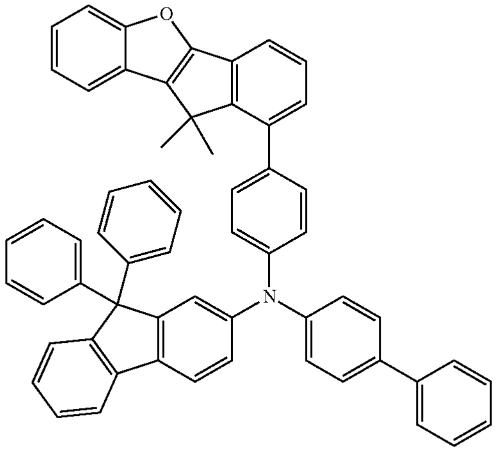

-continued
3-328
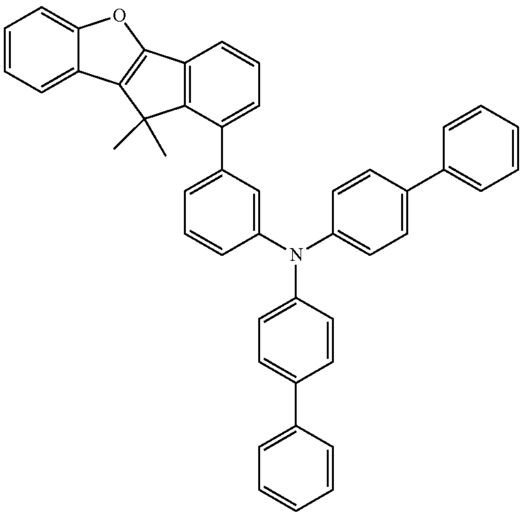
3-329
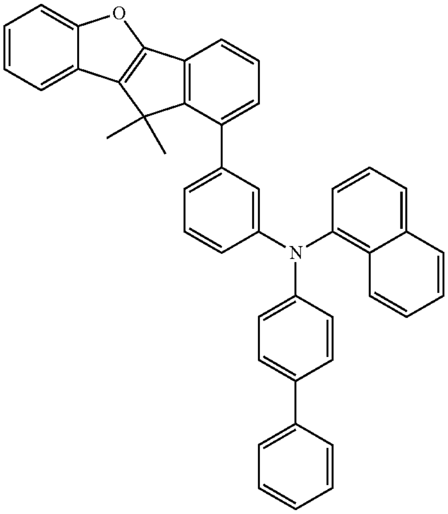
3-330
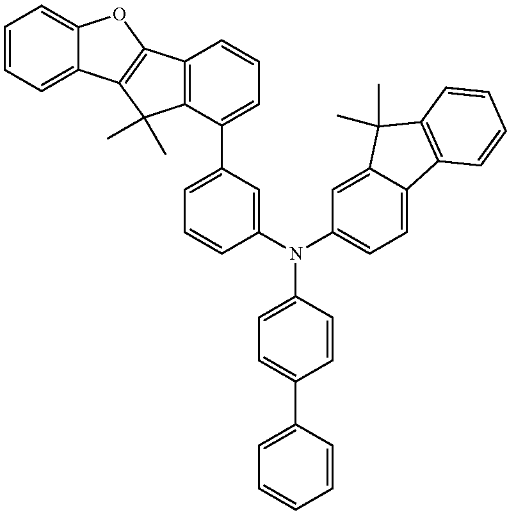
-continued
3-331
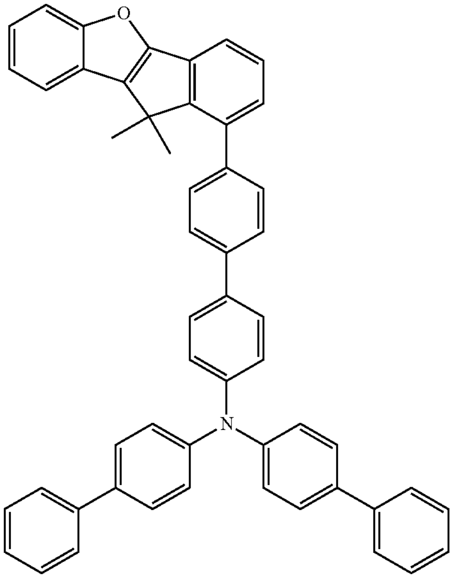
3-332
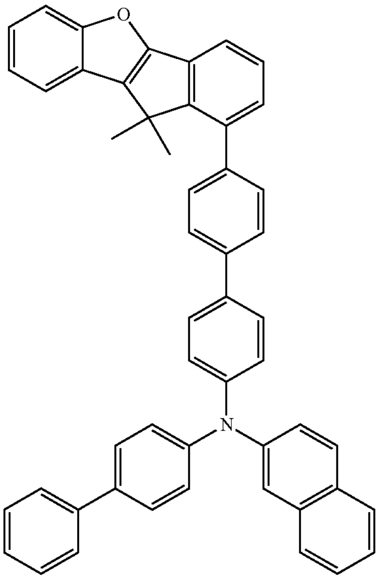

-continued
3-333
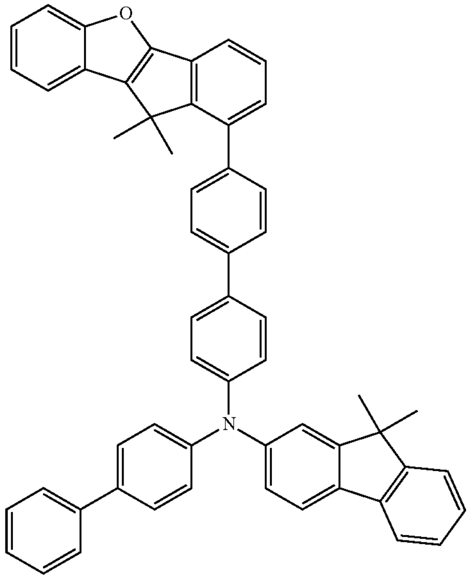
3-334
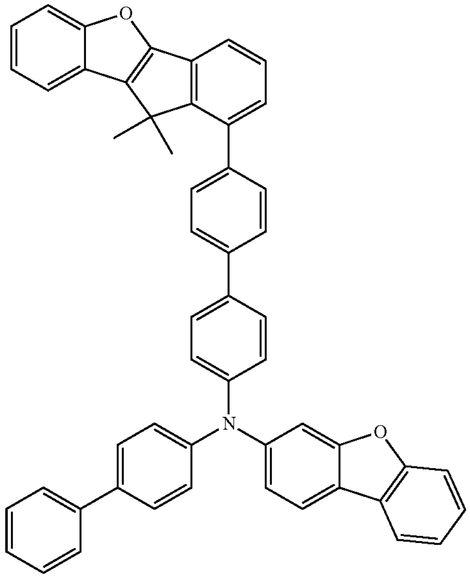
-continued
3-335
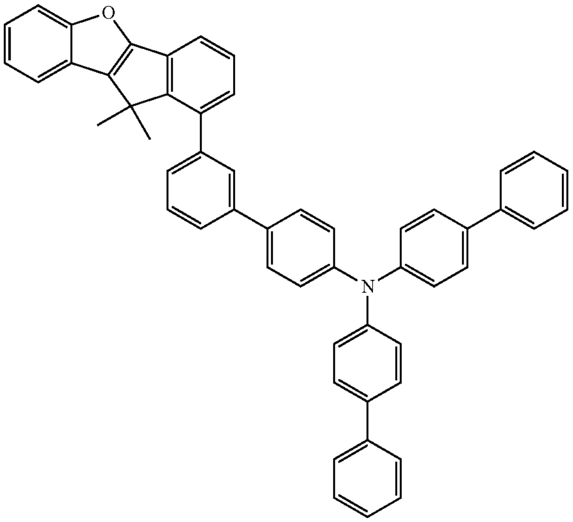
3-336
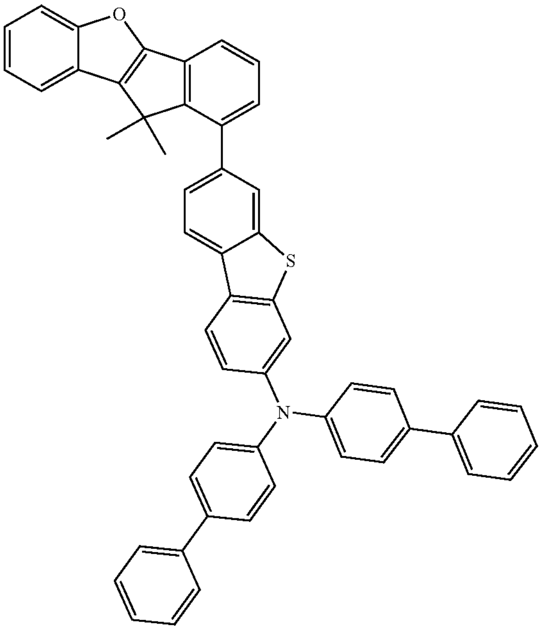

-continued
3-337
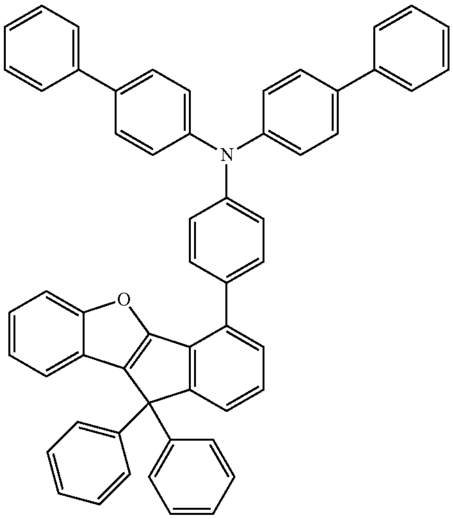
3-338
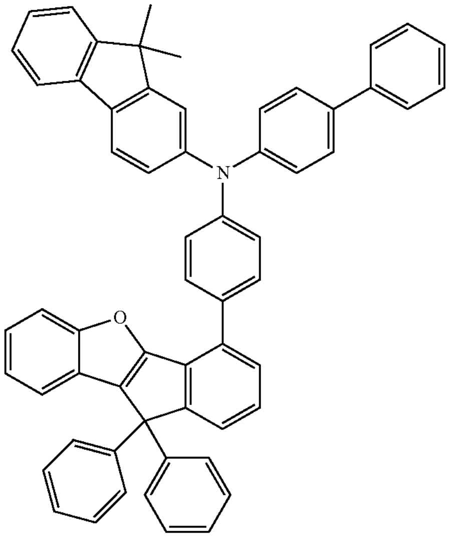
3-339
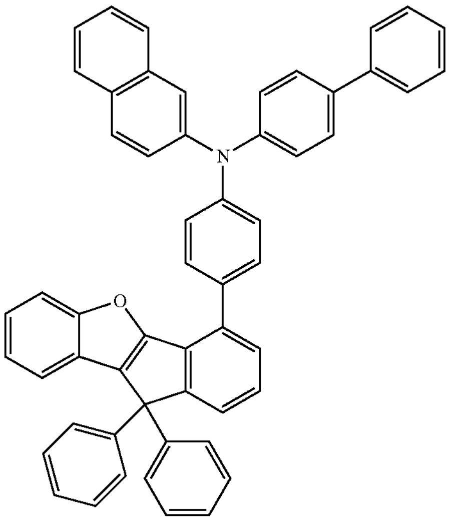
-continued
3-340
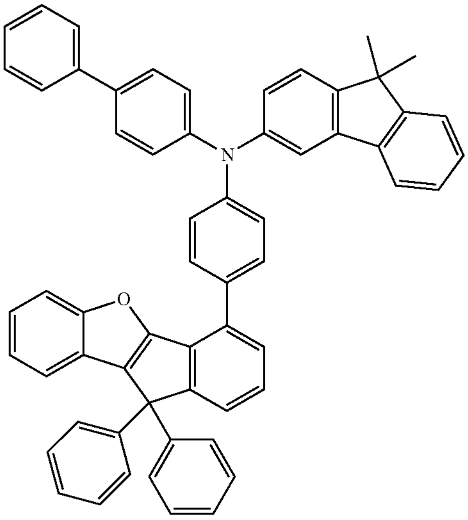
3-341
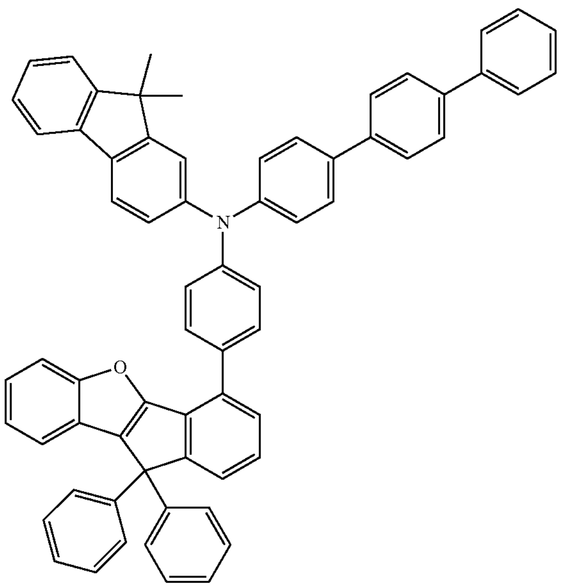
3-342
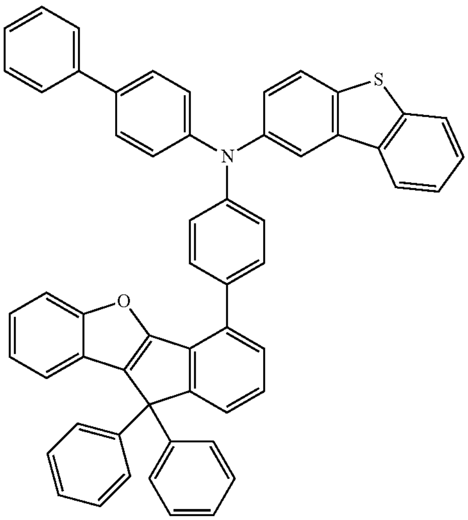

-continued
3-343
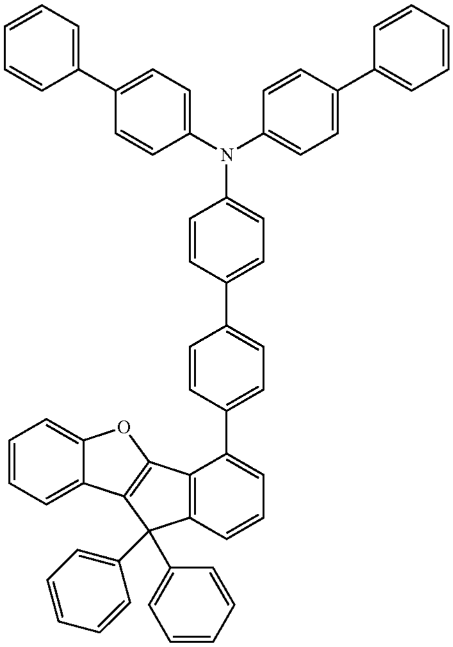
3-344
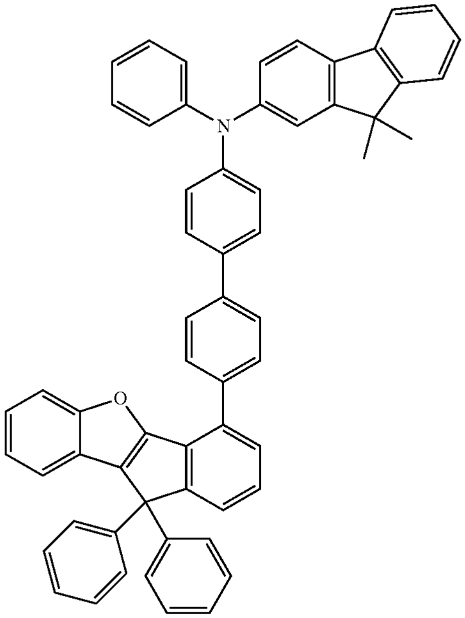
-continued
3-345
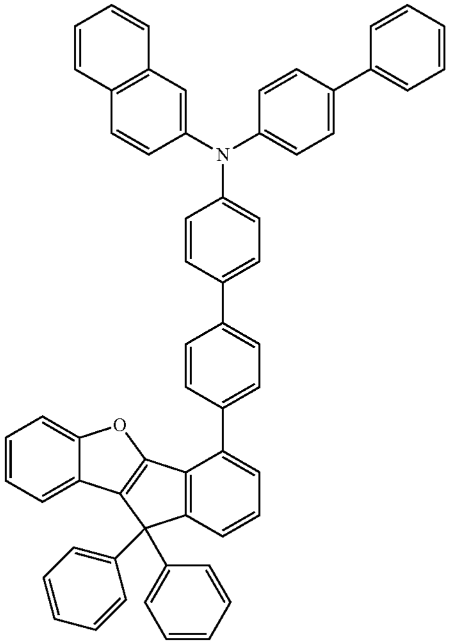
3-346
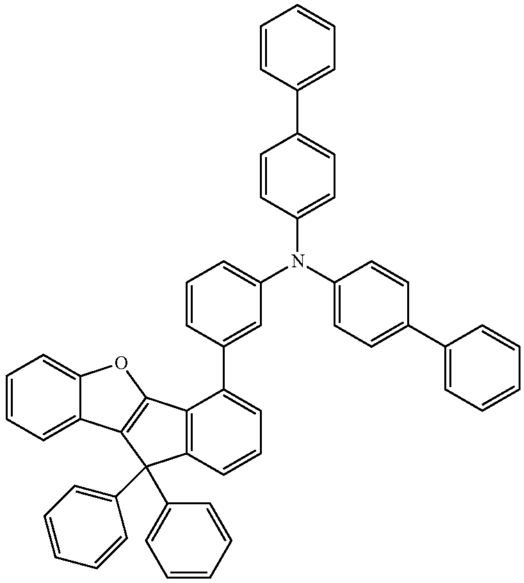

-continued
3-347
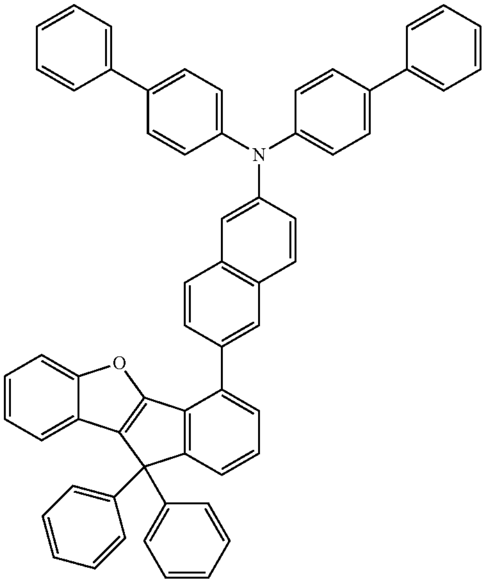
3-348
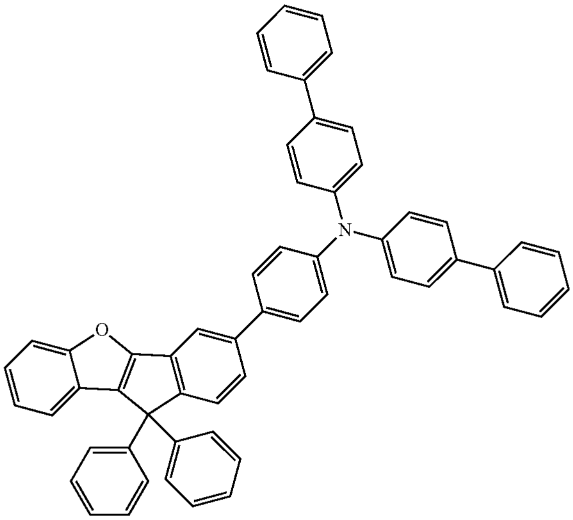
3-349
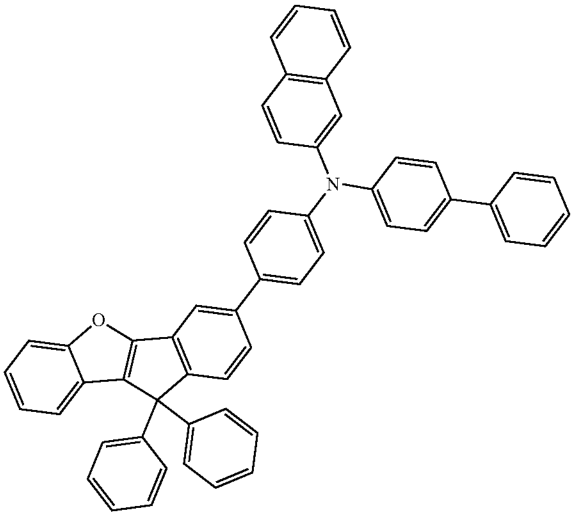
-continued
3-350
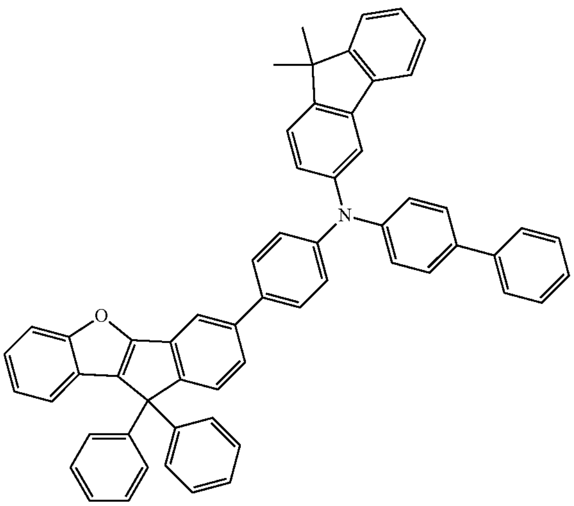
3-351
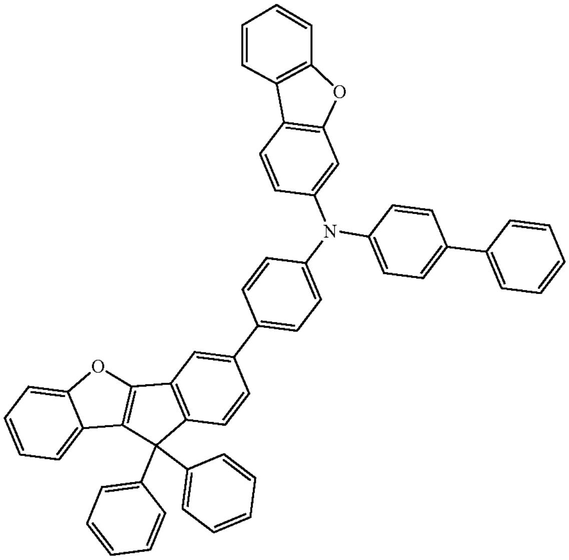

-continued
3-352
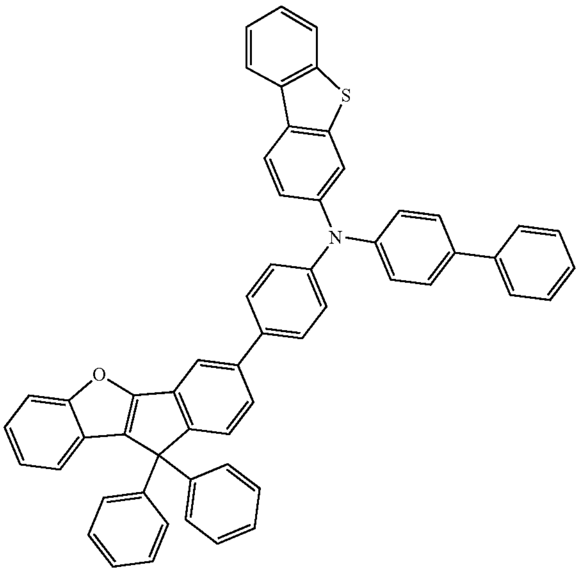
3-353
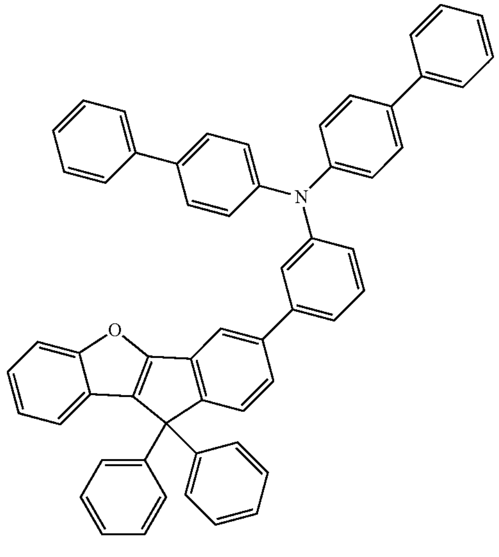
-continued
3-354
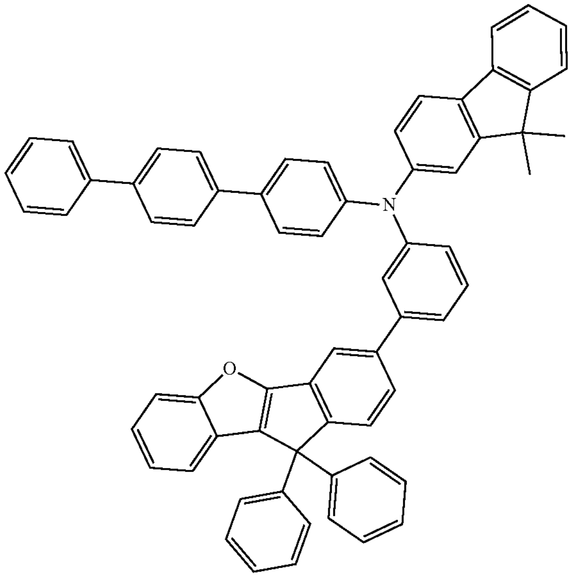
3-355
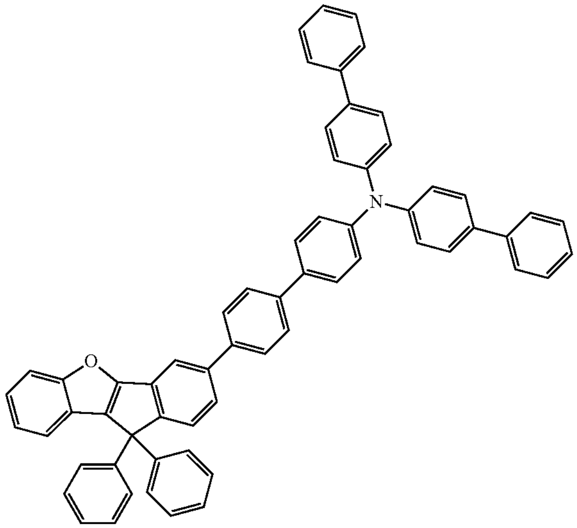
3-356
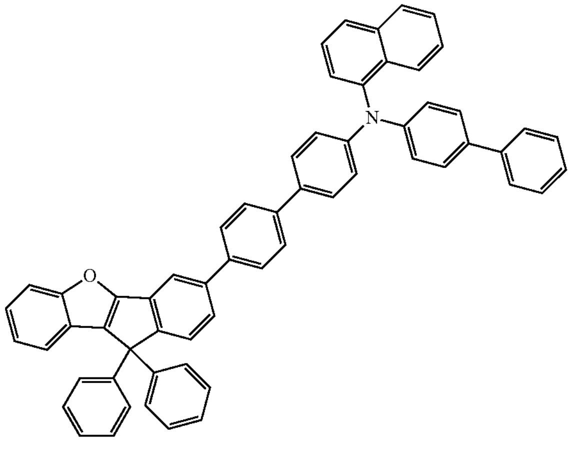

-continued
3-357
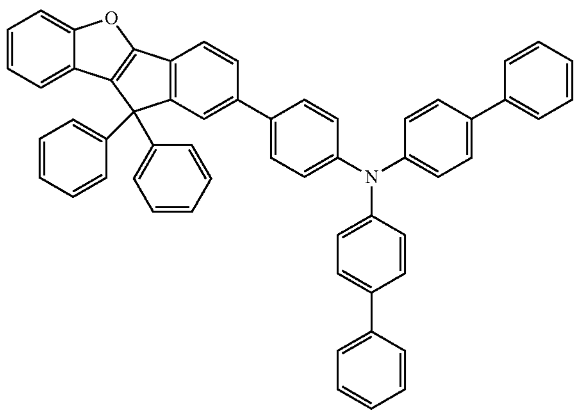
3-358
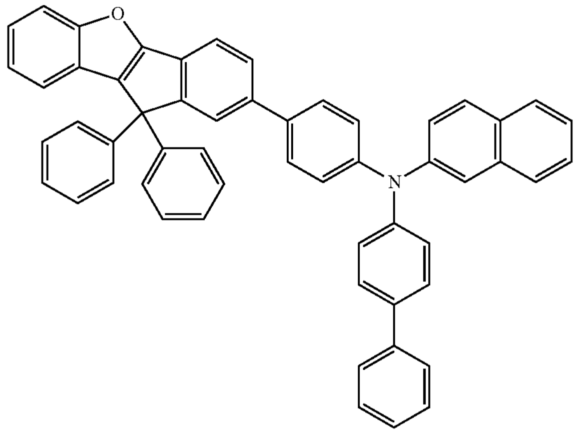
3-359
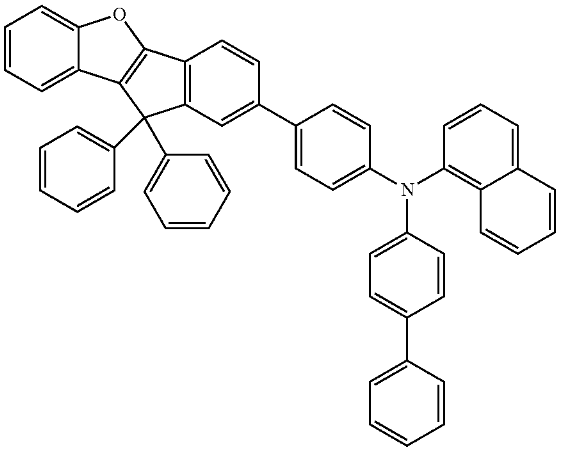
-continued
3-360
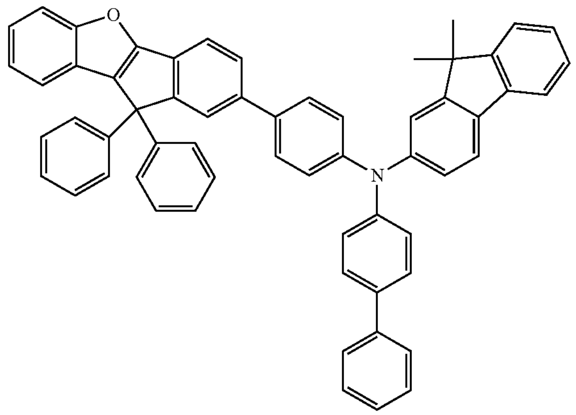
3-361
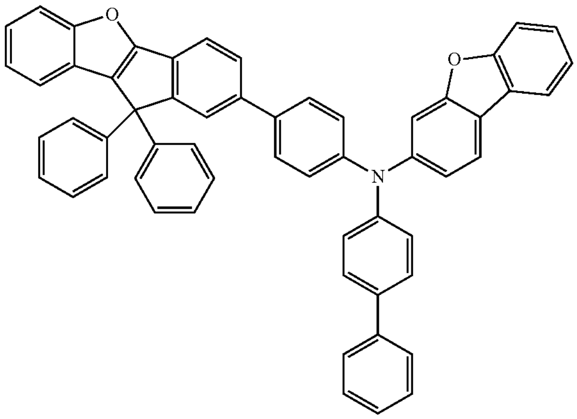
3-362
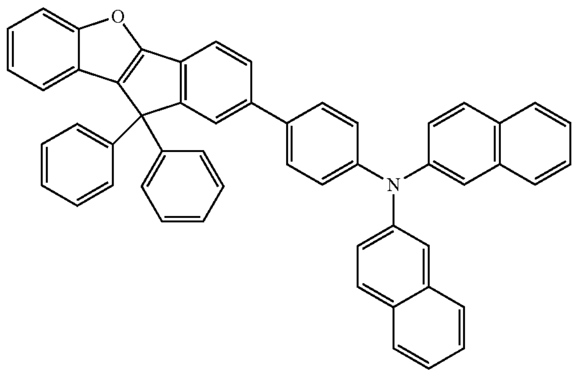

-continued
3-363
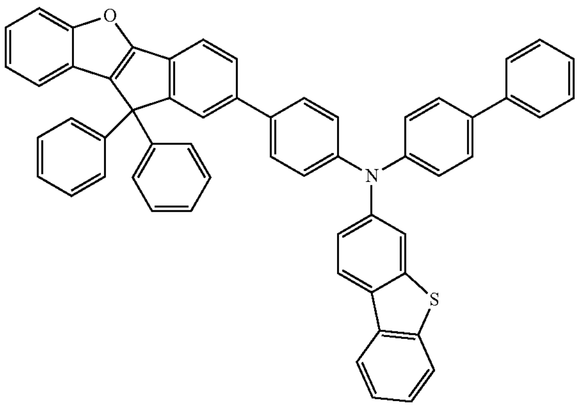
3-364
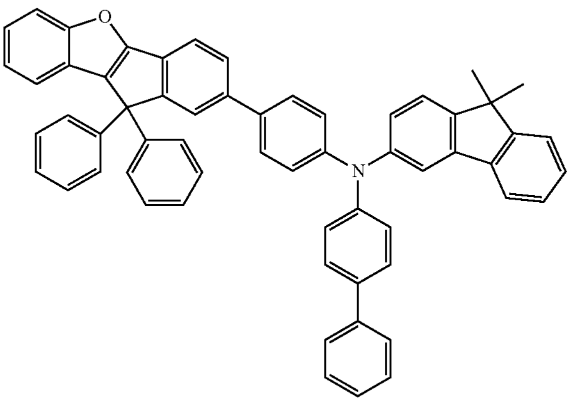
3-365
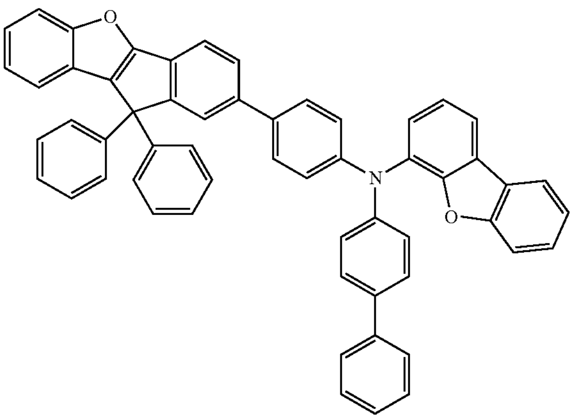
-continued
3-366
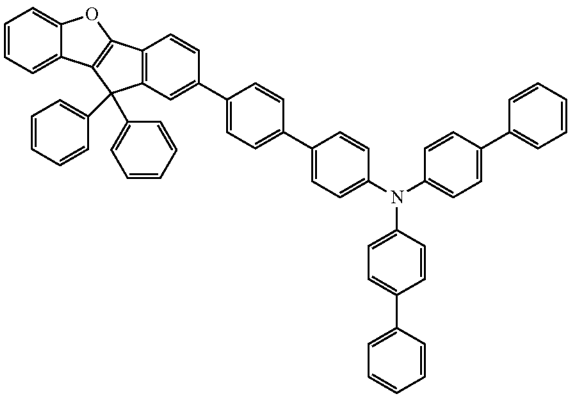
3-367
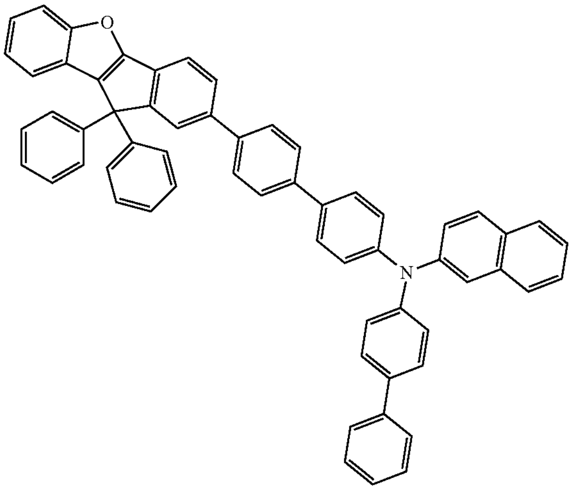
3-368
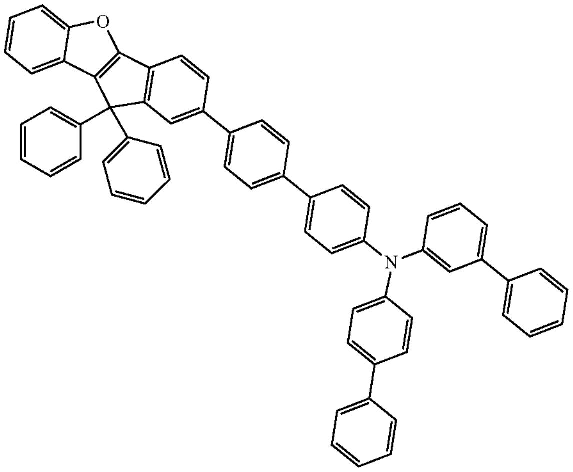

-continued
3-369
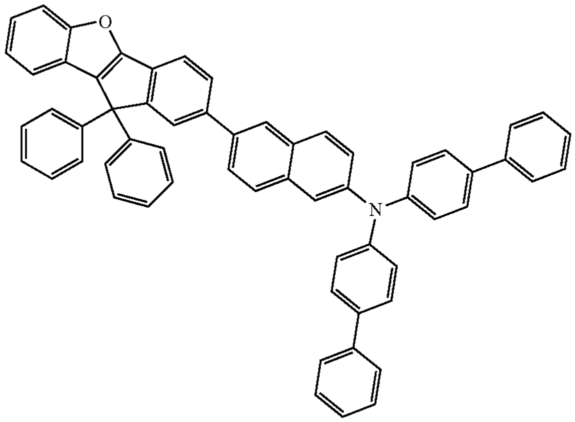
3-370
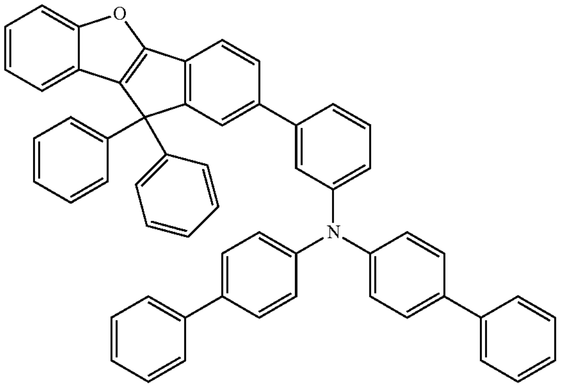
3-371
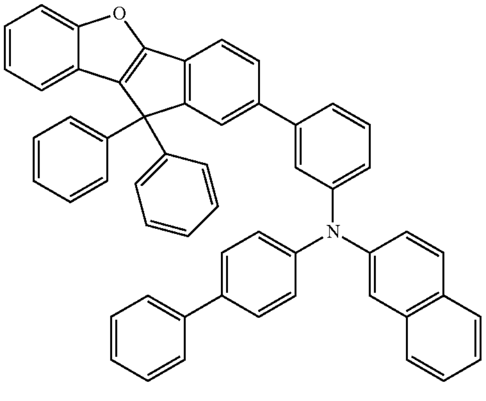
-continued
3-372
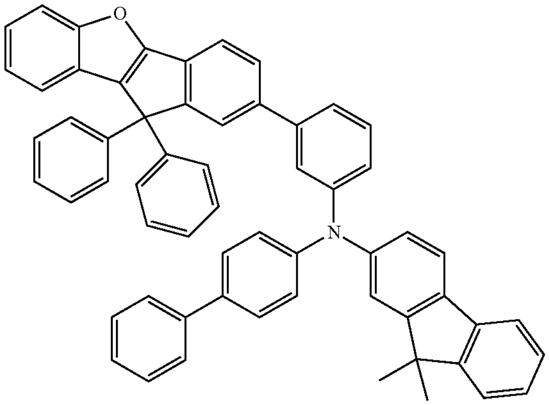
3-373
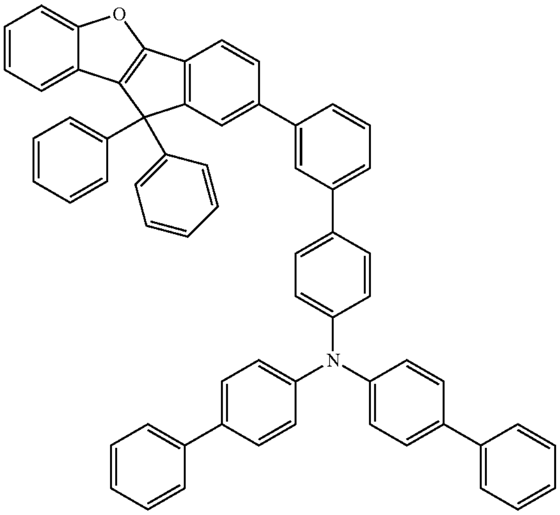
3-374
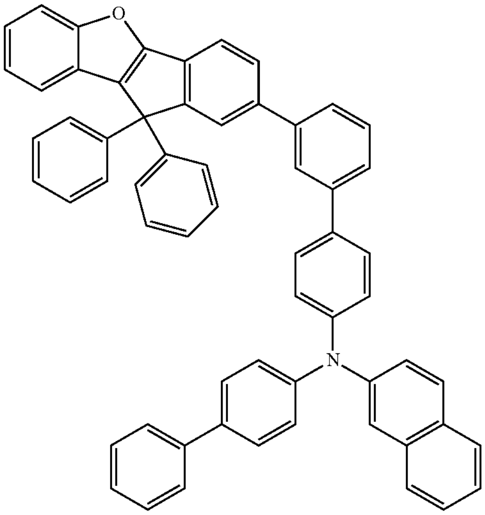

-continued
3-375
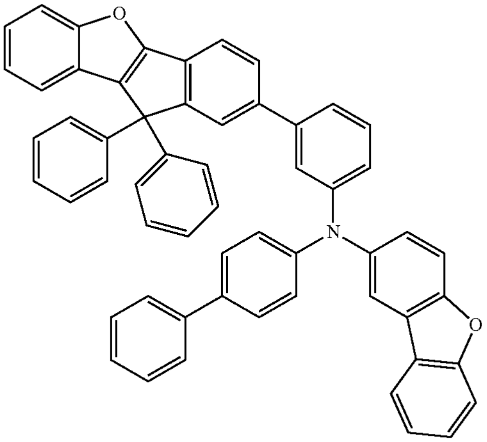
3-376
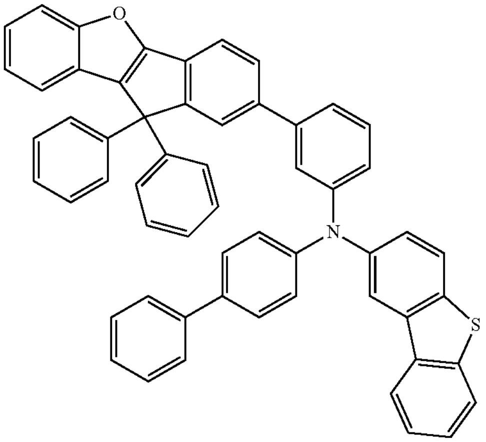
3-377
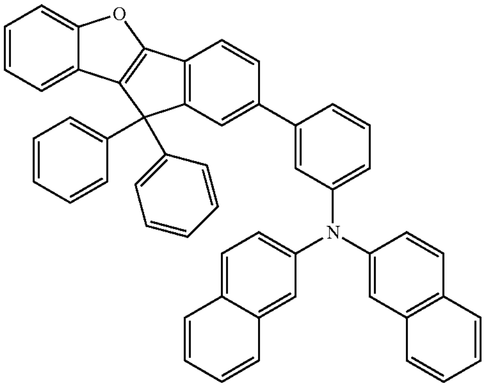
-continued
3-378
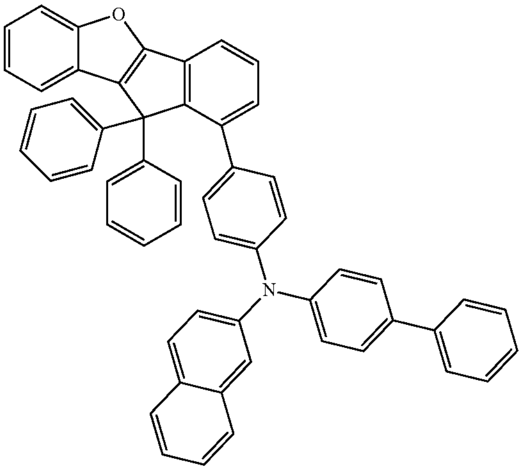
3-379
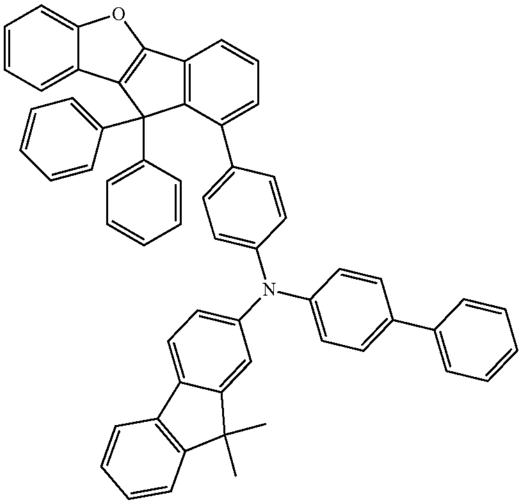
3-380
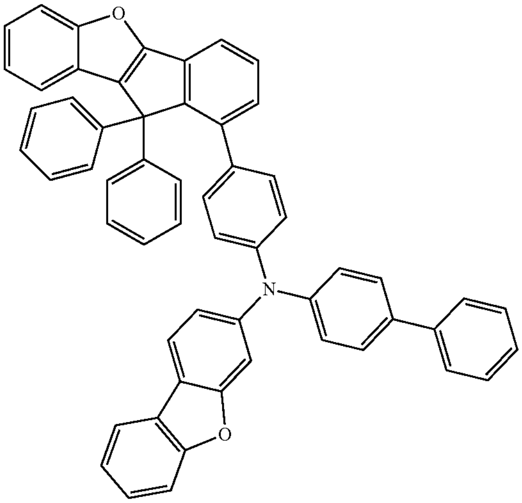

-continued
3-381
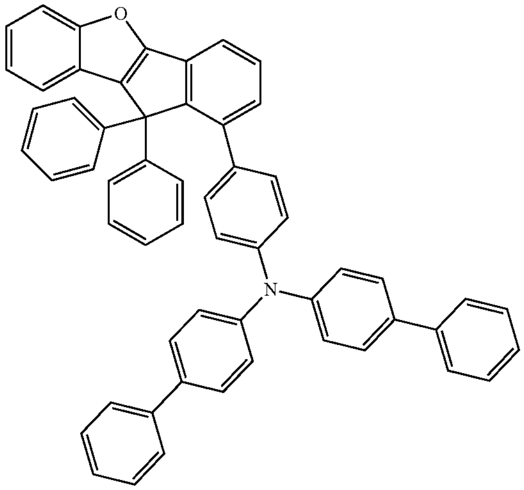
3-382
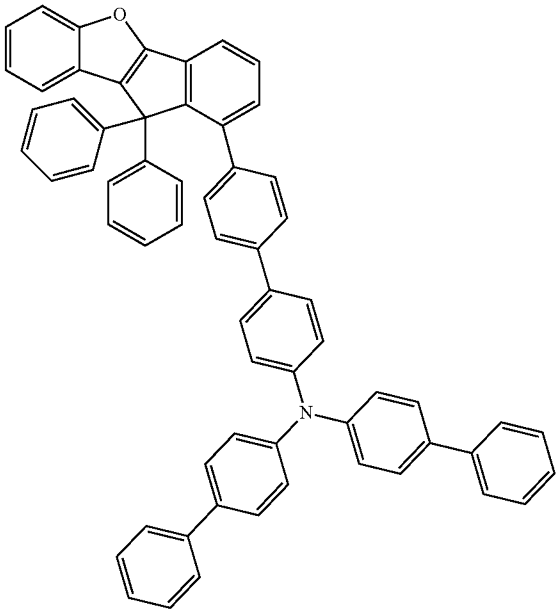
-continued
3-383
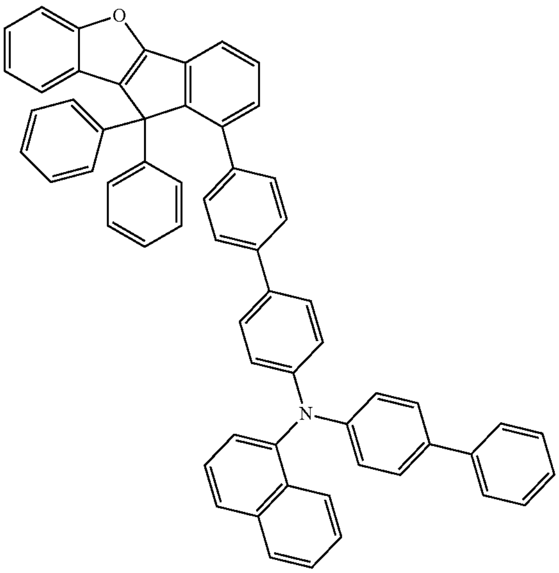
3-384
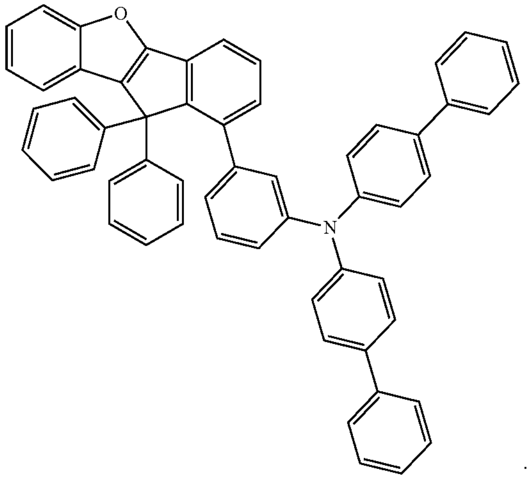
.
9. The organic light emitting device of claim 1, wherein Chemical Formula 4 is represented by any one of the following compounds:
4-1
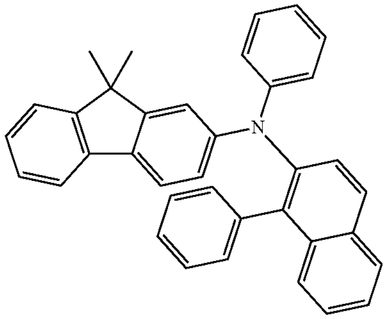

-continued
4-2
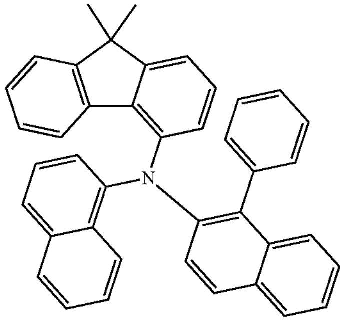
4-3
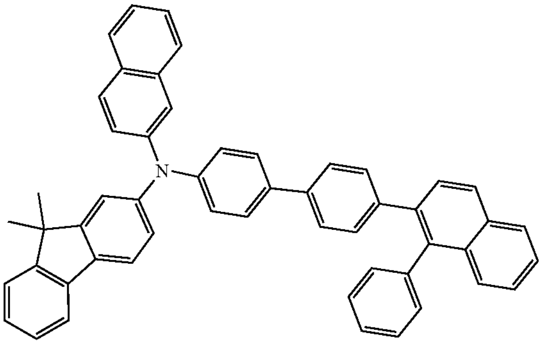
4-4
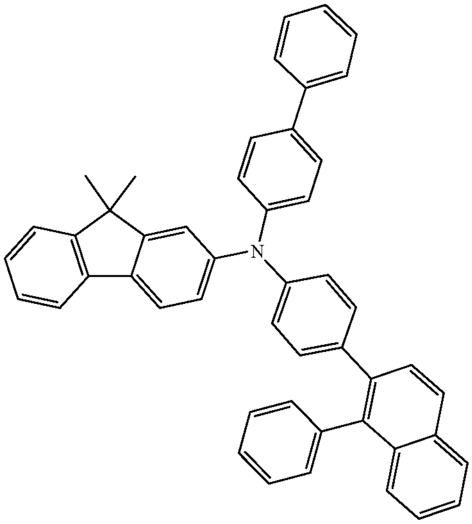
4-5
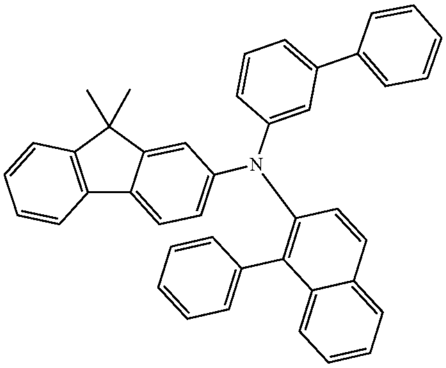
-continued
4-6
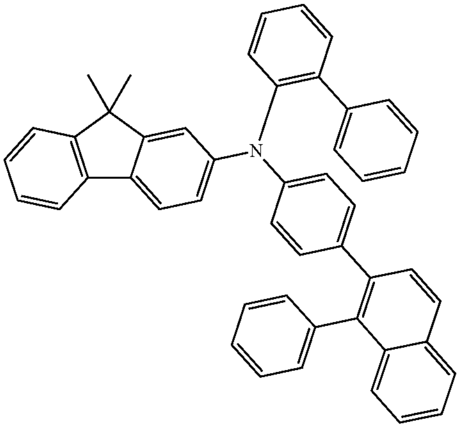
4-7
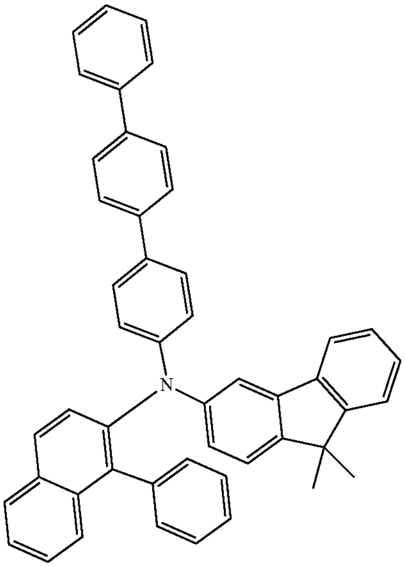
4-8
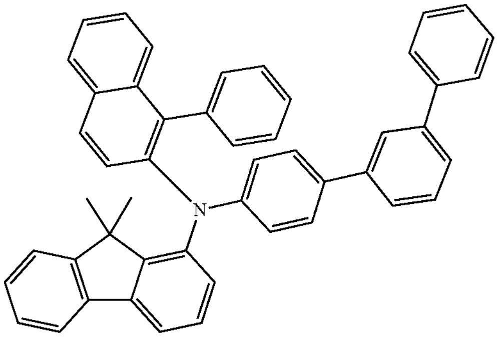

-continued
4-9
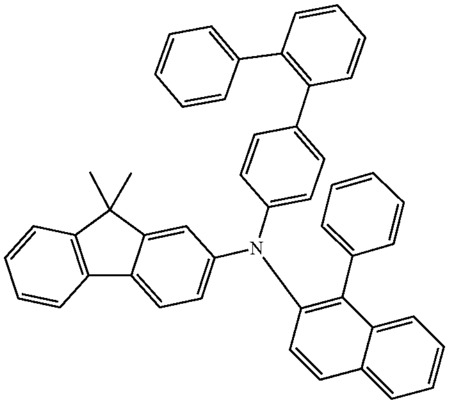
4-10
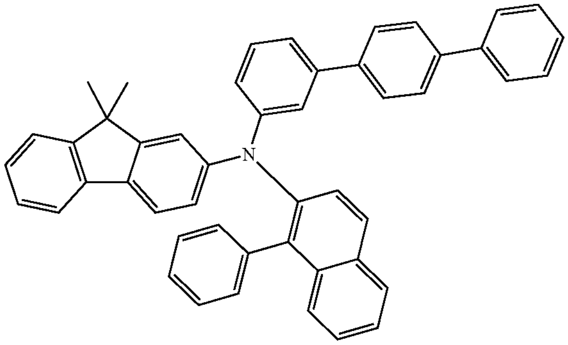
4-11
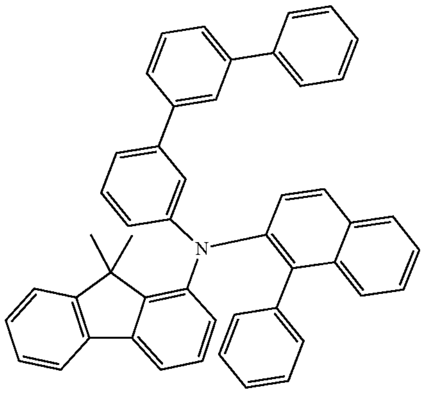
4-12
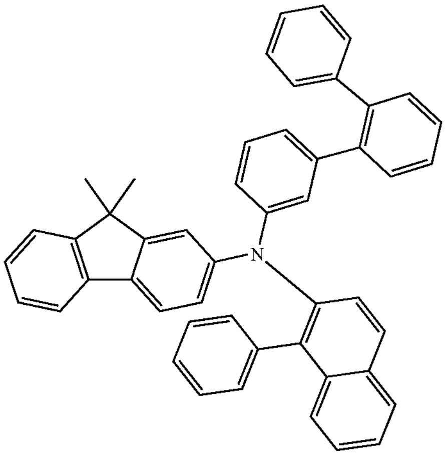
-continued
4-13
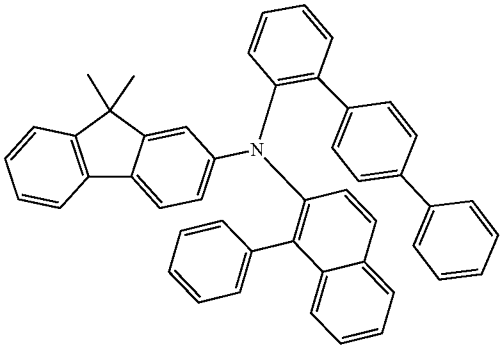
4-14
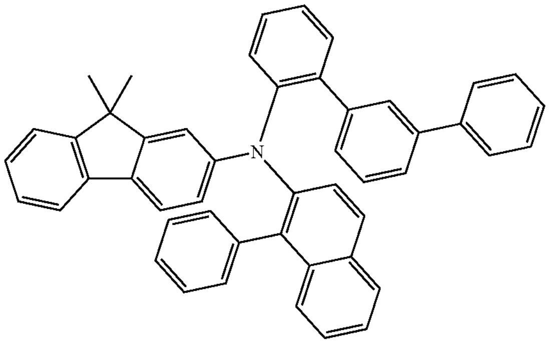
4-15
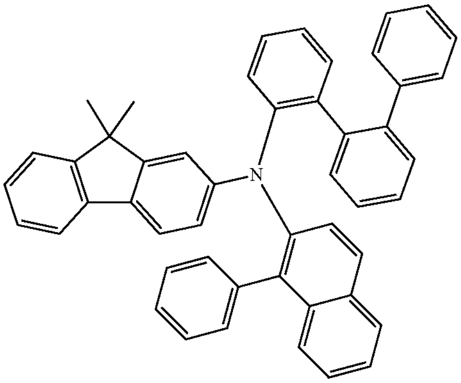
4-16
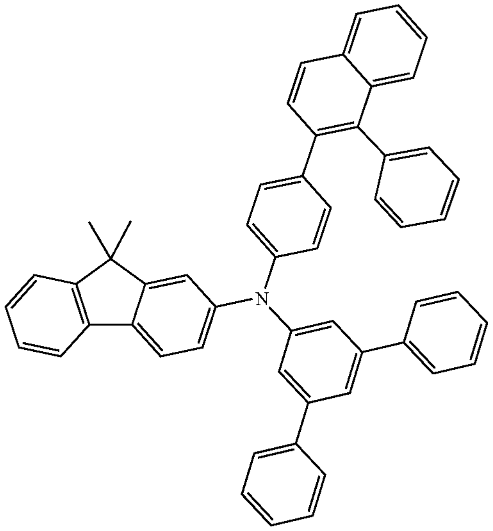

-continued
4-17
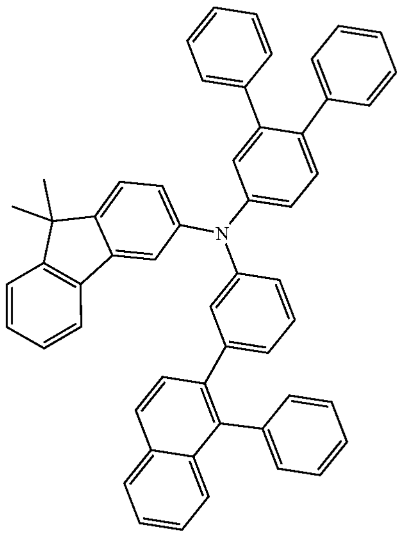
4-18
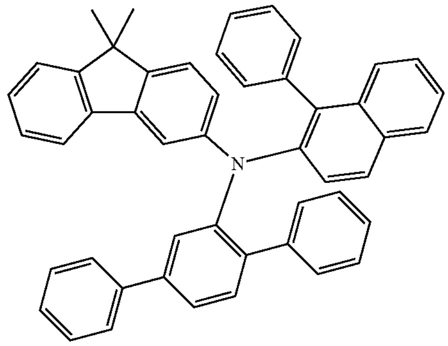
4-19
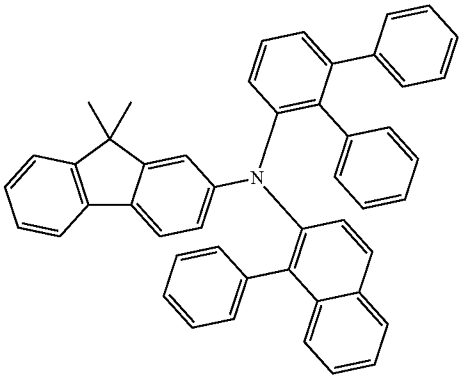
-continued
4-20
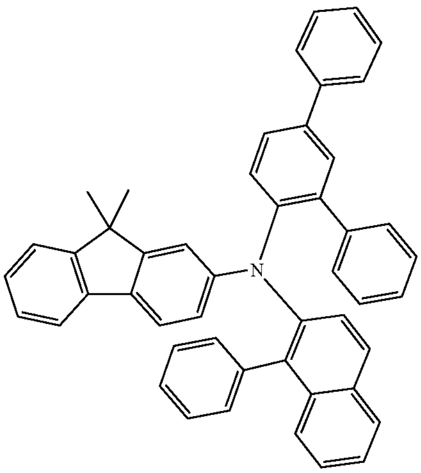
4-21
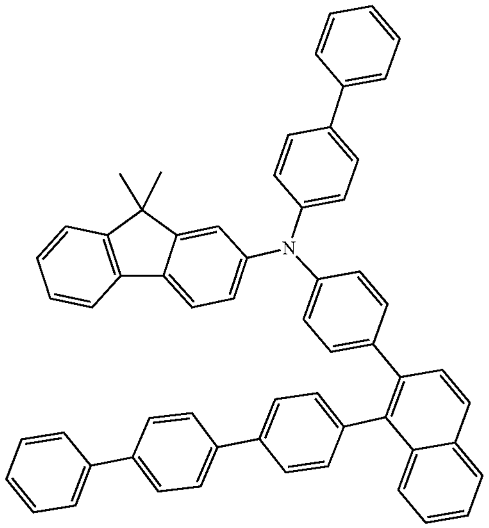
4-22
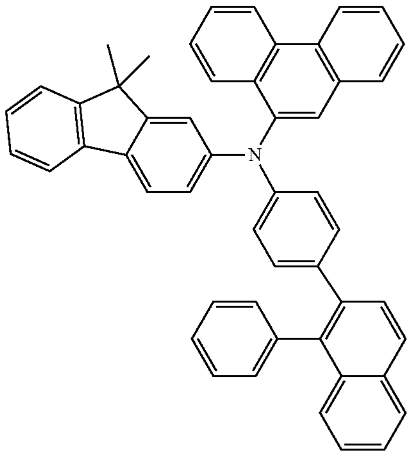

4-23
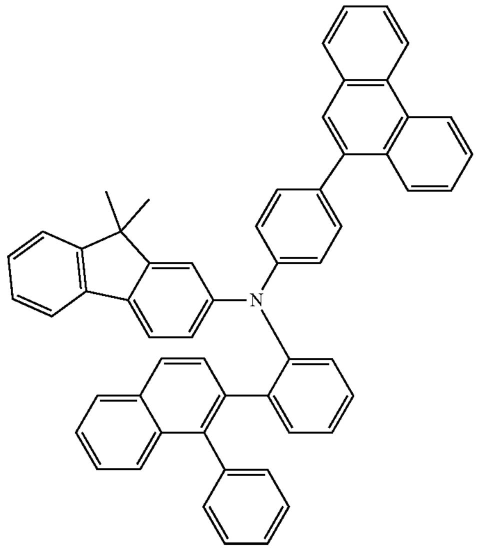
4-24
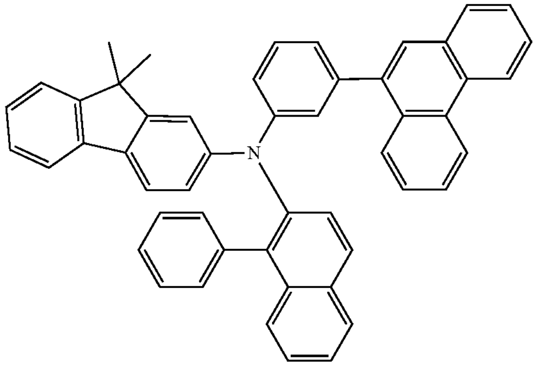
4-25
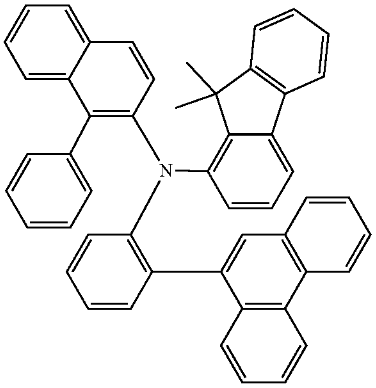
4-26
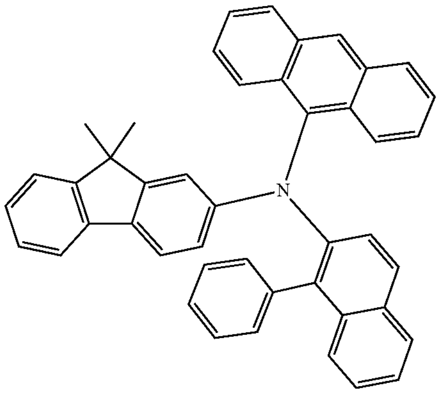
4-27
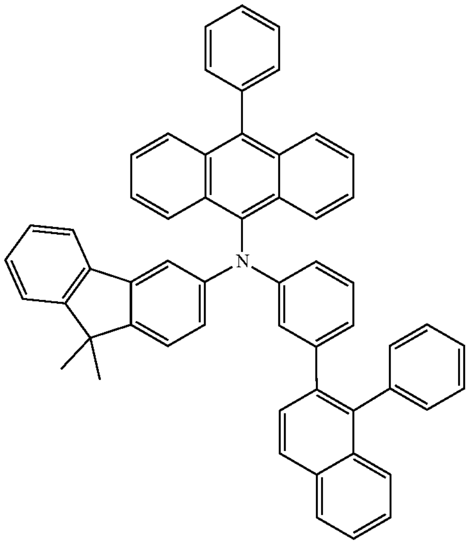
4-28
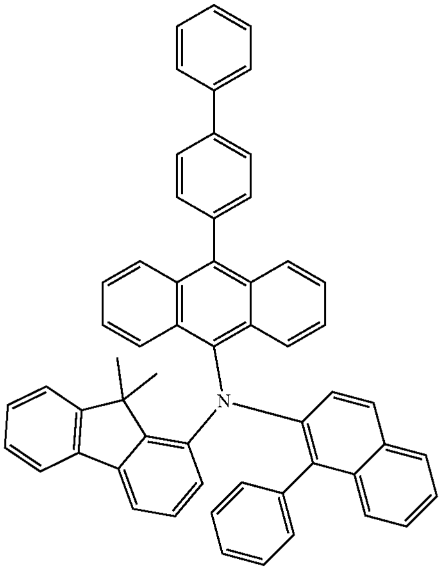

-continued
4-29
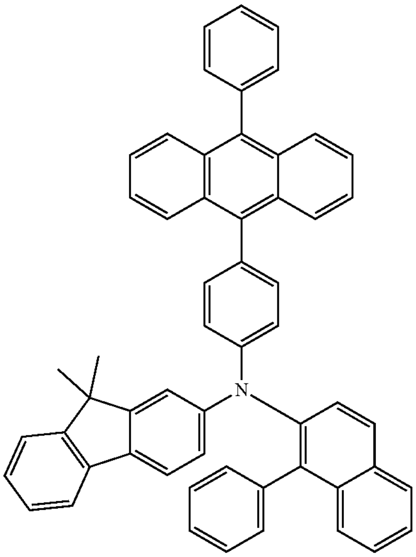
4-30
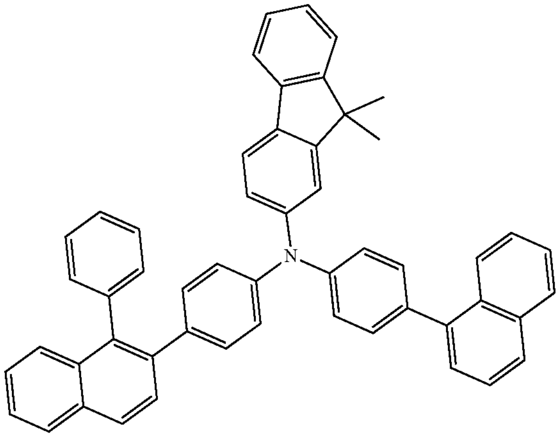
4-31
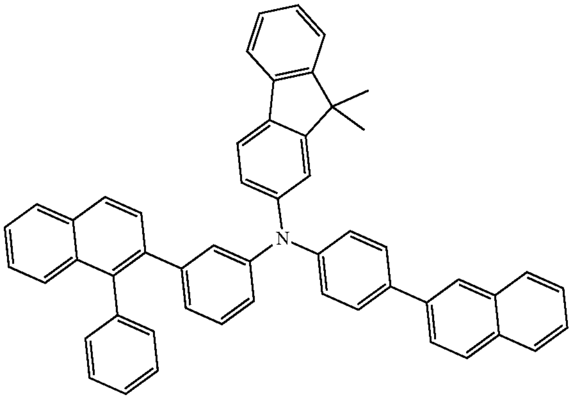
-continued
4-32
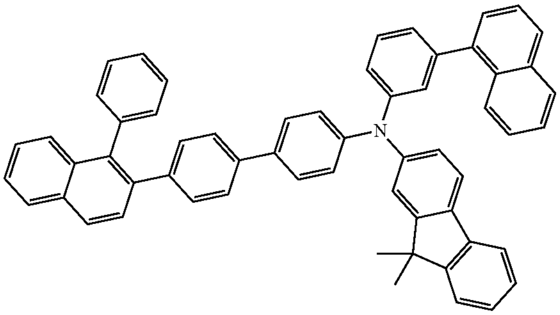
4-33
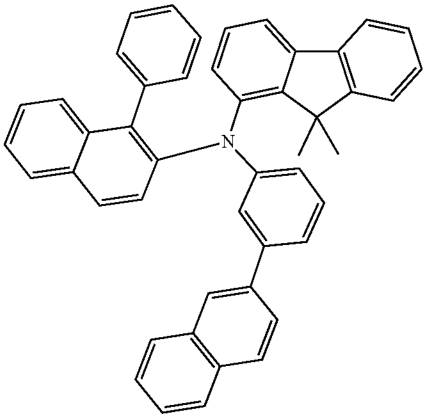
4-34
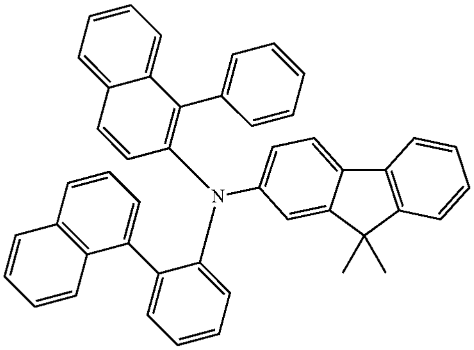
4-35
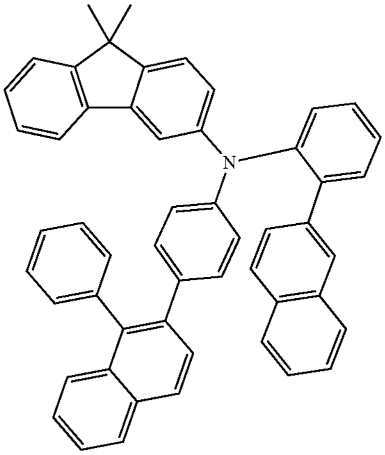

-continued
4-36
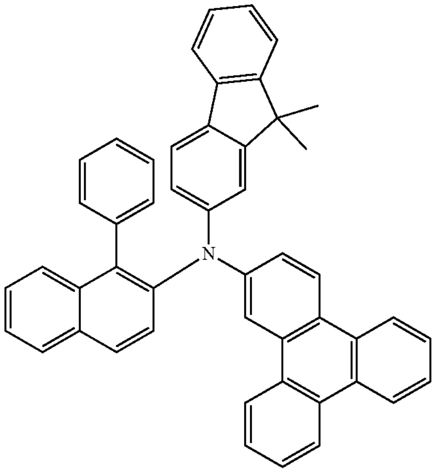
4-37
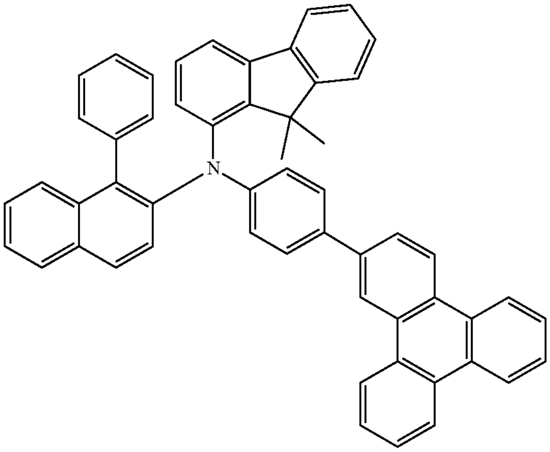
4-38
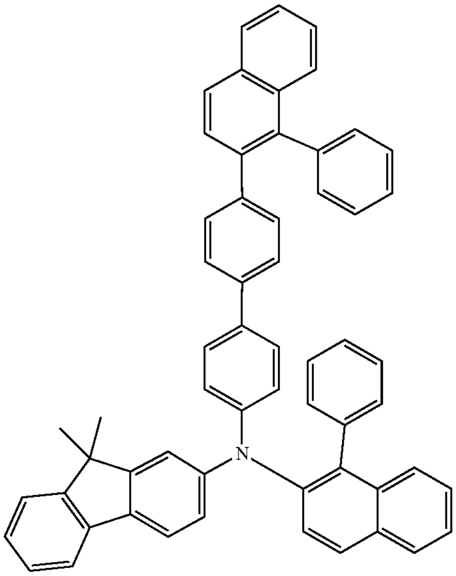
-continued
4-39
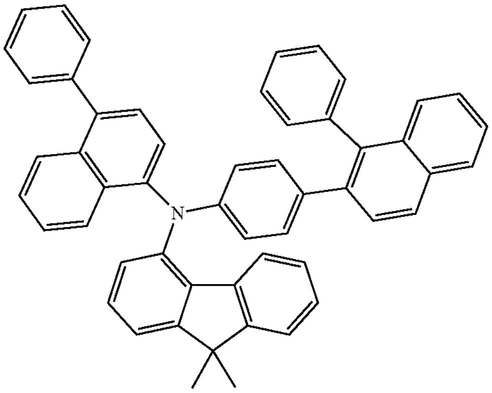
4-40
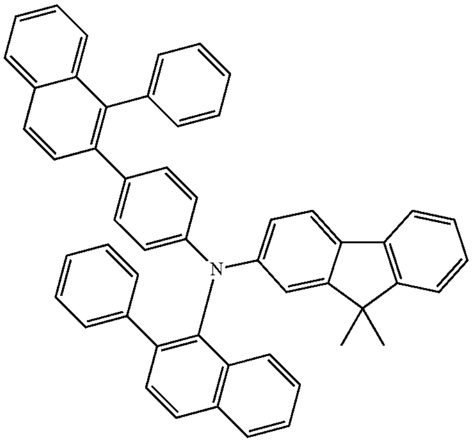
4-41
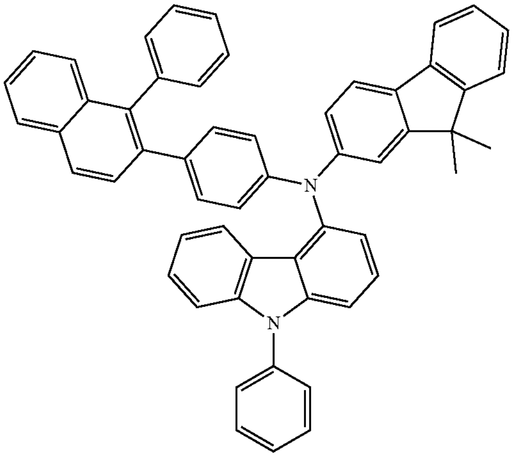

-continued
4-42
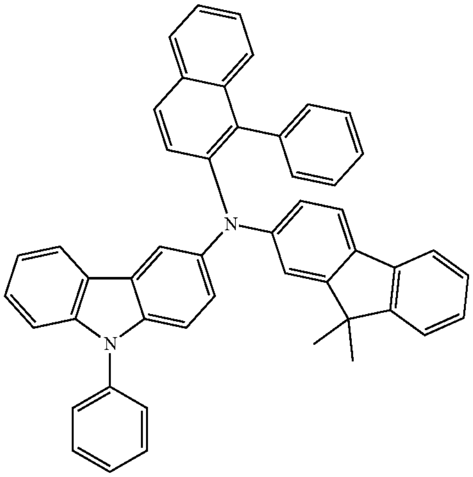
4-43
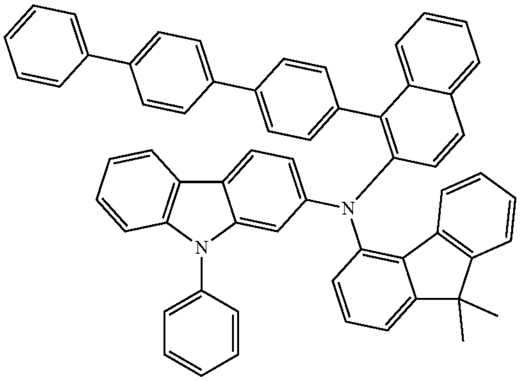
4-44
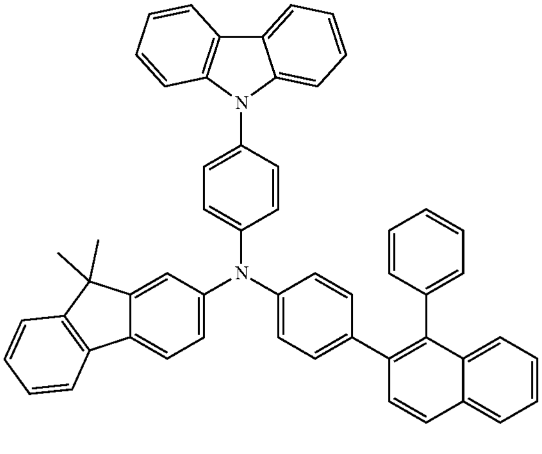
-continued
4-45
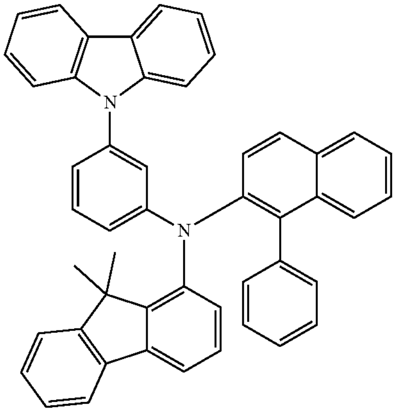
4-46
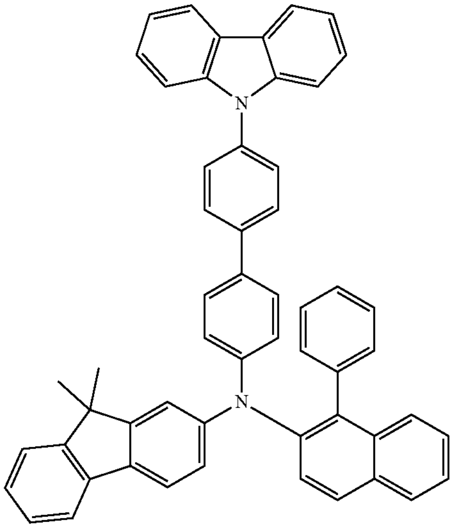
4-47
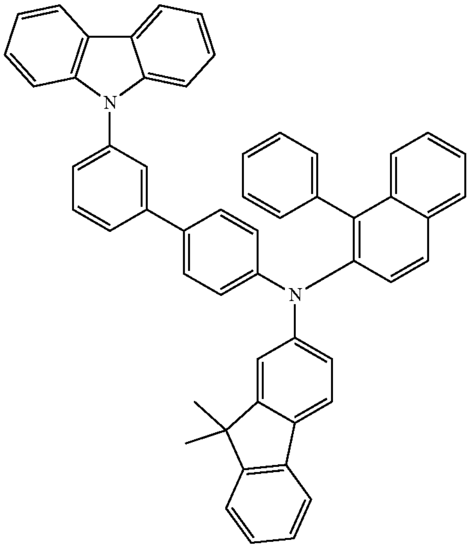

-continued
4-48
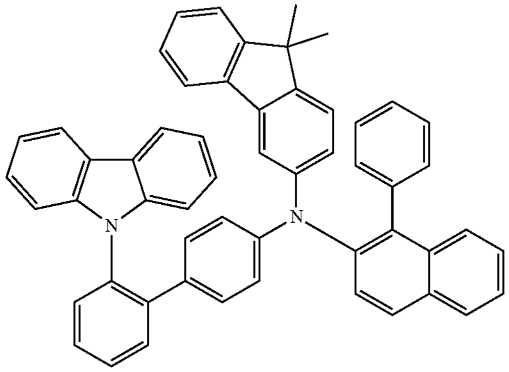
4-49
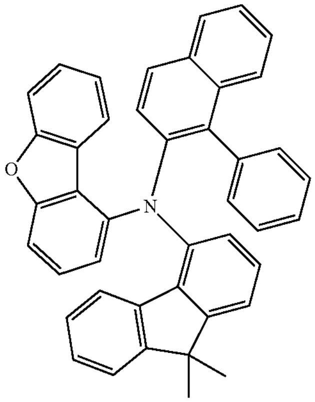
4-50
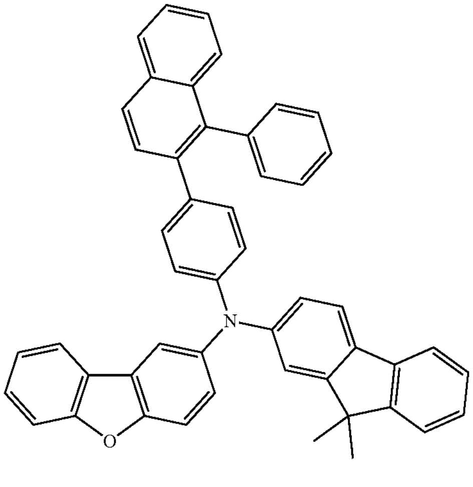
-continued
4-51
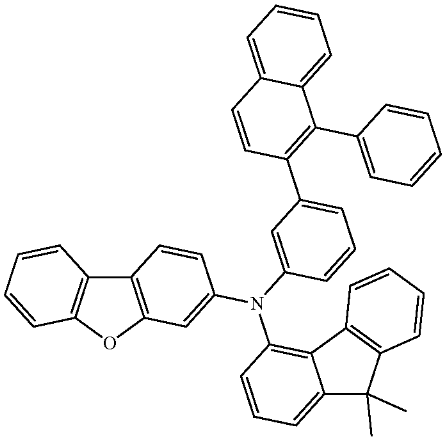
4-52
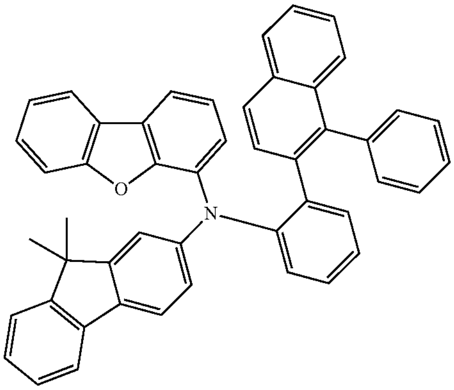
4-53
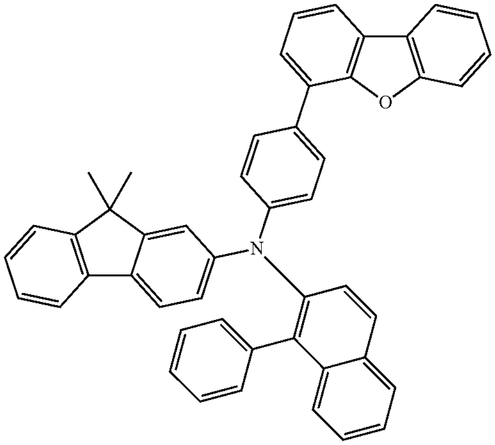

4-54
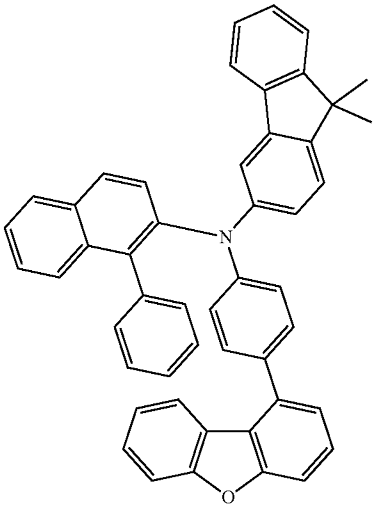
4-55
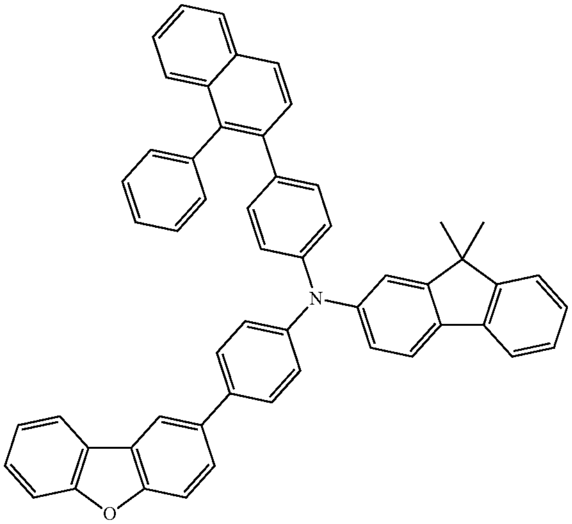
4-56
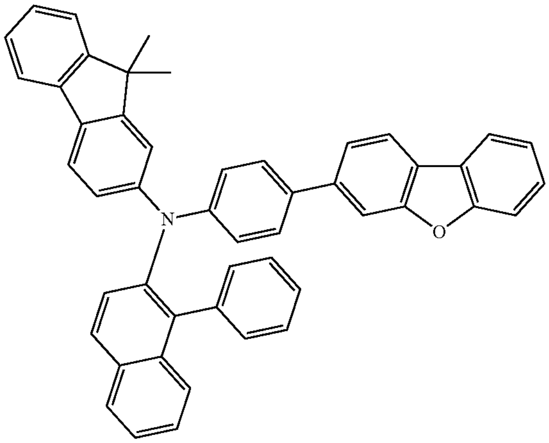
4-57
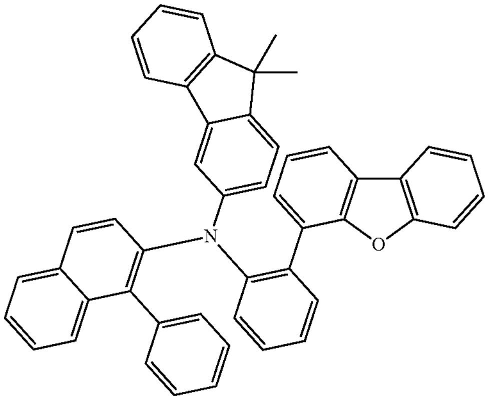
4-58
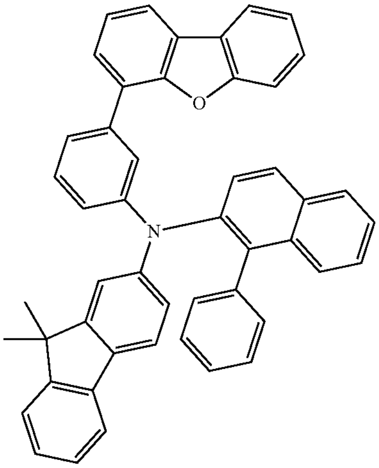
4-59
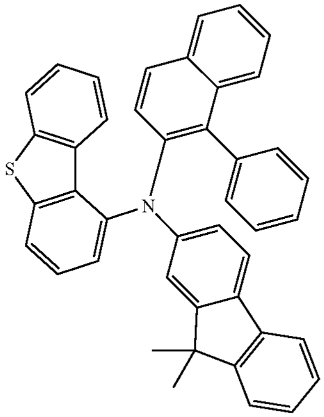

-continued
4-60
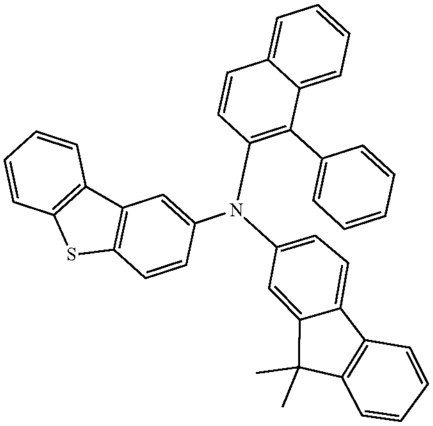
4-61
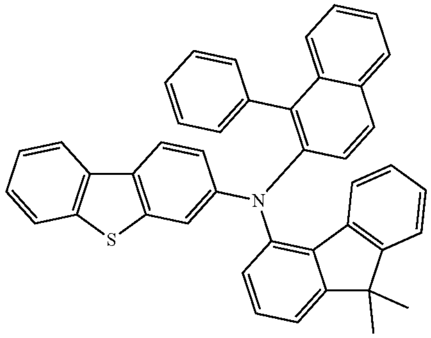
4-62
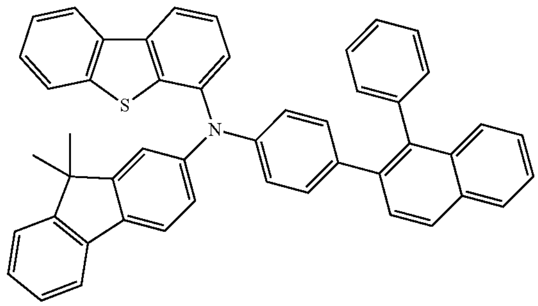
4-63
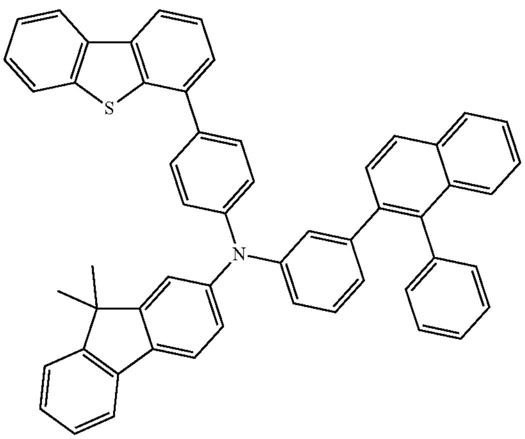
-continued
4-64
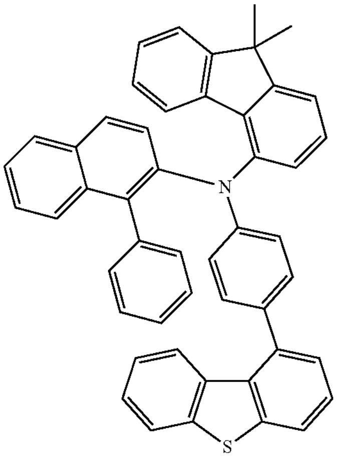
4-65
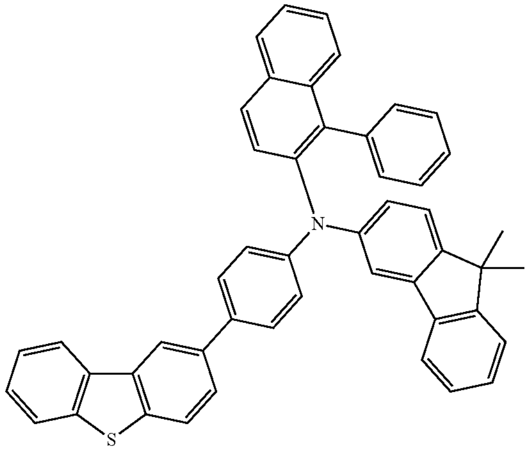
4-66
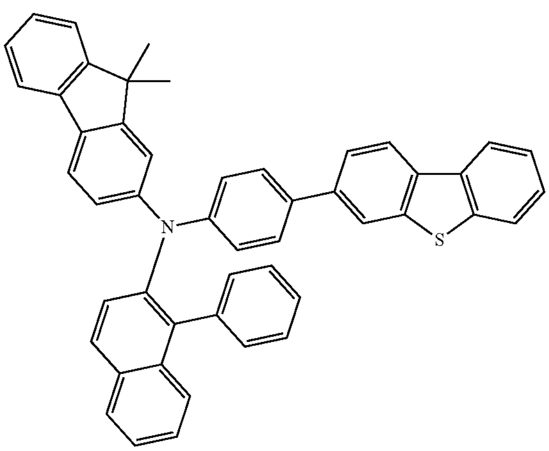

-continued
4-67
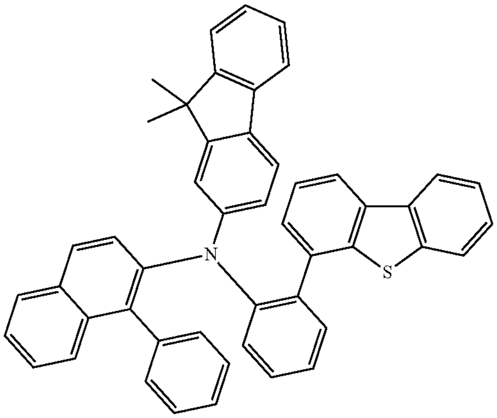
4-68
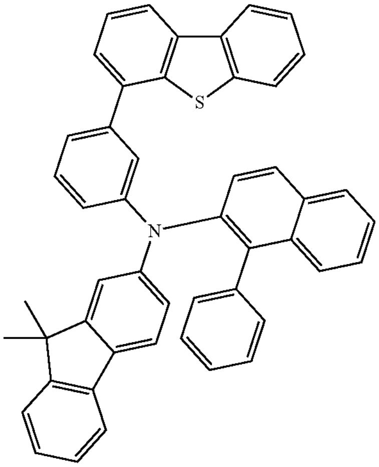
4-69
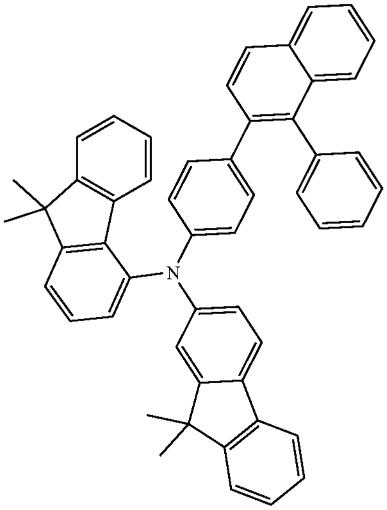
-continued
4-70
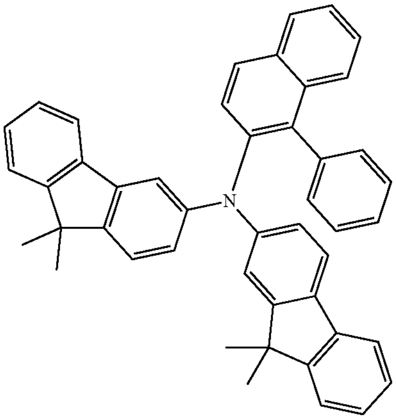
4-71
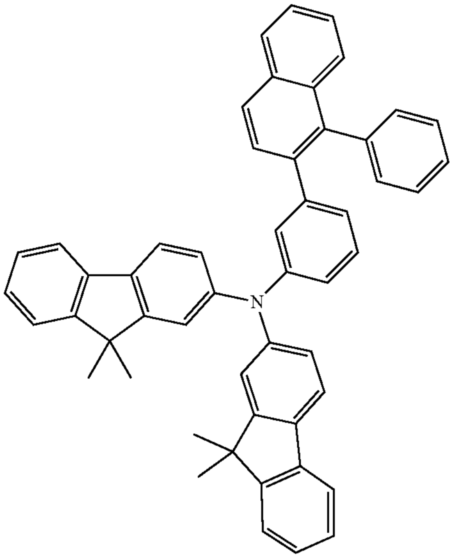
4-72
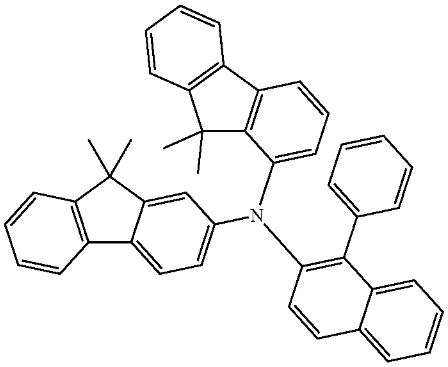

-continued
4-73
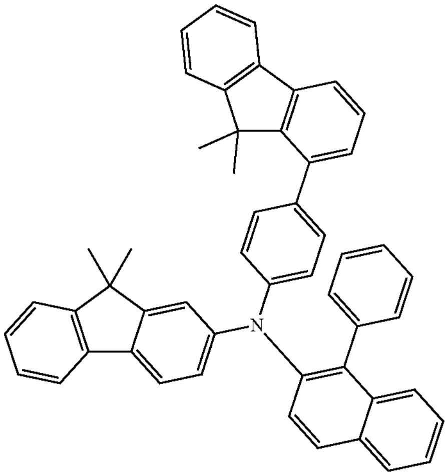
4-74
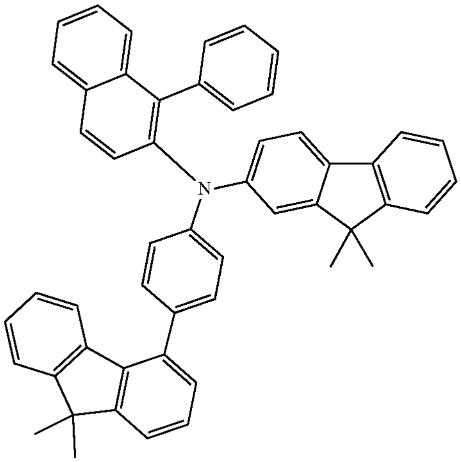
4-75
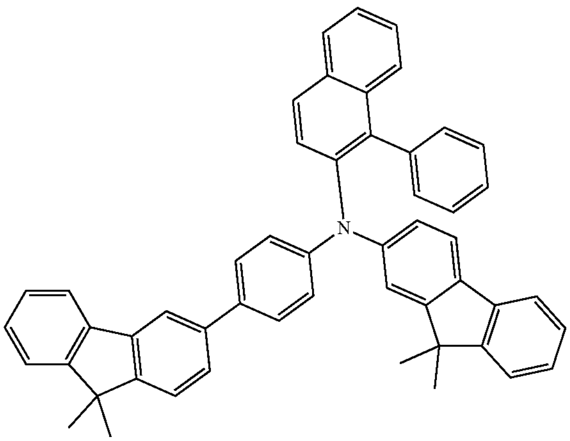
-continued
4-76
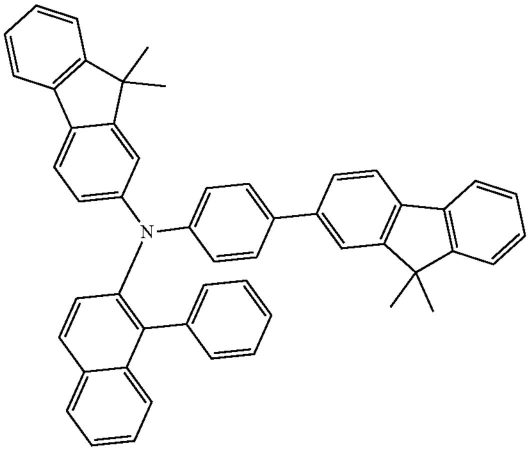
4-77
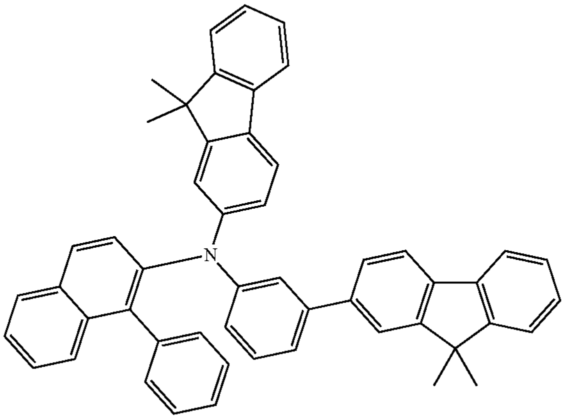
4-78
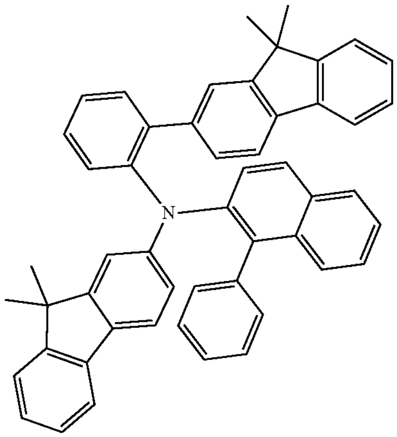

-continued
4-79
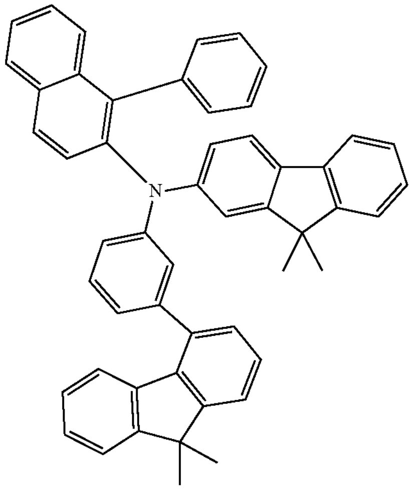
4-80
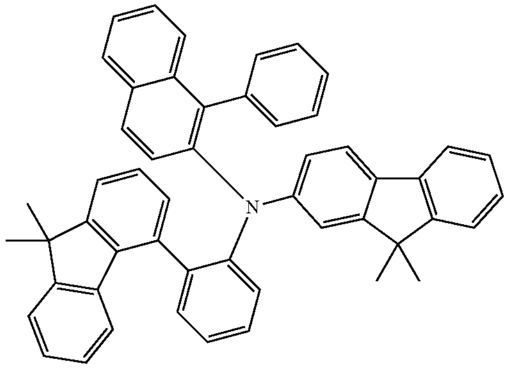
4-81
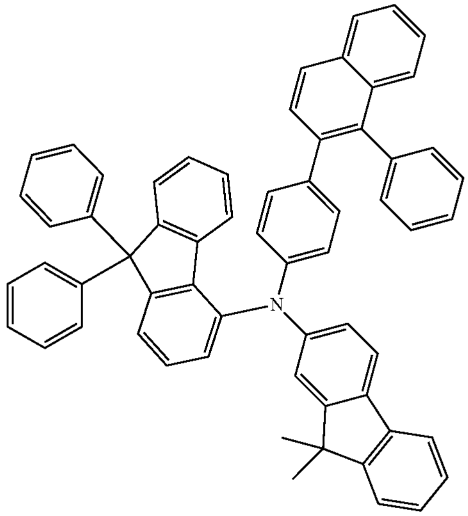
-continued
4-82
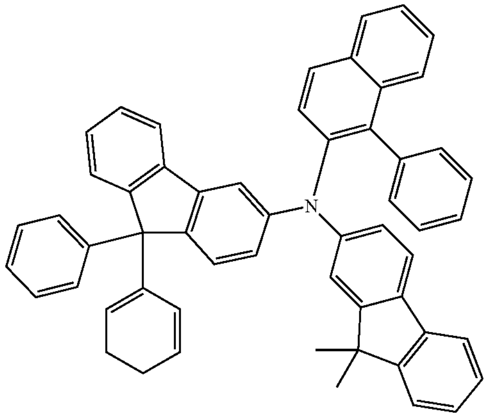
4-83
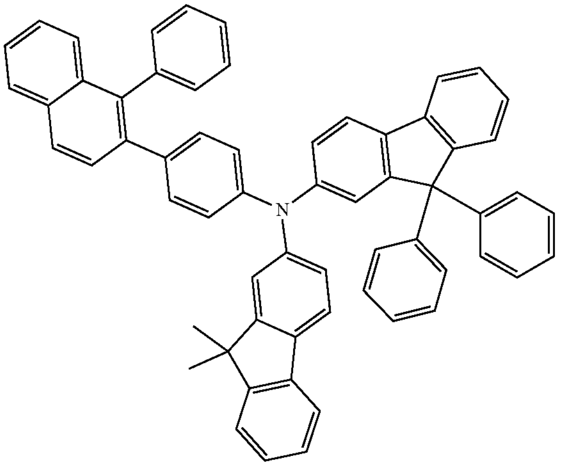
4-84
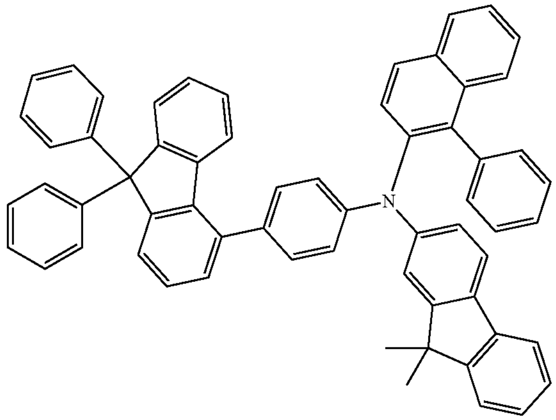

4-85
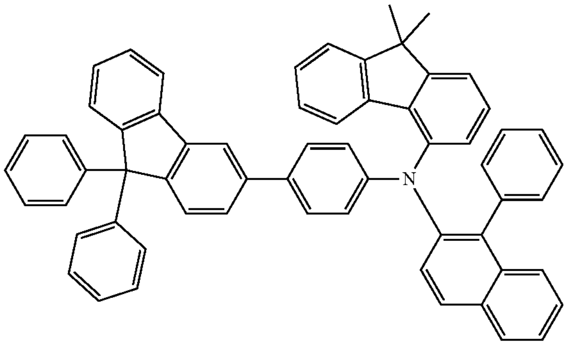
4-86
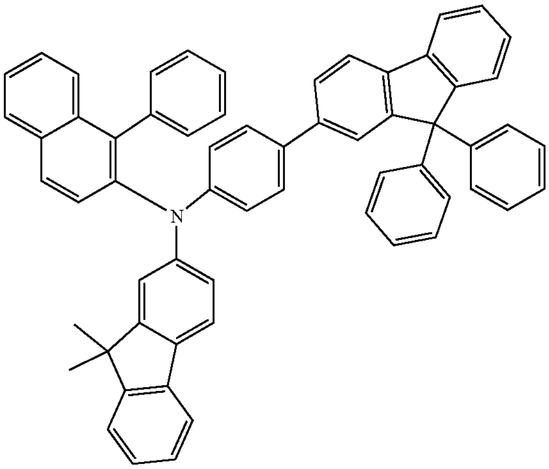
4-87
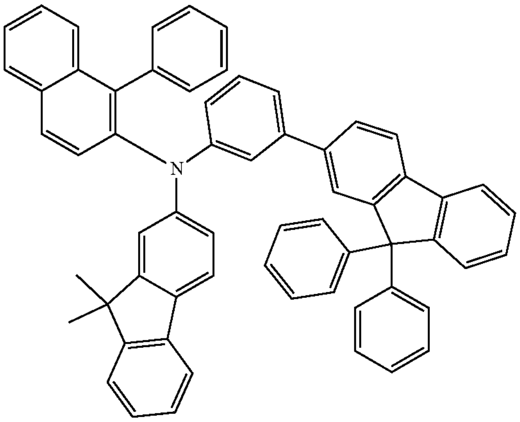
4-88
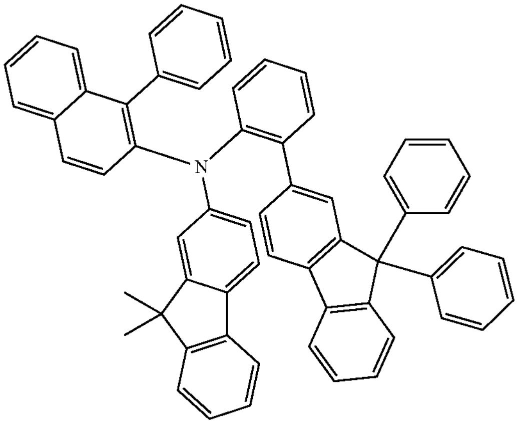
4-89
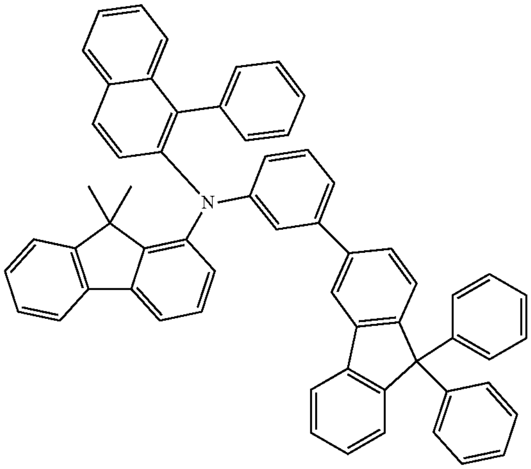
4-90
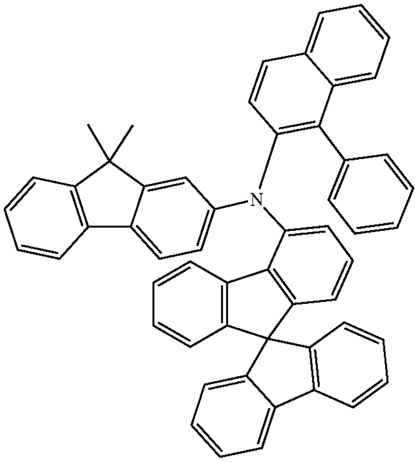

4-91
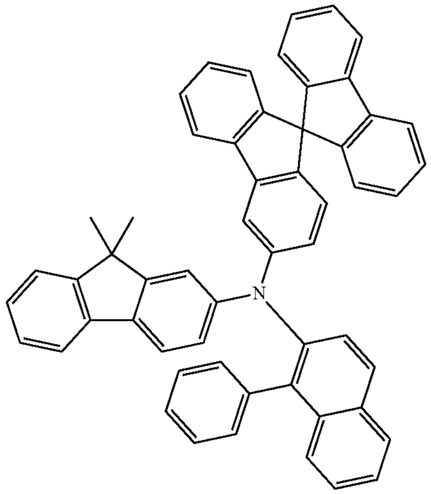
4-92
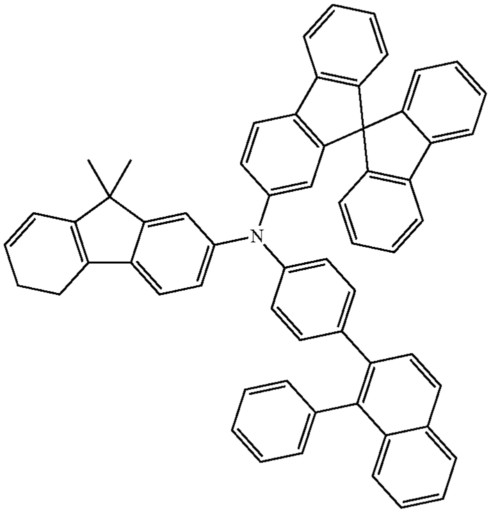 [SMILES: CC1(C)c2ccccc2-c2ccc(N(c3ccc(-c4ccc5ccccc5c4-c4ccccc4)cc3)c3ccc4c(c3)C3(c5ccccc5-c5ccccc53)c3ccccc3-4)cc21]
4-93
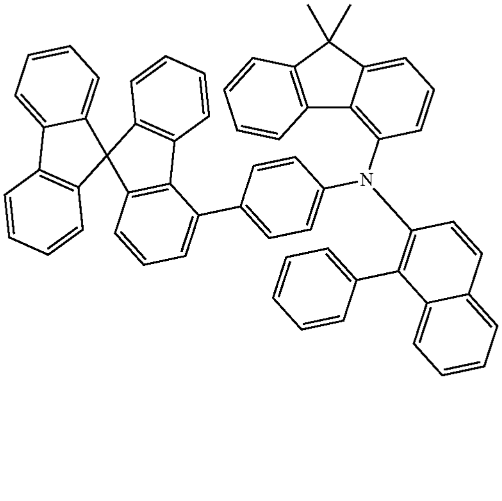
4-94
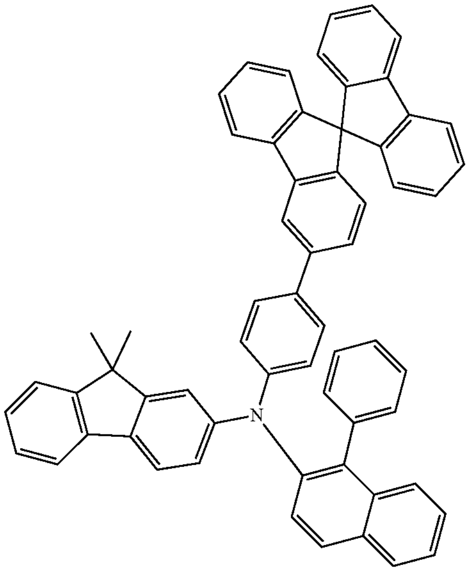
4-95
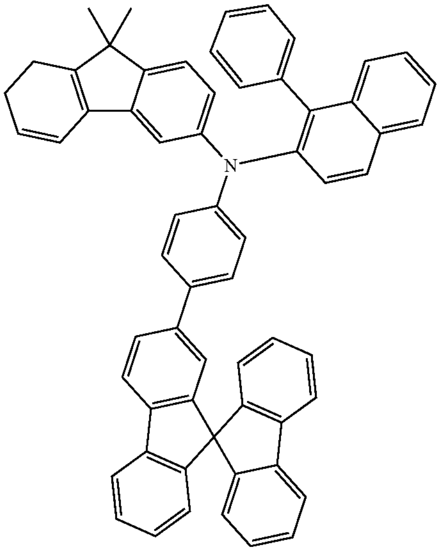
4-96
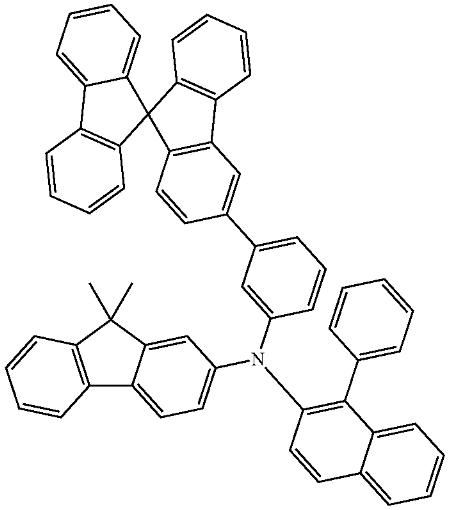

-continued
4-97
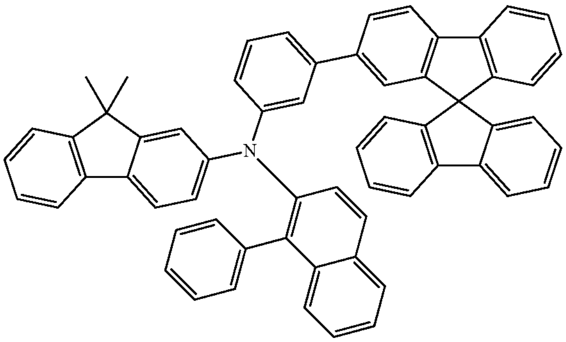
4-98
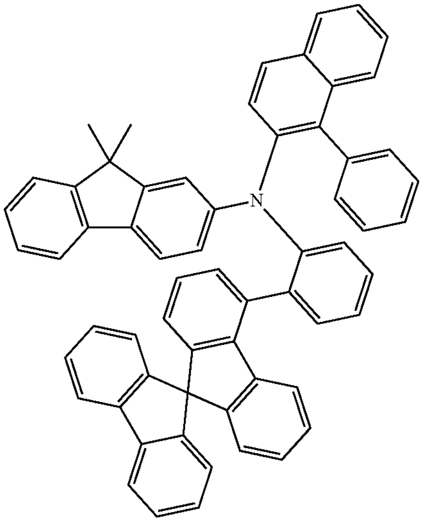
4-99
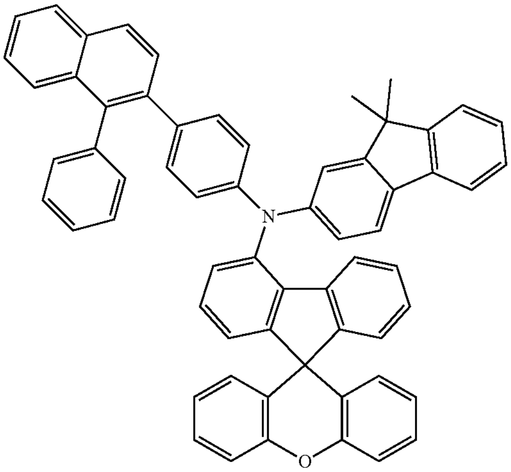
-continued
4-100
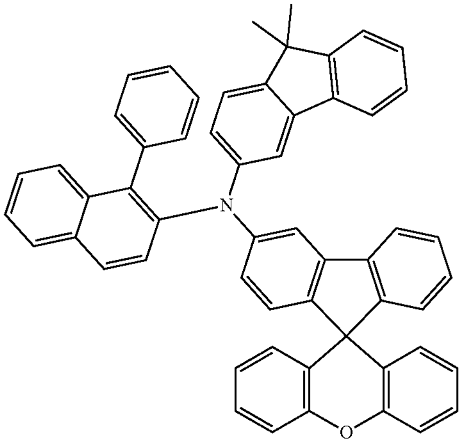
4-101
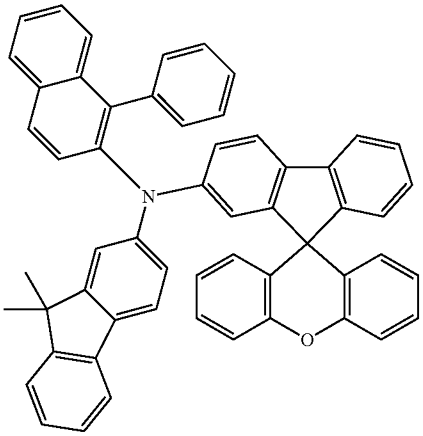
4-102
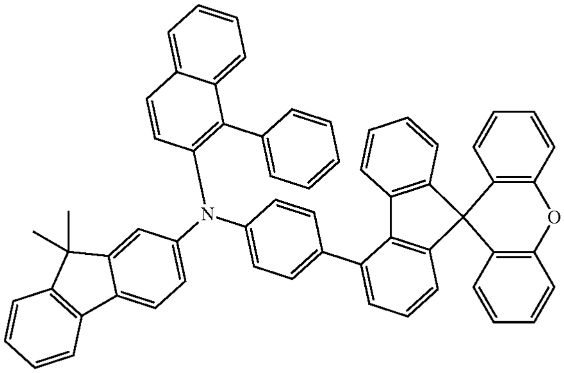

4-103
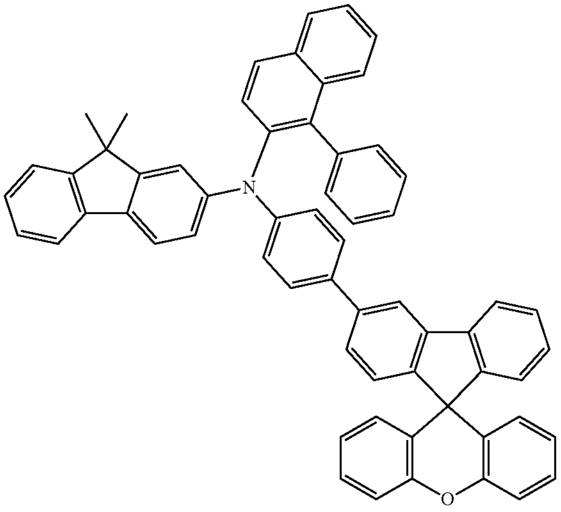
4-104
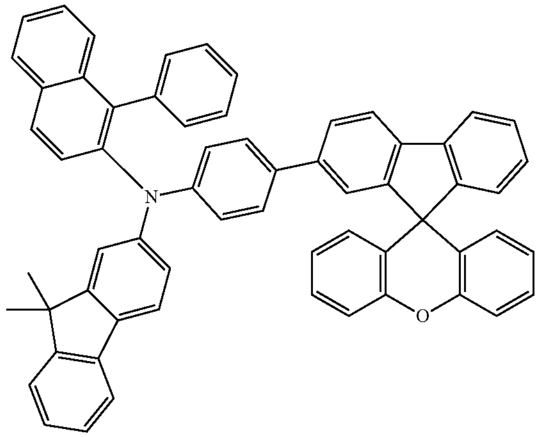
4-105
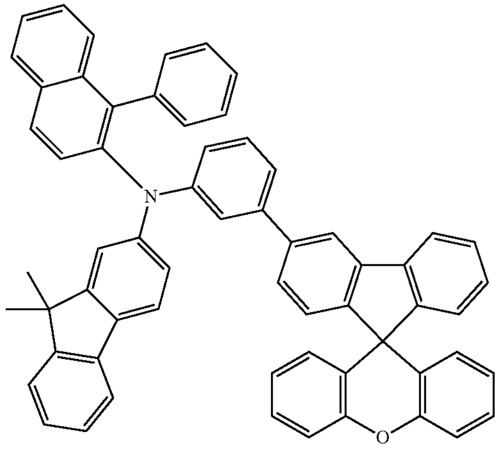
4-106
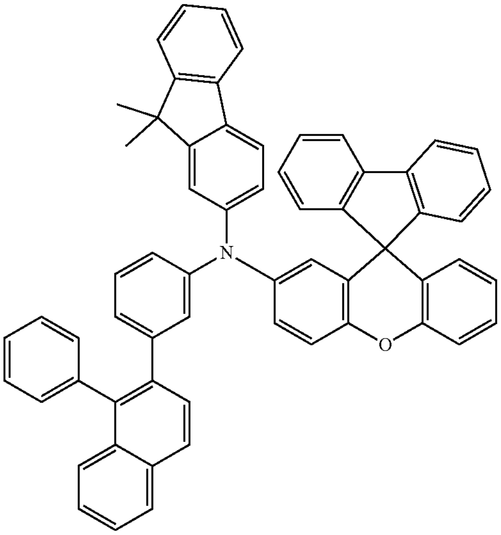
4-107
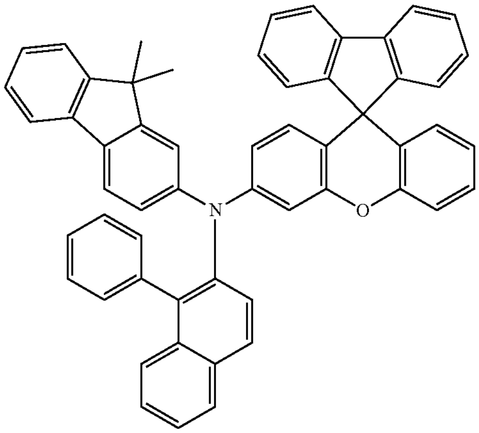
4-108
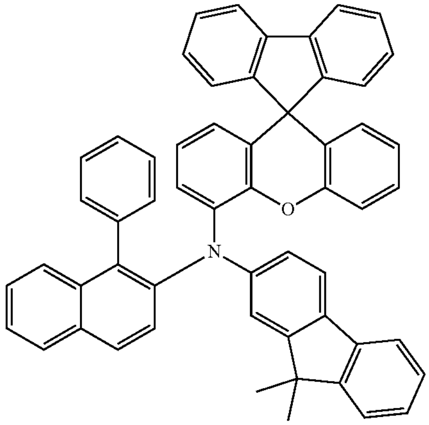

-continued
4-109
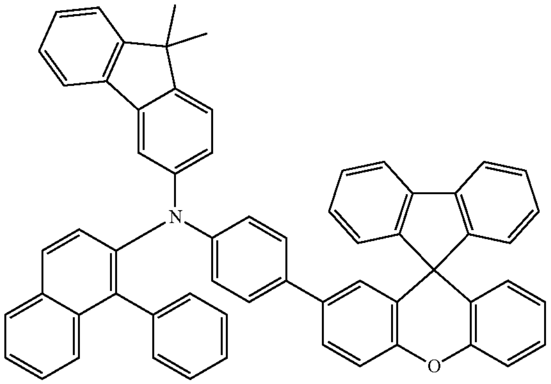
4-110
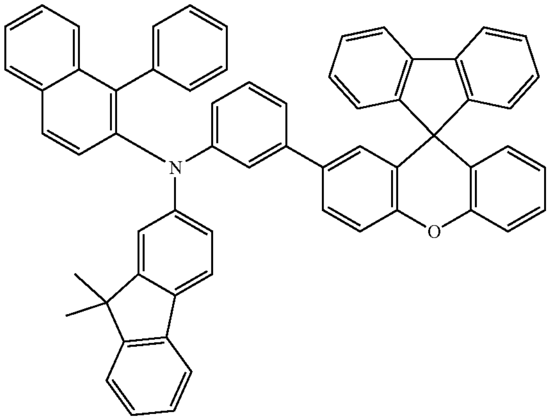
4-111
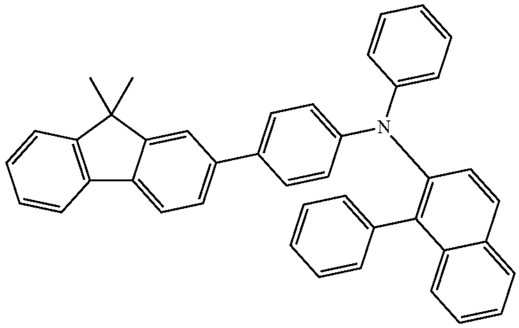
4-112
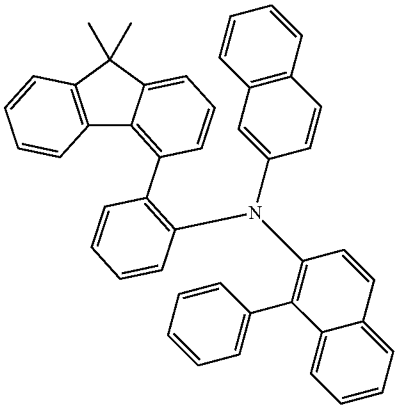
-continued
4-113
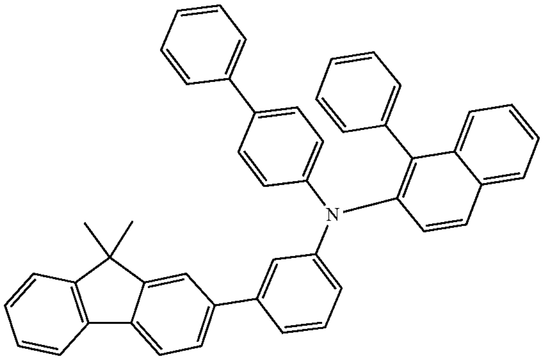
4-114
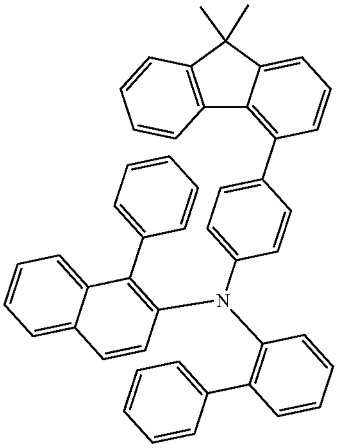
4-115
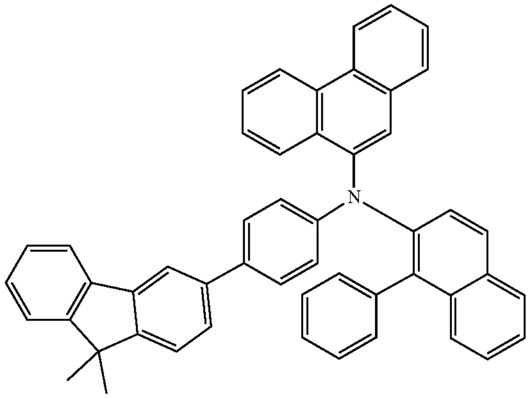

-continued
4-116
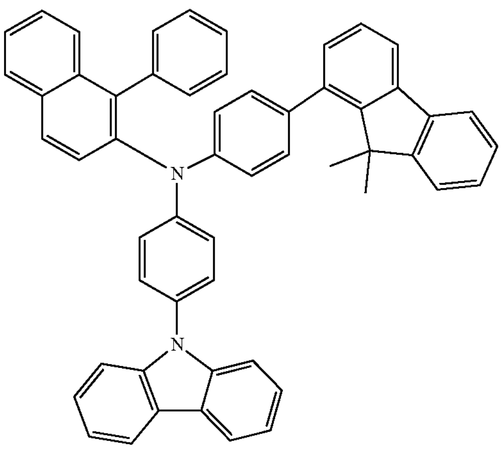
4-117
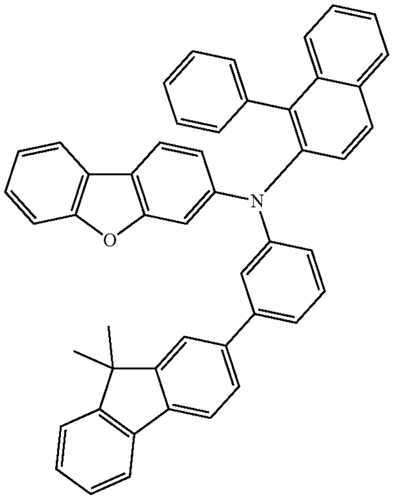
4-118
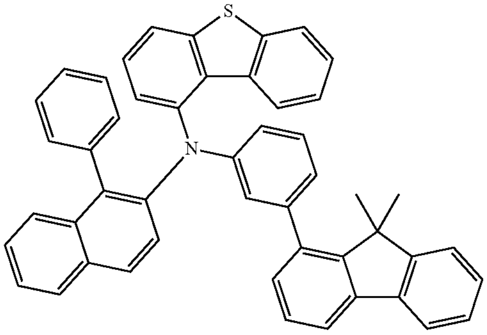
-continued
4-119
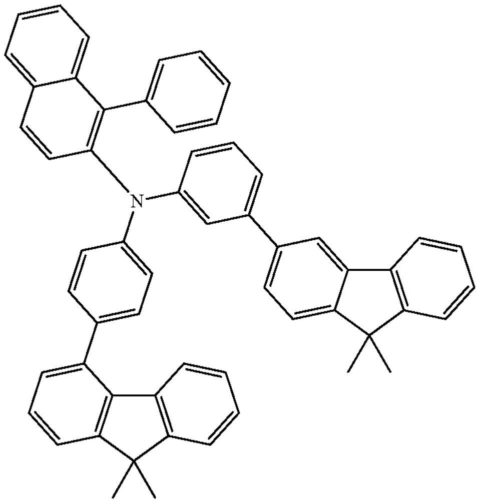
4-120
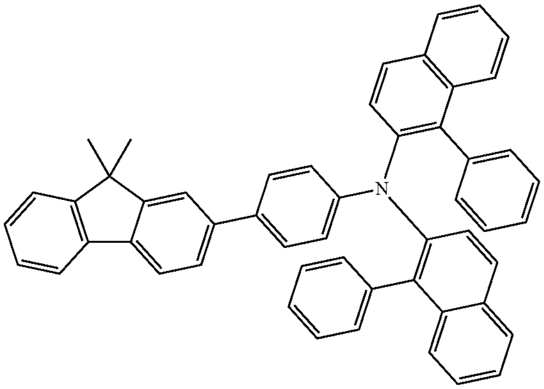
4-121
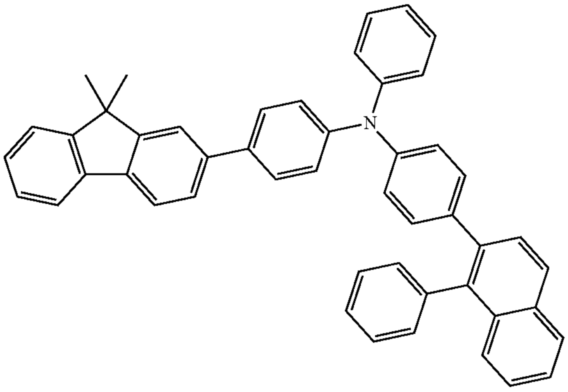

-continued
4-122
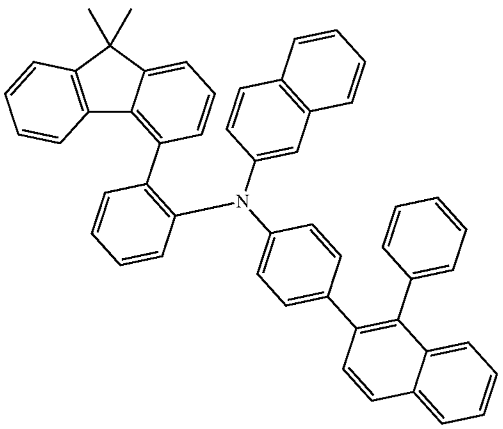
4-123
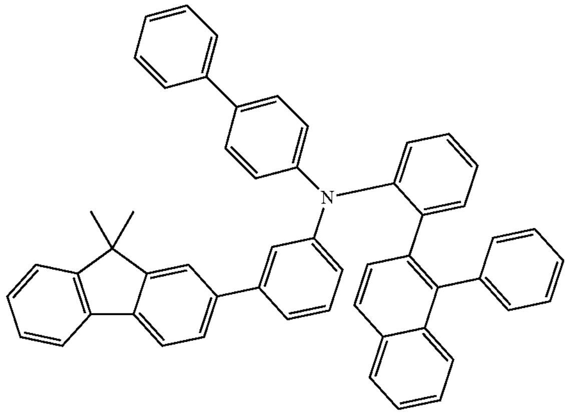
4-124
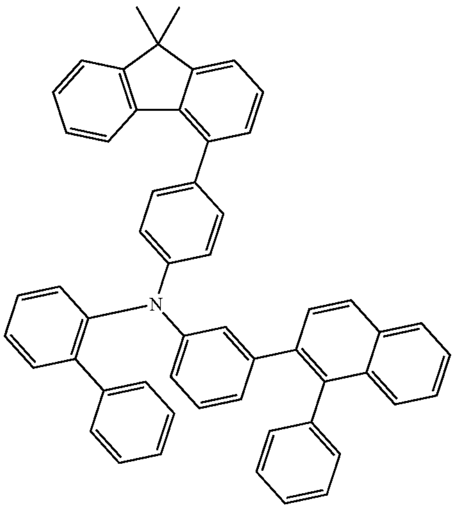
-continued
4-125
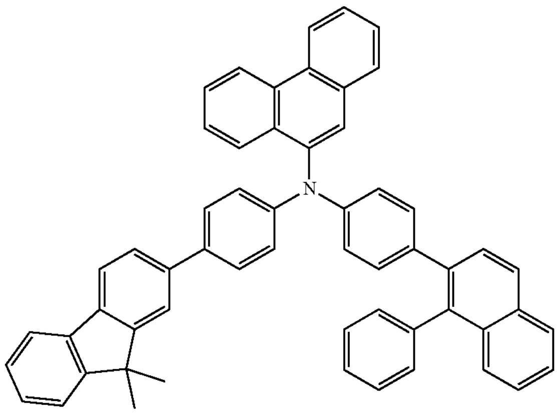
4-126
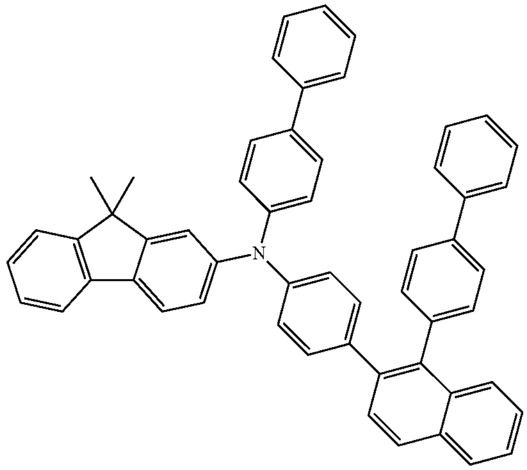
4-127
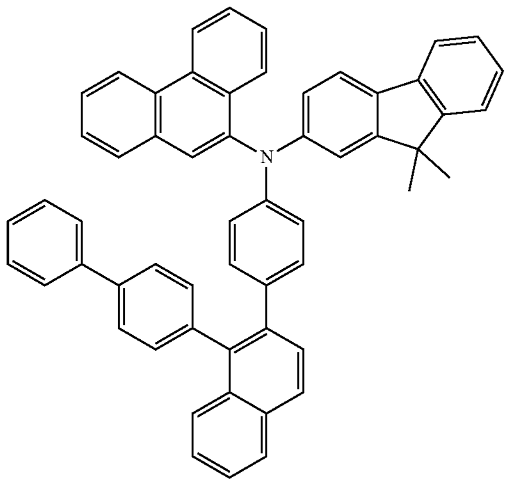

-continued
4-128
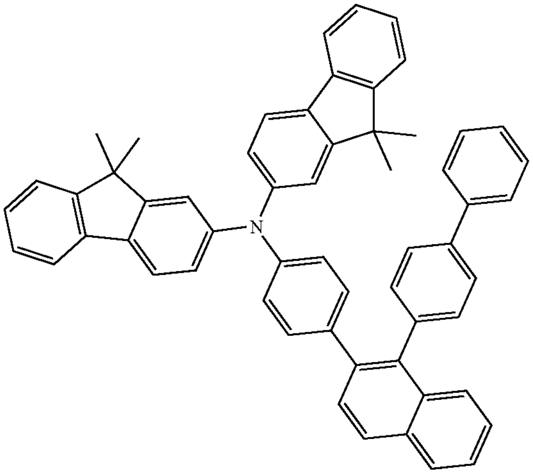
4-129
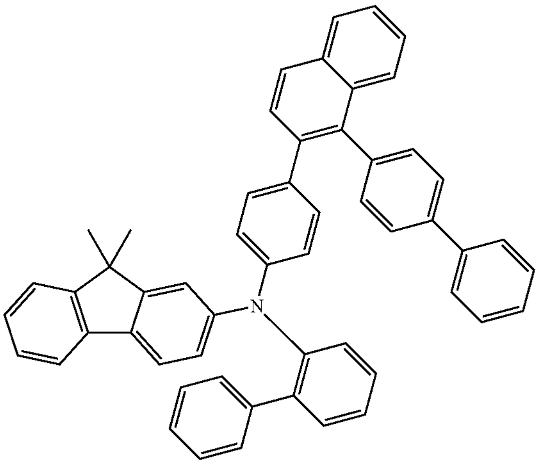
4-130
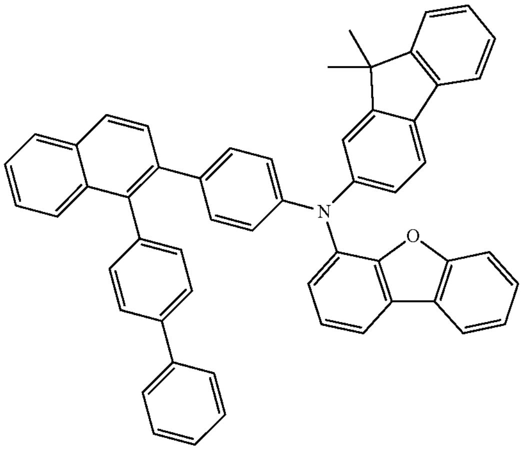
-continued
4-131
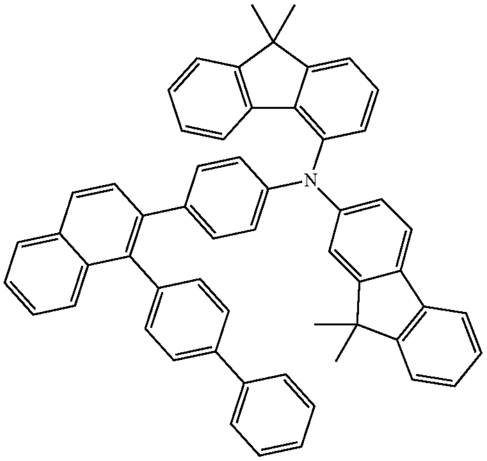
4-132
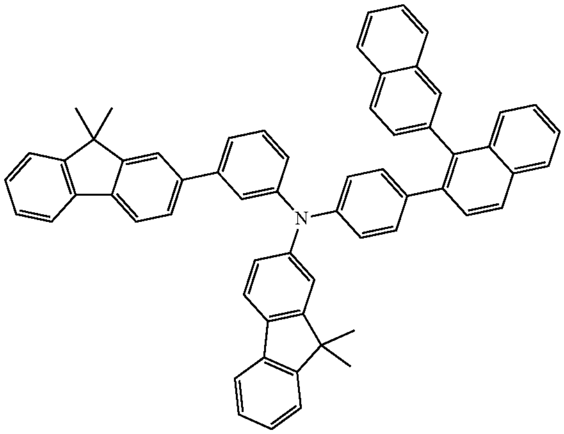
4-133
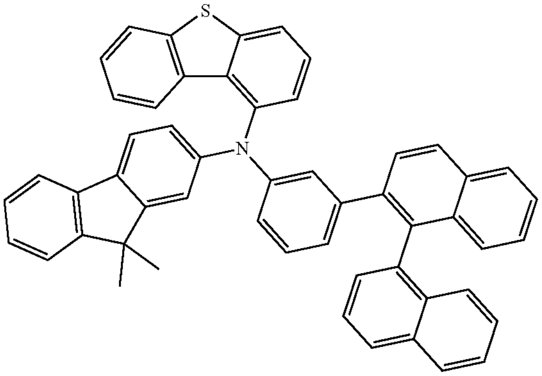
4-134
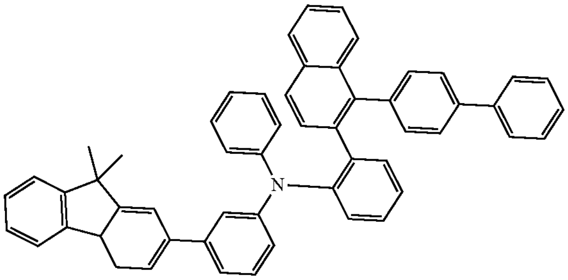

-continued
4-135
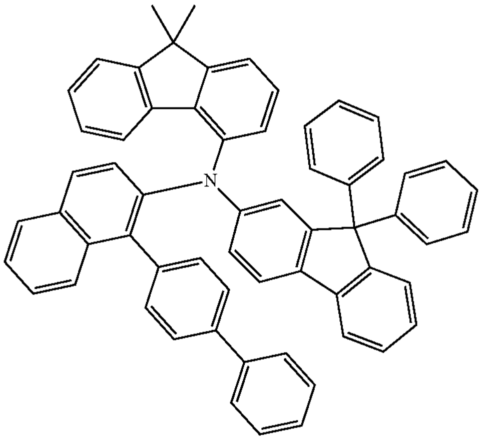
4-136
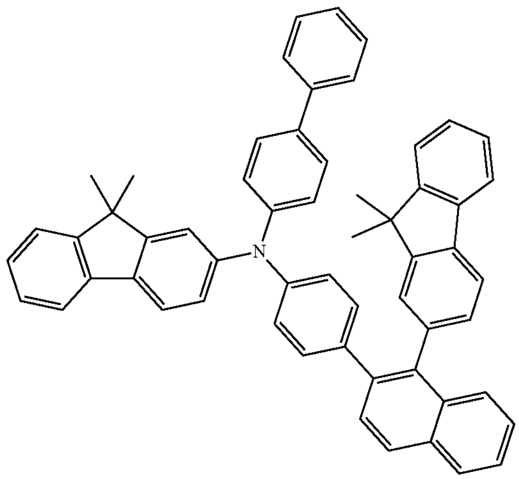
4-137
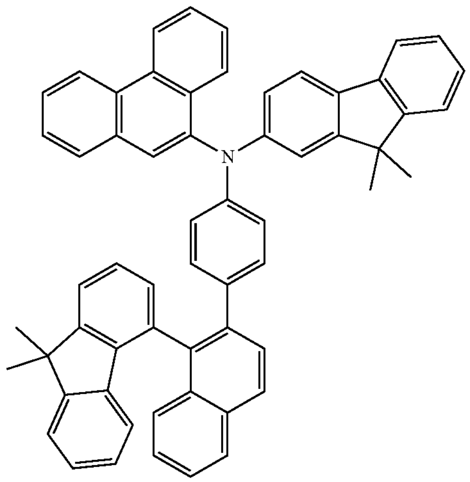
-continued
4-138
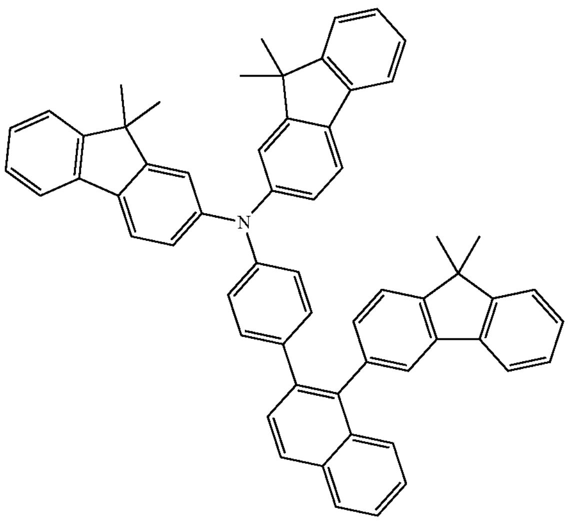
4-139
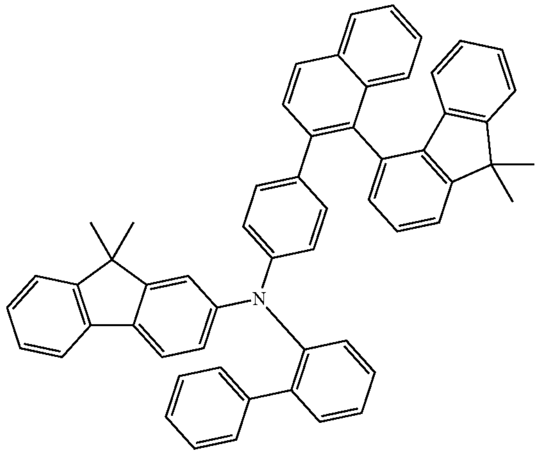
4-140
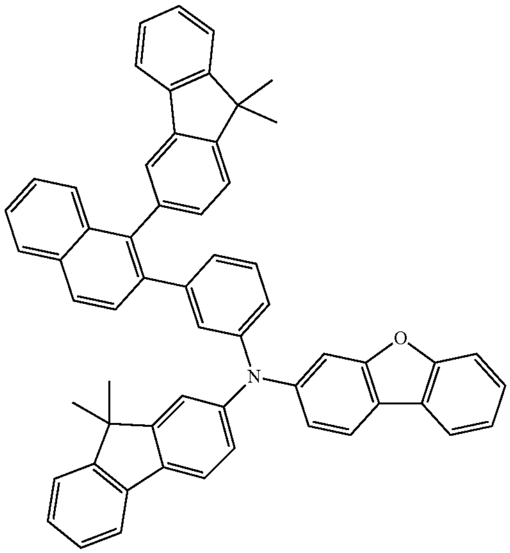

-continued
4-141
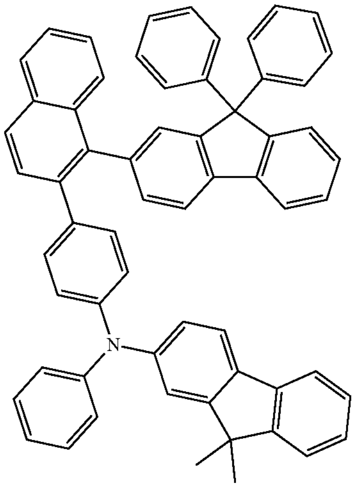
4-142
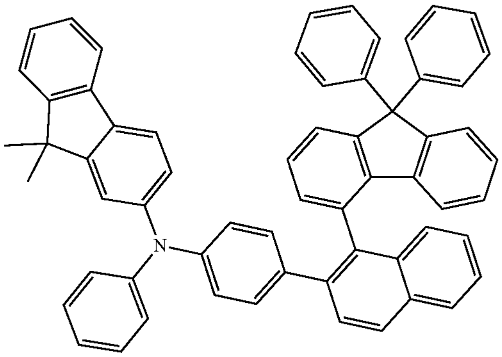
4-143
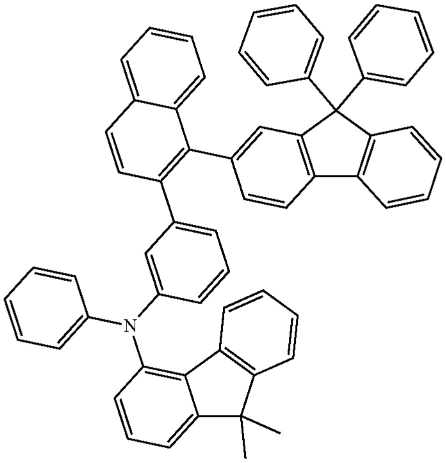
-continued
4-144
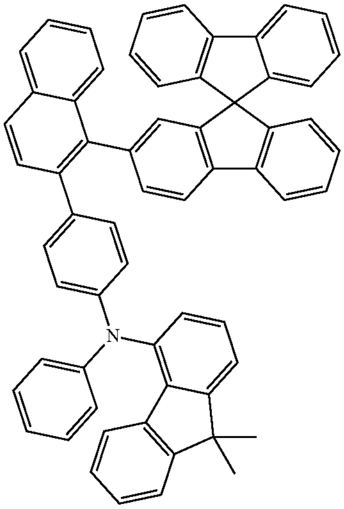
4-145
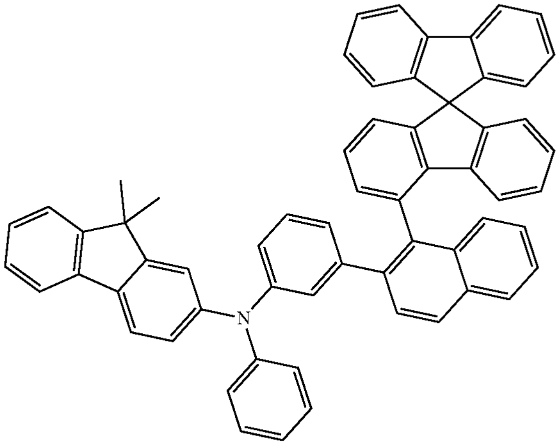
4-146
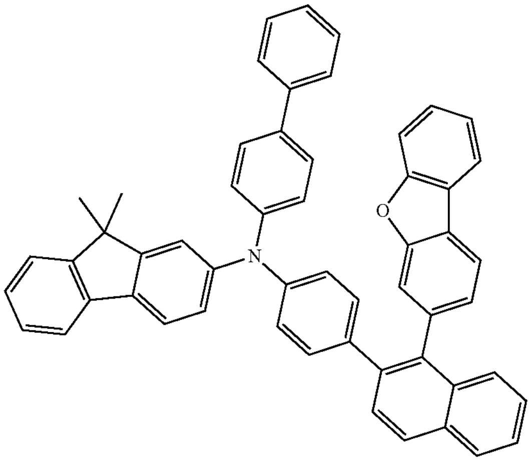

4-147
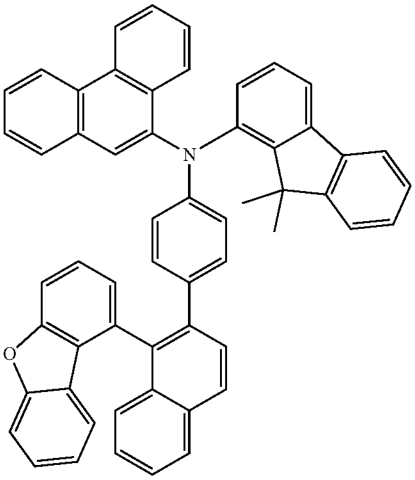
4-148
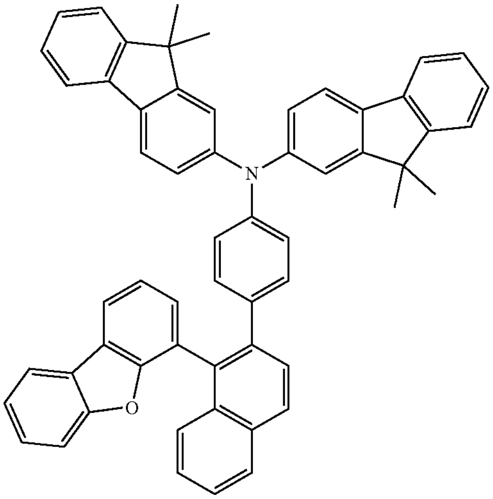
4-149
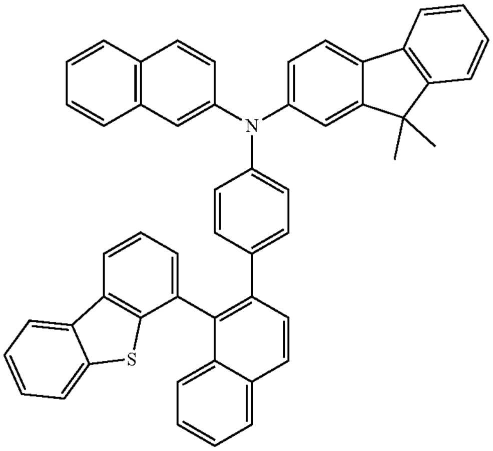
4-150
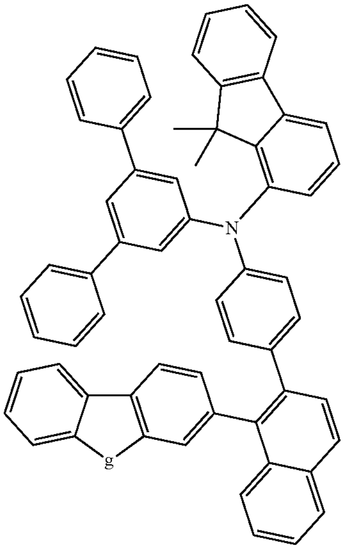
4-151
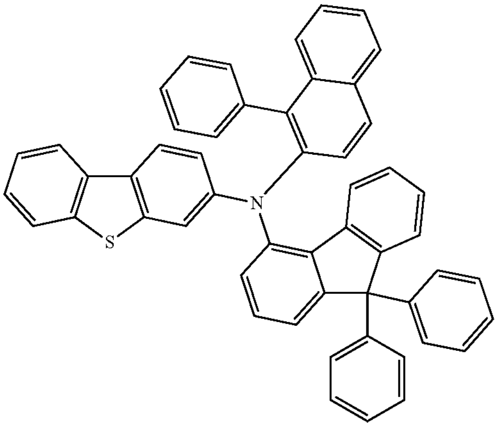
4-152
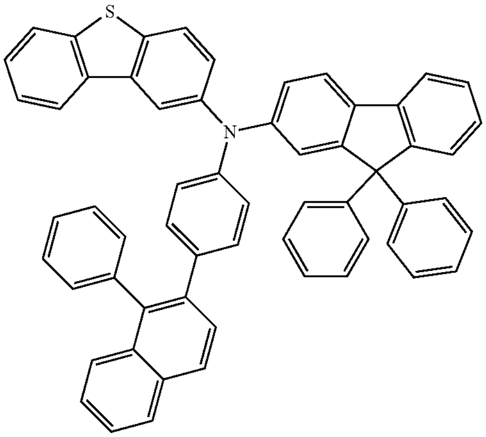

4-153
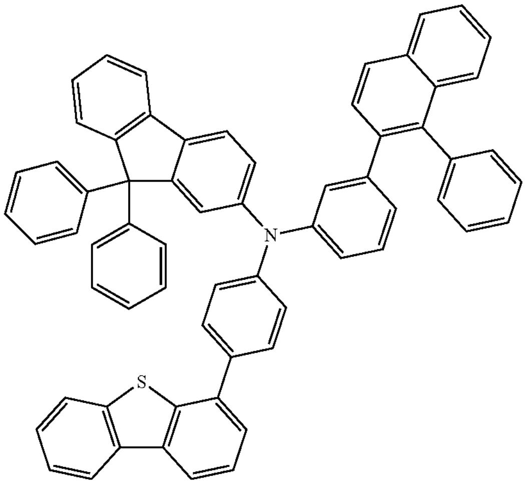
4-154
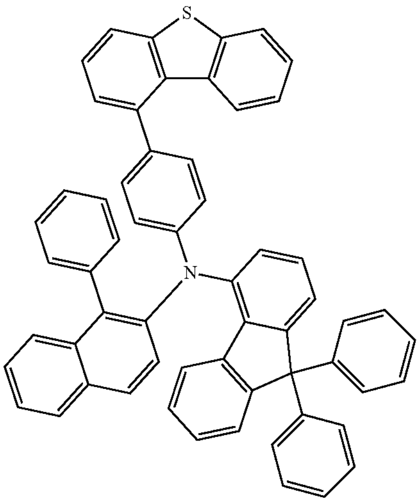
4-155
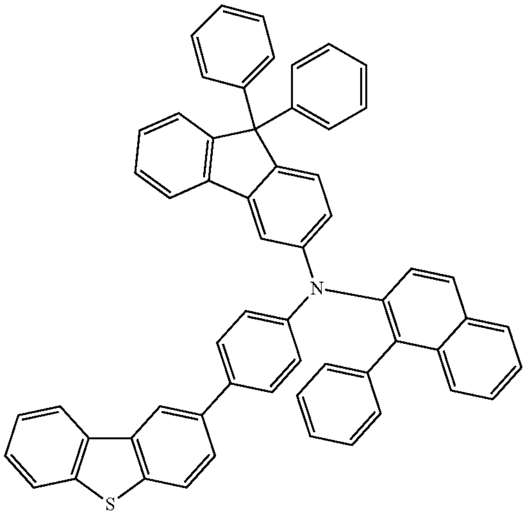
4-156
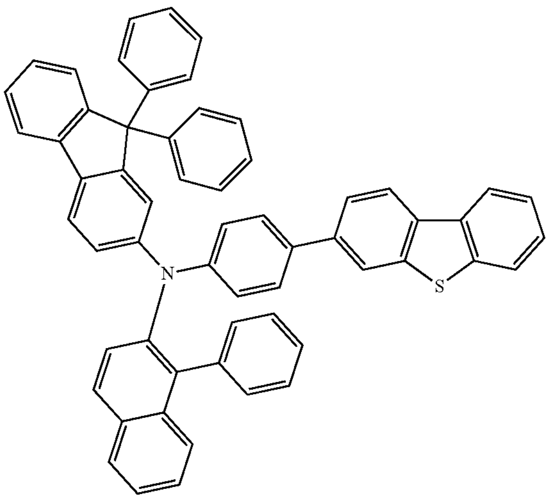
4-157
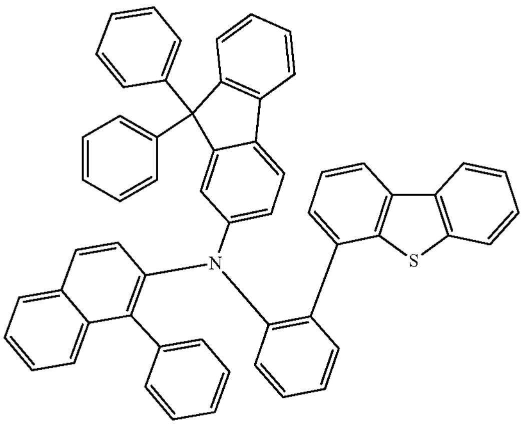
4-158
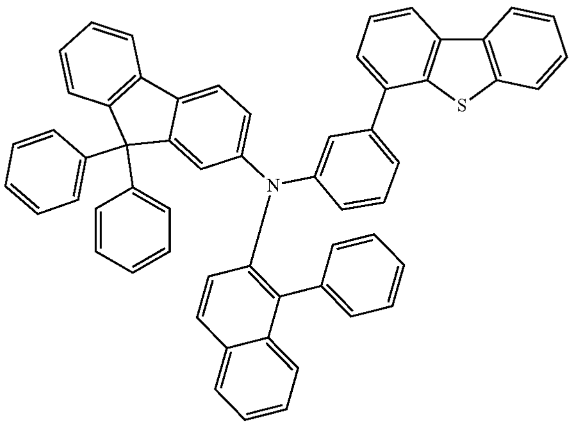

-continued
4-159
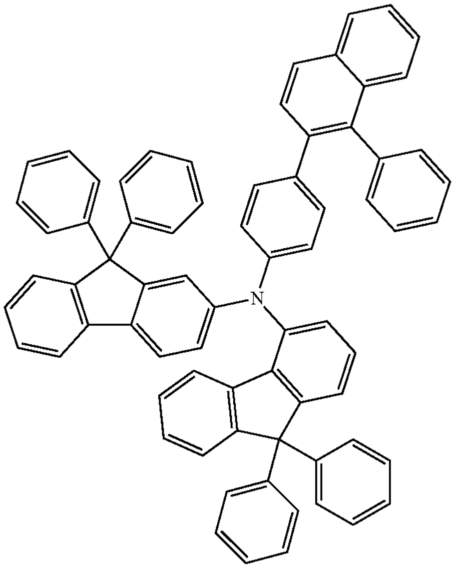
4-160
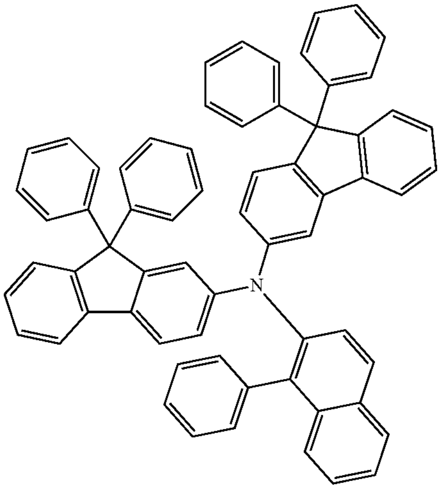
4-161
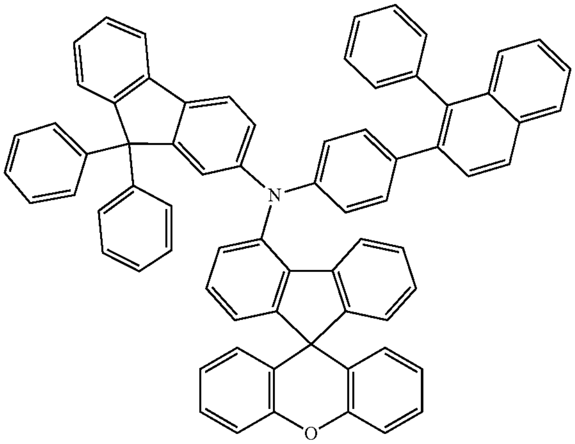
-continued
4-162
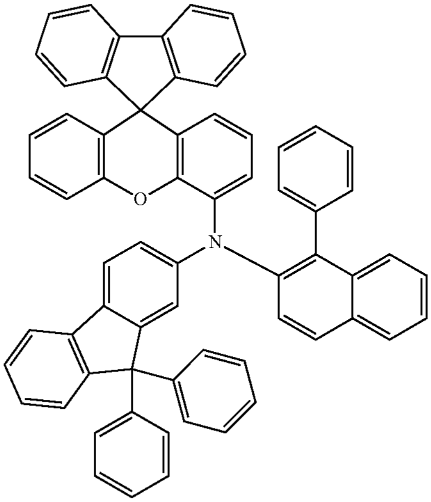
4-163
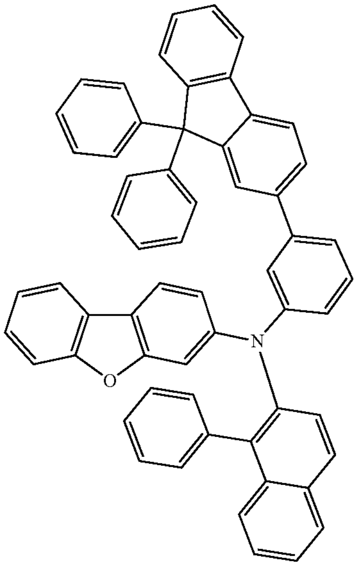
4-164
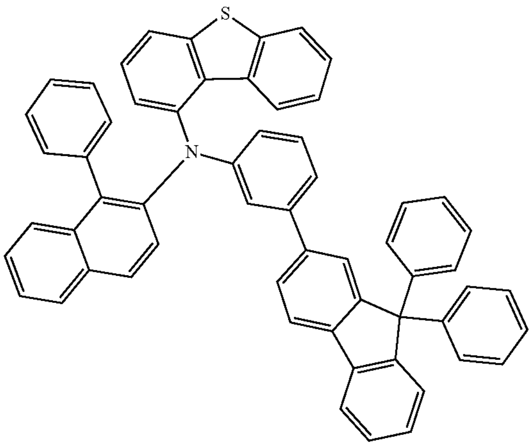

-continued
4-165
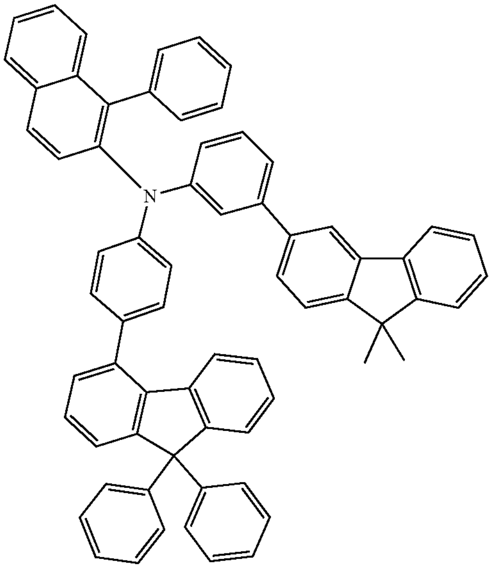
4-166
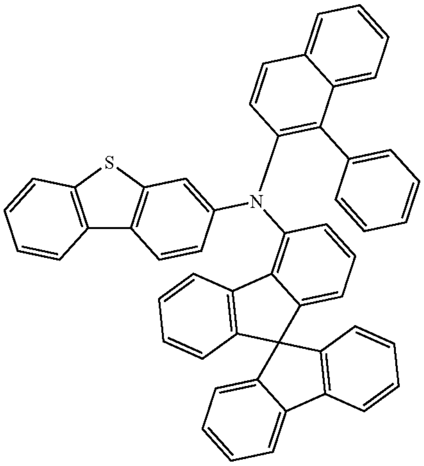
4-167
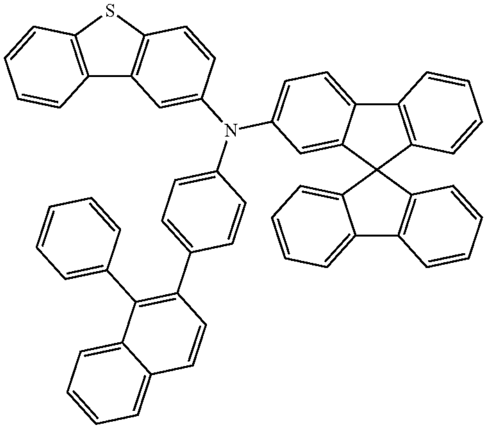
-continued
4-168
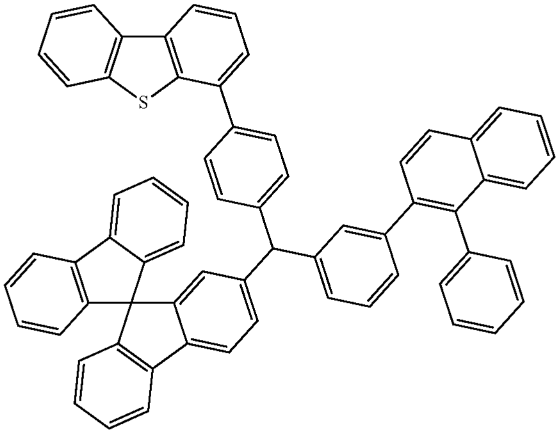
4-169
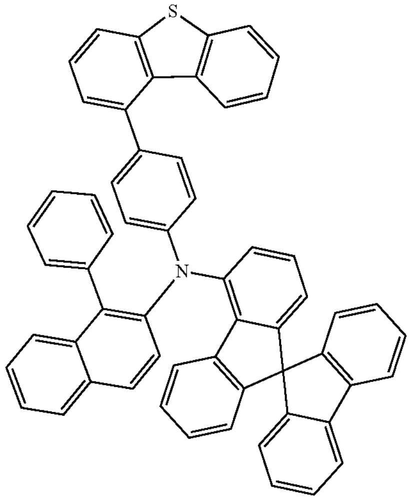
4-170
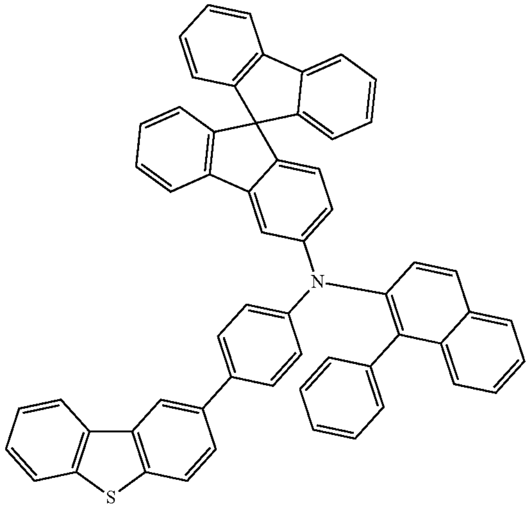

-continued
4-171
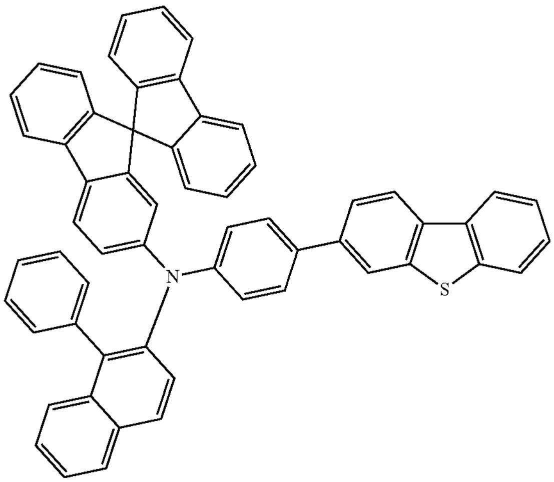
4-172
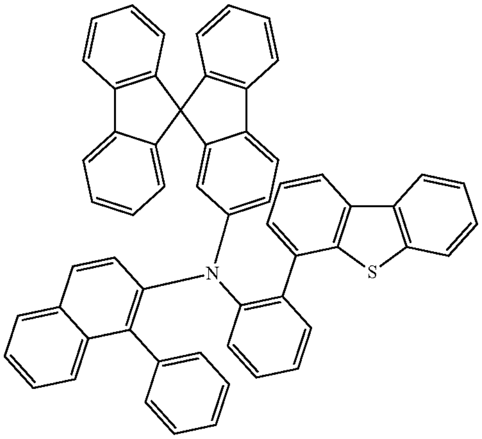
4-173
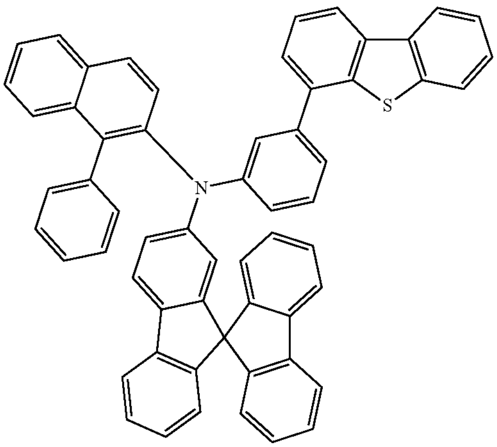
-continued
4-174
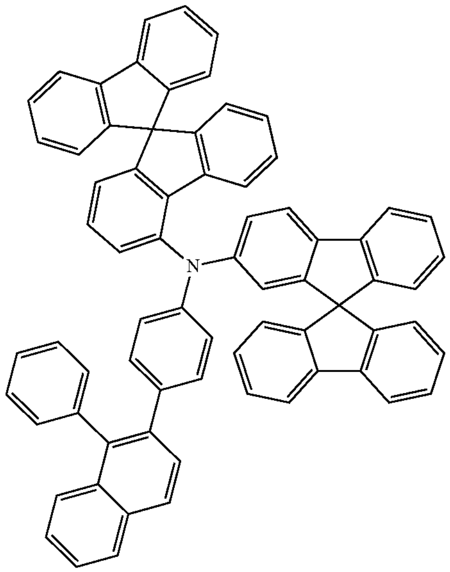
4-175
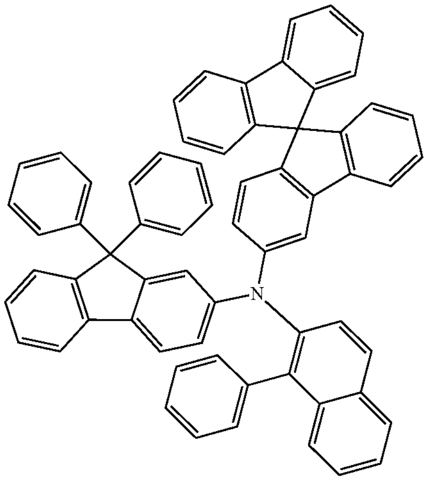
4-176
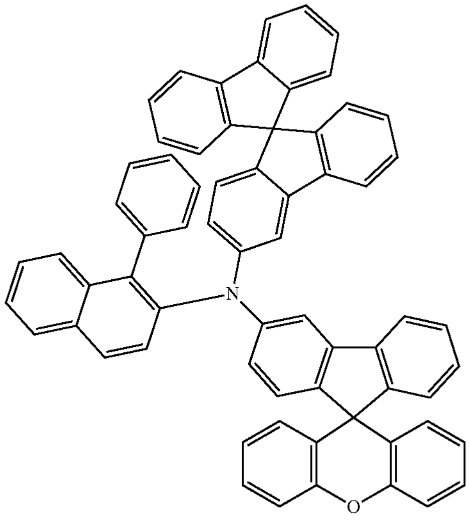

-continued
4-177
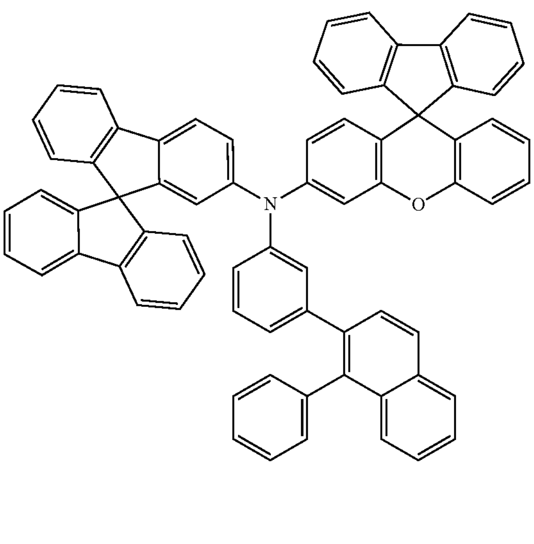
4-178
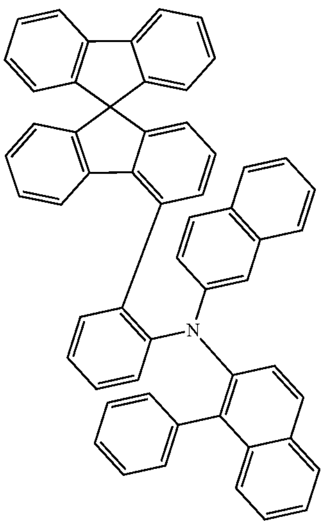
4-179
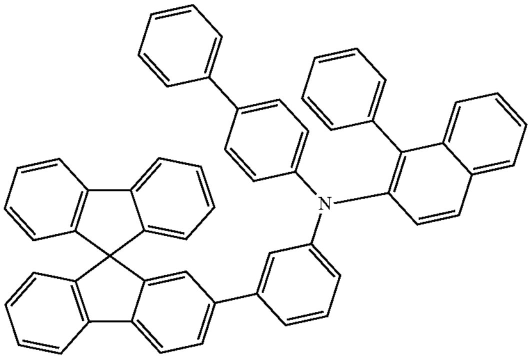
-continued
4-180
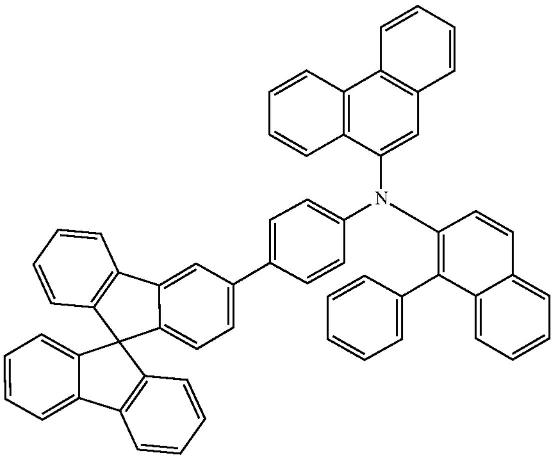
4-181
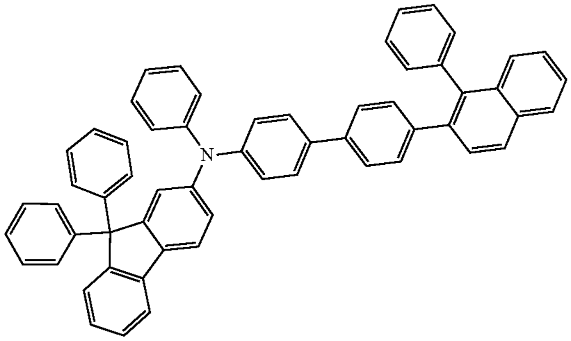
4-182
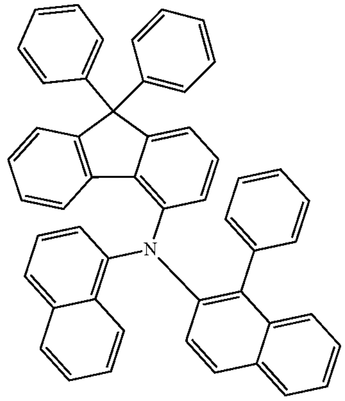
4-183
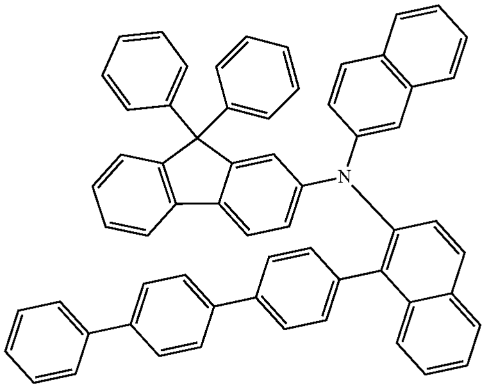

-continued
4-184
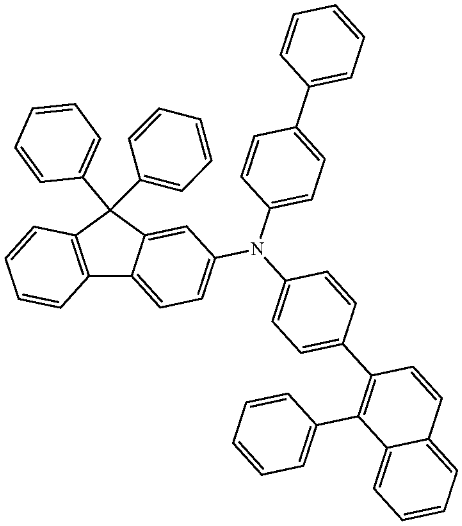
4-185
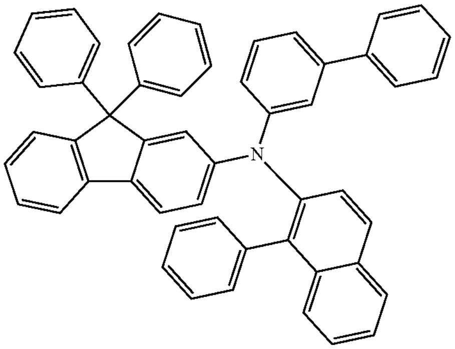
4-186
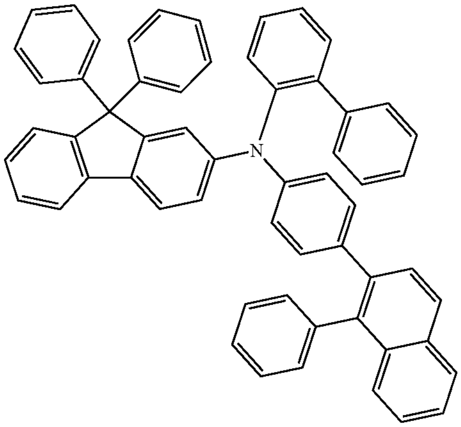
-continued
4-187
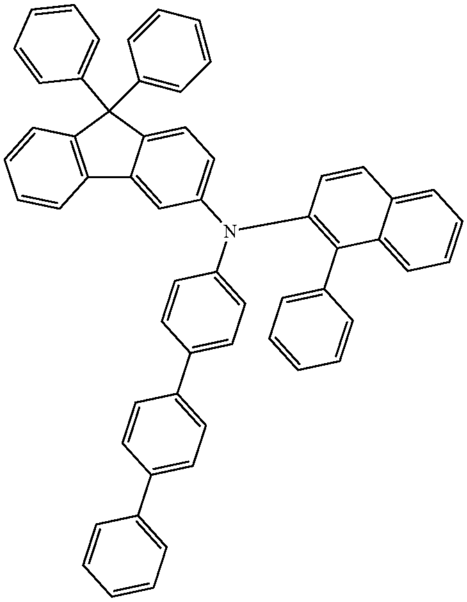
4-188
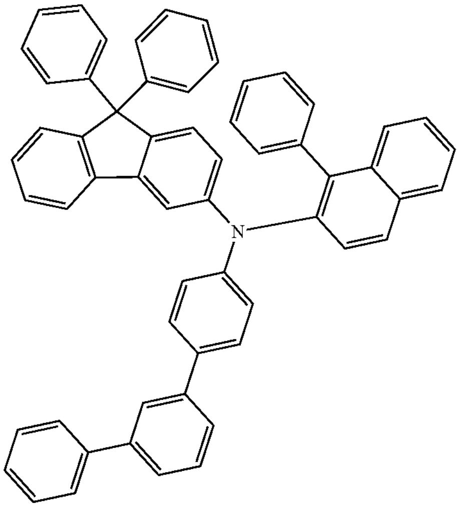
4-189
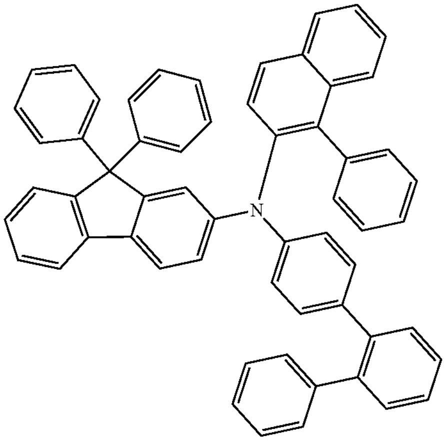

-continued
4-190
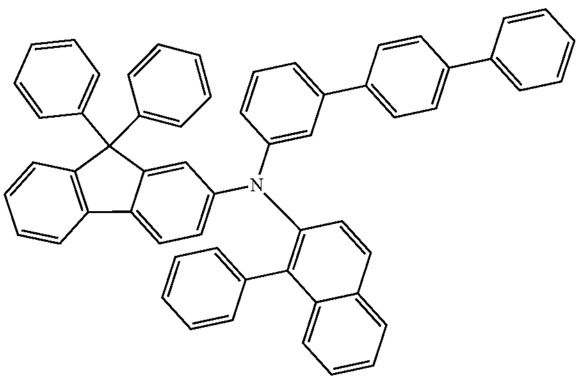
4-191
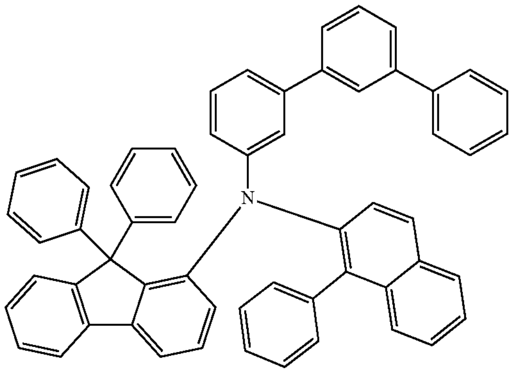
4-192
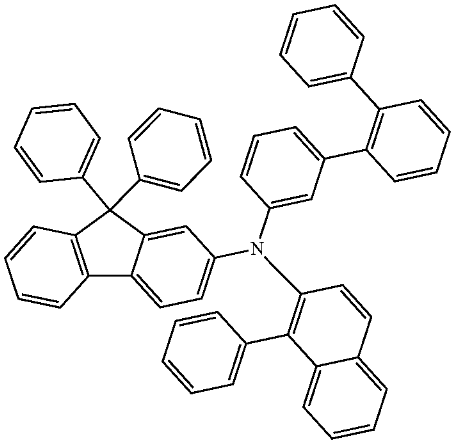
4-193
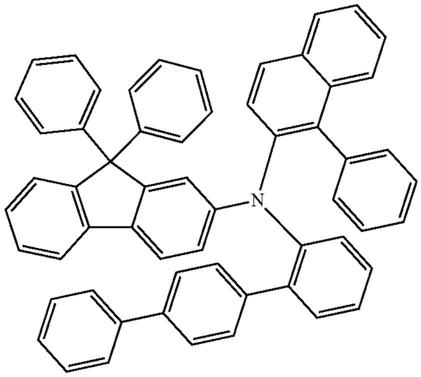
-continued
4-194
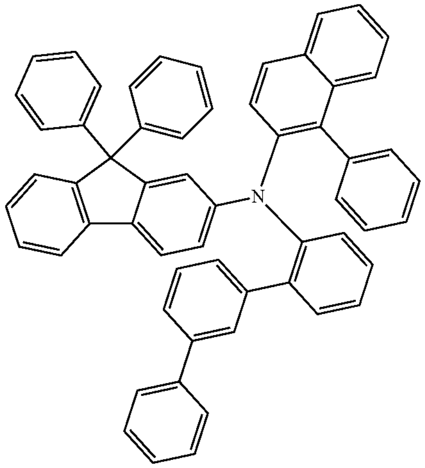
4-195
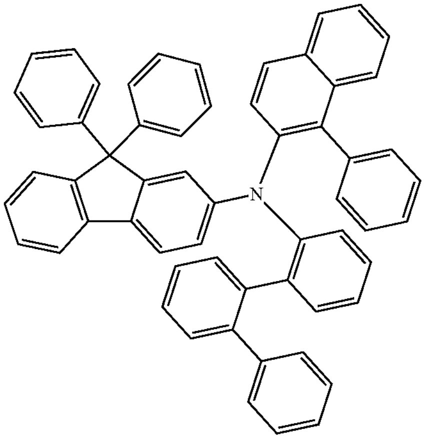
4-196
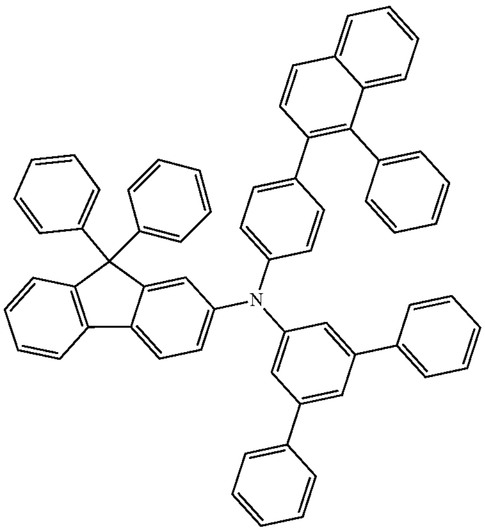

-continued
4-197
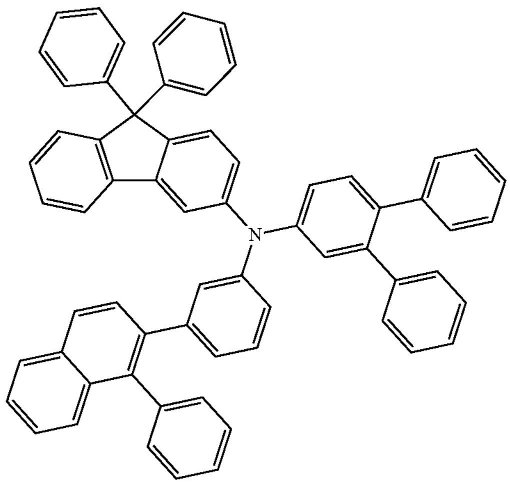
4-198
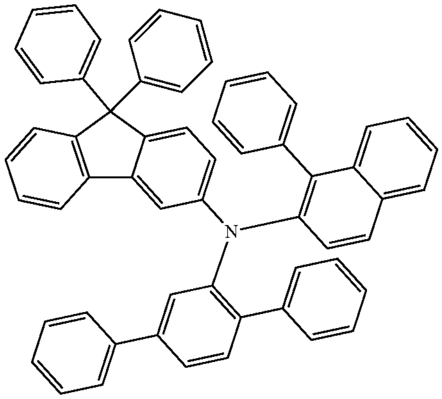
4-199
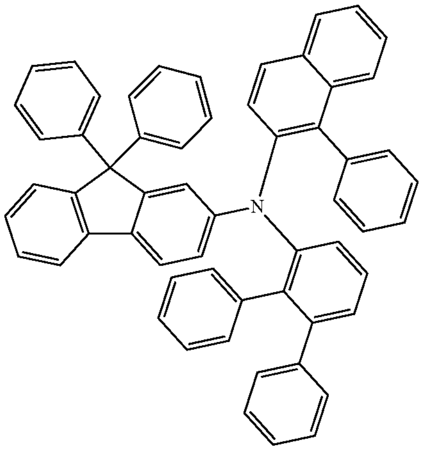
-continued
4-200
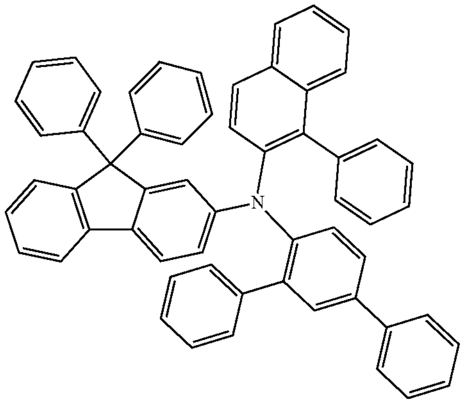
4-201
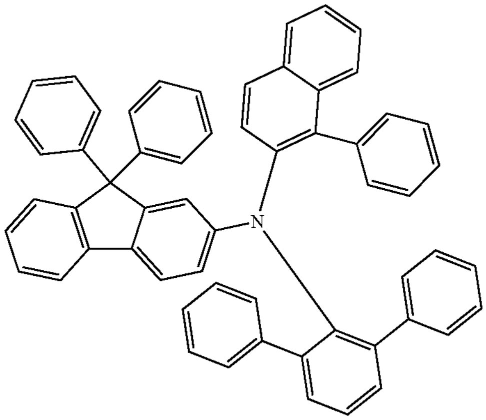
4-202
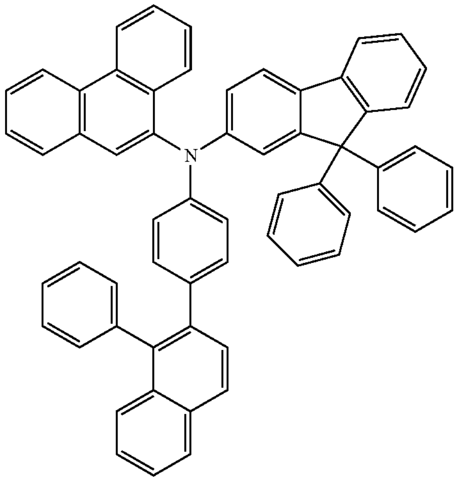

4-203
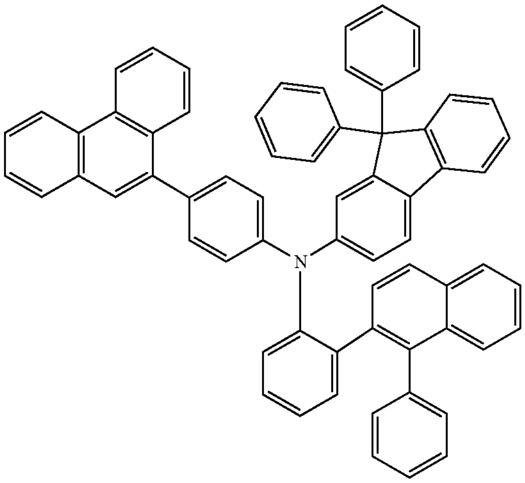
4-204
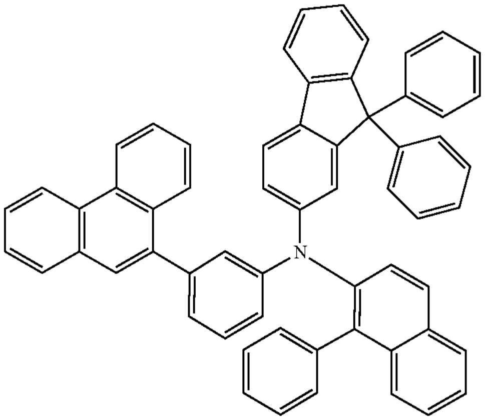
4-205
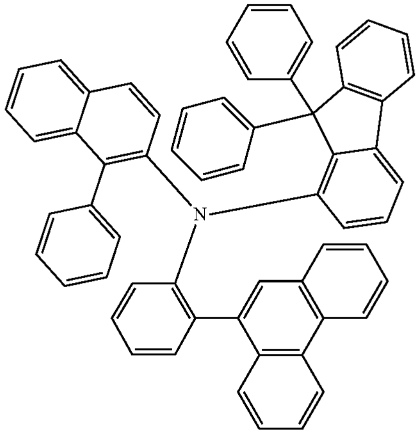
4-206
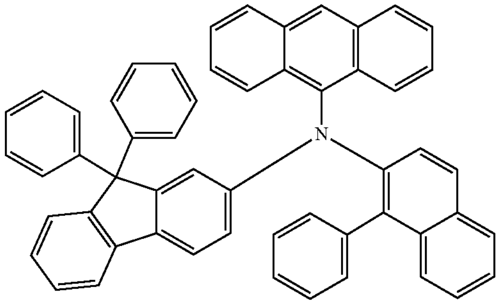
4-207
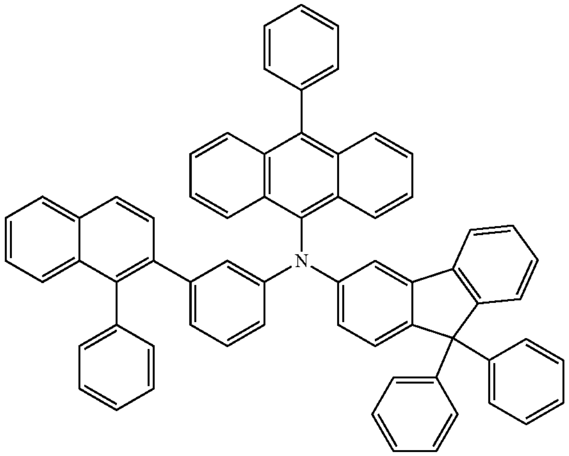
4-208
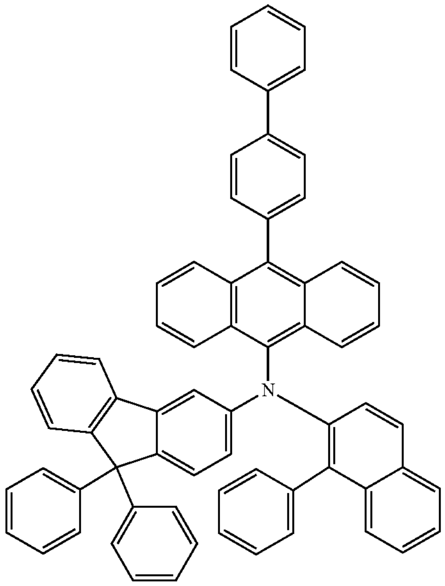

4-209
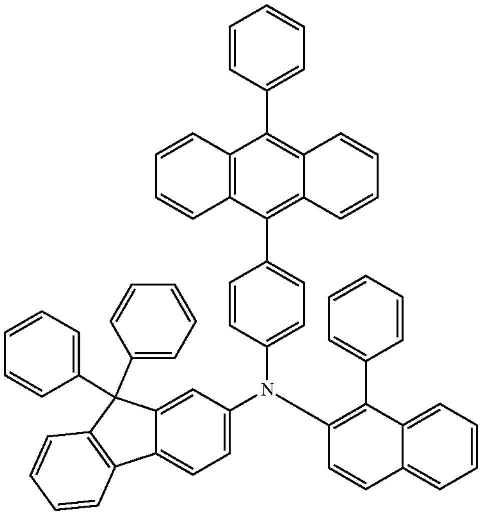
4-210
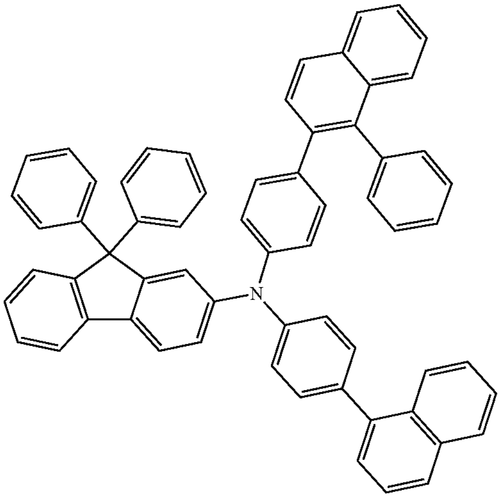
4-211
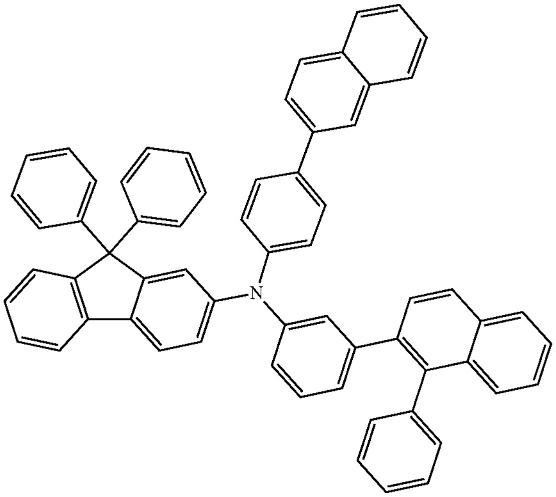
4-212
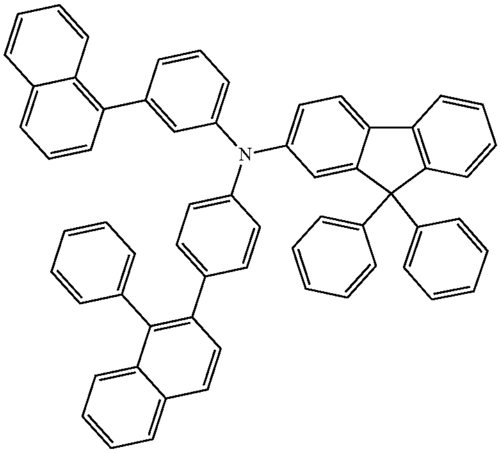
4-213
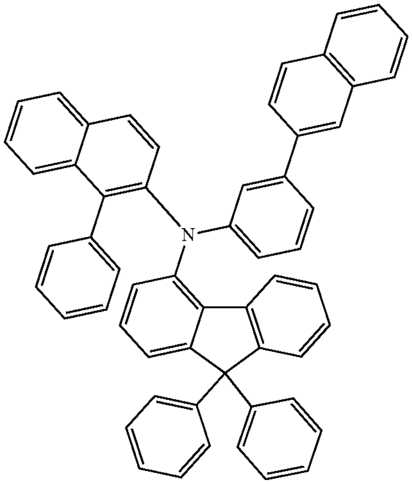
4-214
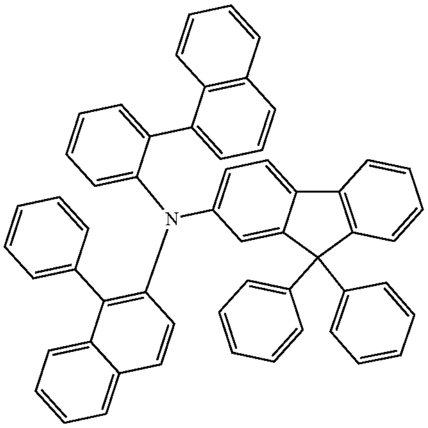

4-215
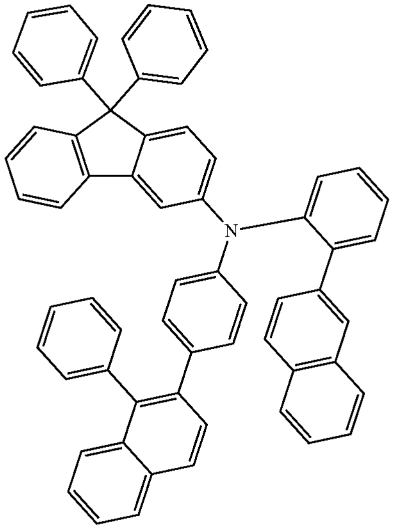
4-216
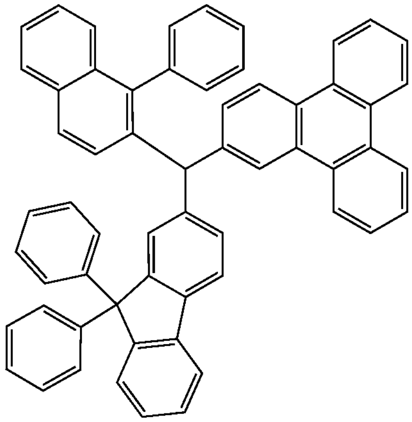
4-217
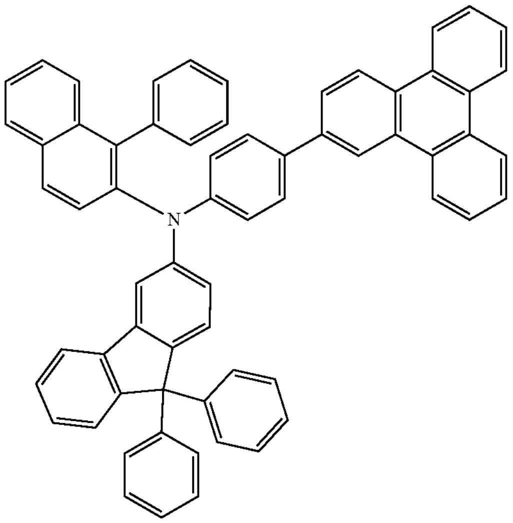
4-218
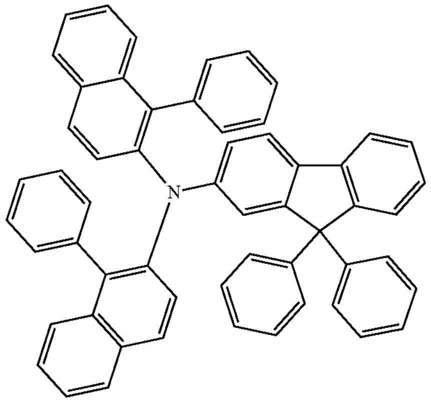
4-219
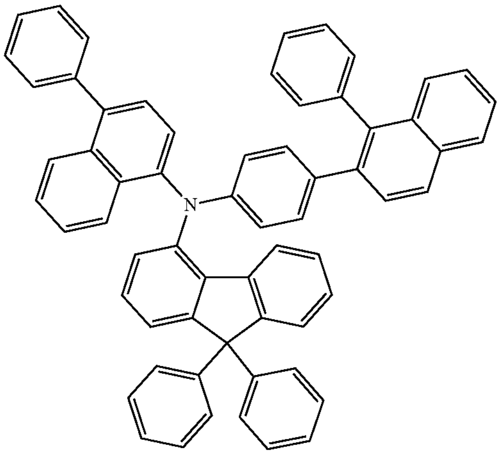
4-220
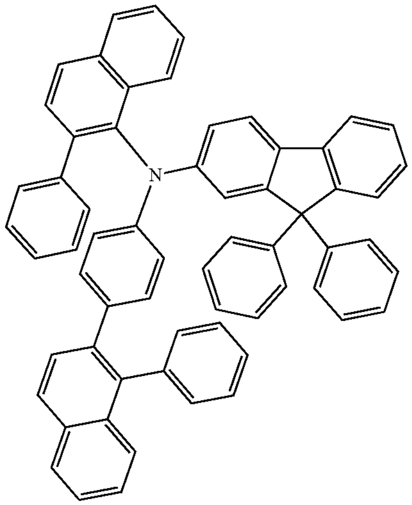

-continued
4-221
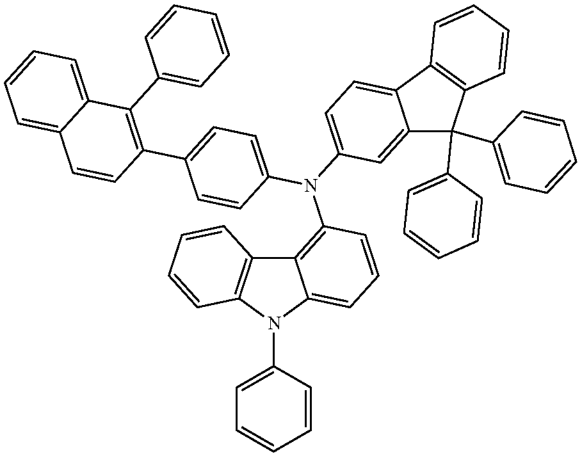
4-222
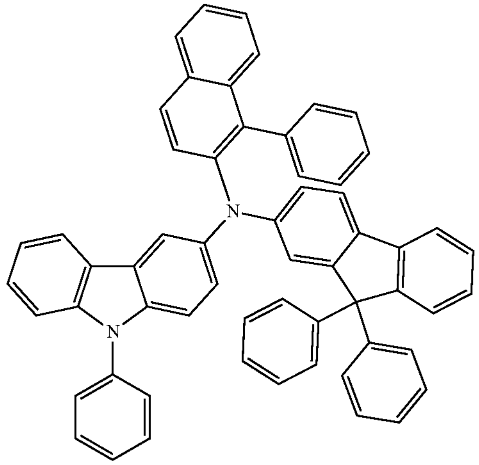
4-223
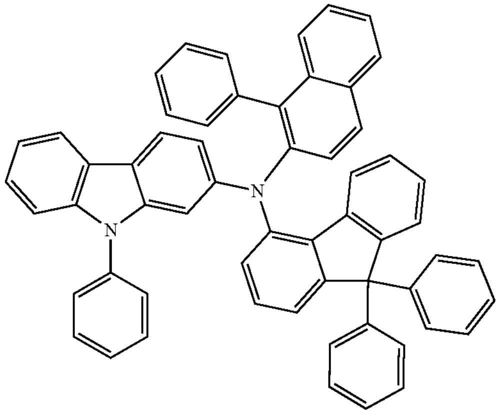
-continued
4-224
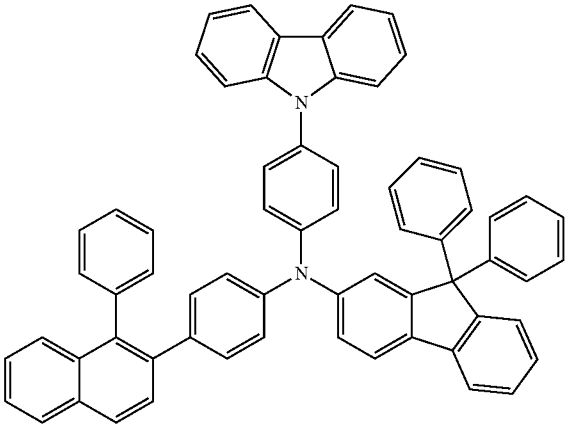
4-225
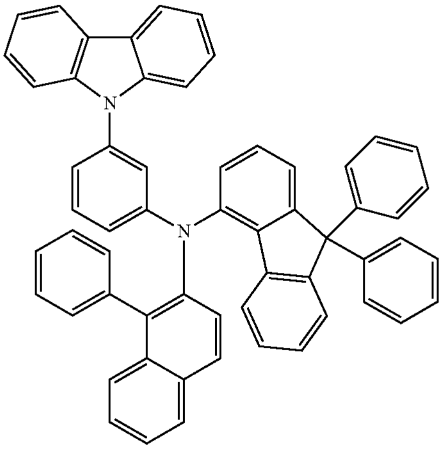
4-226
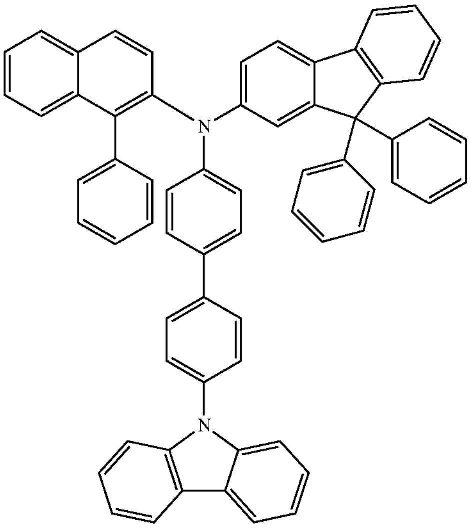

-continued
4-227
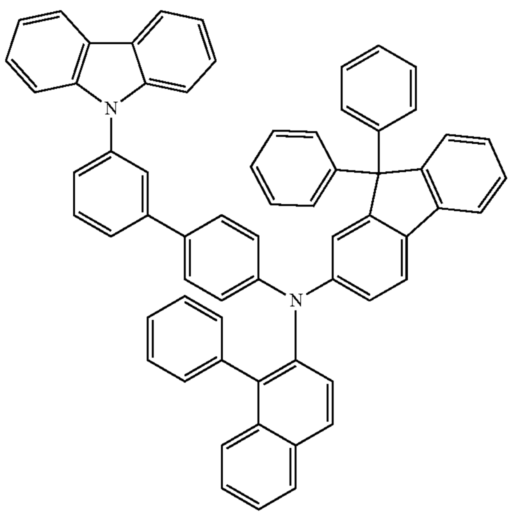
4-228
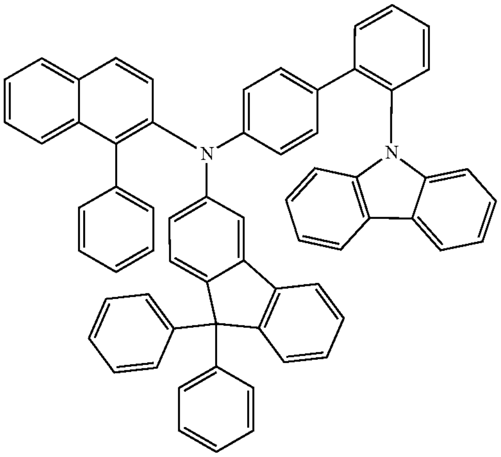
4-229
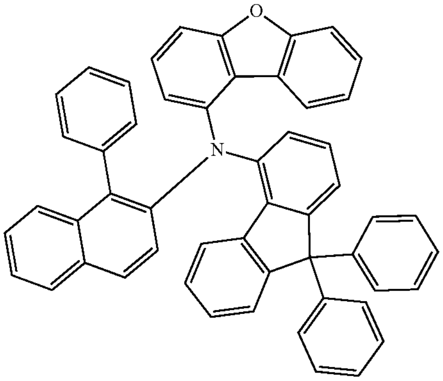
-continued
4-230
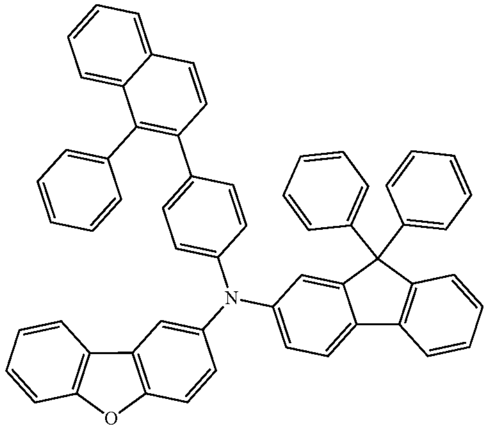
4-231
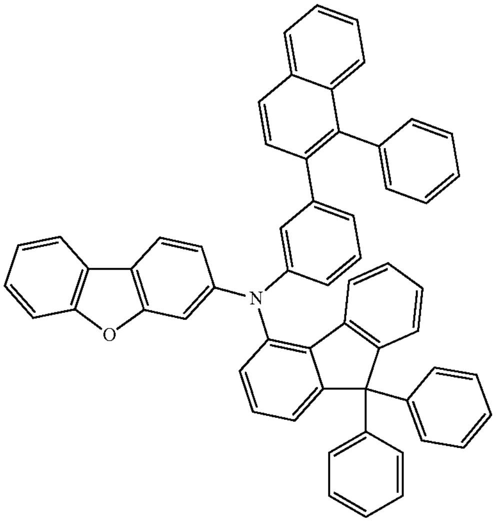
4-232
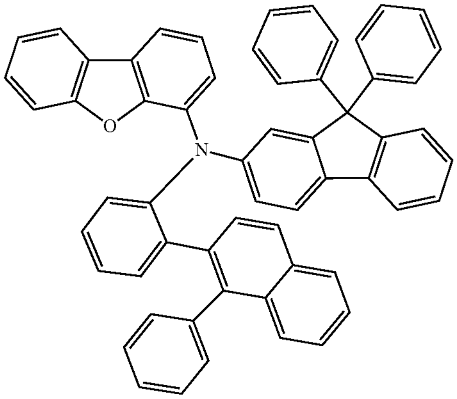

-continued
4-233
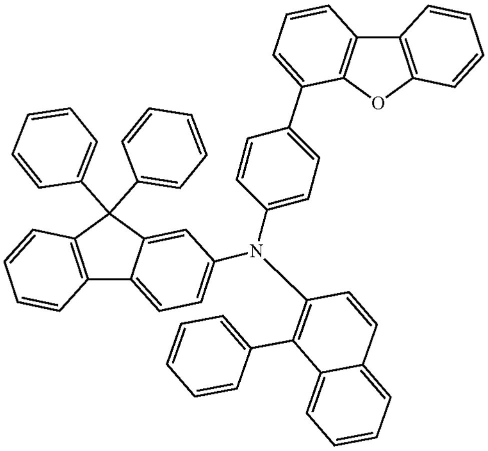
4-234
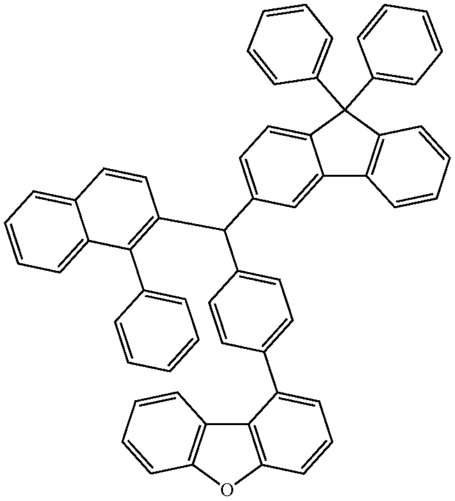
4-235
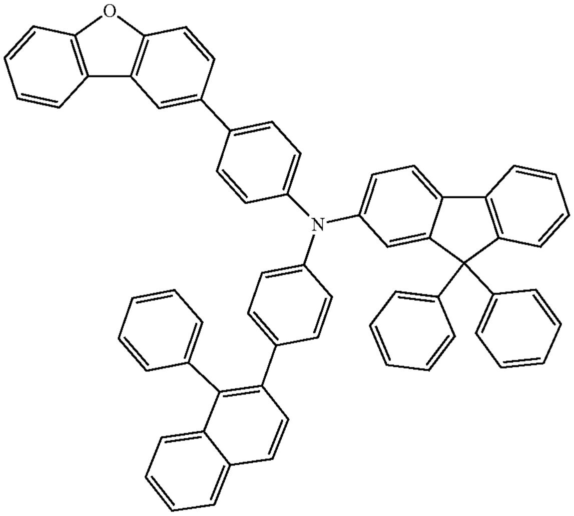
-continued
4-236
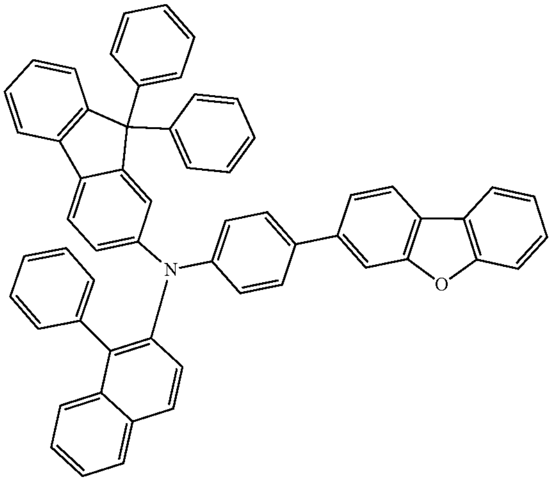
4-237
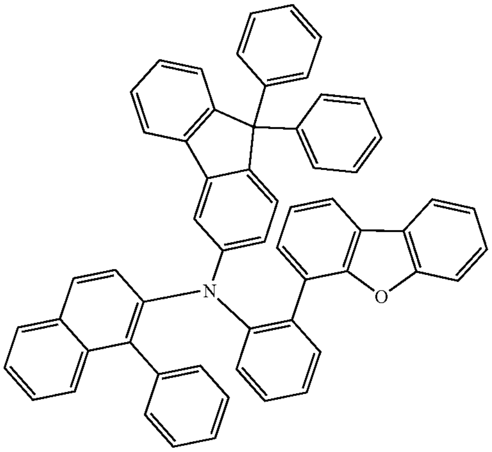
4-238
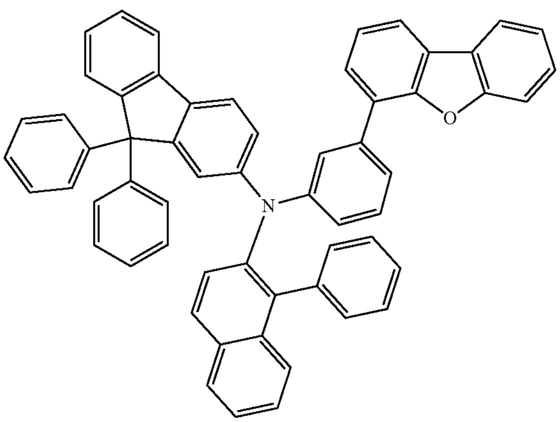

-continued
4-239
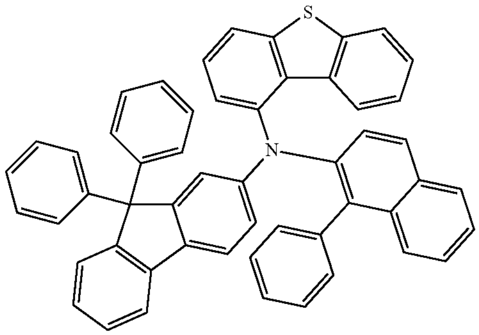
4-240
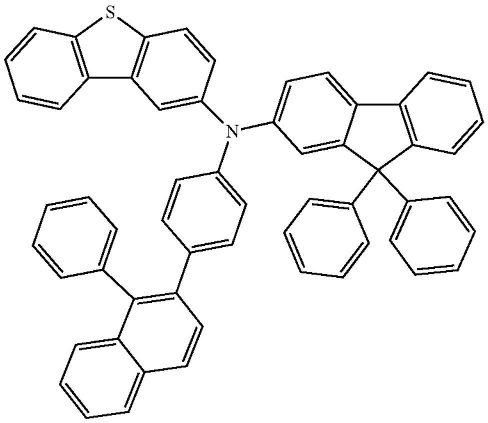
4-241
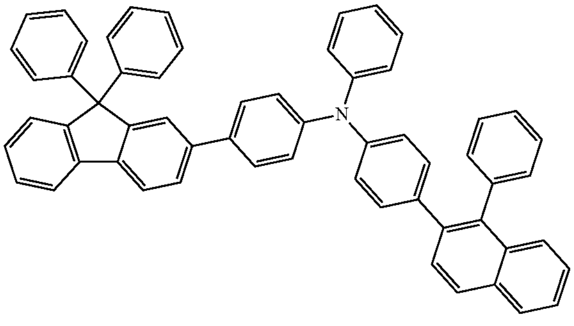
4-242
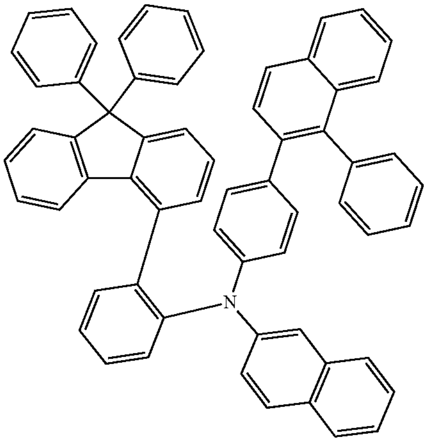
-continued
4-243
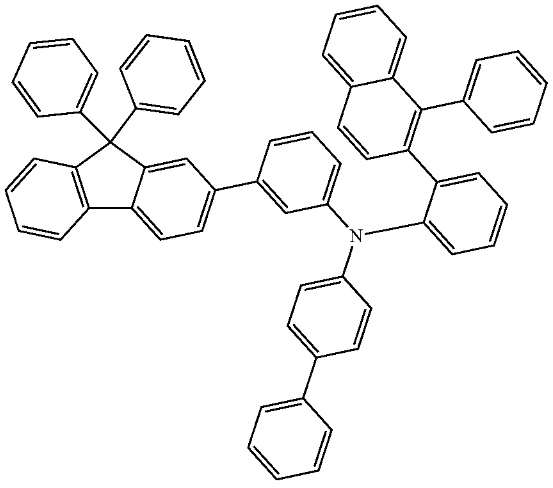
4-244
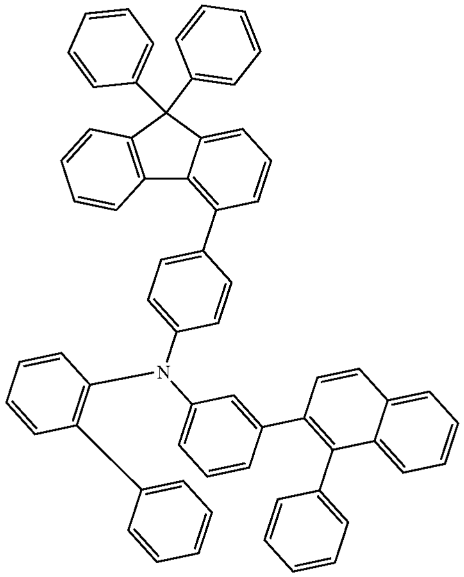
4-245
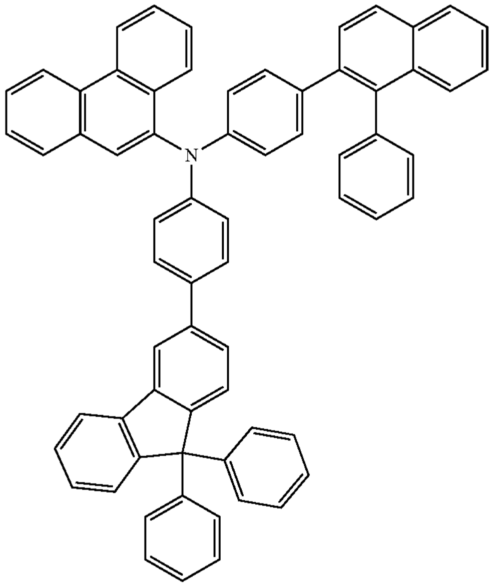

-continued
4-246
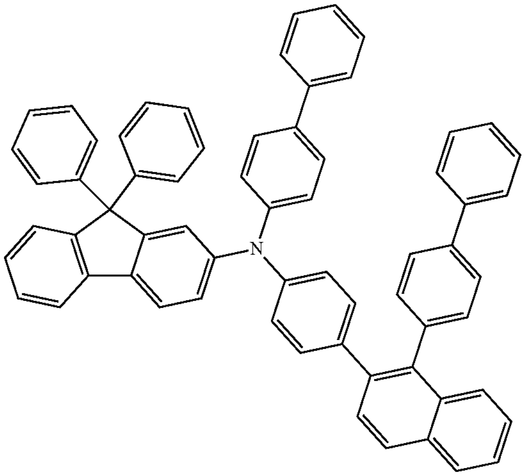
4-247
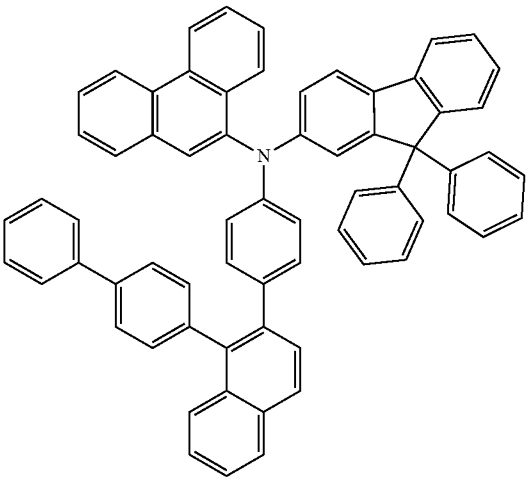
4-248
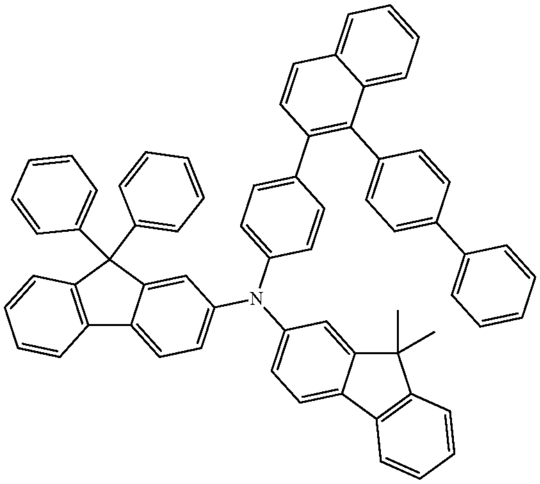
-continued
4-249
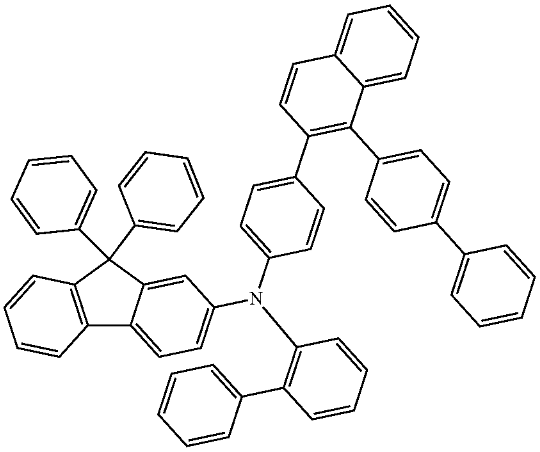
4-250
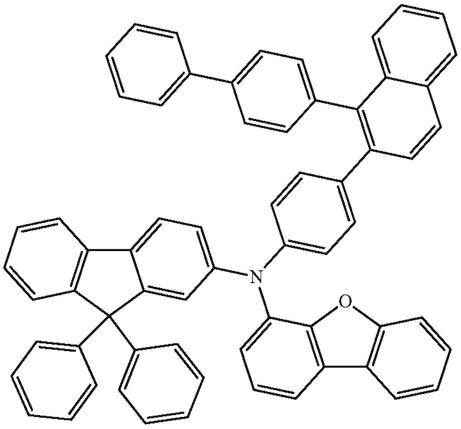
4-251
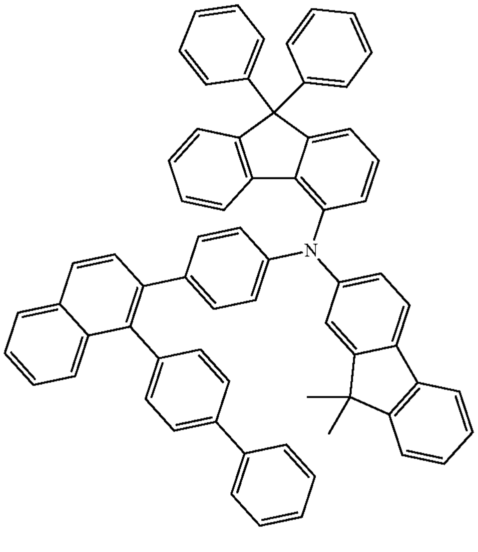

-continued
4-252
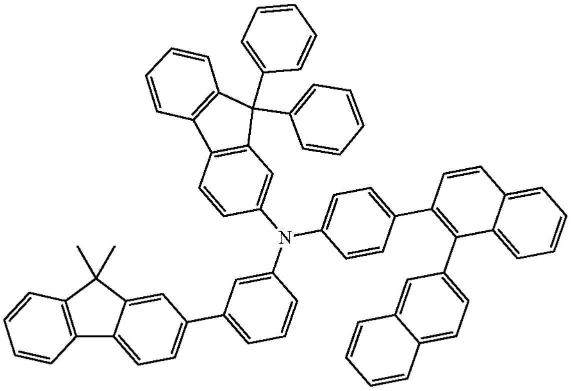
4-253
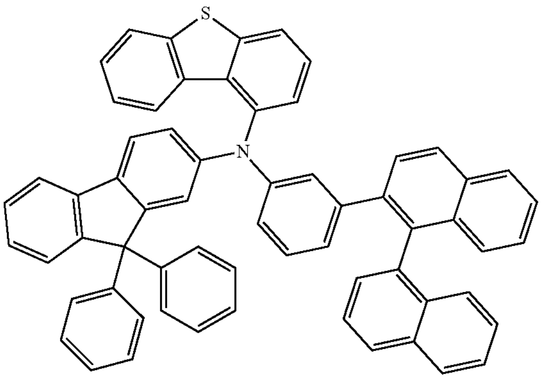
4-254
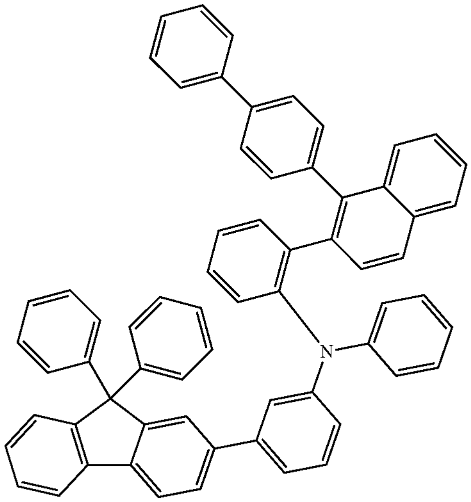
-continued
4-255
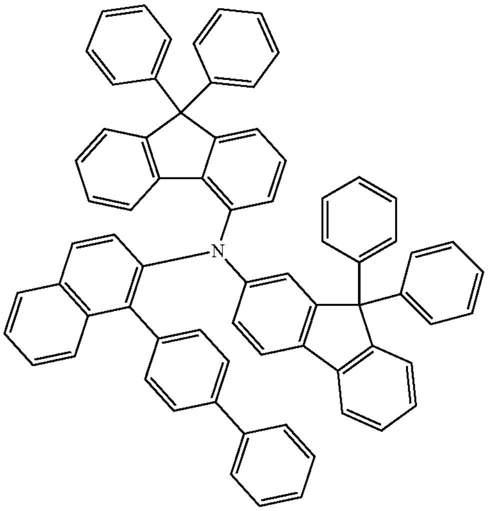
4-256
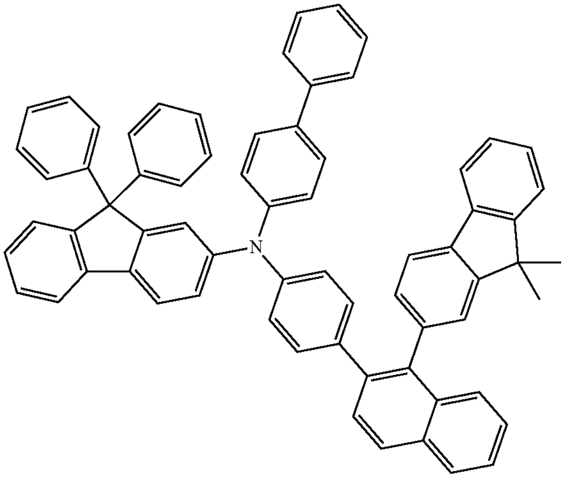
4-257
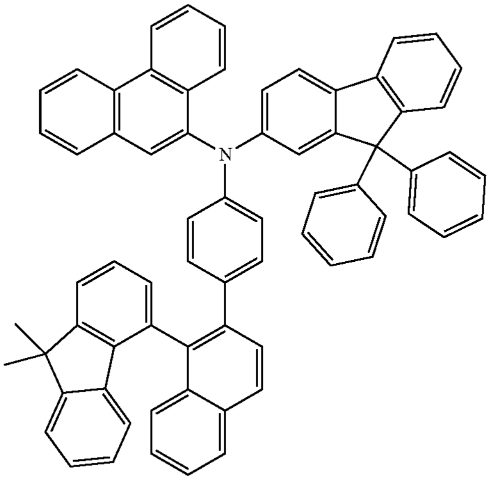

-continued
4-258
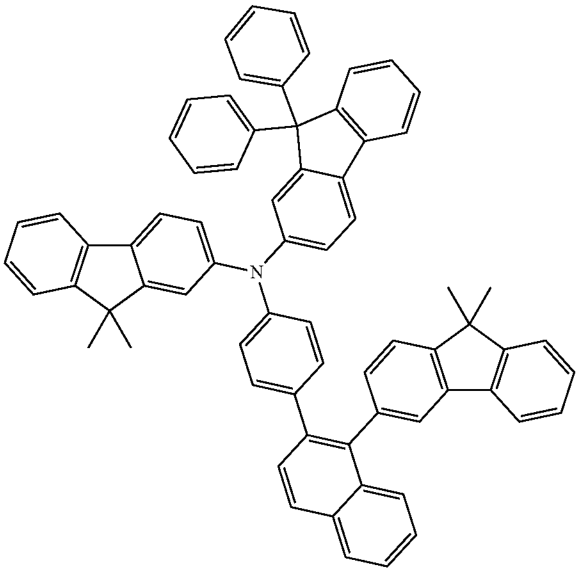
4-259
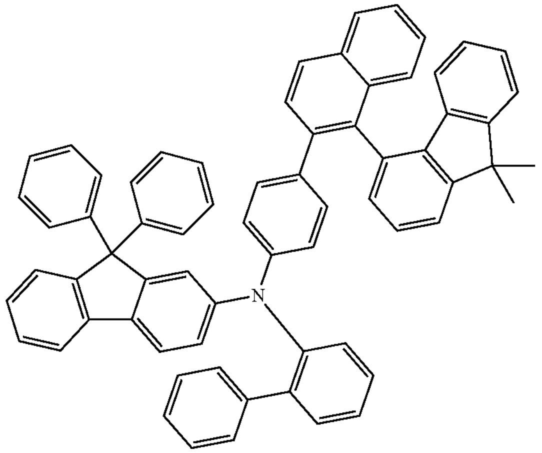
4-260
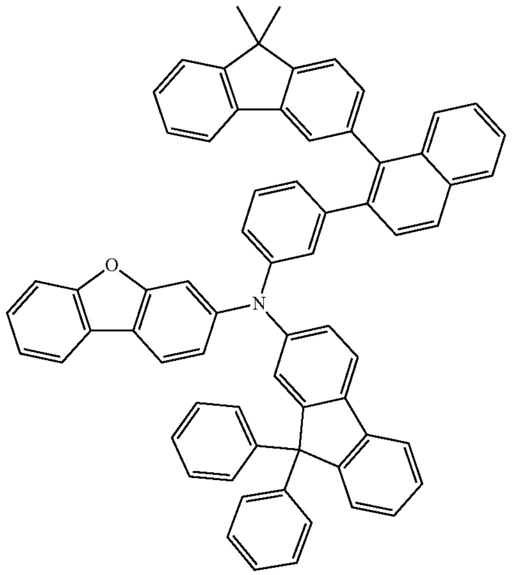
-continued
4-261
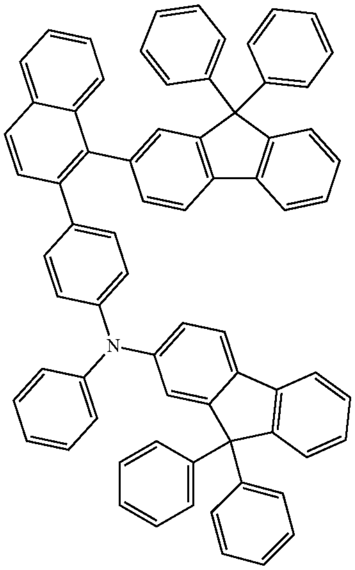
4-262
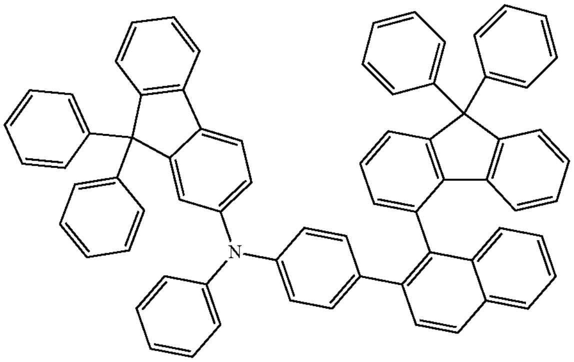
4-263
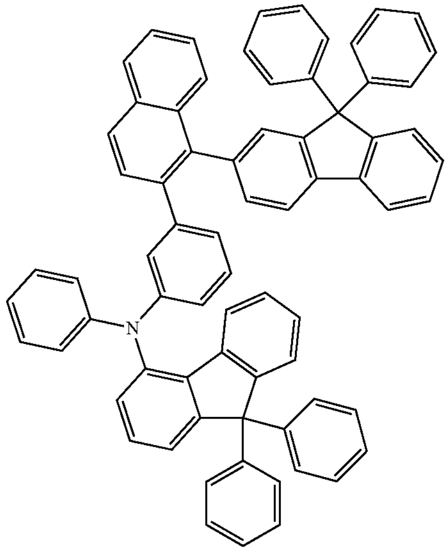

-continued
4-264
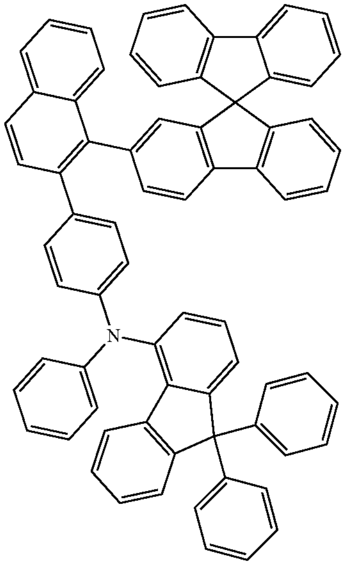
4-265
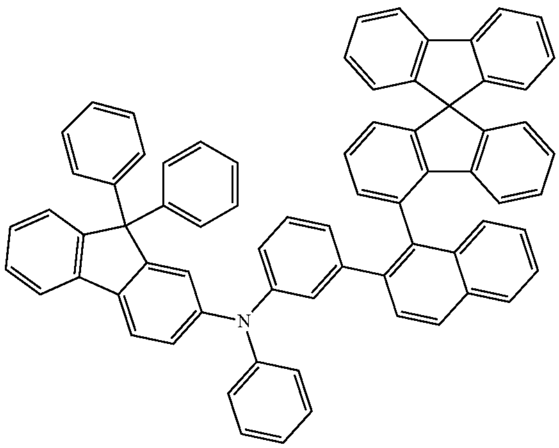
4-266
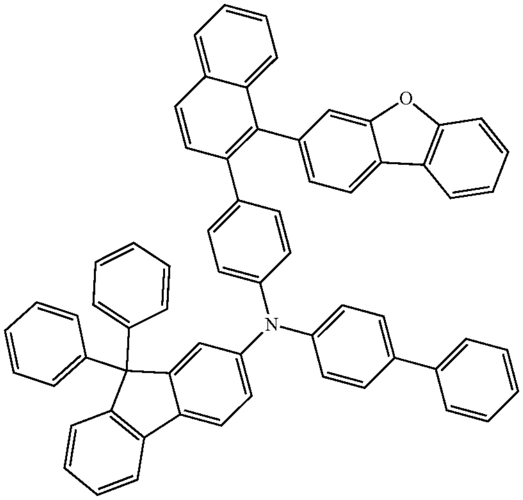
-continued
4-267
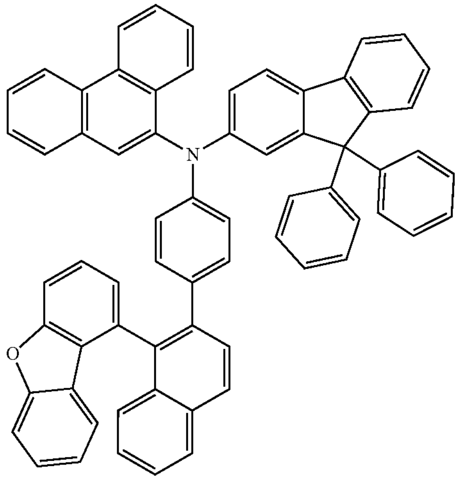
4-268
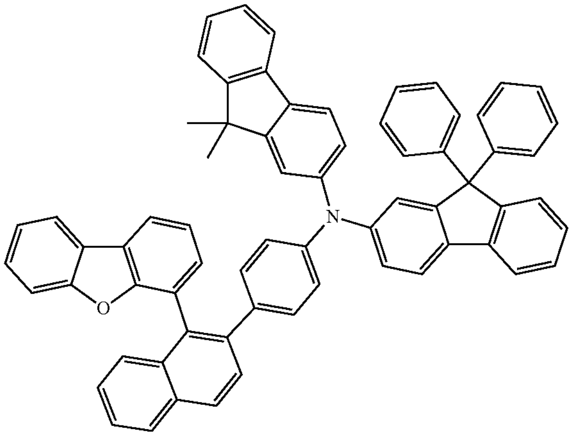
4-269
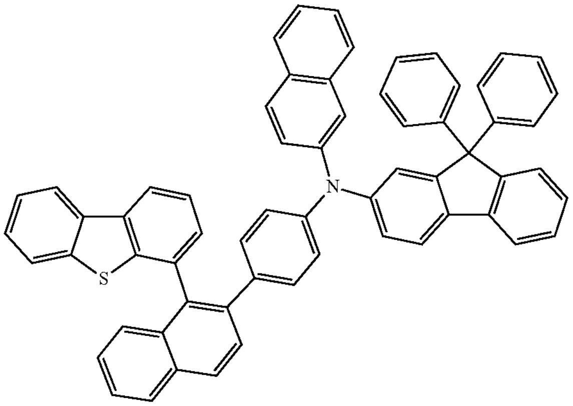

-continued
4-270
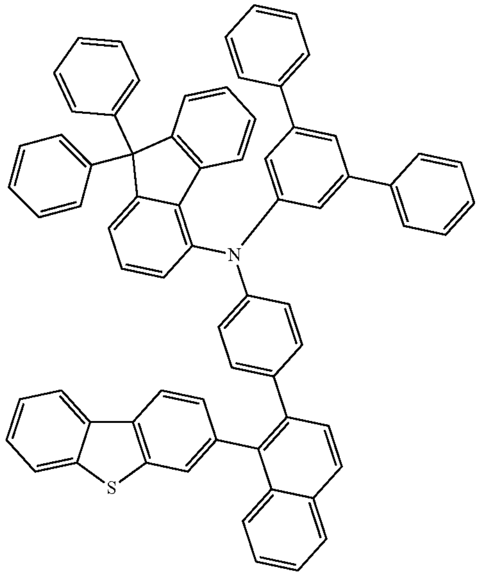
4-271
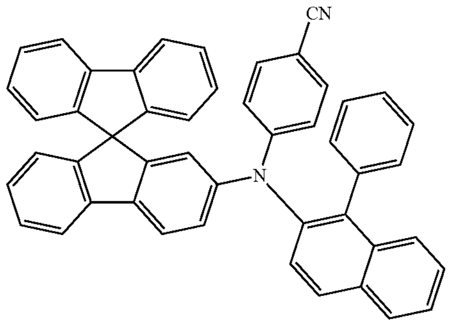
4-272
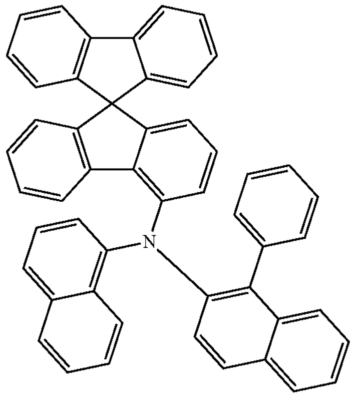
-continued
4-273
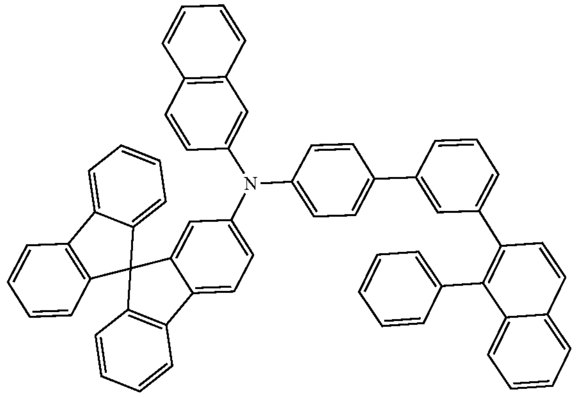
4-274
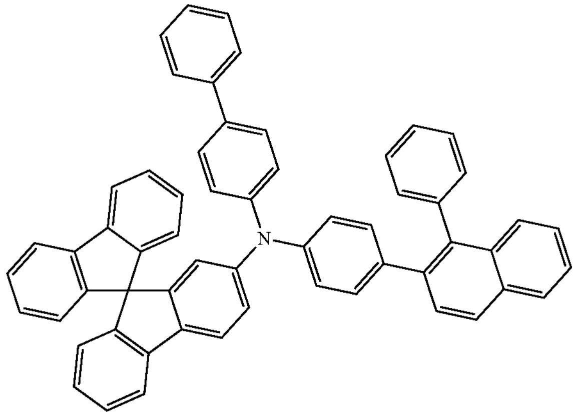
4-275
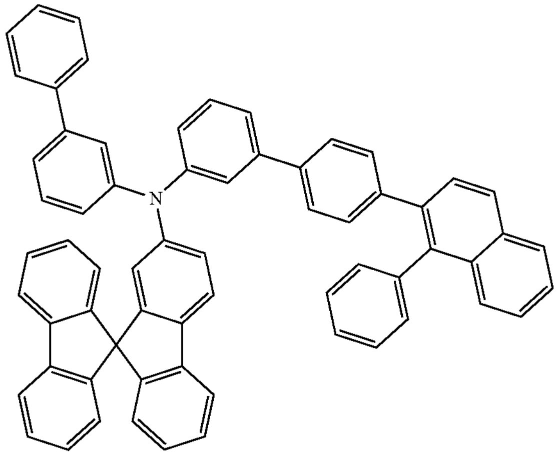

-continued
4-276
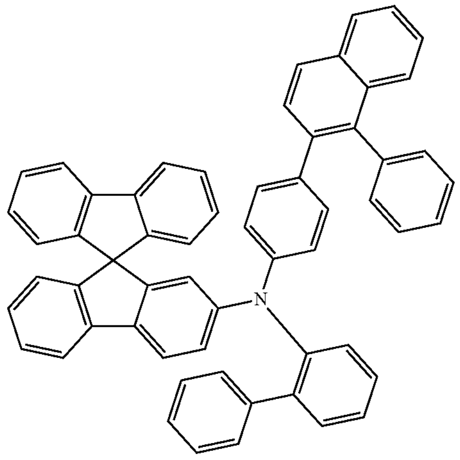
4-277
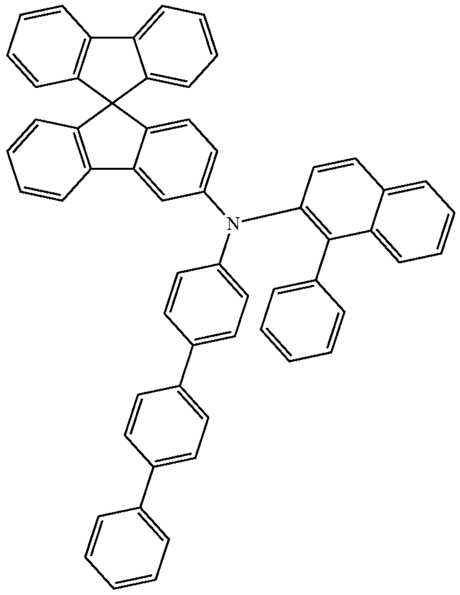
4-278
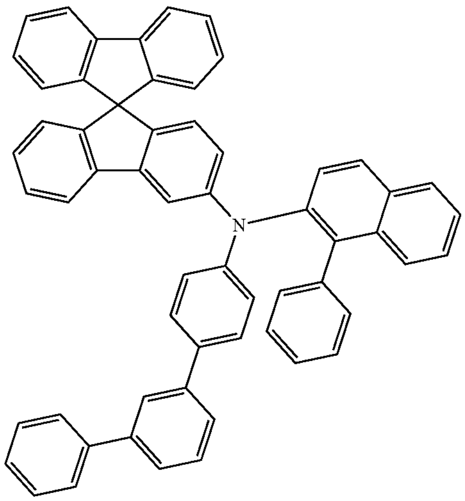
-continued
4-279
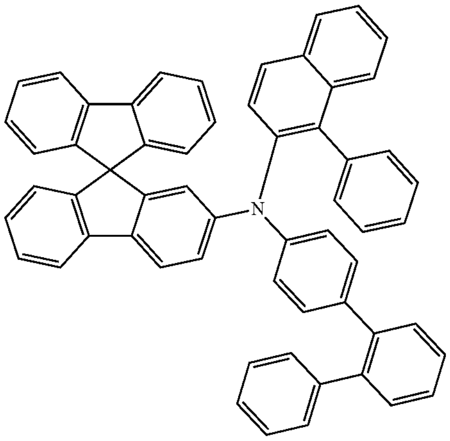
4-280
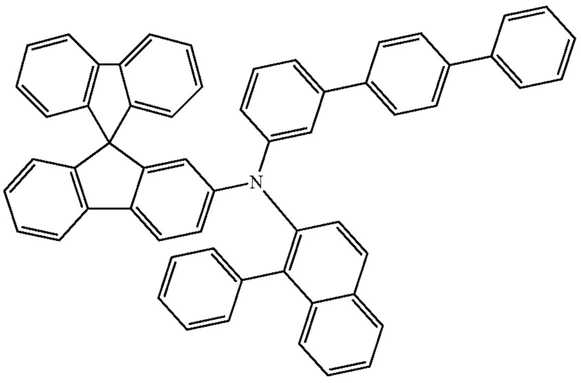
4-281
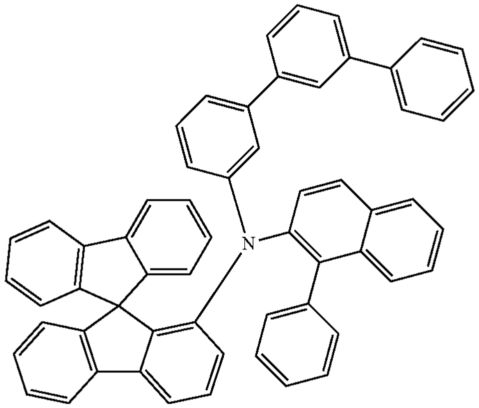

4-282
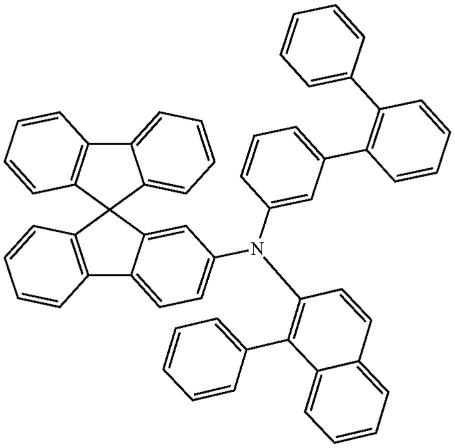
4-283
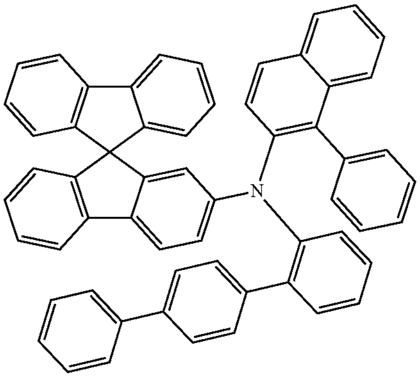
4-284
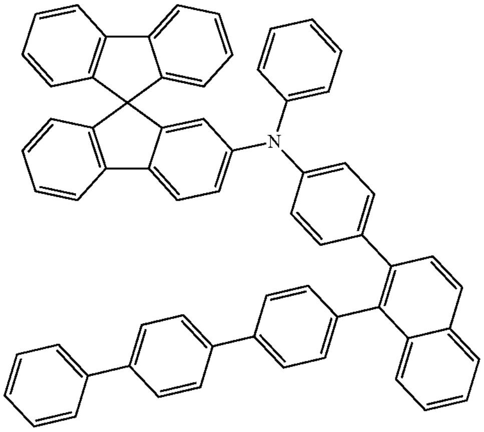
4-285
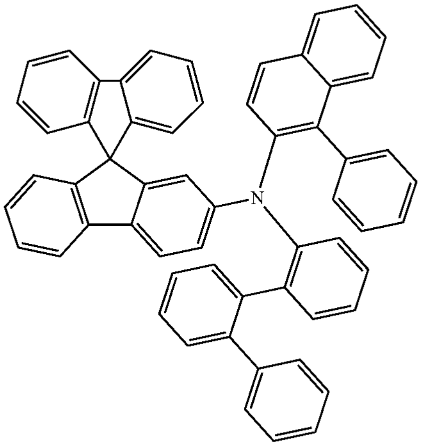
4-286
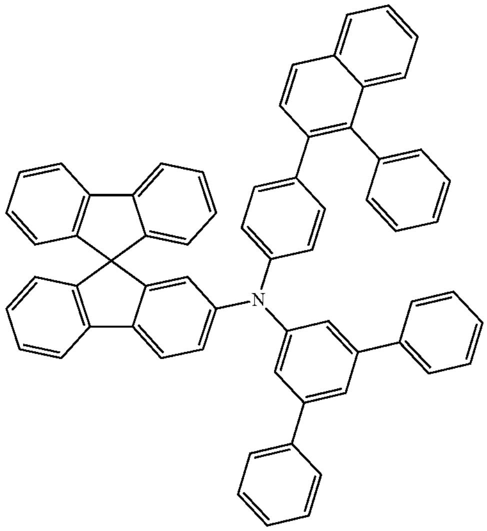
4-287
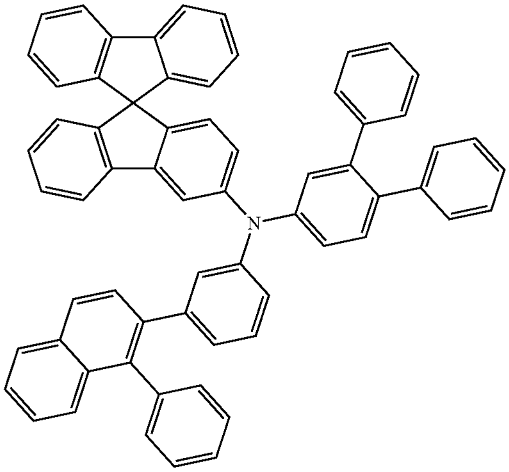

4-288
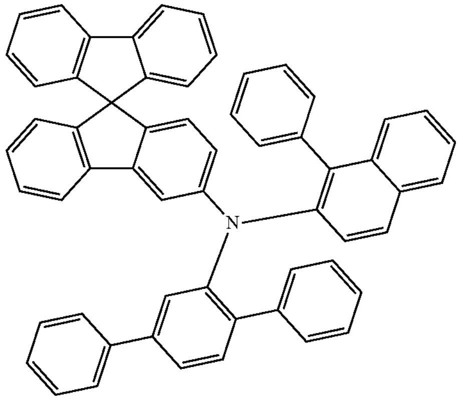
4-289
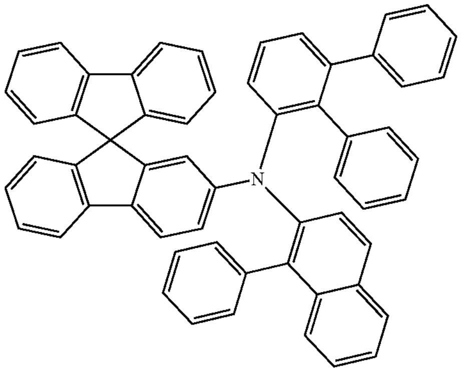
4-290
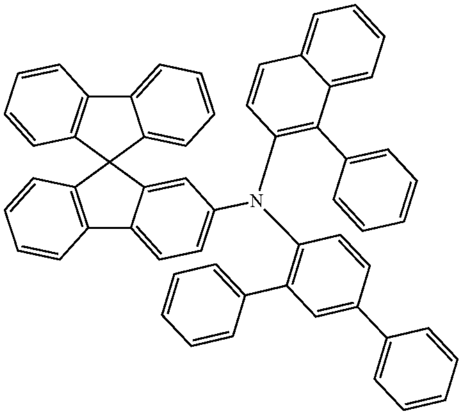
4-291
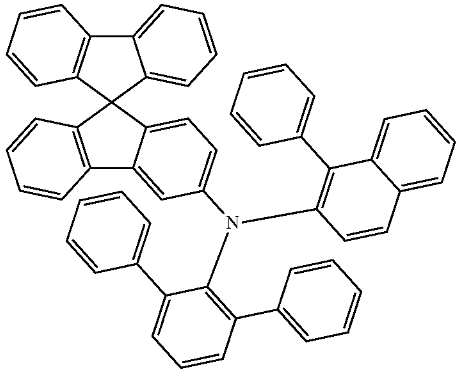
4-292
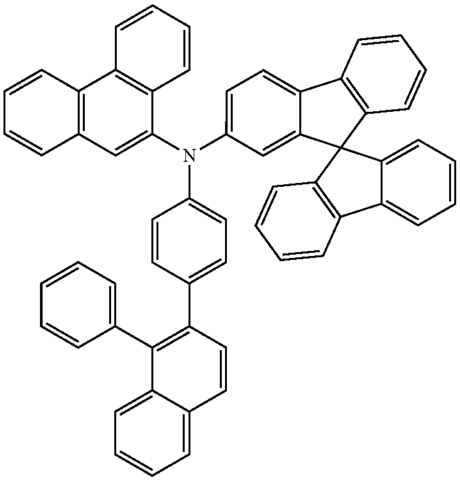
4-293
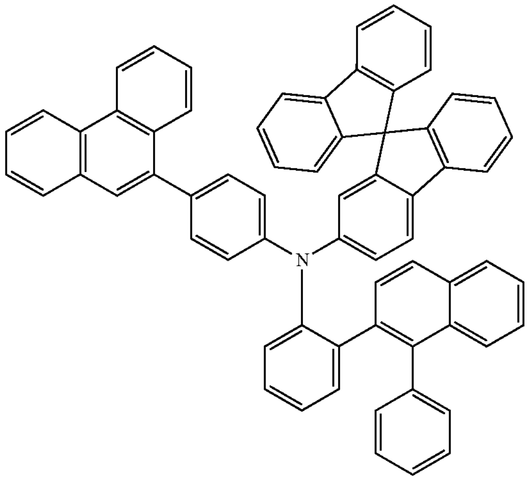
4-294
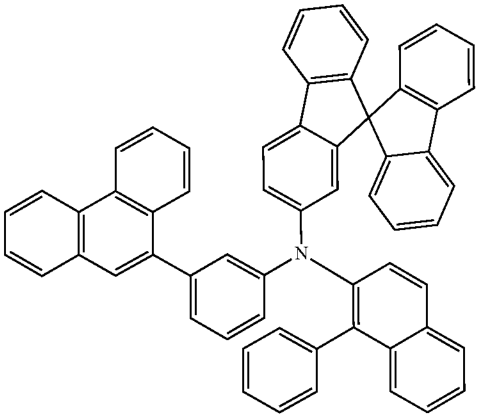

-continued
4-295
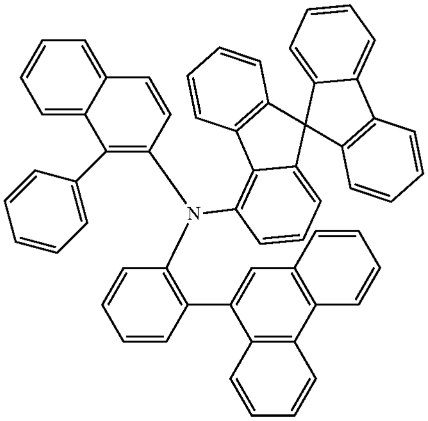
4-296
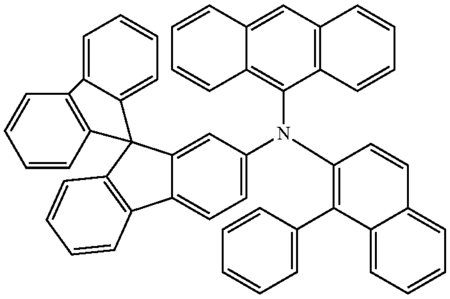
4-297
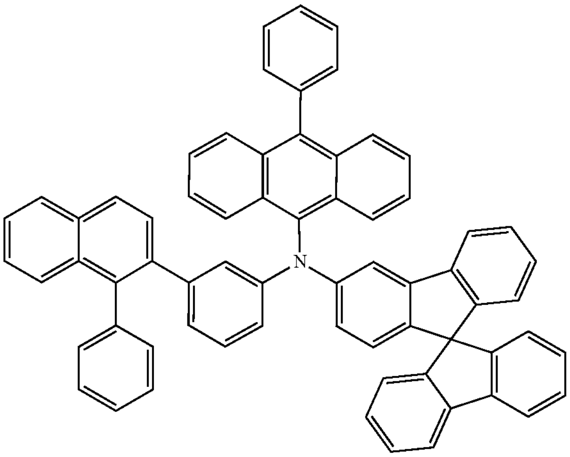
-continued
4-298
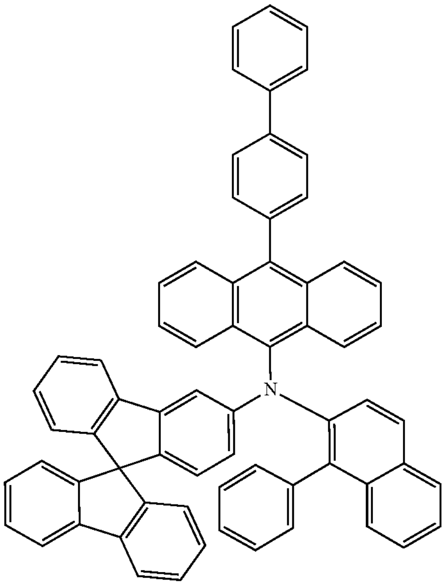
4-299
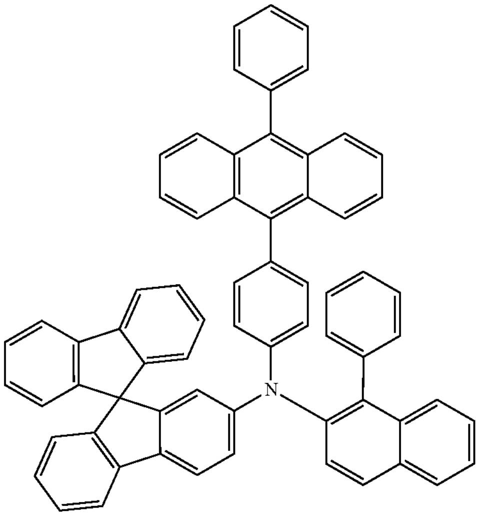
4-300
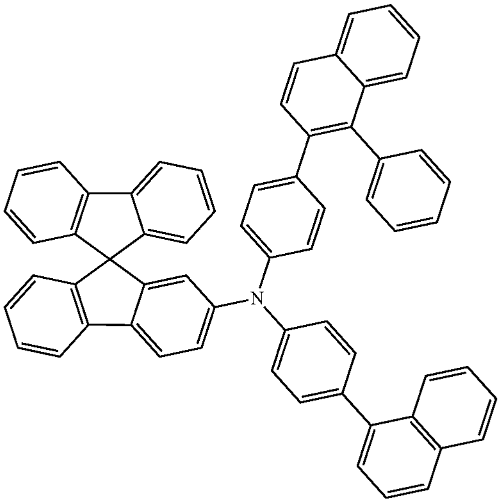

-continued
4-301
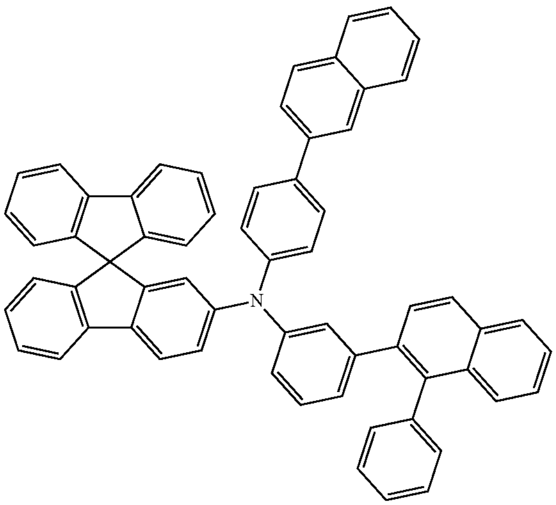
4-302
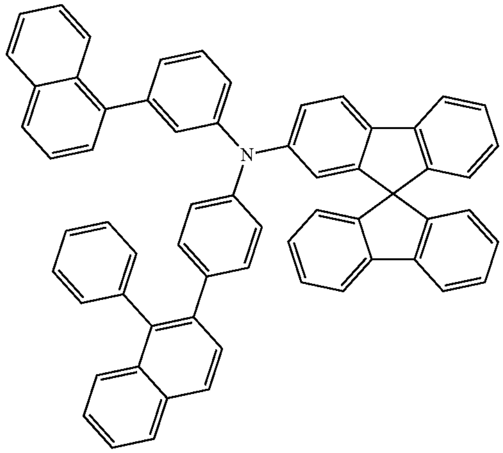
4-303
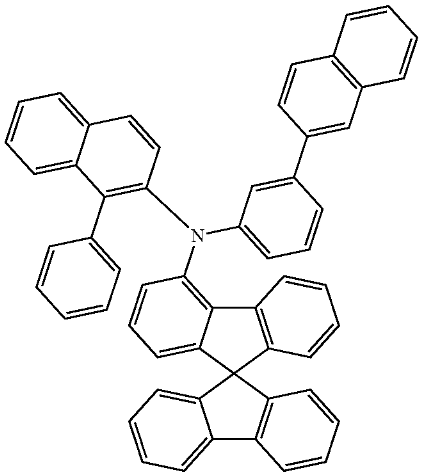
4-304
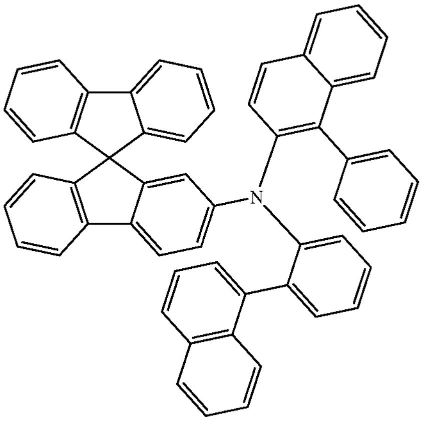
4-305
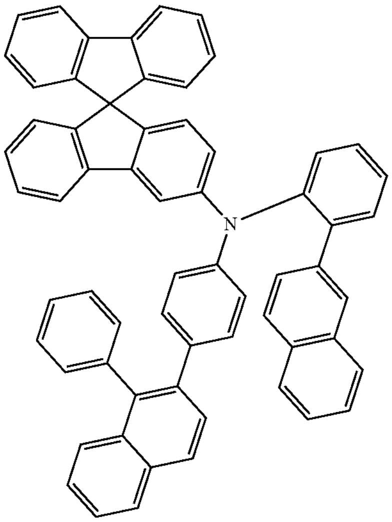
4-306
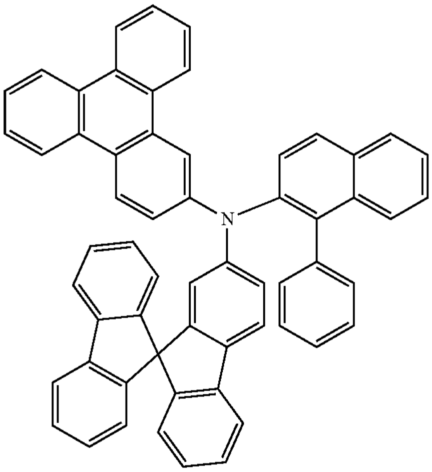

4-307
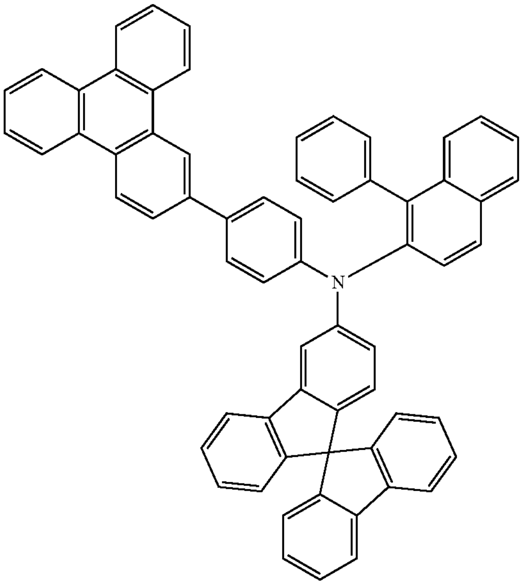
4-308
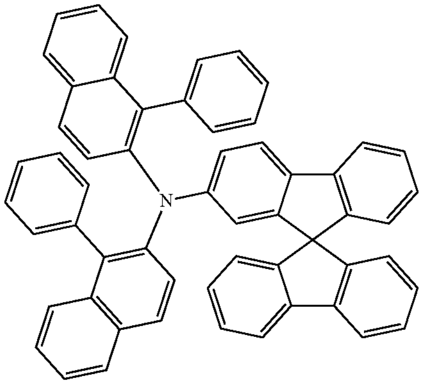
4-309
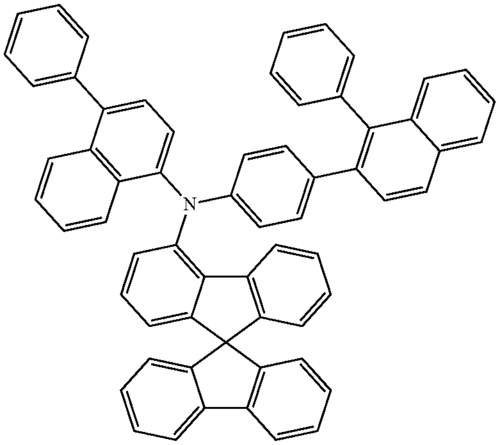
4-310
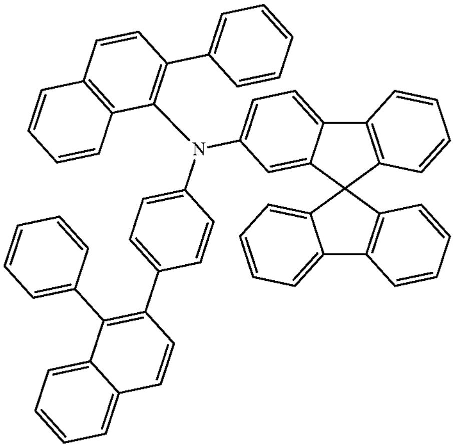
4-311
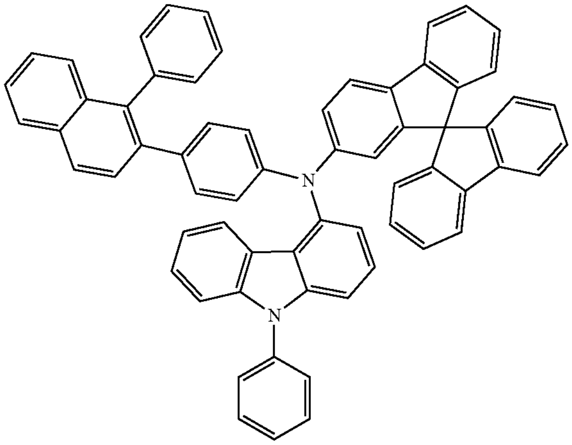
4-312
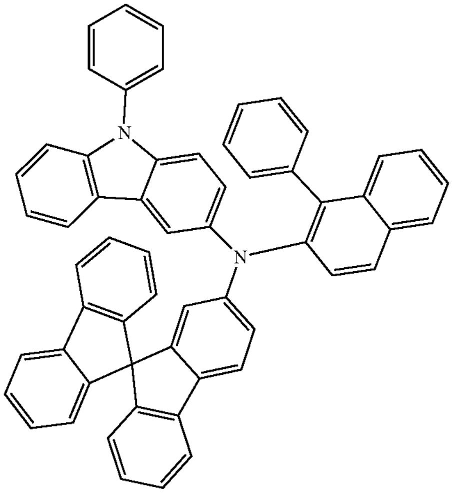

-continued
4-313
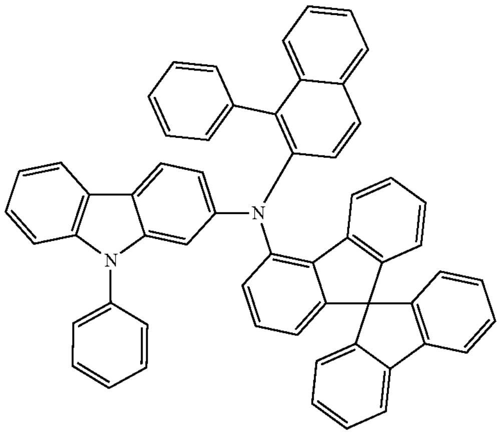
4-314
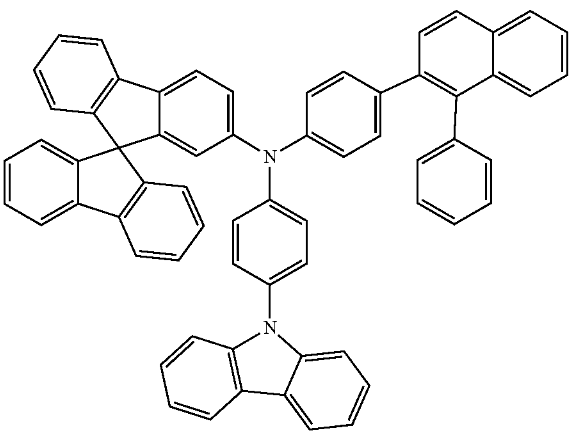
4-315
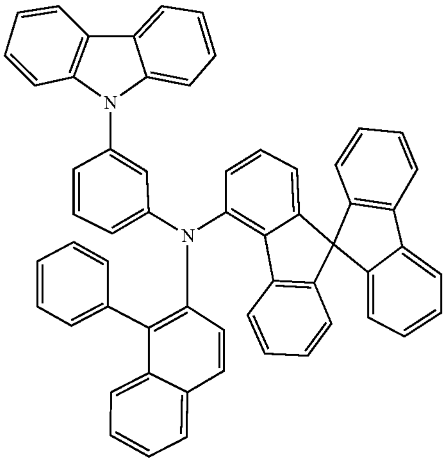
-continued
4-316
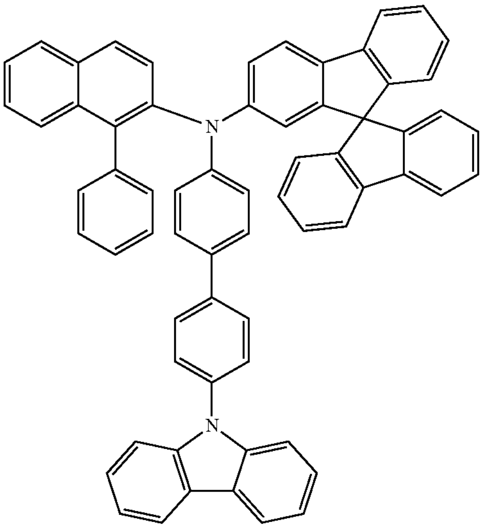
4-317
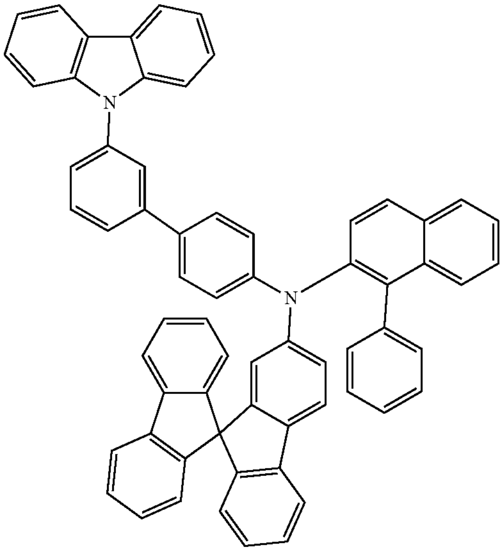
4-318
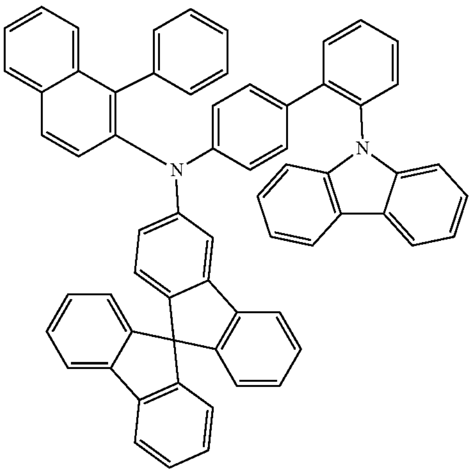

-continued
4-319
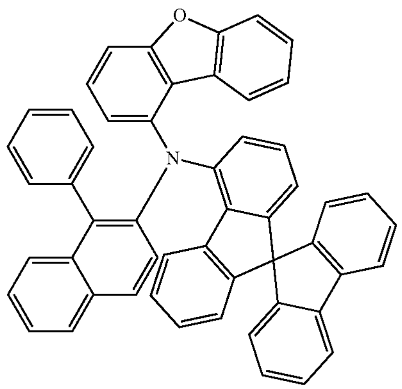
4-320
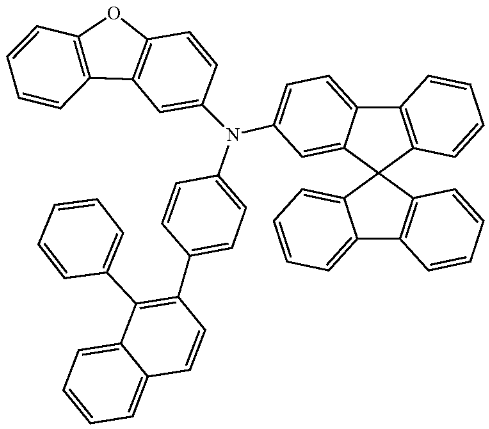
4-321
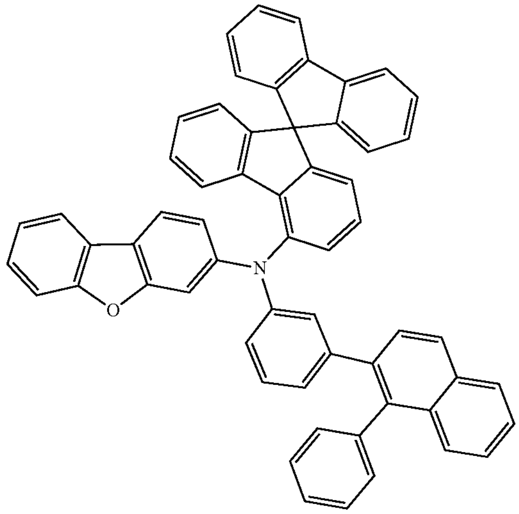
-continued
4-322
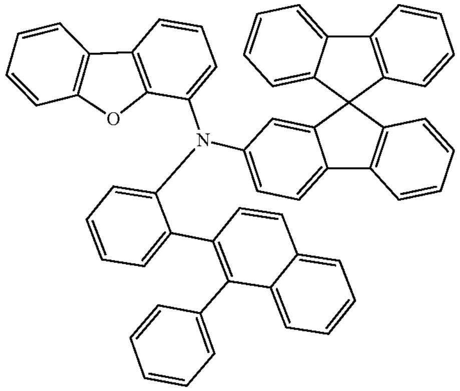
4-323
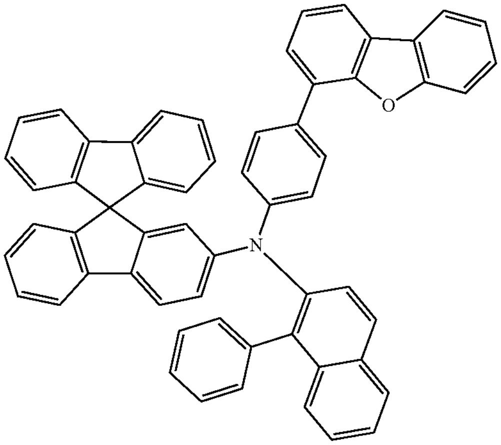
4-324
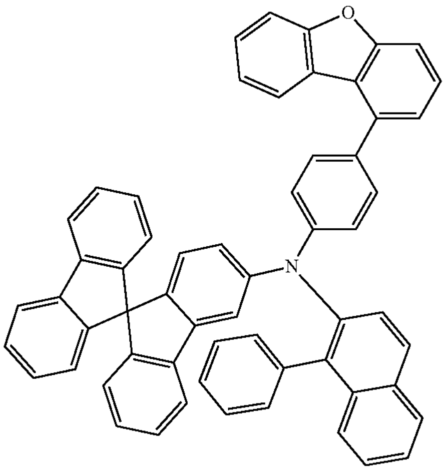

-continued
4-325
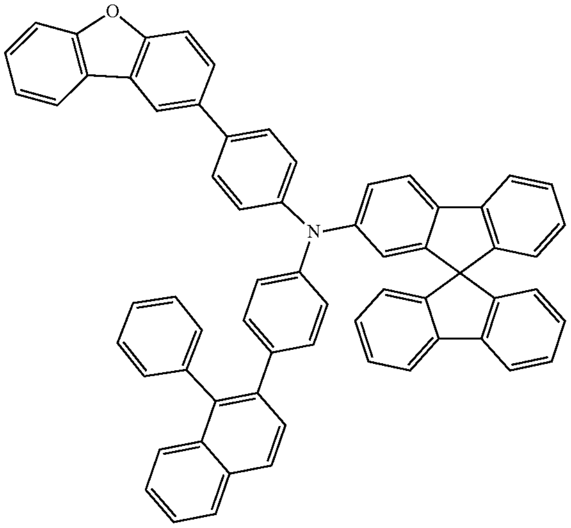
4-326
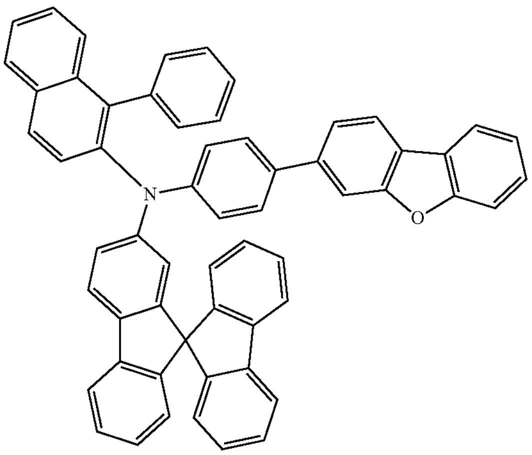
4-327
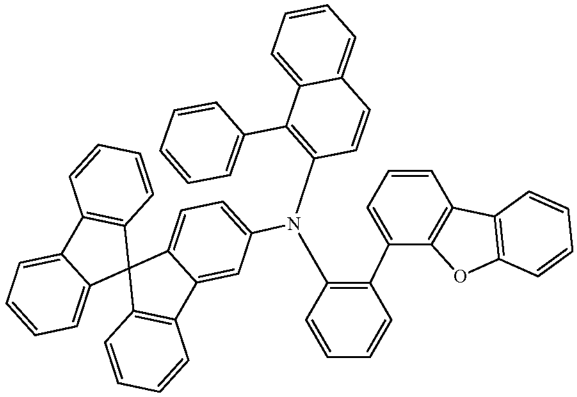
-continued
4-328
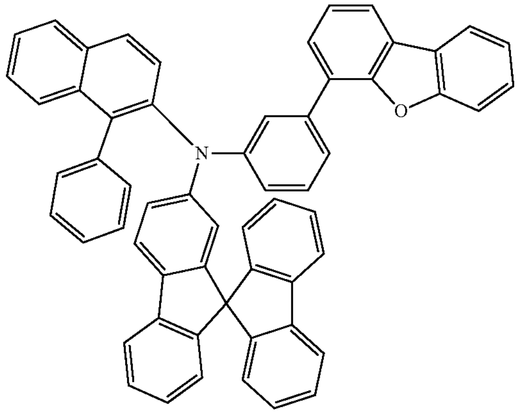
4-329
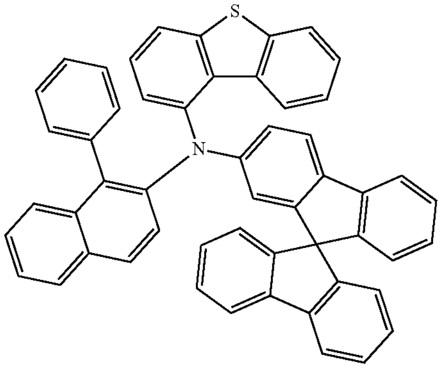
4-330
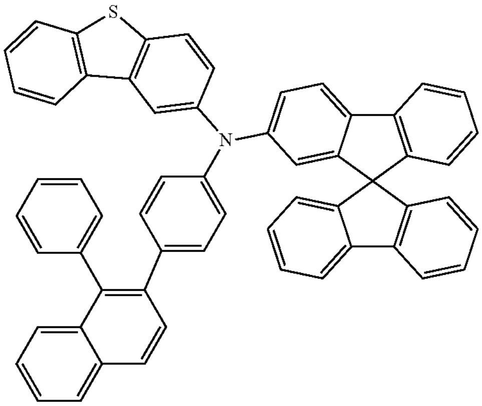
4-331
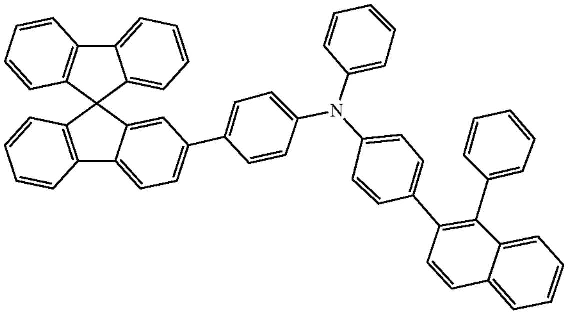

-continued
4-332
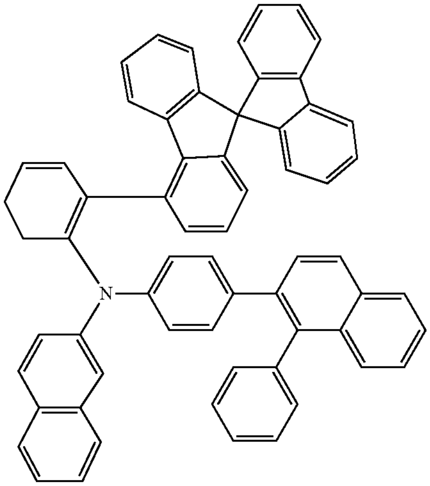
4-333
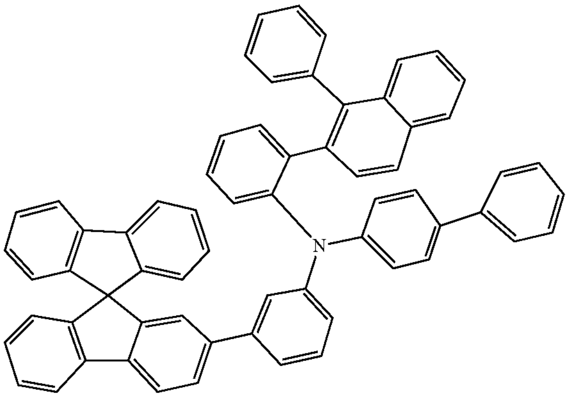
4-334
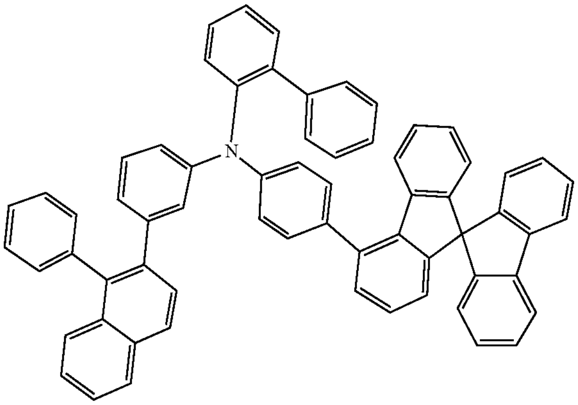
-continued
4-335
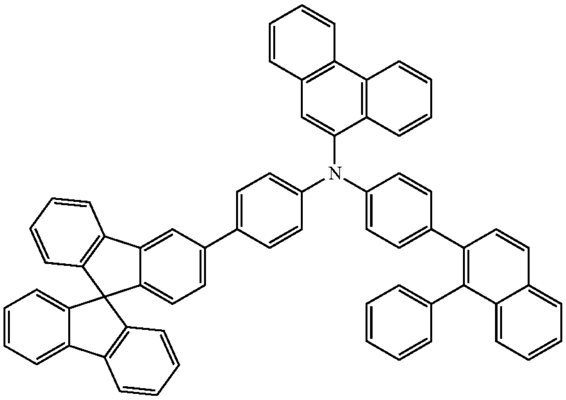
4-336
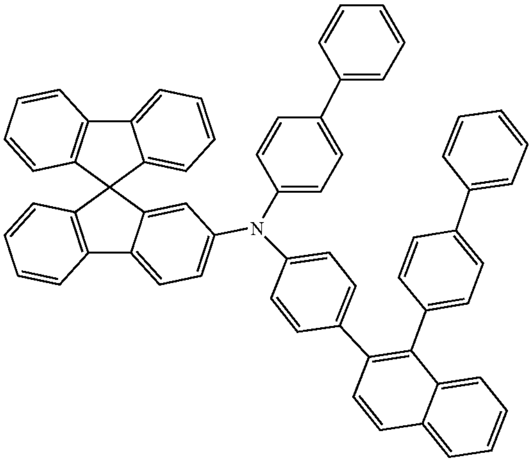
4-337
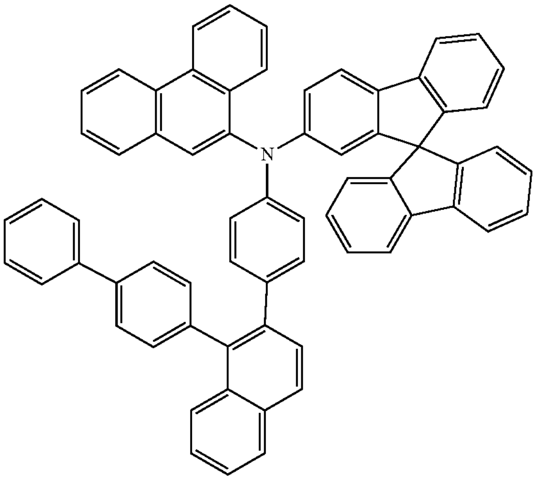

-continued
4-338
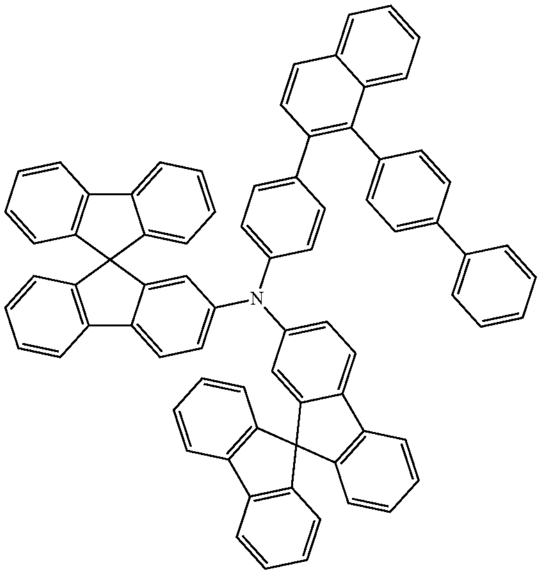
4-339
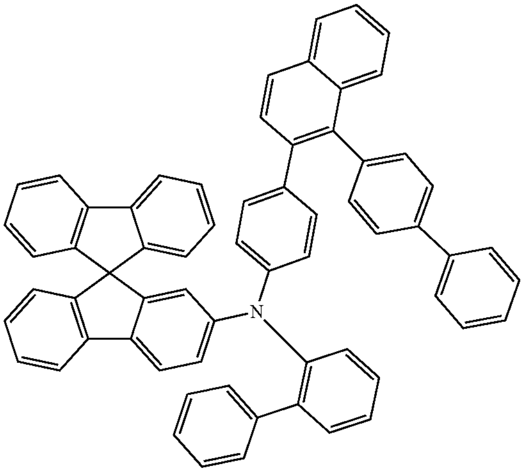
4-340
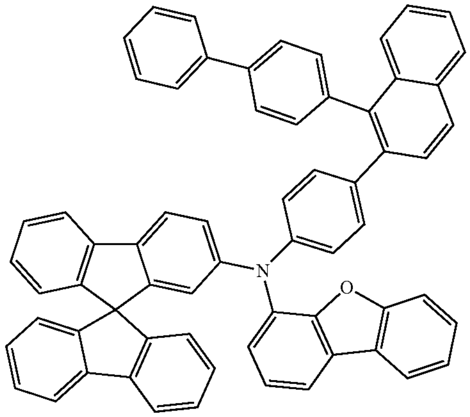
-continued
4-341
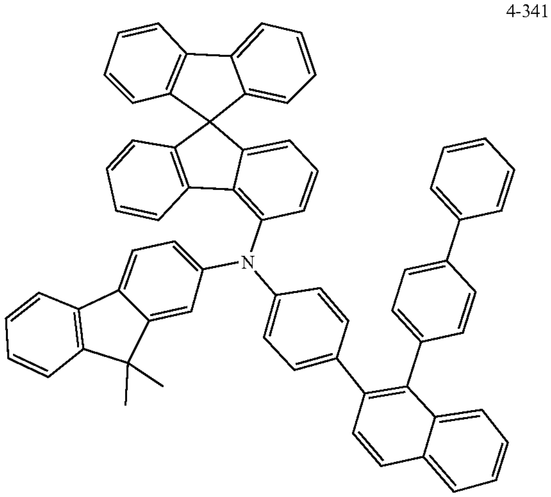
4-342
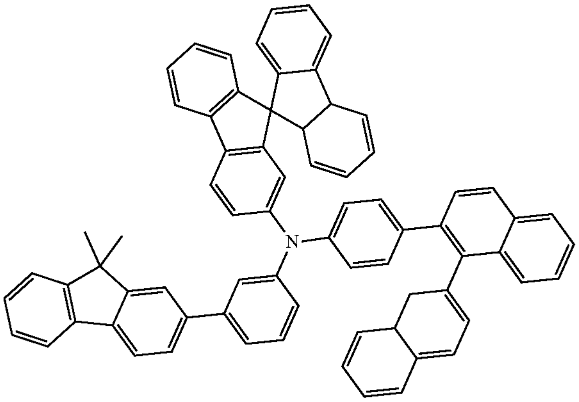
4-343
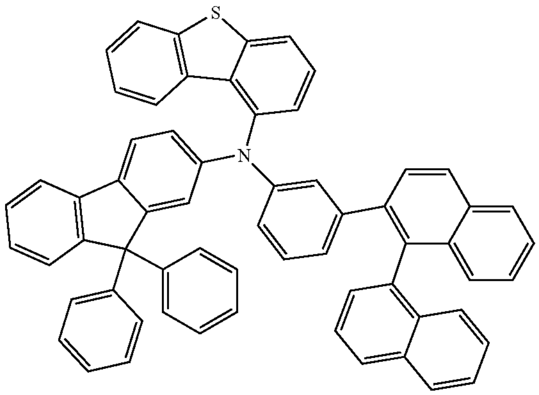
4-344
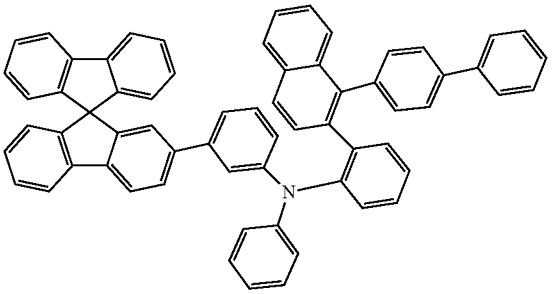

-continued
4-345
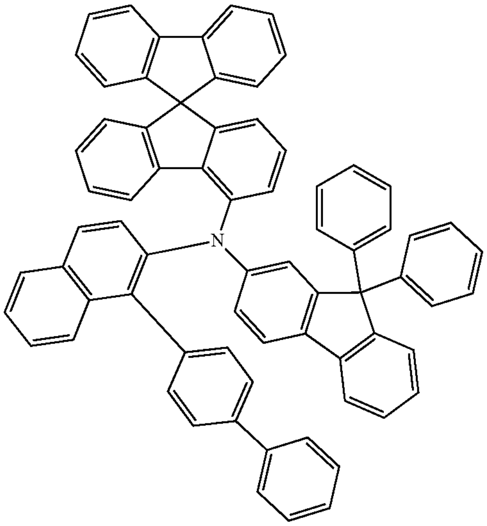
4-346
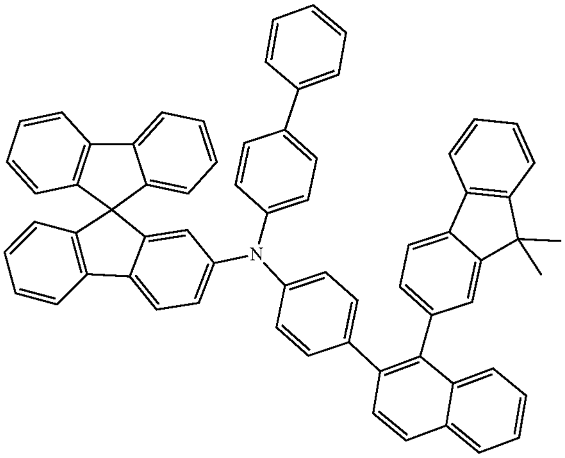
4-347
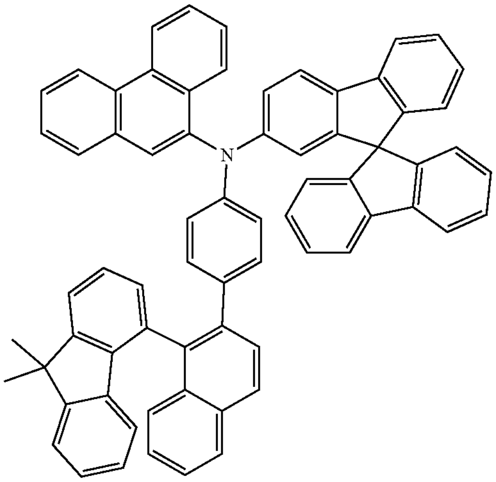
-continued
4-348
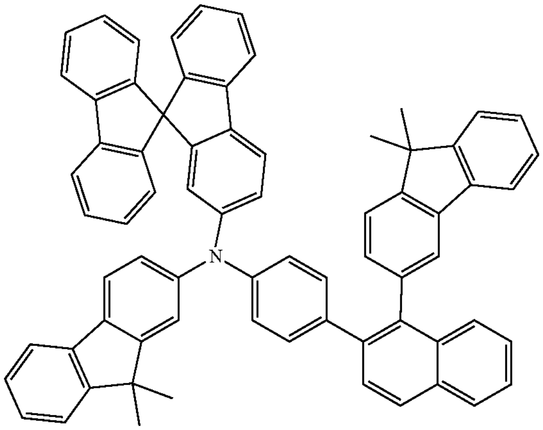
4-349
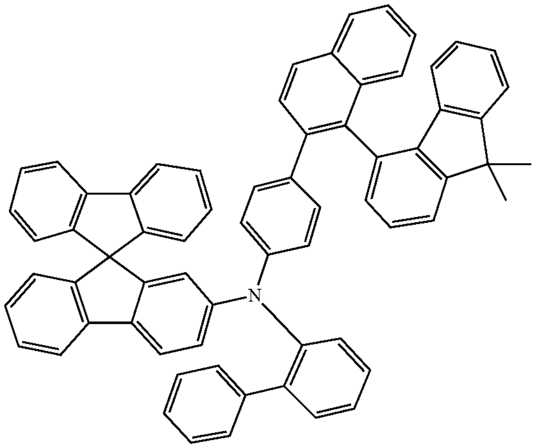
4-350
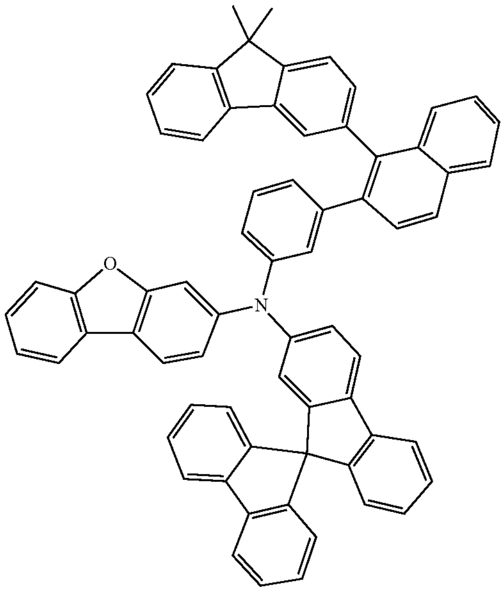

-continued
4-351
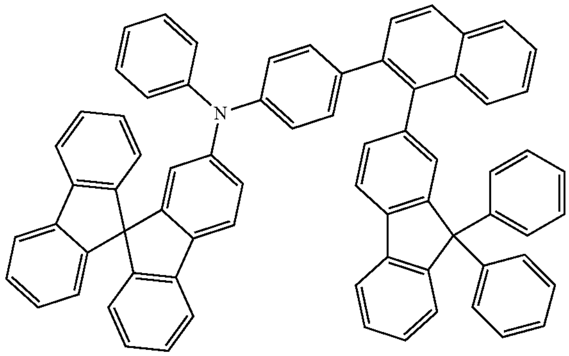
4-352
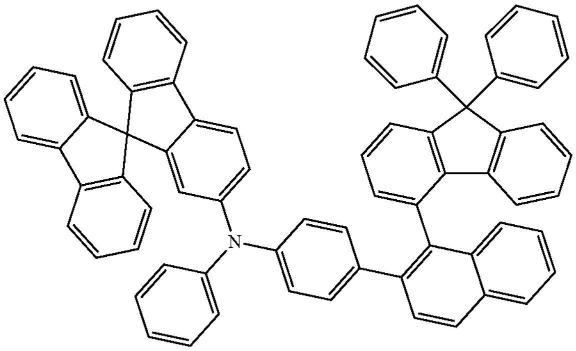
4-353
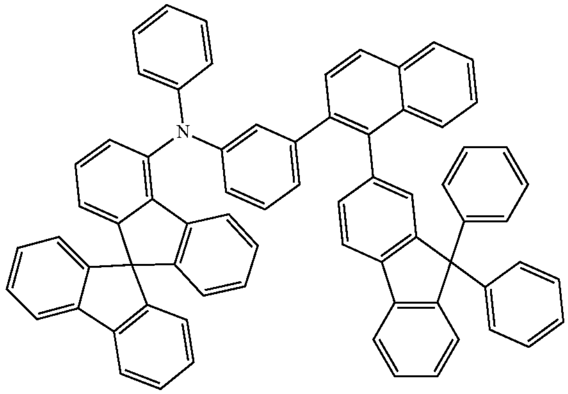
4-354
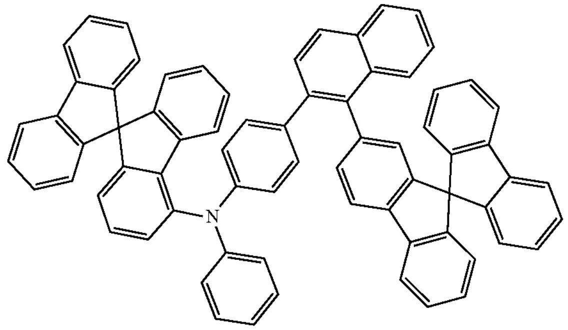
-continued
4-355
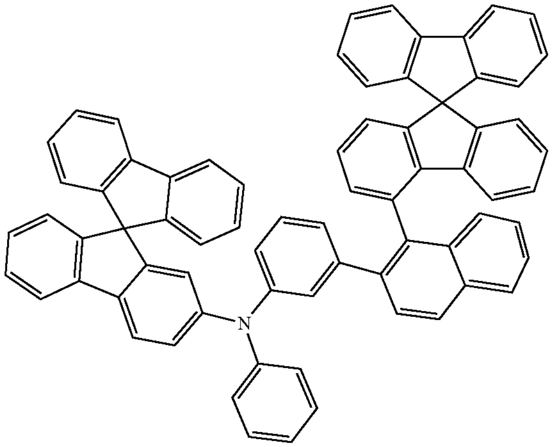
4-356
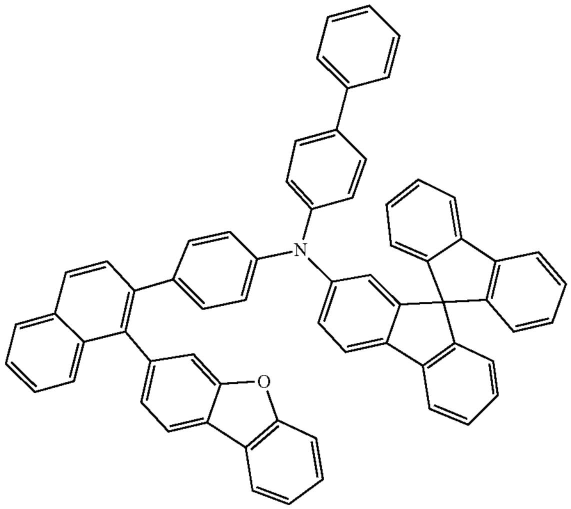
4-357
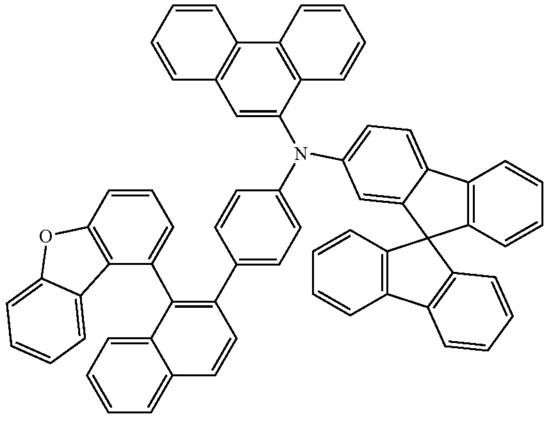

-continued 4-358

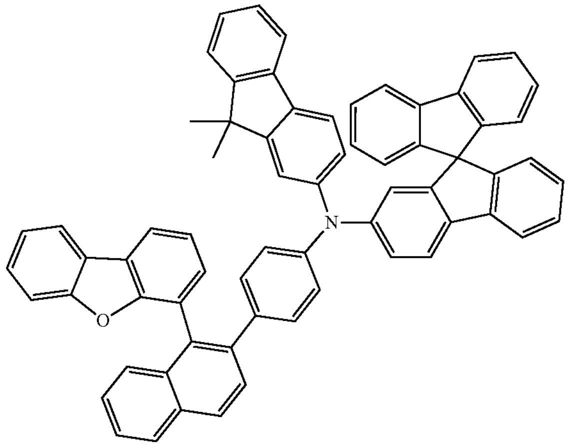

4-359

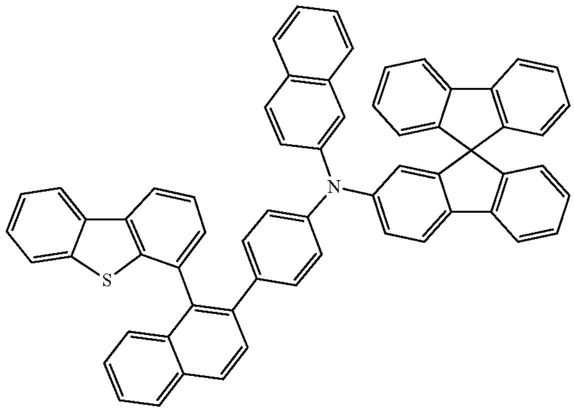

4-360

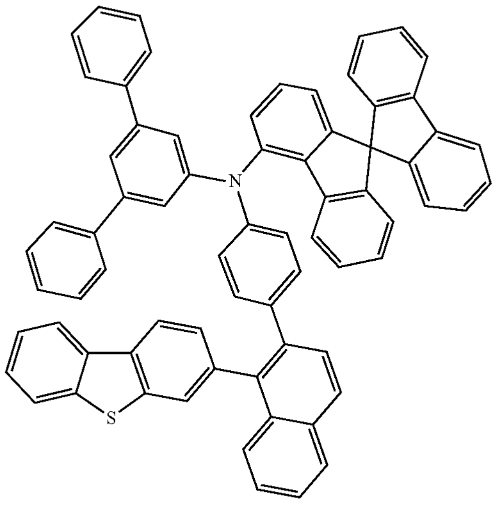

10. The organic light emitting device of claim 1, wherein the organic material layer includes a light emitting layer, and the light emitting layer includes Compound (A) and Compound (B).

11. The organic light emitting device of claim 1, wherein the organic material layer includes a light emitting layer, the light emitting layer includes a host, and the host includes Compound (A) and Compound (B).

12. The organic light emitting device of claim 1, wherein Compound (A) and Compound (B) are included in a weight ratio of 1:10 to 10:1.

13. The organic light emitting device of claim 1, further comprising one, two or more layers selected from the group consisting of a light emitting layer, a hole injection layer, a hole transfer layer, an electron injection layer, an electron transfer layer, an electron blocking layer and a hole blocking layer.

14. A composition for an organic material layer of an organic light emitting device, the composition comprising:

Compound (A) represented by the following Chemical Formula 1; and

Compound (B) represented by any one of the following Chemical Formulae 2 to 4:

[Chemical Formula 1]

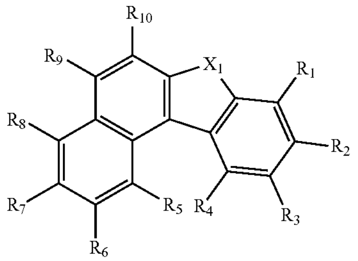

wherein, in Chemical Formula 1,

X1 is O; S; or NR;

R1 to R10 are each independently selected from the group consisting of hydrogen; deuterium; a halogen group; a cyano group; a substituted or unsubstituted alkyl group having 1 to 60 carbon atoms; a substituted or unsubstituted alkenyl group having 2 to 60 carbon atoms; a substituted or unsubstituted alkynyl group having 2 to 60 carbon atoms; a substituted or unsubstituted alkoxy group having 1 to 60 carbon atoms; a substituted or unsubstituted cycloalkyl group having 3 to 60 carbon atoms; a substituted or unsubstituted heterocycloalkyl group having 2 to 60 carbon atoms; a substituted or unsubstituted aryl group having 6 to 60 carbon atoms; a substituted or unsubstituted heteroaryl group having 2 to 60 carbon atoms; a substituted or unsubstituted phosphine oxide group; and a substituted or unsubstituted amine group, or adjacent two or more groups bond to form a substituted or unsubstituted ring;

at least one of R1 to R10 is —N-Het, and at least one of the rest of R1 to R10 is $-(L)_m$-Ar;

L is a direct bond; a substituted or unsubstituted arylene group having 6 to 60 carbon atoms; or a substituted or unsubstituted heteroarylene group having 2 to 60 carbon atoms;

Ar is a substituted or unsubstituted aryl group having 6 to 60 carbon atoms; a substituted or unsubstituted heteroaryl group having 2 to 60 carbon atoms; or a substituted or unsubstituted amine group;

N-Het is a monocyclic or polycyclic heteroaryl group having 2 to 60 carbon atoms substituted or unsubstituted, and including one or more Ns;

R is a substituted or unsubstituted aryl group having 6 to 60 carbon atoms;

m is an integer of 1 to 5; and when m is an integer of 2 or greater, substituents in the parentheses are the same as or different from each other,

[Chemical Formula 2]

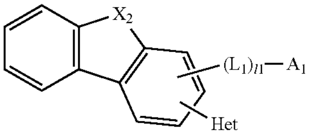

[Chemical Formula 3]

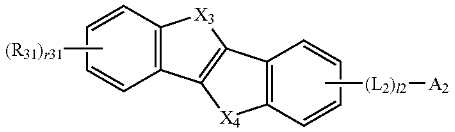

[Chemical Formula 4]

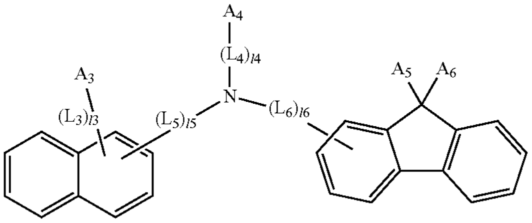

in Chemical Formulae 2 to 4,

X2 is 0 or S;

X3 and X4 are each independently O; S; or CR'R";

L1 to L6 are each independently a direct bond; a substituted or unsubstituted arylene group having 6 to 60 carbon atoms; or a substituted or unsubstituted heteroarylene group having 2 to 60 carbon atoms;

l1 to l6 are each independently an integer of 1 to 5;

A1 to A4 are each independently a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; a substituted or unsubstituted heteroaryl group having 2 to 60 carbon atoms; or a substituted or unsubstituted amine group;

A5 and A6 are each independently hydrogen; deuterium; a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; or a substituted or unsubstituted heteroaryl group having 2 to 60 carbon atoms, or A5 and A6 bond to form a substituted or unsubstituted ring;

R', R" and R31 are each independently hydrogen; deuterium; a halogen group; a cyano group; a substituted or unsubstituted alkyl group having 1 to 60 carbon atoms; a substituted or unsubstituted cycloalkyl group having 3 to 60 carbon atoms; a substituted or unsubstituted aryl group having 6 to 60 carbon atoms; or a substituted or unsubstituted heteroaryl group having 2 to 60 carbon atoms;

Het is a substituted or unsubstituted aryl group having 6 to 60 carbon atoms; or a substituted or unsubstituted heteroaryl group having 2 to 60 carbon atoms;

r31 is an integer of 1 to 4; and when l1 to l6 and r31 are each 2 or greater, substituents in the parentheses are the same as or different from each other.

* * * * *